US012183758B2

(12) United States Patent
Miyamoto

(10) Patent No.: US 12,183,758 B2
(45) Date of Patent: Dec. 31, 2024

(54) CIRCUIT BOARD, SEMICONDUCTOR DEVICE, AND ELECTRONIC DEVICE

(71) Applicant: SONY SEMICONDUCTOR SOLUTIONS CORPORATION, Kanagawa (JP)

(72) Inventor: Takashi Miyamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 740 days.

(21) Appl. No.: 17/309,987

(22) PCT Filed: Jan. 9, 2020

(86) PCT No.: PCT/JP2020/000381
§ 371 (c)(1),
(2) Date: Jul. 8, 2021

(87) PCT Pub. No.: WO2020/153129
PCT Pub. Date: Jul. 30, 2020

(65) Prior Publication Data
US 2022/0165777 A1 May 26, 2022

(30) Foreign Application Priority Data
Jan. 22, 2019 (JP) ................................. 2019-008271

(51) Int. Cl.
*H05K 1/02* (2006.01)
*H01L 27/146* (2006.01)

(52) U.S. Cl.
CPC .. *H01L 27/14636* (2013.01); *H01L 27/14603* (2013.01)

(58) Field of Classification Search
CPC ........ H01L 27/14636; H01L 27/14603; H05K 1/0296; H05K 2201/09209; H05K 2201/09227–09254; H05K 2201/09272
See application file for complete search history.

(56) References Cited

U.S. PATENT DOCUMENTS

| | | | |
|---|---|---|---|
| 6,483,714 | B1 | 11/2002 | Kabumoto |
| 2006/0232949 | A1 | 10/2006 | Osaka |

(Continued)

FOREIGN PATENT DOCUMENTS

| | | | |
|---|---|---|---|
| CN | 101188245 A | 5/2008 | |
| CN | 101594732 A | 12/2009 | |

(Continued)

OTHER PUBLICATIONS

International Search Report and Written Opinion of PCT Application No. PCT/JP2019/000381, issued on Mar. 24, 2020, 11 pages of ISRWO.

*Primary Examiner* — Hoa C Nguyen
(74) *Attorney, Agent, or Firm* — CHIP LAW GROUP

(57) ABSTRACT

Provided is a circuit board comprising a first conductor periodically arranged with a first periodic width in a first region, a second conductor periodically arranged with a second periodic width in the first region, a third conductor periodically arranged with a third periodic width in a second region, and a fourth conductor periodically arranged with a fourth periodic width in the second region. The first periodic width and the second periodic width, and the third periodic width and the fourth periodic width are in a rational number relationship, the first periodic width and the fourth periodic width are same or substantially same, the first region and the second region have a conductor structure mirror-symmetrical or substantially mirror-symmetrical in a first direction. A first power supply is connected to the first conductor and the (Continued)

third conductor and a second power supply is connected to the second conductor and the fourth conductor.

19 Claims, 293 Drawing Sheets

(56) References Cited

U.S. PATENT DOCUMENTS

| | | | |
|---|---|---|---|
| 2008/0088724 | A1 | 4/2008 | Kudoh |
| 2011/0128400 | A1* | 6/2011 | Wakano ............ H01L 27/14609 348/222.1 |
| 2013/0021390 | A1 | 1/2013 | Inada |
| 2013/0101755 | A1 | 4/2013 | Lee et al. |
| 2017/0133425 | A1* | 5/2017 | Shigenami ............. H04N 25/76 |
| 2017/0308192 | A1* | 10/2017 | Ogura ................. G06F 3/04164 |
| 2018/0124345 | A1* | 5/2018 | Aoki ...................... H04N 25/60 |

FOREIGN PATENT DOCUMENTS

| | | | |
|---|---|---|---|
| CN | 103064217 | A | 4/2013 |
| CN | 106662955 | A | 5/2017 |
| EP | 2584400 | A1 | 4/2013 |
| EP | 3176680 | A1 | 6/2017 |
| JP | 2000277928 | A | 10/2000 |
| JP | 2001274287 | A | 10/2001 |
| JP | 2007-207997 | A | 8/2007 |
| JP | 2008-124237 | A | 5/2008 |
| JP | 2008177363 | A | 7/2008 |
| JP | 2013-088803 | A | 5/2013 |
| JP | 2013-251306 | A | 12/2013 |
| JP | 2014-057426 | A | 3/2014 |
| JP | 2016-218834 | A | 12/2016 |
| KR | 10-2008-0033881 | A | 4/2008 |
| KR | 10-2013-0048297 | A | 5/2013 |
| TW | 200824110 | A | 6/2008 |
| TW | 201601302 | A | 1/2016 |
| TW | 201706795 | A | 2/2017 |
| WO | 2013/115075 | A1 | 8/2013 |
| WO | 2015/198913 | A1 | 12/2015 |
| WO | 2016/136967 | A1 | 9/2016 |

* cited by examiner

A
CONDUCTOR LAYER C
WYCA
GYC
WYCB
FXC
WXCA, WXCB
GXC
FYC
1341B
1341A
165C
B
CONDUCTOR LAYER A
WYA
FYA
GYA
FXA
WXA
GXA
1241
1311
165A
C
CONDUCTOR LAYER B
WYB
FYB
GYB
FXB
WXB
GXB
1242
1312
165B
D
CONDUCTOR LAYER A+CONDUCTOR LAYER C
E
CONDUCTOR LAYER B+CONDUCTOR LAYER C
F
CONDUCTOR LAYER A+CONDUCTOR LAYER B
Y
X
Z
Vdd WIRING
Vss WIRING
FOURTEENTH CONFIGURATION EXAMPLE

FOURTH CONFIGURATION EXAMPLE

CIRCUIT BOARD, SEMICONDUCTOR DEVICE, AND ELECTRONIC DEVICE

CROSS REFERENCE TO RELATED APPLICATIONS

This application is a U.S. National Phase of International Patent Application No. PCT/JP2020/000381 filed on Jan. 9, 2020, which claims priority benefit of Japanese Patent Application No. JP 2019-008271 filed in the Japan Patent Office on Jan. 22, 2019. Each of the above-referenced applications is hereby incorporated herein by reference in its entirety.

TECHNICAL FIELD

The present technology relates to a circuit board, a semiconductor device, and an electronic device, and more particularly to a circuit board, a semiconductor device, and an electronic device for enabling effective suppression of generation of noise in a signal.

BACKGROUND ART

In a solid-state imaging device represented by a complementary metal oxide semiconductor (CMOS) image sensor, noise may occur in a pixel signal generated by each pixel due to an internal configuration of the solid-state imaging device.

For example, some active elements such as transistors and diodes existing inside a solid-state imaging device generate fine hot carrier light emission. In a case where the hot carrier light emission leaks into a photoelectric conversion unit formed in a pixel, noise occurs in the pixel signal.

As a method of suppressing the noise caused by hot carrier light emission generated from an active element, a technique of providing a light-shielding structure to wiring formed between the active element and a photoelectric conversion unit is known (for example, see Patent Document 1).

Furthermore, for example, noise (inductive noise) may be generated in the pixel signal due to induced electromotive force caused by a magnetic field generated due to the internal configuration of the solid-state imaging device. Specifically, a conductor loop is formed on a pixel array, the conductor loop being formed using a control line for transmitting a control signal for selecting a pixel to read the pixel signal, and a signal line for transmitting the pixel signal read from the selected pixel, when reading the pixel signal from a certain pixel.

In addition, when wiring exists near the conductor loop formed using the control line and the signal line, a magnetic flux passing through the conductor loop may be generated due to a change in current flowing through the wiring, the induced electromotive force may be generated in the conductor loop, accordingly, and the inductive noise may be generated in the pixel signal. Hereinafter, the conductor loop in which a magnetic flux is generated due to a change in current flowing through nearby wiring and the induced electromotive force is generated by the magnetic flux is referred to as Victim conductor loop.

As a method of suppressing inductive noise inside an electronic device, there is a method of canceling a generated magnetic flux by arranging wiring that generates the magnetic flux inside the electronic device as two-layer reticulated wiring (for example, see Patent Document 2).

CITATION LIST

Patent Document

Patent Document 1: International Publication No. 2013/115075

Patent Document 2: Japanese Patent Application Laid-Open No. 2014-57426

SUMMARY OF THE INVENTION

Problems to be Solved by the Invention

However, the invention described in Patent Document 2 can suppress the inductive noise but having not considered shielding the hot carrier light emission.

The present technology has been made in view of the foregoing, and enables effective suppression of generation of noise in a signal.

Solutions to Problems

A circuit board according to the first aspect of the present technology includes a first conductor periodically arranged with a first periodic width in a first region, a second conductor periodically arranged with a second periodic width in the first region, a third conductor periodically arranged with a third periodic width in a second region different from the first region, and a fourth conductor periodically arranged with a fourth periodic width in the second region, in which the first periodic width and the second periodic width are in a rational number relationship, the third periodic width and the fourth periodic width are in a rational number relationship, the first periodic width and the fourth periodic width are same or substantially same, the first region and the second region have a conductor structure mirror-symmetrical or substantially mirror-symmetrical in a first direction, and a first power supply connected to the first conductor and the third conductor and a second power supply connected to the second conductor and the fourth conductor are power supplies having different voltage values.

A semiconductor device according to the second aspect of the present technology includes a circuit board including: a first conductor periodically arranged with a first periodic width in a first region; a second conductor periodically arranged with a second periodic width in the first region; a third conductor periodically arranged with a third periodic width in a second region different from the first region; and a fourth conductor periodically arranged with a fourth periodic width in the second region, in which the first periodic width and the second periodic width are in a rational number relationship, the third periodic width and the fourth periodic width are in a rational number relationship, the first periodic width and the fourth periodic width are same or substantially same, the first region and the second region have a conductor structure mirror-symmetrical or substantially mirror-symmetrical in a first direction, and a first power supply connected to the first conductor and the third conductor and a second power supply connected to the second conductor and the fourth conductor are power supplies having different voltage values.

An electronic device according to the third aspect of the present technology includes a semiconductor device including a circuit board including: a first conductor periodically arranged with a first periodic width in a first region; a second conductor periodically arranged with a second periodic width width in the first region; a third conductor periodically arranged with a third periodic width in a second region different from the first region; and a fourth conductor periodically arranged with a fourth periodic width in the second region, in which the first periodic width and the second periodic width are in a rational number relationship, the third periodic width and the fourth periodic width are in a rational number relationship, the first periodic width and the fourth periodic width are same or substantially same, the first region and the second region have a conductor structure mirror-symmetrical or substantially mirror-symmetrical in a first direction, and a first power supply connected to the first conductor and the third conductor and a second power supply connected to the second conductor and the fourth conductor are power supplies having different voltage values.

In the first to third aspects of the present technology, a first conductor periodically arranged with a first periodic width in a first region, a second conductor periodically arranged with a second periodic width in the first region, a third conductor periodically arranged with a third periodic width in a second region different from the first region, and a fourth conductor periodically arranged with a fourth periodic width in the second region are provided, the first periodic width and the second periodic width are in a rational number relationship, the third periodic width and the fourth periodic width are in a rational number relationship, the first periodic width and the fourth periodic width are same or substantially same, the first region and the second region have a conductor structure mirror-symmetrical or substantially mirror-symmetrical in a first direction, and a first power supply connected to the first conductor and the third conductor and a second power supply connected to the second conductor and the fourth conductor are configured to be power supplies having different voltage values.

The circuit board, the semiconductor device, and the electronic device may be independent devices or may be modules incorporated in other devices.

BRIEF DESCRIPTION OF DRAWINGS

FIG. 120 is diagrams illustrating arrangement examples in a case where there are three conductor layers.

FIG. 121 is diagrams illustrating a problem in the case where there are three conductor layers.

FIG. 122 is diagrams illustrating a first configuration example of a three-layer conductor layer.

FIG. 123 is diagrams illustrating a second configuration example of the three-layer conductor layer.

FIG. 124 is diagrams illustrating a first modification of the second configuration example of the three-layer conductor layer.

FIG. 125 is diagrams illustrating a second modification of the second configuration example of the three-layer conductor layer.

FIG. 126 is diagrams illustrating a third configuration example of the three-layer conductor layer.

FIG. 127 is diagrams illustrating a modification of the third configuration example of the three-layer conductor layer.

FIG. 128 is diagrams illustrating a fourth configuration example of the three-layer conductor layer.

FIG. 129 is diagrams illustrating a first modification of the fourth configuration example of the three-layer conductor layer.

FIG. 130 is diagrams illustrating a second modification of the fourth configuration example of the three-layer conductor layer.

FIG. 131 is diagrams illustrating a fifth configuration example of the three-layer conductor layer.

Figure 132:
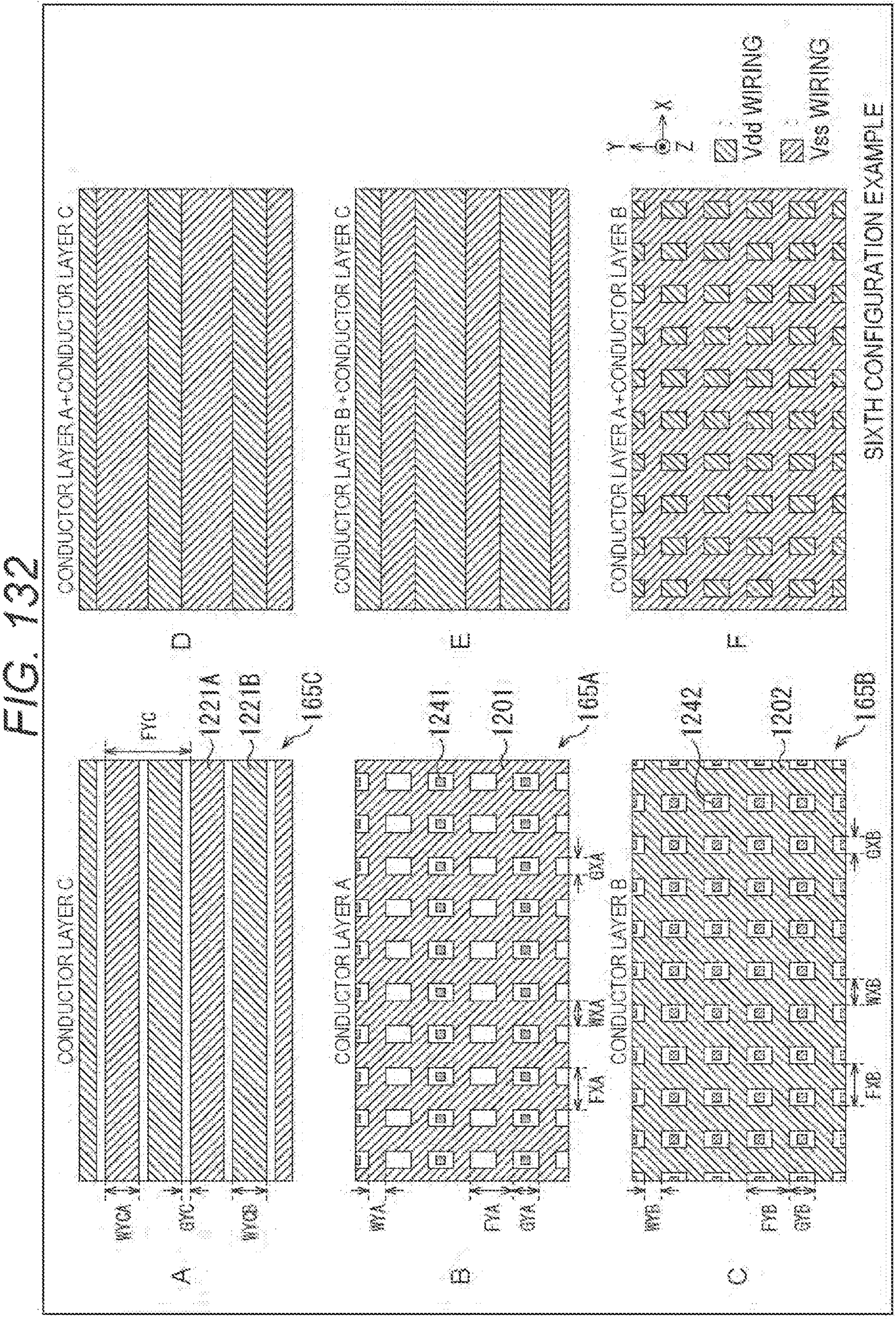

FIG. 132 is diagrams illustrating a sixth configuration example of the three-layer conductor layer.

Figure 133:
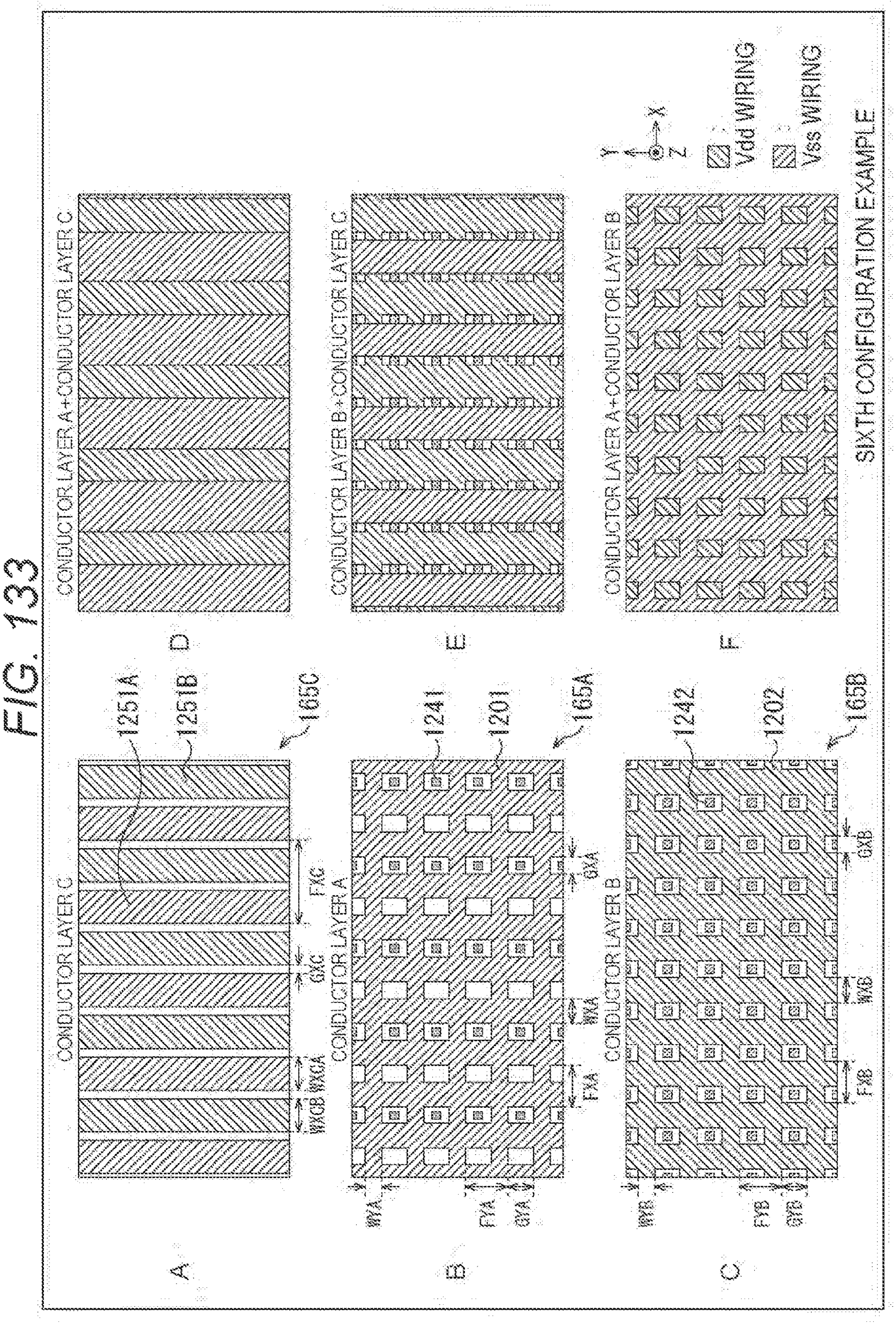

FIG. 133 is diagrams illustrating a modification of the sixth configuration example of the three-layer conductor layer.

Figure 134:
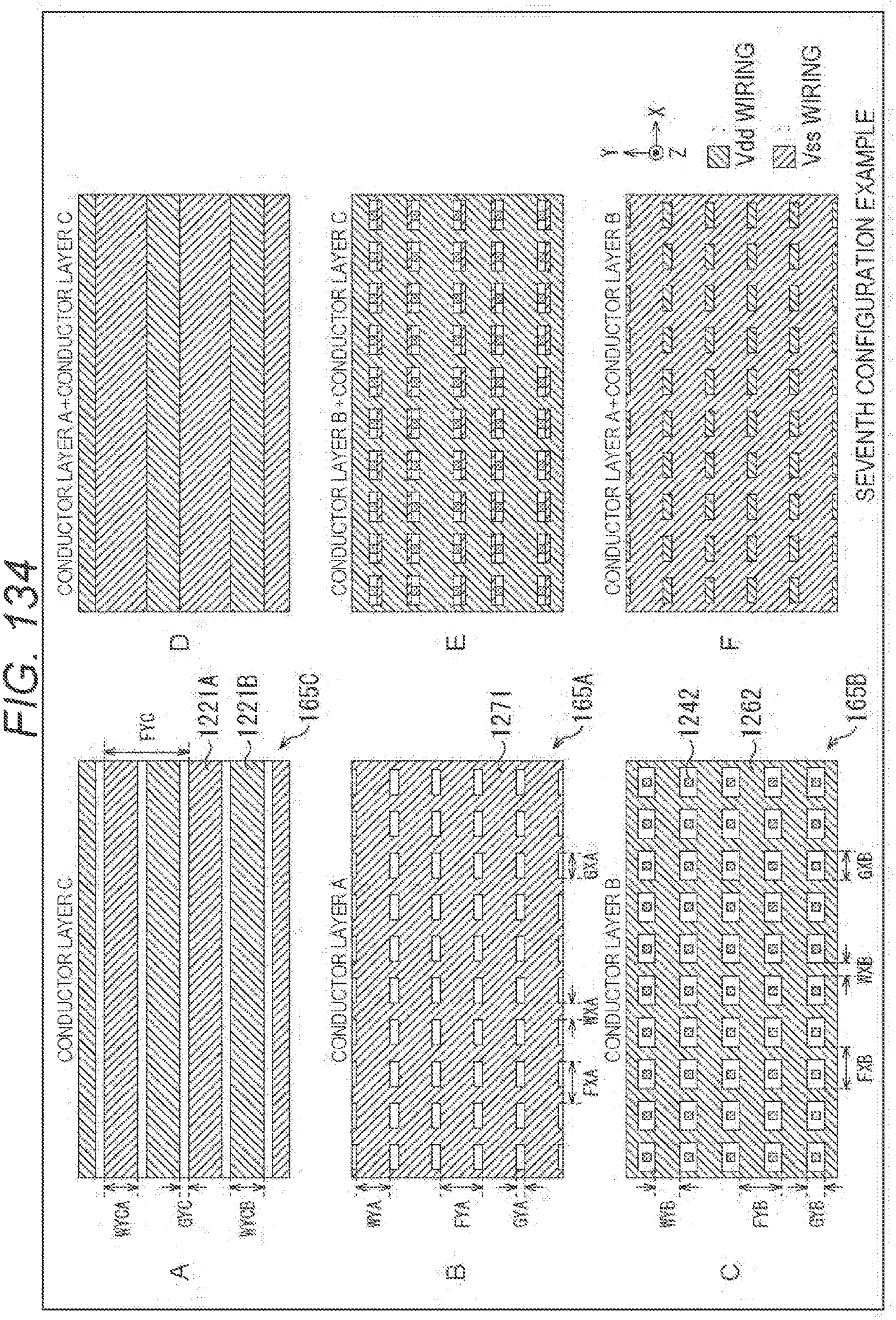

FIG. 134 is diagrams illustrating a seventh configuration example of the three-layer conductor layer.

Figure 135:
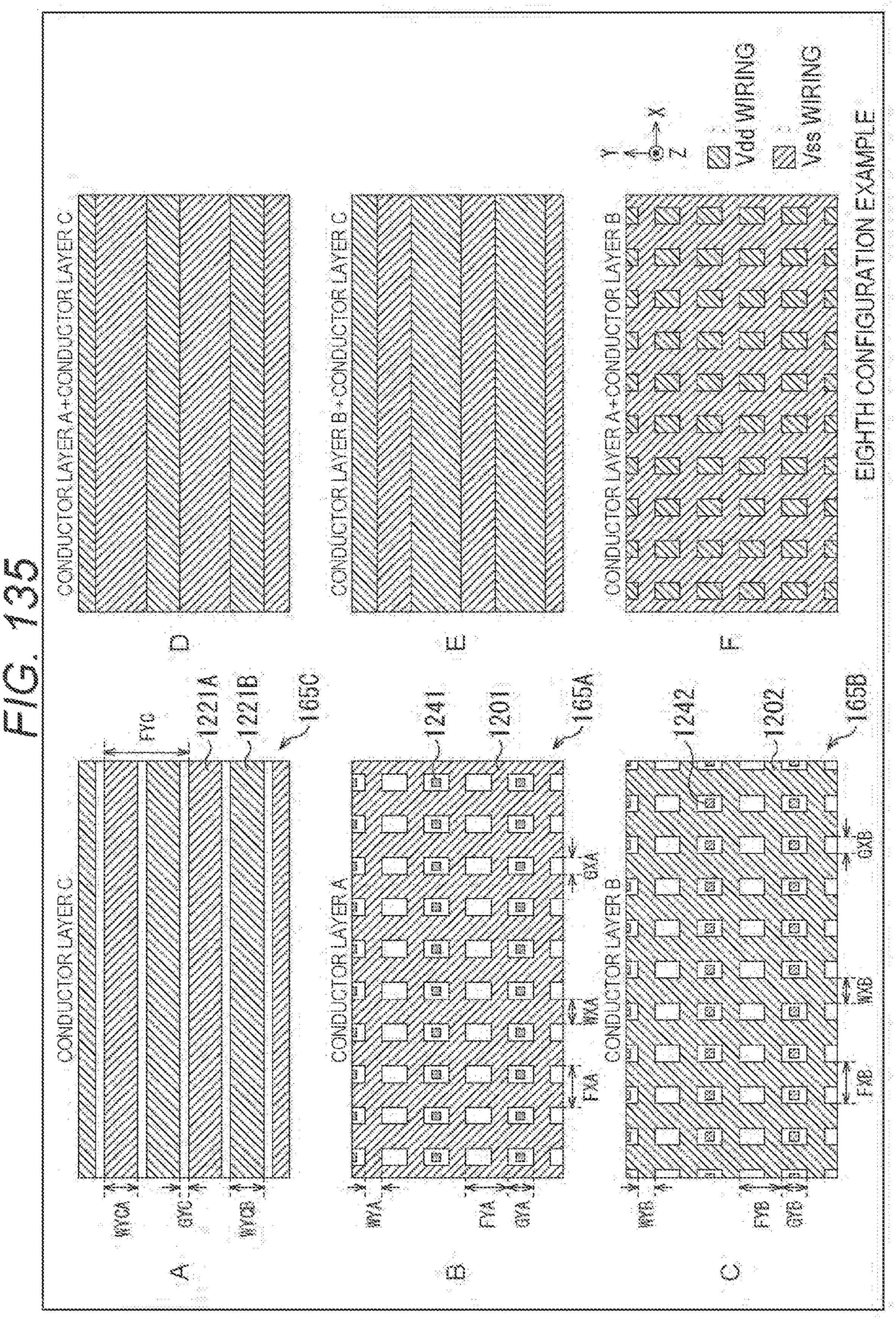

FIG. 135 is diagrams illustrating an eighth configuration example of the three-layer conductor layer.

Figure 136:
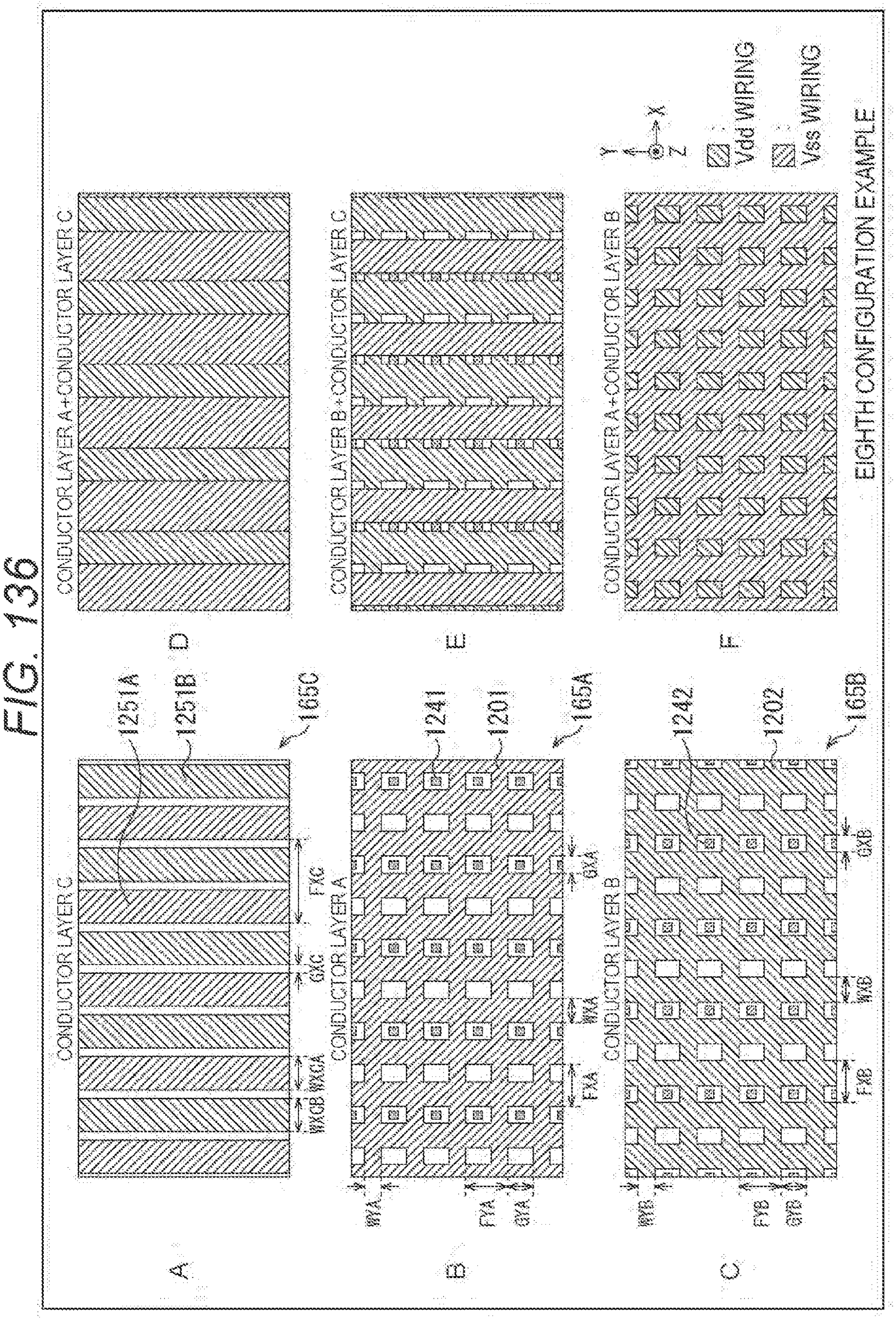

FIG. 136 is diagrams illustrating a first modification of the eighth configuration example of the three-layer conductor layer.

Figure 137:
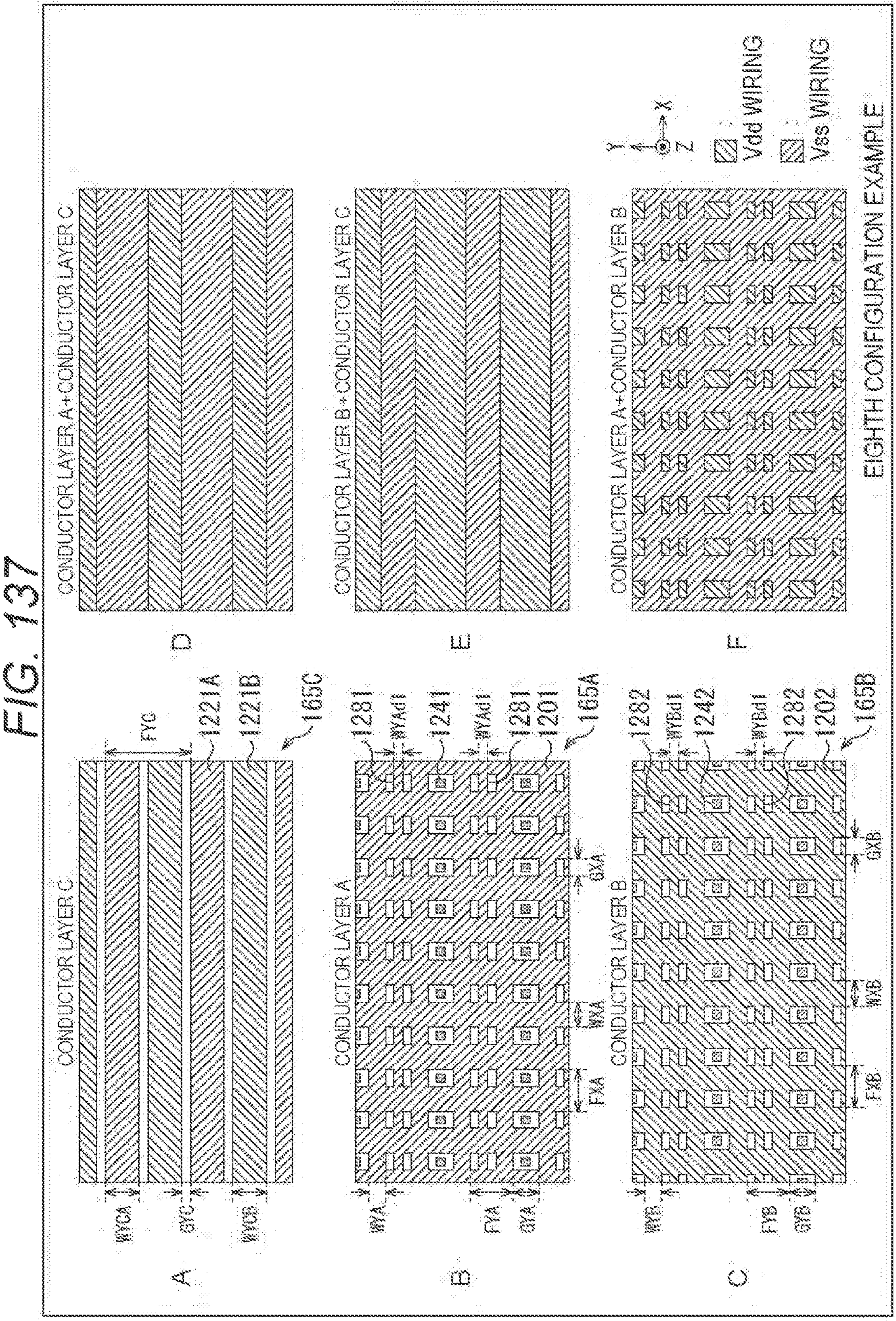

FIG. 137 is diagrams illustrating a second modification of the eighth configuration example of the three-layer conductor layer.

Figure 138:
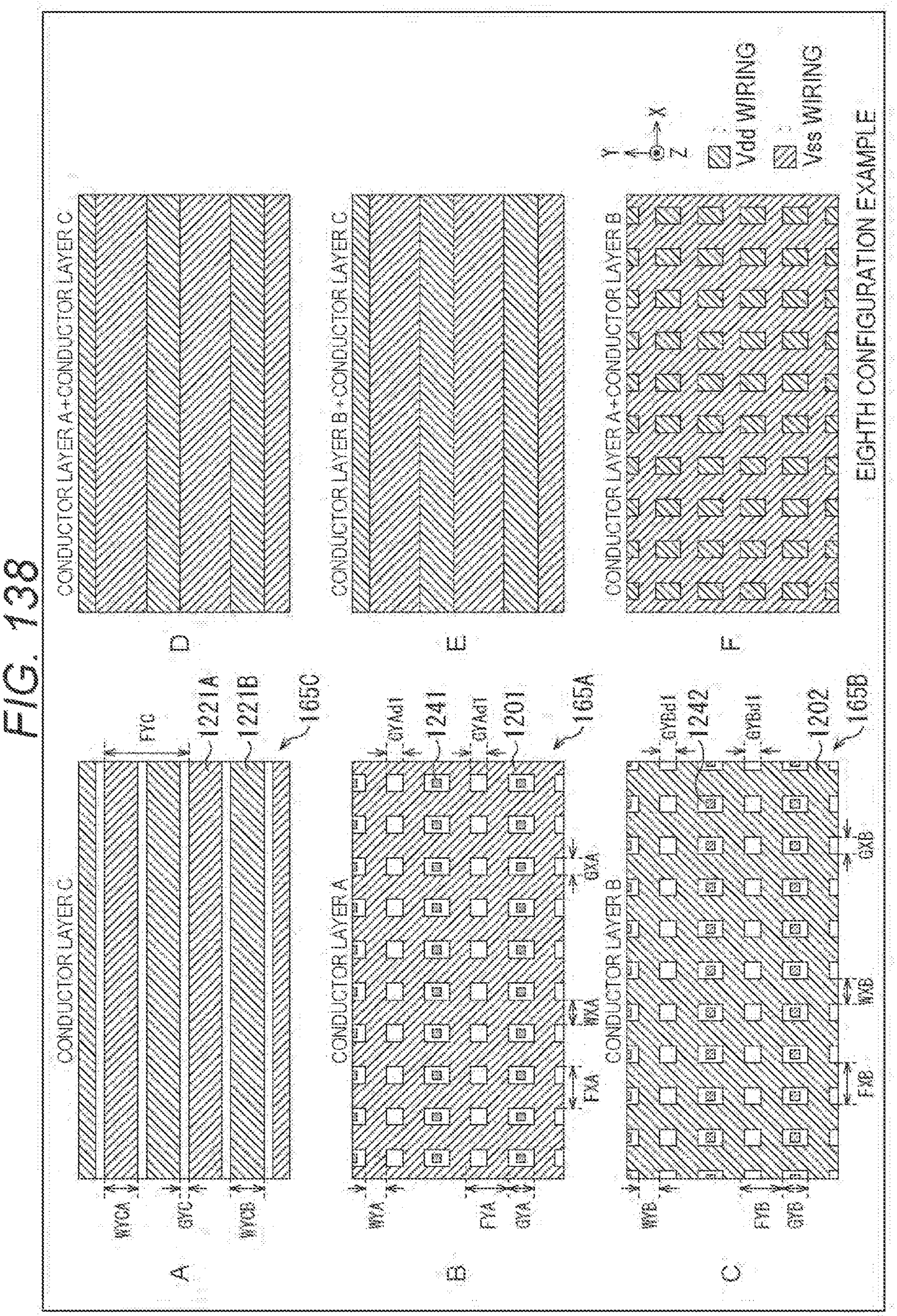

FIG. 138 is diagrams illustrating a third modification of the eighth configuration example of the three-layer conductor layer.

Figure 139:
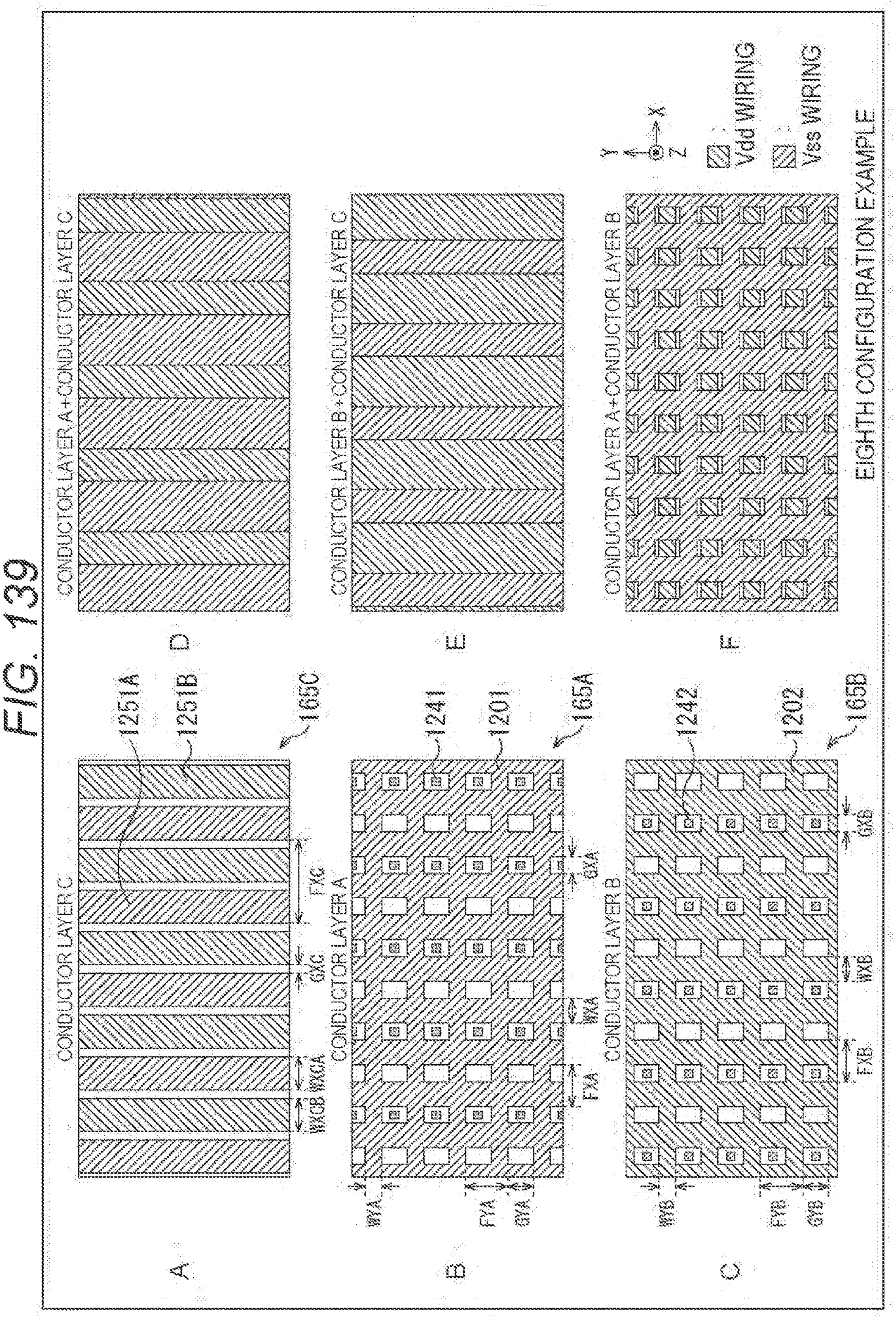

FIG. 139 is diagrams illustrating a fourth modification of the eighth configuration example of the three-layer conductor layer.

Figure 140:
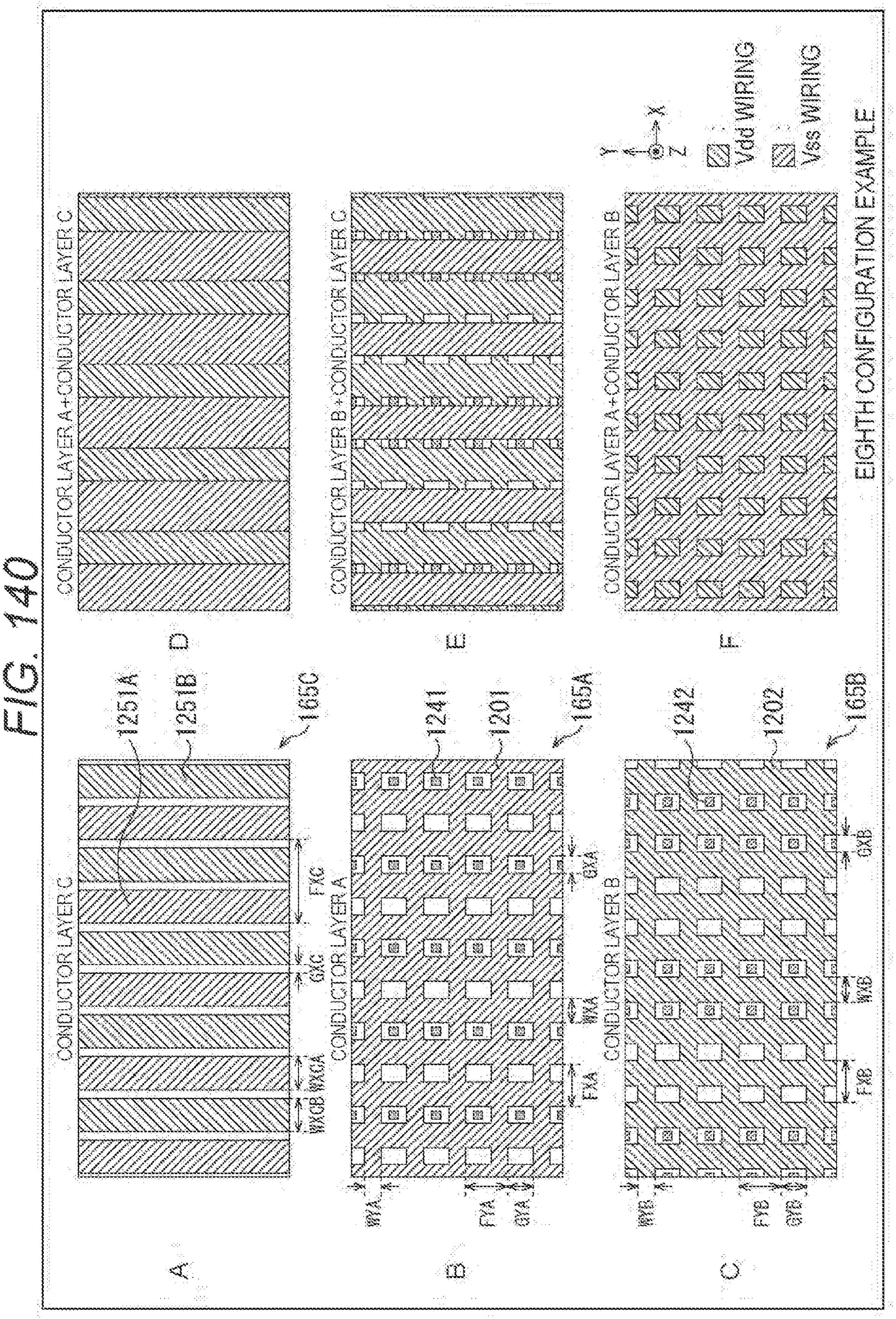

FIG. 140 is diagrams illustrating a fifth modification of the eighth configuration example of the three-layer conductor layer.

Figure 141:
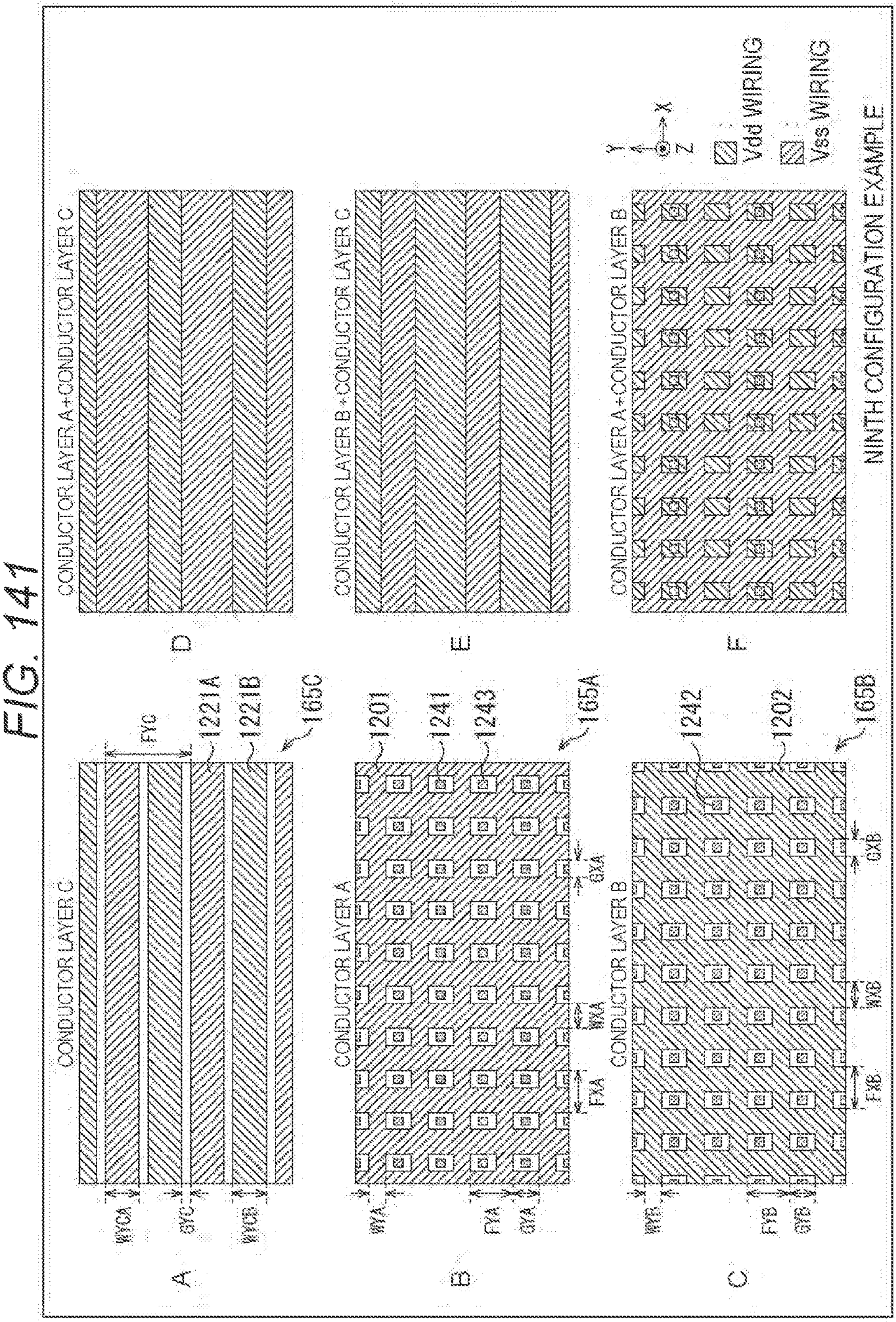

FIG. 141 is diagrams illustrating a ninth configuration example of the three-layer conductor layer.

Figure 142:
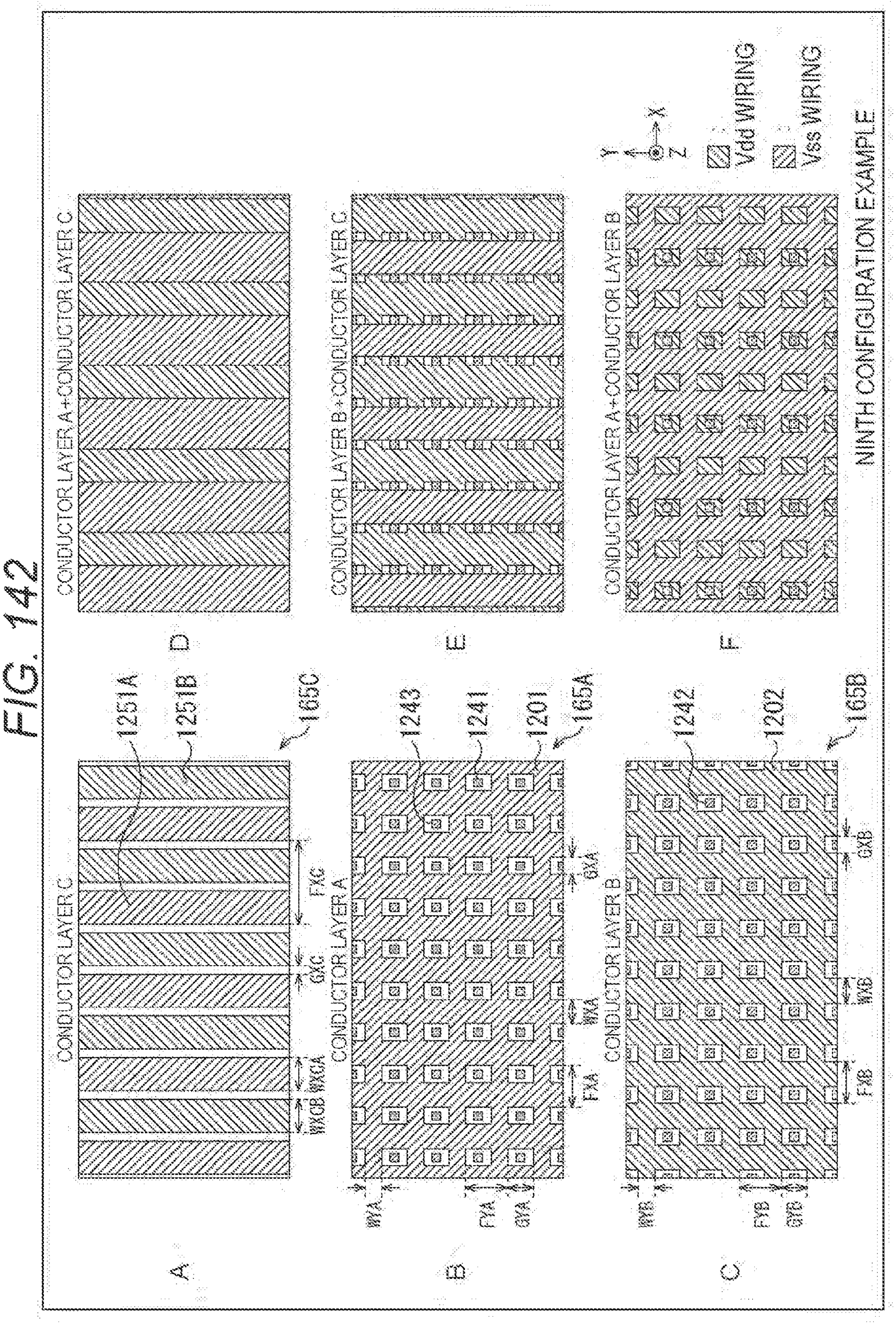

FIG. 142 is diagrams illustrating a first modification of the ninth configuration example of the three-layer conductor layer.

Figure 143:
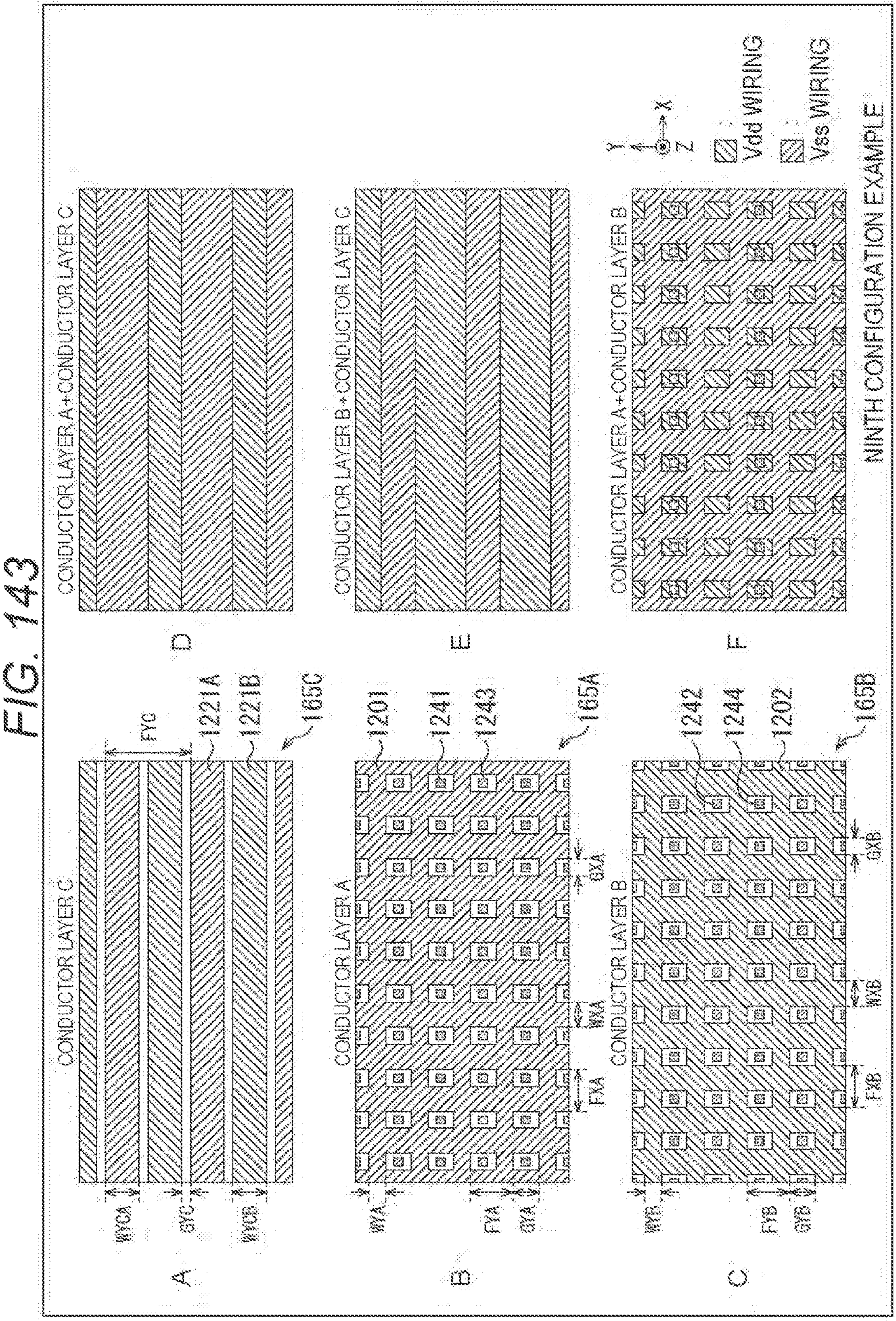

FIG. 143 is diagrams illustrating a second modification of the ninth configuration example of the three-layer conductor layer.

Figure 144:
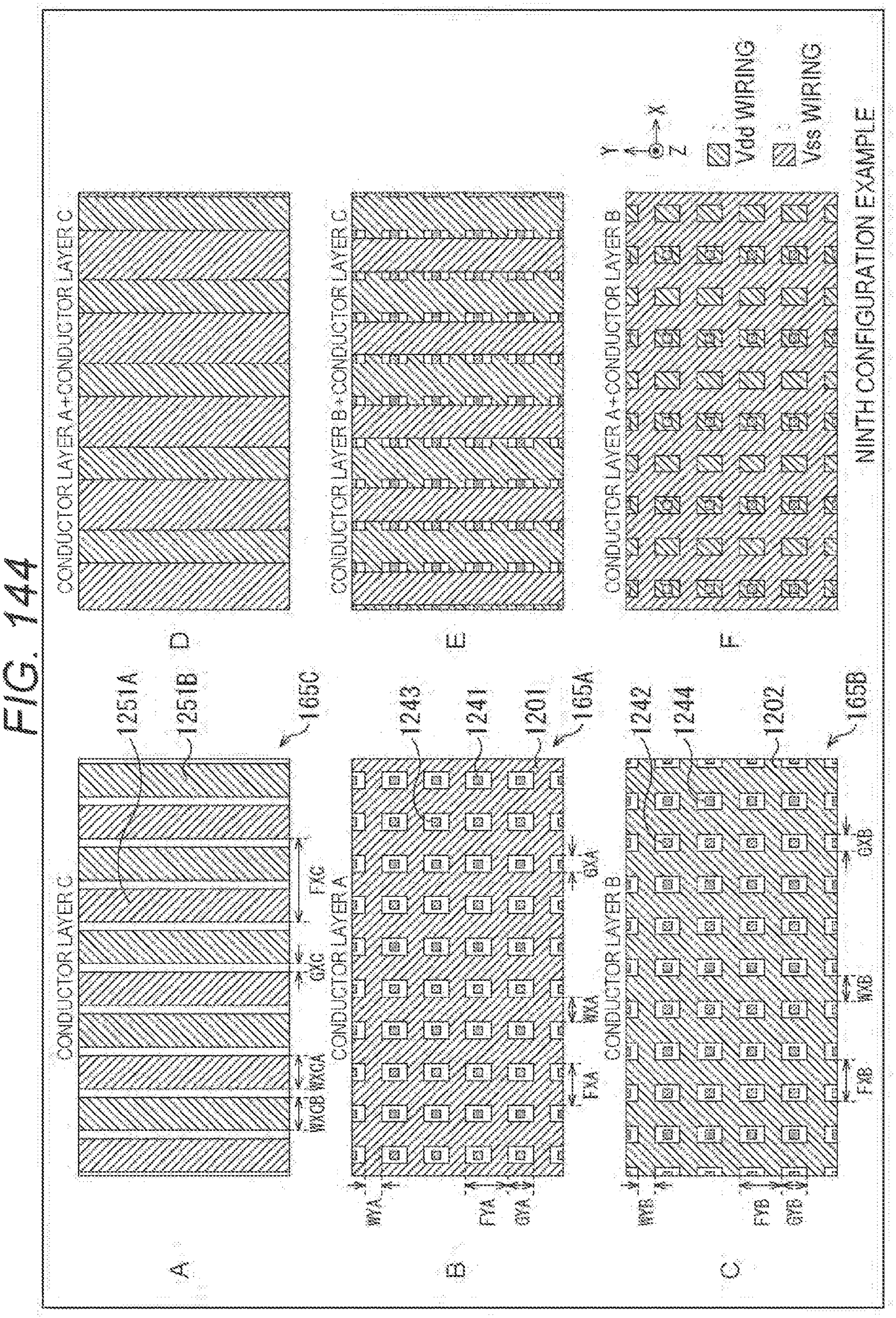

FIG. 144 is diagrams illustrating a third modification of the ninth configuration example of the three-layer conductor layer.

Figure 145:
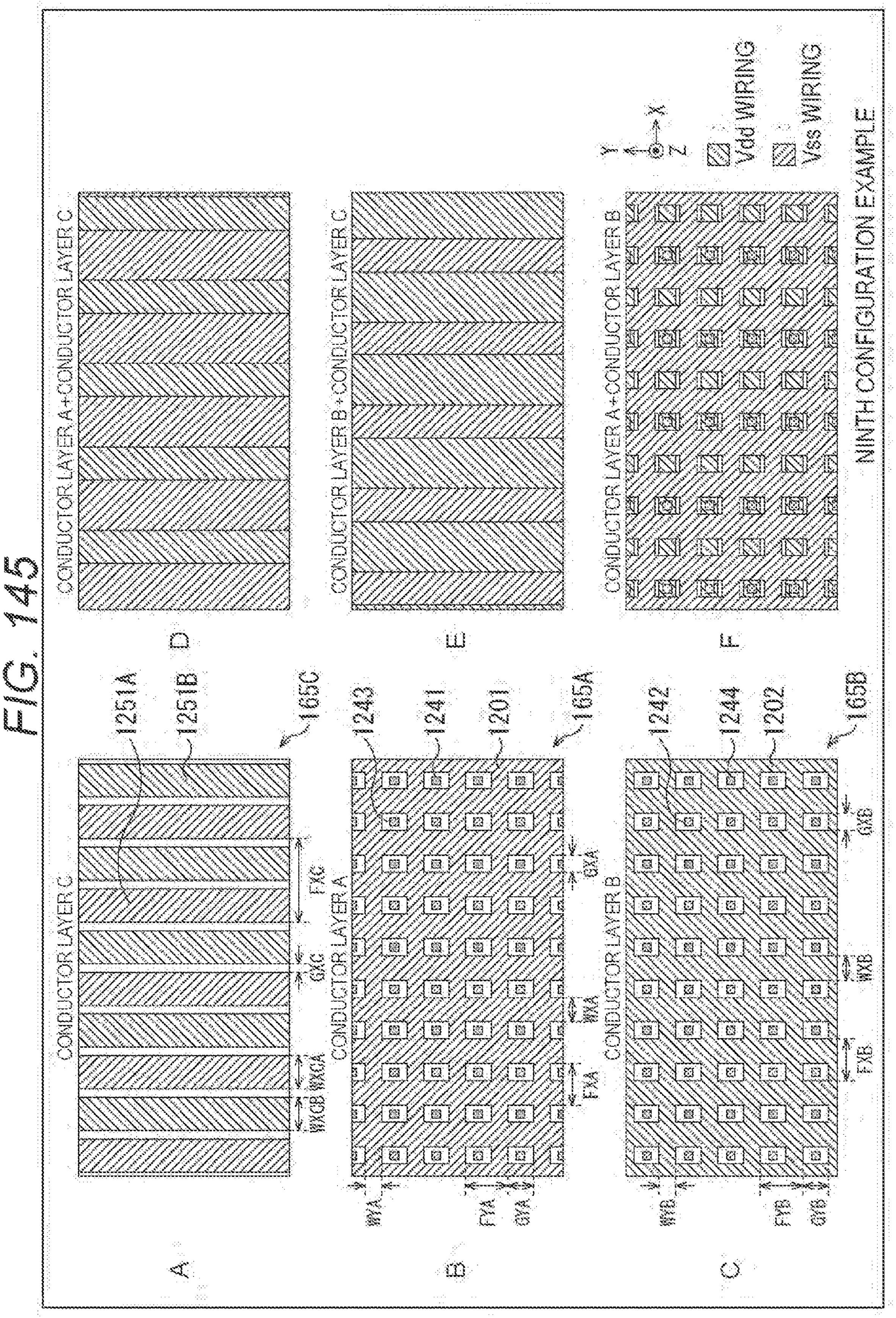

FIG. 145 is diagrams illustrating a fourth modification of the ninth configuration example of the three-layer conductor layer.

Figure 146:
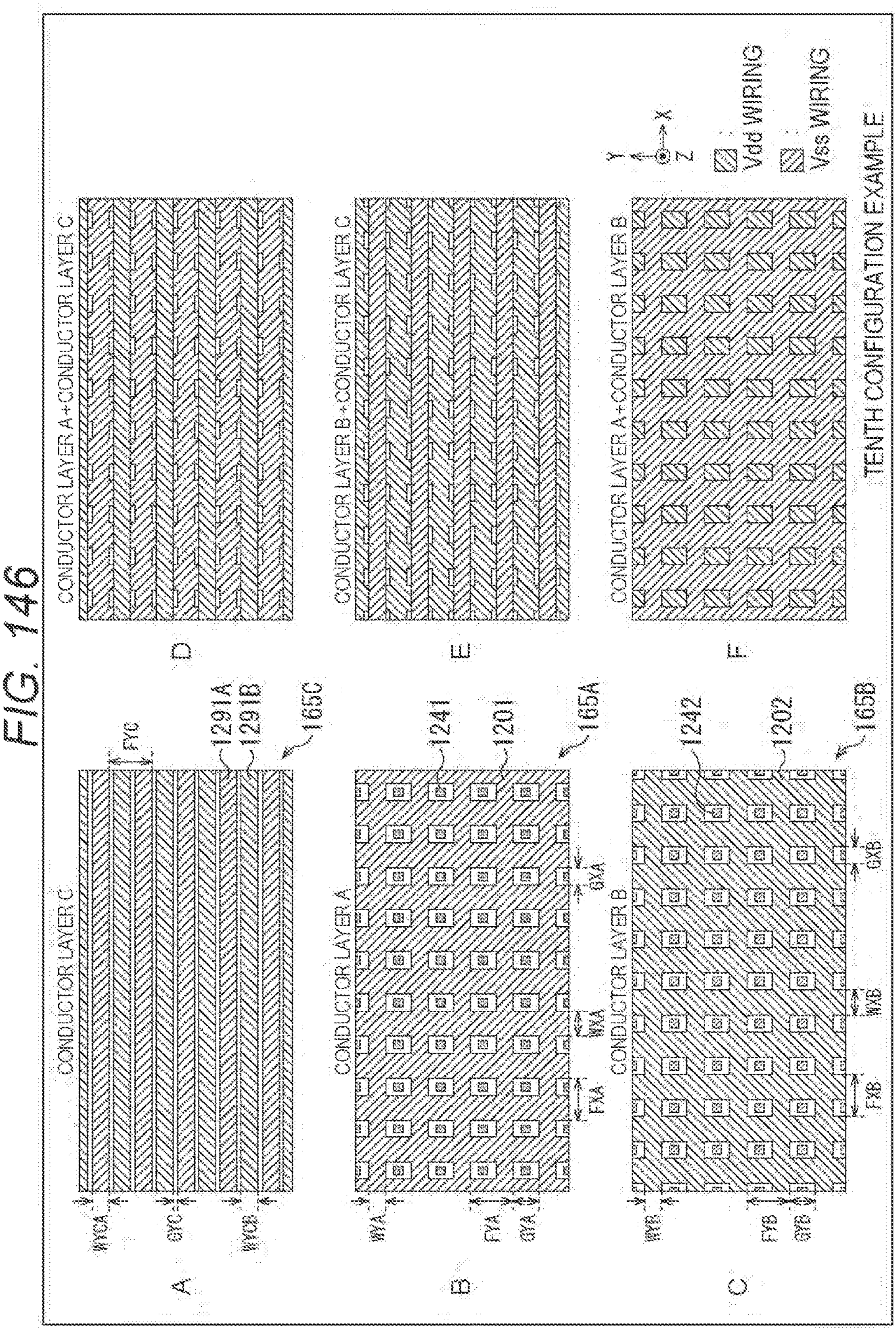

FIG. 146 is diagrams illustrating a tenth configuration example of the three-layer conductor layer.

Figure 147:
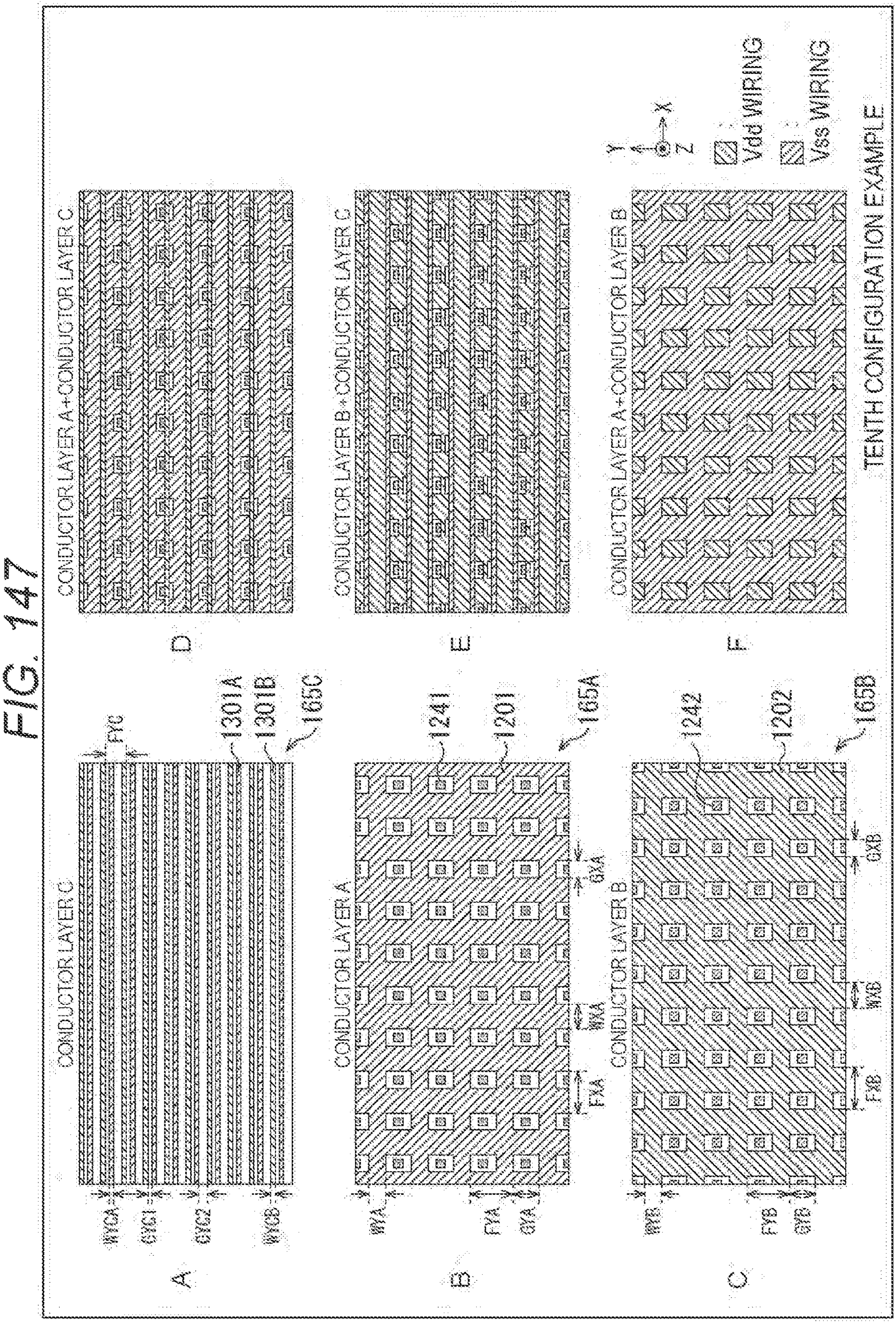

FIG. 147 is diagrams illustrating a modification of the tenth configuration example of the three-layer conductor layer.

Figure 148:
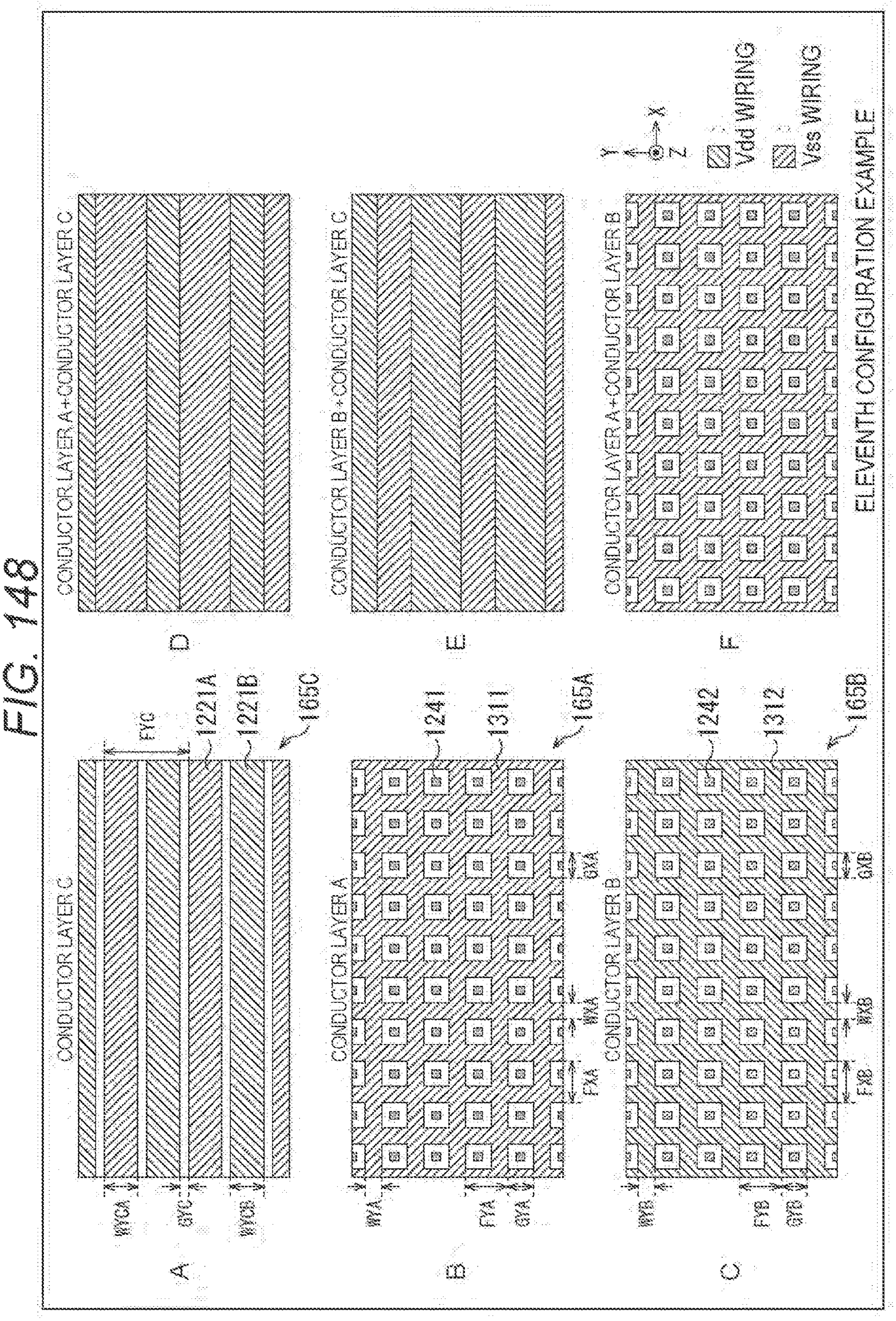

FIG. 148 is diagrams illustrating an eleventh configuration example of the three-layer conductor layer.

Figure 149:
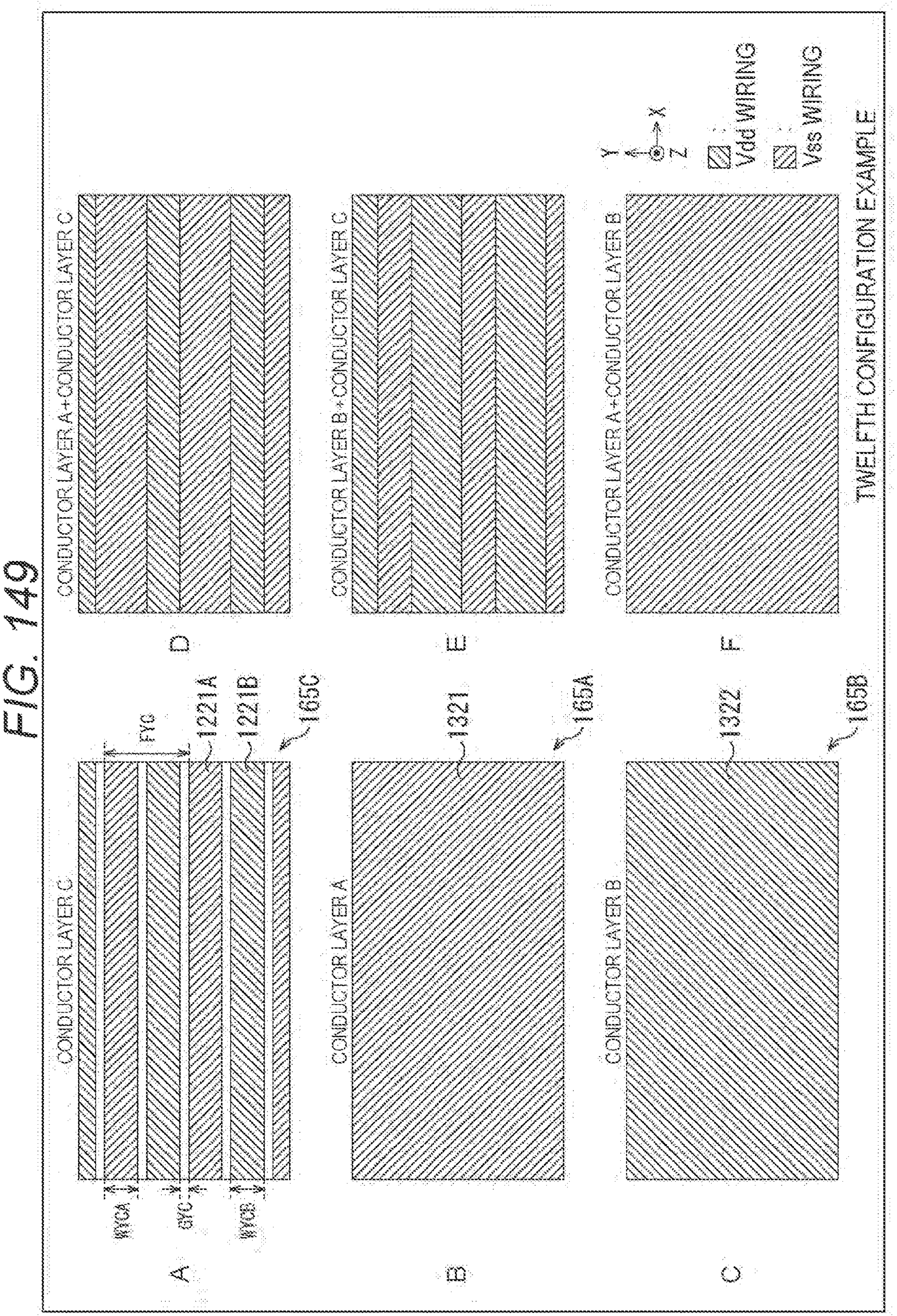

FIG. 149 is diagrams illustrating a twelfth configuration example of the three-layer conductor layer.

Figure 150:
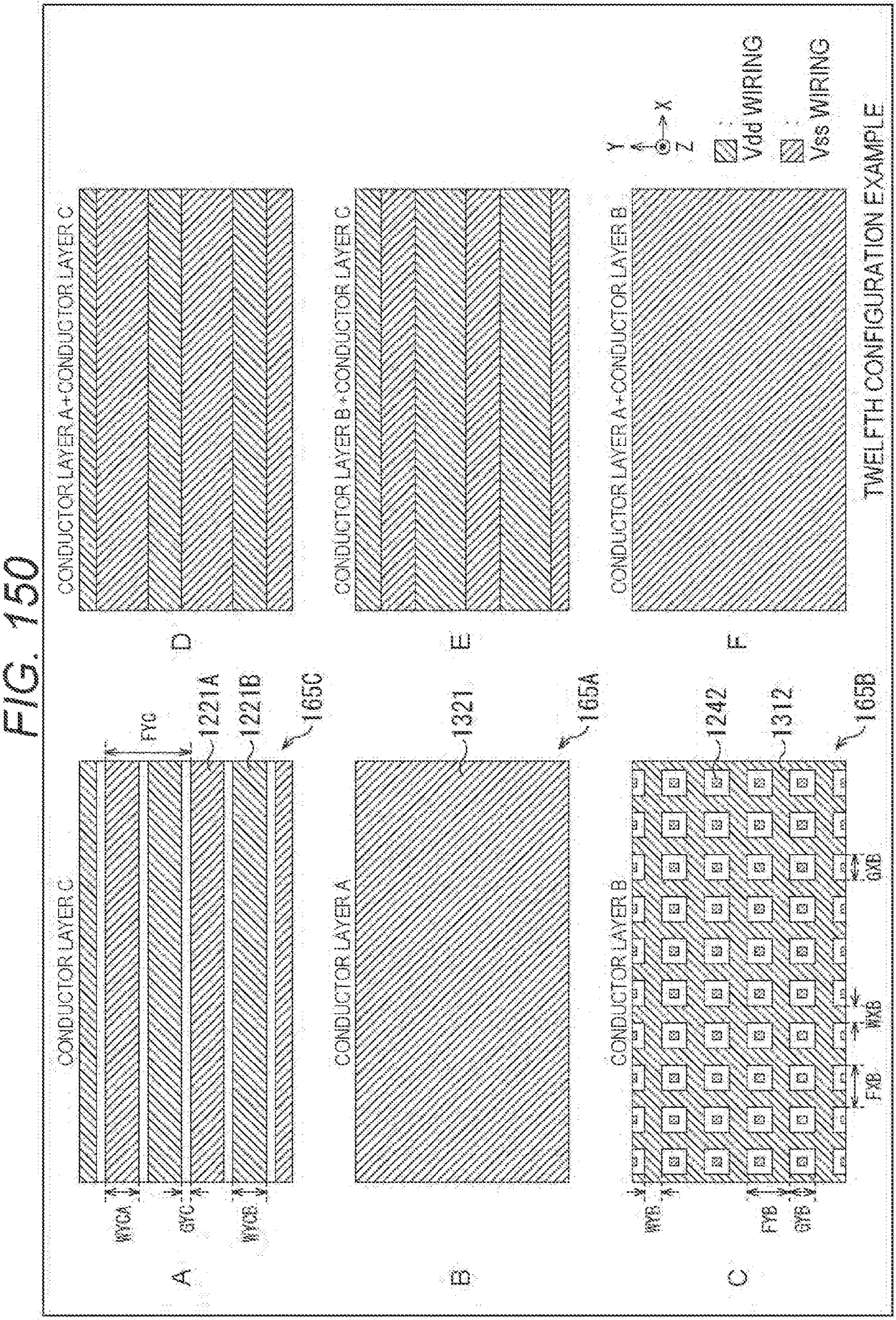

FIG. 150 is diagrams illustrating a first modification of the twelfth configuration example of the three-layer conductor layer.

Figure 151:
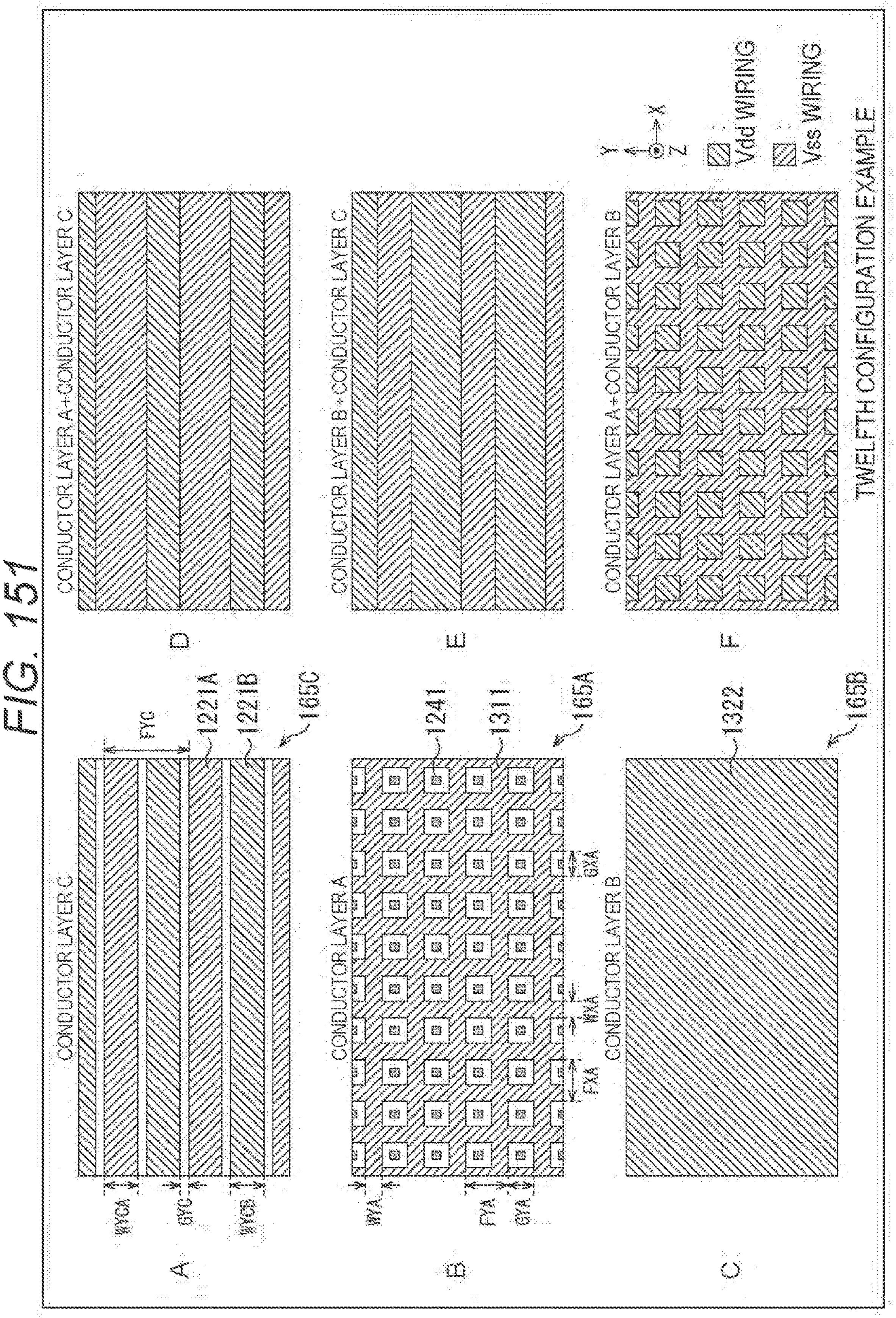

FIG. 151 is diagrams illustrating a second modification of the twelfth configuration example of the three-layer conductor layer.

Figure 152:
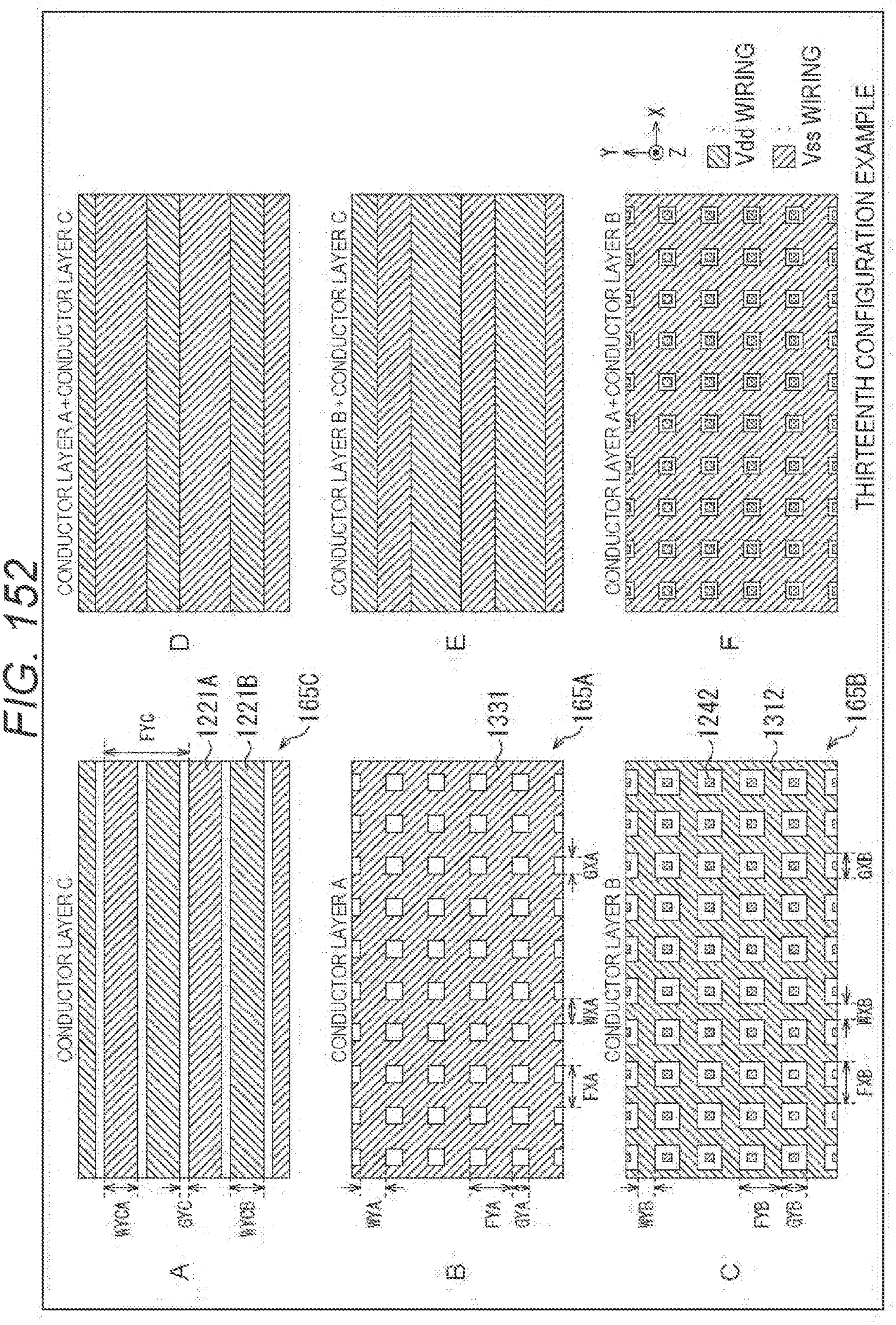

FIG. 152 is diagrams illustrating a thirteenth configuration example of the three-layer conductor layer.

Figure 153:
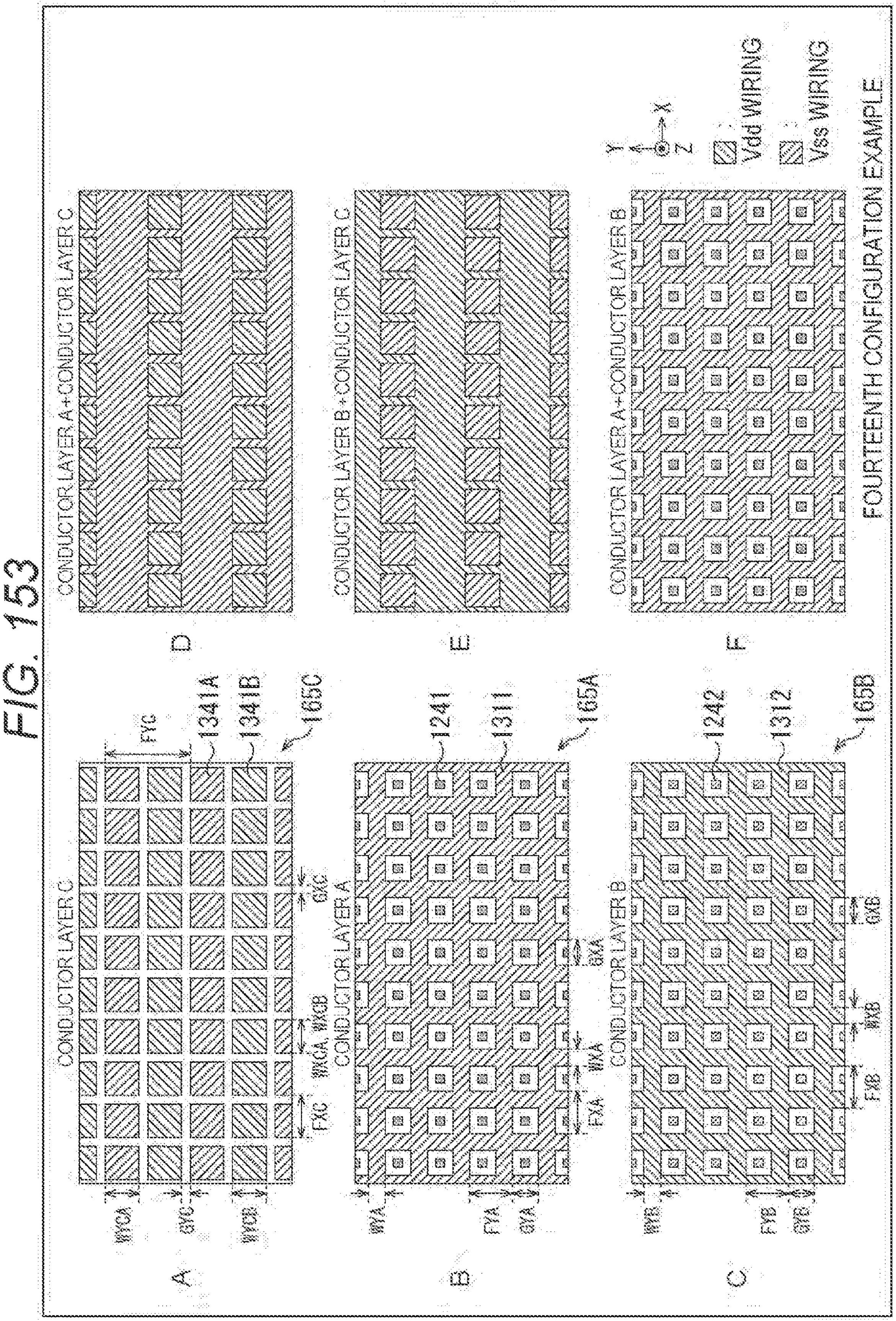

FIG. 153 is diagrams illustrating a fourteenth configuration example of the three-layer conductor layer.

Figure 154:
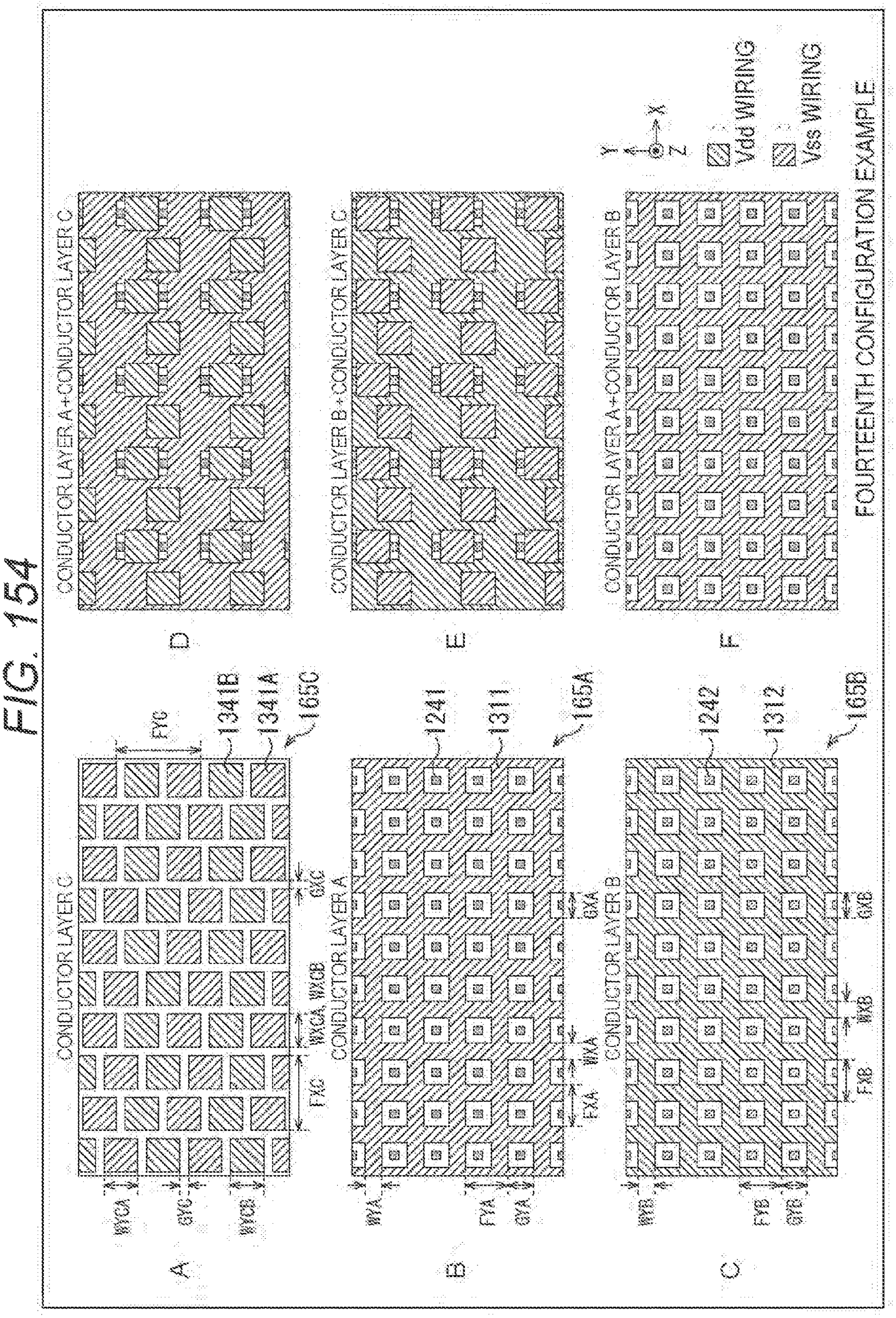

FIG. 154 is diagrams illustrating a first modification of the fourteenth configuration example of the three-layer conductor layer.

Figure 155:
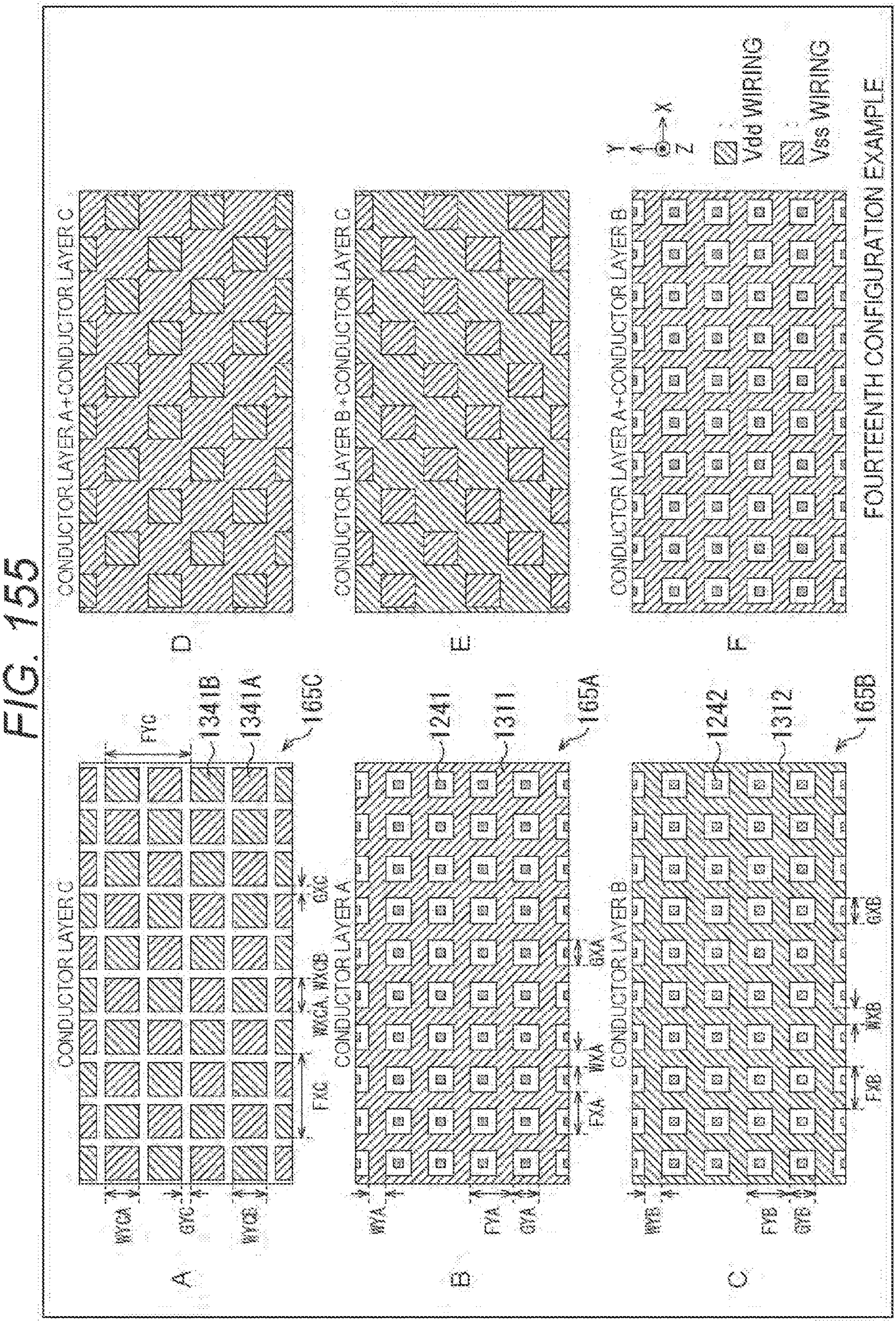

FIG. 155 is diagrams illustrating a second modification of the fourteenth configuration example of the three-layer conductor layer.

Figure 156:
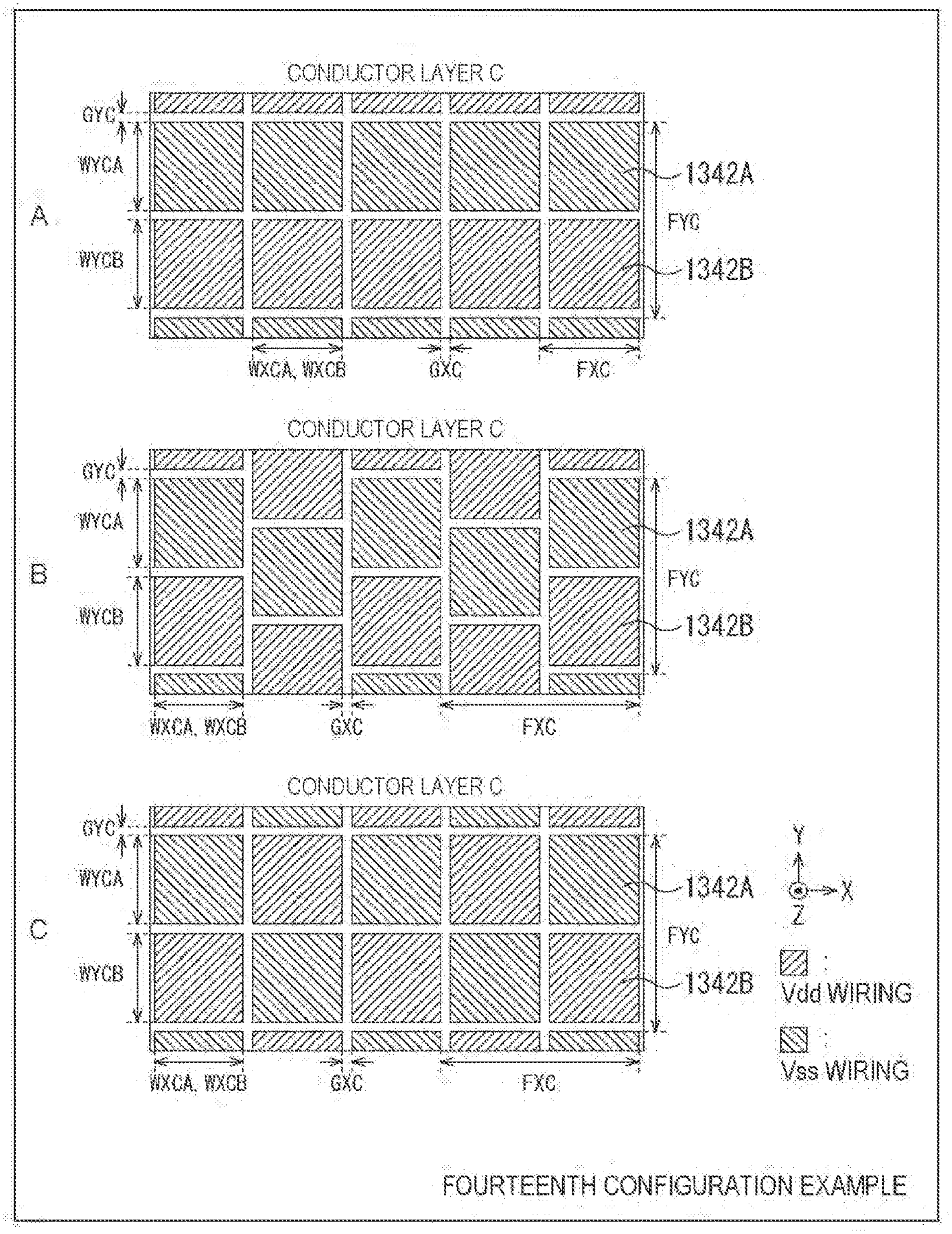

FIG. 156 is diagrams illustrating a third modification to a fifth modification of the fourteenth configuration example of the three-layer conductor layer.

Figure 157:
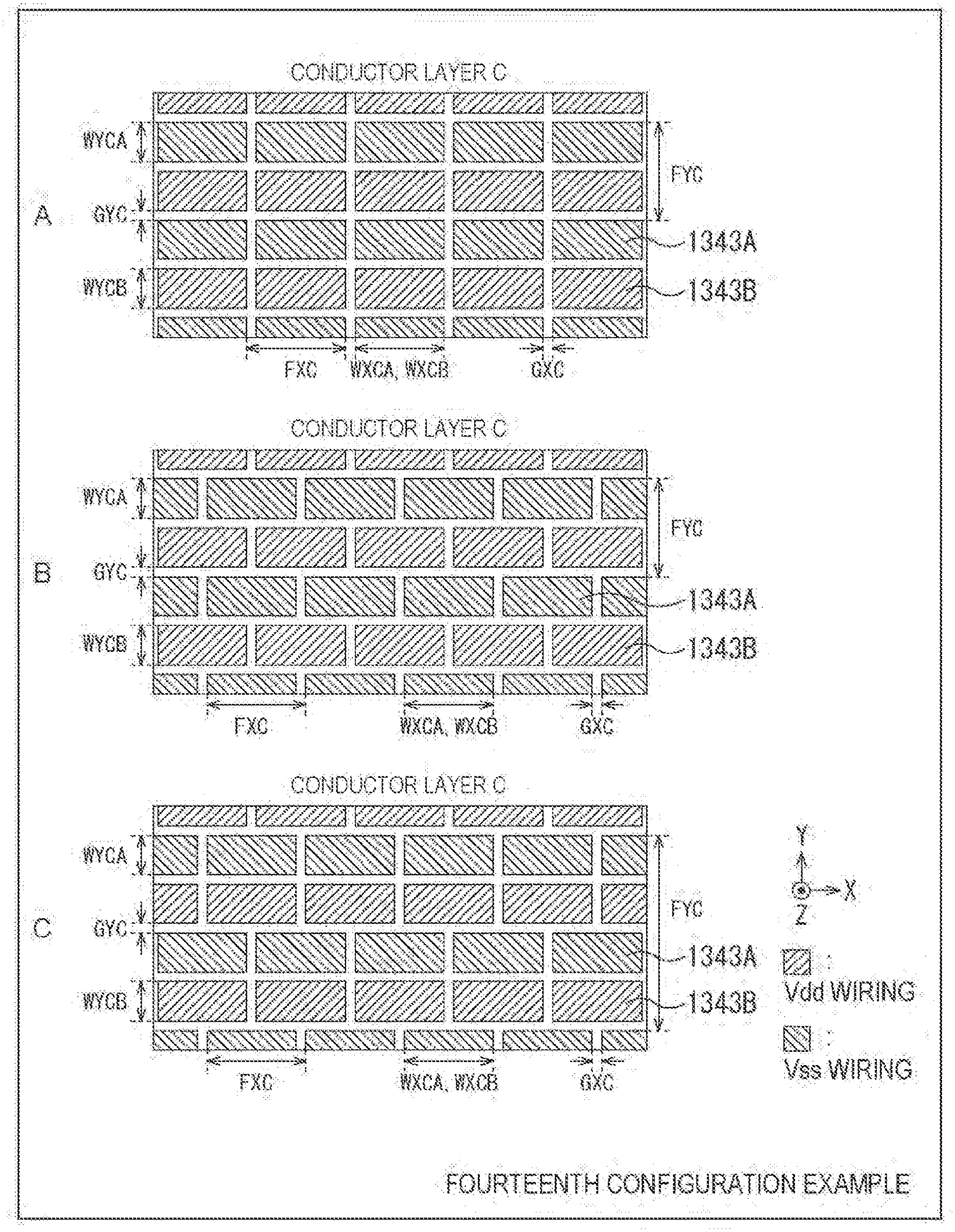

FIG. 157 is diagrams illustrating a sixth modification to an eighth modification of the fourteenth configuration example of the three-layer conductor layer.

Figure 158:
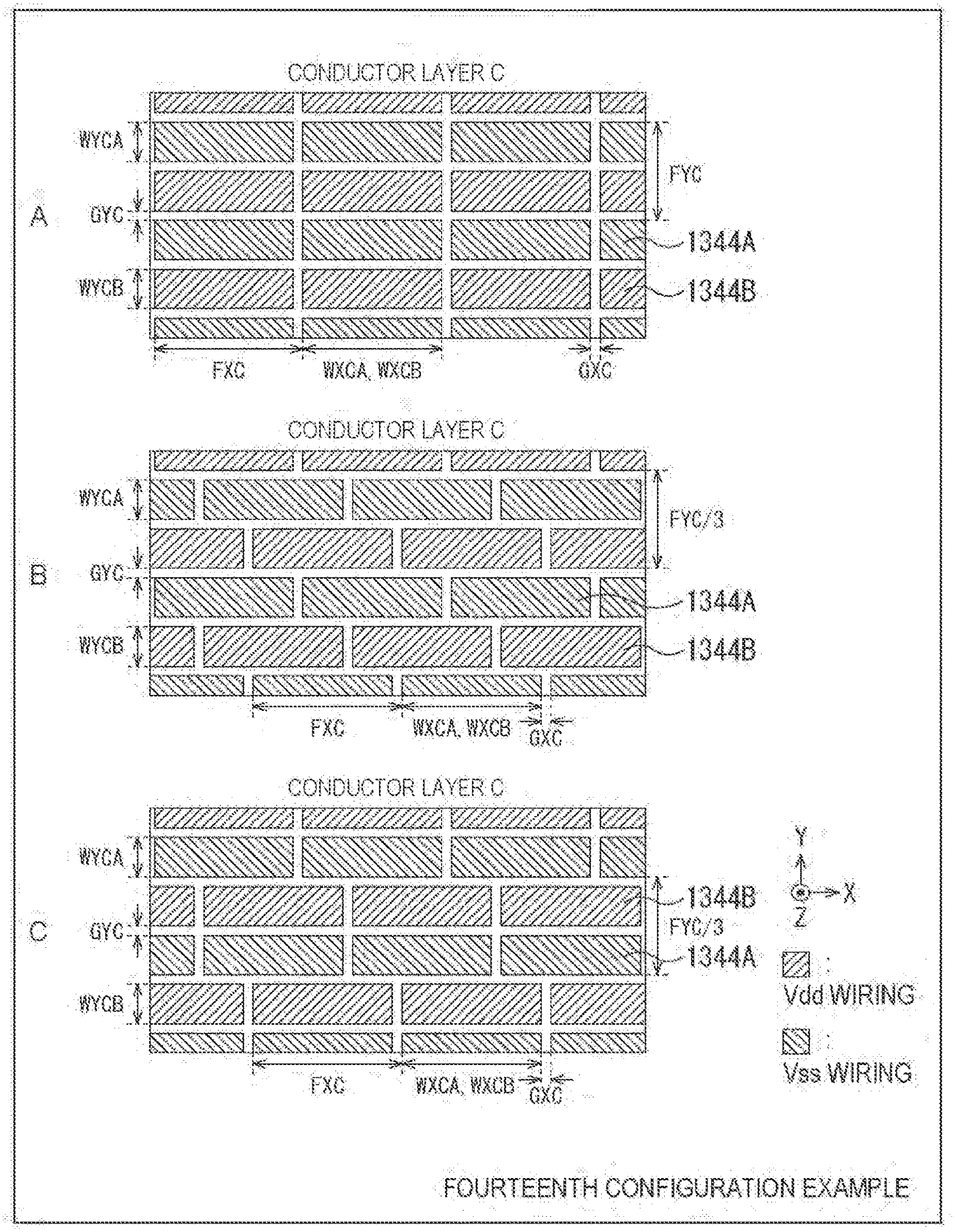

FIG. 158 is diagrams illustrating a ninth modification to an eleventh modification of the fourteenth configuration example of the three-layer conductor layer.

Figure 159:
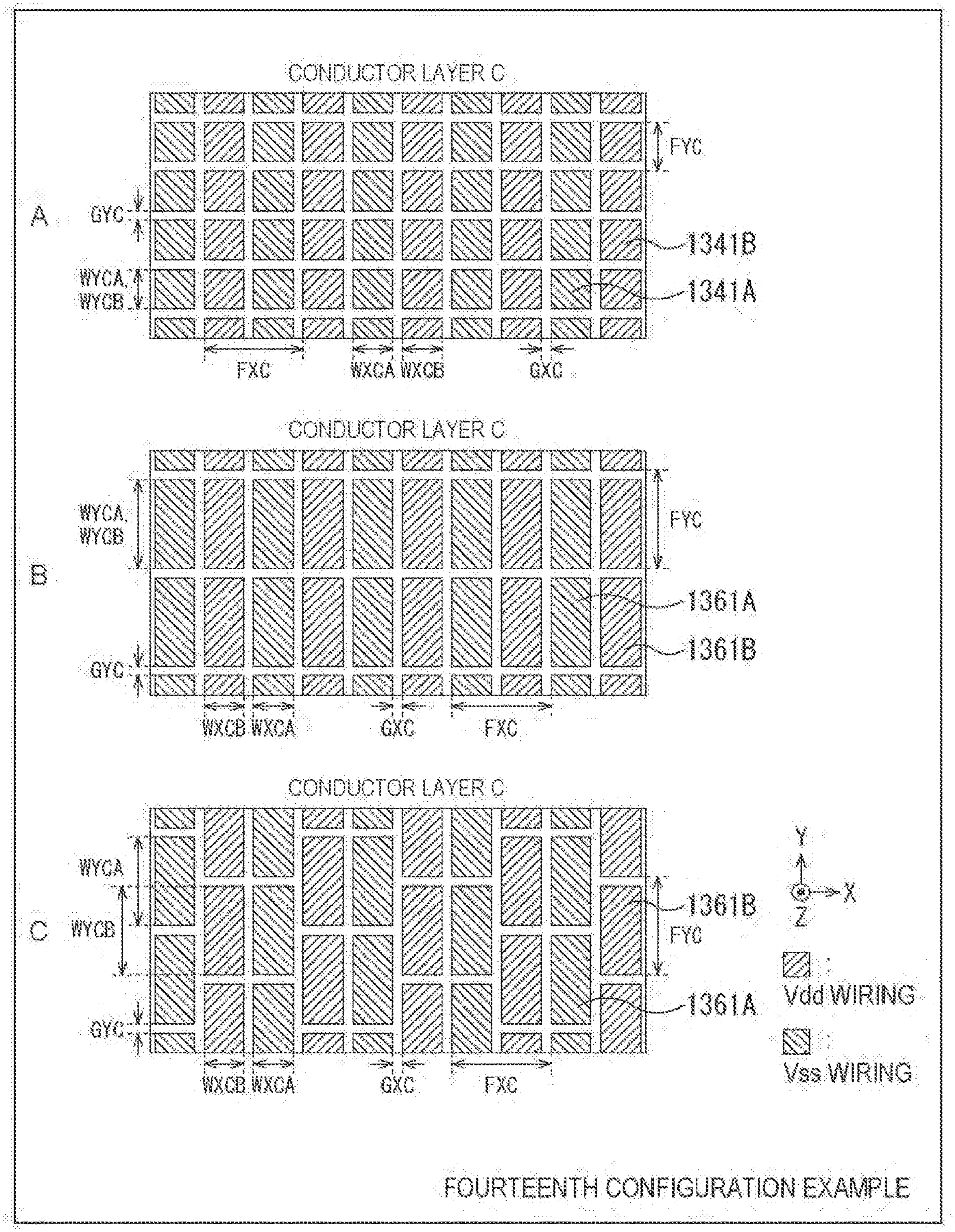

FIG. 159 is diagrams illustrating a twelfth modification to a fourteenth modification of the fourteenth configuration example of the three-layer conductor layer.

Figure 160:
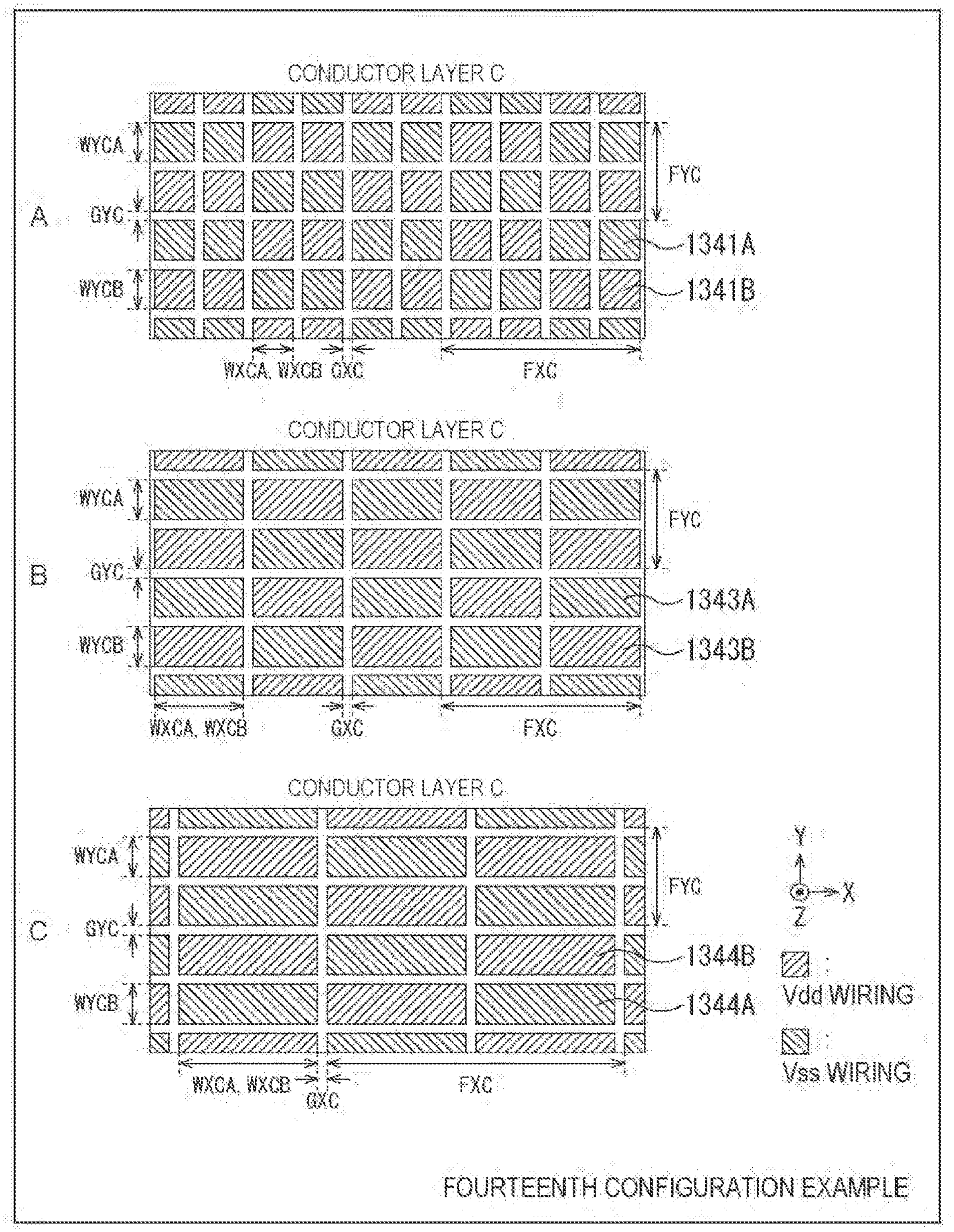

FIG. 160 is diagrams illustrating a fifteenth modification to a seventeenth modification of the fourteenth configuration example of the three-layer conductor layer.

Figure 161:
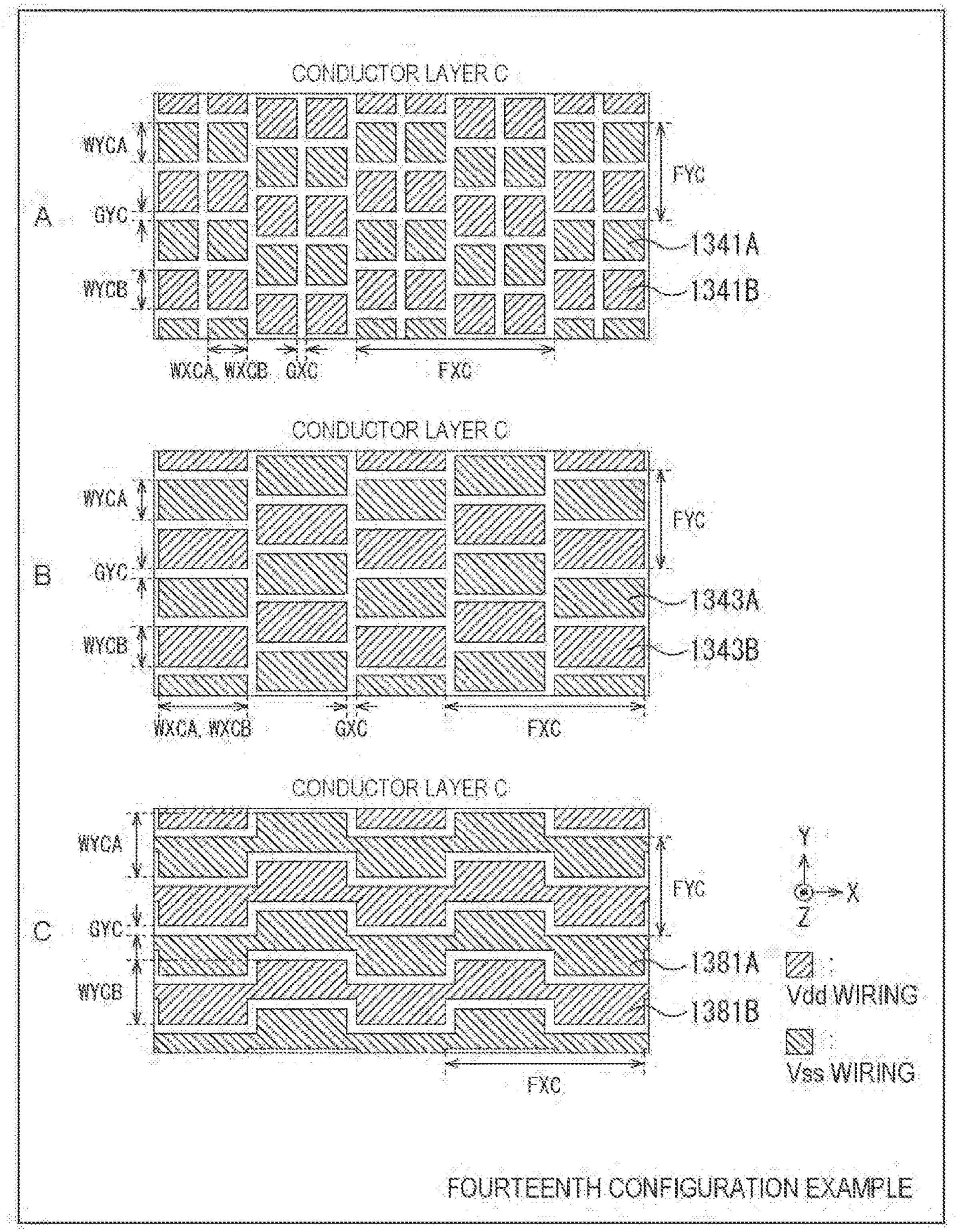

FIG. 161 is diagrams illustrating an eighteenth modification to a twentieth modification of the fourteenth configuration example of the three-layer conductor layer.

Figure 162:
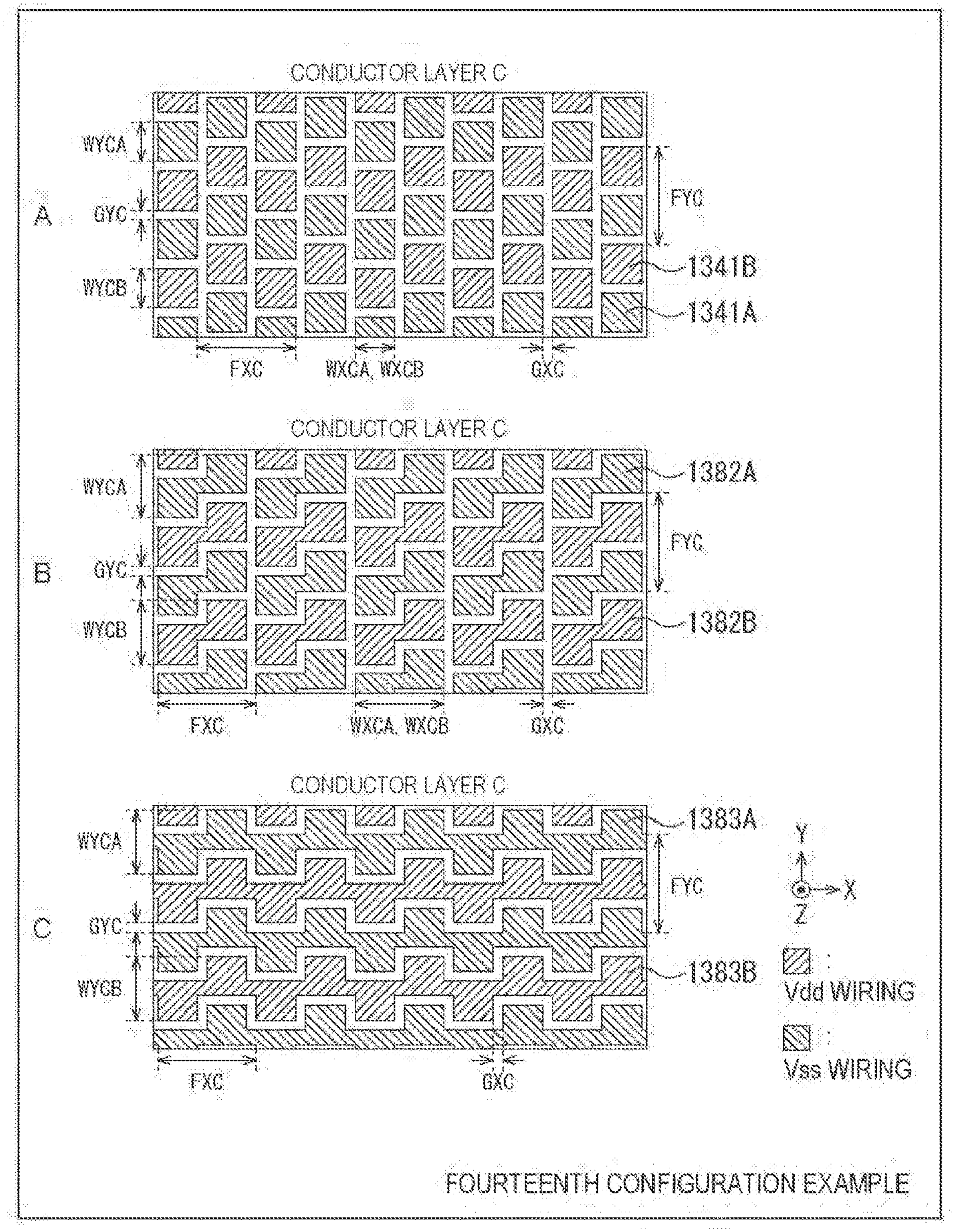

FIG. 162 is diagrams illustrating a twenty-first modification to a twenty-third modification of the fourteenth configuration example of the three-layer conductor layer.

Figure 163:
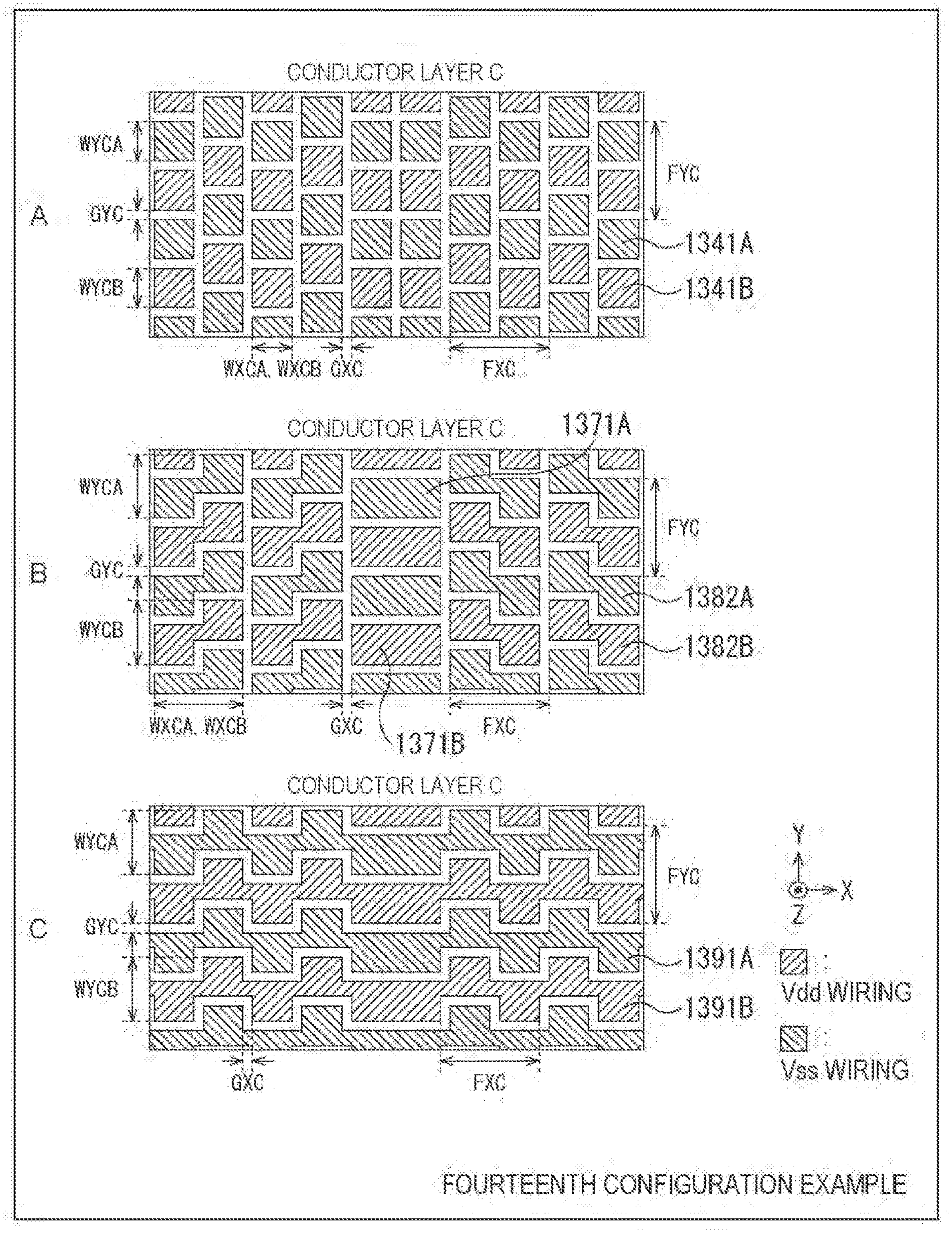

FIG. 163 is diagrams illustrating a twenty-fourth modification to a twenty-sixth modification of the fourteenth configuration example of the three-layer conductor layer.

Figure 164:
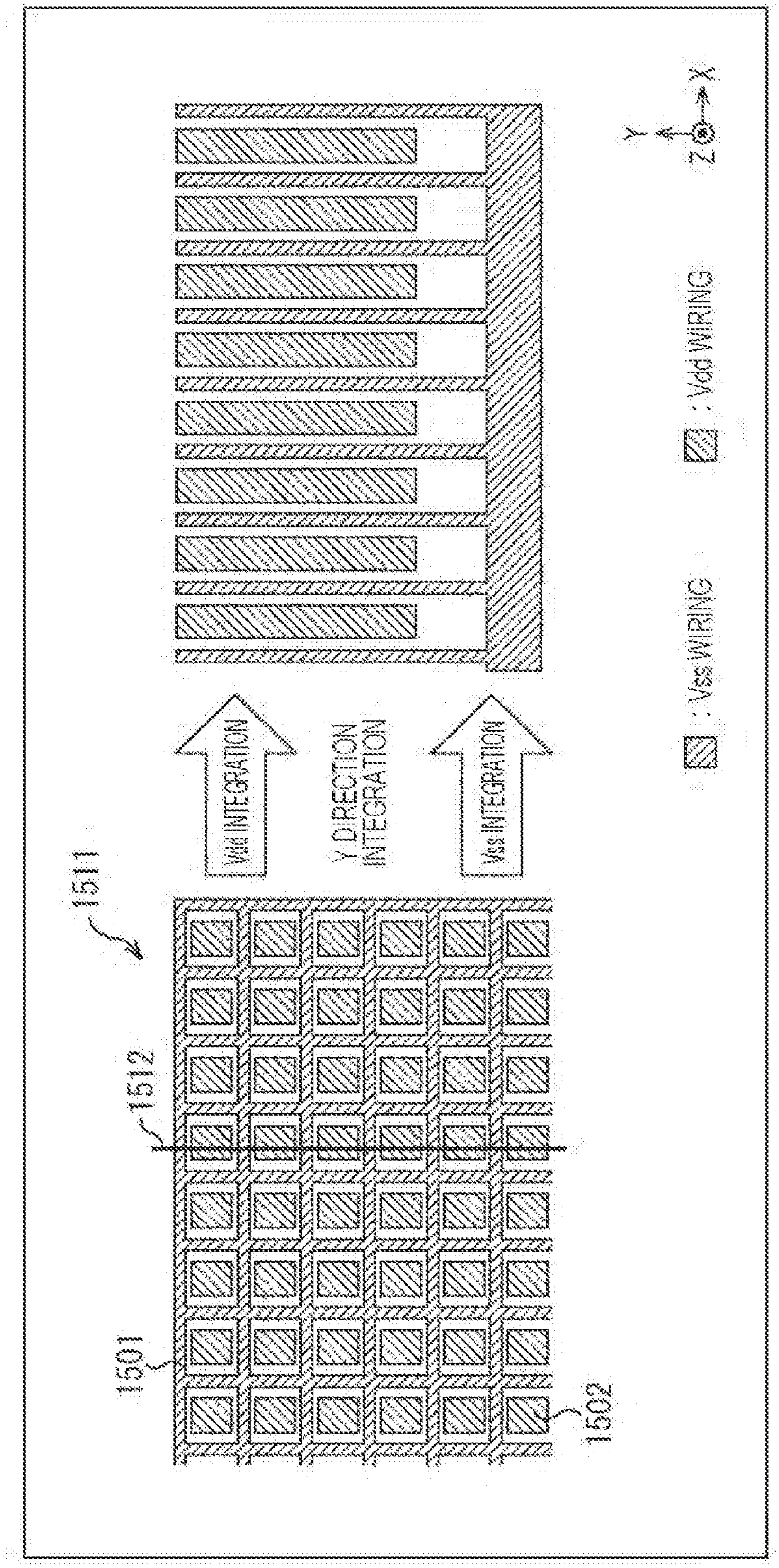

FIG. 164 is a diagram for describing capacitive noise of a reticulated conductor.

Figure 165:
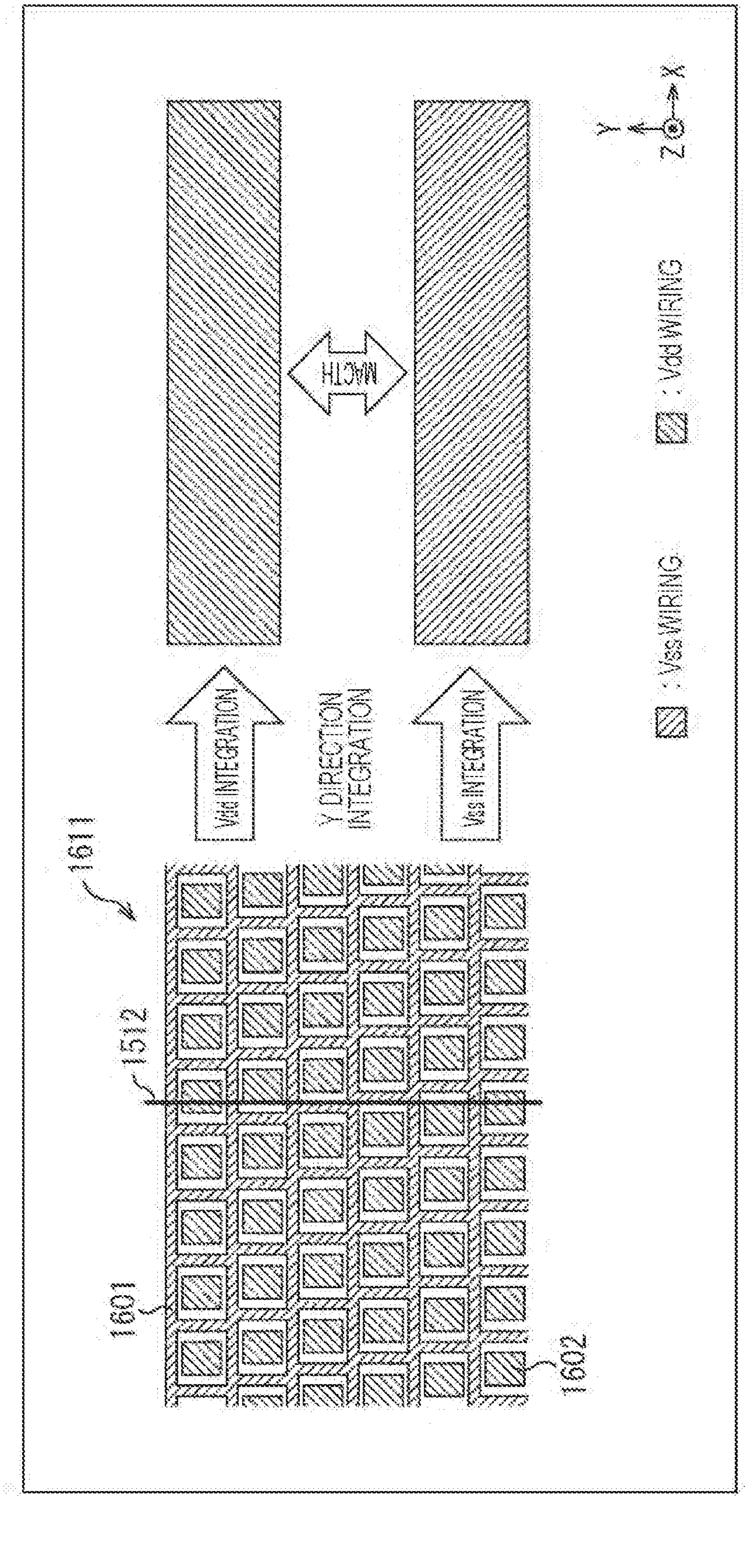

FIG. 165 is a diagram for describing capacitive noise of a reticulated conductor in which a predetermined amount of shift is set.

Figure 166:
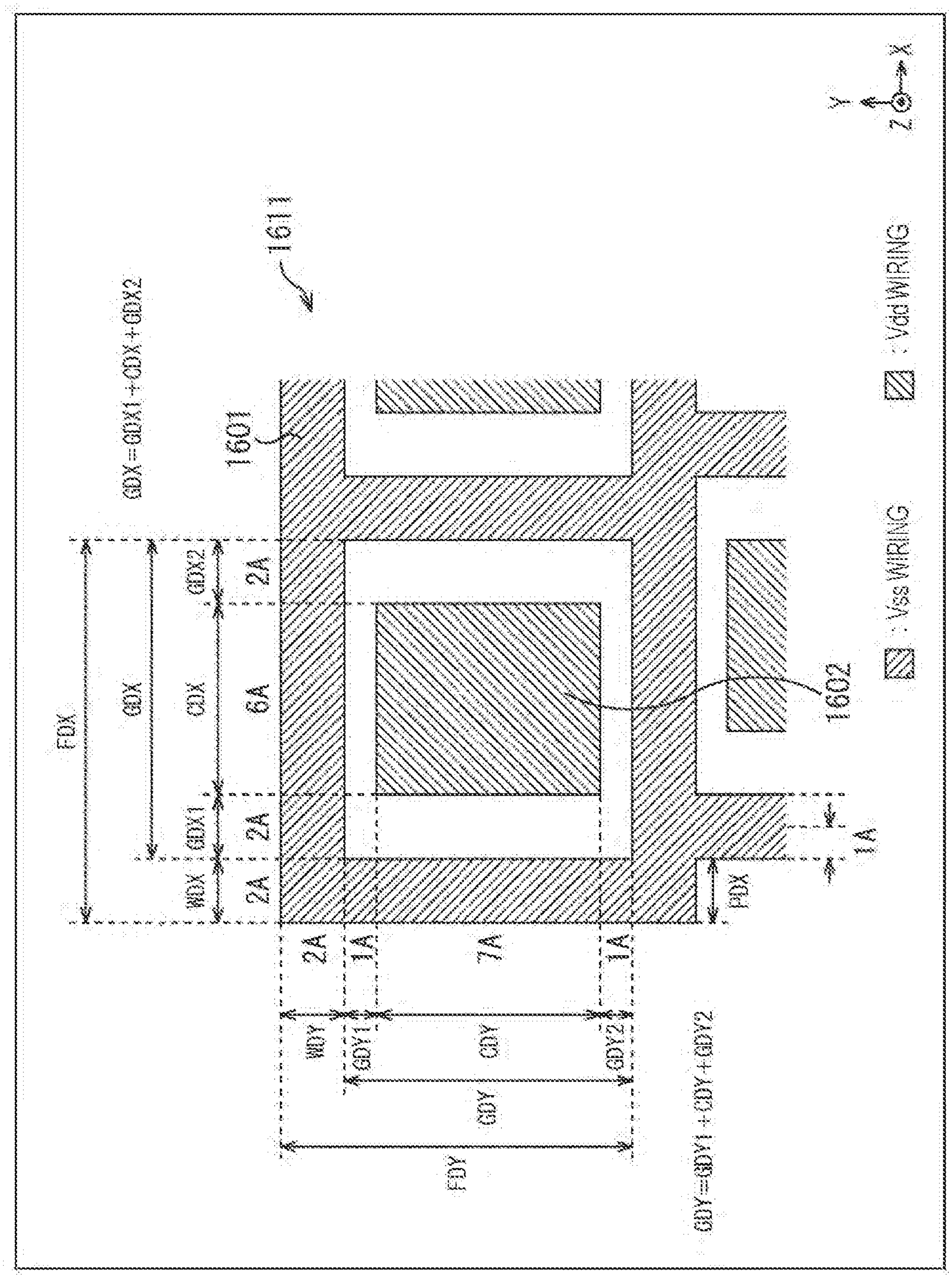

FIG. 166 is a view for describing a conductor width and a gap width of a first shift configuration example of the reticulated conductor.

Figure 167:
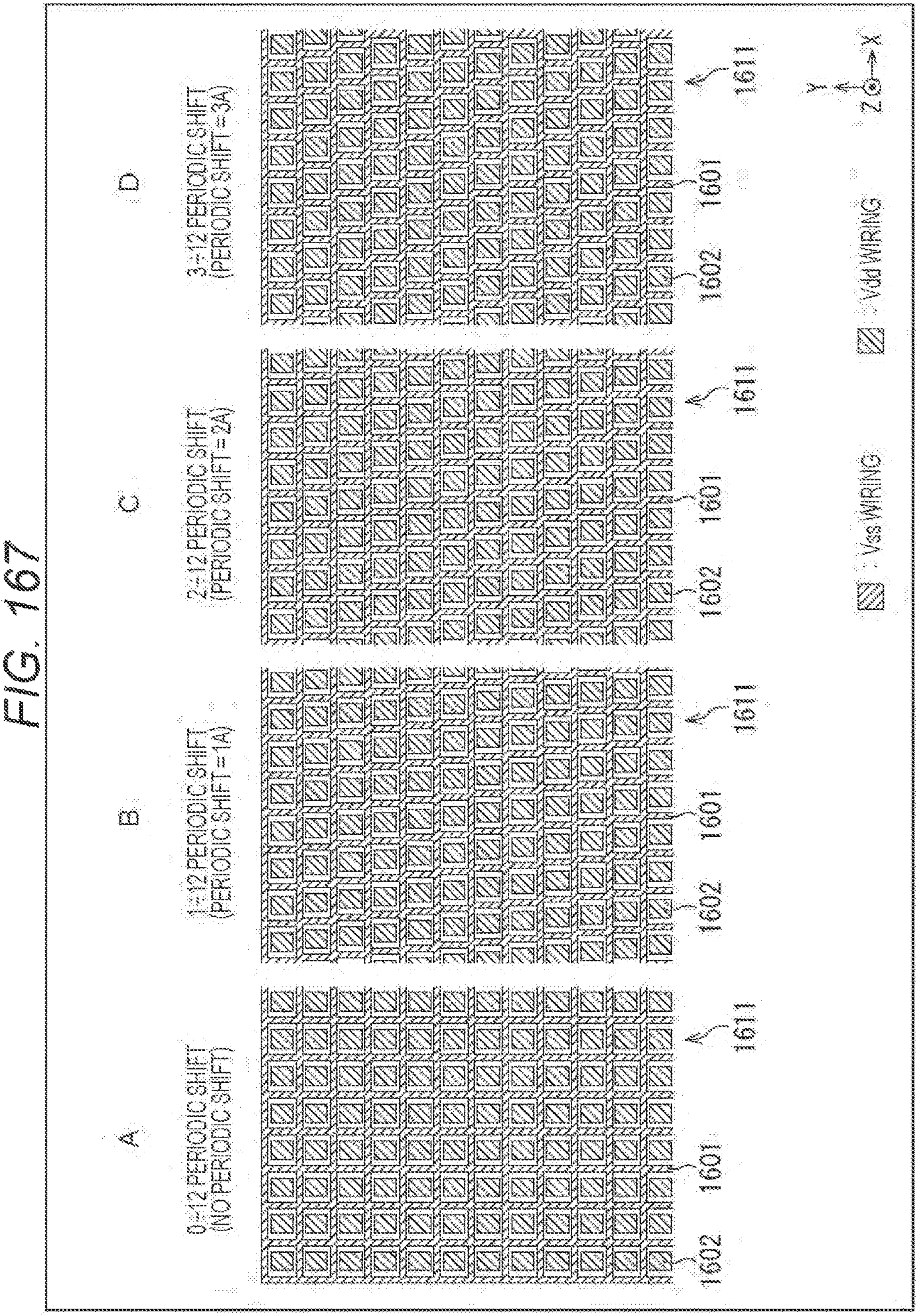

FIG. 167 is plan views of the first shift configuration example of the reticulated conductor.

Figure 168:
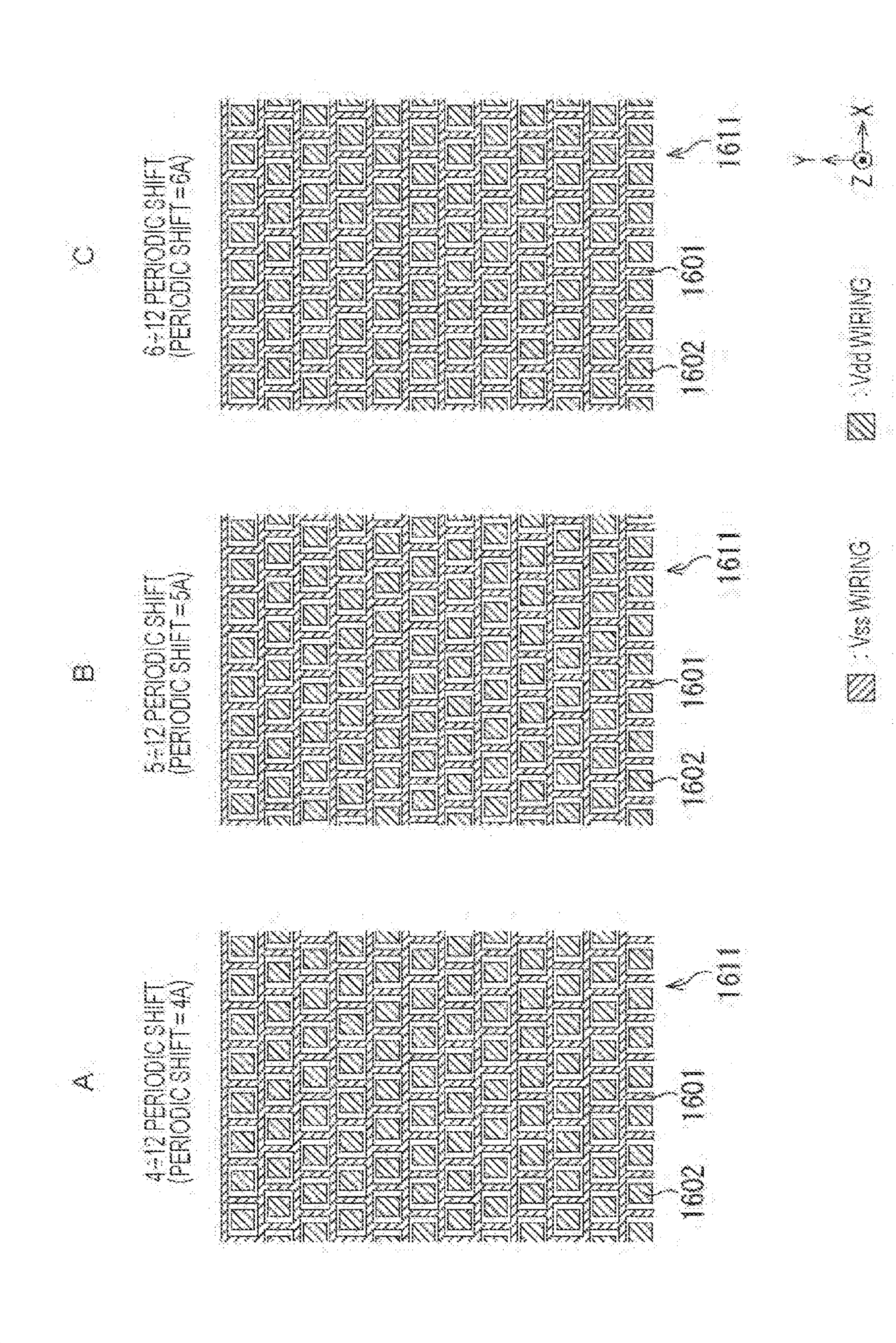

FIG. 168 is plan views of the first shift configuration example of the reticulated conductor.

Figure 169:
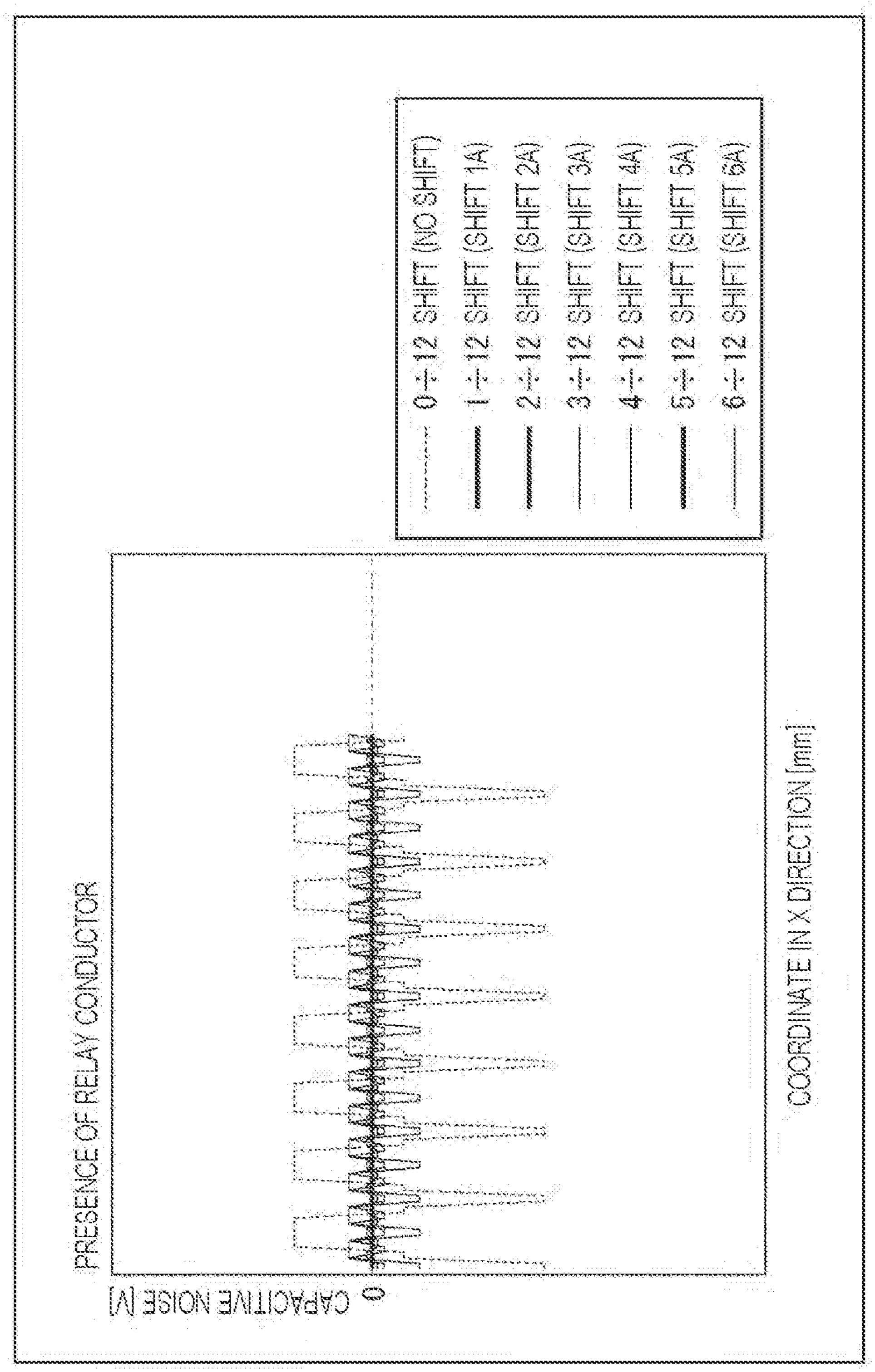

FIG. 169 is a diagram illustrating theoretical values of the capacitive noise in the first shift configuration example.

Figure 170:
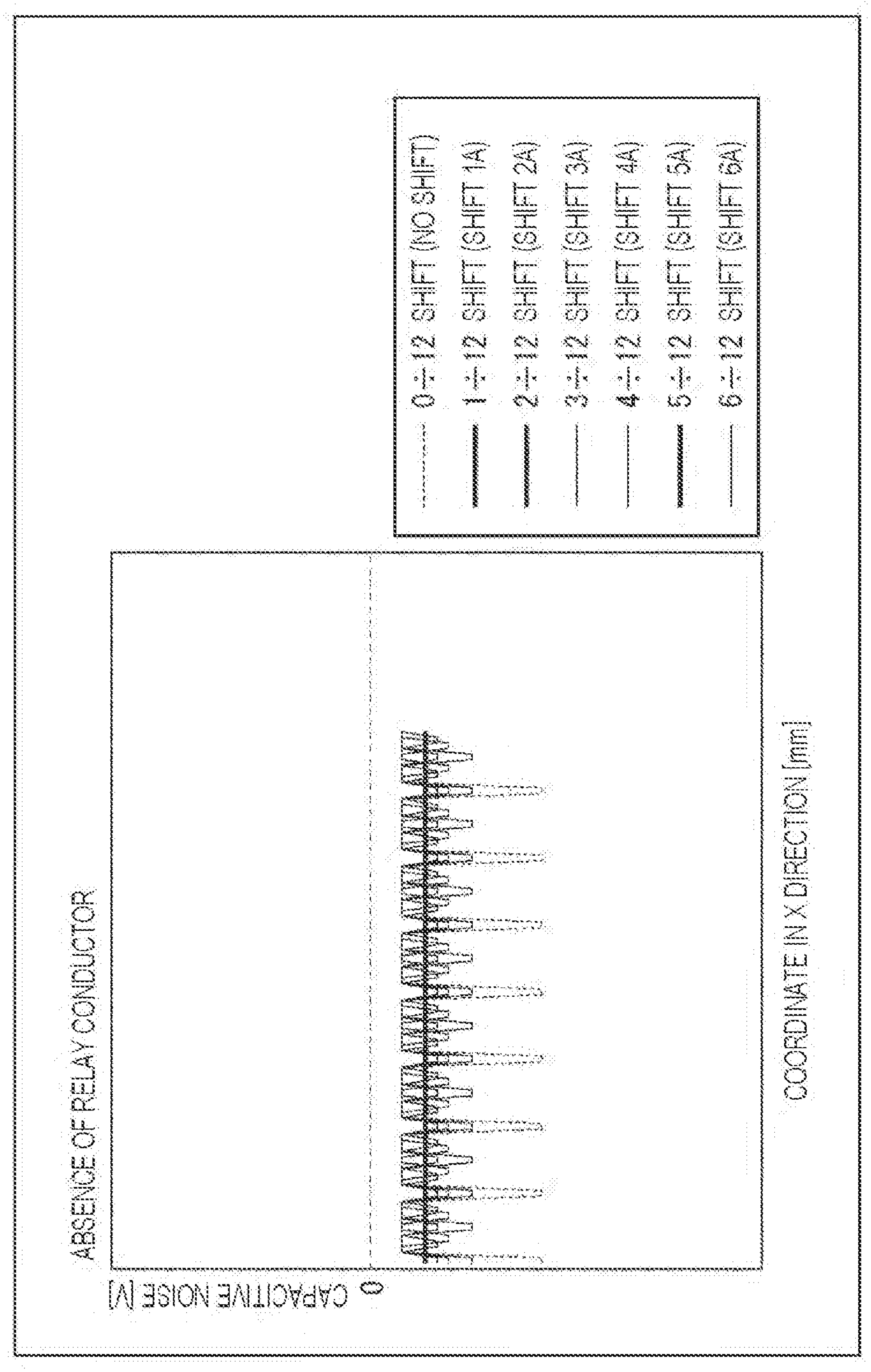

FIG. 170 is a diagram illustrating theoretical values of the capacitive noise in the first shift configuration example.

Figure 171:
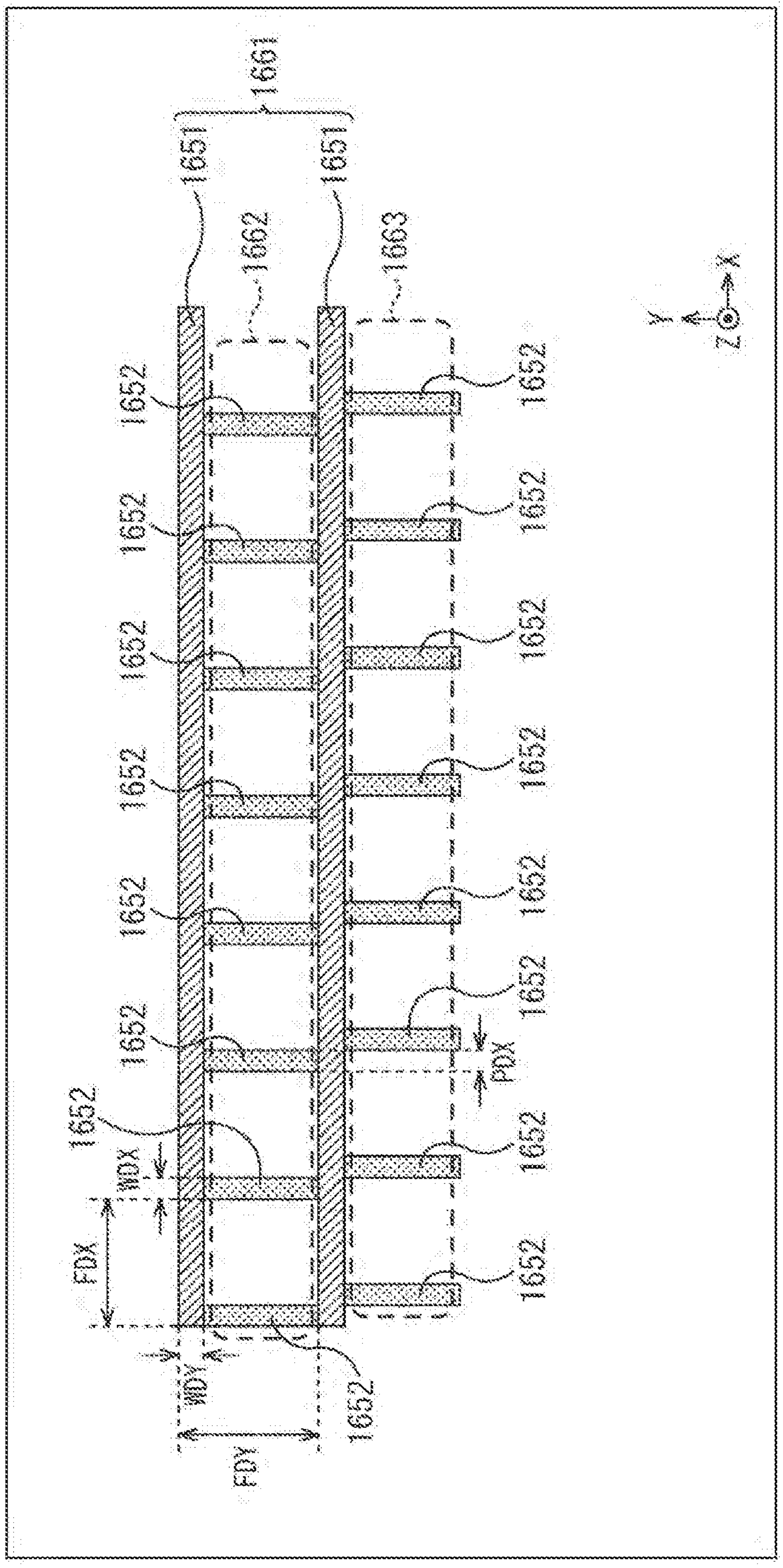

FIG. 171 is a diagram for describing definition of a reticulated conductor.

Figure 172:
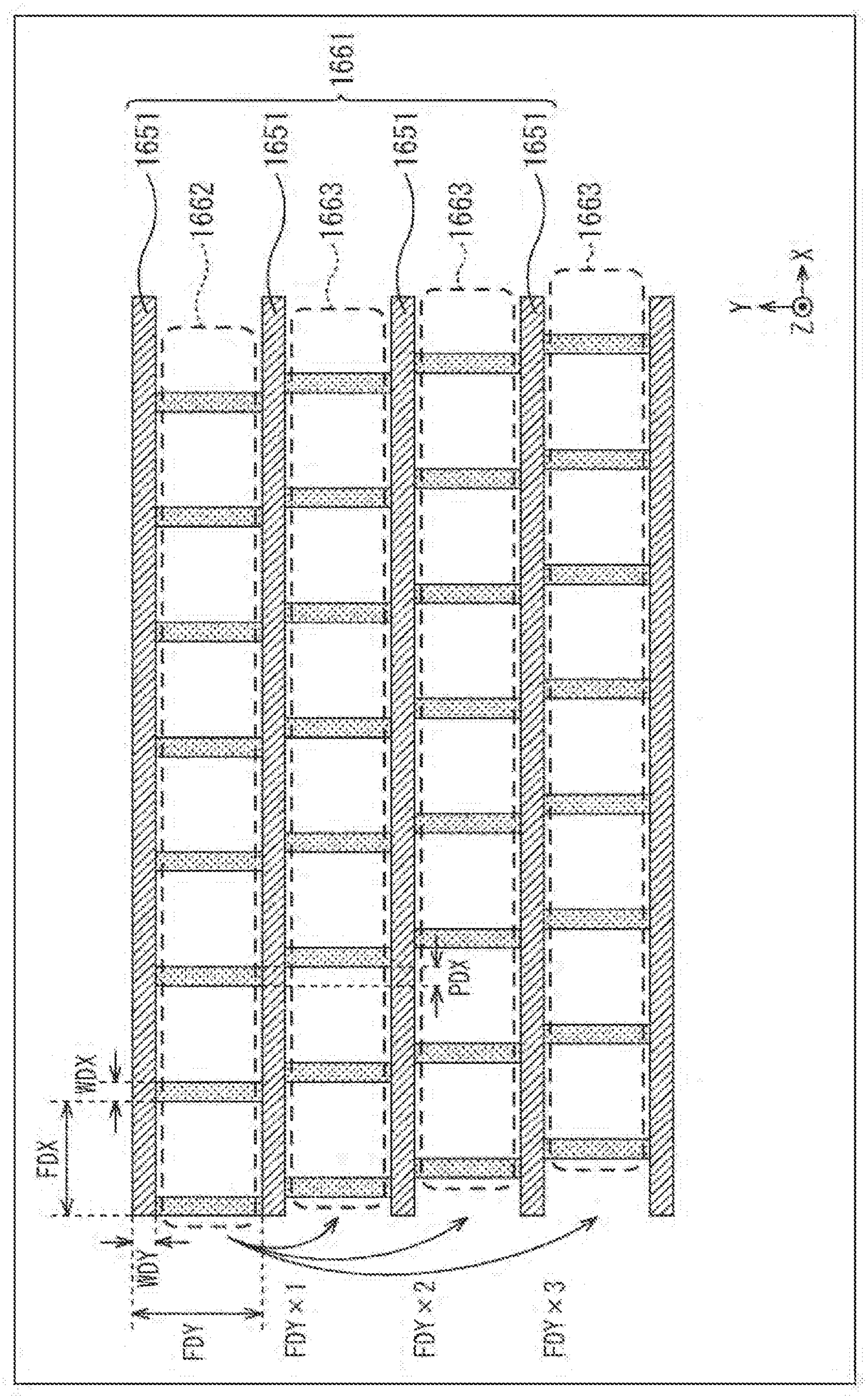

FIG. 172 is a diagram for describing definition of a reticulated conductor.

Figure 173:
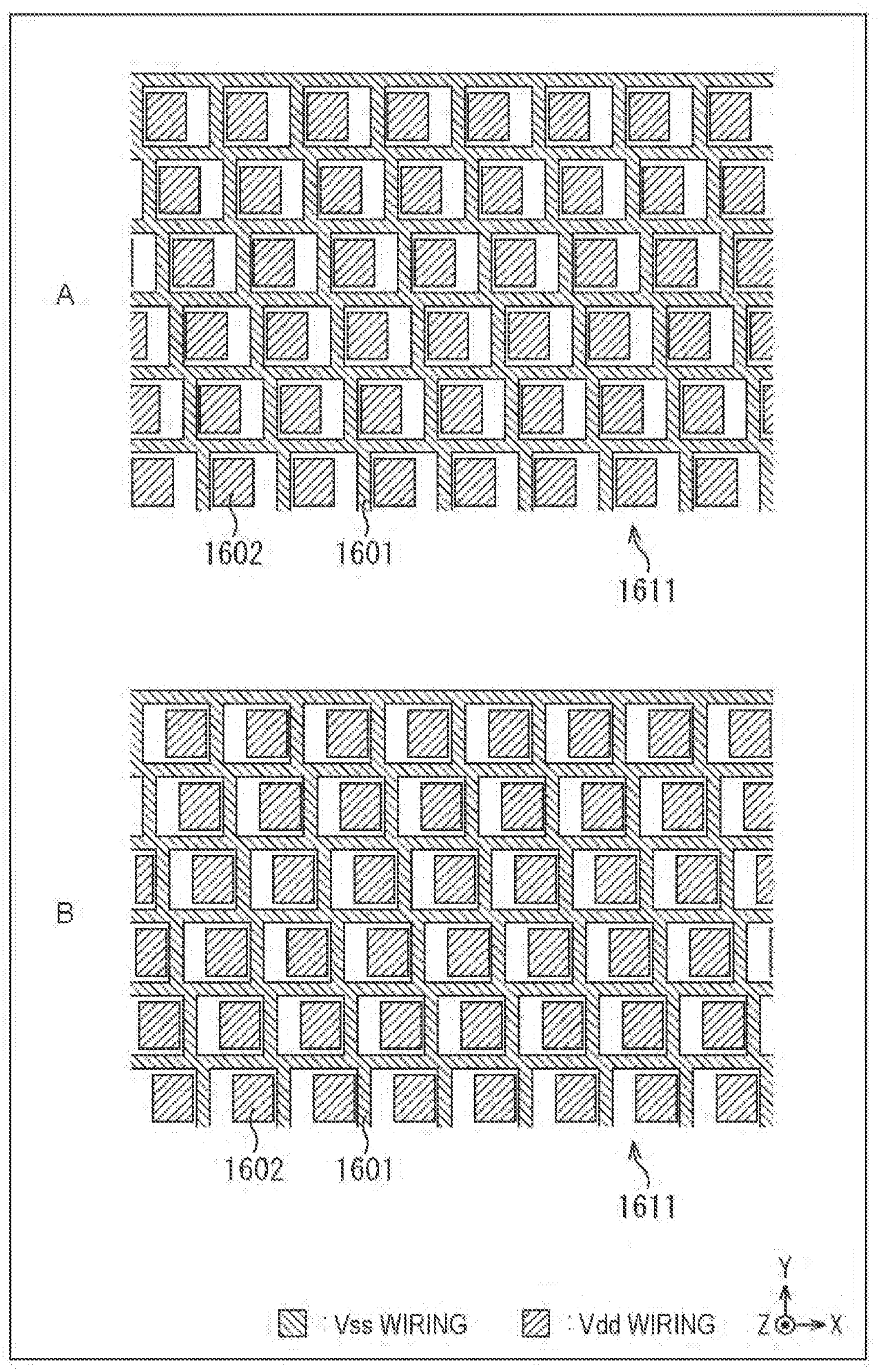

FIG. 173 is plan views illustrating first and second modifications of the first shift configuration example.

Figure 174:
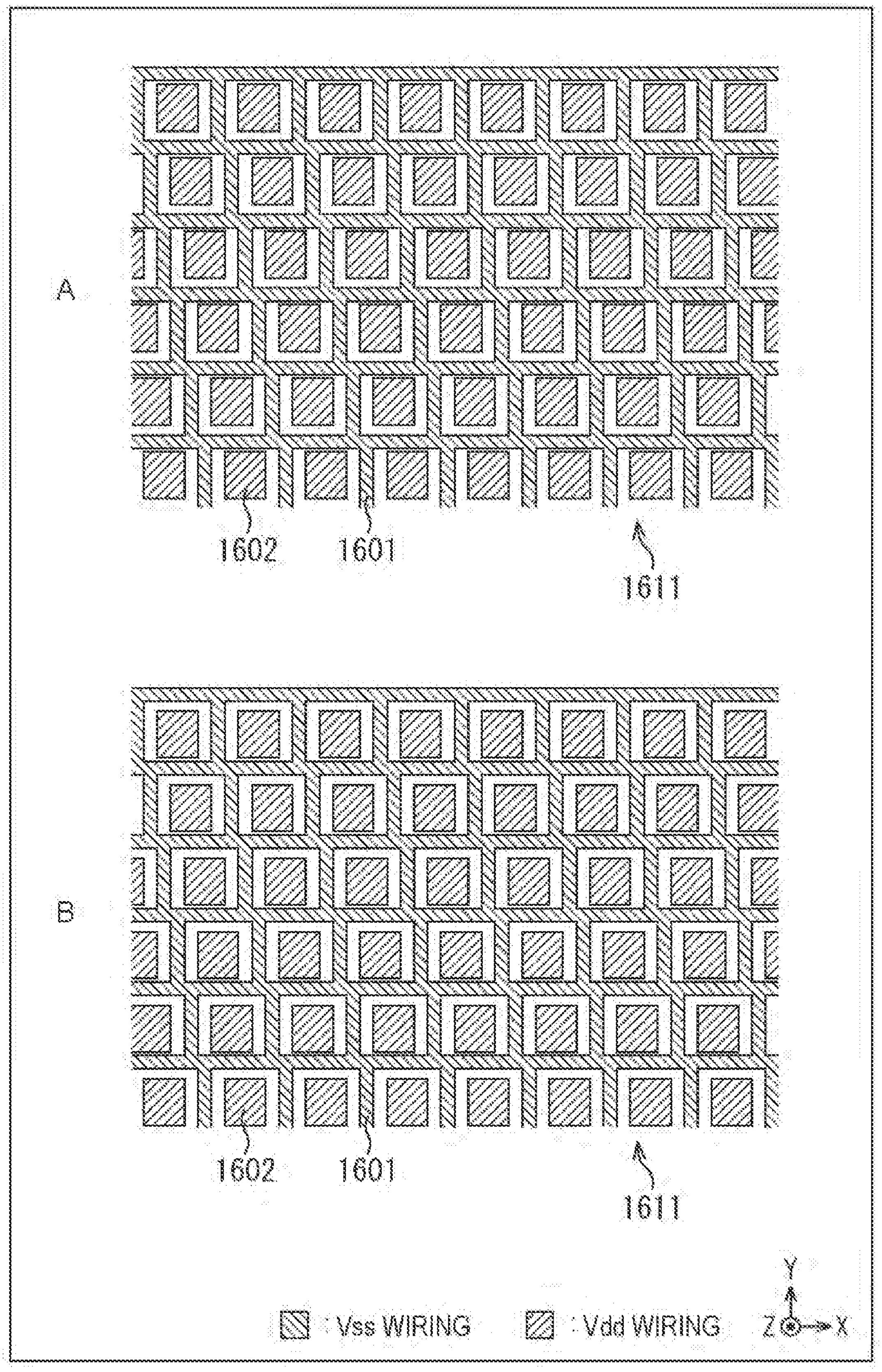

FIG. 174 is plan views illustrating third and fourth modifications of the first shift configuration example.

Figure 175:
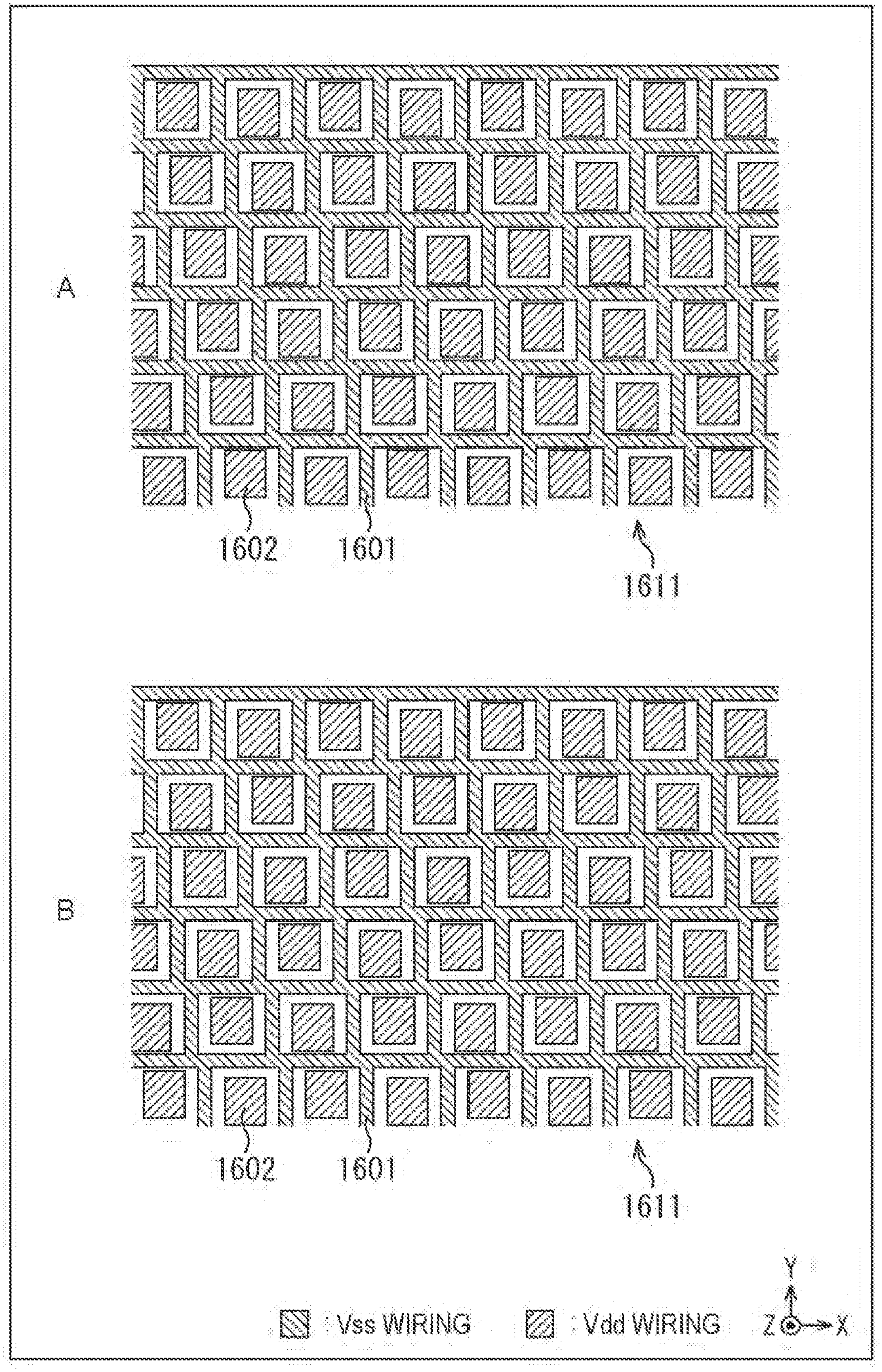

FIG. 175 is plan views illustrating fifth and sixth modifications of the first shift configuration example.

Figure 176:
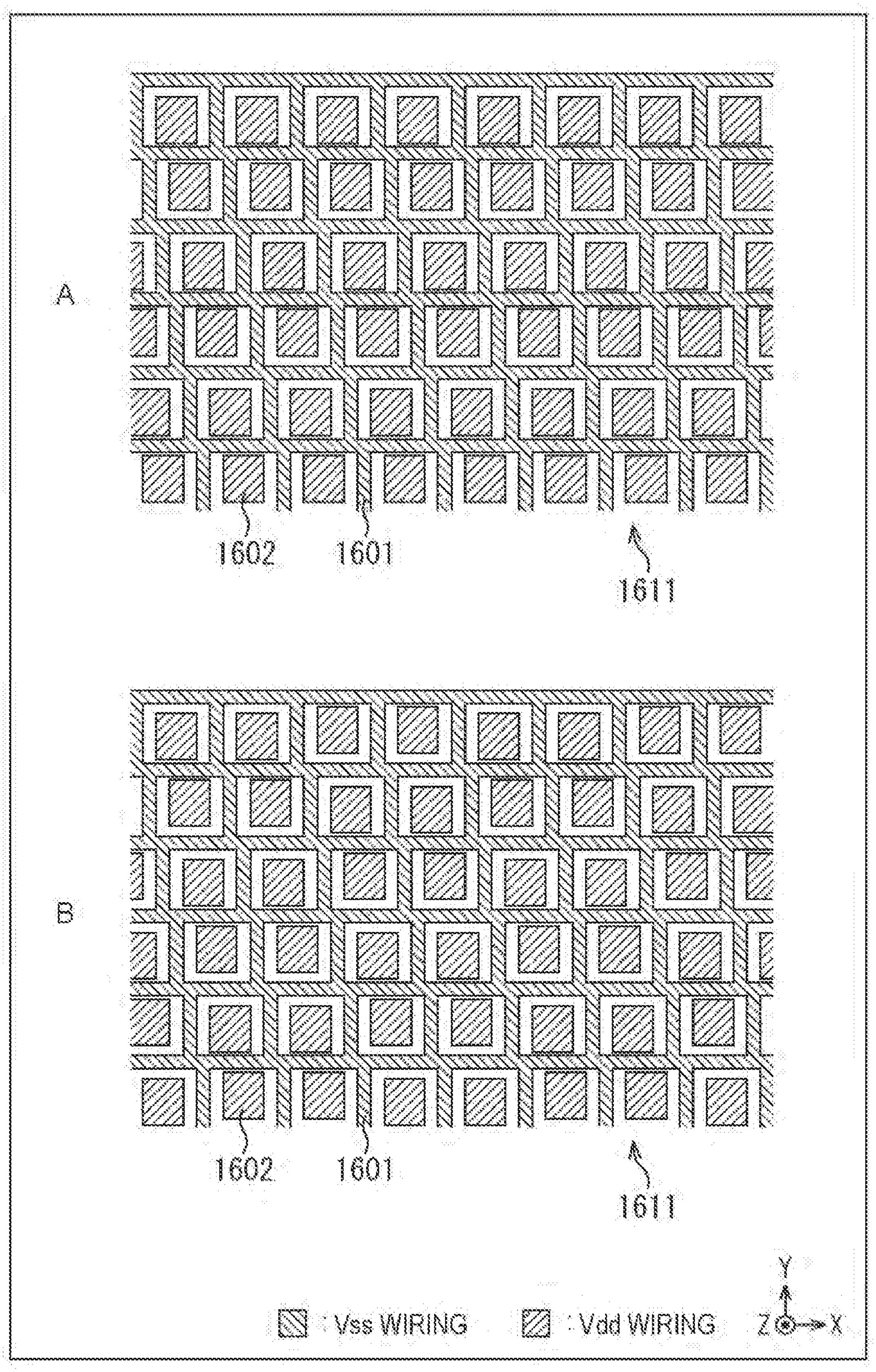

FIG. 176 is plan views illustrating seventh and eighth modifications of the first shift configuration example.

Figure 177:
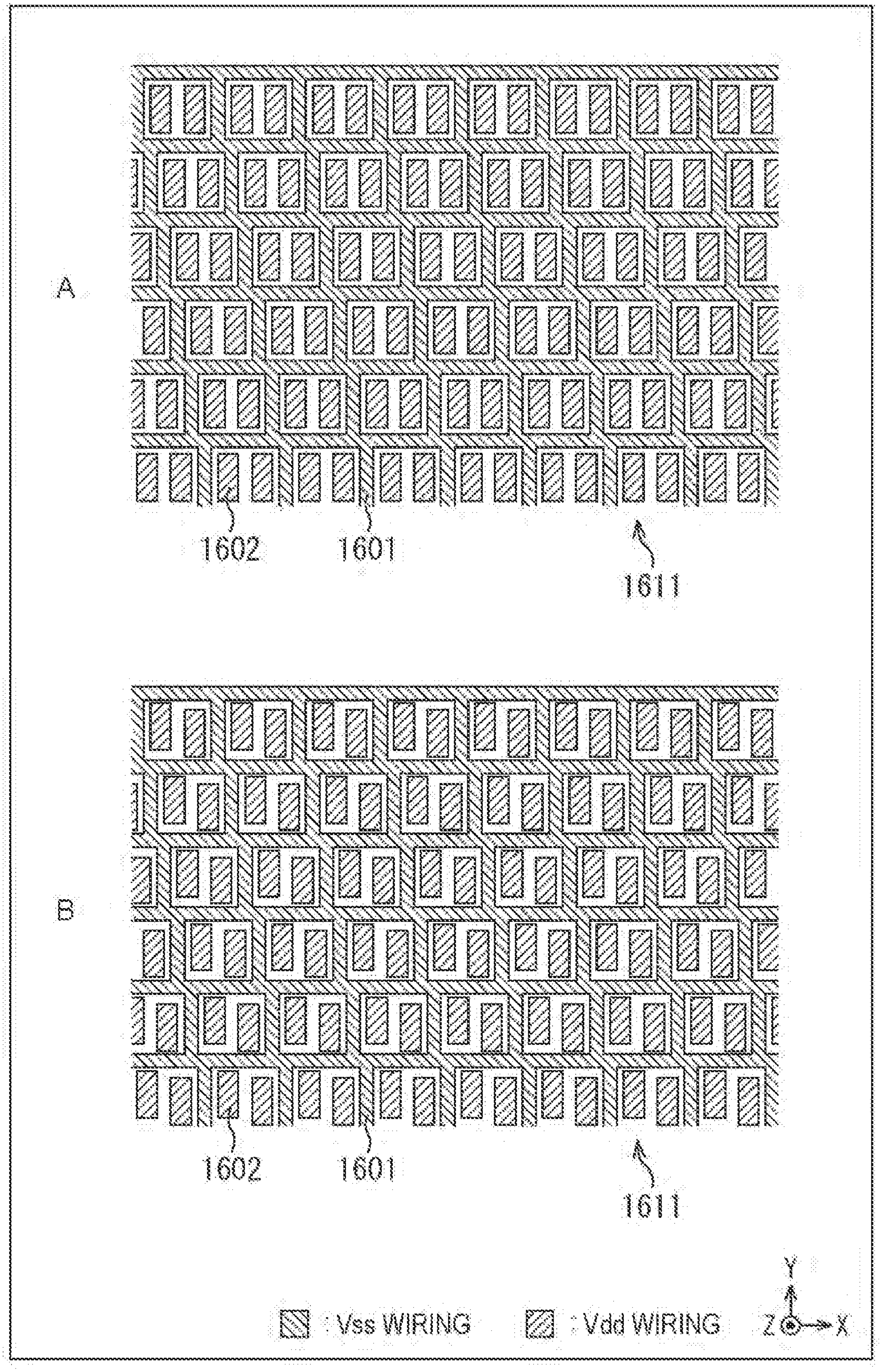

FIG. 177 is plan views illustrating ninth and tenth modifications of the first shift configuration example.

Figure 178:
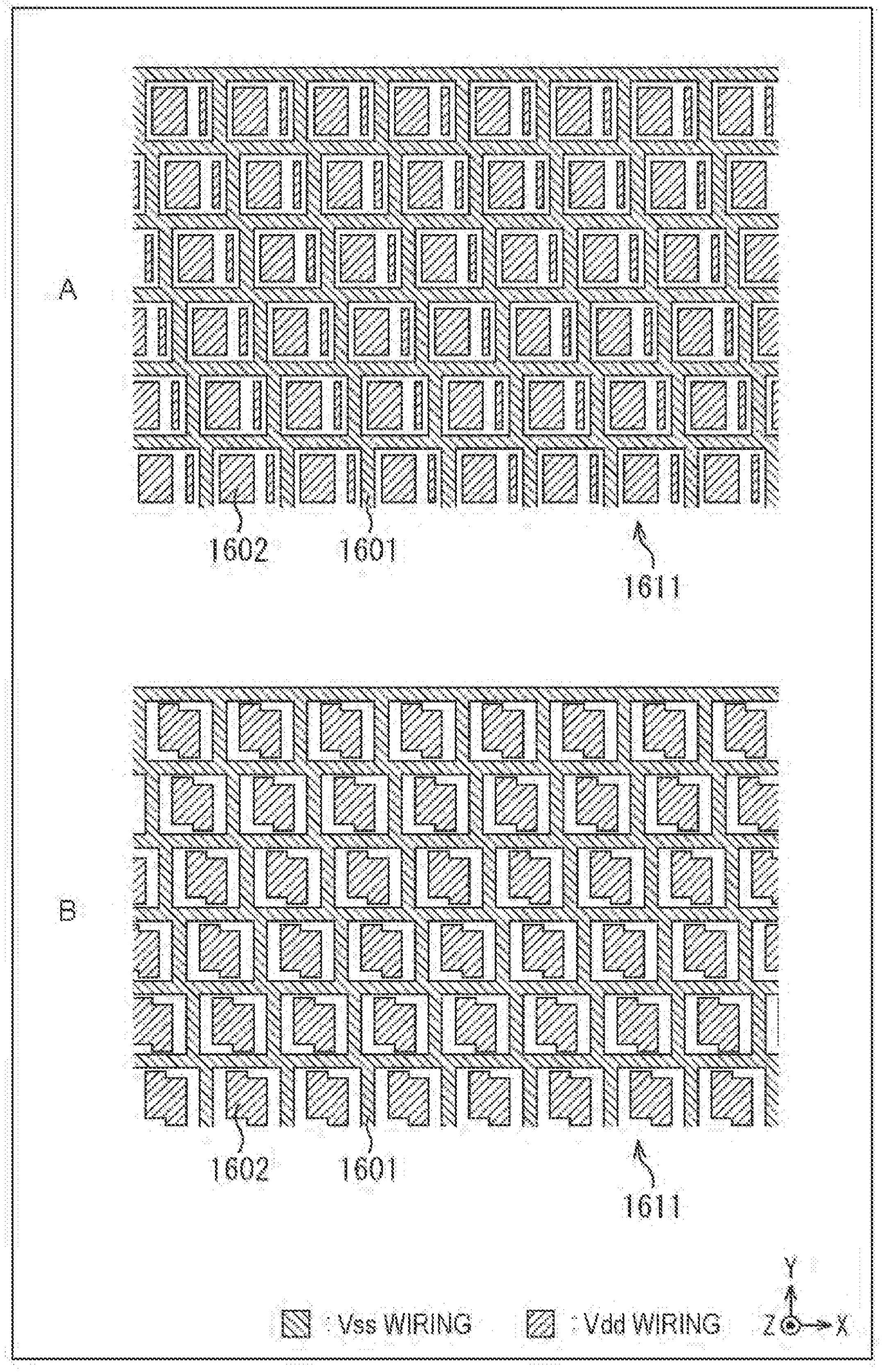

FIG. 178 is plan views illustrating eleventh and twelfth modifications of the first shift configuration example.

Figure 179:
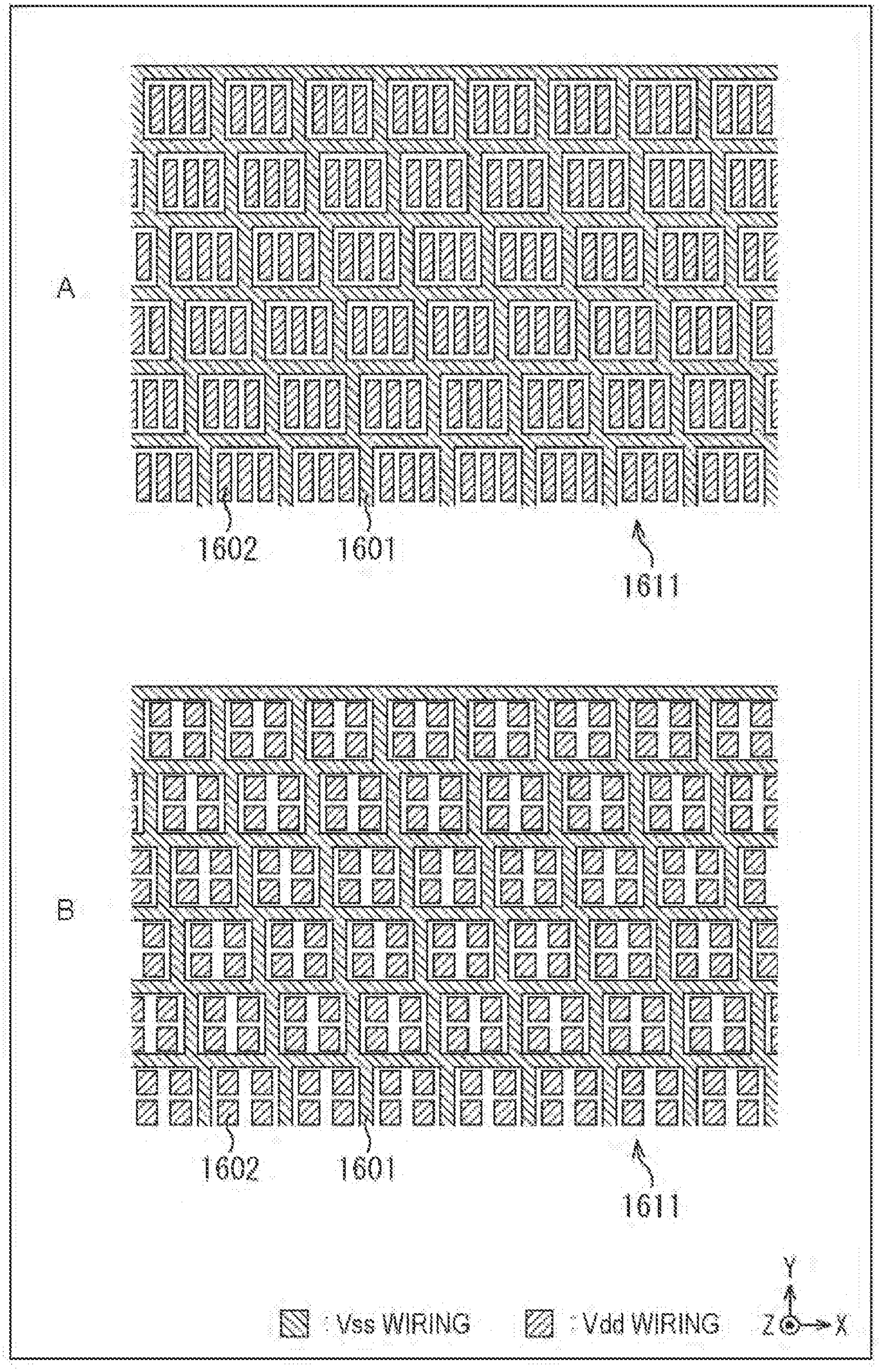

FIG. 179 is plan views illustrating thirteenth and fourteenth modifications of the first shift configuration example.

Figure 180:
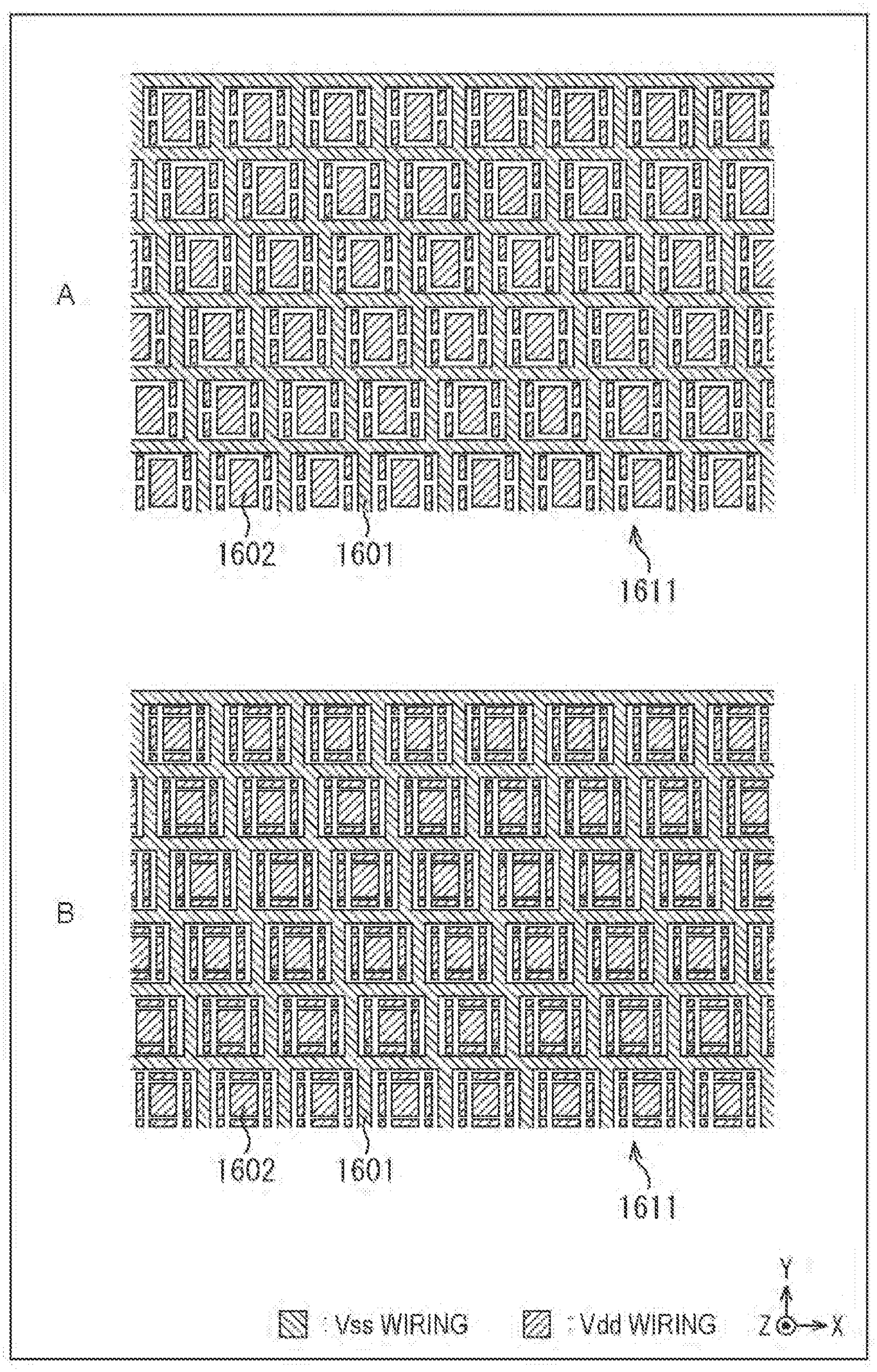

FIG. 180 is plan views illustrating fifteenth and sixteenth modifications of the first shift configuration example.

Figure 181:
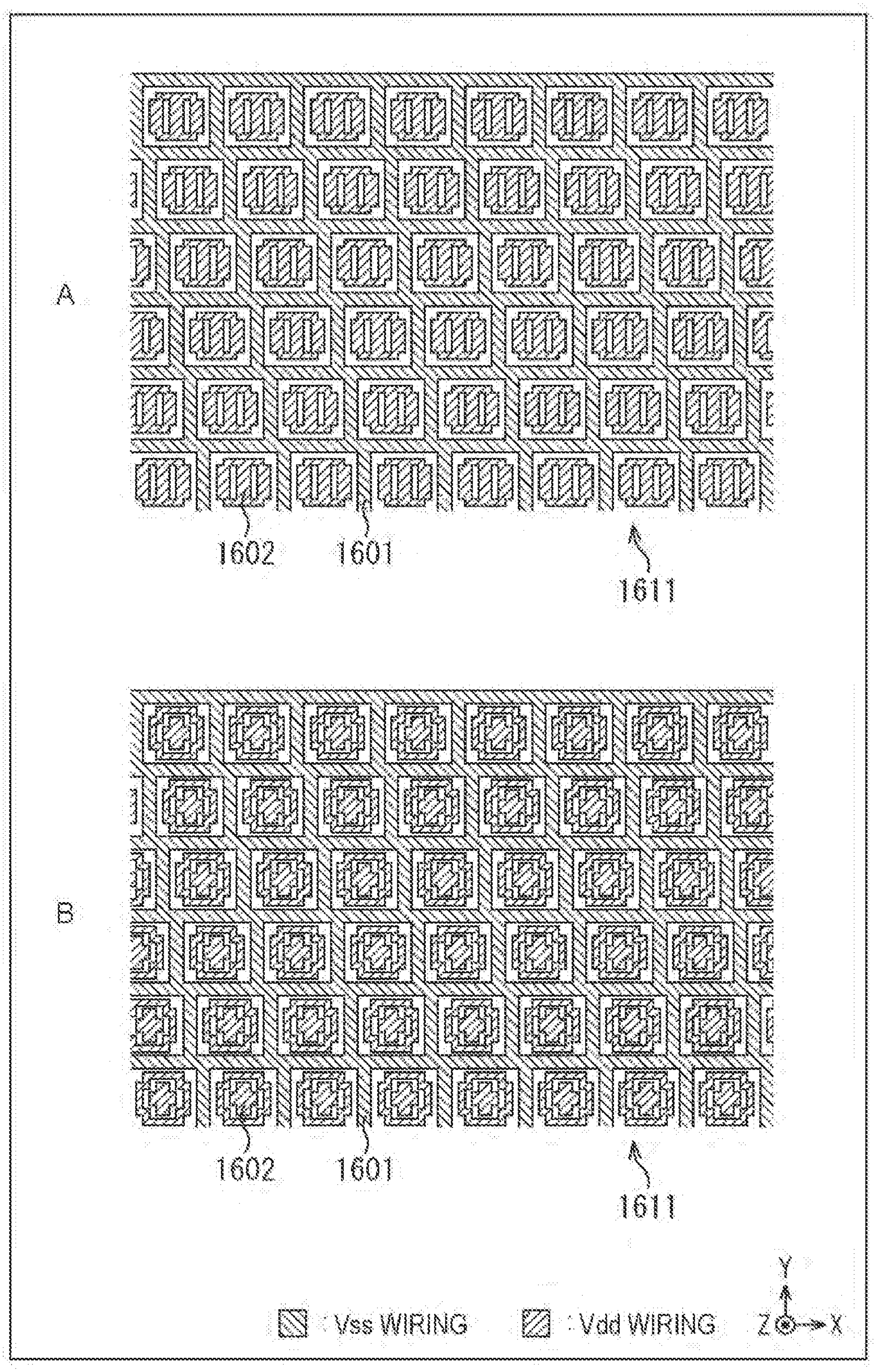

FIG. 181 is plan views illustrating seventeenth and eighteenth modifications of the first shift configuration example.

Figure 182:
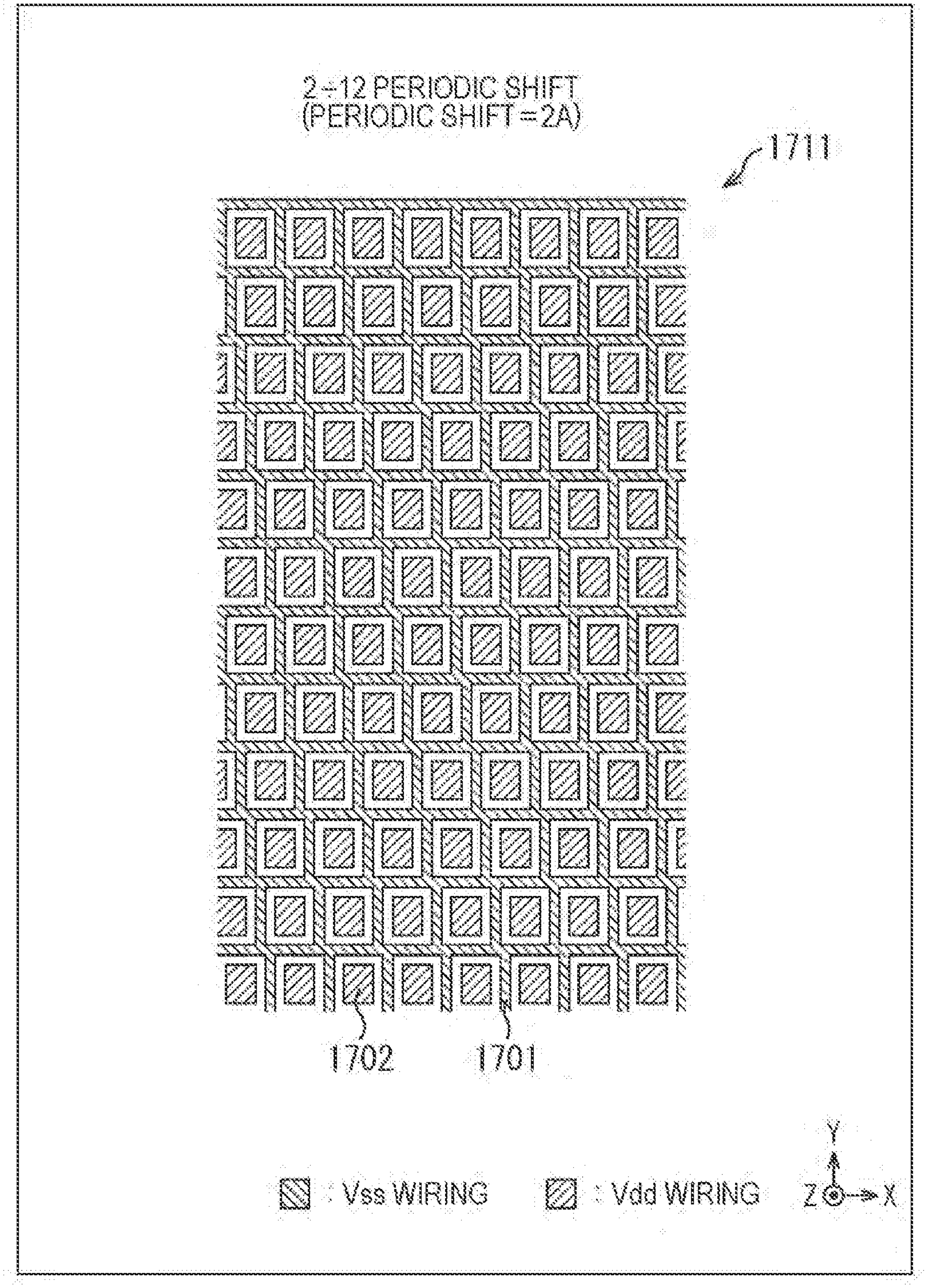

FIG. 182 is a plan view of a second shift configuration example of the reticulated conductor.

Figure 183:
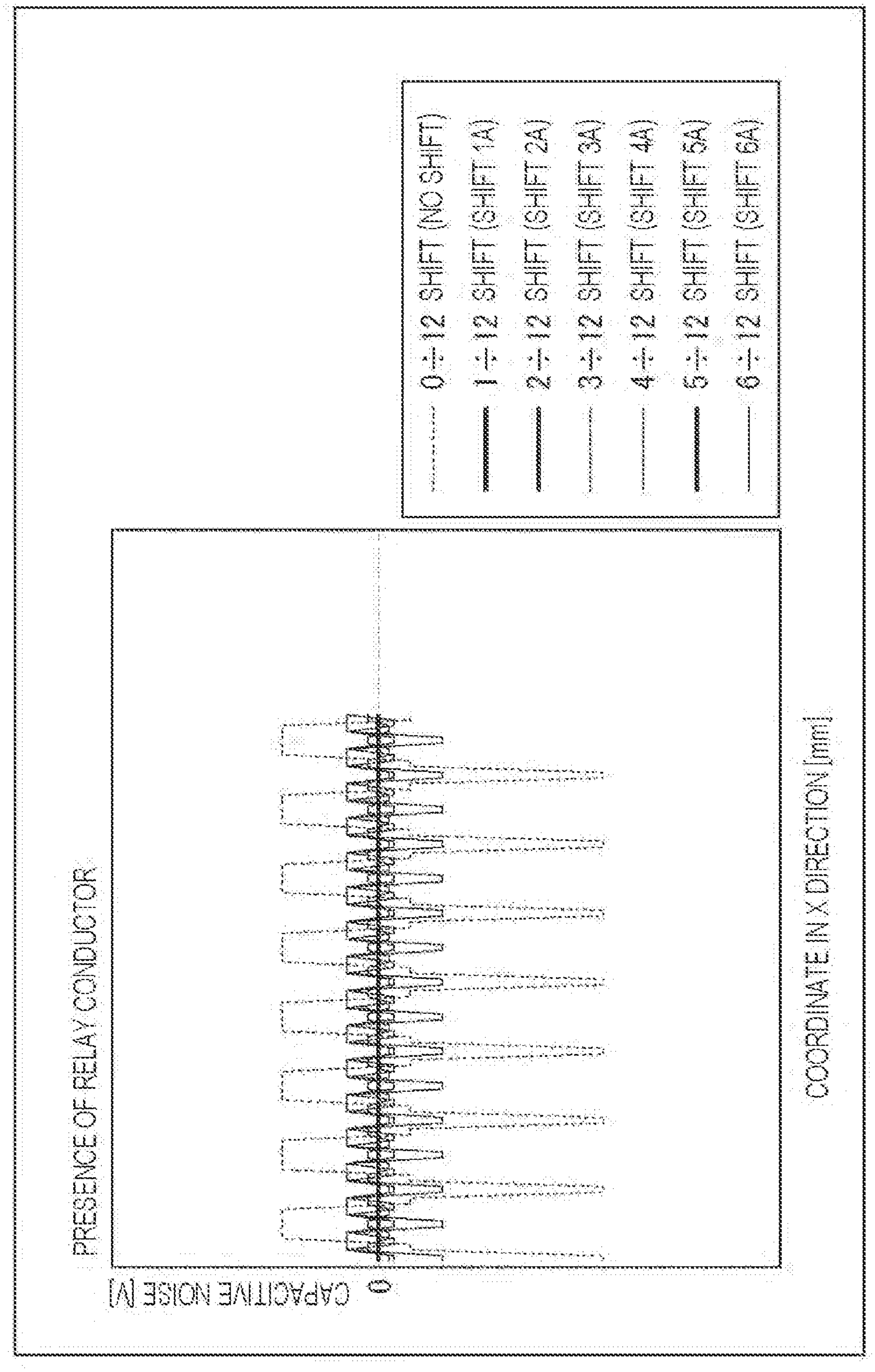

FIG. 183 is a diagram illustrating theoretical values of the capacitive noise in the second shift configuration example.

Figure 184:
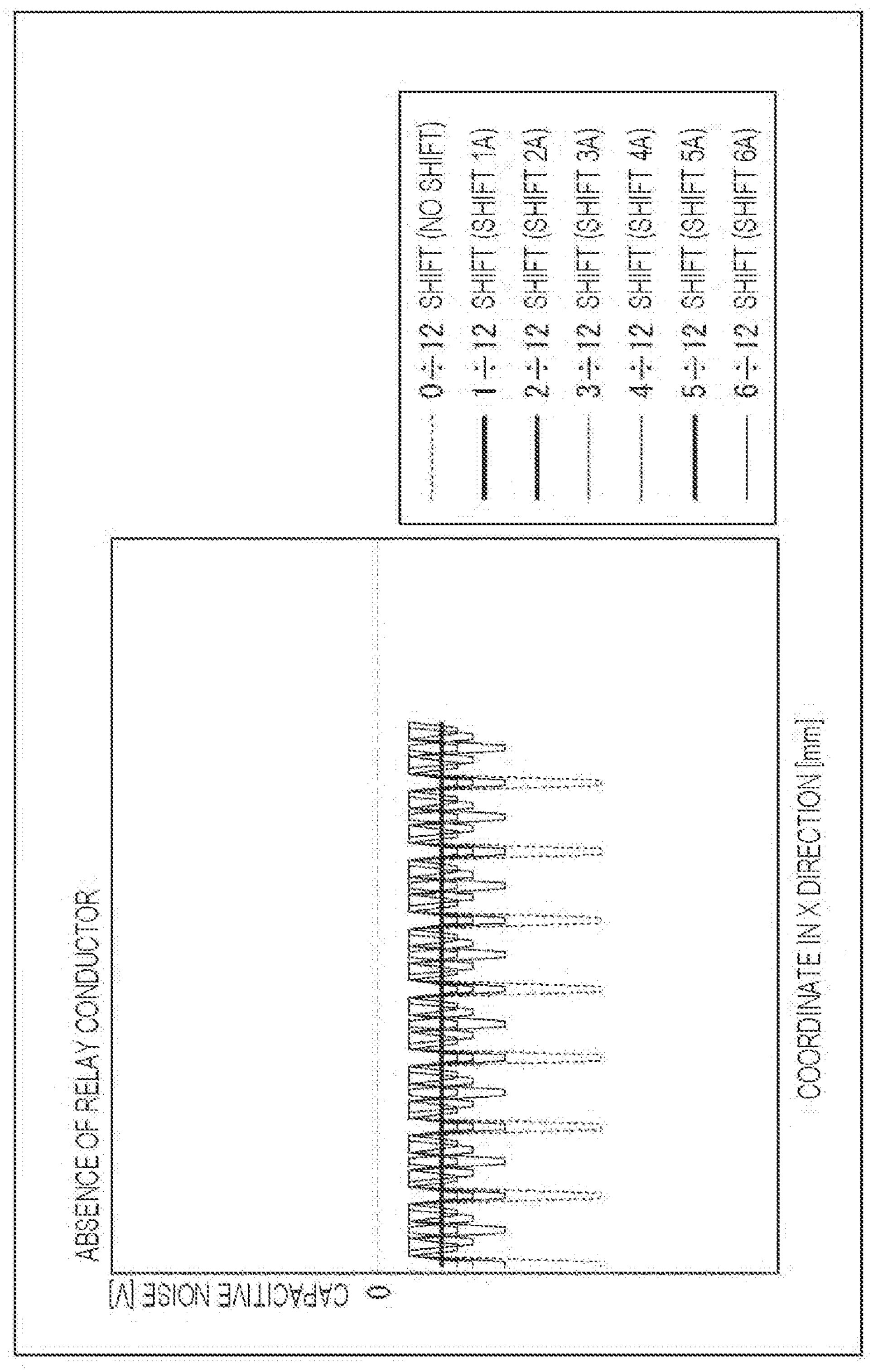

FIG. 184 is a diagram illustrating theoretical values of the capacitive noise in the second shift configuration example.

Figure 185:
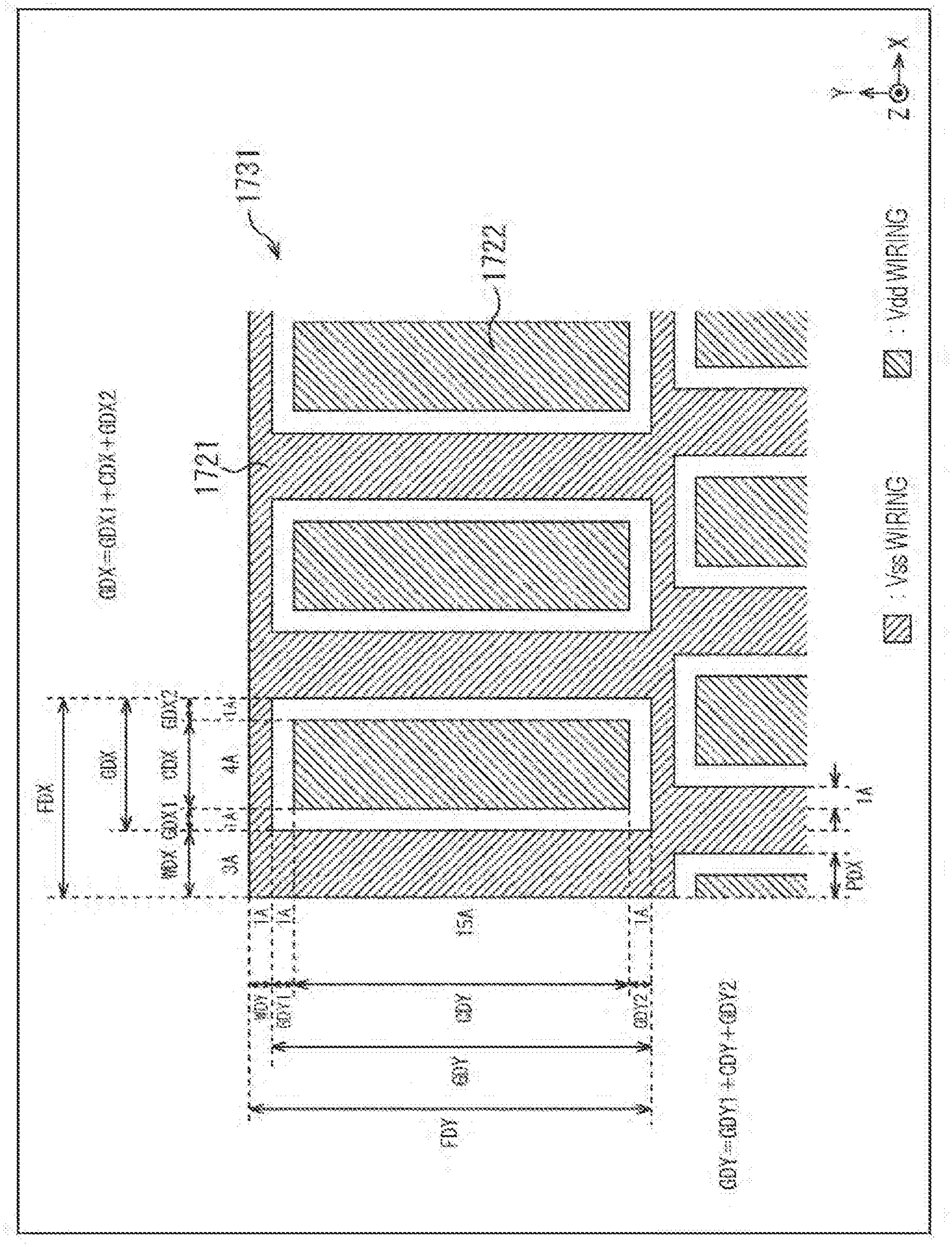

FIG. 185 is a view for describing a conductor width and a gap width of a third shift configuration example of the reticulated conductor.

Figure 186:
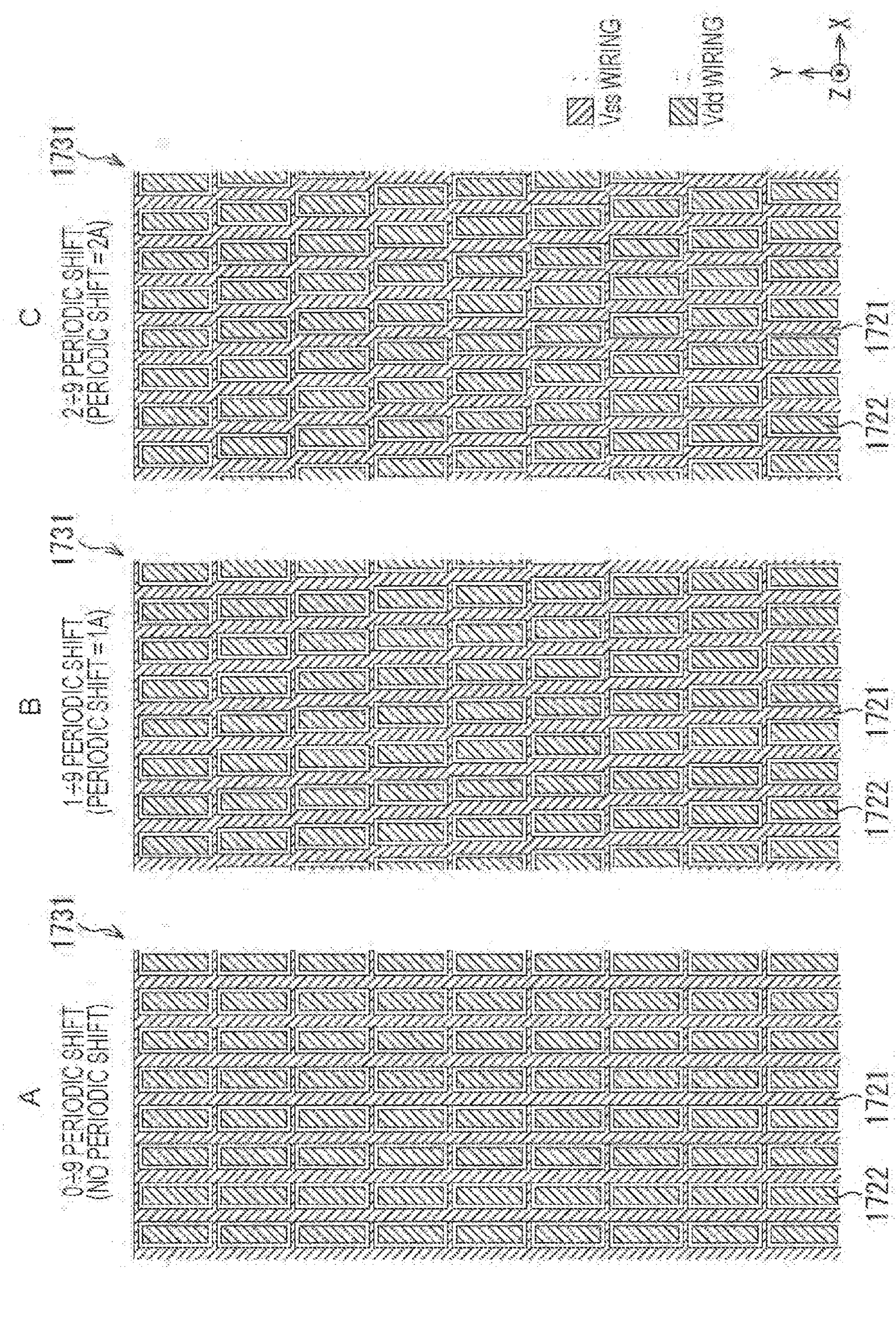

FIG. 186 is plan views of the third shift configuration example of the reticulated conductor.

Figure 187:
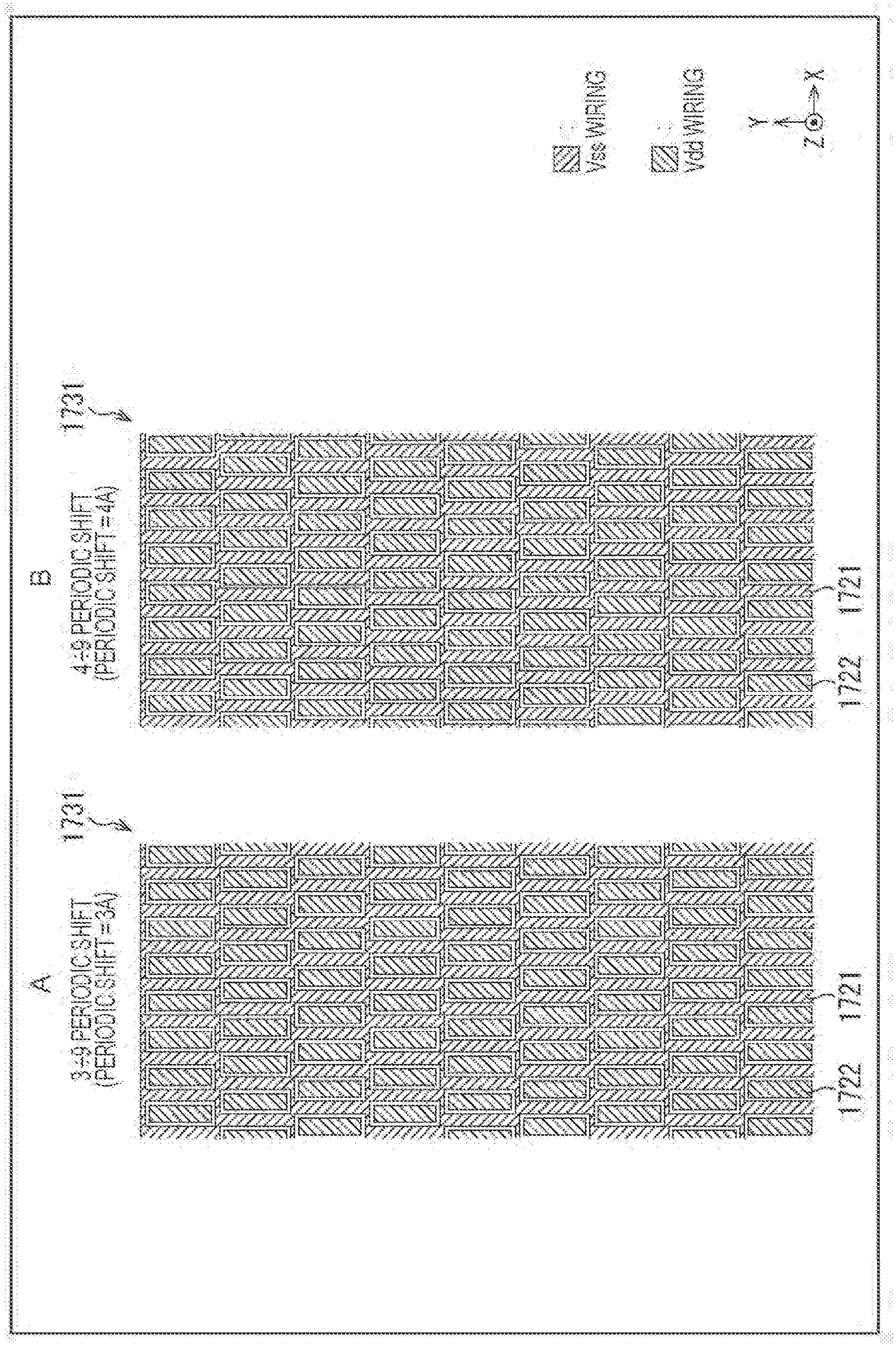

FIG. 187 is plan views of the third shift configuration example of the reticulated conductor.

Figure 188:
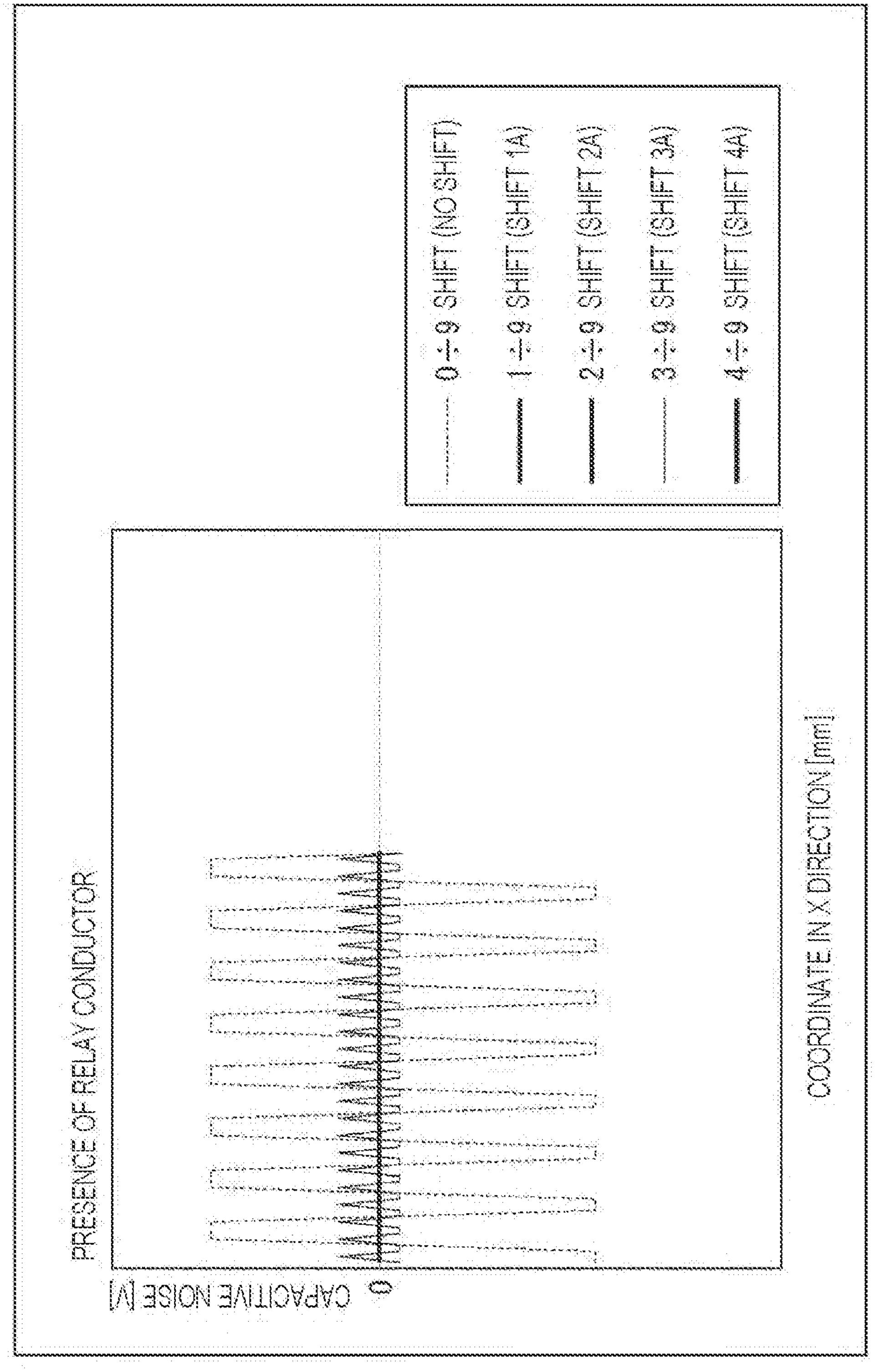

FIG. 188 is a diagram illustrating theoretical values of the capacitive noise in the third shift configuration example.

Figure 189:
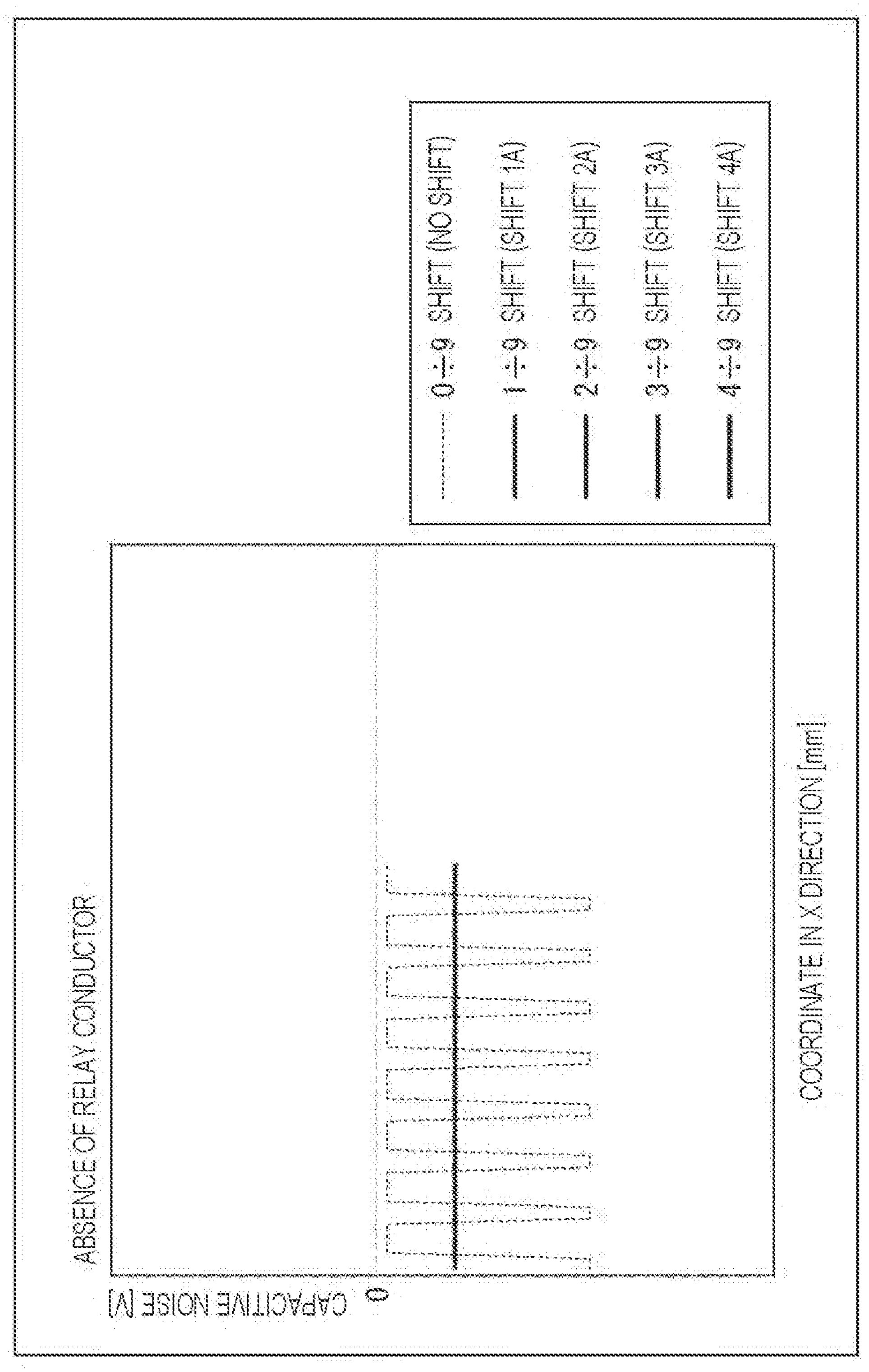

FIG. 189 is a diagram illustrating theoretical values of the capacitive noise in the third shift configuration example.

Figure 190:
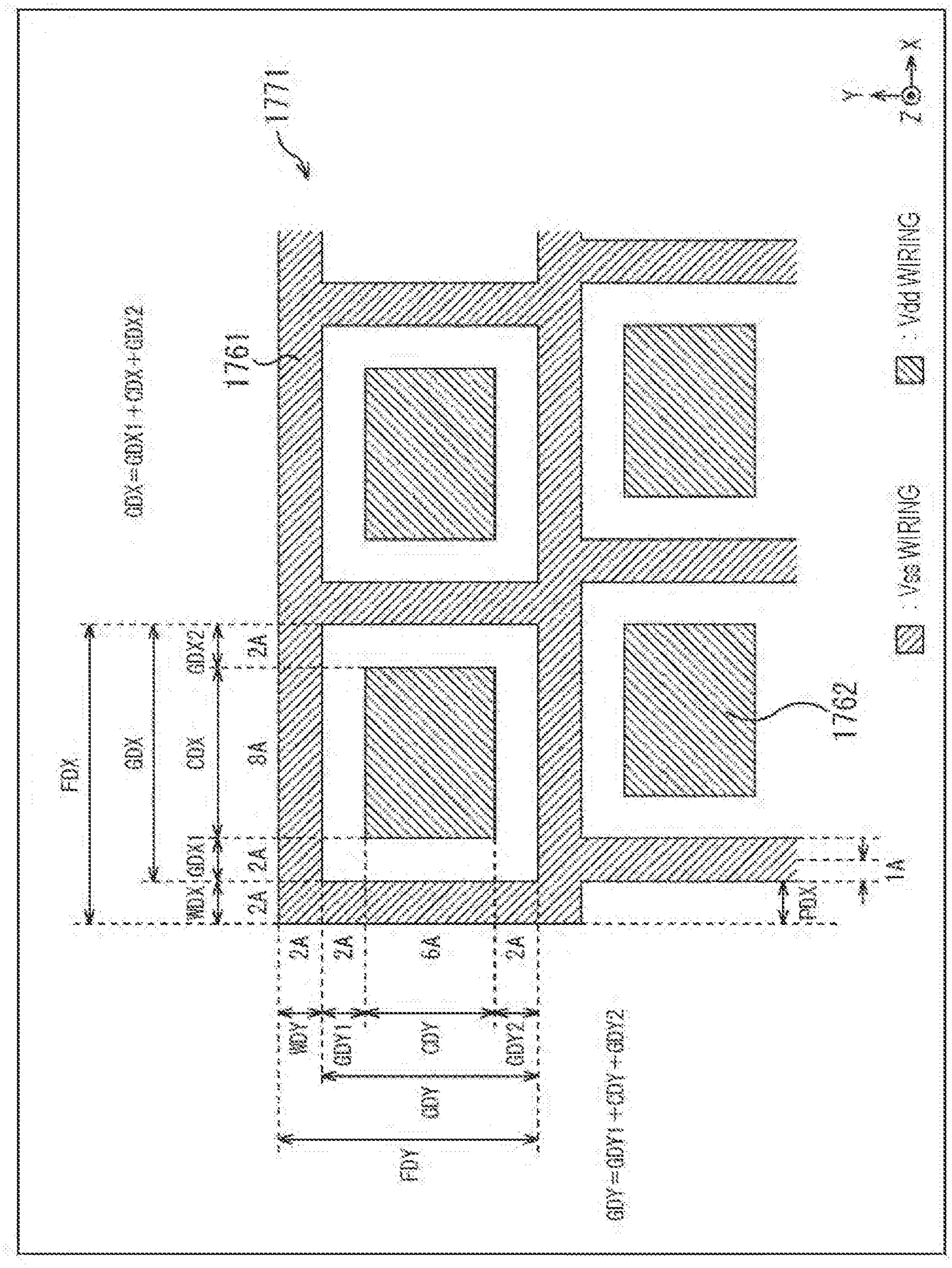

FIG. 190 is a view for describing a conductor width and a gap width of a fourth shift configuration example of the reticulated conductor.

Figure 191:
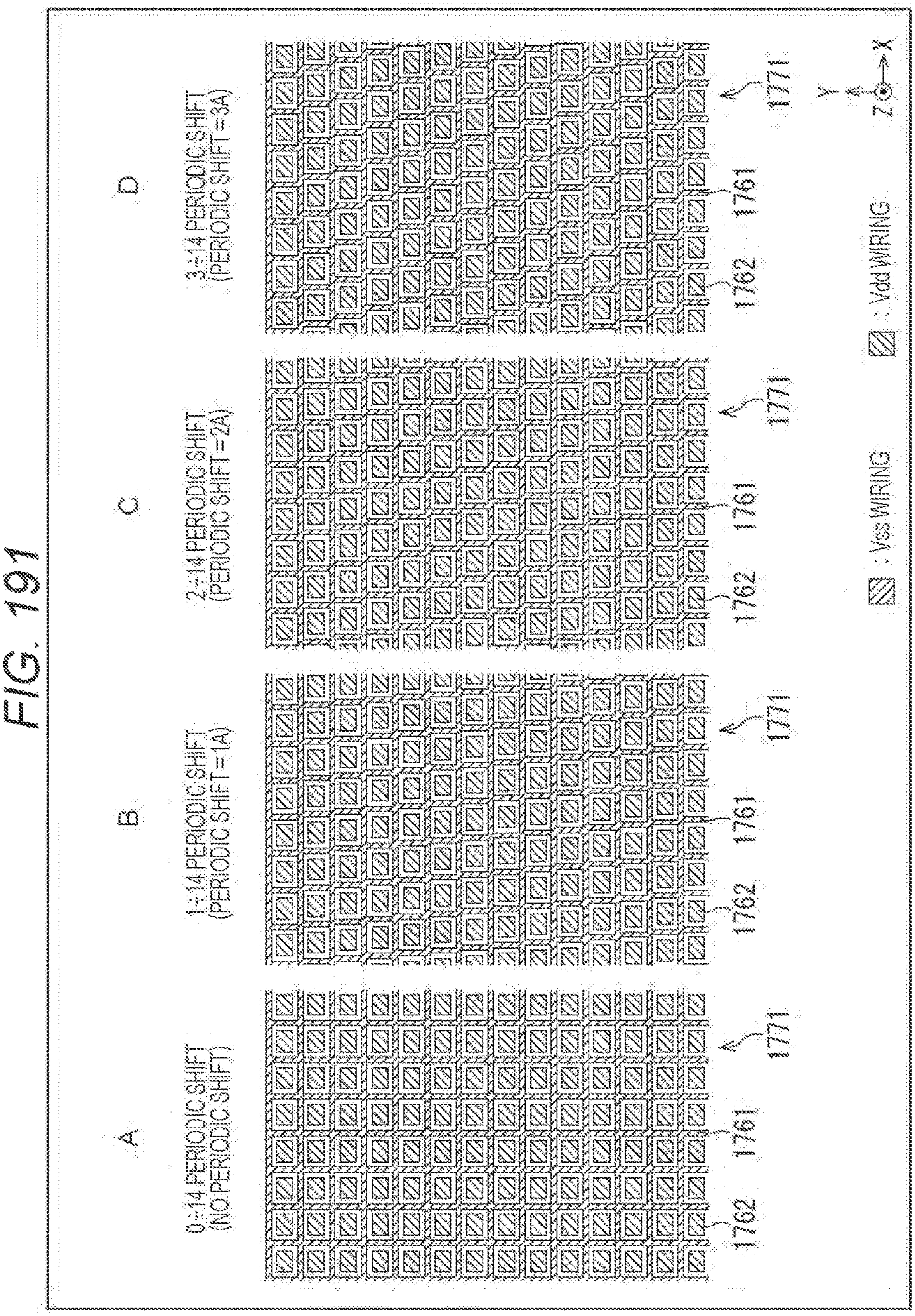

FIG. 191 is plan views of the fourth shift configuration example of the reticulated conductor.

Figure 192:
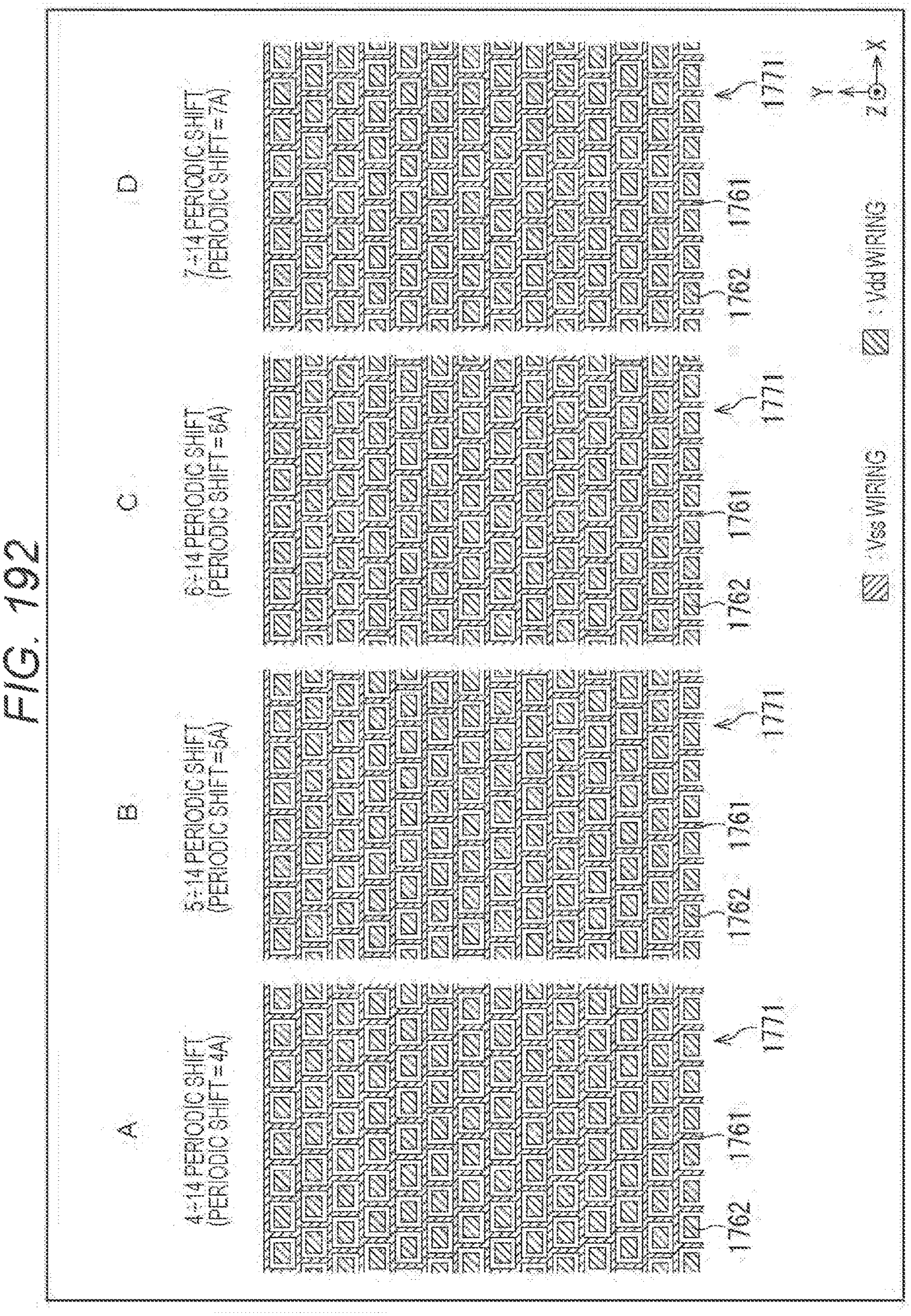

FIG. 192 is plan views of the fourth shift configuration example of the reticulated conductor.

Figure 193:
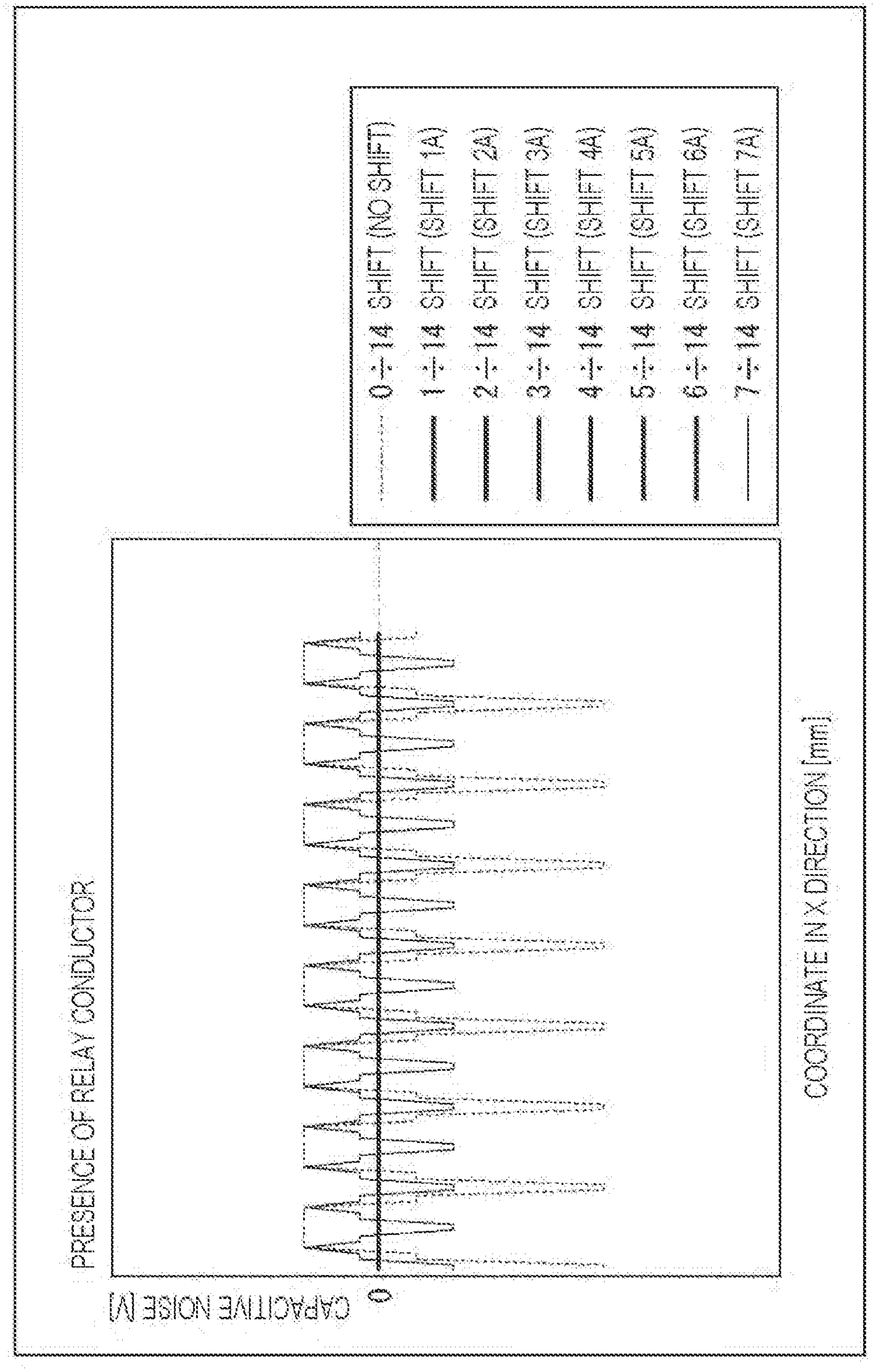

FIG. 193 is a diagram illustrating theoretical values of the capacitive noise in the fourth shift configuration example.

Figure 194:
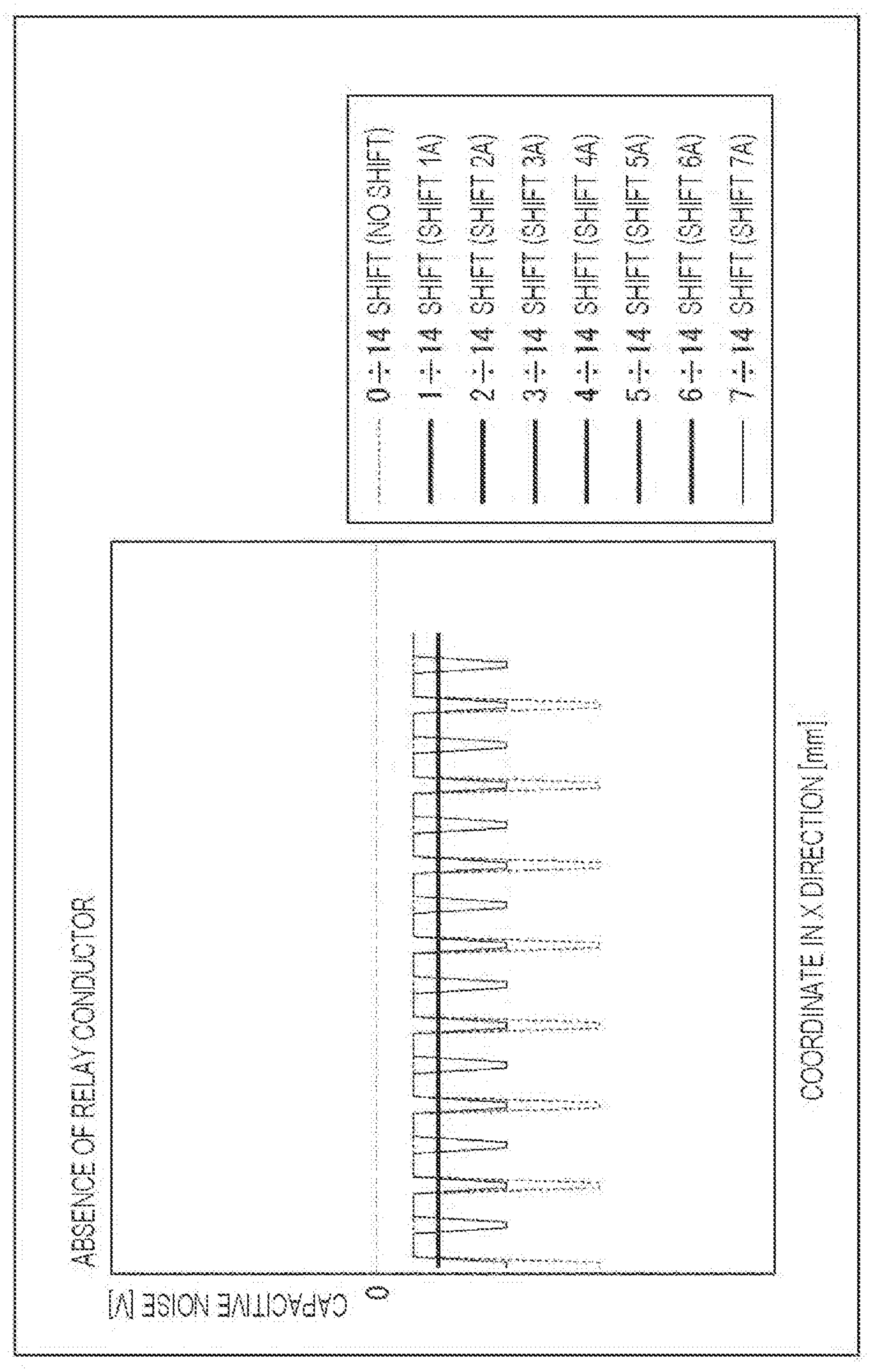

FIG. 194 is a diagram illustrating theoretical values of the capacitive noise in the fourth shift configuration example.

Figure 195:
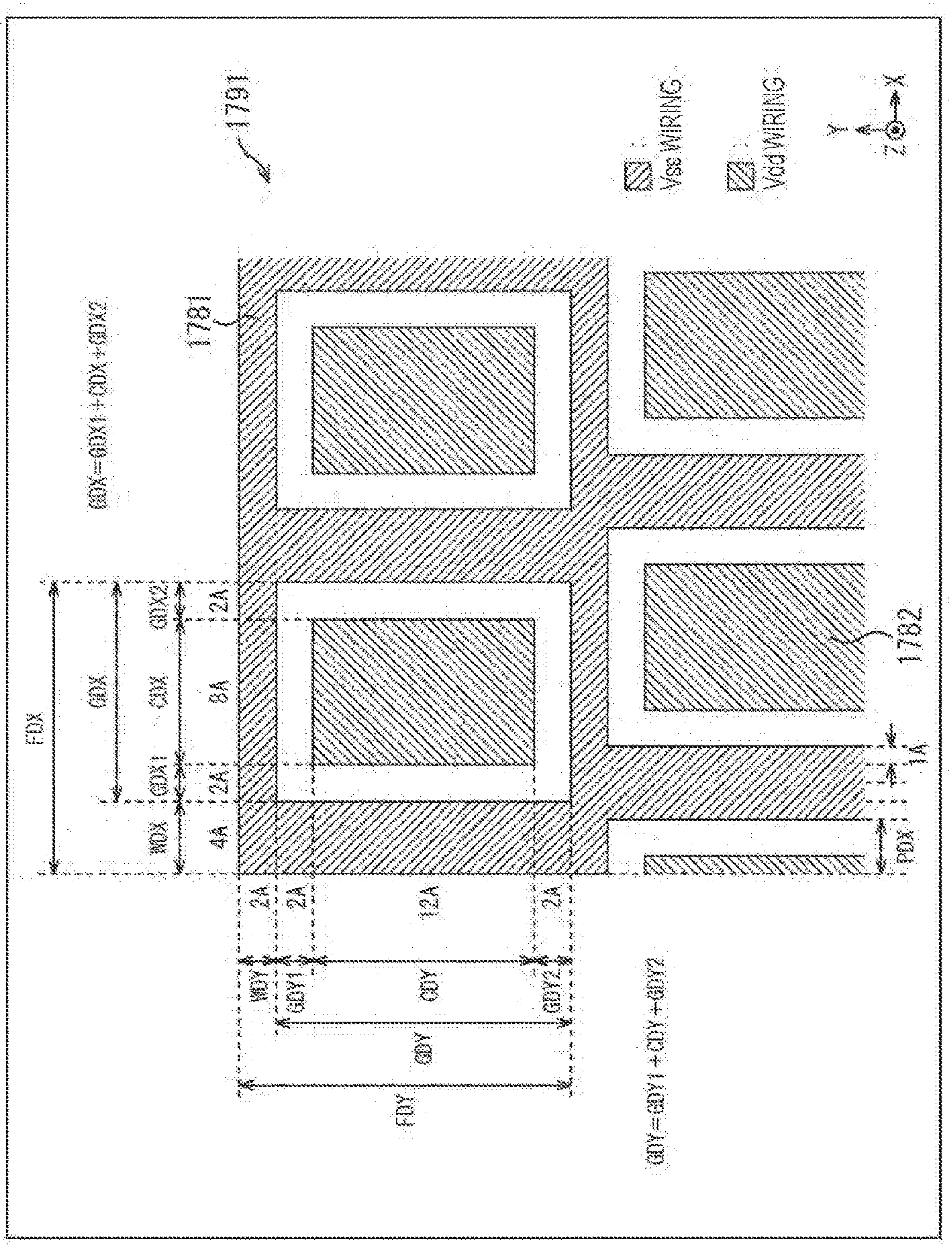

FIG. 195 is a view for describing a conductor width and a gap width of a fifth shift configuration example of the reticulated conductor.

Figure 196:
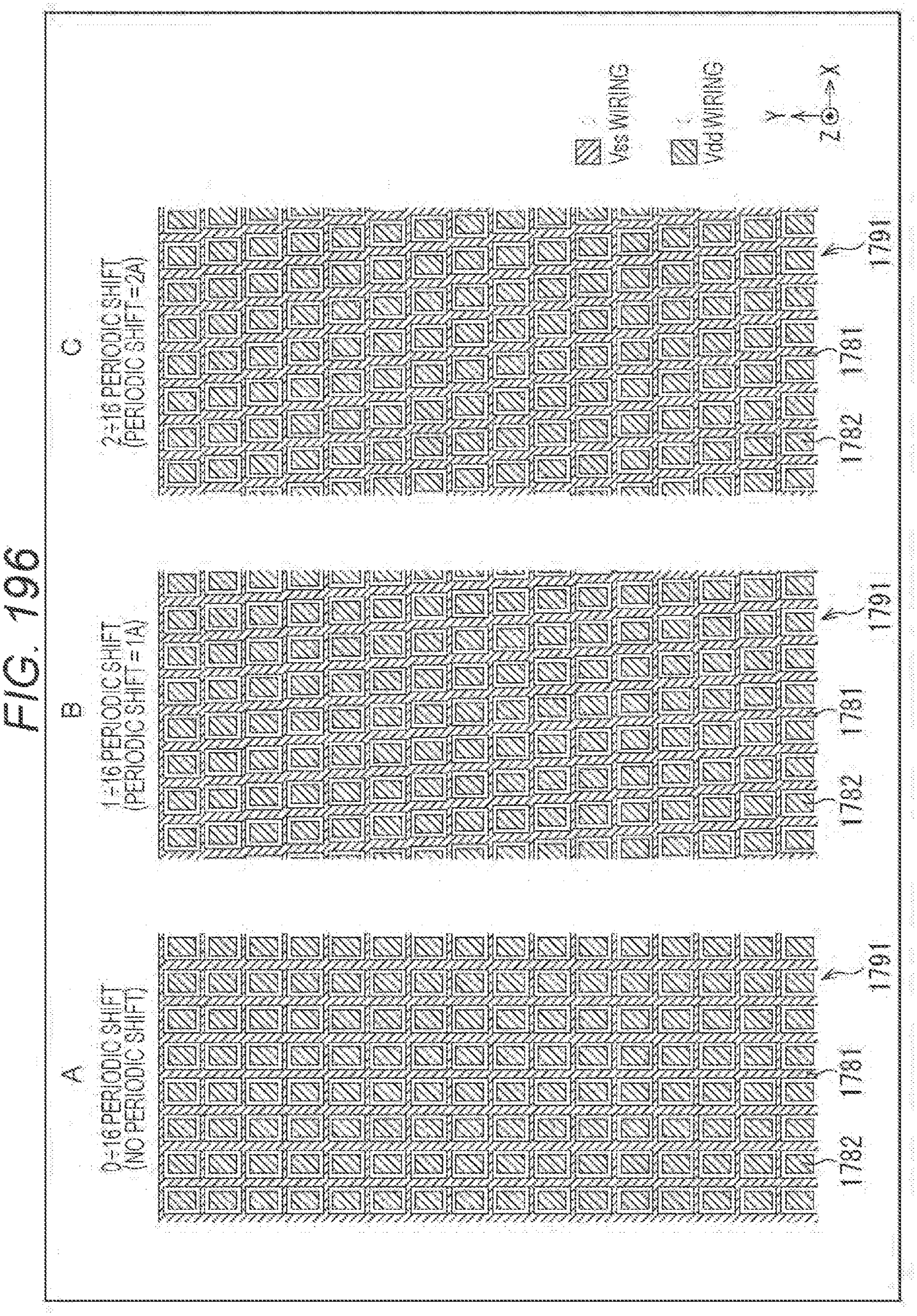

FIG. 196 is plan views of the fifth shift configuration example of the reticulated conductor.

Figure 197:
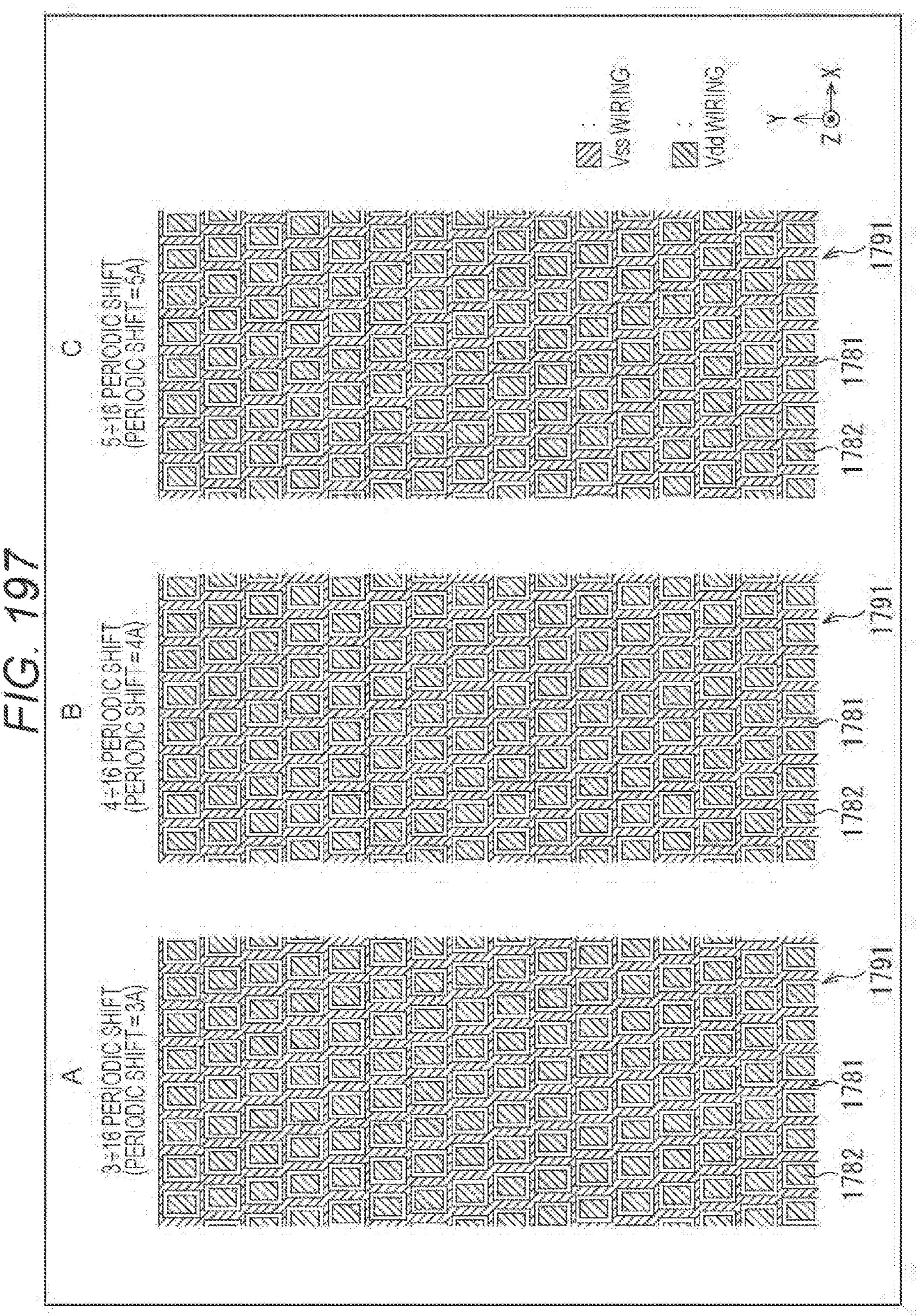

FIG. 197 is plan views of the fifth shift configuration example of the reticulated conductor.

Figure 198:
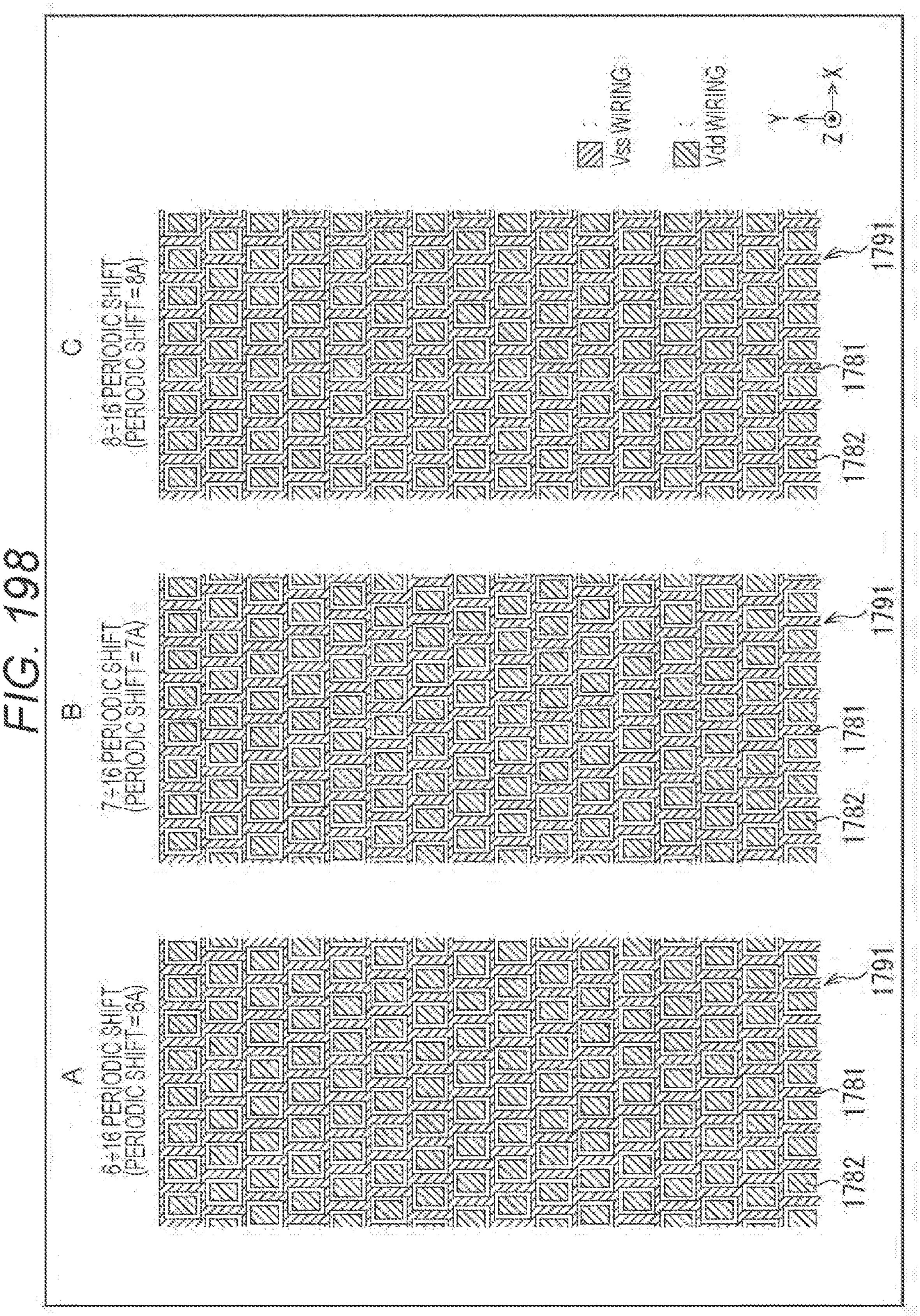

FIG. 198 is plan views of the fifth shift configuration example of the reticulated conductor.

Figure 199:
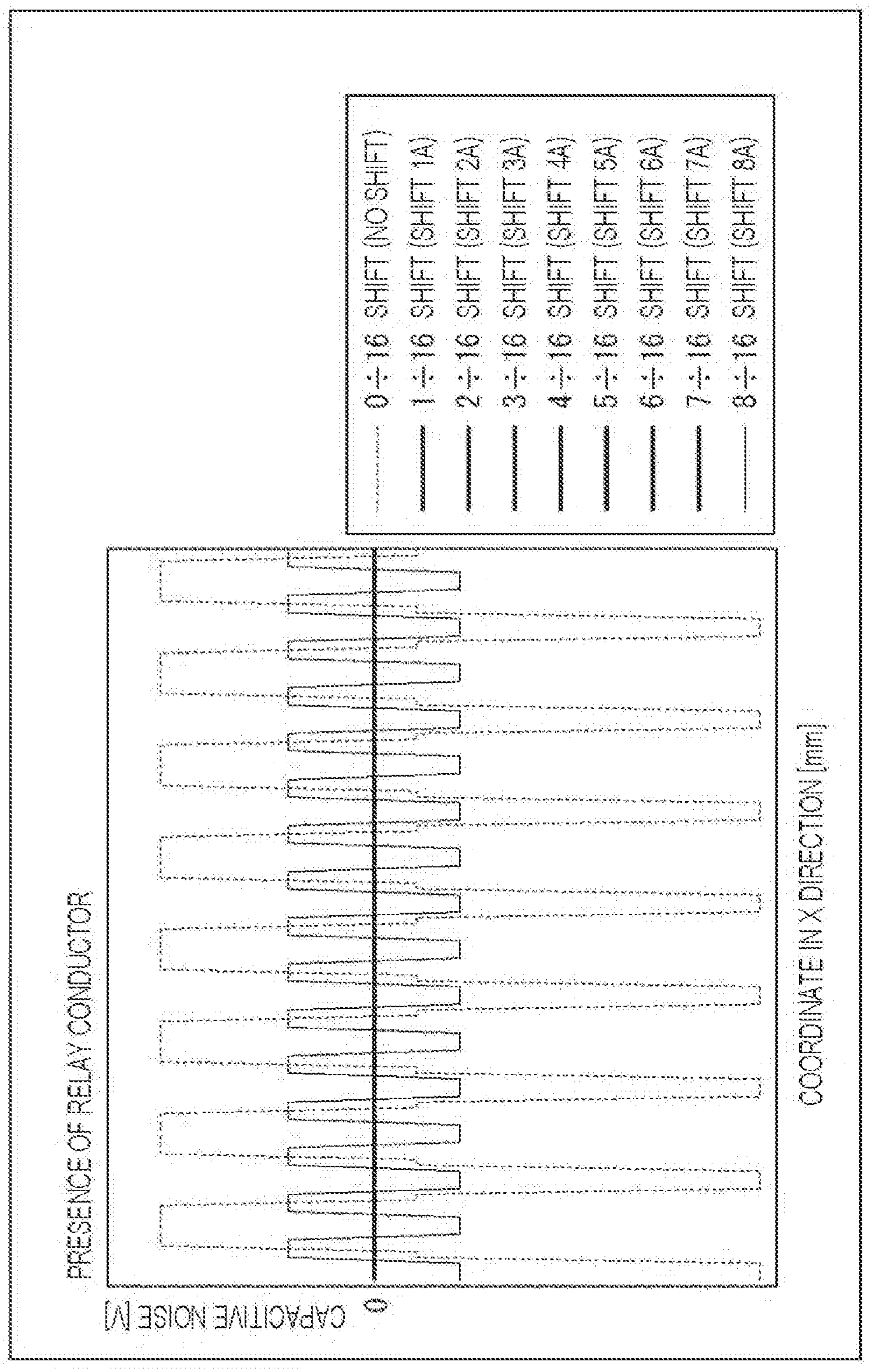

FIG. 199 is a diagram illustrating theoretical values of the capacitive noise in the fifth shift configuration example.

Figure 200:
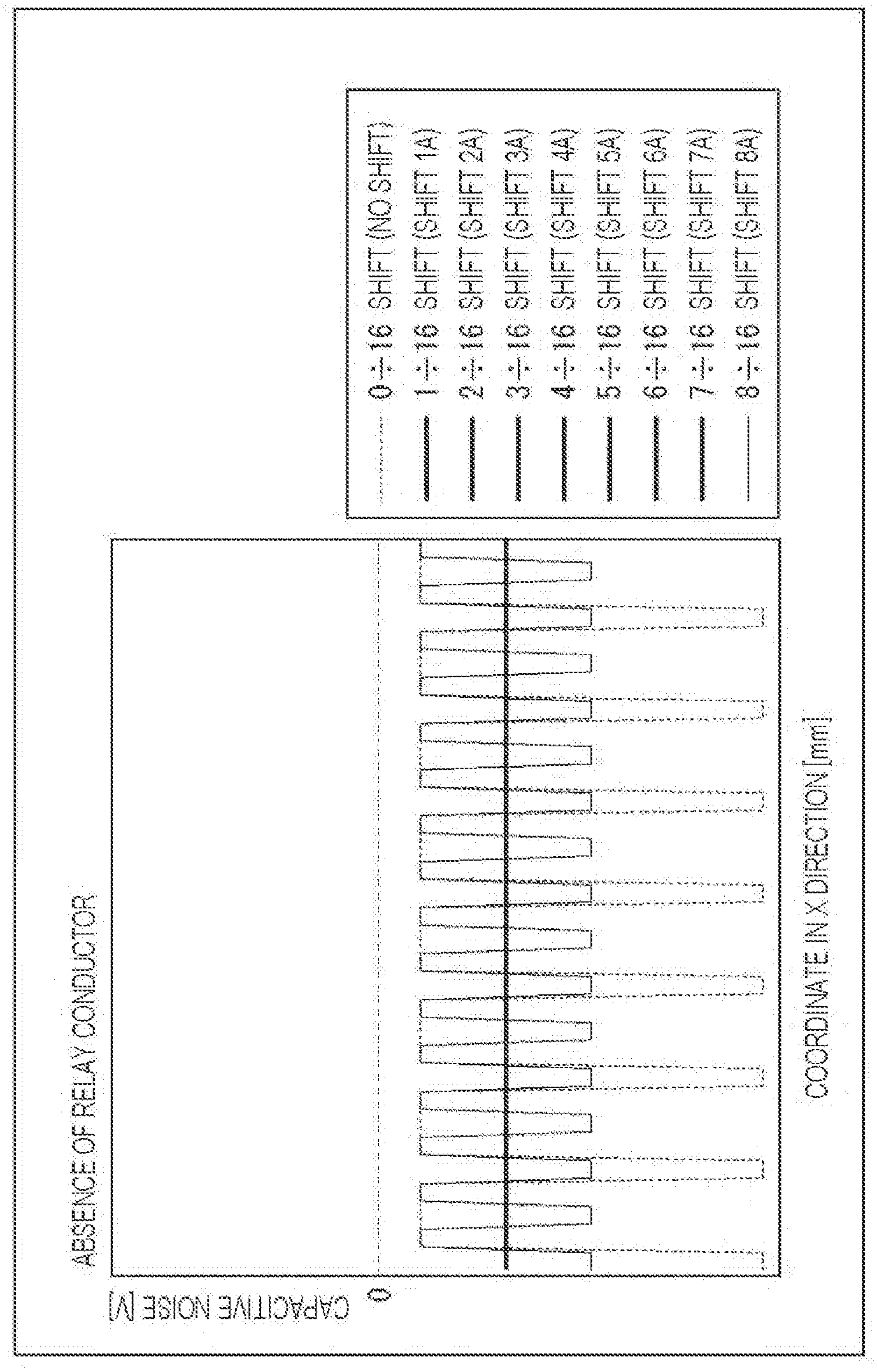

FIG. 200 is a diagram illustrating theoretical values of the capacitive noise in the fifth shift configuration example.

Figure 201:
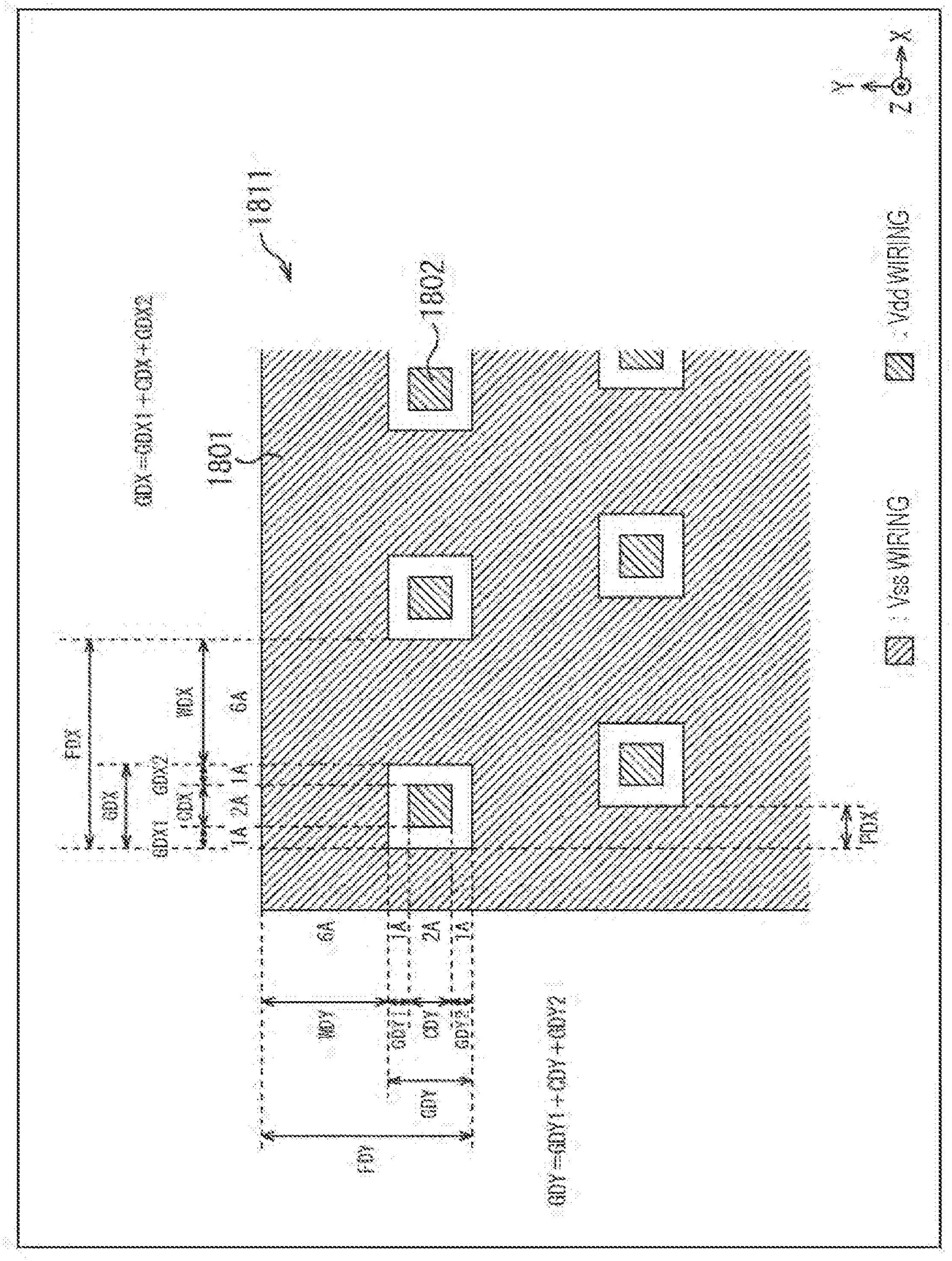

FIG. 201 is a view for describing a conductor width and a gap width of a sixth shift configuration example of the reticulated conductor.

Figure 202:
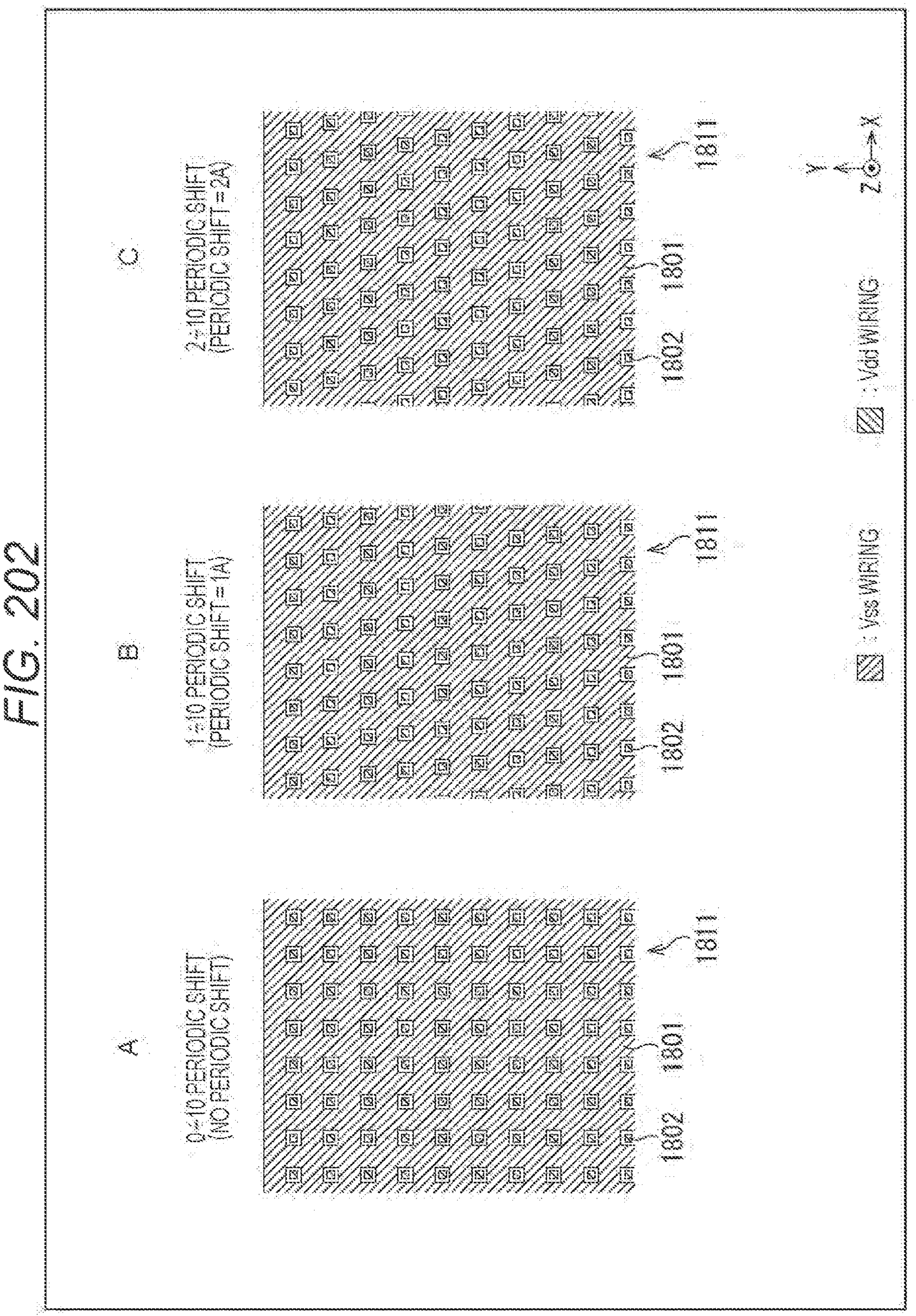

FIG. 202 is plan views of the sixth shift configuration example of the reticulated conductor.

Figure 203:
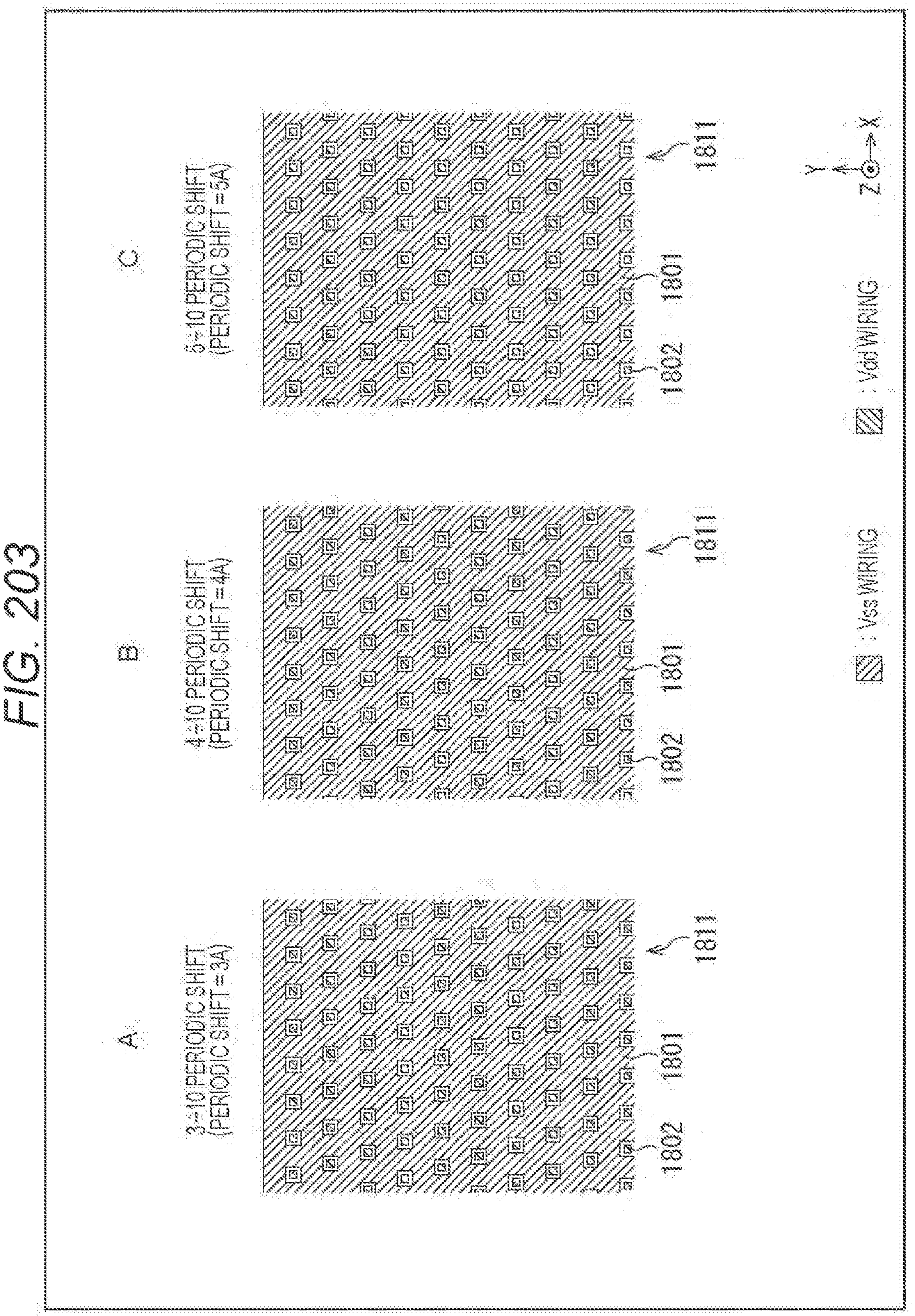

FIG. 203 is plan views of the sixth shift configuration example of the reticulated conductor.

Figure 204:
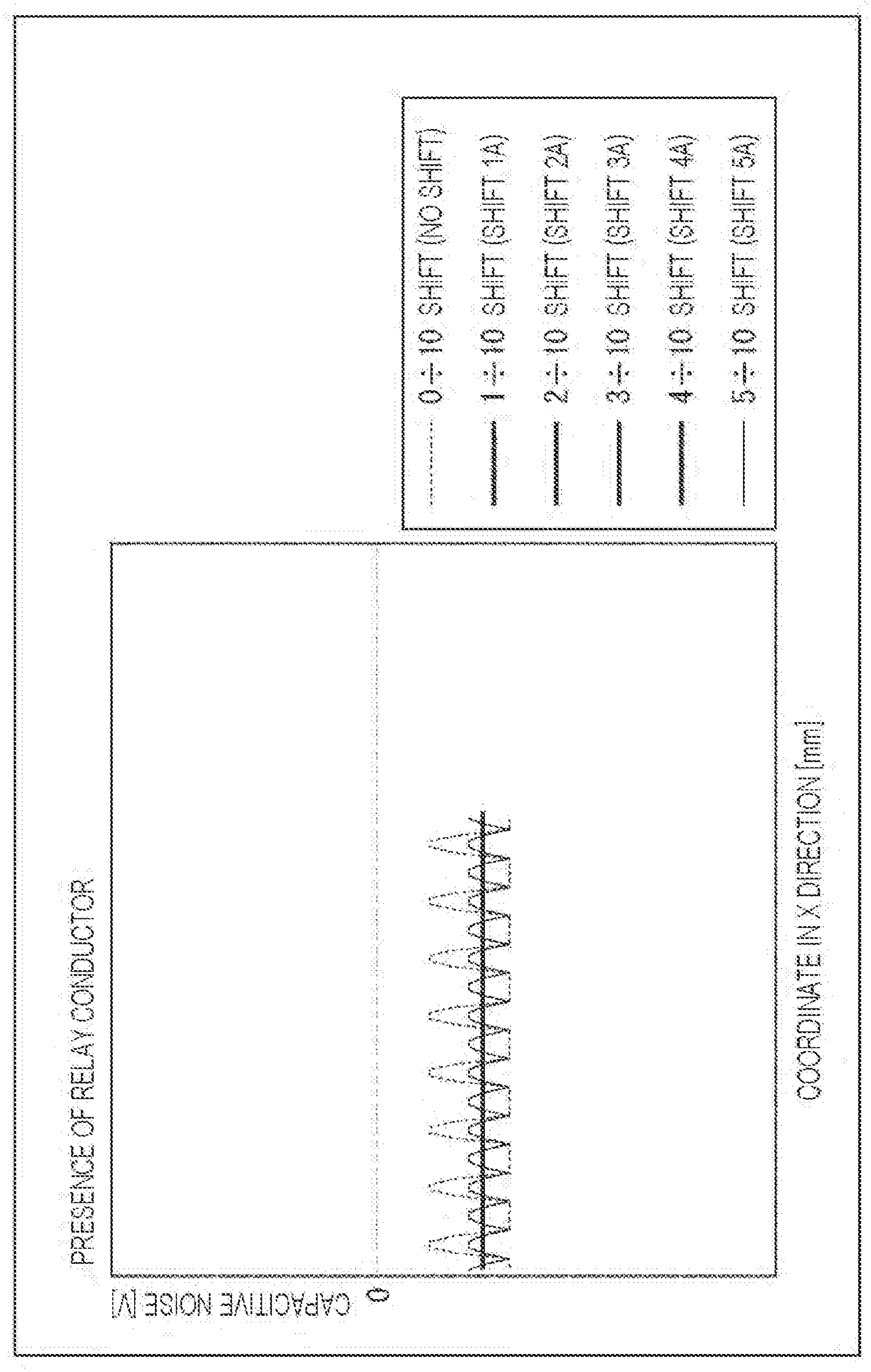

FIG. 204 is a diagram illustrating theoretical values of the capacitive noise in the sixth shift configuration example.

Figure 205:
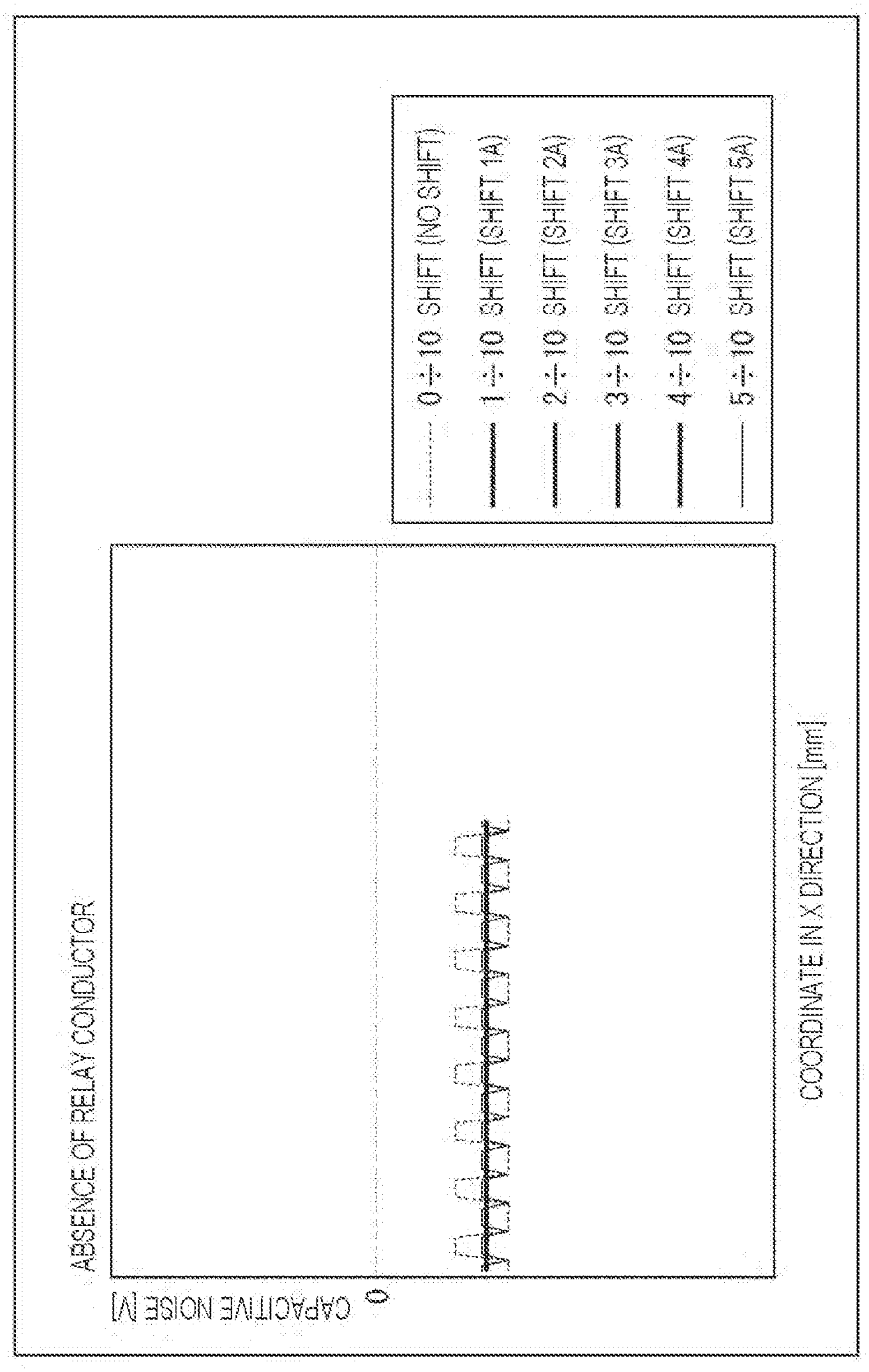

FIG. 205 is a diagram illustrating theoretical values of the capacitive noise in the sixth shift configuration example.

Figure 206:
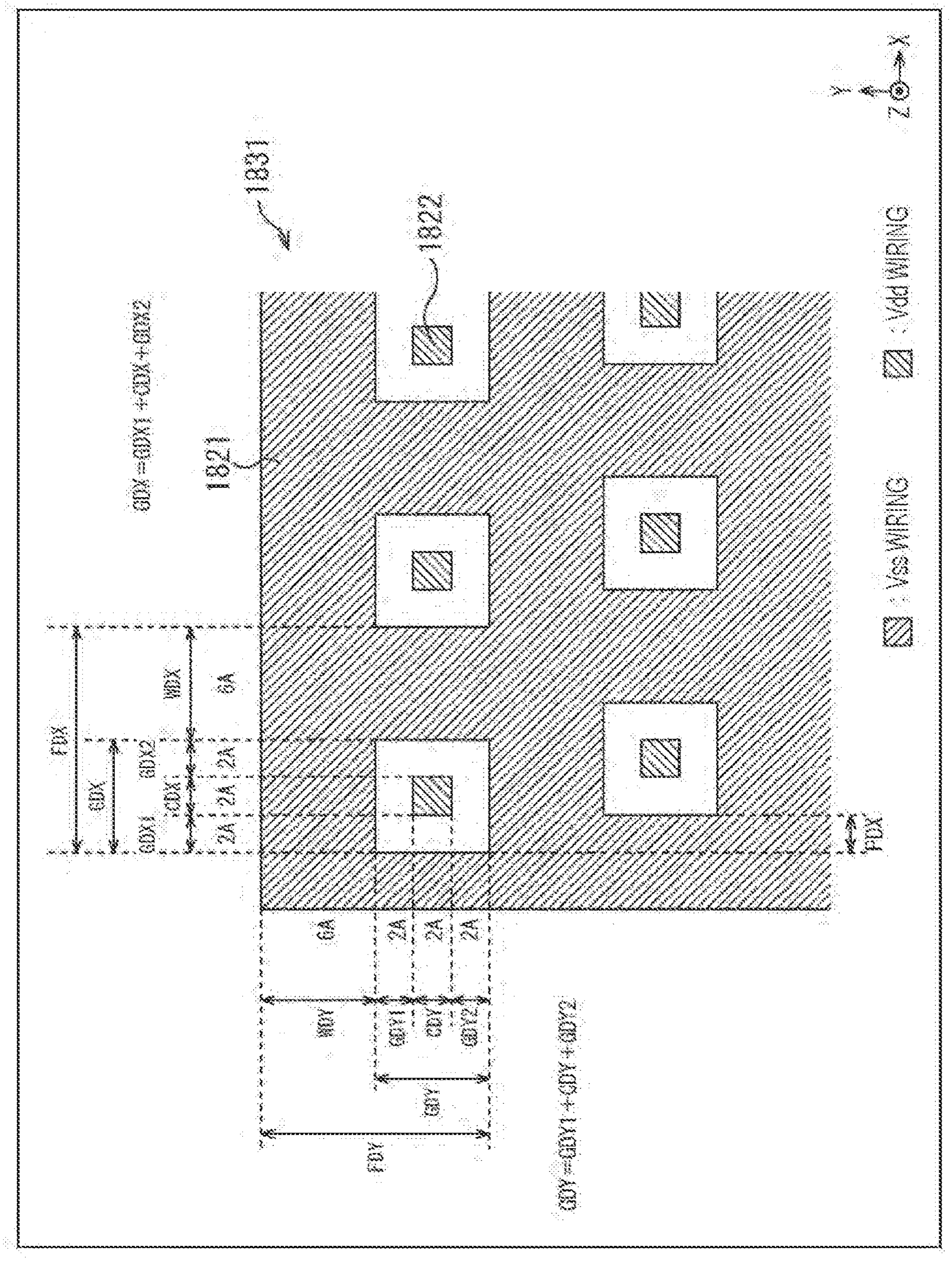

FIG. 206 is a view for describing a conductor width and a gap width of a seventh shift configuration example of the reticulated conductor.

Figure 207:
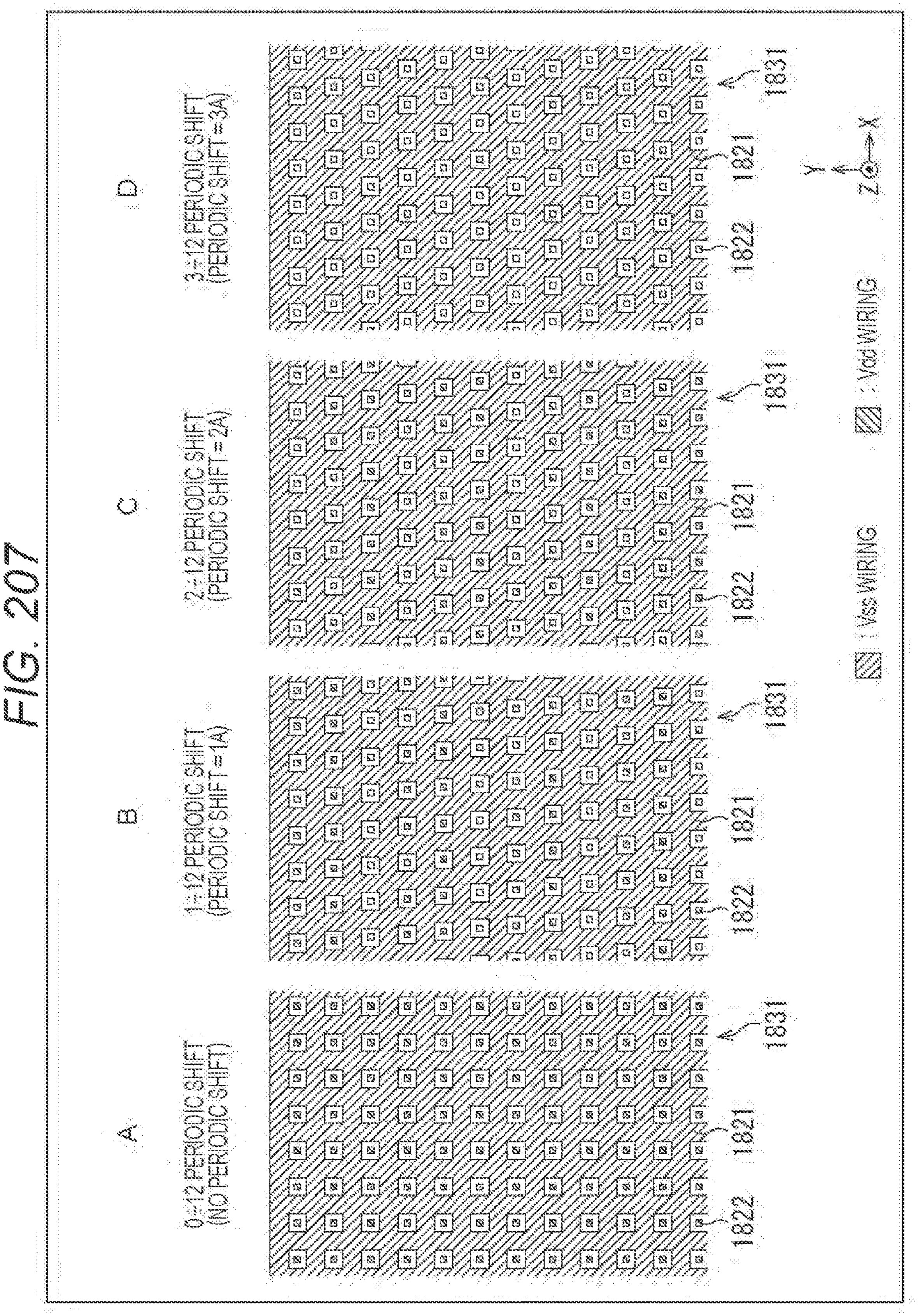

FIG. 207 is plan views of the seventh shift configuration example of the reticulated conductor.

Figure 208:
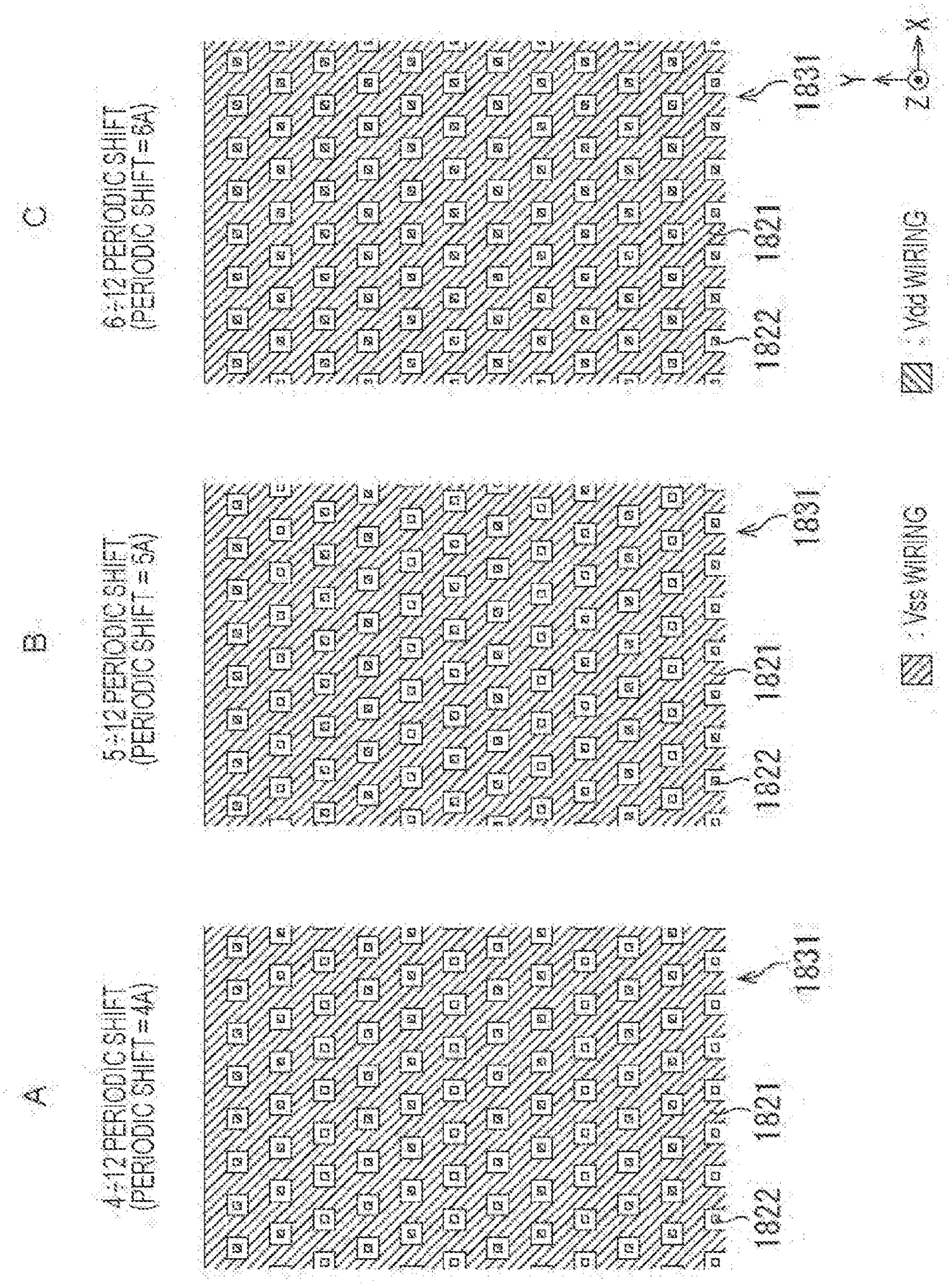

FIG. 208 is plan views of the seventh shift configuration example of the reticulated conductor.

Figure 209:
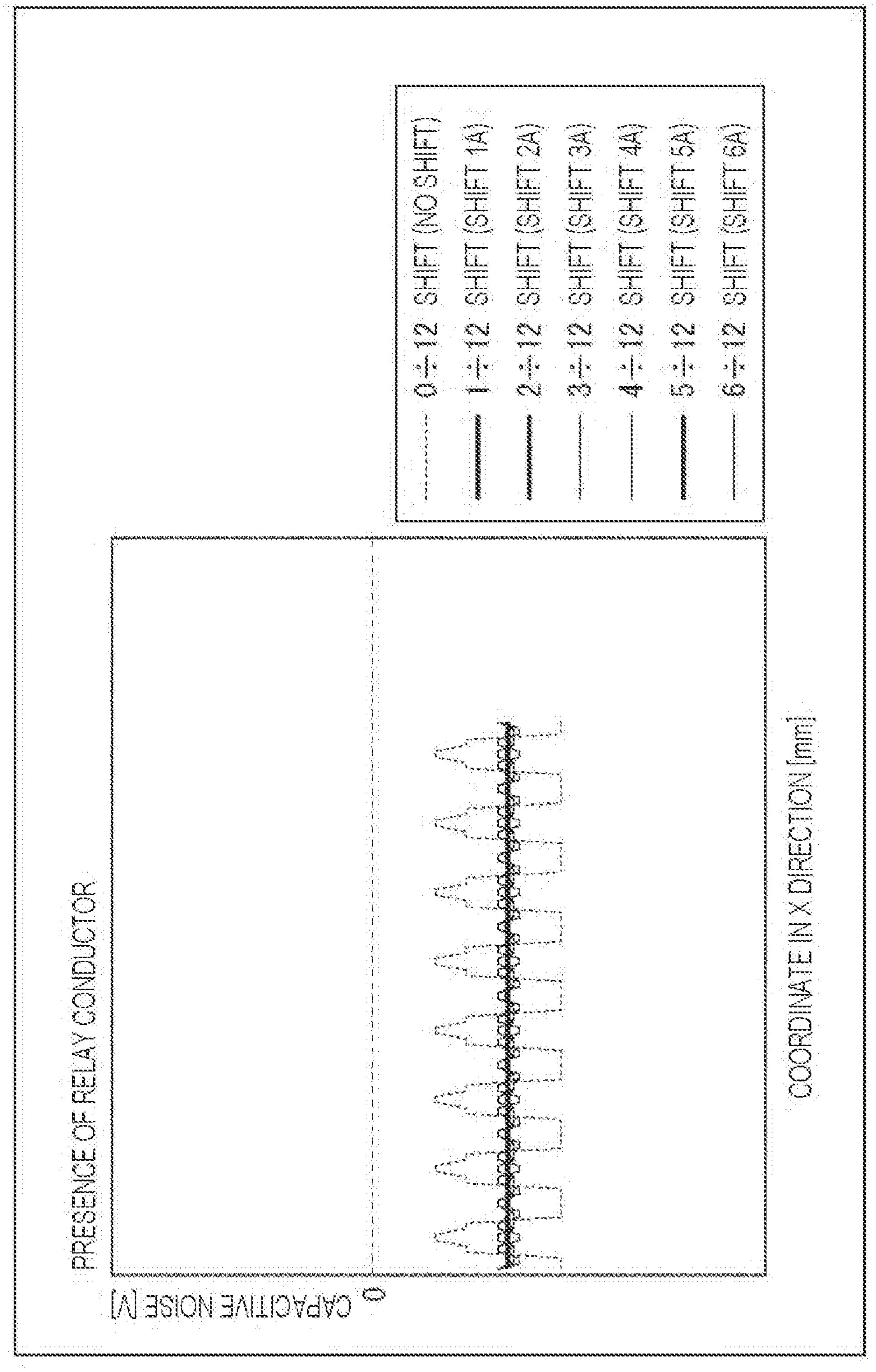

FIG. 209 is a diagram illustrating theoretical values of the capacitive noise in the seventh shift configuration example.

Figure 210:
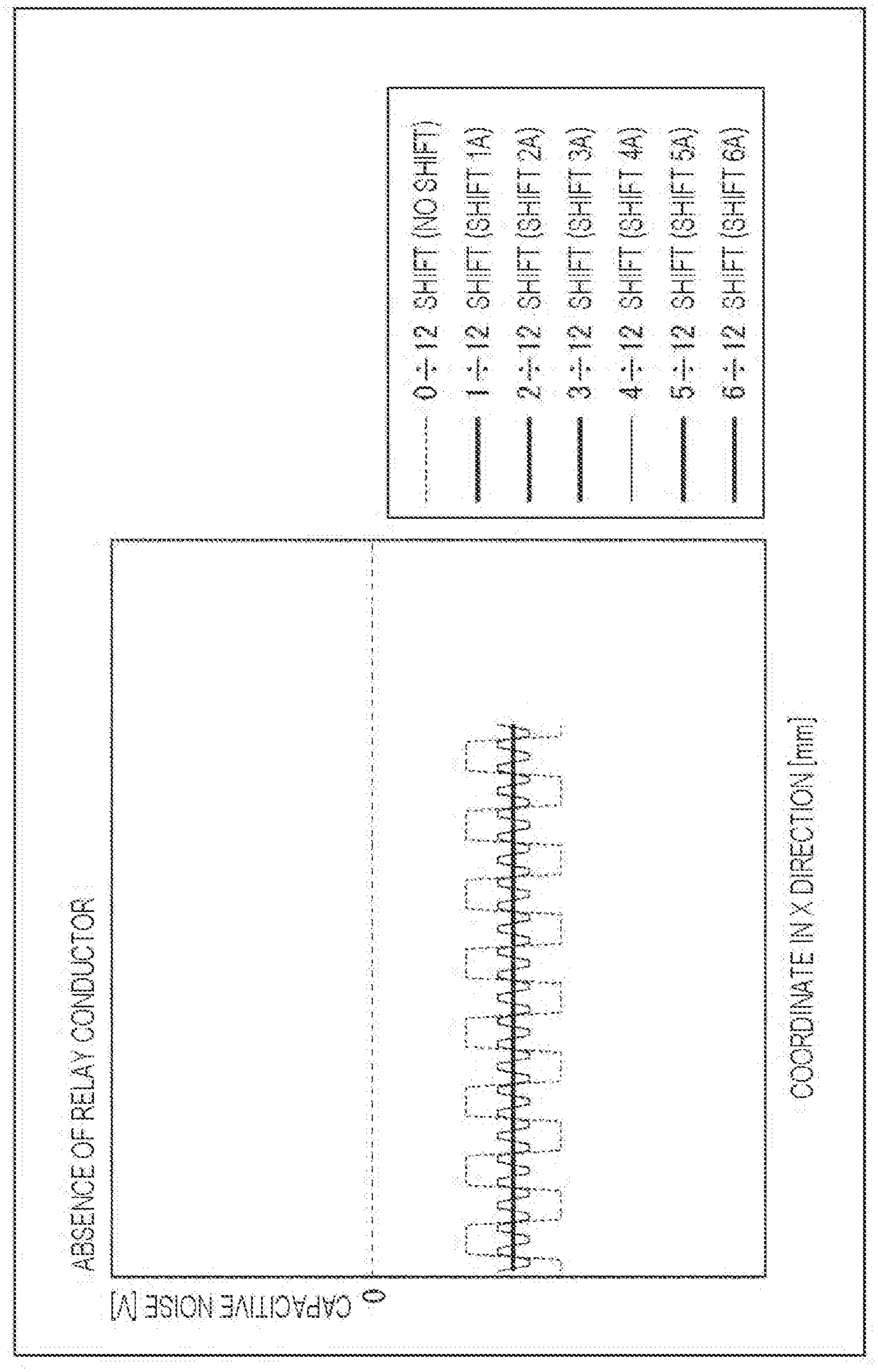

FIG. 210 is a diagram illustrating theoretical values of the capacitive noise in the seventh shift configuration example.

Figure 211:
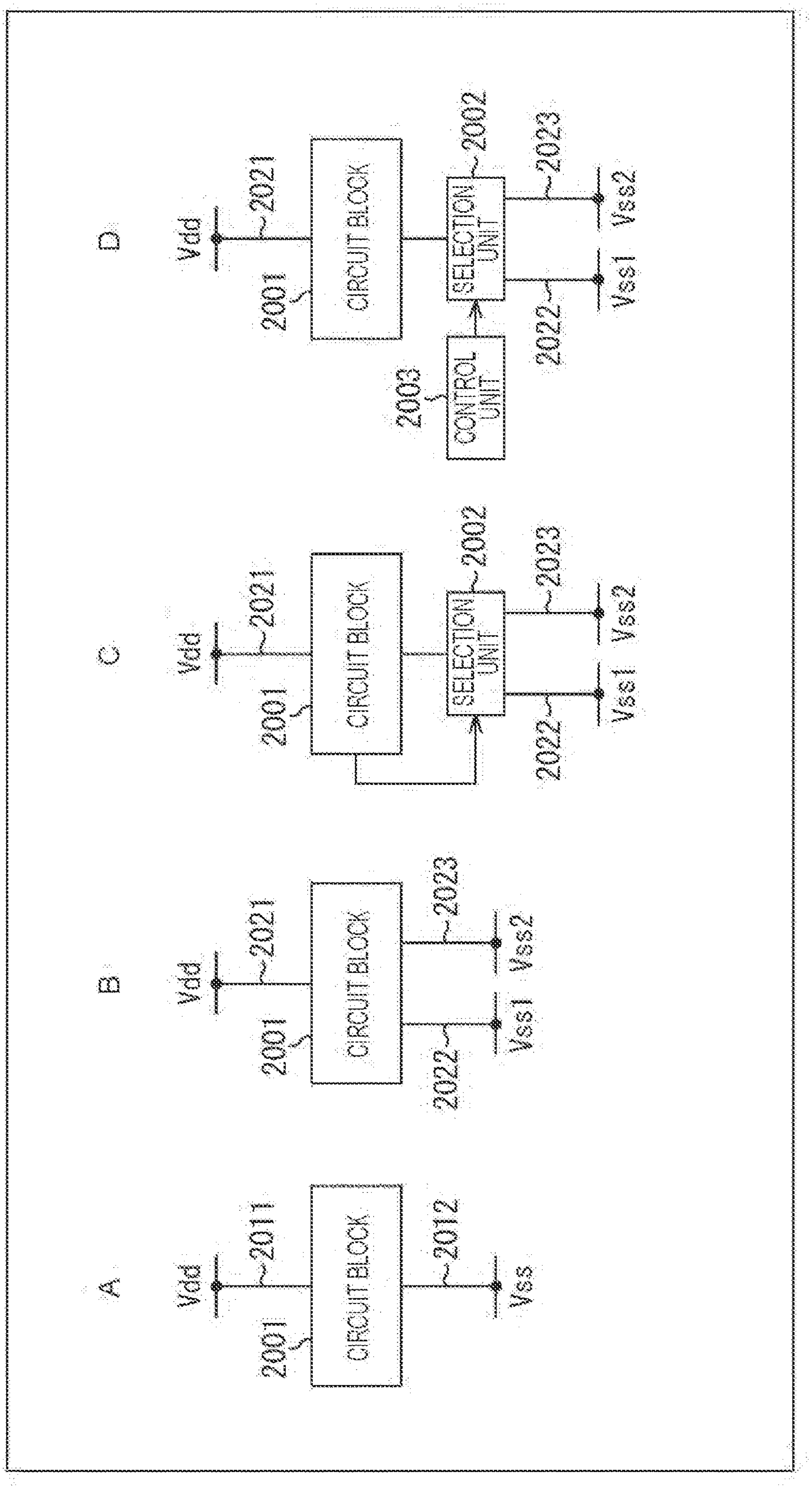

FIG. 211 is conceptual diagrams in cases where a solid-state imaging device adopts a two-power supply and a three-power supply.

Figure 212:
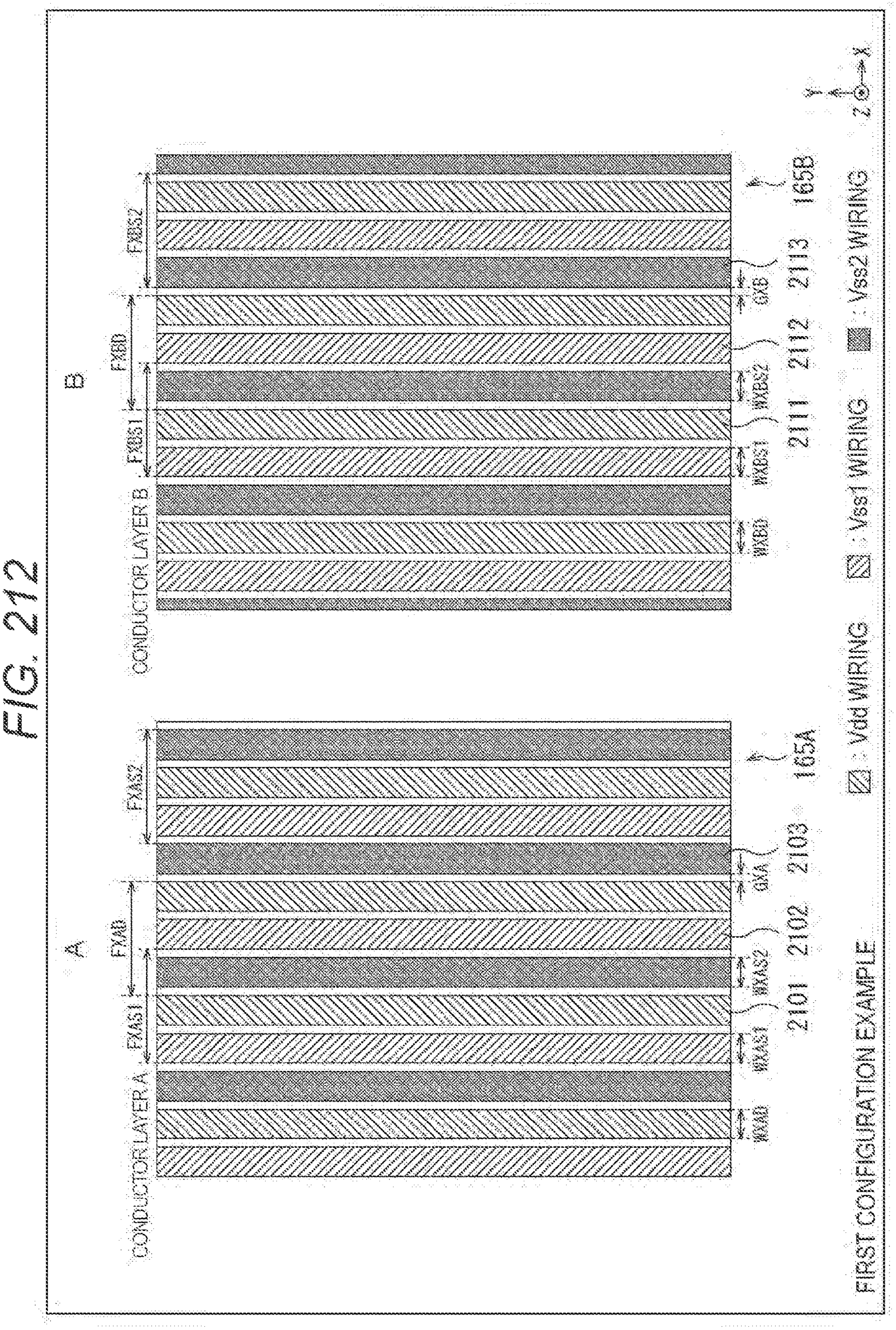

FIG. 212 is plan views of a first configuration example of the three-power supply.

Figure 213:
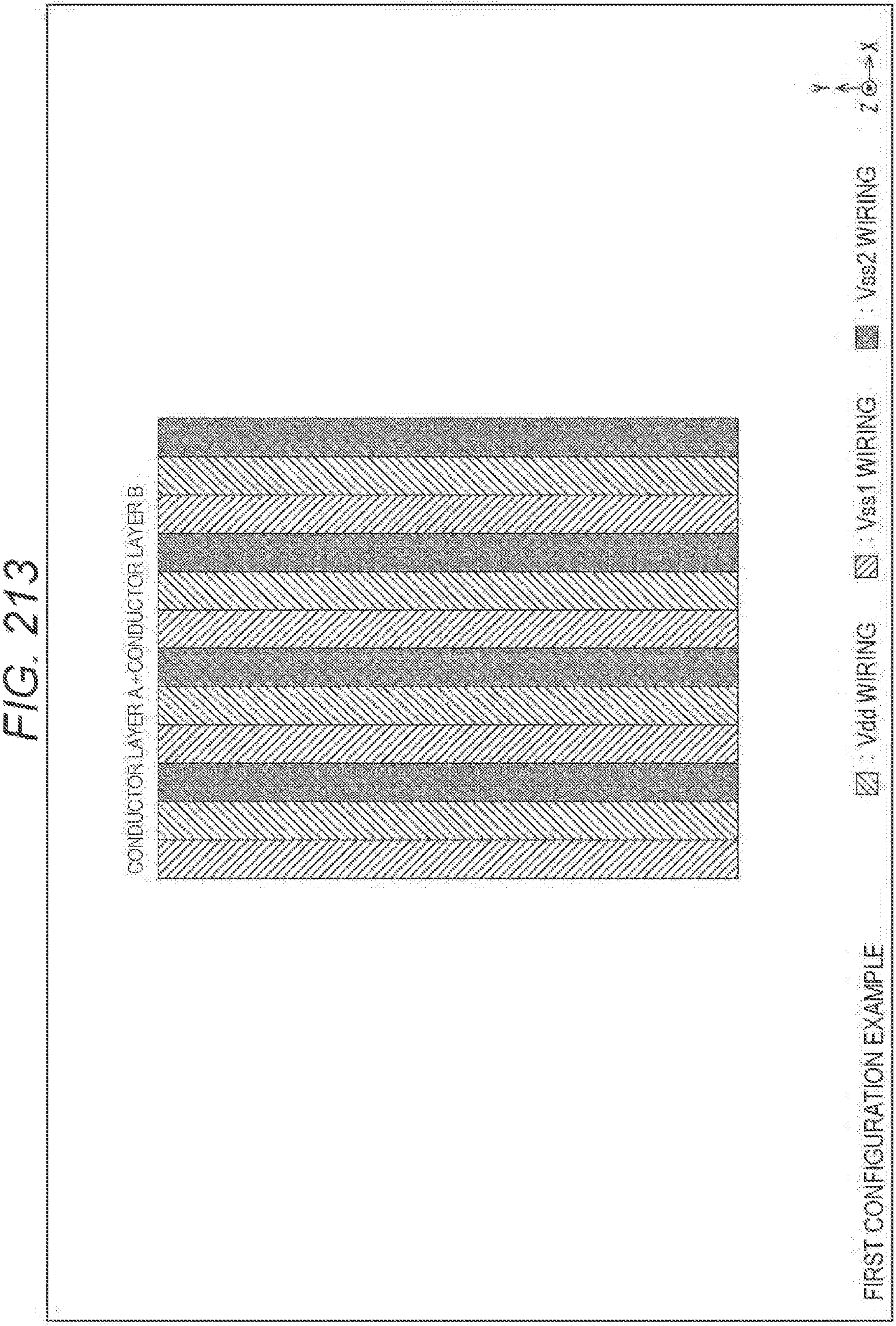

FIG. 213 is a plan view of the first configuration example of the three-power supply.

Figure 214:
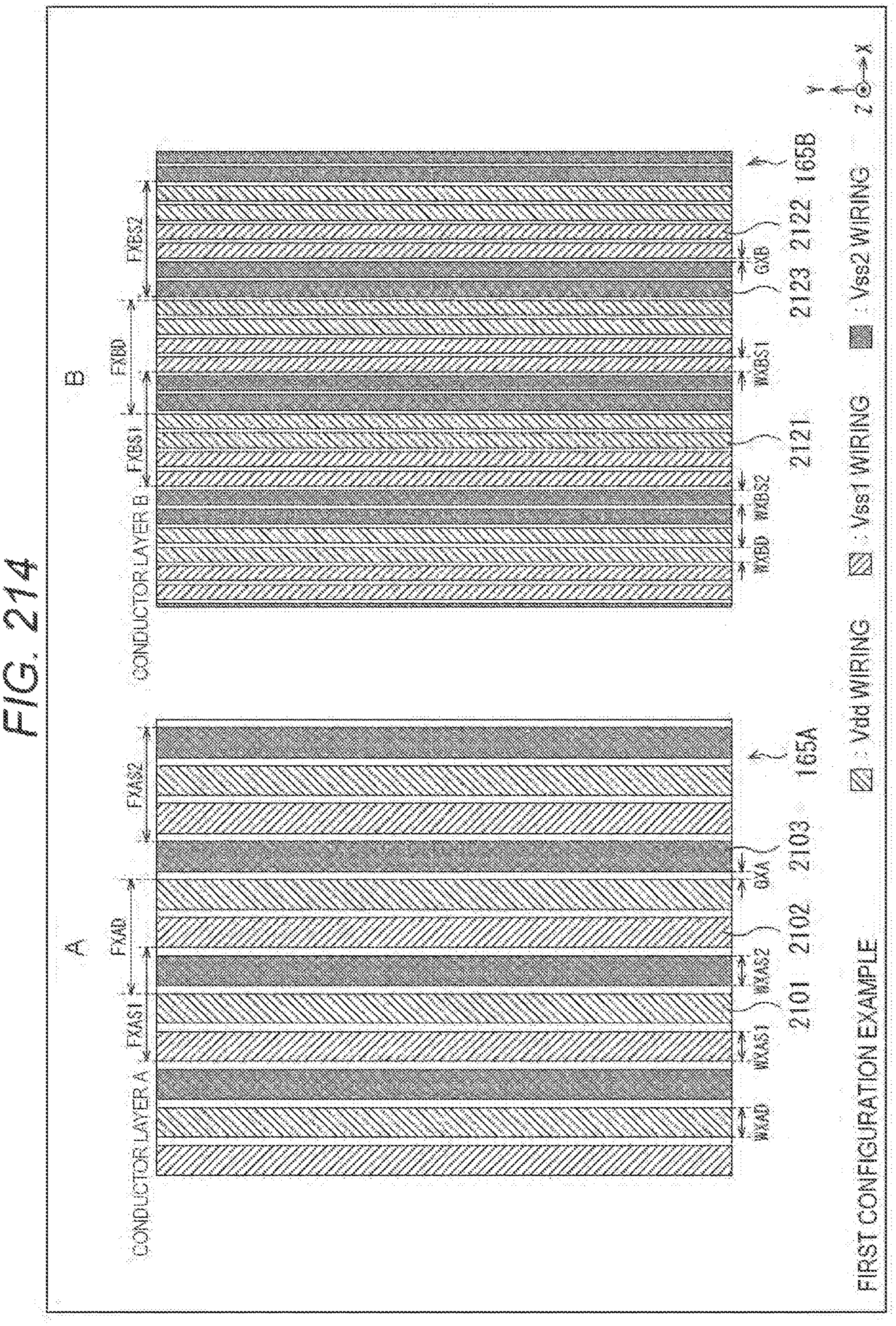

FIG. 214 is plan views of a first modification of the first configuration example of the three-power supply.

Figure 215:
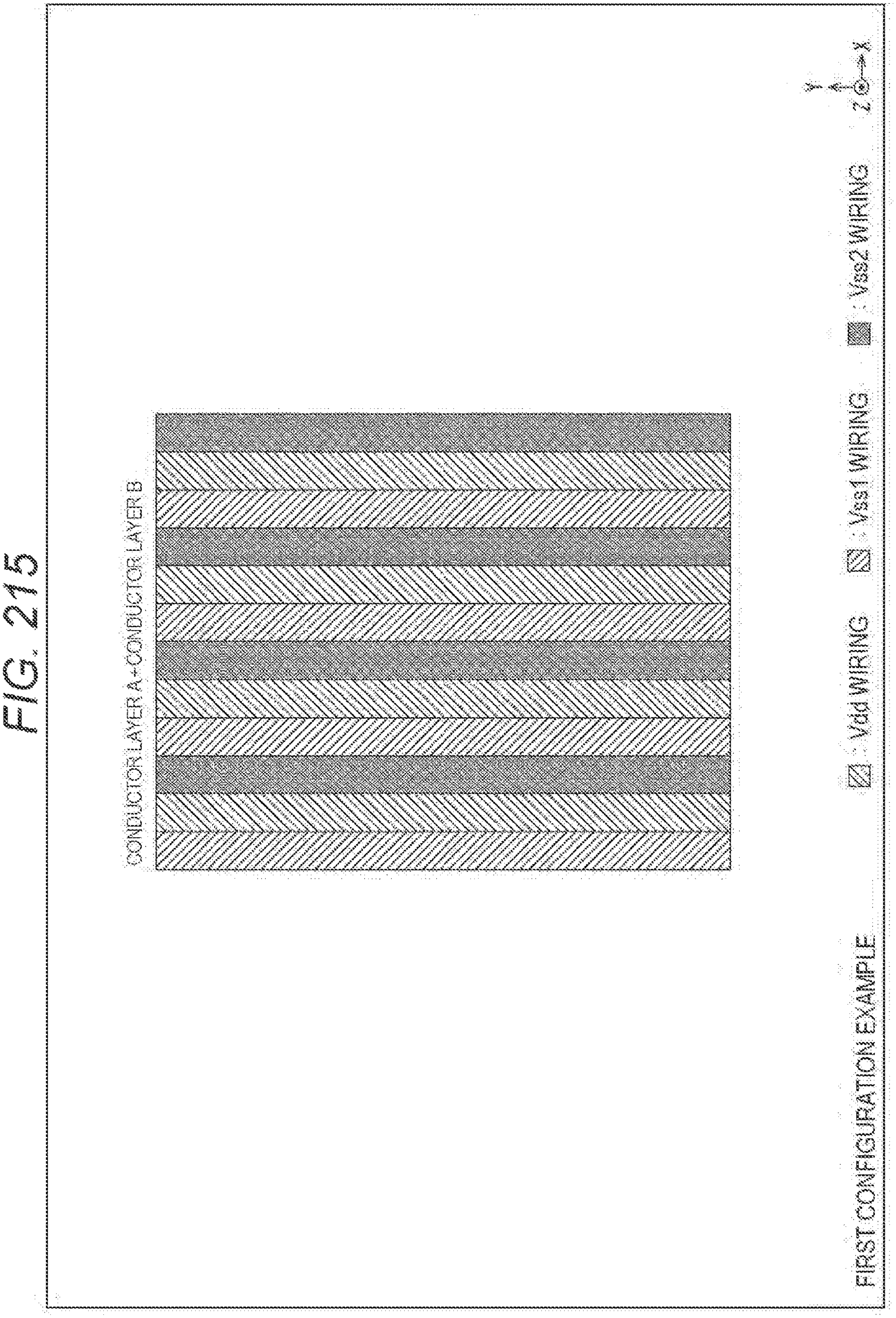

FIG. 215 is a plan view of the first modification of the first configuration example of the three-power supply.

Figure 216:
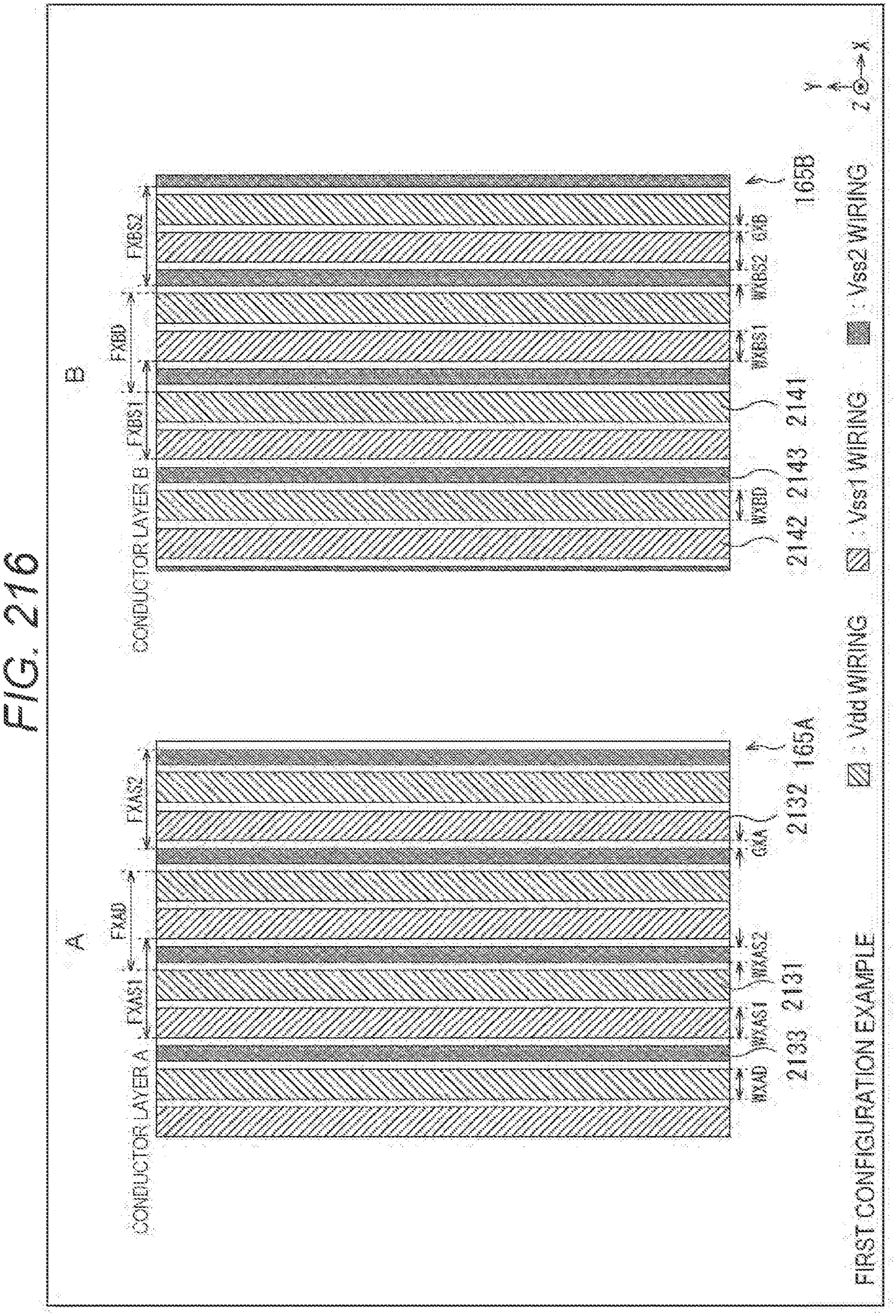

FIG. 216 is plan views of a second modification of the first configuration example of the three-power supply.

Figure 217:
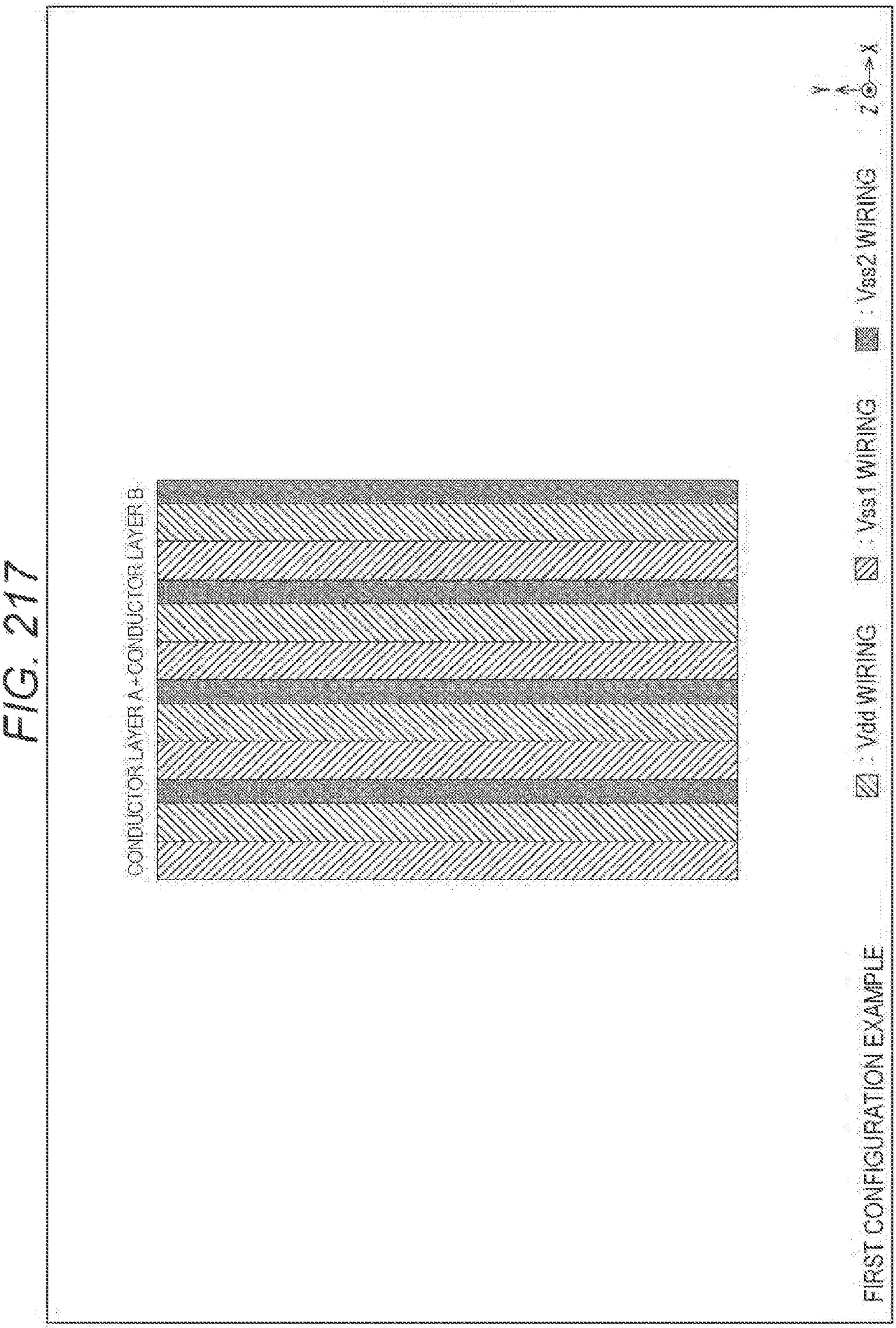

FIG. 217 is a plan view of the second modification of the first configuration example of the three-power supply.

Figure 218:
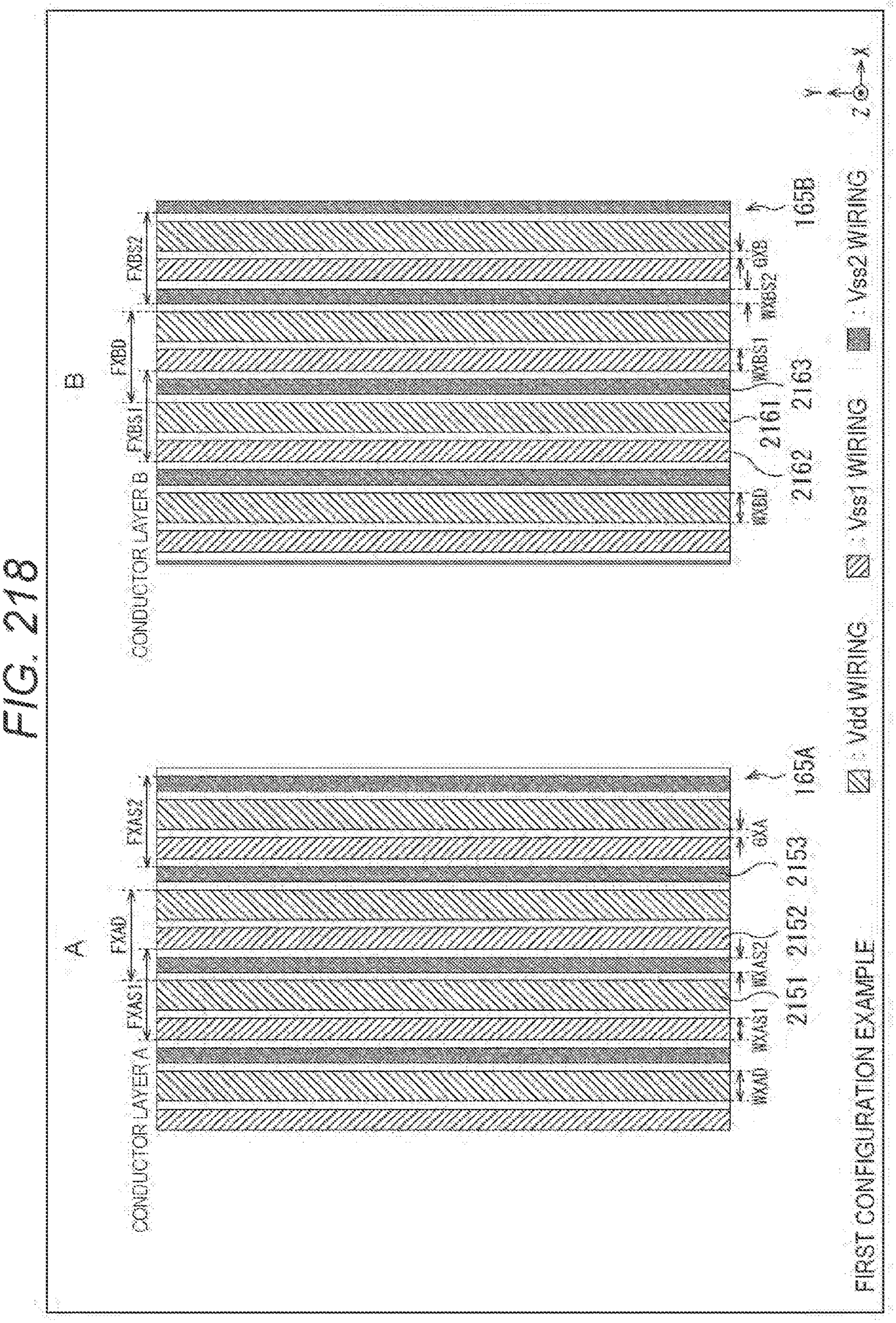

FIG. 218 is plan views of a third modification of the first configuration example of the three-power supply.

Figure 219:
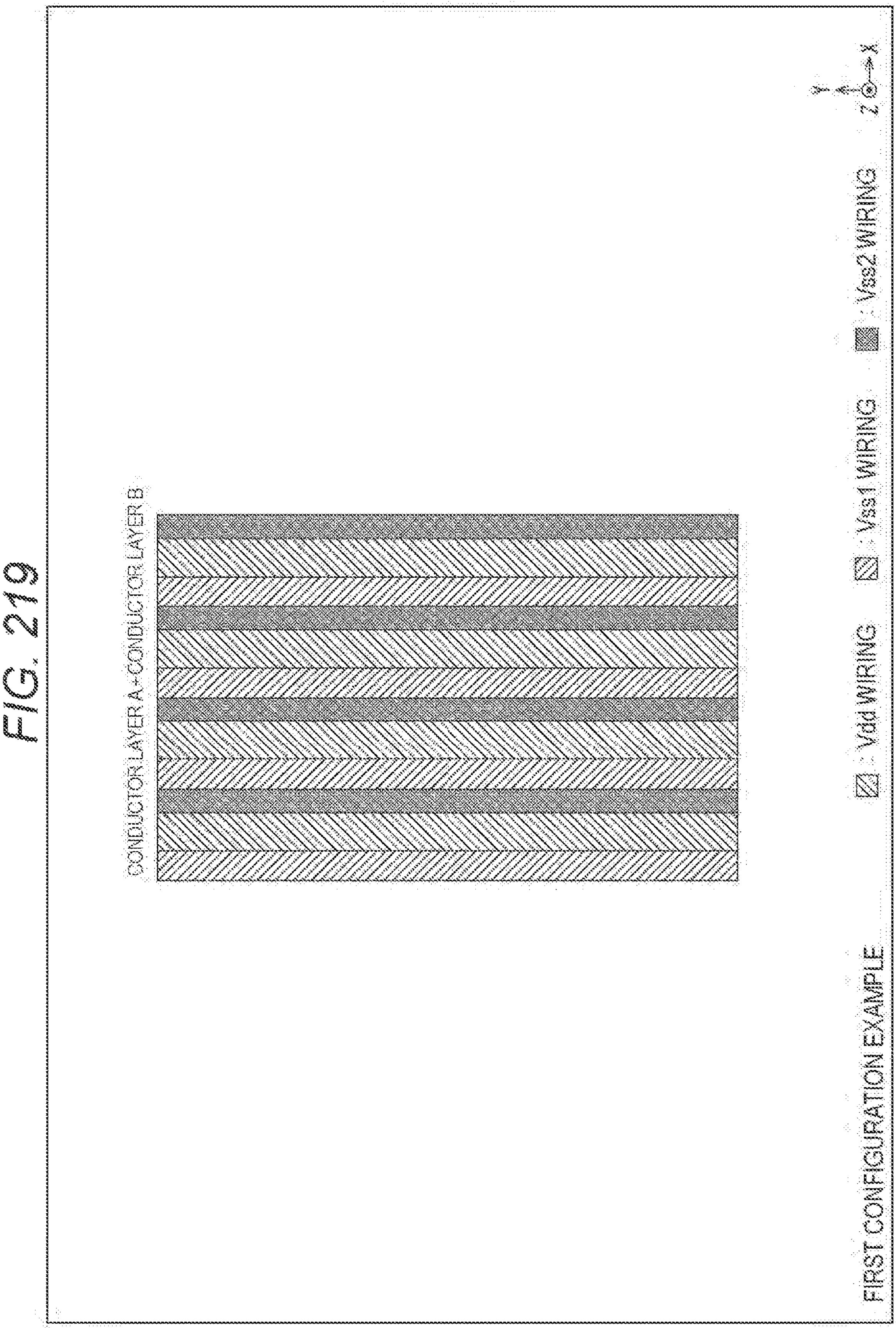

FIG. 219 is a plan view of the third modification of the first configuration example of the three-power supply.

Figure 220:
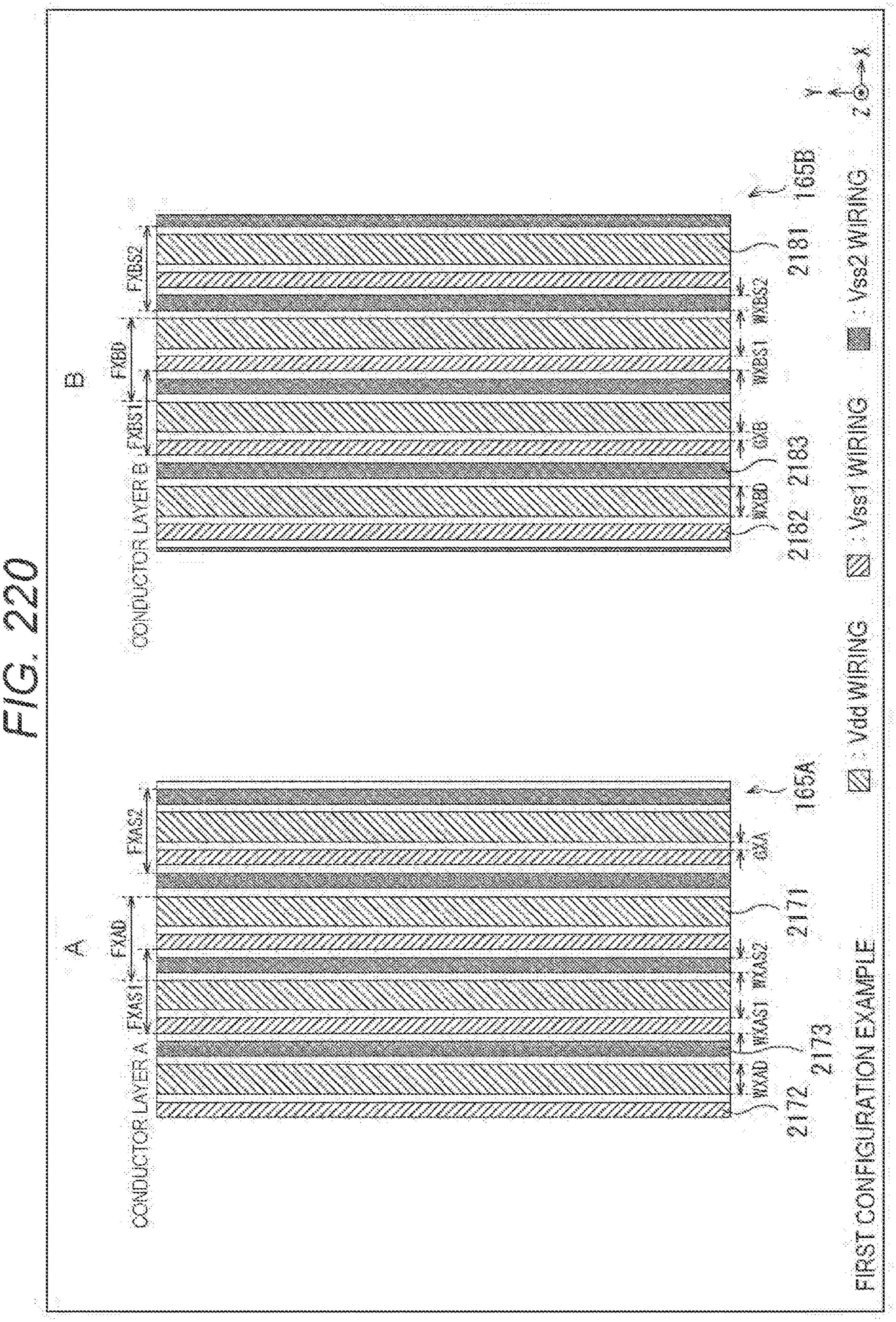

FIG. 220 is plan views of a fourth modification of the first configuration example of the three-power supply.

Figure 221:
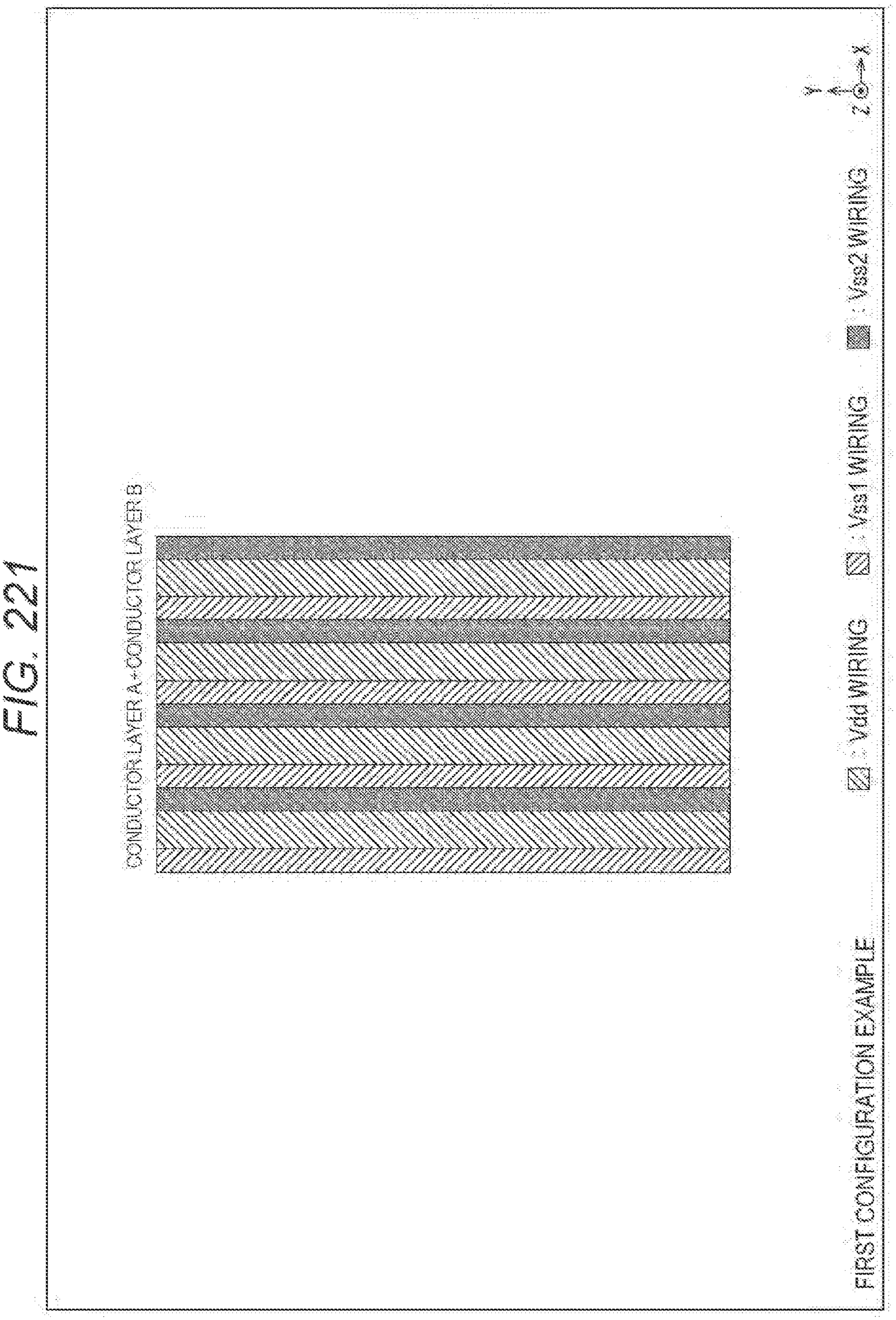

FIG. 221 is a plan view of the fourth modification of the first configuration example of the three-power supply.

Figure 222:
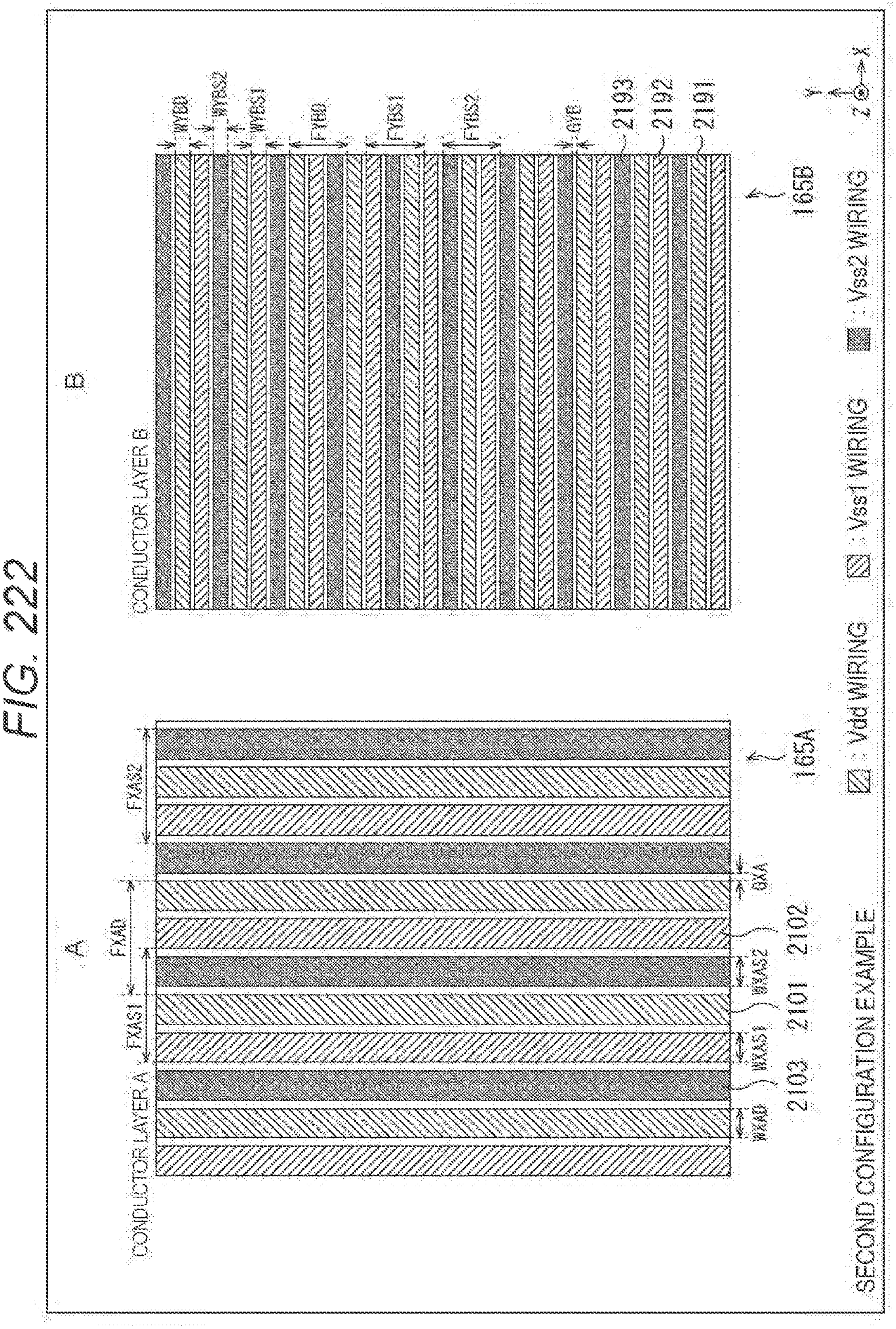

FIG. 222 is plan views of a second configuration example of the three-power supply.

Figure 223:
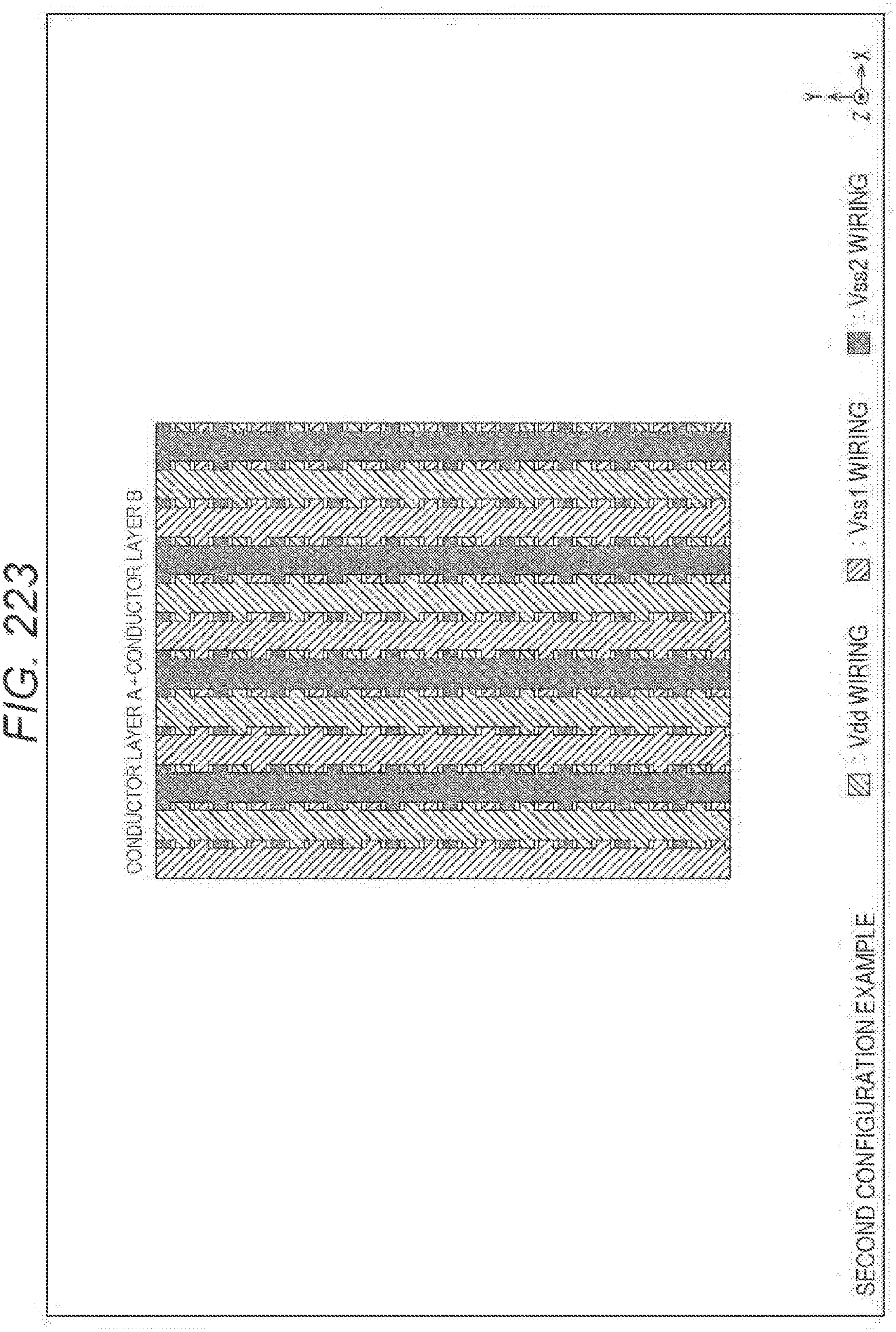

FIG. 223 is a plan view of the second configuration example of the three-power supply.

Figure 224:
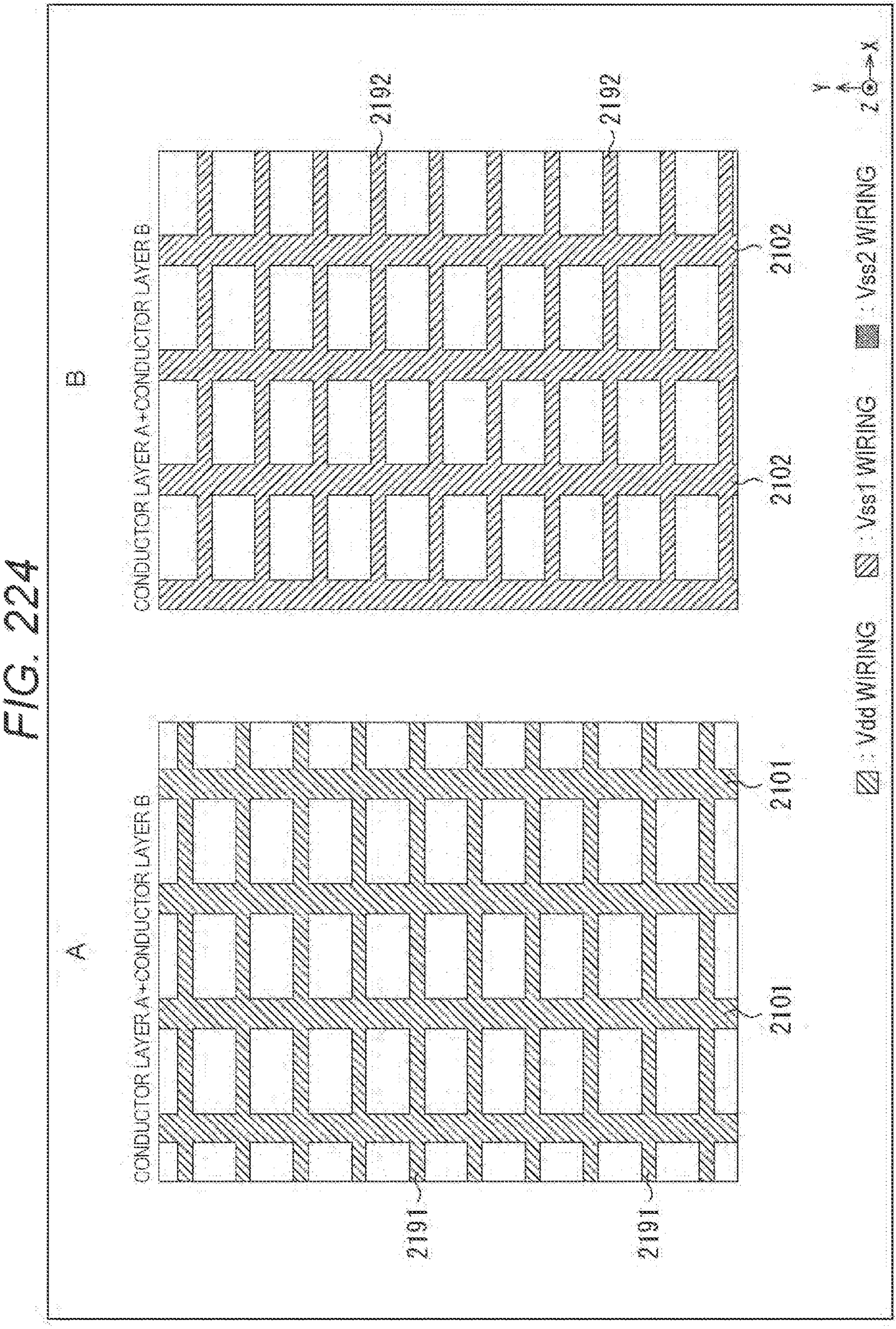

FIG. 224 is plan views of the second configuration example of the three-power supply.

Figure 225:
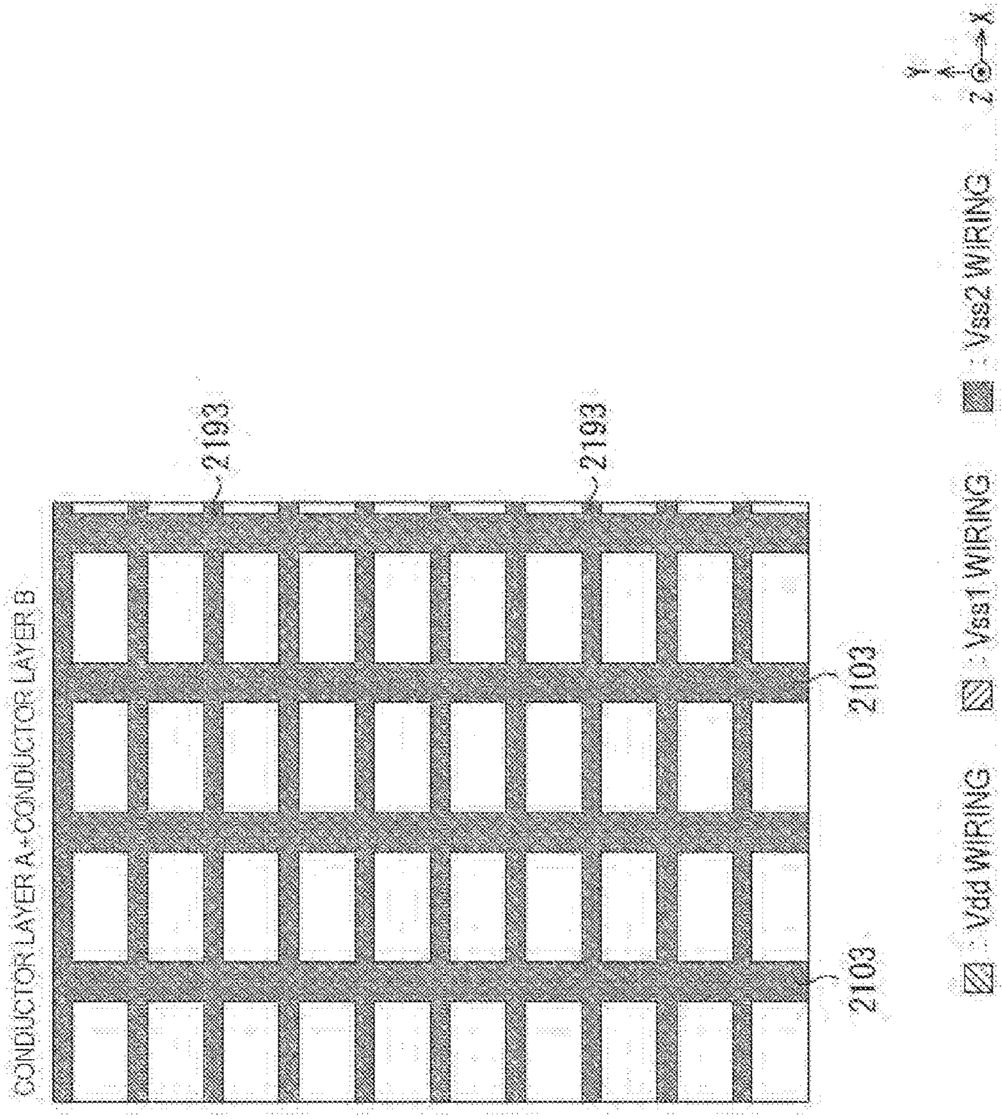

FIG. 225 is a plan view of the second configuration example of the three-power supply.

Figure 226:
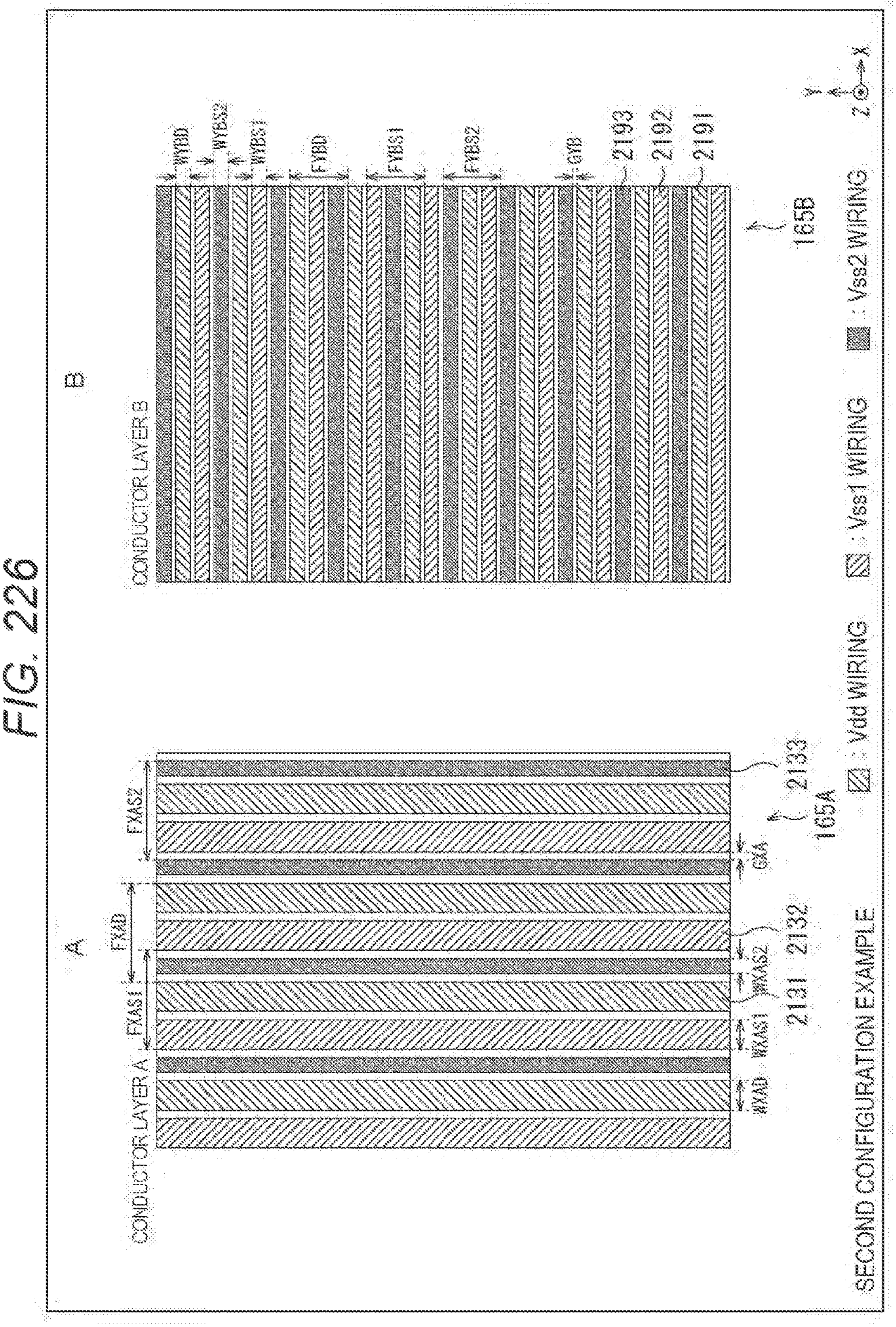

FIG. 226 is plan views of a first modification of the second configuration example of the three-power supply.

Figure 227:
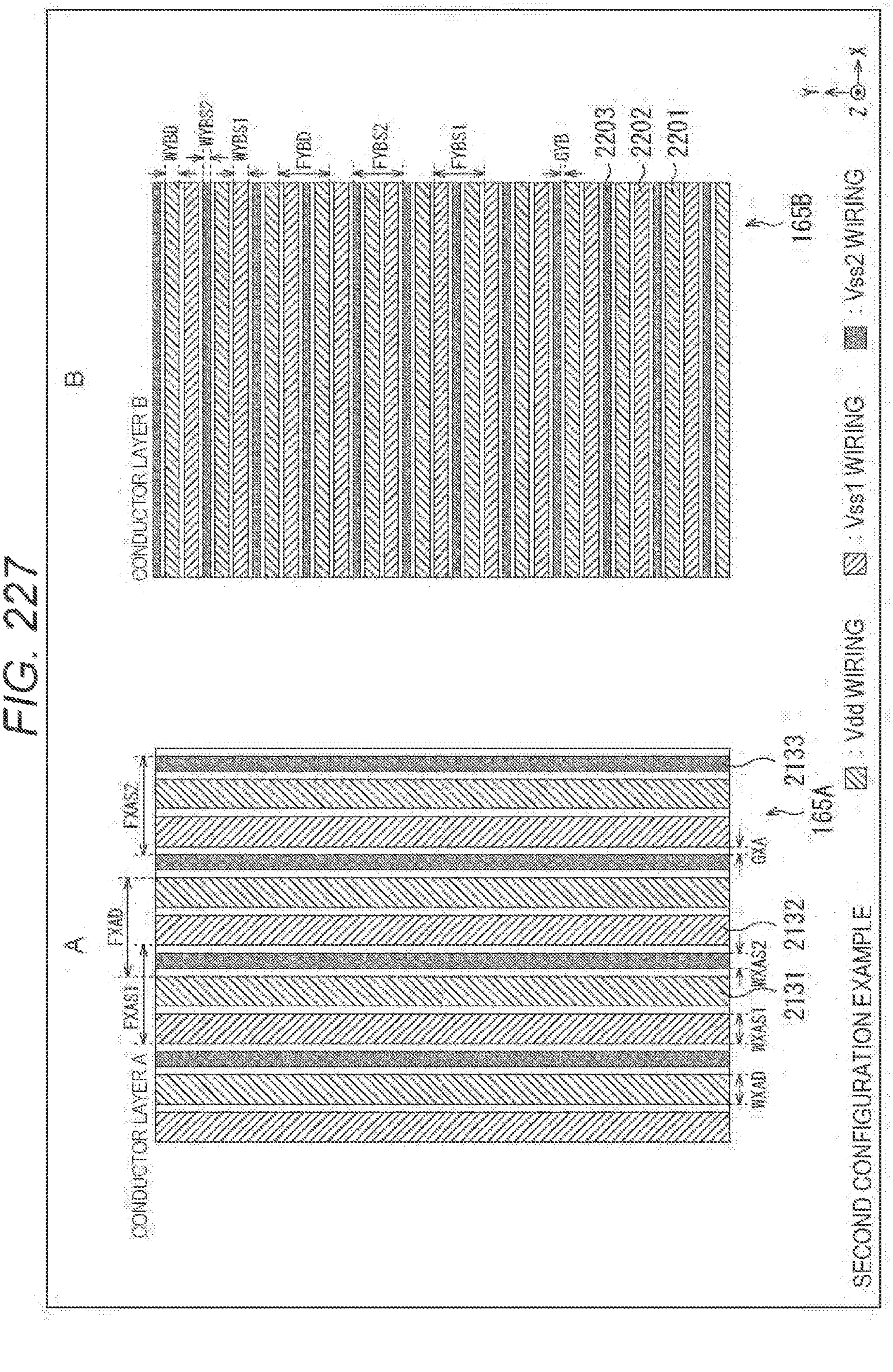

FIG. 227 is plan views of a second modification of the second configuration example of the three-power supply.

Figure 228:
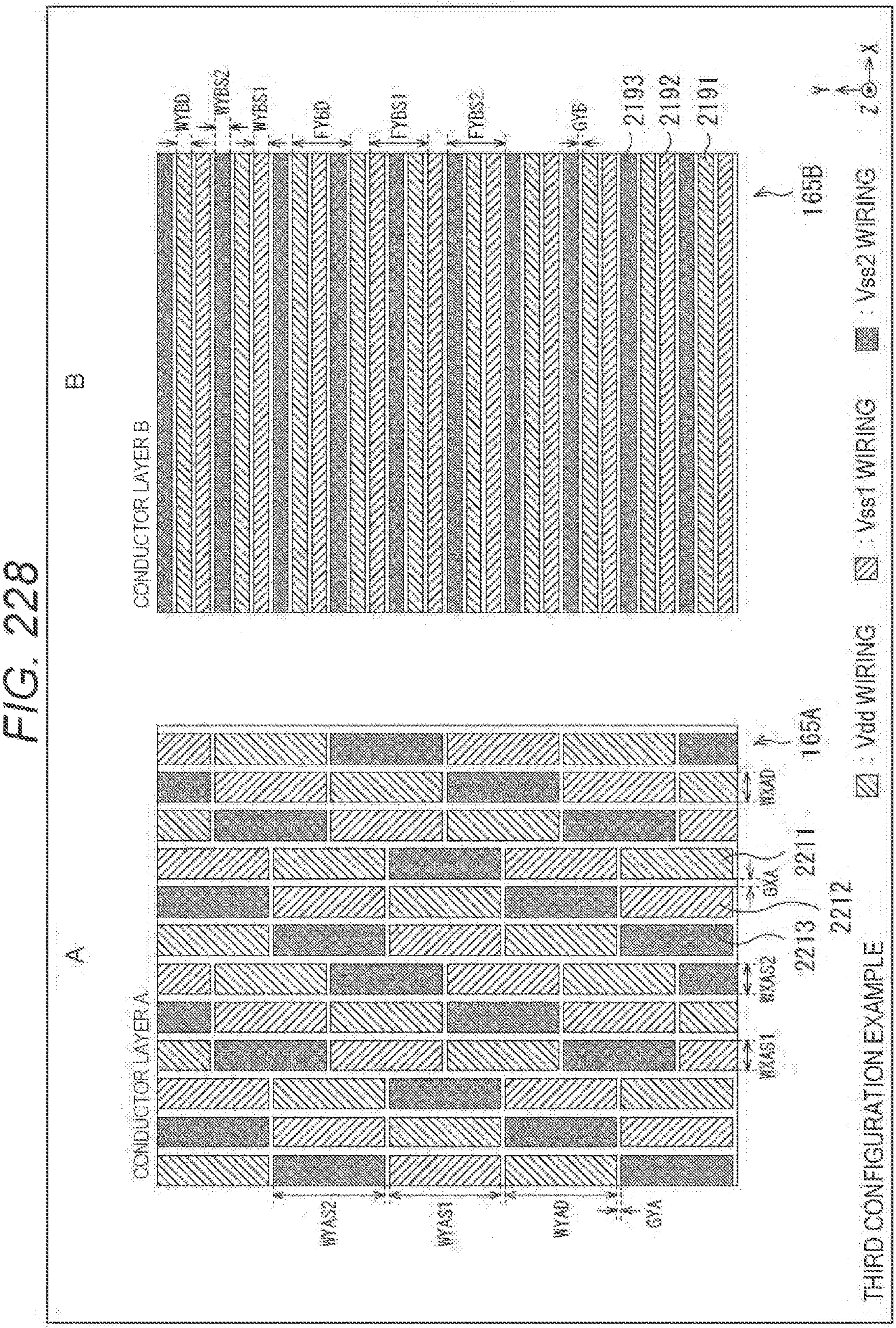

FIG. 228 is plan views of a third configuration example of the three-power supply.

Figure 229:
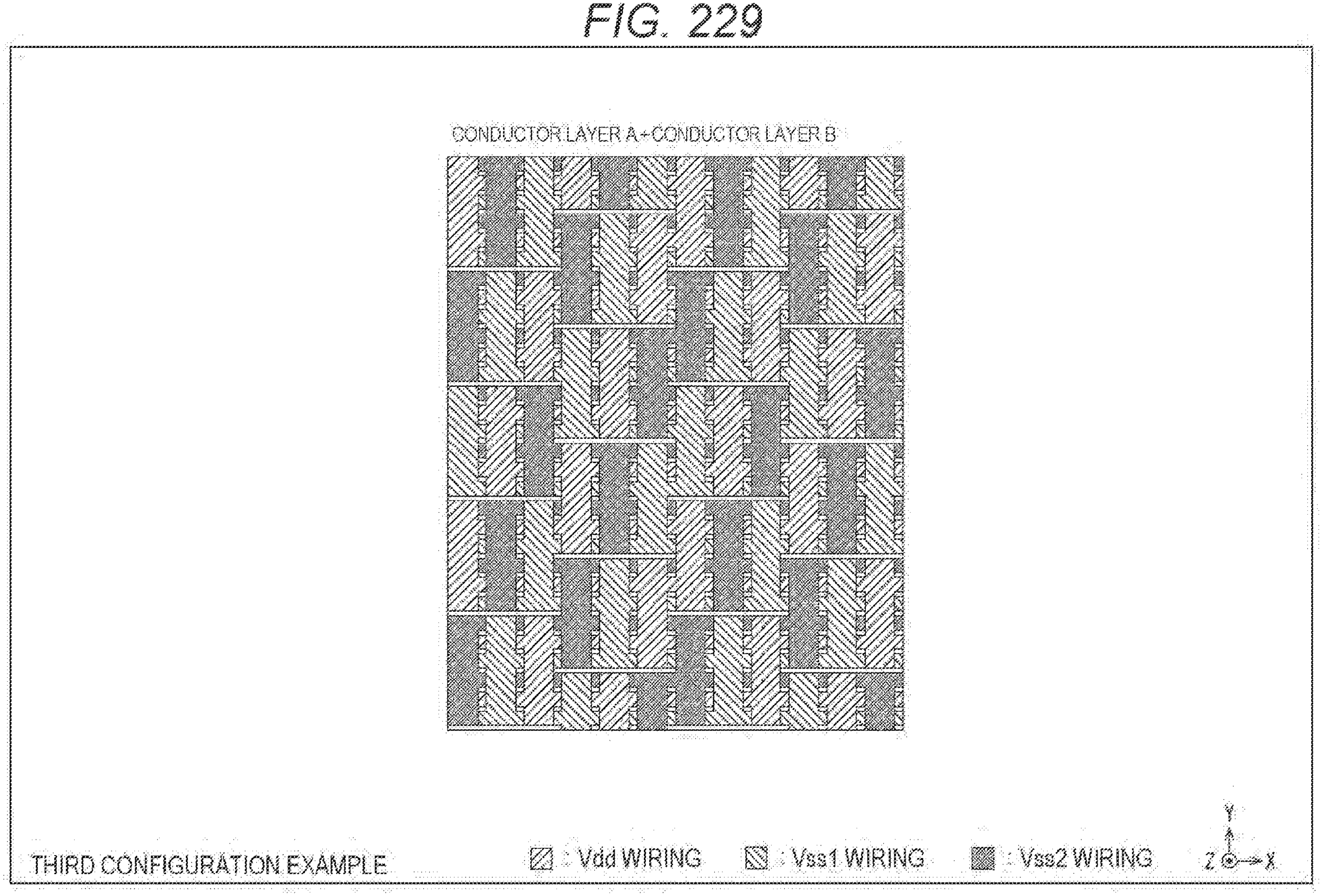

FIG. 229 is a plan view of the third configuration example of the three-power supply.

Figure 230:
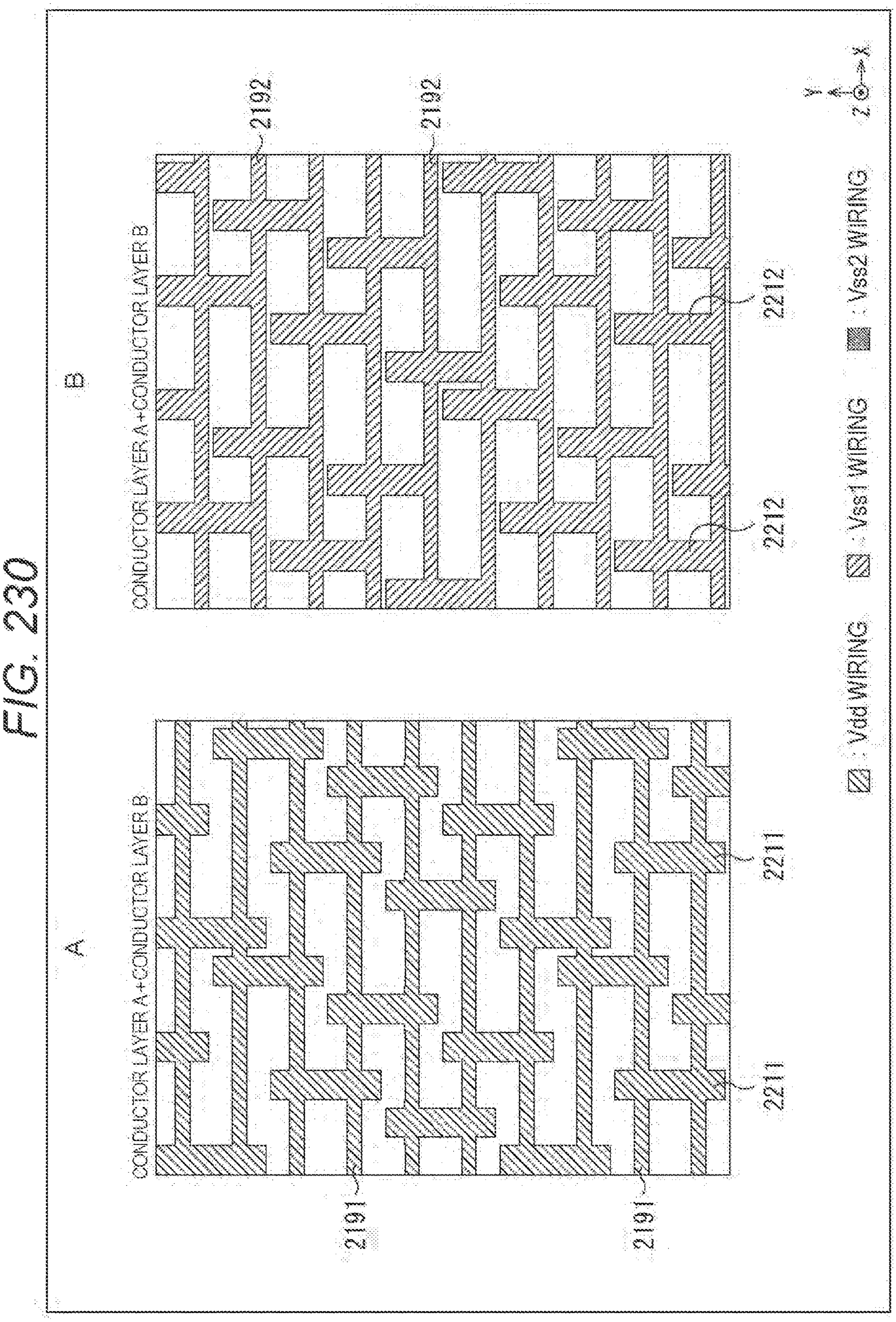

FIG. 230 is plan views of the third configuration example of the three-power supply.

Figure 231:
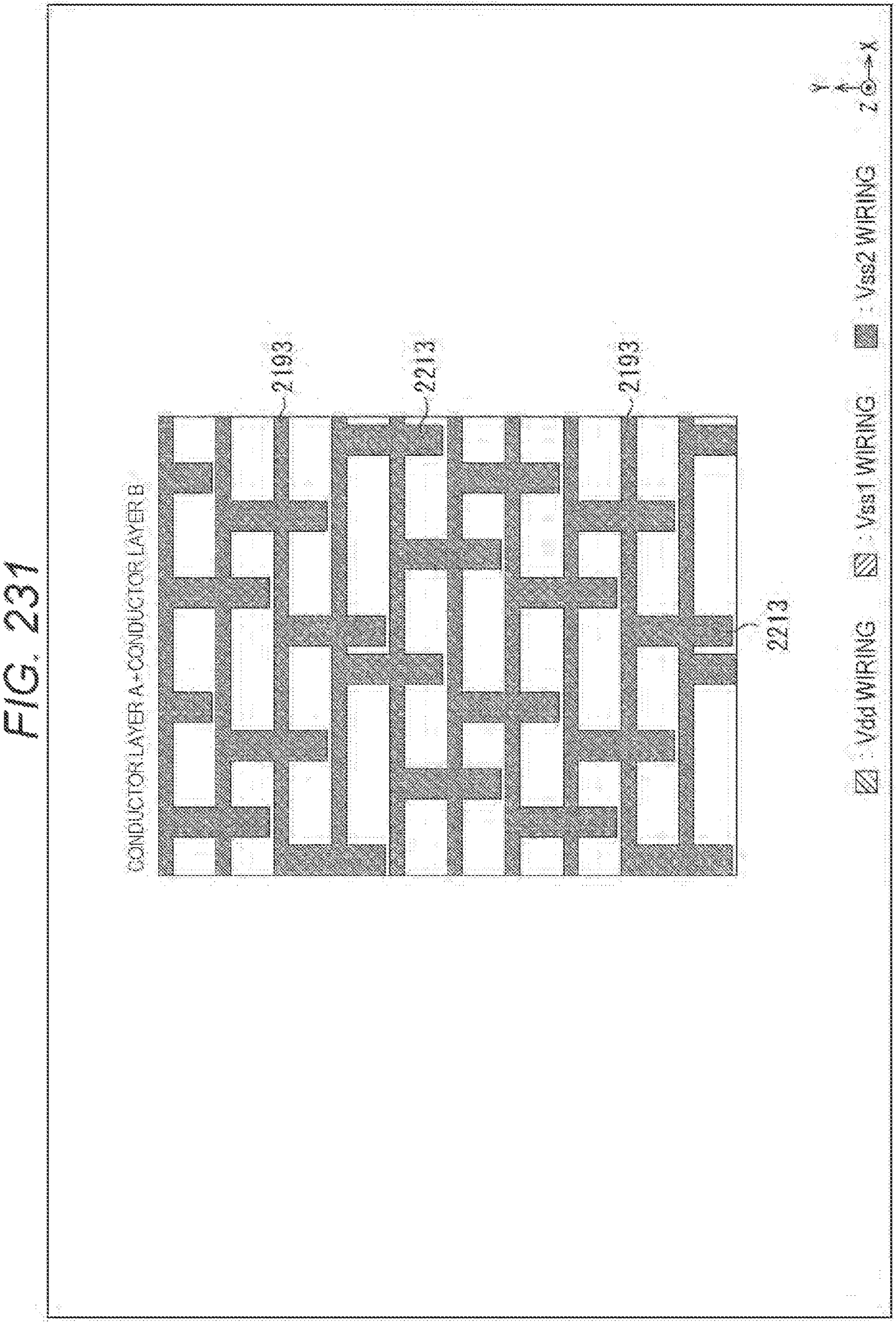

FIG. 231 is a plan view of the third configuration example of the three-power supply.

Figure 232:
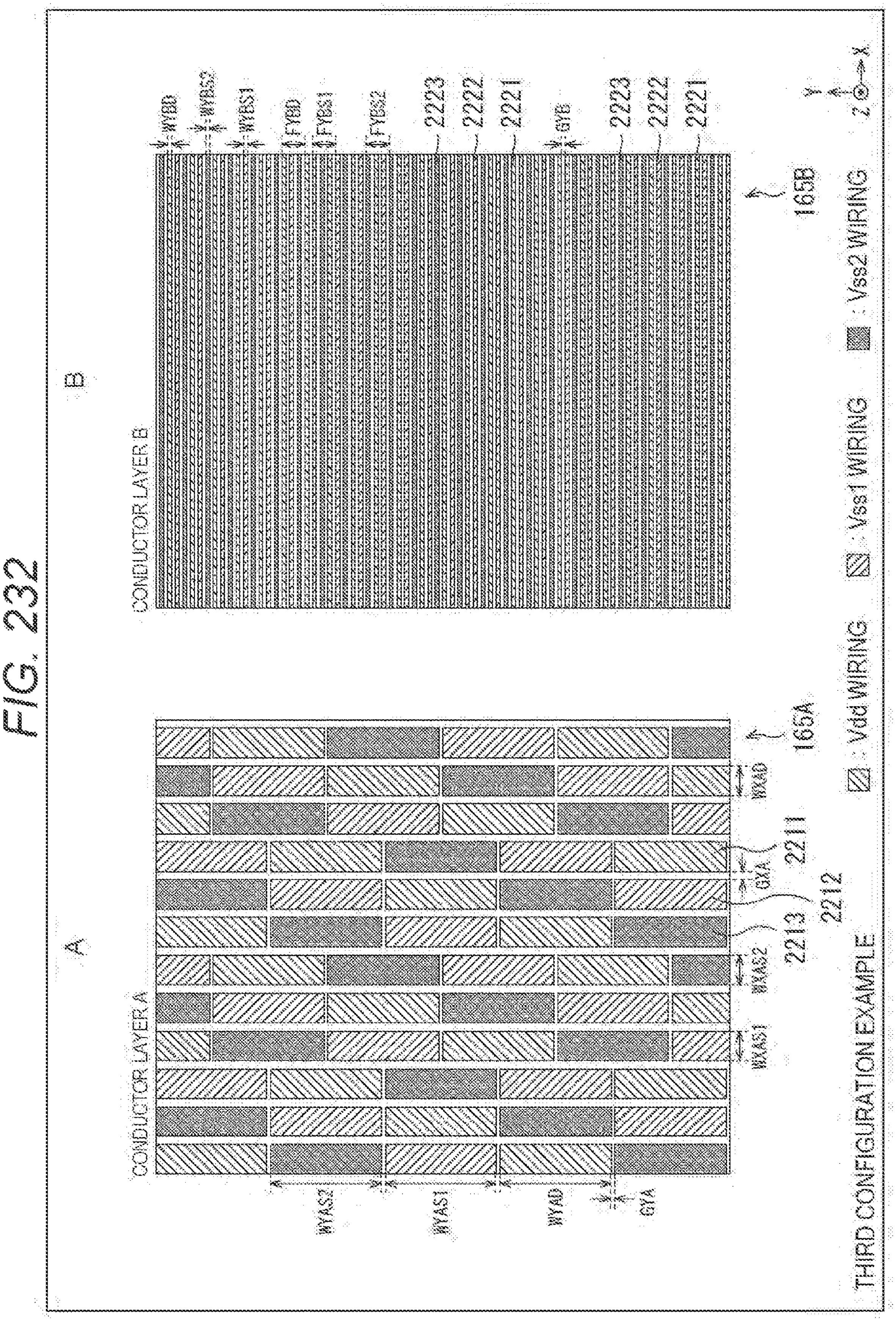

FIG. 232 is plan views of a first modification of the third configuration example of the three-power supply.

Figure 233:
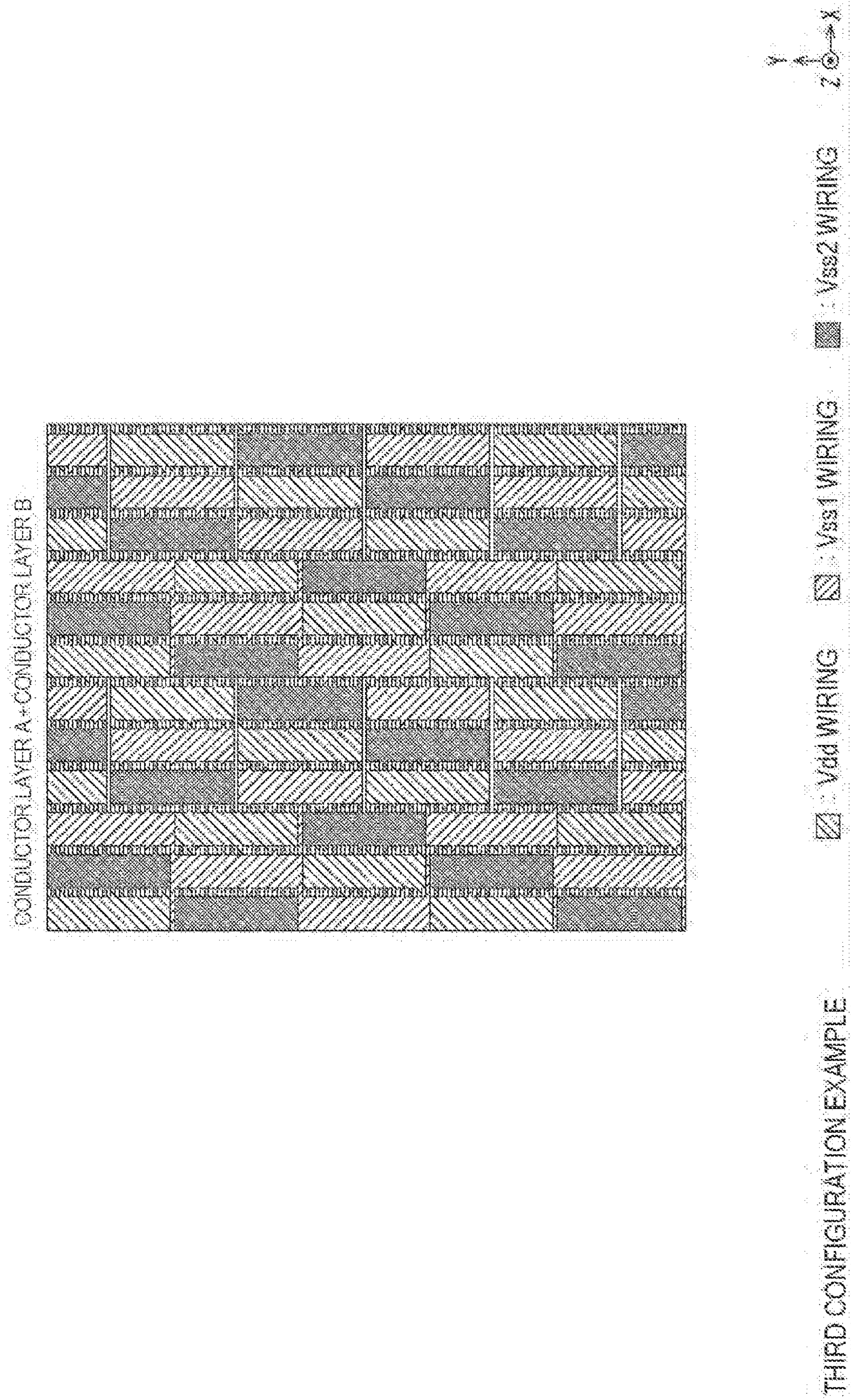

FIG. 233 is a plan view of the first modification of the third configuration example of the three-power supply.

Figure 234:
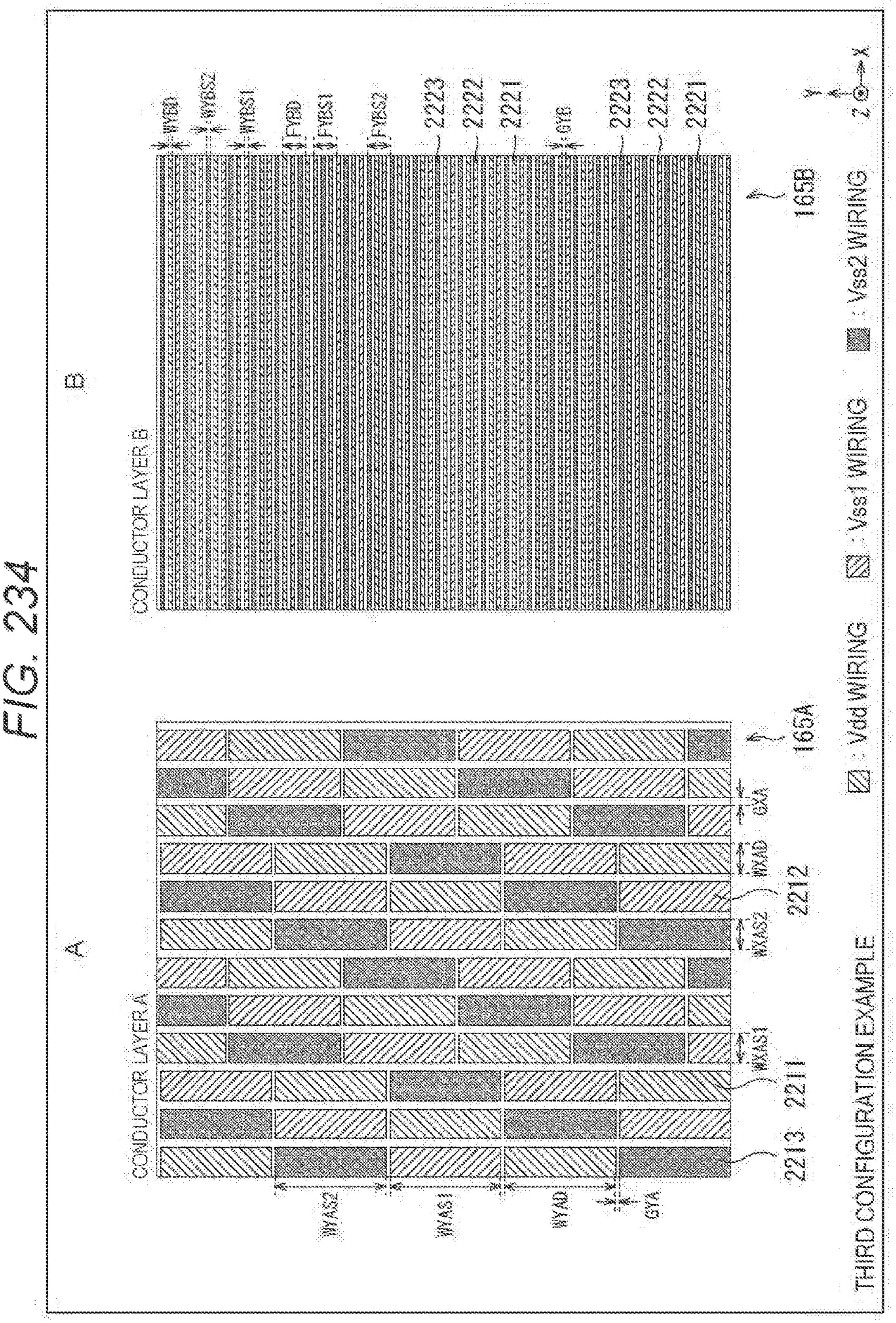

FIG. 234 is plan views of a second modification of the third configuration example of the three-power supply.

Figure 235:
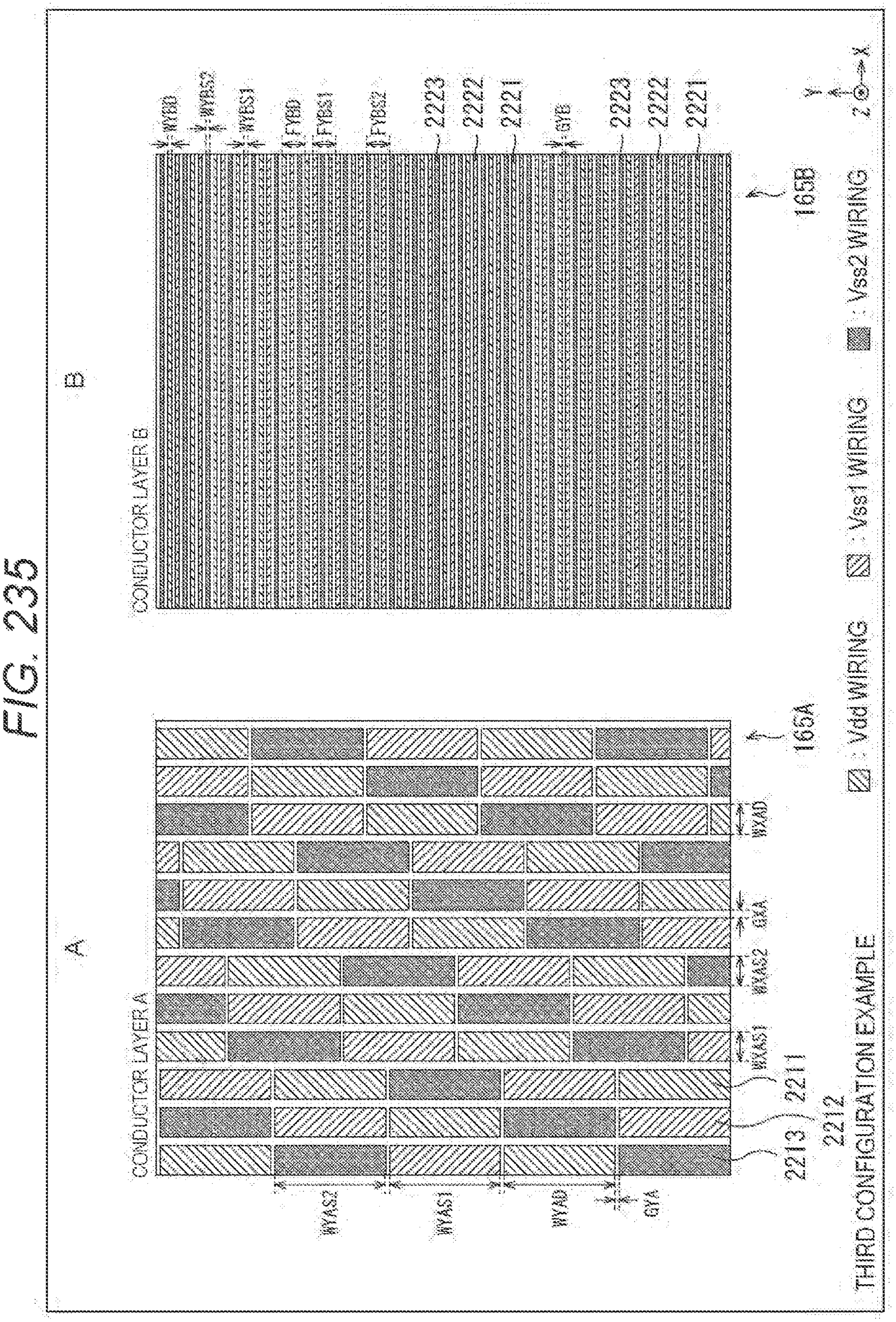

FIG. 235 is plan views of a third modification of the third configuration example of the three-power supply.

Figure 236:
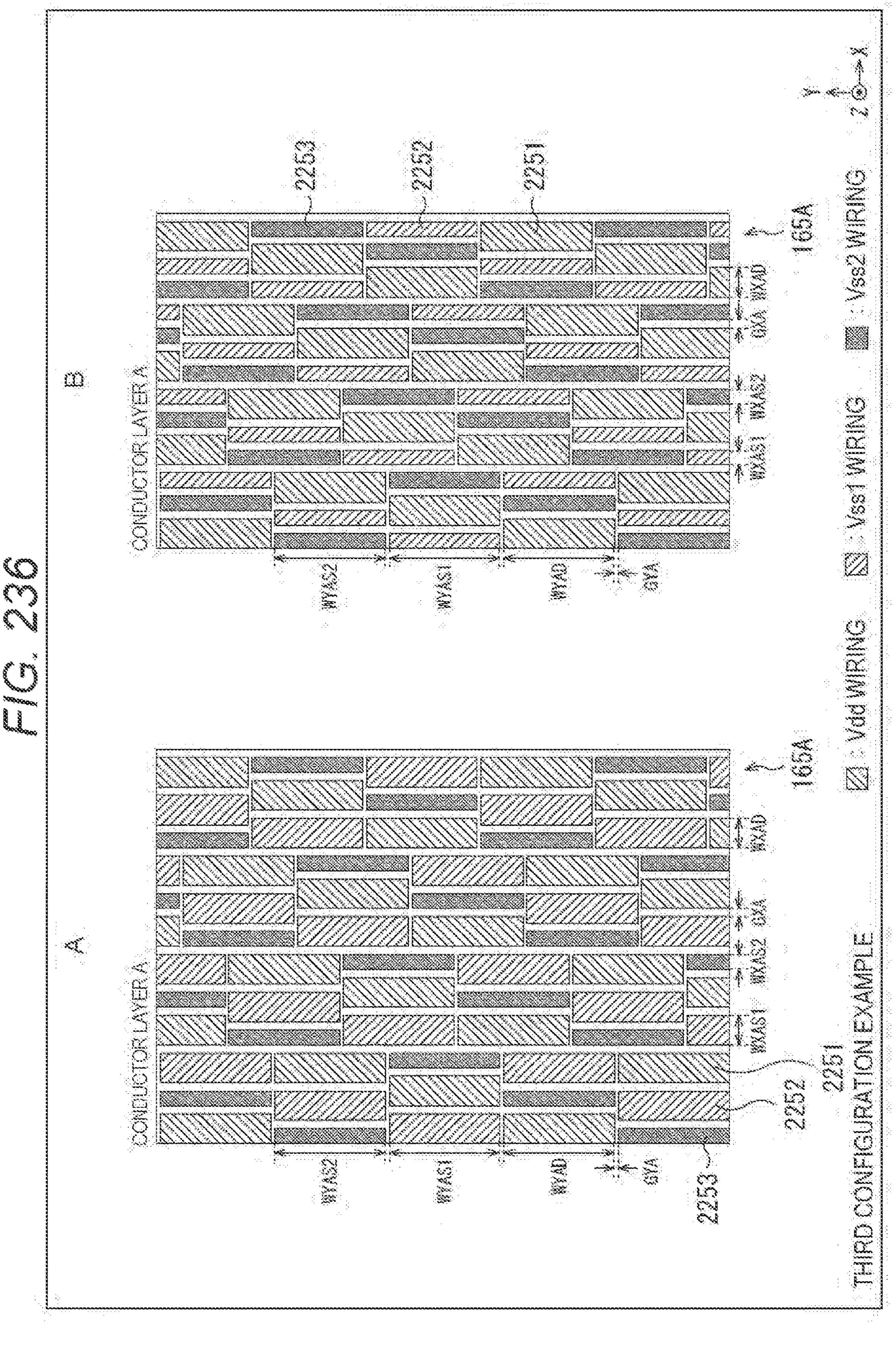

FIG. 236 is plan views of a fourth modification and a fifth modification of the third configuration example of the three-power supply.

Figure 237:
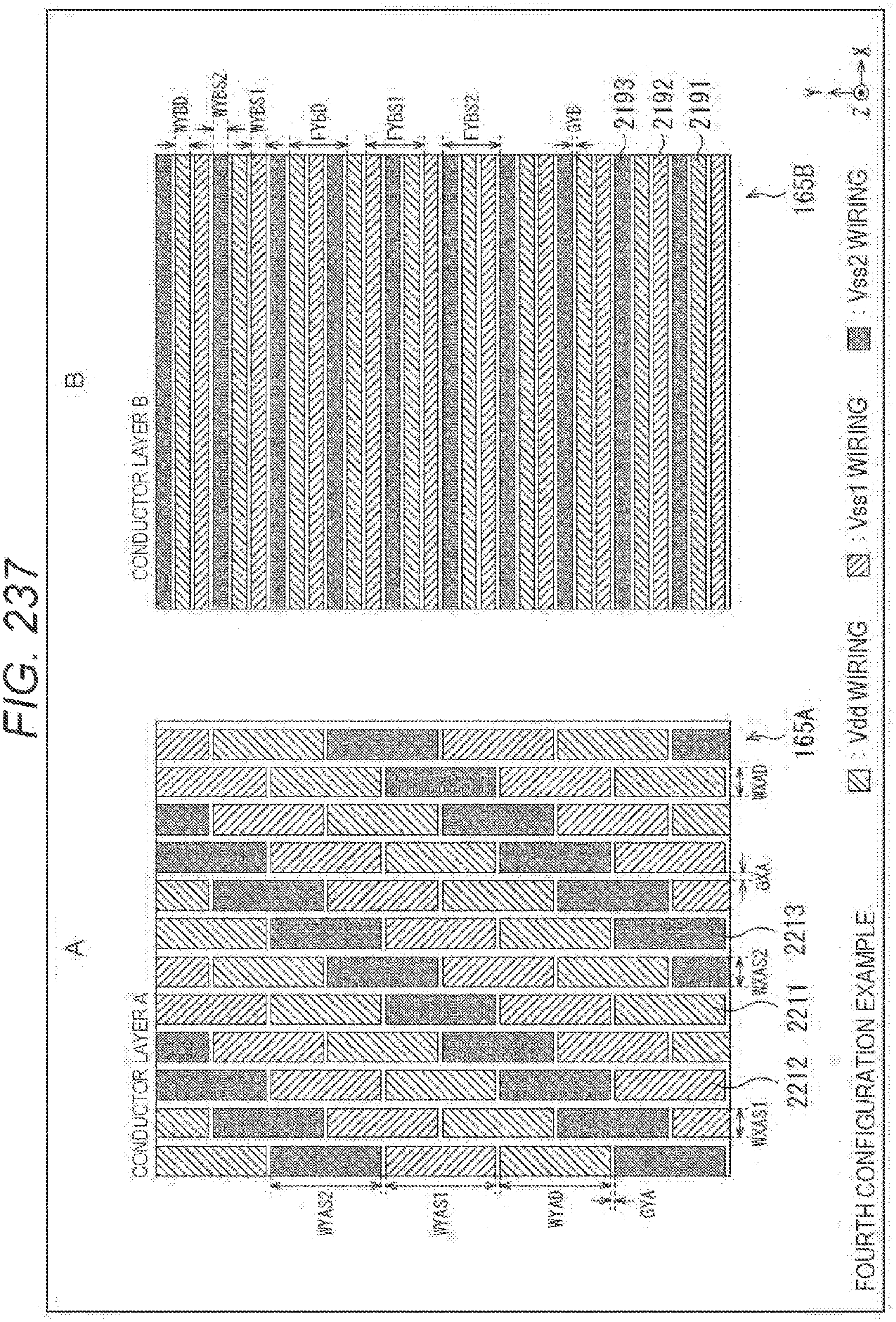

FIG. 237 is plan views of a fourth configuration example of the three-power supply.

Figure 238:
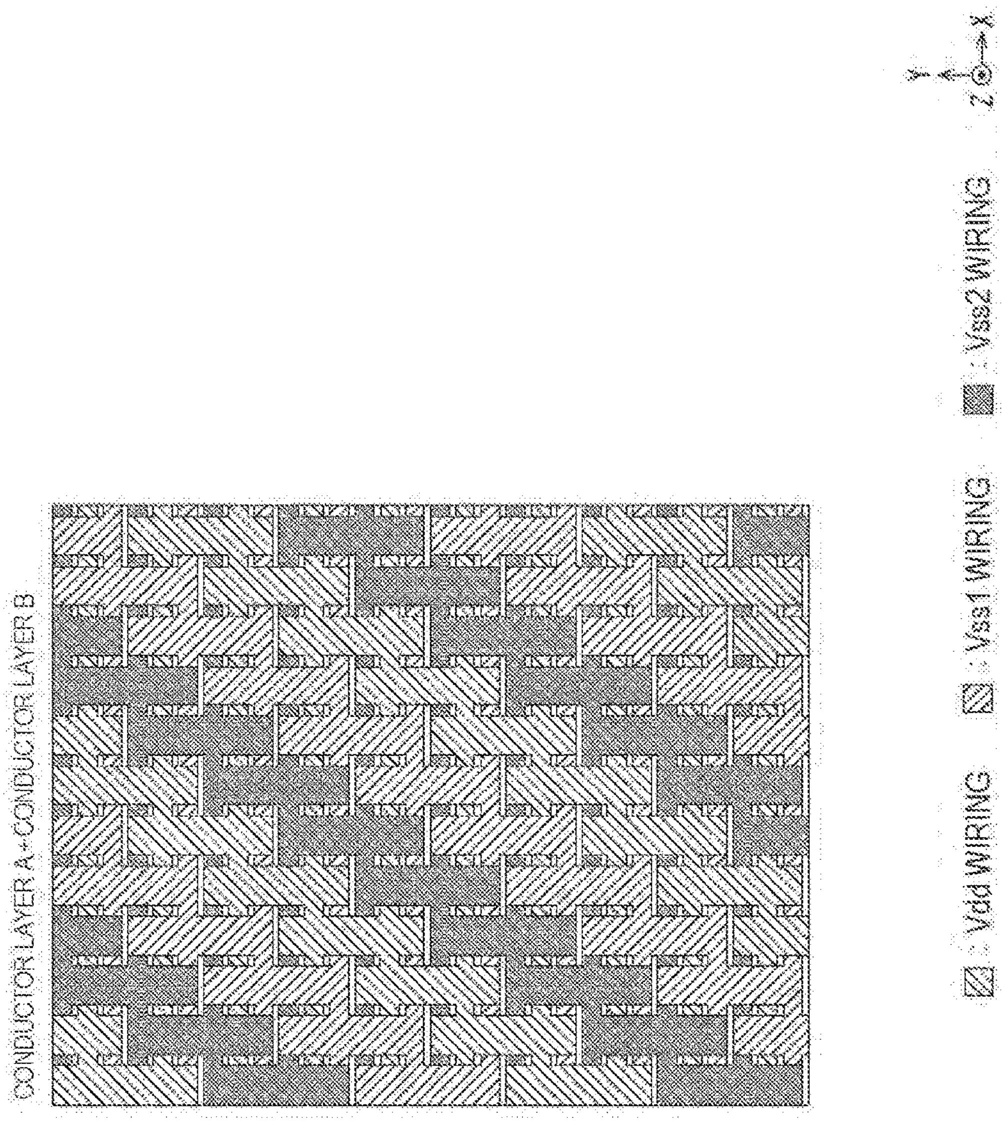

FIG. 238 is a plan view of the fourth configuration example of the three-power supply.

Figure 239:
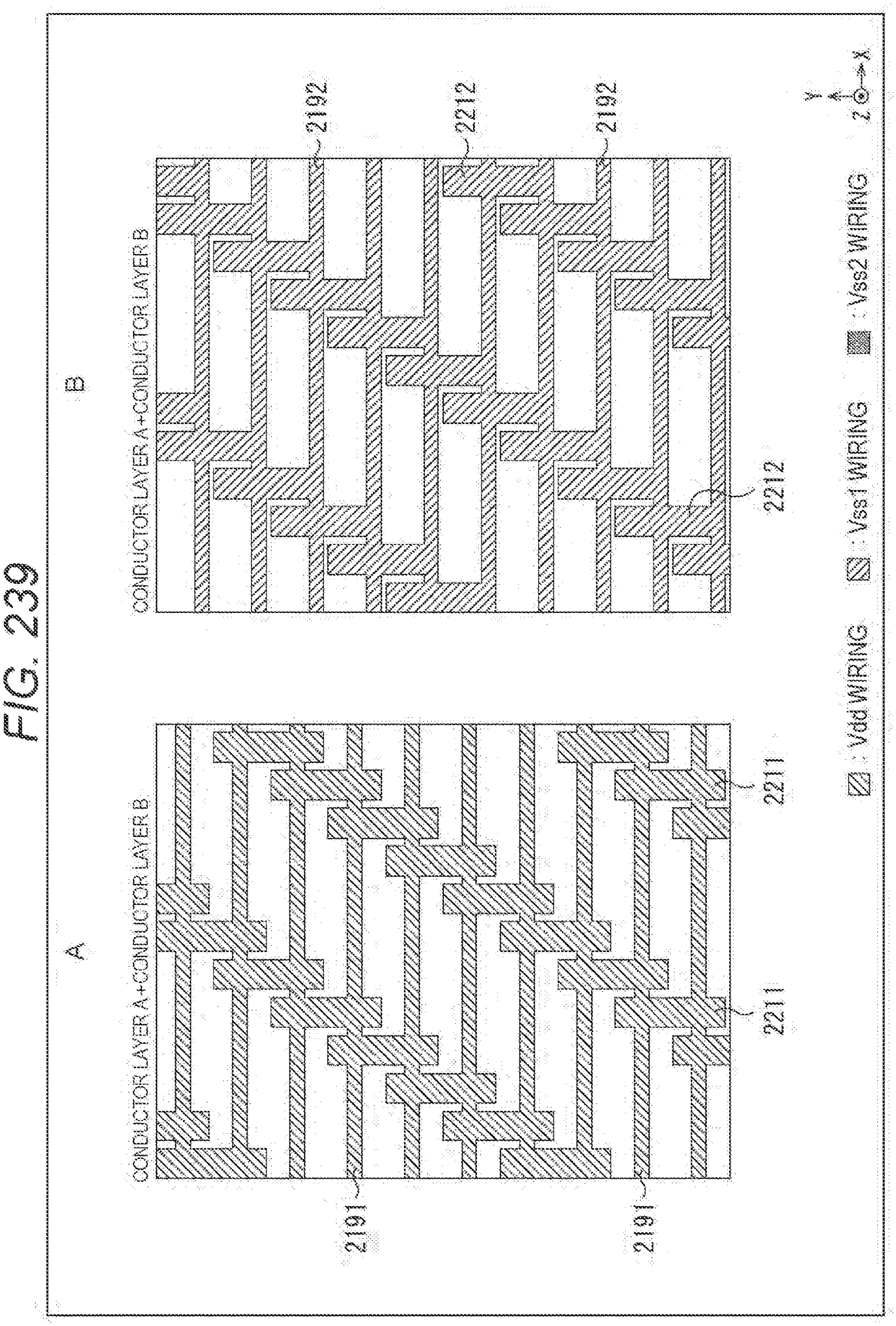

FIG. 239 is plan views of the fourth configuration example of the three-power supply.

Figure 240:
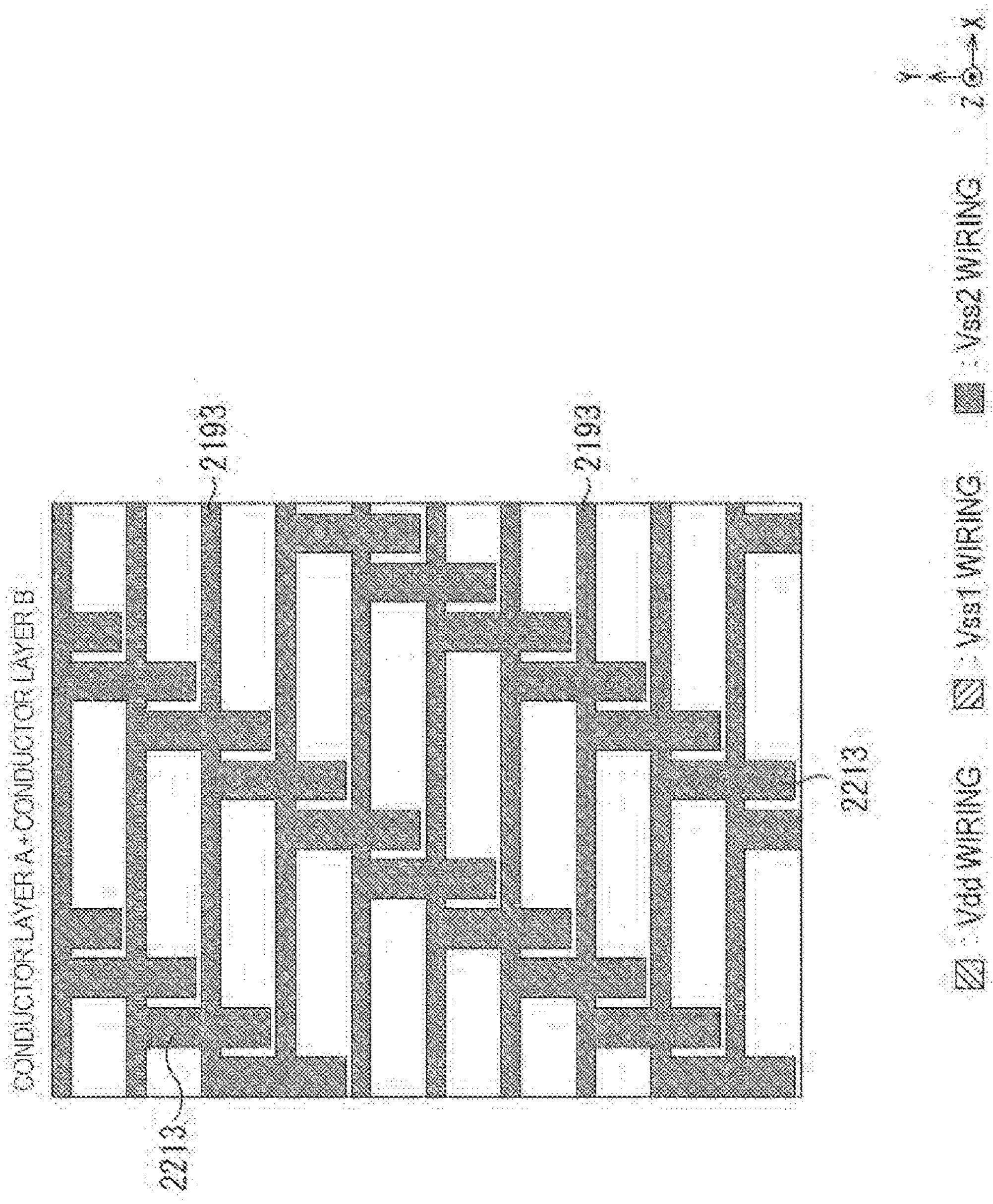

FIG. 240 is a plan view of the fourth configuration example of the three-power supply.

Figure 241:
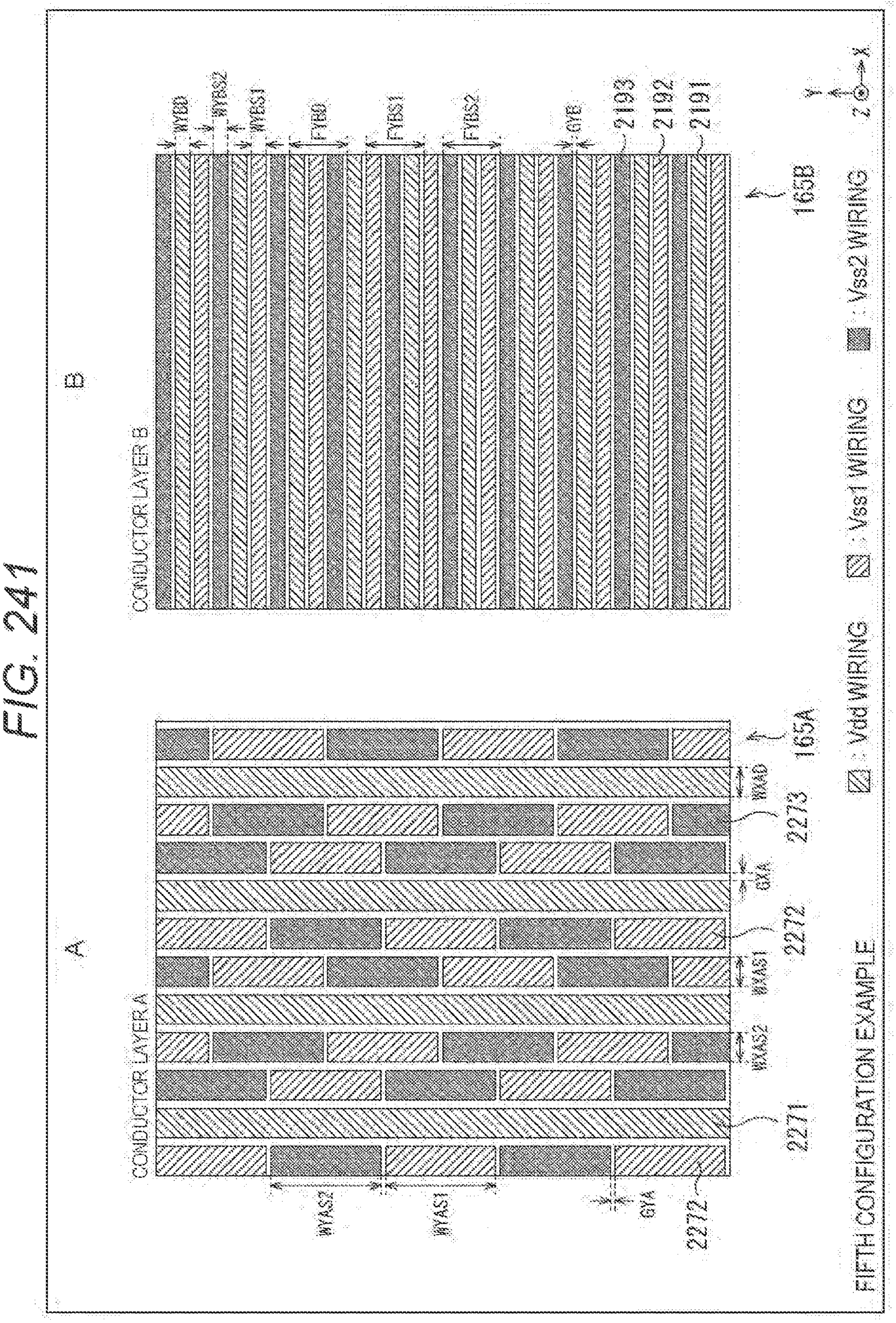

FIG. 241 is plan views of a fifth configuration example of the three-power supply.

Figure 242:
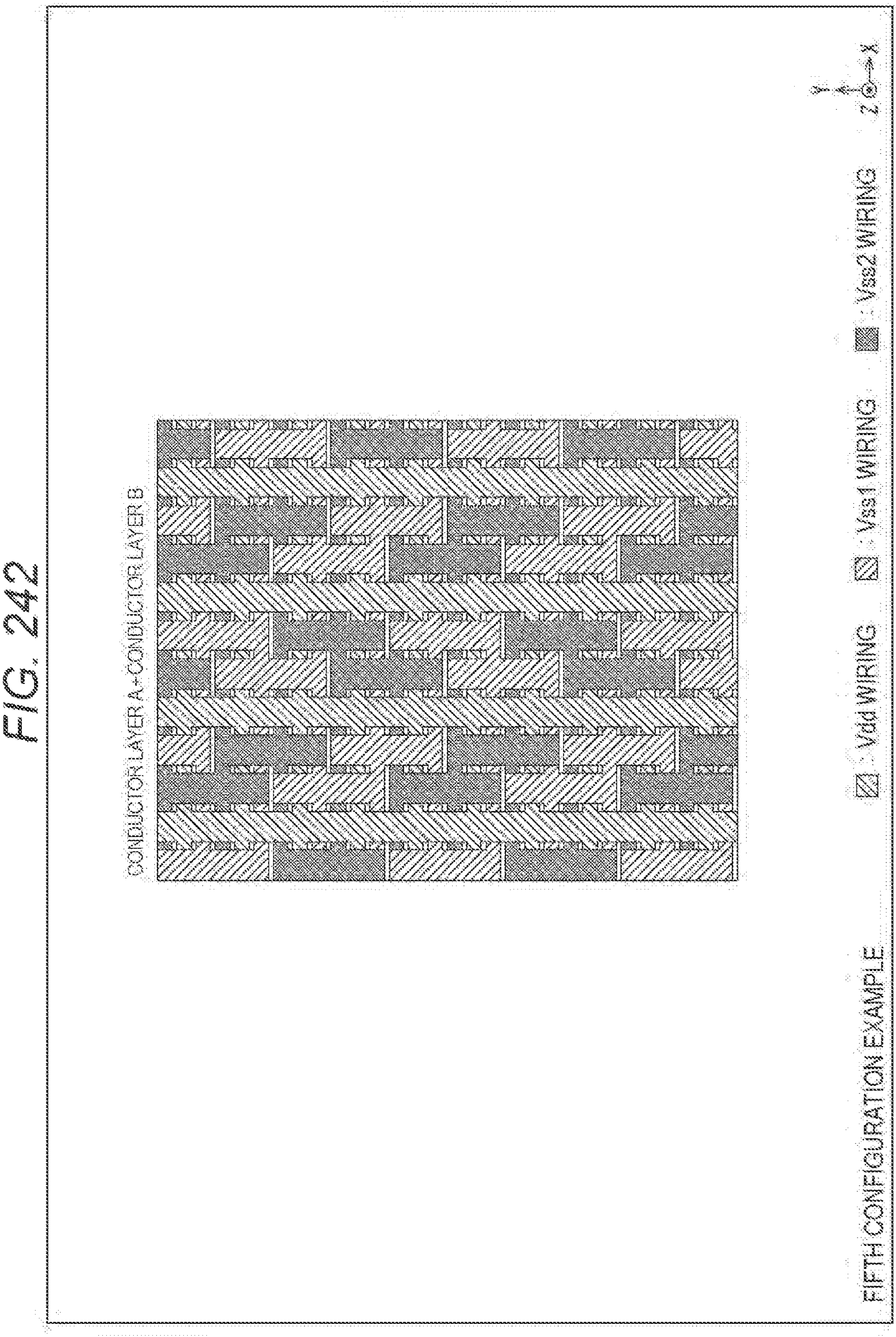

FIG. 242 is a plan view of the fifth configuration example of the three-power supply.

Figure 243:
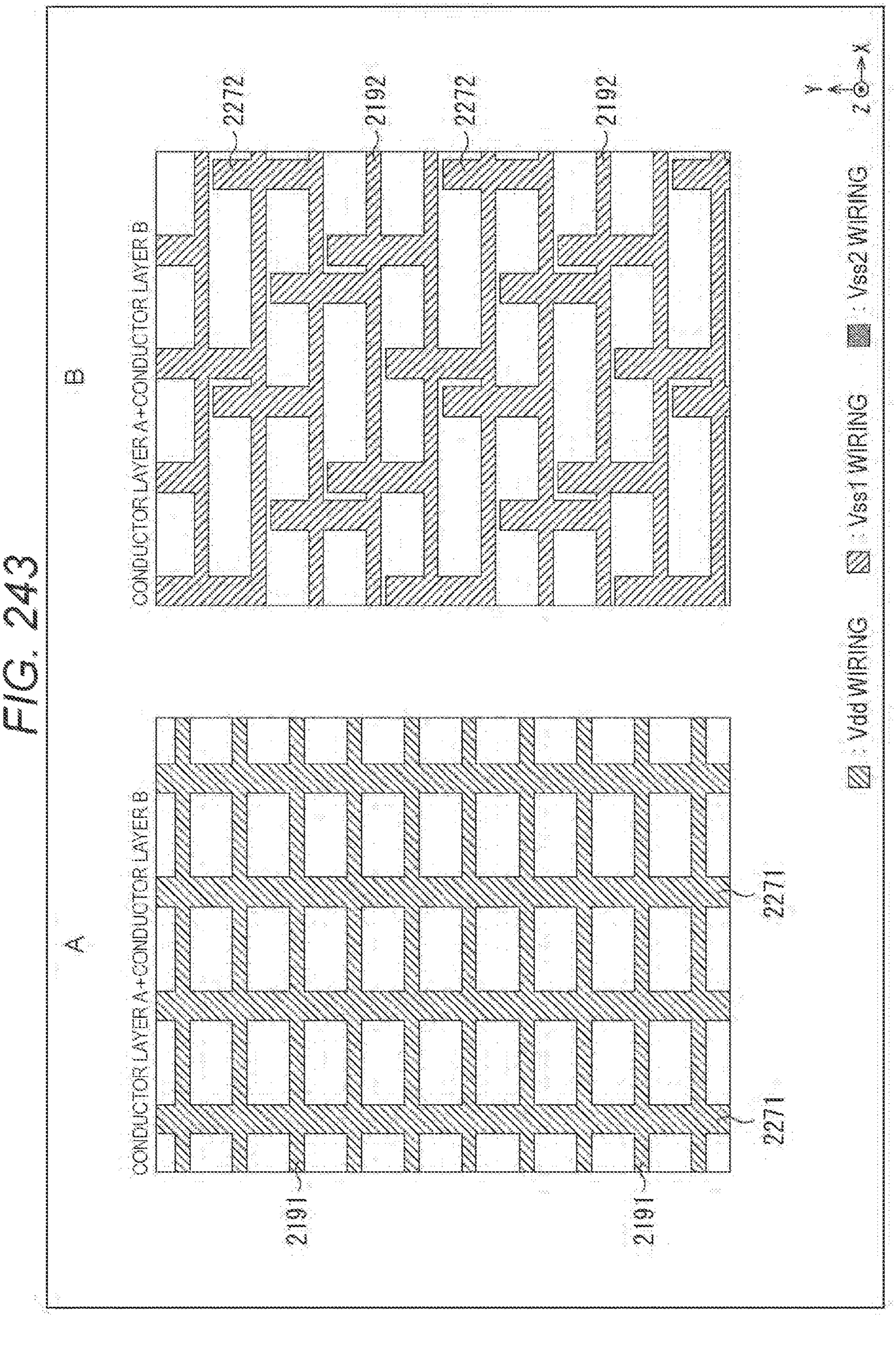

FIG. 243 is plan views of the fifth configuration example of the three-power supply.

Figure 244:
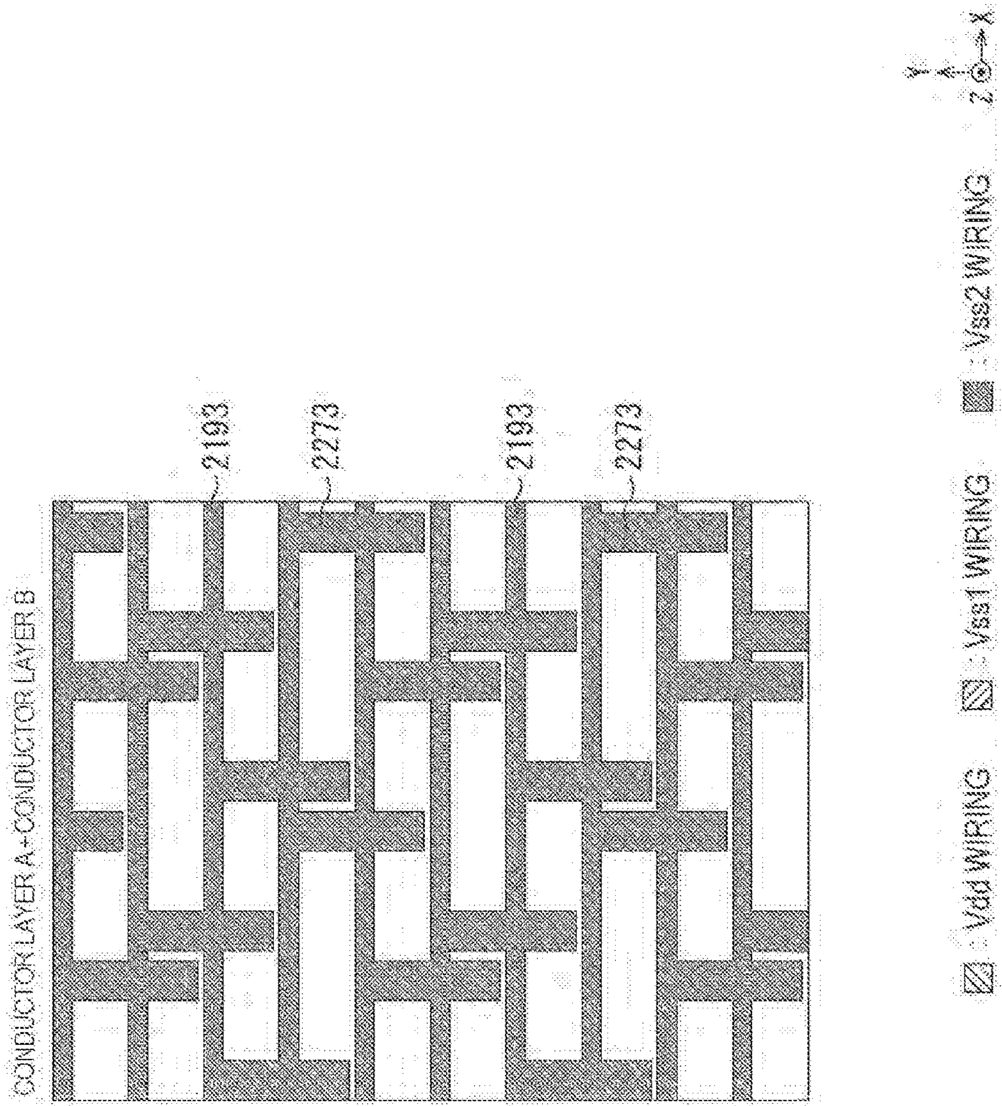

FIG. 244 is a plan view of the fifth configuration example of the three-power supply.

Figure 245:
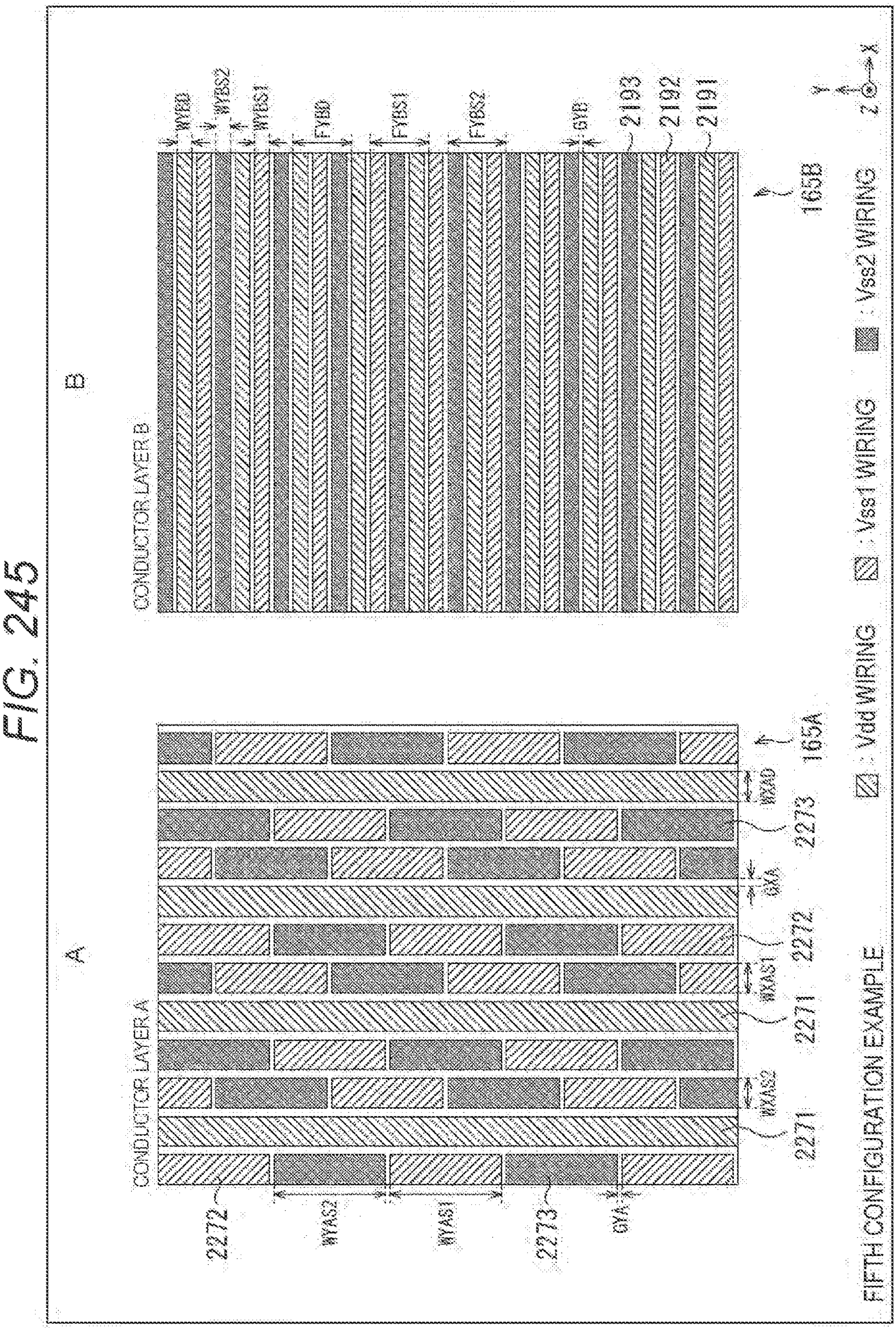

FIG. 245 is plan views of a first modification of the fifth configuration example of the three-power supply.

Figure 246:
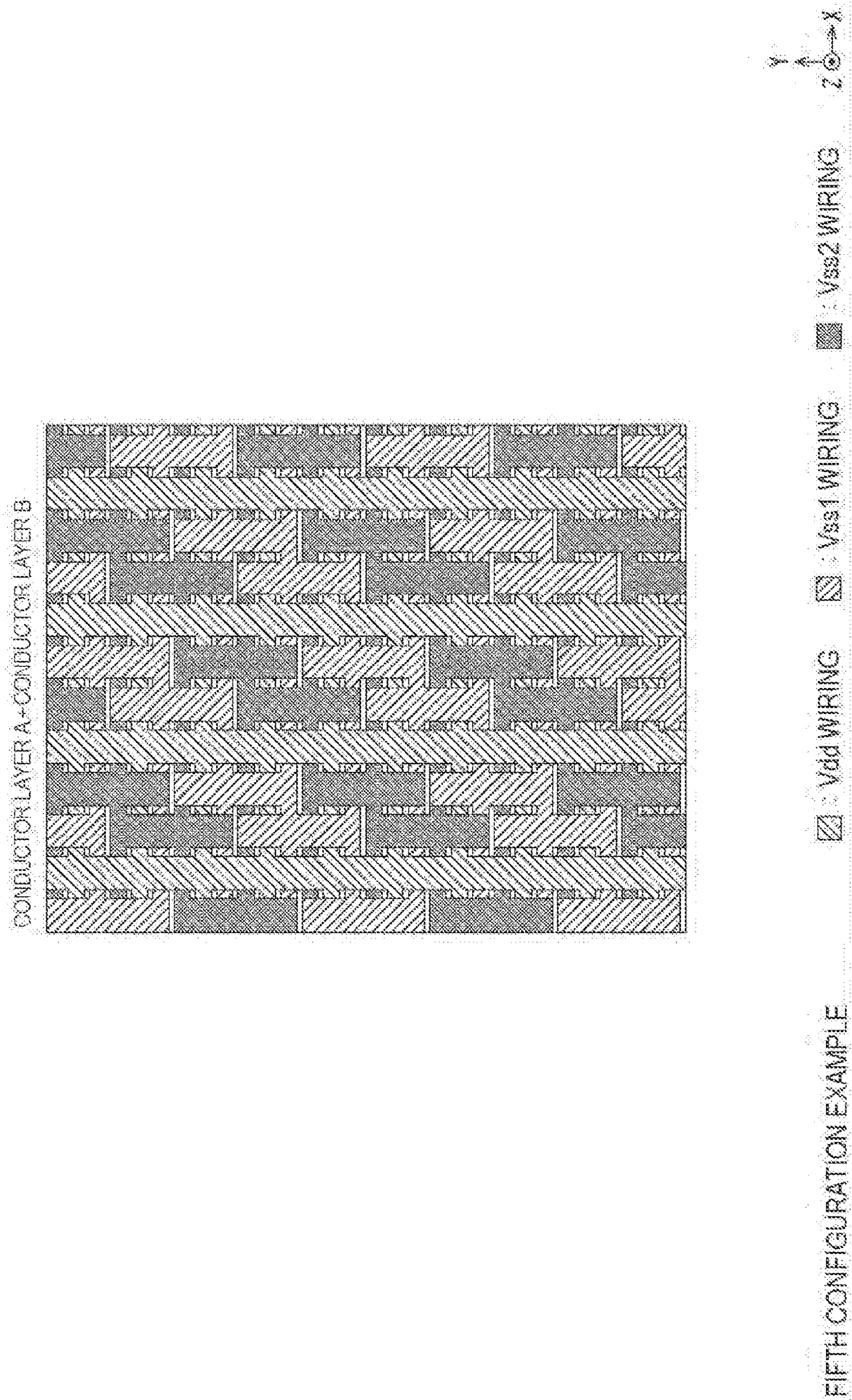

FIG. 246 is a plan view of the first modification of the fifth configuration example of the three-power supply.

Figure 247:
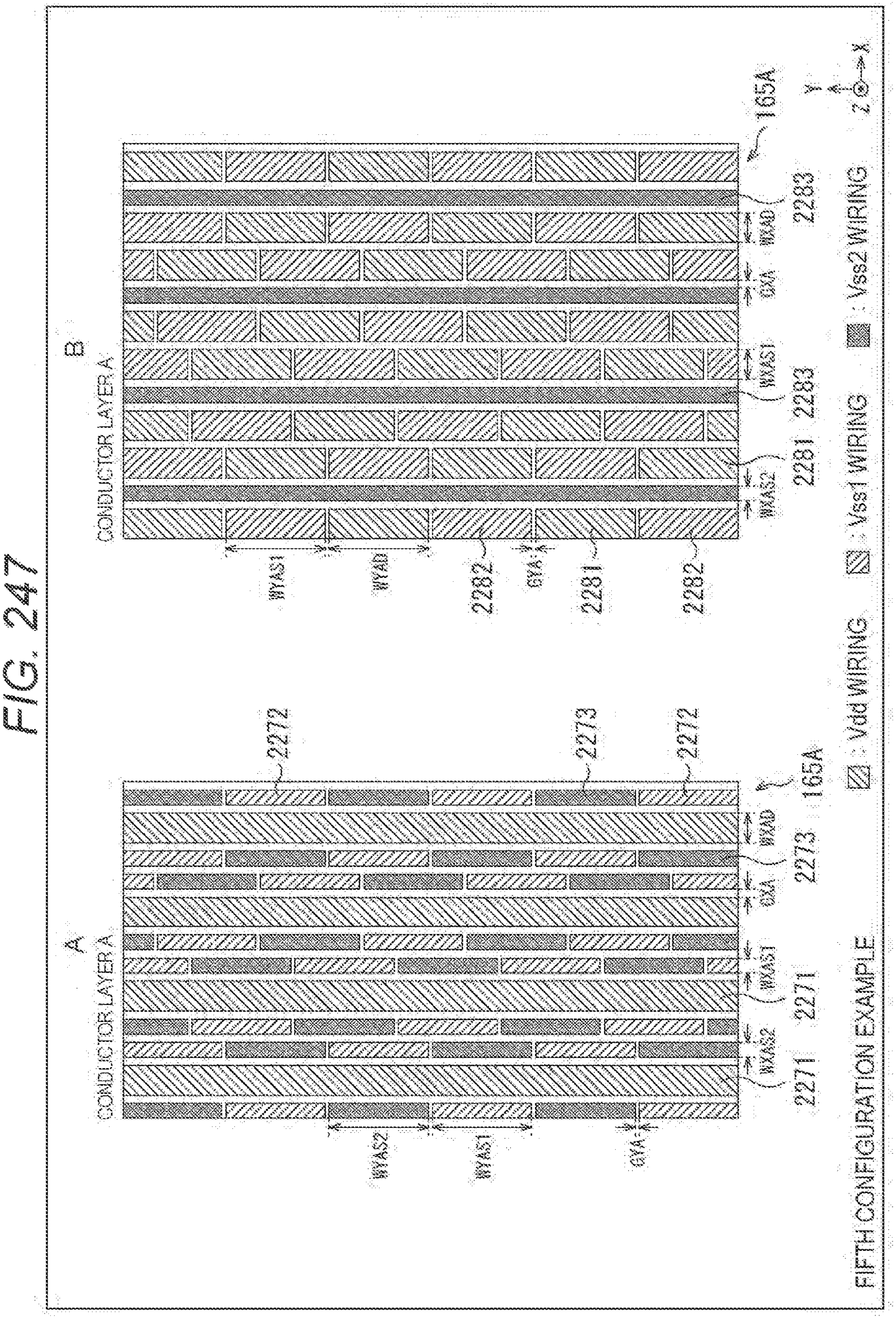

FIG. 247 is plan views of a second modification and a third modification of the fifth configuration example of the three-power supply.

Figure 248:
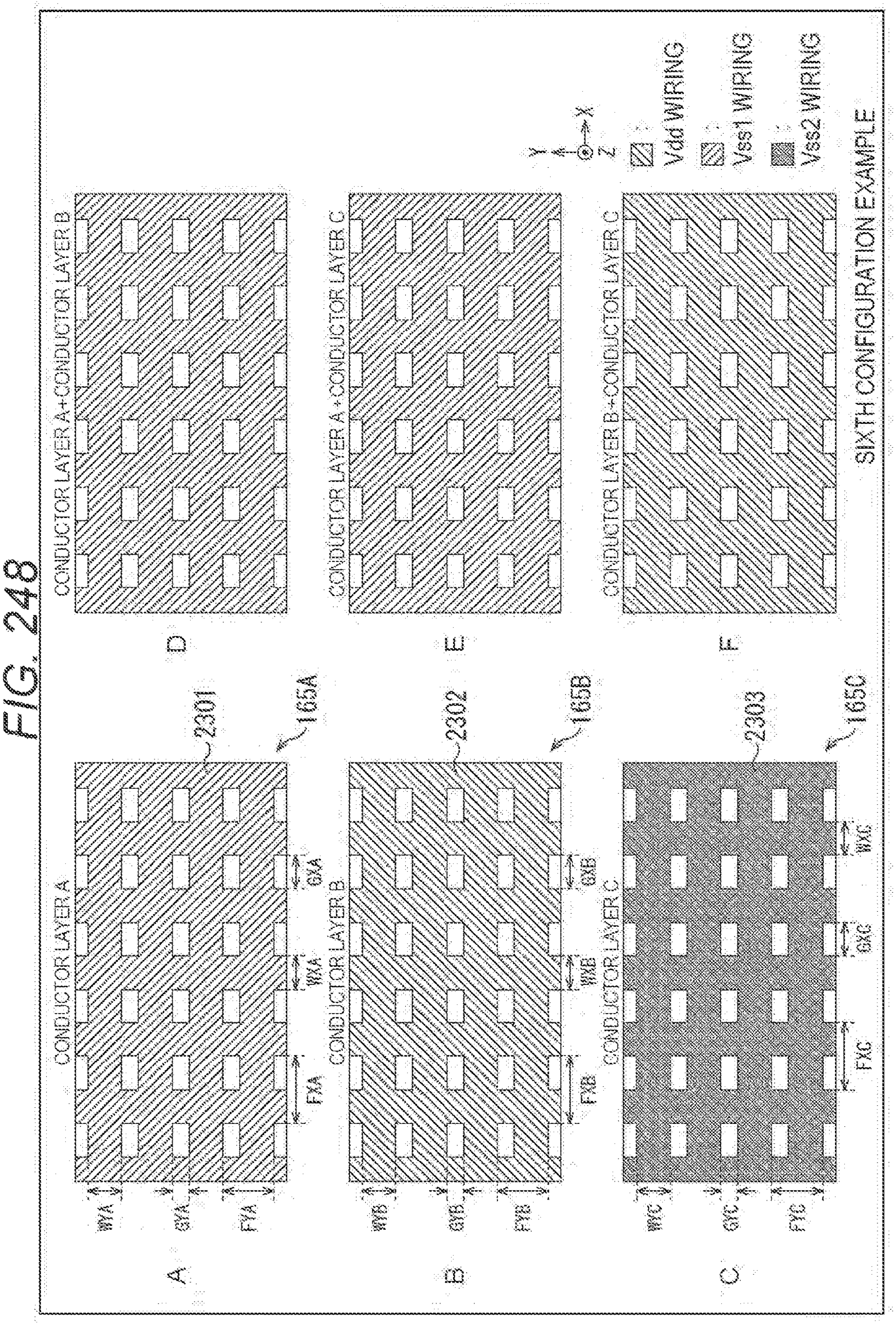

FIG. 248 is plan views of a sixth configuration example of the three-power supply.

Figure 249:
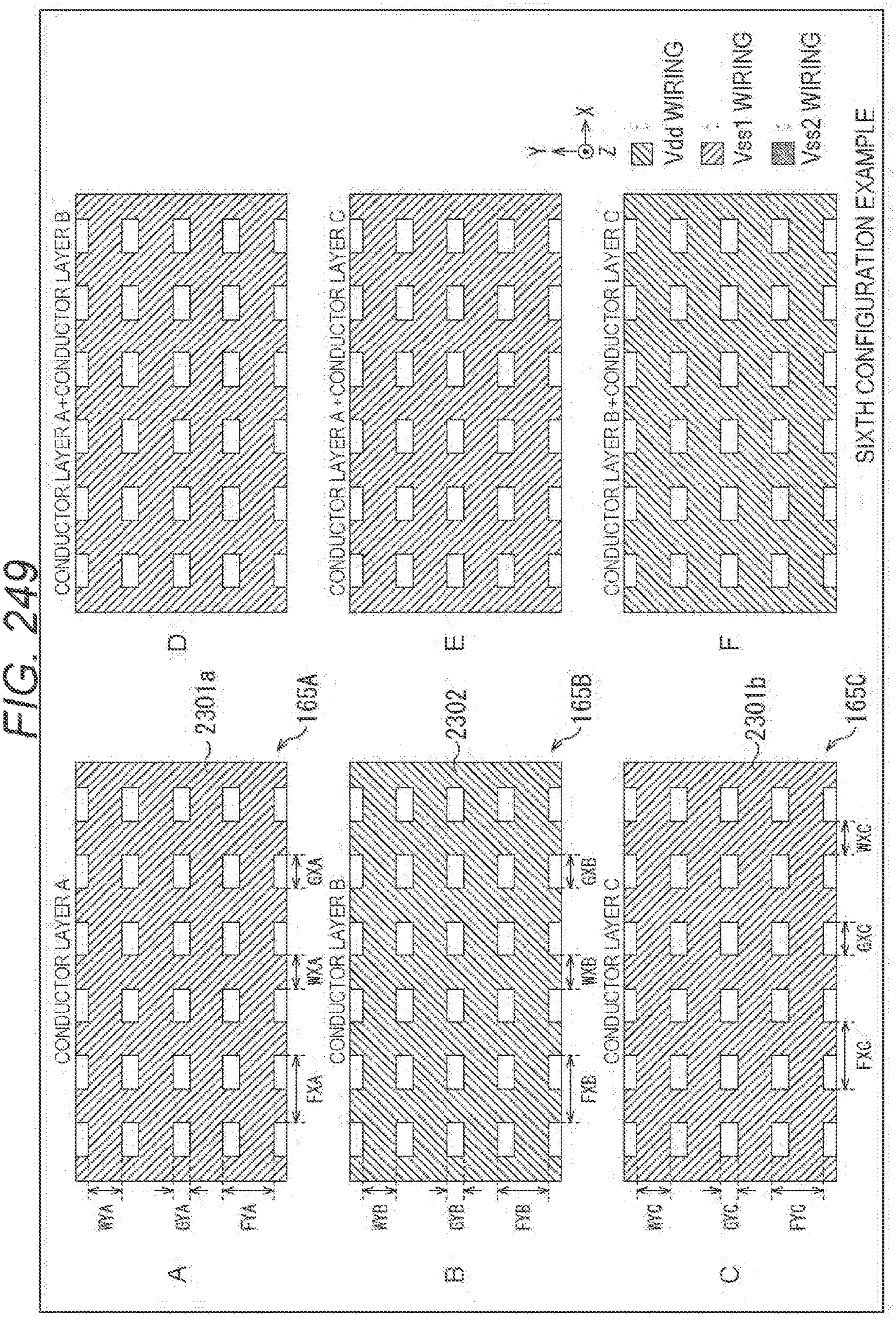

FIG. 249 is plan views of a first modification of the sixth configuration example of the three-power supply.

Figure 250:
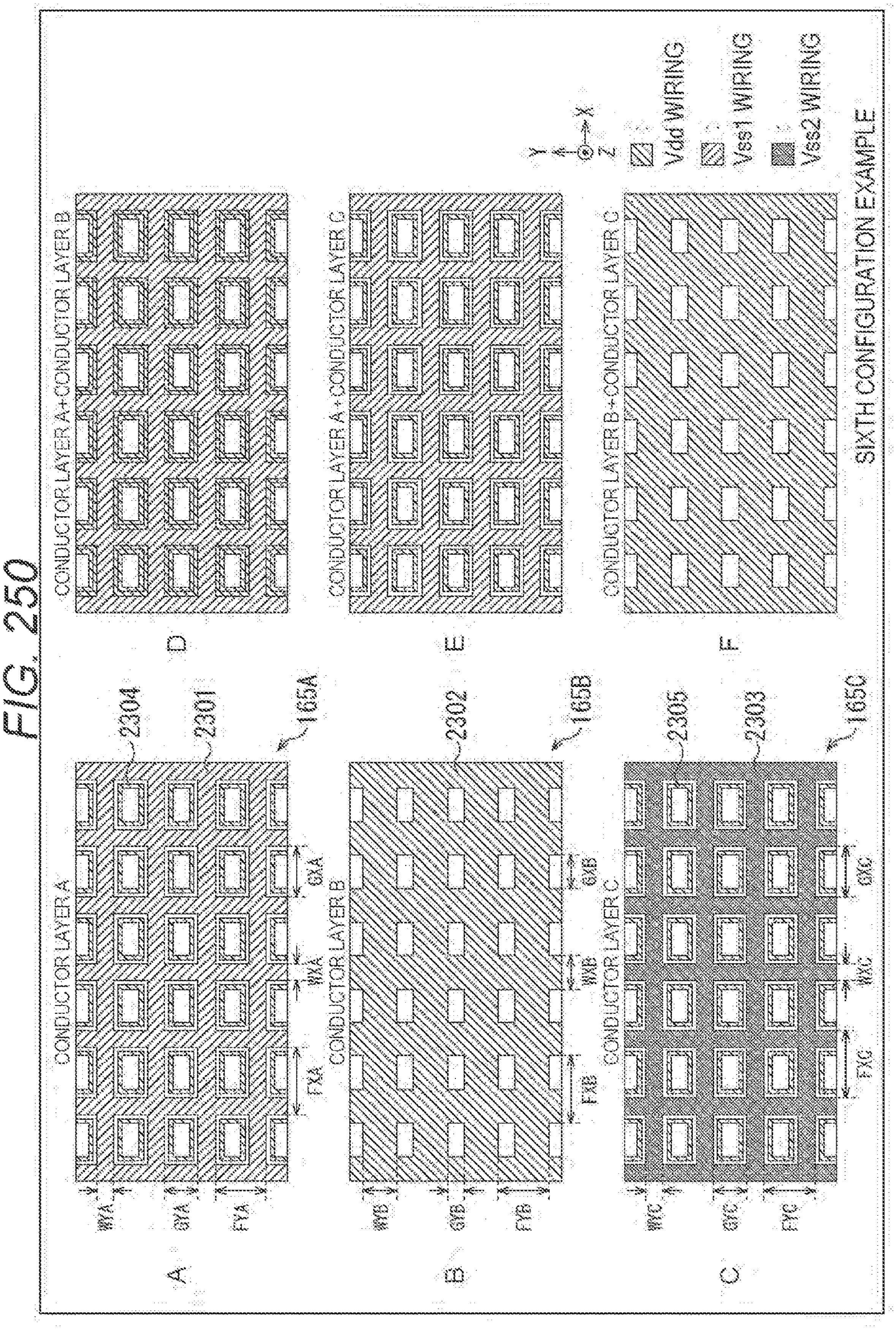

FIG. 250 is plan views of a second modification of the sixth configuration example of the three-power supply.

Figure 251:
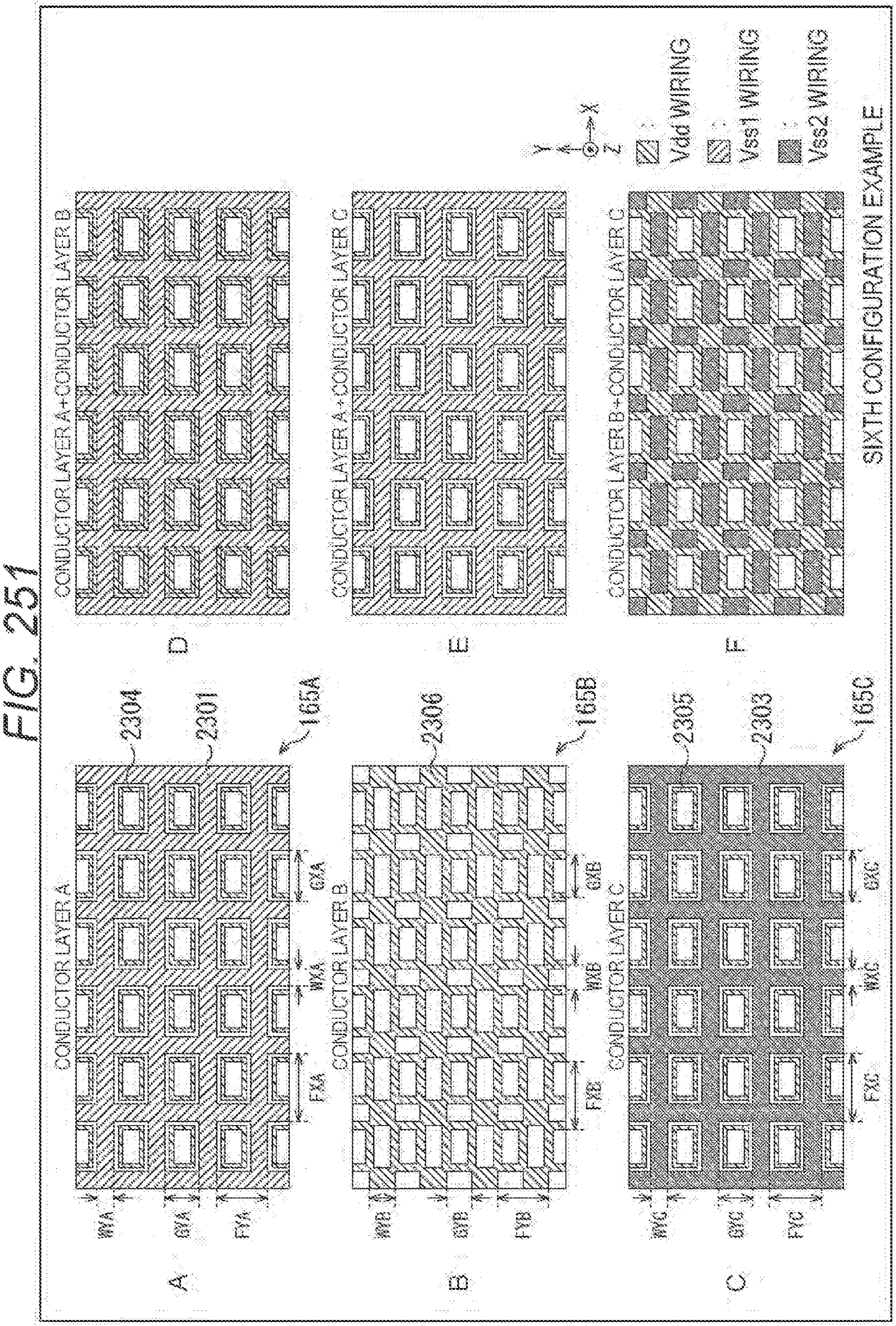

FIG. 251 is plan views of a third modification of the sixth configuration example of the three-power supply.

Figure 252:
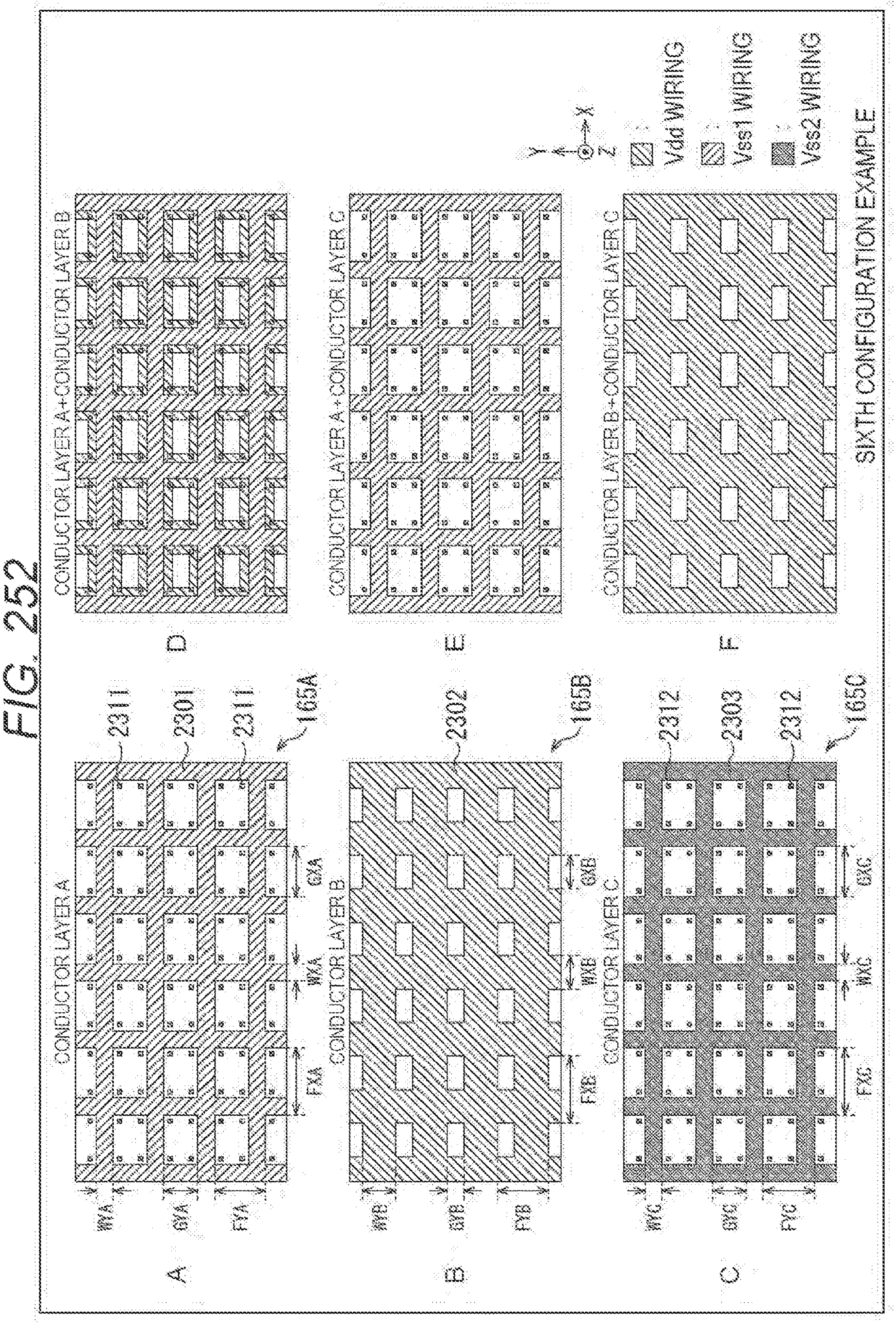

FIG. 252 is plan views of a fourth modification of the sixth configuration example of the three-power supply.

Figure 253:
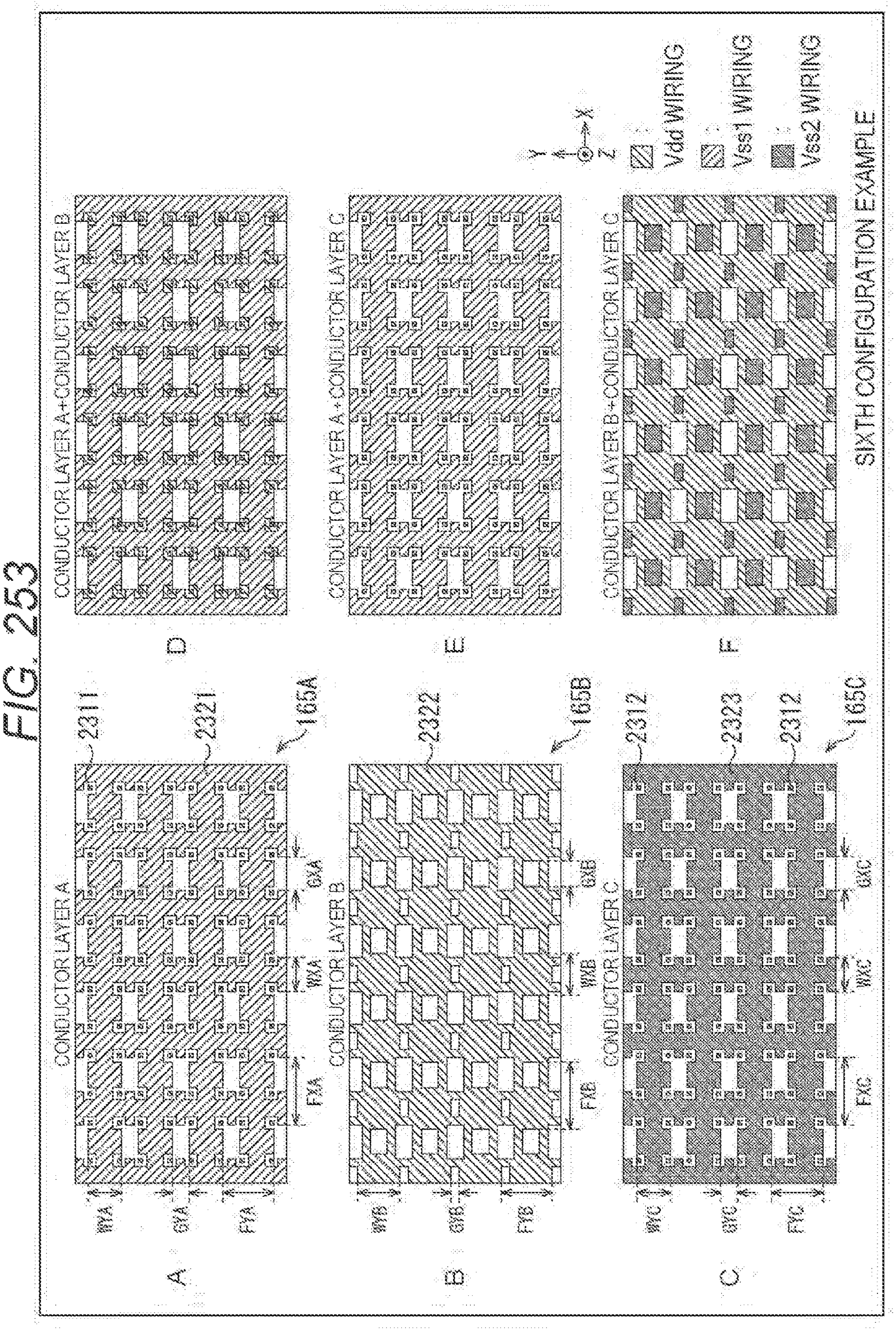

FIG. 253 is plan views of a fifth modification of the sixth configuration example of the three-power supply.

Figure 254:
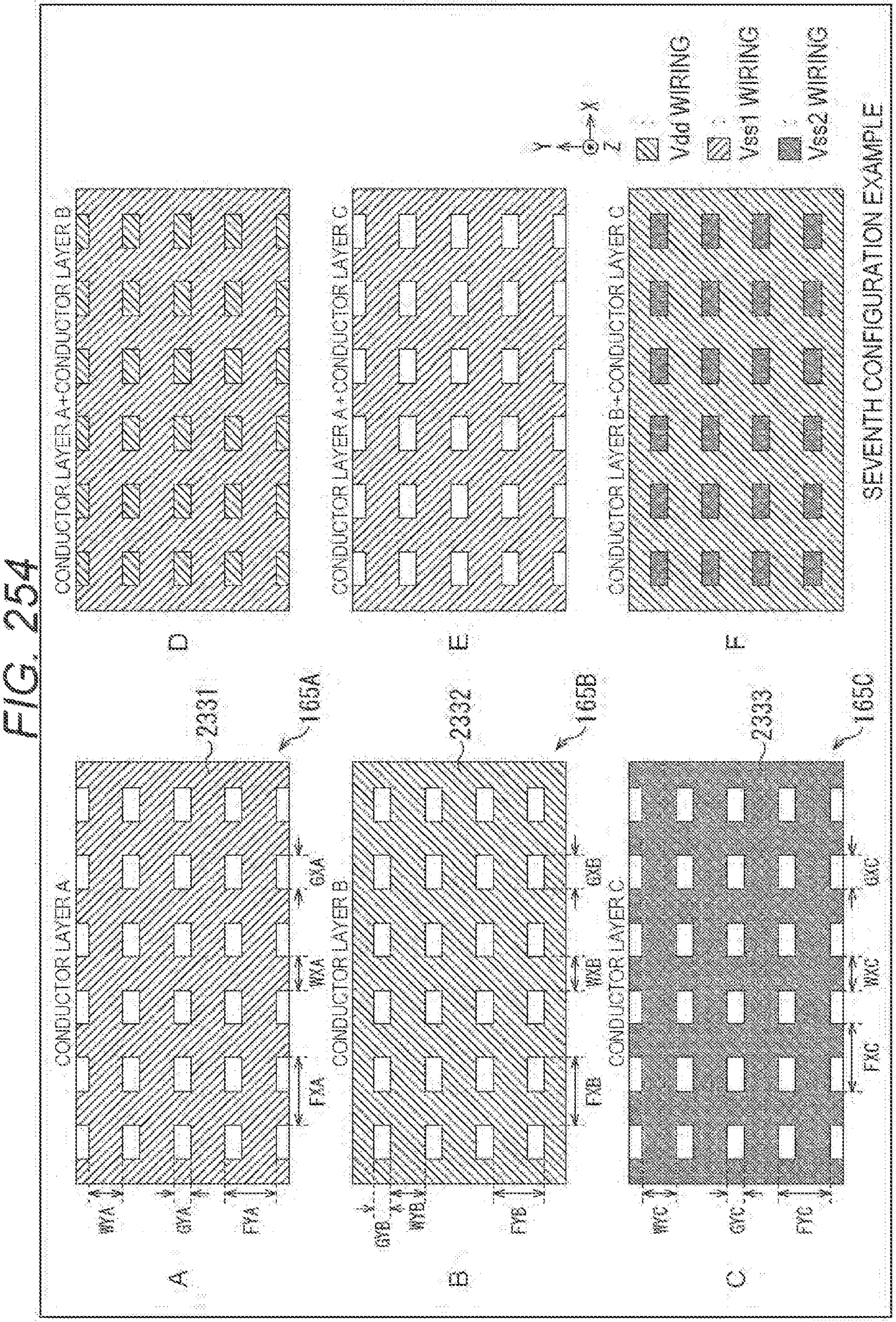

FIG. 254 is plan views of a seventh configuration example of the three-power supply.

Figure 255:
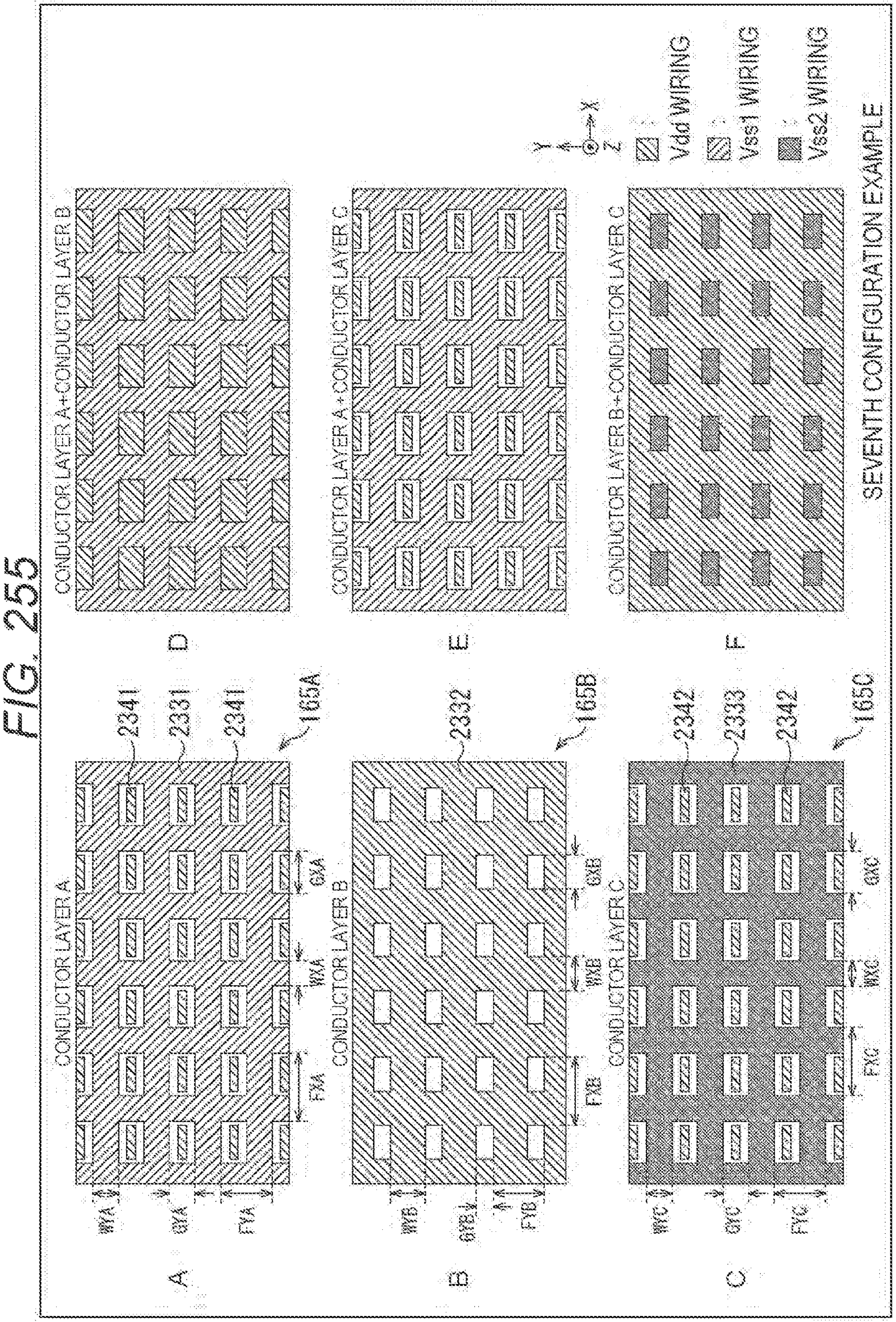

FIG. 255 is plan views of a modification of the seventh configuration example of the three-power supply.

Figure 256:
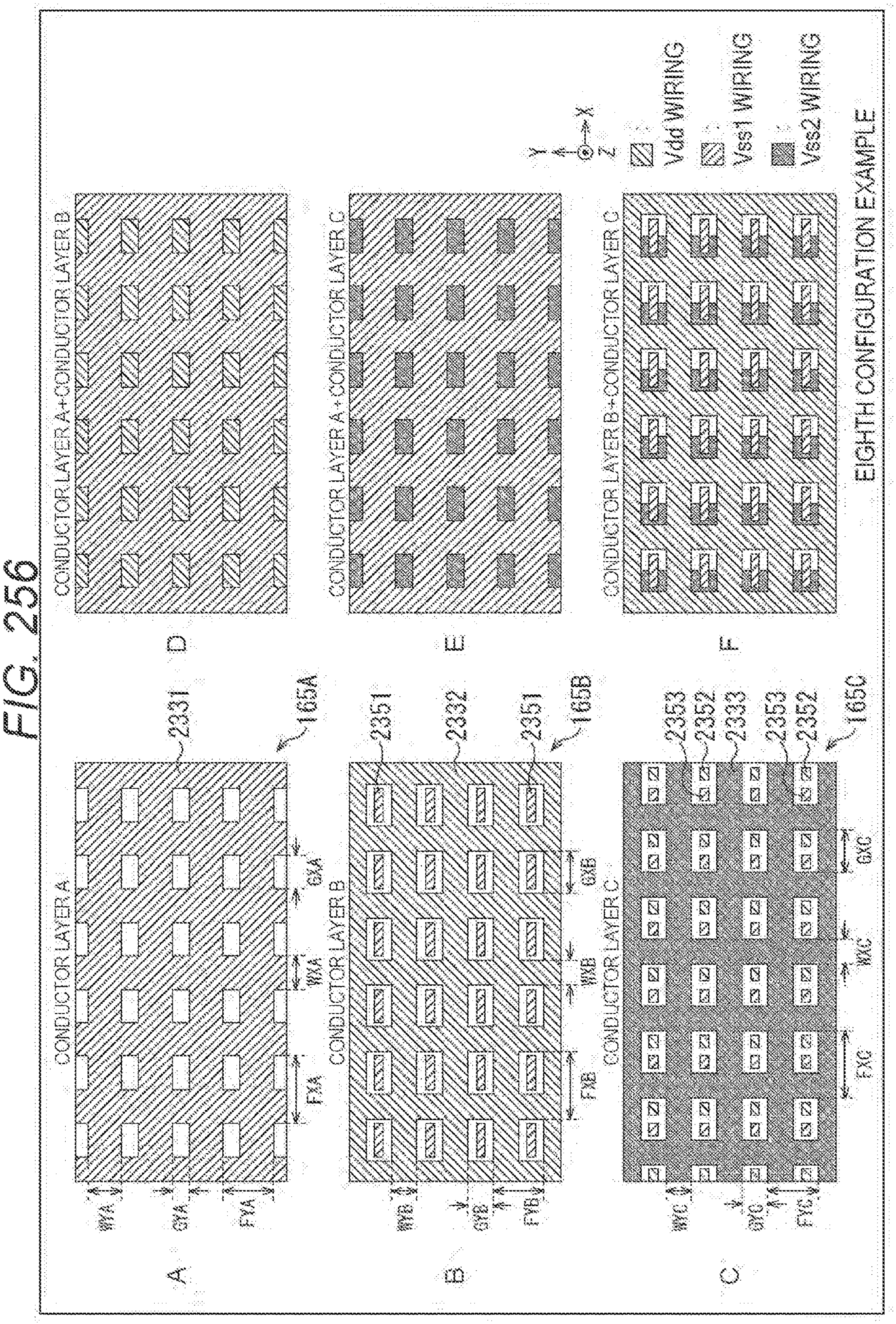

FIG. 256 is plan views of an eighth configuration example of the three-power supply.

Figure 257:
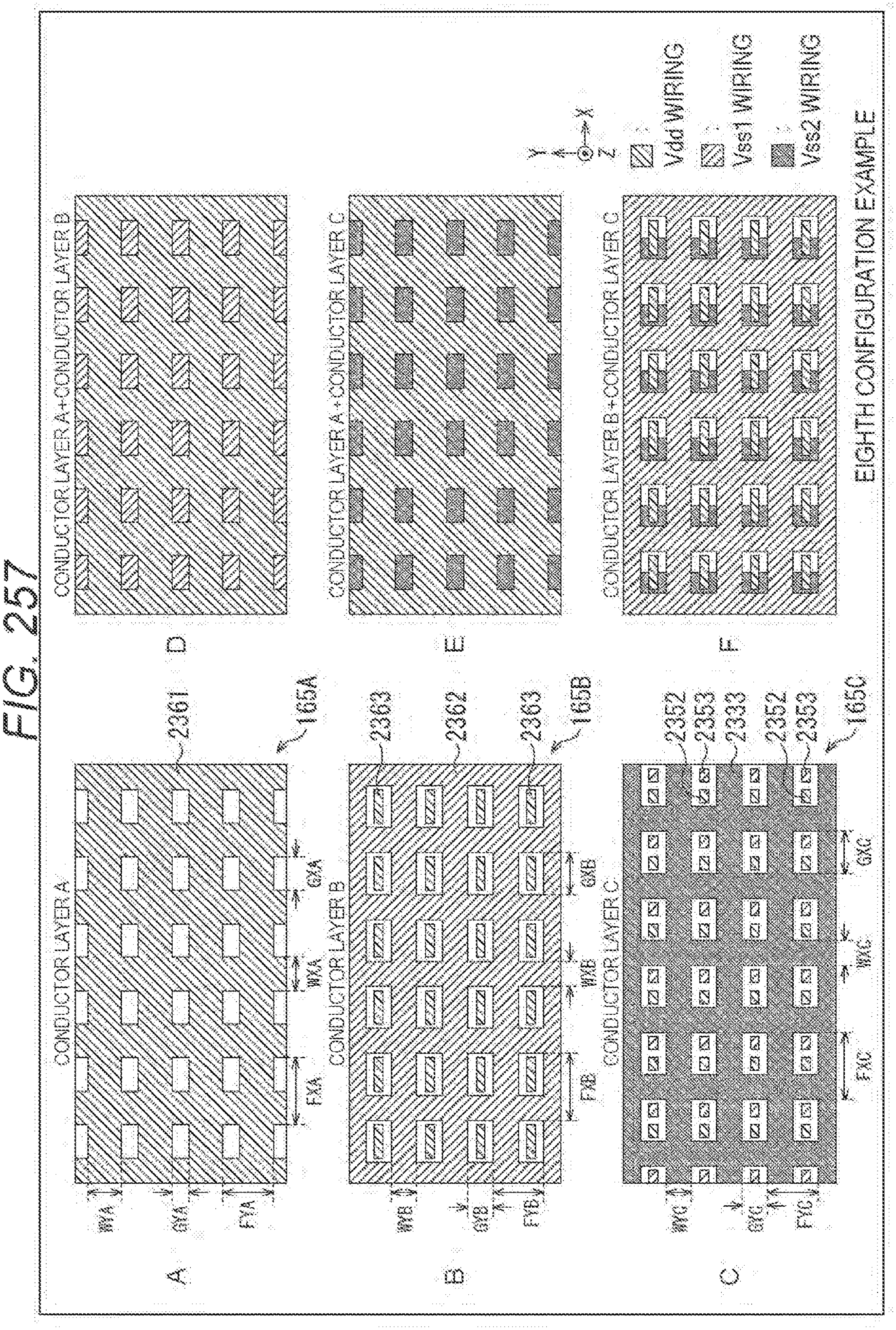

FIG. 257 is plan views of a first modification of the eighth configuration example of the three-power supply.

Figure 258:
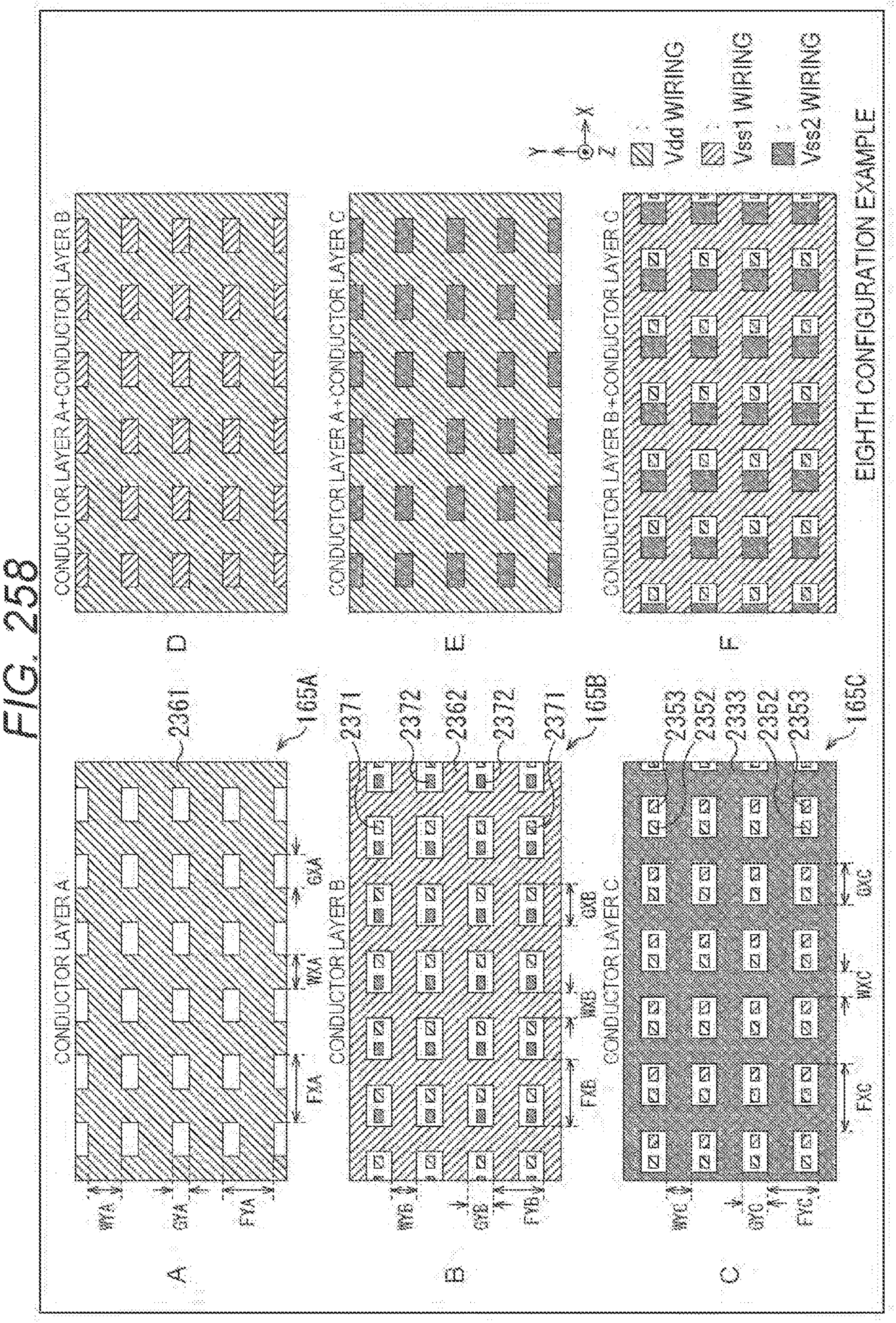

FIG. 258 is plan views of a second modification of the eighth configuration example of the three-power supply.

Figure 259:
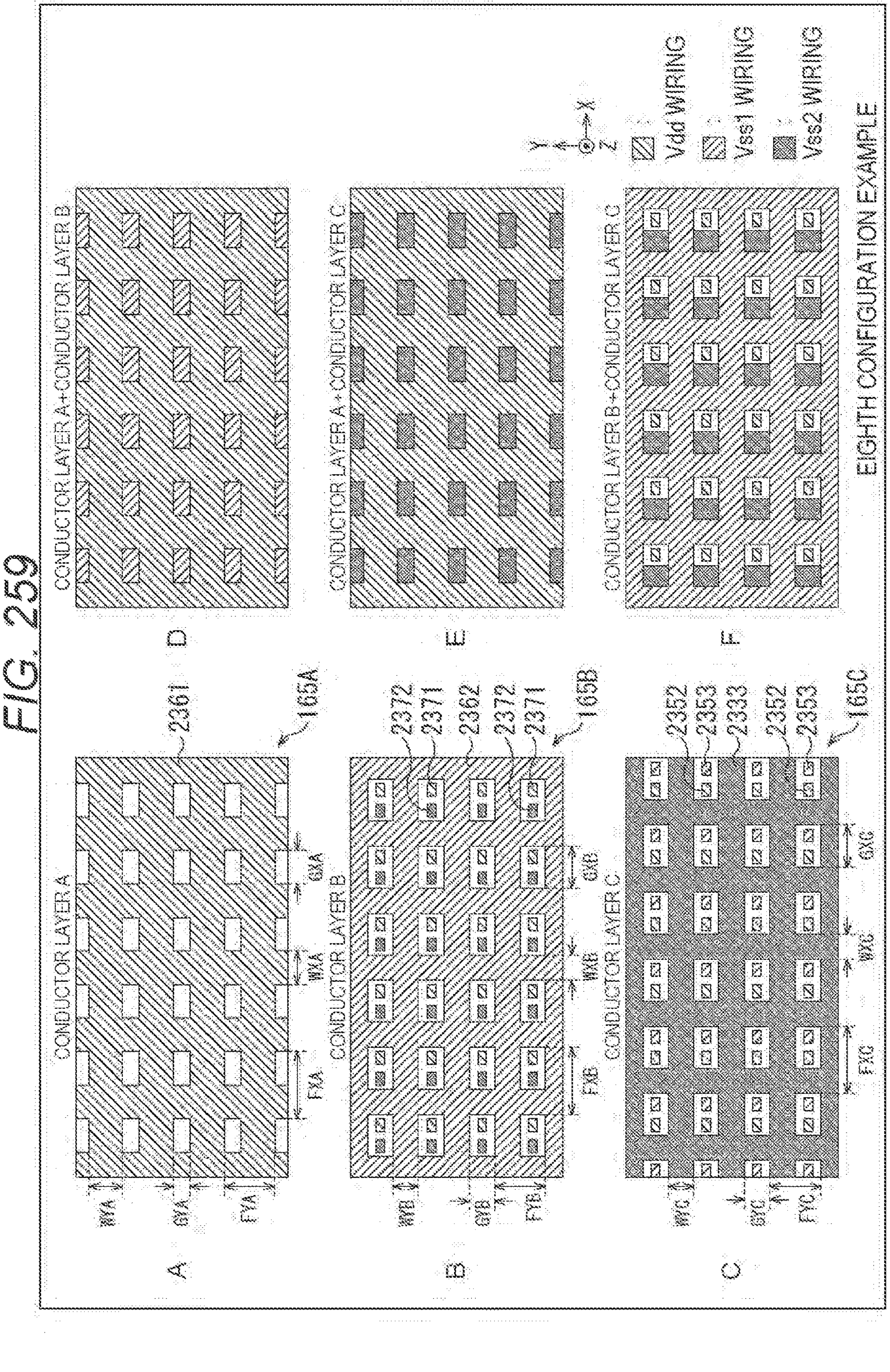

FIG. 259 is plan views of a third modification of the eighth configuration example of the three-power supply.

Figure 260:
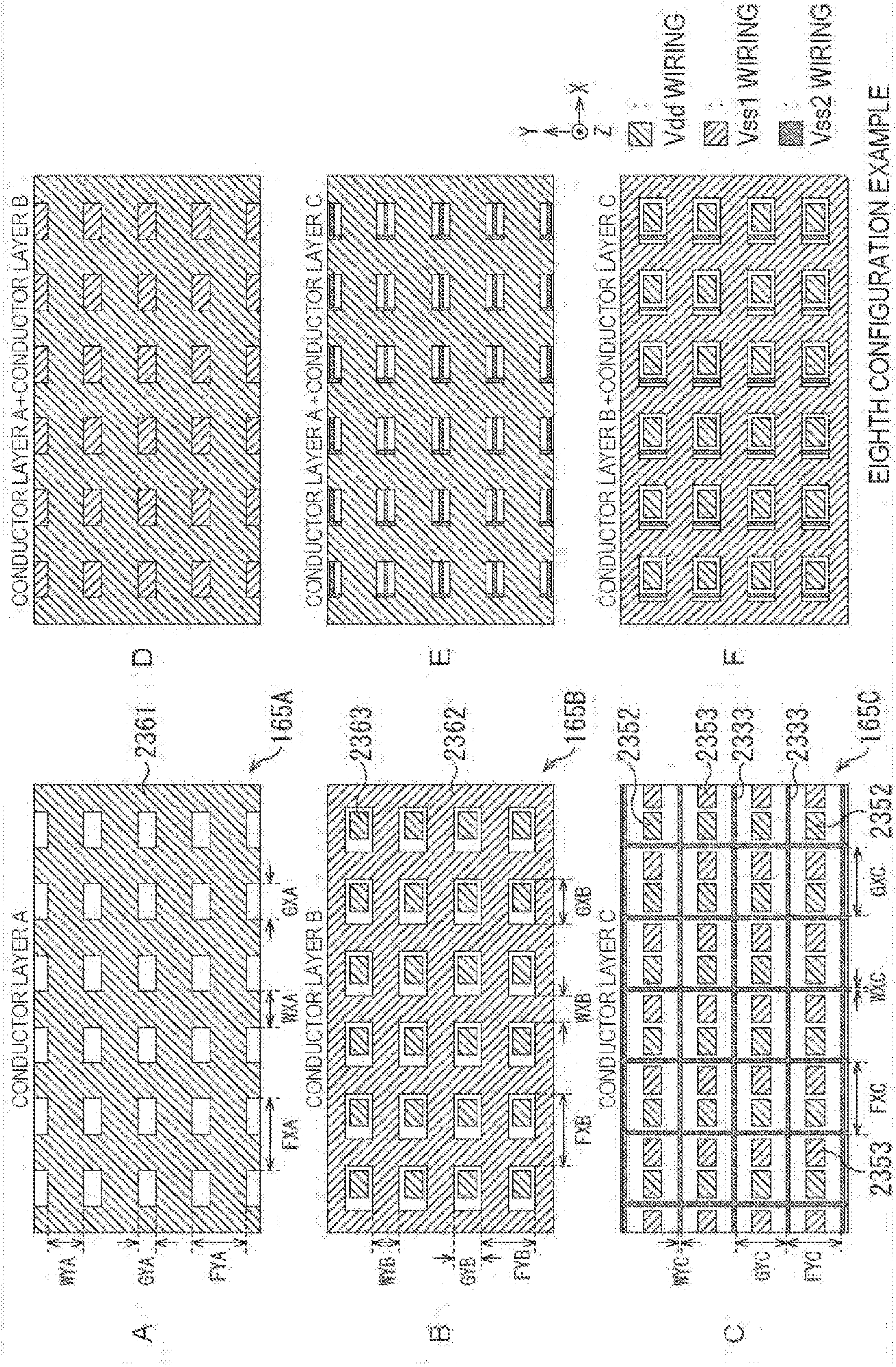

FIG. 260 is plan views of a fourth modification of the eighth configuration example of the three-power supply.

Figure 261:
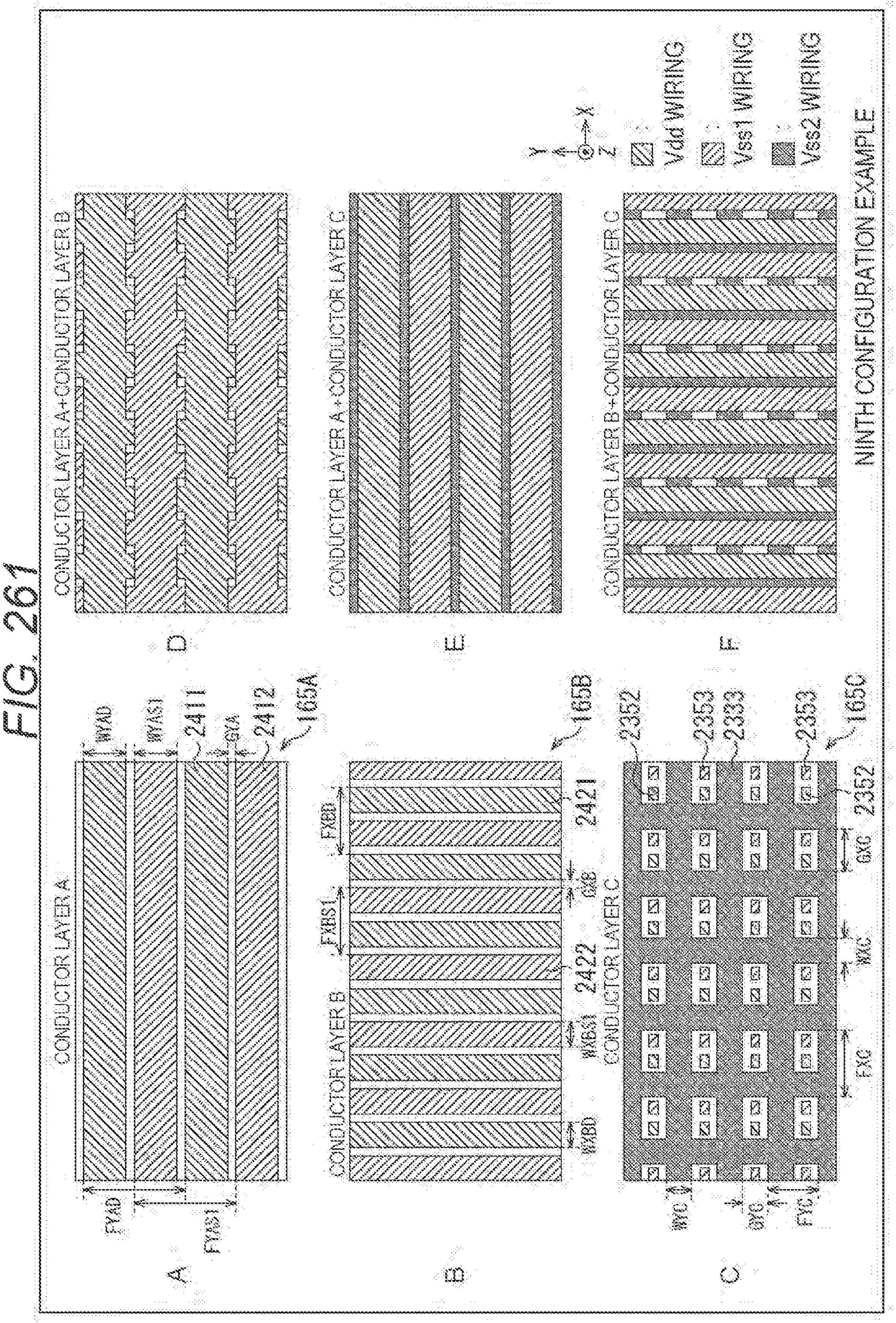

FIG. 261 is plan views of a ninth configuration example of the three-power supply.

Figure 262:
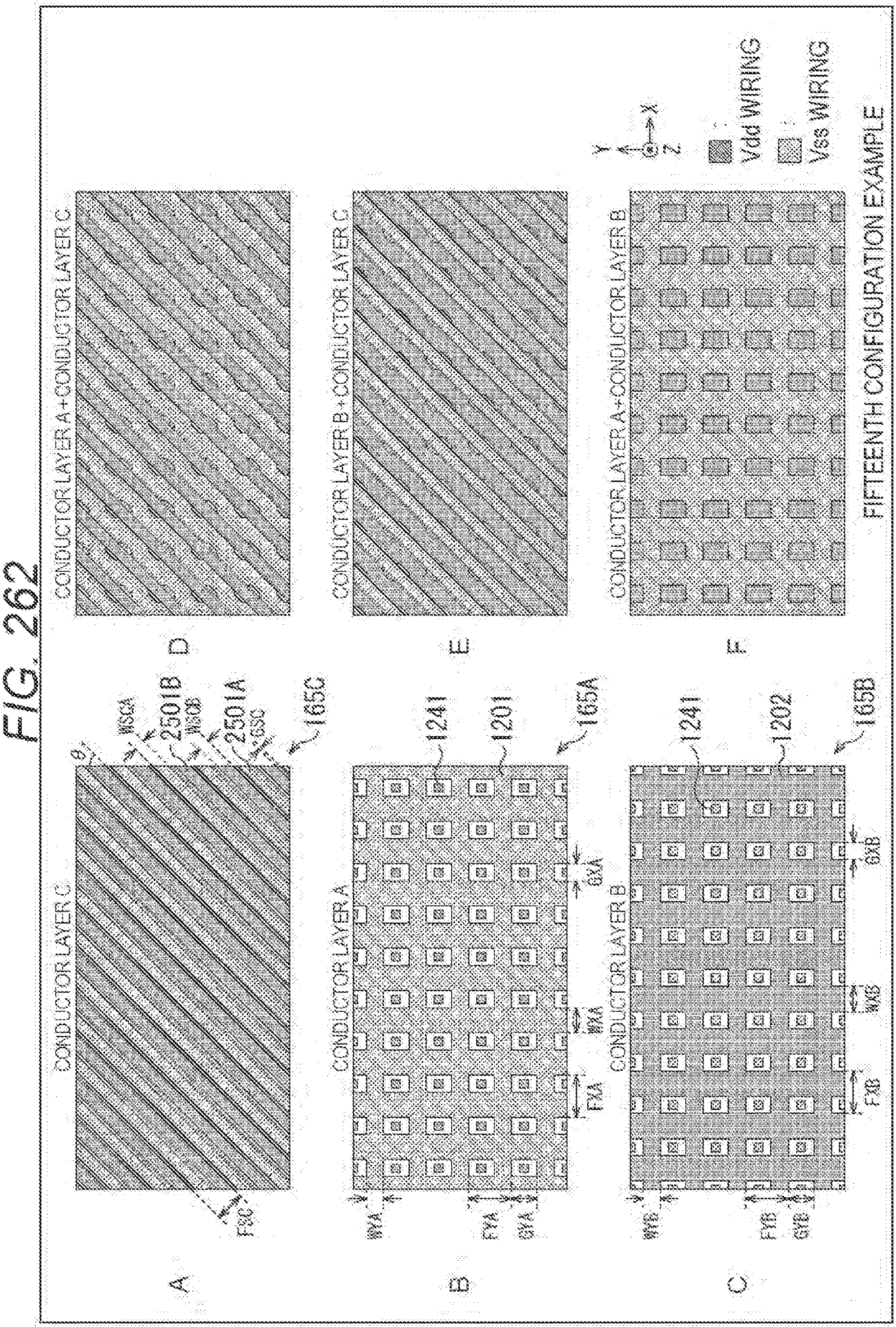

FIG. 262 is views illustrating a fifteenth configuration example of the three-layer conductor layer.

Figure 263:
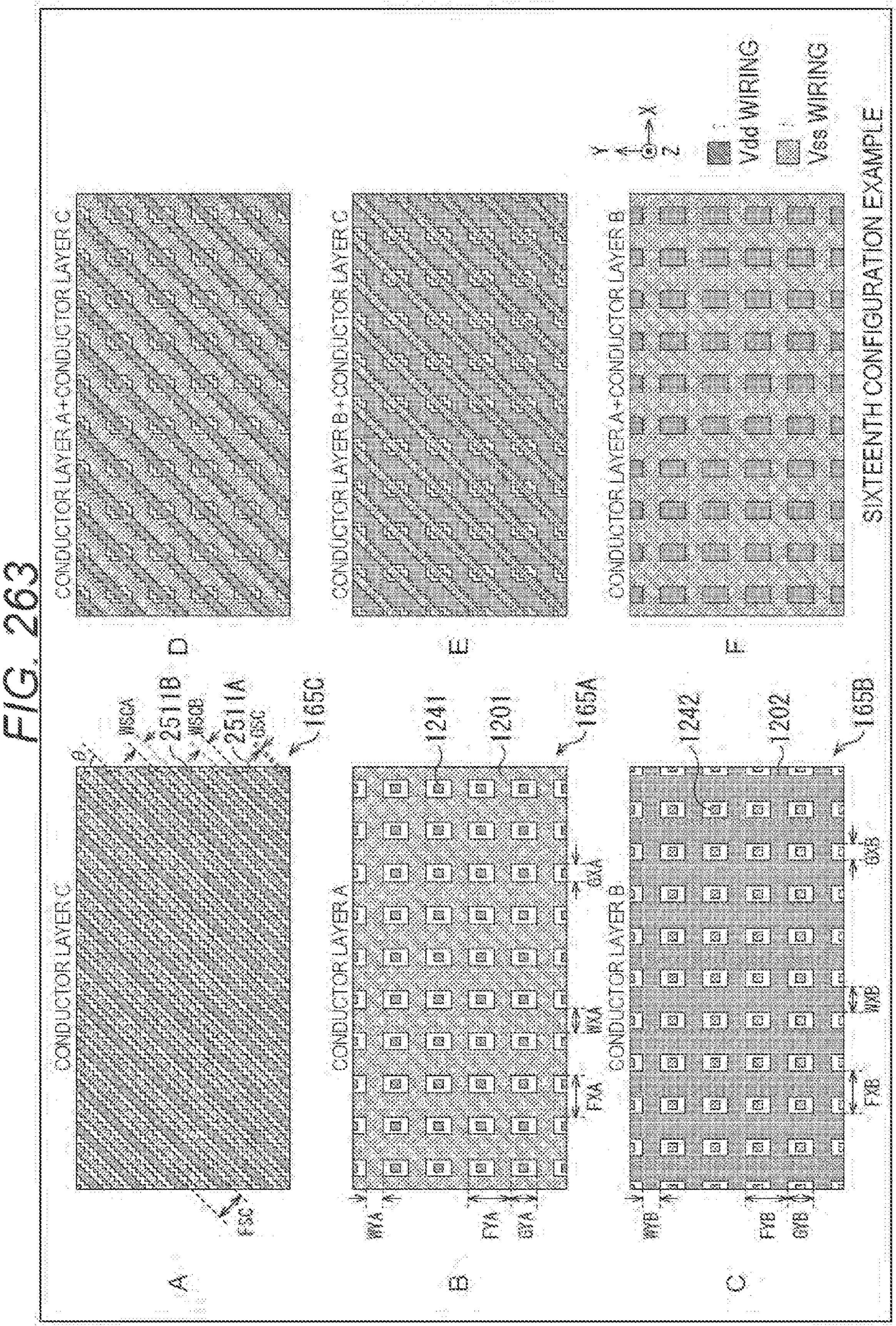

FIG. 263 is views illustrating a sixteenth configuration example of the three-layer conductor layer.

Figure 264:
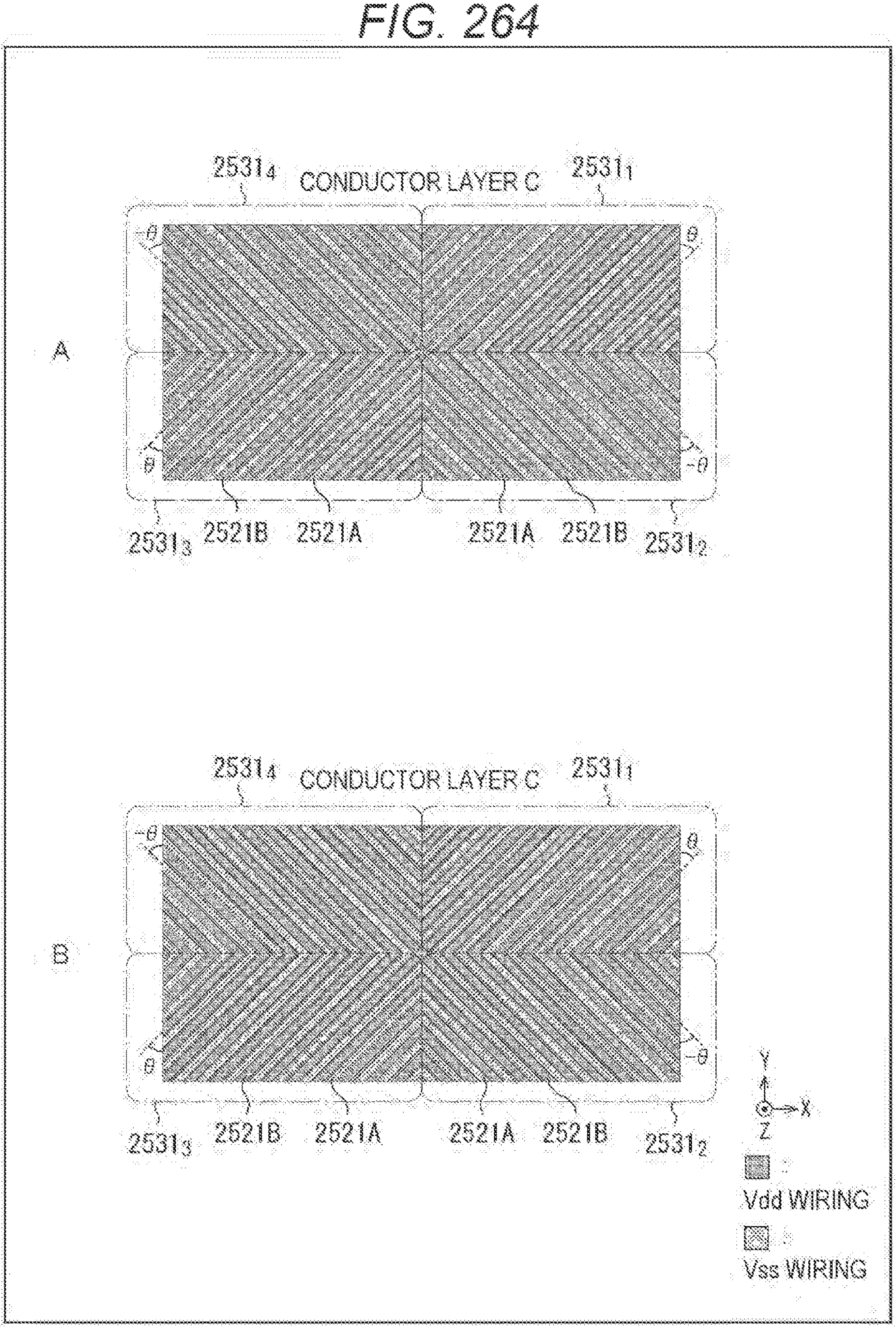

FIG. 264 is views illustrating a first modification and a second modification of the fifteenth configuration example of the three-layer conductor layer.

Figure 265:
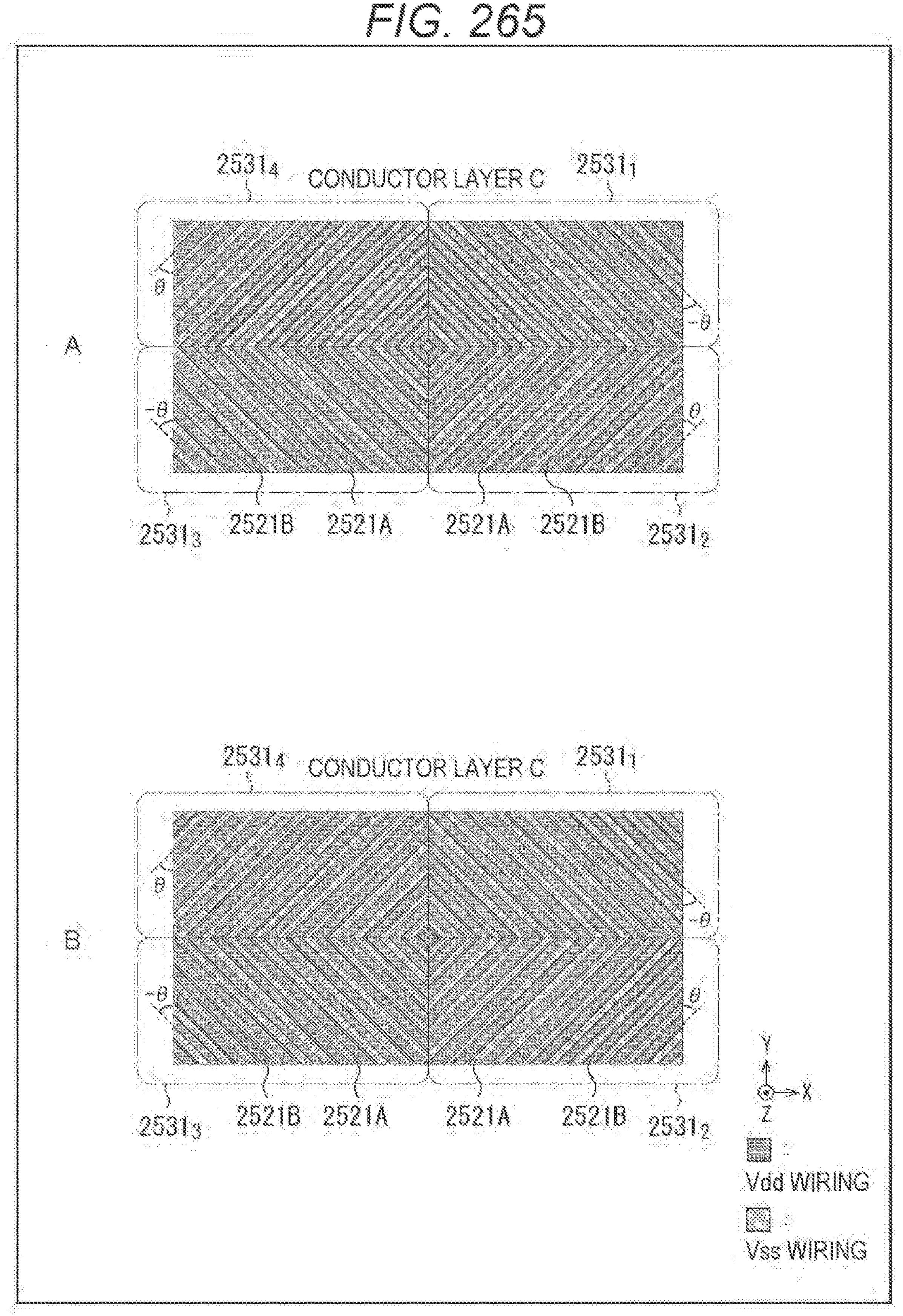

FIG. 265 is views illustrating a third modification and a fourth modification of the fifteenth configuration example of the three-layer conductor layer.

Figure 266:
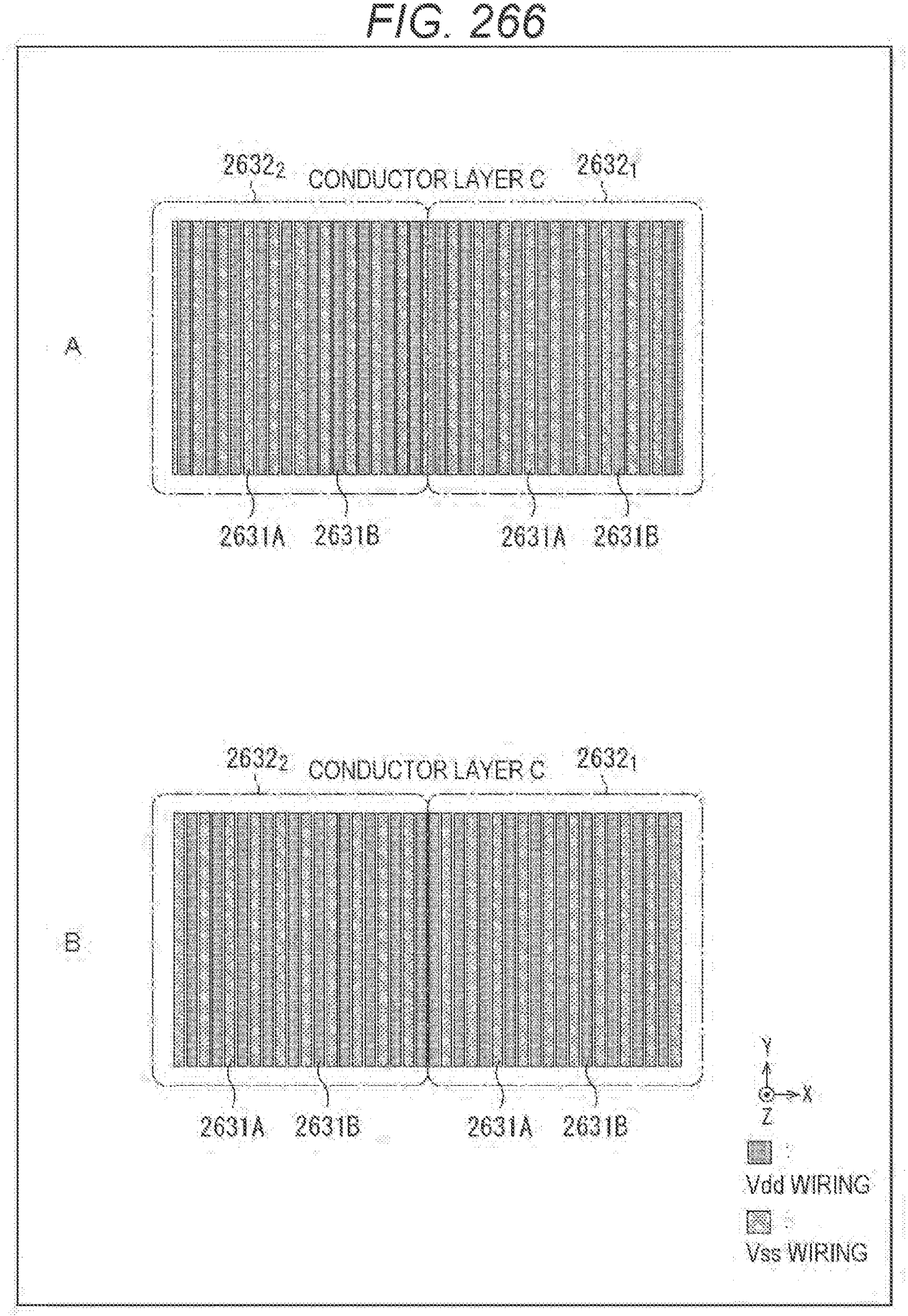

FIG. 266 is views illustrating a fifth modification and a sixth modification of the fifteenth configuration example of the three-layer conductor layer.

Figure 267:
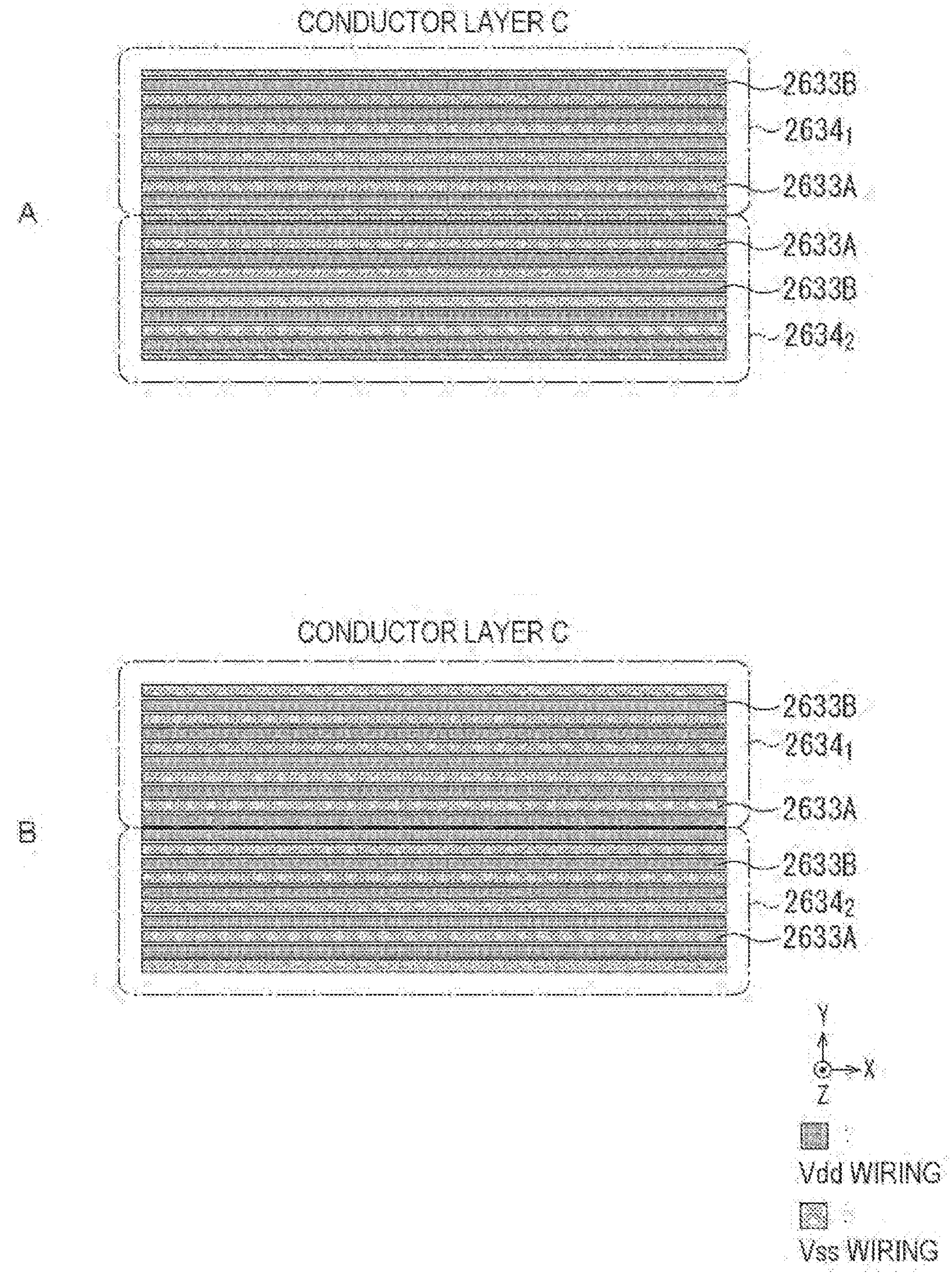

FIG. 267 is views illustrating a seventh modification and an eighth modification of the fifteenth configuration example of the three-layer conductor layer.

Figure 268:
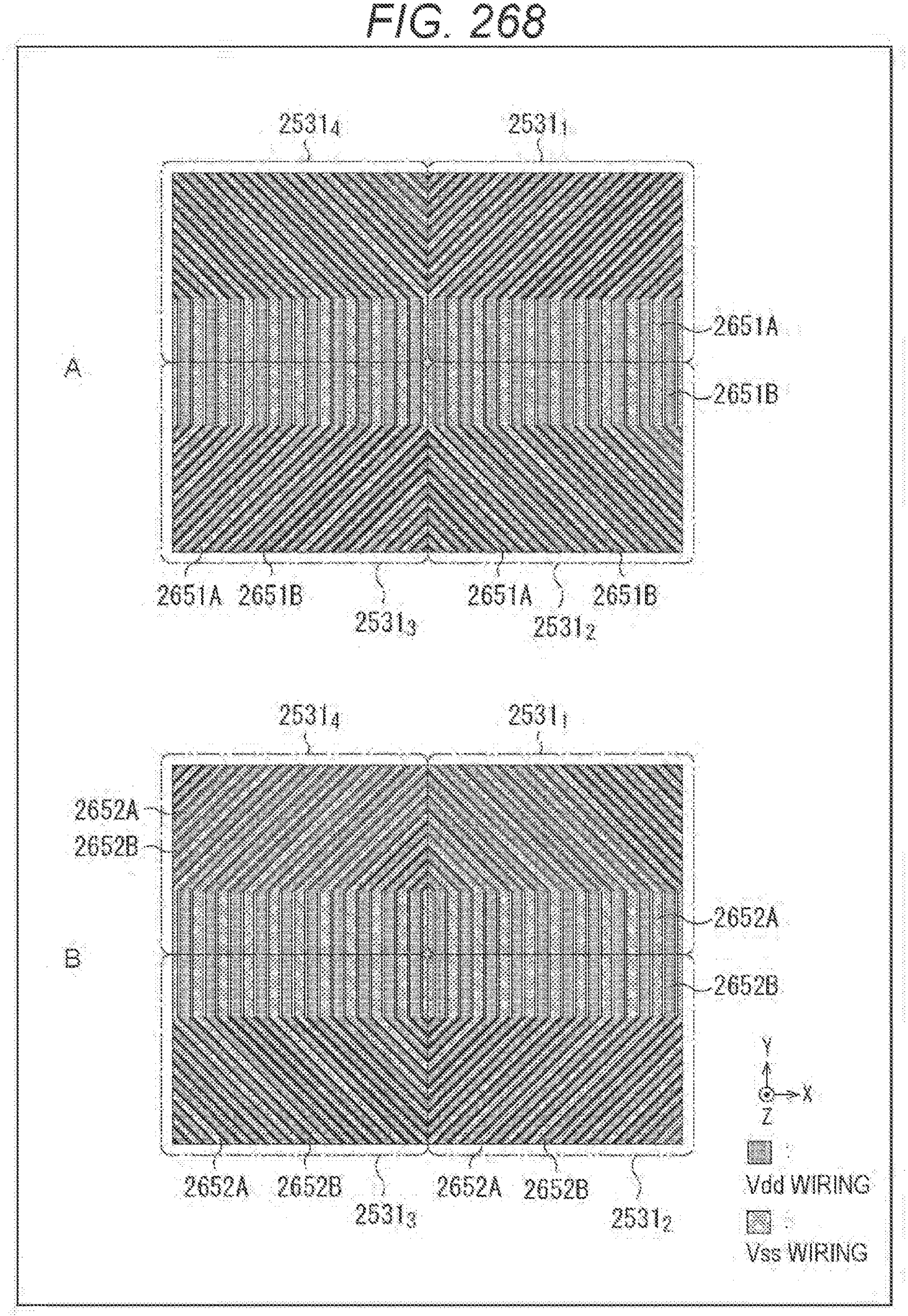

FIG. 268 is views illustrating a ninth modification and a tenth modification of the fifteenth configuration example of the three-layer conductor layer.

Figure 269:
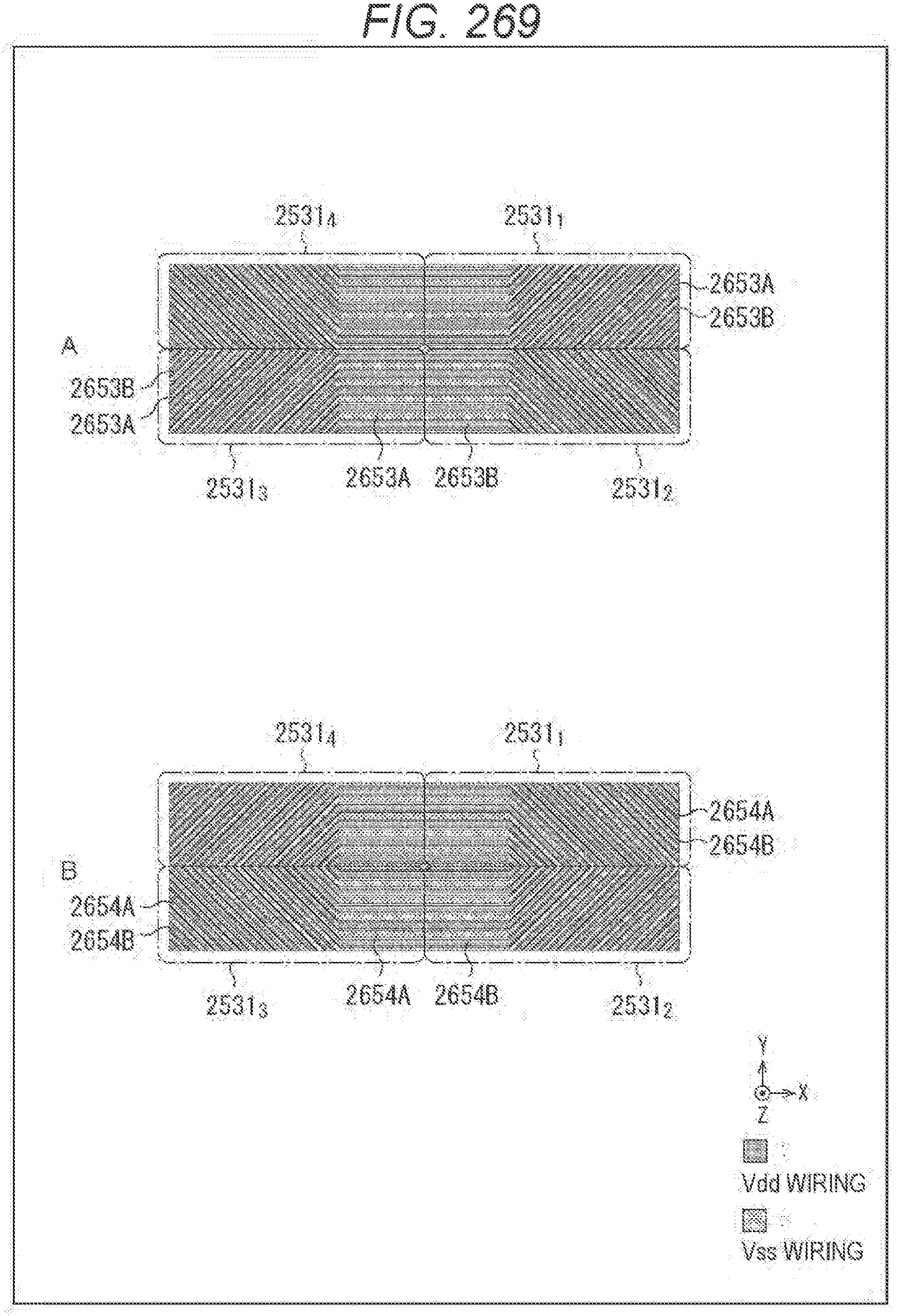

FIG. 269 is views illustrating an eleventh modification and a twelfth modification of the fifteenth configuration example of the three-layer conductor layer.

Figure 270:
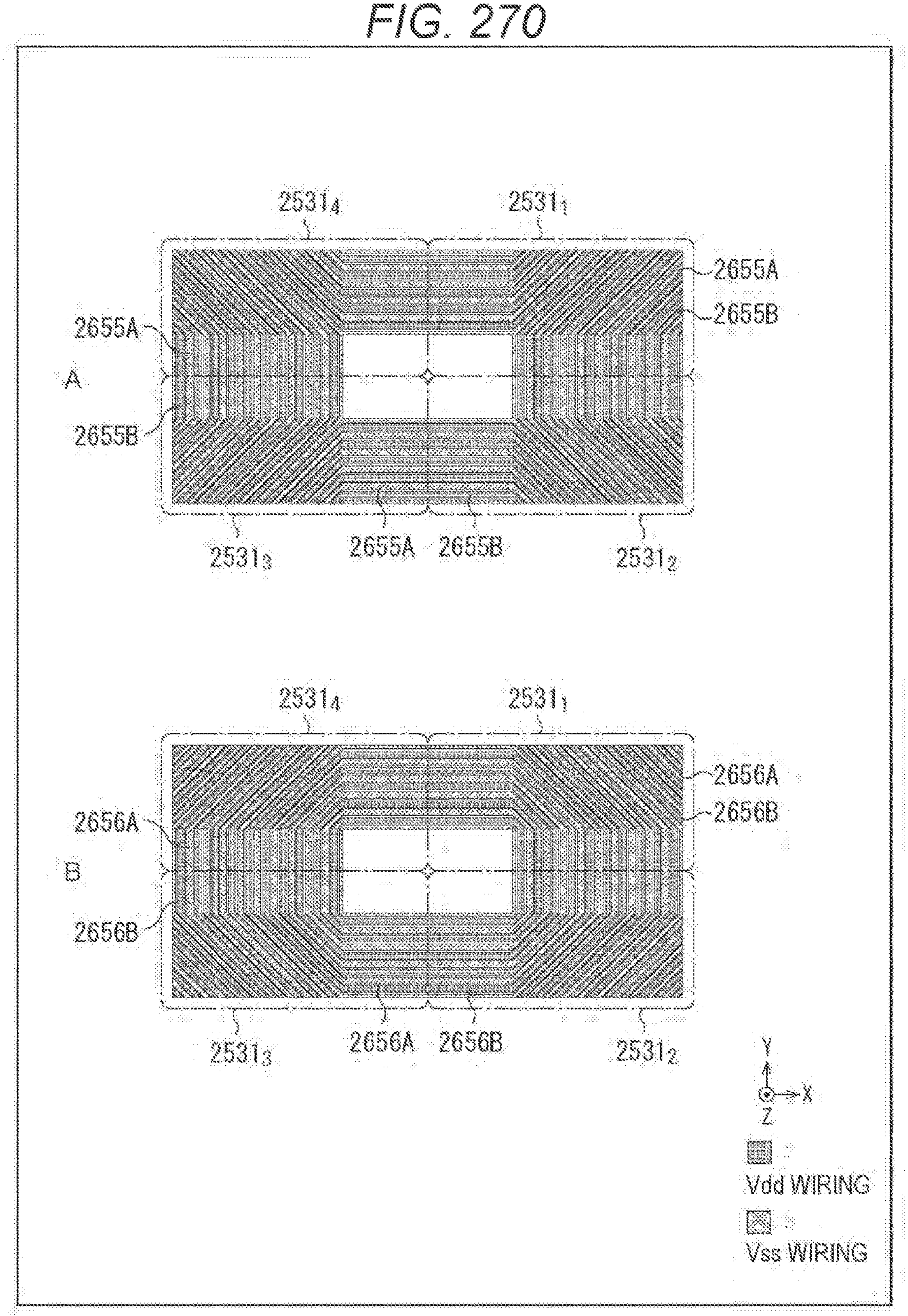

FIG. 270 is views illustrating a thirteenth modification and a fourteenth modification of the fifteenth configuration example of the three-layer conductor layer.

Figure 271:
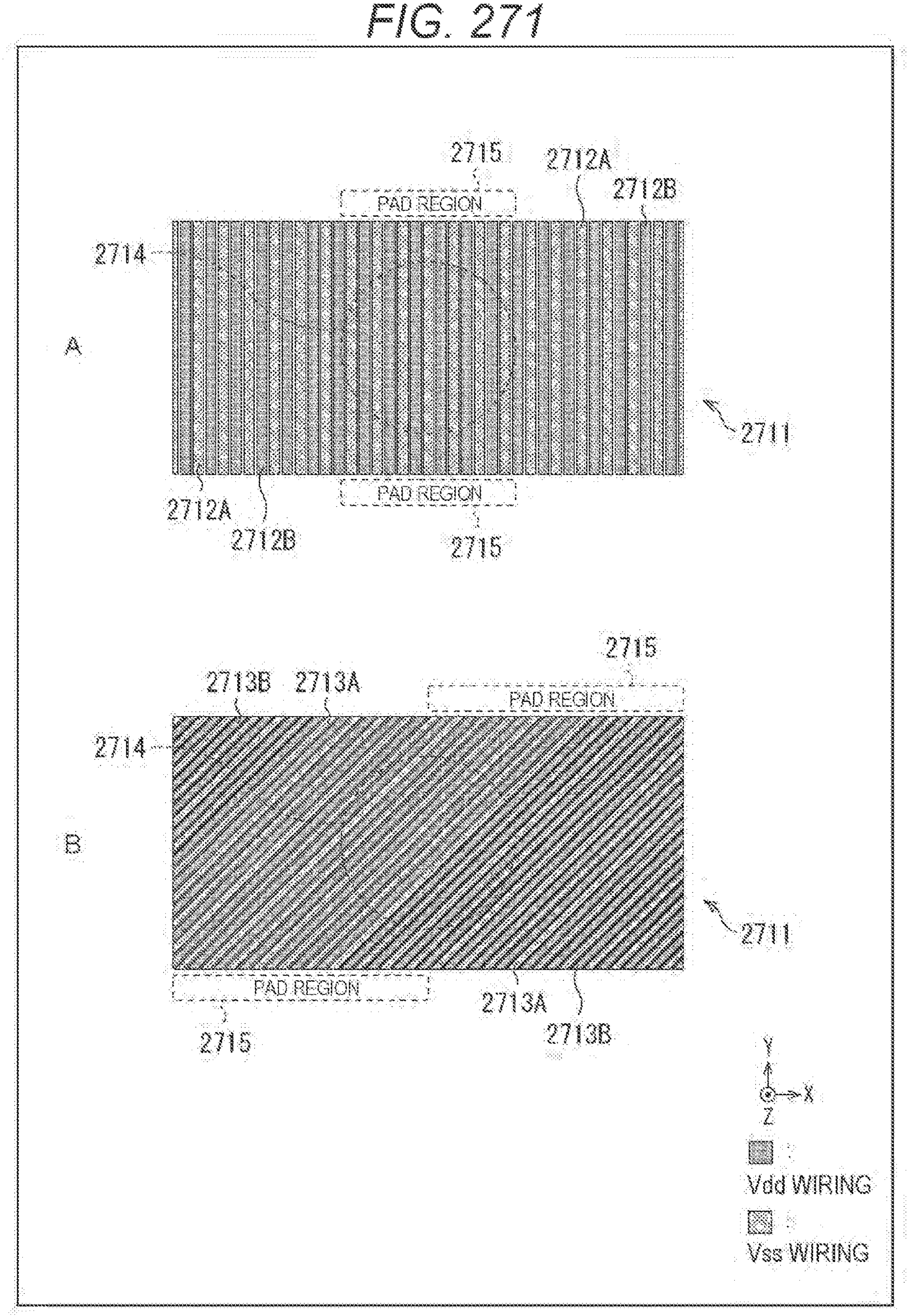

FIG. 271 is views for describing effects of mirror-symmetrical arrangement.

Figure 272:
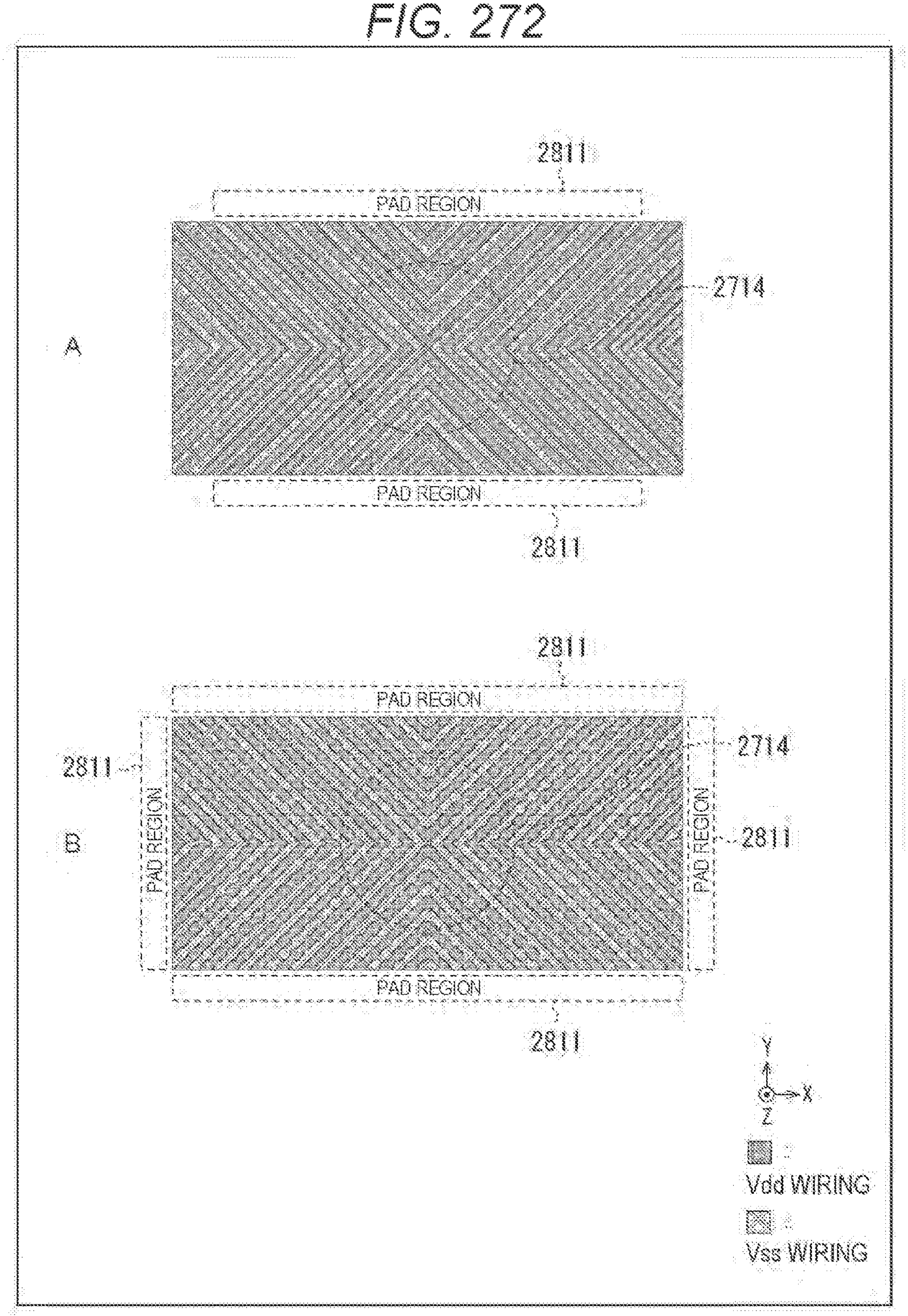

FIG. 272 is views for describing effects of mirror-symmetrical arrangement.

Figure 273:
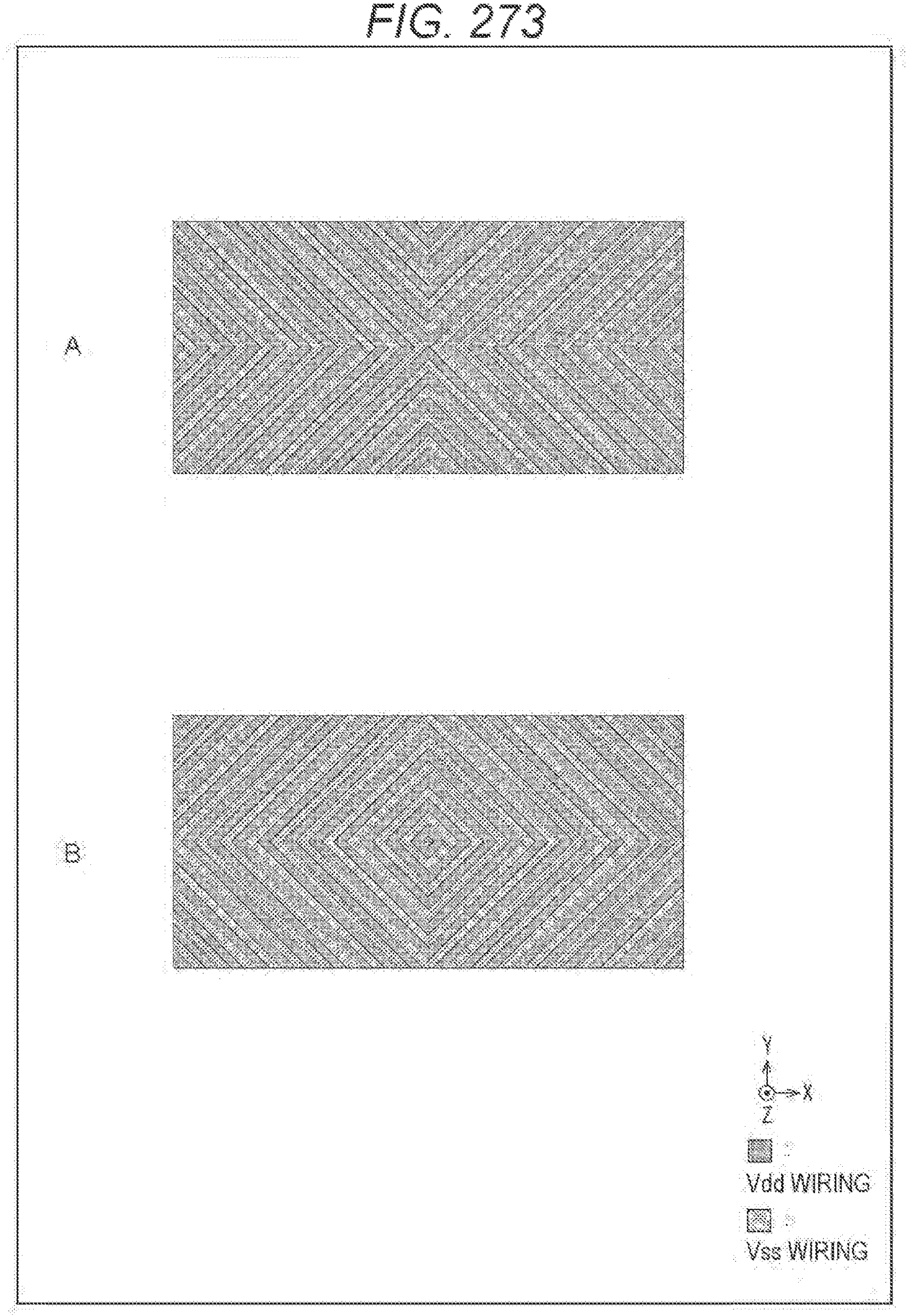

FIG. 273 is views illustrating a light-shielding structure of the fifteenth configuration example of the three-layer conductor layer.

Figure 274:
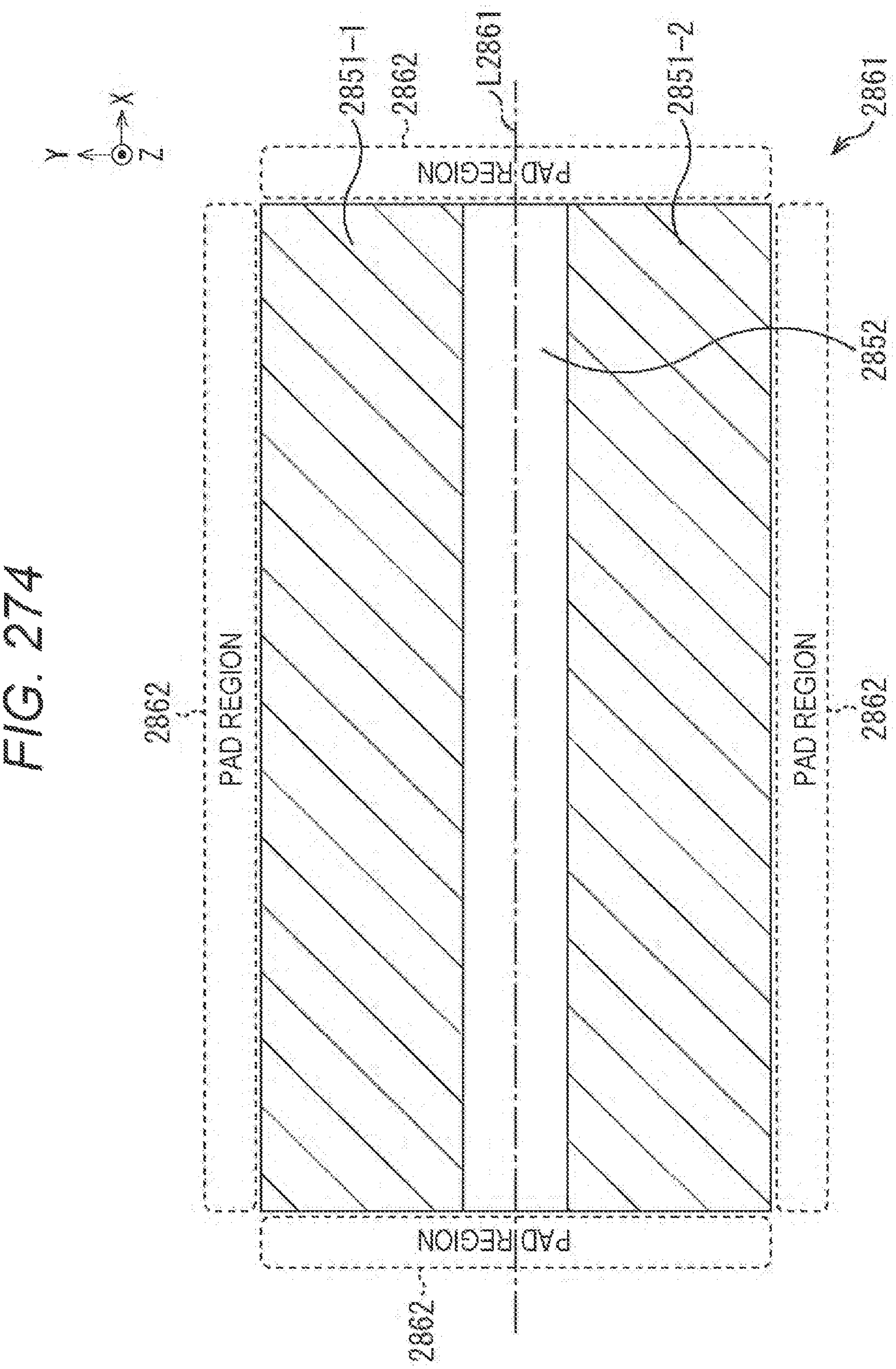

FIG. 274 is a view illustrating a first configuration example of a conductor layer having a mirror-symmetrical arrangement with a gap.

Figure 275:
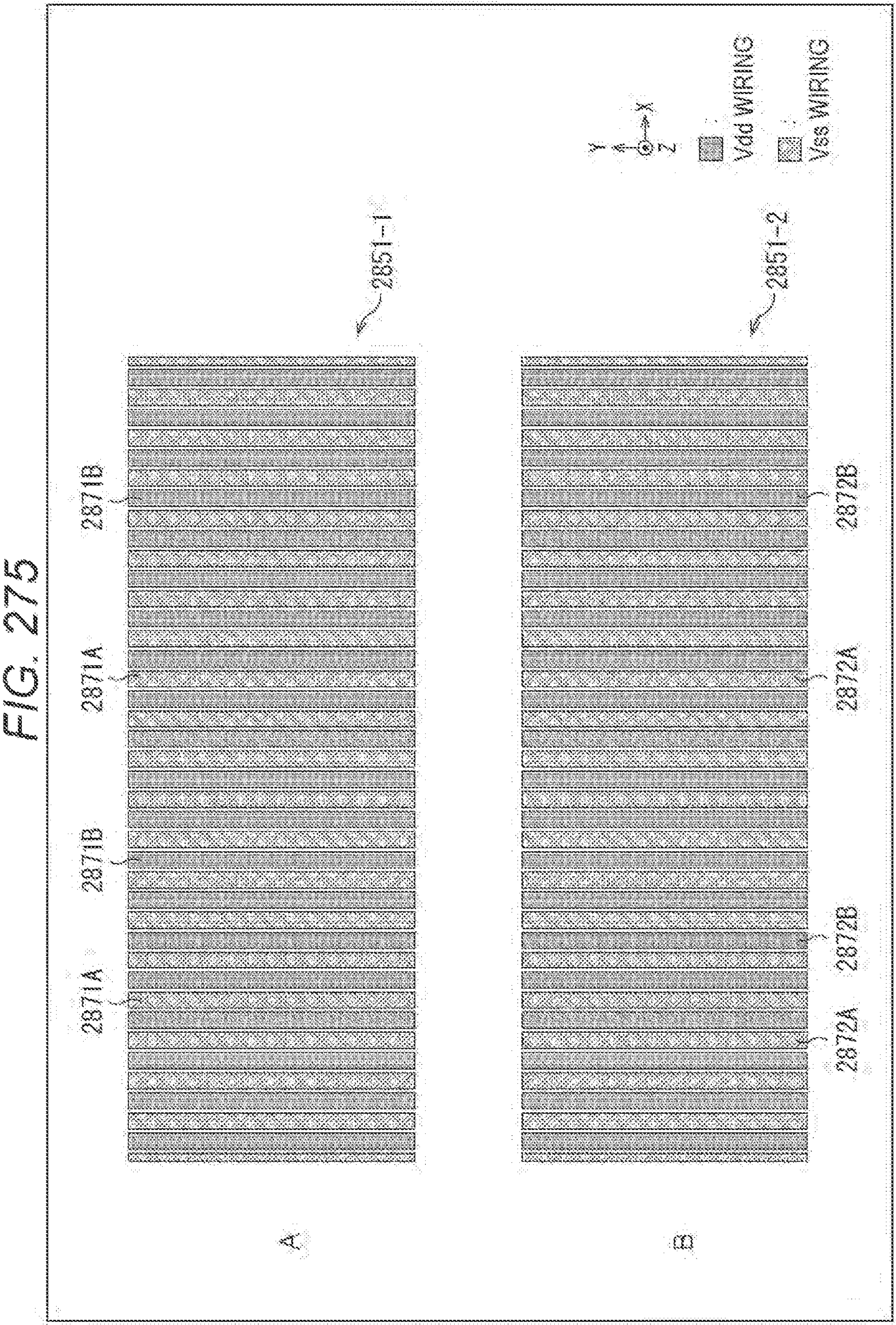

FIG. 275 is views illustrating an example of a first conductor that can be arranged in the conductor layer of FIG. 274.

Figure 276:
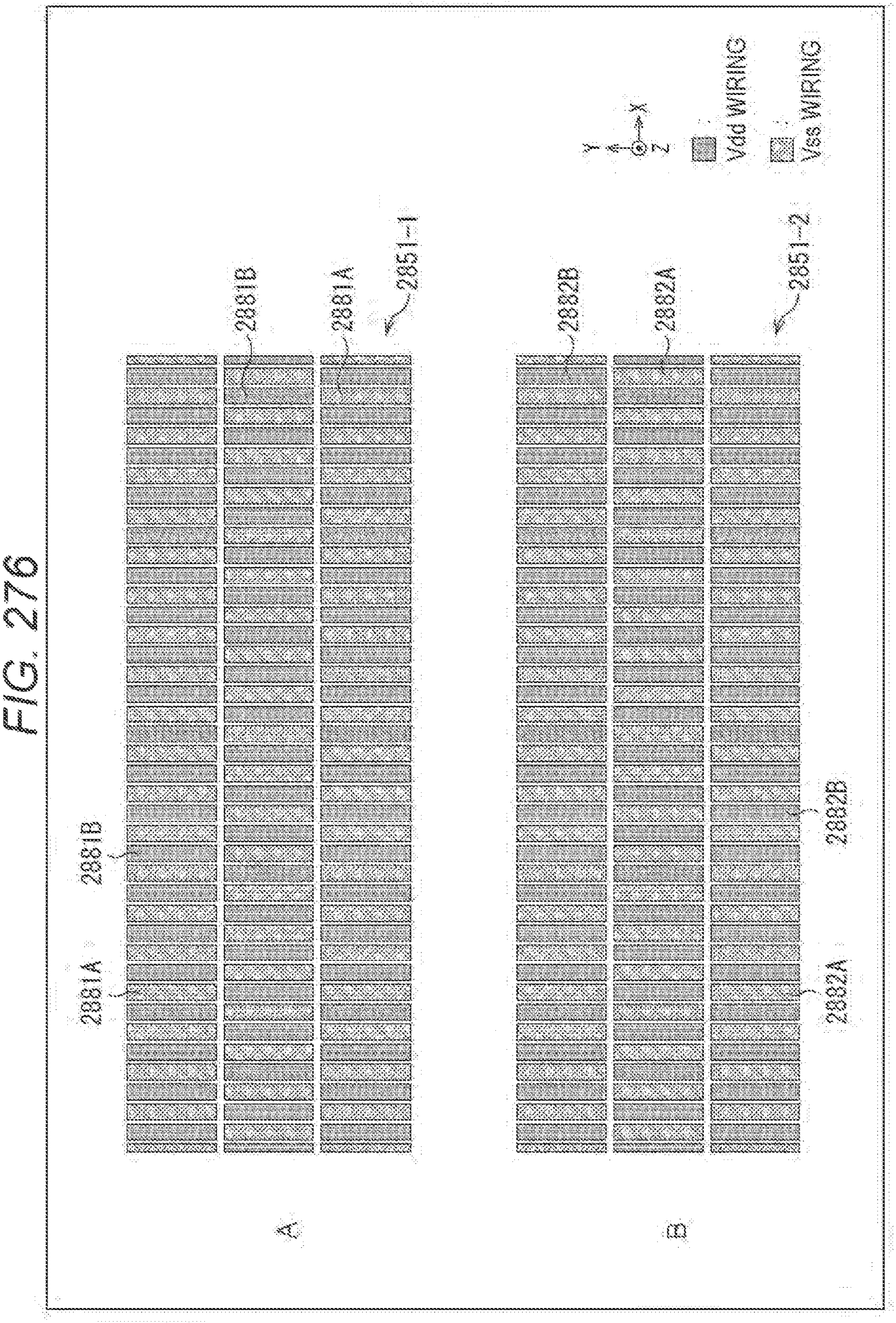

FIG. 276 is views illustrating an example of a second conductor that can be arranged in the conductor layer of FIG. 274.

Figure 277:
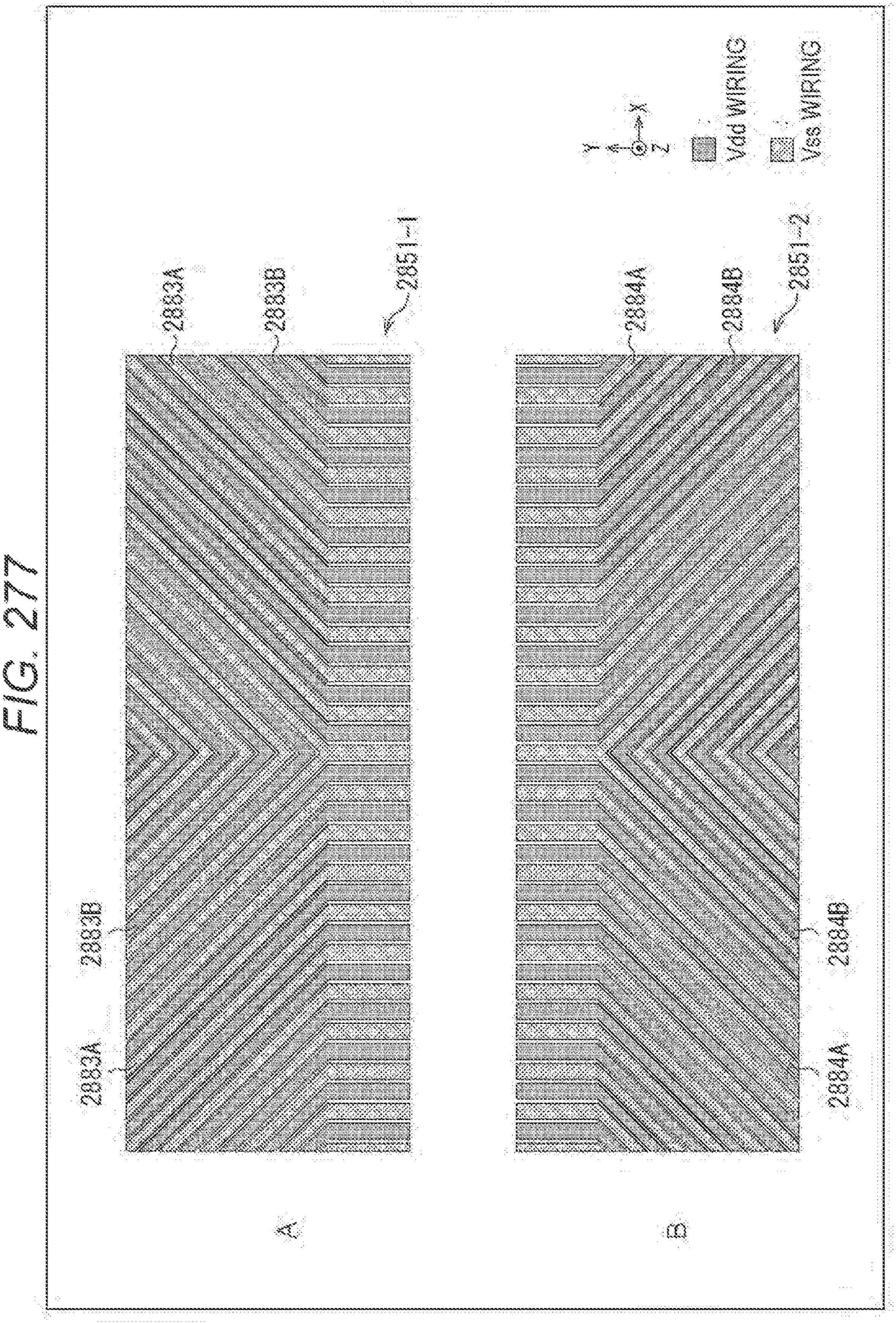

FIG. 277 is views illustrating an example of a third conductor that can be arranged in the conductor layer of FIG. 274.

Figure 278:
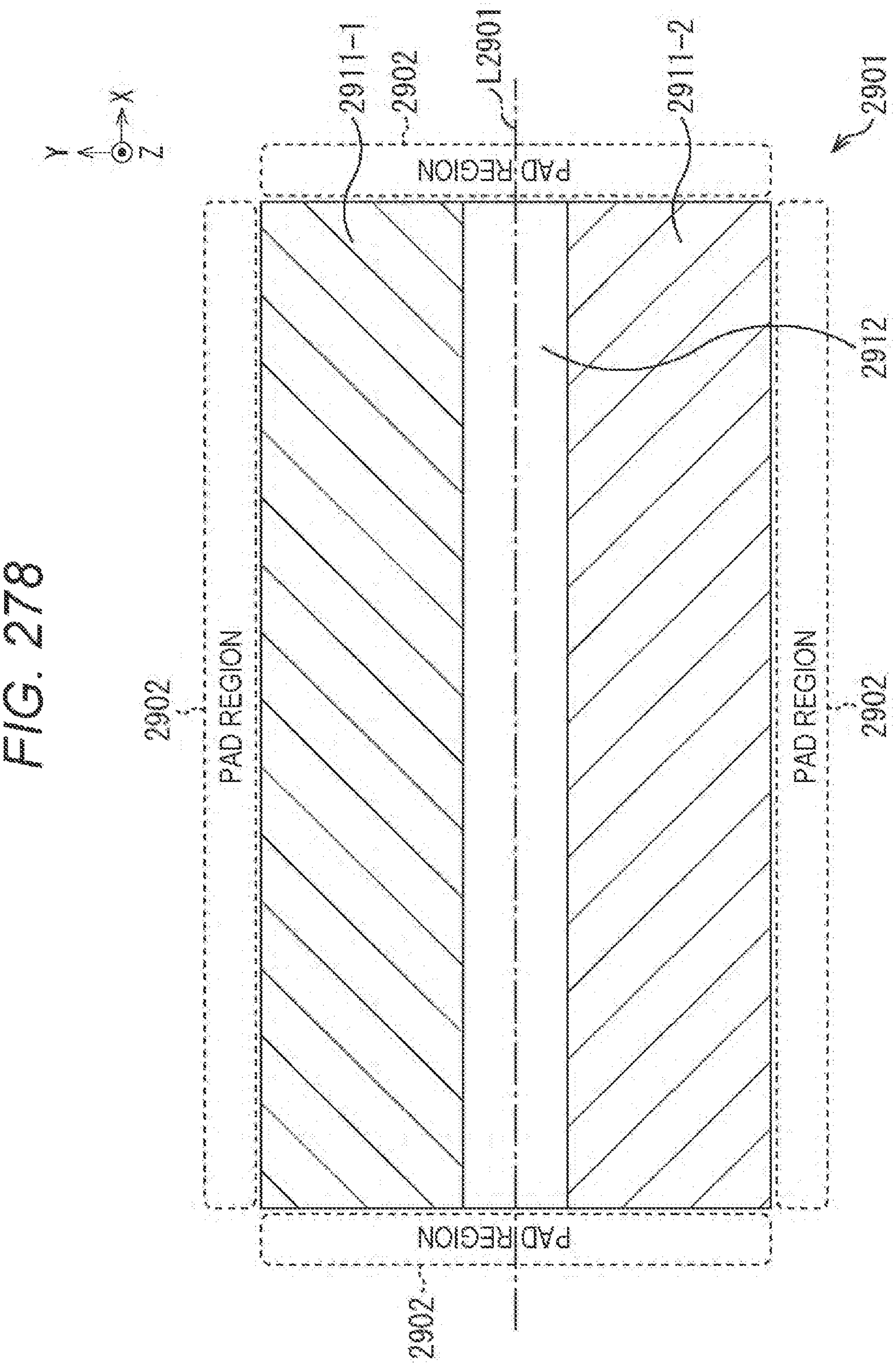

FIG. 278 is a view illustrating a second configuration example of the conductor layer having a mirror-symmetrical arrangement with a gap.

Figure 279:
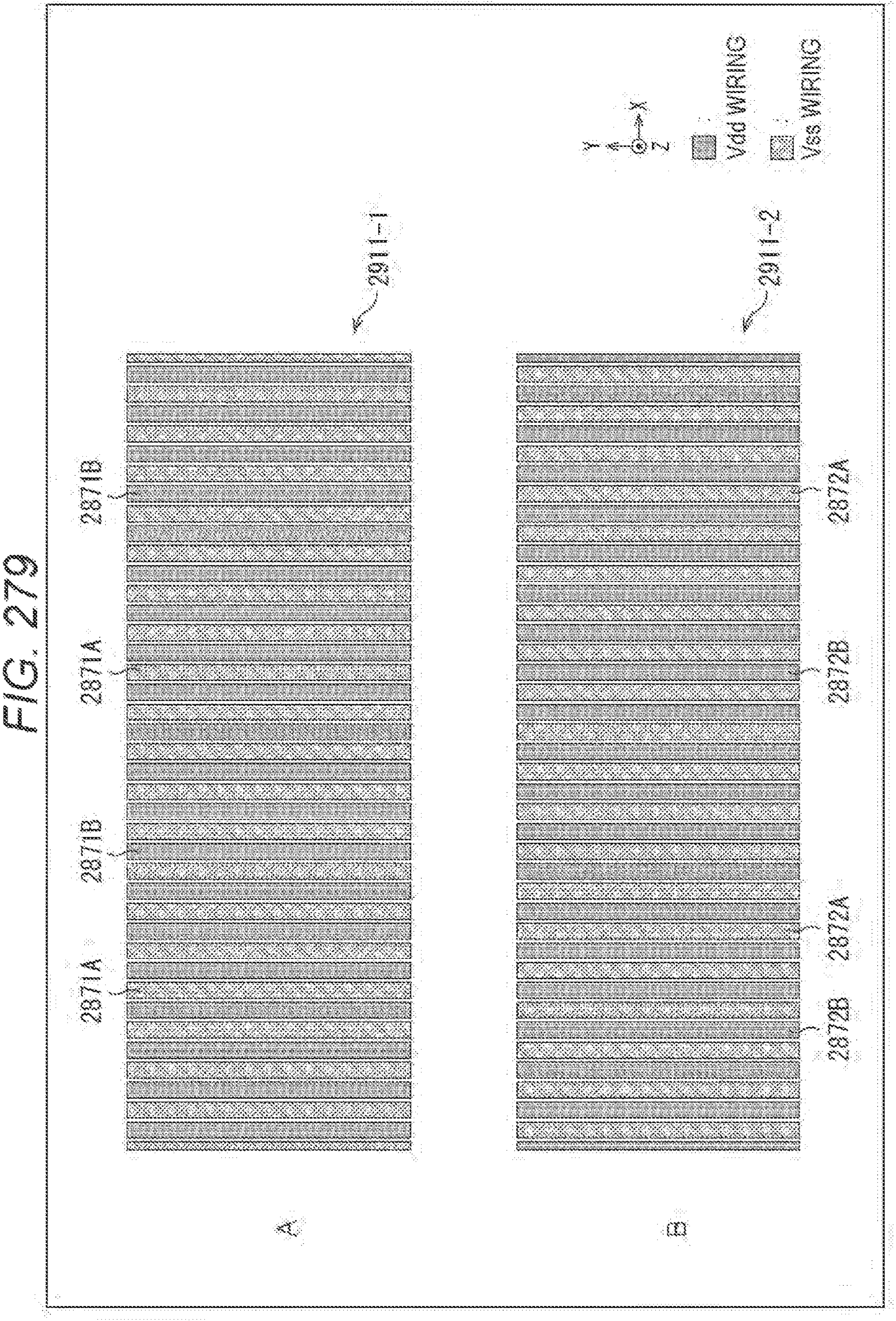

FIG. 279 is views illustrating an example of a first conductor that can be arranged in the conductor layer of FIG. 278.

Figure 280:
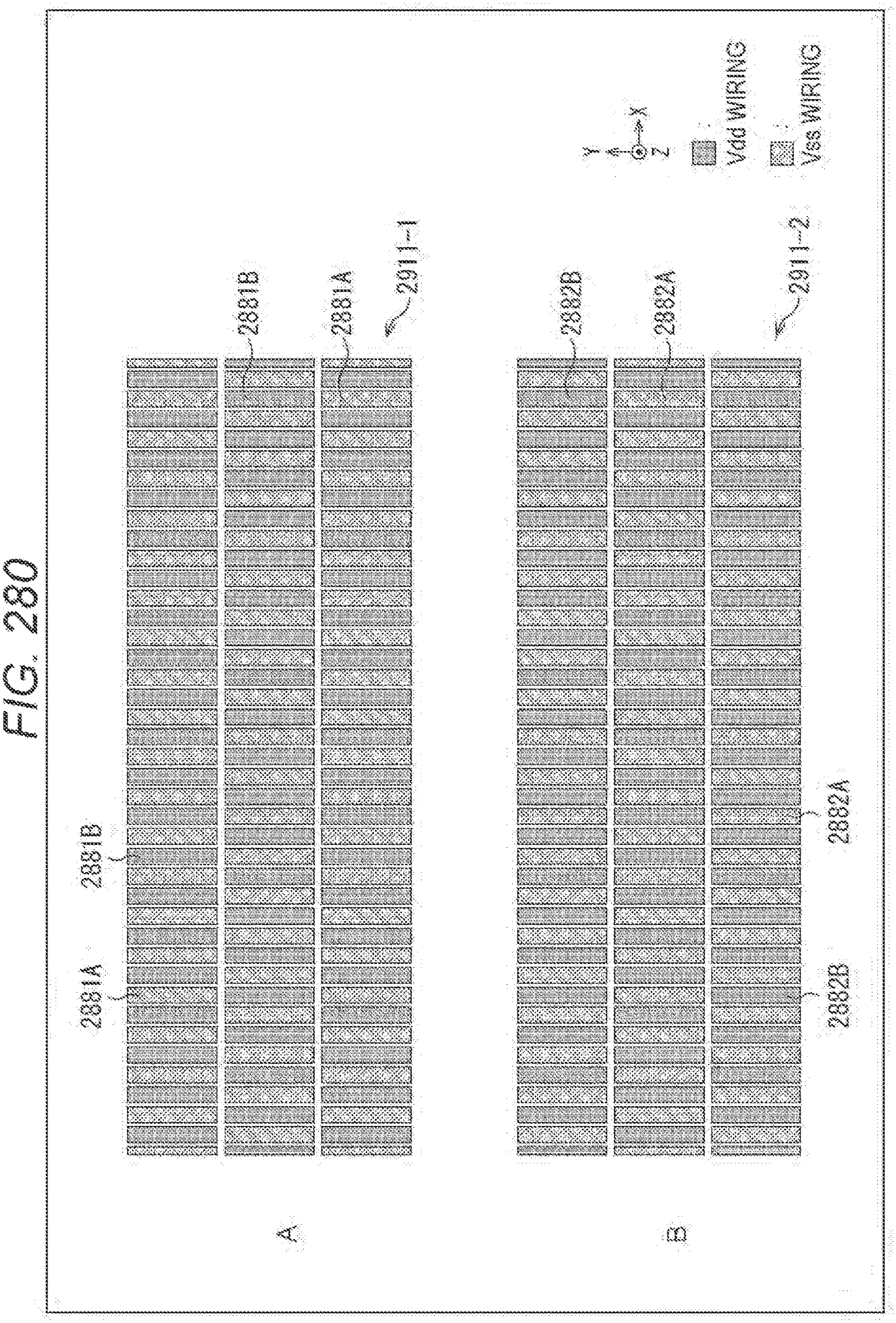

FIG. 280 is views illustrating an example of a second conductor that can be arranged in the conductor layer of FIG. 278.

Figure 281:
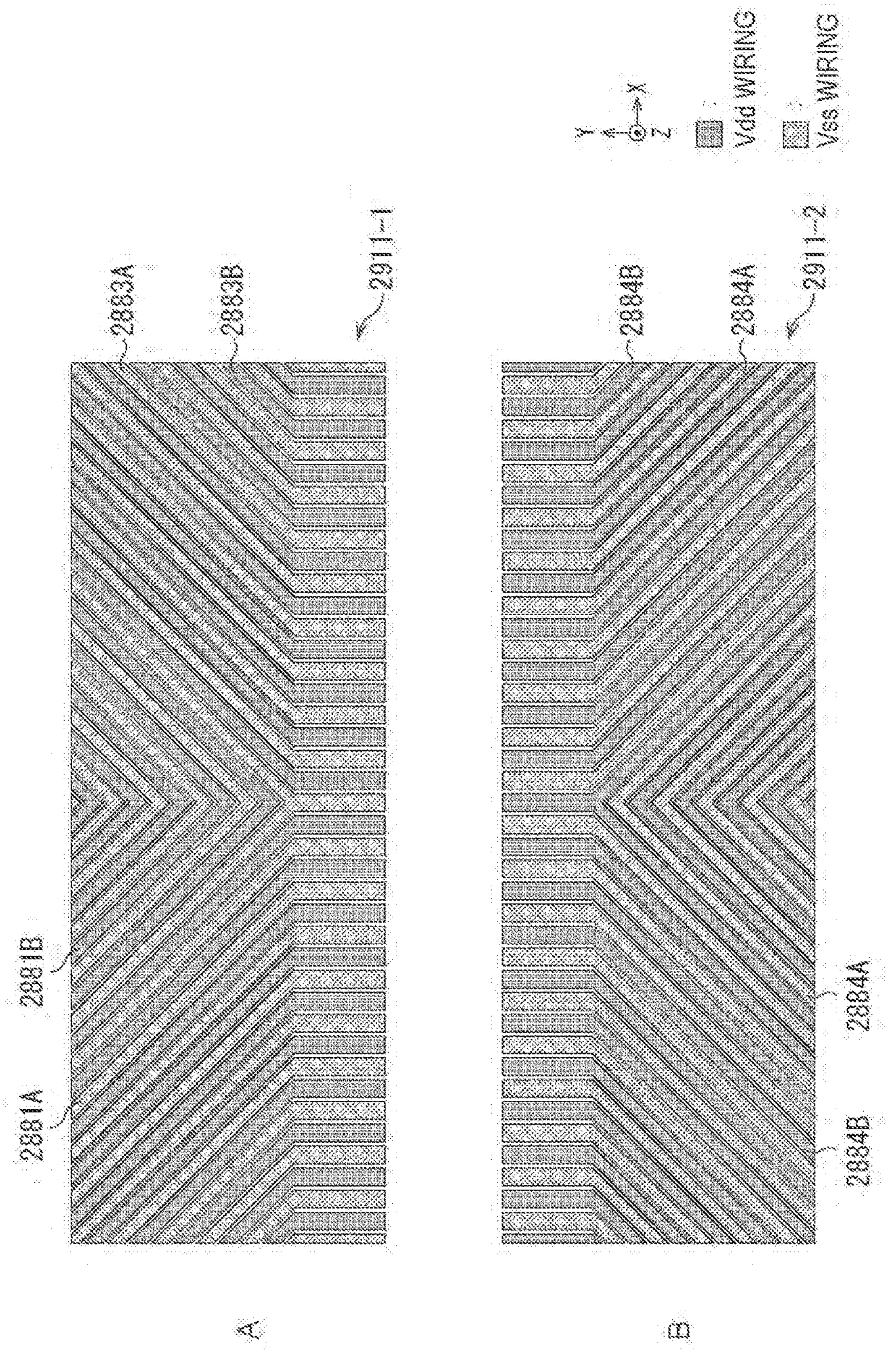

FIG. 281 is views illustrating an example of a third conductor that can be arranged in the conductor layer of FIG. 278.

Figure 282:
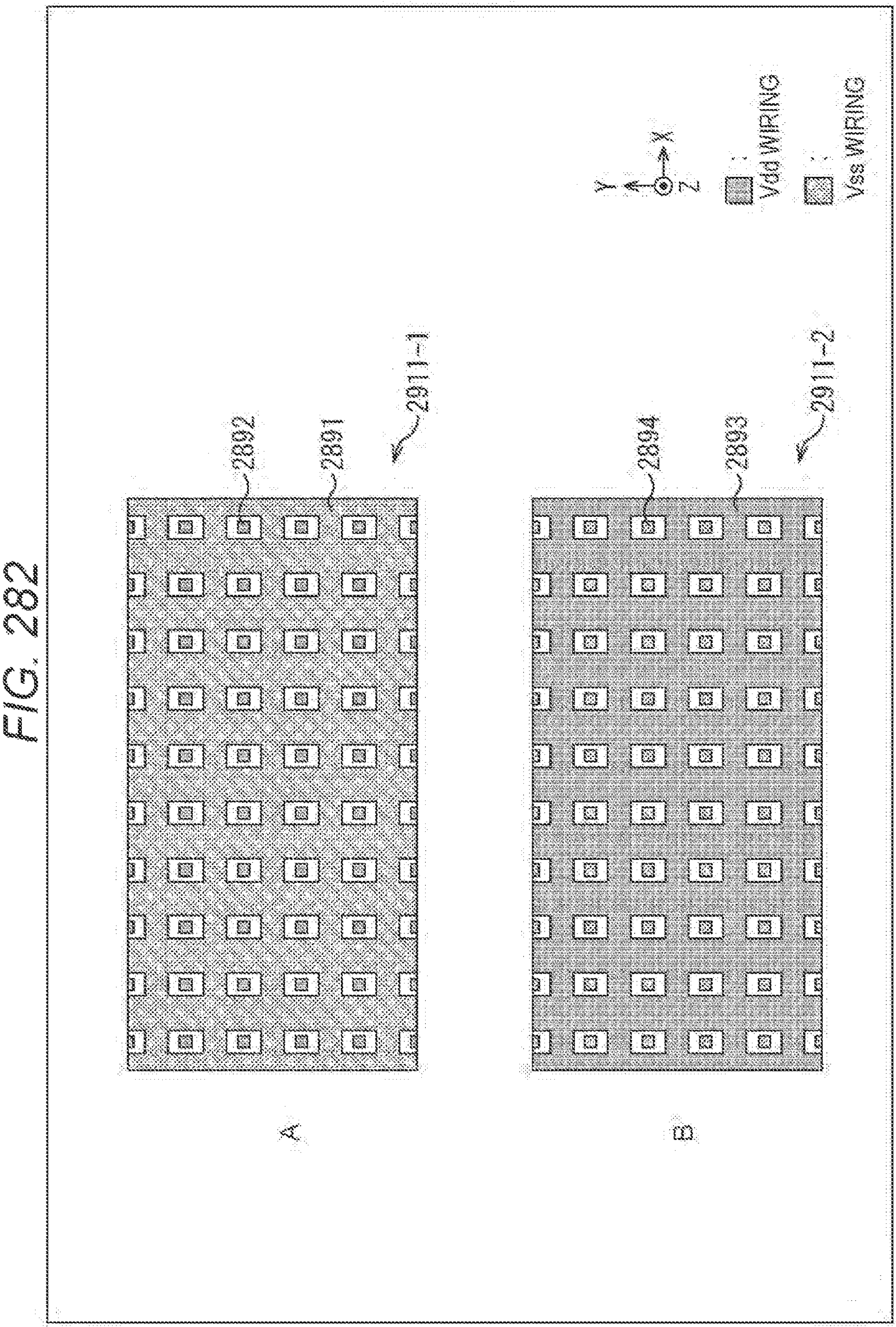

FIG. 282 is views illustrating an example of a fourth conductor that can be arranged in the conductor layer of FIG. 278.

Figure 283:
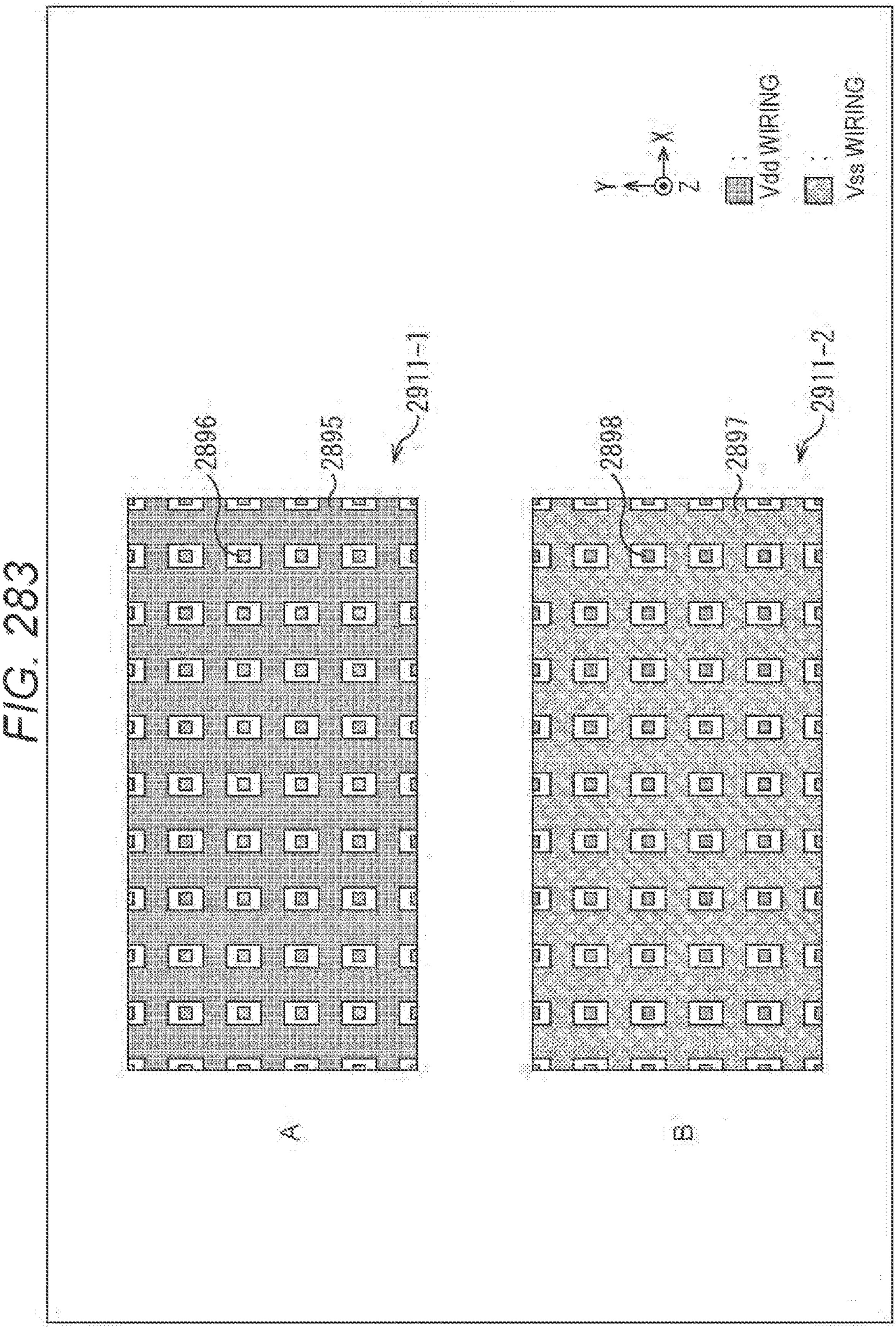

FIG. 283 is views illustrating an example of a fifth conductor that can be arranged in the conductor layer of FIG. 278.

Figure 284:
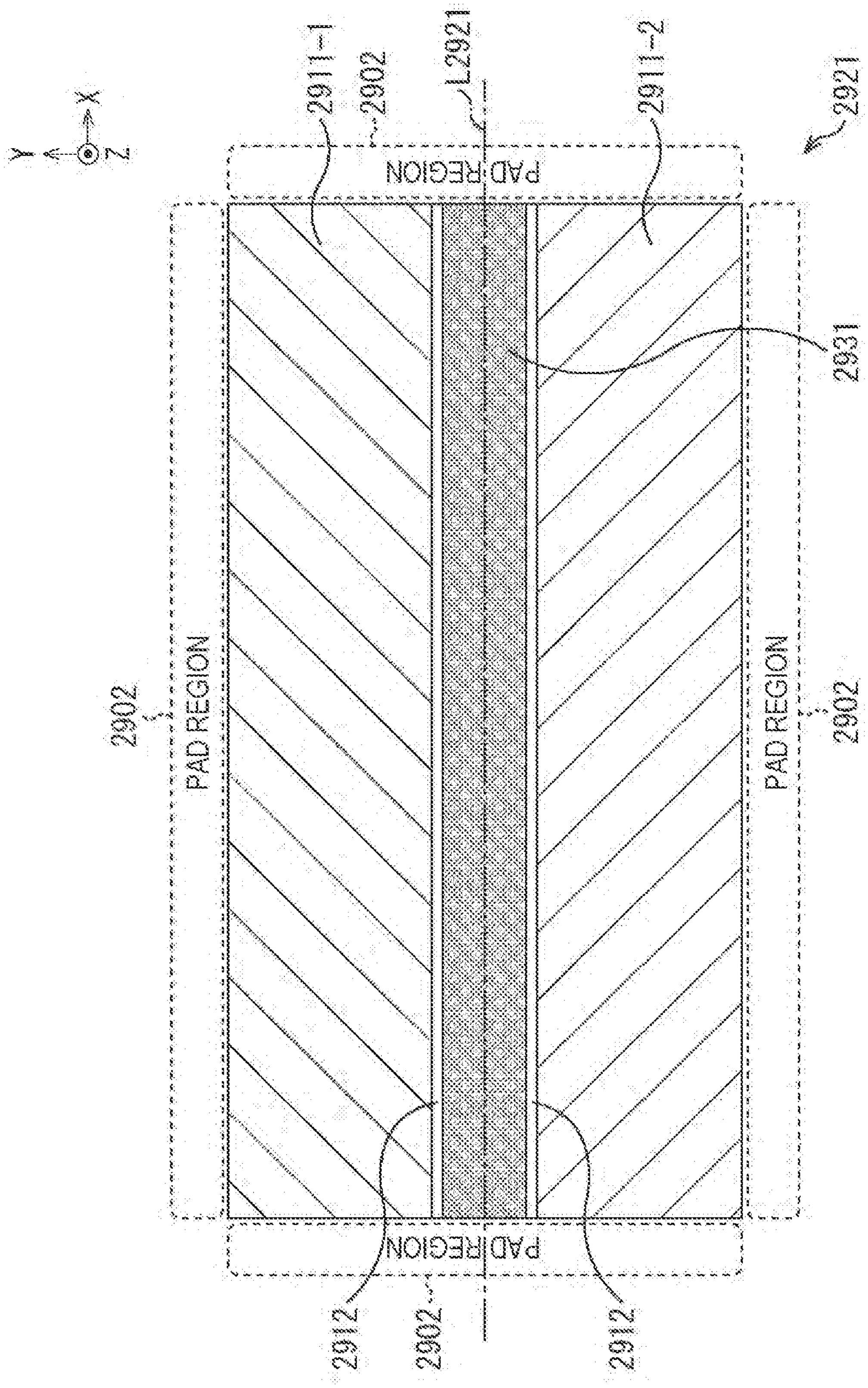

FIG. 284 is a view illustrating a third configuration example of the conductor layer having a mirror-symmetrical arrangement with a gap.

Figure 285:
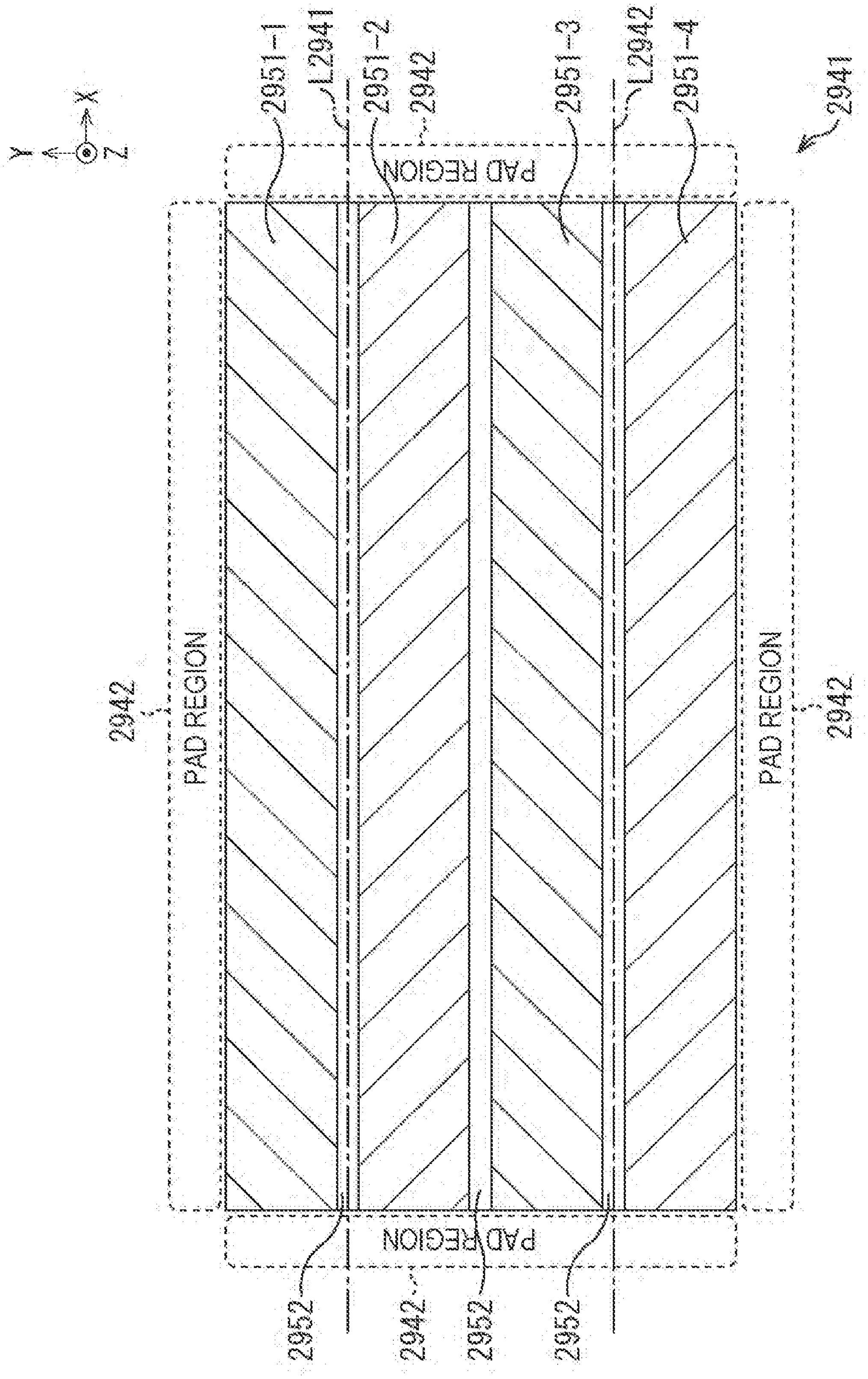

FIG. 285 is a view illustrating a fourth configuration example of the conductor layer having a mirror-symmetrical arrangement with a gap.

Figure 286:
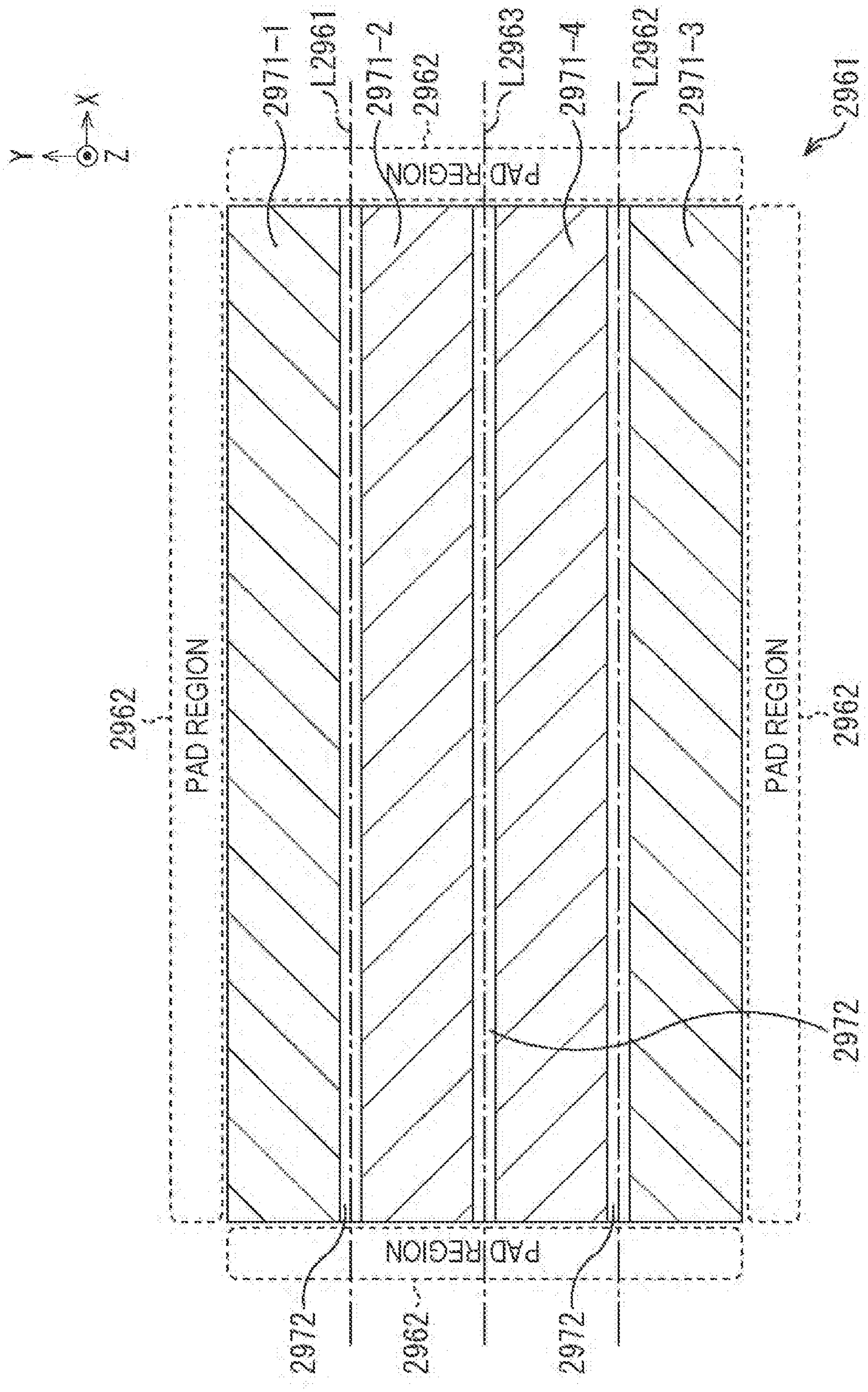

FIG. 286 is a view illustrating a fifth configuration example of the conductor layer having a mirror-symmetrical arrangement with a gap.

Figure 287:
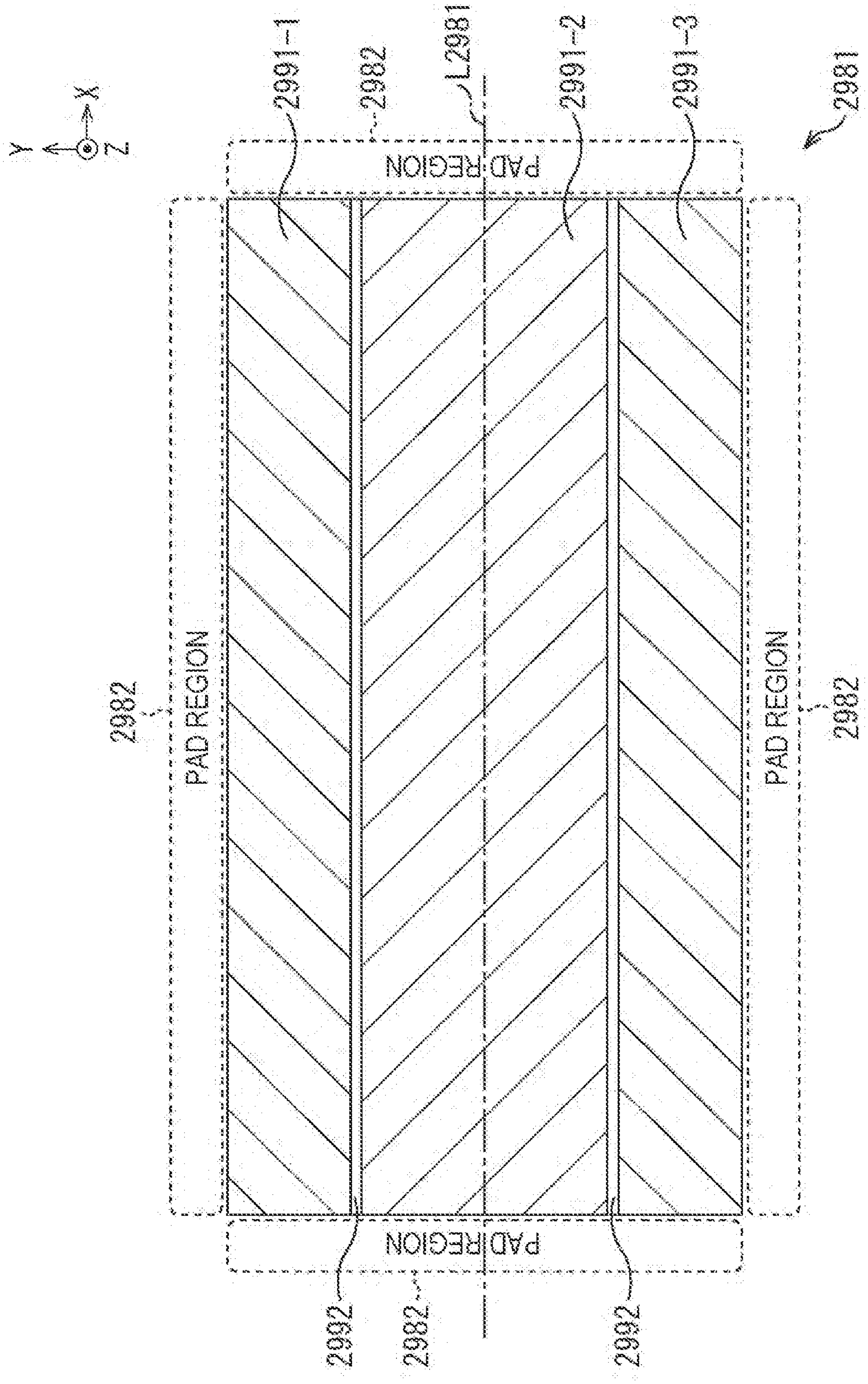

FIG. 287 is a view illustrating a sixth configuration example of the conductor layer having a mirror-symmetrical arrangement with a gap.

Figure 288:
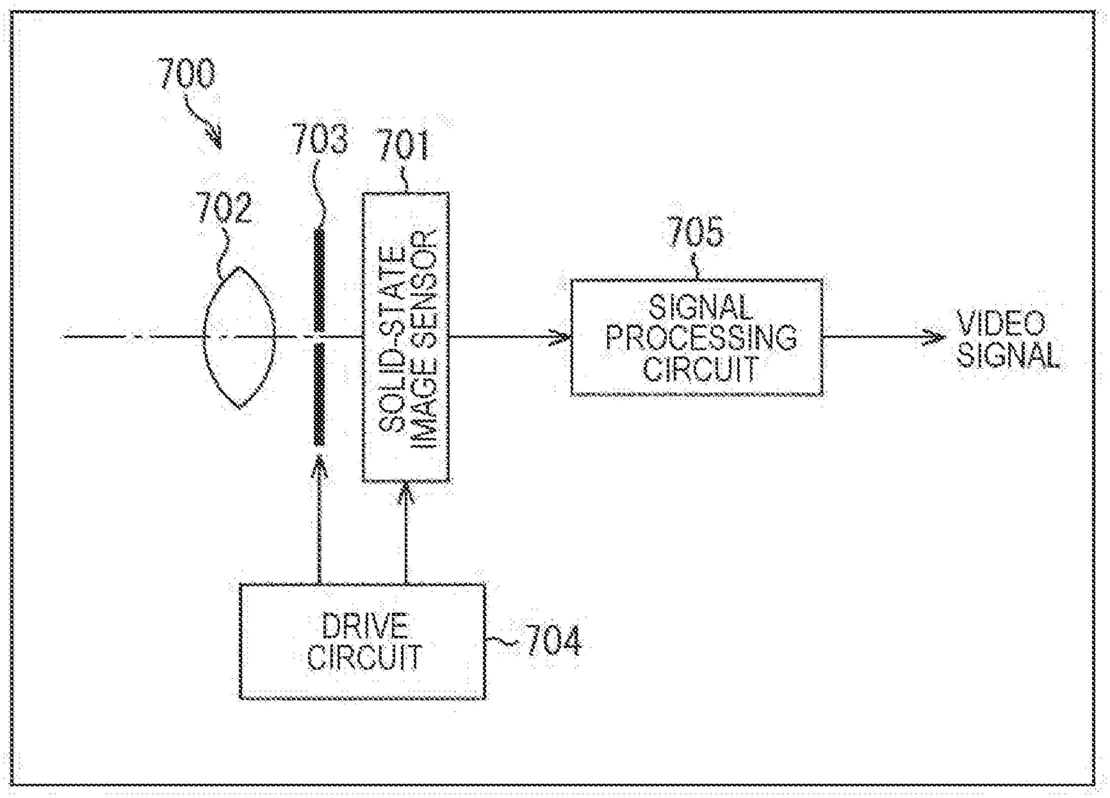

FIG. 288 is a block diagram illustrating a configuration example of an imaging device.

Figure 289:
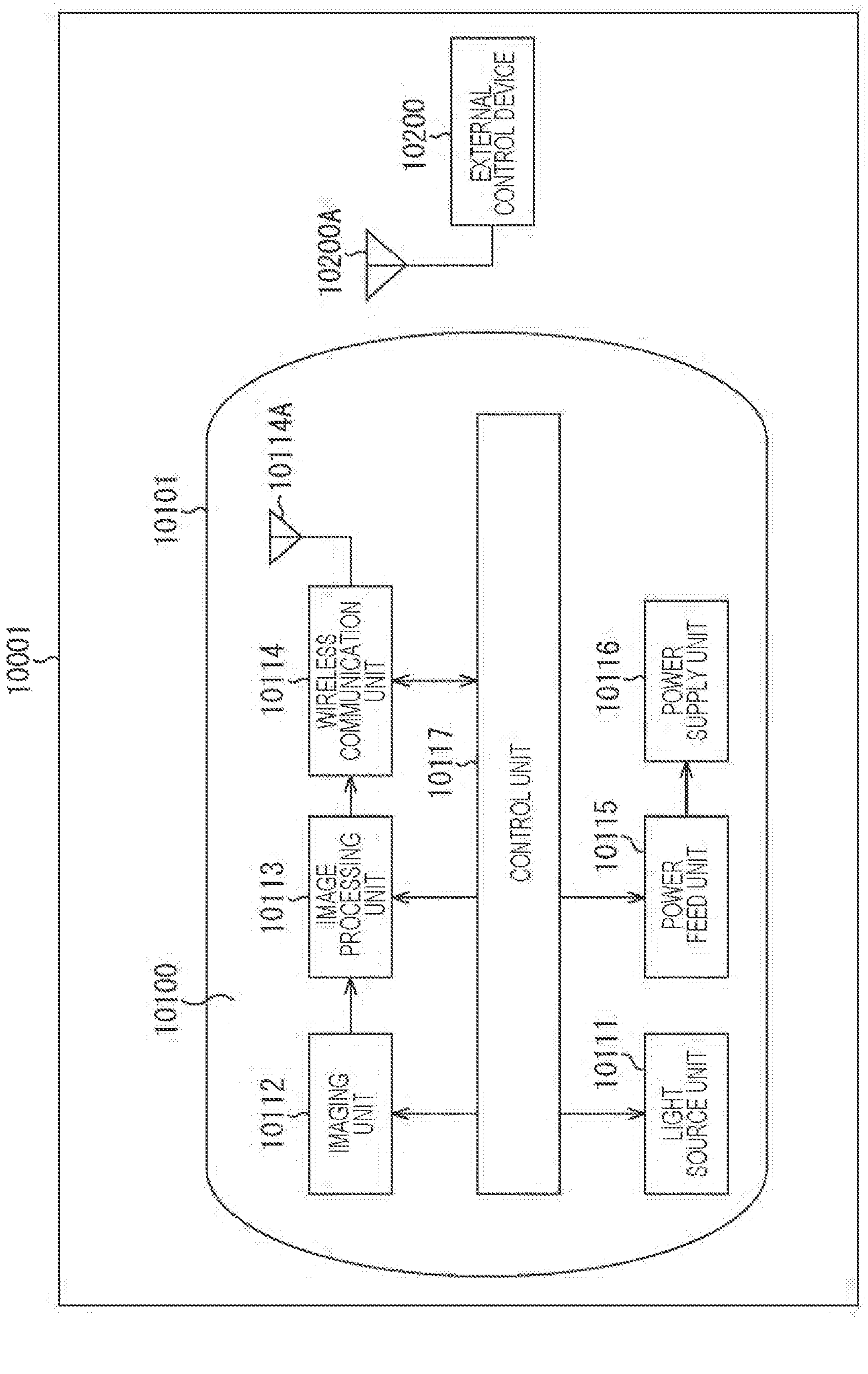

FIG. 289 is a block diagram illustrating an example of a schematic configuration of an in-vivo information acquisition system.

Figure 290:
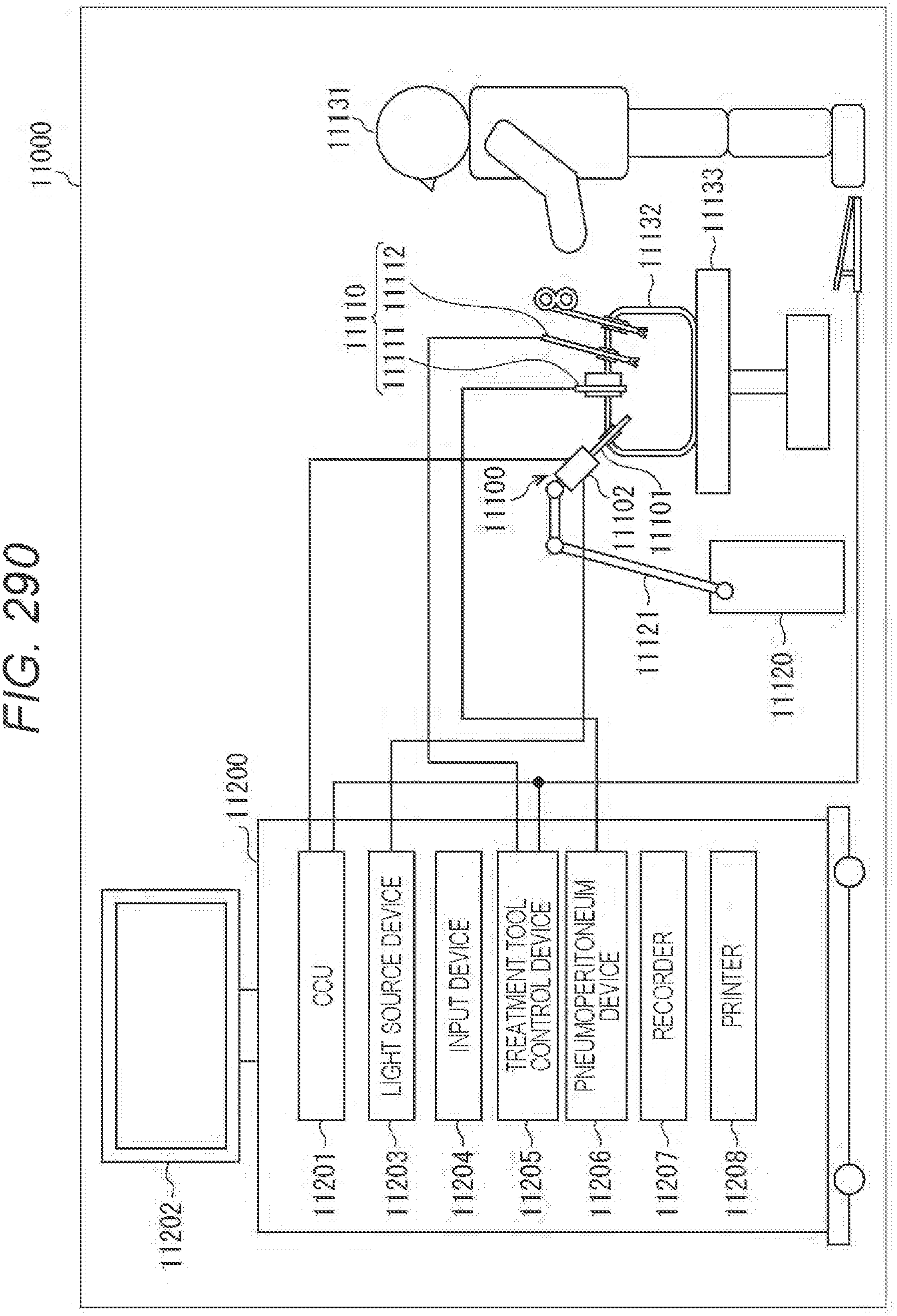

FIG. 290 is a diagram illustrating an example of a schematic configuration of an endoscopic surgical system.

Figure 291:
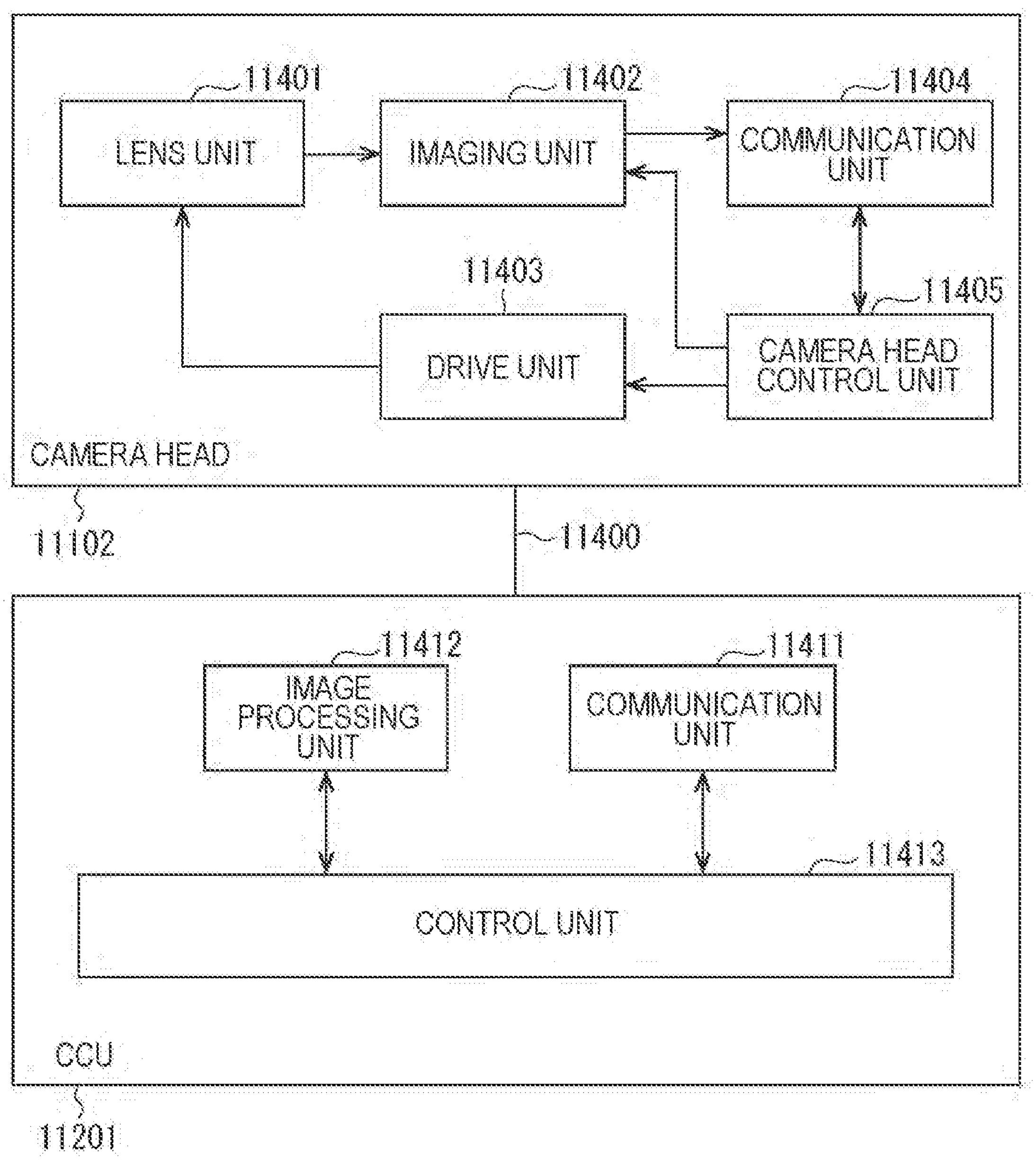

FIG. 291 is a block diagram illustrating an example of functional configurations of a camera head and a CCU.

Figure 292:
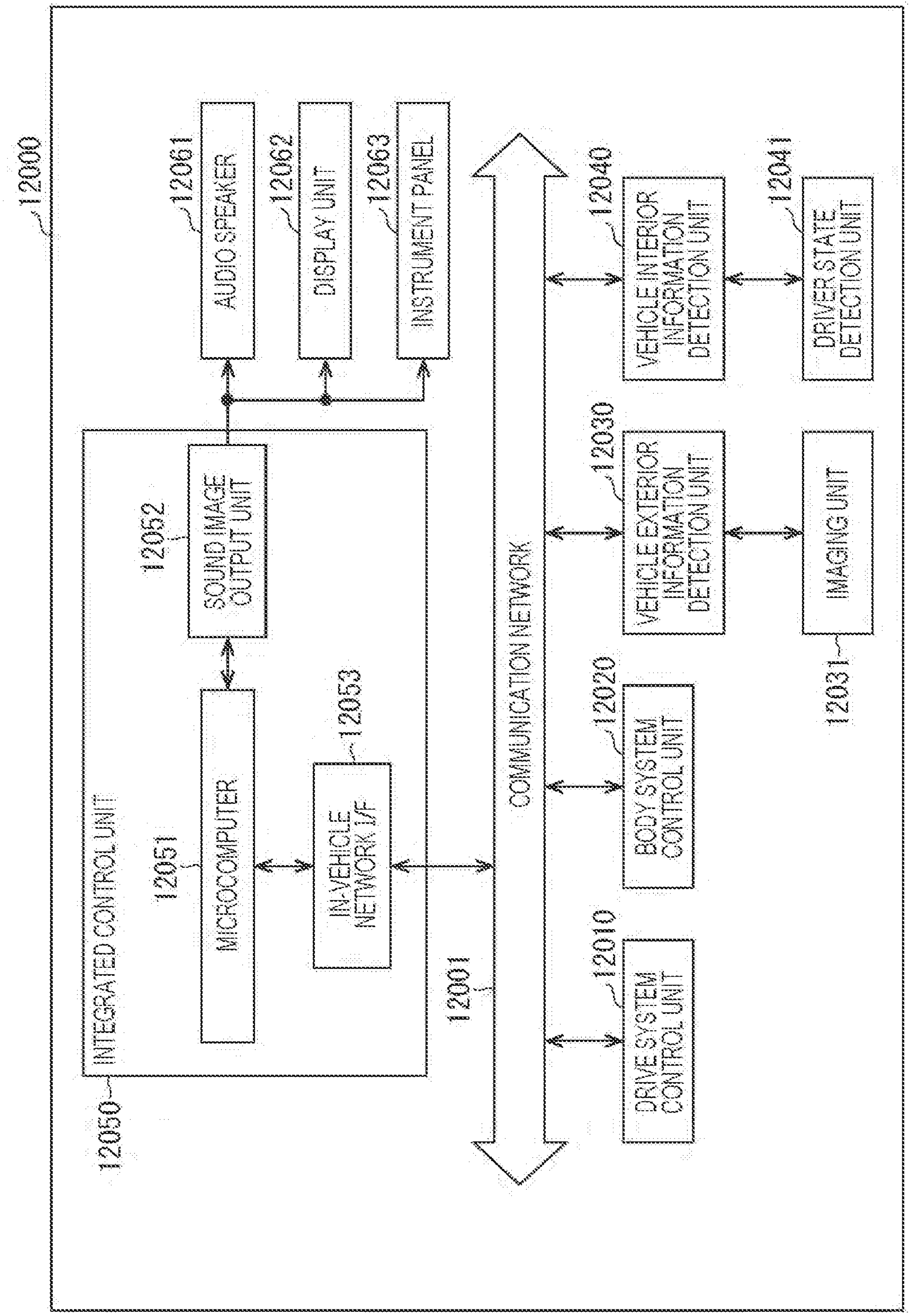

FIG. 292 is a block diagram illustrating an example of a schematic configuration of a vehicle control system.

Figure 293:
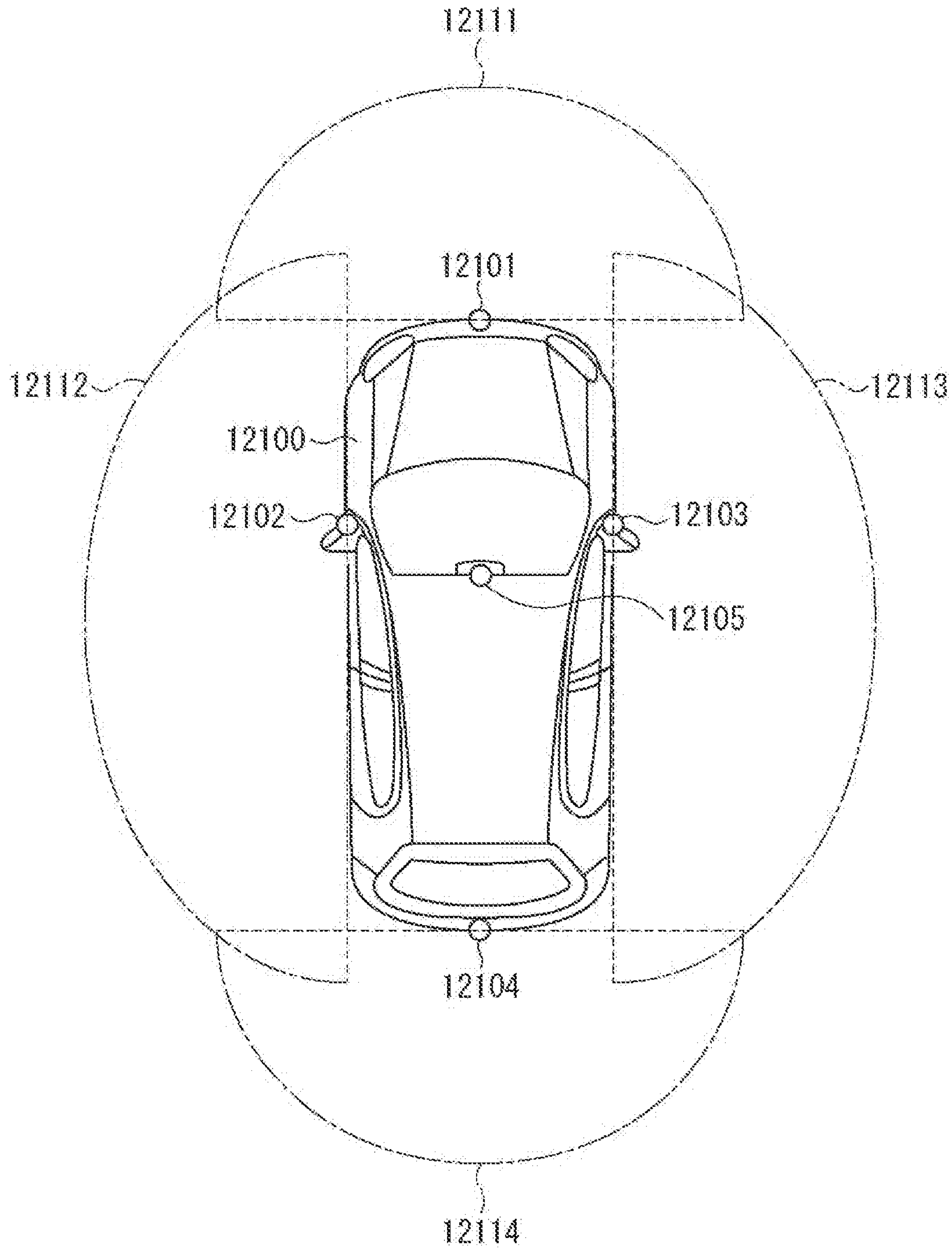

FIG. 293 is an explanatory diagram illustrating an example of installation positions of a vehicle exterior information detection unit and an imaging unit.

MODE FOR CARRYING OUT THE INVENTION

Hereinafter, best modes for implementing the present technology (hereinafter referred to as embodiments) will be described in detail with reference to the drawings. Note that the description will be given in the following order.

1. Victim Conductor Loop and Magnetic Flux
2. Configuration Example of Solid-State Imaging Device (Semiconductor Device) as Embodiment of Present Technology
3. Light-shielding Structure for Hot Carrier Light Emission
4. Configuration Example of Conductor Layers A and B
5. Arrangement Example of Electrodes in Semiconductor Substrate in which Conductor Layers A and B are Formed
6. Modification of Configuration Example of Conductor Layers A and B
7. Modification of Reticulated Conductor
8. Various Effects
9. Configuration Example with Different Drawing Portion
10. Connection Configuration Example with Pads
11. Arrangement Example of Conductive Shield
12. Configuration Example of Case Having Three Conductor Layers
13. Application
14. Shift Configuration Example of Reticulated Conductor
15. Configuration Examples of Three-power Supply
16. Other Configuration Examples of Case Having Three Conductor Layers
17. Configuration Example of Imaging Device
18. Application to In-vivo Information Acquisition System
19. Application to Endoscopic Surgical System
20. Application to Moving Bodies

1. Victim Conductor Loop and Magnetic Flux

For example, in a case where a circuit in which a Victim conductor loop is formed is present near power wiring in a solid-state imaging device (semiconductor device) such as a CMOS image sensor, when a magnetic flux passing through a loop plane of the Victim conductor loop changes, induced electromotive force generated in the Victim conductor loop changes, and noise is sometimes generated in a pixel signal. Note that it is sufficient that the Victim conductor loop includes a conductor at least in part. Furthermore, the Victim conductor loop may be entirely formed using a conductor.

Here, the Victim conductor loop (first conductor loop) refers to a conductor loop on a side affected by a change in magnetic field intensity generated nearby. Meanwhile, a conductor loop on a side that is present near the Victim conductor loop, causes a change in the magnetic field intensity by a change in a flowing current, and affects the Victim conductor loop is referred to as Aggressor conductor loop (second conductor loop).

Figure 1:
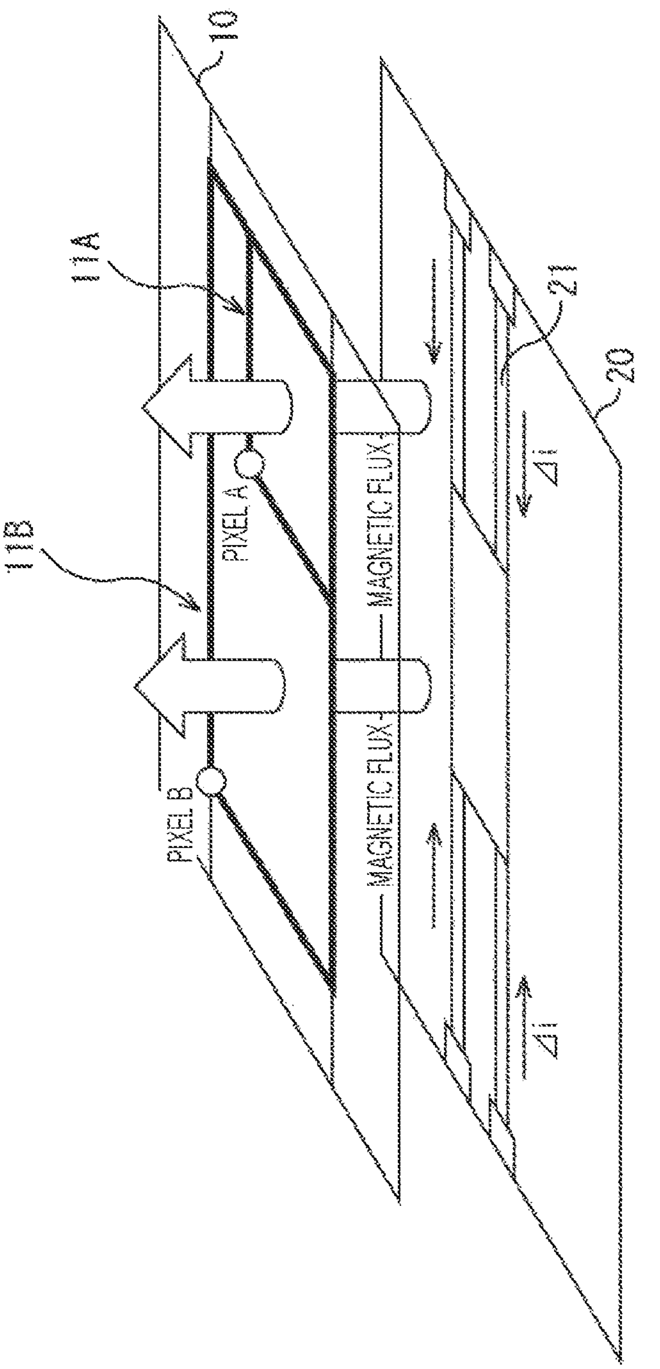
FIG. 1 is a diagram for describing a change in induced electromotive force due to a change in a conductor loop.

FIG. 1 is a diagram for describing a change in induced electromotive force due to a change in the Victim conductor loop. For example, a solid-state imaging device such as a CMOS image sensor illustrated in FIG. 1 is configured by stacking a pixel board 10 and a logic board 20 in that order from the top. In the solid-state imaging device in FIG. 1, at least a part of a Victim conductor loop 11 (11A or 11B) is formed in a pixel region of the pixel board 10, and power wiring 21 for supplying a (digital) power supply is formed in a region of the logic board 20 stacked with the pixel board 10, the region being near the Victim conductor loop 11.

Then, a magnetic flux due to the power wiring 21 passes through a loop plane of the Victim conductor loop 11 on the pixel board 10, thereby induced electromotive force is generated in the Victim conductor loop 11.

Note that induced electromotive force Vemf generated in the Victim conductor loop 11 can be calculated by the following equations (1) and (2). Note that Φ represents the magnetic flux, H represents the magnetic field intensity, μ represents magnetic permeability, and S represents the area of the Victim conductor loop 11.

[Math. 1]

$$\Phi = \int_S \mu H \cdot dS \quad (1)$$

[Math. 2]

$$V_{emf} = -\frac{d\Phi}{dt} \quad (2)$$

A loop path of the Victim conductor loop 11 formed in the pixel region of the pixel board 10 changes depending on a position of a pixel selected as a pixel to be read from which a pixel signal is read. In the case of the example in FIG. 1, the loop path of the Victim conductor loop 11A formed when a pixel A is selected is different from the loop path of the Victim conductor loop 11B formed when a pixel B at a different position from the pixel A is selected. In other words, the effective shape of the conductor loop changes depending on the position of the selected pixel.

When the loop path of the Victim conductor loop 11 changes in this way, the magnetic flux passing through the loop plane of the Victim conductor loop changes, thereby the induced electromotive force generated in the Victim conductor loop sometimes significantly changes. Furthermore, noise (inductive noise) sometimes occurs in the pixel signal read from the pixel due to the change in the induced electromotive force. Then, striped image noise is sometimes generated in a captured image due to the inductive noise. That is, the image quality of the captured image is sometimes reduced.

Therefore, the present disclosure proposes a technique of suppressing generation of the inductive noise in the induced electromotive force in the Victim conductor loop.

2. Configuration Example of Solid-State Imaging Device (Semiconductor Device) as Embodiment of Present Technology FIG. 2 is a block diagram illustrating a main configuration example of a solid-state imaging device that is an embodiment of the present technology.

Figure 2:
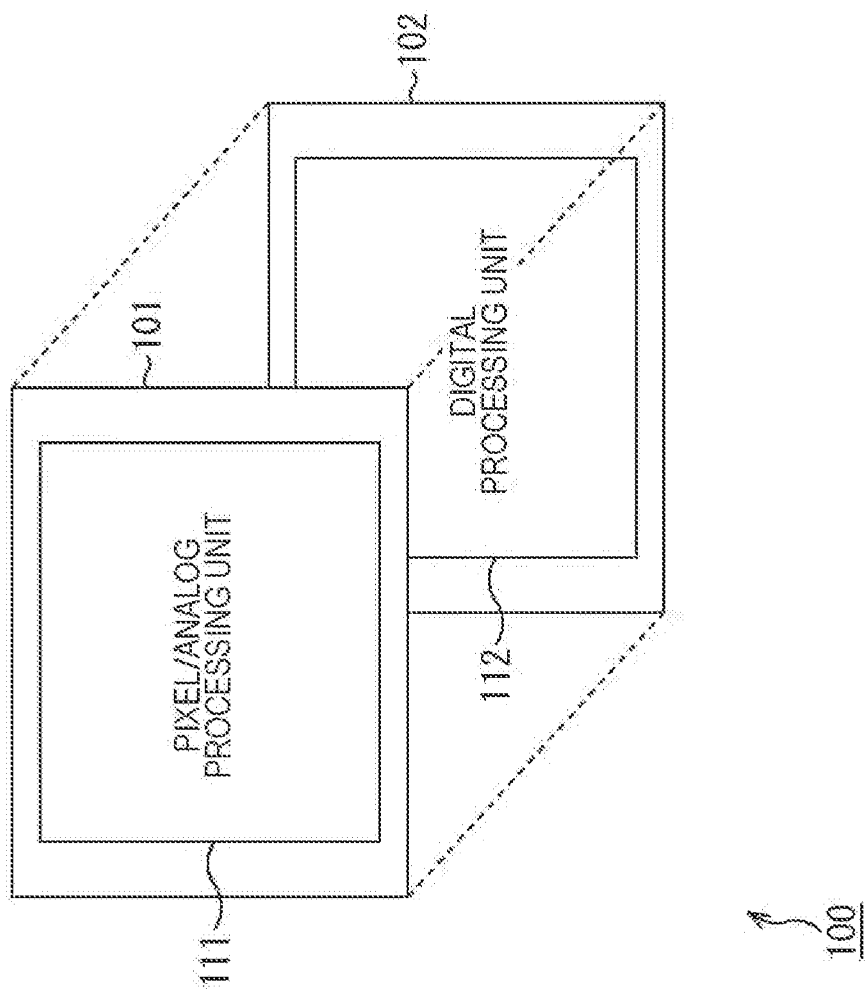
FIG. 2 is a block diagram illustrating a configuration example of a solid-state imaging device to which the present technology is applied.

A solid-state imaging device 100 illustrated in FIG. 2 is a device that photoelectrically converts light from an object and outputs the photoelectrically converted light as image data. For example, the solid-state imaging device 100 is configured as a back-illuminated CMOS image sensor using a CMOS, or the like.

As illustrated in FIG. 2, the solid-state imaging device 100 is configured by stacking a first semiconductor substrate 101 and a second semiconductor substrate 102.

A pixel/analog processing unit 111 including pixels, an analog circuit, and the like is formed on the first semiconductor substrate 101. A digital processing unit 112 including a digital circuit and the like is formed on the second semiconductor substrate 102.

The first semiconductor substrate 101 and the second semiconductor substrate 102 are superposed in an insulated state from each other. That is, the configuration of the pixel/analog processing unit 111 and the configuration of the second semiconductor substrate 102 are basically insulated from each other. Note that although not illustrated, the configuration formed in the pixel/analog processing unit 111 and the configuration formed in the digital processing unit 112 are electrically connected with each other as needed (in necessary parts) via, for example, a conductor via (VIA), a through silicon via (TSV), similar metal bonding such as Cu—Cu bonding, Au—Au bonding, or Al—Al bonding, dissimilar metal bonding such as Cu—Au bonding, Cu—Al bonding, or Au—Al bonding, a bonding wire, or the like.

Note that, in FIG. 2, the solid-state imaging device 100 including stacked two-layer substrates has been described as an example. However, the number of stacked substrates constituting the solid-state imaging device 100 is arbitrary. For example, the solid-state imaging device 100 may have a single substrate or three or more layers of substrates. Hereinafter, the case where the solid-state imaging device 100 is configured using two layers of substrates as in the example in FIG. 2 will be described.

Figure 3:
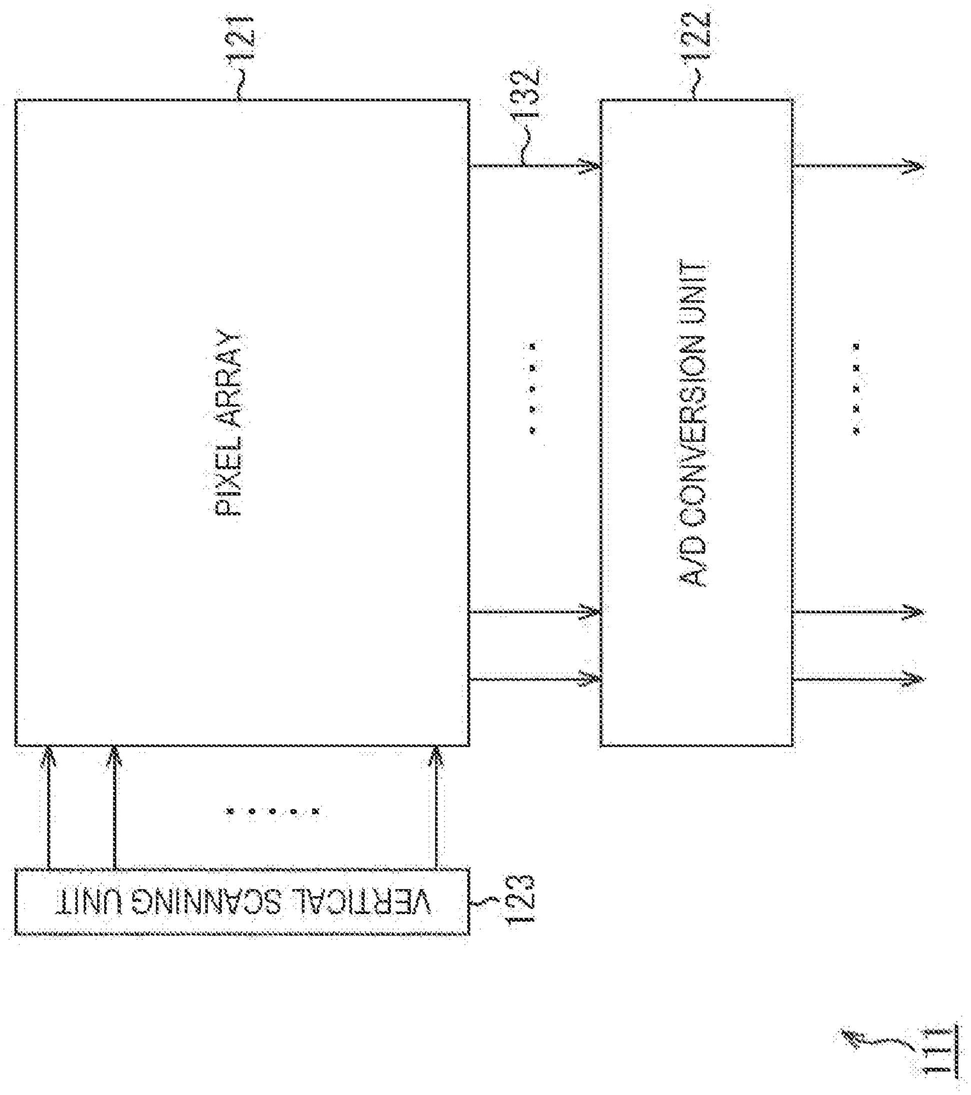
FIG. 3 is a block diagram illustrating an example of main configuration elements of a pixel/analog processing unit.

FIG. 3 is a block diagram illustrating an example of main configuration elements of a pixel/analog processing unit 111.

As illustrated in FIG. 3, a pixel array 121, an A/D conversion unit 122, a vertical scanning unit 123, and the like are formed in the pixel/analog processing unit 111.

In the pixel array 121, a plurality of pixels 131 (FIG. 4) each having a photoelectric conversion element such as a photodiode is vertically and horizontally arranged.

The A/D conversion unit 122 performs A/D conversion for an analog signal or the like read from each pixel 131 of the pixel array 121, and outputs a resultant digital pixel signal.

The vertical scanning unit 123 controls operation of a transistor (a transfer transistor 142 or the like in FIG. 5) of each pixel 131 of the pixel array 121. That is, a charge accumulated in each pixel 131 of the pixel array 121 is controlled and read by the vertical scanning unit 123, is supplied as a pixel signal to the A/D conversion unit 122 via a signal line 132 (FIG. 4) for each column of a unit pixel, and is A/D converted.

The A/D conversion unit 122 supplies an A/D conversion result (digital pixel signal) to a logic circuit (not illustrated) formed in the digital processing unit 112 for each column of the pixel 131.

Figure 4:
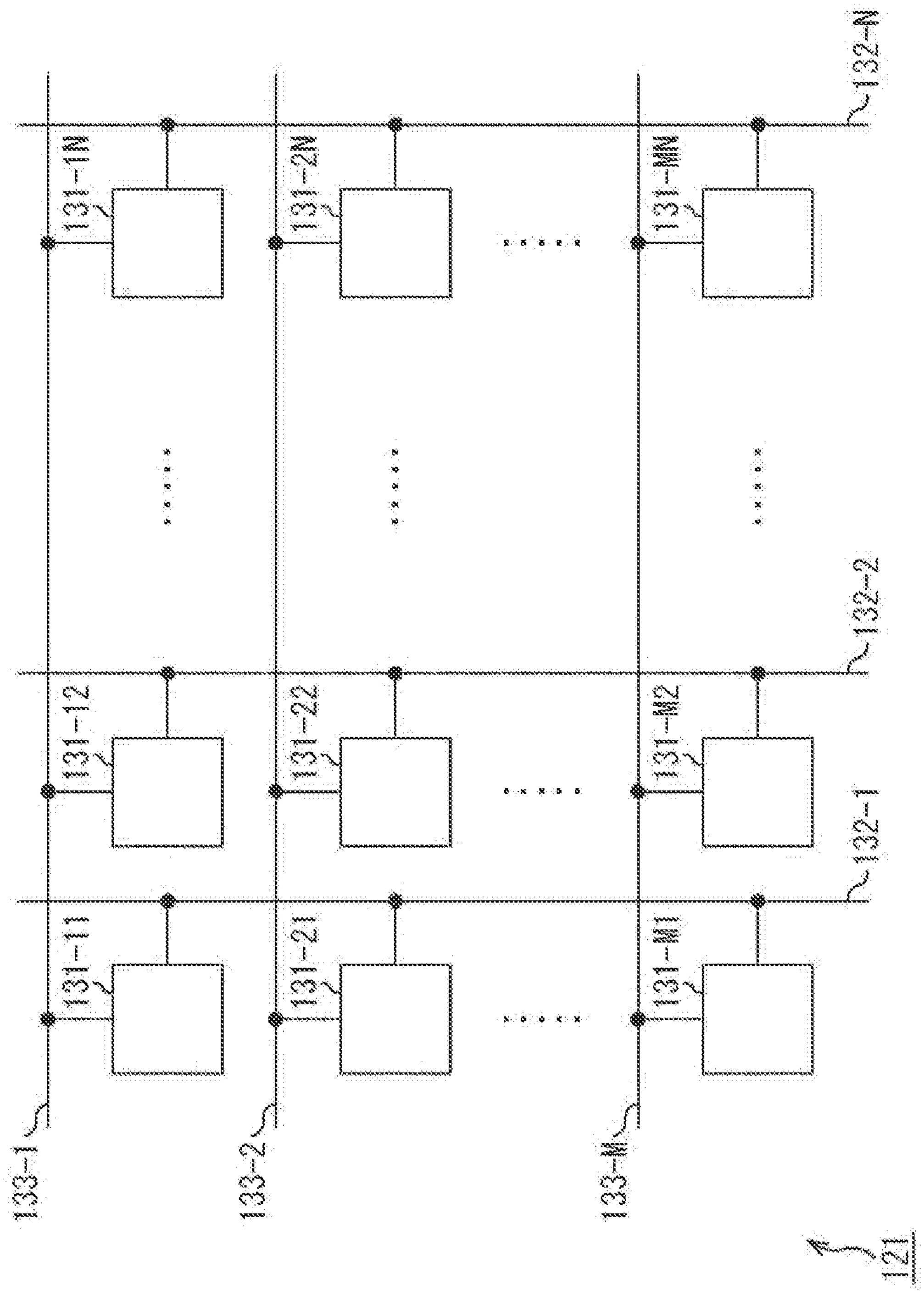
FIG. 4 is a diagram illustrating a detailed configuration example of a pixel array.

FIG. 4 is a diagram illustrating a detailed configuration example of the pixel array 121. Pixels 131-11 to 131-MN are formed in the pixel array 121 (M and N are arbitrary natural numbers). That is, in the pixel array 121, the pixels 131 of M rows and N columns are arranged in a matrix (array). Hereinafter, the pixels 131-11 to 131-MN are simply referred to as pixel(s) 131 in a case where there is no need to individually distinguish the pixels 131-11 to 131-MN.

Signal lines 132-1 to 132-N and control lines 133-1 to 133-M are formed on the pixel array 121. Hereinafter, the signal lines 132-1 to 132-N are simply referred to as signal line(s) 132 in a case where there is no need to individually distinguish the signal lines 132-1 to 132-N, and the control lines 133-1 to 133-M are simply referred to as control line(s) 133 in a case where there is no need to individually distinguish the control lines 133-1 to 133-M.

For each column, the signal line 132 corresponding to the column is connected to the pixels 131. Furthermore, for each row, the control line 133 corresponding to the row is connected to the pixels 131. A control signal from the vertical scanning unit 123 is transmitted to the pixel 131 via the control line 133.

The analog pixel signal is output from the pixel 131 to the A/D conversion unit 122 via the signal line 132.

Figure 5:
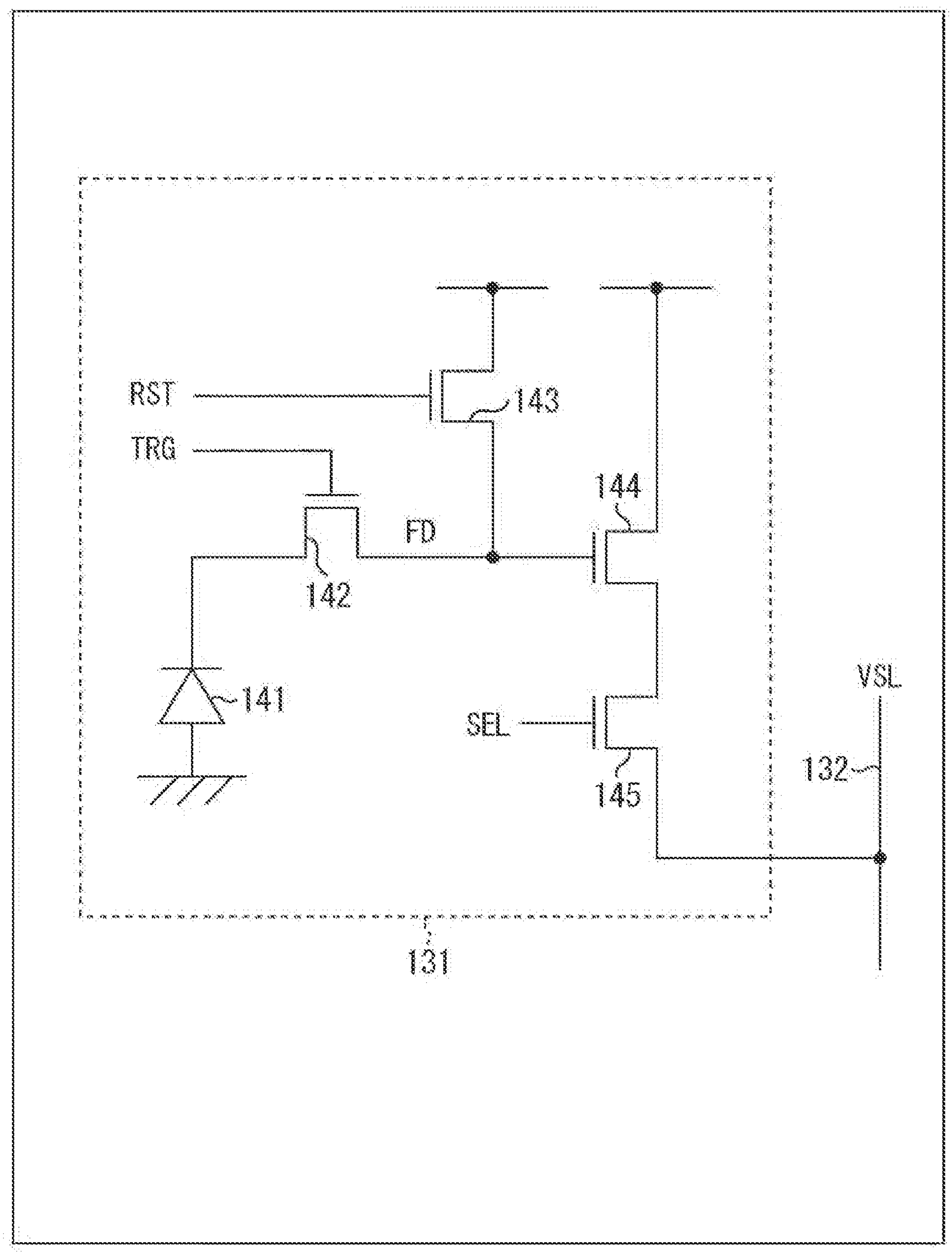
FIG. 5 is a circuit diagram illustrating a configuration example of a pixel.

Next, FIG. 5 is a circuit diagram illustrating a configuration example of the pixel 131. The pixel 131 includes a photodiode 141 as a photoelectric conversion element, a transfer transistor 142, a reset transistor 143, an amplification transistor 144, and a select transistor 145.

The photodiode 141 photoelectrically converts received light into a photocharge (photoelectrons here) having a charge amount corresponding to a light amount of the received light and accumulates the photocharge. An anode electrode of the photodiode 141 is connected to GND, and a cathode electrode is connected to floating diffusion (FD) via the transfer transistor 142. Of course, the cathode electrode of the photodiode 141 may be connected to a power supply, the anode electrode may be connected to the floating diffusion via the transfer transistor 142, and the photocharge may be read as an optical hole.

The transfer transistor 142 controls readout of the photocharge from the photodiode 141. A drain electrode of the transfer transistor 142 is connected to the floating diffusion, and a source electrode of the transfer transistor 142 is connected to the cathode electrode of the photodiode 141. Furthermore, a transfer control line for transmitting a transfer control signal TRG supplied from the vertical scanning unit 123 (FIG. 3) is connected to a gate electrode of the transfer transistor 142. When the transfer control signal TRG (that is, a gate potential of the transfer transistor 142) is in an OFF state, the photocharge is not transferred from the photodiode 141 (the photocharge is accumulated in the photodiode 141). When the transfer control signal TRG (that is, the gate potential of the transfer transistor 142) is in an ON state, the photocharge accumulated in the photodiode 141 is transferred to the floating diffusion.

The reset transistor 143 resets the potential of the floating diffusion. A drain electrode of the reset transistor 143 is connected to a power supply potential, and a source electrode of the reset transistor 143 is connected to the floating diffusion. Furthermore, a reset control line for transmitting a reset control signal RST supplied from the vertical scanning unit 123 is connected to a gate electrode of the reset transistor 143. When the reset control signal RST (that is, a gate potential of the reset transistor 143) is in the OFF state, the floating diffusion is disconnected from the power supply potential. When the reset control signal RST (that is, the gate potential of the reset transistor 143) is in the ON state, the charge of the floating diffusion is discharged to the power supply potential, and the floating diffusion is reset.

The amplification transistor 144 outputs an electrical signal (analog signal) corresponding to a voltage of the floating diffusion (causes a current to flow). A gate electrode of the amplification transistor 144 is connected to the floating diffusion, a drain electrode of the amplification transistor 144 is connected to a (source-follower) power supply voltage, and a source electrode of the amplification transistor 144 is connected to a drain electrode of the select transistor 145. For example, the amplification transistor 144 outputs a reset signal (reset level) as an electrical signal according to the voltage of the floating diffusion reset by the reset transistor 143 to the select transistor 145 as a pixel signal. Furthermore, the amplification transistor 144 outputs an optical storage signal (signal level) as an electrical signal according to the voltage of the floating diffusion to which the photocharge has been transferred by the transfer transistor 142 to the select transistor 145 as a pixel signal.

The select transistor 145 controls output of the electrical signal supplied from the amplification transistor 144 to the signal line (VSL) 132 (that is, the A/D conversion unit 122). The drain electrode of the select transistor 145 is connected to the source electrode of the amplification transistor 144 and a source electrode of the select transistor 145 is connected to the signal line 132 Furthermore, a select control line for transmitting a select control signal SEL supplied from the vertical scanning unit 123 is connected to the gate electrode of the select transistor 145. When the select control signal SEL (that is, a gate potential of the select transistor 145) is in the OFF state, the amplification transistor 144 and the signal line 132 are electrically disconnected. Therefore, in this state, the reset signal or the optical storage signal as the pixel signal is not output from the pixel 131. When the select control signal SEL (that is, the gate potential of the select transistor 145) is in the ON state, the pixel 131 becomes selected. That is, the amplification transistor 144 and the signal line 132 are electrically connected, and the reset signal or the optical storage signal as the pixel signal output from the amplification transistor 144 is supplied to the A/D conversion unit 122 via the signal line 132. That is, the reset signal or the optical storage signal as the pixel signal is read from the pixel 131.

Note that the configuration of the pixel 131 is arbitrary and is not limited to the example in FIG. 5.

In the pixel/analog processing unit 111 configured as described above, when the pixel 131 is selected as the target for reading the analog signal as the pixel signal, the control line 133 for controlling the above-described various transistors, the signal line 132, the power wiring (analog power wiring and digital power wiring), and the like form various Victim conductor loops (conductors having a loop shape (annular shape). When the magnetic flux generated from nearby wiring or the like passes through the loop plane of the Victim conductor loop, induced electromotive force is generated.

It is sufficient that the Victim conductor loop includes at least one of the control line 133 or the signal line 132. Furthermore, the Victim conductor loop including a part of the control lines 133 and the Victim conductor loop including a part of the signal lines 132 may be present as Victim conductor loops independent of each other. Moreover, a part or the whole of the Victim conductor loop may be included in the second semiconductor substrate 102. Moreover, the loop path of the Victim conductor loop may be variable or fixed.

Wiring directions of the control lines 133 and the signal lines 132 forming the Victim conductor loop are desirably substantially orthogonal to each other, but may be substantially parallel to each other.

Note that a conductor loop existing near another conductor loop can be the Victim conductor loop. For example, a conductor loop that is not affected even when a change in magnetic field intensity occurs due to a change in a current flowing through a nearby aggressor loop can be the Victim conductor loop.

In the Victim conductor loop, when a high-frequency signal flows through the wiring (Aggressor conductor loop) existing nearby and the magnetic field intensity around the Aggressor conductor loop changes, the induced electromotive force is generated in the Victim conductor loop due to the influence of the change, and noise is sometimes generated in the Victim conductor loop. In particular, in a case where wirings in which the currents flow in the same direction are concentrated near the Victim conductor loop, the change in magnetic field intensity becomes large, and the induced electromotive force (that is, noise) generated in the Victim conductor loop also becomes large.

Therefore, in the present disclosure, the direction of the magnetic flux generated from the loop plane of the Aggressor conductor loop is adjusted so that the magnetic field does not pass through the Aggressor conductor loop.

3. Light-Shielding Structure for Hot Carrier Light Emission

Figure 6:
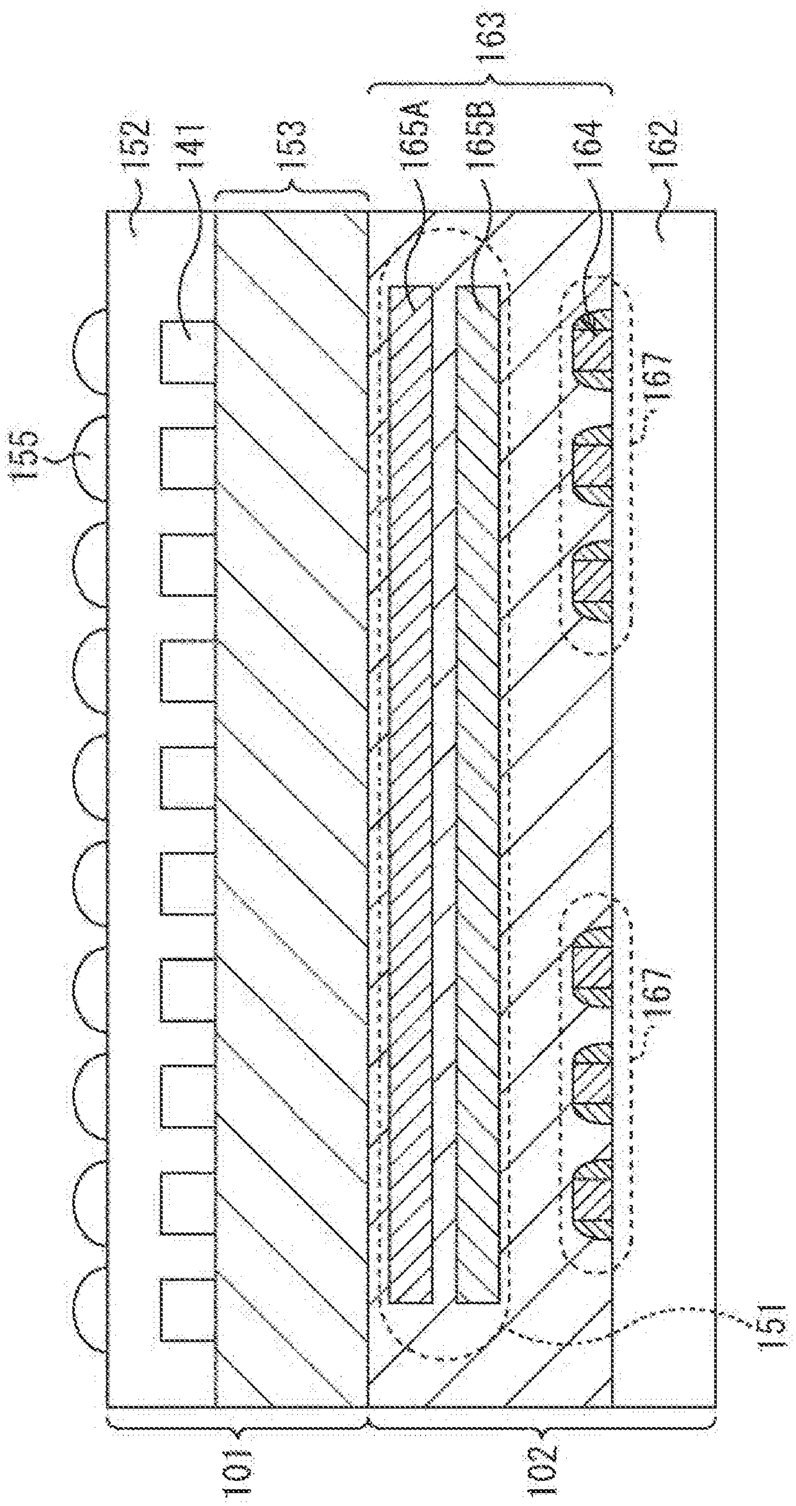
FIG. 6 is a block diagram illustrating an example of a cross-sectional structure of a solid-state imaging device.

FIG. 6 is a diagram illustrating an example of a cross-sectional structure of the solid-state imaging device 100.

As described above, the solid-state imaging device 100 is configured by stacking the first semiconductor substrate 101 and the second semiconductor substrate 102.

In the first semiconductor substrate 101, for example, a pixel array in which a plurality of pixel units is two-dimensionally arrayed, is formed, each pixel units including the photodiode 141 serving as a photoelectric conversion unit, and the plurality of pixel transistors (the transfer transistor 142 to the select transistor 145 in FIG. 5).

The photodiode 141 has, for example, an n-type semiconductor region and a p-type semiconductor region on a front surface side (lower side in the figure) of the substrate in a well region formed in a semiconductor substrate 152. The plurality of pixel transistors (the transfer transistor 142 to the select transistor 145 in FIG. 5) is formed on the semiconductor substrate 152.

A multilayer wiring layer 153 in which wiring of a plurality of layers is arranged via an interlayer insulating film is formed on the front surface side of the semiconductor substrate 152. The wiring is formed using, for example, copper wiring. Wirings in different wiring layers of the pixel transistors, the vertical scanning unit 123, and the like are connected to one another at required points by a connecting conductor penetrating the wiring layers. For example, an anti-reflection film, a light-shielding film that blocks a predetermined region, and an optical member 155 such as a color filter and a microlens provided at positions corresponding to each photodiode 141 are formed on a back surface (upper side in the figure) of the semiconductor substrate 152.

Meanwhile, a logic circuit as the digital processing unit 112 (FIG. 2) is formed in the second semiconductor substrate 102. The logic circuit includes, for example, a plurality of MOS transistors 164 formed in a p-type semiconductor well region of a semiconductor substrate 162.

Moreover, a multilayer wiring layer 163 including a plurality of wiring layers in each of which wiring is arranged via an interlayer insulating film is formed on the semiconductor substrate 162. FIG. 6 illustrates two wiring layers (wiring layers 165A and 165B) of the plurality of wiring layers forming the multilayer wiring layer 163.

In the solid-state imaging device 100, a light-shielding structure 151 is formed by the wiring layer 165A and the wiring layer 165B.

Here, in the second semiconductor substrate 102, a region in which active elements such as the MOS transistors 164 are formed is referred to as an active element group 167. In the second semiconductor substrate 102, a circuit for implementing one function by combining active elements such as a plurality of nMOS transistors and pMOS transistors is configured, for example. Then, the region where the active element group 167 is formed is defined as a circuit block (corresponding to circuit blocks 202 to 204 in FIG. 7). Note that, as the active element formed on the second semiconductor substrate 102, a diode or the like may be present in addition to the MOS transistors 164.

Then, in the multilayer wiring layer 163 of the second semiconductor substrate 102, the light-shielding structure 151 including the wiring layer 165A and the wiring layer 165B is present between the active element group 167 and the photodiode 141, so that the light-shielding structure 151 suppresses leakage of hot carrier light emission generated from the active element group 167 into the photodiode 141 (details will be described below).

Hereinafter, the wiring layer 165A closer to the first semiconductor substrate 101 on which the photodiode 141 and the like are formed, between the wiring layer 165A and the wiring layer 165B forming the light-shielding structure 151, will be referred to as a conductor layer A (first conductor layer). Furthermore, the wiring layer 165B closer to the active element group 167 will be referred to as a conductor layer B (second conductor layer).

However, the wiring layer 165A closer to the first semiconductor substrate 101 on which the photodiode 141 and the like are formed may be referred to as the conductor layer B, and the wiring layer 165B closer to the active element group 167 may be referred to as the conductor layer A. Moreover, any one of an insulating layer, a semiconductor layer, another conductor layer, or the like may be provided between the conductor layers A and B. Furthermore, any one of an insulating layer, a semiconductor layer, another conductor layer, or the like may be provided between layers other than the conductor layers A and B.

The conductor layer A and the conductor layer B are desirably, but are not limited to, the conductor layers in which the current most easily flows among circuit boards, semiconductor substrates, and electronic devices.

One of the conductor layer A or the conductor layer B is desirably, but is not limited to, the conductor layer in which the current most easily flows among circuit boards, semiconductor substrates, and electronic devices, and the other is desirably, but are not limited to, the conductor layer in which the current second-most easily flows among circuit boards, semiconductor substrates, and electronic devices.

One of the conductor layer A or the conductor layer B is desirably, but is not limited to, not a conductor layer in which the current most uneasily flows among circuit boards, semiconductor substrates, and electronic devices. Both of the conductor layer A and the conductor layer B are desirably, but are not limited to, not the conductor layers in which the current most uneasily flows among circuit boards, semiconductor substrates, and electronic devices.

For example, one of the conductor layer A or the conductor layer B may be the conductor layer in which the current most easily flows in the first semiconductor substrate 101 and the other may be the conductor layer in which the current second-most easily flows in the first semiconductor substrate 101.

For example, one of the conductor layer A or the conductor layer B may be the conductor layer in which the current most easily flows in the second semiconductor substrate 102 and the other may be the conductor layer in which the current second-most easily flows in the second semiconductor substrate 102.

For example, one of the conductor layer A or the conductor layer B may be the conductor layer in which the current most easily flows in the first semiconductor substrate 101 and the other may be the conductor layer in which the current most easily flows in the second semiconductor substrate 102.

For example, one of the conductor layer A or the conductor layer B may be the conductor layer in which the current most easily flows in the first semiconductor substrate 101 and the other may be the conductor layer in which the current second-most easily flows in the second semiconductor substrate 102.

For example, one of the conductor layer A or the conductor layer B may be the conductor layer in which the current second-most easily flows in the first semiconductor substrate 101 and the other may be the conductor layer in which the current most easily flows in the second semiconductor substrate 102.

For example, one of the conductor layer A or the conductor layer B may be the conductor layer in which the current second-most easily flows in the first semiconductor substrate 101 and the other may be the conductor layer in which the current second-most easily flows in the second semiconductor substrate 102.

For example, one of the conductor layer A or the conductor layer B may not be the conductor layer in which the current most uneasily flows in the first semiconductor substrate 101 or the second semiconductor substrate 102.

For example, both of the conductor layer A and the conductor layer B may not be the conductor layers in which the current most uneasily flows in the first semiconductor substrate 101 or the second semiconductor substrate 102.

Note that the above-described first can be replaced as third, fourth, or Nth (N is a positive number), and the above-described second can also be replaced as third, fourth, or Nth (N is a positive number).

Note that the above-described conductor layer in which the current easily flows among circuit boards, semiconductor substrates, and electronic devices may be considered to be any of a conductor layer in which the current easily flows among the circuit boards, a conductor layer in which the current easily flows among the semiconductor substrates, or a conductor layer in which the current easily flows among the electronic devices. Note that the above-described conductor layer in which the current less easily flows among circuit boards, semiconductor substrates, and electronic devices may be considered to be any of a conductor layer in which the current less easily flows among the circuit boards, a conductor layer in which the current less easily flows among the semiconductor substrates, or a conductor layer in which the current less easily flows among the electronic devices. Furthermore, even if the conductor layer in which the current easily flows is a conductor layer having a low sheet resistance, and the conductor layer in which the current less easily flows is a conductor layer having a high sheet resistance, thereby can be replaced with each other.

Note that, as the conductor material used for the conductor layers A and B, a metal such as copper, aluminum, tungsten, chromium, nickel, tantalum, molybdenum, titanium, gold, silver, or iron, or a mixture, a compound, or an alloy containing at least one of the aforementioned metals, is mainly used. Furthermore, a semiconductor such as silicon, germanium, a compound semiconductor, or an organic semiconductor may be included. Moreover, an insulator such as cotton, paper, polyethylene, polyvinyl chloride, natural rubber, polyester, epoxy resin, melamine resin, phenol resin, polyurethane, synthetic resin, mica, asbestos, glass fiber, or porcelain may be included.

The conductor layers A and B forming the light-shielding structure 151 can form an Aggressor conductor loop by a current flowing through the conductor layers A and B.

Next, a region shielded by the light-shielding structure 151 (light-shielding target region) will be described.

Figure 7:
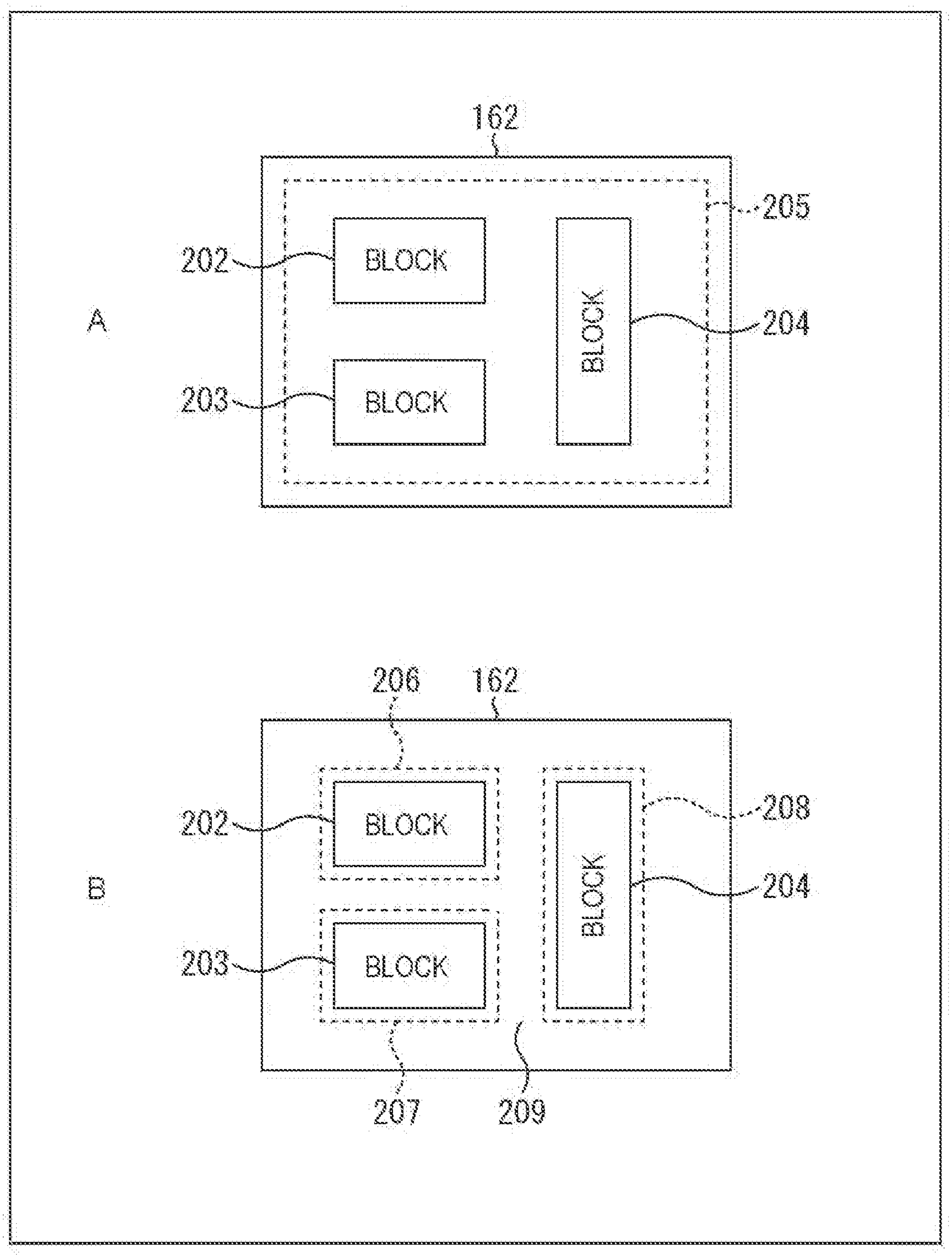
FIG. 7 is schematic configuration diagrams illustrating plan arrangement examples of circuit blocks including regions in which active element groups are formed.

FIG. 7 is schematic configuration diagrams illustrating plan arrangement examples of circuit blocks including the regions in which the active element groups 167 are formed in the semiconductor substrate 162.

A in FIG. 7 illustrates an example of a case in which the plurality of circuit blocks 202 to 204 is collectively the light-shielding target region by the light-shielding structure 151, and a region 205 including all the circuit blocks 202, 203, and 204 serves as the light-shielding target region.

B in FIG. 7 illustrates an example of a case in which the plurality of circuit blocks 202 to 204 is individually the light-shielding target region by the light-shielding structure 151. Regions 206, 207, and 208 respectively including the circuit blocks 202, 203, and 204 individually serve as the light-shielding target regions, and a region 209 other than the regions 206 to 208 serves as a non-light-shielding target region.

In the case of the example illustrated in B in FIG. 7, restriction on the degree of freedom in layout of the conductor layers A and B forming the light-shielding structure 151 can be avoided. However, since the layout of the conductor layers A and B becomes complicated, a great deal of labor is required to design the layout of the conductor layers A and B.

To easily design the layout of the conductor layers A and B forming the light-shielding structure 151, it is desirable to adopt the example illustrated in A in FIG. 7 and collectively set the plurality of circuit blocks as the light-shielding target region.

Therefore, the present disclosure proposes structures of the conductor layers A and B for which the layout can be easily designed while avoiding the restriction on the degree of freedom in layout of the conductor layers A and B.

Note that the light-shielding target region in the present embodiment is provided with a buffer region to serve as a light-shielding target region around the circuit block, in addition to the circuit block representing the region of the active element group 167 that is a light-emission source of the hot carrier light emission. By providing a buffer region around the circuit block, the hot carrier light emission obliquely emitted from the circuit block can be prevented from leaking into the photodiode 141.

Figure 8:
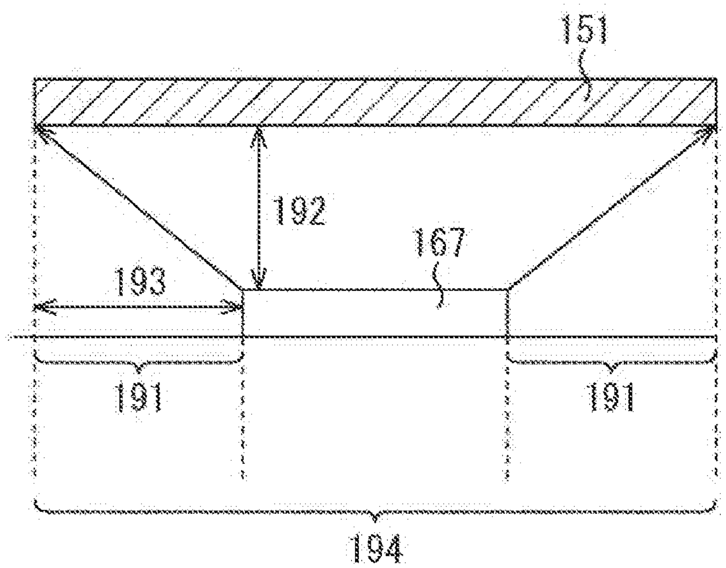
FIG. 8 is a diagram illustrating an example of a positional relationship between a light-shielding target region by a light-shielding structure, and a region of an active element group and a buffer region.

FIG. 8 is a diagram illustrating an example of a positional relationship between the light-shielding target region by the light-shielding structure 151, and the region of the active element group and the buffer region.

In the example illustrated in FIG. 8, the region in which the active element group 167 is formed and a buffer region 191 around the active element group 167 are a light-shielding target region 194, and the light-shielding structure 151 is formed to face the light-shielding target region 194.

Here, the length from the active element group 167 to the light-shielding structure 151 is defined as an interlayer distance 192. Furthermore, the length from an end of the active element group 167 to an end of the light-shielding structure 151 by wiring is defined as a buffer region width 193.

The light-shielding structure 151 is formed so that the buffer region width 193 is larger than the interlayer distance 192. Thereby, oblique components of the hot carrier light emission generated as a point light source can be shielded.

Note that an appropriate value of the buffer region width 193 changes depending on the interlayer distance 192 between the light-shielding structure 151 and the active element group 167. For example, in a case where the interlayer distance 192 is long, the buffer region 191 needs to be provided in a large manner in order to sufficiently shield the oblique components of the hot carrier light emission from the active element group 167. Meanwhile, in a case where the interlayer distance 192 is short, the hot carrier light emission from the active element group 167 can be sufficiently shielded even if the buffer region 191 is not largely provided. Therefore, by forming the light-shielding structure 151 using the wiring layer close to the active element group 167 among the plurality of wiring layers constituting the multilayer wiring layer 163, the degree of freedom in layout of the conductor layers A and B can be improved. However, it is often difficult to form the light-shielding structure 151 using the wiring layer close to the active element group 167 due to layout restrictions of the wiring layer close to the active element group 167, for example. In the present technology, a high degree of freedom in layout can be obtained even in a case where the light-shielding structure 151 is formed using a wiring layer far from the active element group 167.

4. Configuration Example of Conductor Layers A and B

Hereinafter, configuration examples of the conductor layer A (wiring layer 165A) and the conductor layer B (wiring layer 165B) forming the light-shielding structure 151, which can be the Aggressor conductor loop in the solid-state imaging device 100 to which the present technology is applied, will be described. First, a comparative example to be compared with the configuration examples will be described.

First Comparative Example

Figure 9:
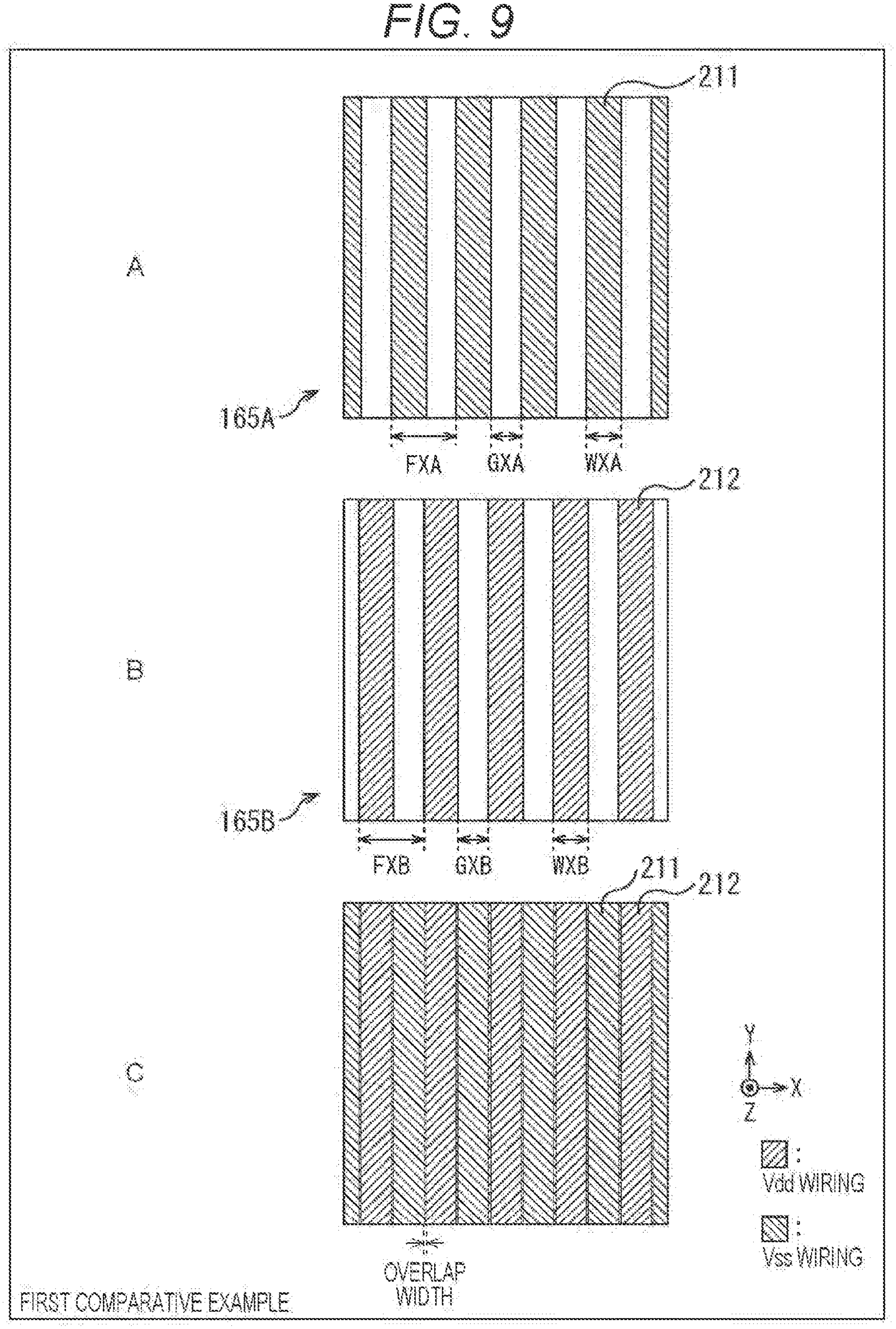
FIG. 9 is diagrams illustrating a first comparative example of conductor layers A and B.

FIG. 9 is plan views illustrating a first comparative example of the conductor layers A and B forming the light-shielding structure 151, for comparison with a plurality of configuration examples to be described below. Note that A in FIG. 9 illustrates the conductor layer A, and B in FIG. 9 illustrates the conductor layer B. In a coordinate system in FIG. 9, a horizontal direction is an X axis, a vertical direction is a Y axis, and a direction perpendicular to an XY plane is a Z axis.

In the conductor layer A in the first comparative example, a linear conductor 211 long in a Y direction is periodically arranged in an X direction with a conductor period FXA. Note that the conductor period FXA=a conductor width WXA in the X direction+a gap width GXA in the X direction. Each linear conductor 211 is, for example, wiring (Vss wiring) connected to GND or a negative power supply.

In the conductor layer B in the first comparative example, a linear conductor 212 long in the Y direction is periodically arranged in the X direction with a conductor period FXB. Note that the conductor period FXB=a conductor width WXB in the X direction+a gap width GXB in the X direction. Each linear conductor 212 is, for example, wiring (Vdd wiring) connected to a positive power supply. Here, the conductor period FXB=the conductor period FXA.

Note that connection destinations of the conductor layers A and B may be exchanged so that each linear conductor 211 serves as the Vdd wiring and each linear conductor 212 serves as the Vss wiring.

C in FIG. 9 illustrates a state of the conductor layers A and B respectively illustrated in A and B in FIG. 9, which are viewed from the photodiode 141 side (back surface side). In the case of the first comparative example, in a case where the linear conductors 211 constituting the conductor layer A and the linear conductors 212 constituting the conductor layer B are arranged in an overlapping manner as illustrated in C in FIG. 9, the linear conductors 211 and 212 are formed to cause overlapping portions where the conductor portions overlap with each other. Therefore, the hot carrier light emission from the active element group 167 can be sufficiently shielded. Note that the width of the overlapping portion is also referred to as an overlap width.

Figure 10:
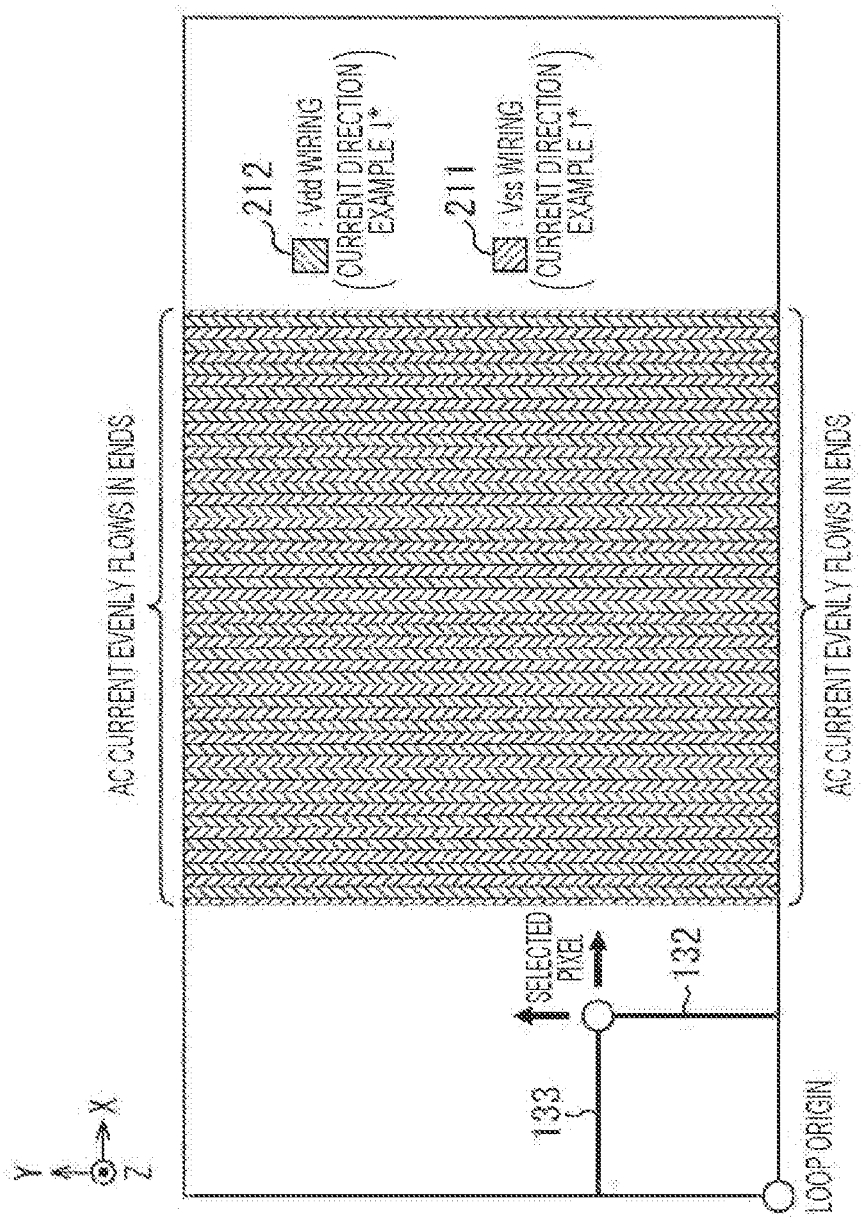
FIG. 10 is a diagram illustrating a current condition of a current flowing in the first comparative example.

FIG. 10 is a diagram illustrating a current condition of a current flowing in the first comparative example (FIG. 9).

It is assumed that an AC current evenly flows in ends of the linear conductor 211 constituting the conductor layer A and the linear conductor 212 constituting the conductor layer B. However, a current direction changes with time. For example, when the current flows through the linear conductor 212 that is the Vdd wiring from the upper side to the lower side of the drawing, the current flows through the linear conductor 211 that is the Vss wiring from the lower side to the upper side of the drawing.

In the first comparative example, in the case where the current flows as illustrated in FIG. 10, a magnetic flux in a substantially Z direction is likely to be generated between the linear conductor 211 as the Vss wiring and the linear conductor 212 as the Vdd wiring by a conductor loop having a loop plane substantially parallel to an XY plane, the conductor loop being generated including the adjacent linear conductors 211 and 212 in the plan view in FIG. 10.

Meanwhile, the Victim conductor loop formed using the signal line 132 and the control line 133 is formed in the XY plane, as illustrated in FIG. 10, in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, since the induced electromotive force is proportional to dimensions of the Victim conductor loop depending on the configuration of the Aggressor conductor loop, when the effective dimensions of the Victim conductor loop formed using the signal line 132 and the control line 133 are changed due to movement of selected pixels in the pixel array 121, the change in the induced electromotive force becomes remarkable.

In the case of the first comparative example, since the direction (substantially Z direction) of the magnetic flux generated from the loop plane of the Aggressor conductor loop of the light-shielding structure 151 formed using the conductor layers A and B and the direction (Z direction) of the magnetic flux that is likely to generate the induced electromotive force in the Victim conductor loop substantially match, deterioration (generation of inductive noise) of an image output from the solid-state imaging device 100 is expected.

Figure 11:
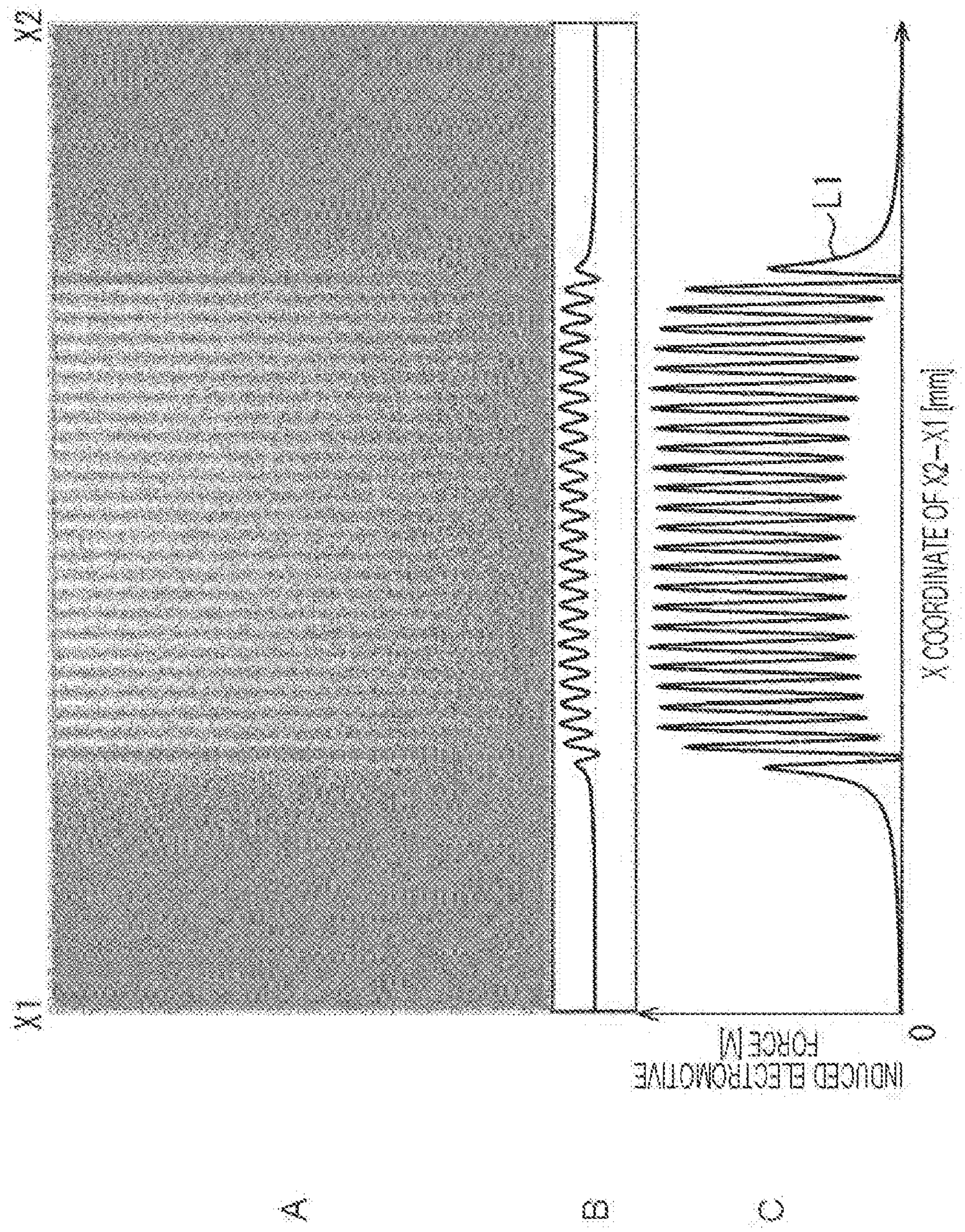
FIG. 11 is diagrams illustrating a simulation result of inductive noise corresponding to the first comparative example.

FIG. 11 illustrates a simulation result of the inductive noise generated in the case where the first comparative example is applied to the solid-state imaging device 100.

A in FIG. 11 illustrates an image in which the inductive noise is generated, the image being output from the solid-state imaging device 100. B in FIG. 11 illustrates a change in a pixel signal in the line segment X1-X2 of the image illustrated in A in FIG. 11. C in FIG. 11 illustrates the solid line L1 representing the induced electromotive force that generates the inductive noise in the image. The horizontal axis in C in FIG. 11 represents X-axis coordinates of the image, and the vertical axis represents the magnitude of the induced electromotive force.

Hereinafter, the solid line L1 illustrated in C in FIG. 11 will be used for comparison with the simulation result of the inductive noise generated in a case where the configuration examples of the conductor layers A and B forming the light-shielding structure 151 are applied to the solid-state imaging device 100.

First Configuration Example

Figure 12:
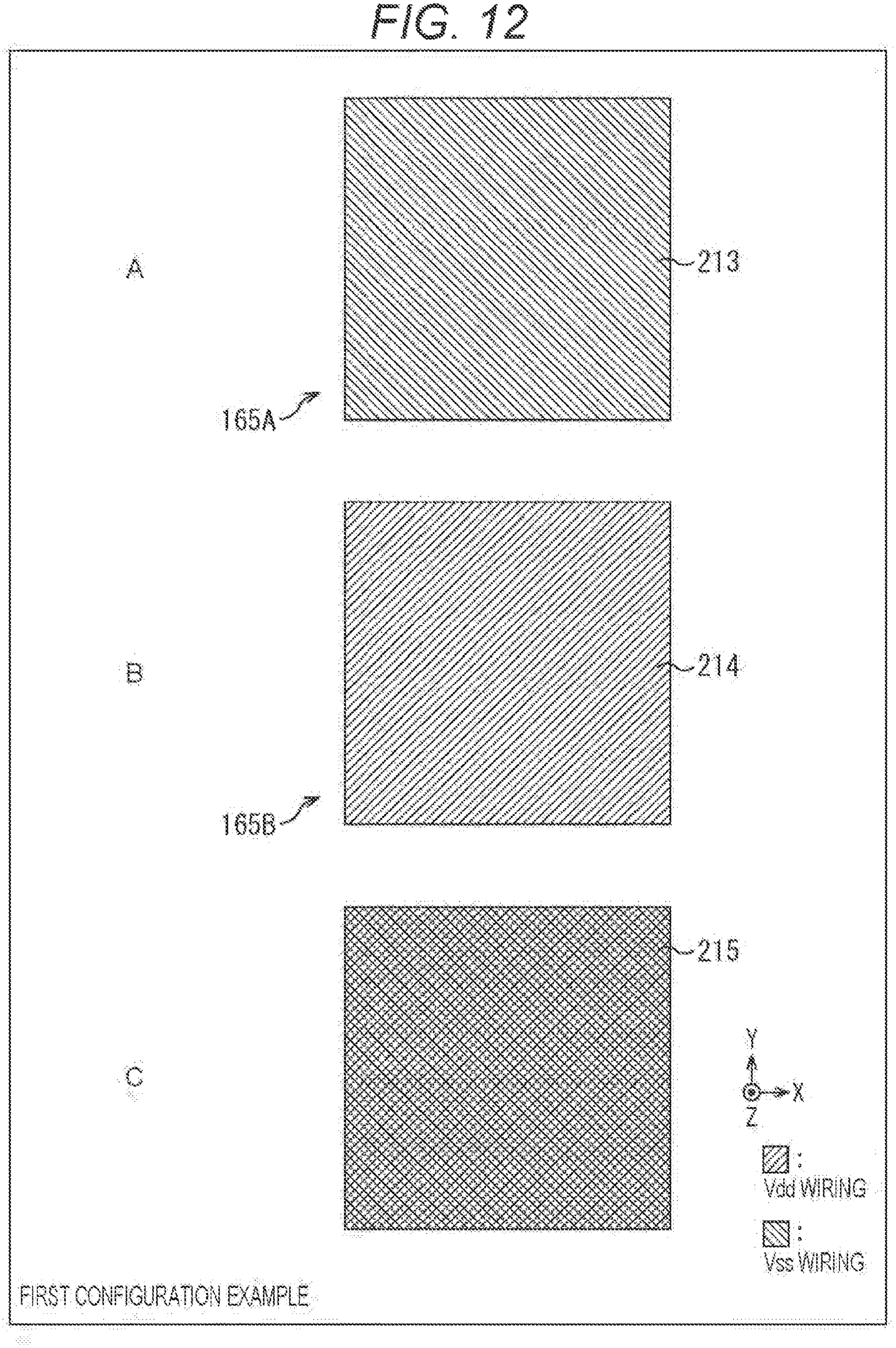
FIG. 12 is diagrams illustrating a first configuration example of the conductor layers A and B.

FIG. 12 illustrates a first configuration example of the conductor layers A and B. Note that A in FIG. 12 illustrates the conductor layer A, and B in FIG. 12 illustrates the conductor layer B. In the coordinate system in FIG. 12, the horizontal direction is the X axis, the vertical direction is the Y axis, and the direction perpendicular to the XY plane is the Z axis.

The conductor layer A in the first configuration example is configured by a planar conductor 213. The planar conductor 213 is, for example, wiring (Vss wiring) connected to the GND or the negative power supply.

The conductor layer B in the first comparative example is configured by a planar conductor 214. The planar conductor 214 is, for example, wiring (Vdd wiring) connected to the positive power supply.

Note that the connection destinations of the conductor layers A and B may be exchanged so that the planar conductor 213 serves as the Vdd wiring and the planar conductor 214 serves as the Vss wiring. The same applies to each configuration example to be described below.

C in FIG. 12 illustrates a state of the conductor layers A and B respectively illustrated in A and B in FIG. 12, which are viewed from the photodiode 141 side (back surface side). Note that a hatched region 215 in C in FIG. 12 where diagonal lines intersect represents a region where the planar conductor 213 of the conductor layer A and the planar conductor 214 of the conductor layer B overlap. Therefore, the case of C in FIG. 12 illustrates that the entire planar conductor 213 of the conductor layer A and the entire planar conductor 214 of the conductor layer B overlap. In the case of the first configuration example, the entire planar conductor 213 of the conductor layer A and the entire planar conductor 214 of the conductor layer B overlap. Therefore, the hot carrier light emission from the active element group 167 can be reliably shielded.

Figure 13:
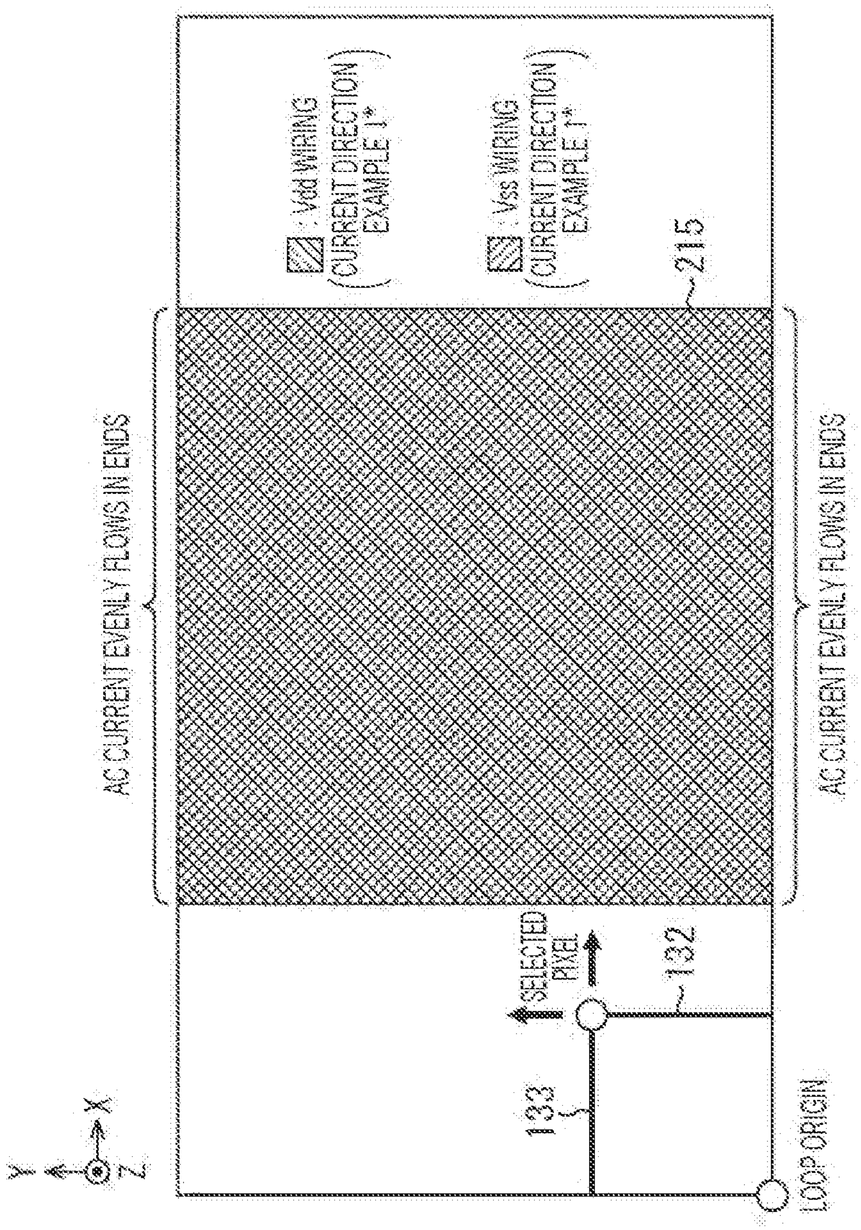
FIG. 13 is a diagram illustrating a current condition of a current flowing in the first configuration example.

FIG. 13 is a diagram illustrating the current condition of the current flowing in the first configuration example (FIG. 12).

It is assumed that AC current evenly flows in ends of the planar conductor 213 constituting the conductor layer A and the planar conductor 214 constituting the conductor layer B. However, the current direction changes with time. For example, when the current flows through the planar conductor 214 that is the Vdd wiring from the upper side to the lower side of the drawing, the current flows through the planar conductor 213 that is the Vss wiring from the lower side to the upper side of the drawing.

In the first configuration example, in a case where the current flows as illustrated in FIG. 13, magnetic fluxes in a substantially X direction and a substantially Y direction are likely to be generated between the planar conductor 213 that is the Vss wiring and the planar conductor 214 that is the Vdd wiring by a conductor loop with a loop plane approximately perpendicular to the X axis and a conductor loop with a loop plane approximately perpendicular to the Y axis, the conductor loops being generated including (cross sections of) the planar conductors 213 and 214 in a cross section where the planar conductors 213 and 214 are arranged.

Meanwhile, the Victim conductor loop formed using the signal line 132 and the control line 133 is formed in the XY plane, as illustrated in FIG. 13, in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z-axis direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the first configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the case of the first comparative example.

Figure 14:
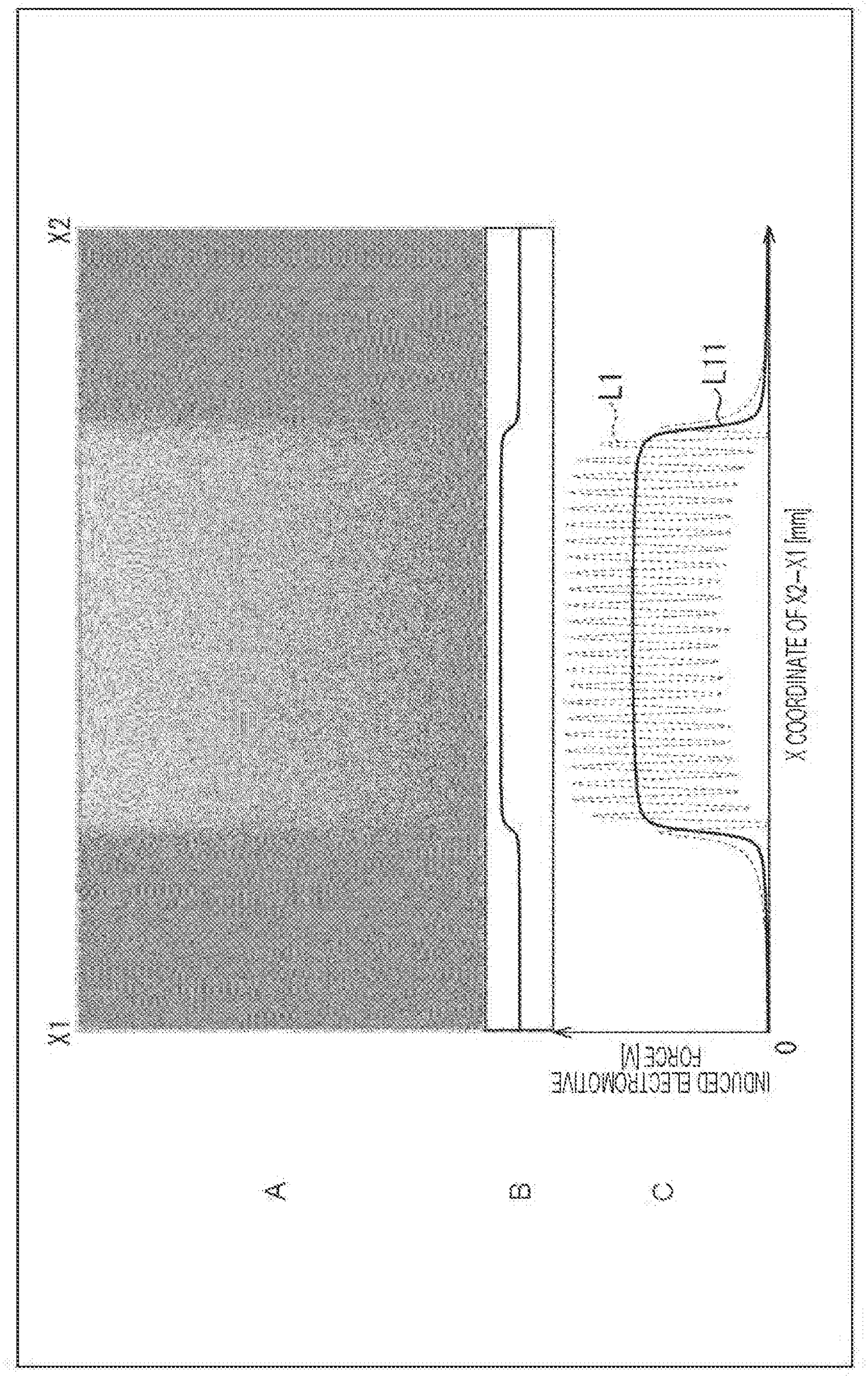
FIG. 14 is diagrams illustrating a simulation result of inductive noise corresponding to the first configuration example.

FIG. 14 illustrates a simulation result of the inductive noise generated in the case where the first configuration example (FIG. 12) is applied to the solid-state imaging device 100.

A in FIG. 14 illustrates an image in which the inductive noise can be generated, the image being output from the solid-state imaging device 100. B in FIG. 14 illustrates a change in a pixel signal in the line segment X1-X2 of the image illustrated in A in FIG. 14. C in FIG. 14 illustrates the solid line L11 representing induced electromotive force that generates the inductive noise in the image. The horizontal axis of C in FIG. 14 represents X-axis coordinates of the image, and the vertical axis represents the magnitude of the induced electromotive force. Note that the dotted line L1 in C in FIG. 14 corresponds to the first comparative example (FIG. 9).

As is clear from the comparison between the solid line L11 and the dotted line L1 illustrated in C in FIG. 14, the first configuration example can suppress a change in the induced electromotive force to be generated in the Victim conductor loop as compared with the first comparative example. Therefore, generation of the inductive noise in the image output from the solid-state imaging device 100 can be suppressed.

Second Configuration Example

Figure 15:
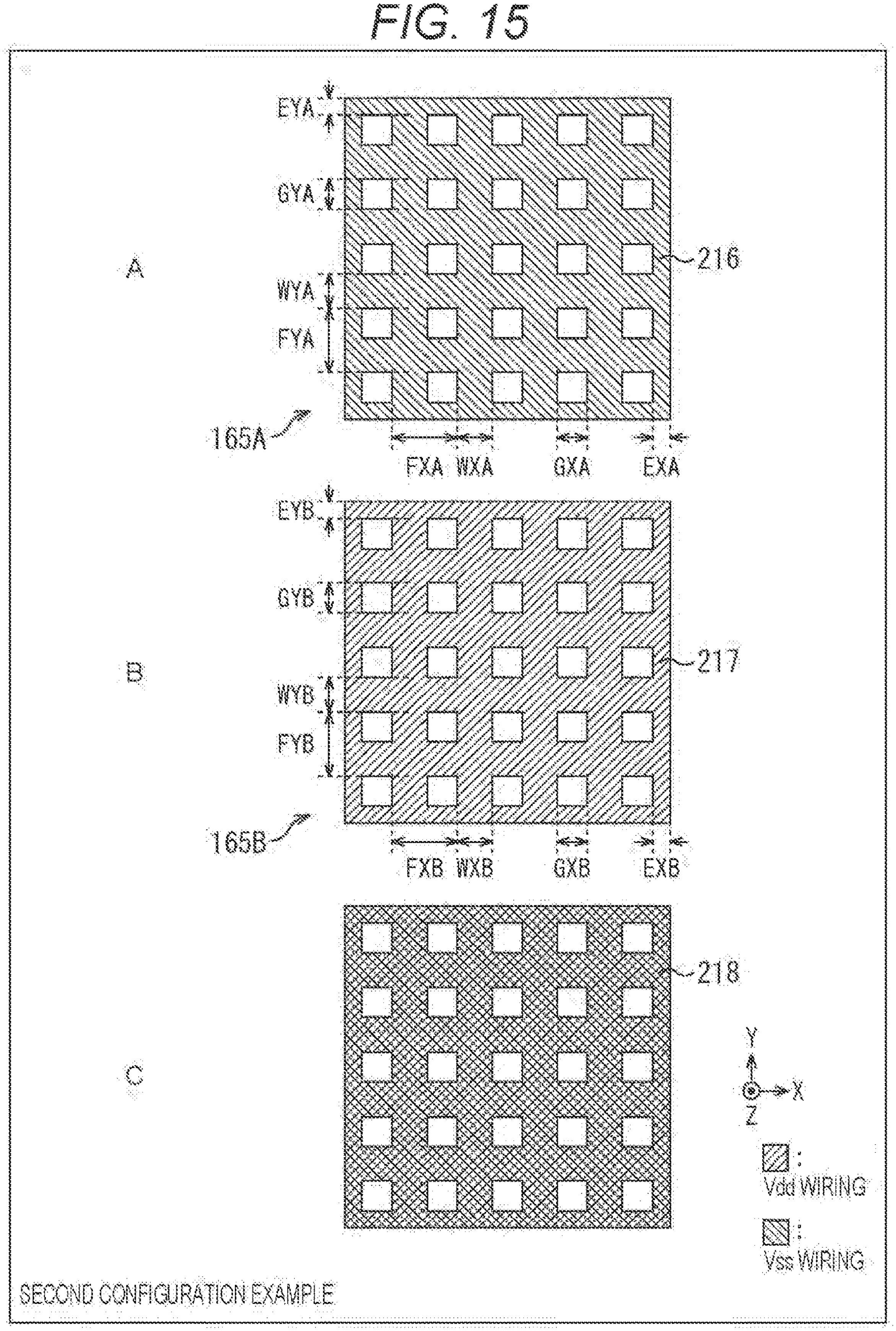
FIG. 15 is diagrams illustrating a second configuration example of the conductor layers A and B.

FIG. 15 illustrates a second configuration example of the conductor layers A and B. Note that A in FIG. 15 illustrates the conductor layer A, and B in FIG. 15 illustrates the conductor layer B. In the coordinate system in FIG. 15, the horizontal direction is the X axis, the vertical direction is the Y axis, and the direction perpendicular to the XY plane is the Z axis.

The conductor layer A in the second configuration example is configured by a reticulated conductor 216. The conductor width in the X direction of the reticulated conductor 216 is WXA, the gap width is GXA, the conductor period is FXA (=the conductor width WXA+the gap width GXA), and an end width is EXA (=the conductor width WXA/2). Furthermore, the conductor width in the Y direction of the reticulated conductor 216 is WYA, the gap width is GYA, the conductor period is FYA (=the conductor width WYA+the gap width GYA), and the end width is EYA (=the conductor width WYA/2). The reticulated conductor 216 is, for example, wiring (Vss wiring) connected to the GND or the negative power supply.

The conductor layer B in the second configuration example is configured by a reticulated conductor 217. The conductor width in the X direction of the reticulated conductor 217 is WXB, the gap width is GXB, the conductor period is FXB (=the conductor width WXB+the gap width GXB), and the end width is EXB (=the conductor width WXB/2). Furthermore, the conductor width in the Y direction of the reticulated conductor 217 is WYB, the gap width is GYB, the conductor period is FYB (=the conductor width WYB+the gap width GYB), and the end width is EYB (=the conductor width WYB/2). The reticulated conductor 217 is, for example, wiring (Vdd wiring) connected to the positive power supply.

Note that the reticulated conductor 216 and the reticulated conductor 217 desirably satisfy the following relationship.

The conductor width *WXA*=the conductor width *WYA*=the conductor width *WXB*=the conductor width *WYB*

The gap width *GXA*=the gap width *GYA*=the gap width *GXB*=the gap width *GYB*

The end width *EXA*=the end width *EYA*=the end width *EXB*=the end width *EYB*

The conductor period *FXA*=the conductor period *FYA*=the conductor period *FXB*=the conductor period *FYB*

C in FIG. 15 illustrates a state of the conductor layers A and B respectively illustrated in A and B in FIG. 15, which are viewed from the photodiode 141 side (back surface side). Note that a hatched region 218 in C in FIG. 15 where diagonal lines intersect represents a region where the reticulated conductor 216 of the conductor layer A and the reticulated conductor 217 of the conductor layer B overlap. In the case of the second configuration example, since the gaps of the reticulated conductor 216 forming the conductor layer A and the gaps of the reticulated conductor 217 forming the conductor layer B match, the hot carrier light emission from the active element group 167 cannot be sufficiently shielded. However, as will be described below, generation of the inductive noise can be suppressed.

Figure 16:
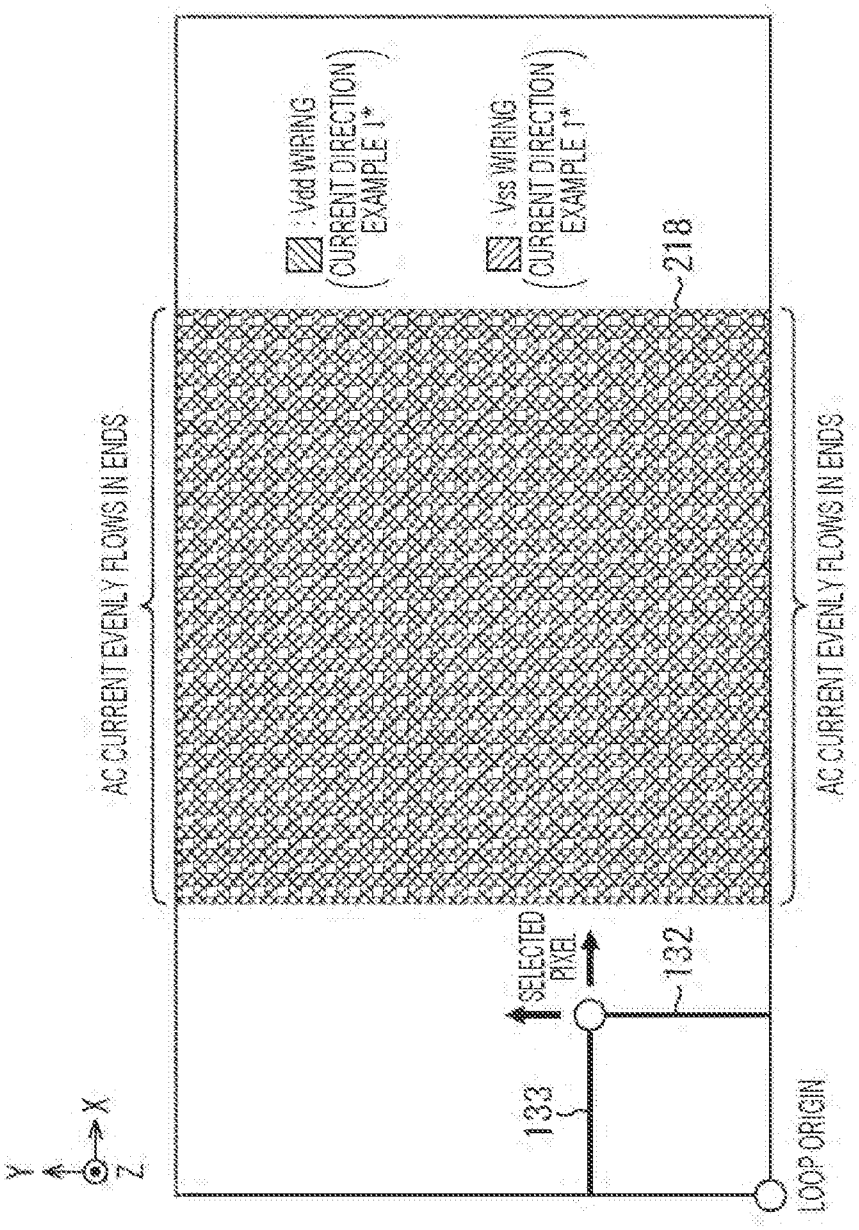
FIG. 16 is a diagram illustrating a current condition of a current flowing in the second configuration example.

FIG. 16 is a diagram illustrating the current condition of the current flowing in the second configuration example (FIG. 15).

It is assumed that AC current evenly flows in ends of the reticulated conductor 216 constituting the conductor layer A and the reticulated conductor 217 constituting the conductor layer B. However, the current direction changes with time. For example, when the current flows through the reticulated conductor 217 that is the Vdd wiring from the upper side to the lower side of the drawing, the current flows through the reticulated conductor 216 that is the Vss wiring from the lower side to the upper side of the drawing.

In the second configuration example, in a case where the current flows as illustrated in FIG. 16, the magnetic fluxes in the substantially X direction and the substantially Y direction are likely to be generated between the reticulated conductor 216 that is the Vss wiring and the reticulated conductor 217 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 216 and 217 in a cross section where the reticulated conductors 216 and 217 are arranged.

Meanwhile, the Victim conductor loop formed using the signal line 132 and the control line 133 is formed in the XY plane, as illustrated in FIG. 16, in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the second configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figure 17:
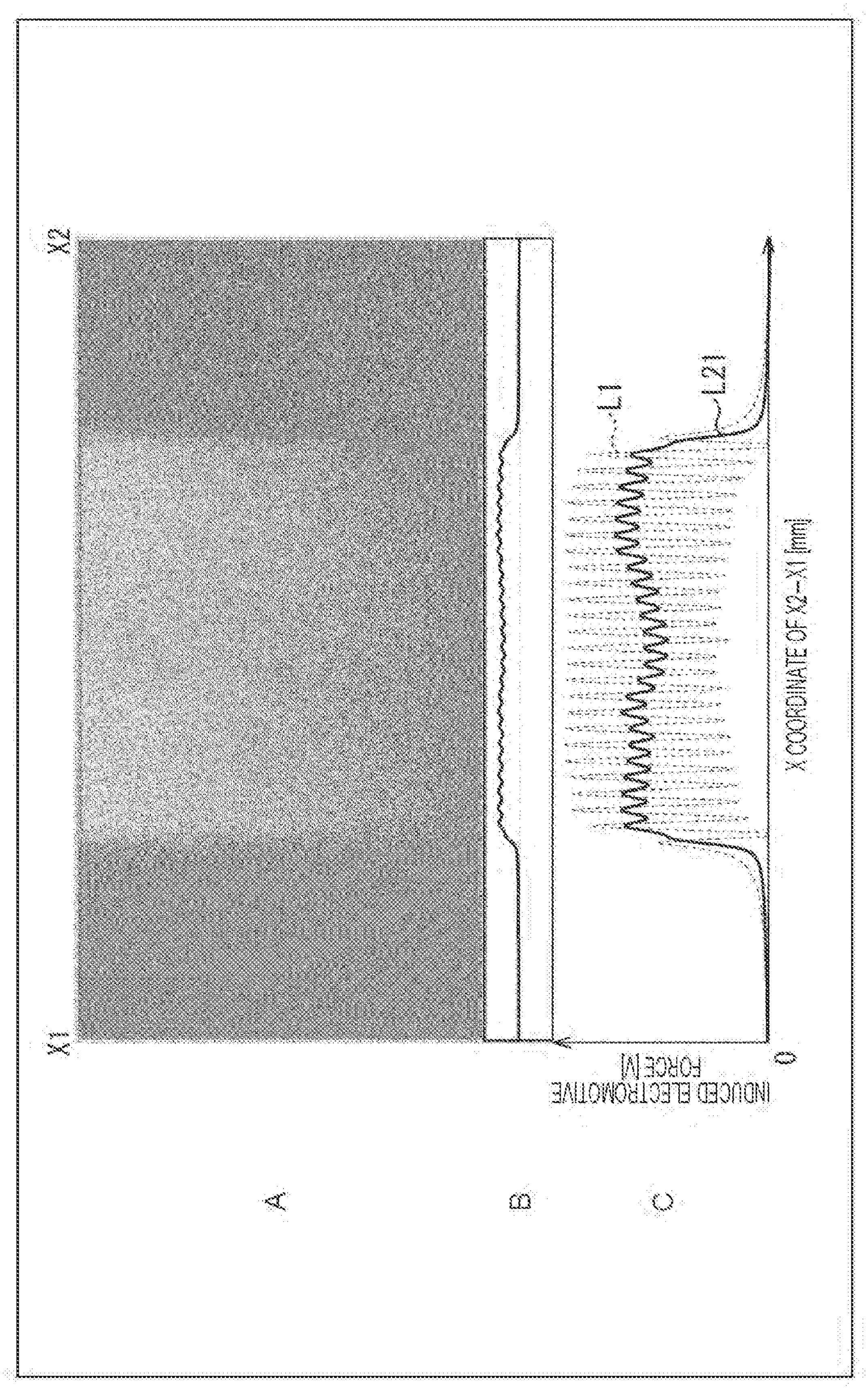
FIG. 17 is diagrams illustrating a simulation result of inductive noise corresponding to the second configuration example.

FIG. 17 illustrates a simulation result of the inductive noise generated in the case where the second configuration example (FIG. 15) is applied to the solid-state imaging device 100.

A in FIG. 17 illustrates an image in which the inductive noise can be generated, the image being output from the solid-state imaging device 100. B in FIG. 17 illustrates a change in a pixel signal in the line segment X1-X2 of the image illustrated in A in FIG. 17. C in FIG. 17 illustrates the solid line L21 representing induced electromotive force that generates the inductive noise in the image. The horizontal axis of C in FIG. 17 represents X-axis coordinates of the image, and the vertical axis represents the magnitude of the induced electromotive force. Note that the dotted line L1 in C in FIG. 17 corresponds to the first comparative example (FIG. 9).

As is clear from the comparison between the solid line L21 and the dotted line L1 illustrated in C in FIG. 17, the second configuration example can suppress a change in the induced electromotive force to be generated in the Victim conductor loop as compared with the first comparative example. Therefore, generation of the inductive noise in the image output from the solid-state imaging device 100 can be suppressed.

Second Comparative Example

In the second configuration example (FIG. 15), as the relationship between the reticulated conductor 216 forming the conductor layer A and the reticulated conductor 217 forming the conductor layer B, the conductor period FXA=the conductor period FYA=the conductor period FXB=the conductor period FYB is satisfied.

In this way, when the conductor period FXA in the X direction of the conductor layer A, the conductor period FYA in the Y direction of the conductor layer A, the conductor period FXB in the X direction of the conductor layer B, and the conductor period FYB in the X direction of the conductor layer B are caused to match, generation of the inductive noise can be suppressed.

Figure 18:
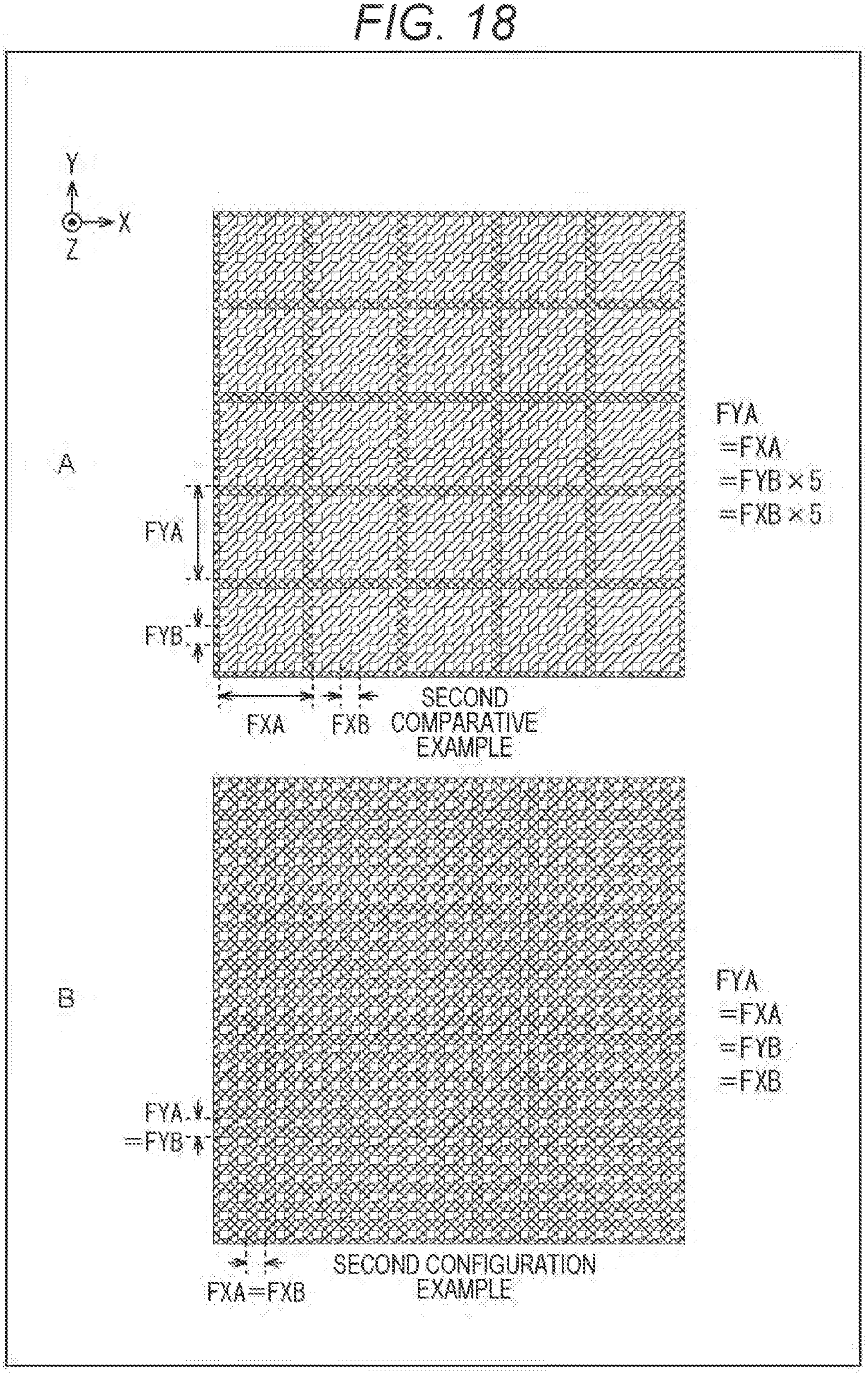
FIG. 18 is diagrams illustrating a second comparative example of the conductor layers A and B.
Figure 19:
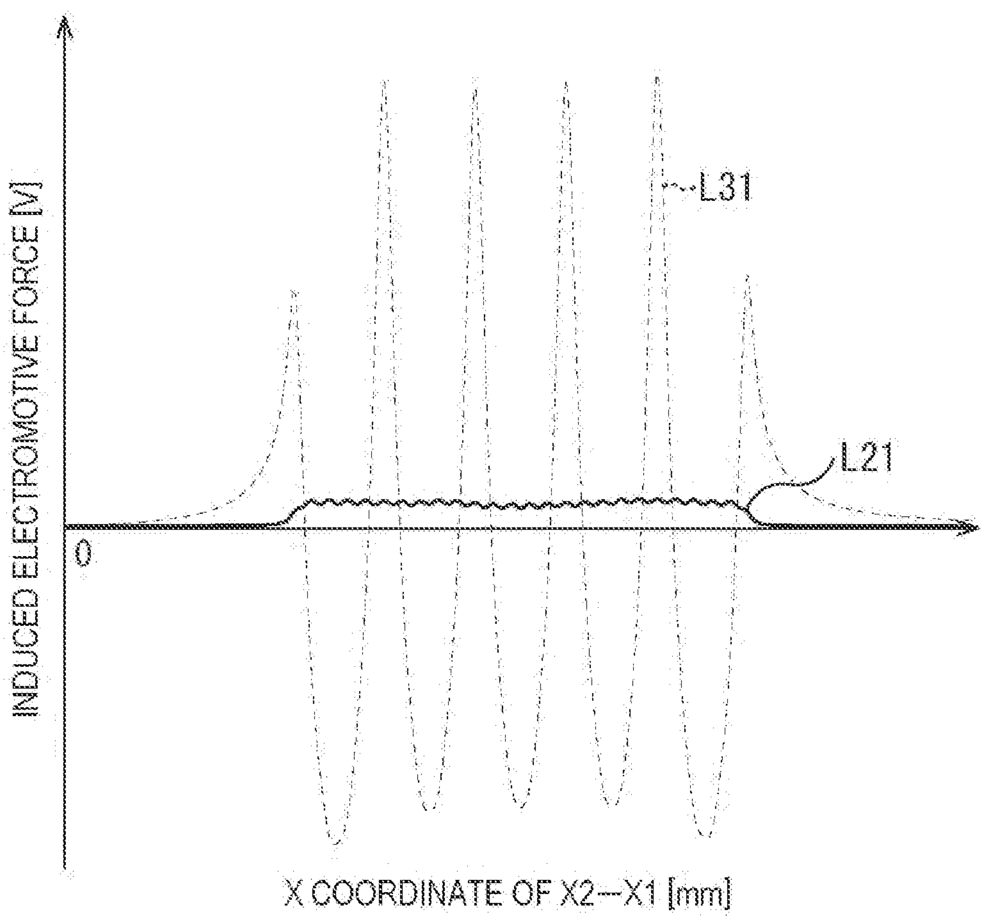
FIG. 19 is a diagram illustrating a simulation result of inductive noise corresponding to the second comparative example.

FIGS. 18 and 19 are diagrams for describing that generation of the inductive noise can be suppressed by matching all the conductor periods of the conductor layer A and the conductor layer B.

A in FIG. 18 illustrates a second comparative example that is a modified second configuration example for comparison with the second configuration example illustrated in FIG. 15. In the second comparative example, the gap width GXA in the X direction and the gap width GYA in the Y direction of the reticulated conductor 216 forming the conductor layer A in the second configuration example are widened, and the conductor period FXA in the X direction and the conductor period FYA in the Y direction are changed by a factor of 5 of the second configuration example. Note that the reticulated conductor 217 forming the conductor layer B in the second comparative example is the same as that in the second configuration example.

B in FIG. 18 illustrates the second configuration example illustrated in C in FIG. 15 by the same magnification as A in FIG. 18.

FIG. 19 illustrates a change in the induced electromotive force that causes the inductive noise in an image, as a simulation result of a case where the second comparative example (A in FIG. 18) and the second configuration example (B in FIG. 18) are applied to the solid-state imaging device 100. Note that the current condition of the current flowing in the second comparative example is similar to that in the case illustrated in FIG. 16. The horizontal axis in FIG. 19 represents X-axis coordinates of the image, and the vertical axis represents the magnitude of the induced electromotive force.

The solid line L21 in FIG. 19 corresponds to the second configuration example, and the dotted line L31 corresponds to the second comparative example.

As is clear from the comparison of the solid line L21 and the dotted line L31, it can be seen that the second configuration example can suppress the change in the induced electromotive force to be generated in the Victim conductor loop as compared with the second comparative example, and can suppress the inductive noise.

Third Comparative Example

By the way, generation of the inductive noise can also be suppressed even in a case where the conductor width of the reticulated conductor forming the conductor layer A in the second comparative example is expanded.

Figure 20:
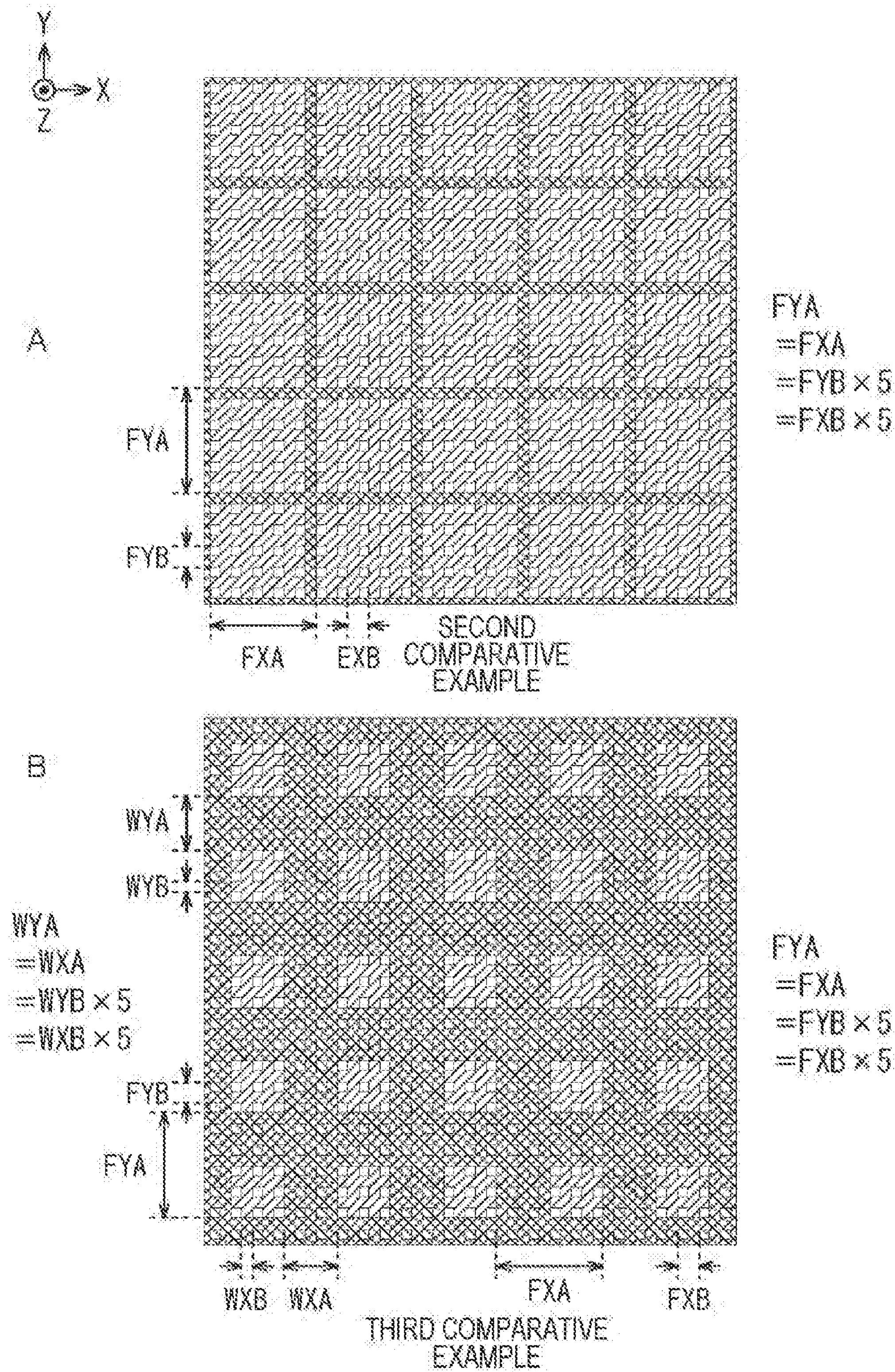
FIG. 20 is diagrams illustrating a third comparative example of the conductor layers A and B.
Figure 21:
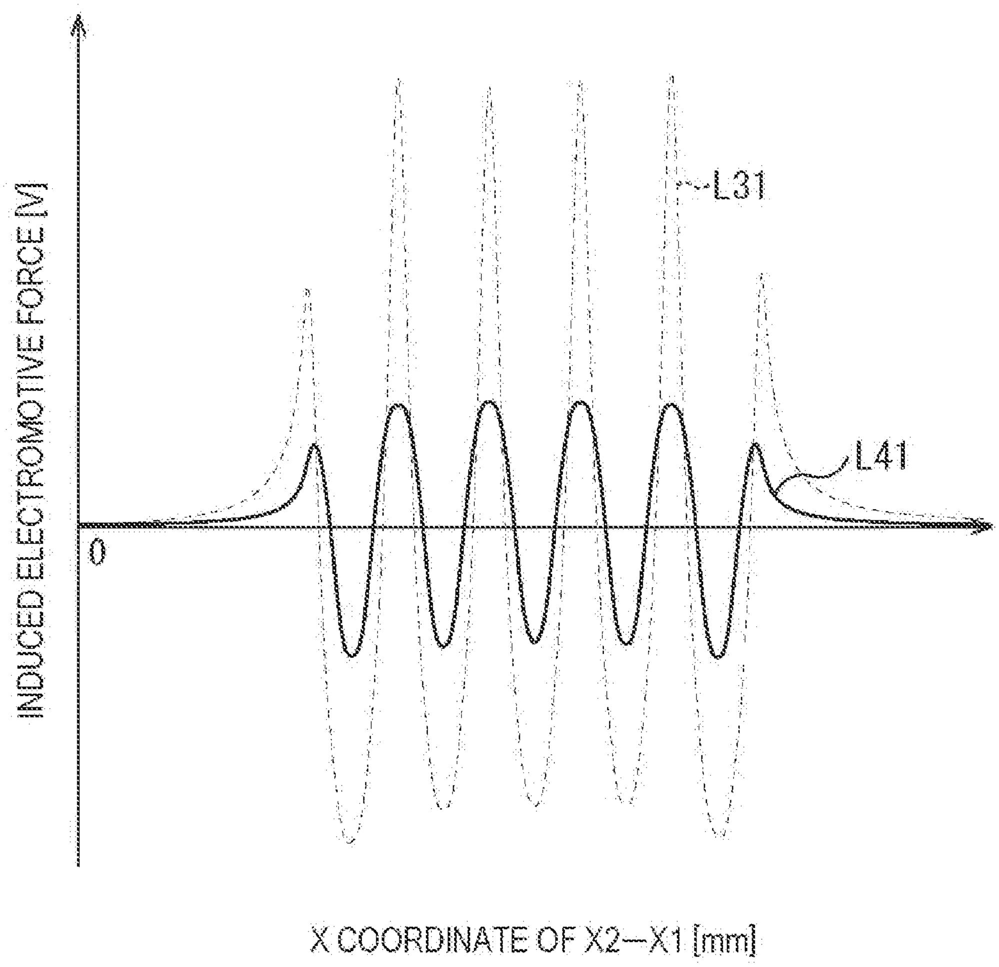
FIG. 21 is a diagram illustrating a simulation result of inductive noise corresponding to the third comparative example.

FIGS. 20 and 21 are diagrams for describing that generation of the inductive noise can be suppressed by expanding the conductor width of the reticulated conductor forming the conductor layer A.

A in FIG. 20 is a re-illustration of the second comparative example illustrated in A in FIG. 18.

B in FIG. 20 illustrates a third comparative example that is a modified second configuration example for comparison with the second comparative example. In the third comparative example, the conductor widths WXA and WYA in the X direction and the Y direction of the reticulated conductor 216 forming the conductor layer A in the second configuration example are expanded by a factor of 5 of the second configuration example. Note that the reticulated conductor 217 forming the conductor layer B in the third comparative example is the same as that in the second configuration example.

FIG. 21 illustrates a change in the induced electromotive force that causes the inductive noise in an image, as a simulation result of a case where the third comparative example and the second comparative example are applied to the solid-state imaging device 100. Note that the current condition of the current flowing in the third comparative example is similar to that in the case illustrated in FIG. 16. The horizontal axis in FIG. 21 represents X-axis coordinates of the image, and the vertical axis represents the magnitude of the induced electromotive force.

The solid line L41 in FIG. 21 corresponds to the third comparative example, and the dotted line L31 corresponds to the second comparative example.

As is clear from the comparison of the solid line L41 and the dotted line L31, it can be seen that the third comparative example can suppress the change in the induced electromotive force to be generated in the Victim conductor loop as compared with the second comparative example, and can suppress the inductive noise.

Third Configuration Example

Figure 22:
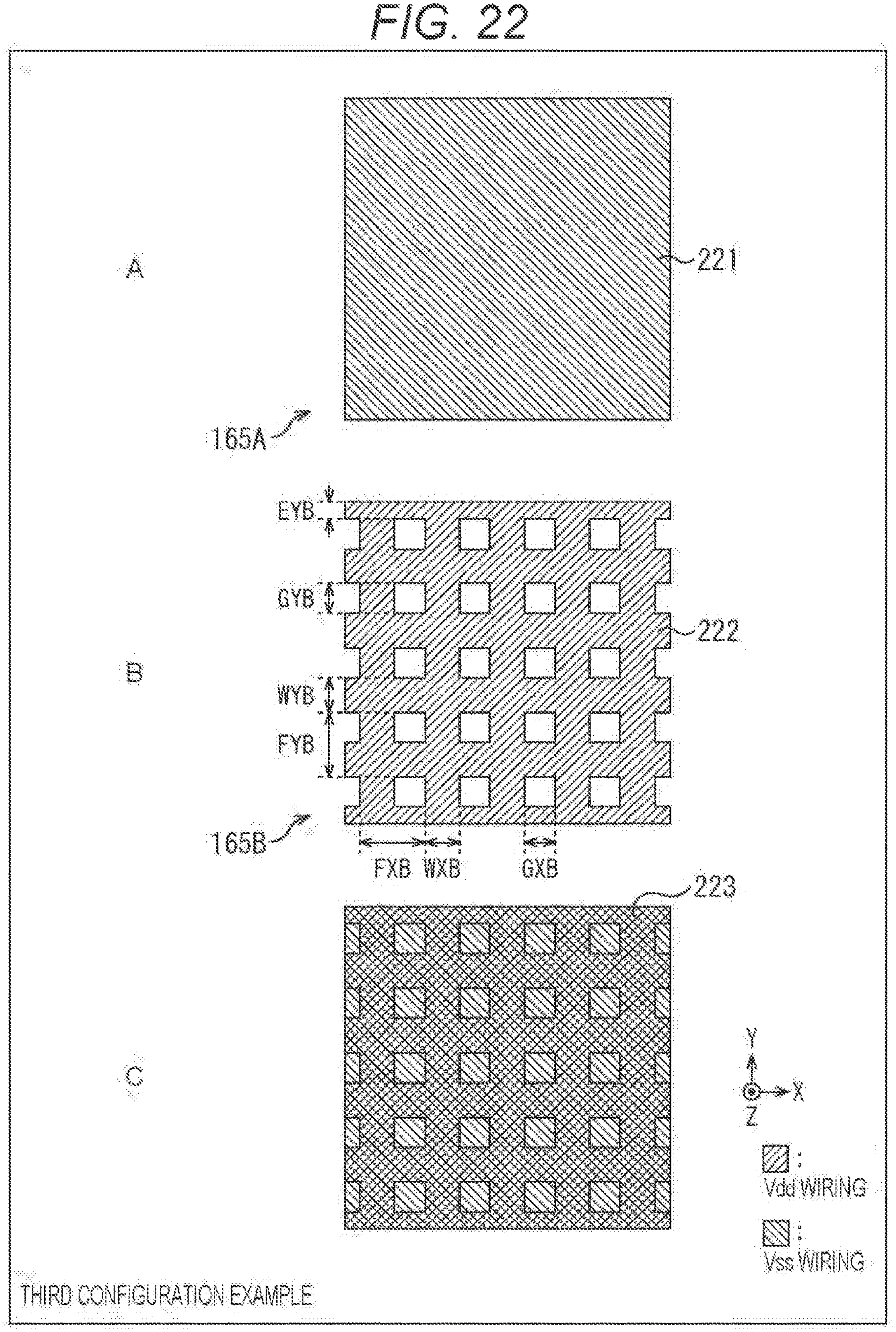
FIG. 22 is diagrams illustrating a third configuration example of the conductor layers A and B.

Next, FIG. 22 illustrates a third configuration example of the conductor layers A and B. Note that A in FIG. 22 illustrates the conductor layer A, and B in FIG. 22 illustrates the conductor layer B. In the coordinate system in FIG. 22, the horizontal direction is the X axis, the vertical direction is the Y axis, and the direction perpendicular to the XY plane is the Z axis.

The conductor layer A in the third configuration example is configured by a planar conductor 221. The planar conductor 221 is, for example, wiring (Vss wiring) connected to the GND or the negative power supply.

The conductor layer B in the third configuration example is configured by a reticulated conductor 222. The conductor width in the X direction of the reticulated conductor 222 is WXB, the gap width is GXB, and the conductor period is FXB (=the conductor width WXB+the gap width GXB). Furthermore, the conductor width in the Y direction of the reticulated conductor 222 is WYB, the gap width is GYB, the conductor period is FYB (=the conductor width WYB+ the gap width GYB), and the end width is EYB. The reticulated conductor 222 is, for example, wiring (Vdd wiring) connected to the positive power supply.

Note that the reticulated conductor 222 desirably satisfies the following relationship.

The conductor width *WXB*=the conductor width *WYB*

The gap width *GXB*=the gap width *GYB*

The end width *EYB*=the conductor width *WYB*/2

The conductor period *FXB*=the conductor period *FYB*

By adjusting the conductor widths, conductor periods, and gap widths in the X direction and the Y direction as described above, wiring resistance and wiring impedance of the reticulated conductor 222 become uniform in the X direction and the Y direction. Therefore, magnetic field resistance and voltage drop can be made uniform in the X direction and the Y direction.

Furthermore, by setting the end width EYB to ½ of the conductor width WYB, the induced electromotive force generated in the Victim conductor loop by the magnetic field generated around the end of the reticulated conductor 222 can be suppressed.

C in FIG. 22 illustrates a state of the conductor layers A and B respectively illustrated in A and B in FIG. 22, which are viewed from the photodiode 141 side (back surface side). Note that a hatched region 223 where diagonal lines intersect in C in FIG. 22 represents a region where the planar conductor 221 of the conductor layer A and the reticulated conductor 222 of the conductor layer B overlap. In the case of the third configuration example, since the active element group 167 is covered with at least one of the conductor layer A or the conductor layer B, the hot carrier light emission from the active element group 167 can be shielded.

Figure 23:
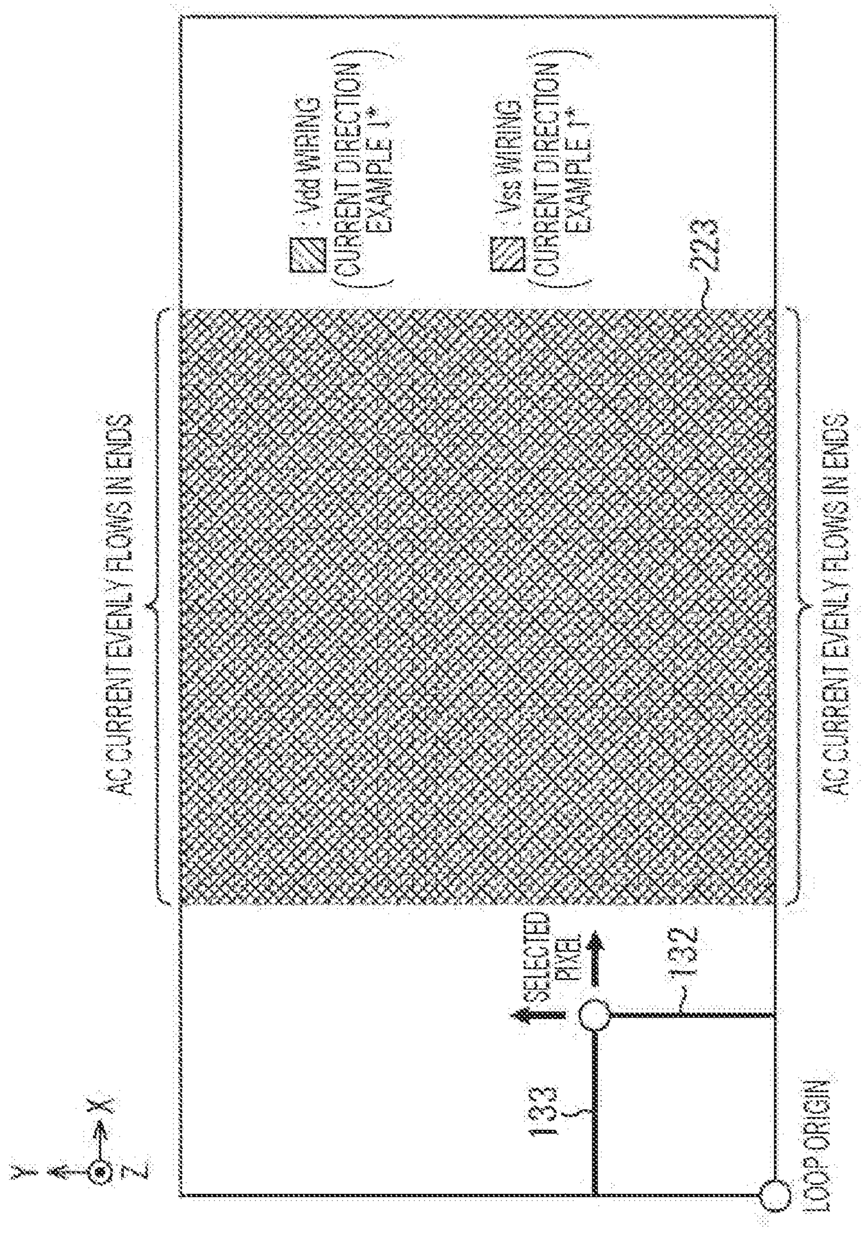
FIG. 23 is a diagram illustrating a current condition of a current flowing in the third configuration example.

FIG. 23 is a diagram illustrating the current condition of the current flowing in the third configuration example (FIG. 22).

It is assumed that AC current evenly flows in ends of the planar conductor 221 constituting the conductor layer A and the reticulated conductor 222 constituting the conductor layer B. However, the current direction changes with time. For example, when the current flows through the reticulated conductor 222 that is the Vdd wiring from the upper side to the lower side of the drawing, the current flows through the planar conductor 221 that is the Vss wiring from the lower side to the upper side of the drawing.

In the third configuration example, in a case where the current flows as illustrated in FIG. 23, the magnetic fluxes in the substantially X direction and the substantially Y direction are likely to be generated between the planar conductor 221 that is the Vss wiring and the reticulated conductor 222 that is the Vdd wiring by the conductor loop with the loop plane approximately perpendicular to the X axis and the conductor loop with the loop plane approximately perpendicular to the Y axis, the conductor loops being generated including (cross sections of) the planar conductor 221 and the reticulated conductor 222 in a cross section where the planar conductor 221 and the reticulated conductor 222 are arranged.

Meanwhile, the Victim conductor loop formed using the signal line 132 and the control line 133 is formed in the XY plane in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the third configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figure 24:
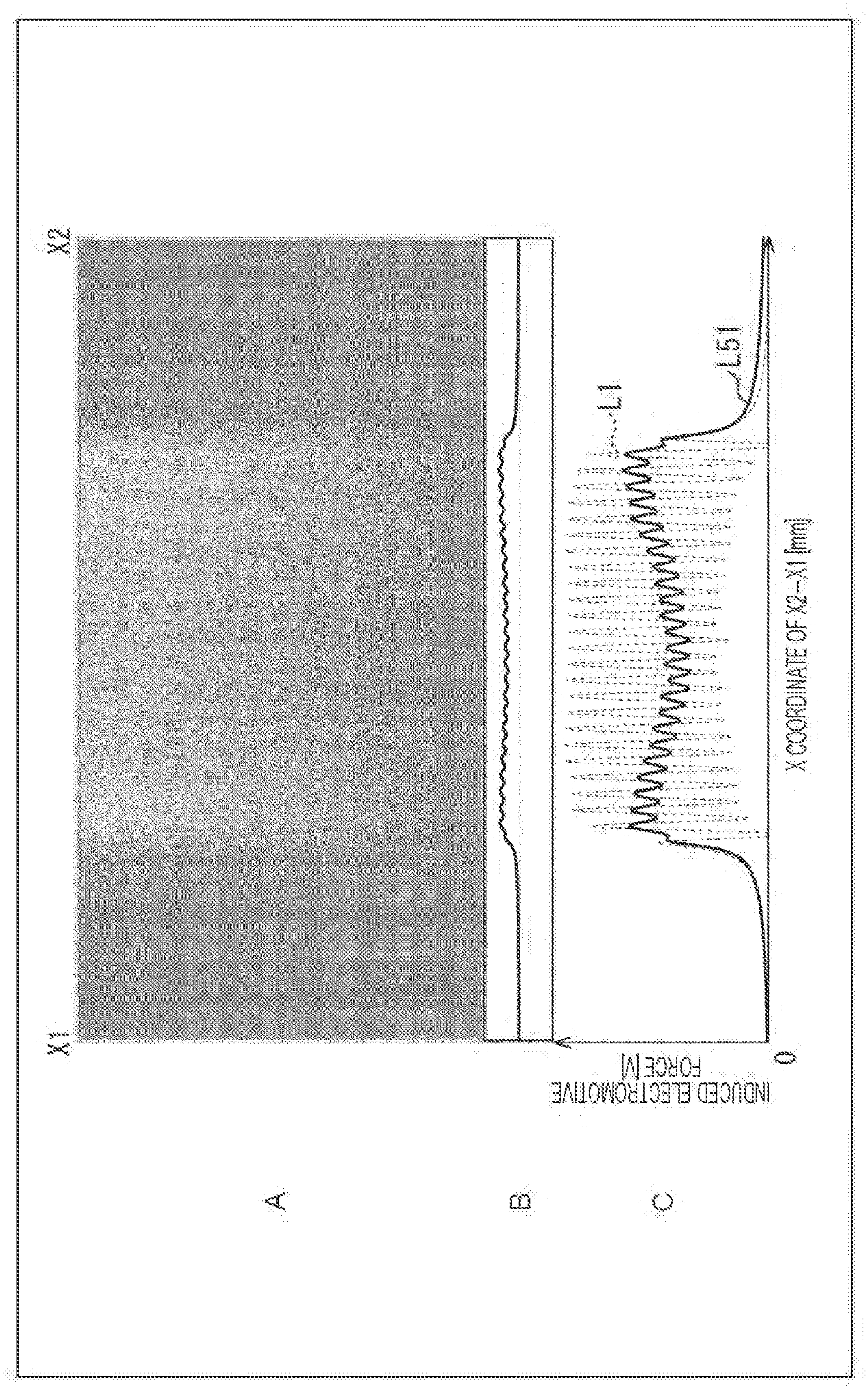
FIG. 24 is diagrams illustrating a simulation result of inductive noise corresponding to the third configuration example.

FIG. 24 illustrates a simulation result of the inductive noise generated in the case where the third configuration example (FIG. 22) is applied to the solid-state imaging device 100.

A in FIG. 24 illustrates an image in which the inductive noise can be generated, the image being output from the solid-state imaging device 100. B in FIG. 24 illustrates a change in a pixel signal in the line segment X1-X2 of the image illustrated in A in FIG. 24. C in FIG. 24 illustrates the solid line L51 representing induced electromotive force that generates the inductive noise in the image. The horizontal axis of C in FIG. 24 represents X-axis coordinates of the image, and the vertical axis represents the magnitude of the induced electromotive force. Note that the dotted line L1 in C in FIG. 24 corresponds to the first comparative example (FIG. 9).

As is clear from the comparison between the solid line L51 and the dotted line L1 illustrated in C in FIG. 24, the third configuration example can suppress a change in the induced electromotive force to be generated in the Victim conductor loop as compared with the first comparative example. Therefore, generation of the inductive noise in the image output from the solid-state imaging device 100 can be suppressed.

Fourth Configuration Example

Figure 25:
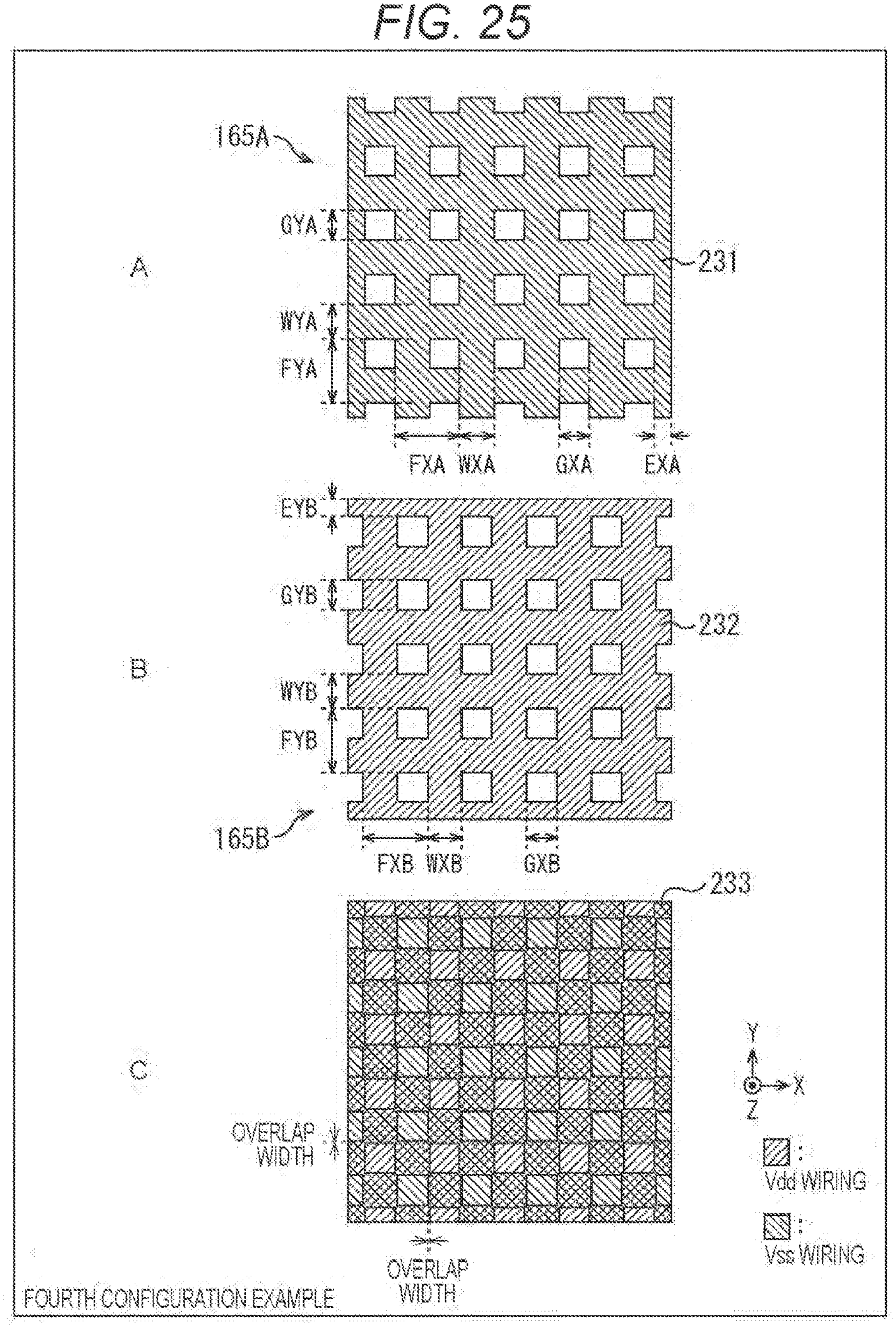
FIG. 25 is diagrams illustrating a fourth configuration example of the conductor layers A and B.

Next, FIG. 25 illustrates a fourth configuration example of the conductor layers A and B. Note that A in FIG. 25 illustrates the conductor layer A, and B in FIG. 25 illustrates the conductor layer B. In the coordinate system in FIG. 25, the horizontal direction is the X axis, the vertical direction is the Y axis, and the direction perpendicular to the XY plane is the Z axis.

The conductor layer A in the fourth configuration example is configured by a reticulated conductor 231. The conductor width in the X direction of the reticulated conductor 231 is WXA, the gap width is GXA, the conductor period is FXA (=the conductor width WXA+the gap width GXA), and an end width is EXA (=the conductor width WXA/2). Furthermore, the conductor width in the Y direction of the reticulated conductor 231 is WYA, the gap width is GYA, and the conductor period is FYA (=the conductor width WYA+the gap width GYA). The reticulated conductor 231 is, for example, wiring (Vss wiring) connected to the GND or the negative power supply.

The conductor layer B in the fourth configuration example is configured by a reticulated conductor 232. The conductor width in the X direction of the reticulated conductor 232 is WXB, the gap width is GXB, and the conductor period is FXB (=the conductor width WXB+the gap width GXB). Furthermore, the conductor width in the Y direction of the reticulated conductor 232 is WYB, the gap width is GYB, the conductor period is FYB (=the conductor width WYB+ the gap width GYB), and the end width is EYB (=the conductor width WYB/2). The reticulated conductor 232 is, for example, wiring (Vdd wiring) connected to the positive power supply.

Note that the reticulated conductor 231 and the reticulated conductor 232 desirably satisfy the following relationship.

The conductor width $WXA$=the conductor width $WYA$=the conductor width $WXB$=the conductor width $WYB$ The gap width $GXA$=the gap width $GYA$=the gap width $GXB$=the gap width $GYB$ The end width $EXA$=the end width $EYB$ The conductor period $FXA$=the conductor period $FYA$=the conductor period $FXB$=the conductor period $FYB$ The conductor width $WYA$=2×the overlap width+the gap width $GYA$, the conductor width $WXA$=2× the overlap width+the gap width $GXA$ The conductor width $WYB$=2×the overlap width+the gap width $GYB$, the conductor width $WXB$=2× the overlap width+the gap width $GXB$ Here, the overlap width is a width of an overlapping portion where the conductor portions overlap in a case where the reticulated conductor 231 of the conductor layer A and the reticulated conductor 232 of the conductor layer B are arranged to overlap each other.

As described above, by adjusting all the conductor periods of the reticulated conductor 231 and the reticulated conductor 232 in the X direction and the Y direction, a current distribution of the reticulated conductor 231 and a current distribution of the reticulated conductor 232 can be made substantially uniform and have opposite characteristics. Therefore, the magnetic field generated by the current distribution of the reticulated conductor 231 and the magnetic field generated by the current distribution of the reticulated conductor 232 can be effectively canceled.

Furthermore, by adjusting all the conductor periods, conductor widths, and gap widths of the reticulated conductor 231 and the reticulated conductor 232 in the X direction and the Y direction, the wiring resistance and wiring impedance of the reticulated conductor 231 and the reticulated conductor 232 become uniform in the X direction and the Y direction. Therefore, magnetic field resistance and voltage drop can be made uniform in the X direction and the Y direction.

Furthermore, by setting the end width EXA of the reticulated conductor 231 to ½ of the conductor width WXA, the induced electromotive force generated in the Victim conductor loop by the magnetic field generated around the end of the reticulated conductor 231 can be suppressed. Furthermore, by setting the end width EYB of the reticulated conductor 232 to ½ of the conductor width WYB, the induced electromotive force generated in the Victim conductor loop by the magnetic field generated around the end of the reticulated conductor 231 can be suppressed.

Note that instead of providing the end in the X direction of the reticulated conductor 231 of the conductor layer A, the end in the X direction of the reticulated conductor 232 of the conductor layer B may be provided. Furthermore, instead of providing the end in the Y direction of the reticulated conductor 232 of the conductor layer B, the end of the reticulated conductor 231 of the conductor layer A may be provided in the Y direction.

C in FIG. 25 illustrates a state of the conductor layers A and B respectively illustrated in A and B in FIG. 25, which are viewed from the photodiode 141 side (back surface side). Note that a hatched region 233 where diagonal lines intersect in C in FIG. 25 represents a region where the reticulated conductor 231 of the conductor layer A and the reticulated conductor 232 of the conductor layer B overlap. In the case of the fourth configuration example, since the active element group 167 is covered with at least one of the conductor layer A or the conductor layer B, the hot carrier light emission from the active element group 167 can be shielded.

Note that to completely shield the hot carrier light emission by the reticulated conductor 231 of the conductor layer A and the reticulated conductor 232 of the conductor layer B, the following relationships need to be satisfied.

The conductor width $WYA$≥the gap width $GYA$

The conductor width $WXA$≥the gap width $GXA$

The conductor width $WYB$≥the gap width $GYB$

The conductor width $WXB$≥the gap width $GXB$

In this case, the following relationships are satisfied.

The conductor width *WYA*=2×the overlap width+the gap width *GYA*

The conductor width *WXA*=2×the overlap width+the gap width *GXA*

The conductor width *WYB*=2×the overlap width+the gap width *GYB*

The conductor width *WXB*=2×the overlap width+the gap width *GXB*

In the fourth configuration example, in a case where the current flows similarly to the case illustrated in FIG. 23, the magnetic fluxes in the substantially X direction and the substantially Y direction are likely to be generated between the reticulated conductor 231 that is the Vss wiring and the reticulated conductor 232 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 231 and 232 in a cross section where the reticulated conductors 231 and 232 are arranged.

Fifth Configuration Example

Figure 26:
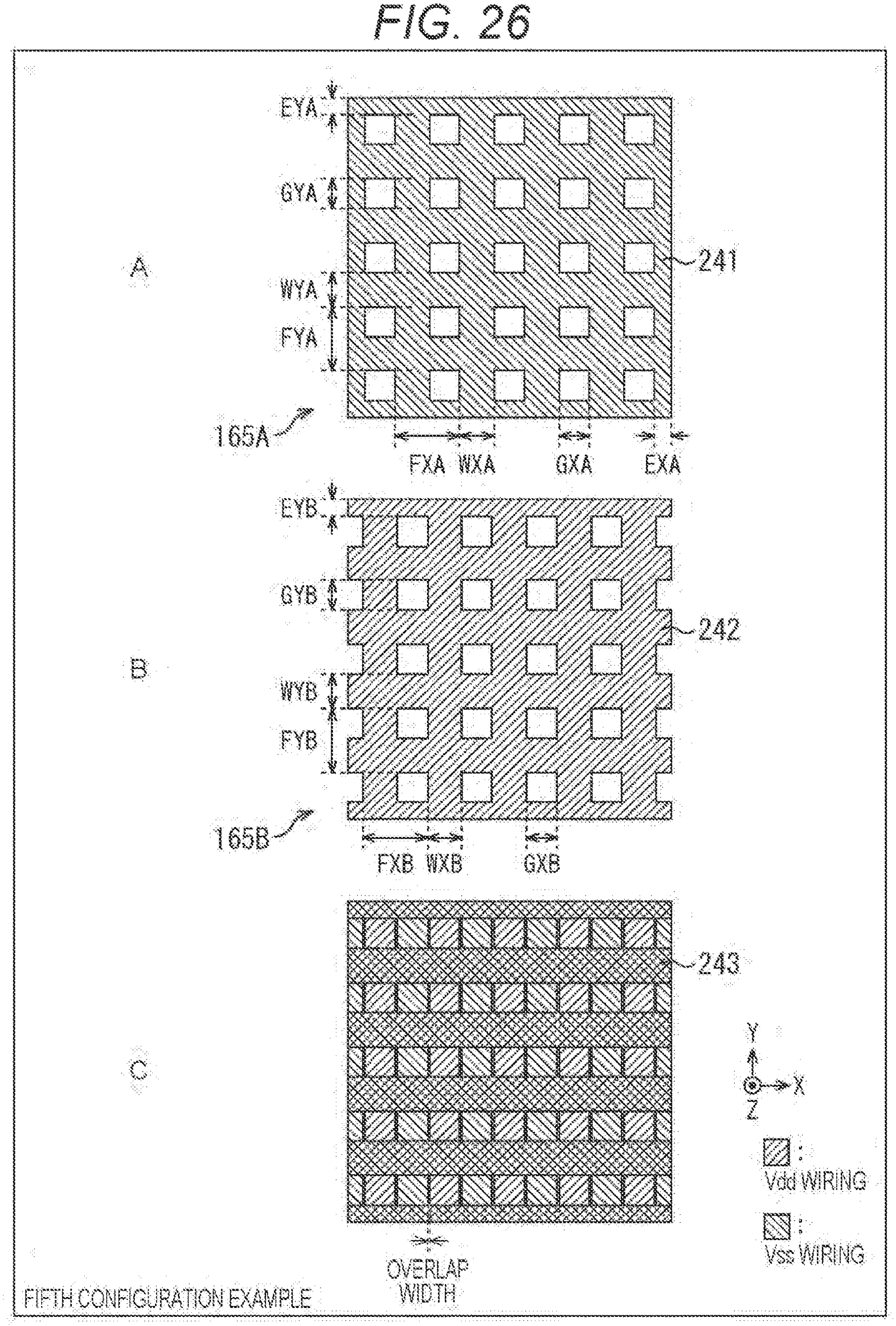
FIG. 26 is diagrams illustrating a fifth configuration example of the conductor layers A and B.

Next, FIG. 26 illustrates a fifth configuration example of the conductor layers A and B. Note that A in FIG. 26 illustrates the conductor layer A, and B in FIG. 26 illustrates the conductor layer B. In the coordinate system in FIG. 26, the horizontal direction is the X axis, the vertical direction is the Y axis, and the direction perpendicular to the XY plane is the Z axis.

The conductor layer A in the fifth configuration example is configured by a reticulated conductor 241. The reticulated conductor 241 is obtained by moving the reticulated conductor 231 forming the conductor layer A in the fourth configuration example (FIG. 25) in the Y direction by the conductor period FYA/2. The reticulated conductor 241 is, for example, wiring (Vss wiring) connected to the GND or the negative power supply.

The conductor layer B in the fifth configuration example is configured by a reticulated conductor 242. Since the reticulated conductor 242 has a similar shape to the reticulated conductor 232 forming the conductor layer B in the fourth configuration example (FIG. 25), the description thereof is omitted. The reticulated conductor 242 is, for example, wiring (Vdd wiring) connected to the positive power supply.

Note that the reticulated conductor 241 and the reticulated conductor 242 desirably satisfy the following relationship.

The conductor width *WXA*=the conductor width *WYA*=the conductor width *WXB*=the conductor width *WYB*

The gap width *GXA*=the gap width *GYA*=the gap width *GXB*=the gap width *GYB*

The end width *EXA*=the end width *EYB*

The conductor period *FXA*=the conductor period *FYA*=the conductor period *FXB*=the conductor period *FYB*

The conductor width *WYA*=2×the overlap width+the gap width *GYA*, the conductor width *WXA*=2×the overlap width+the gap width *GXA*

The conductor width *WYB*=2×the overlap width+the gap width *GYB*, the conductor width *WXB*=2×the overlap width+the gap width *GXB*

Here, the overlap width is a width of an overlapping portion where the conductor portions overlap in a case where the reticulated conductor 241 of the conductor layer A and the reticulated conductor 242 of the conductor layer B are arranged to overlap each other.

C in FIG. 26 illustrates a state of the conductor layers A and B respectively illustrated in A and B in FIG. 26, which are viewed from the photodiode 141 side (back surface side). Note that a hatched region 243 where diagonal lines intersect in C in FIG. 26 represents a region where the reticulated conductor 241 of the conductor layer A and the reticulated conductor 242 of the conductor layer B overlap. In the case of the fifth configuration example, since the active element group 167 is covered with at least one of the conductor layer A or the conductor layer B, the hot carrier light emission from the active element group 167 can be shielded.

Furthermore, in the case of the fifth configuration example, the region 243 where the reticulated conductor 241 and the reticulated conductor 242 overlap is continuous in the X direction. In the region 243 where the reticulated conductor 241 and the reticulated conductor 242 overlap, currents having polarities different from each other flow in the reticulated conductor 241 and the reticulated conductor 242, and thus magnetic fields generated from the region 243 cancel each other. Therefore, generation of the inductive noise near the region 243 can be suppressed.

In the fifth configuration example, in a case where the current flows similarly to the case illustrated in FIG. 23, the magnetic fluxes in the substantially X direction and the substantially Y direction are likely to be generated between the reticulated conductor 241 that is the Vss wiring and the reticulated conductor 242 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 241 and 242 in a cross section where the reticulated conductors 241 and 242 are arranged.

Sixth Configuration Example

Figure 27:
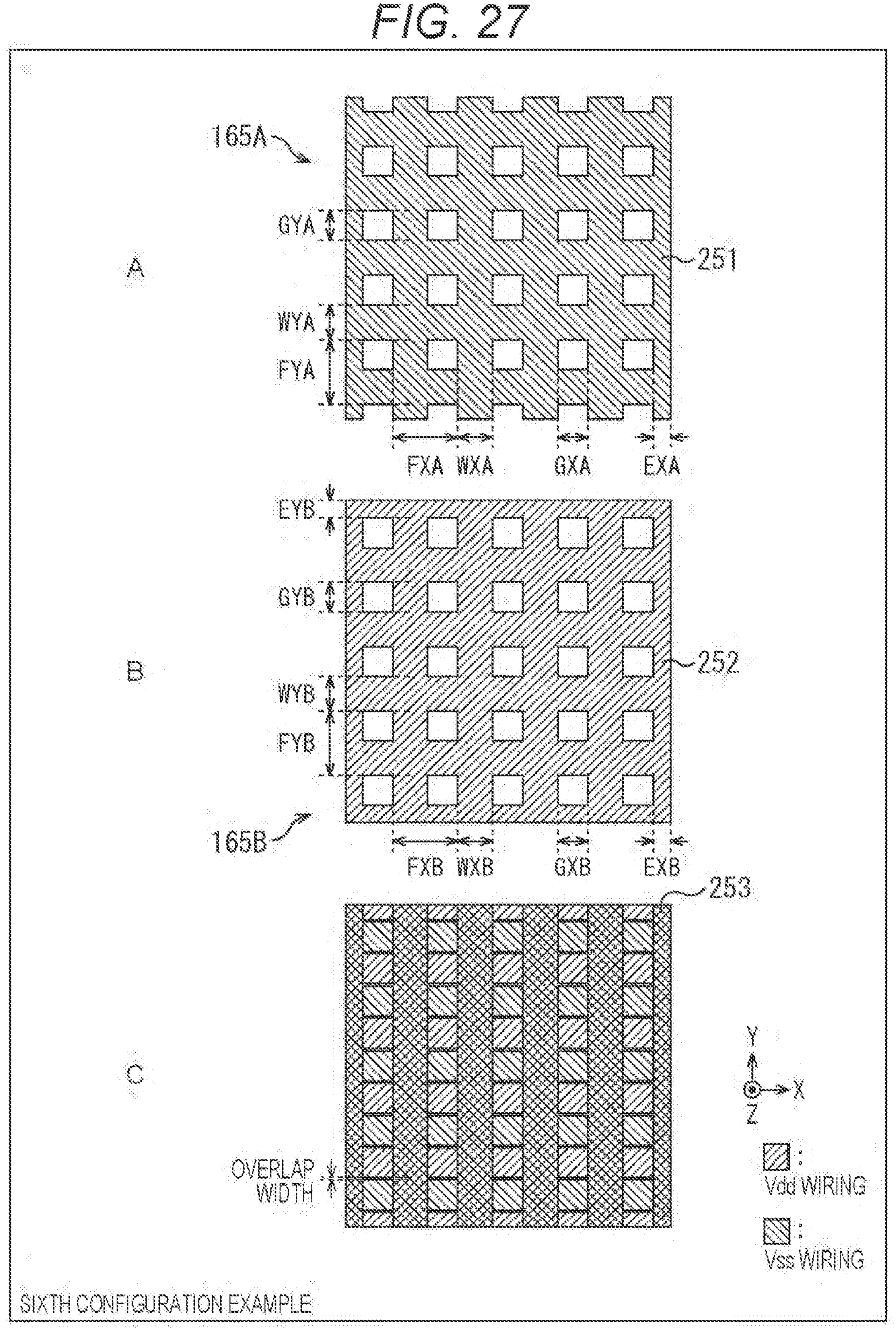
FIG. 27 is diagrams illustrating a sixth configuration example of the conductor layers A and B.

Next, FIG. 27 illustrates a sixth configuration example of the conductor layers A and B. Note that A in FIG. 27 illustrates the conductor layer A, and B in FIG. 27 illustrates the conductor layer B. In the coordinate system in FIG. 27, the horizontal direction is the X axis, the vertical direction is the Y axis, and the direction perpendicular to the XY plane is the Z axis.

The conductor layer A in the sixth configuration example is configured by a reticulated conductor 251. Since the reticulated conductor 251 has a similar shape to the reticulated conductor 231 forming the conductor layer A in the fourth configuration example (FIG. 25), the description thereof is omitted. The reticulated conductor 251 is, for example, wiring (Vss wiring) connected to the GND or the negative power supply.

The conductor layer B in the sixth configuration example is configured by a reticulated conductor 252. The reticulated conductor 252 is obtained by moving the reticulated conductor 232 forming the conductor layer B in the fourth configuration example (FIG. 25) in the X direction by the conductor period FXB/2. The reticulated conductor 252 is, for example, wiring (Vdd wiring) connected to the positive power supply.

Note that the reticulated conductor 251 and the reticulated conductor 252 desirably satisfy the following relationship.

The conductor width *WXA*=the conductor width *WYA*=the conductor width *WXB*=the conductor width *WYB*

The gap width *GXA*=the gap width *GYA*=the gap width *GXB*=the gap width *GYB*

The end width *EXA*=the end width *EYB*

The conductor period *FXA*=the conductor period *FYA*=the conductor period *FXB*=the conductor period *FYB*

The conductor width *WYA*=2×the overlap width+the gap width *GYA*, the conductor width *WXA*=2× the overlap width+the gap width *GXA*

The conductor width *WYB*=2×the overlap width+the gap width *GYB*, the conductor width *WXB*=2× the overlap width+the gap width *GXB*

Here, the overlap width is a width of an overlapping portion where the conductor portions overlap in a case where the reticulated conductor 251 of the conductor layer A and the reticulated conductor 252 of the conductor layer B are arranged to overlap each other.

C in FIG. 27 illustrates a state of the conductor layers A and B respectively illustrated in A and B in FIG. 27, which are viewed from the photodiode 141 side (back surface side). Note that a hatched region 253 in C in FIG. 27 where diagonal lines intersect represents a region where the reticulated conductor 251 of the conductor layer A and the reticulated conductor 252 of the conductor layer B overlap. In the case of the sixth configuration example, since the active element group 167 is covered with at least one of the conductor layer A or the conductor layer B, the hot carrier light emission from the active element group 167 can be shielded.

In the sixth configuration example, in a case where the current flows similarly to the case illustrated in FIG. 23, the magnetic fluxes in the substantially X direction and the substantially Y direction are likely to be generated between the reticulated conductor 251 that is the Vss wiring and the reticulated conductor 252 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 251 and 252 in a cross section where the reticulated conductors 251 and 252 are arranged.

Moreover, in the case of the sixth configuration example, the region 253 where the reticulated conductor 251 and the reticulated conductor 252 overlap is continuous in the Y direction. In the region 253 where the reticulated conductor 251 and the reticulated conductor 252 overlap, currents having polarities different from each other flow in the reticulated conductor 251 and the reticulated conductor 252, and thus magnetic fields generated from the region 253 cancel each other. Therefore, generation of the inductive noise near the region 253 can be suppressed.

Simulation Results of Fourth to Sixth Configuration Examples

Figure 28:
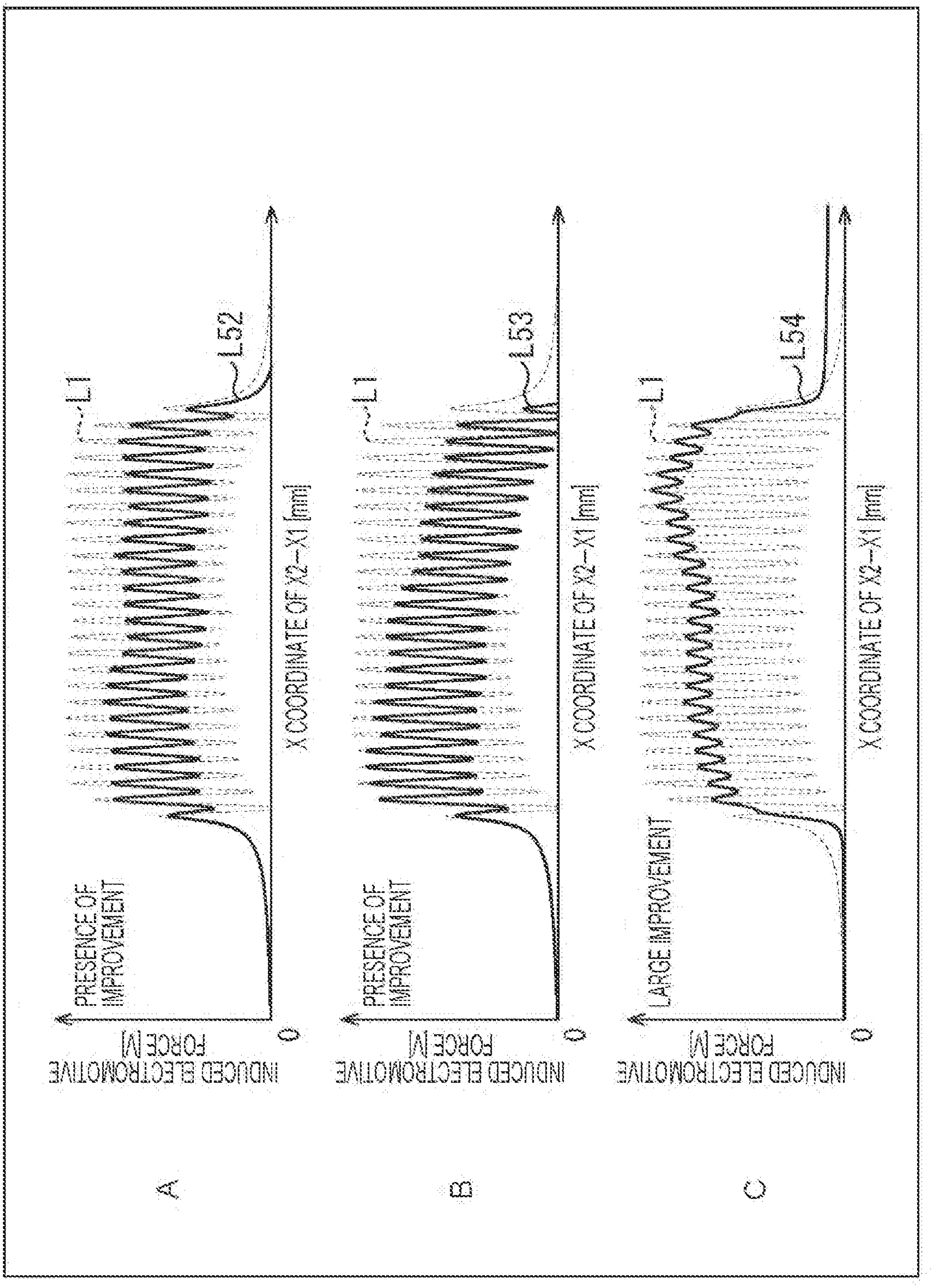
FIG. 28 is diagrams illustrating simulation results of inductive noise corresponding to the fourth to sixth configuration examples.

FIG. 28 illustrates changes in the induced electromotive force that causes the inductive noise in an image, as simulation results of cases where the fourth to sixth configuration examples (FIGS. 25 to 27) are applied to the solid-state imaging device 100. Note that the current conditions of the currents flowing in the fourth to sixth configuration examples are similar to that in the case illustrated in FIG. 23. The horizontal axis in FIG. 28 represents X-axis coordinates of the image, and the vertical axis represents the magnitude of the induced electromotive force.

The solid line L52 in A in FIG. 28 corresponds to the fourth configuration example (FIG. 25), and the dotted line L1 corresponds to the first comparative example (FIG. 9). As is clear from the comparison of the solid line L52 and the dotted line L1, it can be seen that the fourth configuration example can suppress the change in the induced electromotive force to be generated in the Victim conductor loop as compared with the first comparative example, and can suppress the inductive noise.

The solid line L53 in B in FIG. 28 corresponds to the fifth configuration example (FIG. 26), and the dotted line L1 corresponds to the first comparative example (FIG. 9). As is clear from the comparison of the solid line L53 and the dotted line L1, it can be seen that the fifth configuration example can suppress the change in the induced electromotive force to be generated in the Victim conductor loop as compared with the first comparative example, and can suppress the inductive noise.

The solid line L54 in C in FIG. 28 corresponds to the sixth configuration example (FIG. 27), and the dotted line L1 corresponds to the first comparative example (FIG. 9). As is clear from the comparison of the solid line L54 and the dotted line L1, it can be seen that the sixth configuration example can suppress the change in the induced electromotive force to be generated in the Victim conductor loop as compared with the first comparative example, and can suppress the inductive noise.

Furthermore, as is clear from the comparison of the solid lines L52 to L54, it can be seen that the sixth configuration example can further suppress the change in the induced electromotive force to be generated in the Victim conductor loop as compared with the fourth and fifth configuration examples, and can further suppress the inductive noise.

Seventh Configuration Example

Figure 29:
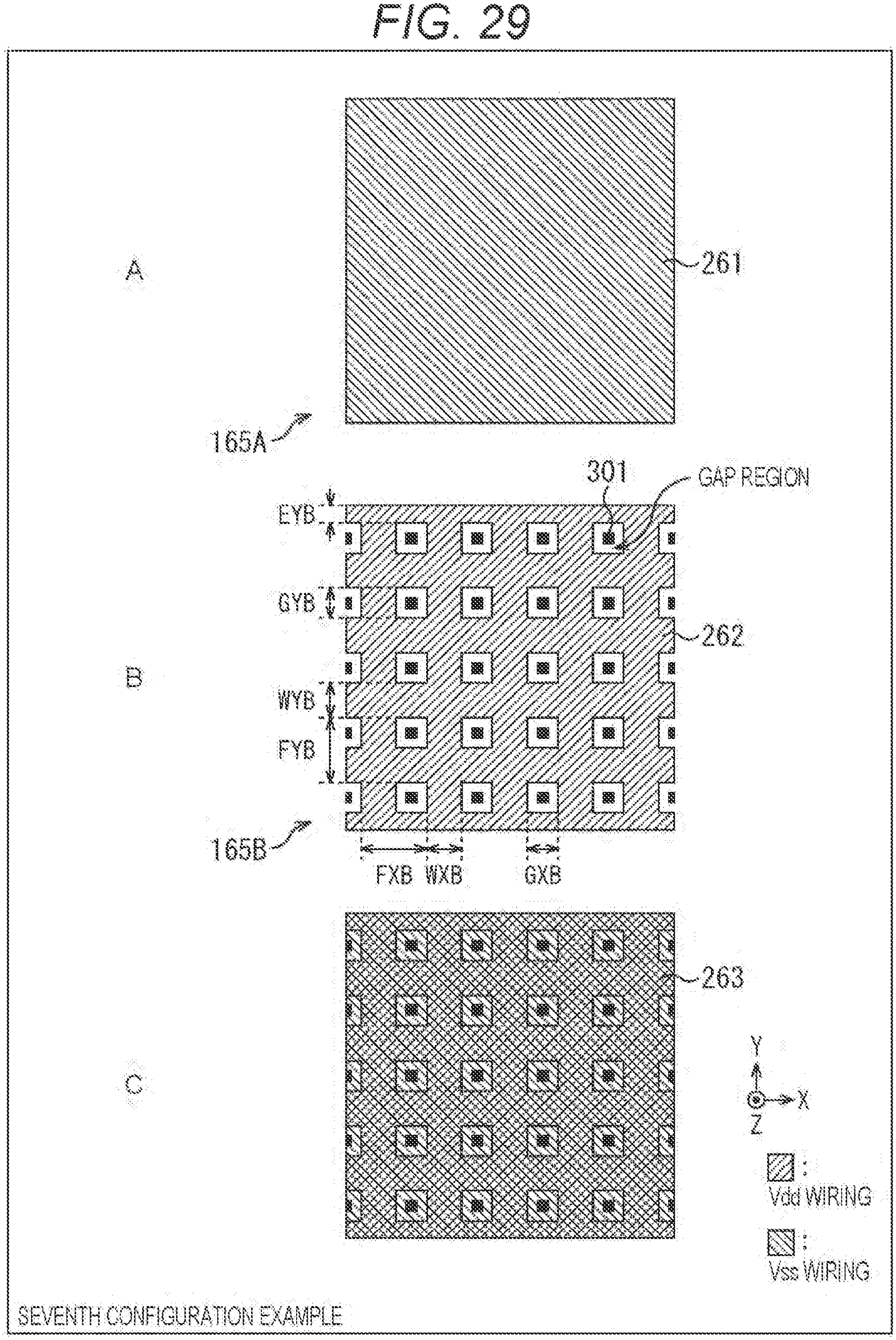
FIG. 29 is diagrams illustrating a seventh configuration example of the conductor layers A and B.

Next, FIG. 29 illustrates a seventh configuration example of the conductor layers A and B. Note that A in FIG. 29 illustrates the conductor layer A, and B in FIG. 29 illustrates the conductor layer B. In the coordinate system in FIG. 29, the horizontal direction is the X axis, the vertical direction is the Y axis, and the direction perpendicular to the XY plane is the Z axis.

The conductor layer A in the seventh configuration example is configured by a planar conductor 261. The planar conductor 261 is, for example, wiring (Vss wiring) connected to the GND or the negative power supply.

The conductor layer B in the seventh configuration example is configured by a reticulated conductor 262 and a relay conductor 301. Since the reticulated conductor 262 has a similar shape to the reticulated conductor 222 of the conductor layer B in the third configuration example (FIG. 22), the description thereof is omitted. The reticulated conductor 262 is, for example, wiring (Vdd wiring) connected to the positive power supply.

The relay conductor (another conductor) 301 is arranged in a gap region other than the conductor of the reticulated conductor 262 and is electrically insulated from the reticulated conductor 262, and is connected to Vss to which the planar conductor 261 of the conductor layer A is connected.

The shape of the relay conductor 301 is arbitrary, and a symmetric circular or polygonal shape such as rotational symmetry or mirror plane symmetry is desirable. The relay conductor 301 can be arranged in a center of or at any other position of the gap region of the reticulated conductor 262. The relay conductor 301 may be connected to a conductor layer as Vss wiring different from the conductor layer A. The relay conductor 301 may be connected to a conductor layer as Vss wiring closer to the active element group 167 than the conductor layer B. The relay conductor 301 can be connected to a conductor layer different from the conductor layer A or a conductor layer or the like closer to the active element group 167 than the conductor layer B via the conductor via (VIA) extending in the Z direction.

C in FIG. 29 illustrates a state of the conductor layers A and B respectively illustrated in A and B in FIG. 29, which are viewed from the photodiode 141 side (back surface side). Note that a hatched region 263 in C in FIG. 29 where diagonal lines intersect represents a region where the planar conductor 261 of the conductor layer A and the reticulated conductor 262 of the conductor layer B overlap. In the case of the seventh configuration example, since the active element group 167 is covered with at least one of the conductor layer A or the conductor layer B, the hot carrier light emission from the active element group 167 can be shielded.

Furthermore, in the case of the seventh configuration example, by providing the relay conductor 301, the planar conductor 261 as Vss wiring can be connected with the active element group 167 at substantially the shortest distance or a short distance. By connecting the planar conductor 261 and the active element group 167 at substantially the shortest distance or a short distance, the voltage drop, energy loss, or inductive noise between the planar conductor 261 and the active element group 167 can be reduced.

Figure 30:
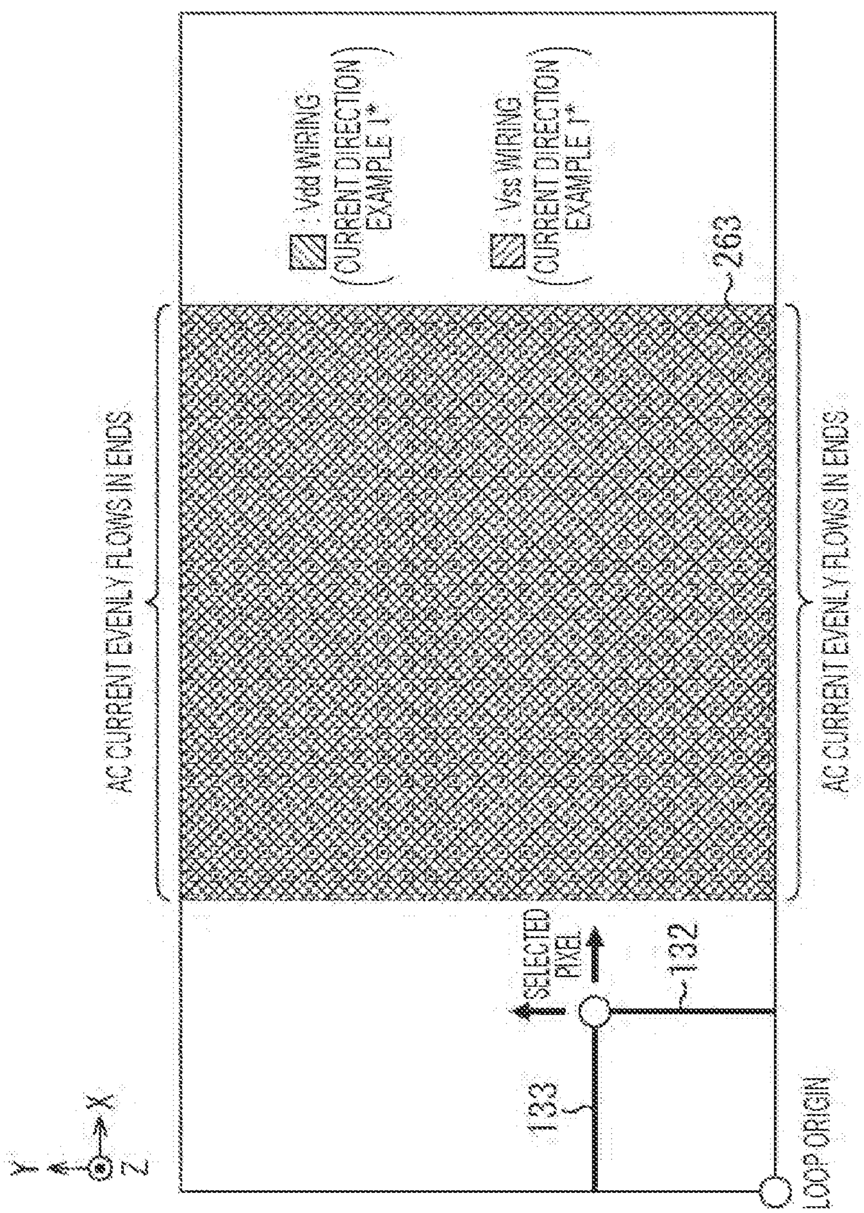
FIG. 30 is a diagram illustrating a current condition of a current flowing in the seventh configuration example.

FIG. 30 is a diagram illustrating the current condition of the current flowing in the seventh configuration example (FIG. 29).

It is assumed that AC current evenly flows in ends of the planar conductor 261 constituting the conductor layer A and the reticulated conductor 262 constituting the conductor layer B. However, the current direction changes with time. For example, when the current flows through the reticulated conductor 262 that is the Vdd wiring from the upper side to the lower side of the drawing, the current flows through the planar conductor 261 that is the Vss wiring from the lower side to the upper side of the drawing.

In the seventh configuration example, in a case where the current flows as illustrated in FIG. 30, the magnetic fluxes in the substantially X direction and the substantially Y direction are likely to be generated between the planar conductor 261 that is the Vss wiring and the reticulated conductor 262 that is the Vdd wiring by the conductor loop with the loop plane approximately perpendicular to the X axis and the conductor loop with the loop plane approximately perpendicular to the Y axis, the conductor loops being generated including (cross sections of) the planar conductor 261 and the reticulated conductor 262 in a cross section where the planar conductor 261 and the reticulated conductor 262 are arranged.

Meanwhile, the Victim conductor loop formed using the signal line 132 and the control line 133 is formed in the XY plane in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the seventh configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figure 31:
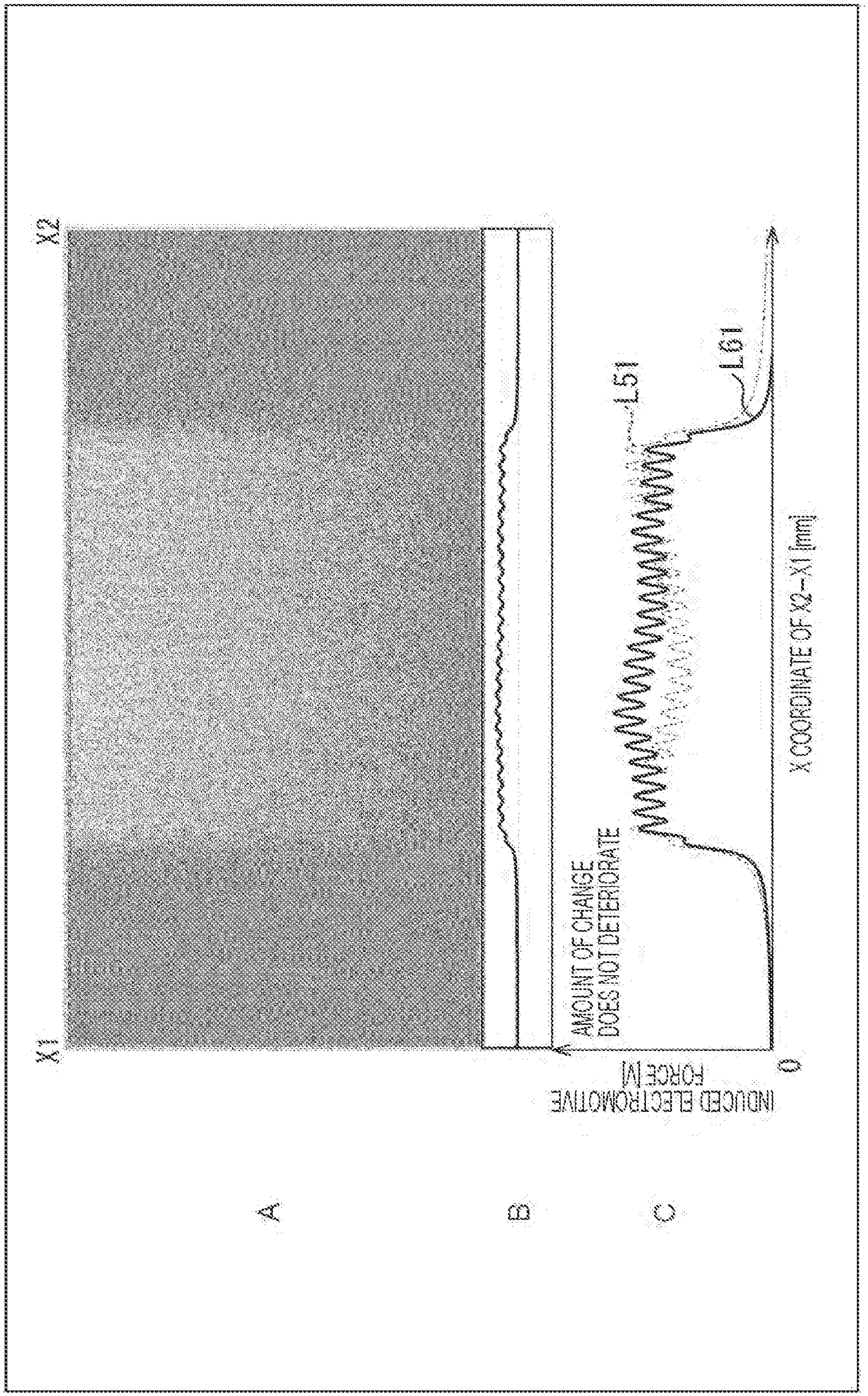
FIG. 31 is diagrams illustrating a simulation result of inductive noise corresponding to the seventh configuration example.

FIG. 31 illustrates a simulation result of the inductive noise generated in the case where the seventh configuration example (FIG. 29) is applied to the solid-state imaging device 100.

A in FIG. 31 illustrates an image in which the inductive noise can be generated, the image being output from the solid-state imaging device 100. B in FIG. 31 illustrates a change in a pixel signal in the line segment X1-X2 of the image illustrated in A in FIG. 31. C in FIG. 31 illustrates the solid line L61 representing induced electromotive force that generates the inductive noise in the image. The horizontal axis of C in FIG. 31 represents X-axis coordinates of the image, and the vertical axis represents the magnitude of the induced electromotive force. Note that the dotted line L51 in C in FIG. 31 corresponds to the third configuration example (FIG. 22).

As is clear from the comparison between the solid line L61 and the dotted line L51 illustrated in C in FIG. 31, it can be seen that the seventh configuration example does not deteriorate the change in the induced electromotive force to be generated in the Victim conductor loop as compared with the third configuration example. That is, even the seventh configuration example in which the relay conductor 301 is arranged in the gap of the reticulated conductor 262 of the conductor layer B can suppress the generation of the inductive noise in the image output from the solid-state imaging device 100 to the same extent as the third configuration example. Note that this simulation result is a simulation result of a case where the planar conductor 261 is not connected to the active element group 167 and the reticulated conductor 262 is not connected to the active element group 167. For example, in a case where at least a part of the planar conductor 261 and a part of the active element group 167 are connected via a conductor via or the like at substantially the shortest distance or a short distance, or in a case where at least a part of the reticulated conductor 262 and a part of the active element group 167 are connected via a conductor via or the like at substantially the shortest distance or a short distance, the amount of current flowing through the planar conductor 261 and the reticulated conductor 262 gradually decreases depending on the position. In such a case, there is also a condition that the voltage drop, energy loss, and inductive noise are significantly improved to less than half by providing the relay conductor 301.

Eighth Configuration Example

Figure 32:
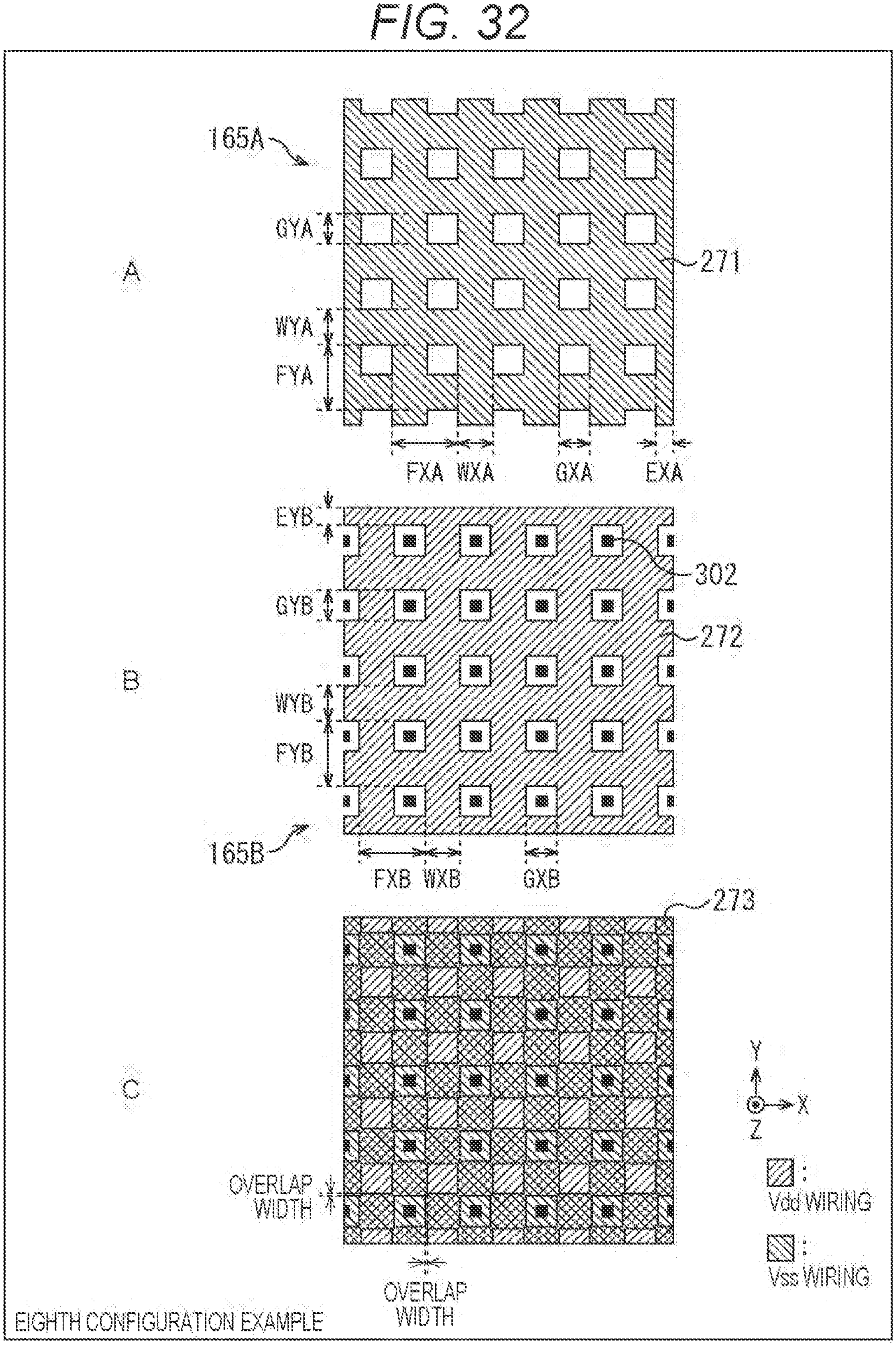
FIG. 32 is diagrams illustrating an eighth configuration example of the conductor layers A and B.

Next, FIG. 32 illustrates an eighth configuration example of the conductor layers A and B. Note that A in FIG. 32 illustrates the conductor layer A, and B in FIG. 32 illustrates the conductor layer B. In the coordinate system in FIG. 32, the horizontal direction is the X axis, the vertical direction is the Y axis, and the direction perpendicular to the XY plane is the Z axis.

The conductor layer A in the eighth configuration example is configured by a reticulated conductor 271. Since the reticulated conductor 271 has a similar shape to the reticulated conductor 231 of the conductor layer A in the fourth configuration example (FIG. 25), the description thereof is omitted. The reticulated conductor 271 is, for example, wiring (Vss wiring) connected to the GND or the negative power supply.

The conductor layer B in the eighth configuration example is configured by a reticulated conductor 272 and a relay conductor 302. Since the reticulated conductor 272 has a similar shape to the reticulated conductor 232 of the conductor layer B in the fourth configuration example (FIG. 25), the description thereof is omitted. The reticulated conductor 232 is, for example, wiring (Vdd wiring) connected to the positive power supply.

The relay conductor (another conductor) 302 is arranged in a gap region other than the conductor of the reticulated conductor 272 and is electrically insulated from the reticulated conductor 272, and is connected to Vss to which the reticulated conductor 271 of the conductor layer A is connected.

Note that the shape of the relay conductor 302 is arbitrary, and a symmetric circular or polygonal shape such as rotational symmetry or mirror plane symmetry is desirable. The relay conductor 302 can be arranged in a center of or at any other position of the gap region of the reticulated conductor 272. The relay conductor 302 may be connected to a conductor layer as Vss wiring different from the conductor layer A. The relay conductor 302 may be connected to a conductor layer as Vss wiring closer to the active element group 167 than the conductor layer B. The relay conductor 302 can be connected to a conductor layer different from the conductor layer A or to a conductor layer or the like closer to the active element group 167 than the conductor layer B via the conductor via (VIA) extending in the Z direction.

C in FIG. 32 illustrates a state of the conductor layers A and B respectively illustrated in A and B in FIG. 32, which are viewed from the photodiode 141 side (back surface side). Note that a hatched region 273 where diagonal lines intersect in C in FIG. 32 represents a region where the reticulated conductor 271 of the conductor layer A and the reticulated conductor 272 of the conductor layer B overlap. In the case of the eighth configuration example, since the active element group 167 is covered with at least one of the conductor layer A or the conductor layer B, the hot carrier light emission from the active element group 167 can be shielded.

In the eighth configuration example, in a case where the current flows similarly to the case illustrated in FIG. 30, the magnetic fluxes in the substantially X direction and the substantially Y direction are likely to be generated between the reticulated conductor 271 that is the Vss wiring and the reticulated conductor 272 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 271 and 272 in a cross section where the reticulated conductors 271 and 272 are arranged.

Furthermore, in the case of the eighth configuration example, by providing the relay conductor 302, the reticulated conductor 271 as Vss wiring can be connected with the active element group 167 at substantially the shortest distance or a short distance. By connecting the reticulated conductor 271 and the active element group 167 at substantially the shortest distance or a short distance, the voltage drop, energy loss, or inductive noise between the reticulated conductor 271 and the active element group 167 can be reduced.

Ninth Configuration Example

Figure 33:
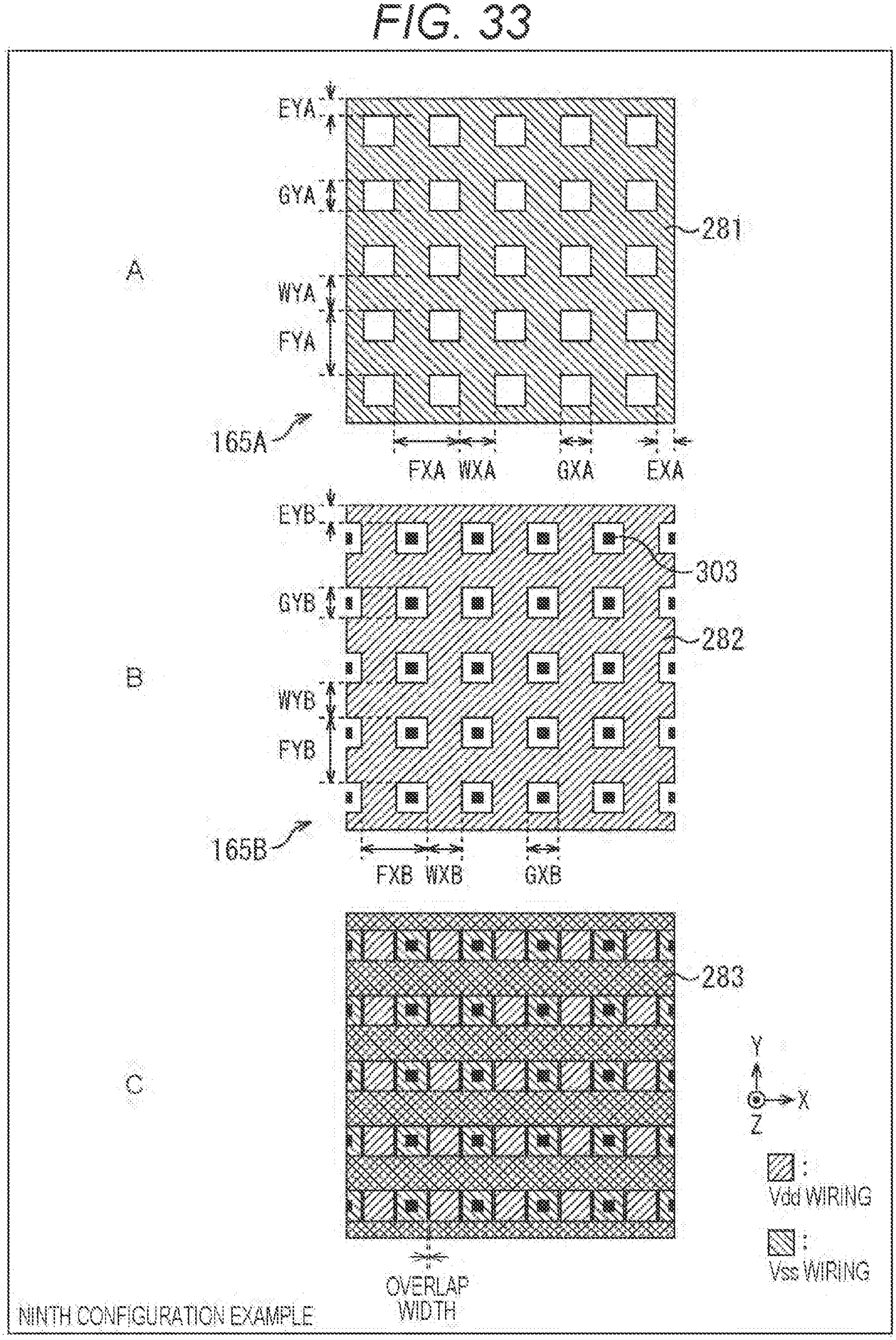
FIG. 33 is diagrams illustrating a ninth configuration example of the conductor layers A and B.

Next, FIG. 33 illustrates a ninth configuration example of the conductor layers A and B. Note that A in FIG. 33 illustrates the conductor layer A, and B in FIG. 33 illustrates the conductor layer B. In the coordinate system in FIG. 33, the horizontal direction is the X axis, the vertical direction is the Y axis, and the direction perpendicular to the XY plane is the Z axis.

The conductor layer A in the ninth configuration example is configured by a reticulated conductor 281. Since the reticulated conductor 281 has a similar shape to the reticulated conductor 241 of the conductor layer A in the fifth configuration example (FIG. 26), the description thereof is omitted. The reticulated conductor 281 is, for example, wiring (Vss wiring) connected to the GND or the negative power supply.

The conductor layer B in the ninth configuration example is configured by a reticulated conductor 282 and a relay conductor 303. Since the reticulated conductor 282 has a similar shape to the reticulated conductor 242 of the conductor layer B in the fifth configuration example (FIG. 26), the description thereof is omitted. The reticulated conductor 282 is, for example, wiring (Vdd wiring) connected to the positive power supply.

The relay conductor (another conductor) 303 is arranged in a gap region other than the conductor of the reticulated conductor 282 and is electrically insulated from the reticulated conductor 282, and is connected to Vss to which the reticulated conductor 281 of the conductor layer A is connected Note that the shape of the relay conductor 303 is arbitrary, and a symmetric circular or polygonal shape such as rotational symmetry or mirror plane symmetry is desirable. The relay conductor 303 can be arranged in a center of or at any other position of the gap region of the reticulated conductor 282. The relay conductor 303 may be connected to a conductor layer as Vss wiring different from the conductor layer A. The relay conductor 303 may be connected to a conductor layer as Vss wiring closer to the active element group 167 than the conductor layer B. The relay conductor 303 can be connected to a conductor layer different from the conductor layer A or to a conductor layer or the like closer to the active element group 167 than the conductor layer B via the conductor via (VIA) extending in the Z direction.

C in FIG. 33 illustrates a state of the conductor layers A and B respectively illustrated in A and B in FIG. 33, which are viewed from the photodiode 141 side (back surface side). Note that a hatched region 283 in C in FIG. 33 where diagonal lines intersect represents a region where the reticulated conductor 281 of the conductor layer A and the reticulated conductor 282 of the conductor layer B overlap. In the case of the ninth configuration example, since the active element group 167 is covered with at least one of the conductor layer A or the conductor layer B, the hot carrier light emission from the active element group 167 can be shielded.

In the ninth configuration example, in a case where the current flows similarly to the case illustrated in FIG. 30, the magnetic fluxes in the substantially X direction and the substantially Y direction are likely to be generated between the reticulated conductor 281 that is the Vss wiring and the reticulated conductor 282 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 281 and 282 in a cross section where the reticulated conductors 281 and 282 are arranged.

Furthermore, in the case of the ninth configuration example, by providing the relay conductor 303, the reticulated conductor 281 as Vss wiring can be connected with the active element group 167 at substantially the shortest distance or a short distance. By connecting the reticulated conductor 281 and the active element group 167 at substantially the shortest distance or a short distance, the voltage drop, energy loss, or inductive noise between the reticulated conductor 281 and the active element group 167 can be reduced.

Tenth Configuration Example

Figure 34:
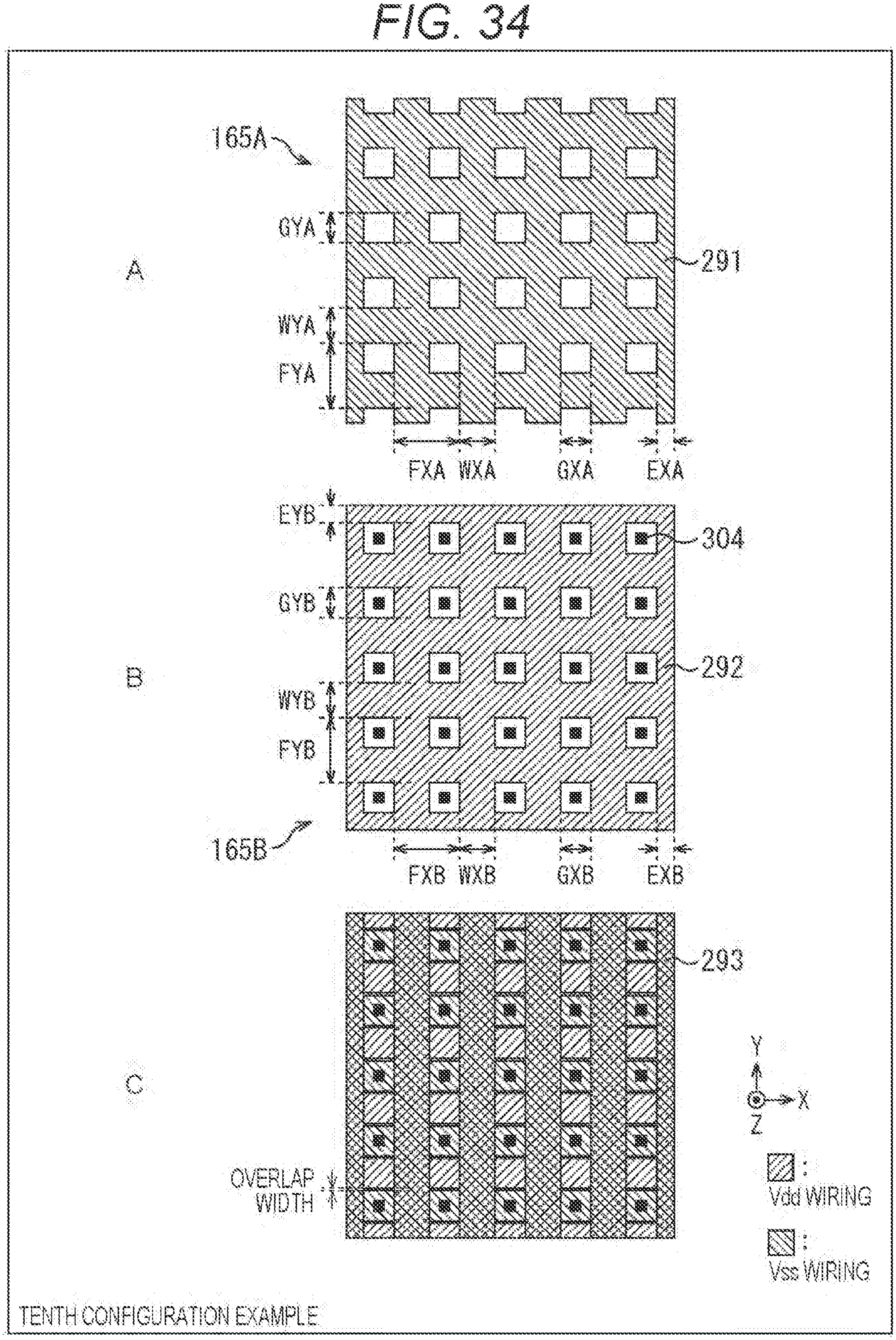
FIG. 34 is diagrams illustrating a tenth configuration example of the conductor layers A and B.

Next, FIG. 34 illustrates a tenth configuration example of the conductor layers A and B. Note that A in FIG. 34 illustrates the conductor layer A, and B in FIG. 34 illustrates the conductor layer B. In the coordinate system in FIG. 34, the horizontal direction is the X axis, the vertical direction is the Y axis, and the direction perpendicular to the XY plane is the Z axis.

The conductor layer A in the tenth configuration example is configured by a reticulated conductor 291. Since the reticulated conductor 291 has a similar shape to the reticulated conductor 251 of the conductor layer A in the sixth configuration example (FIG. 27), the description thereof is omitted. The reticulated conductor 291 is, for example, wiring (Vss wiring) connected to the GND or the negative power supply.

The conductor layer B in the tenth configuration example is configured by a reticulated conductor 292 and a relay conductor 304. Since the reticulated conductor 292 has a similar shape to the reticulated conductor 252 of the conductor layer B in the sixth configuration example (FIG. 27), the description thereof is omitted. The reticulated conductor 292 is, for example, wiring (Vdd wiring) connected to the positive power supply.

The relay conductor (another conductor) 304 is arranged in a gap region other than the conductor of the reticulated conductor 292 and is electrically insulated from the reticulated conductor 292, and is connected to Vss to which the reticulated conductor 291 of the conductor layer A is connected Note that the shape of the relay conductor 304 is arbitrary, and a symmetric circular or polygonal shape such as rotational symmetry or mirror plane symmetry is desirable. The relay conductor 304 can be arranged in a center of or at any other position of the gap region of the reticulated conductor 292. The relay conductor 304 may be connected to a conductor layer as Vss wiring different from the conductor layer A. The relay conductor 304 may be connected to a conductor layer as Vss wiring closer to the active element group 167 than the conductor layer B. The relay conductor 304 can be connected to a conductor layer different from the conductor layer A or to a conductor layer or the like closer to the active element group 167 than the conductor layer B via the conductor via (VIA) extending in the Z direction.

C in FIG. 34 illustrates a state of the conductor layers A and B respectively illustrated in A and B in FIG. 34, which are viewed from the photodiode 141 side (back surface side). Note that a hatched region 293 where diagonal lines intersect in C in FIG. 34 represents a region where the reticulated conductor 291 of the conductor layer A and the reticulated conductor 292 of the conductor layer B overlap. In the case of the tenth configuration example, since the active element group 167 is covered with at least one of the conductor layer A or the conductor layer B, the hot carrier light emission from the active element group 167 can be shielded.

In the tenth configuration example, in a case where the current flows similarly to the case illustrated in FIG. 30, the magnetic fluxes in the substantially X direction and the substantially Y direction are likely to be generated between the reticulated conductor 291 that is the Vss wiring and the reticulated conductor 292 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 291 and 292 in a cross section where the reticulated conductors 291 and 292 are arranged.

Furthermore, in the case of the tenth configuration example, by providing the relay conductor 304, the reticulated conductor 291 as Vss wiring can be connected with the active element group 167 at substantially the shortest distance or a short distance. By connecting the reticulated conductor 291 and the active element group 167 at substantially the shortest distance or a short distance, the voltage drop, energy loss, or inductive noise between the reticulated conductor 291 and the active element group 167 can be reduced.

Simulation Results of Eighth to Tenth Configuration Examples

Figure 35:
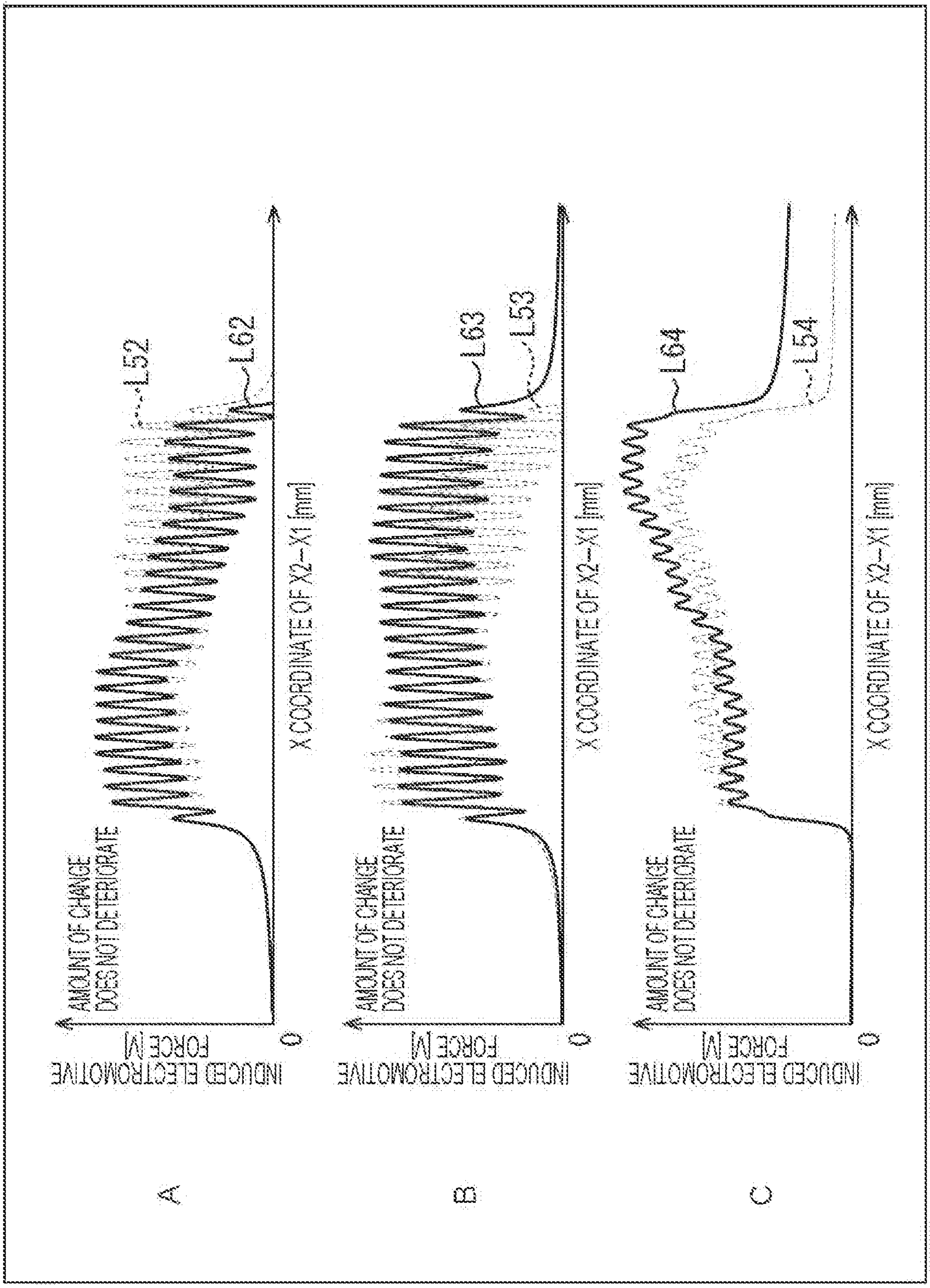
FIG. 35 is diagrams illustrating simulation results of inductive noise corresponding to the eighth to tenth configuration examples.

FIG. 35 illustrates changes in the induced electromotive force that causes the inductive noise in an image, as simulation results of cases where the eighth to tenth configuration examples (FIGS. 32 to 34) are applied to the solid-state imaging device 100. Note that the current conditions of the currents flowing in the eighth to tenth configuration examples are similar to that in the case illustrated in FIG. 30. The horizontal axis in FIG. 35 represents X-axis coordinates of the image, and the vertical axis represents the magnitude of the induced electromotive force.

The solid line L62 in A in FIG. 35 corresponds to the eighth configuration example (FIG. 32), and the dotted line L52 corresponds to the fourth configuration example (FIG. 25). As is clear from the comparison between the solid line L62 and the dotted line L52, it can be seen that the eighth configuration example does not deteriorate the change in the induced electromotive force to be generated in the Victim conductor loop as compared with the fourth configuration example. That is, even the eighth configuration example in which the relay conductor 302 is arranged in the gap of the reticulated conductor 272 of the conductor layer B can suppress the generation of the inductive noise in the image output from the solid-state imaging device 100 to the same extent as the fourth configuration example. Note that this simulation result is a simulation result of a case where the reticulated conductor 271 is not connected to the active element group 167 and the reticulated conductor 272 is not connected to the active element group 167. For example, in a case where at least a part of the reticulated conductor 271 and a part of the active element group 167 are connected via a conductor via or the like at substantially the shortest distance or a short distance, or in a case where at least a part of the reticulated conductor 272 and a part of the active element group 167 are connected via a conductor via or the like at substantially the shortest distance or a short distance, the amount of current flowing through the reticulated conductor 271 and the reticulated conductor 272 gradually decreases depending on the position. In such a case, there is also a condition that the voltage drop, energy loss, and inductive noise are significantly improved to less than half by providing the relay conductor 302.

The solid line L63 in B in FIG. 35 corresponds to the ninth configuration example (FIG. 33), and the dotted line L53 corresponds to the fifth configuration example (FIG. 26). As is clear from the comparison between the solid line L63 and the dotted line L53, it can be seen that the ninth configuration example does not deteriorate the change in the induced electromotive force to be generated in the Victim conductor loop as compared with the fifth configuration example. That is, even the ninth configuration example in which the relay conductor 303 is arranged in the gap of the reticulated conductor 282 of the conductor layer B can suppress the generation of the inductive noise in the image output from the solid-state imaging device 100 to the same extent as the fifth configuration example. Note that this simulation result is a simulation result of a case where the reticulated conductor 281 is not connected to the active element group 167 and the reticulated conductor 282 is not connected to the active element group 167. For example, in a case where at least a part of the reticulated conductor 281 and a part of the active element group 167 are connected via a conductor via or the like at the at substantially the shortest distance shortest distance or a short distance, or in a case where at least a part of the reticulated conductor 282 and a part of the active element group 167 are connected via a conductor via or the like at substantially the shortest distance or a short distance, the amount of current flowing through the reticulated conductor 281 and the reticulated conductor 282 gradually decreases depending on the position. In such a case, there is also a condition that the voltage drop, energy loss, and inductive noise are significantly improved to less than half by providing the relay conductor 303.

The solid line L64 in C in FIG. 35 corresponds to the tenth configuration example (FIG. 34), and the dotted line L54 corresponds to the sixth configuration example (FIG. 27). As is clear from the comparison between the solid line L64 and the dotted line L54, it can be seen that the tenth configuration example does not deteriorate the change in the induced electromotive force to be generated in the Victim conductor loop as compared with the sixth configuration example. That is, even the tenth configuration example in which the relay conductor 304 is arranged in the gap of the reticulated conductor 292 of the conductor layer B can suppress the generation of the inductive noise in the image output from the solid-state imaging device 100 to the same extent as the sixth configuration example. Note that this simulation result is a simulation result of a case where the reticulated conductor 291 is not connected to the active element group 167 and the reticulated conductor 292 is not connected to the active element group 167. For example, in a case where at least a part of the reticulated conductor 291 and a part of the active element group 167 are connected via a conductor via or the like at substantially the shortest distance or a short distance, or in a case where at least a part of the reticulated conductor 292 and a part of the active element group 167 are connected via a conductor via or the like at substantially the shortest distance or a short distance, the amount of current flowing through the reticulated conductor 291 and the reticulated conductor 292 gradually decreases depending on the position. In such a case, there is also a condition that the voltage drop, energy loss, and inductive noise are significantly improved to less than half by providing the relay conductor 304.

Furthermore, as is clear from the comparison of the solid lines L62 to L64, it can be seen that the tenth configuration example can further suppress the change in the induced electromotive force to be generated in the Victim conductor loop as compared with the eighth and ninth configuration examples, and can further suppress the inductive noise.

Eleventh Configuration Example

Figure 36:
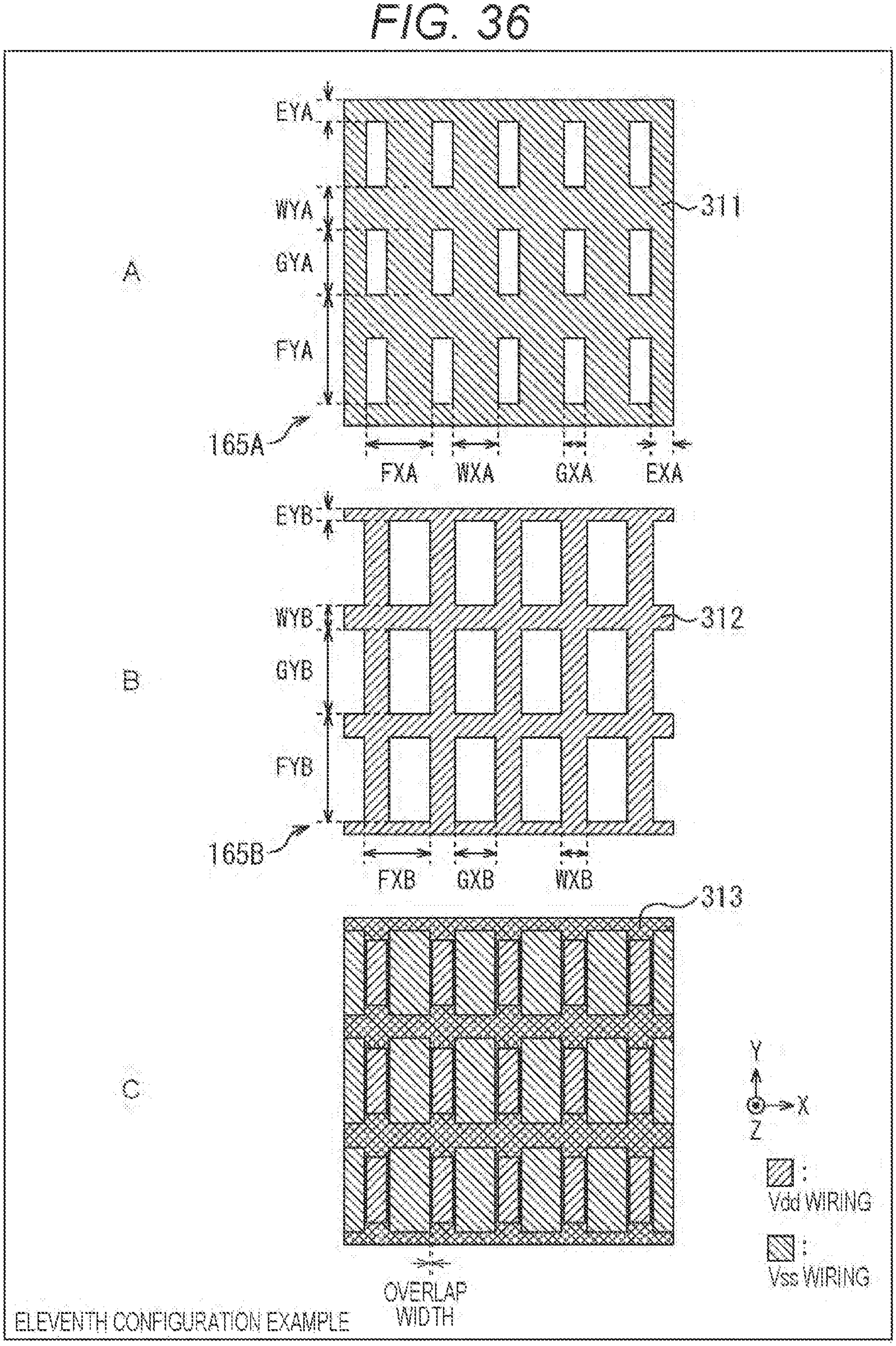
FIG. 36 is diagrams illustrating an eleventh configuration example of the conductor layers A and B.

Next, FIG. 36 illustrates an eleventh configuration example of the conductor layers A and B. Note that A in FIG. 36 illustrates the conductor layer A, and B in FIG. 36 illustrates the conductor layer B. In the coordinate system in FIG. 36, the horizontal direction is the X axis, the vertical direction is the Y axis, and the direction perpendicular to the XY plane is the Z axis.

The conductor layer A in the eleventh configuration example is configured by a reticulated conductor 311 having a resistance value in the X direction (first direction) and a resistance value in the Y direction (second direction) that are different from each other. The reticulated conductor 311 is, for example, wiring (Vss wiring) connected to the GND or the negative power supply.

The conductor width in the X direction of the reticulated conductor 311 is WXA, the gap width is GXA, the conductor period is FXA (=the conductor width WXA+the gap width GXA), and an end width is EXA (=the conductor width WXA/2). Furthermore, the conductor width in the Y direction of the reticulated conductor 311 is WYA, the gap width is GYA, the conductor period is FYA (=the conductor width WYA+the gap width GYA), and the end width is EYA (=the conductor width WYA/2). In the reticulated conductor 311, the gap width GYA>the gap width GXA is satisfied. Therefore, the gap region of the reticulated conductor 311 has a shape longer in the Y direction than in the X direction, the resistance values differ between the X direction and the Y direction, and the resistance value in the Y direction is smaller than the resistance value in the X direction.

The conductor layer B in the eleventh configuration example is configured by a reticulated conductor 312 having a resistance value in the X direction and a resistance value in the Y direction that are different from each other. The reticulated conductor 312 is, for example, wiring (Vdd wiring) connected to the positive power supply.

The conductor width in the X direction of the reticulated conductor 312 is WXB, the gap width is GXB, and the conductor period is FXB (=the conductor width WXB+the gap width GXB). Furthermore, the conductor width in the Y direction of the reticulated conductor 312 is WYB, the gap width is GYB, the conductor period is FYB (=the conductor width WYB+the gap width GYB), and the end width is EYB (=the conductor width WYB/2). In the reticulated conductor 312, the gap width GYB>the gap width GXB is satisfied. Therefore, the gap region of the reticulated conductor 312 has a shape longer in the Y direction than in the X direction, the resistance values differ between the X direction and the Y direction, and the resistance value in the Y direction is smaller than the resistance value in the X direction.

Note that, in a case where a sheet resistance value of the reticulated conductor 311 is larger than a sheet resistance value of the reticulated conductor 312, the reticulated conductor 311 and the reticulated conductor 312 desirably satisfy the following relationships.

The conductor width $WYA \geq$ the conductor width $WYB$

The conductor width $WXA \geq$ the conductor width $WXB$

The gap width $GXA \leq$ the gap width $GXB$

The gap width $GYA \leq$ the gap width $GYB$

On the contrary, in a case where the sheet resistance value of the reticulated conductor 311 is smaller than the sheet resistance value of the reticulated conductor 312, the reticulated conductor 311 and the reticulated conductor 312 desirably satisfy the following relationships.

The conductor width $WYA \leq$ the conductor width $WYB$

The conductor width $WXA \leq$ the conductor width $WXB$

The gap width $GXA \geq$ the gap width $GXB$

The gap width $GYA \geq$ the gap width $GYB$

Moreover, the sheet resistance values and the conductor widths of the reticulated conductors 311 and 312 desirably satisfy the following relationships.

(The sheet resistance value of the reticulated conductor 311)/(the sheet resistance value of the reticulated conductor 312)

≈the conductor width $WYA$/the conductor width $WYB$ (The sheet resistance value of the reticulated conductor 311)/(the sheet resistance value of the reticulated conductor 312)

≈the conductor width $WXA$/the conductor width $WXB$

The limitations regarding the dimensional relationship disclosed in the present specification are not essential, and the current distribution of the reticulated conductor 311 and the current distribution of the reticulated conductor 312 are desirably substantially uniform, substantially the same, or substantially similar, and have opposite characteristics.

For example, it is desirable that a ratio of the wiring resistance in the X direction of the reticulated conductor 311 and the wiring resistance in the Y direction of the reticulated conductor 311, and a ratio of the wiring resistance in the X direction of the reticulated conductor 312 and the wiring resistance in the Y direction of the reticulated conductor 312 be substantially the same.

Furthermore, it is desirable that a ratio of wiring inductance in the X direction of the reticulated conductor 311 and wiring inductance in the Y direction of the reticulated conductor 311, and a ratio of wiring inductance in the X direction of the reticulated conductor 312 and wiring inductance in the Y direction of the reticulated conductor 312 be substantially the same.

Furthermore, it is desirable that a ratio of wiring capacitance in the X direction of the reticulated conductor 311 and wiring capacitance in the Y direction of the reticulated conductor 311, and a ratio of wiring capacitance in the X direction of the reticulated conductor 312 and wiring capacitance in the Y direction of the reticulated conductor 312 be substantially the same.

Furthermore, it is desirable that a ratio of wiring impedance in the X direction of the reticulated conductor 311 and wiring impedance in the Y direction of the reticulated conductor 311, and a ratio of wiring impedance in the X direction of the reticulated conductor 312 and wiring impedance in the Y direction of the reticulated conductor 312 be substantially the same.

In other words, it is desirable but is not essential to satisfy any of the following relationships:

(the wiring resistance in the $X$ direction of the reticulated conductor 311×the wiring resistance in the $Y$ direction of the reticulated conductor 312)≈(the wiring resistance in the $X$ direction of the reticulated conductor 312×the wiring resistance in the $Y$ direction of the reticulated conductor 311);

(the wiring inductance in the $X$ direction of the reticulated conductor 311×the wiring inductance in the $Y$ direction of the reticulated conductor 312)≈(the wiring inductance in the $X$ direction of the reticulated conductor 312×the wiring inductance in the $Y$ direction of the reticulated conductor 311);

(the wiring capacitance in the $X$ direction of the reticulated conductor 311×the wiring capacitance in the $Y$ direction of the reticulated conductor 312)≈(the wiring capacitance in the $X$ direction of the reticulated conductor 312×the wiring capacitance in the $Y$ direction of the reticulated conductor 311); and (the wiring impedance in the $X$ direction of the reticulated conductor 311×the wiring impedance in the $Y$ direction of the reticulated conductor 312)≈(the wiring impedance in the $X$ direction of the reticulated conductor 312×the wiring impedance in the $Y$ direction of the reticulated conductor 311).

Note that the above-described wiring resistance, wiring inductance, wiring capacitance, and wiring impedance can be replaced with conductor resistance, conductor inductance, conductor capacitance, and conductor impedance, respectively.

Note that the above-described impedance Z, resistor R, inductance L, and capacitance C have a relationship of $Z=R+j\omega L+1\div(j\omega C)$, using an angular frequency ω and an imaginary unit j.

Note that the relationship among these ratios may be satisfied as a whole of the reticulated conductor 311 and the reticulated conductor 312 or may be satisfied within a part of the reticulated conductor 311 and the reticulated conductor 312, and it is sufficient that the relationship is satisfied within an arbitrary range.

Moreover, a circuit that adjusts the current distributions to be substantially uniform, substantially the same, or substantially similar, and to have opposite characteristics.

By satisfying the above-described relationships, the current distribution of the reticulated conductor 311 and the current distribution of the reticulated conductor 312 can be made substantially uniform and have opposite characteristics. Therefore, the magnetic field generated by the current distribution of the reticulated conductor 311 and the magnetic field generated by the current distribution of the reticulated conductor 312 can be effectively canceled.

C in FIG. 36 illustrates a state of the conductor layers A and B respectively illustrated in A and B in FIG. 36, which are viewed from the photodiode 141 side (back surface side). Note that a hatched region 313 where diagonal lines intersect in C in FIG. 36 represents a region where the reticulated conductor 311 of the conductor layer A and the reticulated conductor 312 of the conductor layer B overlap. In the case of the eleventh configuration example, since the active element group 167 is covered with at least one of the conductor layer A or the conductor layer B, the hot carrier light emission from the active element group 167 can be shielded.

Furthermore, in the case of the eleventh configuration example, the region 313 where the reticulated conductor 311 and the reticulated conductor 312 overlap is continuous in the X direction. In the region 313 where the reticulated conductor 311 and the reticulated conductor 312 overlap, currents having polarities different from each other flow in the reticulated conductor 311 and the reticulated conductor 312, and thus magnetic fields generated from the region 313 cancel each other. Therefore, generation of the inductive noise near the region 313 can be suppressed.

Furthermore, in the case of the eleventh configuration example, the gap width GYA in the Y direction and the gap width GXA in the X direction of the reticulated conductor 311 are formed to be different, and the gap width GYB in the Y direction and the gap width GXB in the X direction of the reticulated conductor 312 are formed to be different.

By forming the reticulated conductors 311 and 312 to have the shapes having a difference in the gap widths in the X direction and the Y direction, restrictions such as dimensions of a wiring region, dimensions of a gap region, and occupancy of the wiring region in each conductor layer in actually designing and manufacturing the conductor layers can be secured, and the degree of freedom in designing wiring layout can be increased. Furthermore, the wiring can be designed in a layout that is advantageous in terms of voltage drop (IR-Drop), inductive noise, and the like, as compared with a case having no difference in the gap widths.

Figure 37:
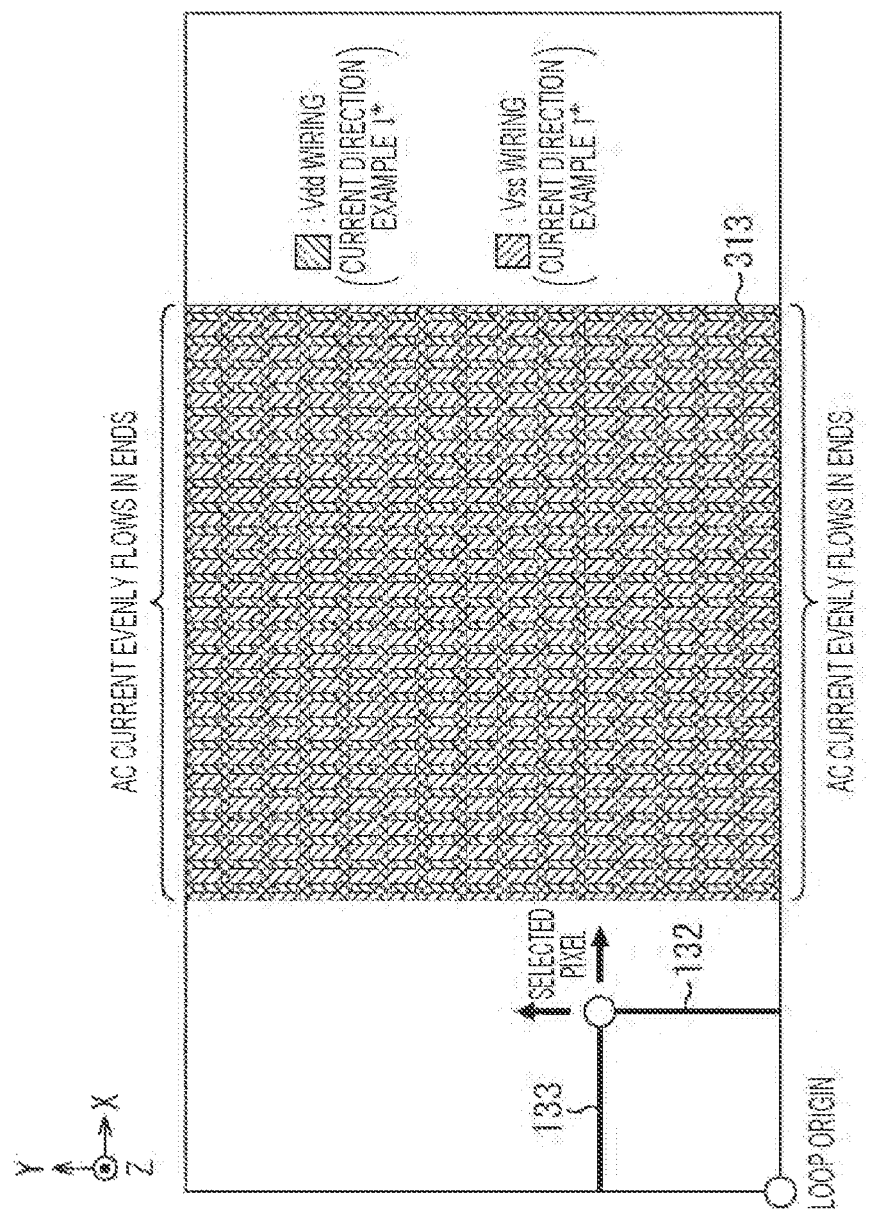
FIG. 37 is a diagram illustrating a current condition of a current flowing in the eleventh configuration example.

FIG. 37 is a diagram illustrating the current condition of the current flowing in the eleventh configuration example (FIG. 36).

It is assumed that AC current evenly flows in ends of the reticulated conductor 311 constituting the conductor layer A and the reticulated conductor 312 constituting the conductor layer B. However, the current direction changes with time. For example, when the current flows through the reticulated conductor 312 that is the Vdd wiring from the upper side to the lower side of the drawing, the current flows through the reticulated conductor 311 that is the Vss wiring from the lower side to the upper side of the drawing.

In the eleventh configuration example, in a case where the current flows as illustrated in FIG. 37, the magnetic fluxes in the substantially X direction and the substantially Y direction are likely to be generated between the reticulated conductor 311 that is the Vss wiring and the reticulated conductor 312 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 311 and 312 in a cross section where the reticulated conductors 311 and 312 are arranged.

Meanwhile, the Victim conductor loop formed using the signal line 132 and the control line 133 is formed in the XY plane in the pixel array 121 of the first semiconductor substrate 101 stacked on the second semiconductor substrate 102 in which the light-shielding structure 151 formed using the conductor layers A and B is formed. In the Victim conductor loop formed on the XY plane, the induced electromotive force is likely to be generated by the magnetic flux in the Z direction, and an image output from the solid-state imaging device 100 further deteriorates (the inductive noise increases) as a change in the induced electromotive force is larger.

Moreover, when the effective dimensions of the Victim conductor loop formed using the signal line 132 and the control line 133 are changed due to movement of selected pixels in the pixel array 121, the change in the induced electromotive force becomes remarkable.

In the case of the eleventh configuration example, the direction (approximately X direction or approximately Y direction) of the magnetic flux generated from the loop plane of the Aggressor conductor loop of the light-shielding structure 151 formed using the conductor layers A and B and the direction (Z direction) of the magnetic flux to generate the induced electromotive force in the Victim conductor loop are substantially orthogonal and differ by approximately 90 degrees. In other words, the direction of the loop plane where the magnetic flux is generated from the Aggressor conductor loop and the direction of the loop plane where the induced electromotive force is generated in the Victim conductor loop differ by approximately 90 degrees. Therefore, it is expected that the deterioration (generation of inductive noise) of the image output from the solid-state imaging device 100 is less than that in the first comparative example.

Figure 38:
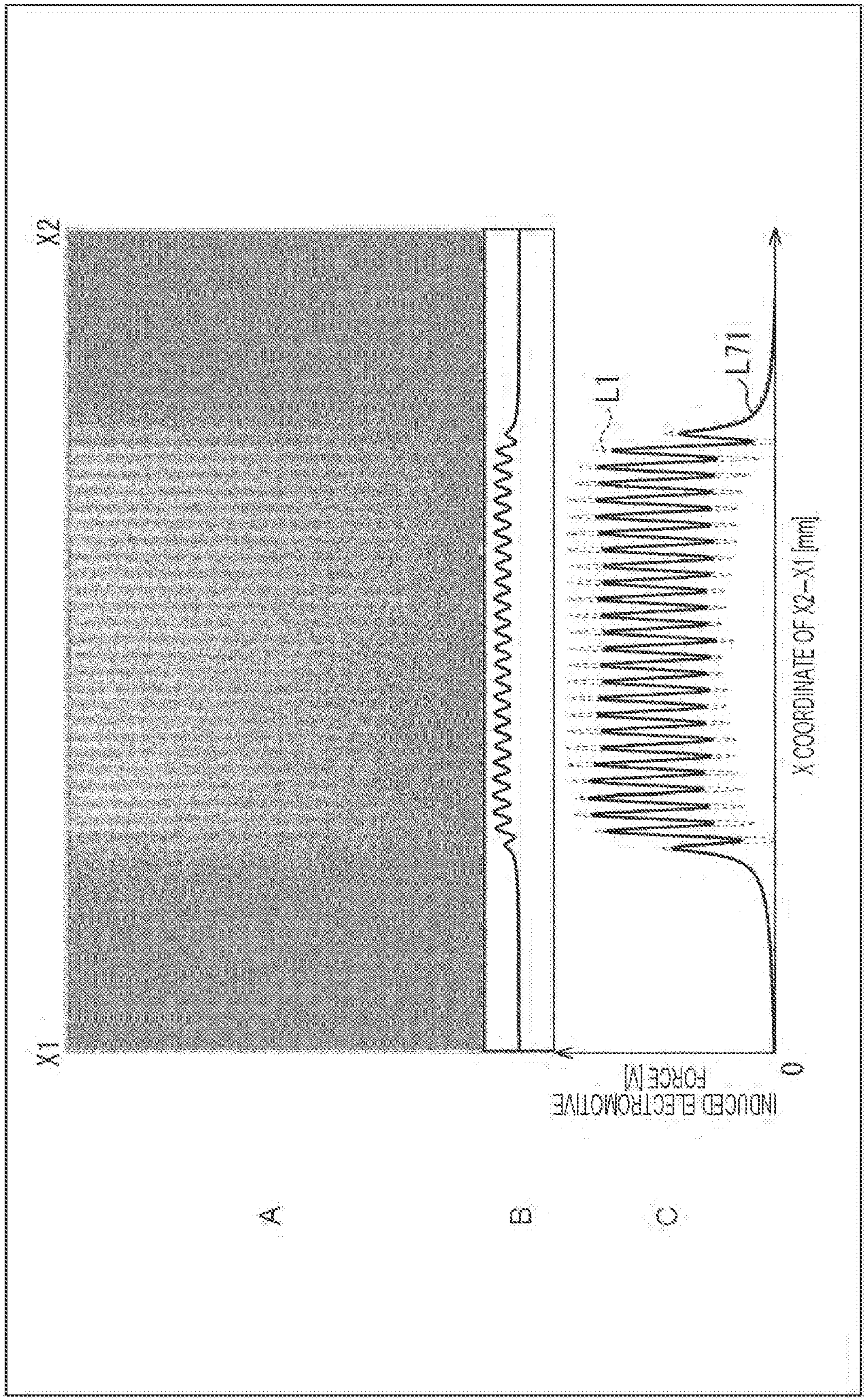
FIG. 38 is diagrams illustrating a simulation result of inductive noise corresponding to the eleventh configuration example.

FIG. 38 illustrates a simulation result of the inductive noise generated in the case where the eleventh configuration example (FIG. 36) is applied to the solid-state imaging device 100.

A in FIG. 38 illustrates an image in which the inductive noise can be generated, the image being output from the solid-state imaging device 100. B in FIG. 38 illustrates a change in a pixel signal in the line segment X1-X2 of the image illustrated in A in FIG. 38. C in FIG. 38 illustrates the solid line L71 representing induced electromotive force that generates the inductive noise in the image. The horizontal axis of C in FIG. 38 represents X-axis coordinates of the image, and the vertical axis represents the magnitude of the induced electromotive force. Note that the dotted line L1 in C in FIG. 38 corresponds to the first comparative example (FIG. 9).

As is clear from the comparison of the solid line L71 and the dotted line L1 illustrated in C in FIG. 38, it can be seen that the eleventh configuration example can suppress the change in the induced electromotive force to be generated in the Victim conductor loop as compared with the first comparative example, and can suppress the inductive noise.

Note that the eleventh configuration example may be rotated by 90 degrees in an XY plane shape and used. Furthermore, the angle is not limited to 90 degrees and the configuration may be rotated by an arbitrary angle and used. For example, the configuration may be diagonal with respect to the X axis and the Y axis.

Twelfth Configuration Example

Figure 39:
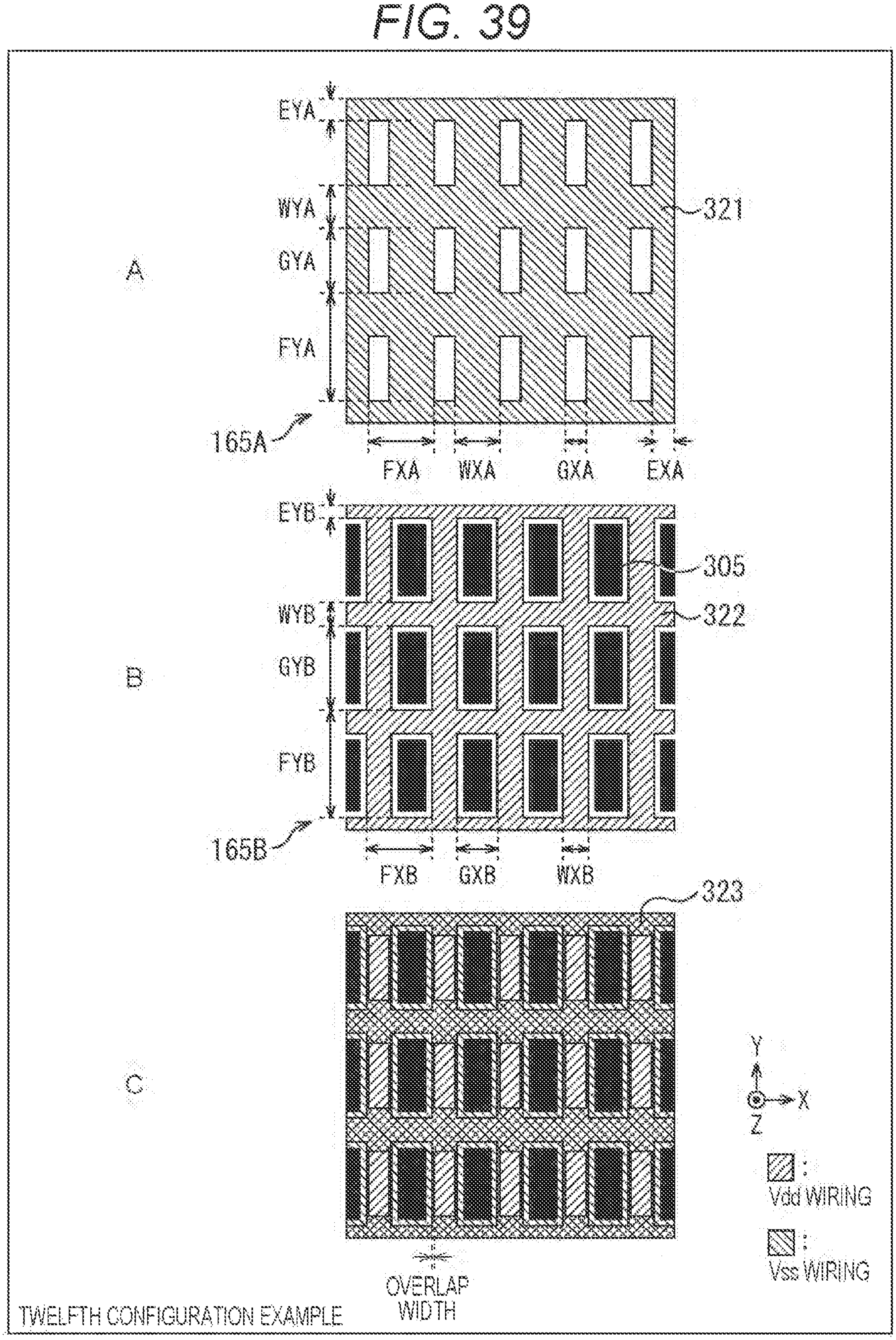
FIG. 39 is diagrams illustrating a twelfth configuration example of the conductor layers A and B.

Next, FIG. 39 illustrates a twelfth configuration example of the conductor layers A and B. Note that A in FIG. 39 illustrates the conductor layer A, and B in FIG. 39 illustrates the conductor layer B. In the coordinate system in FIG. 39, the horizontal direction is the X axis, the vertical direction is the Y axis, and the direction perpendicular to the XY plane is the Z axis.

The conductor layer A in the twelfth configuration example is configured by a reticulated conductor 321. Since the reticulated conductor 321 has a similar shape to the reticulated conductor 311 of the conductor layer A in the eleventh configuration example (FIG. 36), the description thereof is omitted. The reticulated conductor 321 is, for example, wiring (Vss wiring) connected to the GND or the negative power supply.

The conductor layer B in the twelfth configuration example is configured by a reticulated conductor 322 and a relay conductor 305. Since the reticulated conductor 322 has a similar shape to the reticulated conductor 312 of the conductor layer B in the eleventh configuration example (FIG. 36), the description thereof is omitted. The reticulated conductor 322 is, for example, wiring (Vdd wiring) connected to the positive power supply.

The relay conductor (another conductor) 305 is arranged in a rectangular gap region long in the Y direction other than the conductor of the reticulated conductor 322 and is electrically insulated from the reticulated conductor 322, and is connected to Vss to which the reticulated conductor 321 of the conductor layer A is connected Note that the shape of the relay conductor 305 is arbitrary, and a symmetric circular or polygonal shape such as rotational symmetry or mirror plane symmetry is desirable. The relay conductor 305 can be arranged in a center of or at any other position of the gap region of the reticulated conductor 322. The relay conductor 305 may be connected to a conductor layer as Vss wiring different from the conductor layer A. The relay conductor 305 may be connected to a conductor layer as Vss wiring closer to the active element group 167 than the conductor layer B. The relay conductor 305 can be connected to a conductor layer different from the conductor layer A or a conductor layer or the like closer to the active element group 167 than the conductor layer B via the conductor via (VIA) extending in the Z direction.

C in FIG. 39 illustrates a state of the conductor layers A and B respectively illustrated in A and B in FIG. 39, which are viewed from the photodiode 141 side (back surface side). Note that a hatched region 323 in C in FIG. 39 where diagonal lines intersect represents a region where the reticulated conductor 321 of the conductor layer A and the reticulated conductor 322 of the conductor layer B overlap. In the case of the twelfth configuration example, since the active element group 167 is covered with at least one of the conductor layer A or the conductor layer B, the hot carrier light emission from the active element group 167 can be shielded.

In the twelfth configuration example, in a case where the current flows similarly to the case illustrated in FIG. 37, the magnetic fluxes in the substantially X direction and the substantially Y direction are likely to be generated between the reticulated conductor 321 that is the Vss wiring and the reticulated conductor 322 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 321 and 322 in a cross section where the reticulated conductors 321 and 322 are arranged.

Moreover, in the case of the twelfth configuration example, the region 323 where the reticulated conductor 321 and the reticulated conductor 322 overlap is continuous in the X direction. In the region 323 where the reticulated conductor 321 and the reticulated conductor 322 overlap, currents having polarities different from each other flow in the reticulated conductor 321 and the reticulated conductor 322, and thus magnetic fields generated from the region 323 cancel each other. Therefore, generation of the inductive noise near the region 323 can be suppressed.

Furthermore, in the case of the twelfth configuration example, by providing the relay conductor 305, the reticulated conductor 321 as Vss wiring can be connected with the active element group 167 at substantially the shortest distance or a short distance. By connecting the reticulated conductor 321 and the active element group 167 at substantially the shortest distance or a short distance, the voltage drop, energy loss, or inductive noise between the reticulated conductor 321 and the active element group 167 can be reduced.

Note that the twelfth configuration example may be rotated by 90 degrees in an XY plane shape and used. Furthermore, the angle is not limited to 90 degrees and the configuration may be rotated by an arbitrary angle and used. For example, the configuration may be diagonal with respect to the X axis and the Y axis.

Thirteenth Configuration Example

Figure 40:
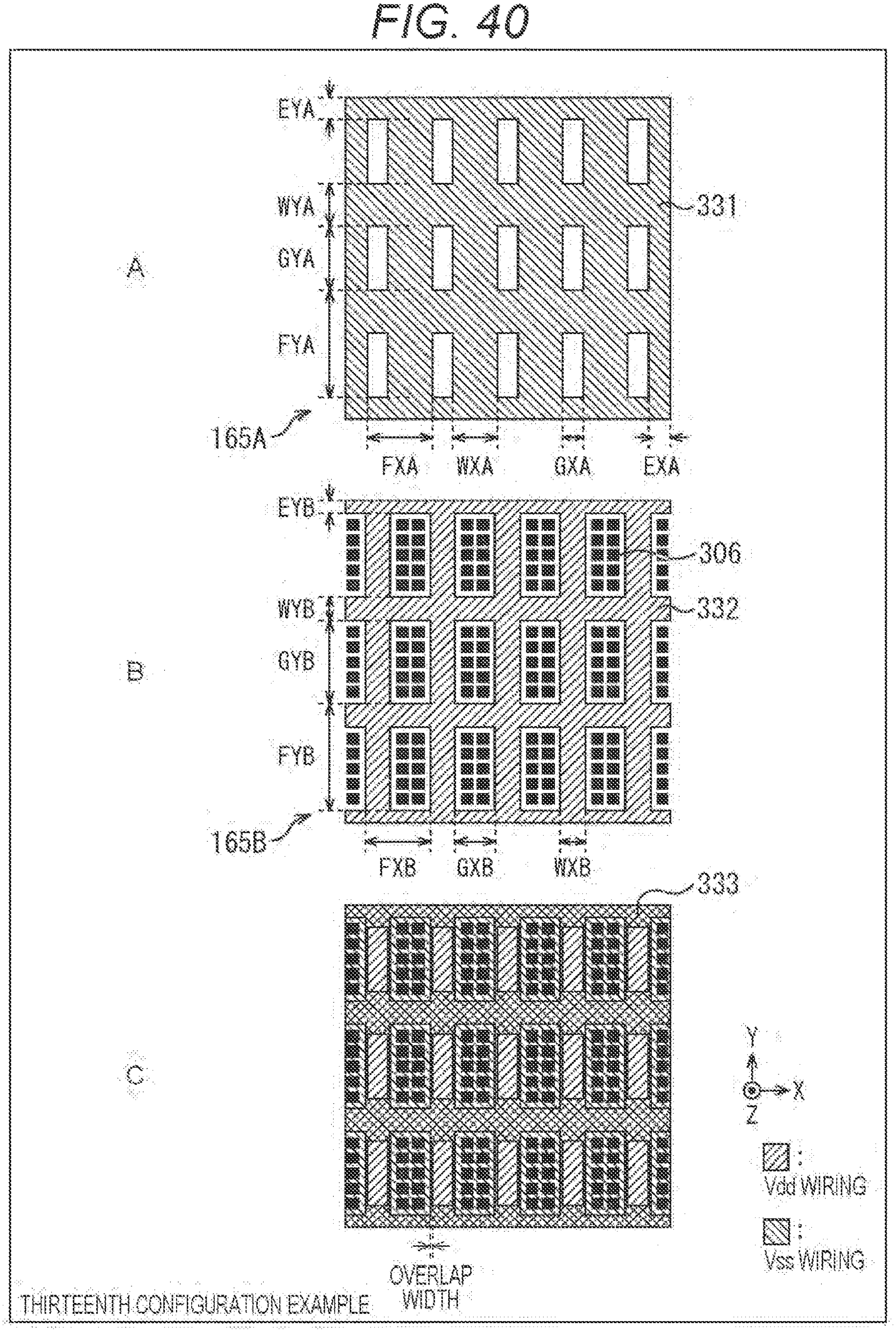
FIG. 40 is diagrams illustrating a thirteenth configuration example of the conductor layers A and B.

Next, FIG. 40 illustrates a thirteenth configuration example of the conductor layers A and B. Note that A in FIG. 40 illustrates the conductor layer A, and B in FIG. 40 illustrates the conductor layer B. In the coordinate system in FIG. 40, the horizontal direction is the X axis, the vertical direction is the Y axis, and the direction perpendicular to the XY plane is the Z axis.

The conductor layer A in the thirteenth configuration example is configured by a reticulated conductor 331. Since the reticulated conductor 331 has a similar shape to the reticulated conductor 311 of the conductor layer A in the eleventh configuration example (FIG. 36), the description thereof is omitted. The reticulated conductor 331 is, for example, wiring (Vss wiring) connected to the GND or the negative power supply.

The conductor layer B in the thirteenth configuration example is configured by a reticulated conductor 332 and a relay conductor 306. Since the reticulated conductor 332 has a similar shape to the reticulated conductor 312 of the conductor layer B in the eleventh configuration example (FIG. 36), the description thereof is omitted. The reticulated conductor 332 is, for example, wiring (Vdd wiring) connected to the positive power supply.

The relay conductor (another conductor) 306 is obtained by dividing the relay conductor 305 in the twelfth configuration example (FIG. 39) into a plurality of (10 in the case of FIG. 40) parts with a space. The relay conductor 306 is arranged in a rectangular gap region long in the Y direction of the reticulated conductor 332 and is electrically insulated from the reticulated conductor 332, and is connected to Vss to which the reticulated conductor 331 of the conductor layer A is connected The number of divisions of the relay conductor and the presence/absence of connection to Vss may be different depending on a region. In this case, the current distribution can be finely adjusted at the time of design, leading to suppression of the inductive noise and reduction of the voltage drop (IR-Drop).

Note that the shape of the relay conductor 306 is arbitrary, and a symmetric circle or polygon such as rotational symmetry or mirror plane symmetry is desirable. The number of divisions of the relay conductor 306 can be arbitrarily changed. The relay conductor 306 can be arranged in a center of or at any other position of the gap region of the reticulated conductor 332. The relay conductor 306 may be connected to a conductor layer as Vss wiring different from the conductor layer A. The relay conductor 306 may be connected to a conductor layer as Vss wiring closer to the active element group 167 than the conductor layer B. The relay conductor 306 can be connected to a conductor layer different from the conductor layer A or to a conductor layer or the like closer to the active element group 167 than the conductor layer B via the conductor via (VIA) extending in the Z direction.

C in FIG. 40 illustrates a state of the conductor layers A and B respectively illustrated in A and B in FIG. 40, which are viewed from the photodiode 141 side (back surface side). Note that a hatched region 333 where diagonal lines intersect in C in FIG. 40 represents a region where the reticulated conductor 331 of the conductor layer A and the reticulated conductor 332 of the conductor layer B overlap. In the case of the thirteenth configuration example, since the active element group 167 is covered with at least one of the conductor layer A or the conductor layer B, the hot carrier light emission from the active element group 167 can be shielded.

In the thirteenth configuration example, in a case where the current flows similarly to the case illustrated in FIG. 37, the magnetic fluxes in the substantially X direction and the substantially Y direction are likely to be generated between the reticulated conductor 331 that is the Vss wiring and the reticulated conductor 332 that is the Vdd wiring by the conductor loop with the loop plane approximately perpendicular to the X axis and the conductor loop with the loop plane approximately perpendicular to the Y axis, the conductor loops being generated including (cross sections of) the reticulated conductors 331 and 332 in a cross section where the reticulated conductors 331 and 332 are arranged.

Moreover, in the case of the thirteenth configuration example, the region 333 where the reticulated conductor 331 and the reticulated conductor 332 overlap is continuous in the X direction. In the region 333, currents having polarities different from each other flow in the reticulated conductor 331 and the reticulated conductor 332, and thus magnetic fields generated from the region 333 cancel each other. Therefore, generation of the inductive noise near the region 333 can be suppressed.

Furthermore, in the case of the thirteenth configuration example, by providing the relay conductor 306, the reticulated conductor 331 as Vss wiring can be connected with the active element group 167 at substantially the shortest distance or a short distance. By connecting the reticulated conductor 331 and the active element group 167 at substantially the shortest distance or a short distance, the voltage drop, energy loss, or inductive noise between the reticulated conductor 331 and the active element group 167 can be reduced.

Furthermore, in the thirteenth configuration example, the relay conductor 306 is divided into the plurality of parts, the current distribution in the conductor layer A and the current distribution in the conductor layer B can be made substantially uniform and have opposite polarities. Therefore, the magnetic field generated from the conductor layer A and the magnetic field generated from the conductor layer B can cancel each other. Therefore, in the thirteenth configuration example, it is possible to make it difficult to cause a current distribution difference between the Vdd wiring and the Vss wiring due to an external factor. Therefore, the sixteenth configuration example is suitable for a case where the current distribution of the XY plane is complicated, or a case where the impedances of the conductors connected to the reticulated conductors 331 and 332 are different between the Vdd wiring and the Vss wiring.

Note that the thirteenth configuration example may be rotated by 90 degrees in an XY plane shape and used. Furthermore, the angle is not limited to 90 degrees and the configuration may be rotated by an arbitrary angle and used. For example, the configuration may be diagonal with respect to the X axis and the Y axis.

Simulation Results of Twelfth and Thirteenth Configuration Examples

Figure 41:
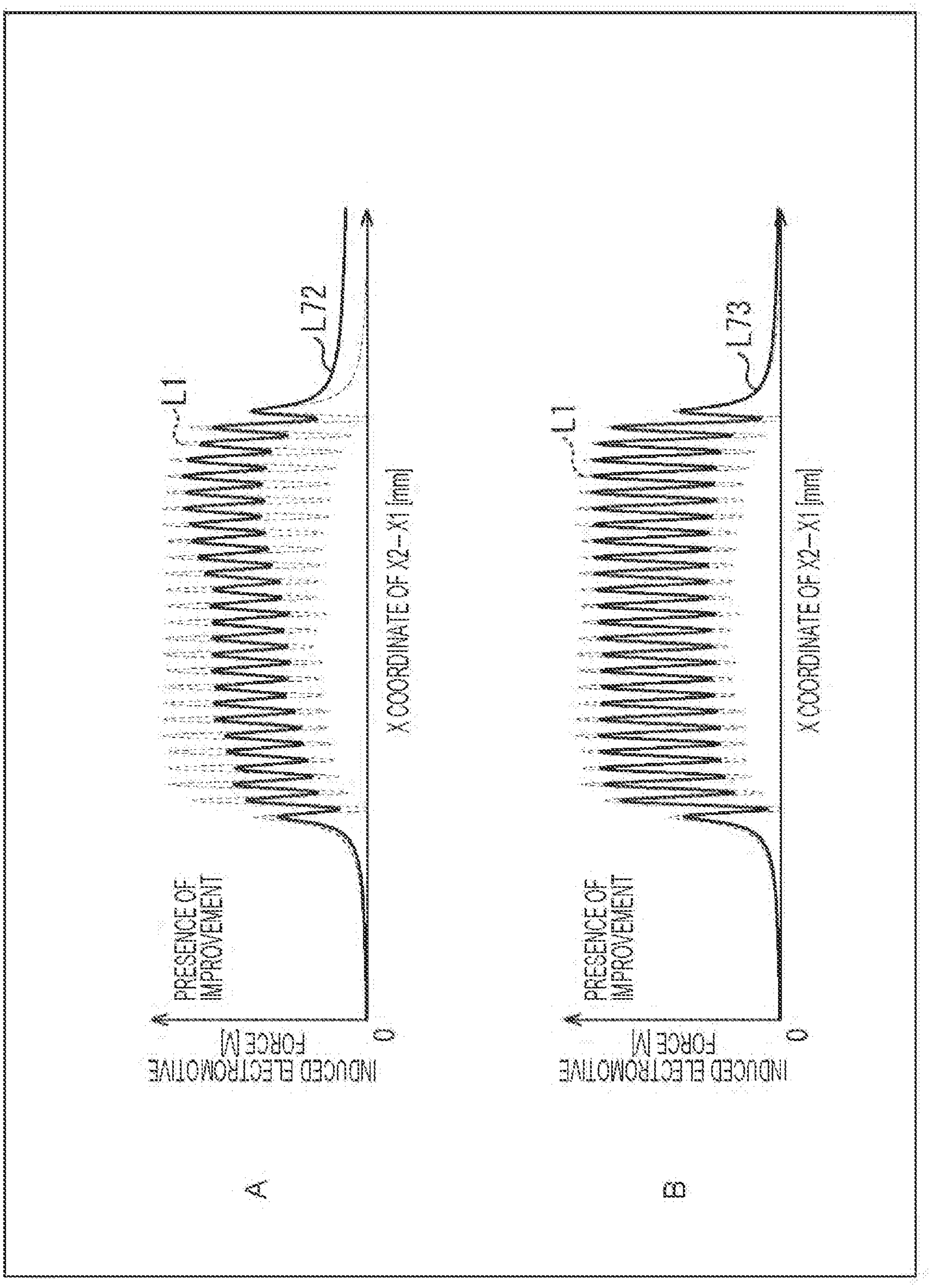
FIG. 41 is diagrams illustrating simulation results of inductive noise corresponding to the twelfth and thirteenth configuration examples.

FIG. 41 illustrates changes in the induced electromotive force that causes the inductive noise in an image, as simulation results of cases where the twelfth (FIG. 39) and thirteenth (FIG. 40) configuration examples are applied to the solid-state imaging device 100. Note that the current conditions of the currents flowing in twelfth and thirteenth configuration examples are similar to that in the case illustrated in FIG. 37. The horizontal axis in FIG. 41 represents X-axis coordinates of the image, and the vertical axis represents the magnitude of the induced electromotive force.

The solid line L72 in A in FIG. 41 corresponds to the twelfth configuration example (FIG. 39), and the dotted line L1 corresponds to the first comparative example (FIG. 9). As is clear from the comparison between the solid line L72 and the dotted line L1, it can be seen that the twelfth configuration example does not change the induced electromotive force to be generated in the Victim conductor loop as compared with the first comparative example. Therefore, the twelfth configuration example can suppress the inductive noise in the image output from the solid-state imaging device 100 as compared with the first comparative example. Note that this simulation result is a simulation result of a case where the reticulated conductor 321 is not connected to the active element group 167 and the reticulated conductor 322 is not connected to the active element group 167. For example, in a case where at least a part of the reticulated conductor 321 and a part of the active element group 167 are connected via a conductor via or the like at substantially the substantially shortest distance or a short distance, or in a case where at least a part of the reticulated conductor 322 and a part of the active element group 167 are connected via a conductor via or the like at substantially the shortest distance or a short distance, the amount of current flowing through the reticulated conductor 321 and the reticulated conductor 322 gradually decreases depending on the position. In such a case, there is a condition that the voltage drop, energy loss, and inductive noise are significantly improved to less than half by providing the relay conductor 305.

The solid line L73 in B in FIG. 41 corresponds to the thirteenth configuration example (FIG. 40), and the dotted line L1 corresponds to the first comparative example (FIG. 9). As is clear from the comparison between the solid line L73 and the dotted line L1, it can be seen that the thirteenth configuration example does not change the induced electromotive force to be generated in the Victim conductor loop as compared with the first comparative example. Therefore, the thirteenth configuration example can suppress the inductive noise in the image output from the solid-state imaging device 100 as compared with the first comparative example. Note that this simulation result is a simulation result of a case where the reticulated conductor 331 is not connected to the active element group 167 and the reticulated conductor 332 is not connected to the active element group 167. For example, in a case where at least a part of the reticulated conductor 331 and a part of the active element group 167 are connected via a conductor via or the like at substantially the shortest distance or a short distance, or in a case where at least a part of the reticulated conductor 332 and a part of the active element group 167 are connected via a conductor via or the like at substantially the shortest distance or a short distance, the amount of current flowing through the reticulated conductor 331 and the reticulated conductor 332 gradually decreases depending on the position. In such a case, there is also a condition that the voltage drop, energy loss, and inductive noise are significantly improved to less than half by providing the relay conductor 306.

5. Arrangement Example of Electrodes in Semiconductor Substrate in which Conductor Layers A and B are Formed Next, arrangement of electrodes in a semiconductor substrate in which conductors having different resistance values in the X direction and the Y direction are formed, as in the eleventh to thirteenth configuration examples of the conductor layers A and B, will be described.

Note that the following description will be given using a case in which the thirteenth configuration example (FIG. 40) including the conductor layers A and B including the conductors (the reticulated conductors 331 and 332) in which the resistance value in the Y direction is smaller than the resistance value in the X direction is formed in a semiconductor substrate as an example. Note that, the same applies to cases where the eleventh and twelfth configuration examples of the conductor layers A and B including the conductors in which the resistance value in the Y direction is smaller than the resistance value in the X direction are formed in a semiconductor substrate.

In the thirteenth configuration example of the conductor layers A and B formed in the semiconductor substrate, since the resistance values of the conductors (reticulated conductors 331 and 332) in the Y direction are smaller than the resistance values in the X direction, a current easily flows in the Y direction. Therefore, to make the voltage drop (IR-Drop) in the conductors in the thirteenth configuration example of the conductor layers A and B as small as possible, it is desirable to arrange a plurality of pads (electrodes) to be arranged in the semiconductor substrate more densely in the X direction that is the direction with the large resistance value than in the Y direction that is the direction with the small resistance value. However, the pads may be more densely arranged in the Y direction than in the X direction.

First Arrangement Example of Pads on Semiconductor Substrate

Figure 42:
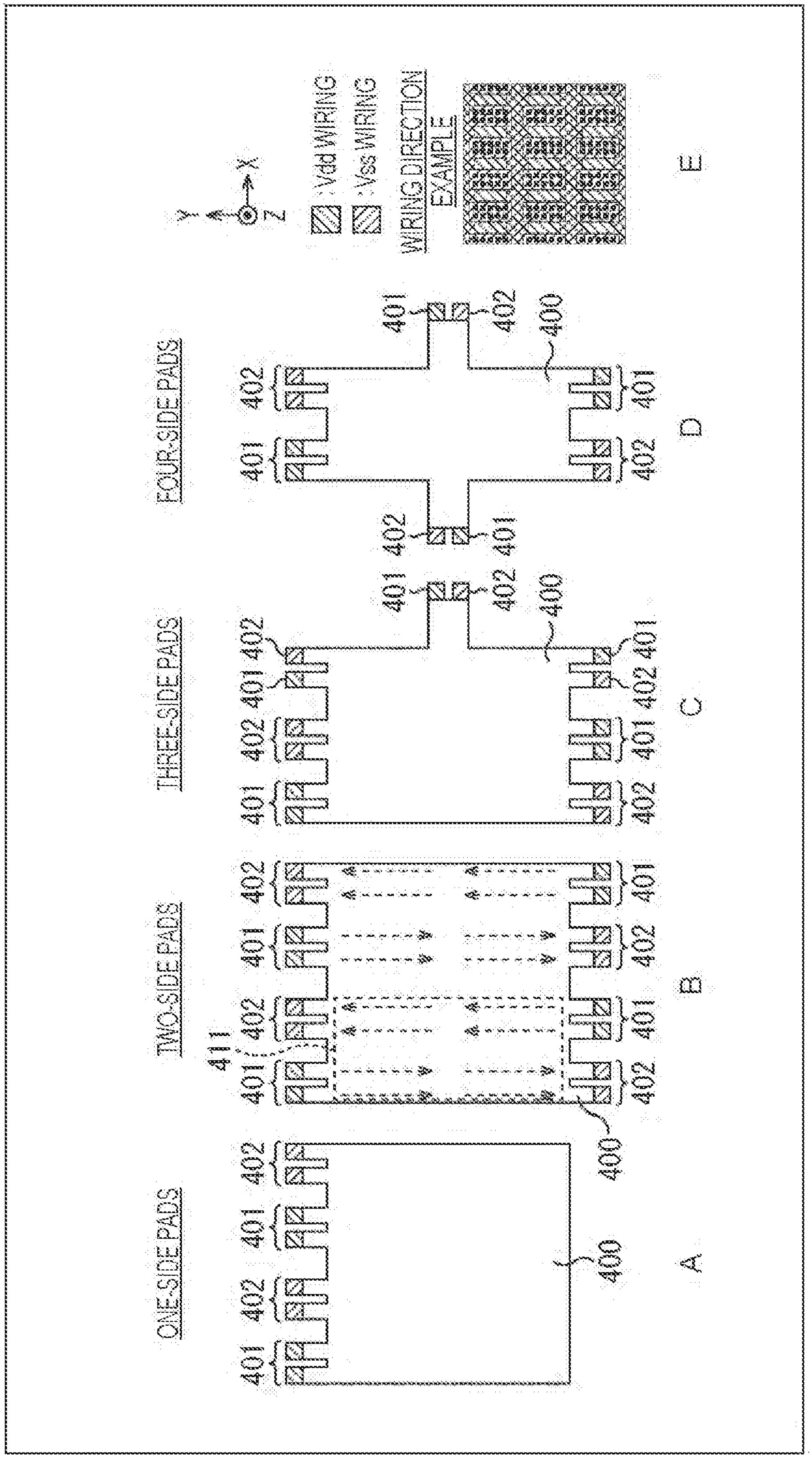
FIG. 42 is plan views illustrating a first arrangement example of pads on a semiconductor substrate.

FIG. 42 is a plan view illustrating a first arrangement example in which the pads are arranged more densely in the X direction than in the Y direction on the semiconductor substrate. Note that, in the coordinate system in FIG. 42, the horizontal direction is the X axis, the vertical direction is the Y axis, and the direction perpendicular to the XY plane is the Z axis.

A in FIG. 42 illustrates a case of arranging pads on one side of a wiring region 400 in which a plurality of the thirteenth configuration examples (FIG. 40) each including the conductor layers A and B is formed. B in FIG. 42 illustrates a case of arranging pads on two sides facing each other in the Y direction of the wiring region 400 in which a plurality of the thirteenth configuration examples (FIG. 40) each including the conductor layers A and B is formed. Note that the dotted arrow in the figure illustrates an example of the direction of the current flowing there, and a current loop 411 by the current illustrated by the dotted arrow is generated. The direction of the current indicated by the dotted arrow changes from moment to moment.

C in FIG. 42 illustrates a case of arranging pads on three sides of the wiring region 400 in which a plurality of the thirteenth configuration examples (FIG. 40) each including the conductor layers A and B is formed. D in FIG. 42 illustrates a case of arranging pads on four sides of the wiring region 400 in which a plurality of the thirteenth configuration examples (FIG. 40) each including the conductor layers A and B is formed. E in FIG. 42 illustrates the orientation of the plurality of thirteenth configuration examples of the conductor layers A and B formed in the wiring region 400.

The pad 401 arranged in the wiring region 400 is connected to the Vdd wiring, and the pad 402 is, for example, wiring (Vss wiring) connected to the GND or the negative power supply.

In the case of the first arrangement example illustrated in FIG. 42, each of the pads 401 and 402 includes one or a plurality (two in the case of FIG. 42) of adjacently arranged pads. The pads 401 and 402 are arranged adjacent to each other. The pad 401 including one pad and the pad 402 including one pad are arranged adjacent to each other, and the pad 401 including two pads and the pad 402 including two pads are arranged adjacent to each other. The polarities of the pads 401 and 402 (the connection destination is the Vdd wiring or the Vss wiring) are opposite polarities. The number of pads 401 and the number of pads 402 arranged in the wiring region 400 are substantially the same.

As a result, the current distributions respectively flowing through the conductor layers A and B formed in the wiring region 400 can be made substantially uniform and have opposite polarities. Therefore, the magnetic fields respectively generated from the conductor layers A and B and the induced electromotive forces based on the magnetic fields can be effectively canceled.

Furthermore, as illustrated in B, C, and D in FIG. 42, in a case where the pads are formed on two or more sides of the wiring region 400, the polarities of the pads facing each other on the opposite sides are opposite. As a result, as illustrated by the dotted arrows in B in FIG. 42, currents in the same direction are likely to be distributed at positions where the X coordinate of the wiring region 400 is common and the Y coordinates are different.

Second Arrangement Example of Pads on Semiconductor Substrate

Figure 43:
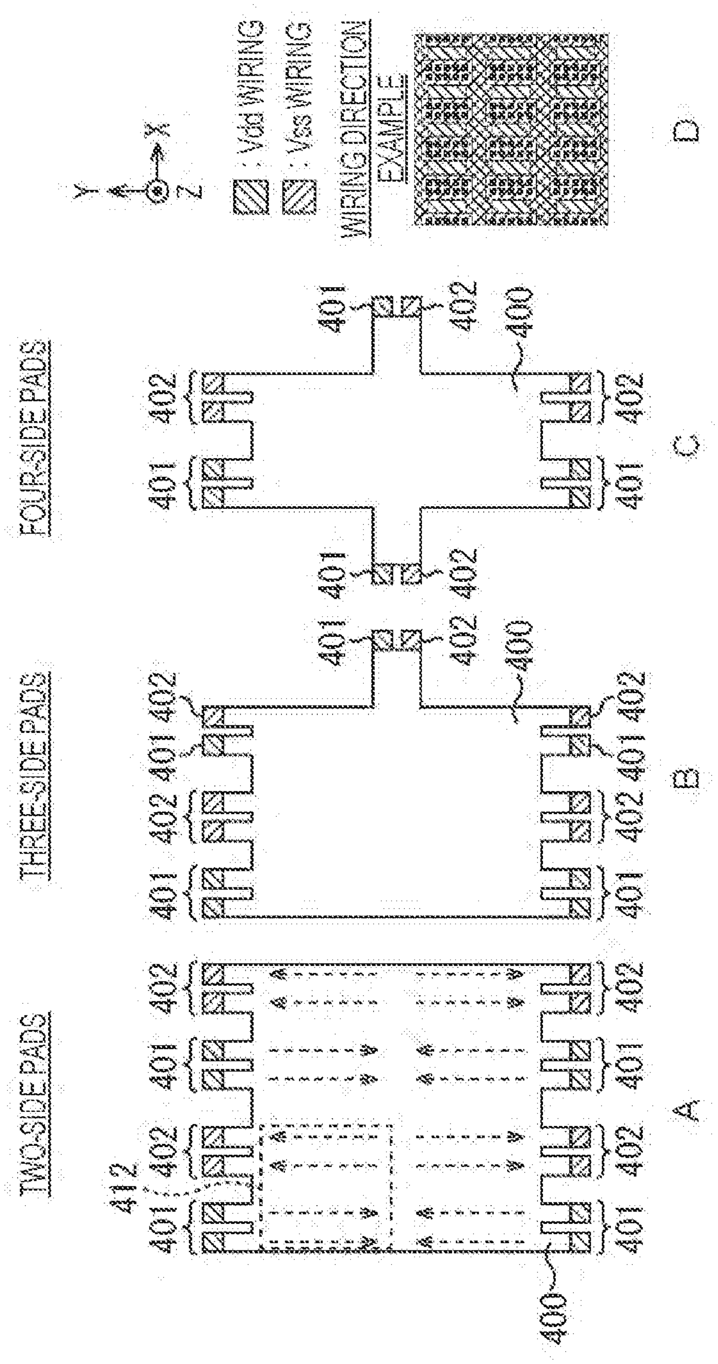
FIG. 43 is plan views illustrating a second arrangement example of pads on a semiconductor substrate.

Next, FIG. 43 is a plan view illustrating a second arrangement example in which the pads are arranged more densely in the X direction than in the Y direction on the semiconductor substrate. Note that, in the coordinate system in FIG. 43, the horizontal direction is the X axis, the vertical direction is the Y axis, and the direction perpendicular to the XY plane is the Z axis.

A in FIG. 43 illustrates a case of arranging pads on two sides facing each other in the Y direction of the wiring region 400 in which a plurality of the thirteenth configuration examples (FIG. 40) each including the conductor layers A and B is formed. Note that the dotted arrow in the figure illustrates the direction of the current flowing there, and a current loop 412 by the current illustrated by the dotted arrow is generated. The direction of the current indicated by the dotted arrow changes from moment to moment.

B in FIG. 43 illustrates a case of arranging pads on three sides of the wiring region 400 in which a plurality of the thirteenth configuration examples (FIG. 40) each including the conductor layers A and B is formed. C in FIG. 43 illustrates a case of arranging pads on four sides of the wiring region 400 in which a plurality of the thirteenth configuration examples (FIG. 40) each including the conductor layers A and B is formed. D in FIG. 43 illustrates the orientation of the plurality of thirteenth configuration examples of the conductor layers A and B formed in the wiring region 400.

The pad 401 arranged in the wiring region 400 is connected to the Vdd wiring, and the pad 402 is, for example, wiring (Vss wiring) connected to the GND or the negative power supply.

In the case of the second arrangement example illustrated in FIG. 43, each of the pads 401 and 402 includes a plurality (two in the case of FIG. 43) of adjacently arranged pads. The pads 401 and 402 are arranged adjacent to each other. The pad 401 including one pad and the pad 402 including one pad are arranged adjacent to each other, and the pad 401 including two pads and the pad 402 including two pads are arranged adjacent to each other. The polarities of the pads 401 and 402 (the connection destination is the Vdd wiring or the Vss wiring) are opposite polarities. The number of pads 401 and the number of pads 402 arranged in the wiring region 400 are substantially the same.

As a result, the current distributions respectively flowing through the conductor layers A and B formed in the wiring region 400 can be made substantially uniform and have opposite polarities. Therefore, the magnetic fields respectively generated from the conductor layers A and B and the induced electromotive forces based on the magnetic fields can be effectively canceled.

Moreover, in the second arrangement example, the polarities of the pads facing each other on the opposite sides are the same. Note that the polarities of some of the pads facing each other on the opposite sides may be opposite. As a result, a current loop 412, which is smaller than the current loop 411 illustrated in B in FIG. 42, is generated in the wiring region 400. The size of the current loop affects the distribution range of the magnetic field, and the smaller the electric field loop, the narrower the distribution range of the magnetic field. Therefore, in the second arrangement example, the distribution range of the magnetic field is narrower than that in the first arrangement example. Therefore, in the second arrangement example, the generated induced electromotive force and the inductive noise based on the induced electromotive force can be made smaller than that in the first arrangement example.

Third Arrangement Example of Pads on Semiconductor Substrate

Figure 44:
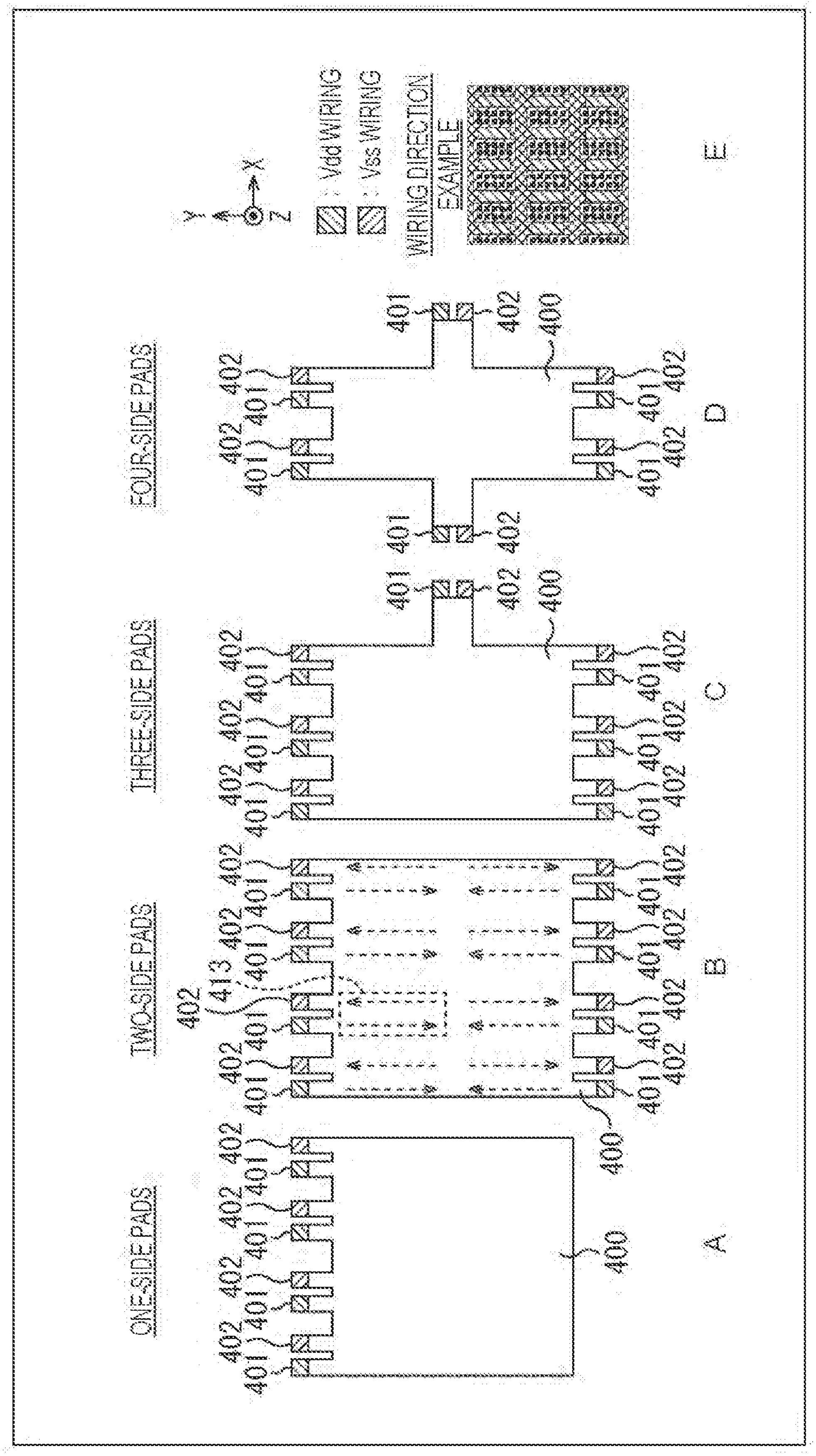
FIG. 44 is plan views illustrating a third arrangement example of pads on a semiconductor substrate.

Next, FIG. 44 is a plan view illustrating a third arrangement example in which the pads are arranged more densely in the X direction than in the Y direction on the semiconductor substrate. Note that, in the coordinate system in FIG. 44, the horizontal direction is the X axis, the vertical direction is the Y axis, and the direction perpendicular to the XY plane is the Z axis.

A in FIG. 44 illustrates a case of arranging pads on one side of the wiring region 400 in which a plurality of the thirteenth configuration examples (FIG. 40) each including the conductor layers A and B is formed. B in FIG. 44 illustrates a case of arranging pads on two sides facing each other in the Y direction of the wiring region 400 in which a plurality of the thirteenth configuration examples (FIG. 40) each including the conductor layers A and B is formed. Note that the dotted arrow in the figure illustrates the direction of the current flowing there, and a current loop 413 by the current illustrated by the dotted arrow is generated.

C in FIG. 44 illustrates a case of arranging pads on three sides of the wiring region 400 in which a plurality of the thirteenth configuration examples (FIG. 40) each including the conductor layers A and B is formed. D in FIG. 44 illustrates a case of arranging pads on four sides of the wiring region 400 in which a plurality of the thirteenth configuration examples (FIG. 40) each including the conductor layers A and B is formed. E in FIG. 44 illustrates the orientation of the plurality of thirteenth configuration examples of the conductor layers A and B formed in the wiring region 400.

The pad 401 arranged in the wiring region 400 is connected to the Vdd wiring, and the pad 402 is, for example, wiring (Vss wiring) connected to the GND or the negative power supply.

In the case of the third arrangement example illustrated in FIG. 44, the polarities (connection destination is Vdd wiring or Vss wiring) of the pads forming a pad group including a plurality (two in the case of FIG. 44) of adjacently arranged pads are opposite. The number of pads 401 and the number of pads 402 arranged on one or all sides of the wiring region 400 are substantially the same.

Moreover, in the third arrangement example, the polarities of the pads facing each other on the opposite sides are the same. Note that the polarities of some of the pads facing each other on the opposite sides may be opposite.

As a result, the current loop 413 that is smaller than the current loop 412 illustrated in A in FIG. 43 is generated in the wiring region 400. Therefore, in the third arrangement example, the distribution range of the magnetic field is narrower than that in the second arrangement example. Therefore, in the third arrangement example, the generated induced electromotive force and the inductive noise based on the induced electromotive force can be made smaller than that in the second arrangement example.

Figure 45:
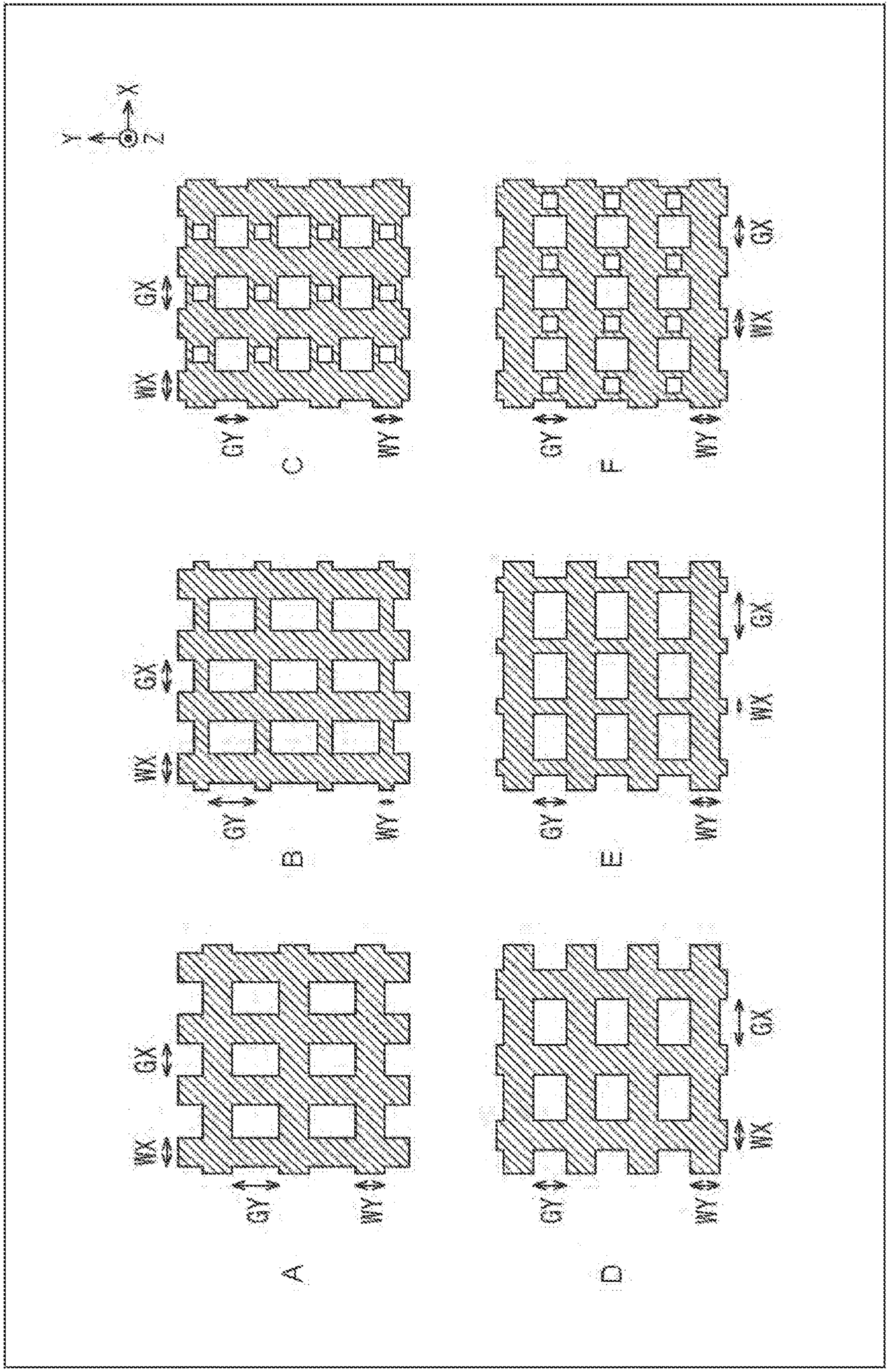
FIG. 45 is diagrams illustrating examples of a conductor having different resistance values in an X direction and a Y direction.

Example of Conductors Having Different Resistance Values in Y Direction and in X Direction FIG. 45 is plan views illustrating other examples of the conductors constituting the conductor layers A and B. That is, FIG. 45 is plan views illustrating examples of conductors having different resistance values in the Y direction and the X direction. Note that A to C in FIG. 45 illustrate examples in which the resistance value in the Y direction is smaller than the resistance value in the X direction, and D to F in FIG. 45 illustrate examples in which the resistance value in the X direction smaller than the resistance value in the Y direction.

A in FIG. 45 illustrates a reticulated conductor in which a conductor width WX in the X direction and a conductor width WY in the Y direction are equal, and a gap width GX in the X direction is narrower than a gap width GY in the Y direction. B in FIG. 45 illustrates a reticulated conductor in which the conductor width WX in the X direction is wider than the conductor width WY in the Y direction, and the gap width GX in the X direction is narrower than the gap width GY in the Y direction. C in FIG. 45 illustrates a reticulated conductor in which the conductor width WX in the X direction and the conductor width WY in the Y direction are equal, the gap width GX in the X direction and the gap width GY in the Y direction are equal, and a hole is provided in a region of a portion long in the X direction having the conductor width WY, the region not intersecting with a portion long in the Y direction having the conductor width WX.

D in FIG. 45 illustrates a reticulated conductor in which the conductor width WX in the X direction and the conductor width WY in the Y direction are equal, and the gap width GX in the X direction is wider than the gap width GY in the Y direction. E in FIG. 45 illustrates a reticulated conductor in which the conductor width WX in the X direction is narrower than the conductor width WY in the Y direction, and the gap width GX in the X direction is wider than the gap width GY in the Y direction. F in FIG. 45 illustrates a reticulated conductor in which the conductor width WX in the X direction and the conductor width WY in the Y direction are equal, the gap width GX in the X direction and the gap width GY in the Y direction are equal, and a hole is provided in a region of a portion long in the Y direction having the conductor width WX, the region not intersecting with a portion long in the X direction having the conductor width WY.

In the first to third arrangement examples of the pads in the wiring region 400 illustrated in FIGS. 42 to 44, the resistance value in the Y direction as illustrated in A to C in FIG. 45 is smaller than the resistance value in the X direction. In a case where a conductor in which a current easily flows in the Y direction is formed in the wiring region 400, it has an effect of suppressing the voltage drop (IR-Drop) in the conductor.

Furthermore, in the first to third arrangement examples of the pads in the wiring region 400 illustrated in FIGS. 42 to 44, the resistance value in the X direction as illustrated in D to F in FIG. 45 is smaller than the resistance value in the Y direction, and in a case where a conductor in which a current easily flows in the X direction is formed in the wiring region 400, the current is easily diffused in the X direction, and the magnetic field near the pads arranged on the side of the wiring region 400 is less likely to be concentrated. Therefore, the effect of suppressing generation of the inductive noise can be expected.

6. Modification of Configuration Example of Conductor Layers A and B

Next, modifications of some of the first to thirteenth configuration examples of the conductor layers A and B will be described.

Figure 46:
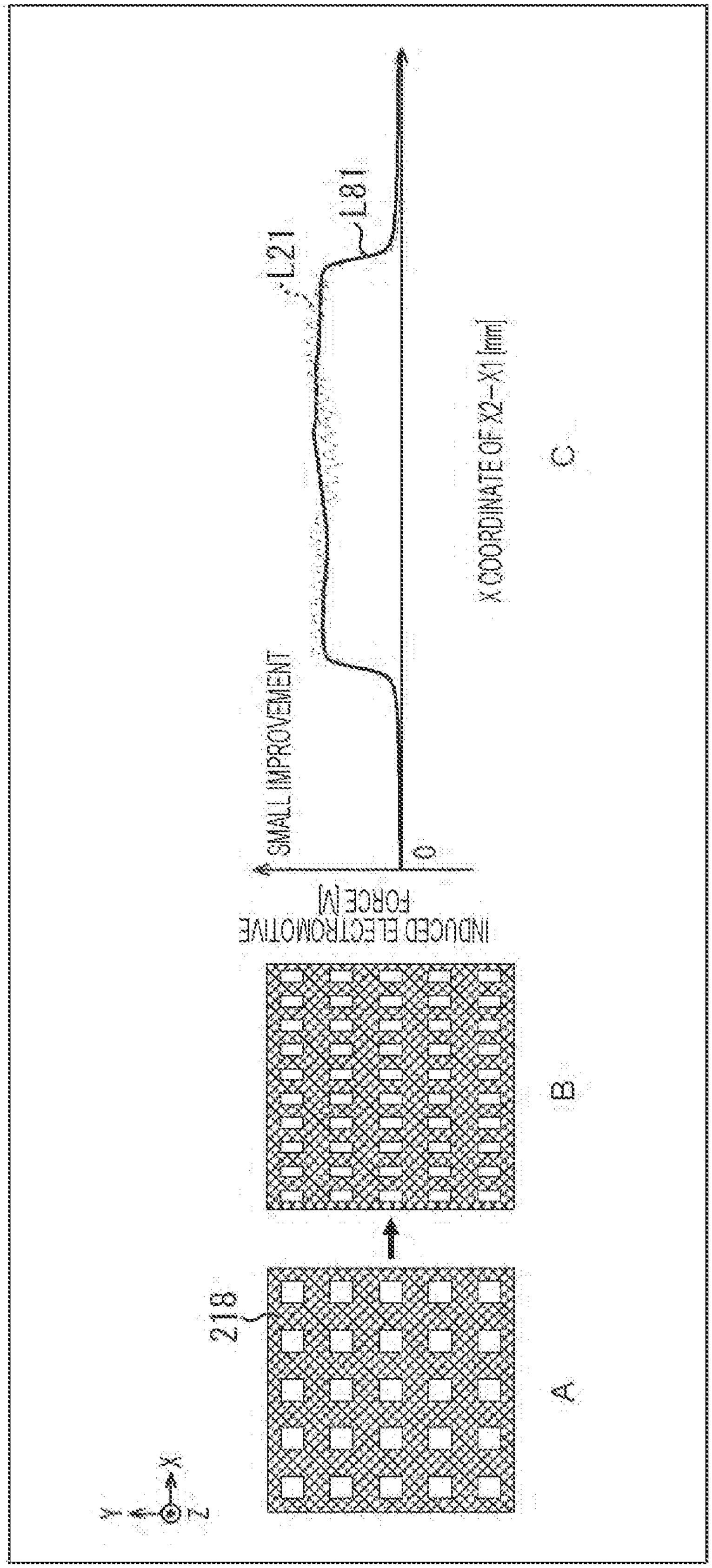
FIG. 46 is diagrams illustrating a modification in which a conductor period in the X direction of the second configuration example of the conductor layers A and B is deformed by a factor of ½ and an effect of the modification.

FIG. 46 is a diagram illustrating a modification in which the conductor period in the X direction of the second configuration example (FIG. 15) of the conductor layers A and B is deformed by a factor of ½ and an effect of the modification. Note that A in FIG. 46 illustrates the second configuration example of the conductor layers A and B, and B in FIG. 46 illustrates the modification of the second configuration example of the conductor layers A and B.

C in FIG. 46 illustrates a change in the induced electromotive force that causes the inductive noise in an image, as a simulation result of a case where the modification illustrated in B in FIG. 46 is applied to the solid-state imaging device 100. Note that the current condition of the current flowing in this modification is similar to the case illustrated in FIG. 13. The horizontal axis in FIG. 46 represents X-axis coordinates of the image, and the vertical axis represents the magnitude of the induced electromotive force.

The solid line L81 in C in FIG. 46 corresponds to the modification illustrated in B in FIG. 46, and the dotted line L21 corresponds to the second configuration example (FIG. 15). As is clear from the comparison between the solid line L81 and the dotted line L21, this modification has a slightly less change in the induced electromotive force to be generated in the Victim conductor loop than the second configuration example. Therefore, it can be seen that this modification can slightly suppress the inductive noise as compared with the second configuration example.

Figure 47:
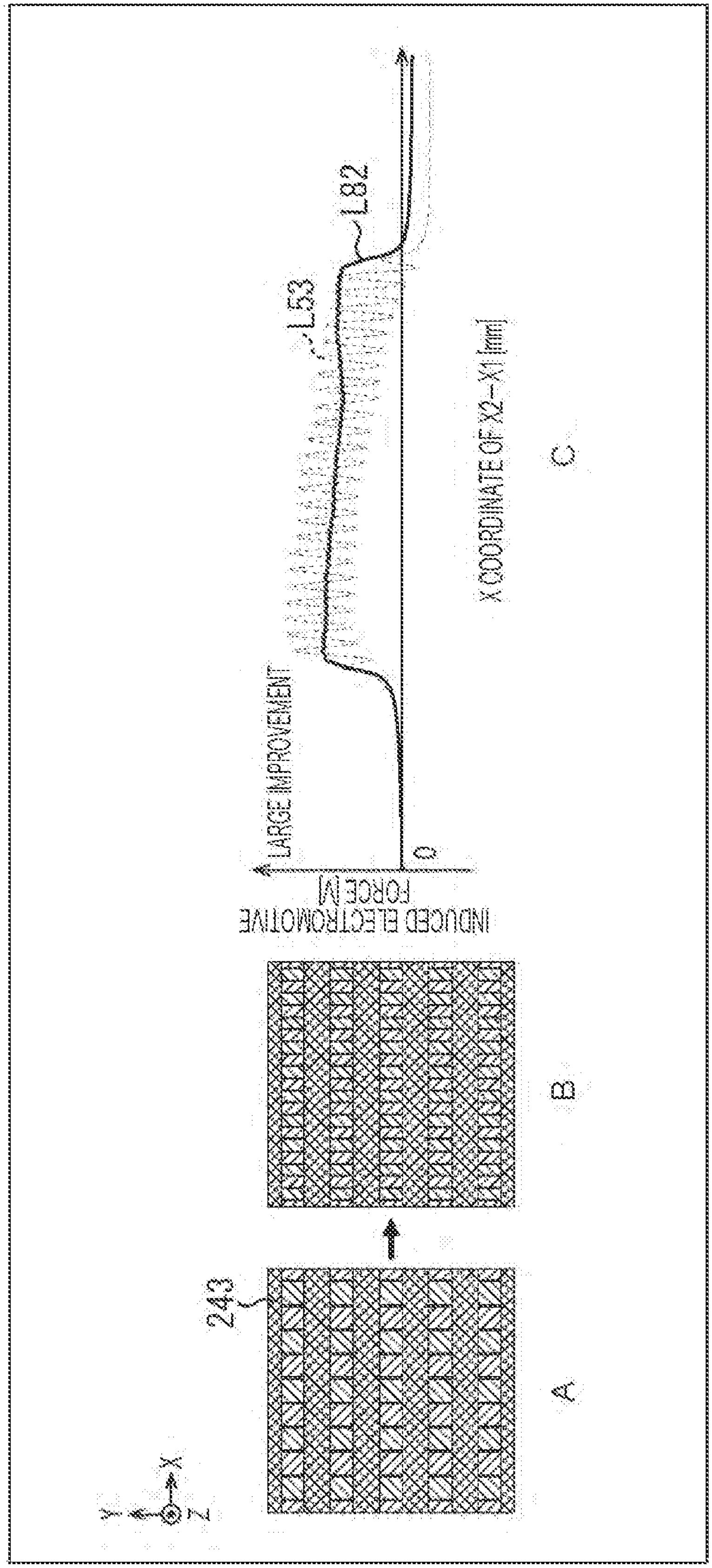
FIG. 47 is diagrams illustrating a modification in which the conductor period in the X direction of the fifth configuration example of the conductor layers A and B is deformed by a factor of ½ and an effect of the modification.

FIG. 47 is a diagram illustrating a modification in which the conductor period in the X direction of the fifth configuration example (FIG. 26) of the conductor layers A and B is deformed by a factor of ½ and an effect of the modification. Note that A in FIG. 47 illustrates the fifth configuration example of the conductor layers A and B, and B in FIG. 47 illustrates the modification of the fifth configuration example of the conductor layers A and B.

C in FIG. 47 illustrates a change in the induced electromotive force that causes the inductive noise in an image, as a simulation result of a case where the modification illustrated in B in FIG. 47 is applied to the solid-state imaging device 100. Note that the current condition of the current flowing in this modification is similar to the case illustrated in FIG. 23. The horizontal axis in FIG. 47 represents X-axis coordinates of the image, and the vertical axis represents the magnitude of the induced electromotive force.

The solid line L82 in C in FIG. 47 corresponds to the modification illustrated in B in FIG. 47, and the dotted line L53 corresponds to the fifth configuration example (FIG. 26). As is clear from the comparison between the solid line L82 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figure 48:
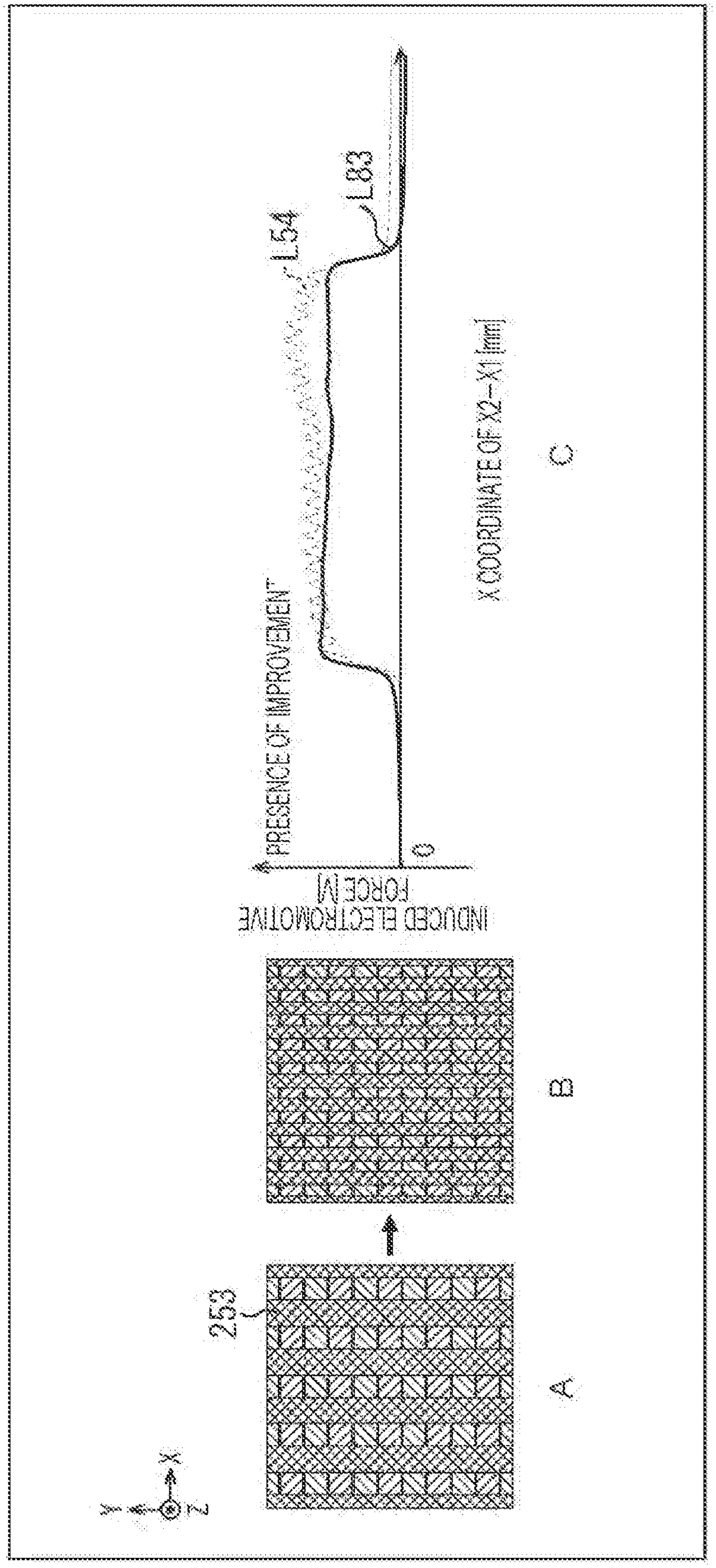
FIG. 48 is diagrams illustrating a modification in which the conductor period in the X direction of the sixth configuration example of the conductor layers A and B is deformed by a factor of ½ and an effect of the modification.

FIG. 48 is a diagram illustrating a modification in which the conductor period in the X direction of the sixth configuration example (FIG. 27) of the conductor layers A and B is deformed by a factor of ½ and an effect of the modification. Note that A in FIG. 48 illustrates the sixth configuration example of the conductor layers A and B, and B in FIG. 48 illustrates the modification of the sixth configuration example of the conductor layers A and B.

C in FIG. 48 illustrates a change in the induced electromotive force that causes the inductive noise in an image, as a simulation result of a case where the modification illustrated in B in FIG. 48 is applied to the solid-state imaging device 100. Note that the current condition of the current flowing in this modification is similar to the case illustrated in FIG. 23. The horizontal axis in FIG. 48 represents X-axis coordinates of the image, and the vertical axis represents the magnitude of the induced electromotive force.

The solid line L83 in C in FIG. 48 corresponds to the modification illustrated in B in FIG. 48, and the dotted line L54 corresponds to the sixth configuration example (FIG. 27). As is clear by comparing the solid line L83 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

Figure 49:
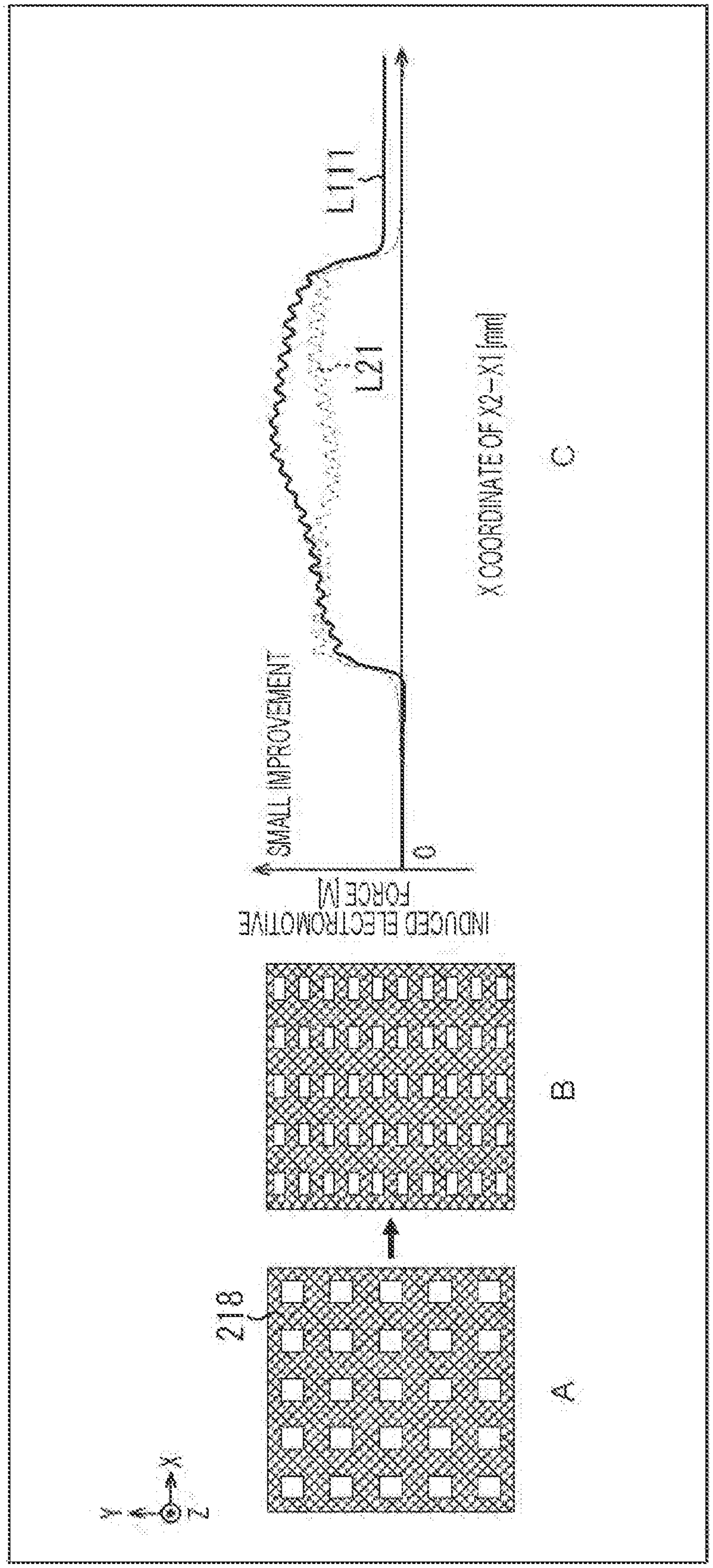
FIG. 49 is diagrams illustrating a modification in which the conductor period in the Y direction of the second configuration example of the conductor layers A and B is deformed by a factor of ½ and an effect of the modification.

FIG. 49 is a diagram illustrating a modification in which the conductor period in the Y direction of the second configuration example (FIG. 15) of the conductor layers A and B is deformed by a factor of ½ and an effect of the modification. Note that A in FIG. 49 illustrates the second configuration example of the conductor layers A and B, and B in FIG. 49 illustrates the modification of the second configuration example of the conductor layers A and B.

C in FIG. 49 illustrates a change in the induced electromotive force that causes the inductive noise in an image, as a simulation result of a case where the modification illustrated in B in FIG. 49 is applied to the solid-state imaging device 100. Note that the current condition of the current flowing in this modification is similar to the case illustrated in FIG. 13. The horizontal axis in FIG. 49 represents X-axis coordinates of the image, and the vertical axis represents the magnitude of the induced electromotive force.

The solid line L111 in C in FIG. 49 corresponds to the modification illustrated in B in FIG. 49, and the dotted line L21 corresponds to the second configuration example. As is clear from the comparison between the solid line L111 and the dotted line L21, this modification has a slightly less change in the induced electromotive force to be generated in the Victim conductor loop than the second configuration example. Therefore, it can be seen that this modification can slightly suppress the inductive noise as compared with the second configuration example.

Figure 50:
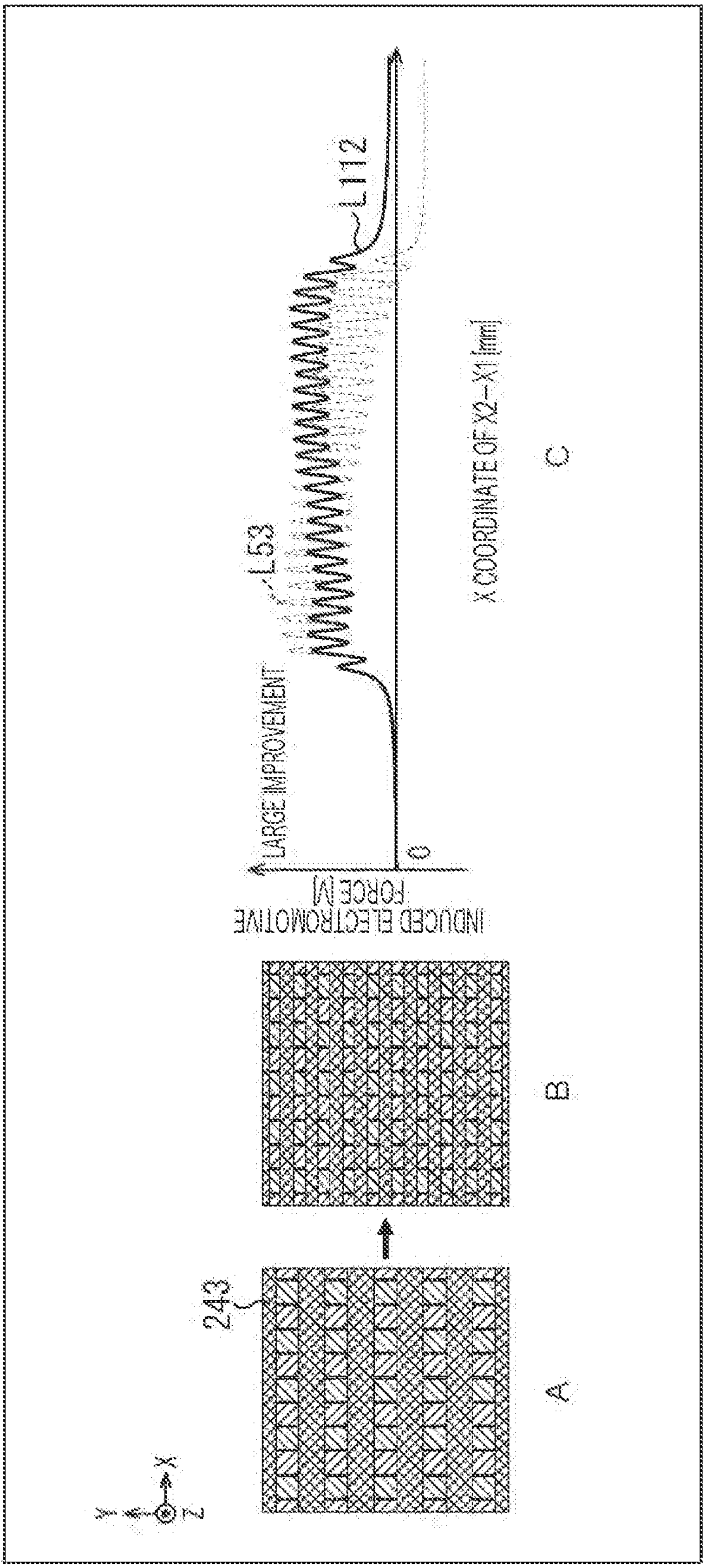
FIG. 50 is diagrams illustrating a modification in which the conductor period in the Y direction of the fifth configuration example of the conductor layers A and B is deformed by a factor of ½ and an effect of the modification.

FIG. 50 is a diagram illustrating a modification in which the conductor period in the Y direction of the fifth configuration example (FIG. 26) of the conductor layers A and B is deformed by a factor of ½ and an effect of the modification. Note that A in FIG. 50 illustrates the fifth configuration example of the conductor layers A and B, and B in FIG. 50 illustrates the modification of the fifth configuration example of the conductor layers A and B.

C in FIG. 50 illustrates a change in the induced electromotive force that causes the inductive noise in an image, as a simulation result of a case where the modification illustrated in B in FIG. 50 is applied to the solid-state imaging device 100. Note that the current condition of the current flowing in this modification is similar to the case illustrated in FIG. 23. The horizontal axis in FIG. 50 represents X-axis coordinates of the image, and the vertical axis represents the magnitude of the induced electromotive force.

The solid line L112 in C in FIG. 50 corresponds to the modification illustrated in B in FIG. 50, and the dotted line L53 corresponds to the fifth configuration example. As is clear from the comparison between the solid line L112 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figure 51:
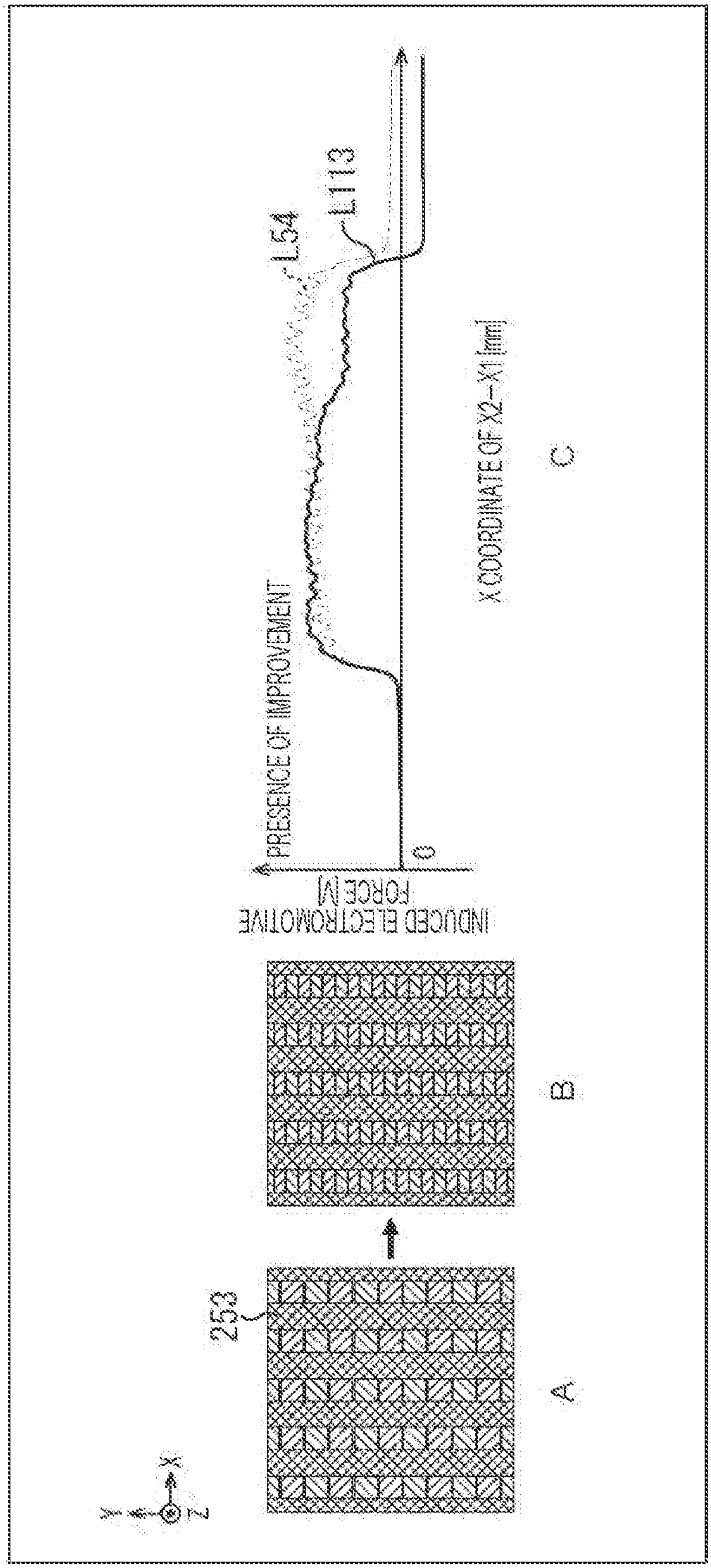
FIG. 51 is diagrams illustrating a modification in which the conductor period in the Y direction of the sixth configuration example of the conductor layers A and B is deformed by a factor of ½ and an effect of the modification.

FIG. 51 is a diagram illustrating a modification in which the conductor period in the Y direction of the sixth configuration example (FIG. 27) of the conductor layers A and B is deformed by a factor of ½ and an effect of the modification. Note that A in FIG. 51 illustrates the sixth configuration example of the conductor layers A and B, and B in FIG. 51 illustrates the modification of the sixth configuration example of the conductor layers A and B.

C in FIG. 51 illustrates a change in the induced electromotive force that causes the inductive noise in an image, as a simulation result of a case where the modification illustrated in B in FIG. 51 is applied to the solid-state imaging device 100. Note that the current condition of the current flowing in this modification is similar to the case illustrated in FIG. 23. The horizontal axis in FIG. 51 represents X-axis coordinates of the image, and the vertical axis represents the magnitude of the induced electromotive force.

The solid line L113 in C in FIG. 51 corresponds to the modification illustrated in B in FIG. 51, and the dotted line L54 corresponds to the sixth configuration example. As is clear by comparing the solid line L113 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

Figure 52:
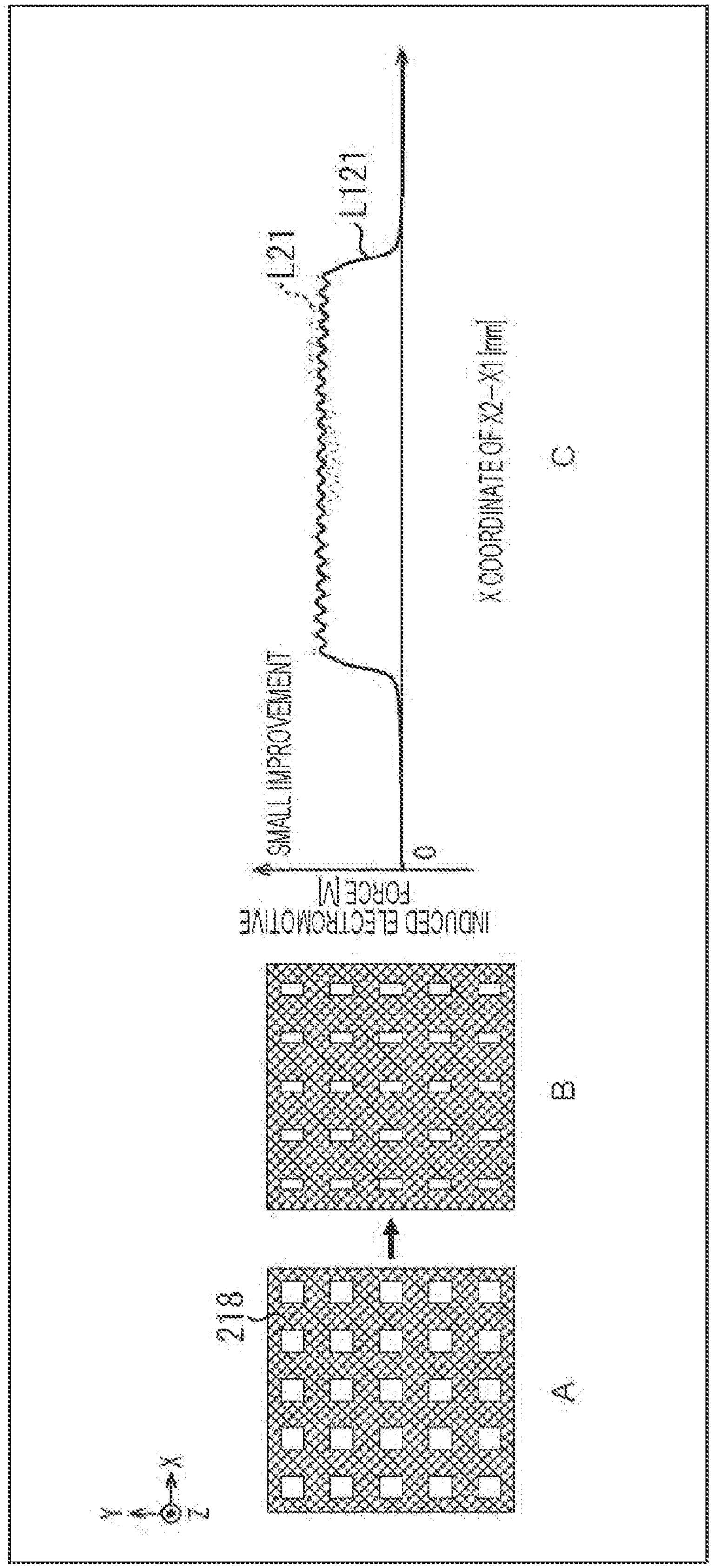
FIG. 52 is diagrams illustrating a modification in which a conductor width in the X direction of the second configuration example of the conductor layers A and B is deformed by a factor of 2 and an effect of the modification.

FIG. 52 is a diagram illustrating a modification in which the conductor width in the X direction of the second configuration example (FIG. 15) of the conductor layers A and B is deformed by a factor of 2 and an effect of the modification. Note that A in FIG. 52 illustrates the second configuration example of the conductor layers A and B, and B in FIG. 52 illustrates the modification of the second configuration example of the conductor layers A and B.

C in FIG. 52 illustrates a change in the induced electromotive force that causes the inductive noise in an image, as a simulation result of a case where the modification illustrated in B in FIG. 52 is applied to the solid-state imaging device 100. Note that the current condition of the current flowing in this modification is similar to the case illustrated in FIG. 13. The horizontal axis in FIG. 52 represents X-axis coordinates of the image, and the vertical axis represents the magnitude of the induced electromotive force.

The solid line L121 in C in FIG. 52 corresponds to the modification illustrated in B in FIG. 52, and the dotted line L21 corresponds to the second configuration example. As is clear from the comparison between the solid line L121 and the dotted line L21, this modification has a slightly less change in the induced electromotive force to be generated in the Victim conductor loop than in the second configuration example. Therefore, it can be seen that this modification can slightly suppress the inductive noise as compared with the second configuration example.

Figure 53:
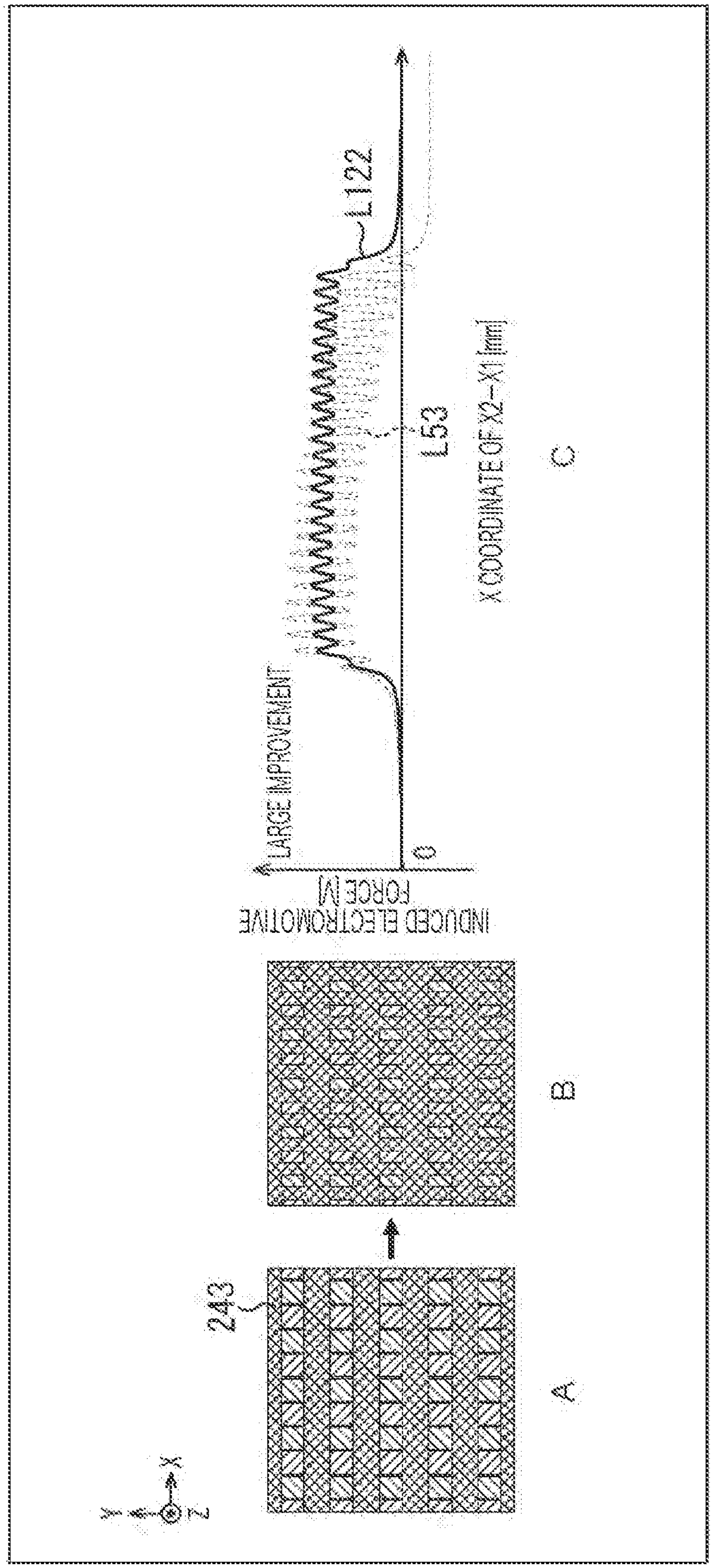
FIG. 53 is diagrams illustrating a modification in which the conductor width in the X direction of the fifth configuration example of the conductor layers A and B is deformed by a factor of 2 and an effect of the modification.

FIG. 53 is a diagram illustrating a modification in which the conductor width in the X direction of the fifth configuration example (FIG. 26) of the conductor layers A and B is deformed by a factor of 2 and an effect of the modification. Note that A in FIG. 53 illustrates the fifth configuration example of the conductor layers A and B, and B in FIG. 53 illustrates the modification of the fifth configuration example of the conductor layers A and B.

C in FIG. 53 illustrates a change in the induced electromotive force that causes the inductive noise in an image, as a simulation result of a case where the modification illustrated in B in FIG. 53 is applied to the solid-state imaging device 100. Note that the current condition of the current flowing in this modification is similar to the case illustrated in FIG. 23. The horizontal axis in FIG. 53 represents X-axis coordinates of the image, and the vertical axis represents the magnitude of the induced electromotive force.

The solid line L122 in C in FIG. 53 corresponds to the modification illustrated in B in FIG. 53, and the dotted line L53 corresponds to the fifth configuration example. As is clear from the comparison between the solid line L122 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figure 54:
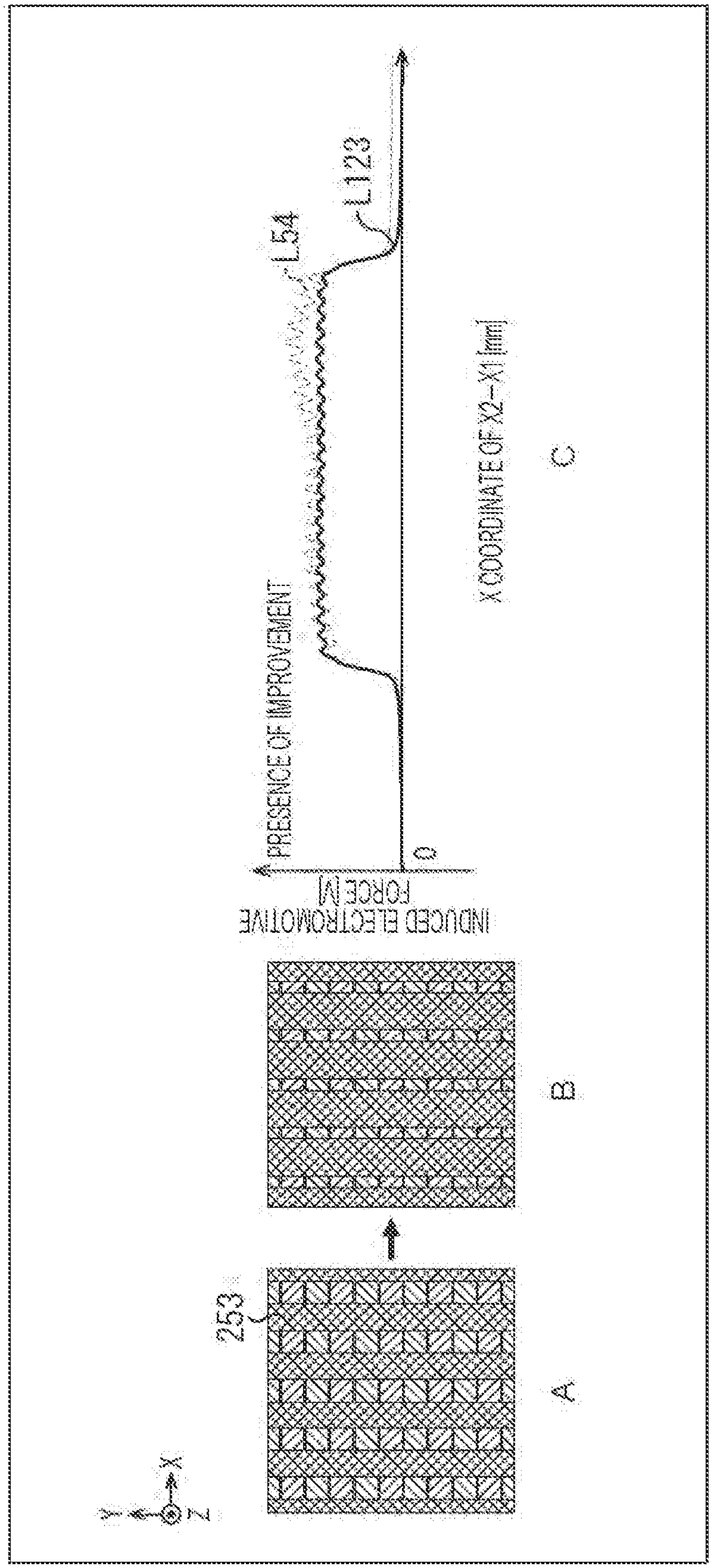
FIG. 54 is diagrams illustrating a modification in which the conductor width in the X direction of the sixth configuration example of the conductor layers A and B is deformed by a factor of 2 and an effect of the modification.

FIG. 54 is a diagram illustrating a modification in which the conductor width in the X direction of the sixth configuration example (FIG. 27) of the conductor layers A and B is deformed by a factor of 2 and an effect of the modification. Note that A in FIG. 54 illustrates the sixth configuration example of the conductor layers A and B, and B in FIG. 54 illustrates the modification of the sixth configuration example of the conductor layers A and B.

C in FIG. 54 illustrates a change in the induced electromotive force that causes the inductive noise in an image, as a simulation result of a case where the modification illustrated in B in FIG. 54 is applied to the solid-state imaging device 100. Note that the current condition of the current flowing in this modification is similar to the case illustrated in FIG. 23. The horizontal axis in FIG. 54 represents X-axis coordinates of the image, and the vertical axis represents the magnitude of the induced electromotive force.

The solid line L123 in C in FIG. 54 corresponds to the modification illustrated in B in FIG. 54, and the dotted line L54 corresponds to the sixth configuration example. As is clear from the comparison between the solid line L123 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

Figure 55:
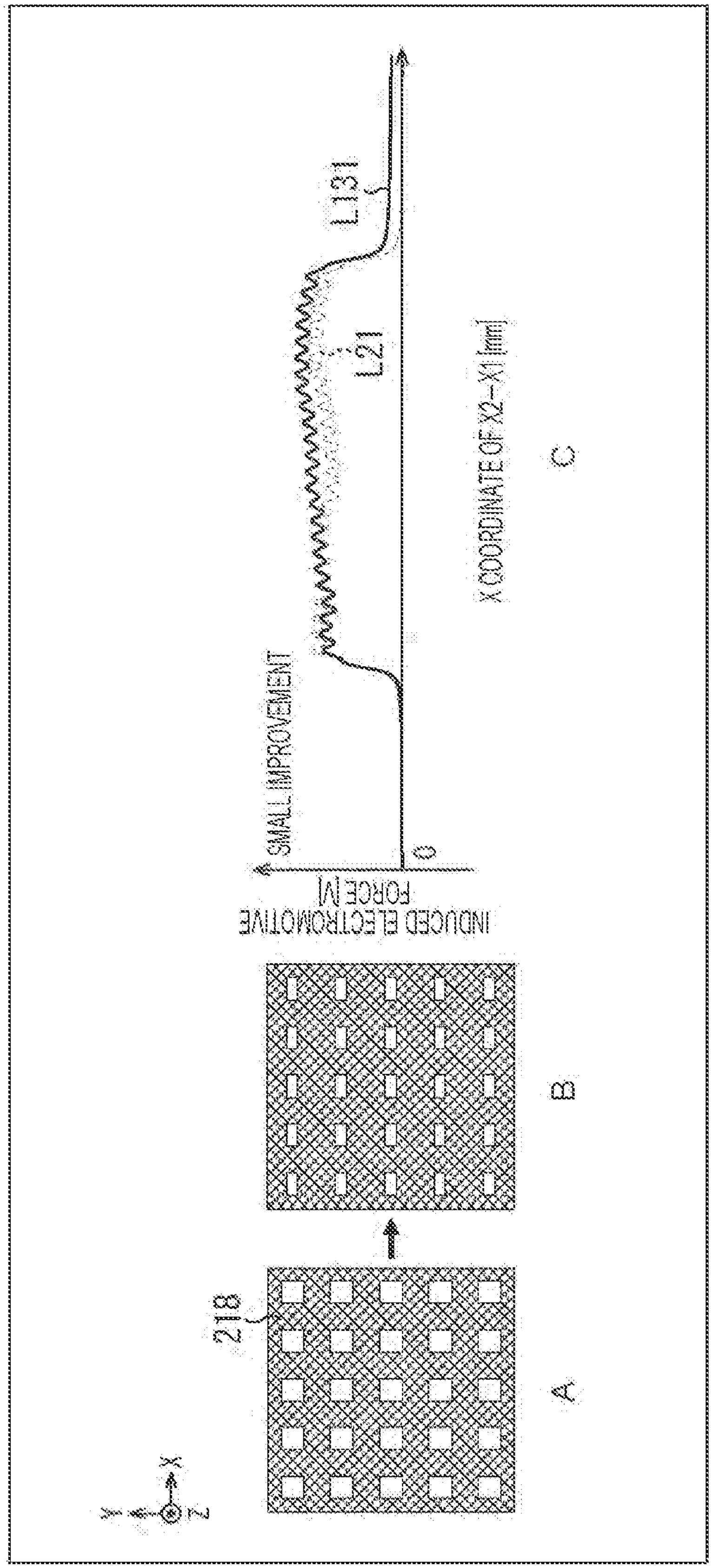
FIG. 55 is diagrams illustrating a modification in which the conductor width in the Y direction of the second configuration example of the conductor layers A and B is deformed by a factor of 2 and an effect of the modification.

FIG. 55 is a diagram illustrating a modification in which the conductor width in the Y direction of the second configuration example (FIG. 15) of the conductor layers A and B is deformed by a factor of 2 and an effect of the modification. Note that A in FIG. 55 illustrates the second configuration example of the conductor layers A and B, and B in FIG. 55 illustrates the modification of the second configuration example of the conductor layers A and B.

C in FIG. 55 illustrates a change in the induced electromotive force that causes the inductive noise in an image, as a simulation result of a case where the modification illustrated in B in FIG. 55 is applied to the solid-state imaging device 100. Note that the current condition of the current flowing in this modification is similar to the case illustrated in FIG. 13. The horizontal axis in FIG. 55 represents X-axis coordinates of the image, and the vertical axis represents the magnitude of the induced electromotive force.

The solid line L131 in C in FIG. 55 corresponds to the modification illustrated in B in FIG. 55, and the dotted line L21 corresponds to the second configuration example. As is clear from the comparison between the solid line L131 and the dotted line L21, this modification has a slightly less change in the induced electromotive force to be generated in the Victim conductor loop than the second configuration example. Therefore, it can be seen that this modification can slightly suppress the inductive noise as compared with the second configuration example.

Figure 56:
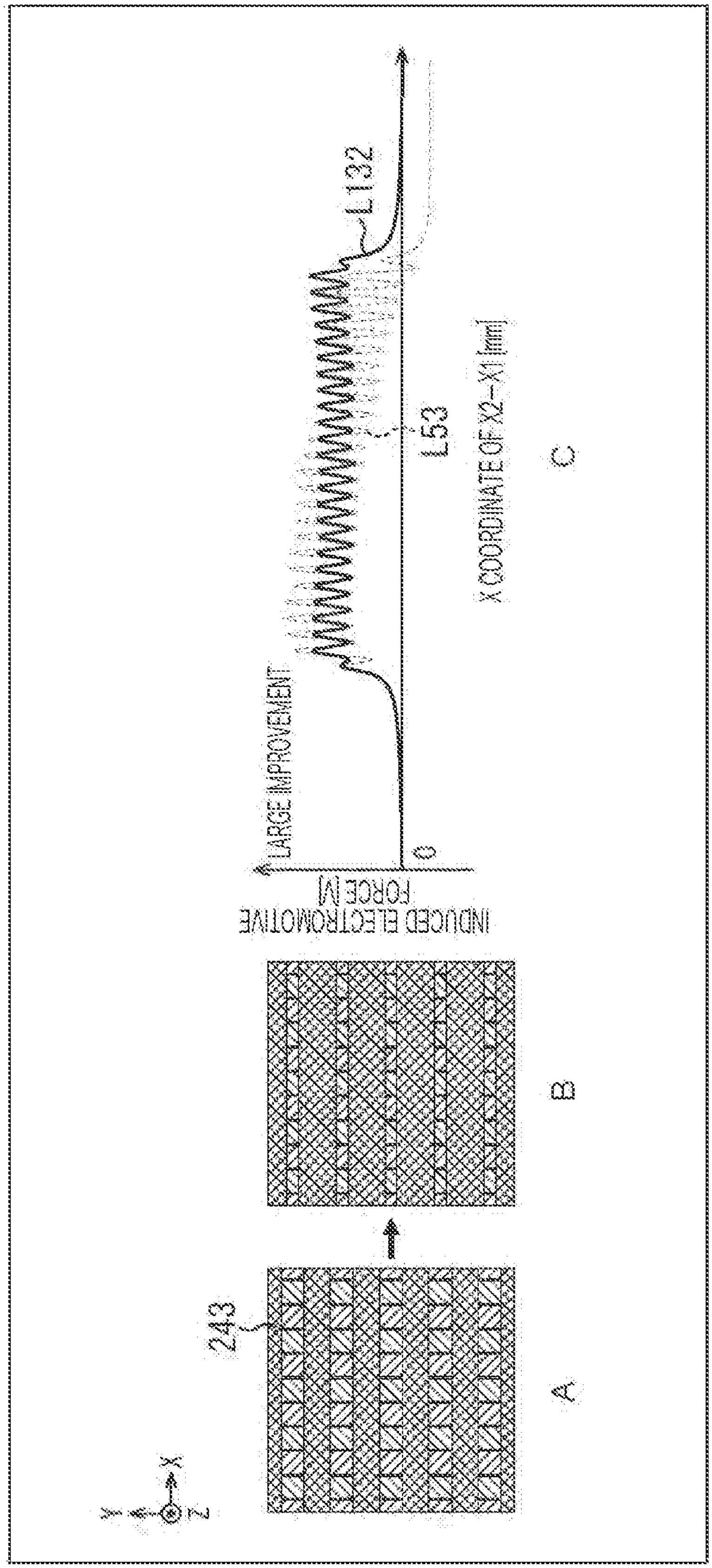
FIG. 56 is diagrams illustrating a modification in which the conductor width in the Y direction of the fifth configuration example of the conductor layers A and B is deformed by a factor of 2 and an effect of the modification.

FIG. 56 is a diagram illustrating a modification in which the conductor width in the Y direction of the fifth configuration example (FIG. 26) of the conductor layers A and B is deformed by a factor of 2 and an effect of the modification. Note that A in FIG. 56 illustrates the fifth configuration example of the conductor layers A and B, and B in FIG. 56 illustrates the modification of the fifth configuration example of the conductor layers A and B.

C in FIG. 56 illustrates a change in the induced electromotive force that causes the inductive noise in an image, as a simulation result of a case where the modification illustrated in B in FIG. 56 is applied to the solid-state imaging device 100. Note that the current condition of the current flowing in this modification is similar to the case illustrated in FIG. 23. The horizontal axis in FIG. 56 represents X-axis coordinates of the image, and the vertical axis represents the magnitude of the induced electromotive force.

The solid line L132 in C in FIG. 56 corresponds to the modification illustrated in B in FIG. 56, and the dotted line L53 corresponds to the fifth configuration example. As is clear from the comparison between the solid line L132 and the dotted line L53, this modification has a very little change in the induced electromotive force to be generated in the Victim conductor loop as compared with the fifth configuration example. Therefore, it can be seen that this modification can further suppress the inductive noise as compared with the fifth configuration example.

Figure 57:
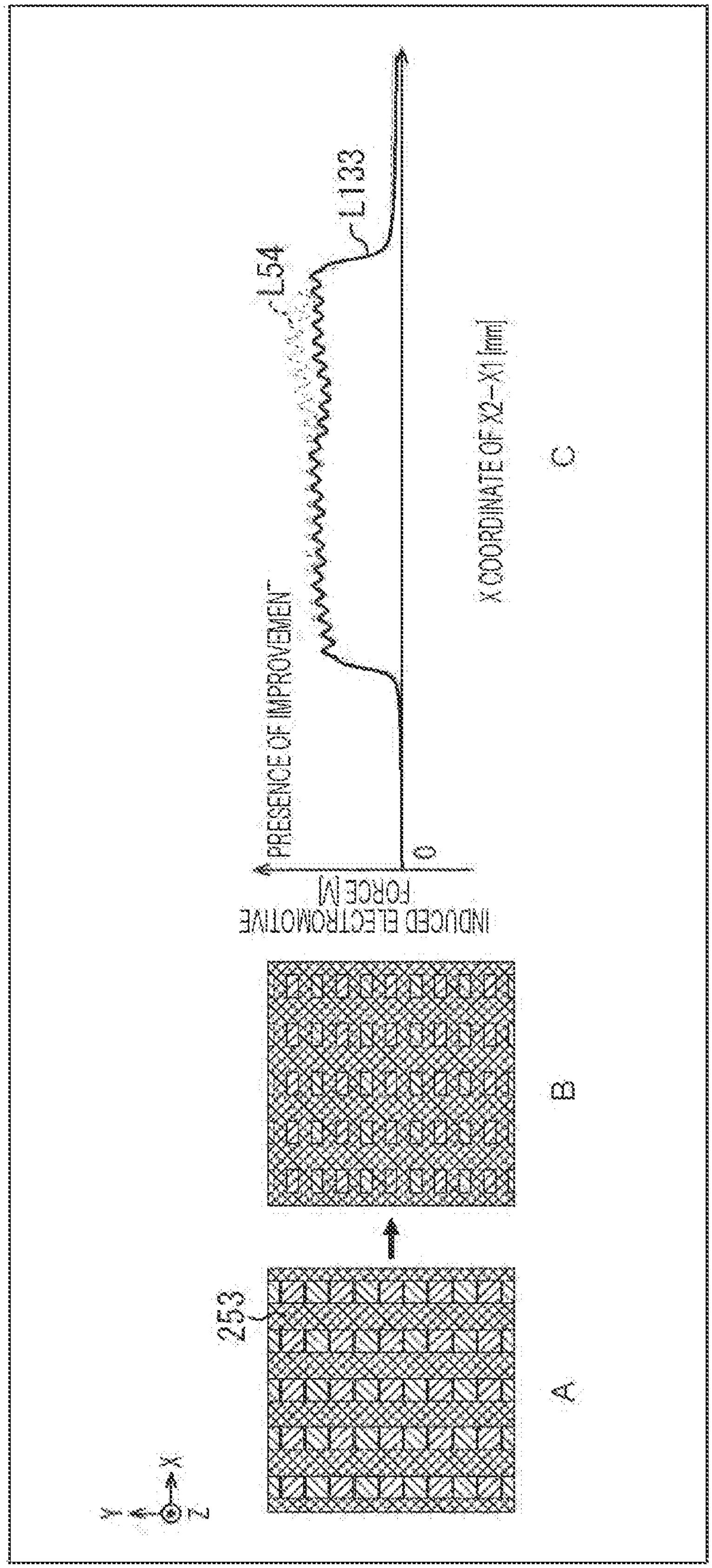
FIG. 57 is diagrams illustrating a modification in which the conductor width in the Y direction of the sixth configuration example of the conductor layers A and B is deformed by a factor of 2 and an effect of the modification.

FIG. 57 is a diagram illustrating a modification in which the conductor width in the Y direction of the sixth configuration example (FIG. 27) of the conductor layers A and B is deformed by a factor of 2 and an effect of the modification. Note that A in FIG. 57 illustrates the sixth configuration example of the conductor layers A and B, and B in FIG. 57 illustrates the modification of the sixth configuration example of the conductor layers A and B.

C in FIG. 57 illustrates a change in the induced electromotive force that causes the inductive noise in an image, as a simulation result of a case where the modification illustrated in B in FIG. 57 is applied to the solid-state imaging device 100. Note that the current condition of the current flowing in this modification is similar to the case illustrated in FIG. 23. The horizontal axis in FIG. 57 represents X-axis coordinates of the image, and the vertical axis represents the magnitude of the induced electromotive force.

The solid line L133 in C in FIG. 57 corresponds to the modification illustrated in B in FIG. 57, and the dotted line L54 corresponds to the sixth configuration example. As is clear from the comparison between the solid line L133 and the dotted line L54, this modification has a smaller change in the induced electromotive force to be generated in the Victim conductor loop than the sixth configuration example. Therefore, it can be seen that this modification can further suppress the inductive noise as compared with the sixth configuration example.

7. Modification of Reticulated Conductor

Figure 58:
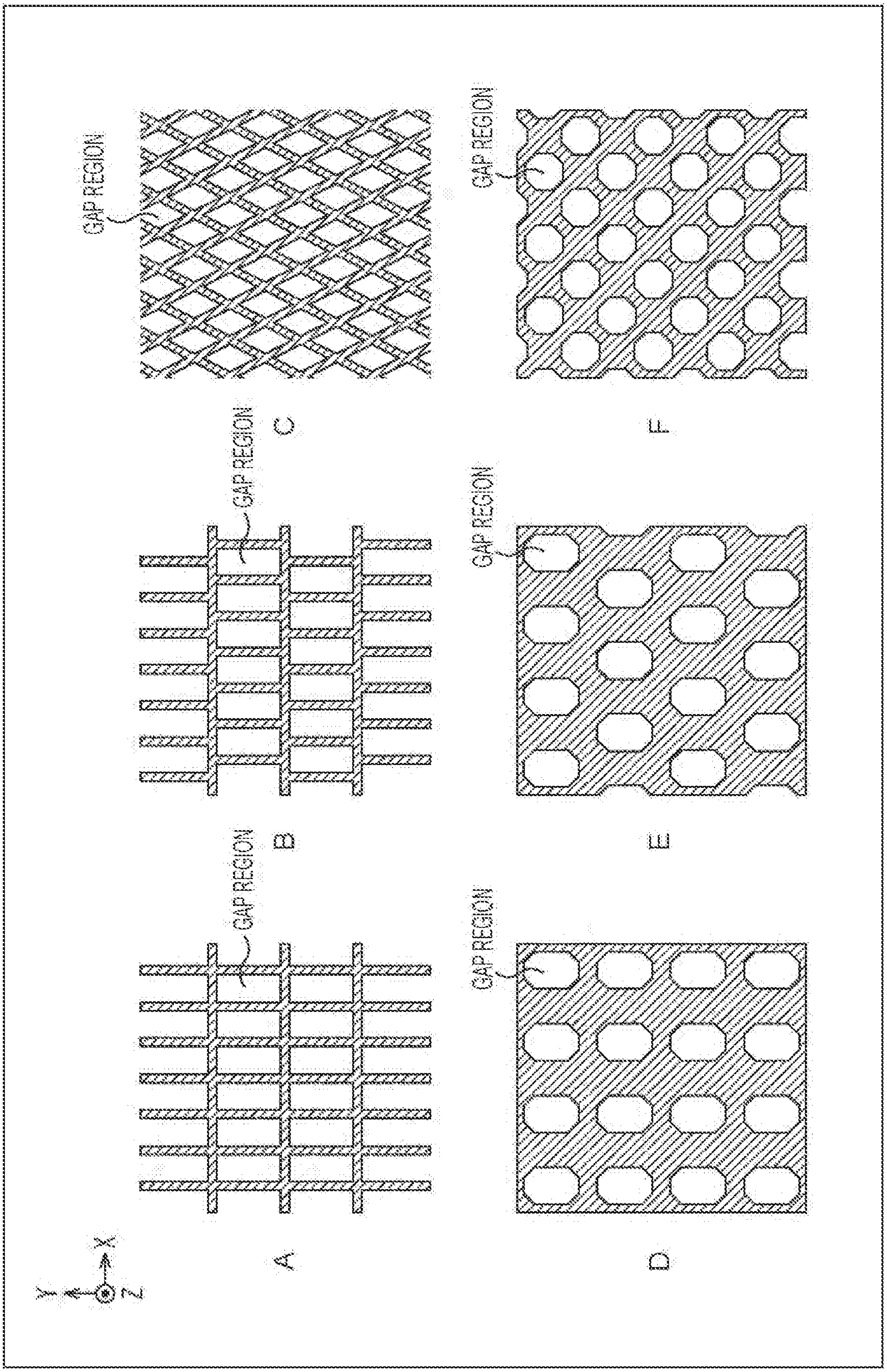
FIG. 58 is diagrams illustrating modifications of reticulated conductors forming configuration examples of the conductor layers A and B.

Next, FIG. 58 is plan views illustrating modifications of the reticulated conductor applicable to each of the above-described configuration examples of the conductor layers A and B.

A in FIG. 58 is simplified illustration of the shape of the reticulated conductor used in each of the above-described configuration examples of the conductor layers A and B. The reticulated conductor adopted in each of the above-described configuration examples of the conductor layers A and B has a rectangular gap region, and the rectangular gap regions are linearly arranged in the X direction and the Y direction.

B in FIG. 58 is simplified illustration of a first modification of the reticulated conductor. In the first modification of the reticulated conductor, the gap region is rectangular, and the gap regions are linearly arranged in the X direction and are arranged in the Y direction with a stepwise shift.

C in FIG. 58 is simplified illustration of a second modification of the reticulated conductor. In the second modification of the reticulated conductor, the gap region is rhombic, and the gap regions are linearly arranged in a diagonal direction.

D in FIG. 58 is simplified illustration of a third modification of the reticulated conductor. In the third modification of the reticulated conductor, the gap region is circular or polygonal other than rectangular (octagonal in the case of D in FIG. 58), and the gap regions are linearly arranged in the X direction and the Y direction.

E in FIG. 58 is simplified illustration of a fourth modification of the reticulated conductor. In the fourth modification of the reticulated conductor, the gap region is circular or polygonal other than rectangular (octagonal in the case of E in FIG. 58), and the gap regions are linearly arranged in the X direction, and are arranged in the Y direction with a stepwise shift.

F in FIG. 58 is simplified illustration of a fifth modification of the reticulated conductor. In the fifth modification of the reticulated conductor, the gap region is circular or polygonal other than rectangular (octagonal in the case of F in FIG. 58), and the gap regions are linearly arranged in the diagonal direction.

Note that the shape of the reticulated conductor applicable to each configuration example of the conductor layers A and B is not limited to the modifications illustrated in FIG. 58 as long as the shape is reticulated.

8. Various Effects

<Improvement of Degree of Freedom in Layout Design>

As described above, in each of the configuration examples of the conductor layers A and B, the planar conductor or the reticulated conductor is adopted. In general, the reticulated conductor (lattice conductor) has a wiring structure that is periodic in the X direction and the Y direction. Therefore, by designing the reticulated conductor having a basic periodic structure that is a unit of the periodic structure (for one period) and repeatedly arranging the basic periodic structure in the X direction and the Y direction, the wiring layout can be more easily designed than the case of using the linear conductor. In other words, in the case of using the reticulated conductor, the degree of freedom in layout is improved as compared with the case of using the linear conductor. Therefore, the man-hours, time, and cost required for the layout design can be reduced.

Figure 59:
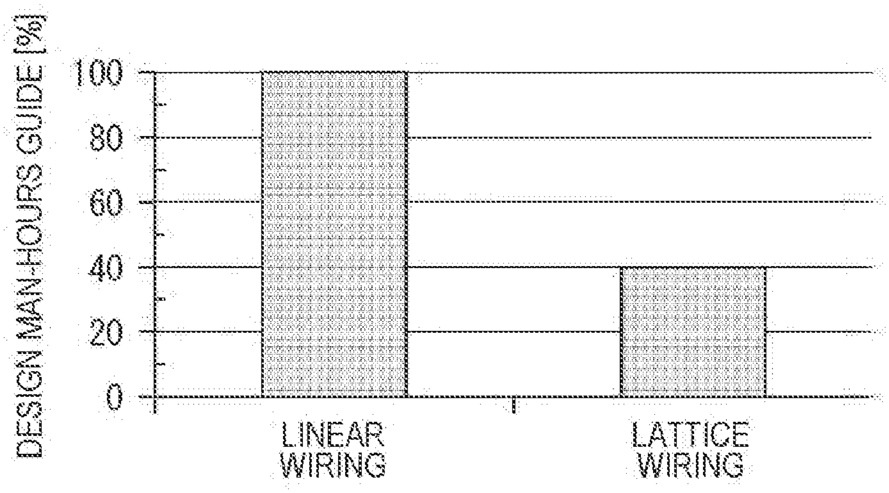
FIG. 59 is a diagram for describing improvement of layout freedom.

FIG. 59 simulates the design man-hours in the case of using the linear conductor and the case of using the reticulated conductor (lattice conductor) in designing the circuit wiring layout that satisfies a predetermined condition.

In the case of FIG. 59, when the design man-hours in designing the layout using the linear conductor is 100%, the design man-hours in designing the layout using the reticulated conductor (lattice conductor) is about 40%, which can be seen that the man-hours can significantly be reduced.

<Reduction of Voltage Drop (IR-Drop)>

Figure 60:
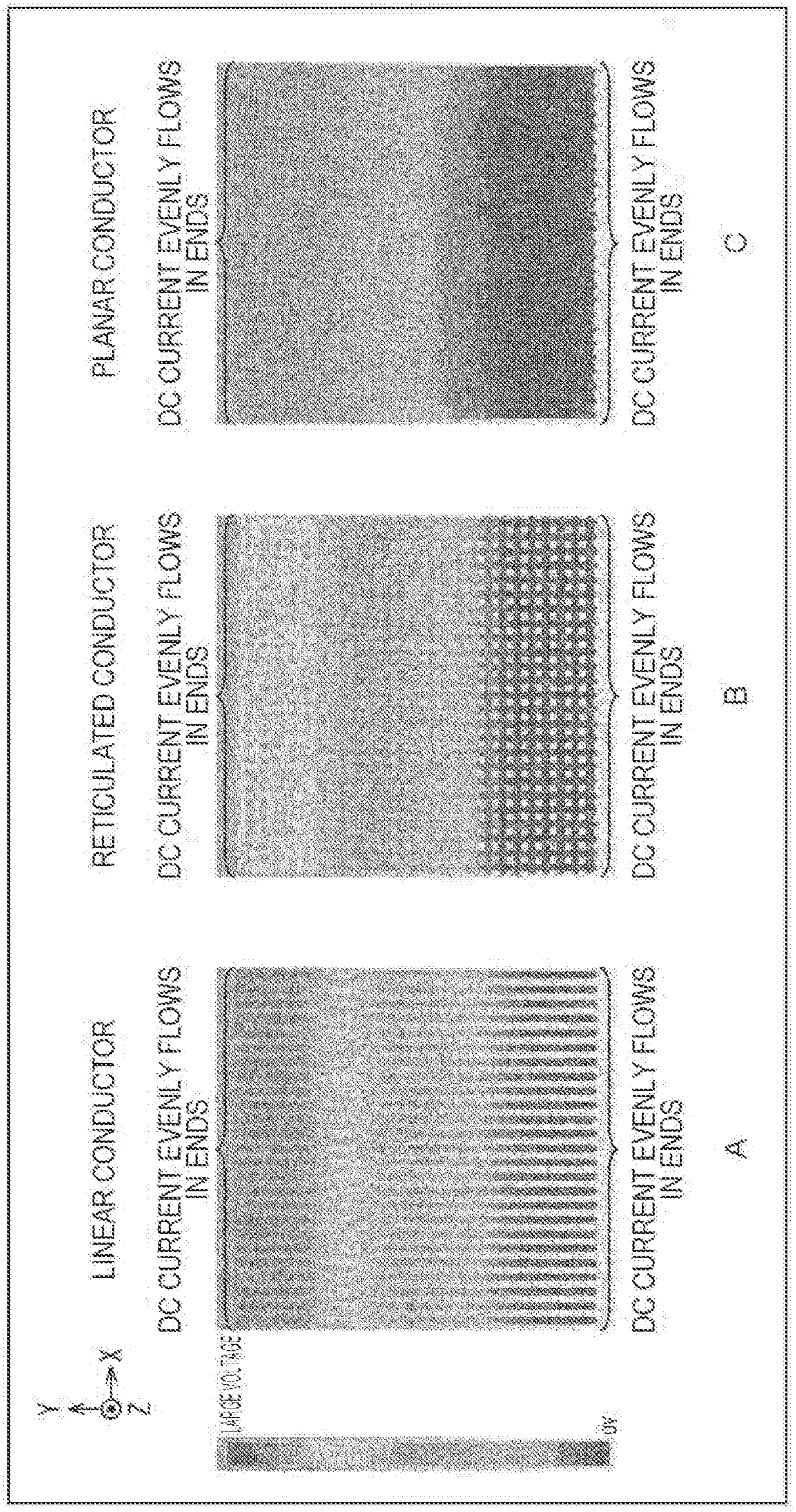
FIG. 60 is diagrams for describing a reduction in voltage drop (IR-Drop).

FIG. 60 is diagrams illustrating a voltage change in a case of causing a DC current to flow in the Y direction under the same condition through conductors of the same material but different shapes arranged on the XY plane.

A in FIG. 60 corresponds to the linear conductor, B in FIG. 60 corresponds to the reticulated conductor, and C in FIG. 60 corresponds to the planar conductor. The shade of color represents the voltage. Comparing A, B, and C in FIG. 60, it can be seen that the voltage change is the largest in the linear conductor, followed by the reticulated conductor and the planar conductor in that order.

Figure 61:
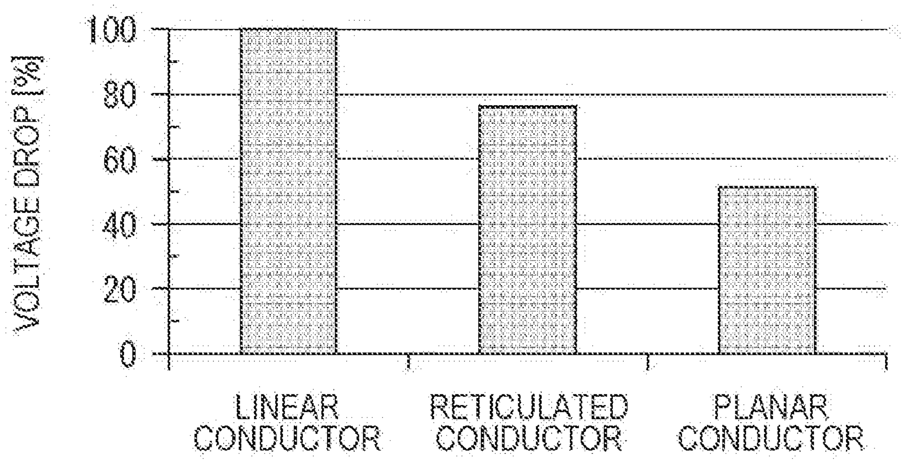
FIG. 61 is a diagram for describing a reduction in voltage drop (IR-Drop).

FIG. 61 is a diagram illustrating a relative graph of the voltage drops of the linear conductor, the reticulated conductor, and the planar conductor, assuming that the voltage drop of the linear conductor illustrated in A in FIG. 60 is 100%.

As is clear from FIG. 61, it can be seen that the planar conductor and the reticulated conductor can reduce the voltage drop (IR-Drop), which can be a fatal obstacle to the driving of the semiconductor device, as compared with the linear conductor.

However, it is known that in many cases, the planar conductor cannot be manufactured in the current semiconductor substrate manufacturing process. Therefore, it is realistic to adopt a configuration example using the reticulated conductor for both the conductor layers A and B. However, this does not apply to the case where the semiconductor substrate manufacturing process has been advanced to manufacture the planar conductor. There are some cases where the planar conductor can be manufactured for the uppermost metal or the lowermost metal in metal layers.

<Reduction of Capacitive Noise>

The conductor (planar conductor or reticulated conductor) forming the conductor layers A and B may cause not only the inductive noise but also capacitive noise for the Victim conductor loop including the signal line 132 and the control line 133.

Here, the capacitive noise refers to generation of a voltage in the signal line 132 and the control line 133 by capacitive coupling between the conductor forming the conductor layers A and B, and the signal line 132 and the control line 133, in a case where a voltage is applied to the conductor, and occurrence of voltage noise in the signal line 132 or the control line 133 as the applied voltage changes. This voltage noise becomes noise of the pixel signal.

The magnitude of the capacitive noise is considered to be substantially proportional to the capacitance and voltage between the conductor forming the conductor layers A and B and the wiring of the signal line 132, the control line 133, and the like. The capacitance is a capacitance $C=\varepsilon*S/d$ between two conductors in a case where an overlapping area of the two conductors (one may be a conductor and the other may be wiring) is S, the two conductors are arranged in parallel with a distance d, and a dielectric with a dielectric constant ε is uniformly added between the conductors. Therefore, it can be seen that the larger the overlapping area S of the two conductors, the larger the capacitive noise.

Figure 62:
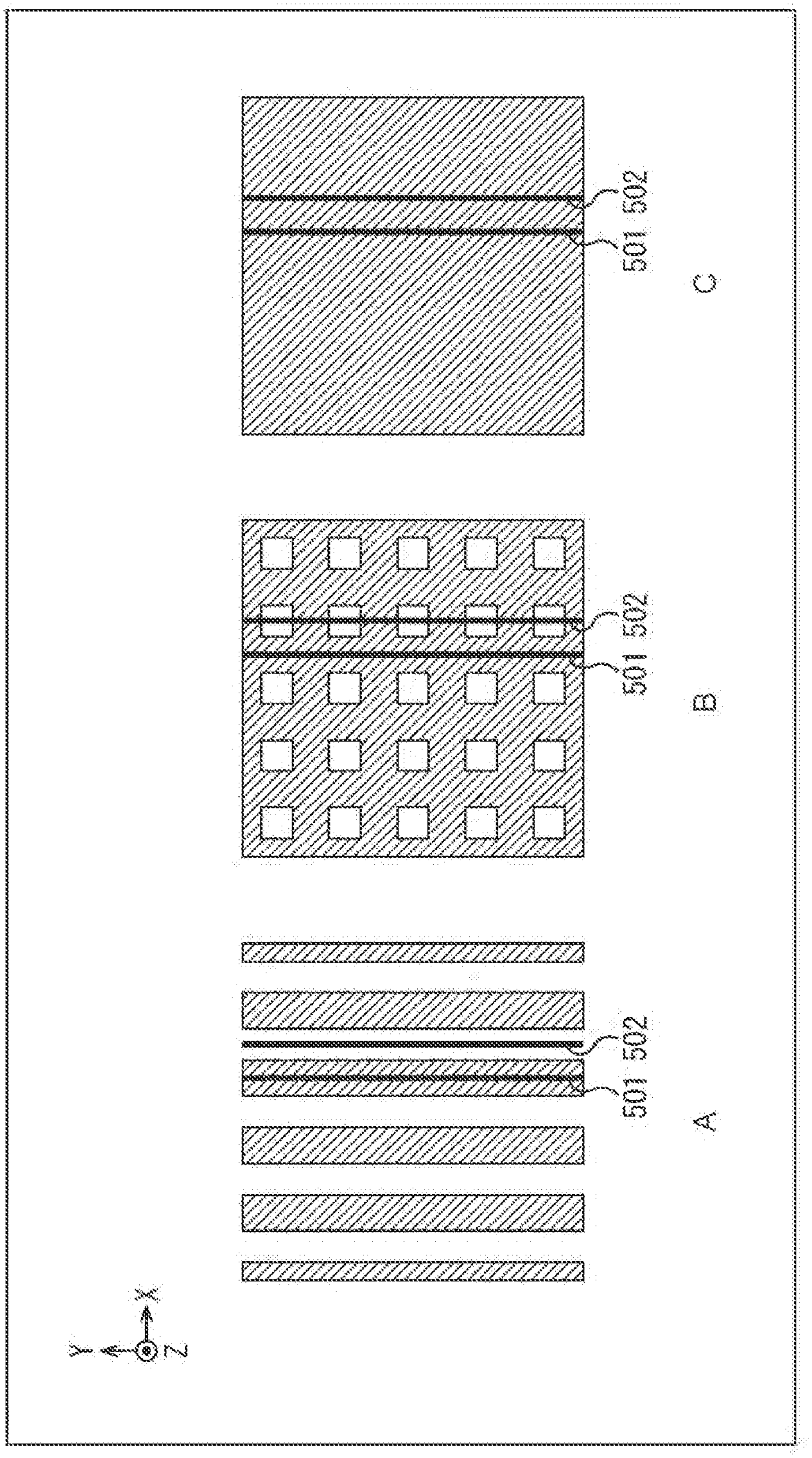
FIG. 62 is diagrams for describing reduction of capacitive noise.

FIG. 62 is diagrams for describing a difference in capacitance between conductors of the same material but different shapes arranged on the XY plane, and other conductors (wiring).

A in FIG. 62 corresponds to the linear conductor long in the Y direction and wirings 501 and 502 (corresponding to the signal line 132 and the control line 133) linearly formed in the Y direction with a space in the Z direction from the linear conductor. Note that the wiring 501 as a whole overlaps with the conductor region of the linear conductor, but the wiring 502 as a whole overlaps with the gap region of the linear conductor and does not have an area overlapping with the conductor region.

B in FIG. 62 corresponds to the reticulated conductor and wirings 501 and 502 linearly formed in the Y direction with a space in the Z direction from the reticulated conductor. Note that the wiring 501 as a whole overlaps with the conductor region of the reticulated conductor, but substantially half of the wiring 502 overlaps with the conductor region of the reticulated conductor.

C in FIG. 62 corresponds to the planar conductor and wirings 501 and 502 linearly formed in the Y direction with a space in the Z direction from the planar conductor. Note that the wirings 501 and 502 as a whole overlap with the conducting region of the planar conductor.

In a case of comparing the differences between the capacitance of the conductor (linear conductor, reticulated conductor, or planar conductor) and the wiring 501, and the capacitance of the conductor (linear conductor, reticulated conductor, or planar conductor) and the wiring 502 in A, B, and C in FIG. 62, the difference is the largest in the linear conductor, followed by the reticulated conductor and the planar conductor.

That is, in the linear conductor, the difference in capacitance between the linear conductor and the wiring is large due to the difference in the XY coordinates of the wiring, and generation of the capacitive noise is also significantly different. Therefore, there is a possibility of noise of a pixel signal having high visibility in an image.

In contrast, in the reticulated conductor and the planar conductor, the difference in capacitance between the conductor and the wiring due to the difference in the XY coordinates of the wiring is smaller than the linear conductor, and thus generation of the capacitive noise can be made smaller. Therefore, the noise of the pixel signal due to the capacitive noise can be suppressed.

<Reduction of Radioactive Noise>

As described above, the reticulated conductor is used in the configuration examples of the conductor layers A and B other than the first configuration example. The reticulated conductor can be expected to have an effect of reducing radioactive noise. Here, it is assumed that the radioactive noise includes radioactive noise (unnecessary radiation) from the inside to the outside of the solid-state imaging device 100 and radioactive noise (transmitted noise) from the outside to the inside of the solid-state imaging device 100.

Since the radioactive noise from the outside to the inside of the solid-state imaging device 100 can generate voltage noise and pixel signal noise in the signal line 132 and the like, the effect of suppressing the voltage noise and pixel signal noise can be expected in a case of adopting a configuration example using the reticulated conductor for at least one of the conductor layer A or B.

Since the conductor period of the reticulated conductor affects a frequency band of the radioactive noise that can be reduced by the reticulated conductor, the radioactive noise in a broader frequency band can be reduced in a case of using the reticulated conductors having different conductor periods for the conductor layers A and B than a case of using the reticulated conductors having the same conductor frequency for the conductor layers A and B.

Note that the above-described effects are merely examples and are not limited, and other effects may be exhibited.

9. Configuration Example with Different Drawing Portion

By the way, in the case where the wiring layer 165A as the conductor layer A or the wiring layer 165B as the conductor layer B is connected to the pad 401 or 402, for example, a wiring lead-out portion for being connected to the pad 401 or 402 is provided, as illustrated in FIGS. 42 to 44. The wiring lead-out portion is usually formed to have a narrow wiring width according to the size of the pad.

Figure 63:
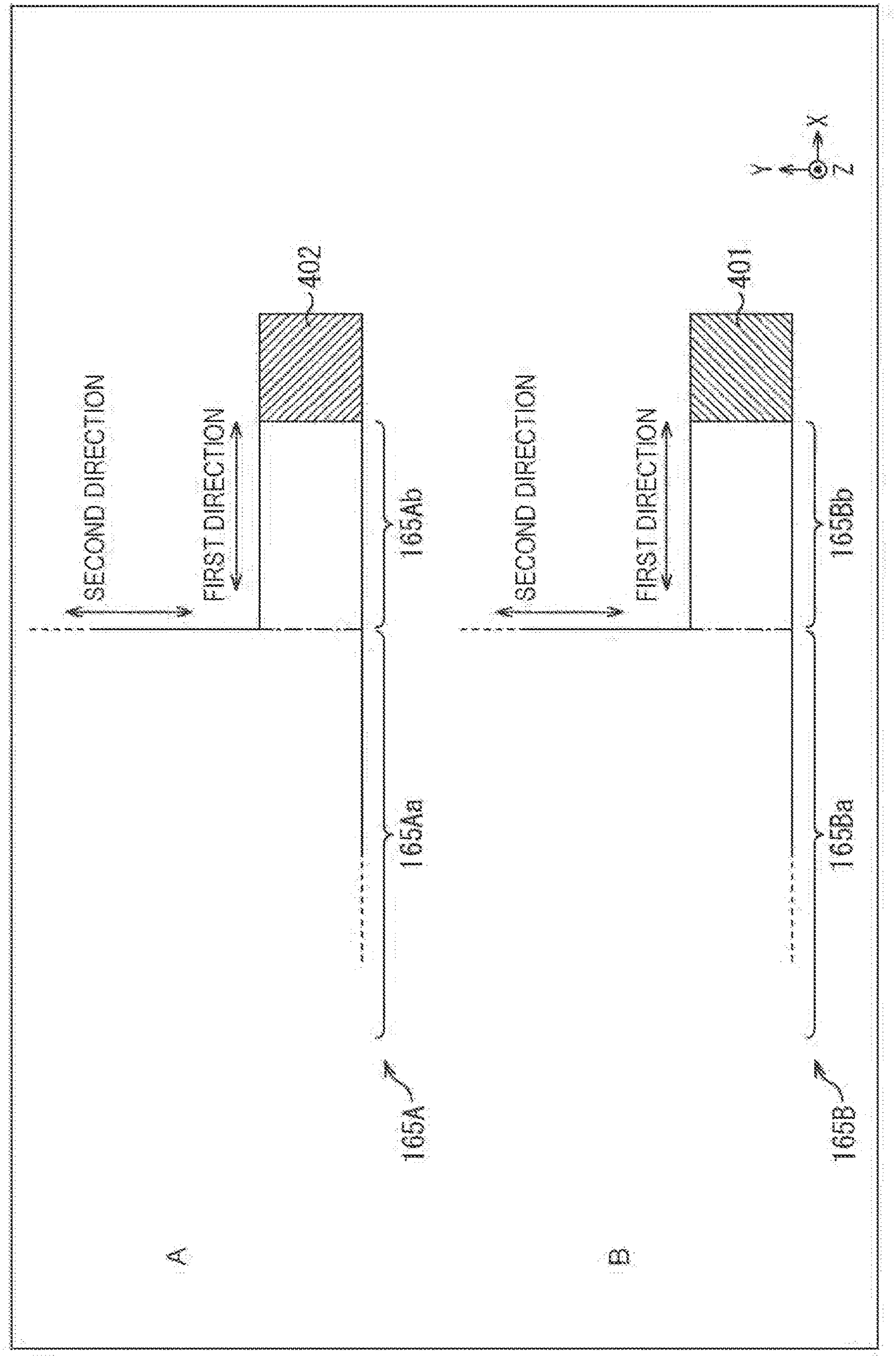
FIG. 63 is diagrams for illustrating a main conductor portion and a lead-out conductor portion of a conductor layer.

Therefore, consider the case by dividing the wiring layer 165A (conductor layer A) into a main conductor portion 165Aa and a lead-out conductor portion 165Ab as illustrated in A in FIG. 63. The main conductor portion 165Aa is a portion provided to mainly shield the hot carrier light emission from the active element group 167 and suppress generation of the inductive noise, and has a larger area than the lead-out conductor portion 165Ab. The lead-out conductor portion 165Ab is a portion provided to mainly connect the main conductor portion 165Aa and the pad 402 and supply a predetermined voltage such as the GND or the negative power supply (Vss) to the main conductor portion 165Aa. The length (width) of at least one of the X direction (first direction) or the Y direction (second direction) of the lead-out conductor portion 165Ab is shorter (narrower) than the length (width) of the main conductor portion 165Aa. A connecting portion between the main conductor portion 165Aa and the lead-out conductor portion 165Ab illustrated by the alternate long and short dash line in A in FIG. 63 is referred to as a joint portion.

Similarly, consider the case by dividing the wiring layer 165B (conductor layer B) into a main conductor portion 165Ba and a lead-out conductor portion 165Bb as illustrated in B in FIG. 63. The main conductor portion 165Ba is a portion provided to mainly shield the hot carrier light emission from the active element group 167 and suppress generation of the inductive noise, and has a larger area than the lead-out conductor portion 165Bb. The lead-out conductor portion 165Bb is a portion provided to mainly connect the main conductor portion 165Ba and the pad 401 and supply a predetermined voltage such as the positive power supply (Vdd) to the main conductor portion 165Ba. The length (width) of at least one of the X direction (first direction) or the Y direction (second direction) of the lead-out conductor portion 165Bb is shorter (narrower) than the length (width) of the main conductor portion 165Ba. A connecting portion between the main conductor portion 165Ba and the lead-out conductor portion 165Bb illustrated by the alternate long and short dash line in B in FIG. 63 is referred to as a joint portion.

Note that, in a case of collectively referring to the main conductor portion 165Aa and the main conductor portion 165Ba and in a case of collectively referring to the lead-out conductor portion 165Ab and the lead-out conductor portion 165Bb without distinguishing the wiring layer 165A (conductor layer A) and the wiring layer 165B (conductor layer B), they are respectively referred to as main conductor portion(s) 165*a* and lead-out conductor portion(s) 165*b*.

For facilitating the understanding, in FIG. 63, the description has been given on the assumption that the lead-out conductor portion 165Ab and the lead-out conductor portion 165Bb are connected to the pad 401 or 402. However, the lead-out conductor portion 165Ab and the lead-out conductor portion 165Bb are not necessarily connected to the pad 401 or 402, and it is sufficient that they are connected to another wiring or electrode.

Furthermore, FIG. 63 illustrates an example in which the pads 401 and 402 have substantially the same shape and are arranged at substantially the same position. However, the configuration is not limited to the example. For example, the pads 401 and 402 may have different shapes or may be arranged at different positions. Furthermore, the pads 401 and 402 may have smaller dimensions than the example illustrated in FIG. 63, may not be in contact with each other in the wiring layer 165A, or may not be in contact with each other in the wiring layer 165B, or a plurality of the pads 401 and 402 may be provided.

Moreover, FIG. 63 illustrates, but is not limited to, the example in which the end positions in the Y direction substantially match in the main conductor portion 165Aa and the lead-out conductor portion 165Ab. For example, the main conductor portion 165Aa and the lead-out conductor portion 165Ab may be configured such that the end positions do not match. Similarly, FIG. 63 illustrates, but is not limited to, the example in which the end positions in the Y direction substantially match in the main conductor portion 165Ba and the lead-out conductor portion 165Bb. For example, the main conductor portion 165Ba and the lead-out conductor portion 165Bb may be configured such that the end positions do not match. The shapes and positions of the main conductor portions 165*a* and the lead-out conductor portions 165*b* and the relationship between the pads 401 and 402 are similar in the configuration examples to be described below.

In the above-described first to thirteenth configuration examples, for the wiring layer 165A, the main conductor portion 165Aa and the lead-out conductor portion 165Ab are not particularly distinguished, and both the main conductor portion 165Aa and the lead-out conductor portion 165Ab have been formed using the same wiring pattern such as the planar conductor or the reticulated conductor.

As for the wiring layer 165B, the main conductor portion 165Ba and the lead-out conductor portion 165Bb are not particularly distinguished, and both the main conductor portion 165Ba and the lead-out conductor portion 165Bb have been formed using the same wiring pattern such as the planar conductor or the reticulated conductor.

Figure 64:
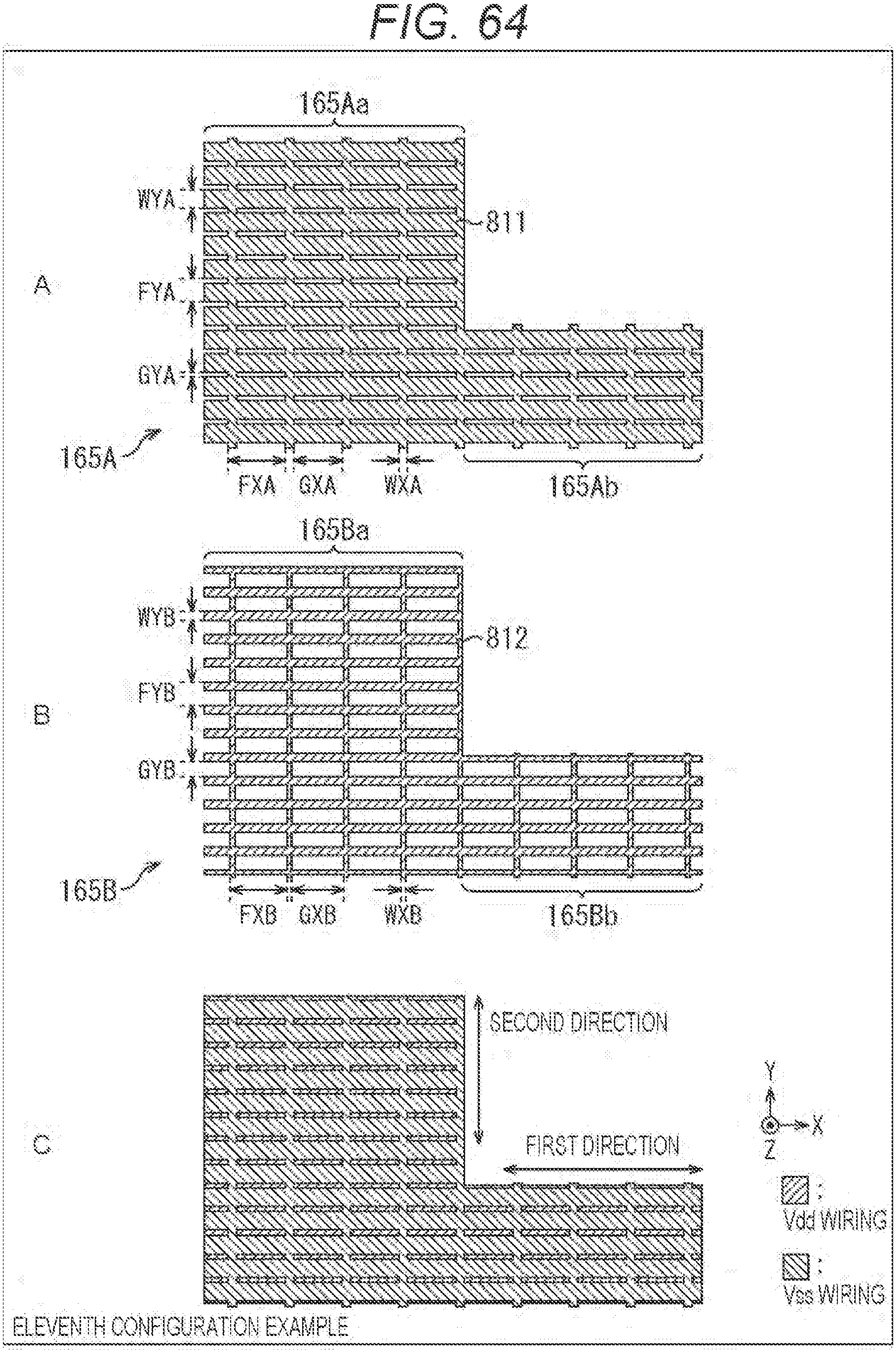
FIG. 64 is diagrams illustrating an eleventh configuration example of the conductor layers A and B.

FIG. 64 illustrates examples in which the eleventh configuration example illustrated in FIG. 36 is applied to the wiring layer 165A and the wiring layer 165B, using different wiring patterns, as an example of the first to thirteenth configuration examples.

A in FIG. 64 illustrates the conductor layer A (wiring layer 165A) and B in FIG. 64 illustrates the conductor layer B (wiring layer 165B). In the coordinate system in FIG. 64, the horizontal direction is the X axis, the vertical direction is the Y axis, and the direction perpendicular to the XY plane is the Z axis.

In the eleventh configuration example illustrated in FIG. 36, the reticulated conductor 311 of the conductor layer A illustrated in A in FIG. 36 is an example of the shape in which the conductor width WXA in the X direction is wider than the gap width GXA, whereas a reticulated conductor 811 of the conductor layer A in A in FIG. 64 has a shape in which the conductor width WXA in the X direction is narrower than the gap width GXA. Furthermore, in the Y direction, the reticulated conductor 311 illustrated in A in FIG. 36 is an example of the shape in which the conductor width WYA is narrower than the gap width GYA, whereas the reticulated conductor 811 of the conductor layer A in A in FIG. 64 has a shape in which the conductor width WYA is wider than the gap width GYA. The reticulated conductor 311 of the conductor layer A illustrated in A in FIG. 36 is an example of the shape in which the conductor width WYA and the conductor width WXA are substantially the same, whereas the reticulated conductor 811 of the conductor layer A in A in FIG. 64 has a shape in which the conductor width WYA is wider than the conductor width WXA. Then, in the reticulated conductor 811 of the conductor layer A in A in FIG. 64, the same pattern is periodically arranged with the conductor period FXA in the X direction, and the same pattern is periodically arranged with the conductor period FYA in the Y direction, both in the main conductor portion 165Aa and the lead-out conductor portion 165Ab.

The conductor layer B has a shape in which a ratio of the gap width GXB to the conductor width WXB in the X direction (gap width GXB/conductor width WXB) of a reticulated conductor 812 of the conductor layer B in B in FIG. 64 is larger than the ratio of the gap width GXB to the conductor width WXB in the X direction (gap width GXB/conductor width WXB) of the reticulated conductor 312 of the conductor layer B illustrated in B in FIG. 36. In other words, the reticulated conductor 812 of the conductor layer B in B in FIG. 64 has a larger difference between the conductor width WXB and the gap width GXB than the reticulated conductor 312 of the conductor layer B illustrated in B in FIG. 36. In the Y direction, the ratio of the gap width GYB to the conductor width WYB (gap width GYB/conductor width WYB) of the reticulated conductor 812 of the conductor layer B in B in FIG. 64 is smaller than the ratio of the gap width GYB to the conductor width WYB (gap width GYB/conductor width WYB) of the reticulated conductor 312 of the conductor layer B illustrated in B in FIG. 36. The reticulated conductor 312 of the conductor layer B illustrated in B in FIG. 36 is an example of the shape in which the conductor width WYB and the conductor width WXB are substantially the same, whereas the reticulated conductor 812 of the conductor layer B in B in FIG. 64 has a shape in which the conductor width WYB is wider than the conductor width WXB. Then, in the reticulated conductor 812 of the conductor layer B in B in FIG. 64, the same pattern is periodically arranged with the conductor period FXB in the X direction, and the same pattern is periodically arranged with the conductor period FYB in the Y direction, both in the main conductor portion 165Ba and the lead-out conductor portion 165Bb.

C in FIG. 64 illustrates a state of the conductor layers A and B respectively illustrated in A and B in FIG. 64, which are viewed from the conductor layer A side (photodiode 141 side). In C in FIG. 64, regions of the conductor layer B, which overlap with and are hidden by the conductor layer A, are not illustrated.

As illustrated in C in FIG. 64, in the case of the eleventh configuration example, the active element group 167 is covered with at least one of the conductor layer A or the conductor layer B, the hot carrier light emission from the active element group 167 can be shielded, and generation of the inductive noise can be suppressed.

As described above, the first to thirteenth configuration examples are examples in which the main conductor portion 165Aa and the lead-out conductor portion 165Ab are not particularly distinguished and are formed using the same wiring pattern in the wiring layer 165A (conductor layer A), and the main conductor portion 165Ba and the lead-out conductor portion 165Bb are not particularly distinguished and are formed using the same wiring pattern in the wiring layer 165B (conductor layer B).

However, since the lead-out conductor portion 165*b* is formed with a smaller area than the main conductor portion 165*a* and is also a portion where the current is concentrated, it is desirable to have a configuration in which the wiring resistance is small and the current is easily diffused in the main conductor portion 165*a*.

Therefore, hereinafter, a configuration example in which the wiring pattern of the lead-out conductor portion 165Ab of the wiring layer 165A (conductor layer A) is made different from the wiring pattern of the main conductor portion 165Aa, and also the wiring pattern of the lead-out conductor portion 165Bb of the wiring layer 165B (conductor layer B) is made different from the wiring pattern of the main conductor portion 165Ba will be described.

Fourteenth Configuration Example

Figure 65:
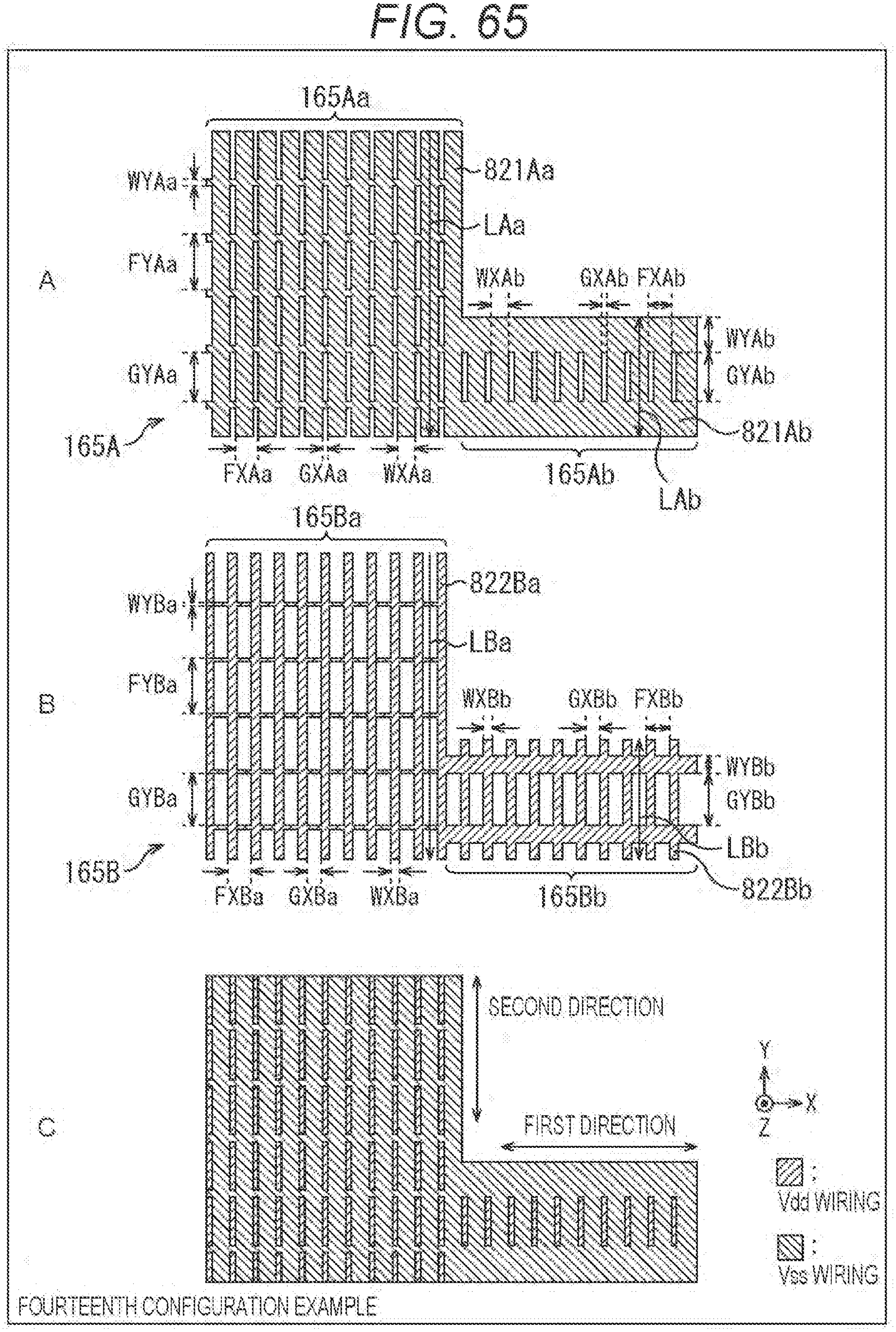
FIG. 65 is diagrams illustrating a fourteenth configuration example of the conductor layers A and B.

FIG. 65 illustrates a fourteenth configuration example of the conductor layers A and B. Note that A in FIG. 65 illustrates the conductor layer A, and B in FIG. 65 illustrates the conductor layer B. In the coordinate system in FIG. 65, the horizontal direction is the X axis, the vertical direction is the Y axis, and the direction perpendicular to the XY plane is the Z axis.

The conductor layer A in the fourteenth configuration example includes a reticulated conductor 821Aa of the main conductor portion 165Aa and a reticulated conductor 821Ab of the lead-out conductor portion 165Ab, as illustrated in A in FIG. 65. The reticulated conductor 821Aa and the reticulated conductor 821Ab are, for example, wiring (Vss wiring) connected to GND or the negative power supply.

The reticulated conductor 821Aa of the main conductor portion 165Aa has a conductor width WXAa and a gap width GXAa and is configured such that the same pattern is periodically arranged with a conductor period FXAa in the X direction, and has a conductor width WYAa and a gap width GYAa and is configured such that the same pattern is periodically arranged with a conductor period FYAa in the Y direction. Therefore, the reticulated conductor 821Aa has a shape including a repeating pattern in which a predetermined basic pattern is repeatedly arranged with a conductor period in at least one of the X direction or the Y direction.

The reticulated conductor 821Ab of the lead-out conductor portion 165Ab has a conductor width WXAb and a gap width GXAb and is configured such that the same pattern is periodically arranged with a conductor period FXAb in the X direction, and has a conductor width WYAb and a gap width GYAb in the Y direction. Therefore, the reticulated conductor 821Ab has a shape including a repeating pattern in which a predetermined basic pattern is repeatedly arranged with a conductor period in at least one of the X direction or the Y direction.

Furthermore, when comparing the corresponding conductor widths WXA, gap widths GXA, conductor widths WYA, and gap widths GYA of the reticulated conductor 821Aa of the main conductor portion 165Aa and the reticulated conductor 821Ab of the lead-out conductor portion 165Ab, at least one widths have different values, and the repeating pattern of the reticulated conductor 821Ab of the lead-out conductor portion 165Ab is different from the repeating pattern of the reticulated conductor 821Aa of the main conductor portion 165Aa.

When comparing a total length LAa in the Y direction of the reticulated conductor 821Aa of the main conductor portion 165Aa with a total length LAb in the Y direction of the reticulated conductor 821Ab of the lead-out conductor portion 165Ab, the total length LAa of the reticulated conductor 821Aa is longer than the total length LAb of the reticulated conductor 821Ab. Therefore, the reticulated conductor 821Ab of the lead-out conductor portion 165Ab has a locally more concentrated current than the reticulated conductor 821Aa of the main conductor portion 165Aa, and thus has a larger voltage drop (particularly IR-Drop).

Here, the repeating pattern of the reticulated conductor 821Ab of the lead-out conductor portion 165Ab has a shape in which the current flows at least in a first direction, where the X direction toward the main conductor portion 165Aa is the first direction, and the conductor width (wiring width) WYAb in a second direction (Y direction) orthogonal to the first direction is larger than the conductor width (wiring width) WYAa in the second direction of the reticulated conductor 821Aa of the main conductor portion 165Aa. As a result, the wiring resistance of the reticulated conductor 821Ab of the lead-out conductor portion 165Ab, which is the current concentration point, can be reduced, so that the voltage drop can be further improved. Note that the example in which the conductor width WYAb is larger than the conductor width WYAa has been described. However, the configuration is not limited to the example, and for example, the conductor width WXAb may be larger than the conductor width WXAa. As a result, the wiring resistance of the reticulated conductor 821Ab can be reduced, so that the voltage drop can be further improved.

Furthermore, at least a part of the reticulated conductor 821Aa of the main conductor portion 165Aa has a pattern (shape) in which the current is more likely to flow in the Y direction (second direction) than in the X direction (first direction). Specifically, the wiring resistance is made smaller in the Y direction than in the X direction as at least one of the wiring widths (conductor width WXAa and conductor width WYAa) or the wiring gaps (gap width GXAa and gap width GYAa) is different. As a result, the current is easily diffused in the Y direction in the main conductor portion 165Aa having the total length LAa longer than the total length LAb of the reticulated conductor 821Ab, so that the electrodes concentrated around the joint portion between the main conductor portion 165Aa and the lead-out conductor portion 165Ab can be alleviated, and the inductive noise can be further improved.

The conductor layer B in the fourteenth configuration example includes a reticulated conductor 822Ba of the main conductor portion 165Ba and a reticulated conductor 822Bb of the lead-out conductor portion 165Bb, as illustrated in B in FIG. 65. The reticulated conductor 822Ba and the reticulated conductor 822Bb are, for example, wiring (Vdd wiring) connected to the positive power supply.

The reticulated conductor 822Ba of the main conductor portion 165Ba has a conductor width WXBa and a gap width GXBa and is configured such that the same pattern is periodically arranged with a conductor period FXBa in the X direction, and has a conductor width WYBa and a gap width GYBa and is configured such that the same pattern is periodically arranged with a conductor period FYBa in the Y direction. Therefore, the reticulated conductor 822Ba has a shape including a repeating pattern in which a predetermined basic pattern is repeatedly arranged with a conductor period in at least one of the X direction or the Y direction.

The reticulated conductor 822Bb of the lead-out conductor portion 165Bb has a conductor width WXBb and a gap width GXBb and is configured such that the same pattern is periodically arranged with a conductor period FXBb in the X direction, and has a conductor width WYBb and a gap width GYBb in the Y direction. Therefore, the reticulated conductor 822Bb has a shape including a repeating pattern in which a predetermined basic pattern is repeatedly arranged with a conductor period in at least one of the X direction or the Y direction.

Furthermore, when comparing the corresponding conductor widths WXB, gap widths GXB, conductor widths WYB, and gap widths GYB of the reticulated conductor 822Ba of the main conductor portion 165Ba and the reticulated conductor 822Bb of the lead-out conductor portion 165Bb, at least one widths have different values, and the repeating pattern of the reticulated conductor 822Bb of the lead-out conductor portion 165Bb is different from the repeating pattern of the reticulated conductor 822Ba of the main conductor portion 165Ba.

When comparing a total length LBa in the Y direction of the reticulated conductor 822Ba of the main conductor portion 165Ba with a total length LBb in the Y direction of the reticulated conductor 822Bb of the lead-out conductor portion 165Bb, the total length LBa of the reticulated conductor 822Ba is longer than the total length LBb of the reticulated conductor 822Bb. Therefore, the reticulated conductor 822Bb of the lead-out conductor portion 165Bb has a locally more concentrated current than the reticulated conductor 822Ba of the main conductor portion 165Ba, and thus has a larger voltage drop (particularly IR-Drop).

Here, the repeating pattern of the reticulated conductor 822Bb of the lead-out conductor portion 165Bb has a shape in which the current flows at least in the first direction, where the X direction toward the main conductor portion 165Ba is the first direction, and the conductor width (wiring width) WYBb in the second direction (Y direction) orthogonal to the first direction is larger than the conductor width (wiring width) WYBa in the second direction of the reticulated conductor 822Ba of the main conductor portion 165Ba. As a result, the wiring resistance of the reticulated conductor 822Bb of the lead-out conductor portion 165Bb, which is the current concentration point, can be reduced, so that the voltage drop can be further improved. Note that the example in which the conductor width WYBb is larger than the conductor width WYBa has been described. However, the configuration is not limited to the example, and for example, the conductor width WXBb may be larger than the conductor width WXBa. As a result, the wiring resistance of the reticulated conductor 822Bb can be reduced, so that the voltage drop can be further improved.

Furthermore, at least a part of the reticulated conductor 822Ba of the main conductor portion 165Ba has a pattern (shape) in which the current is more likely to flow in the Y direction (second direction) than in the X direction (first direction). Specifically, the wiring resistance is made smaller in the Y direction than in the X direction as at least one of the wiring widths (conductor width WXBa and conductor width WYBa) or the wiring gaps (gap width GXBa and gap width GYBa) is different. As a result, the current is easily diffused in the Y direction in the main conductor portion 165Ba having the total length LBa longer than the total length LBb of the reticulated conductor 822Bb, so that the electrodes concentrated around the joint portion between the main conductor portion 165Ba and the lead-out conductor portion 165Bb can be alleviated, and the inductive noise can be further improved.

According to the fourteenth configuration example, in the wiring layer 165A (conductor layer A), the repeating pattern of the reticulated conductor 821Ab of the lead-out conductor portion 165Ab is formed to be different from the repeating pattern of the reticulated conductor 821Aa of the main conductor portion 165Aa, and the main conductor portion 165Aa and the lead-out conductor portion 165Ab are electrically connected, whereby the wiring resistance of the lead-out conductor portion 165Ab can be made small and the voltage drop can be further improved. In the wiring layer 165B (conductor layer B), the repeating pattern of the reticulated conductor 822Bb of the lead-out conductor portion 165Bb is formed to be different from the repeating pattern of the reticulated conductor 822Ba of the main conductor portion 165Ba, and the main conductor portion 165Ba and the lead-out conductor portion 165Bb are electrically connected, whereby the wiring resistance of the lead-out conductor portion 165Bb can be made small and the voltage drop can be further improved.

Furthermore, as illustrated in C in FIG. 65, in the state where the conductor layer A and the conductor layer B are stacked, the active element group 167 is covered with at least one of the conductor layer A or the conductor layer B. That is, the main conductor portion 165Aa of the wiring layer 165A and the main conductor portion 165Ba of the wiring layer 165B form a light-shielding structure, and the lead-out conductor portion 165Ab of the wiring layer 165A and the lead-out conductor portion 165Bb of the wiring layer 165B form a light-shielding structure. Thereby, the hot carrier light emission from the active element group 167 can be shielded in the fourteenth configuration example similarly to the above-described first to thirteenth configuration examples.

Modification of Fourteenth Configuration Example

Figure 66:
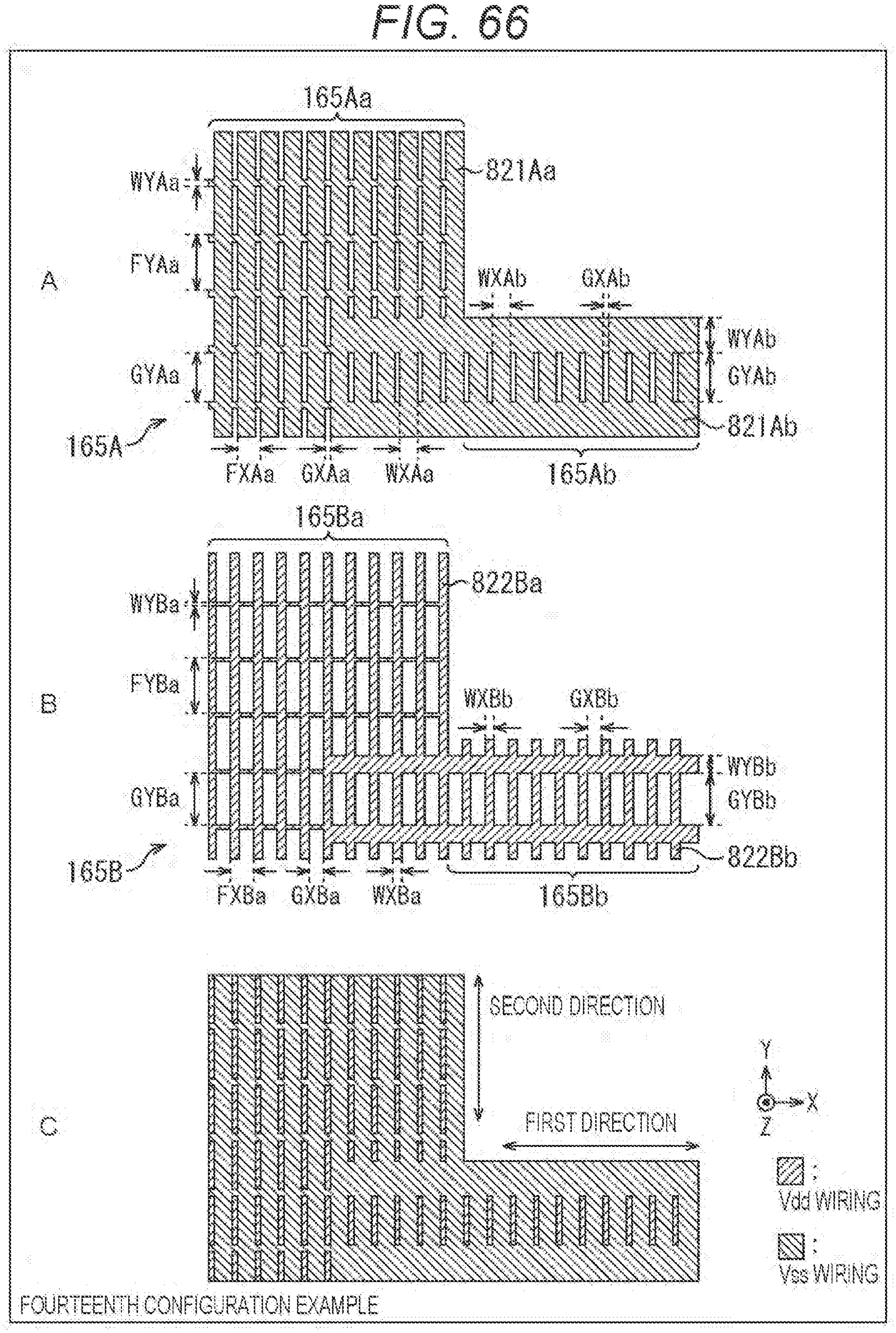
FIG. 66 is diagrams illustrating a first modification of the fourteenth configuration example of the conductor layers A and B.
Figure 67:
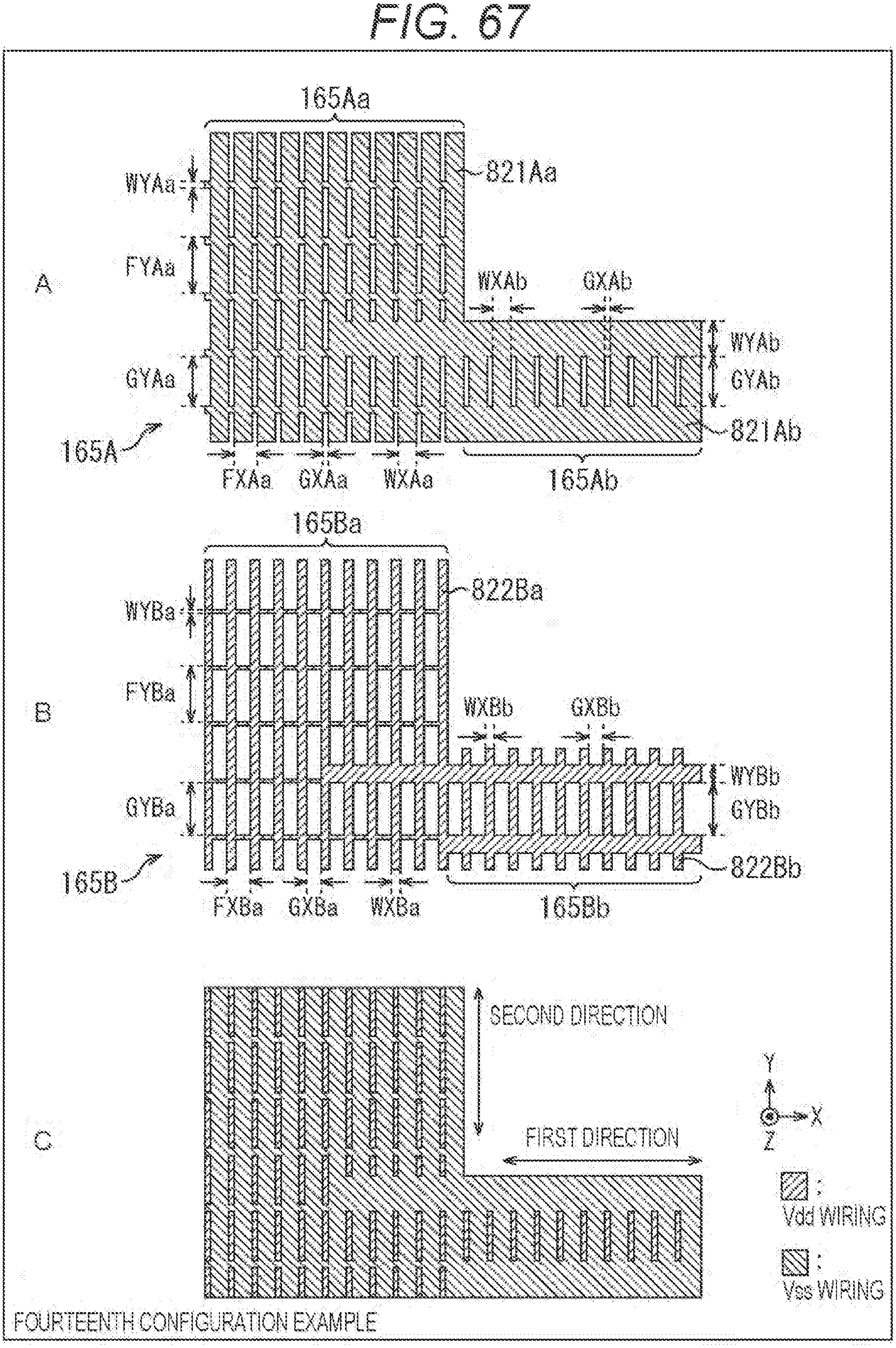
FIG. 67 is diagrams illustrating a second modification of the fourteenth configuration example of the conductor layers A and B.
Figure 68:
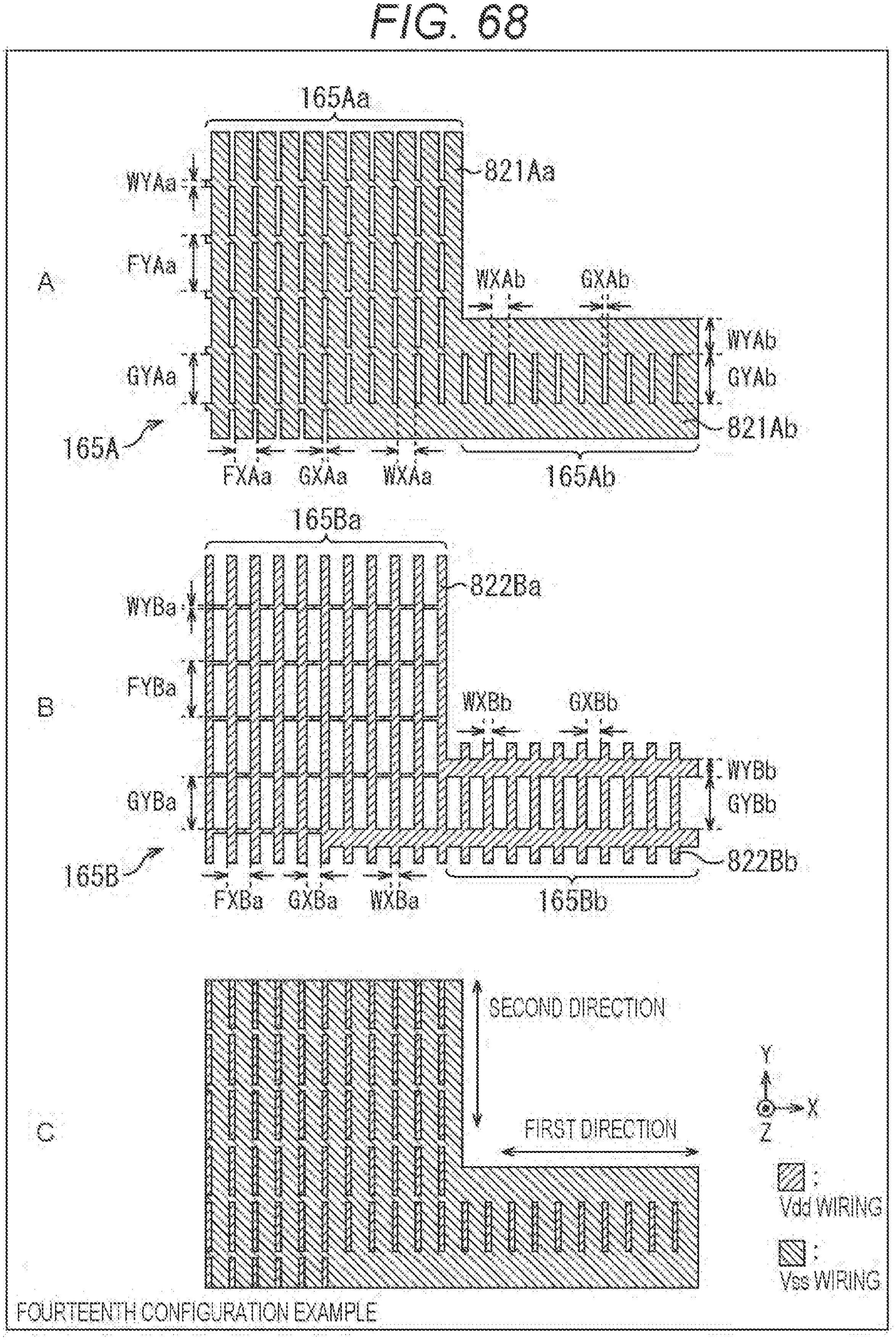
FIG. 68 is diagrams illustrating a third modification of the fourteenth configuration example of the conductor layers A and B.

FIGS. 66 to 68 illustrate first to third modifications of the fourteenth configuration example. Note that since A to C in FIGS. 66 to 68 correspond to A to C in FIG. 65 and are given the same reference numerals, description of common parts will be omitted as appropriate, and different parts will be described.

In the fourteenth configuration example illustrated in FIG. 65, the joint portion of the main conductor portion 165Aa and the lead-out conductor portion 165Ab is arranged on a side of a rectangle surrounding an outer periphery of the main conductor portion 165Aa in the wiring layer 165A (conductor layer A). However, the configuration is not limited thereto.

For example, as illustrated in A in FIG. 66, the main conductor portion 165Aa and the lead-out conductor portion 165Ab may be connected so that the reticulated conductor 821Ab of the lead-out conductor portion 165Ab enters the inside of the rectangle surrounding the outer periphery of the main conductor portion 165Aa.

Furthermore, for example, the main conductor portion 165Aa and the lead-out conductor portion 165Ab may be connected such that only a part of the plurality of wirings of the conductor width WYAb extending toward the main conductor portion 165Aa of the reticulated conductor 821Ab of the lead-out conductor portion 165Ab enters the inside of the rectangle surrounding the outer periphery of the main conductor portion 165Aa, as illustrated in A in FIG. 67 and in A in FIG. 68. In the reticulated conductor 821Ab of the lead-out conductor portion 165Ab in A in FIG. 67, the upper wiring of the two wirings of the conductor width WYAb extends to enter the inside of the rectangle surrounding the outer periphery of the main conductor portion 165Aa. In the reticulated conductor 821Ab of the lead-out conductor portion 165Ab in A in FIG. 68, the lower wiring extends to enter the inside of the rectangle surrounding the outer periphery of the main conductor portion 165Aa.

The same applies to the wiring layer 165B (conductor layer B). That is, in the fourteenth configuration example illustrated in FIG. 65, the joint portion of the main conductor portion 165Ba and the lead-out conductor portion 165Bb is arranged on a side of a rectangle surrounding an outer periphery of the main conductor portion 165Ba. However, the configuration is not limited thereto.

For example, as illustrated in B in FIG. 66, the main conductor portion 165Ba and the lead-out conductor portion 165Bb may be connected so that the reticulated conductor 822Bb of the lead-out conductor portion 165Bb enters the inside of the rectangle surrounding the outer periphery of the main conductor portion 165Ba.

Furthermore, for example, the main conductor portion 165Ba and the lead-out conductor portion 165Bb may be connected such that only a part of the plurality of wirings of the conductor width WYBb extending toward the main conductor portion 165Ba of the reticulated conductor 822Bb of the lead-out conductor portion 165Bb enters the inside of the rectangle surrounding the outer periphery of the main conductor portion 165Ba, as illustrated in B in FIG. 67 and in B in FIG. 68. In the reticulated conductor 822Bb of the lead-out conductor portion 165Bb in B in FIG. 67, the upper wiring of the two wirings of the conductor width WYBb extends to enter the inside of the rectangle surrounding the outer periphery of the main conductor portion 165Ba. In the reticulated conductor 822Bb of the lead-out conductor portion 165Bb in B in FIG. 68, the lower wiring extends to enter the inside of the rectangle surrounding the outer periphery of the main conductor portion 165Ba.

As illustrated in FIGS. 66 to 68, the shape of the portion connecting the main conductor portion 165*a* and the lead-out conductor portion 165*b* may be complicatedly configured.

In the first to third modifications of the fourteenth configuration example illustrated in FIGS. 66 to 68, the main conductor portion 165Aa and the lead-out conductor portion 165Ab are connected such that the reticulated conductor 821Ab of the lead-out conductor portion 165Ab enters the inside of the rectangle surrounding the outer periphery of the main conductor portion 165Aa. However, the reticulated conductor 821Aa of the main conductor portion 165Aa may extend outside the rectangle surrounding the outer periphery of the main conductor portion 165Aa and enter the lead-out conductor portion 165Ab. Furthermore, the reticulated conductor 822Ba of the main conductor portion 165Ba may extend outside the rectangle surrounding the outer periphery of the main conductor portion 165Ba and enter the lead-out conductor portion 165Bb.

Fifteenth Configuration Example

Figure 69:
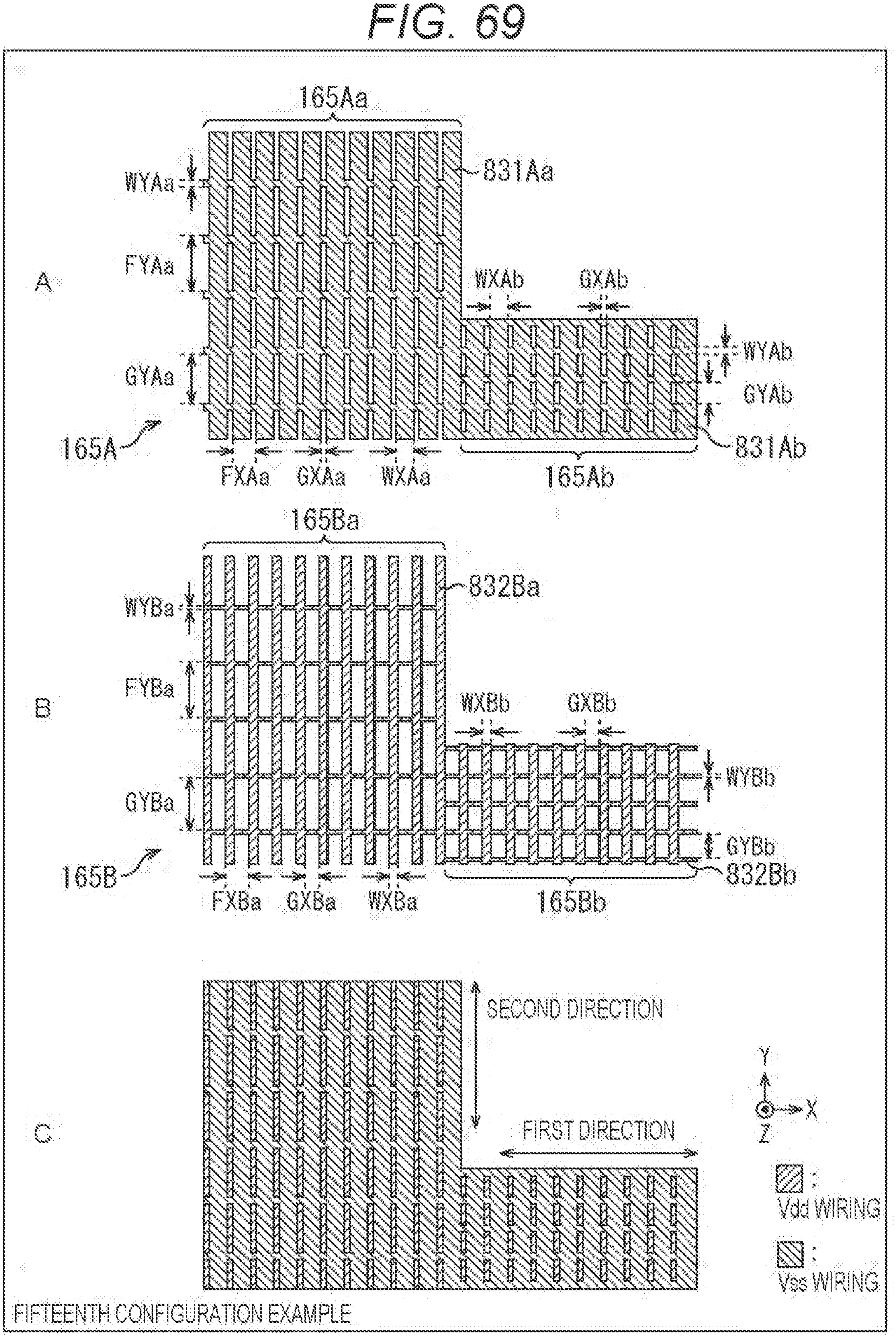
FIG. 69 is diagrams illustrating a fifteenth configuration example of the conductor layers A and B.

FIG. 69 illustrates a fifteenth configuration example of the conductor layers A and B. Note that A in FIG. 69 illustrates the conductor layer A, and B in FIG. 69 illustrates the conductor layer B. In the coordinate system in FIG. 69, the horizontal direction is the X axis, the vertical direction is the Y axis, and the direction perpendicular to the XY plane is the Z axis.

The conductor layer A in the fifteenth configuration example includes a reticulated conductor 831Aa of the main conductor portion 165Aa and a reticulated conductor 831Ab of the lead-out conductor portion 165Ab, as illustrated in A in FIG. 69. The reticulated conductor 831Aa and the reticulated conductor 831Ab are, for example, wiring (Vss wiring) connected to the GND or the negative power supply.

The reticulated conductor 831Aa of the main conductor portion 165Aa is similar to the reticulated conductor 821Aa of the main conductor portion 165Aa in the fourteenth configuration example in FIG. 65. Meanwhile, the reticulated conductor 831Ab of the lead-out conductor portion 165Ab is different from the reticulated conductor 821Ab of the lead-out conductor portion 165Ab in the fourteenth configuration example in FIG. 65.

Specifically, the gap width GYAb in the Y direction of the reticulated conductor 831Ab of the lead-out conductor portion 165Ab is formed to be smaller than the gap width GYAa in the Y direction of the reticulated conductor 831Aa of the main conductor portion 165Aa. In the fourteenth configuration example illustrated in FIG. 65, the gap width GYAb in the Y direction of the reticulated conductor 821Ab of the lead-out conductor portion 165Ab is the same as the gap width GYAa in the Y direction of the reticulated conductor 821Aa of the main conductor portion 165Aa.

By forming the gap width GYAb in the Y direction of the reticulated conductor 831Ab of the lead-out conductor portion 165Ab to be smaller than the gap width GYAa in the Y direction of the reticulated conductor 831Aa of the main conductor portion 165Aa, the wiring resistance of the reticulated conductor 831Ab of the lead-out conductor portion 165Ab, which is the current concentration point, can be reduced, so that the voltage drop can be further improved. Note that the description has been given using the example in which the gap width GYAb is smaller than the gap width GYAa. However, the configuration is not limited thereto, and for example, the gap width GXAb may be formed to be smaller than the gap width GXAa. As a result, the wiring resistance of the reticulated conductor 831Ab can be reduced, so that the voltage drop can be further improved.

The conductor layer B in the fifteenth configuration example includes a reticulated conductor 832Ba of the main conductor portion 165Ba and a reticulated conductor 832Bb of the lead-out conductor portion 165Bb, as illustrated in B in FIG. 69. The reticulated conductor 832Ba and the reticulated conductor 832Bb are, for example, wiring (Vdd wiring) connected to the positive power supply.

The reticulated conductor 832Ba of the main conductor portion 165Ba is similar to the reticulated conductor 822Ba of the main conductor portion 165Ba in the fourteenth configuration example in FIG. 65. Meanwhile, the reticulated conductor 832Bb of the lead-out conductor portion 165Bb is different from the reticulated conductor 822Bb of the lead-out conductor portion 165Bb in the fourteenth configuration example in FIG. 65.

Specifically, the gap width GYBb in the Y direction of the reticulated conductor 832Bb of the lead-out conductor portion 165Bb is formed to be smaller than the gap width GYBa in the Y direction of the reticulated conductor 832Ba of the main conductor portion 165Ba. In the fourteenth configuration example in FIG. 65, the gap width GYBb in the Y direction of the reticulated conductor 822Bb of the lead-out conductor portion 165Bb is the same as the gap width GYBa in the second direction of the reticulated conductor 822Ba of the main conductor portion 165Ba.

By forming the gap width GYBb in the Y direction of the reticulated conductor 832Bb of the lead-out conductor portion 165Bb to be smaller than the gap width GYBa in the Y direction of the reticulated conductor 832Ba of the main conductor portion 165Ba, the wiring resistance of the reticulated conductor 832Bb of the lead-out conductor portion 165Bb, which is the current concentration point, can be reduced, so that the voltage drop can be further improved. Note that the description has been given using the example in which the gap width GYBb is smaller than the gap width GYBa. However, the configuration is not limited thereto, and for example, the gap width GXBb may be formed to be smaller than the gap width GXBa. As a result, the wiring resistance of the reticulated conductor 832Bb can be reduced, so that the voltage drop can be further improved.

Furthermore, as illustrated in C in FIG. 69, in the state where the conductor layer A and the conductor layer B are stacked, the active element group 167 is covered with at least one of the conductor layer A or the conductor layer B. That is, the main conductor portion 165Aa of the wiring layer 165A and the main conductor portion 165Ba of the wiring layer 165B form a light-shielding structure, and the lead-out conductor portion 165Ab of the wiring layer 165A and the lead-out conductor portion 165Bb of the wiring layer 165B form a light-shielding structure. Thereby, the hot carrier light emission from the active element group 167 can also be shielded in the fifteenth configuration example.

First Modification of Fifteenth Configuration Example

Figure 70:
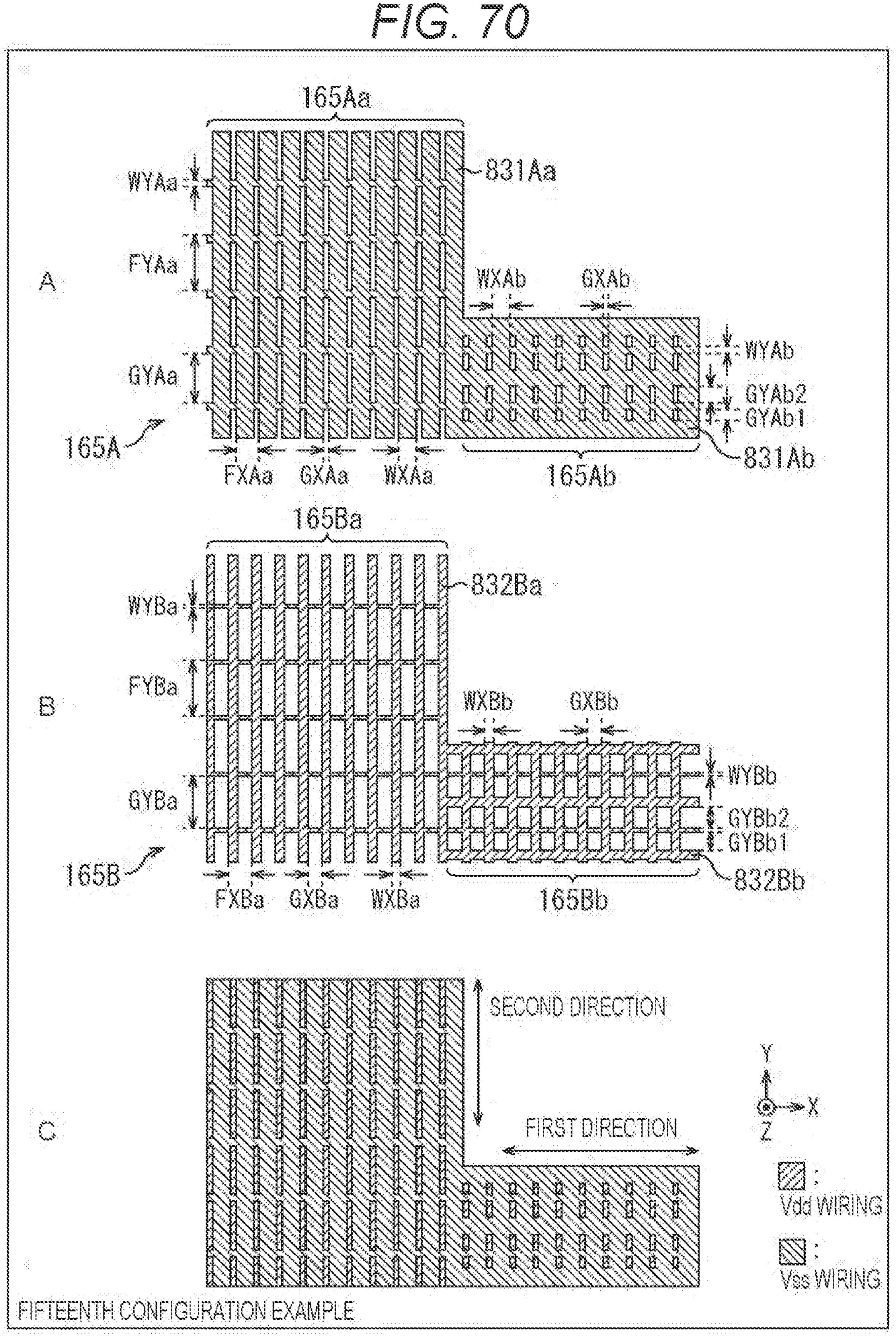
FIG. 70 is diagrams illustrating a first modification of the fifteenth configuration example of the conductor layers A and B.

FIG. 70 illustrates a first modification of the fifteenth configuration example. Note that A in FIG. 70 illustrates the conductor layer A, and B in FIG. 70 illustrates the conductor layer B. C in FIG. 70 illustrates a state of the conductor layers A and B respectively illustrated in A and B in FIG. 70, which are viewed from the conductor layer A side. In the coordinate system in FIG. 70, the horizontal direction is the X axis, the vertical direction is the Y axis, and the direction perpendicular to the XY plane is the Z axis.

The first modification of the fifteenth configuration example is different from the fifteenth configuration example illustrated in FIG. 69 in that all the gap widths GYAb in the Y direction of the lead-out conductor portion 165Ab of the wiring layer 165A are not uniform. Specifically, as illustrated in A in FIG. 70, the reticulated conductor 831Ab of the lead-out conductor portion 165Ab of the wiring layer 165A has two types of gap widths GYAb: a small gap width GYAb1 and a large gap width GYAb2.

Furthermore, the first modification of the fifteenth configuration example is different from the fifteenth configuration example illustrated in FIG. 69 in that all the gap widths GYBb in the Y direction of the lead-out conductor portion 165Bb of the wiring layer 165B are not uniform. Specifically, as illustrated in B in FIG. 70, the reticulated conductor 832Bb of the lead-out conductor portion 165Bb of the wiring layer 165B has two types of gap widths GYBb: a small gap width GYBb1 and a large gap width GYBb2.

Even in the first modification of the fifteenth configuration example, the lead-out conductor portion 165Ab of the wiring layer 165A and the lead-out conductor portion 165Bb of the wiring layer 165B form the light-shielding structure in the state where the conductor layer A and the conductor layer B are stacked, as illustrated in C in FIG. 70.

Second Modification of Fifteenth Configuration Example

Figure 71:
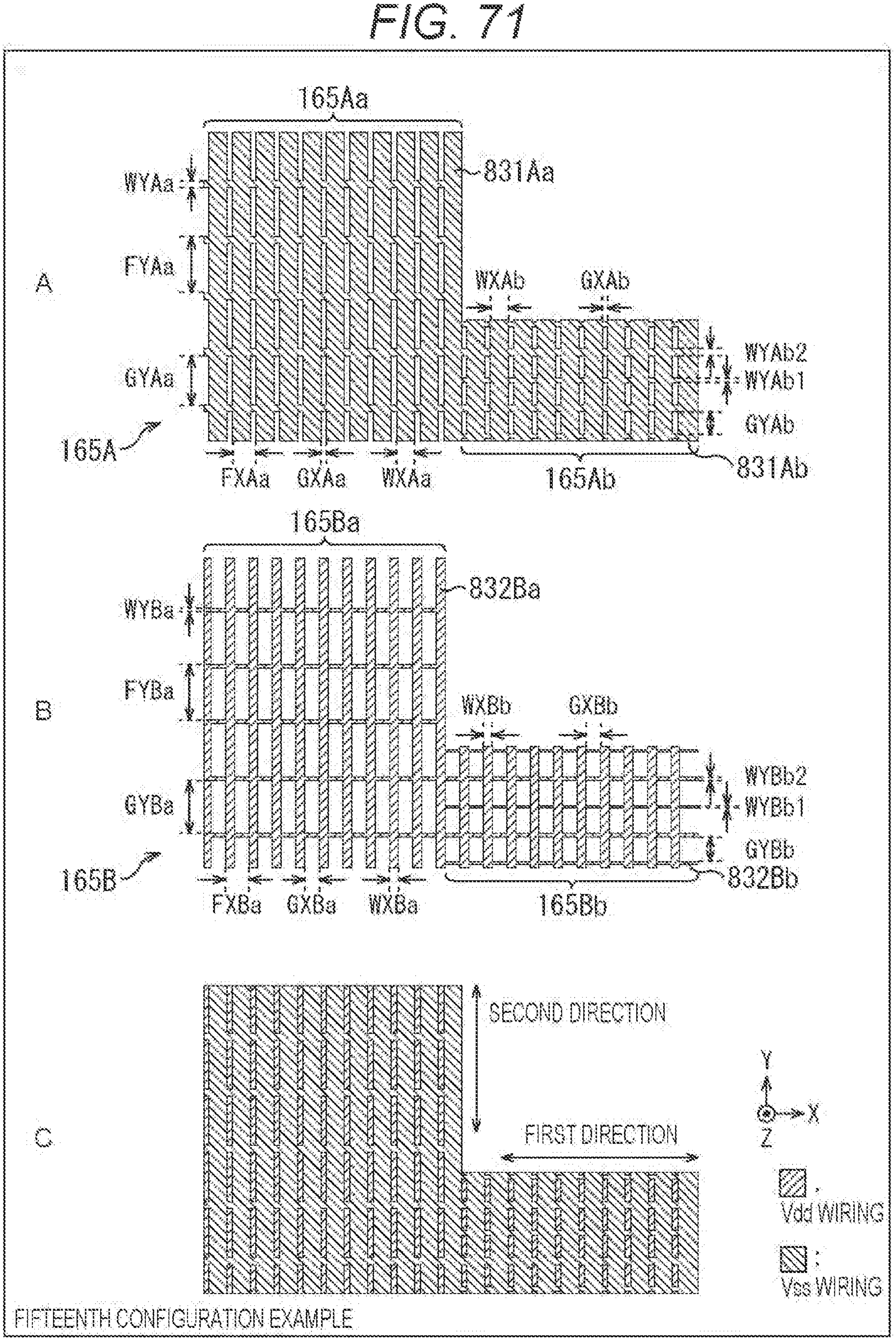
FIG. 71 is diagrams illustrating a second modification of the fifteenth configuration example of the conductor layers A and B.

FIG. 71 illustrates a second modification of the fifteenth configuration example. Note that A in FIG. 71 illustrates the conductor layer A, and B in FIG. 71 illustrates the conductor layer B. C in FIG. 71 illustrates a state of the conductor layers A and B respectively illustrated in A and B in FIG. 71, which are viewed from the conductor layer A side. In the coordinate system in FIG. 71, the horizontal direction is the X axis, the vertical direction is the Y axis, and the direction perpendicular to the XY plane is the Z axis.

The second modification of the fifteenth configuration example is different from the fifteenth configuration example illustrated in FIG. 69 in that all the conductor widths WYAb in the Y direction of the lead-out conductor portion 165Ab of the wiring layer 165A are not uniform. Specifically, as illustrated in A in FIG. 71, the reticulated conductor 831Ab of the lead-out conductor portion 165Ab of the wiring layer 165A has two types of conductor widths WYAb: a small conductor width WYAb1 and a large conductor width WYAb2.

Furthermore, the second modification of the fifteenth configuration example is different from the fifteenth configuration example illustrated in FIG. 69 in that all the conductor widths WYBb in the Y direction of the lead-out conductor portion 165Bb of the wiring layer 165B are not uniform. Specifically, as illustrated in B in FIG. 71, the reticulated conductor 832Bb of the lead-out conductor portion 165Bb of the wiring layer 165B has two types of conductor widths WYBb: a small conductor width WYBb1 and a large conductor width WYBb2.

Even in the second modification of the fifteenth configuration example, the lead-out conductor portion 165Ab of the wiring layer 165A and the lead-out conductor portion 165Bb of the wiring layer 165B form the light-shielding structure in the state where the conductor layer A and the conductor layer B are stacked, as illustrated in C in FIG. 71.

As in the first modification and the second modification of the fifteenth configuration example, the gap width GYAb or the conductor width WYAb of the lead-out conductor portion 165Ab of the wiring layer 165A or the gap width GYBb or the conductor width WYBb of the lead-out conductor portion 165Bb of the wiring layer 165B is made non-uniform, so that the degree of freedom in wiring can be increased. Each conductor layer generally has a restriction on occupancy of a conductor region. However, since the wiring resistances of the lead-out conductor portions 165Ab and 165Bb can be minimized within the restriction on the occupancy due to the increase in the degree of freedom in wiring, the voltage drop can be further improved. Note that the description has been given using the example in which all the gap widths GYAb are not uniform, the example in which all the gap widths GYBb are not uniform, the example in which all the conductor widths WYAb are not uniform, and the case in which all the conductor widths WYBb are not uniform. However, the configuration is not limited to the examples. For example, the conductor layers may be configured such that all the gap widths GXAb in the X direction, all the gap widths GXBb in the X direction, all the conductor widths WXAb in the X direction, or all the conductor widths WXBb in the X direction are not uniform. Even in these cases, the degree of freedom in wiring can be increased, so that the voltage drop can be further improved for the similar reason as described above.

Sixteenth Configuration Example

Figure 72:
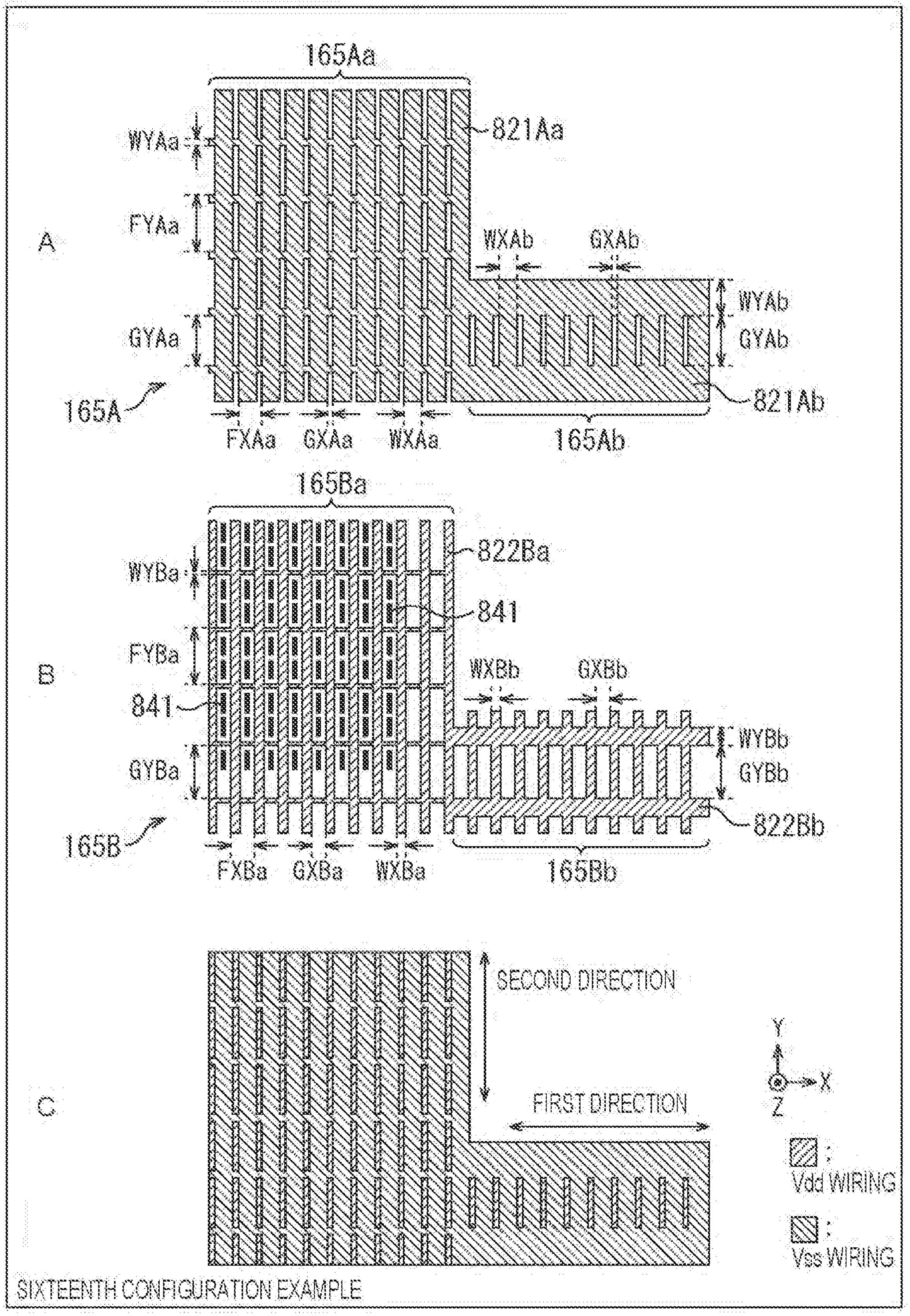
FIG. 72 is diagrams illustrating a sixteenth configuration example of the conductor layers A and B.

FIG. 72 illustrates a sixteenth configuration example of the conductor layers A and B. Note that A in FIG. 72 illustrates the conductor layer A, and B in FIG. 72 illustrates the conductor layer B. In the coordinate system in FIG. 72, the horizontal direction is the X axis, the vertical direction is the Y axis, and the direction perpendicular to the XY plane is the Z axis.

Since the conductor layer A of the sixteenth configuration example illustrated in A in FIG. 72 is similar to the conductor layer A of the fourteenth configuration example illustrated in FIG. 65, description thereof will be omitted.

The conductor layer B of the sixteenth configuration example illustrated in B in FIG. 72 has a configuration in which a relay conductor 841 is further added to the conductor layer B of the fourteenth configuration example illustrated in FIG. 65. More specifically, the main conductor portion 165Ba includes the reticulated conductor 822Ba and a plurality of relay conductors 841, and the lead-out conductor portion 165Bb includes the reticulated conductor 822Bb similar to the fourteenth configuration example.

In the main conductor portion 165Ba, the relay conductor 841 is arranged in a rectangular gap region long in the Y direction other than the reticulated conductor 822Ba and is electrically isolated from the reticulated conductor 822Ba, and is connected to, for example, Vss wiring to which the reticulated conductor 821Aa of the conductor layer A is connected. One or a plurality of relay conductors 841 is arranged in the gap region of the reticulated conductor 822Ba. B in FIG. 72 illustrates an example in which a total of two relay conductors 841 are arranged in the gap region of the reticulated conductor 822Ba in two-row one-column arrangement.

In B in FIG. 72, the relay conductors 841 are arranged in only some gap regions of the reticulated conductor 822Ba in the entire region of the main conductor portion 165Ba.

However, the relay conductor 841 may be arranged in the gap regions of the entire region of the main conductor portion 165Ba. Furthermore, in the conductor layer B of the sixteenth configuration example, the relay conductor 841 is not arranged in the gap region of the reticulated conductor 822Bb of the lead-out conductor portion 165Bb. However, the relay conductor 841 may be arranged in the gap region of the reticulated conductor 822Bb.

First Modification of Sixteenth Configuration Example

Figure 73:
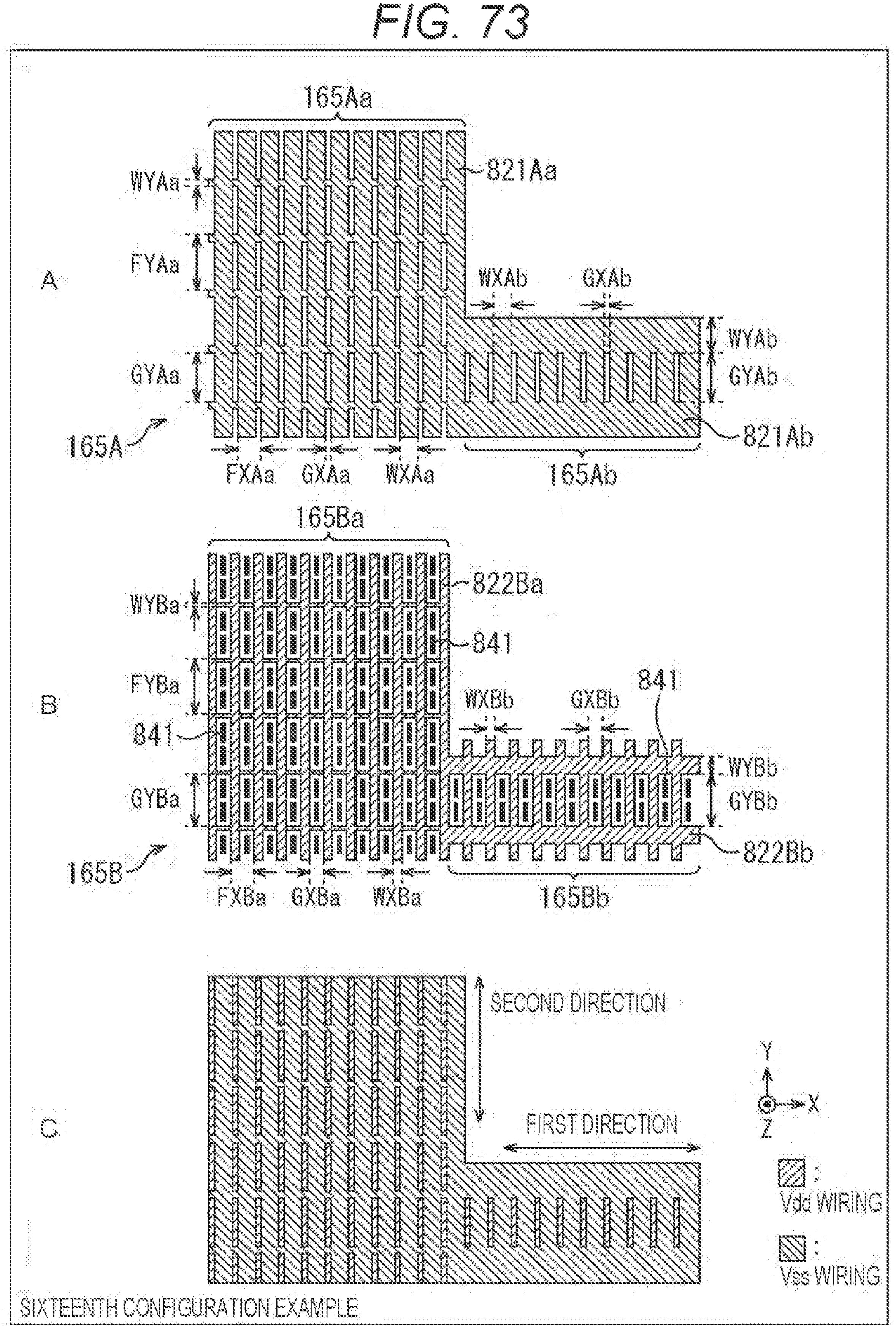
FIG. 73 is diagrams illustrating a first modification of the sixteenth configuration example of the conductor layers A and B.

FIG. 73 illustrates a first modification of the sixteenth configuration example.

In the first modification of the sixteenth configuration example in FIG. 73, the relay conductor 841 is arranged in the gap regions of the entire region of the main conductor portion 165Ba of the conductor layer B, and is arranged in the gap regions of the reticulated conductor 822Bb of the lead-out conductor portion 165Bb. Other configurations in the first modification in FIG. 73 are similar to those in the sixteenth configuration example illustrated in FIG. 72.

Second Modification of Sixteenth Configuration Example

Figure 74:
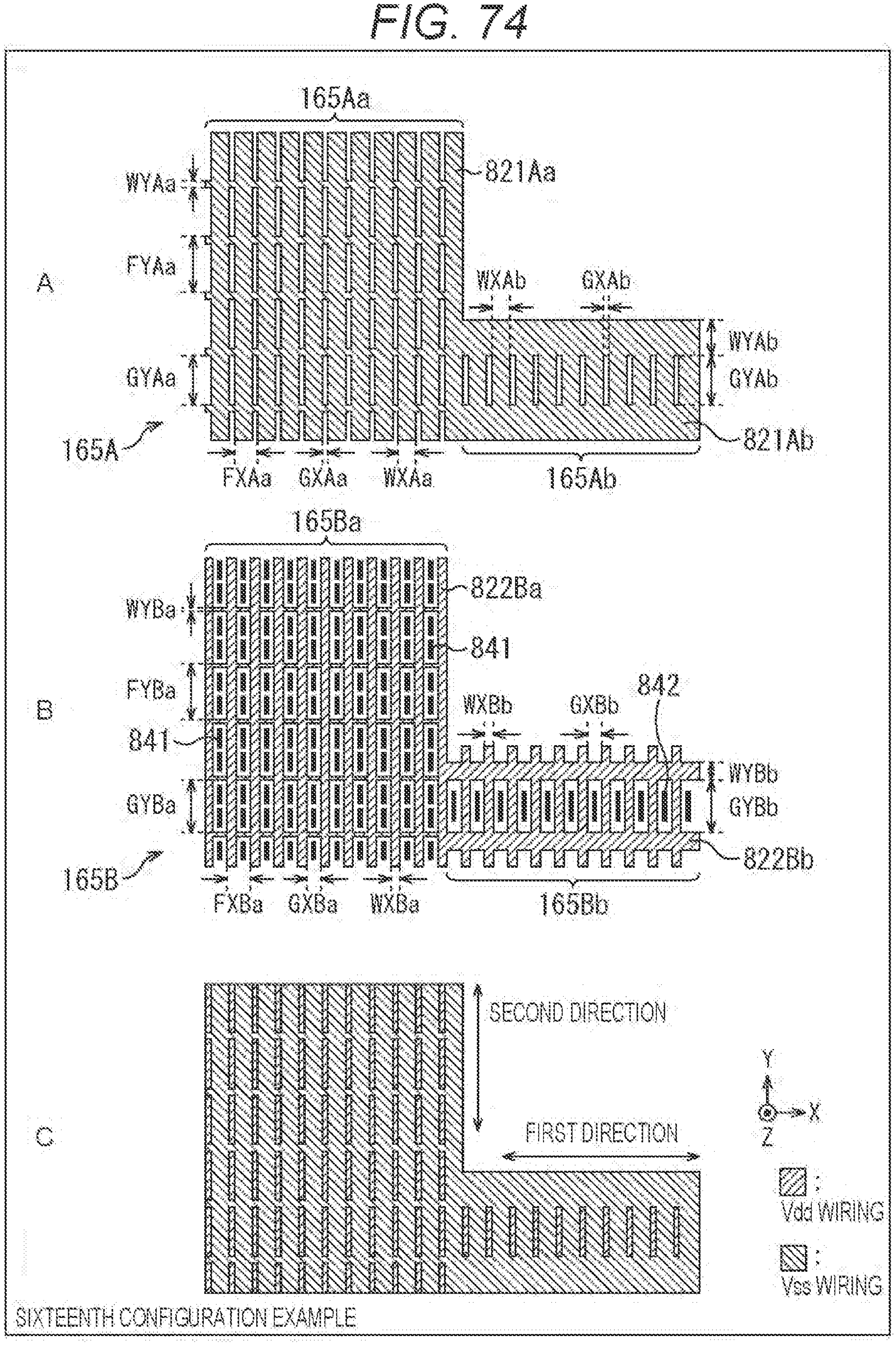
FIG. 74 is diagrams illustrating a second modification of the sixteenth configuration example of the conductor layers A and B.

FIG. 74 illustrates a second modification of the sixteenth configuration example.

The second modification of the sixteenth configuration example in FIG. 74 is similar to the first modification in that the relay conductor 841 is arranged in the gap regions of the entire region of the main conductor portion 165Ba of the conductor layer B. Meanwhile, the second modification of the sixteenth configuration example is different from the first modification in that a relay conductor 842 different from the relay conductor 841 is arranged in the gap regions of the reticulated conductor 822Bb of the lead-out conductor portion 165Bb. Other configurations in the second modification in FIG. 74 are similar to those in the sixteenth configuration example illustrated in FIG. 72.

As in the second modification, the numbers and shapes of the relay conductors 841 arranged in the gap regions of the reticulated conductor 822Ba of the main conductor portion 165Ba and the relay conductors 842 arranged in the gap regions of the reticulated conductor 822Bb of the lead-out conductor portion 165Bb, of the conductor layer B may be different.

In the case where the relay conductor 841 is not arranged in the gap region of the reticulated conductor 822Bb of the lead-out conductor portion 165Bb, as in the conductor layer B of the sixteenth configuration example in FIG. 72, the degree of freedom in wiring (reticulated conductor 822Bb) can be increased. Each conductor layer generally has a restriction on occupancy of a conductor region. However, since the wiring resistance of the lead-out conductor portion 165Bb can be minimized within the restriction on the occupancy due to the increase in the degree of freedom in wiring, the voltage drop can be further improved.

Meanwhile, in the case where the relay conductor 841, the relay conductor 842, or the like is arranged in the gap regions of the reticulated conductor 822Bb of the lead-out conductor portion 165Bb, and in a case where active elements such as MOS transistors and diodes are arranged in the region of the lead-out conductor portion 165Bb or in upper and lower layers at the same plane positions as the lead-out conductor portion 165Bb, the voltage drop can be further improved.

Furthermore, by making the numbers and shapes different between the relay conductor 841 arranged in the gap regions of the reticulated conductor 822Ba of the main conductor portion 165Ba and the relay conductor 842 arranged in the gap regions of the reticulated conductor 822Bb of the lead-out conductor portion 165Bb, of the conductor layer B, the occupancy in the conductor regions of each conductor layer can be maximized in the main conductor portion 165Ba and the lead-out conductor portion 165Bb. Therefore, the voltage drop can be further improved as the wiring resistance is made small.

Note that the shape of the relay conductor 841 is arbitrary, and a symmetric circle or polygon such as rotational symmetry or mirror plane symmetry is desirable. The relay conductor 841 can be arranged in a center of or at any other position of the gap region of the reticulated conductor 822Ba. The relay conductor 841 may be connected to a conductor layer as Vss wiring different from the conductor layer A. The relay conductor 841 may be connected to a conductor layer as Vss wiring closer to the active element group 167 than the conductor layer B. The relay conductor 841 can be connected to a conductor layer different from the conductor layer A or to a conductor layer or the like closer to the active element group 167 than the conductor layer B via the conductor via (VIA) extending in the Z direction. The same applies to the relay conductor 842.

The sixteenth configuration example in FIGS. 72 to 74 illustrates an example of arranging the relay conductor 841 or 842 in the gap regions of the reticulated conductors 822Ba and 822Bb of the conductor layer B. However, the same or different relay conductors may be arranged in the gap regions of the reticulated conductors 821Aa and 821Ab of the conductor layer A.

Seventeenth Configuration Example

Figure 75:
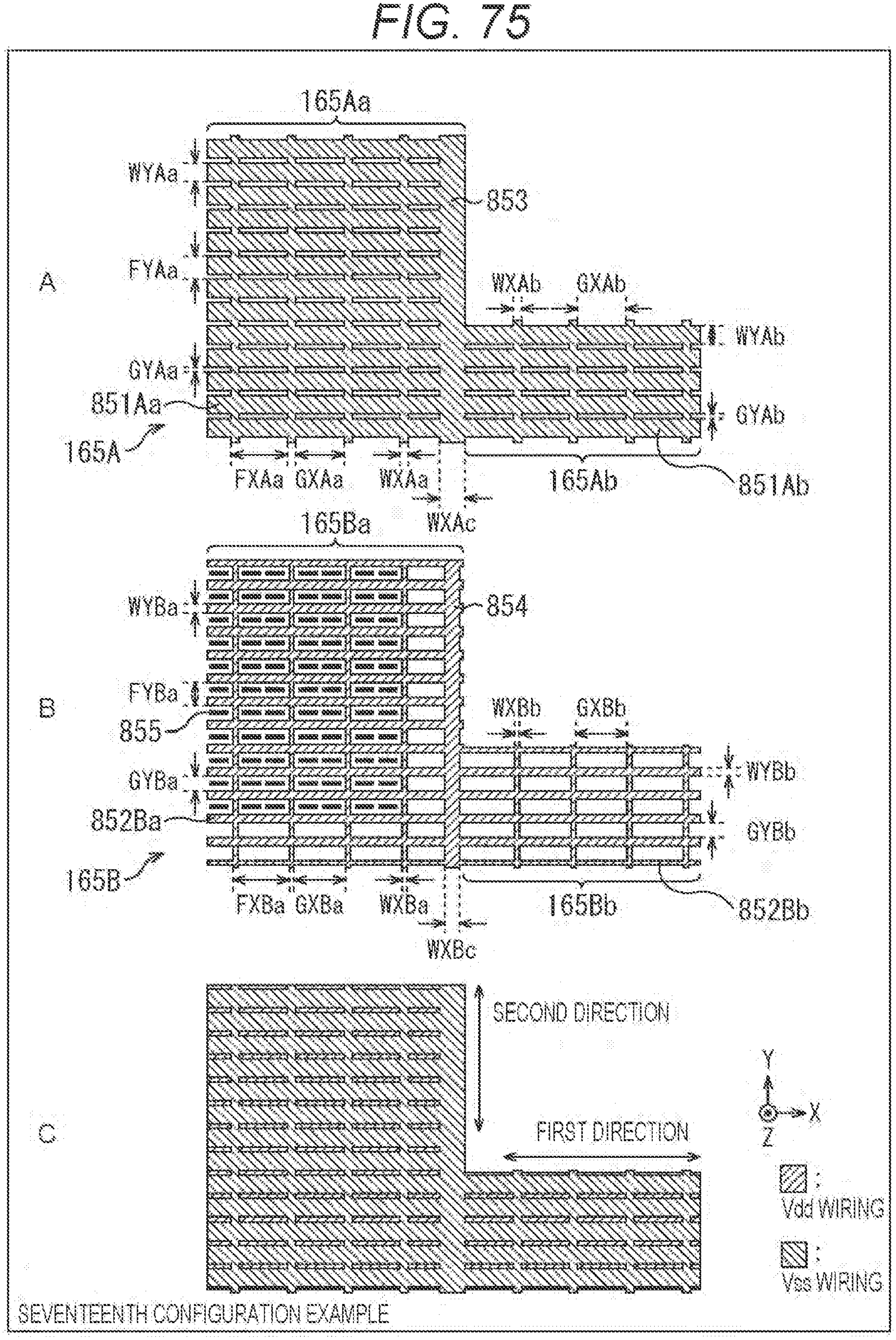
FIG. 75 is diagrams illustrating a seventeenth configuration example of the conductor layers A and B.

FIG. 75 illustrates a seventeenth configuration example of the conductor layers A and B. Note that A in FIG. 75 illustrates the conductor layer A, and B in FIG. 75 illustrates the conductor layer B. In the coordinate system in FIG. 75, the horizontal direction is the X axis, the vertical direction is the Y axis, and the direction perpendicular to the XY plane is the Z axis.

When comparing the conductor layer A in the seventeenth configuration example illustrated in A in FIG. 75 with the conductor layer A of the fourteenth configuration example illustrated in A in FIG. 65, the shape of a reticulated conductor 851Aa of the main conductor portion 165Aa and the shape of a reticulated conductor 851Ab of the lead-out conductor portion 165Ab are different.

In other words, the gap region of the reticulated conductor 821Aa in the fourteenth configuration example in A in FIG. 65 has the vertically long rectangular shape, whereas the gap region of the reticulated conductor 851Aa in the seventeenth configuration example in A in FIG. 75 has a horizontally long rectangular shape. Furthermore, the gap region of the reticulated conductor 821Ab in A in FIG. 65 has the vertically long rectangular shape, whereas the gap region of the reticulated conductor 851Ab in A in FIG. 75 has a horizontally long rectangular shape.

The reticulated conductor 851Ab of the lead-out conductor portion 165Ab in A in FIG. 75 is common to the reticulated conductor 821Ab in the fourteenth configuration example in A in FIG. 65 in that the current more easily flows in the X direction (first direction) toward the main conductor portion 165Aa than in the Y direction (second direction) orthogonal to the X direction.

Meanwhile, the reticulated conductor 851Aa of the main conductor portion 165Aa in A in FIG. 75 has a shape in which the current more easily flows in the X direction than in the Y direction, whereas the reticulated conductor 821Aa of the main conductor portion 165Aa in the fourteenth configuration example in A in FIG. 65 has the shape in which the current more easily flows in the Y direction.

That is, the conductor layer A in the seventeenth configuration example illustrated in A in FIG. 75 is different from the conductor layer A of the fourteenth configuration example in A in FIG. 65 in the direction in which the current easily flows in the main conductor portion 165Aa.

Furthermore, the main conductor portion 165Aa of the conductor layer A in the seventeenth configuration example includes a reinforced conductor 853 reinforced such that the current more easily flows in the Y direction than in the X direction. A conductor width WXAc of the reinforced conductor 853 is desirably formed to be larger than one or both of the conductor width WXAa in the X direction and the conductor width WYAa in the Y direction of the reticulated conductor 851Aa. The conductor width WXAc of the reinforced conductor 853 is formed to be larger than the conductor width WXAa in the X direction or the conductor width WYAa in the Y direction of the reticulated conductor 851Aa, whichever is smaller. Note that, in the example in FIG. 75, the position in the X direction at which the reinforced conductor 853 is formed is a position closest to the lead-out conductor portion 165Ab in the region of the main conductor portion 165Aa. However, it is sufficient that the position is a position near the joint portion.

Since the reticulated conductor 851Aa of the main conductor portion 165Aa can be formed in the shape that allows the current to easily flow in the X direction, the layout can be created with a minimum number of repetitions of the basic pattern, which increases the degree of freedom in designing the wiring layout. Furthermore, the voltage drop can be further improved depending on arrangement of the active elements such as MOS transistors and diodes.

Then, by providing the reinforced conductor 853 reinforced such that the current can easily flow in the Y direction, the current can be easily diffused in the Y direction in the main conductor portion 165Aa, so that the current concentration around the joint portion between the main conductor portion 165Aa and the lead-out conductor portion 165Ab can be alleviated. In a case where the current is locally concentrated, the inductive noise deteriorates due to the concentrated portion. However, since the current concentration can be reduced, the inductive noise can be further improved.

When comparing the conductor layer B in the seventeenth configuration example illustrated in B in FIG. 75 with the conductor layer B of the fourteenth configuration example illustrated in B in FIG. 65, the shape of a reticulated conductor 852Ba of the main conductor portion 165Ba and the shape of a reticulated conductor 852Bb of the lead-out conductor portion 165Bb are different.

In other words, the gap region of the reticulated conductor 822Ba in the fourteenth configuration example illustrated in B in FIG. 65 has the vertically long rectangular shape, whereas the gap region of the reticulated conductor 852Ba in the seventeenth configuration example illustrated in B in FIG. 75 has a horizontally long rectangular shape. Furthermore, the gap region of the reticulated conductor 822Bb in B in FIG. 65 has the vertically long rectangular shape, whereas the gap region of the reticulated conductor 852Bb in B in FIG. 75 has a horizontally long rectangular shape.

The reticulated conductor 852Bb of the lead-out conductor portion 165Bb in B in FIG. 75 is common to the reticulated conductor 822Bb in the fourteenth configuration example in B in FIG. 65 in that the current more easily flows in the X direction (first direction) toward the main conductor portion 165Ba than in the Y direction (second direction) orthogonal to the X direction.

Meanwhile, the reticulated conductor 852Ba of the main conductor portion 165Ba in B in FIG. 75 has a shape in which the current more easily flows in the X direction than in the Y direction, whereas the reticulated conductor 822Ba of the main conductor portion 165Ba in the fourteenth configuration example in B in FIG. 65 has the shape in which the current more easily flows in the Y direction.

That is, the conductor layer B in the seventeenth configuration example illustrated in B in FIG. 75 is different from the conductor layer B of the fourteenth configuration example in B in FIG. 65 in the direction in which the current easily flows in the main conductor portion 165Ba.

Furthermore, the main conductor portion 165Ba of the conductor layer B in the seventeenth configuration example includes a reinforced conductor 854 reinforced such that the current more easily flows in the Y direction than in the X direction. A conductor width WXBc of the reinforced conductor 854 is desirably formed to be larger than one or both of the conductor width WXBa in the X direction and the conductor width WYBa in the Y direction of the reticulated conductor 852Ba. The conductor width WXBc of the reinforced conductor 854 is formed to be larger than the conductor width WXBa in the X direction or the conductor width WYBa in the Y direction of the reticulated conductor 852Ba, whichever is smaller. In the example in FIG. 75, the position in the X direction at which the reinforced conductor 854 is formed is a position closest to the lead-out conductor portion 165Bb in the region of the main conductor portion 165Ba. However, it is sufficient that the position is a position near the joint portion.

As illustrated in C in FIG. 75, the reinforced conductor 853 of the conductor layer A and the reinforced conductor 854 of the conductor layer B are formed at overlapping positions. In the state where the conductor layer A and the conductor layer B are stacked, the active element group 167 is covered with at least one of the conductor layer A or the conductor layer B. Therefore, the hot carrier light emission from the active element group 167 can be shielded even in the seventeenth configuration example. Note that, for example, in a case where light-shielding is not necessary near the reinforced conductor 853 or the reinforced conductor 854, the reinforced conductor 853 and the reinforced conductor 854 may not be formed at overlapping positions. Furthermore, for example, at least one of the reinforced conductor 853 or the reinforced conductor 854 may not be provided depending on the current distribution of the main conductor portion 165*a*.

Since the reticulated conductor 852Ba of the main conductor portion 165Ba can be formed in the shape that allows the current to easily flow in the X direction, the layout can be created with a minimum number of repetitions of the basic pattern, which increases the degree of freedom in designing the wiring layout. Furthermore, the voltage drop can be further improved depending on arrangement of the active elements such as MOS transistors and diodes.

Then, by providing the reinforced conductor 854 reinforced such that the current easily flows in the Y direction, the current can be easily diffused in the second direction in the main conductor portion 165Ba, so that the current concentration around the joint portion between the main conductor portion 165Ba and the lead-out conductor portion 165Bb can be alleviated. In a case where the current is locally concentrated, the inductive noise deteriorates due to the concentrated portion. However, since the current concentration can be reduced, the inductive noise can be further improved.

Moreover, the conductor layer B in the seventeenth configuration example illustrated in B in FIG. 75 is different from the conductor layer B of the fourteenth configuration example in B in FIG. 65 in that a relay conductor 855 is arranged in at least some gap regions of the reticulated conductor 852Ba of the main conductor portion 165Ba. The relay conductor 855 may be or may not be arranged.

First Modification of Seventeenth Configuration Example

Figure 76:
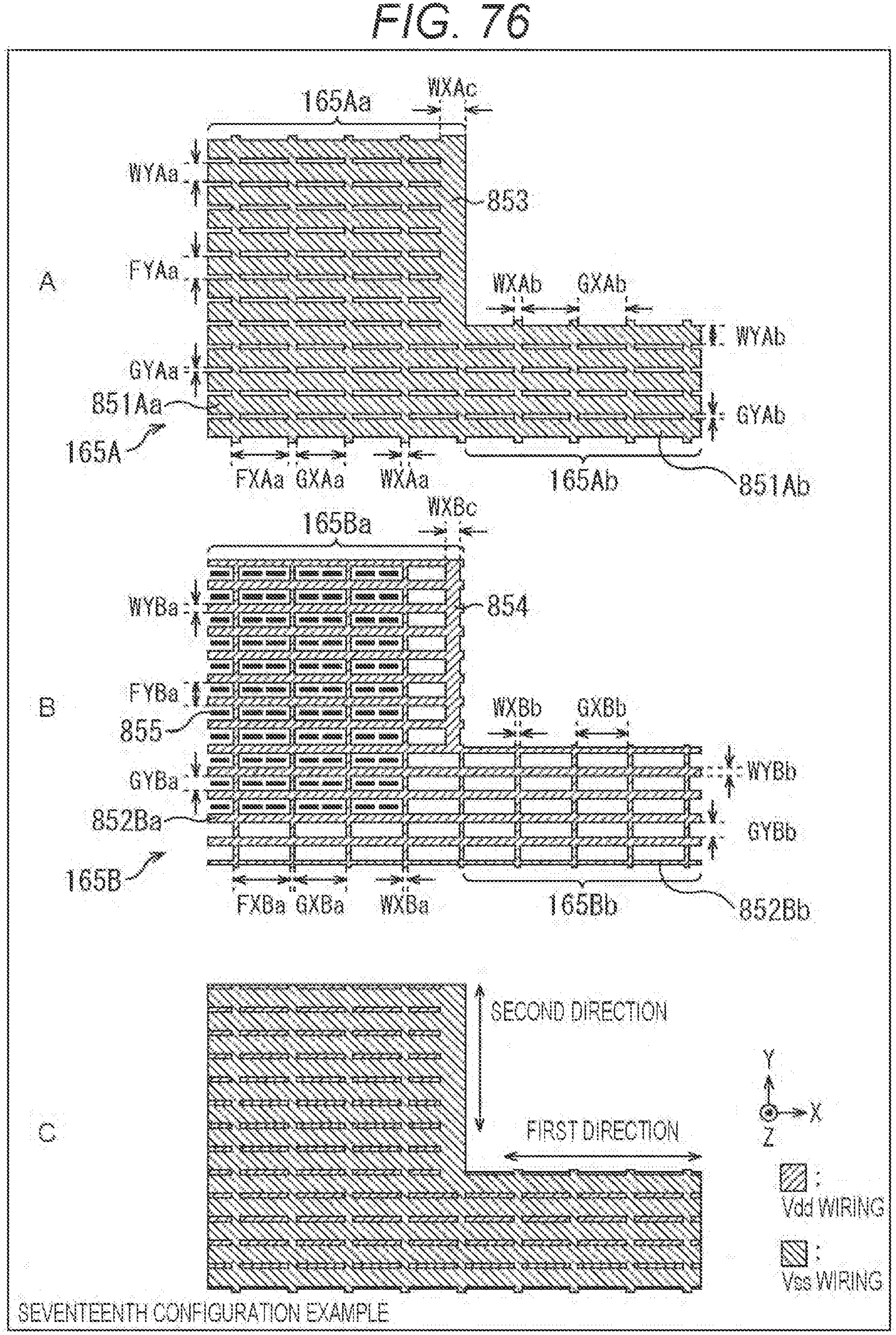
FIG. 76 is diagrams illustrating a first modification of the seventeenth configuration example of the conductor layers A and B.

FIG. 76 illustrates a first modification of the seventeenth configuration example.

The first modification of the seventeenth configuration example is different from the conductor layer A of the seventeenth configuration example illustrated in A in FIG. 75 in that the reinforced conductor 853 of the conductor layer A illustrated in A in FIG. 76 is not formed over the entire length in the Y direction of the main conductor portion 165Aa but formed in a part in the Y direction. More specifically, in the first modification in FIG. 76, the reinforced conductor 853 of the conductor layer A is formed at a position in the Y direction excluding the position of the joint portion in the Y direction. Other configurations of the conductor layer A in the first modification are similar to those of the conductor layer A in the seventeenth configuration example illustrated in A in FIG. 75.

Similarly, the conductor layer B of the first modification of the seventeenth configuration example is different from the conductor layer B of the seventeenth configuration example illustrated in B in FIG. 75 in that the reinforced conductor 854 of the conductor layer B illustrated in B in FIG. 76 is not formed over the entire length in the Y direction of the main conductor portion 165Ba but formed in a part in the Y direction. More specifically, in the first modification in FIG. 76, the reinforced conductor 854 of the conductor layer B is formed at a position in the Y direction excluding the position of the joint portion in the Y direction. Other configurations of the conductor layer B in the first modification are similar to those of the conductor layer B in the seventeenth configuration example illustrated in A in FIG. 75.

Second Modification of Seventeenth Configuration Example

Figure 77:
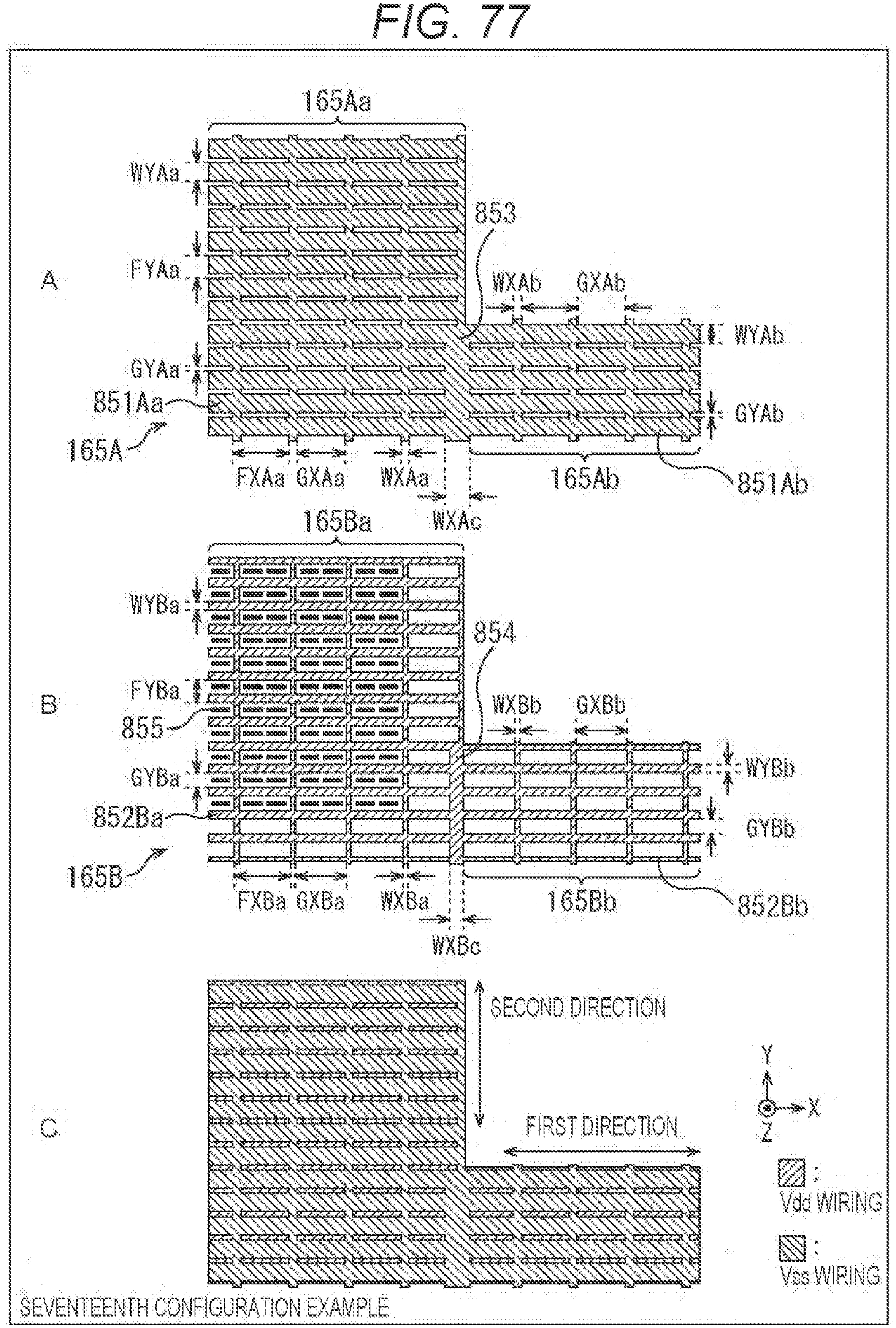
FIG. 77 is diagrams illustrating a second modification of the seventeenth configuration example of the conductor layers A and B.

FIG. 77 illustrates a second modification of the seventeenth configuration example.

The second modification of the seventeenth configuration example is different from the conductor layer A of the seventeenth configuration example illustrated in A in FIG. 75 in that the reinforced conductor 853 of the conductor layer A illustrated in A in FIG. 77 is not formed over the entire length in the Y direction of the main conductor portion 165Aa but formed in a part in the Y direction. More specifically, in the second modification in FIG. 77, the reinforced conductor 853 of the conductor layer A is formed only at the position in the Y direction of the joint portion. Other configurations of the conductor layer A in the second modification are similar to those of the conductor layer A in the seventeenth configuration example illustrated in A in FIG. 75.

Similarly, the conductor layer B of the first modification of the seventeenth configuration example is different from the conductor layer B of the seventeenth configuration example illustrated in B in FIG. 75 in that the reinforced conductor 854 of the conductor layer B illustrated in B in FIG. 77 is not formed over the entire length in the Y direction of the main conductor portion 165Ba but formed in a part in the Y direction. More specifically, in the second modification in FIG. 77, the reinforced conductor 854 of the conductor layer B is formed only at the position in the Y direction of the joint portion. Other configurations of the conductor layer B in the second modification are similar to those of the conductor layer B in the seventeenth configuration example illustrated in A in FIG. 75.

As in the first modification and the second modification of the seventeenth configuration example, the reinforced conductor 853 of the conductor layer A and the reinforced conductor 854 of the conductor layer B are not necessarily formed over the entire length in the Y direction of the main conductor portion 165Aa, and may be formed in a region in the Y direction of a predetermined part.

Eighteenth Configuration Example

Figure 78:
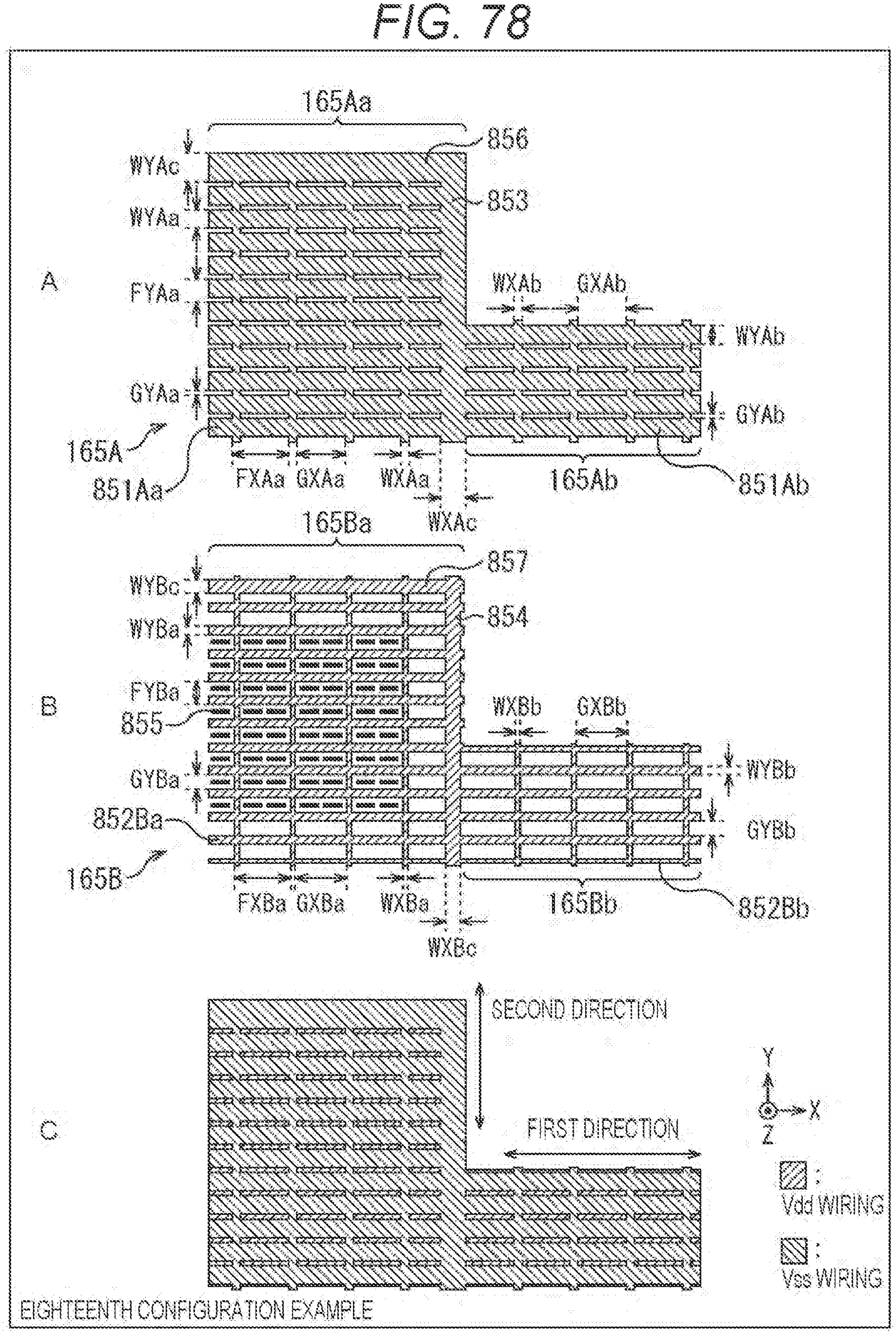
FIG. 78 is diagrams illustrating an eighteenth configuration example of the conductor layers A and B.

FIG. 78 illustrates an eighteenth configuration example of the conductor layers A and B. Note that A in FIG. 78 illustrates the conductor layer A, and B in FIG. 78 illustrates the conductor layer B. C in FIG. 78 illustrates a state of the conductor layers A and B respectively illustrated in A and B in FIG. 78, which are viewed from the conductor layer A side. In the coordinate system in FIG. 78, the horizontal direction is the X axis, the vertical direction is the Y axis, and the direction perpendicular to the XY plane is the Z axis.

The eighteenth configuration example illustrated in FIG. 78 has a configuration in which a part of the seventeenth configuration example illustrated in FIG. 75 is changed. Note that, in FIG. 78, a portion corresponding to FIG. 75 is given the same reference numeral and description thereof is omitted as appropriate.

The conductor layer A of the eighteenth configuration example illustrated in A in FIG. 78 is common to the seventeenth configuration example illustrated in FIG. 75 in including the reticulated conductor 851Aa having the shape in which the current easily flows in the X direction and the reinforced conductor 853 reinforced such that the current easily flows in the Y direction.

Meanwhile, the conductor layer A in the eighteenth configuration example is different from that in the seventeenth configuration example illustrated in FIG. 75 in further including a reinforced conductor 856 reinforced such that the current more easily flows in the X direction than in the Y direction. A conductor width WYAc of the reinforced conductor 856 is desirably formed to be larger than one or both of the conductor width WXAa in the X direction and the conductor width WYAa in the Y direction of the reticulated conductor 851Aa. The conductor width WYAc of the reinforced conductor 856 is formed to be larger than the conductor width WXAa in the X direction or the conductor width WYAa in the Y direction of the reticulated conductor 851Aa, whichever is smaller. A plurality of the reinforced conductors 856 may be arranged in a region of the main conductor portion 165Aa at predetermined intervals in the Y direction or one reinforced conductor 856 may be arranged at a predetermined position in the Y direction.

By providing the reinforced conductor 856 reinforced such that the current can easily flow in the X direction, the current can easily flow not only in the Y direction by the reinforced conductor 853 but also in the X direction, and the current concentration around the joint portion between the main conductor portion 165Aa and the lead-out conductor portion 165Ab can be alleviated. In a case where the current is locally concentrated, the inductive noise deteriorates due to the concentrated portion. However, since the current concentration can be reduced, the inductive noise can be further improved.

The conductor layer B of the eighteenth configuration example illustrated in B in FIG. 78 is common to the seventeenth configuration example illustrated in FIG. 75 in including the reticulated conductor 852Ba having the shape in which the current easily flows in the X direction and the reinforced conductor 854 reinforced such that the current easily flows in the Y direction.

Meanwhile, the conductor layer B in the eighteenth configuration example is different from that in the seventeenth configuration example illustrated in FIG. 75 in further including a reinforced conductor 857 reinforced such that the current more easily flows in the X direction than in the Y direction. A conductor width WYBc of the reinforced conductor 857 is desirably formed to be larger than one or both of the conductor width WXBa in the X direction and the conductor width WYBa in the Y direction of the reticulated conductor 852Ba. The conductor width WYBc of the reinforced conductor 857 is formed to be larger than the conductor width WXBa in the X direction or the conductor width WYBa in the Y direction of the reticulated conductor 852Ba, whichever is smaller. A plurality of the reinforced conductors 857 may be arranged in a region of the main conductor portion 165Ba at predetermined intervals in the Y direction or one reinforced conductor 857 may be arranged at a predetermined position in the Y direction.

As illustrated in C in FIG. 78, the reinforced conductor 856 of the conductor layer A and the reinforced conductor 857 of the conductor layer B are formed at overlapping positions. In the state where the conductor layer A and the conductor layer B are stacked, the active element group 167 is covered with at least one of the conductor layer A or the conductor layer B. Therefore, the hot carrier light emission from the active element group 167 can be shielded even in the eighteenth configuration example. Note that, for example, in a case where light-shielding is not necessary near the reinforced conductor 856 or the reinforced conductor 857, the reinforced conductor 856 and the reinforced conductor 857 may not be formed at overlapping positions. Furthermore, for example, at least one of the reinforced conductor 856 or the reinforced conductor 857 may not be provided depending on the current distribution of the main conductor portion 165*a*.

By providing a reinforced conductor 857 reinforced such that the current can easily flow in the X direction, the current can easily flow not only in the Y direction by the reinforced conductor 854 but also in the X direction, and the current concentration around the joint portion between the main conductor portion 165Ba and the lead-out conductor portion 165Bb can be alleviated. In a case where the current is locally concentrated, the inductive noise deteriorates due to the concentrated portion. However, since the current concentration can be reduced, the inductive noise can be further improved.

In the seventeenth configuration example in FIG. 75, the configuration including the reinforced conductors 853 and 854 reinforced such that the current easily flows in the Y direction has been described. In the eighteenth configuration example in FIG. 78, the configuration including the reinforced conductors 856 and 857 reinforced such that the current easily flows in the X direction in addition to the reinforced conductors 853 and 854 has been described.

Although not illustrated, as a modification of the seventeenth configuration example or the eighteenth configuration example, a configuration in which the conductor layer A does not include the reinforced conductor 853 and includes the reinforced conductor 856, and the conductor layer B does not include the reinforced conductor 854 and includes the reinforced conductor 857 may be adopted. In other words, a configuration provided with only the reinforced conductors 856 and 857 as the reinforced conductors may be adopted.

By providing the reinforced conductor 856 reinforced such that the current easily flows in the X direction, the current can be easily diffused in the Y direction depending on the relationship of the wiring resistance even in the case of not including the reinforced conductor 853, and the current concentration near the joint portion between the main conductor portion 165Aa and the lead-out conductor portion 165Ab can be alleviated. In a case where the current is locally concentrated, the inductive noise deteriorates due to the concentrated portion. However, since the current concentration can be reduced, the inductive noise can be further improved.

By providing the reinforced conductor 857 reinforced such that the current easily flows in the X direction, the current can be easily diffused in the Y direction depending on the relationship of the wiring resistance even in the case of not including the reinforced conductor 854, and the current concentration near the joint portion between the main conductor portion 165Ba and the lead-out conductor portion 165Bb can be alleviated. In a case where the current is locally concentrated, the inductive noise deteriorates due to the concentrated portion. However, since the current concentration can be reduced, the inductive noise can be further improved.

Nineteenth Configuration Example

Figure 79:
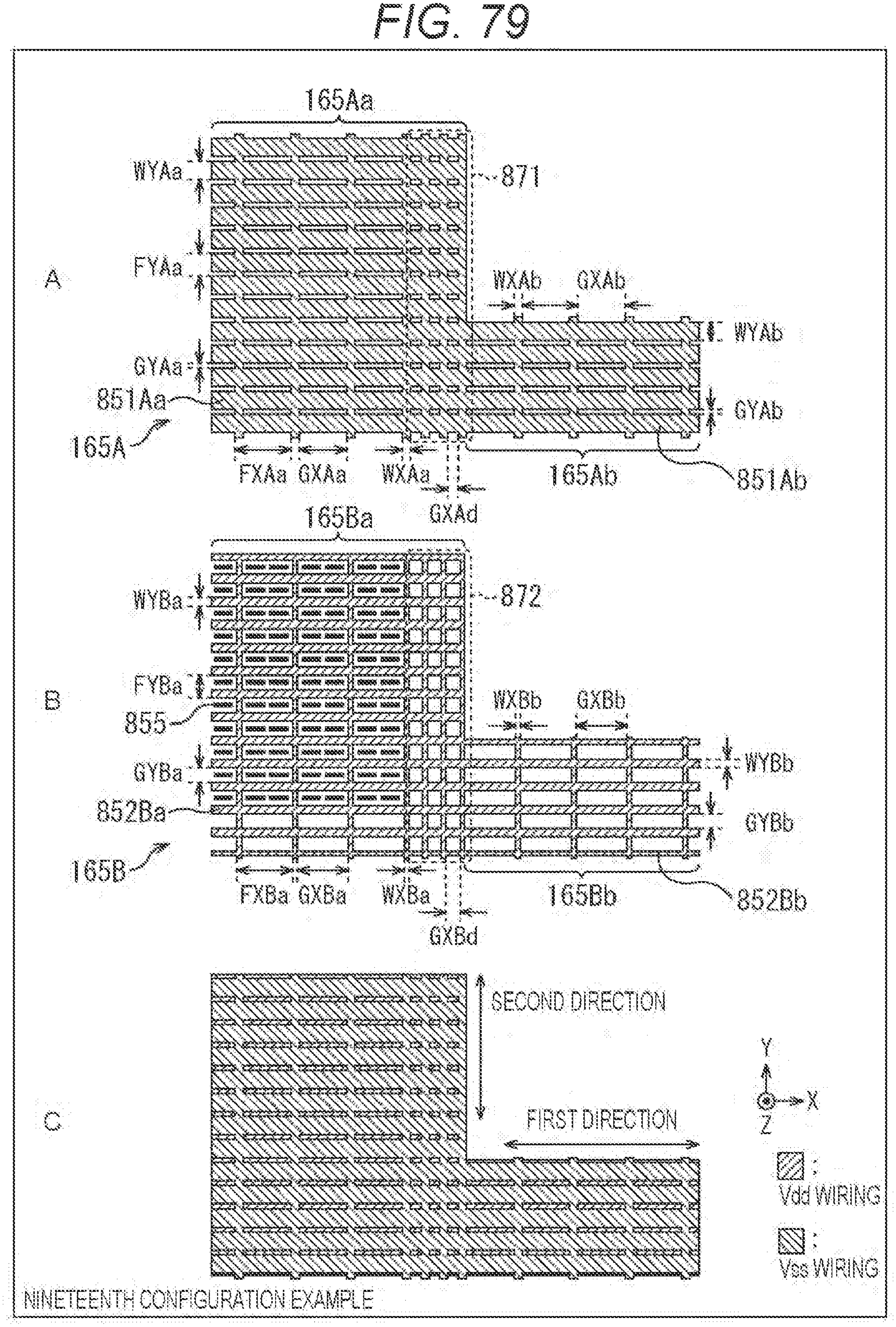
FIG. 79 is diagrams illustrating a nineteenth configuration example of the conductor layers A and B.

FIG. 79 illustrates a nineteenth configuration example of the conductor layers A and B. Note that A in FIG. 79 illustrates the conductor layer A, and B in FIG. 79 illustrates the conductor layer B. C in FIG. 79 illustrates a state of the conductor layers A and B respectively illustrated in A and B in FIG. 79, which are viewed from the conductor layer A side. In the coordinate system in FIG. 79, the horizontal direction is the X axis, the vertical direction is the Y axis, and the direction perpendicular to the XY plane is the Z axis.

The nineteenth configuration example illustrated in FIG. 79 has a configuration in which a part of the seventeenth configuration example illustrated in FIG. 75 is changed. Note that, in FIG. 79, a portion corresponding to FIG. 75 is given the same reference numeral and description thereof is omitted as appropriate.

The conductor layer A in the nineteenth configuration example illustrated in A in FIG. 79 is different in that the reinforced conductor 853 of the seventeenth configuration example illustrated in FIG. 75 is replaced with a reinforced conductor 871 and is common in the other points. The reinforced conductor 871 includes a plurality of wirings extending in the Y direction. The wirings constituting the reinforced conductor 871 are evenly spaced in the X direction with a gap width GXAd. The gap width GXAd is smaller than the gap width GXAa of the reticulated conductor 851Aa of the main conductor portion 165Aa.

The conductor layer B in the nineteenth configuration example illustrated in B in FIG. 79 is different in that the reinforced conductor 854 of the seventeenth configuration example illustrated in FIG. 75 is replaced with a reinforced conductor 872 and is common in the other points. The reinforced conductor 872 includes a plurality of wirings extending in the Y direction. The wirings constituting the reinforced conductor 872 are evenly spaced in the X direction with a gap width GXBd. The gap width GXBd is smaller than the gap width GXBa of the reticulated conductor 852Ba of the main conductor portion 165Ba.

As illustrated in C in FIG. 79, the reinforced conductor 871 of the conductor layer A and the reinforced conductor 872 of the conductor layer B are formed at overlapping positions. In the state where the conductor layer A and the conductor layer B are stacked, the active element group 167 is covered with at least one of the conductor layer A or the conductor layer B. Therefore, the hot carrier light emission from the active element group 167 can be shielded even in the nineteenth configuration example. Note that, for example, in a case where light-shielding is not necessary near the reinforced conductor 871 or the reinforced conductor 872, the reinforced conductor 871 and the reinforced conductor 872 may not be formed at overlapping positions. Furthermore, for example, at least one of the reinforced conductor 871 or the reinforced conductor 872 may not be provided depending on the current distribution of the main conductor portion 165*a*.

Modifications of Nineteenth Configuration Example

Figure 80:
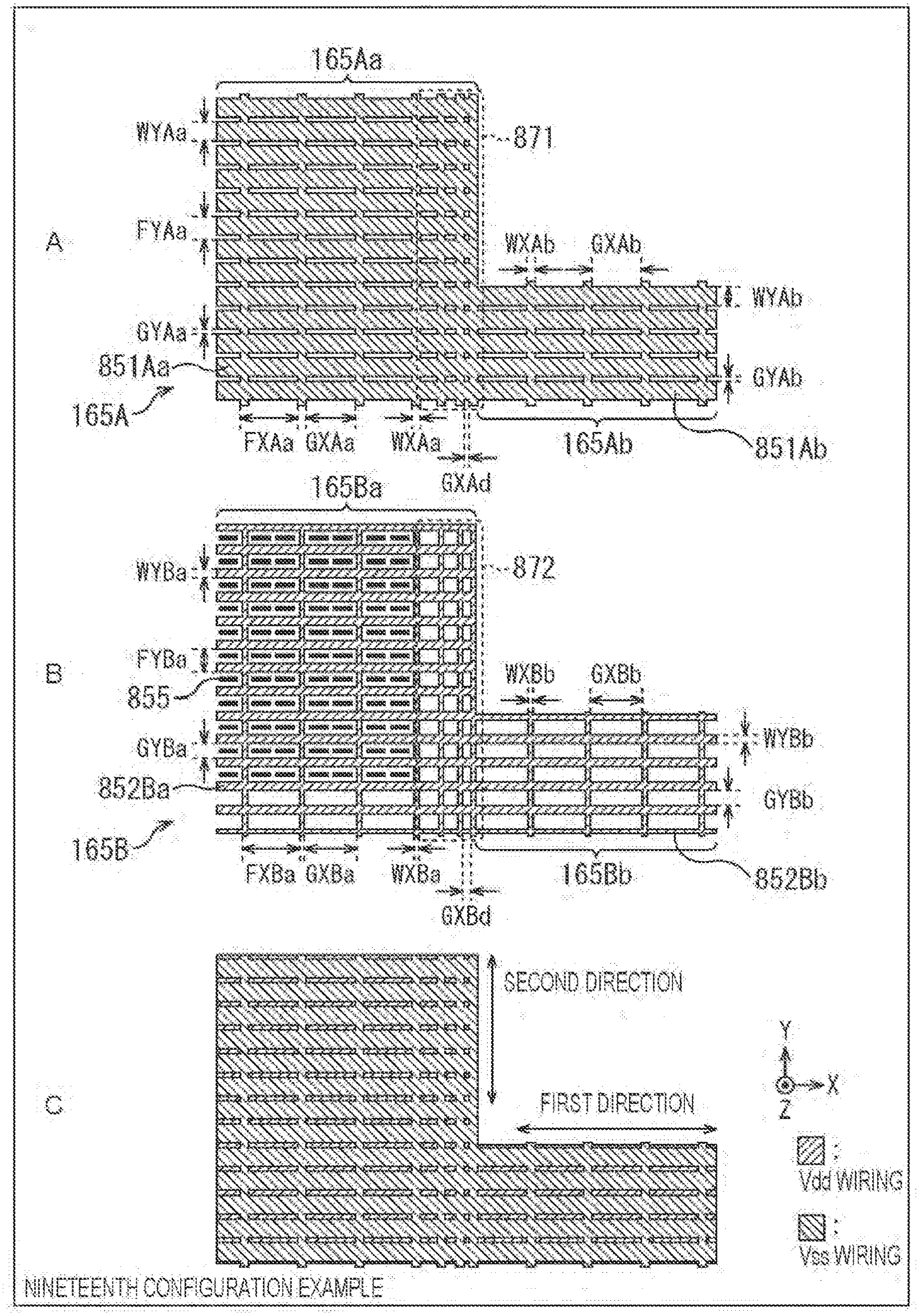
FIG. 80 is diagrams illustrating a modification of the nineteenth configuration example of the conductor layers A and B.

FIG. 80 illustrates a modification of the nineteenth configuration example.

In the nineteenth configuration example illustrated in FIG. 79, the plurality of wirings constituting the reinforced conductor 871 of the conductor layer A has been evenly spaced in the X direction with the gap width GXAd. A plurality of wirings constituting the reinforced conductor 872 of the conductor layer B has been evenly spaced in the X direction with the gap width GXAd.

In contrast, in FIG. 80 as the modification of the nineteenth configuration example, each gap width GXAd of adjacent wirings is different among the plurality of wirings constituting the reinforced conductor 871 of the conductor layer A. At least one of the gap widths GXAd is smaller than the gap width GXAa of the reticulated conductor 851Aa of the main conductor portion 165Aa. In the plurality of wirings constituting the reinforced conductor 872 of the conductor layer B, the gap widths GXBd of adjacent wirings are different. At least one of the gap widths GXBd is smaller than the gap width GXBa of the reticulated conductor 852Ba of the main conductor portion 165Ba.

Note that, in the example in FIG. 80, the plurality of gap widths GXAd and gap widths GXBd is formed to be gradually shortened from the left side. However, the configuration is not limited thereto, and the plurality of gap widths may be formed to be gradually shortened from the right side or may be random widths.

As described above, the modification of the nineteenth configuration example in FIG. 80 is similar to the nineteenth configuration example illustrated in FIG. 79 except that the gap widths GXAd and GXBd are not uniform and are modulated.

The reinforced conductor 871 of the conductor layer A and the reinforced conductor 872 of the conductor layer B can be configured using a plurality of wirings arranged with the predetermined gap width GXAd or GXBd, as in the nineteenth configuration example and the modification illustrated in FIGS. 79 and 80.

By providing the reinforced conductors 871 and 872 reinforced such that the current can easily flow in the Y direction, the current can be easily diffused in the Y direction, so that the current concentration around the joint portion can be alleviated. In a case where the current is locally concentrated, the inductive noise deteriorates due to the concentrated portion. However, since the current concentration can be reduced, the inductive noise can be further improved. In the nineteenth configuration example and its modification illustrated in FIGS. 79 and 80, the configuration including at least the gap width smaller than the gap width GXAa or the gap width GXBa in the X direction, and including the reinforced conductors 871 and 872 reinforced such that the current easily flows in the Y direction has been described. However, the configuration is not limited thereto. For example, although not illustrated, a configuration including at least a gap width smaller than the gap width GYAa or the gap width GYBa in the Y direction and including a reinforced conductor reinforced such that the current easily flows in the X direction similarly to the eighteenth configuration example in FIG. 78 may be adopted. Furthermore, any of the configuration including the reinforced conductor reinforced such that the current easily flows in the X direction, the configuration including the reinforced conductor reinforced such that the current easily flows in the Y direction, or a configuration including both the reinforced conductor reinforced such that the current easily flows in the X direction and the reinforced conductor reinforced such that the current easily flows in the Y direction may be adopted. Even in these cases, the current concentration can be alleviated depending on the relationship of the wiring resistance, so that the inductive noise can be further improved.

Twentieth Configuration Example

Figure 81:
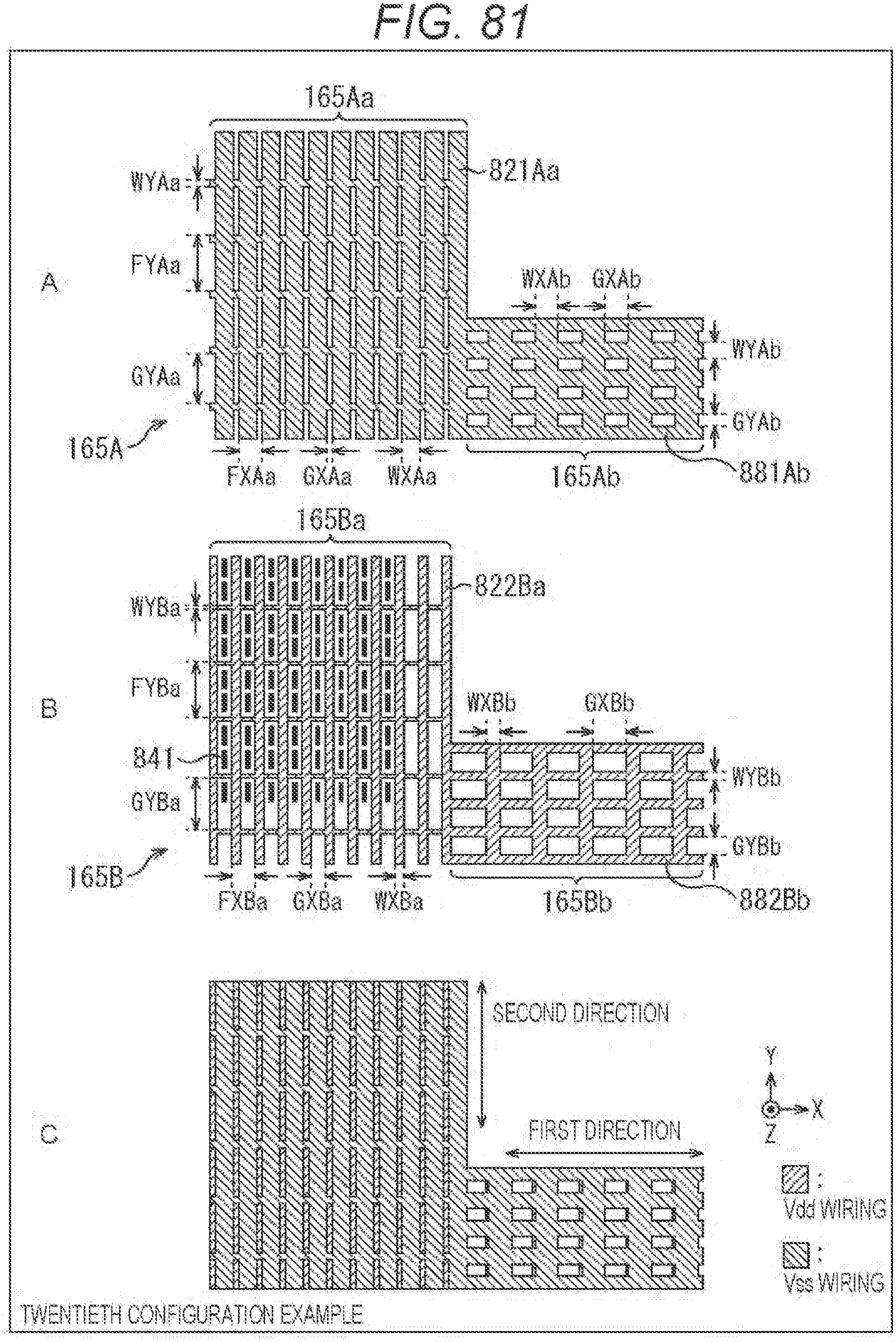
FIG. 81 is diagrams illustrating a twentieth configuration example of the conductor layers A and B.

FIG. 81 illustrates a twentieth configuration example of the conductor layers A and B. Note that A in FIG. 81 illustrates the conductor layer A, and B in FIG. 81 illustrates the conductor layer B. C in FIG. 81 illustrates a state of the conductor layers A and B respectively illustrated in A and B in FIG. 81, which are viewed from the conductor layer A side. In the coordinate system in FIG. 81, the horizontal direction is the X axis, the vertical direction is the Y axis, and the direction perpendicular to the XY plane is the Z axis.

The twentieth configuration example illustrated in FIG. 81 has a configuration in which a part of the sixteenth configuration example illustrated in FIG. 72 is changed. Note that, in FIG. 81, a portion corresponding to FIG. 72 is given the same reference numeral and description thereof is omitted as appropriate.

The conductor layer A of the twentieth configuration example illustrated in A in FIG. 81 is common to the conductor layer A of the sixteenth configuration example illustrated in FIG. 72 in that the main conductor portion 165Aa includes the reticulated conductor 821Aa. Meanwhile, the conductor layer A of the twentieth configuration example is different from the conductor layer A of the sixteenth configuration example illustrated in FIG. 72 in that the lead-out conductor portion 165Ab includes a reticulated conductor 881Ab different from the reticulated conductor 821Ab.

The conductor layer B of the twentieth configuration example illustrated in B in FIG. 81 is common to the conductor layer B of the sixteenth configuration example illustrated in FIG. 72 in that the main conductor portion 165Ba includes the reticulated conductor 822Ba and the relay conductor 841 arranged in the gap region. The conductor layer B of the twentieth configuration example is different from the conductor layer B of the sixteenth configuration example illustrated in FIG. 72 in that the lead-out conductor portion 165Bb includes a reticulated conductor 882Bb different from the reticulated conductor 822Bb.

That is, the twentieth configuration example is different in the shape of the repeating pattern of the lead-out conductor portion 165*b* from the sixteenth configuration example illustrated in FIG. 72.

As illustrated in C in FIG. 81, some regions of the lead-out conductor portion 165*b* are open regions in the state where the conductor layer A and the conductor layer B are stacked.

As described above, it is not necessary to adopt a light-shielding structure in the entire region of the conductor layer A and the conductor layer B, and a region where the active elements such as MOS transistors and diodes are not arranged may not be shielded.

The twentieth configuration example in FIG. 81 has the configuration in which some regions of the lead-out conductor portions 165*b* of the conductor layer A and the conductor layer B are not shielded. However, a configuration in which some regions of the main conductor portions 165*a* of the conductor layer A and the conductor layer B are not shielded may be adopted. By not adopting the light-shielding structure for the regions where shielding is not required, the degree of freedom in designing the wiring layout further increases, whereby a wiring pattern that further improves the inductive noise and further improves the voltage drop can be adopted.

Twenty-First Configuration Example

The above-described fourteenth to twentieth configuration examples are the examples in which the conductor layers of the lead-out conductor portion 165*b* connected to the main conductor portion 165*a* are the reticulated conductors.

However, the conductor layer of the lead-out conductor portion 165*b* is not limited to the reticulated conductor, and may be configured by a planar conductor or a linear conductor similarly to the main conductor portion 165*a*.

In the following twenty-first to twenty-fourth configuration examples, configuration examples in which the conductor layer of the lead-out conductor portion 165*b* is formed using a planar conductor or a linear conductor will be described.

Figure 82:
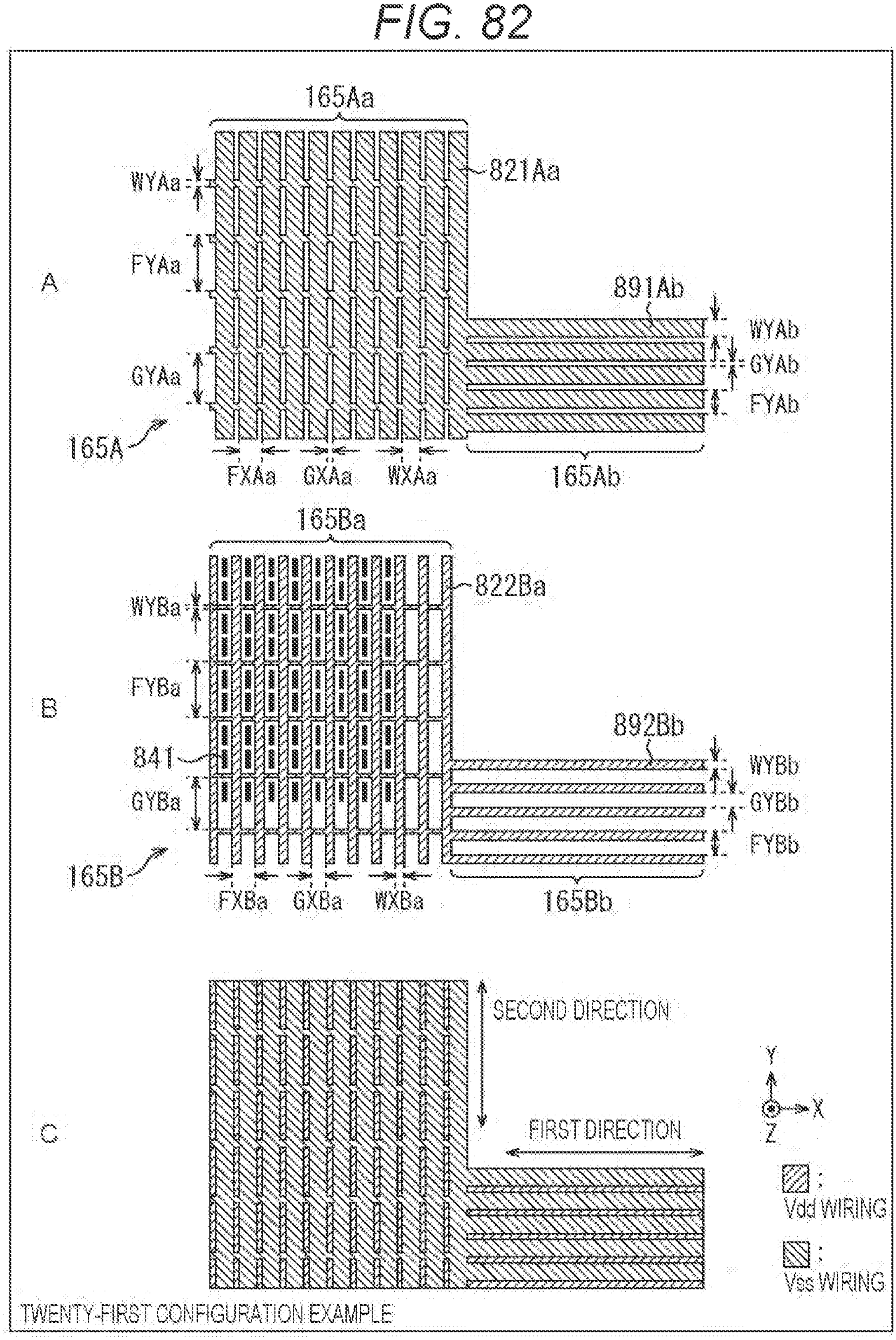
FIG. 82 is diagrams illustrating a twenty-first configuration example of the conductor layers A and B.

FIG. 82 illustrates a twenty-first configuration example of the conductor layers A and B. Note that A in FIG. 82 illustrates the conductor layer A, and B in FIG. 81 illustrates the conductor layer B. C in FIG. 82 illustrates a state of the conductor layers A and B respectively illustrated in A and B in FIG. 82, which are viewed from the conductor layer A side. In the coordinate system in FIG. 82, the horizontal direction is the X axis, the vertical direction is the Y axis, and the direction perpendicular to the XY plane is the Z axis.

The twenty-first configuration example illustrated in FIG. 82 has a configuration in which the conductor layer of the lead-out conductor portion 165*b* of the sixteenth configuration example illustrated in FIG. 72 is changed. Note that, in FIG. 82, a portion corresponding to FIG. 72 is given the same reference numeral and description thereof is omitted as appropriate.

A linear conductor 891Ab long in the X direction is periodically arranged in the Y direction with a conductor period FYAb instead of the reticulated conductor 821Ab of the sixteenth configuration example, in the lead-out conductor portion 165Ab of the conductor layer A of the twenty-first configuration example illustrated in A in FIG. 82. The conductor period FYAb is equal to the sum of the conductor width WYAb in the Y direction and the gap width GYAb in the Y direction (the conductor period FYAb=the conductor width WYAb in the Y direction+the gap width GYAb in the Y direction).

A linear conductor 892Bb long in the X direction is periodically arranged in the Y direction with a conductor period FYBb instead of the reticulated conductor 822Bb of the sixteenth configuration example, in the lead-out conductor portion 165Bb of the conductor layer B of the twenty-first configuration example illustrated in B in FIG. 82. The conductor period FYBb is equal to the sum of the conductor width WYBb in the Y direction and the gap width GYBb in the Y direction (the conductor period FYBb=the conductor width WYBb in the Y direction+the gap width GYBb in the Y direction).

As illustrated in C in FIG. 82, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-first configuration example.

Twenty-Second Configuration Example

Figure 83:
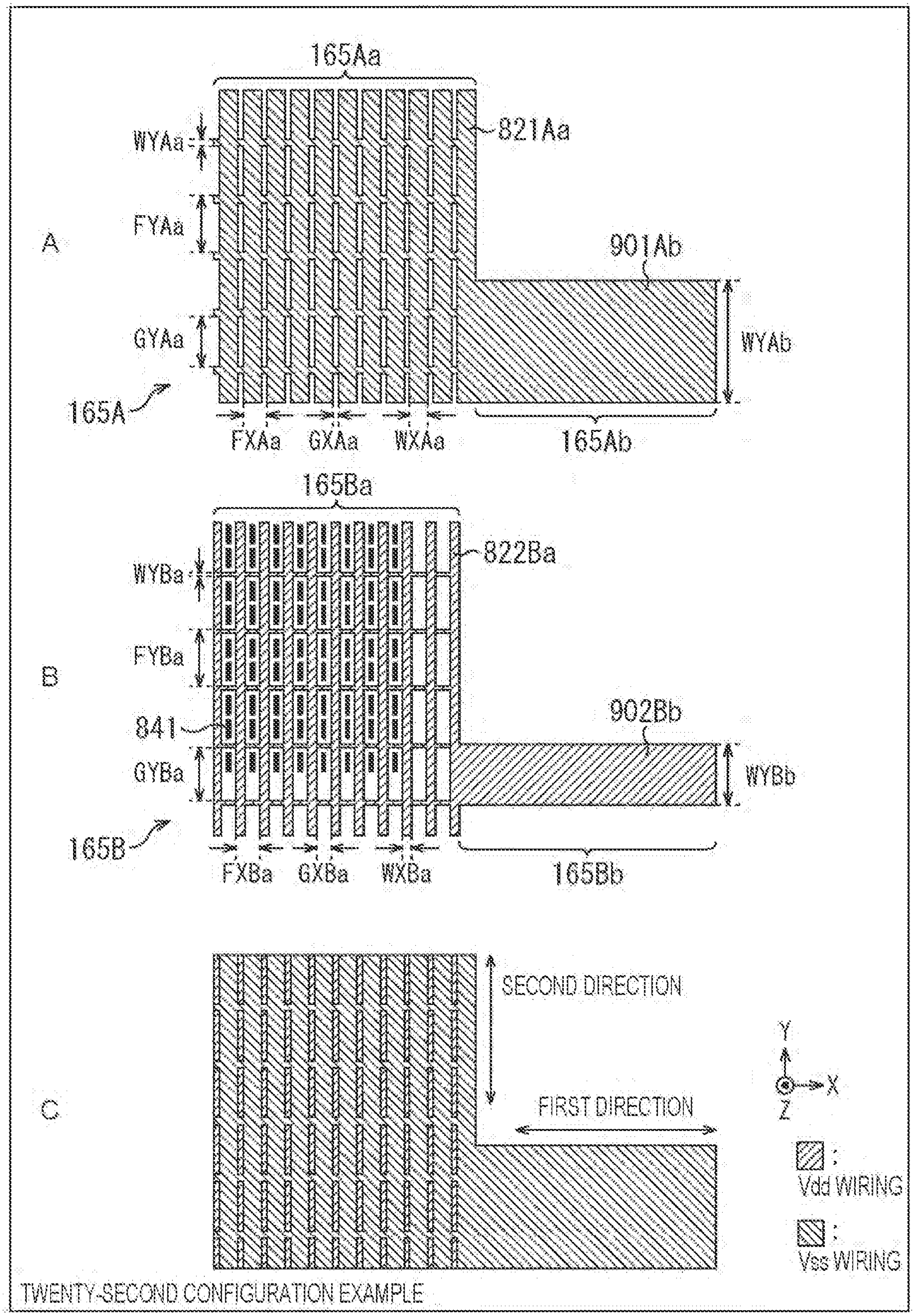
FIG. 83 is diagrams illustrating a twenty-second configuration example of the conductor layers A and B.

FIG. 83 illustrates a twenty-second configuration example of the conductor layers A and B. Note that A in FIG. 83 illustrates the conductor layer A, and B in FIG. 83 illustrates the conductor layer B. C in FIG. 83 illustrates a state of the conductor layers A and B respectively illustrated in A and B in FIG. 83, which are viewed from the conductor layer A side. In the coordinate system in FIG. 83, the horizontal direction is the X axis, the vertical direction is the Y axis, and the direction perpendicular to the XY plane is the Z axis.

The twenty-second configuration example illustrated in FIG. 83 has a configuration in which the conductor layer of the lead-out conductor portion 165*b* of the sixteenth configuration example illustrated in FIG. 72 is changed. Note that, in FIG. 83, a portion corresponding to FIG. 72 is given the same reference numeral and description thereof is omitted as appropriate.

A planar conductor 901Ab is arranged instead of the reticulated conductor 821Ab of the sixteenth configuration example, in the lead-out conductor portion 165Ab of the conductor layer A of the twenty-second configuration example illustrated in A in FIG. 83. The planar conductor 901Ab has the conductor width WYAb in the Y direction.

A planar conductor 902Bb is arranged instead of the reticulated conductor 822Bb of the sixteenth configuration example, in the lead-out conductor portion 165Bb of the conductor layer B of the twenty-second configuration example illustrated in B in FIG. 83. The planar conductor 902Bb has the conductor width WYBb in the Y direction.

As illustrated in C in FIG. 83, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-second configuration example.

Figure 84:
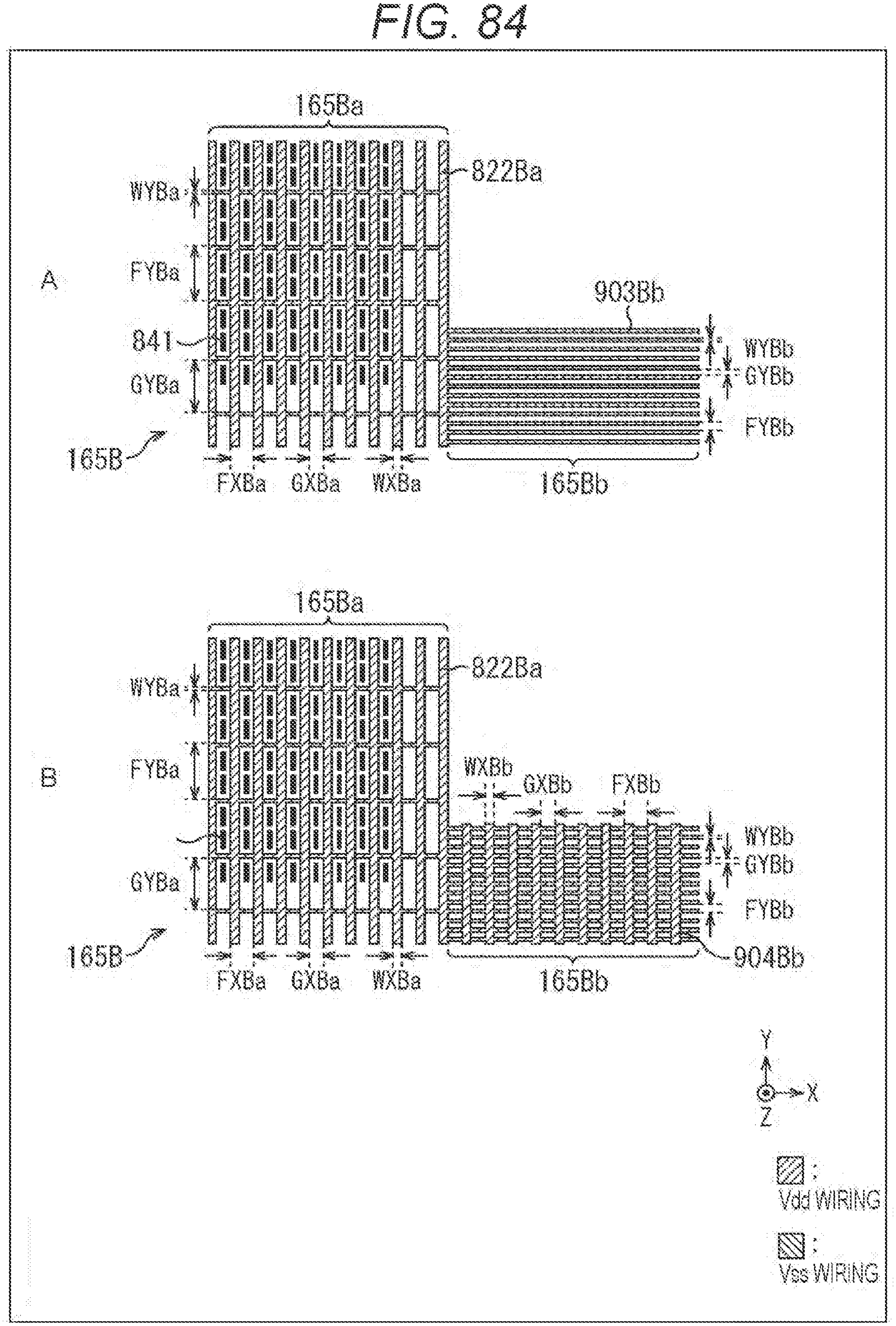
FIG. 84 is diagrams illustrating another configuration example of the conductor layer B in the twenty-second configuration example.

Note that, in the twenty-second configuration example, the conductor layer B in A or B in FIG. 84 may be adopted instead of the conductor layer B illustrated in B in FIG. 83.

The conductor layers B illustrated in A and B in FIG. 84 differ only in the lead-out conductor portion 165*b* from the conductor layer B illustrated in B in FIG. 83.

A linear conductor 903Bb long in the X direction is periodically arranged in the Y direction with the conductor period FYBb instead of the planar conductor 901Ab illustrated in B in FIG. 83, in the lead-out conductor portion 165Bb of the conductor layer B in A in FIG. 84. Note that the conductor period FYBb=a conductor width WYBb in the Y direction+a gap width GYBb in the Y direction.

A reticulated conductor 904Bb is provided instead of the planar conductor 901Ab illustrated in B in FIG. 83, in the lead-out conductor portion 165Bb of the conductor layer B in B in FIG. 84. The reticulated conductor 904Bb has a conductor width WXBb and a gap width GXBb and is configured such that the same pattern is periodically arranged with a conductor period FXBb in the X direction, and has a conductor width WYBb and a gap width GYBb and is configured such that the same pattern is periodically arranged with a conductor period FYBb in the Y direction. Therefore, the reticulated conductor 904Bb has a shape including a repeating pattern in which a predetermined basic pattern is repeatedly arranged with a conductor period in at least one of the X direction or the Y direction.

A plan view in a state where the conductor layer B in A or B in FIG. 84 is stacked with the conductor layer A illustrated in A in FIG. 83 is similar to C in FIG. 83.

Twenty-Third Configuration Example

Figure 85:
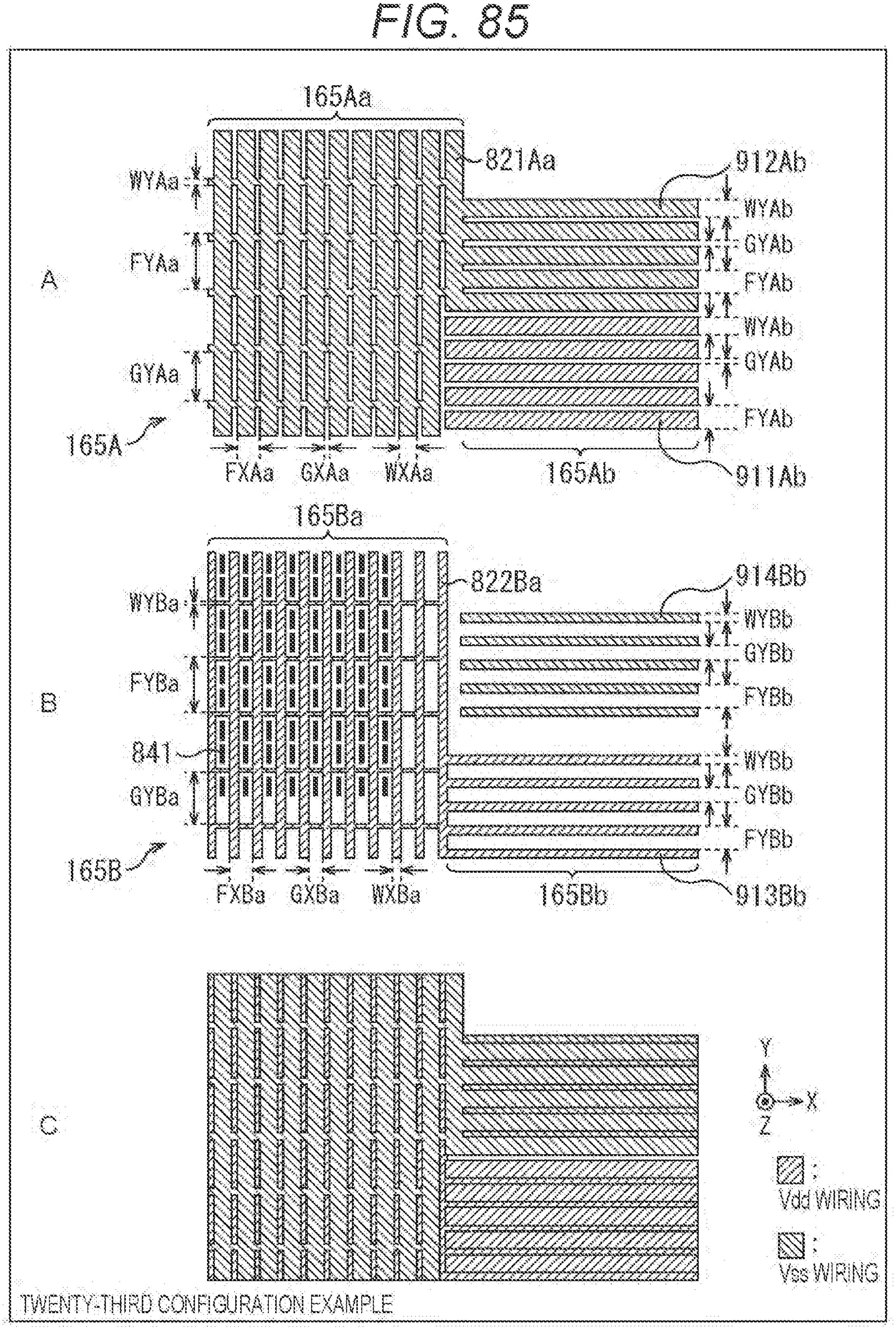
FIG. 85 is diagrams illustrating a twenty-third configuration example of the conductor layers A and B.

FIG. 85 illustrates a twenty-third configuration example of the conductor layers A and B. Note that A in FIG. 85 illustrates the conductor layer A, and B in FIG. 85 illustrates the conductor layer B. C in FIG. 85 illustrates a state of the conductor layers A and B respectively illustrated in A and B in FIG. 85, which are viewed from the conductor layer A side. In the coordinate system in FIG. 85, the horizontal direction is the X axis, the vertical direction is the Y axis, and the direction perpendicular to the XY plane is the Z axis.

The twenty-third configuration example illustrated in FIG. 85 has a configuration in which the conductor layer of the lead-out conductor portion 165*b* of the sixteenth configuration example illustrated in FIG. 72 is changed. Note that, in FIG. 85, a portion corresponding to FIG. 72 is given the same reference numeral and description thereof is omitted as appropriate.

A linear conductor 911Ab long in the X direction is periodically arranged in the Y direction with the conductor period FYAb and a linear conductor 912Ab long in the X direction is periodically arranged in the Y direction with the conductor period FYAb, instead of the reticulated conductor 821Ab of the sixteenth configuration example, in the lead-out conductor portion 165Ab of the conductor layer A of the twenty-third configuration example illustrated in A in FIG. 85. The linear conductor 911Ab is, for example, wiring (Vdd wiring) connected to the positive power supply. The linear conductor 912Ab is, for example, wiring (Vss wiring) connected to the GND or the negative power supply. The conductor period FYAb is equal to the sum of the conductor width WYAb in the Y direction and the gap width GYAb in the Y direction (the conductor period FYAb=the conductor width WYAb+the gap width GYAb).

A linear conductor 913Bb long in the X direction is periodically arranged in the Y direction with the conductor period FYBb and a linear conductor 914Bb long in the X direction is periodically arranged in the Y direction with the conductor period FYBb, instead of the reticulated conductor 822Bb of the sixteenth configuration example, in the lead-out conductor portion 165Bb of the conductor layer B of the twenty-third configuration example illustrated in B in FIG. 85. The linear conductor 913Bb is, for example, wiring (Vdd wiring) connected to the positive power supply. The linear conductor 914Bb is, for example, wiring (Vss wiring) connected to the GND or the negative power supply. The conductor period FYBb is equal to the sum of the conductor width WYBb in the Y direction and the gap width GYBb in the Y direction (the conductor period FYBb=the conductor width WYBb+the gap width GYBb).

The linear conductor 912Ab of the lead-out conductor portion 165Ab of the conductor layer A is electrically connected to the reticulated conductor 821Aa of the main conductor portion 165Aa, and is electrically connected to the linear conductor 914Bb of the lead-out conductor portion 165Bb of the conductor layer B via the conductor via (VIA) extending in the Z direction, for example.

The linear conductor 913Bb of the lead-out conductor portion 165Bb of the conductor layer B is electrically connected to the reticulated conductor 822Ba of the main conductor portion 165Ba, and is electrically connected to the linear conductor 911Ab of the lead-out conductor portion 165Ab of the conductor layer A via the conductor via (VIA) extending in the Z direction, for example.

As illustrated in C in FIG. 85, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-first configuration example.

In the above-described fourteenth to twenty-second configuration examples, the Vdd wiring and the Vss wiring having different polarities are arranged to overlap on the same plane region in the lead-out conductor portion 165*b*. However, as in the twenty-third configuration example in FIG. 85, the Vdd wiring and the Vss wiring having different polarities may be shifted and arranged on different plane regions, and the GND, the negative power supply, and the positive power supply may be transmitted using both the conductor layer A and the conductor layer B.

Note that the linear conductor 911Ab of the lead-out conductor portion 165Ab of the conductor layer A may be used as dummy wiring without being electrically connected to the linear conductor 913Bb of the lead-out conductor portion 165Bb of the conductor layer B. The linear conductor 914Bb of the lead-out conductor portion 165Bb of the conductor layer B may be used as dummy wiring without being electrically connected to the linear conductor 912Ab of the lead-out conductor portion 165Ab of the conductor layer A.

Note that FIG. 85 illustrates an example in which a group of linear conductors 911Ab and a group of linear conductors 912Ab are adjacently arranged. However, the configuration is not limited to the example. For example, a plurality of groups of linear conductors 911Ab and a plurality of groups of linear conductors 912Ab may be provided, and a group of linear conductors 911Ab and a group of linear conductors 912Ab may be alternately arranged.

Furthermore, FIG. 85 illustrates an example in which the linear conductor 911Ab including a plurality of linear conductors and the linear conductor 912Ab including a plurality of linear conductors are adjacently arranged. However, the configuration is not limited to the example. For example, one linear conductor 911Ab and one linear conductor 912Ab may be alternately arranged.

Furthermore, FIG. 85 illustrates an example in which a group of linear conductors 913Bb and a group of linear conductors 914Bb are adjacently arranged. However, the configuration is not limited to the example. For example, a plurality of groups of linear conductors 913Bb and a plurality of groups of linear conductors 914Bb may be provided, and a group of linear conductors 913Bb and a group of linear conductors 914Bb may be alternately arranged.

Furthermore, FIG. 85 illustrates an example in which the linear conductor 913Bb including a plurality of linear conductors and the linear conductor 914Bb including a plurality of linear conductors are adjacently arranged. However, the configuration is not limited to the example. For example, one linear conductor 913Bb and one linear conductor 914Bb may be alternately arranged.

Twenty-Fourth Configuration Example

Figure 86:
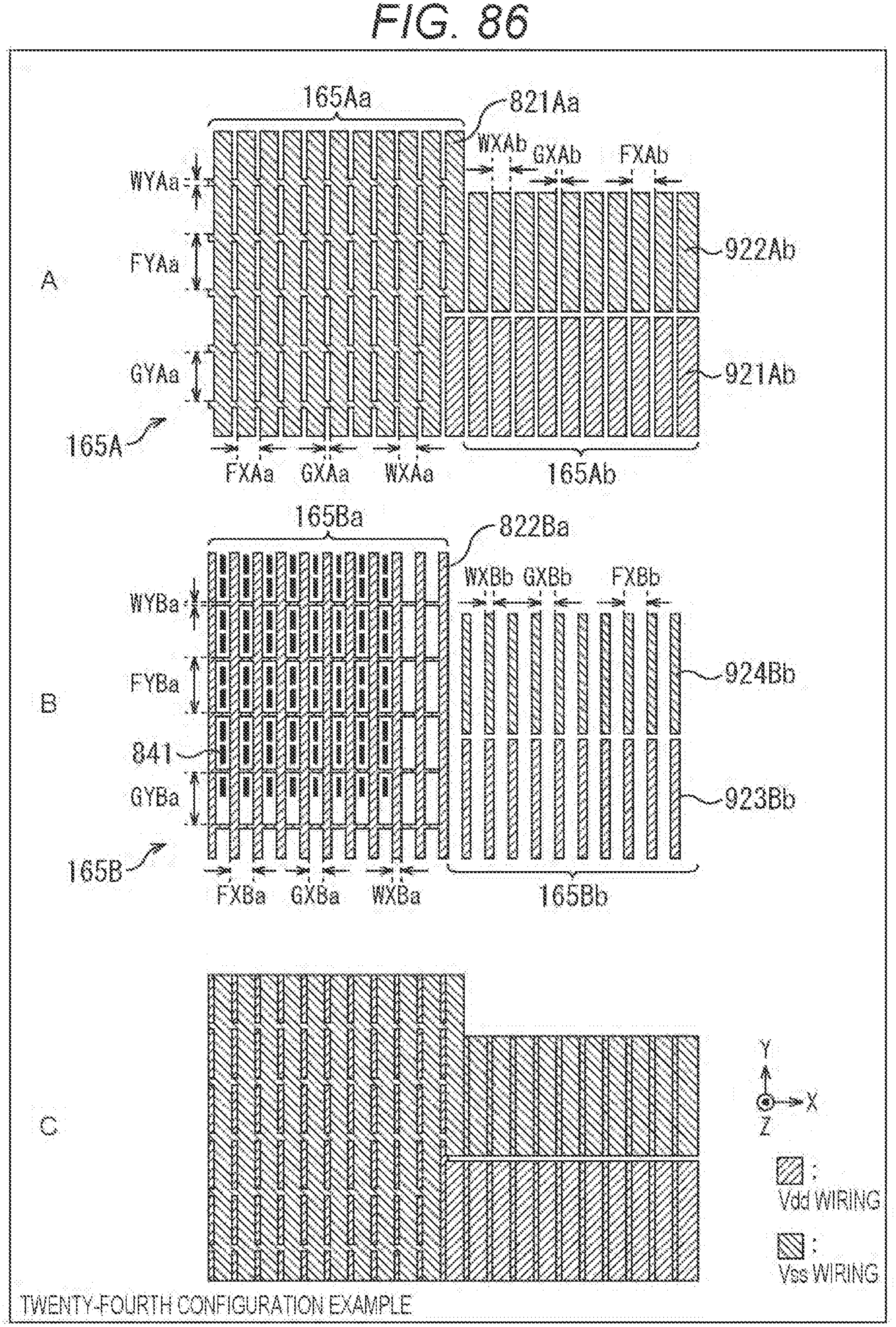
FIG. 86 is diagrams illustrating a twenty-fourth configuration example of the conductor layers A and B.

FIG. 86 illustrates a twenty-fourth configuration example of the conductor layers A and B. Note that A in FIG. 86 illustrates the conductor layer A, and B in FIG. 86 illustrates the conductor layer B. C in FIG. 86 illustrates a state of the conductor layers A and B respectively illustrated in A and B in FIG. 86, which are viewed from the conductor layer A side. In the coordinate system in FIG. 86, the horizontal direction is the X axis, the vertical direction is the Y axis, and the direction perpendicular to the XY plane is the Z axis.

The twenty-fourth configuration example illustrated in FIG. 86 has a configuration in which the conductor layer of the lead-out conductor portion 165*b* of the sixteenth configuration example illustrated in FIG. 72 is changed. Note that, in FIG. 86, a portion corresponding to FIG. 72 is given the same reference numeral and description thereof is omitted as appropriate.

A linear conductor 921Ab long in the Y direction is periodically arranged in the X direction with the conductor period FXAb and a linear conductor 922Ab long in the Y direction is periodically arranged in the X direction with the conductor period FXAb, instead of the reticulated conductor 821Ab of the sixteenth configuration example, in the lead-out conductor portion 165Ab of the conductor layer A of the twenty-fourth configuration example illustrated in A in FIG. 86. The linear conductor 921Ab is, for example, wiring (Vdd wiring) connected to the positive power supply. The linear conductor 922Ab is, for example, wiring (Vss wiring) connected to the GND or the negative power supply. The conductor period FXAb is equal to the sum of the conductor width WXAb in the X direction and the gap width GXAb in the X direction (the conductor period FXAb=the conductor width WXAb+the gap width GXAb).

A linear conductor 923Bb long in the Y direction is periodically arranged in the X direction with the conductor period FXBb and a linear conductor 924Bb long in the Y direction is periodically arranged in the X direction with the conductor period FXBb, instead of the reticulated conductor 822Bb of the sixteenth configuration example, in the lead-out conductor portion 165Bb of the conductor layer B of the twenty-fourth configuration example illustrated in B in FIG. 86. The linear conductor 923Bb is, for example, wiring (Vdd wiring) connected to the positive power supply. The linear conductor 924Bb is, for example, wiring (Vss wiring) connected to the GND or the negative power supply. The conductor period FXBb is equal to the sum of the conductor width WXBb in the X direction and the gap width GXBb in the X direction (the conductor period FXBb=the conductor width WXBb+the gap width GXBb).

The linear conductor 922Ab of the lead-out conductor portion 165Ab of the conductor layer A is electrically connected to the linear conductor 924Bb of the lead-out conductor portion 165Bb of the conductor layer B via, for example, the conductor via (VIA) extending in the Z direction, and is electrically connected to the reticulated conductor 821Aa of the main conductor portion 165Aa via the linear conductor 924Bb.

That is, for example, the GND or the negative power supply is alternately transmitted in the linear conductor 922Ab of the conductor layer A and in the linear conductor 924Bb of the conductor layer B in the lead-out conductor portion 165*b*, and reaches the reticulated conductor 821Aa of the main conductor portion 165Aa.

The linear conductor 923Bb of the lead-out conductor portion 165Bb of the conductor layer B is electrically connected to the linear conductor 921Ab of the lead-out conductor portion 165Ab of the conductor layer A via, for example, the conductor via (VIA) extending in the Z direction, and is electrically connected to the reticulated conductor 822Ba of the main conductor portion 165Ba via the linear conductor 921Ab.

That is, for example, the positive power supply is alternately transmitted in the linear conductor 921Ab of the conductor layer A and in the linear conductor 923Bb of the conductor layer B in the lead-out conductor portion 165*b* and reaches the reticulated conductor 822Ba of the main conductor portion 165Ba.

As illustrated in C in FIG. 86, in the state where the conductor layer A and the conductor layer B are stacked, the active element group 167 is covered with at least one of the conductor layer A or the conductor layer B. Therefore, the hot carrier light emission from the active element group 167 can be shielded even in the twenty-first configuration example.

In the above-described fourteenth to twenty-second configuration examples, the Vdd wiring and the Vss wiring having different polarities are arranged to overlap on the same plane region in the lead-out conductor portion 165*b*. However, as in the twenty-fourth configuration example in FIG. 86, the Vdd wiring and the Vss wiring having different polarities may be shifted and arranged on different plane regions, and the GND, the negative power supply, and the positive power supply may be transmitted using both the conductor layer A and the conductor layer B.

As described above, the conductor layer of the lead-out conductor portion 165*b* is not limited to the reticulated conductor, and may be configured by a planar conductor or a linear conductor, as in the twenty-first to twenty-fourth configuration examples illustrated in FIGS. 82 to 86. Furthermore, not only one layer of the conductor layer A or B but also two layers of the conductor layers A and B may be used.

With such a configuration, any of effects of satisfying the wiring layout restrictions, further improving the degree of freedom in designing the wiring layout, further improving the inductive noise, further improving the voltage drop, or the like can be exhibited.

Twenty-Fifth Configuration Example

Figure 87:
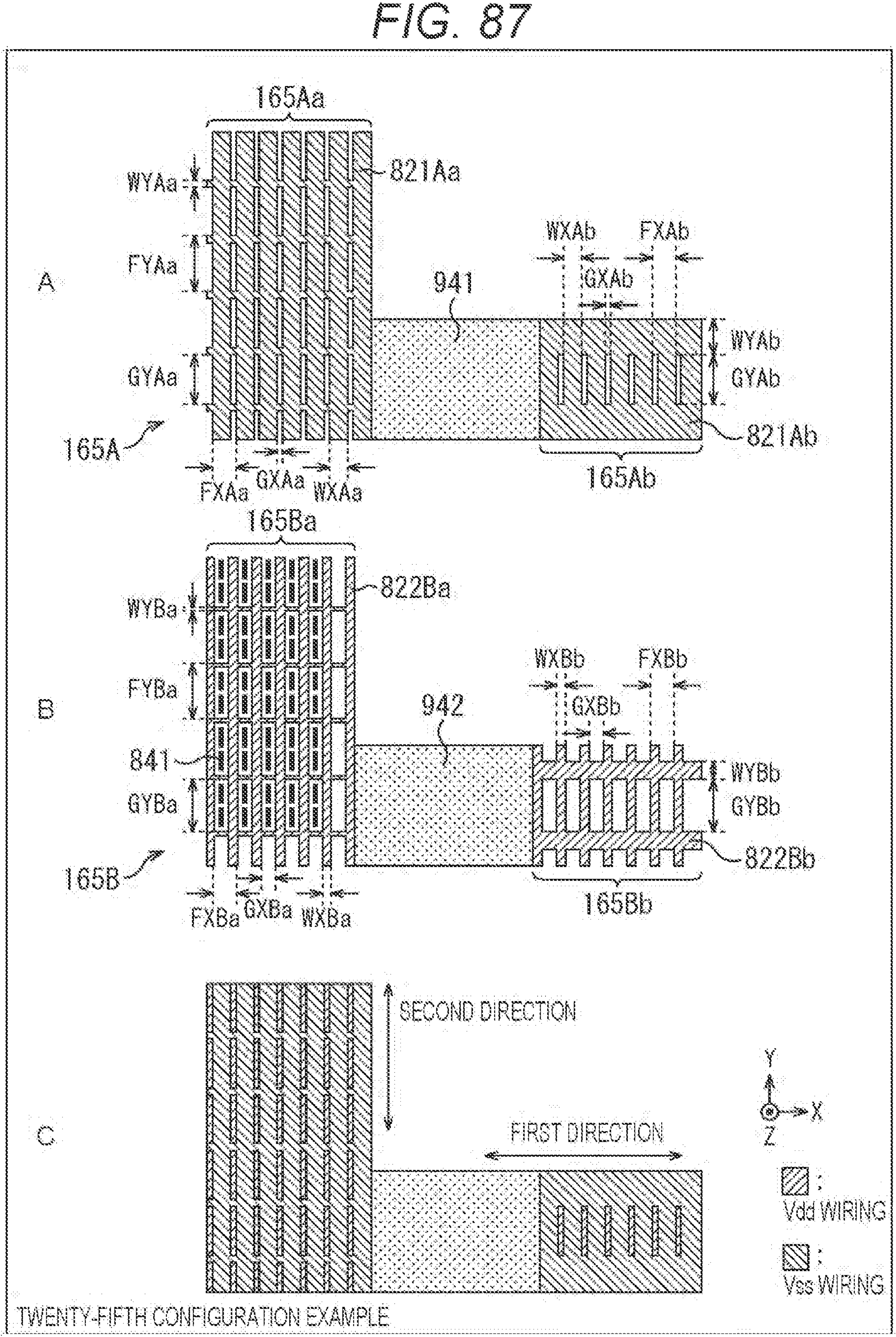
FIG. 87 is diagrams illustrating a twenty-fifth configuration example of the conductor layers A and B.

FIG. 87 illustrates a twenty-fifth configuration example of the conductor layers A and B. Note that A in FIG. 87 illustrates the conductor layer A, and B in FIG. 87 illustrates the conductor layer B. C in FIG. 87 illustrates a state of the conductor layers A and B respectively illustrated in A and B in FIG. 87, which are viewed from the conductor layer A side. In the coordinate system in FIG. 87, the horizontal direction is the X axis, the vertical direction is the Y axis, and the direction perpendicular to the XY plane is the Z axis.

The twenty-fifth configuration example illustrated in FIG. 87 has a configuration in which a part is added to the sixteenth configuration example illustrated in FIG. 72. Note that, in FIG. 86, a portion corresponding to FIG. 72 is given the same reference numeral and description thereof is omitted as appropriate.

In the conductor layer A of the twenty-fifth configuration example illustrated in A in FIG. 87, a conductor 941 having a shape that optionally contains a repeating pattern different from the reticulated conductor 821Aa and the reticulated conductor 821Ab is added between the reticulated conductor 821Aa of the main conductor portion 165Aa and the reticulated conductor 821Ab of the lead-out conductor portion 165Ab in the sixteenth configuration example illustrated in FIG. 72. Note that the conductor 941 desirably has a shape including the repeating pattern in order to efficiently design the wiring layout, but may have a shape not including the repeating pattern. Since the pattern of the conductor 941 can take any shape, the conductor 941 in A in FIG. 87 is represented by a planar shape without any particular specification. The conductor 941 is electrically connected to both the reticulated conductor 821Aa and the reticulated conductor 821Ab. In other words, the reticulated conductor 821Aa of the main conductor portion 165Aa and the reticulated conductor 821Ab of the lead-out conductor portion 165Ab are electrically connected via the conductor 941.

In the conductor layer B of the twenty-fifth configuration example illustrated in B in FIG. 87, a conductor 942 having a shape that optionally contains a repeating pattern different from the reticulated conductor 822Ba and the reticulated conductor 822Bb is added between the reticulated conductor 822Ba of the main conductor portion 165Ba and the reticulated conductor 822Bb of the lead-out conductor portion 165Bb in the sixteenth configuration example illustrated in FIG. 72. Note that the conductor 942 desirably has a shape including the repeating pattern in order to efficiently design the wiring layout, but may have a shape not including the repeating pattern. Since the pattern of the conductor 942 can take any shape, the conductor 942 in B in FIG. 87 is represented by a planar shape without any particular specification. The conductor 942 is electrically connected to both the reticulated conductor 822Ba and the reticulated conductor 822Bb. In other words, the reticulated conductor 822Ba of the main conductor portion 165Ba and the reticulated conductor 822Bb of the lead-out conductor portion 165Bb are electrically connected via the conductor 942.

According to the twenty-fifth configuration example, the reticulated conductor 821Aa of the main conductor portion 165Aa and the reticulated conductor 821Ab of the lead-out conductor portion 165Ab are connected via the predetermined conductor 941 in the conductor layer A, whereby the degree of freedom in designing the wiring layout can be further improved and the degree of freedom in the vicinity of pads can be particularly improved.

The reticulated conductor 822Ba of the main conductor portion 165Ba and the reticulated conductor 822Bb of the lead-out conductor portion 165Bb are connected via the predetermined conductor 942 in the conductor layer B, whereby the degree of freedom in designing the wiring layout can be further improved and the degree of freedom in the vicinity of pads can be particularly improved.

Twenty-Sixth Configuration Example

Figure 88:
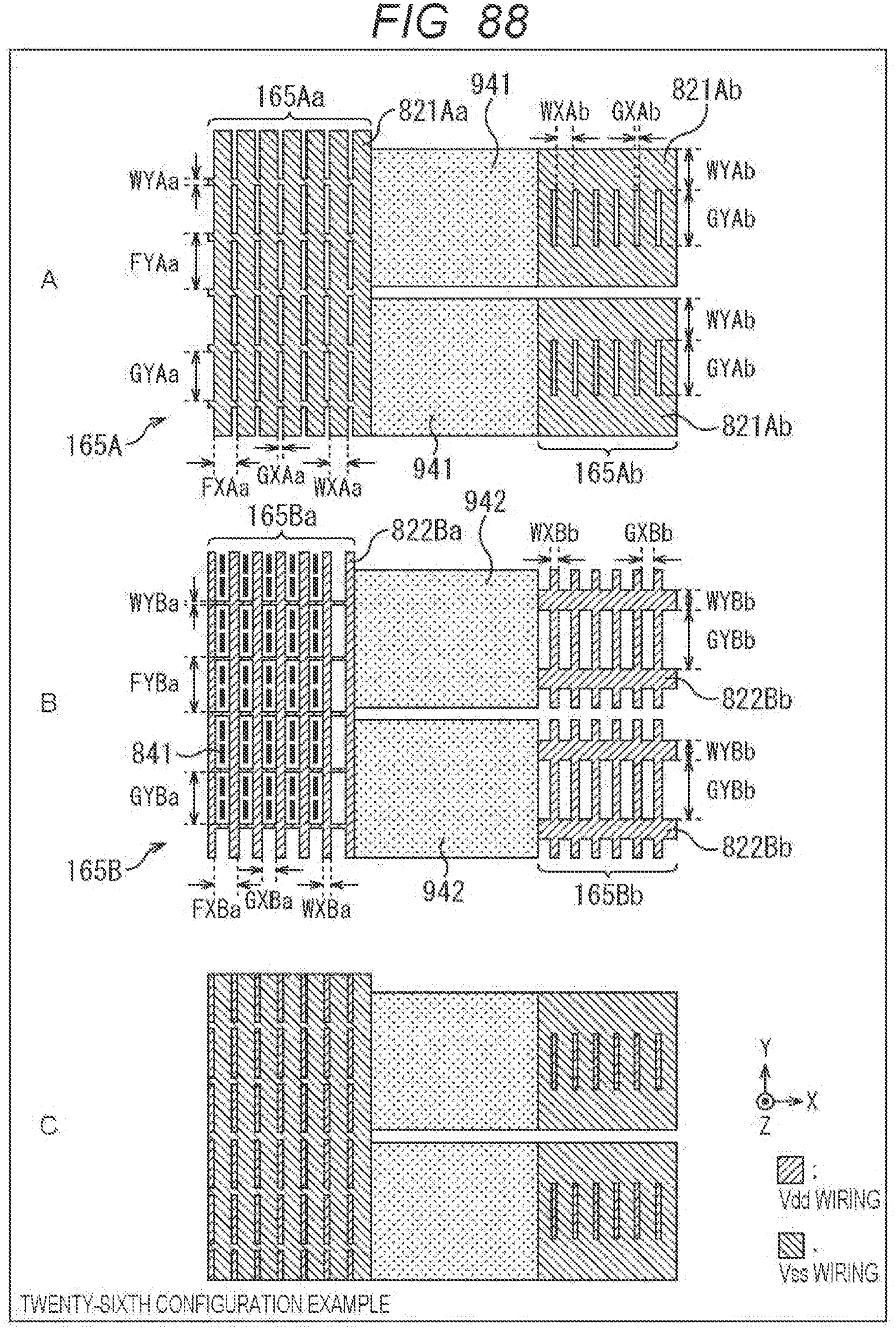
FIG. 88 is diagrams illustrating a twenty-sixth configuration example of the conductor layers A and B.

FIG. 88 illustrates a twenty-sixth configuration example of the conductor layers A and B. Note that A in FIG. 88 illustrates the conductor layer A, and B in FIG. 88 illustrates the conductor layer B. C in FIG. 88 illustrates a state of the conductor layers A and B respectively illustrated in A and B in FIG. 88, which are viewed from the conductor layer A side. In the coordinate system in FIG. 88, the horizontal direction is the X axis, the vertical direction is the Y axis, and the direction perpendicular to the XY plane is the Z axis.

The twenty-sixth configuration example illustrated in FIG. 88 has a configuration in which a part of the twenty-fifth configuration example illustrated in FIG. 87 is changed. Note that, in FIG. 86, a portion corresponding to FIG. 87 is given the same reference numeral and description thereof is omitted as appropriate.

The conductor layer A of the twenty-sixth configuration example illustrated in A in FIG. 88 includes the reticulated conductor 821Aa similar to the twenty-fifth configuration example illustrated in FIG. 87, in the main conductor portion 165Aa. Furthermore, the conductor layer A of the twenty-sixth configuration example includes a plurality of the reticulated conductors 821Ab and the conductors 941 similar to the twenty-fifth configuration example in the Y direction at predetermined intervals in the lead-out conductor portion 165Ab. In other words, the conductor layer A of the twenty-sixth configuration example in A in FIG. 88 has a configuration in which a plurality of the reticulated conductors 821Ab and the conductors 941 of the lead-out conductor portion 165Ab of the twenty-fifth configuration example illustrated in FIG. 87 is provided in the Y direction at predetermined intervals. Note that all of the plurality of conductors 941 may be the same or may not be the same.

The conductor layer B of the twenty-sixth configuration example illustrated in B in FIG. 88 includes the reticulated conductor 822Ba similar to the twenty-fifth configuration example illustrated in FIG. 87, in the main conductor portion 165Ba. Furthermore, the conductor layer B of the twenty-sixth configuration example includes a plurality of the reticulated conductors 822Bb and the conductors 942 similar to the twenty-fifth configuration example in the Y direction at predetermined intervals in the lead-out conductor portion 165Bb. In other words, the conductor layer B of the twenty-sixth configuration example in B in FIG. 88 has a configuration in which a plurality of the reticulated conductors 822Bb and the conductors 942 of the lead-out conductor portion 165Bb of the twenty-fifth configuration example illustrated in FIG. 87 is provided in the Y direction at predetermined intervals. Note that all of the plurality of conductors 942 may be the same or may not be the same.

With such a configuration, any of effects of satisfying the wiring layout restrictions, further improving the degree of freedom in designing the wiring layout, further improving the inductive noise, further improving the voltage drop, or the like can be exhibited.

Twenty-Seventh Configuration Example

Figure 89:
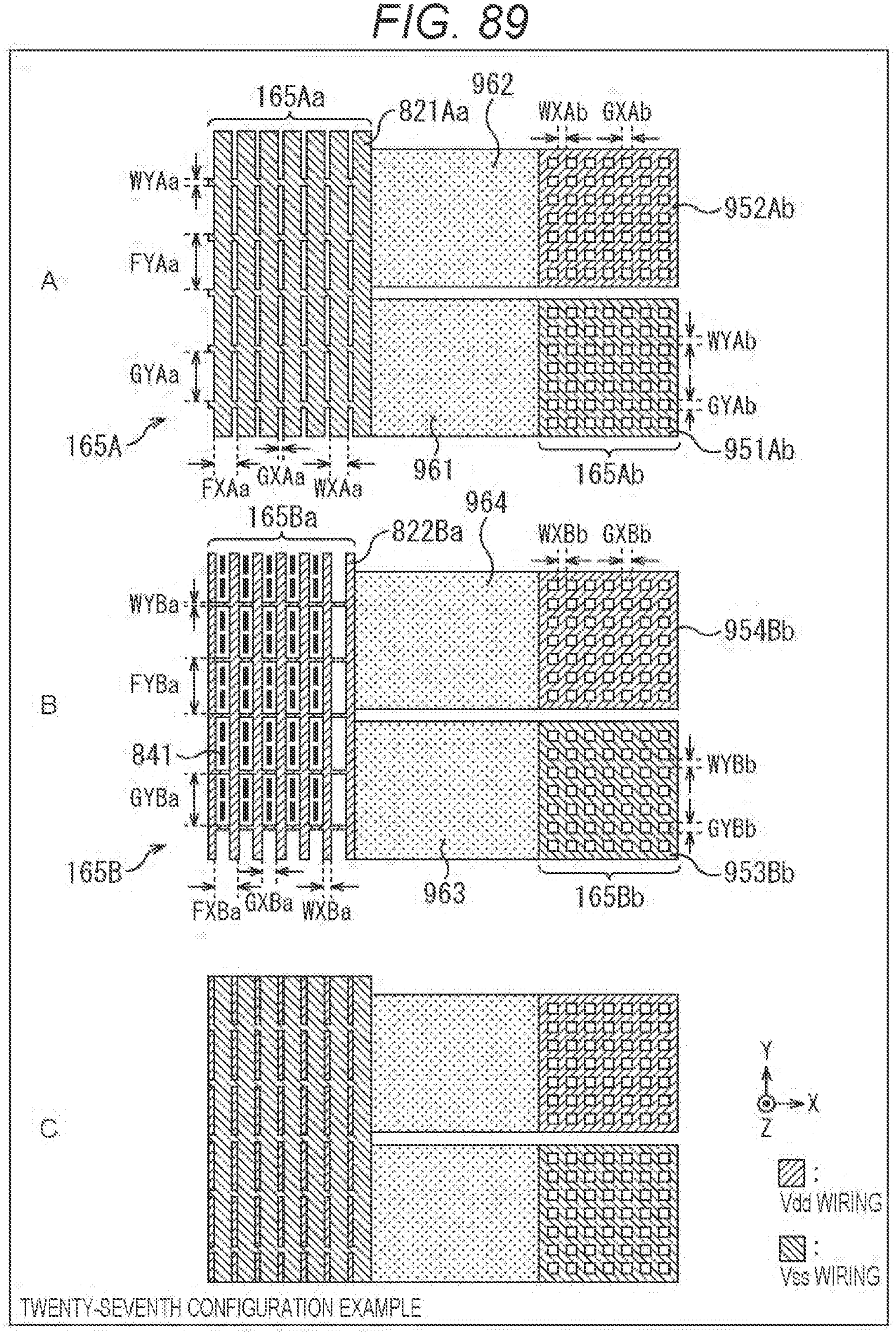
FIG. 89 is diagrams illustrating a twenty-seventh configuration example of the conductor layers A and B.

FIG. 89 illustrates a twenty-seventh configuration example of the conductor layers A and B. Note that A in FIG. 89 illustrates the conductor layer A, and B in FIG. 89 illustrates the conductor layer B. C in FIG. 89 illustrates a state of the conductor layers A and B respectively illustrated in A and B in FIG. 89, which are viewed from the conductor layer A side. In the coordinate system in FIG. 89, the horizontal direction is the X axis, the vertical direction is the Y axis, and the direction perpendicular to the XY plane is the Z axis.

The twenty-seventh configuration example illustrated in FIG. 89 has a configuration in which a part of the twenty-sixth configuration example illustrated in FIG. 88 is changed. Note that, in FIG. 89, a portion corresponding to FIG. 88 is given the same reference numeral and description thereof is omitted as appropriate.

The main conductor portion 165Aa of the conductor layer A of the twenty-seventh configuration example illustrated in A in FIG. 89 includes the reticulated conductor 821Aa similar to the twenty-sixth configuration example illustrated in FIG. 88. The lead-out conductor portion 165Ab of the conductor layer A of the twenty-seventh configuration example includes a reticulated conductor 951Ab and a reticulated conductor 952Ab. The shapes of the reticulated conductor 951Ab and the reticulated conductor 952Ab are each having the conductor width WXAb and the gap width GXAb in the X direction and the conductor width WYAb and the gap width GYAb in the Y direction. Note that the reticulated conductor 952Ab is, for example, wiring (Vdd wiring) connected to the positive power supply and the reticulated conductor 951Ab is, for example, wiring (Vss wiring) connected to the GND or the negative power supply.

A conductor 961 having a shape that optionally contains a repeating pattern different from the reticulated conductor 821Aa of the main conductor portion 165Aa and the reticulated conductor 951Ab of the lead-out conductor portion 165Ab is arranged between the reticulated conductor 821Aa and the reticulated conductor 951Ab. A conductor 962 having a shape that optionally contains a repeating pattern different from the reticulated conductor 821Aa of the main conductor portion 165Aa and the reticulated conductor 952Ab of the lead-out conductor portion 165Ab is arranged between the reticulated conductor 821Aa and the reticulated conductor 952Ab. Note that the conductor 961 or 962 desirably has a shape including a repeating pattern in order to efficiently design the wiring layout, but may have a shape not including the repeating pattern. Since the pattern of the conductors 961 and 962 can take any shape, the conductors 961 and 962 in A in FIG. 89 are represented by a planar shape without any particular specification.

The main conductor portion 165Ba of the conductor layer B of the twenty-seventh configuration example illustrated in B in FIG. 89 includes the reticulated conductor 822Ba similar to the twenty-sixth configuration example illustrated in FIG. 88. The lead-out conductor portion 165Bb of the conductor layer B of the twenty-seventh configuration example includes a reticulated conductor 953Bb and a reticulated conductor 954Bb. The shapes of the reticulated conductor 953Bb and the reticulated conductor 954Bb are each including the conductor width WXBb and the gap width GXBb in the X direction and the conductor width WYBb and the gap width GYBb in the Y direction. Note that the reticulated conductor 954Bb is, for example, wiring (Vdd wiring) connected to the positive power supply and the reticulated conductor 953Bb is, for example, wiring (Vss wiring) connected to the GND or the negative power supply.

A conductor 963 having a shape that optionally contains a repeating pattern different from the reticulated conductor 822Ba of the main conductor portion 165Ba and the reticulated conductor 953Bb of the lead-out conductor portion 165Bb is arranged between the reticulated conductor 822Ba and the reticulated conductor 953Bb. A conductor 964 having a shape that optionally contains a repeating pattern different from the reticulated conductor 822Ba of the main conductor portion 165Ba and the reticulated conductor 954Bb of the lead-out conductor portion 165Bb is arranged between the reticulated conductor 822Ba and the reticulated conductor 954Bb. Note that the conductor 963 or 964 desirably has a shape including a repeating pattern in order to efficiently design the wiring layout, but may have a shape not including the repeating pattern. Since the pattern of the conductors 963 and 964 can take any shape, the conductors 963 and 964 in B in FIG. 89 are represented by a planar shape without any particular specification.

The conductor 961 of the conductor layer A is electrically connected to the reticulated conductor 821Aa of the main conductor portion 165Aa and at least one of the reticulated conductor 951Ab or 953Bb of the lead-out conductor portion 165*b* directly or indirectly via, for example, a conductor that is at least a part of the conductor 963. In other words, the reticulated conductor 821Aa of the main conductor portion 165Aa and at least one of the reticulated conductor 951Ab or 953Bb of the lead-out conductor portion 165*b* are electrically connected via the conductor 961. Furthermore, the reticulated conductor 951Ab of the lead-out conductor portion 165Ab is electrically connected to the reticulated conductor 953Bb of the lead-out conductor portion 165Bb of the conductor layer B via, for example, the conductor via (VIA) extending in the Z direction. The conductor 961 and the conductor 963 may also be electrically connected via, for example, a conductor via (VIA) extending in the Z direction.

The conductor 964 of the conductor layer B is electrically connected to the reticulated conductor 822Ba of the main conductor portion 165Ba and at least one of the reticulated conductor 952Ab or 954Bb of the lead-out conductor portion 165*b* directly or indirectly via, for example, a conductor that is at least a part of the conductor 962. In other words, the reticulated conductor 822Ba of the main conductor portion 165Ba and at least one of the reticulated conductor 952Ab or 954Bb of the lead-out conductor portion 165*b* are electrically connected via the conductor 964. Furthermore, the reticulated conductor 952Ab of the lead-out conductor portion 165Ab is electrically connected to the reticulated conductor 954Bb of the lead-out conductor portion 165Bb of the conductor layer B via, for example, the conductor via (VIA) extending in the Z direction. The conductor 962 and the conductor 964 may also be electrically connected via, for example, a conductor via (VIA) extending in the Z direction.

For example, in the twenty-sixth configuration example in FIG. 88, when looking at the polarities of the conductor layer A and the conductor layer B at the same plane position of the main conductor portion 165*a* and the lead-out conductor portion 165*b*, the main conductor portion 165Aa of the conductor layer A and the main conductor portion 165Ba of the conductor layer B have different polarities between the Vss wiring and the Vdd wiring, and the lead-out conductor portion 165Ab of the conductor layer A and the lead-out conductor portion 165Bb of the conductor layer B also have different polarities.

In contrast, in the twenty-seventh configuration example in FIG. 89, when looking at the polarities of the conductor layer A and the conductor layer B at the same plane position of the main conductor portion 165*a* and the lead-out conductor portion 165*b*, the main conductor portion 165Aa of the conductor layer A and the main conductor portion 165Ba of the conductor layer B have different polarities between the Vss wiring and the Vdd wiring, but the lead-out conductor portion 165Ab of the conductor layer A and the lead-out conductor portion 165Bb of the conductor layer B have the same polarity. With such a polarity arrangement, in the case where the upper and lower conductor layer A and conductor layer B are configured, the lead-out conductor portion 165*b* electrically connected with the upper and lower conductor layer A and conductor layer B can be used as a pad (electrode).

According to the twenty-seventh configuration example, any of effects of satisfying the wiring layout restrictions, further improving the degree of freedom in designing the wiring layout, further improving the inductive noise, further improving the voltage drop, and the like can be exhibited.

Twenty-Eighth Configuration Example

Figure 90:
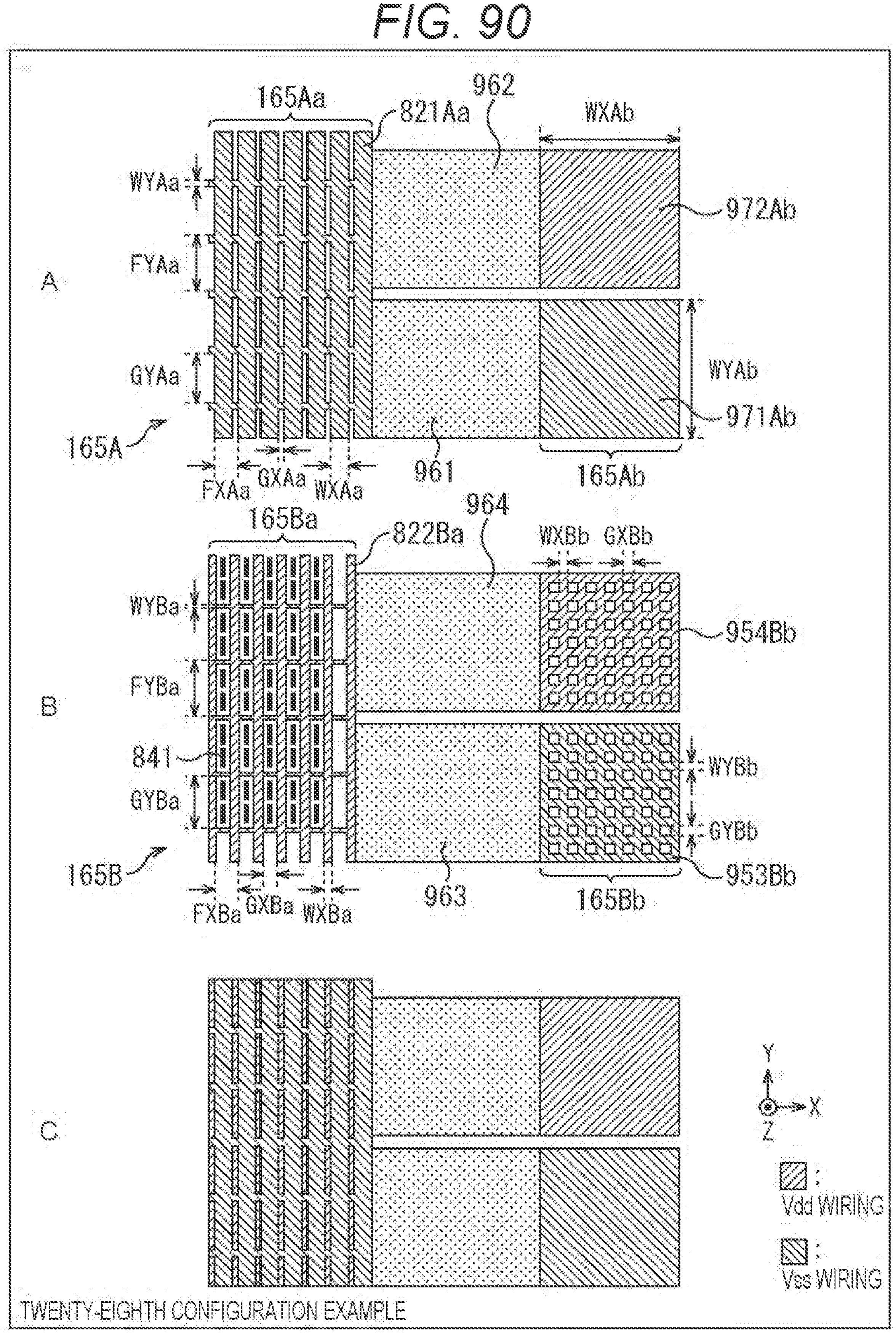
FIG. 90 is diagrams illustrating a twenty-eighth configuration example of the conductor layers A and B.

FIG. 90 illustrates a twenty-eighth configuration example of the conductor layers A and B. Note that A in FIG. 90 illustrates the conductor layer A, and B in FIG. 90 illustrates the conductor layer B. C in FIG. 90 illustrates a state of the conductor layers A and B respectively illustrated in A and B in FIG. 90, which are viewed from the conductor layer A side. In the coordinate system in FIG. 90, the horizontal direction is the X axis, the vertical direction is the Y axis, and the direction perpendicular to the XY plane is the Z axis.

The twenty-eighth configuration example illustrated in FIG. 90 has a configuration in which a part of the twenty-seventh configuration example illustrated in FIG. 89 is changed. Note that, in FIG. 90, a portion corresponding to FIG. 89 is given the same reference numeral and description thereof is omitted as appropriate.

The twenty-eighth configuration example illustrated in FIG. 90 is different only in the shape of the lead-out conductor portion 165Ab of the conductor layer A from the twenty-seventh configuration example in FIG. 89 and is common in the other points to the twenty-seventh configuration example in FIG. 89.

Specifically, in the lead-out conductor portion 165Ab of the conductor layer A in the twenty-seventh configuration example in FIG. 89, the reticulated conductor 951Ab and the reticulated conductor 952Ab having the shapes with the conductor width WXAb and the gap width GXAb in the X direction and the conductor width WYAb and the gap width GYAb in the Y direction are formed.

In contrast, in the lead-out conductor portion 165Ab of the conductor layer A in the twenty-eighth configuration example in FIG. 90, a planar conductor 971Ab and a planar conductor 972Ab having shapes with the conductor width WXAb in the X direction and the conductor width WYAb in the Y direction are formed.

In other words, in the twenty-eighth configuration example in FIG. 90, the lead-out conductor portion 165Ab of the conductor layer A includes the planar conductor 971Ab instead of the reticulated conductor 951Ab in the twenty-seventh configuration example in FIG. 89 and the planar conductor 972Ab instead of the reticulated conductor 952Ab in the twenty-seventh configuration example in FIG. 89.

The twenty-seventh configuration example in FIG. 89 is an example in which the shapes of the lead-out conductor portions 165*b* of the upper and lower conductor layer A and conductor layer B are the same shapes. However, different shapes may be adopted as in the twenty-eighth configuration example in FIG. 90.

Figure 91:
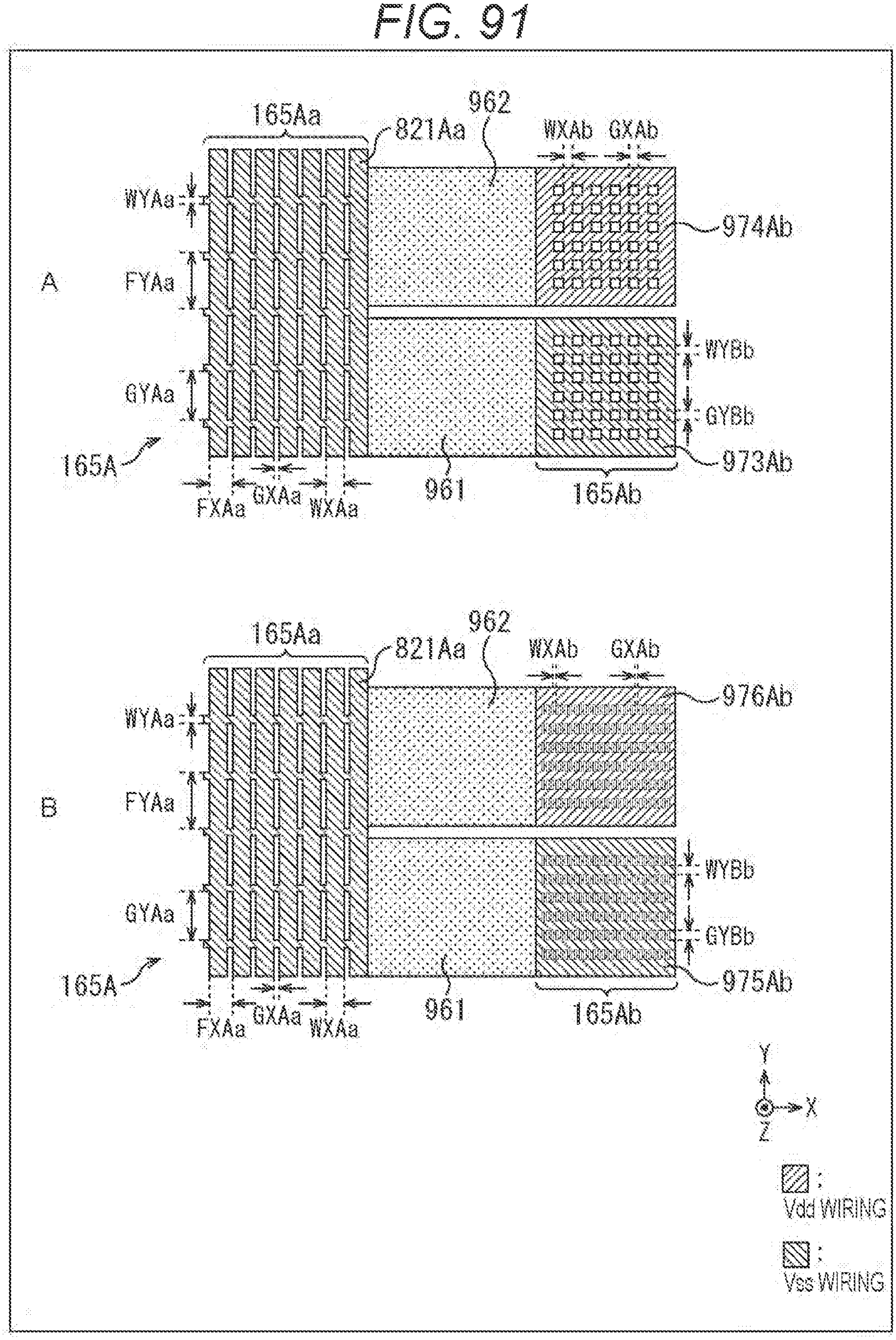
FIG. 91 is diagrams illustrating other configuration examples of the conductor layer A in the twenty-eighth configuration example.

Moreover, while the shape of the lead-out conductor portion 165Ab of the conductor layer A is planar in the twenty-eighth configuration example in FIG. 90, a light-shielding structure may be formed using a reticulated conductor 973Ab of the conductor layer A in A in FIG. 91 and the reticulated conductor 953Bb of the conductor layer B in B in FIG. 90, and a light-shielding structure may be formed using a reticulated conductor 974Ab of the conductor layer A in A in FIG. 91 and the reticulated conductor 954Bb of the conductor layer B in B in FIG. 90, even if the upper and lower layers have the same reticulated shape like the reticulated conductor 973Ab and the reticulated conductor 974Ab of the lead-out conductor portion 165Ab of the conductor layer A illustrated in A in FIG. 91. Moreover, the conductor width WXAb or the gap width GXAb in the X direction and the conductor width WYAb or the gap width GYAb in the Y direction may be substantially the same size as the reticulated conductor 953Bb or the reticulated conductor 954Bb of the lead-out conductor portion 165Bb of the conductor layer B.

Alternatively, as in a reticulated conductor 975Ab and a reticulated conductor 976Ab of the lead-out conductor portion 165Ab of the conductor layer A illustrated in B in FIG. 91, the conductor width WXAb or the gap width GXAb in the X direction may be made smaller than the reticulated conductor 953Bb or the reticulated conductor 954Bb of the lead-out conductor portion 165Bb of the conductor layer B in B in FIG. 90. Moreover, a light-shielding structure may be formed using the reticulated conductor 975Ab of the conductor layer A in B in FIG. 91 and the reticulated conductor 953Bb of the conductor layer B in B in FIG. 90, and a light-shielding structure may be formed using the reticulated conductor 976Ab of the conductor layer A in B in FIG. 91 and the reticulated conductor 954Bb of the conductor layer B in B in FIG. 90. In addition, although not illustrated, the conductor width WYAb or the gap width GYAb in the Y direction of the lead-out conductor portion 165Ab of the conductor layer A may be made smaller than the reticulated conductor 953Bb or the reticulated conductor 954Bb of the lead-out conductor portion 165Bb of the conductor layer B, and the conductor width WXAb or the gap width GXAb in the X direction, or the conductor width WYAb or the gap width GYAb in the Y direction, of the lead-out conductor portion 165Ab of the conductor layer A, may be made larger than the reticulated conductor 953Bb or the reticulated conductor 954Bb of the lead-out conductor portion 165Bb of the conductor layer B.

A and B in FIG. 91 illustrate other configuration examples of the conductor layer A in the twenty-eighth configuration example in FIG. 90.

Summary of Fourteenth to Twenty-Eighth Configuration Examples

In the fourteenth to twenty-eighth configuration examples illustrated in FIGS. 65 to 90, the repeating patterns of the main conductor portion 165*a* and the lead-out conductor portion 165*b* are different patterns (shapes) both in the conductor layer A and the conductor layer B.

The conductor layer A (first conductor layer) includes the main conductor portion 165Aa (first conductor portion) including a conductor having a shape in which a planar, linear, or reticulated repeating pattern (first basic pattern) is repeatedly arranged on the same plane in the X direction or the Y direction, and the lead-out conductor portion 165Ab (fourth conductor portion) including a conductor having a shape in which a planar, linear, or reticulated repeating pattern (fourth basic pattern) is repeatedly arranged on the same plane in the X direction or the Y direction. Here, the repeating pattern of the conductor of the main conductor portion 165Aa and the repeating pattern of the conductor of the lead-out conductor portion 165Ab have different shapes, and a conductor having a pattern different from the above repeating patterns may be present between the conductor of the main conductor portion 165Aa and the conductor of the lead-out conductor portion 165Ab.

The conductor layer B (second conductor layer) includes the main conductor portion 165Ba (second conductor portion) including a conductor having a shape in which a planar, linear, or reticulated repeating pattern (second basic pattern) is repeatedly arranged on the same plane in the X direction or the Y direction, and the lead-out conductor portion 165Bb (third conductor portion) including a conductor having a shape in which the planar, linear, or reticulated repeating pattern (third basic pattern) is repeatedly arranged on the same plane in the X direction or the Y direction. Here, the repeating pattern of the conductor of the main conductor portion 165Ba and the repeating pattern of the conductor of the lead-out conductor portion 165Bb have different shapes, and a conductor having a pattern different from the above repeating patterns may be present between the conductor of the main conductor portion 165Ba and the conductor of the lead-out conductor portion 165Bb.

In each of the above configuration examples, the conductor described as the wiring (Vss wiring) connected to the GND or the negative power supply, for example, may be the wiring (Vdd wiring) connected to the positive power supply, for example. The conductor described as the wiring (Vdd wiring) connected to the positive power supply, for example, may be the wiring (Vss wiring) connected to the GND or the negative power supply, for example.

In each of the above-described configuration examples, the total length LAa in the Y direction of the conductor of the main conductor portion 165Aa has been longer than the total length LAb in the Y direction of the conductor of the lead-out conductor portion 165Ab. However, the total length LAa and the total length LAb may be the same or substantially the same, or the total length LAa may be shorter than the total length LAb.

Similarly, the total length LBa in the Y direction of the main conductor portion 165Ba has been longer than the total length LBb in the Y direction of the lead-out conductor portion 165Bb. However, the total length LBa and the total length LBb may be the same or substantially the same, or the total length LBa may be shorter than the total length LBb.

In each of the above-described configuration examples, as an example of the repeating patterns of the main conductor portion 165Aa and the main conductor portion 165Ba, a repeating pattern example in which the current easily flows in the X direction may be adopted for the configuration example using the repeating pattern in which the current easily flows in the Y direction than in the X direction, and on the contrary, a repeating pattern example in which the current easily flows in the Y direction may be adopted for the configuration example using the repeating pattern in which the current easily flows in the X direction than in the Y direction. Furthermore, a repeating pattern example in which the current easily flows in the X direction and Y direction to the same extent.

In each of the above-described configuration examples, the conductor patterns of the main conductor portion 165Aa of the conductor layer A (wiring layer 165A) and the main conductor portion 165Ba of the conductor layer B (wiring layer 165B) may be any of the patterns described in the first to thirteenth configuration examples. Note that some of the above-described configuration examples have been described using the example in which all the conductor periods, conductor widths, and gap widths are uniform. However, this is not the case. For example, the conductor period, the conductor width, and the gap width may be non-uniform, or the conductor period, the conductor width, and the gap width may be modulated depending on a position. Furthermore, some of the above-described configuration examples have been described using the example in which the conductor periods, conductor widths, gap widths, wiring shapes, wiring positions, the numbers of wirings, and the like are substantially the same in the Vdd wiring and the Vss wiring. However, this is not the case. For example, the Vdd wiring and the Vss wiring may have different conductor periods, different conductor widths, different gap widths, different wiring shapes, or different wiring positions. The wiring position may be shifted or misaligned, and the number of wirings may be different.

10. Connection Configuration Example with Pads

Next, the relationship between the conductor layers A and B and the pads will be described with reference to FIGS. 92 to 108.

Figure 92:
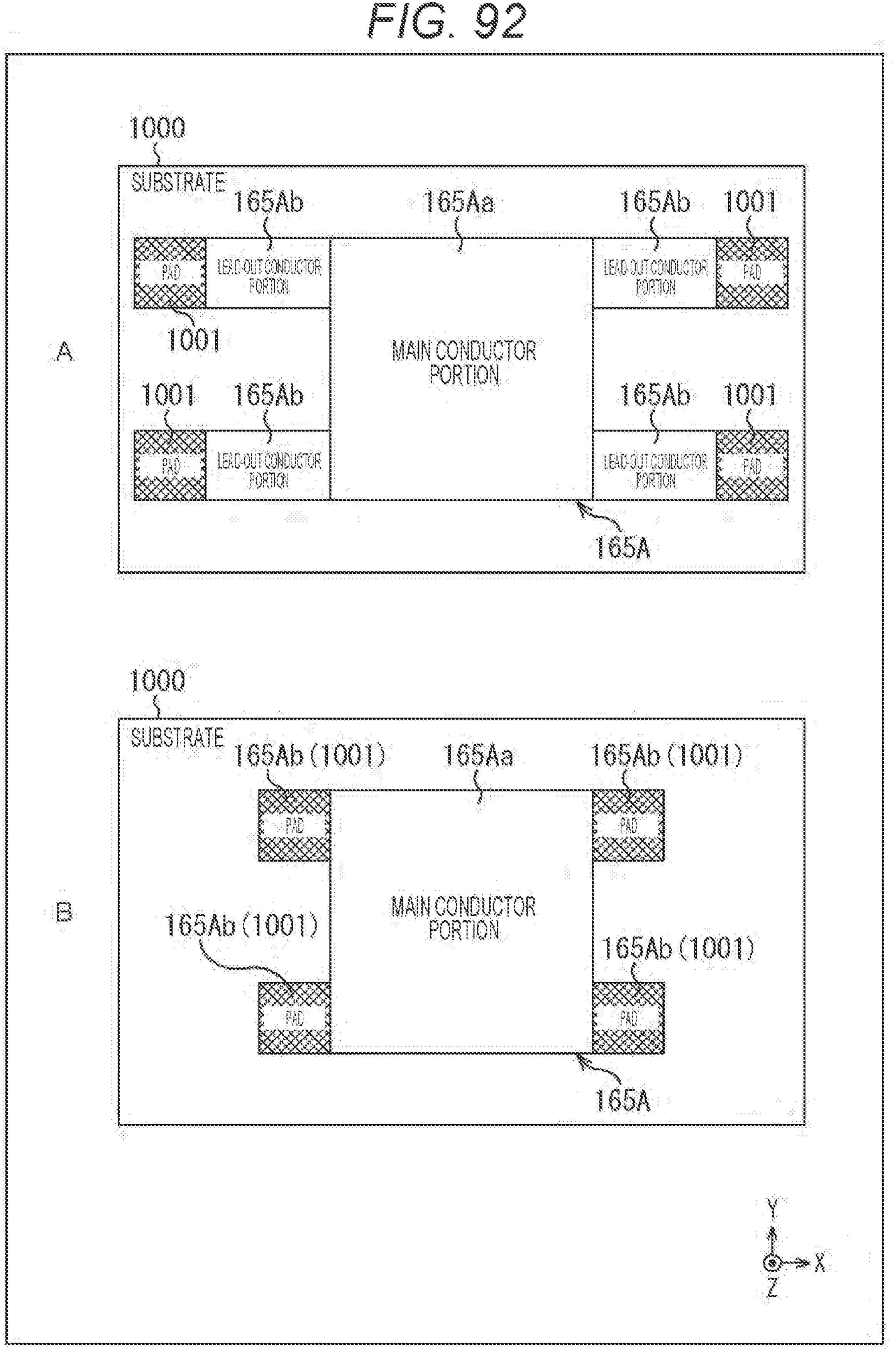
FIG. 92 is plan views illustrating the entire conductor layer A formed on the substrate.

FIG. 92 is plan views illustrating the entire conductor layer A formed on the substrate.

As described above, the conductor layer A (wiring layer 165A) includes the main conductor portion 165Aa and the lead-out conductor portion 165Ab.

In a case where the pads are separately provided from the conductor layer A, the lead-out conductor portion 165Ab is provided at a position close to a pad 1001, and connects the main conductor portion 165Aa and the pad 1001, as illustrated in A in FIG. 92. Meanwhile, there are some cases where the lead-out conductor portion 165Ab configures the pad 1001, as illustrated in B in FIG. 92.

The main conductor portion 165Aa is formed in a main region of a substrate 1000, for example, a central region of the substrate, with an area larger than the lead-out conductor portion 165Ab, and shields the active elements such as MOMS transistors and diodes formed in a region of the main conductor portion 165Aa or in another layer in the Z direction perpendicular to a plane of the region.

Note that FIG. 92 illustrates an example of the arrangement and shape of the conductor layer A, and the arrangement and shape of the conductor layer A are not limited to this example. Therefore, the positions and areas in the substrate 1000 on which the main conductor portion 165Aa, the lead-out conductor portion 165Ab, and the pad 1001 are formed are arbitrary, and the active elements may not be formed in a region of the main conductor portion 165Aa or the lead-out conductor portion 165Ab or in another layer in the Z direction perpendicular to the plane of the region. The lead-out conductor portion 165Ab may not be provided at the position near the pad 1001. Furthermore, the arrangement of the lead-out conductor portion 165Ab and the pad 1001 with respect to the main conductor portion 165Aa may be sides on the Y direction side or may be both sides on the X direction side and the Y direction side, instead of the sides on the X direction side, of the four sides of the main conductor portion 165Aa as in FIG. 92. Moreover, the number of pads 1001 may be one or three or more instead of two on each side as in FIG. 92.

FIG. 92 illustrates examples of the conductor layer A (wiring layer 165A). However, the same applies to the conductor layer B (wiring layer 165B).

With such a configuration, any of effects of satisfying the wiring layout restrictions, further improving the degree of freedom in designing the wiring layout, further improving the inductive noise, further improving the voltage drop, or the like can be exhibited.

In FIG. 92, for example, whether the pad 1001 is an electrode (Vdd electrode) connected to the positive power supply or an electrode (Vss electrode) connected to the GND or the negative power supply has not been particularly distinguished. However, the arrangement of the pad 1001 when distinguished will be described below.

Fourth Arrangement Example of Pads

Figure 93:
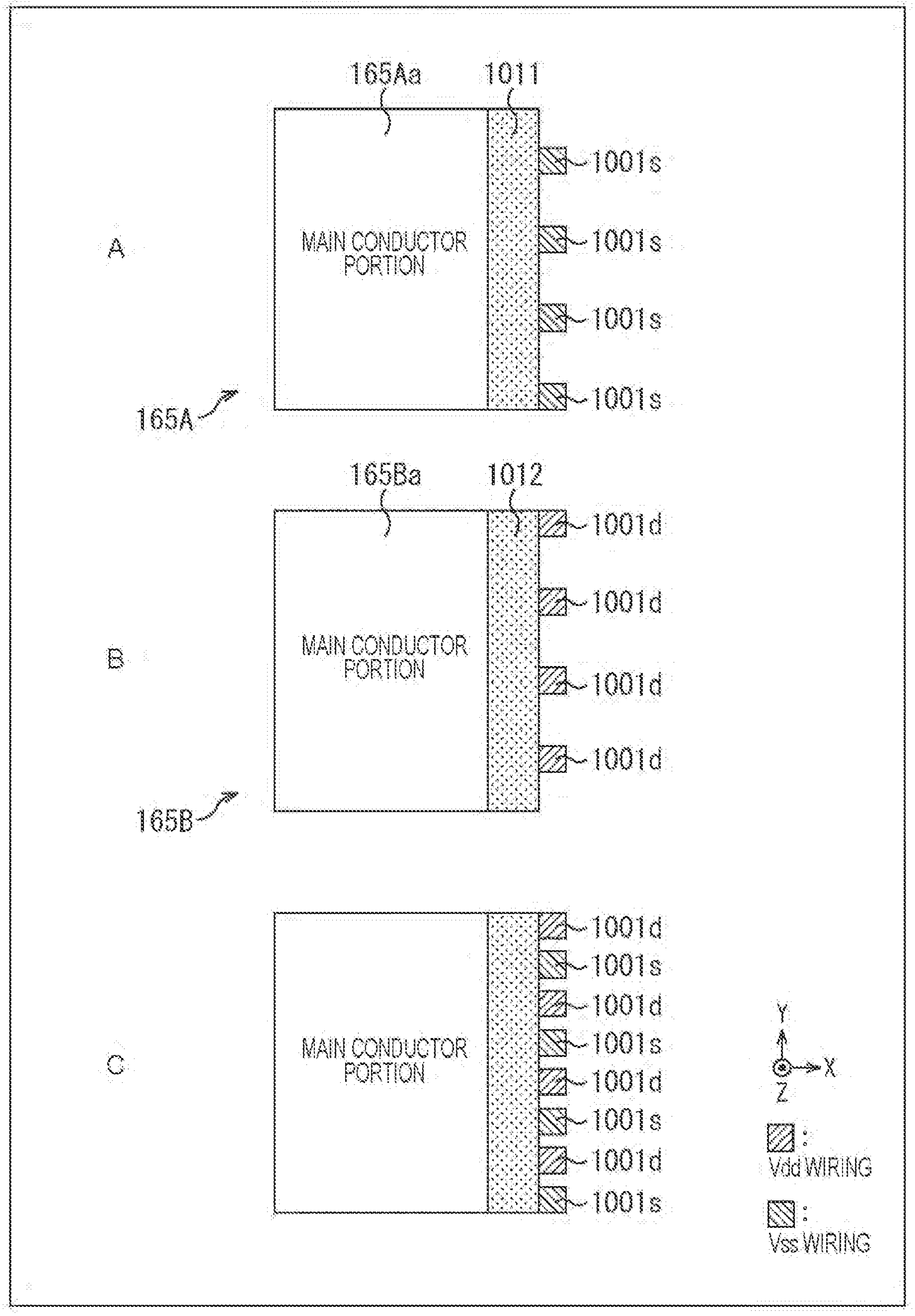
FIG. 93 is plan views illustrating a fourth arrangement example of pads.

FIG. 93 illustrates a fourth arrangement example of pads.

A in FIG. 93 is a plan view illustrating an arrangement example of the conductor layer A (wiring layer 165A) and pads 1001*s* connected to the conductor layer A.

B in FIG. 93 is a plan view illustrating an arrangement example of the conductor layer B (wiring layer 165B) and pads 1001*d* connected to the conductor layer B.

C in FIG. 93 is a plan view of a state in which the conductor layers A and B and the pads 1001*s* and 1001*d* respectively illustrated in A and B in FIG. 93 are stacked.

In FIG. 93, the pad 1001*s* represents, for example, the pad 1001 to which GND or a negative power supply (Vss) is supplied, and the pad 1001*d* represents, for example, the pad 1001 to which a positive power supply (Vdd) is supplied.

As illustrated in A in FIG. 93, a plurality of the pads 1001*s* is connected to a predetermined side of the rectangular main conductor portion 165Aa at predetermined intervals via a conductor 1011 having a shape optionally including a predetermined repeating pattern. Each pad 1001*s* may be configured by the lead-out conductor portion 165Ab, as in the twenty-seventh configuration example illustrated in FIG. 89, for example, or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in B in FIG. 93, a plurality of the pads 1001*d* is connected to a predetermined side of the rectangular main conductor portion 165Ba and to the same side as the side where the pads 1001*s* are arranged in the conductor layer A at predetermined intervals via the conductor 1012 having a shape optionally including a predetermined repeating pattern. Each pad 1001*d* may be configured by the lead-out conductor portion 165Bb, as in the twenty-seventh configuration example illustrated in FIG. 89, for example, or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in C in FIG. 93, in the state where the conductor layers A and B are stacked, the arrangement of the pads 1001*s* and the pads 1001*d* is an alternate arrangement in which the pad 1001*s* and the pad 1001*d* are alternately arranged in the Y direction. In this case, as described with reference to FIGS. 42 to 44, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads 1001 (in FIG. 93, the Y direction is longer than the X direction), there may be a magnetic field that cannot be canceled, and the induced electromotive force increases as the Victim conductor loop becomes larger and is accumulated, and the inductive noise may deteriorate.

Fifth Arrangement Example of Pads

Figure 94:
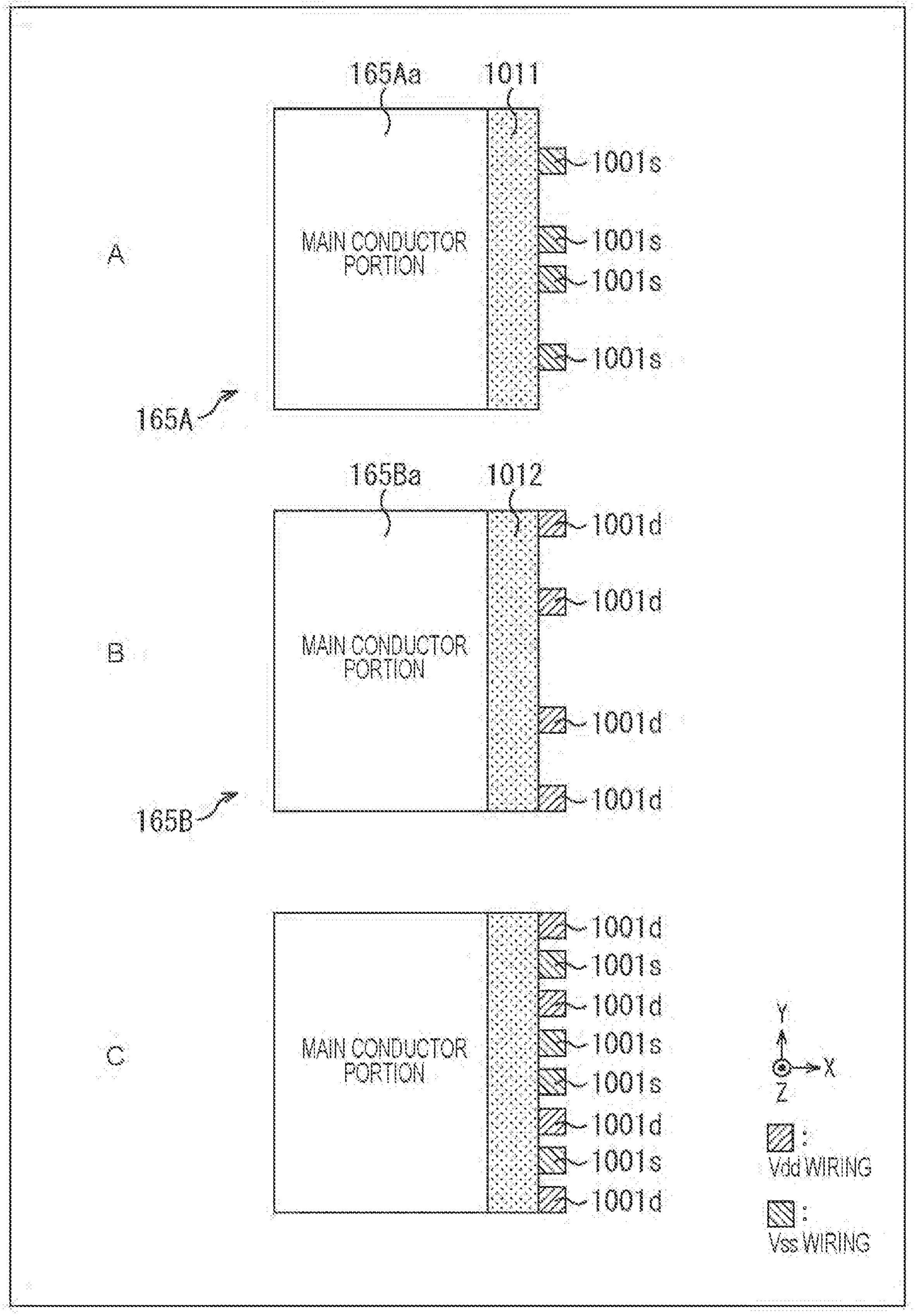
FIG. 94 is plan views illustrating a fifth arrangement example of pads.

FIG. 94 illustrates a fifth arrangement example of pads.

A in FIG. 94 is a plan view illustrating an arrangement example of the conductor layer A (wiring layer 165A) and the pads 1001*s* connected to the conductor layer A.

B in FIG. 94 is a plan view illustrating an arrangement example of the conductor layer B (wiring layer 165B) and the pads 1001*d* connected to the conductor layer B.

C in FIG. 94 is a plan view of a state in which the conductor layers A and B and the pads 1001*s* and 1001*d* respectively illustrated in A and B in FIG. 94 are stacked.

In FIG. 94, the pad 1001*s* represents, for example, the pad 1001 to which GND or a negative power supply is supplied, and the pad 1001*d* represents, for example, the pad 1001 to which a positive power supply is supplied.

As illustrated in A in FIG. 94, a plurality of the pads 1001*s* is connected to a predetermined side of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in B in FIG. 94, a plurality of the pads 1001*d* is connected to a predetermined side of the rectangular main conductor portion 165Ba and to the same side as the side where the pads 1001*s* are arranged in the conductor layer A at predetermined intervals via the conductor 1012 having a shape optionally including a predetermined repeating pattern. Each pad 1001*d* may be configured by the lead-out conductor portion 165Bb or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in C in FIG. 94, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. In this case, as compared with the alternate arrangement illustrated in FIG. 93, the magnetic field generated from each of the conductor layers A and B and the induced electromotive force based on the magnetic field can be more effectively canceled, so that the inductive noise can be further improved depending on the layout other than the pads.

Sixth Arrangement Example of Pads

Figure 95:
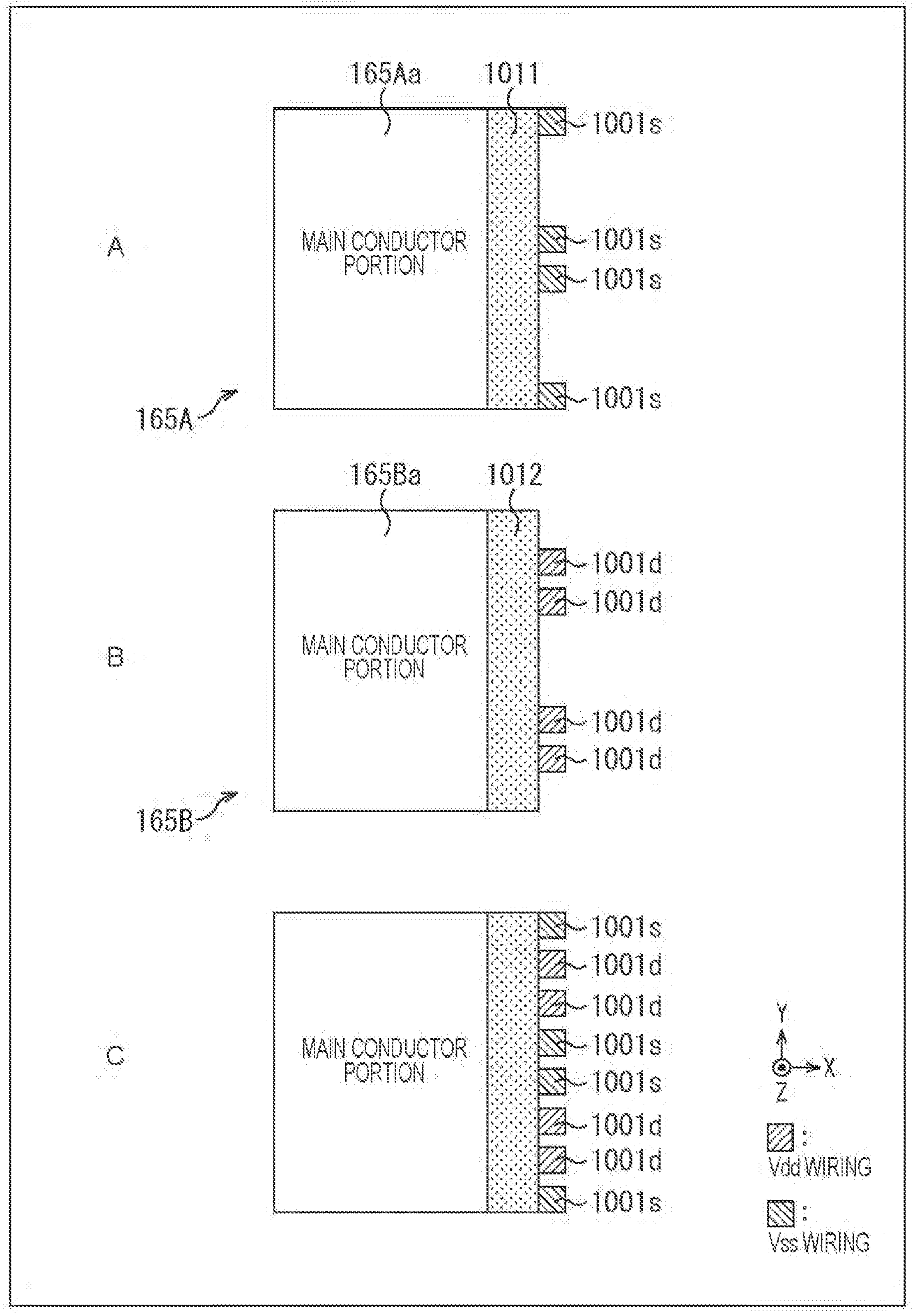
FIG. 95 is plan views illustrating a sixth arrangement example of pads.

FIG. 95 illustrates a sixth arrangement example of pads.

A in FIG. 95 is a plan view illustrating an arrangement example of the conductor layer A (wiring layer 165A) and the pads 1001*s* connected to the conductor layer A.

B in FIG. 95 is a plan view illustrating an arrangement example of the conductor layer B (wiring layer 165B) and the pads 1001*d* connected to the conductor layer B.

C in FIG. 95 is a plan view of a state in which the conductor layers A and B and the pads 1001*s* and 1001*d* respectively illustrated in A and B in FIG. 95 are stacked.

In FIG. 95, the pad 1001*s* represents, for example, the pad 1001 to which GND or a negative power supply is supplied, and the pad 1001*d* represents, for example, the pad 1001 to which a positive power supply is supplied.

As illustrated in A in FIG. 95, a plurality of the pads 1001*s* is connected to a predetermined side of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in B in FIG. 95, a plurality of the pads 1001*d* is connected to a predetermined side of the rectangular main conductor portion 165Ba and to the same side as the side where the pads 1001*s* are arranged in the conductor layer A at predetermined intervals via the conductor 1012 having a shape optionally including a predetermined repeating pattern. Each pad 1001*d* may be configured by the lead-out conductor portion 165Bb or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in C in FIG. 95, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. Moreover, the four pads 1001*s* and pads 1001*d* that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIG. 94, the induced electromotive force is more effectively canceled, and the inductive noise can be further improved depending on the layout other than the pads.

Seventh Arrangement Example of Pads

Figure 96:
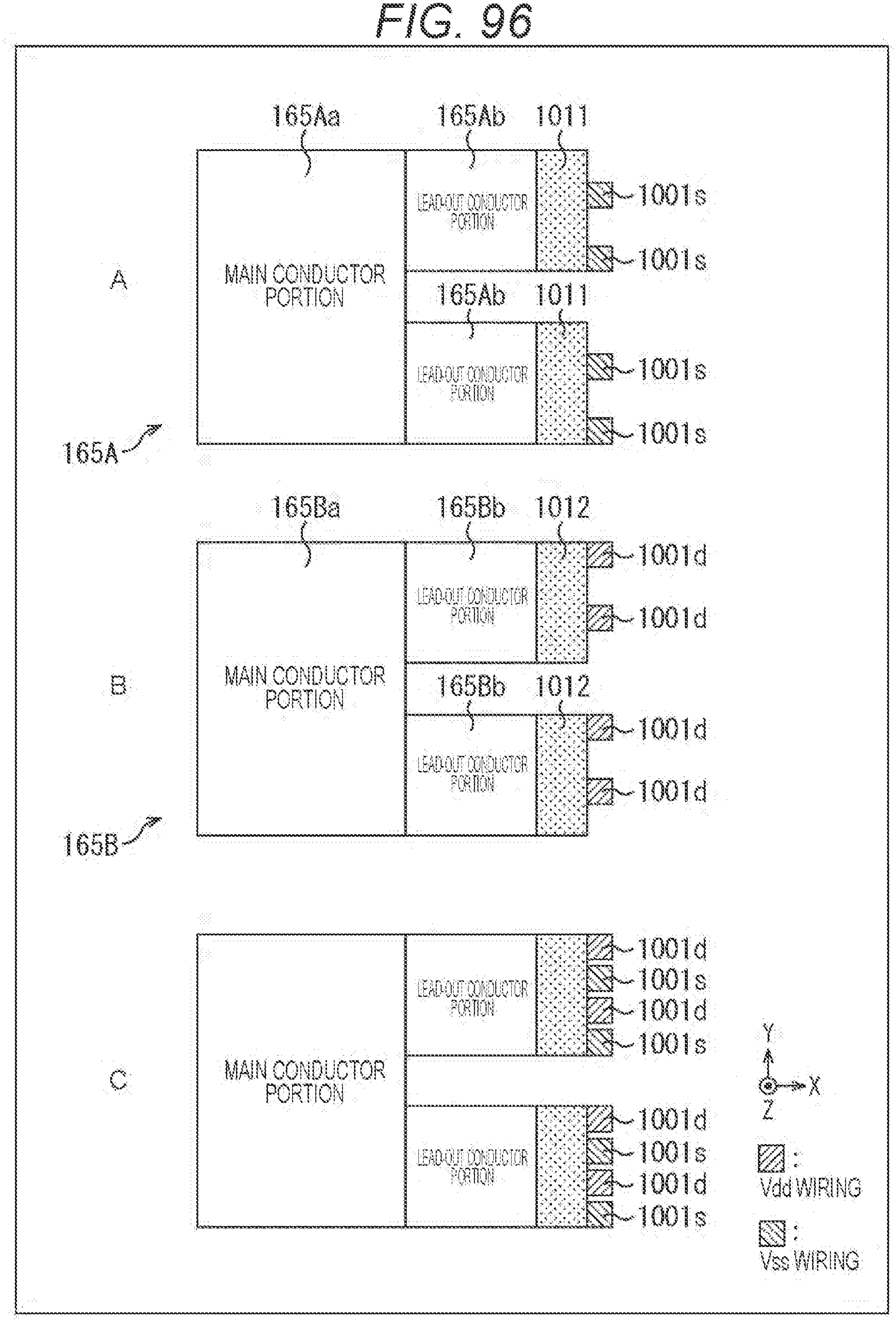
FIG. 96 is plan views illustrating a seventh arrangement example of pads.

FIG. 96 illustrates a seventh arrangement example of pads.

A in FIG. 96 is a plan view illustrating an arrangement example of the conductor layer A (wiring layer 165A) and the pads 1001*s* connected to the conductor layer A.

B in FIG. 96 is a plan view illustrating an arrangement example of the conductor layer B (wiring layer 165B) and the pads 1001*d* connected to the conductor layer B.

C in FIG. 96 is a plan view of a state in which the conductor layers A and B and the pads 1001*s* and 1001*d* respectively illustrated in A and B in FIG. 96 are stacked.

In FIG. 96, the pad 1001*s* represents, for example, the pad 1001 to which GND or a negative power supply is supplied, and the pad 1001*d* represents, for example, the pad 1001 to which a positive power supply is supplied.

As illustrated in A in FIG. 96, a plurality of the lead-out conductor portions 165Ab is connected to a predetermined side of the rectangular main conductor portion 165Aa, and a plurality of the pads 1001*s* is connected to an outer peripheral portion of each of the lead-out conductor portions 165Ab at predetermined intervals via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in B in FIG. 96, a plurality of the lead-out conductor portions 165Bb is connected to a predetermined side of the rectangular main conductor portion 165Ba, and a plurality of the pads 1001*d* is connected to the outer peripheral portion of each of the lead-out conductor portions 165Bb at predetermined intervals via the conductor 1012 having a shape optionally including a predetermined repeating pattern. The conductor 1012 may be omitted or may be present. Furthermore, the conductor 1012 may be located between the main conductor portion 165Ba and the lead-out conductor portion 165Bb.

As illustrated in C in FIG. 96, in the state where the conductor layers A and B are stacked, the arrangement of the pads 1001*s* and the pads 1001*d* is an alternate arrangement in which the pad 1001*s* and the pad 1001*d* are alternately arranged in the Y direction. In this case, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads 1001 (in FIG. 96, the Y direction is longer than the X direction), there may be a magnetic field that cannot be canceled, and the induced electromotive force increases as the Victim conductor loop becomes larger and is accumulated, and the inductive noise may deteriorate.

Eighth Arrangement Example of Pads

Figure 97:
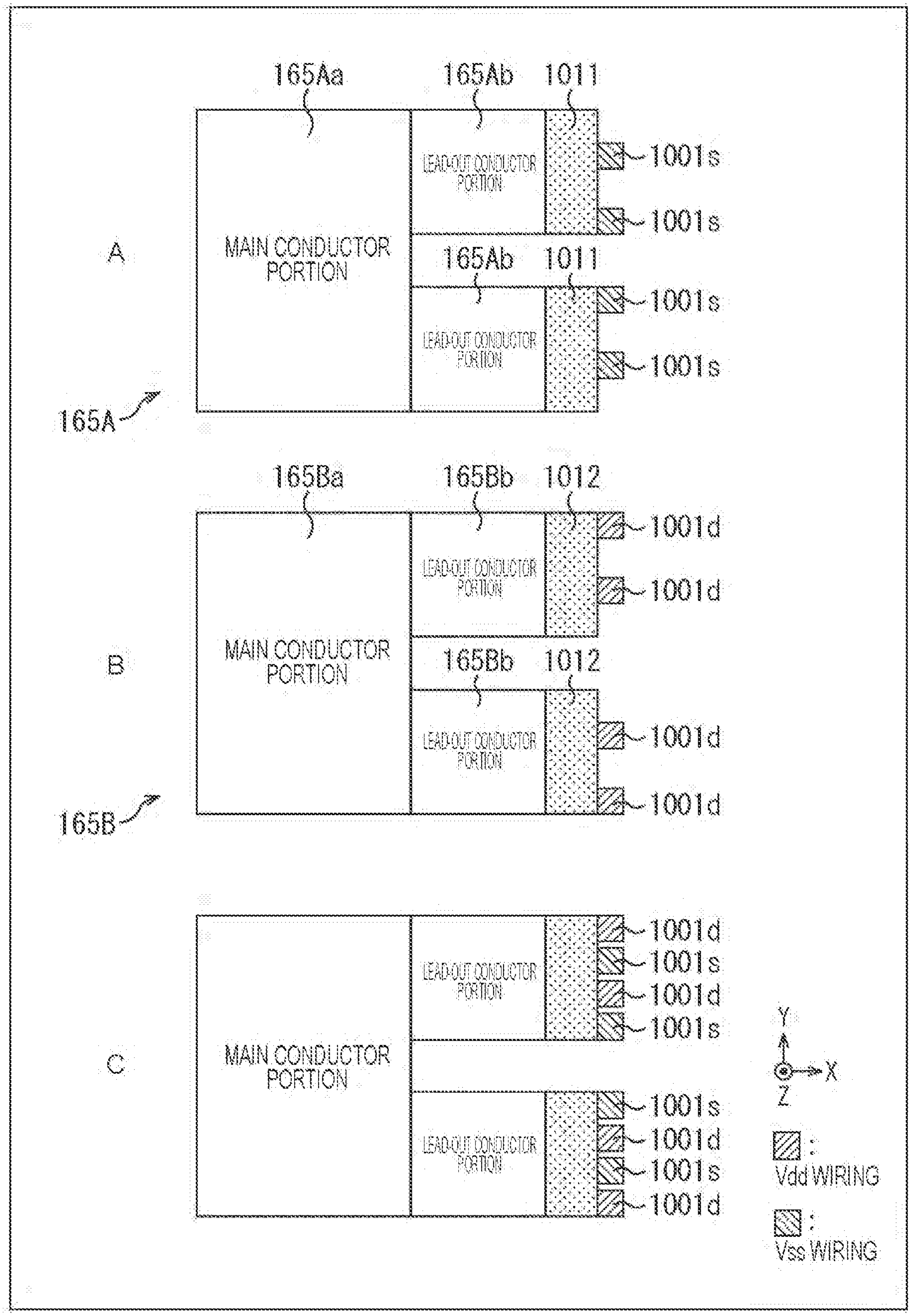
FIG. 97 is plan views illustrating an eighth arrangement example of pads.

FIG. 97 illustrates an eighth arrangement example of pads.

A in FIG. 97 is a plan view illustrating an arrangement example of the conductor layer A (wiring layer 165A) and the pads 1001*s* connected to the conductor layer A.

B in FIG. 97 is a plan view illustrating an arrangement example of the conductor layer B (wiring layer 165B) and the pads 1001*d* connected to the conductor layer B.

C in FIG. 97 is a plan view of a state in which the conductor layers A and B and the pads 1001*s* and 1001*d* respectively illustrated in A and B in FIG. 97 are stacked.

In FIG. 97, the pad 1001*s* represents, for example, the pad 1001 to which GND or a negative power supply is supplied, and the pad 1001*d* represents, for example, the pad 1001 to which a positive power supply is supplied.

As illustrated in A in FIG. 97, a plurality of the lead-out conductor portions 165Ab is connected to a predetermined side of the rectangular main conductor portion 165Aa, and a plurality of the pads 1001*s* is connected to the outer peripheral portion of each of the lead-out conductor portions 165Ab at predetermined intervals via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in B in FIG. 97, a plurality of the lead-out conductor portions 165Bb is connected to a predetermined side of the rectangular main conductor portion 165Ba, and a plurality of the pads 1001$d$ is connected to the outer peripheral portion of each of the lead-out conductor portions 165Bb at predetermined intervals via the conductor 1012 having a shape optionally including a predetermined repeating pattern. The conductor 1012 may be omitted or may be present. Furthermore, the conductor 1012 may be located between the main conductor portion 165Ba and the lead-out conductor portion 165Bb.

As illustrated in C in FIG. 97, in the state where the conductor layers A and B are stacked, the arrangement of the pads 1001$s$ and 1001$d$ is a mirror-symmetrical arrangement in which a set of pads 1001 is folded back in the Y direction and sequentially arranged, where four consecutive pads 1001$s$ and 1001$d$ in the Y direction are set as one set. In this case, as compared with the alternate arrangement illustrated in FIG. 96, the magnetic field generated from each of the conductor layers A and B and the induced electromotive force based on the magnetic field can be more effectively canceled, so that the inductive noise can be further improved depending on the layout other than the pads.

Ninth Arrangement Example of Pads

Figure 98:
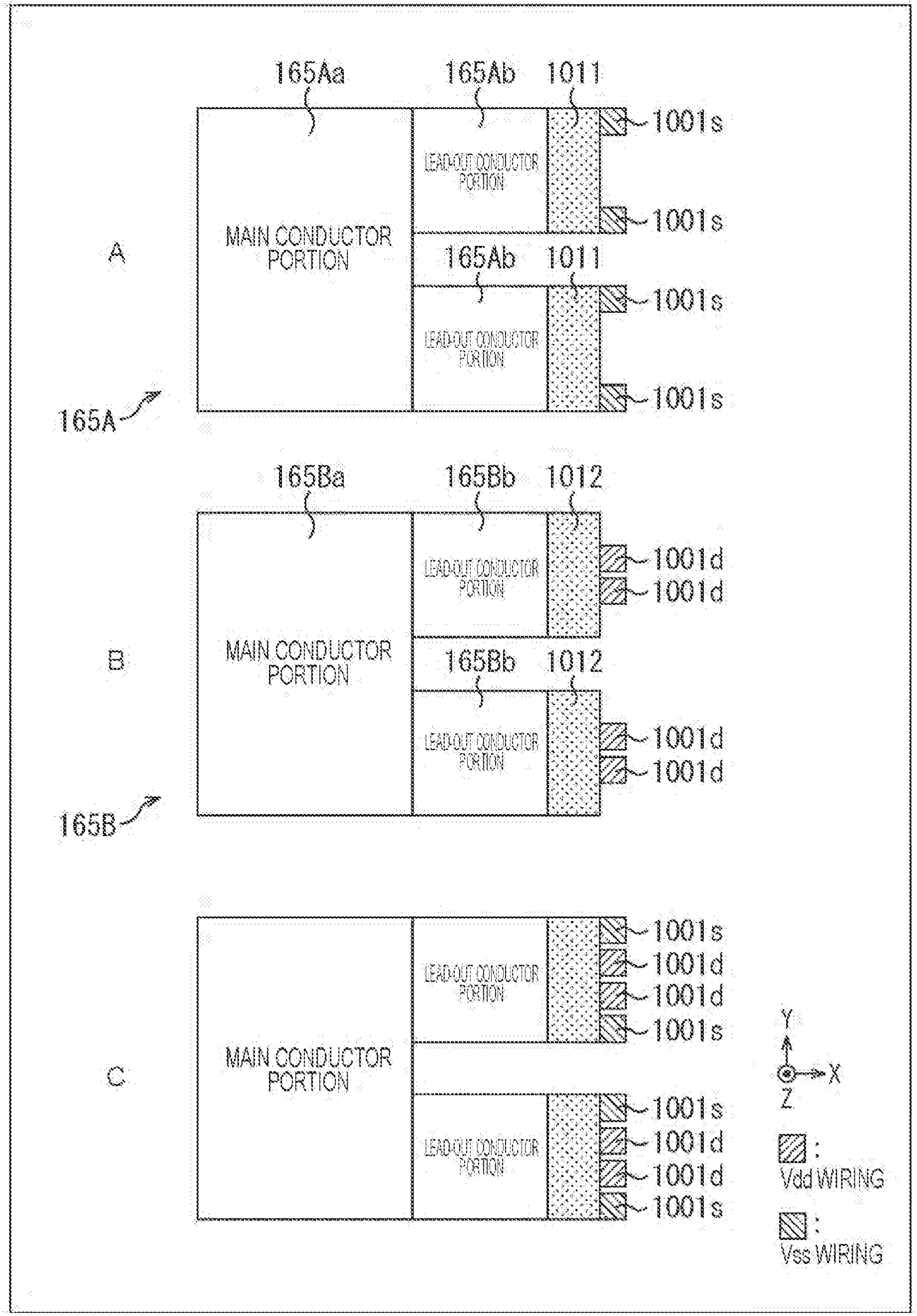
FIG. 98 is plan views illustrating a ninth arrangement example of pads.

FIG. 98 illustrates a ninth arrangement example of pads.

A in FIG. 98 is a plan view illustrating an arrangement example of the conductor layer A (wiring layer 165A) and the pads 1001$s$ connected to the conductor layer A.

B in FIG. 98 is a plan view illustrating an arrangement example of the conductor layer B (wiring layer 165B) and the pads 1001$d$ connected to the conductor layer B.

C in FIG. 98 is a plan view of a state in which the conductor layers A and B and the pads 1001$s$ and 1001$d$ respectively illustrated in A and B in FIG. 98 are stacked.

In FIG. 98, the pad 1001$s$ represents, for example, the pad 1001 to which GND or a negative power supply is supplied, and the pad 1001$d$ represents, for example, the pad 1001 to which a positive power supply is supplied.

As illustrated in A in FIG. 98, a plurality of the lead-out conductor portions 165Ab is connected to a predetermined side of the rectangular main conductor portion 165Aa, and a plurality of the pads 1001$s$ is connected to the outer peripheral portion of each of the lead-out conductor portions 165Ab at predetermined intervals via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in B in FIG. 98, a plurality of the lead-out conductor portions 165Bb is connected to a predetermined side of the rectangular main conductor portion 165Ba, and a plurality of the pads 1001$d$ is connected to the outer peripheral portion of each of the lead-out conductor portions 165Bb at predetermined intervals via the conductor 1012 having a shape optionally including a predetermined repeating pattern. The conductor 1012 may be omitted or may be present. Furthermore, the conductor 1012 may be located between the main conductor portion 165Ba and the lead-out conductor portion 165Bb.

As illustrated in C in FIG. 98, in the state where the conductor layers A and B are stacked, the arrangement of the pads 1001$s$ and 1001$d$ is a mirror-symmetrical arrangement in which a set of pads 1001 is folded back in the Y direction and sequentially arranged, where four consecutive pads 1001$s$ and 1001$d$ in the Y direction are set as one set. Moreover, the four pads 1001$s$ and pads 1001$d$ that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIG. 97, the induced electromotive force is more effectively canceled, and the inductive noise can be further improved depending on the layout other than the pads.

Tenth Arrangement Example of Pads

Figure 99:
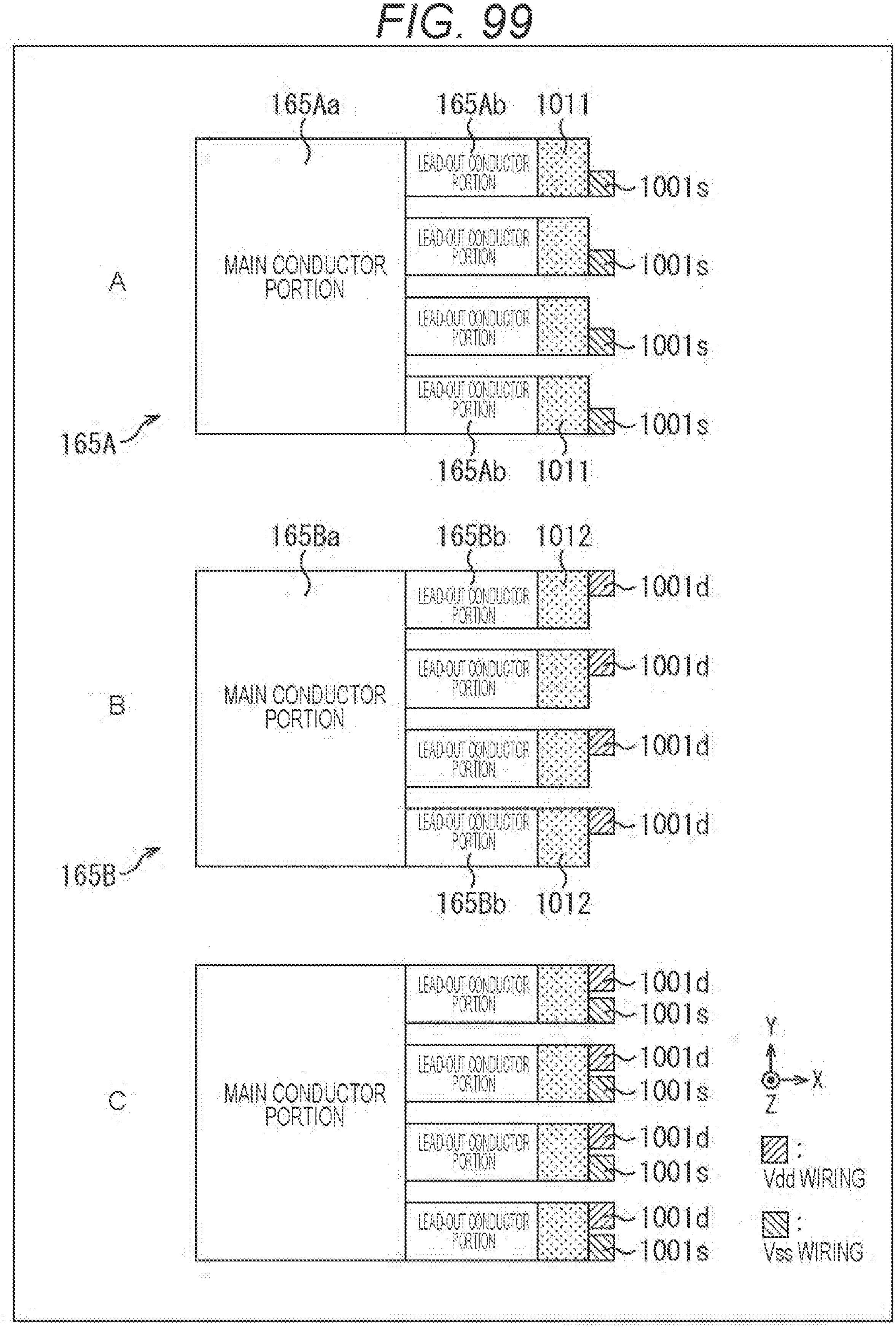
FIG. 99 is plan views illustrating a tenth arrangement example of pads.

FIG. 99 illustrates a tenth arrangement example of pads.

A in FIG. 99 is a plan view illustrating an arrangement example of the conductor layer A (wiring layer 165A) and the pads 1001$s$ connected to the conductor layer A.

B in FIG. 99 is a plan view illustrating an arrangement example of the conductor layer B (wiring layer 165B) and the pads 1001$d$ connected to the conductor layer B.

C in FIG. 99 is a plan view of a state in which the conductor layers A and B and the pads 1001$s$ and 1001$d$ respectively illustrated in A and B in FIG. 99 are stacked.

In FIG. 99, the pad 1001$s$ represents, for example, the pad 1001 to which GND or a negative power supply is supplied, and the pad 1001$d$ represents, for example, the pad 1001 to which a positive power supply is supplied.

As illustrated in A in FIG. 99, a plurality of the lead-out conductor portions 165Ab is connected to a predetermined side of the rectangular main conductor portion 165Aa, and one pad 1001$s$ is connected to the outer peripheral portion of each of the lead-out conductor portions 165Ab via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in B in FIG. 99, a plurality of the lead-out conductor portions 165Bb is connected to a predetermined side of the rectangular main conductor portion 165Ba, and one pad 1001$d$ is connected to the outer peripheral portion of each of the lead-out conductor portions 165Bb via the conductor 1012 having a shape optionally including a predetermined repeating pattern. The conductor 1012 may be omitted or may be present. Furthermore, the conductor 1012 may be located between the main conductor portion 165Ba and the lead-out conductor portion 165Bb.

As illustrated in C in FIG. 99, in the state where the conductor layers A and B are stacked, the arrangement of the pads 1001$s$ and the pads 1001$d$ is an alternate arrangement in which the pad 1001$s$ and the pad 1001$d$ are alternately arranged in the Y direction. In this case, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads 1001 (in FIG. 99, the Y direction is longer than the X direction), there may be a magnetic field that cannot be canceled, and the induced electromotive force increases as the Victim conductor loop becomes larger and is accumulated, and the inductive noise may deteriorate.

Eleventh Arrangement Example of Pads

Figure 100:
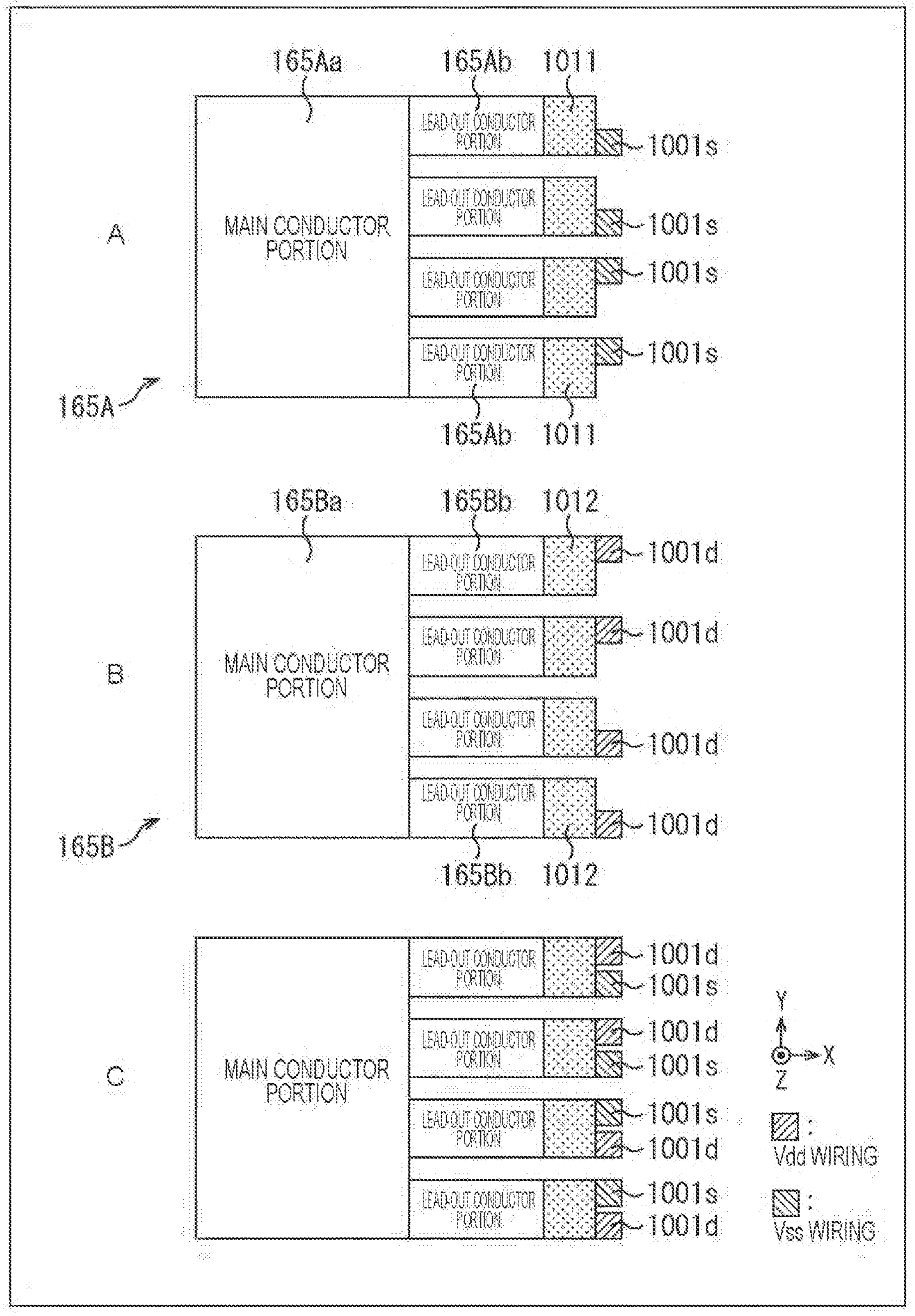
FIG. 100 is plan views illustrating an eleventh arrangement example of pads.

FIG. 100 illustrates an eleventh arrangement example of pads.

A in FIG. 100 is a plan view illustrating an arrangement example of the conductor layer A (wiring layer 165A) and the pads 1001*s* connected to the conductor layer A.

B in FIG. 100 is a plan view illustrating an arrangement example of the conductor layer B (wiring layer 165B) and the pads 1001*d* connected to the conductor layer B.

C in FIG. 100 is a plan view of a state in which the conductor layers A and B and the pads 1001*s* and 1001*d* respectively illustrated in A and B in FIG. 100 are stacked.

In FIG. 100, the pad 1001*s* represents, for example, the pad 1001 to which GND or a negative power supply is supplied, and the pad 1001*d* represents, for example, the pad 1001 to which a positive power supply is supplied.

As illustrated in A in FIG. 100, a plurality of the lead-out conductor portions 165Ab is connected to a predetermined side of the rectangular main conductor portion 165Aa, and one pad 1001*s* is connected to the outer peripheral portion of each of the lead-out conductor portions 165Ab via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in B in FIG. 100, a plurality of the lead-out conductor portions 165Bb is connected to a predetermined side of the rectangular main conductor portion 165Ba, and one pad 1001*d* is connected to the outer peripheral portion of each of the lead-out conductor portions 165Bb via the conductor 1012 having a shape optionally including a predetermined repeating pattern. The conductor 1012 may be omitted or may be present. Furthermore, the conductor 1012 may be located between the main conductor portion 165Ba and the lead-out conductor portion 165Bb.

As illustrated in C in FIG. 100, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. In this case, as compared with the alternate arrangement illustrated in FIG. 99, the magnetic field generated from each of the conductor layers A and B and the induced electromotive force based on the magnetic field can be more effectively canceled, so that the inductive noise can be further improved depending on the layout other than the pads.

Twelfth Arrangement Example of Pads

Figure 101:
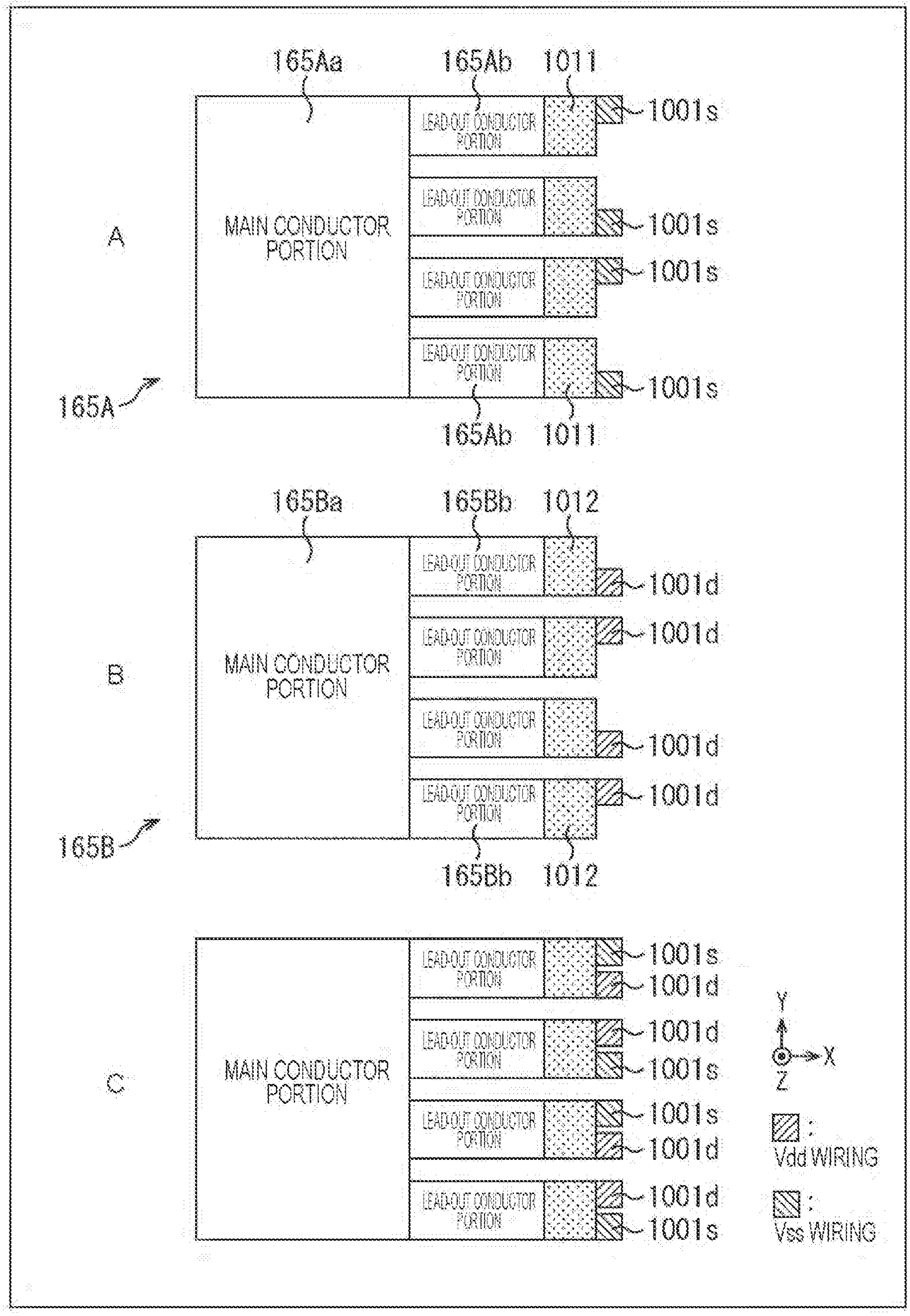
FIG. 101 is plan views illustrating a twelfth arrangement example of pads.

FIG. 101 illustrates a twelfth arrangement example of pads.

A in FIG. 101 is a plan view illustrating an arrangement example of the conductor layer A (wiring layer 165A) and the pads 1001*s* connected to the conductor layer A.

B in FIG. 101 is a plan view illustrating an arrangement example of the conductor layer B (wiring layer 165B) and the pads 1001*d* connected to the conductor layer B.

C in FIG. 101 is a plan view of a state in which the conductor layers A and B and the pads 1001*s* and 1001*d* respectively illustrated in A and B in FIG. 101 are stacked.

In FIG. 101, the pad 1001*s* represents, for example, the pad 1001 to which GND or a negative power supply is supplied, and the pad 1001*d* represents, for example, the pad 1001 to which a positive power supply is supplied.

As illustrated in A in FIG. 101, a plurality of the lead-out conductor portions 165Ab is connected to a predetermined side of the rectangular main conductor portion 165Aa, and one pad 1001*s* is connected to the outer peripheral portion of each of the lead-out conductor portions 165Ab via the conductor 1011 having a shape optionally including a predetermined repeating pattern. The conductor 1011 may be omitted or may be present. Furthermore, the conductor 1011 may be located between the main conductor portion 165Aa and the lead-out conductor portion 165Ab.

As illustrated in B in FIG. 101, a plurality of the lead-out conductor portions 165Bb is connected to a predetermined side of the rectangular main conductor portion 165Ba, and one pad 1001*d* is connected to the outer peripheral portion of each of the lead-out conductor portions 165Bb via the conductor 1012 having a shape optionally including a predetermined repeating pattern. The conductor 1012 may be omitted or may be present. Furthermore, the conductor 1012 may be located between the main conductor portion 165Ba and the lead-out conductor portion 165Bb.

As illustrated in C in FIG. 101, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. Moreover, the four pads 1001*s* and pads 1001*d* that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIG. 100, the induced electromotive force is more effectively canceled, and the inductive noise can be further improved depending on the layout other than the pads.

Thirteenth Arrangement Example of Pads

Figure 102:
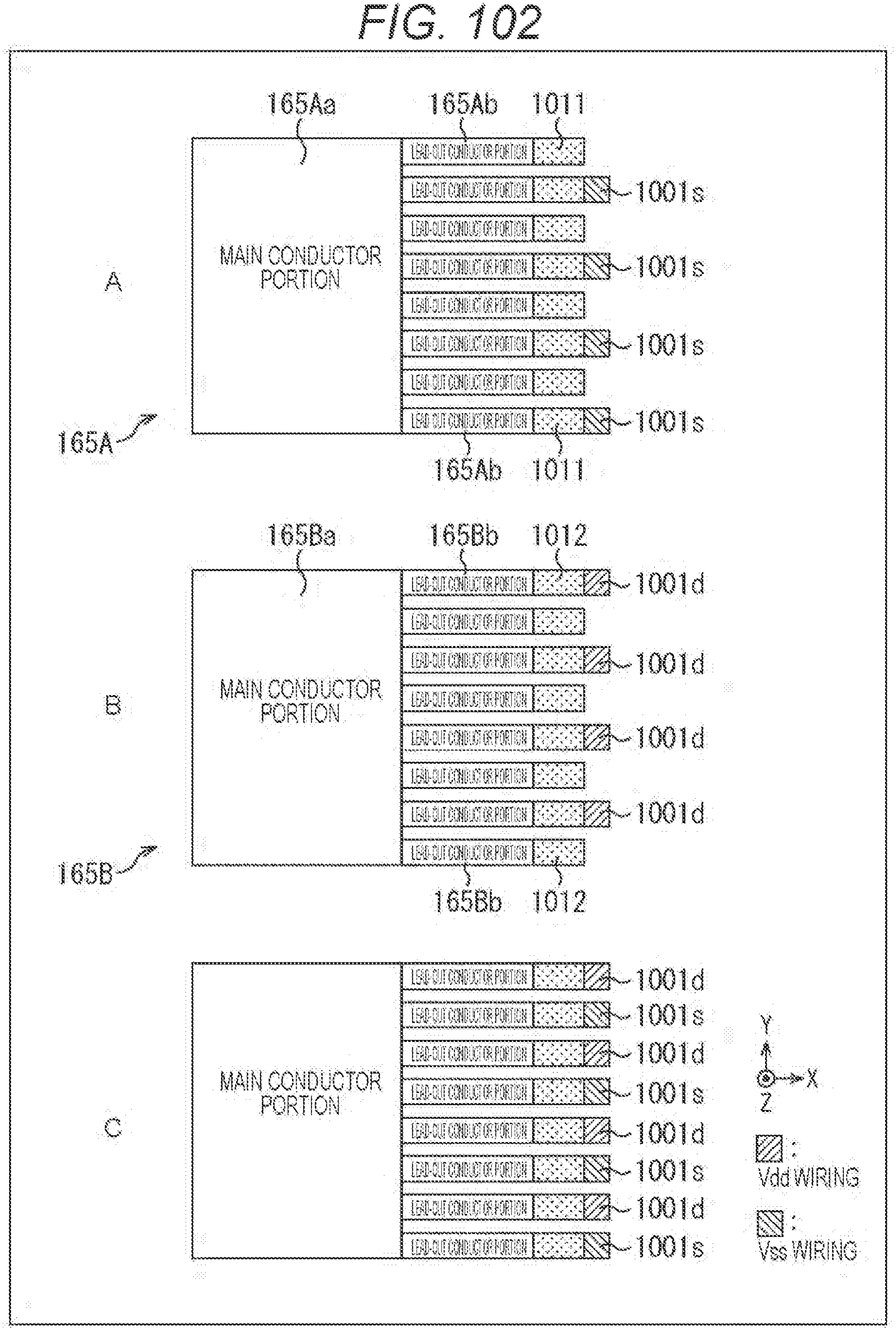
FIG. 102 is plan views illustrating a thirteenth arrangement example of pads.

FIG. 102 illustrates a thirteenth arrangement example of the pad.

A in FIG. 102 is a plan view illustrating an arrangement example of the conductor layer A (wiring layer 165A) and the pads 1001*s* connected to the conductor layer A.

B in FIG. 102 is a plan view illustrating an arrangement example of the conductor layer B (wiring layer 165B) and the pads 1001*d* connected to the conductor layer B.

C in FIG. 102 is a plan view of a state in which the conductor layers A and B and the pads 1001*s* and 1001*d* respectively illustrated in A and B in FIG. 102 are stacked.

In FIG. 102, the pad 1001*s* represents, for example, the pad 1001 to which GND or a negative power supply is supplied, and the pad 1001*d* represents, for example, the pad 1001 to which a positive power supply is supplied.

As illustrated in A in FIG. 102, a plurality of the lead-out conductor portions 165Ab is connected to a predetermined side of the rectangular main conductor portion 165Aa, and the conductor 1011 having a shape optionally including a predetermined repeating pattern is connected to the outer peripheral portion of each of the lead-out conductor portions 165Ab. Furthermore, one pad 1001*s* is connected to a part of the plurality of lead-out conductor portions 165Ab via the conductor 1011. The conductor 1011 may be omitted or may be present. Furthermore, the conductor 1011 may be located between the main conductor portion 165Aa and the lead-out conductor portion 165Ab.

As illustrated in B in FIG. 102, a plurality of the lead-out conductor portions 165Bb is connected to a predetermined side of the rectangular main conductor portion 165Ba, and the conductor 1012 having a shape optionally including a predetermined repeating pattern is connected to the outer peripheral portion of each of the lead-out conductor portions 165Bb. Furthermore, one pad 1001*d* is arranged in a part of the plurality of lead-out conductor portions 165Bb via the conductor 1012. The conductor 1012 may be omitted or may be present. Furthermore, the conductor 1012 may be located between the main conductor portion 165Ba and the lead-out conductor portion 165Bb.

As illustrated in C in FIG. 102, in the state where the conductor layers A and B are stacked, the arrangement of the pads 1001*s* and the pads 1001*d* is an alternate arrangement in which the pad 1001*s* and the pad 1001*d* are alternately arranged in the Y direction. In this case, the magnetic field generated from each of the conductor layers A and B and the induced electromotive force based on the magnetic field can be effectively canceled, so that the inductive noise can be further improved. However, since the arrangement is not symmetrically arranged in the Y direction, in a case where the pads 1001 are arranged over a wide area, that is, in a case where the main conductor portion 165Aa or 165Ba, the lead-out conductor portion 165Ab or 165Bb, or the conductor 1011 or 1012 is longer in the arrangement direction of the pads 1001 (in FIG. 102, the Y direction is longer than the X direction), there may be a magnetic field that cannot be canceled, and the induced electromotive force increases as the Victim conductor loop becomes larger and is accumulated, and the inductive noise may deteriorate.

Fourteenth Arrangement Example of Pads

Figure 103:
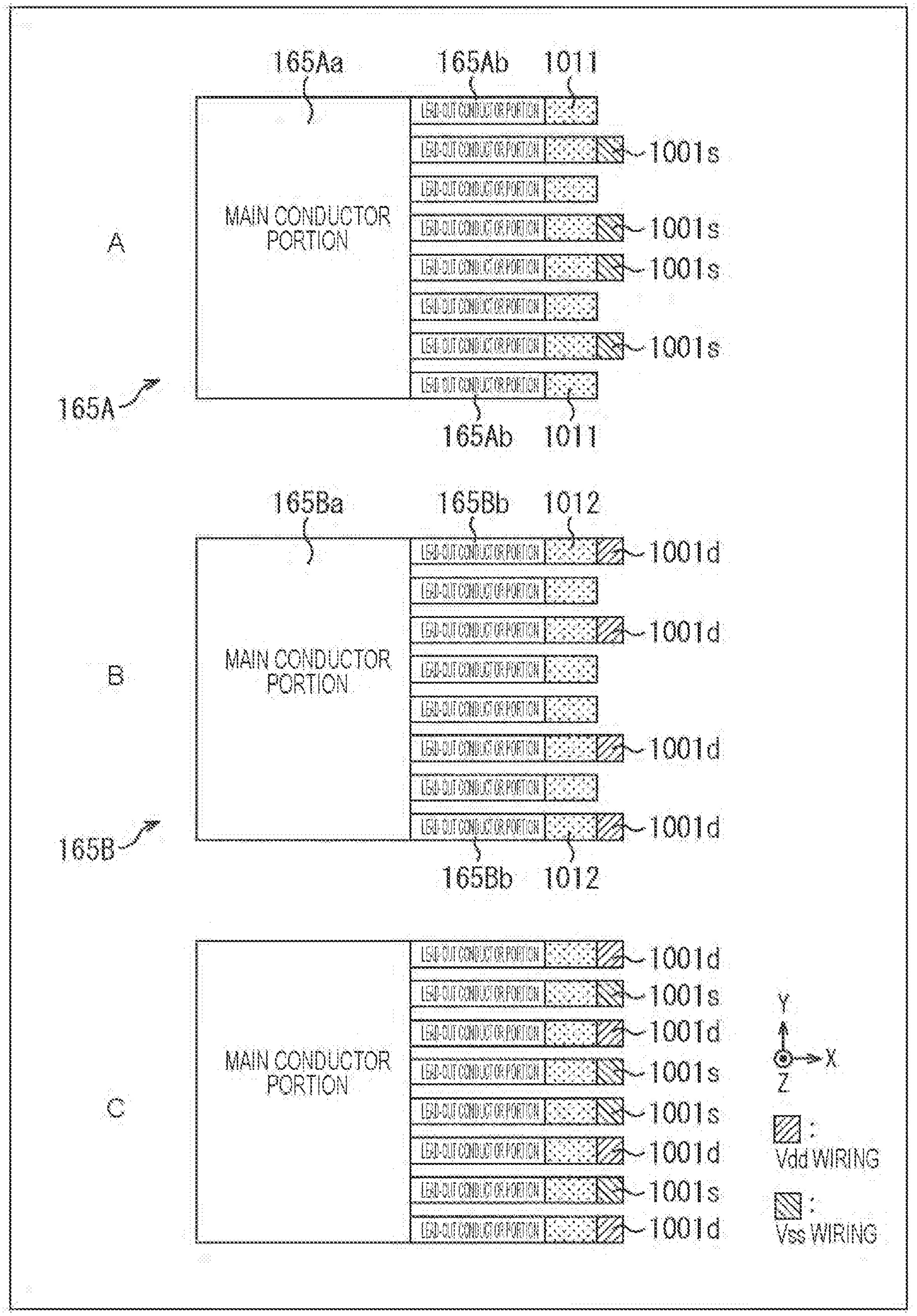
FIG. 103 is plan views illustrating a fourteenth arrangement example of pads.

FIG. 103 illustrates a fourteenth arrangement example of pads.

A in FIG. 103 is a plan view illustrating an arrangement example of the conductor layer A (wiring layer 165A) and the pads 1001*s* connected to the conductor layer A.

B in FIG. 103 is a plan view illustrating an arrangement example of the conductor layer B (wiring layer 165B) and the pads 1001*d* connected to the conductor layer B.

C in FIG. 103 is a plan view of a state in which the conductor layers A and B and the pads 1001*s* and 1001*d* respectively illustrated in A and B in FIG. 103 are stacked.

In FIG. 103, the pad 1001*s* represents, for example, the pad 1001 to which GND or a negative power supply is supplied, and the pad 1001*d* represents, for example, the pad 1001 to which a positive power supply is supplied.

As illustrated in A in FIG. 103, a plurality of the lead-out conductor portions 165Ab is connected to a predetermined side of the rectangular main conductor portion 165Aa, and the conductor 1011 having a shape optionally including a predetermined repeating pattern is connected to the outer peripheral portion of each of the lead-out conductor portions 165Ab. Furthermore, one pad 1001*s* is connected to a part of the plurality of lead-out conductor portions 165Ab via the conductor 1011. The conductor 1011 may be omitted or may be present. Furthermore, the conductor 1011 may be located between the main conductor portion 165Aa and the lead-out conductor portion 165Ab.

As illustrated in B in FIG. 103, a plurality of the lead-out conductor portions 165Bb is connected to a predetermined side of the rectangular main conductor portion 165Ba, and the conductor 1012 having a shape optionally including a predetermined repeating pattern is connected to the outer peripheral portion of each of the lead-out conductor portions 165Bb. Furthermore, one pad 1001*d* is arranged in a part of the plurality of lead-out conductor portions 165Bb via the conductor 1012. The conductor 1012 may be omitted or may be present. Furthermore, the conductor 1012 may be located between the main conductor portion 165Ba and the lead-out conductor portion 165Bb.

As illustrated in C in FIG. 103, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. In this case, as compared with the alternate arrangement illustrated in FIG. 102, the magnetic field generated from each of the conductor layers A and B and the induced electromotive force based on the magnetic field can be more effectively canceled, so that the inductive noise can be further improved depending on the layout other than the pads.

Fifteenth Arrangement Example of Pads

Figure 104:
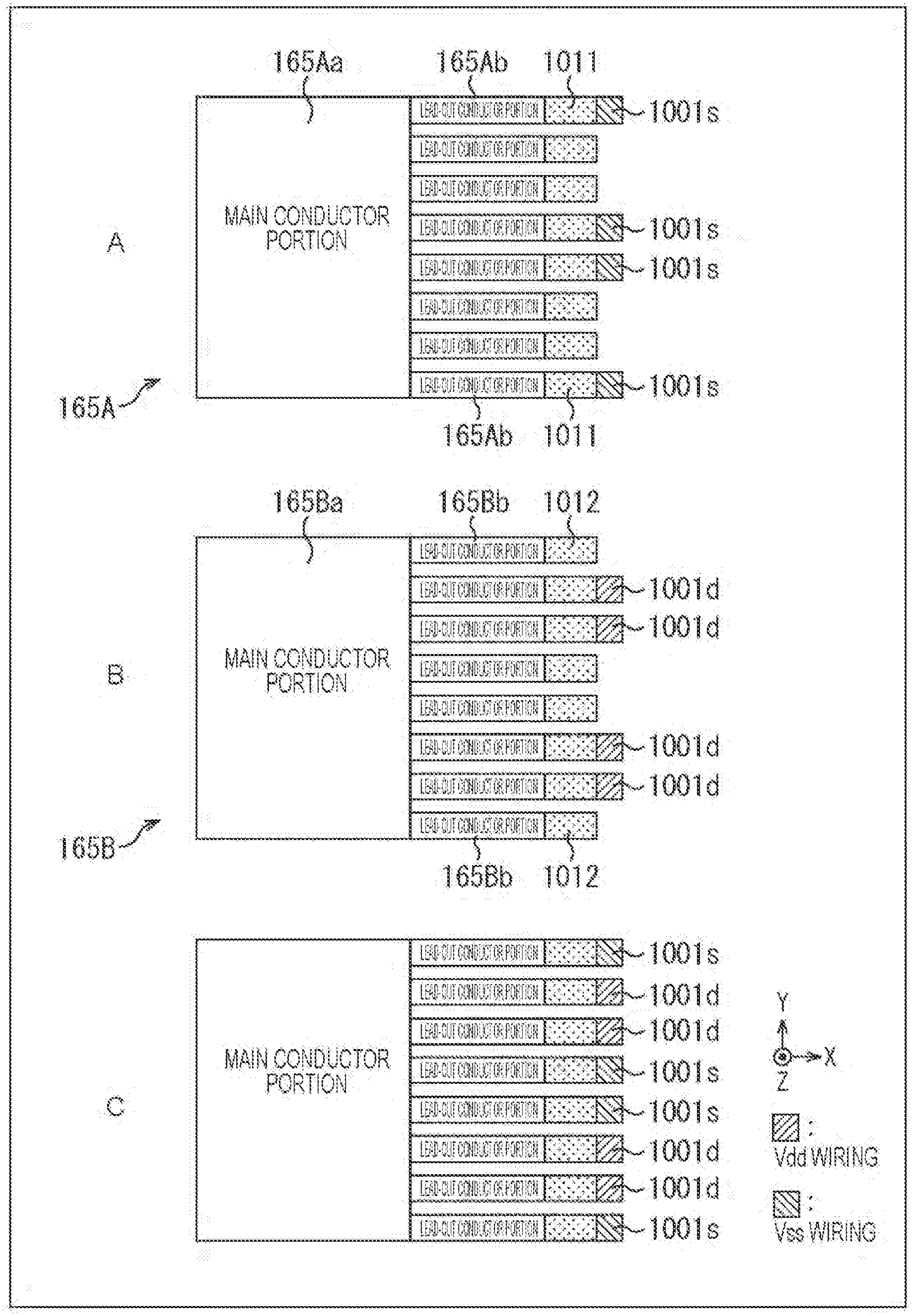
FIG. 104 is plan views illustrating a fifteenth arrangement example of pads.

FIG. 104 illustrates a fifteenth arrangement example of pads.

A in FIG. 104 is a plan view illustrating an arrangement example of the conductor layer A (wiring layer 165A) and the pads 1001*s* connected to the conductor layer A.

B in FIG. 104 is a plan view illustrating an arrangement example of the conductor layer B (wiring layer 165B) and the pads 1001*d* connected to the conductor layer B.

C in FIG. 104 is a plan view of a state in which the conductor layers A and B and the pads 1001*s* and 1001*d* respectively illustrated in A and B in FIG. 104 are stacked.

In FIG. 104, the pad 1001*s* represents, for example, the pad 1001 to which GND or a negative power supply is supplied, and the pad 1001*d* represents, for example, the pad 1001 to which a positive power supply is supplied.

As illustrated in A in FIG. 104, a plurality of the lead-out conductor portions 165Ab is connected to a predetermined side of the rectangular main conductor portion 165Aa, and the conductor 1011 having a shape optionally including a predetermined repeating pattern is connected to the outer peripheral portion of each of the lead-out conductor portions 165Ab. Furthermore, one pad 1001*s* is connected to a part of the plurality of lead-out conductor portions 165Ab via the conductor 1011. The conductor 1011 may be omitted or may be present. Furthermore, the conductor 1011 may be located between the main conductor portion 165Aa and the lead-out conductor portion 165Ab.

As illustrated in B in FIG. 104, a plurality of the lead-out conductor portions 165Bb is connected to a predetermined side of the rectangular main conductor portion 165Ba, and the conductor 1012 having a shape optionally including a predetermined repeating pattern is connected to the outer peripheral portion of each of the lead-out conductor portions 165Bb. Furthermore, one pad 1001*d* is arranged in a part of the plurality of lead-out conductor portions 165Bb via the conductor 1012. The conductor 1012 may be omitted or may be present. Furthermore, the conductor 1012 may be located between the main conductor portion 165Ba and the lead-out conductor portion 165Bb.

As illustrated in C in FIG. 104, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* in the Y direction are set as one set. Moreover, the four pads 1001*s* and pads 1001*d* that constitute one set also have a mirror-symmetrical arrangement in which two of the four pads 1001 are folded back in the Y direction with reference to a center line in the Y direction. In the case of adopting such a two-stage configuration with a mirror arrangement, a range in which a residual magnetic field is accumulated is narrower than that of a one-stage mirror arrangement illustrated in FIG. 103, the induced electromotive force is more effectively canceled, and the inductive noise can be further improved depending on the layout other than the pads.

In the pad arrangement examples described with reference to FIGS. 93 to 104, the examples in which the total number of pads connected to a predetermined one side of the main conductor portions 165*a* of the conductor layers A and B is eight, and the arrangement of the eight pads 1001 continuous in the Y direction is the alternate arrangement, one-stage mirror arrangement, and two-stage mirror arrangement have been described. However, a total number of pads other than eight may be arranged in the alternate arrangement, one-stage mirror arrangement, and two-stage mirror arrangement. The number of pads in one set to be arranged in the alternate arrangement or the mirror arrangement is not limited to two or four, and is arbitrary.

Furthermore, the number of pads connected to one lead-out conductor portion 165*b* is not limited to one or two illustrated in FIGS. 93 to 104, and may be three or more.

Moreover, FIGS. 93 to 104 illustrate the examples in which the plurality of pads 1001 is connected to only the predetermined one side of the main conductor portions 165*a* of the rectangular conductor layers A and B have been described for simplicity. However, the pads may be connected to a side other than the side illustrated in FIGS. 93 to 104, or may be any two sides, three sides, or four sides.

The case where the total number of pads is eight has been described as an example, but this is not the case. The number of pads may be increased or the number of pads may be decreased.

The configuration elements illustrated as the examples of pad arrangement may be omitted in part or in whole, the part or the whole may be changed, the part or the whole may be altered, the part or the whole may be replaced with another configuration element, or another configuration element may be added to the part or the whole. Furthermore, a part or the whole of the configuration elements described as examples of pad arrangement may be divided into a plurality of elements, the part or the whole may be separated into a plurality of elements, or at least some of the plurality of divided or separated configuration elements may have different functions or characteristics. Moreover, at least some of the configuration elements illustrated as examples of pad arrangement may be arbitrarily combined to form different pad arrangement. Moreover, at least some of the configuration elements illustrated as examples of pad arrangement may be moved to form different pad arrangement. Moreover, a coupling element or a relay element may be added to a combination of at least some of the configuration elements illustrated as examples of pad arrangement to form different pad arrangement. Moreover, a switching element or a switching function may be added to a combination of at least some of the configuration elements illustrated as examples of pad arrangement to form different pad arrangement.

Sixteenth Arrangement Example of Pads

Next, examples of orthogonal pad arrangement in cases where a plurality of pads 1001 is arranged on adjacent two sides of the rectangular main conductor portions 165*a* of the conductor layers A and B will be described with reference to FIGS. 105 to 108.

Figure 105:
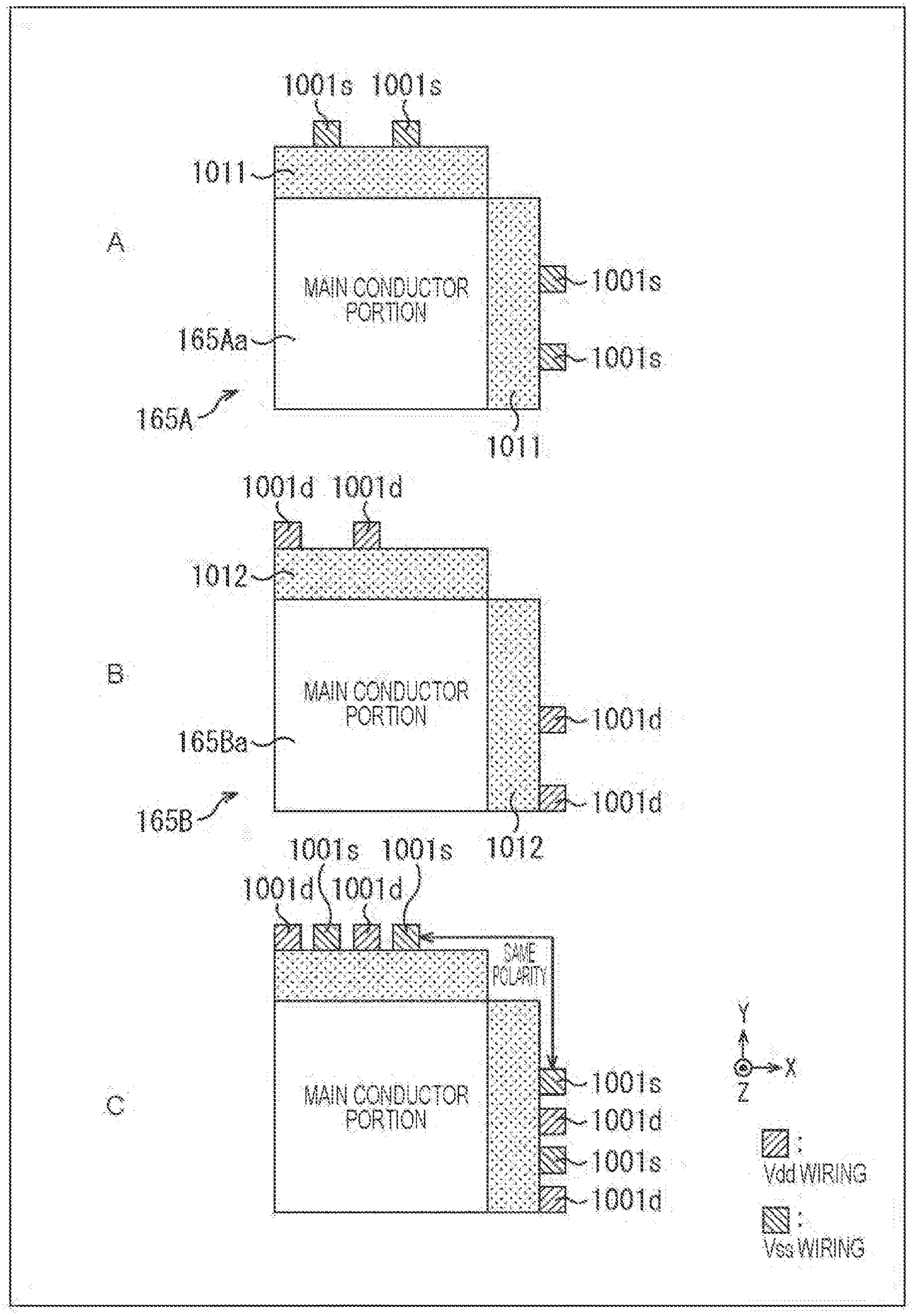
FIG. 105 is plan views illustrating a sixteenth arrangement example of pads.

FIG. 105 illustrates a sixteenth arrangement example of pads.

A in FIG. 105 is a plan view illustrating an arrangement example of the conductor layer A (wiring layer 165A) and the pads 1001*s* connected to the conductor layer A.

B in FIG. 105 is a plan view illustrating an arrangement example of the conductor layer B (wiring layer 165B) and the pads 1001*d* connected to the conductor layer B.

C in FIG. 105 is a plan view of a state in which the conductor layers A and B and the pads 1001*s* and 1001*d* respectively illustrated in A and B in FIG. 105 are stacked.

In FIG. 105, the pad 1001*s* represents, for example, the pad 1001 to which GND or a negative power supply is supplied, and the pad 1001*d* represents, for example, the pad 1001 to which a positive power supply is supplied.

As illustrated in A in FIG. 105, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in B in FIG. 105, a plurality of the pads 1001*d* is connected to adjacent two sides of the rectangular main conductor portion 165Ba at predetermined intervals via the conductor 1012 having a shape optionally including a predetermined repeating pattern. Each pad 1001*d* may be configured by the lead-out conductor portion 165Bb or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in C in FIG. 105, in the state where the conductor layers A and B are stacked, the arrangement of the pads 1001*s* and the pads 1001*d* is an alternate arrangement in which the pad 1001*s* and the pad 1001*d* are alternately arranged on adjacent two sides of the rectangular main conductor portion 165*a*. Furthermore, among the pads 1001*s* and pads 1001*d* alternately arranged on the two sides, the polarities of the pads 1001 at the ends of the two sides are both the pads 1001*s* connected to the GND or the negative power supply. In this way, among the plurality of pads 1001 on the two sides in which the pads 1001*s* and the pads 1001*d* are alternately arranged, the polarities of the pads 1001 at the ends closest to a corner of the substrate 1000 are the same polarity, and the pads 1001*s* with the polarity having higher electrostatic discharge (ESD) resistance are adopted, whereby the ESD resistance can be enhanced.

Note that the polarities of the pads 1001 at the ends of the two sides where the pad 1001*s* and the pad 1001*d* are alternately arranged are favorably set to the pads 1001*s* connected to the GND or the negative power supply, for example, in consideration of the ESD resistance. However, the pads 1001 may be set to the pads 1001*d* connected to the positive power supply, for example.

Seventeenth Arrangement Example of Pads

Figure 106:
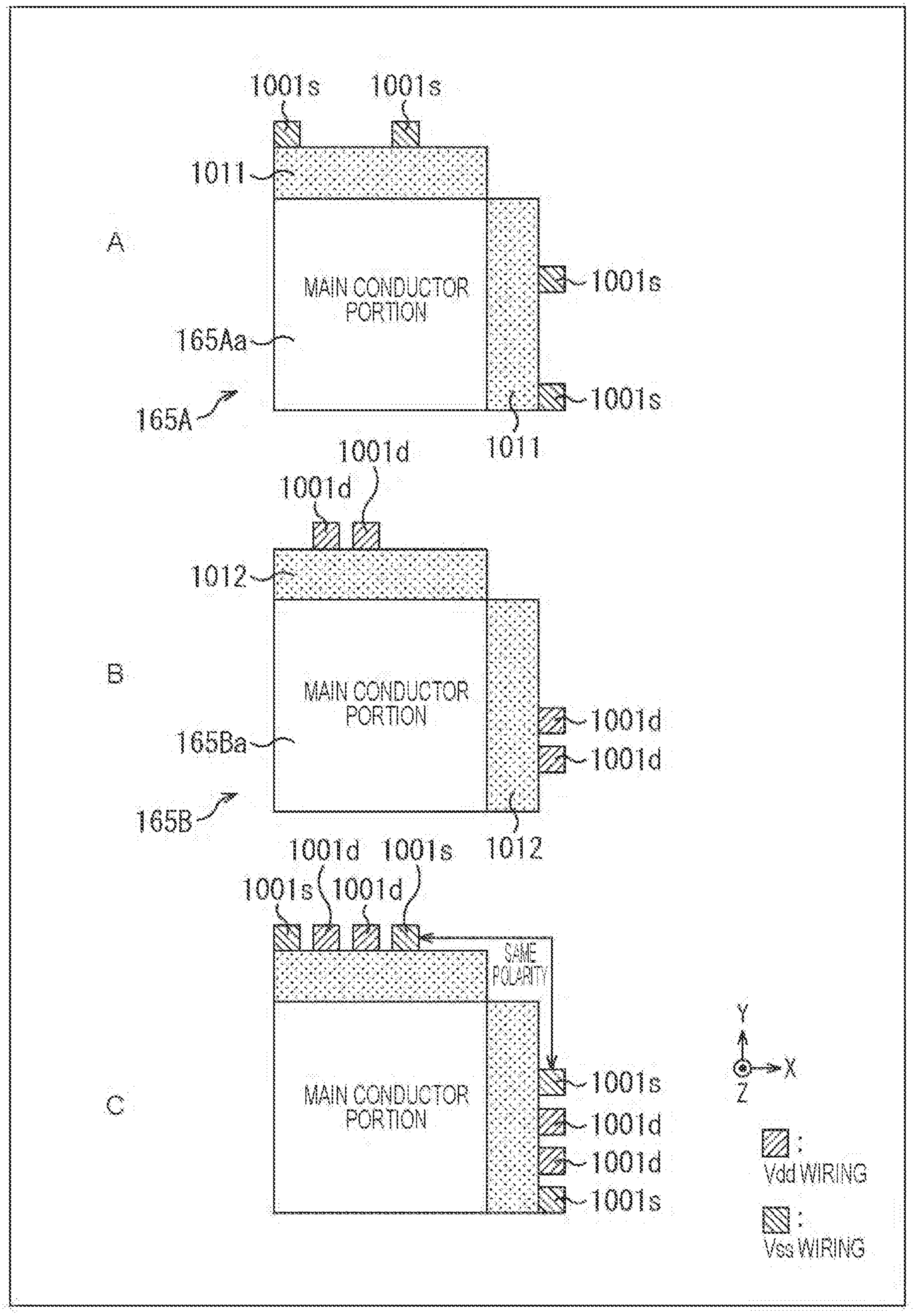
FIG. 106 is plan views illustrating a seventeenth arrangement example of pads.

FIG. 106 illustrates a seventeenth arrangement example of pads.

A in FIG. 106 is a plan view illustrating an arrangement example of the conductor layer A (wiring layer 165A) and the pads 1001*s* connected to the conductor layer A.

B in FIG. 106 is a plan view illustrating an arrangement example of the conductor layer B (wiring layer 165B) and the pads 1001*d* connected to the conductor layer B.

C in FIG. 106 is a plan view of a state in which the conductor layers A and B and the pads 1001*s* and 1001*d* respectively illustrated in A and B in FIG. 106 are stacked.

In FIG. 106, the pad 1001*s* represents, for example, the pad 1001 to which GND or a negative power supply is supplied, and the pad 1001*d* represents, for example, the pad 1001 to which a positive power supply is supplied.

As illustrated in A in FIG. 106, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in B in FIG. 106, a plurality of the pads 1001*d* is connected to adjacent two sides of the rectangular main conductor portion 165Ba at predetermined intervals via the conductor 1012 having a shape optionally including a predetermined repeating pattern. Each pad 1001*d* may be configured by the lead-out conductor portion 165Bb or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in C in FIG. 106, in the state where the conductor layers A and B are stacked, the arrangement of the pads 1001*s* and 1001*d* is a mirror-symmetrical arrangement in which a set of pads 1001 is folded back in the Y direction and sequentially arranged, where four consecutive pads 1001*s* and 1001*d* are set as one set, as in the pad arrangement example illustrated in C in FIG. 95. Furthermore, among the pads 1001*s* and pads 1001*d* mirror-symmetrically arranged on the two sides, the polarities of the pads 1001 at the ends of the two sides are both the pads 1001*s* connected to the GND or the negative power supply. In this way, among the plurality of pads 1001 on the two sides in which the pads 1001*s* and the pads 1001*d* are mirror-symmetrically arranged, the polarities of the pads 1001 at the ends closest to a corner of the substrate 1000 are the same polarity, and the pads 1001*s* with the polarity having higher ESD resistance are adopted, whereby the ESD resistance can be enhanced. Furthermore, with the mirror-symmetrical arrangement, the impedance difference between the Vss wiring and the Vdd wiring becomes small and the current difference becomes small, so that the inductive noise can be further improved as compared with the sixteenth arrangement example in FIG. 105.

Note that the polarities of the pads 1001 at the ends of the two sides where the pad 1001*s* and the pad 1001*d* are mirror-symmetrically arranged are favorably set to the pads 1001*s* connected to the GND or the negative power supply, for example, in consideration of the ESD resistance. However, the pads 1001 may be set to the pads 1001*d* connected to the positive power supply, for example.

Eighteenth Arrangement Example of Pads

Figure 107:
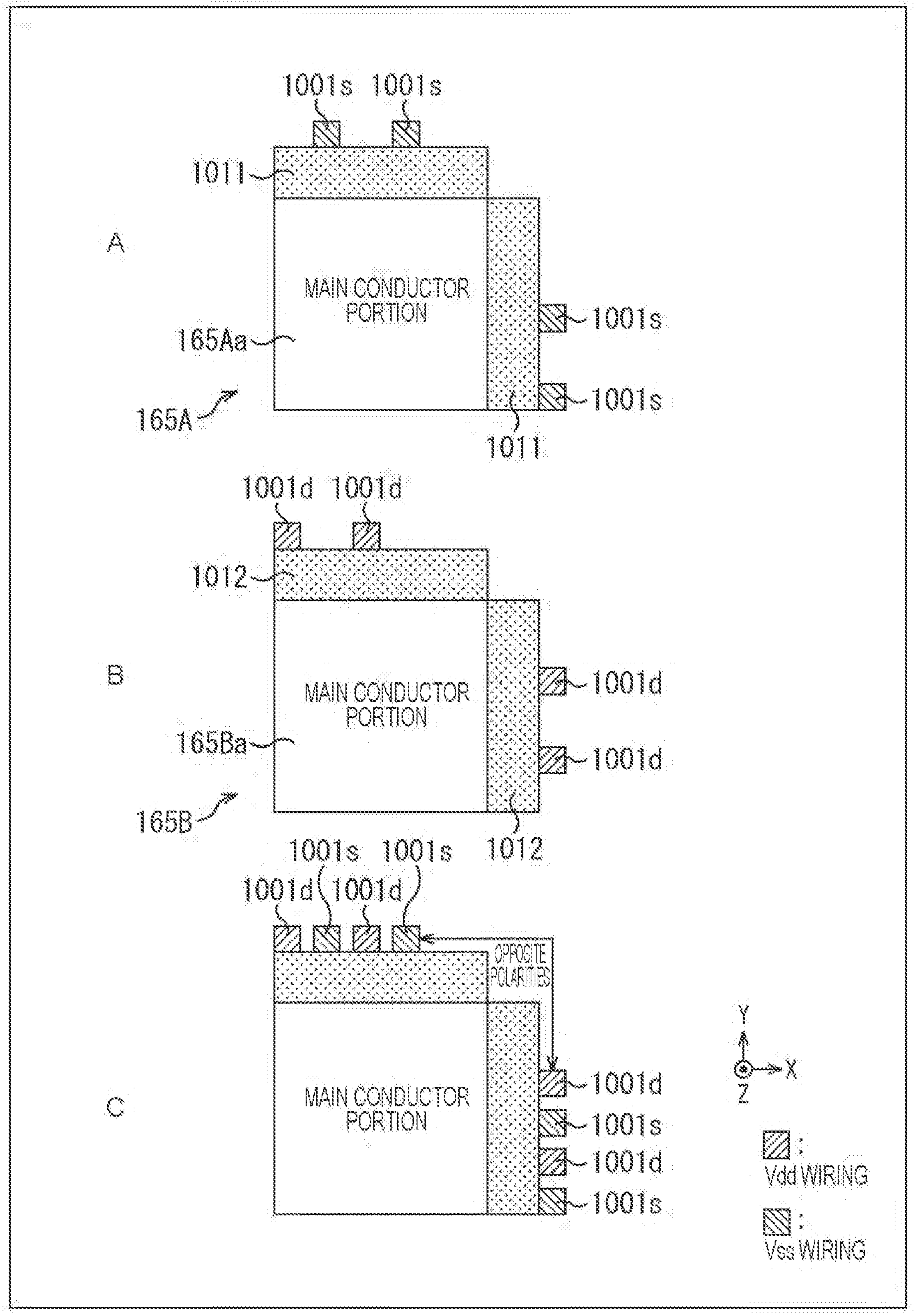
FIG. 107 is plan views illustrating an eighteenth arrangement example of pads.

FIG. 107 illustrates an eighteenth arrangement example of pads.

A in FIG. 107 is a plan view illustrating an arrangement example of the conductor layer A (wiring layer 165A) and the pads 1001*s* connected to the conductor layer A.

B in FIG. 107 is a plan view illustrating an arrangement example of the conductor layer B (wiring layer 165B) and the pads 1001*d* connected to the conductor layer B.

C in FIG. 107 is a plan view of a state in which the conductor layers A and B and the pads 1001*s* and 1001*d* respectively illustrated in A and B in FIG. 107 are stacked.

In FIG. 107, the pad 1001*s* represents, for example, the pad 1001 to which GND or a negative power supply is supplied, and the pad 1001*d* represents, for example, the pad 1001 to which a positive power supply is supplied.

As illustrated in A in FIG. 107, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in B in FIG. 107, a plurality of the pads 1001*d* is connected to adjacent two sides of the rectangular main conductor portion 165Ba at predetermined intervals via the conductor 1012 having a shape optionally including a predetermined repeating pattern. Each pad 1001*d* may be configured by the lead-out conductor portion 165Bb or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in C in FIG. 107, in the state where the conductor layers A and B are stacked, the arrangement of the pads 1001*s* and 1001*d* is an alternate arrangement in which the pad 1001*s* and the pad 1001*d* are alternately arranged, similarly to the pad arrangement example illustrated in FIG. 105. However, among the pads 1001*s* and the pads 1001*d* arranged on the two sides, the polarities of the pads 1001 at the ends of the two sides are opposite polarities of the pad 1001*s* and the pad 1001*d*, which is different from the pad arrangement example illustrated in FIG. 105. By setting the polarities of the pads 1001 at the ends closest to a corner of the substrate 1000 to the opposite polarities among the plurality of pads 1001 on the two sides where the pad 1001*s* and the pad 1001*d* are alternately arranged, the impedance difference between the Vss wiring and the Vdd wiring can be further reduced and the current difference further becomes smaller, whereby the inductive noise can be further improved as compared with the seventeenth arrangement example in FIG. 106.

Nineteenth Arrangement Example of Pads

Figure 108:
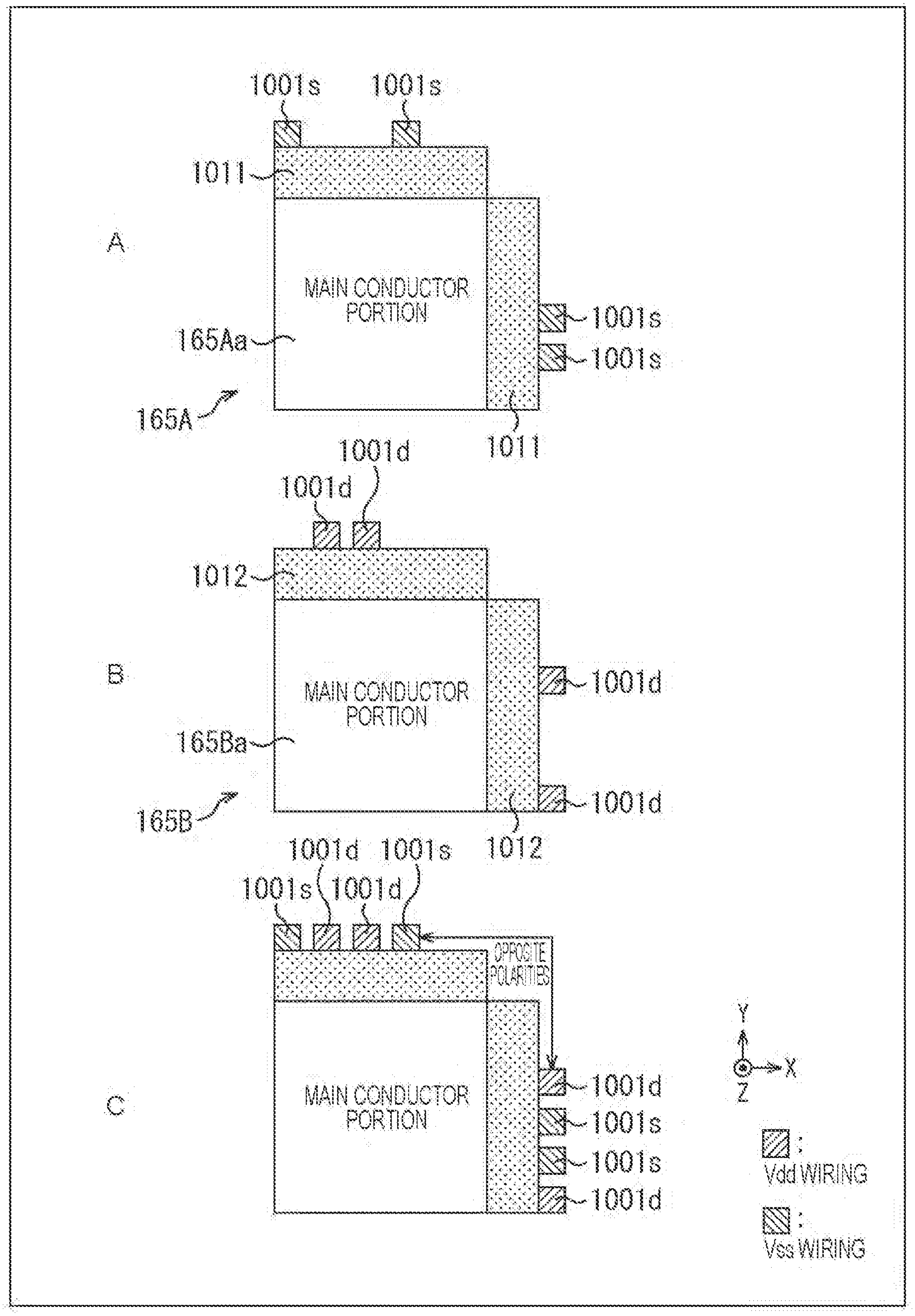
FIG. 108 is plan views illustrating a nineteenth arrangement example of pads.

FIG. 108 illustrates a nineteenth arrangement of pads.

A in FIG. 108 is a plan view illustrating an arrangement example of the conductor layer A (wiring layer 165A) and the pads 1001*s* connected to the conductor layer A.

B in FIG. 108 is a plan view illustrating an arrangement example of the conductor layer B (wiring layer 165B) and the pads 1001*d* connected to the conductor layer B.

C in FIG. 108 is a plan view of a state in which the conductor layers A and B and the pads 1001*s* and 1001*d* respectively illustrated in A and B in FIG. 108 are stacked.

In FIG. 108, the pad 1001*s* represents, for example, the pad 1001 to which GND or a negative power supply is supplied, and the pad 1001*d* represents, for example, the pad 1001 to which a positive power supply is supplied.

As illustrated in A in FIG. 108, a plurality of the pads 1001*s* is connected to adjacent two sides of the rectangular main conductor portion 165Aa at predetermined intervals via the conductor 1011 having a shape optionally including a predetermined repeating pattern. Each pad 1001*s* may be configured by the lead-out conductor portion 165Ab or the conductor 1011 may be configured by the lead-out conductor portion 165Ab. Furthermore, in the case where the pad 1001*s* is the lead-out conductor portion 165Ab, the conductor 1011 may be omitted or may be present.

As illustrated in B in FIG. 108, a plurality of the pads 1001*d* is connected to adjacent two sides of the rectangular main conductor portion 165Ba at predetermined intervals via the conductor 1012 having a shape optionally including a predetermined repeating pattern. Each pad 1001*d* may be configured by the lead-out conductor portion 165Bb or the conductor 1012 may be configured by the lead-out conductor portion 165Bb. Furthermore, in the case where the pad 1001*d* is the lead-out conductor portion 165Bb, the conductor 1012 may be omitted or may be present.

As illustrated in C in FIG. 108, in the state where the conductor layers A and B are stacked, the arrangement of the pads 1001*s* and 1001*d* is a mirror-symmetrical arrangement of the pads 1001*s* and the pads 1001*d*, similarly to the pad arrangement example illustrated in FIG. 106. However, among the pads 1001*s* and the pads 1001*d* arranged on the two sides, the polarities of the pads 1001 at the ends of the two sides are opposite polarities of the pad 1001*s* and the pad 1001*d*, which is different from the pad arrangement example illustrated in FIG. 106. By setting the polarities of the pads 1001 at the ends closest to a corner of the substrate 1000 to the opposite polarities among the plurality of pads 1001 on the two sides where the pad 1001*s* and the pad 1001*d* are mirror-symmetrically arranged, the impedance difference between the Vss wiring and the Vdd wiring can be further reduced and the current difference further becomes smaller, whereby the inductive noise can be further improved as compared with the seventeenth arrangement example in FIG. 106.

In the sixteenth to nineteenth arrangement examples of pads described with reference to FIGS. 105 to 108, the examples in which the plurality of pads 1001 is arranged on the adjacent two sides of the rectangular main conductor portion 165*a* at predetermined intervals via the conductor 1011 or 1012 have been described. However, the sides on which the pads 1001 are arranged are not limited to two sides and may be three or four sides.

Furthermore, in the sixteenth to nineteenth arrangement examples described with reference to FIGS. 105 to 108, the alternate arrangement in FIG. 93 and the two-stage mirror arrangement in FIG. 95 have been adopted as the form of the pads 1001 arranged on one side. However, a form in which the one-stage mirror arrangement in FIG. 94 is adopted, and the polarities of the pads 1001 at the ends closest to a corner are set to the same polarities or opposite polarities may be adopted.

Moreover, in the sixteenth to nineteenth arrangement examples described with reference to FIGS. 105 to 108, the lead-out conductor portion 165*b* has been omitted. However, a form in which the alternate arrangement in FIG. 93, the one-stage mirror arrangement in FIG. 94, or the two-stage mirror arrangement in FIG. 95 is adopted for the configuration provided with the lead-out conductor portion 165*b* on a side of the rectangular main conductor portion 165Aa as in FIGS. 96 to 104, and the polarities of the pads 1001 at the ends closest to a corner are set to the same polarities or opposite polarities may be adopted.

Note that the lead-out conductor portions 165Ab and 165Bb and the conductors 1011 and 1012 are favorably configured such that, but not limited to, the GND or the negative power supply is supplied from the pad 1001*s* to the main conductor portion 165Aa, and the positive power supply of the opposite polarity is supplied from the pad 1001*d* to the main conductor portion 165Ba. In other words, the lead-out conductor portions 165Ab and 165Bb and the conductors 1011 and 1012 are favorably configured such that, but not limited to, the GND or the negative power supply and the positive power supply of the opposite polarity supplied from the pads 1001 are not completely short-circuited. Note that at least some of FIGS. 92 to 108 illustrate the example of arranging the plurality of pads 1001*s*, the example of arranging the plurality of pads 1001*d*, the example of arranging the plurality of conductors 1011, the example of arranging the plurality of conductors 1012, the example of arranging the plurality of lead-out conductor portions 165Ab, the example of arranging the plurality of lead-out conductor portions 165Bb, and the like. In each drawing, all the pads 1001*s* may be the same, not all the pads 1001*s* need to be the same, all the pads 1001*d* may be the same, not all the pads 1001*d* need to be the same, all the conductors 1011 may be the same, not all the conductors 1011 need to be the same, all the conductors 1012 may be the same, not all the conductors 1012 need to be the same, all the lead-out conductor portions 165Ab may be the same, not all the lead-out conductor portions 165Ab need to be the same, all the lead-out conductor portions 165Bb may be the same, and not all the lead-out conductor portions 165Bb need to be the same. Note that it is desirable but not limited to satisfy at least any one of the following: the total number of pads 1001*s* and the total number of pads 1001*d* directly or indirectly connected to the main conductor portion 165*a* in the substrate 1000 are the same or substantially the same, the total number of pads 1001*s* and the total number of pads 1001*d* directly or indirectly connected to the main conductor portion 165*a* on predetermined adjacent two sides of the substrate 1000 are the same or substantially the same, the total number of pads 1001*s* and the total number of pads 1001*d* directly or indirectly connected to the main conductor portion 165*a* on predetermined facing two sides of the substrate 1000 are the same or substantially the same, the total number of pads 1001*s* and the total number of pads 1001*d* directly or indirectly connected to the main conductor portion 165*a* on a predetermined side of the substrate 1000 are the same or substantially the same, the total number of pads 1001*s* and the total number of pads 1001*d* directly or indirectly connected to at least two lead-out conductor portions 165*b* on predetermined adjacent two sides of the substrate 1000 are the same or substantially the same, the total number of pads 1001*s* and the total number of pads 1001*d* directly or indirectly connected to at least two lead-out conductor portions 165*b* on predetermined facing two sides of the substrate 1000 are the same or substantially the same, the total number of pads 1001*s* and the total number of pads 1001*d* directly or indirectly connected to at least one lead-out conductor portion 165*b* on a predetermined side of the substrate 1000 are the same or substantially the same, the total number of pads 1001*s* and the total number of pads 1001*d* directly or indirectly connected to at least two sets of conductors 1011 and 1012 on predetermined adjacent two sides of the substrate 1000 are the same or substantially the same, the total number of pads 1001*s* and the total number of pads 1001*d* directly or indirectly connected to at least two sets of conductors 1011 and 1012 on predetermined facing two sides of the substrate 1000 are the same or substantially the same, or the total number of pads 1001*s* and the total number of pads 1001*d* directly or indirectly connected to at least one set of conductors 1011 and 1012 on a predetermined side of the substrate 1000 are the same or substantially the same. For example, the total number of pads 1001*s* and the total number of pads 1001*d* may not be the same, or the total number of pads 1001*s* and the total number of pads 1001*d* may not be substantially the same.

Figure 109:
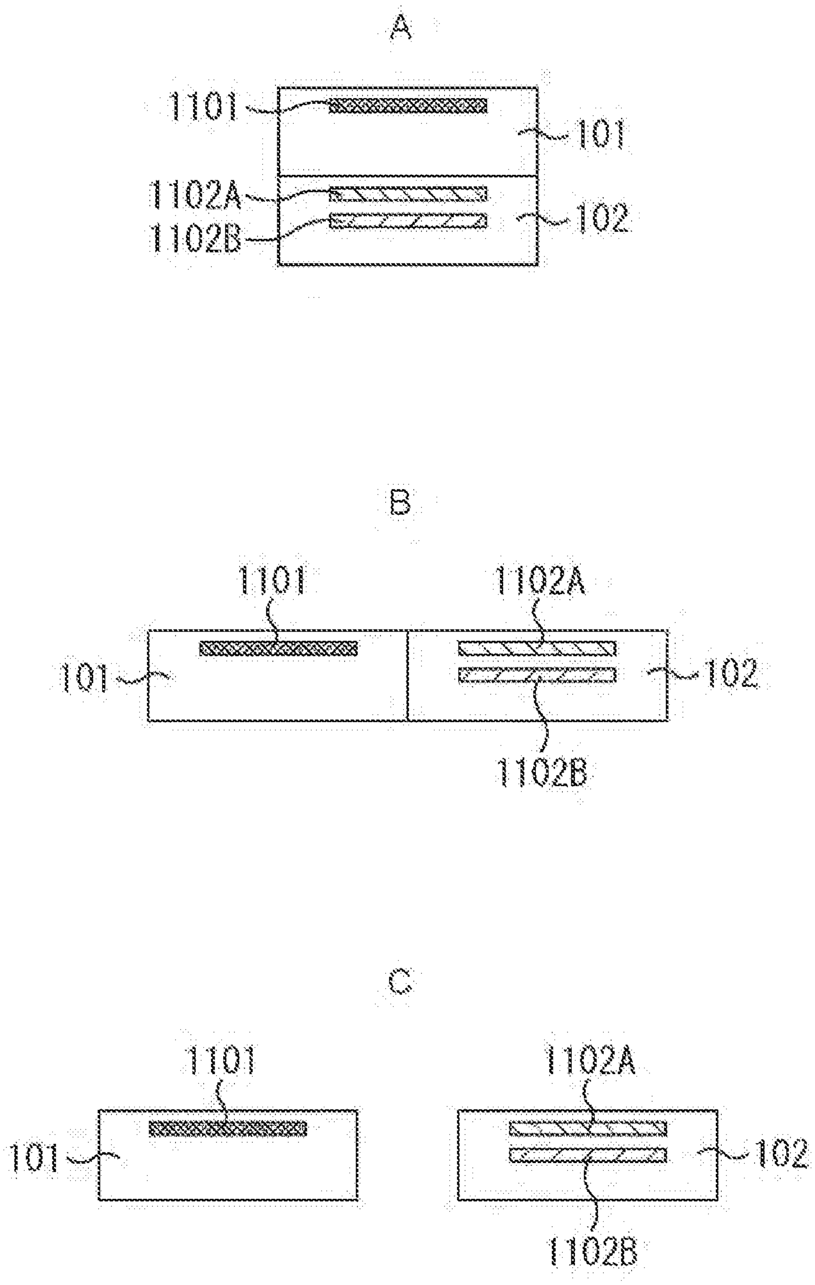
FIG. 109 is cross-sectional views illustrating substrate arrangement examples of a Victim conductor loop and an Aggressor conductor loop.

Substrate Arrangement Example of Victim Conductor Loop and Aggressor Conductor Loop FIG. 109 illustrates substrate arrangement examples of the Victim conductor loop and the Aggressor conductor loop.

A in FIG. 109 is a cross-sectional view schematically illustrating a substrate arrangement example of the Victim conductor loop and the Aggressor conductor loop.

In each of the above-described configuration examples, as illustrated in A in FIG. 109, a Victim conductor loop 1101 being included in the first semiconductor substrate 101, Aggressor conductor loops 1102A and 1102B being included in the second semiconductor substrate 102, and the stacked structure of the first semiconductor substrate 101 and the second semiconductor substrate 102 have been described.

However, a structure in which the first semiconductor substrate 101 and the second semiconductor substrate 102 are not stacked, and the first semiconductor substrate 101 and the second semiconductor substrate 102 are arranged adjacent to each other as illustrated in B in FIG. 109, or a structure in which the first semiconductor substrate 101 and the second semiconductor substrate 102 are arranged on the same plane with a predetermined interval as illustrated in C in FIG. 109 may be adopted.

Figure 110:
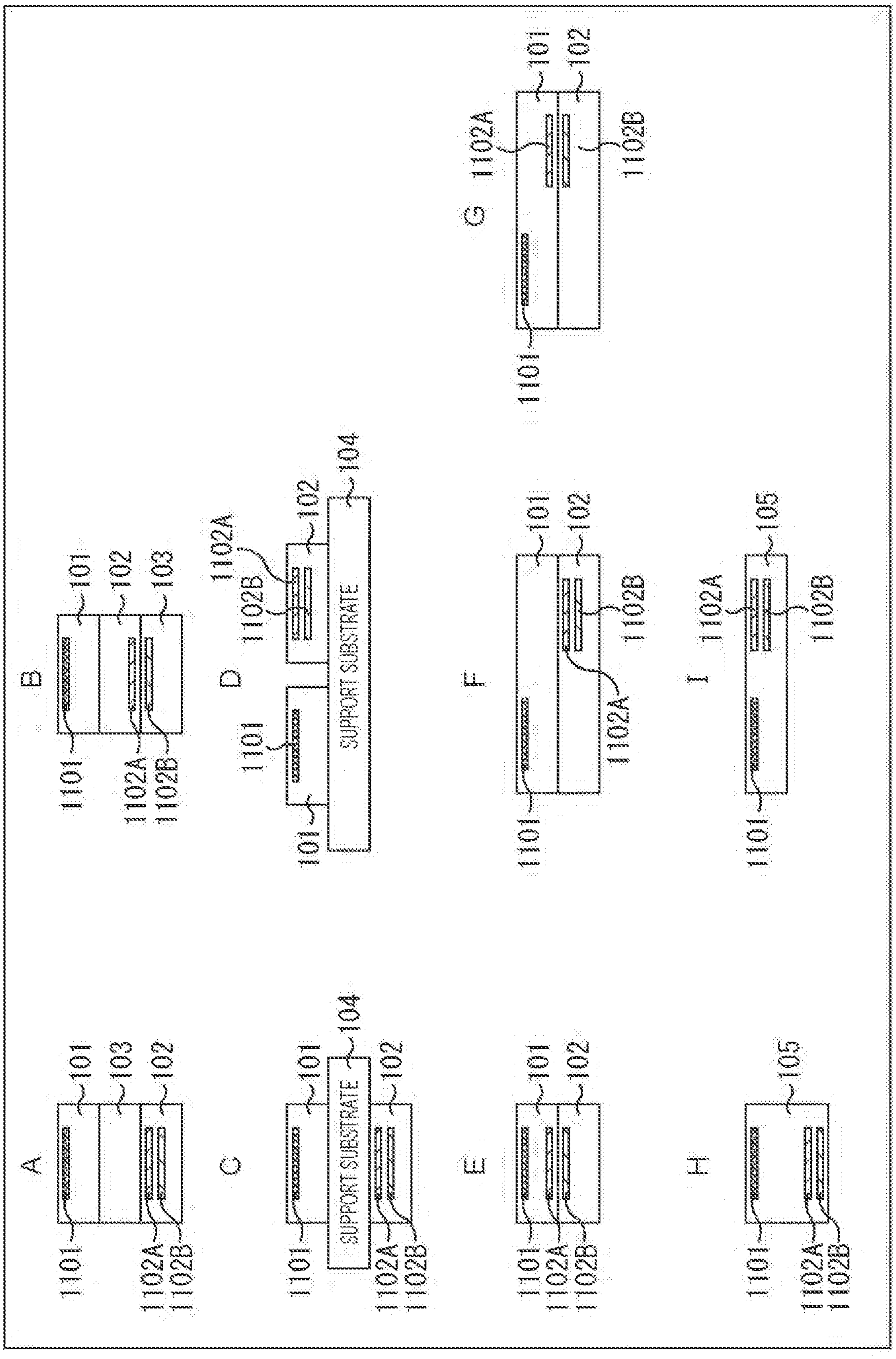
FIG. 110 is cross-sectional views illustrating substrate arrangement examples of a Victim conductor loop and an Aggressor conductor loop.

Moreover, as the substrate arrangement of the Victim conductor loop and the Aggressor conductor loop, various arrangement configurations as illustrated in A to I in FIG. 110 can be adopted.

A in FIG. 110 illustrates a structure in which the Victim conductor loop 1101 is included in the first semiconductor substrate 101, the Aggressor conductor loops 1102A and 1102B are included in the second semiconductor substrate 102, a third semiconductor substrate 103 is inserted between the first semiconductor substrate 101 and the second semiconductor substrate 102, and the first semiconductor substrate 101 to the third semiconductor substrate 103 are stacked.

B in FIG. 110 illustrates a structure in which the Victim conductor loop 1101 is included in the first semiconductor substrate 101, the Aggressor conductor loop 1102A is included in the second semiconductor substrate 102, the Aggressor conductor loop 1102B is included in the third semiconductor substrate 103, and the first semiconductor substrate 101 to the third semiconductor substrate 103 are stacked in that order.

C in FIG. 110 illustrates a structure in which the Victim conductor loop 1101 is included in the first semiconductor substrate 101, the Aggressor conductor loops 1102A and 1102B are included in the second semiconductor substrate 102, a support substrate 104 is inserted between the first semiconductor substrate 101 and the second semiconductor substrate 102, and the first semiconductor substrate 101, the support substrate 104, and the second semiconductor substrate 102 are stacked in this order. The support substrate 104 may be omitted, and the first semiconductor substrate 101 and the second semiconductor substrate 102 may be arranged with a predetermined gap.

D in FIG. 110 illustrates a structure in which the Victim conductor loop 1101 is included in the first semiconductor substrate 101, the Aggressor conductor loops 1102A and 1102B are included in the second semiconductor substrate 102, and the first semiconductor substrate 101 and the second semiconductor substrate 102 are placed on the support substrate 104 and arranged on the same plane with a predetermined interval. The support substrate 104 may be omitted, and the first semiconductor substrate 101 and the second semiconductor substrate 102 may be supported to be arranged in the same plane at different places.

E in FIG. 110 illustrates a structure in which the Victim conductor loop 1101 and Aggressor conductor loop 1102A are included in the first semiconductor substrate 101, the Aggressor conductor loop 1102B is included in the second semiconductor substrate 102, and the first semiconductor substrate 101 and the second semiconductor substrate 102 are stacked. Here, the region on the XY plane where the Victim conductor loop 1101 is formed in the first semiconductor substrate 101 at least partly overlaps with the region on the XY plane where the Aggressor conductor loops 1102A and 1102B are formed in the second semiconductor substrate 102.

F in FIG. 110 illustrates a structure in which the Victim conductor loop 1101 is included in the first semiconductor substrate 101, the Aggressor conductor loops 1102A and 1102B are included in the second semiconductor substrate 102, and the first semiconductor substrate 101 and the second semiconductor substrate 102 are stacked. Here, the region on the XY plane where the Victim conductor loop 1101 is formed in the first semiconductor substrate 101 may be completely different from or partly overlap with the region on the XY plane where the Aggressor conductor loops 1102A and 1102B are formed in the second semiconductor substrate 102.

G in FIG. 110 illustrates a structure in which the Victim conductor loop 1101 and Aggressor conductor loop 1102A are included in the first semiconductor substrate 101, the Aggressor conductor loop 1102B is included in the second semiconductor substrate 102, and the first semiconductor substrate 101 and the second semiconductor substrate 102 are stacked. Here, the region on the XY plane where the Victim conductor loop 1101 is formed in the first semiconductor substrate 101 is different from the region on the XY plane where the Aggressor conductor loops 1102A and 1102B are formed.

H in FIG. 110 illustrates a structure in which the Victim conductor loop 1101 and the Aggressor conductor loops 1102A and 1102B are included in one semiconductor substrate 105. Note that the region on the XY plane where the Victim conductor loop 1101 is formed in the one semiconductor substrate 105 at least partly overlaps with the region on the XY plane where the Aggressor conductor loops 1102A and 1102B are formed.

I in FIG. 110 illustrates a structure in which the Victim conductor loop 1101 and the Aggressor conductor loops 1102A and 1102B are included in one semiconductor substrate 105. Note that the region on the XY plane where the Victim conductor loop 1101 is formed in the one semiconductor substrate 105 is different from the region on the XY plane where the Aggressor conductor loops 1102A and 1102B are formed.

The stacking order of the substrates illustrated in A to I in FIG. 110 may be inverted, and the positions of the Victim conductor loop 1101 and the Aggressor conductor loops 1102A and 1102B may be made upside down.

As described above, the number and arrangement of the semiconductor substrates including the Victim conductor loop 1101 and the Aggressor conductor loops 1102A and 1102B, and the presence or absence of the support substrate can have various structures.

The Aggressor conductor loop that generates the magnetic flux passing through the loop plane of the Victim conductor loop may or may not overlap with the Victim conductor loop. Moreover, the Aggressor conductor loop may be formed in a plurality of semiconductor substrates stacked on the semiconductor substrate in which the Victim conductor loop is formed, or may be formed in the same semiconductor substrate as the Victim conductor loop.

Moreover, the Aggressor conductor loop is not a semiconductor substrate, and for example, various substrates such as a printed circuit board, a flexible printed circuit board, an interposer substrate, a package substrate, an inorganic substrate, and an organic substrate are conceivable. However, it is sufficient that any substrate may be used as long as the substrate includes a conductor or can form a conductor, and may exist in a circuit other than the semiconductor substrate such as a package in which the semiconductor substrate is sealed. In general, the distance of the Aggressor conductor loop to the Victim conductor loop becomes shorter in the order of the case where the Aggressor conductor loop is formed in the semiconductor substrate, the case where the Aggressor conductor loop is formed in the package, and the case where the Aggressor conductor loop is formed in the printed circuit board. Since the inductive noise and capacitive noise that can occur in the Victim conductor loop are more likely to increase as the distance of the Aggressor conductor loop to the Victim conductor loop is shorter, the present technology can be more effective as the distance of the Aggressor conductor loop to the Victim conductor loop is shorter. Moreover, application of the present technology is not limited to the substrates. The present technology can be applied to conductors themselves represented by wires and plates, such as bonding wires, lead wires, antenna wires, power wires, GND wires, coaxial wires, dummy wires, and sheet metal.

Figure 111:
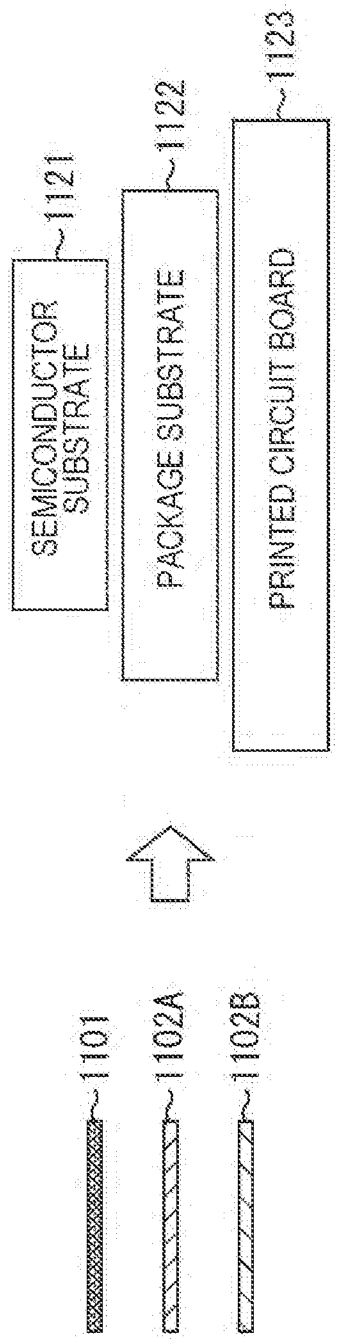
FIG. 111 is diagrams illustrating arrangement examples of the Victim conductor loop and the Aggressor conductor loop in a structure in which three types of substrates are stacked.

Next, as illustrated in FIG. 111, in a structure in which three types of substrates: a semiconductor substrate 1121, a package substrate 1122, and a printed circuit board 1123 are stacked, examples of arranging a conductor 1101 (hereinafter referred to as Victim conductor loop 1101), which is at least a part of the Victim conductor loop, and conductors 1102A and 1102B that are at least a part of the Aggressor conductor loop (hereinafter referred to as Aggressor conductor loops 1102A and 1102B) will be described. Note that although not shown, the Victim conductor loop or Aggressor conductor loop may include at least conductors arranged in two or more of the semiconductor substrate 1121, the package substrate 1122, and the printed circuit board 1123. The semiconductor substrate 1121 can be replaced with any of a package substrate, an interposer substrate, a printed circuit board, a flexible printed circuit board, an inorganic substrate, an organic substrate, a substrate including a conductor, or a substrate capable of forming a conductor. Furthermore, the package substrate 1122 can be replaced with any of a semiconductor substrate, an interposer substrate, a printed circuit board, a flexible printed circuit board, an inorganic substrate, an organic substrate, a substrate including a conductor, or a substrate capable of forming a conductor. Moreover, the printed circuit board 1123 can be replaced with any of a semiconductor substrate, a package substrate, an interposer substrate, a flexible printed circuit board, an inorganic substrate, an organic substrate, a substrate including a conductor, or a substrate capable of forming a conductor.

Figure 112:
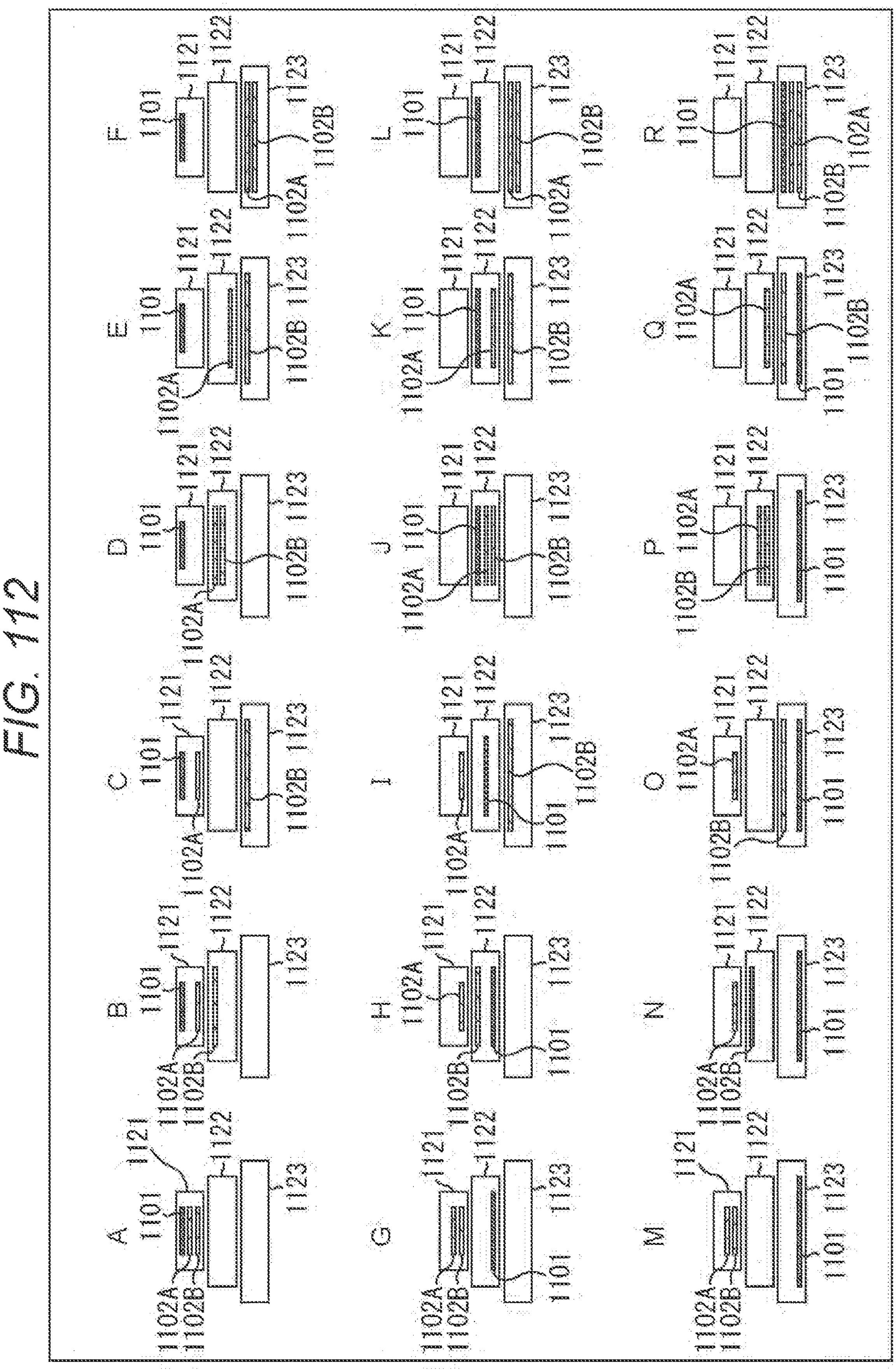
FIG. 112 is diagrams illustrating arrangement examples of the Victim conductor loop and the Aggressor conductor loop in a structure in which three types of substrates are stacked.

A to R in FIG. 112 illustrate arrangement examples of the Victim conductor loop and the Aggressor conductor loop in a stacked structure in which the three types of substrates illustrated in FIG. 111 are stacked.

A in FIG. 112 illustrates a schematic diagram of a stacked structure in which the Victim conductor loop 1101 and the Aggressor conductor loops 1102A and 1102B are all included in the semiconductor substrate 1121. The package substrate 1122 and the printed circuit board 1123 in which none of the Victim conductor loop 1101 and the Aggressor conductor loops 1102A and 1102B are formed may be omitted.

B in FIG. 112 illustrates a schematic diagram of a stacked structure in which the Victim conductor loop 1101 and the Aggressor conductor loop 1102A are included in the semiconductor substrate 1121 and the Aggressor conductor loop 1102B is included in the package substrate 1122. The printed circuit board 1123 in which none of the Victim conductor loop 1101 and the Aggressor conductor loops 1102A and 1102B are formed may be omitted.

C in FIG. 112 illustrates a schematic diagram of a stacked structure in which the Victim conductor loop 1101 and the Aggressor conductor loop 1102A are included in the semiconductor substrate 1121 and the Aggressor conductor loop 1102B is included in the printed circuit board 1123. The package substrate 1122 in which none of the Victim conductor loop 1101 and the Aggressor conductor loops 1102A and 1102B are formed may be omitted.

D in FIG. 112 illustrates a schematic diagram of a stacked structure in which the Victim conductor loop 1101 is included in the semiconductor substrate 1121 and the Aggressor conductor loops 1102A and 1102B are included in the package substrate 1122. The printed circuit board 1123 in which none of the Victim conductor loop 1101 and the Aggressor conductor loops 1102A and 1102B are formed may be omitted.

E in FIG. 112 illustrates a schematic diagram of a stacked structure in which the Victim conductor loop 1101 is included in the semiconductor substrate 1121, the Aggressor conductor loop 1102A is included in the package substrate 1122, and the Aggressor conductor loop 1102B is included in the printed circuit board 1123.

F in FIG. 112 illustrates a schematic diagram of a stacked structure in which the Victim conductor loop 1101 is included in the semiconductor substrate 1121 and the Aggressor conductor loops 1102A and 1102B are included in the printed circuit board 1123. The package substrate 1122 in which none of the Victim conductor loop 1101 and the Aggressor conductor loops 1102A and 1102B are formed may be omitted.

G in FIG. 112 illustrates a schematic diagram of a stacked structure in which the Aggressor conductor loops 1102A and 1102B are included in the semiconductor substrate 1121 and the Victim conductor loop 1101 is included in the package substrate 1122. The printed circuit board 1123 in which none of the Victim conductor loop 1101 and the Aggressor conductor loops 1102A and 1102B are formed may be omitted.

H in FIG. 112 illustrates a schematic diagram of a stacked structure in which the Aggressor conductor loop 1102A is included in the semiconductor substrate 1121 and the Aggressor conductor loop 1102B and the Victim conductor loop 1101 are included in the package substrate 1122. The printed circuit board 1123 in which none of the Victim conductor loop 1101 and the Aggressor conductor loops 1102A and 1102B are formed may be omitted.

I in FIG. 112 illustrates a schematic diagram of a stacked structure in which the Aggressor conductor loop 1102A is included in the semiconductor substrate 1121, the Victim conductor loop 1101 is included in the package substrate 1122, and the Aggressor conductor loop 1102B is included in the printed circuit board 1123.

J in FIG. 112 illustrates a schematic diagram of a stacked structure in which the Victim conductor loop 1101 and the Aggressor conductor loops 1102A and 1102B are all included in the package substrate 1122. The semiconductor substrate 1121 and the printed circuit board 1123 in which none of the Victim conductor loop 1101 and the Aggressor conductor loops 1102A and 1102B are formed may be omitted.

K in FIG. 112 illustrates a schematic diagram of a stacked structure in which the Victim conductor loop 1101 and the Aggressor conductor loop 1102A are included in the package substrate 1122 and the Aggressor conductor loop 1102B is included in the printed circuit board 1123. The semiconductor substrate 1121 in which none of the Victim conductor loop 1101 and the Aggressor conductor loops 1102A and 1102B are formed may be omitted.

L in FIG. 112 illustrates a schematic diagram of a stacked structure in which the Victim conductor loop 1101 is included in the package substrate 1122 and the Aggressor conductor loops 1102A and 1102B are included in the printed circuit board 1123. The semiconductor substrate 1121 in which none of the Victim conductor loop 1101 and the Aggressor conductor loops 1102A and 1102B are formed may be omitted.

M in FIG. 112 illustrates a schematic diagram of a stacked structure in which the Aggressor conductor loops 1102A and 1102B are included in the semiconductor substrate 1121 and the Victim conductor loop 1101 is included in the printed circuit board 1123. The package substrate 1122 in which none of the Victim conductor loop 1101 and the Aggressor conductor loops 1102A and 1102B are formed may be omitted.

N in FIG. 112 illustrates a schematic diagram of a stacked structure in which the Aggressor conductor loop 1102A is included in the semiconductor substrate 1121, the Aggressor conductor loop 1102B is included in the package substrate 1122, and the Victim conductor loop 1101 is included in the printed circuit board 1123.

O in FIG. 112 illustrates a schematic diagram of a stacked structure in which the Aggressor conductor loop 1102A is included in the semiconductor substrate 1121 and the Aggressor conductor loop 1102B and the Victim conductor loop 1101 are included in the printed circuit board 1123. The package substrate 1122 in which none of the Victim conductor loop 1101 and the Aggressor conductor loops 1102A and 1102B are formed may be omitted.

P in FIG. 112 illustrates a schematic diagram of a stacked structure in which Aggressor conductor loops 1102A and 1102B are included in the package substrate 1122 and the Victim conductor loop 1101 is included in the printed circuit board 1123. The semiconductor substrate 1121 in which none of the Victim conductor loop 1101 and the Aggressor conductor loops 1102A and 1102B are formed may be omitted.

Q in FIG. 112 illustrates a schematic diagram of a stacked structure in which the Aggressor conductor loop 1102A is included in the package substrate 1122 and the Aggressor conductor loop 1102B and the Victim conductor loop 1101 are included in the printed circuit board 1123. The semiconductor substrate 1121 in which none of the Victim conductor loop 1101 and the Aggressor conductor loops 1102A and 1102B are formed may be omitted.

R in FIG. 112 illustrates a schematic diagram of a stacked structure in which the Victim conductor loop 1101 and the Aggressor conductor loops 1102A and 1102B are all included in the printed circuit board 1123. The semiconductor substrate 1121 and the package substrate 1122 in which none of the Victim conductor loop 1101 and the Aggressor conductor loops 1102A and 1102B are formed may be omitted.

The stacking order of the substrates illustrated in A to R in FIG. 112 may be inverted, and the positions of the Victim conductor loop 1101 and the Aggressor conductor loop 1102A or the Aggressor conductor loop 1102B may be made upside down.

As described above, the Victim conductor loop 1101 and the Aggressor conductor loops 1102A and 1102B can be formed in any region of the semiconductor substrate 1121, the package substrate 1122, and the printed circuit board 1123.

Package Stacking Examples of First Semiconductor Substrate 101 and Second Semiconductor Substrate 102 Forming Solid-State Imaging Device 100

Figure 113:
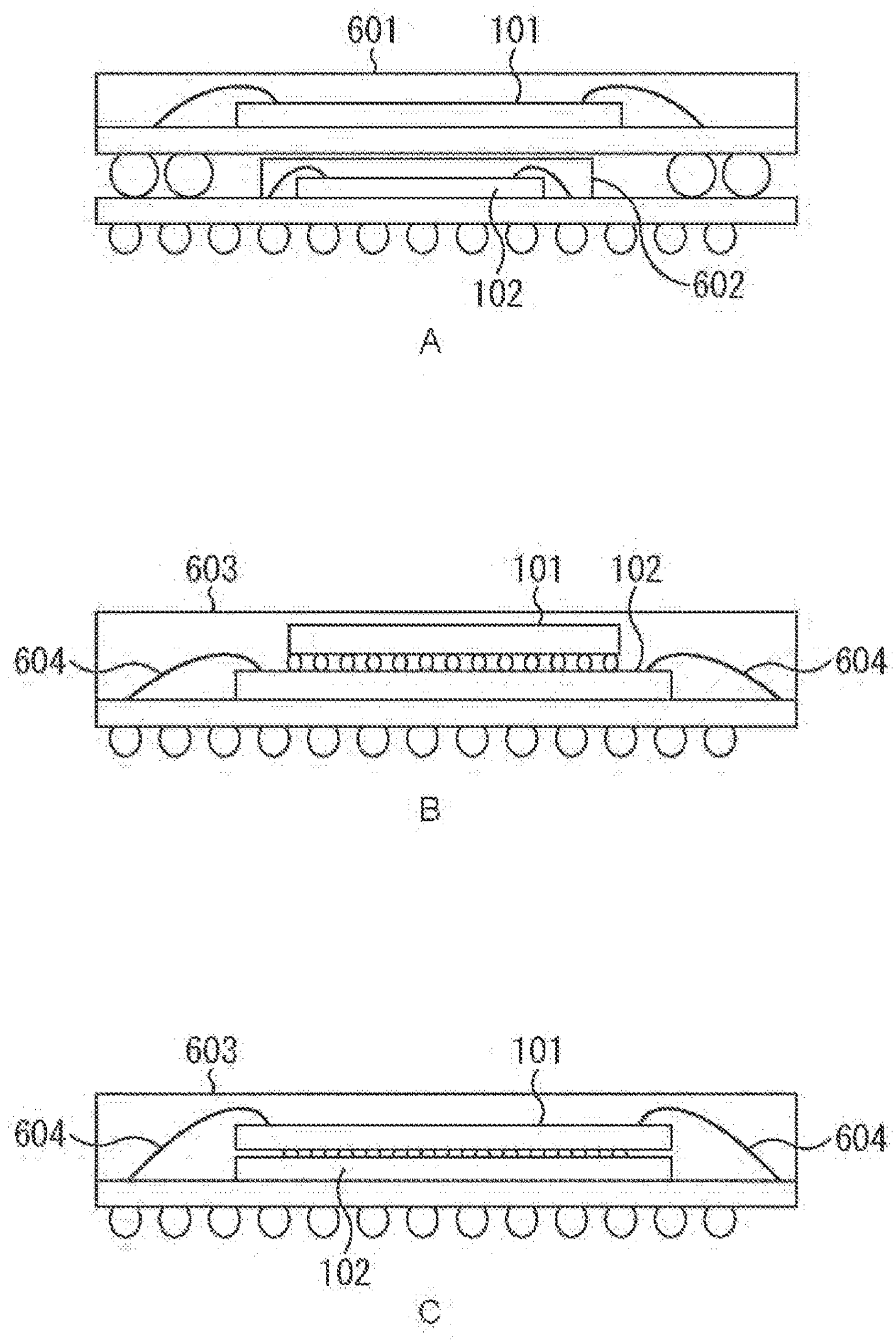
FIG. 113 is diagrams illustrating package stacking examples of a first semiconductor substrate and a second semiconductor substrate forming a solid-state imaging device.

FIG. 113 is diagrams illustrating package stacking examples of the first semiconductor substrate 101 and the second semiconductor substrate 102 forming the solid-state imaging device 100.

The first semiconductor substrate 101 and the second semiconductor substrate 102 may be stacked in any manner as a package.

For example, as illustrated in A in FIG. 113, the first semiconductor substrate 101 and the second semiconductor substrate 102 are individually sealed with a sealing material, and resulting packages 601 and 602 may be stacked.

Furthermore, as illustrated in B or C in FIG. 113, the first semiconductor substrate 101 and the second semiconductor substrate 102 may be stacked and sealed with a sealing material to form a package 603. In this case, a bonding wire 604 may be connected to the second semiconductor substrate 102 as illustrated in B in FIG. 113, or may be connected to the first semiconductor substrate 101 as illustrated in C in FIG. 113.

Moreover, the package may be in any form. For example, the package may be a chip size package (CSP) or a wafer level chip size package (WL-CSP), and an interposer board or a rewiring layer may be used in the package. Furthermore, any form without a package may be adopted. For example, a semiconductor substrate may be mounted as a chip on board (COB). For example, any of the following forms may be adopted: ball grid array BGA), chip on board (COB), chip on tape (COT), chip size package/chip scale package (CSP), dual in-line memory module (DIMM), dual in-line package (DIP), fine-pitch ball grid array (FBGA), fine-pitch land grid array (FLGA), fine-pitch quad flat package (FQFP), single in-line package with heatsink (HSIP), leadless chip carrier (LCC), low profile fine pitch land grid array (LFLGA), land grid array (LGA), low-profile quad flat package (LQFP), multi-chip fine-pitch ball grid array (MC-FBGA), multi-chip module (MCM), multi-chip package (MCP), molded chip size package (M-CSP), mini flat package (MFP), metric quad flat package (MQFP), metal quad (MQUAD), micro small outline package (MSOP), pin grid array (PGA), plastic leaded chip carrier (PLCC), plastic leadless chip carrier (PLCC), quad flat i-leaded package (QFI), quad flat j-leaded package (QFJ), quad flat non-leaded package (QFN), quad flat package (QFP), quad tape carrier package (QTCP), quad in-line package (QUIP), shrink dual in-line package (SDIP), single in-line memory module (SIMM), single in-line package (SIP), stacked multi chip package (S-MCP), small outline non-leaded board (SNB), small outline i-leaded package (SOI), small outline j-leaded package (SOJ), small outline non-leaded package (SON), small outline package (SOP), shrink single in-line package (SSIP), shrink small outline package (SSOP), shrink zigzag in-line package (SZIP), tape-automated bonding (TAB), tape carrier package (TCP), thin quad flat package (TQFP), thin small outline package (TSOP), thin shrink small outline package (TS-SOP), ultra chip scale package (UCSP), ultra thin small outline package (UTSOP), very short pitch small outline package (VSO), very small outline package (VSOP), wafer level chip size package (WL-CSP), zigzag in-line package (ZIP), and micro multi-chip package (pMCP).

The present technology can be applied to, for example, any sensor such as charge-coupled device (CCD) image sensor, CCD sensor, CMOS sensor, MOS sensor, infrared (IR) sensor, ultraviolet (UV) sensor, time of flight (ToF) sensor, or distance measurement sensor, a circuit board, a device, or an electronic device.

Furthermore, the present technology is suitable for, but not limited to, sensors, circuit boards, devices, and electronic devices in which some devices such as transistors, diodes, and antennas are arrayed, and is particularly suitable for, but not limited to, sensors, circuit boards, devices, and electronic devices in which some devices are arrayed on substantially the same plane.

The present technology can be applied to, for example, various memory sensors related to memory devices, circuit boards for memory, memory devices, or electronic devices including memories, various CCD sensors related to CCD, circuit boards for CCD, CCD devices, or electronic devices including CCDs, various CMOS sensors related to CMOS, circuit boards for CMOS, CMOS devices, or electronic devices including CMOSs, various MOS sensors related to MOS, circuit boards for MOS, MOS devices, or electronic devices including MOSs, various display sensors related to light emitting devices, circuit boards for display, display devices, or electronic devices including displays, various laser sensors related to light emitting devices, laser circuit boards, laser devices, or electronic devices including lasers, or various antenna sensors related to antenna devices, antenna circuit boards, antenna devices, electronic devices including antennas, or the like. Among them, the present technology can be favorably applied to, but not limited to, sensors including the Victim conductor loop with variable loop paths, sensors including circuit boards, devices, electronic devices, or control lines or signal lines, sensors including circuit boards, devices, electronic devices, or horizontal control lines or vertical signal lines, circuit boards, devices, electronic devices, or the like.

11. Arrangement Example of Conductive Shield

In the above-described configuration examples, the inductive noise being able to be reduced by devising the configurations of the conductor layer A (wiring layer 165A) and the conductor layer B (wiring layer 165B) has been described. A configuration for further improving the inductive noise by further including a conductive shield will be described.

Figure 114:
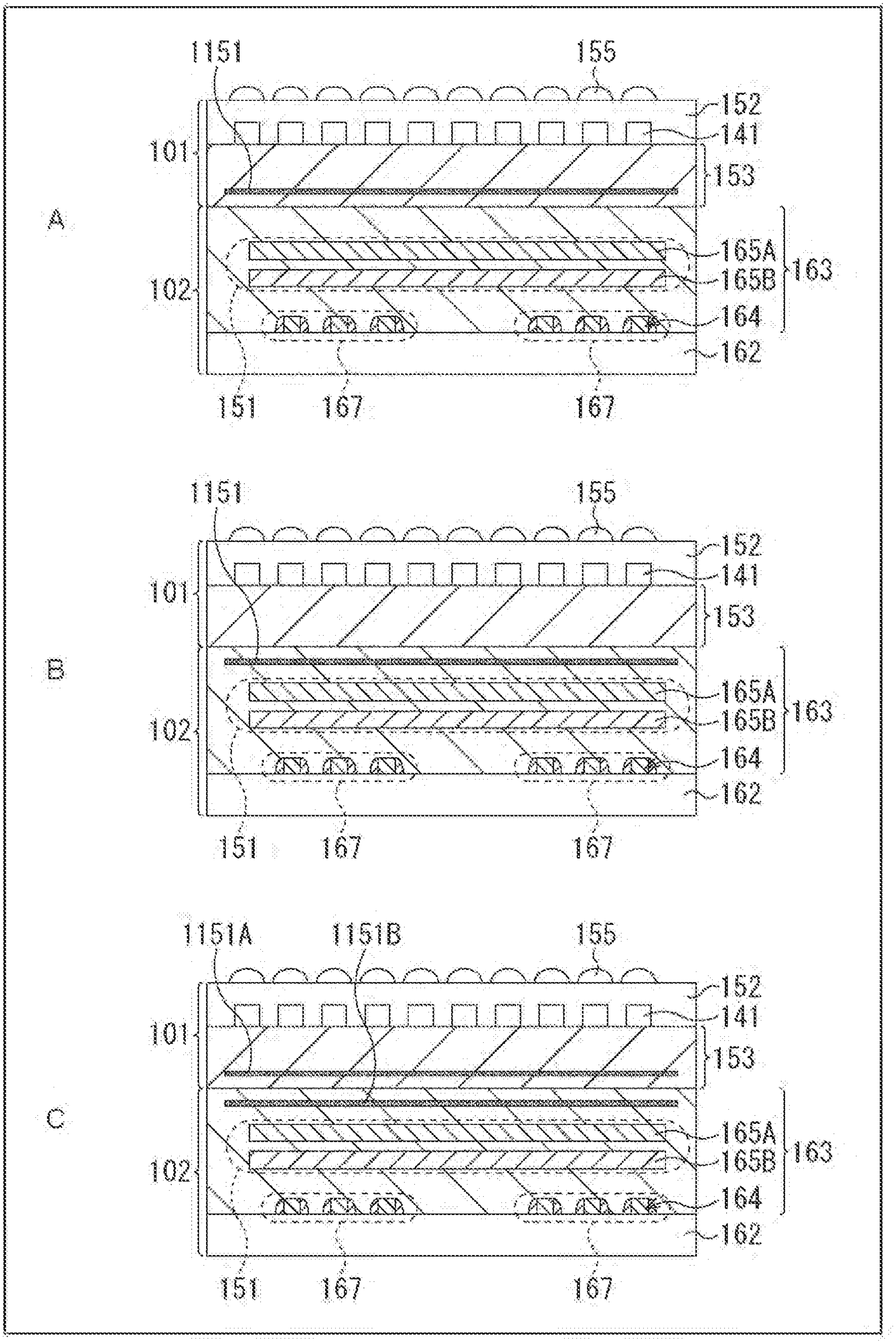
FIG. 114 is cross-sectional views illustrating configuration examples provided with a conductive shield.
Figure 115:
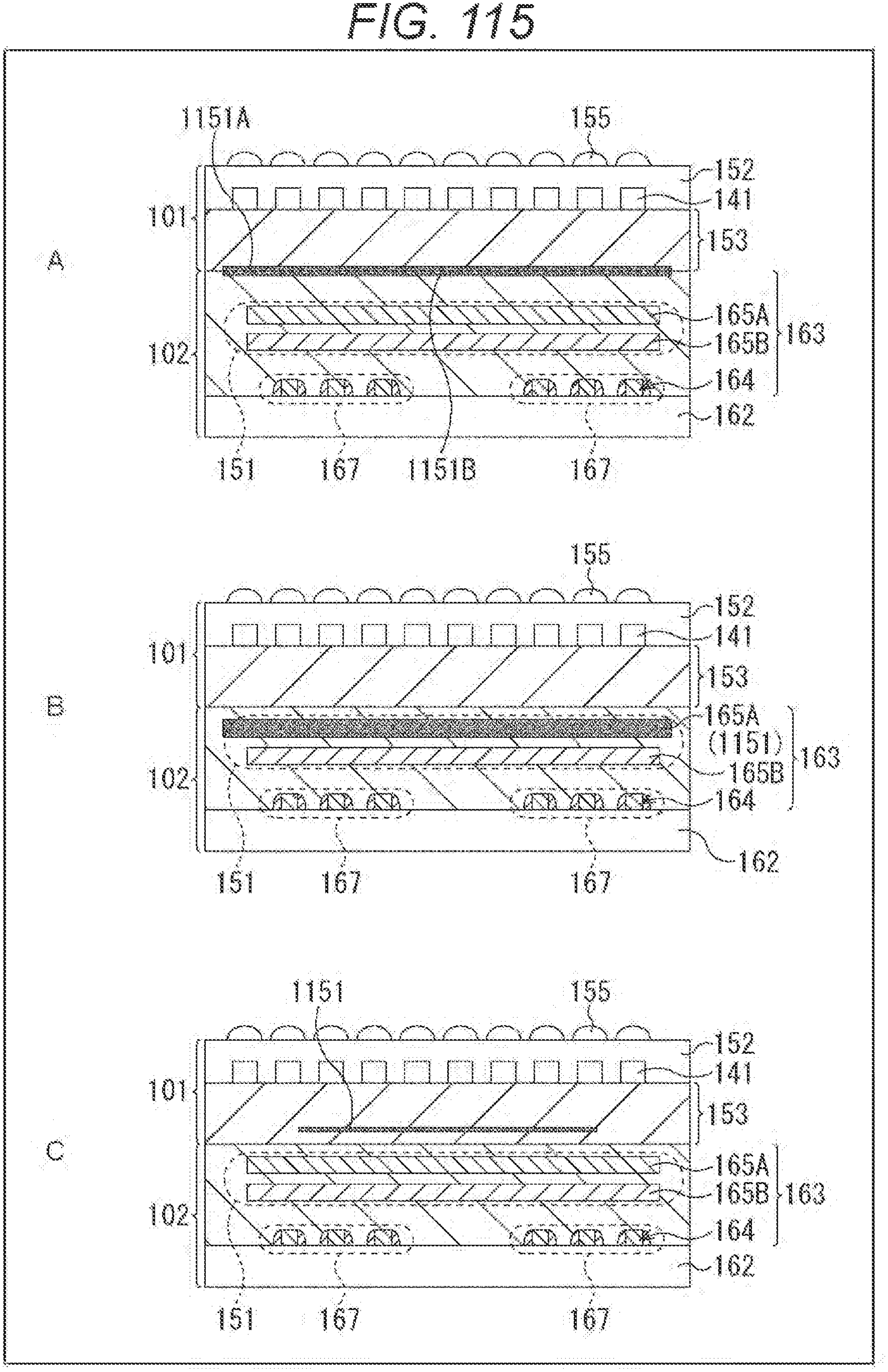
FIG. 115 is cross-sectional views illustrating configuration examples provided with a conductive shield.

FIGS. 114 and 115 are cross-sectional views illustrating configuration examples in which the conductive shield is provided for the solid-state imaging device 100 in which the first semiconductor substrate 101 and the second semiconductor substrate 102 illustrated in FIG. 6 are stacked.

Note that, in FIGS. 114 and 115, description of configurations other than the conductive shield is omitted as appropriate as the configurations are similar to the structure illustrated in FIG. 6.

A in FIG. 114 is a cross-sectional view illustrating a first configuration example in which a conductive shield is provided for the solid-state imaging device 100 illustrated in FIG. 6

In A in FIG. 114, a conductive shield 1151 is formed in the multilayer wiring layer 153 of the first semiconductor substrate 101.

B in FIG. 114 is a cross-sectional view illustrating a second configuration example in which a conductive shield is provided for the solid-state imaging device 100 illustrated in FIG. 6

In B in FIG. 114, the conductive shield 1151 is formed in the multilayer wiring layer 163 of the second semiconductor substrate 102.

C in FIG. 114 is a cross-sectional view illustrating a third configuration example in which a conductive shield is provided for the solid-state imaging device 100 illustrated in FIG. 6

In C in FIG. 114, the conductive shield 1151 is formed in each of the multilayer wiring layers of the first semiconductor substrate 101 and the second semiconductor substrate 102. More specifically, the conductive shield 1151A is formed in the multilayer wiring layer 153 of the first semiconductor substrate 101, and the conductive shield 1151B is formed in the multilayer wiring layer 163 of the second semiconductor substrate 102.

A in FIG. 115 is a cross-sectional view illustrating a fourth configuration example in which a conductive shield is provided for the solid-state imaging device 100 illustrated in FIG. 6

In A in FIG. 115, the conductive shield 1151 is formed in each of the multilayer wiring layers of the first semiconductor substrate 101 and the second semiconductor substrate 102, and the conductive shields 1151 are bonded. More specifically, a conductive shield 1151A is formed on a bonding surface in the multilayer wiring layer 153 of the first semiconductor substrate 101, the bonding surface being for bonding with the multilayer wiring layer 163 of the second semiconductor substrate 102, a conductive shield 1151B is formed on a bonding surface in the multilayer wiring layer 163 of the second semiconductor substrate 102, the bonding surface for bonding with the multilayer wiring layer 153 of the first semiconductor substrate 101, and the conductive shields 1151A and 1151B are bonded by similar metal bonding such as Cu—Cu bonding, Au—Au bonding, or Al—Al bonding, or dissimilar metal bonding such as Cu—Au bonding, Cu—Al bonding, or Au—Al bonding.

Note that C in FIG. 114 and A in FIG. 115 are examples in which plane regions of the conductive shields 1151A and 1151B match, but at least the plane regions overlap and are bonded in part.

B in FIG. 115 is a cross-sectional view illustrating a fifth configuration example in which a conductive shield is provided for the solid-state imaging device 100 illustrated in FIG. 6

B in FIG. 115 illustrates a configuration in which the wiring layer 165A, which is the conductor layer A, also functions as the conductive shield 1151. A part of the wiring layer 165A may be the conductive shield 1151.

C in FIG. 115 is a cross-sectional view illustrating a sixth configuration example in which a conductive shield is provided for the solid-state imaging device 100 illustrated in FIG. 6

In the sixth configuration example in C in FIG. 115, the conductive shield 1151 is formed in the multilayer wiring layer 153, similarly to the first configuration example illustrated in A in FIG. 114, but the plane region in which the conductive shield 1151 is formed is smaller than the plane region of the wiring layer 165A as the conductor layer A and the wiring layer 165B as the conductor layer B.

The area of the plane region where the conductive shield 1151 is formed is favorably equal to or larger than the area of the plane region of the wiring layer 165A as the conductor layer A and the wiring layer 165B as the conductor layer B, as in the first configuration example in A in FIG. 114, but may be smaller, as in B in FIG. 115.

The inductive noise can be further improved by providing the conductive shield 1151, as in the first to sixth configuration examples in FIGS. 114 and 115.

In the first to sixth configuration examples in FIGS. 114 and 115, the wiring layers shielded by the conductive shield 1151 are two layers of the wiring layers 165A and 165B, but one layer may be shielded.

In the first to sixth configuration examples in FIGS. 114 and 115, a magnetic shield may be used instead of the conductive shield 1151. The magnetic shield may be conductive or non-conductive. In the case where the magnetic shield is conductive, the inductive noise and the capacitive noise can be further improved.

Next, the arrangement and the planar shape of the conductive shield 1151 with respect to the signal line 132 formed in the first semiconductor substrate 101 will be described with reference to FIGS. 116 to 119.

FIGS. 116 to 119 illustrate first to fourth configuration examples of the arrangement and the planar shape of the conductive shield 1151 with respect to the signal line 132. The first to fourth configuration examples in FIGS. 116 to 119 have the same configuration other than the planar shape of the conductive shield 1151.

Figure 116:
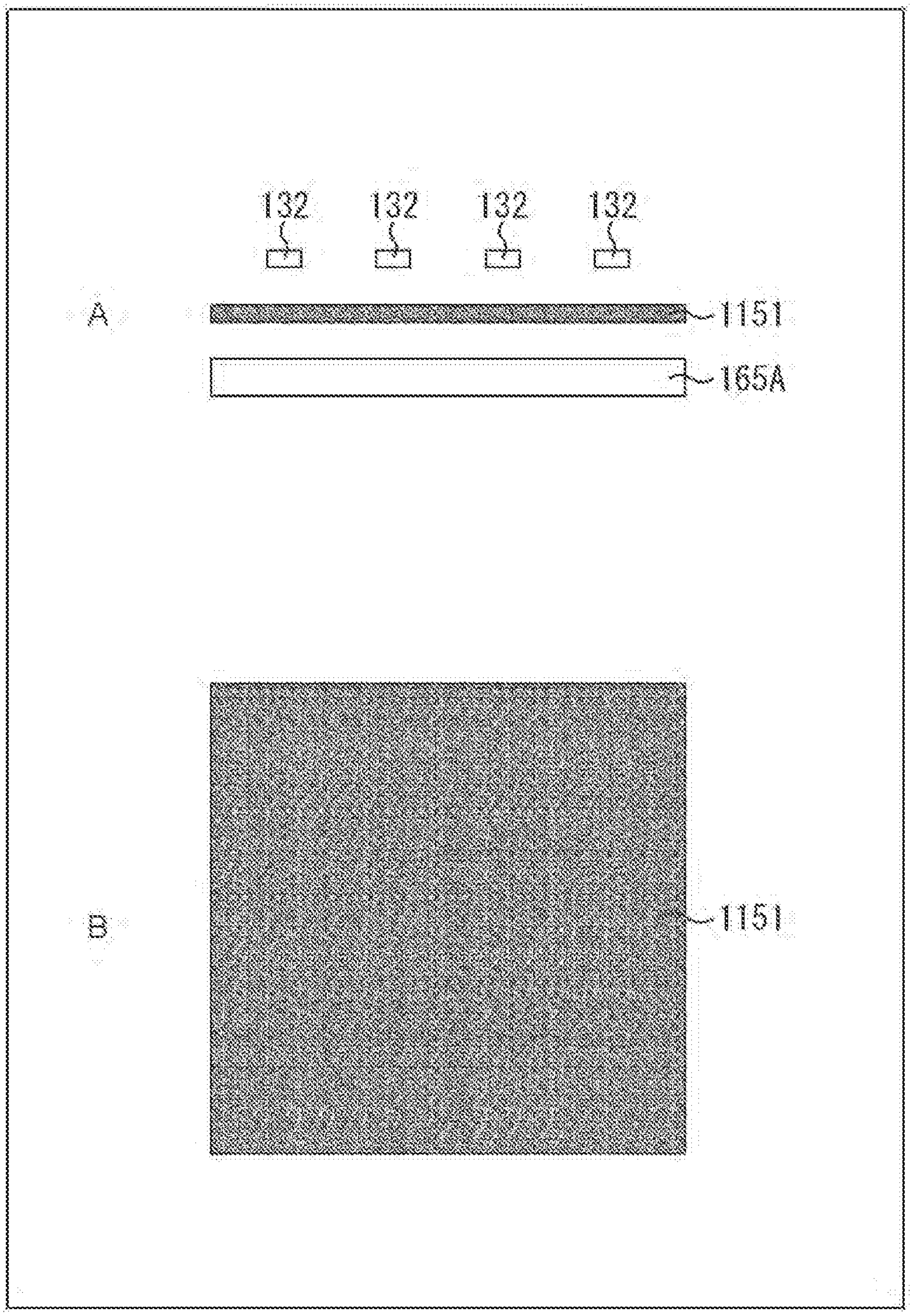
FIG. 116 is diagrams illustrating a first configuration example of arrangement of a conductive shield with respect to a signal line and a planar shape.

A in FIG. 116 is a cross-sectional view illustrating a positional relationship in the Z direction of the signal line 132 through which an analog pixel signal is transmitted on the first semiconductor substrate 101, the conductive shield 1151, and the wiring layer 165A. B in FIG. 116 is a plan view illustrating a planar shape of the conductive shield 1151.

As illustrated in A in FIG. 116, the conductive shield 1151 is arranged between the signal line 132 and the wiring layer 165A. As illustrated in B in FIG. 116, the planar shape of the conductive shield 1151 can be formed in a planar shape.

Figure 117:
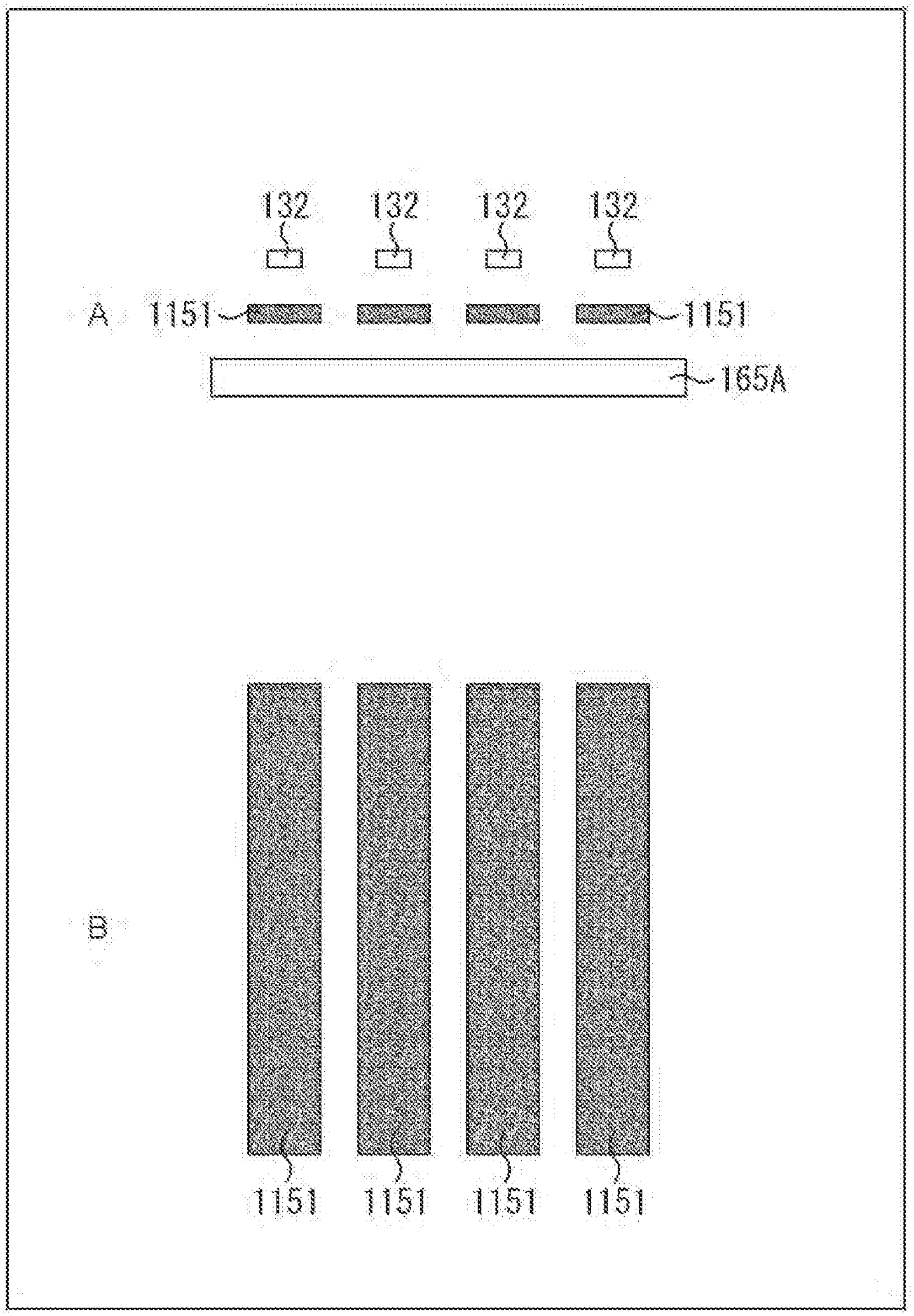
FIG. 117 is diagrams illustrating a second configuration example of arrangement of a conductive shield with respect to a signal line and a planar shape.

Alternatively, as in the second configuration example in A and B in FIG. 117, the planar shape of the conductive shield 1151 is formed in a linear shape, and each linear region can be formed to correspond to and overlap with the signal line 132 in a one-to-one manner.

Figure 118:
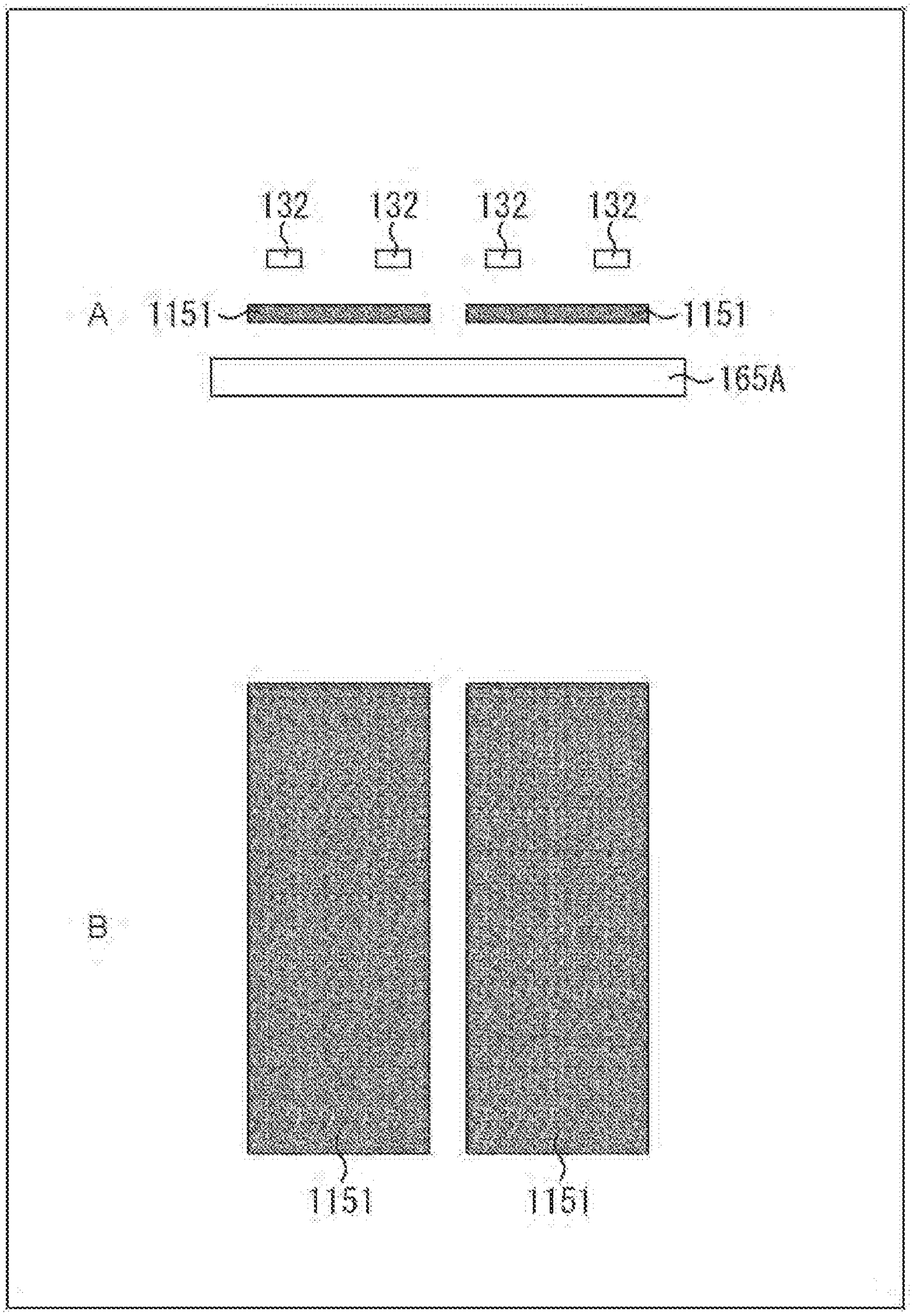
FIG. 118 is diagrams illustrating a third configuration example of arrangement of a conductive shield with respect to a signal line and a planar shape.

Alternatively, each linear region of the conductive shield 1151 does not have to correspond one-to-one with the signal line 132, as in the second configuration example in A and B in FIG. 117. For example, one linear region may be formed to overlap with a plurality of signal lines 132, as in the third configuration example in A and B in FIG. 118. FIG. 118 illustrates a planar shape in which one linear region of the conductive shield 1151 corresponds to two signal lines 132. However, a planar shape corresponding to three or more signal lines 132 may be adopted.

Figure 119:
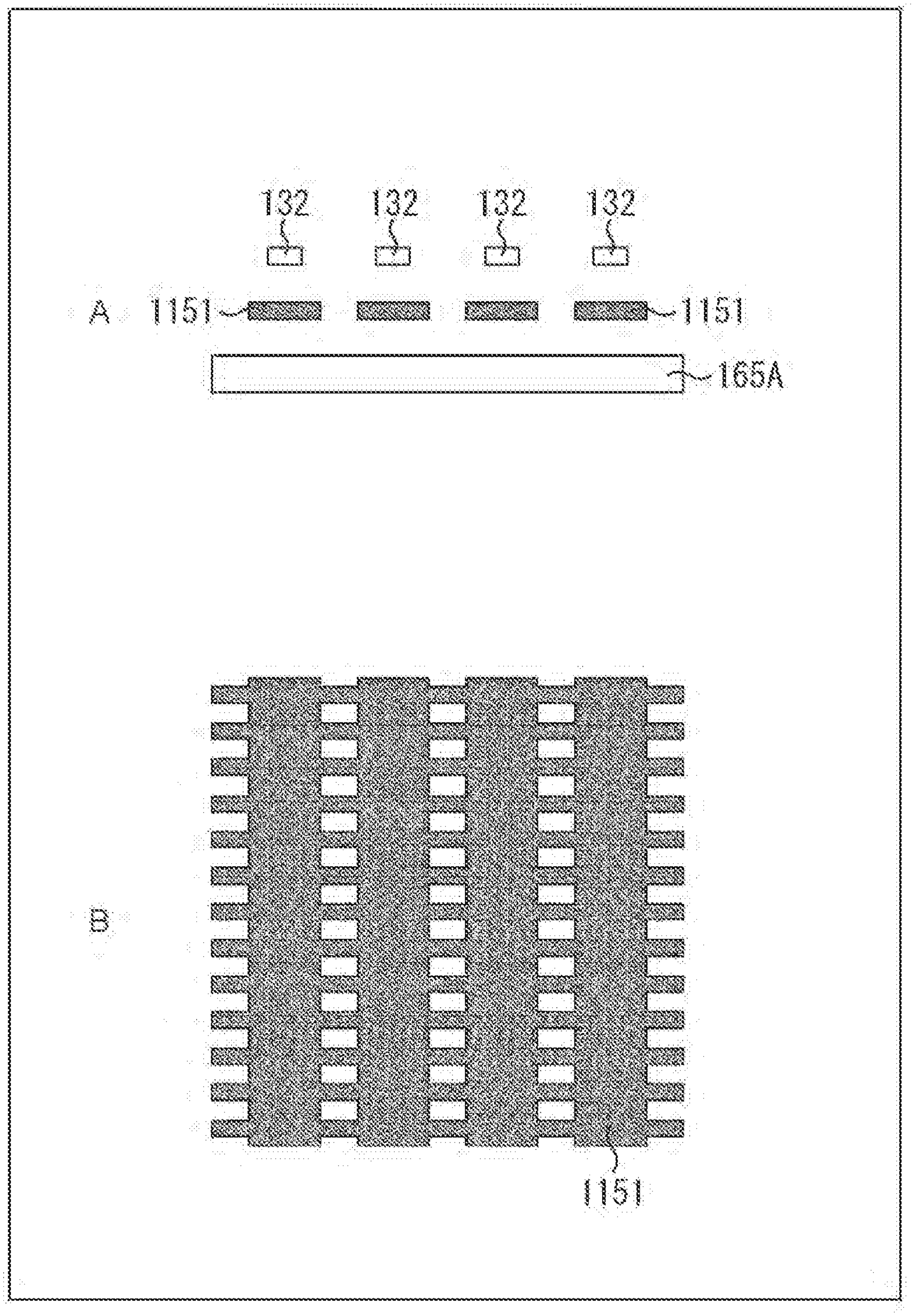
FIG. 119 is diagrams illustrating a fourth configuration example of arrangement of a conductive shield with respect to a signal line and a planar shape.

Alternatively, the planar shape of the conductive shield 1151 may be formed in a reticulated shape, as in the fourth configuration example in A and B in FIG. 119, instead of the linear shape. Conductor widths, gap widths, and conductor periods of a vertical conductor extending in the vertical direction (Y direction) of the reticulated conductive shield 1151, and of a horizontal conductor extending in the horizontal direction (X direction) may be different or the same.

In the first to fourth configuration examples in FIGS. 116 to 119, the conductive shield 1151 is placed in one layer but can be placed in two layers, as illustrated in C in FIG. 114 and in A in FIG. 115. Furthermore, the wiring layer 165A illustrated in FIGS. 116 to 119 is similarly applied to the wiring layer 165B.

The conductive shield 1151 is formed at a position where the conductive shield 1151 overlaps with the entire region of the signal line 132, but may be at a position where the conductive shield 1151 overlaps with a part of the region or a position where the conductive shield 1151 does not overlap with the region. Note that since noise is often propagated via a signal line, the conductive shield 1151 is favorably located at the position where the conductive shield 1151 overlaps with the signal line 132.

Although the forming position of the conductive shield 1151 with respect to the signal line 132 through which the analog pixel signal is transmitted in the first semiconductor substrate 101 has been described, the configuration may be applied to another signal line for signal transmission, control line, wire, conductor, or GND, instead of the signal line 132 for pixel signal transmission. The conductive shield 1151 is favorably connected to the GND or the negative power supply to efficiently dissipate noise, but may be connected to another control line, another signal line, another conductor, or another wire. Alternatively, the conductive shield 1151 may not be connected to another control line, another signal line, another conductor, another wire, or the like.

By providing the conductive shield 1151, the inductive noise and the capacitive noise can be further improved.

12. Configuration Example of Case Having Three Conductor Layers

Arrangement Example of Case Having Three Conductor Layers

In each of the above-described configuration examples, the wiring pattern of the two conductor layers: the conductor layer A as the wiring layer 165A and the conductor layer B as the wiring layer 165B has been described.

However, a third conductor layer is sometimes further arranged near the two conductor layers of the wiring layer 165A (conductor layer A) and the wiring layer 165B (conductor layer B).

The third conductor layer is used as, for example, wiring for relaying the GND or the negative power supply to the Vss wiring of the conductor layer A as the wiring layer 165A, wiring for relaying the positive power supply to the Vdd wiring of the conductor layer B as the wiring layer 165B, reinforcing wiring for minimizing the voltage drop (IR-Drop) of the conductor layer A or the conductor layer B, or the like.

Figure 120:
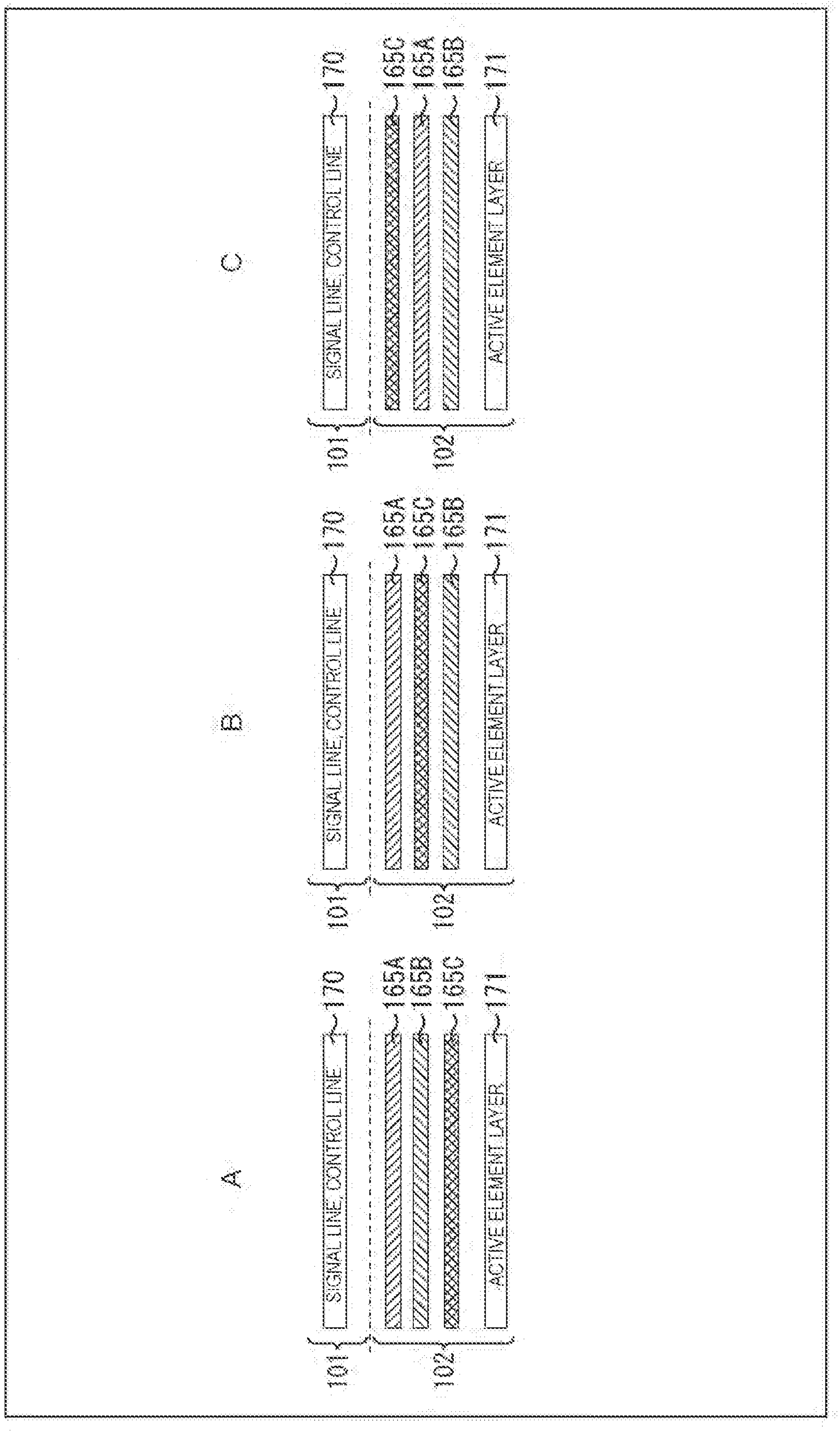

When the third conductor layer is referred to as a wiring layer 165C or a conductor layer C, corresponding to the names of the wiring layers 165A and 165B, and the conductor layers A and B in the above-described configuration examples, the wiring layer 165C that is the third conductor layer is arranged in any of the positional relationships in A to C in FIG. 120 with respect to the wiring layers 165A and 165B.

A to C in FIG. 120 are schematic cross-sectional views illustrating arrangement examples of the wiring layer 165C with respect to the wiring layers 165A and 165B.

In the first semiconductor substrate 101, at least a part of the control lines 133 for controlling the transistors of the pixels 131, or a wiring layer 170 (fourth conductor layer) containing at least a part of the signal lines 132 for transmitting the pixel signals is formed. In the second semiconductor substrate 102, an active element layer 171 including active elements such as the MOS transistor 164 is formed. At least a part of the control lines 133 or at least a part of the signal lines 132 may form at least a part of the Victim conductor loop (Victim conductor loop 11 or Victim conductor loop 1101), but this is not the case.

As described with reference to FIG. 6 and the like, the wiring layer 165A is arranged on the wiring layer 170 side of the first semiconductor substrate 101, and the wiring layer 165B is arranged on the active element layer 171 side.

In contrast to the arrangement of the wiring layers 165A and 165B, the wiring layer 165C (conductor layer C) may be arranged between the wiring layer 165B and the active element layer 171 as illustrated in A in FIG. 120. In this case, the wiring layers are stacked in the order of the wiring layer 170, the wiring layer 165A, the wiring layer 165B, the wiring layer 165C, and the active element layer 171 from the first semiconductor substrate 101 side.

Alternatively, the wiring layer 165C (conductor layer C) may be arranged between the wiring layer 165A and the wiring layer 165B, as illustrated in B in FIG. 120. In this case, the wiring layers are stacked in the order of the wiring layer 170, the wiring layer 165A, the wiring layer 165C, the wiring layer 165B, and the active element layer 171 from the first semiconductor substrate 101 side.

Moreover, the wiring layer 165C (conductor layer C) may be arranged between the wiring layer 170 and the wiring layer 165A as illustrated in C in FIG. 120. In this case, the wiring layers are stacked in the order of the wiring layer 170, the wiring layer 165C, the wiring layer 165A, the wiring layer 165B, and the active element layer 171 from the first semiconductor substrate 101 side.

Note that FIG. 120 is diagrams illustrating the positional relationship among the three conductor layers of the wiring layers 165A to 165C, and the arrangement of a wiring layer 170 of the first semiconductor substrate 101 and an active element layer 171 of the second semiconductor substrate 102 may be reversed. Furthermore, the first semiconductor substrate 101 does not have to include either the signal line 132 or the control line 133, and even in a case where the first semiconductor substrate 101 includes both the signal line 132 and the control line 133, it is sufficient that at least a part of either the signal line 132 or the control line 133 is formed in the wiring layer 170. Furthermore, the signal line 132 or the control line 133 may be provided in the second semiconductor substrate 102 instead of the first semiconductor substrate 101. Furthermore, at least a part of the signal line 132 or the control line 133 may be included in the first semiconductor substrate 101 and the second semiconductor substrate 102, and the signal line 132 or the control line 133 may straddle at least the first semiconductor substrate 101 and the second semiconductor substrate 102, for example. Furthermore, at least one of the wiring layer 165A, the wiring layer 165B, or the wiring layer 165C may be provided in the second semiconductor substrate 102 instead of the first semiconductor substrate 101. Furthermore, the arrangement of the wiring layer 170 of the first semiconductor substrate 101 and the active element layer 171 of the second semiconductor substrate 102 may be omitted. Furthermore, the first semiconductor substrate 101 and the second semiconductor substrate 102 may not be separate bodies but may be integrally configured as one semiconductor substrate. Furthermore, the wiring layer 170 is interpreted as Victim conductor loop 1101, the wiring layer 165A is interpreted as Aggressor conductor loop 1102A, and the wiring layer 165B is interpreted as Aggressor conductor loop 1102B, and the wiring layer 165C may be arranged at an arbitrary position in the substrate arrangement examples illustrated in FIGS. 109 to 112. The positional relationship among the three conductor layers of the wiring layers 165A to 165C is desirably the positional relationship illustrated in FIG. 120 but this is not the case.

<Problem of Case Having Three Conductor Layers>

In each of the above-described configuration examples, the wiring layout for shielding the hot carrier light emission from the active element group 167 and improving at least the inductive noise, the capacitive noise, or the voltage drop in the two conductor layers of the conductor layer A (wiring layer 165A) and the conductor layer B (wiring layer 165B) has been proposed. However, the inductive noise may further deteriorate depending on the wiring layout of the third conductor layer.

Figure 121:
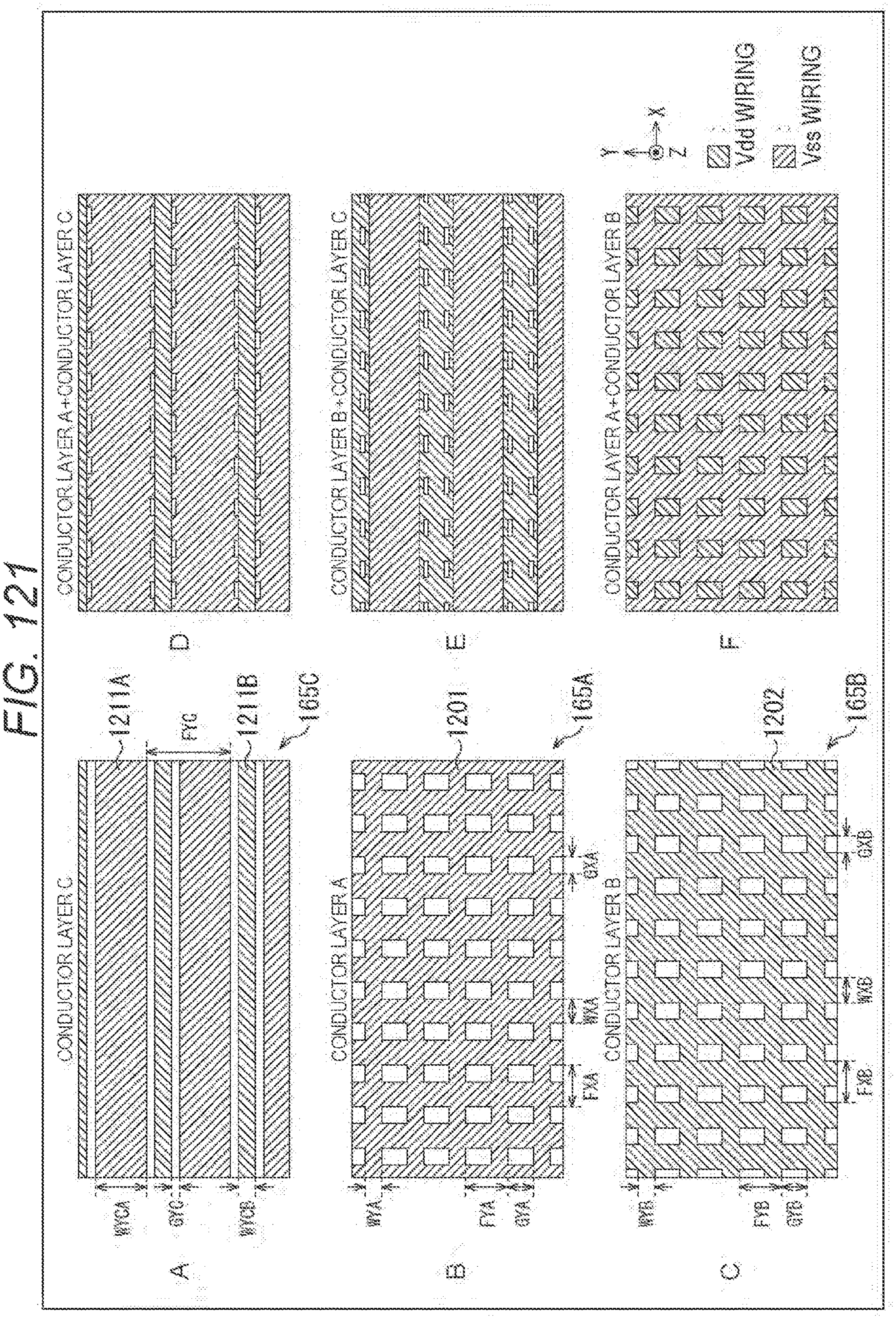

FIG. 121 is diagrams illustrating examples of wiring patterns of the wiring layer 165C.

A in FIG. 121 illustrates the conductor layer C (wiring layer 165C), B in FIG. 121 illustrates the conductor layer A (wiring layer 165A), and C in FIG. 121 illustrates the conductor layer B (wiring layer 165B).

Furthermore, D in FIG. 121 is a plan view of a stacked state of the conductor layer A and the conductor layer C, E in FIG. 121 is a plan view of a stacked state of the conductor layer B and the conductor layer C, and F in FIG. 121 is a plan view of a stacked state of the conductor layer A and the conductor layer B.

In the coordinate system in FIG. 121, the horizontal direction is the X axis, the vertical direction is the Y axis, and the direction perpendicular to the XY plane is the Z axis.

For the conductor layer A (wiring layer 165A) and the conductor layer B (wiring layer 165B) in FIG. 121, the eleventh configuration example described with reference to FIG. 36 is adopted, which uses the reticulated conductor having the resistance value in the X direction (first direction) and the resistance value in the Y direction (second direction), which are different from each other.

The conductor layer A in B in FIG. 121 is configured by a reticulated conductor 1201. The reticulated conductor 1201 has the conductor width WXA, the gap width GXA, and the conductor period FXA in the X direction, and the conductor width WYA, the gap width GYA, and the conductor period FYA in the Y direction. The reticulated conductor 1201 is a conductor having a shape in which basic patterns (first basic pattern) of the conductor period FXA and the conductor period FYA are repeatedly arranged on the same plane. The reticulated conductor 1201 is, for example, wiring (Vss wiring) connected to the GND or the negative power supply.

In the reticulated conductor 1201, the conductor width WXA>the conductor width WYA and the gap width GYA>the gap width GXA. The gap region of the reticulated conductor 1201 has a shape longer in the Y direction than in the X direction, the resistance values are different between the X direction and the Y direction, and the resistance value in the Y direction is smaller than the resistance value in the X direction. Therefore, in the reticulated conductor 1201, the current is more likely to flow in the Y direction than in the X direction.

The conductor layer B in C in FIG. 121 is configured by a reticulated conductor 1202. The reticulated conductor 1202 has the conductor width WXB, the gap width GXB, and the conductor period FXB in the X direction, and the conductor width WYB, the gap width GYB, and the conductor period FYB in the Y direction. The reticulated conductor 1202 is a conductor having a shape in which basic patterns (second basic pattern) of the conductor period FXB and the conductor period FYB are repeatedly arranged on the same plane. The reticulated conductor 1202 is, for example, wiring (Vdd wiring) connected to the positive power supply.

In the reticulated conductor 1202, the conductor width WXB>the conductor width WYB and the gap width GYB>the gap width GXB. The gap region of the reticulated conductor 1202 has a shape longer in the Y direction than in the X direction, the resistance values are different between the X direction and the Y direction, and the resistance value in the Y direction is smaller than the resistance value in the X direction. Therefore, in the reticulated conductor 1202, the current is more likely to flow in the Y direction than in the X direction.

The reticulated conductor 1201 of the conductor layer A and the reticulated conductor 1202 of the conductor layer B form a differential structure. That is, as described in the eleventh configuration example and the like, the current distribution of the reticulated conductor 1201 of the conductor layer A and the current distribution of the reticulated conductor 1202 of the conductor layer B are substantially uniform and have opposite characteristics. Here, the substantially uniform is a difference in a range that can be regarded as uniform, but for example, the difference may be a difference in a range not exceeding at least twice. More specifically, an AC current substantially uniformly flows in ends of the reticulated conductor 1201 of the conductor layer A and the reticulated conductor 1202 of the conductor layer B, and current directions are opposite between the reticulated conductor 1201 and the reticulated conductor 1202. As a result, the magnetic field generated by the current distribution of the reticulated conductor 1201 and the magnetic field generated by the current distribution of the reticulated conductor 1202 are effectively canceled. As a result, the inductive noise can be suppressed.

Furthermore, as illustrated in F in FIG. 121, an opened region is no longer present due to the stacked layer of the conductor layer A and the conductor layer B. Therefore, the hot carrier light emission from the active element group 167 can be shielded.

Meanwhile, the conductor layer C in A in FIG. 121 is a conductor layer having a low sheet resistance through which a current easily flows, and a linear conductor 1211A long in the X direction and a linear conductor 1211B long in the X direction are alternately and periodically arranged in the Y direction. The linear conductor 1211A is, for example, wiring (Vss wiring) connected to the GND or the negative power supply. The linear conductor 1211B is, for example, wiring (Vdd wiring) connected to the positive power supply. The linear conductor 1211A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1211A of the conductor layer C may be electrically connected via, for example, a conductor via (VIA) extending in the Z direction. The linear conductor 1211B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1211B of the conductor layer C may be electrically connected via, for example, a conductor via (VIA) extending in the Z direction.

The linear conductor 1211A has a conductor width WYCA in the Y direction and the linear conductor 1211B has a conductor width WYCB in the Y direction, and the conductor width WYCA of the linear conductor 1211A is larger than the conductor width WYCB of the linear conductor 1211B (conductor width WYCA>conductor width WYCB). There is a gap with a gap width GYC between the linear conductor 1211A and the linear conductor 1211B in the Y direction. Then, the one linear conductor 1211A and the one linear conductor 1211B are periodically arranged in the Y direction with a conductor period FYC (=the conductor width WYCA+the conductor width WYCB+2×the gap width GYC).

When the conductor layer C in which the linear conductor 1211A and the linear conductor 1211B are periodically arranged in the Y direction in the conductor period FYC is viewed in a predetermined plane range (plane region), the sum of the conductor widths WYCA of a plurality of linear conductors 1211A and the sum of the conductor widths WYCB of a plurality of linear conductors 1211B in the predetermined plane range are significantly different because the conductor width WYCA of the linear conductor 1211A and the conductor width WYCB of the linear conductor 1211B are different. In this case, since the current distribution of the linear conductor 1211A and the current distribution of the linear conductor 1211B are significantly different, generation of the inductive noise cannot be suppressed and the inductive noise is deteriorated. Specifically, since the resistance value in the X direction significantly differs between the linear conductor 1211A and the linear conductor 1211B, the current distribution significantly differs between the linear conductor 1211A and the linear conductor 1211B, and the total amount of current flowing through the linear conductor 1211A becomes larger than the total amount of current flowing through the linear conductor 1211B. Furthermore, the total amount of current flowing through the reticulated conductor 1202 becomes larger than the total amount of current flowing through the reticulated conductor 1201 according to the law of current conservation (Kirchhoff's first law). As a result, since the current distribution significantly differs between the reticulated conductor 1201 and the reticulated conductor 1202, generation of the inductive noise cannot be suppressed and the inductive noise is deteriorated.

Therefore, the effect of suppressing the inductive noise in the two conductor layers of the conductor layer A or the conductor layer B is reduced depending on the wiring layout of the conductor layer C.

Therefore, hereinafter, a configuration of effectively reducing the inductive noise in a case of having a stacked structure of the three conductor layers of the wiring layers 165A to 165C will be described. Note that the configuration examples in FIG. 121 are not excluded because the configuration examples in FIG. 121 may be applicable depending on the magnitude of the inductive noise.

First Configuration Example of Three-Layer Conductor Layer

Figure 122:
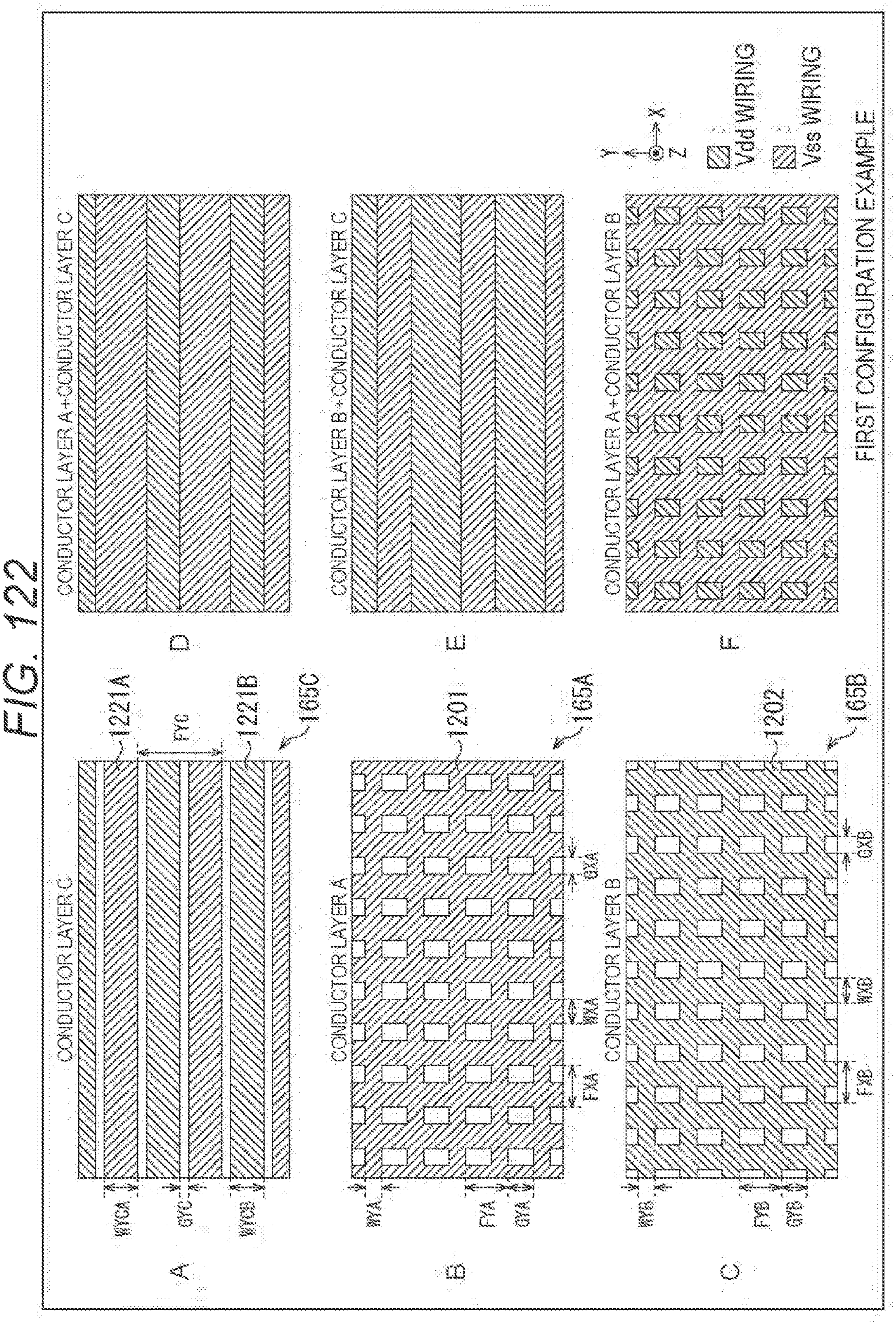

FIG. 122 illustrates a first configuration example of a three-layer conductor layer.

A in FIG. 122 illustrates the conductor layer C (wiring layer 165C), B in FIG. 122 illustrates the conductor layer A (wiring layer 165A), and C in FIG. 122 illustrates the conductor layer B (wiring layer 165B).

Furthermore, D in FIG. 122 is a plan view of a stacked state of the conductor layer A and the conductor layer C, E in FIG. 122 is a plan view of a stacked state of the conductor layer B and the conductor layer C, and F in FIG. 122 is a plan view of a stacked state of the conductor layer A and the conductor layer B.

The conductor layer A in B in FIG. 122 is configured by the same reticulated conductor 1201 as in FIG. 121. That is, the reticulated conductor 1201 has the conductor width WXA, the gap width GXA, and the conductor period FXA in the X direction, and the conductor width WYA, the gap width GYA, and the conductor period FYA in the Y direction. The reticulated conductor 1201 is a conductor having a shape in which basic patterns (first basic pattern) of the conductor period FXA and the conductor period FYA are repeatedly arranged on the same plane. The reticulated conductor 1201 is, for example, wiring (Vss wiring) connected to the GND or the negative power supply.

The conductor layer B in C in FIG. 122 is configured by the same reticulated conductor 1202 as in FIG. 121. That is, the reticulated conductor 1202 has the conductor width WXB, the gap width GXB, and the conductor period FXB in the X direction, and the conductor width WYB, the gap width GYB, and the conductor period FYB in the Y direction. The reticulated conductor 1202 is a conductor having a shape in which basic patterns (second basic pattern) of the conductor period FXB and the conductor period FYB are repeatedly arranged on the same plane. The reticulated conductor 1202 is, for example, wiring (Vdd wiring) connected to the positive power supply. The conductor periods of the reticulated conductor 1201 and the reticulated conductor 1202 are the same. That is, the conductor period FXA=the conductor period FXB and the conductor period FYA=the conductor period FYB. In addition, the conductor periods may be substantially the same. Here, the substantially the same is a difference in a range that can be regarded as the same, but for example, the difference may be a difference in a range not exceeding at least twice.

The conductor layer C in A in FIG. 122 is a conductor layer having a low sheet resistance through which a current easily flows, and a linear conductor 1221A (third basic pattern) long in the X direction and a linear conductor 1221B (fourth basic pattern) long in the X direction are alternately and periodically arranged in the Y direction.

The linear conductor 1221A is, for example, wiring (Vss wiring) connected to the GND or the negative power supply. The linear conductor 1221B is, for example, wiring (Vdd wiring) connected to the positive power supply. The linear conductor 1221A and the linear conductor 1221B are differential conductors (differential structure) having the current directions opposite to each other. The linear conductor 1221A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1221A of the conductor layer C may be electrically connected via, for example, a conductor via (VIA) extending in the Z direction. The linear conductor 1221B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1221B of the conductor layer C may be electrically connected via, for example, a conductor via (VIA) extending in the Z direction.

The linear conductor 1221A has the conductor width WYCA in the Y direction and the linear conductor 1221B has the conductor width WYCB in the Y direction, and the conductor width WYCA of the linear conductor 1221A is the same as the conductor width WYCB of the linear conductor 1221B (conductor width WYCA=conductor width WYCB). Note that the conductor width WYCA and the conductor width WYCB may not be the same or may be substantially the same (the conductor width WYCA z the conductor width WYCB). There is a gap with the gap width GYC between the linear conductor 1221A and the linear conductor 1221B in the Y direction.

Then, the one linear conductor 1221A and the one linear conductor 1221B are periodically arranged in the Y direction with the conductor period FYC (=the conductor width WYCA+the conductor width WYCB+2×the gap width GYC). The conductor period FYC of the linear conductor 1221A and the conductor period FYC of the linear conductor 1221B are the same or substantially the same.

Furthermore, the conductor period FYC that is a repetition period of the linear conductor 1221A of the conductor layer C is an integral multiple of the conductor period FYA that is a repetition period in the Y direction of the reticulated conductor 1201 of the conductor layer A. FIG. 122 illustrates an example in which the conductor period FYC is twice the conductor period FYA.

The conductor period FYC that is a repetition period of the linear conductor 1221B of the conductor layer C is an integral multiple of the conductor period FYB that is a repetition period in the Y direction of the reticulated conductor 1202 of the conductor layer B. FIG. 122 illustrates an example in which the conductor period FYC is twice the conductor period FYB.

Note that the conductor width WYCA, the conductor width WYCB, and the gap width GYC can be designed to arbitrary values.

When the conductor layer C in which the linear conductor 1221A and the linear conductor 1221B are periodically arranged in the Y direction in the conductor period FYC is viewed in a predetermined plane range (plane region), the sum of the conductor widths WYCA of a plurality of linear conductors 1221A and the sum of the conductor widths WYCB of a plurality of linear conductors 1221B in the predetermined plane range are the same or substantially the same because the conductor width WYCA of the linear conductor 1221A and the conductor width WYCB of the linear conductor 1221B are the same or substantially the same. As a result, the current distribution of the linear conductor 1221A and the current distribution of the linear conductor 1221B become the same or substantially the same, so that generation of inductive noise can be suppressed.

Furthermore, in a case where the conductor layer C is arranged near the wiring layer 170, as illustrated in C in FIG. 120, for example, the capacitive noise due to capacitive coupling between the linear conductor 1221A and the linear conductor 1221B of the conductor layer C, and the signal line 132 and the control line 133 of the wiring layer 170 can occur. However, since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 122, the stacked layer of the conductor layers A and B has a light-shielding structure, and the hot carrier light emission from the active element group 167 can be shielded. In addition, as illustrated in D and E in FIG. 122, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1221A of the conductor layer C are electrically connected, and the reticulated conductor 1202 of the conductor layer B and the linear conductor 1221B of the conductor layer C are electrically connected, the current amount of the conductor layers A and B can be made small. Therefore, the inductive noise and the voltage drop from the conductor layer A or B can be further improved.

Second Configuration Example of Three-Layer Conductor Layer

Figure 123:
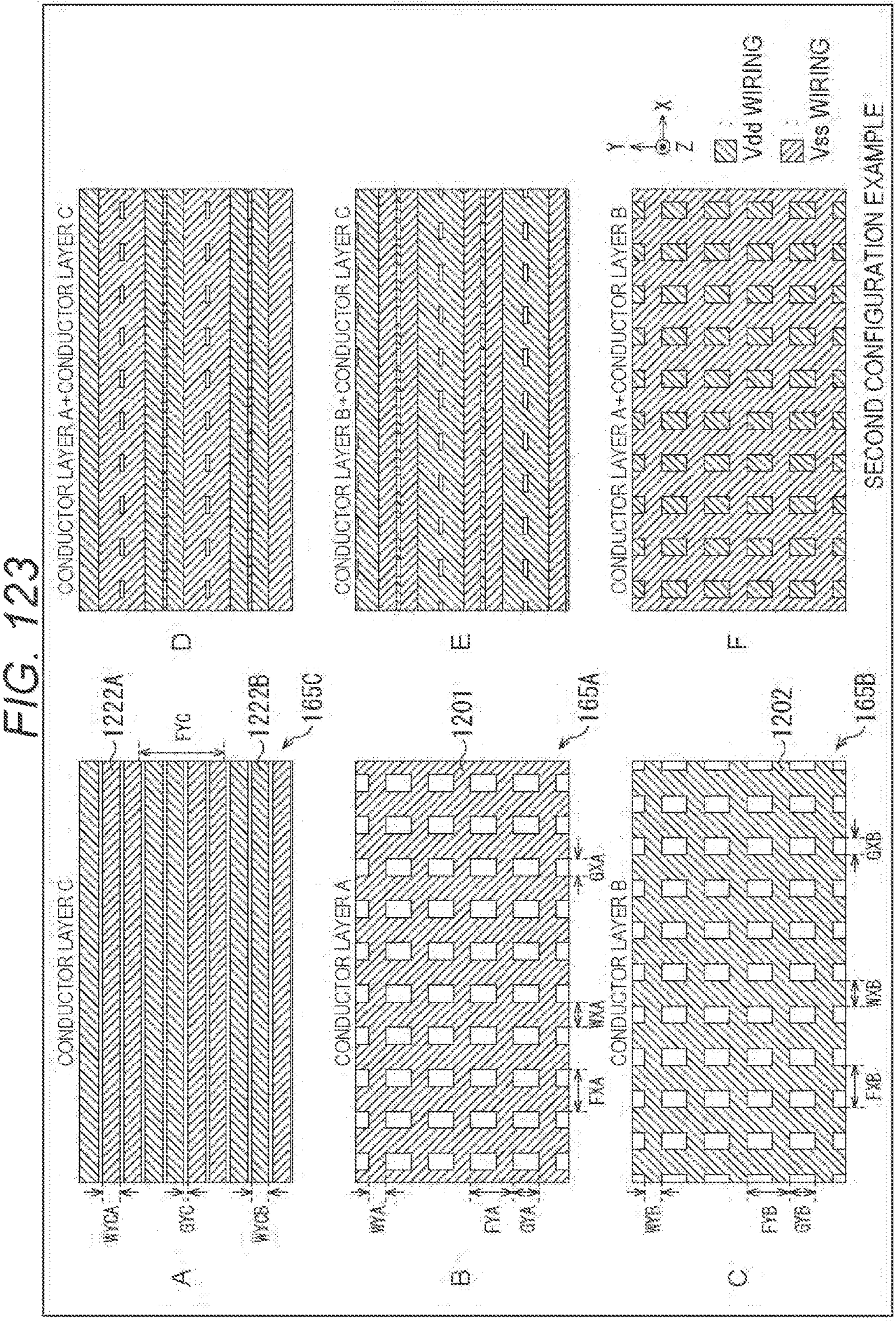

FIG. 123 illustrates a second configuration example of the three-layer conductor layer.

A in FIG. 123 illustrates the conductor layer C (wiring layer 165C), B in FIG. 123 illustrates the conductor layer A (wiring layer 165A), and C in FIG. 123 illustrates the conductor layer B (wiring layer 165B).

Furthermore, D in FIG. 123 is a plan view of a stacked state of the conductor layer A and the conductor layer C, E in FIG. 123 is a plan view of a stacked state of the conductor layer B and the conductor layer C, and F in FIG. 123 is a plan view of a stacked state of the conductor layer A and the conductor layer B.

The conductor layer A in B in FIG. 123 is a reticulated conductor 1201 that is the same as the first configuration example in FIG. 122, and the conductor layer B in C in FIG. 123 is a reticulated conductor 1202 that is the same as the first configuration example in FIG. 122. Therefore, description thereof is omitted.

The conductor layer C in A in FIG. 123 is configured such that two linear conductors 1222A long in the X direction and two linear conductors 1222B long in the X direction are alternately and periodically arranged in the Y direction.

The linear conductor 1222A is, for example, wiring (Vss wiring) connected to the GND or the negative power supply. The linear conductor 1222B is, for example, wiring (Vdd wiring) connected to the positive power supply. The linear conductor 1222A and the linear conductor 1222B are differential conductors whose current directions are opposite to each other. The linear conductor 1222A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1222A of the conductor layer C may be electrically connected via, for example, a conductor via (VIA) extending in the Z direction. The linear conductor 1222B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1222B of the conductor layer C may be electrically connected via, for example, a conductor via (VIA) extending in the Z direction.

The linear conductor 1222A has the conductor width WYCA in the Y direction and the linear conductor 1222B has the conductor width WYCB in the Y direction, and the conductor width WYCA of the linear conductor 1222A is the same as the conductor width WYCB of the linear conductor 1222B (conductor width WYCA=conductor width WYCB). Note that the conductor width WYCA and the conductor width WYCB may not be the same or may be substantially the same (the conductor width WYCA z the conductor width WYCB). There is a gap with the gap width GYC between the linear conductors 1222A adjacent in the Y direction, between the linear conductors 1222B adjacent in the Y direction, or between the linear conductors 1222A and the linear conductors 1222B.

Then, the two linear conductors 1222A and the two linear conductors 1222B are periodically arranged in the Y direction with a conductor period FYC (=2×the conductor width WYCA+2×the conductor width WYCB+4×the gap width GYC). In other words, the conductor period FYC of the two linear conductors 1222A and the conductor period FYC of the two linear conductors 1222B are the same or substantially the same.

Note that the conductor width WYCA, the conductor width WYCB, and the gap width GYC can be designed to arbitrary values. Furthermore, FIG. 123 illustrates an example in which the two linear conductors 1222A and two linear conductors 1222B are periodically arranged. However, the configuration is not limited thereto, and three or more linear conductors may be periodically arranged, for example. Furthermore, FIG. 123 illustrates an example in which the same numbers of linear conductors 1222A and linear conductors 1222B are periodically arranged. However, the configuration is not limited thereto, and different numbers of linear conductors 1222A and linear conductors 1222B may be periodically arranged.

When the conductor layer C in which the linear conductor 1222A and the linear conductor 1222B are periodically arranged in the Y direction in the conductor period FYC is viewed in a predetermined plane range (plane region), the sum of the conductor widths WYCA of a plurality of linear conductors 1222A and the sum of the conductor widths WYCB of a plurality of linear conductors 1222B in the predetermined plane range are the same or substantially the same because the conductor width WYCA of the linear conductor 1222A and the conductor width WYCB of the linear conductor 1222B are the same or substantially the same. As a result, the current distribution of the linear conductor 1222A and the current distribution of the linear conductor 1222B become the same or substantially the same, so that generation of inductive noise can be suppressed.

Furthermore, in a case where the conductor layer C is arranged near the wiring layer 170, as illustrated in C in FIG. 120, for example, the capacitive noise due to capacitive coupling between the linear conductor 1222A and the linear conductor 1222B of the conductor layer C, and the signal line 132 and the control line 133 of the wiring layer 170 can occur. However, since the linear conductor 1222A and the linear conductor 1222B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 123, the stacked layer of the conductor layers A and B has a light-shielding structure, and the hot carrier light emission from the active element group 167 can be shielded, and as illustrated in D and E in FIG. 123, the light-shielding property is maintained in a fixed range in the stacked layer of the conductor layers A and C and the stacked layer of the conductor layers B and C. Thereby, since the light-shielding restrictions of the conductor layers A and B can be alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1222A of the conductor layer C are electrically connected, and the reticulated conductor 1202 of the conductor layer B and the linear conductor 1222B of the conductor layer C are electrically connected, the current amount of the conductor layers A and B can be made small. Therefore, the inductive noise and the voltage drop from the conductor layer A or B can be further improved.

Modification of Second Configuration Example of Three-Layer Conductor Layer

Figure 124:
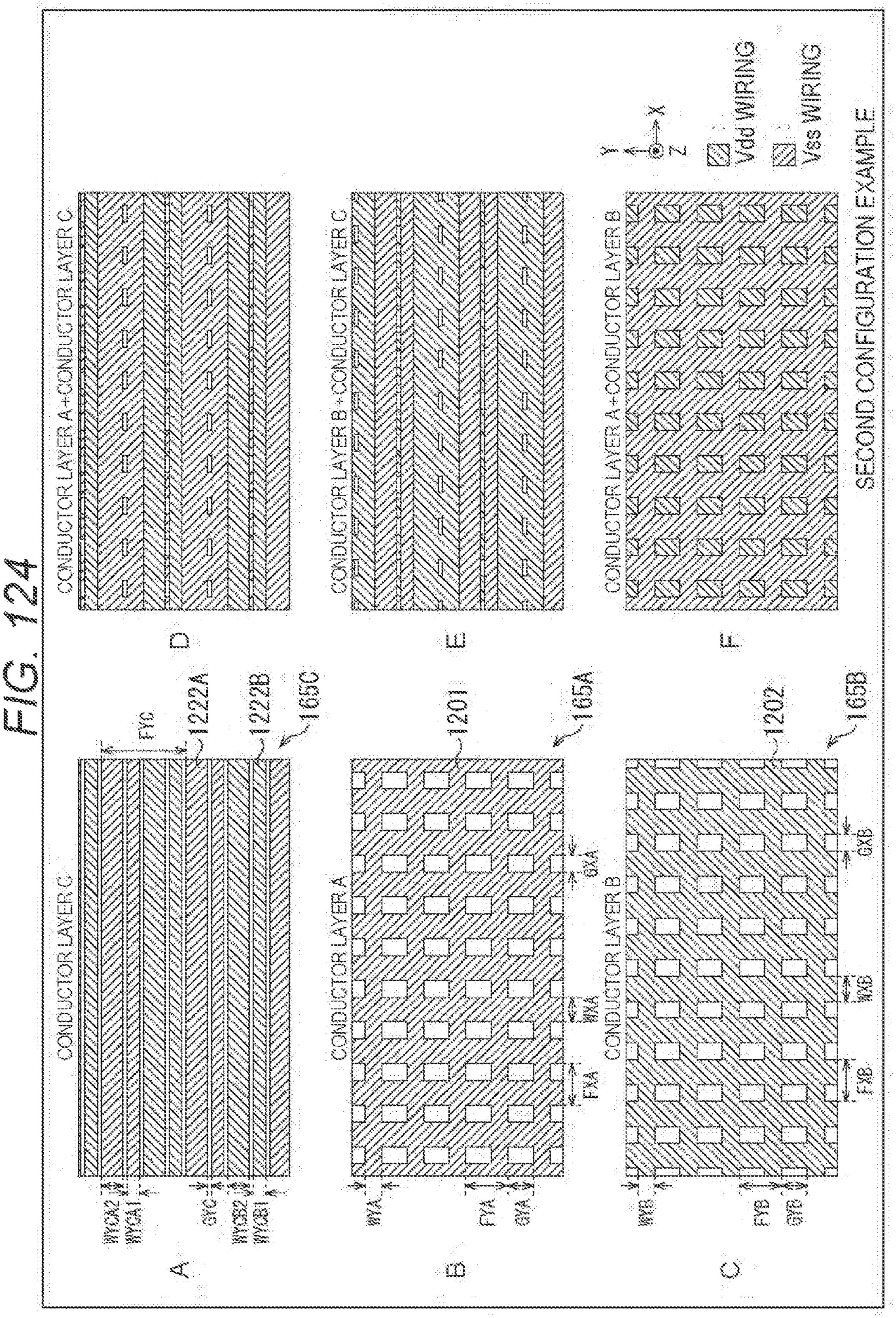

FIG. 124 illustrates a first modification of the second configuration example of the three-layer conductor layer.

A to F in FIG. 124 correspond to A to F in FIG. 123, respectively, and description of common parts having the same reference numerals will be omitted as appropriate, and different parts will be described.

In the second configuration example in FIG. 123, in the conductor layer C, the conductor widths WYCA in the Y direction of the two linear conductors 1222A adjacent in the Y direction are the same. In contrast, in the first modification in FIG. 124, the conductor widths of the two linear conductors 1222A adjacent in the Y direction are different, which are a conductor width WYCA1 and a conductor width WYCA2 (conductor width WYCA1<conductor width WYCA2). Note that the conductor width WYCA1 and the conductor width WYCA2 can be designed to arbitrary values.

Similarly, in the second configuration example in FIG. 123, in the conductor layer C, the conductor widths WYCB in the Y direction of the two linear conductors 1222B adjacent in the Y direction are the same. In contrast, in the first modification in FIG. 124, the conductor widths of the two linear conductors 1222B adjacent in the Y direction are different, which are a conductor width WYCB1 and a conductor width WYCB2 (conductor width WYCB1<conductor width WYCB2). Note that the conductor width WYCB1 and the conductor width WYCB2 can be designed to arbitrary values.

The configuration of the first modification in FIG. 124 is similar to the second configuration example in FIG. 123 except for the difference in the conductor widths of the linear conductors 1222A and 1222B.

Figure 125:
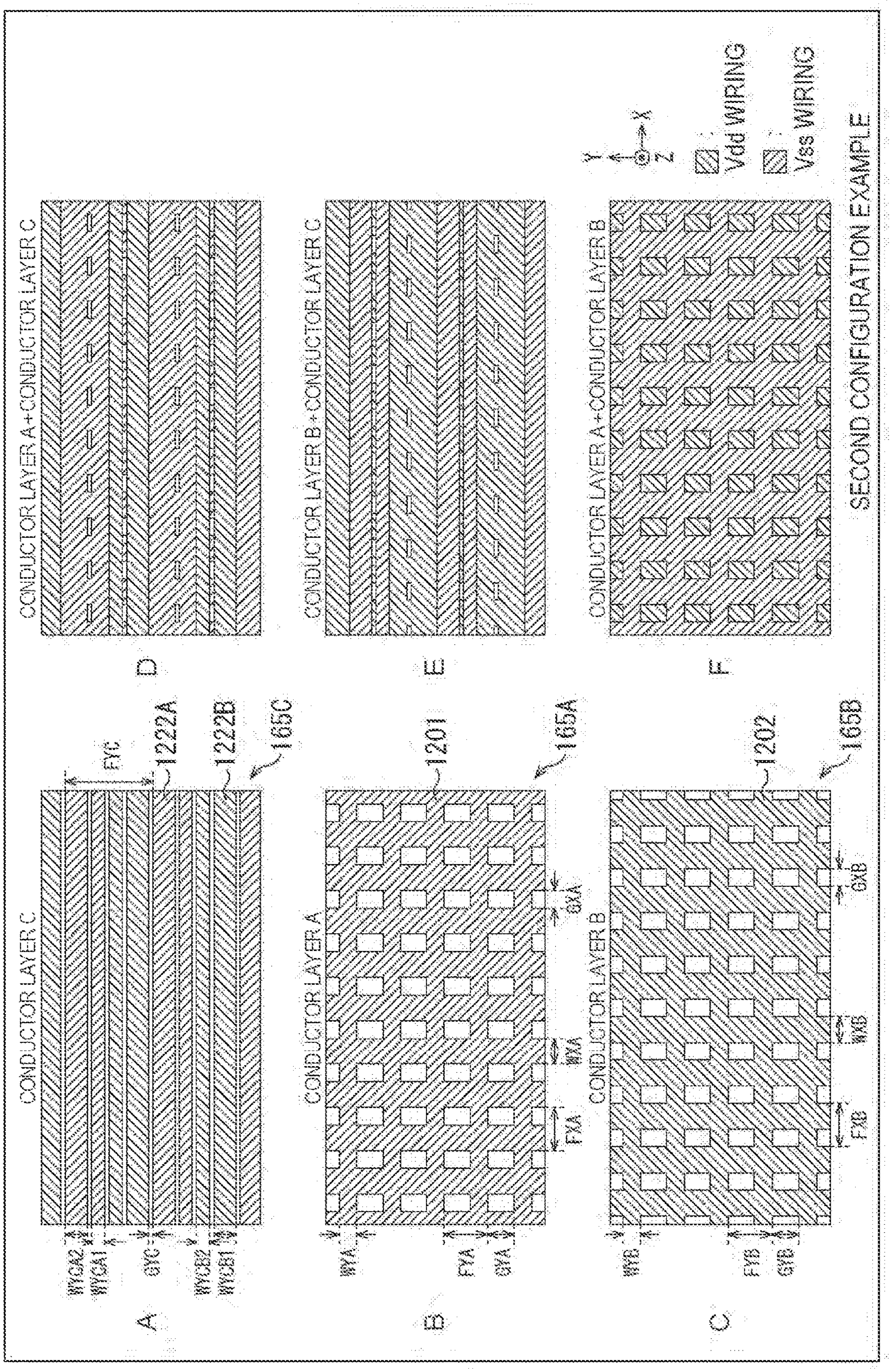

FIG. 125 illustrates a second modification of the second configuration example of the three-layer conductor layer.

A to F in FIG. 125 correspond to A to F in FIG. 123, respectively, and description of common parts having the same reference numerals will be omitted as appropriate, and different parts will be described.

The second modification in FIG. 125 is different from the second configuration example in FIG. 123 and is common to the first modification in FIG. 124 in that the conductor widths of the two linear conductors 1222A adjacent in the Y direction are different are different in the conductor layer C. Furthermore, the second modification in FIG. 125 is different from the second configuration example in FIG. 123 and is common to the first modification in FIG. 124 in that the conductor widths of the two linear conductors 1222B adjacent in the Y direction are different Meanwhile, in the first modification in FIG. 124, the arrangement of the two linear conductors 1222A having different conductor widths is the same as the arrangement of the two linear conductors 1222B. Specifically, in a case where the two linear conductors 1222A are arranged in the Y direction in the order of the linear conductor 1222A with a narrow conductor width (with the conductor width WYCA1) and the linear conductor 1222A with a wide conductor width (with the conductor width WYCA2), the two linear conductors 1222B are also arranged in the Y direction in the order of the linear conductor 1222B with a narrow conductor width (with the conductor width WYCB1) and the linear conductor 1222B with a wide conductor width (with the conductor width WYCB2)

In contrast, in the second modification in FIG. 125, the arrangement of the two linear conductors 1222A having different conductor widths is different from the arrangement of the two linear conductors 1222B. Specifically, in a case where the two linear conductors 1222A are arranged in the Y direction in the order of the linear conductor 1222A with a narrow conductor width (with the conductor width WYCA1) and the linear conductor 1222A with a wide conductor width (with the conductor width WYCA2), the two linear conductors 1222B are arranged in the Y direction in the order of the linear conductor 1222B with a wide conductor width (with the conductor width WYCB1) and the linear conductor 1222B with a narrow conductor width (with the conductor width WYCB2) In other words, the two linear conductors 1222A and 1222B with different conductor widths are arranged mirror-symmetrically in the Y direction.

The configuration of the second modification in FIG. 125 is similar to the second configuration example in FIG. 123 except for the difference in the conductor widths of the linear conductors 1222A and 1222B.

Even in the first modification and the second modification in FIGS. 124 and 125, when the conductor layer C is viewed in a predetermined plane range (plane region), the sum of the conductor widths WYCA1 and WYCA2 of a plurality of linear conductors 1222A and the sum of the conductor widths WYCB1 and WYCB2 of a plurality of linear conductors 1222B in the predetermined plane range are the same or substantially the same. As a result, the current distribution of the linear conductor 1222A and the current distribution of the linear conductor 1222B become the same or substantially the same, so that generation of inductive noise can be suppressed.

Even in the first modification and the second modification in FIGS. 124 and 125, the capacitive noise can be significantly improved and the light-shielding restriction of the conductor layers A and B can be alleviated. Furthermore, the wiring resistance can be lowered and the voltage drop can be improved. Moreover, the degree of freedom in layout of the conductor layers A and B can be improved.

Third Configuration Example of Three-Layer Conductor Layer

Figure 126:
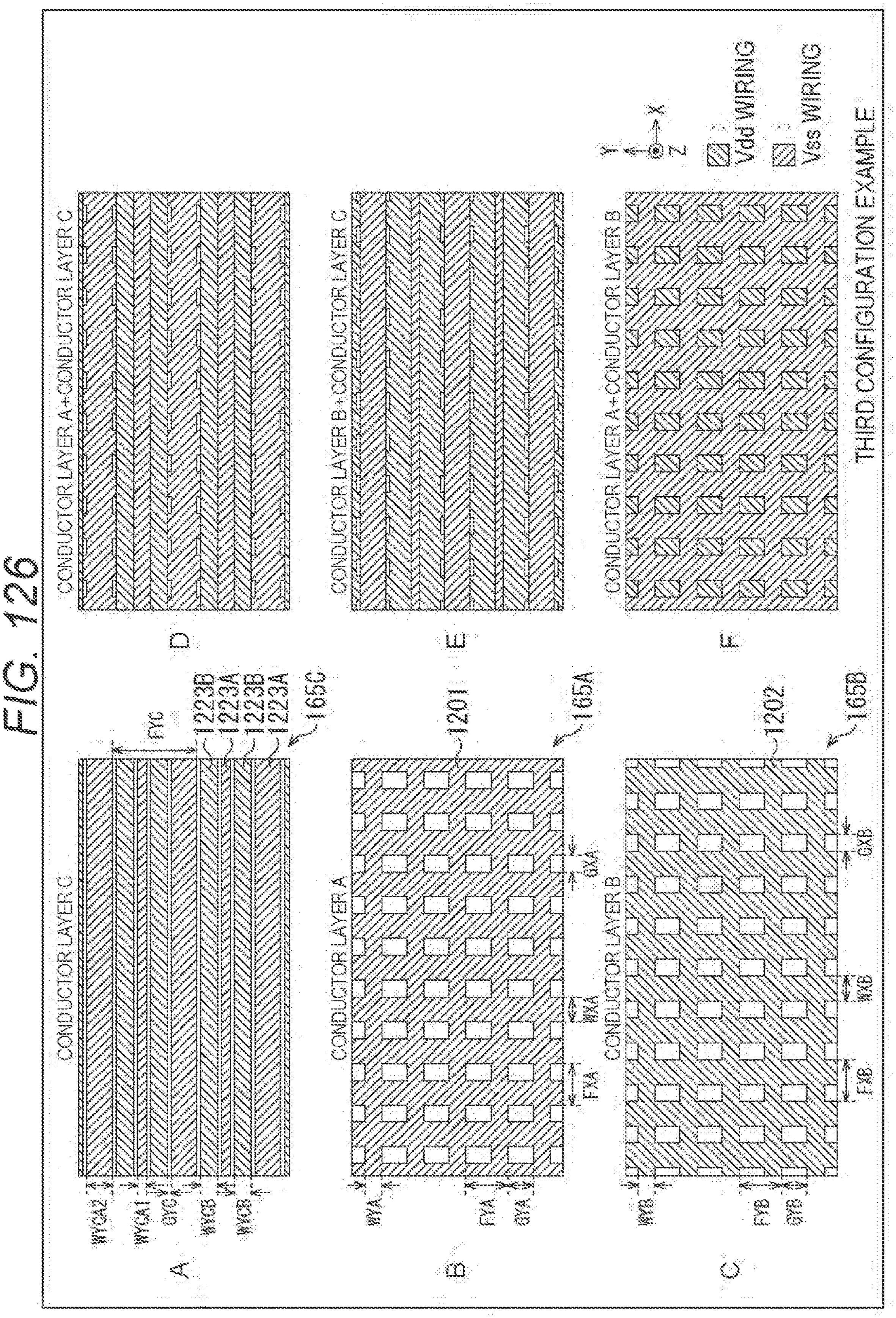

FIG. 126 illustrates a third configuration example of the three-layer conductor layer.

A in FIG. 126 illustrates the conductor layer C (wiring layer 165C), B in FIG. 126 illustrates the conductor layer A (wiring layer 165A), and C in FIG. 126 illustrates the conductor layer B (wiring layer 165B).

Furthermore, D in FIG. 126 is a plan view of a stacked state of the conductor layer A and the conductor layer C, E in FIG. 126 is a plan view of a stacked state of the conductor layer B and the conductor layer C, and F in FIG. 126 is a plan view of a stacked state of the conductor layer A and the conductor layer B.

The conductor layer A in B in FIG. 126 is a reticulated conductor 1201 that is the same as the first configuration example in FIG. 122, and the conductor layer B in C in FIG. 126 is a reticulated conductor 1202 that is the same as the first configuration example in FIG. 122. Therefore, description thereof is omitted.

The conductor layer C in A in FIG. 126 is similar to the first configuration example in FIG. 122 in that a linear conductor 1223A long in the X direction and a linear conductor 1223B long in the X direction are alternately and periodically arranged in the Y direction. Note that, in the first configuration example in FIG. 122, the conductor widths of the linear conductors 1221A arranged in order in the Y direction are all the same, which are the conductor width WYCA.

In contrast, in the third configuration example in FIG. 126, among the linear conductors 1223A and the linear conductors 1223B alternately and periodically arranged in the Y direction, for the linear conductors 1223A, the linear conductors 1223A having the different conductor width WYCA1 and conductor width WYCA2 are alternately arranged in the Y direction, whereas, for the linear conductors 1223B, the linear conductors 1223A having the same conductor width WYCB are arranged.

The third configuration example in FIG. 126 is similar to the first configuration example in FIG. 122 except for the difference in the conductor widths of the linear conductors 1223A and 1223B.

That is, the linear conductor 1223A is, for example, wiring (Vss wiring) connected to the GND or the negative power supply. The linear conductor 1223B is, for example, a wiring (Vdd wiring) connected to the positive power supply. The linear conductor 1223A and the linear conductor 1223B are differential conductors whose current directions are opposite to each other. The linear conductor 1223A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1223A of the conductor layer C may be electrically connected via, for example, a conductor via (VIA) extending in the Z direction. The linear conductor 1223B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1223B of the conductor layer C may be electrically connected via, for example, a conductor via (VIA) extending in the Z direction.

There is a gap with the gap width GYC between the linear conductor 1223A and the linear conductor 1223B adjacent in the Y direction. Then, the two linear conductors 1223A and the two linear conductors 1223B are periodically arranged in the Y direction with the conductor period FYC (=the conductor width WYCA1+the conductor width WYCA2+2×the conductor width WYCB+4×the gap width GYC). Note that the conductor width WYCA1, the conductor width WYCA2, the conductor width WYCB, and the gap width GYC can be designed to any values. Furthermore, FIG. 126 illustrates an example in which the two linear conductors 1223A and two linear conductors 1223B are periodically arranged. However, the configuration is not limited thereto, and three or more linear conductors may be periodically arranged, for example. Furthermore, FIG. 126 illustrates an example in which the same numbers of linear conductors 1223A and linear conductors 1223B are periodically arranged. However, the configuration is not limited thereto, and different numbers of linear conductors 1223A and linear conductors 1223B may be periodically arranged.

When the conductor layer C in which the linear conductor 1223A and the linear conductor 1223B are periodically arranged in the Y direction in the conductor period FYC is viewed in a predetermined plane range (plane region), the sum of the conductor widths WYCA1 and WYCA2 of a plurality of linear conductors 1223A and the sum of the conductor widths WYCB of a plurality of linear conductors 1223B in the predetermined plane range are the same or substantially the same. As a result, the current distribution of the linear conductor 1223A and the current distribution of the linear conductor 1223B become the same or substantially the same, so that generation of inductive noise can be suppressed.

Even in the third configuration example in FIG. 126, the capacitive noise can be significantly improved and the light-shielding restriction of the conductor layers A and B can be alleviated. Furthermore, the wiring resistance can be lowered and the voltage drop can be improved. Moreover, the degree of freedom in layout of the conductor layers A and B can be improved.

Modification of Third Configuration Example of Three-Layer Conductor Layer

Figure 127:
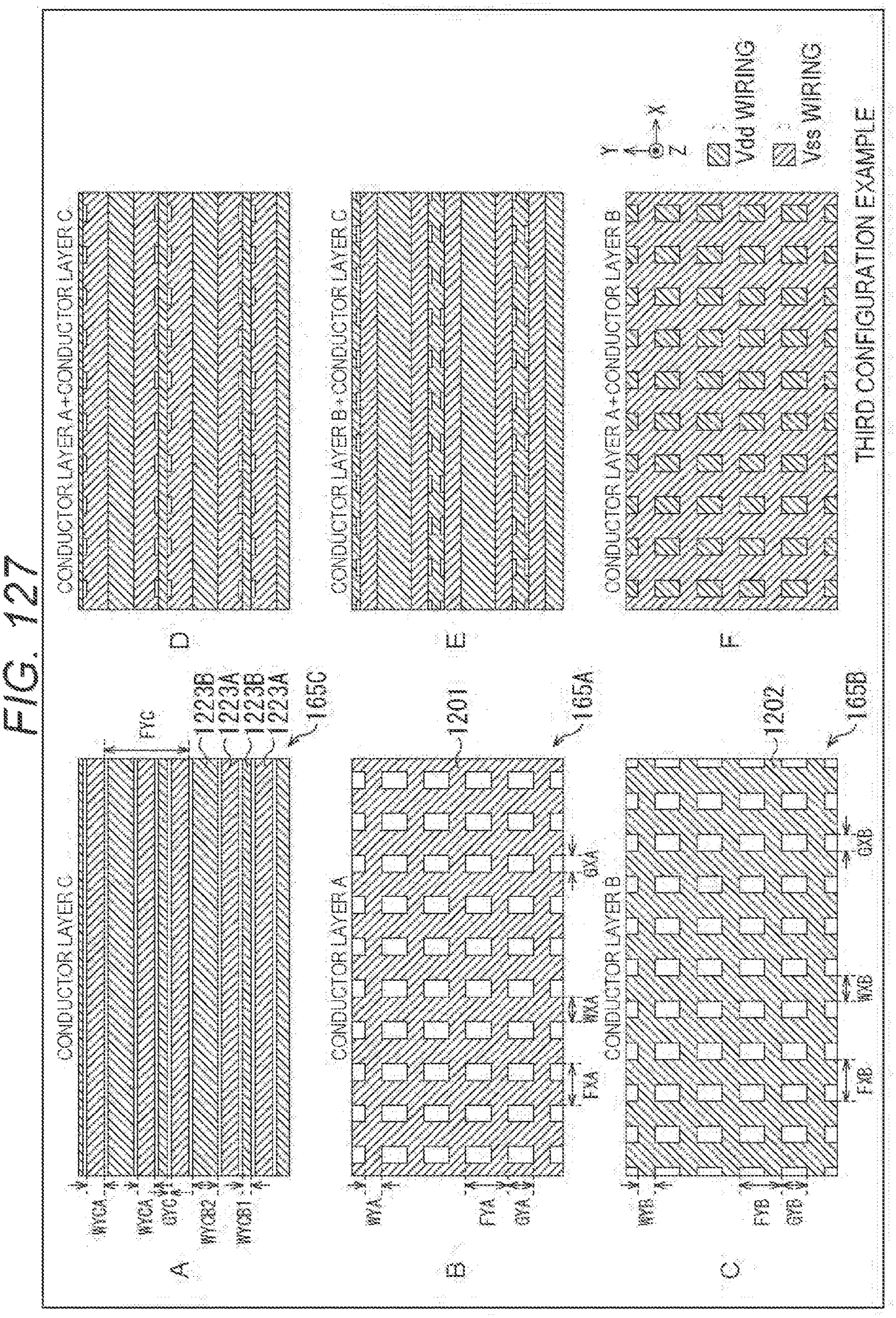

FIG. 127 illustrates a modification of the third configuration example of the three-layer conductor layer.

A to F in FIG. 127 correspond to A to F in FIG. 126, respectively, and description of common parts having the same reference numerals will be omitted as appropriate, and different parts will be described.

In the third configuration example in FIG. 126, there are two types of conductor widths: the conductor width WYCA1 and the conductor width WYCA2 for the conductor widths of the linear conductors 1223A, and the linear conductors 1223B have the same conductor width WYCB, among the linear conductors 1223A and the linear conductors 1223B alternately and periodically arranged in the Y direction in the conductor layer C.

In contrast, in the modification of the third configuration example in FIG. 127, the linear conductors 1223A have the same conductor width WYCA, and there are two types of conductor widths: the conductor width WYCB1 and the conductor width WYCB2 for the conductor widths of the linear conductors 1223B, among the linear conductors 1223A and the linear conductors 1223B alternately and periodically arranged in the Y direction in the conductor layer C. In the modification of the third configuration example in FIG. 127, the linear conductors 1223B having different conductor width WYCB1 and conductor width WYCB2 are alternately arranged in the Y direction.

The modification of the third configuration example in FIG. 127 is similar to the third configuration example in FIG. 126 except for the difference in the conductor widths of the linear conductors 1223A and 1223B.

When the conductor layer C in which the linear conductor 1223A and the linear conductor 1223B are periodically arranged in the Y direction in the conductor period FYC is viewed in a predetermined plane range (plane region), the sum of the conductor widths WYCA of a plurality of linear conductors 1223A and the sum of the conductor widths WYCB1 and WYCB2 of a plurality of linear conductors 1223B in the predetermined plane range are the same or substantially the same. As a result, the current distribution of the linear conductor 1223A and the current distribution of the linear conductor 1223B become the same or substantially the same, so that generation of inductive noise can be suppressed.

Even in the modification of the third configuration example in FIG. 127, the capacitive noise can be significantly improved and the light-shielding restriction of the conductor layers A and B can be alleviated. Furthermore, the wiring resistance can be lowered and the voltage drop can be improved. Moreover, the degree of freedom in layout of the conductor layers A and B can be improved.

Fourth Configuration Example of Three-Layer Conductor Layer

Figure 128:
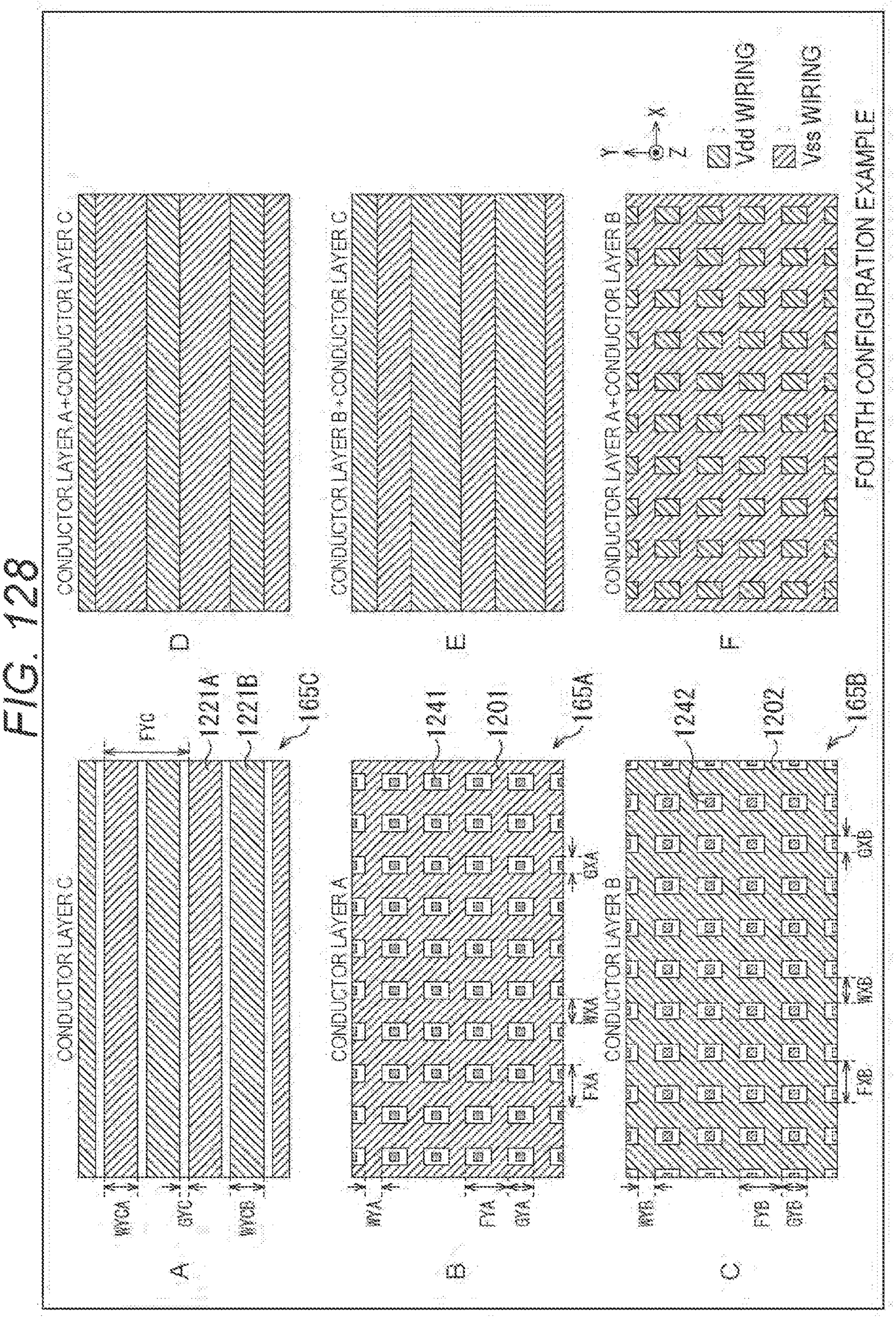

FIG. 128 illustrates a fourth configuration example of the three-layer conductor layer.

A in FIG. 128 illustrates the conductor layer C (wiring layer 165C), B in FIG. 128 illustrates the conductor layer A (wiring layer 165A), and C in FIG. 128 illustrates the conductor layer B (wiring layer 165B).

Furthermore, D in FIG. 128 is a plan view of a stacked state of the conductor layer A and the conductor layer C, E in FIG. 128 is a plan view of a stacked state of the conductor layer B and the conductor layer C, and F in FIG. 128 is a plan view of a stacked state of the conductor layer A and the conductor layer B.

In the fourth configuration example in FIG. 128, a portion corresponding to that in the first configuration example illustrated in FIG. 122 is given the same reference numeral and description of the portion is omitted as appropriate, and description will be given focusing on different portions.

The conductor layer C in A in FIG. 128 is similar to the conductor layer C of the first configuration example illustrated in FIG. 122. That is, the conductor layer C is configured such that a linear conductor 1221A long in the X direction and a linear conductor 1221B long in the X direction are alternately and periodically arranged in the Y direction with the conductor period FYC.

The conductor layer A in B in FIG. 128 has the same reticulated conductor 1201 as in FIG. 121. Furthermore, the conductor layer A includes a relay conductor 1241 (first relay conductor) inside the gap having the gap width GXA in the X direction and the gap width GYA in the Y direction of the reticulated conductor 1201. The relay conductor 1241 is arranged one-to-one in all the gaps of the reticulated conductor 1201. The distance between the relay conductors 1241, in other words, the period of the relay conductor 1241 is also the conductor periods FXA and FYA.

The relay conductor 1241 is, for example, wiring (Vdd wiring) connected to the positive power supply, and electrically connects the reticulated conductor 1202 of the conductor layer B and the linear conductor 1221B of the conductor layer C via, for example, the conductor via (VIA) extending in the Z direction, in the case of the stacking order illustrated in C in FIG. 120. In other words, the reticulated conductor 1202 of the conductor layer B and the linear conductor 1221B of the conductor layer C are electrically connected via the relay conductor 1241 of the conductor layer A. Furthermore, the relay conductor 1241 may electrically connect the reticulated conductor 1202 of the conductor layer B and a conductor of a conductor layer different from the conductor layers A to C via, for example, the conductor via (VIA) extending in the Z direction, in the case of the stacking order illustrated in A in FIG. 120. Furthermore, the relay conductor 1241 may electrically connect the linear conductor 1221B of the conductor layer C and a conductor of a conductor layer different from the conductor layers A to C via, for example, the conductor via (VIA) extending in the Z direction, in the case of the stacking order illustrated in B in FIG. 120. Furthermore, not all the relay conductors 1241 may be used for electrical connection, all the relay conductors 1241 may be used for electrical connection, or some of the relay conductors 1241 may be used for electrical connection.

By providing the relay conductor 1241, it becomes possible to connect the reticulated conductor 1202 and the linear conductor 1221B in the substantially shortest distance or a short distance to draw the power supply, thereby reducing the voltage drop, energy loss, or inductive noise.

The conductor layer B in C in FIG. 128 has the same reticulated conductor 1202 as in FIG. 121. Furthermore, the conductor layer B includes a relay conductor 1242 (second relay conductor) inside the gap having the gap width GXB in the X direction and the gap width GYB in the Y direction of the reticulated conductor 1202. The relay conductor 1242 is arranged one-to-one in all the gaps of the reticulated conductor 1202. The distance between the relay conductors 1242, in other words, the period of the relay conductors 1242 is also the conductor periods FXB and FYB.

The relay conductor 1242 is, for example, wiring (Vss wiring) connected to GND or the negative power supply, and electrically connects the reticulated conductor 1201 of the conductor layer A and the linear conductor 1221A of the conductor layer C via, for example, the conductor via (VIA) extending in the Z direction, in the case of the stacking layer illustrated in A in FIG. 120. In other words, the reticulated conductor 1201 of the conductor layer B and the linear conductor 1221A of the conductor layer C are electrically connected via the relay conductor 1242 of the conductor layer B. Furthermore, the relay conductor 1242 may electrically connect the reticulated conductor 1201 of the conductor layer A and a conductor of a conductor layer different from the conductor layers A to C via, for example, the conductor via (VIA) extending in the Z direction, in the case of the stacking order illustrated in C in FIG. 120. Furthermore, the relay conductor 1242 may electrically connect the linear conductor 1221A of the conductor layer C and a conductor of a conductor layer different from the conductor layers A to C via, for example, the conductor via (VIA) extending in the Z direction, in the case of the stacking order illustrated in B in FIG. 120. Furthermore, not all the relay conductors 1242 may be used for electrical connection, all the relay conductors 1242 may be used for electrical connection, or some of the relay conductors 1242 may be used for electrical connection.

By providing the relay conductor 1242, it becomes possible to connect the reticulated conductor 1201 and the linear conductor 1221A in the substantially shortest distance or a short distance, thereby reducing the voltage drop, energy loss, or inductive noise.

Furthermore, since the linear conductor 1221A and the linear conductor 1221B in A in FIG. 128 are conductors long in the X direction, the direction in which the current easily flows is the X direction. Furthermore, the direction in which the current of the reticulated conductors 1201 and 1202 in B and C in FIG. 128 is likely to flow is the Y direction. Therefore, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

As illustrated in F in FIG. 128, the stacked layer of the conductor layers A and B has a light-shielding structure. Furthermore, as illustrated in D and E in FIG. 128, the stacked layer of the conductor layers A and C and the stacked layer of the conductor layers B and C have a light-shielding structure, and the light-shielding property is maintained. As a result, the hot carrier light emission from the active element group 167 can be shielded. Furthermore, since the light-shielding restrictions of the conductor layers A and B can be significantly alleviated, the conductive area of the conductor layers A and B can be used to the maximum, the wiring resistance can be lowered, and the voltage drop can be further improved. The degree of freedom in layout of the conductor layers A and B can be improved.

Modification of Fourth Configuration Example of Three-Layer Conductor Layer

Figure 129:
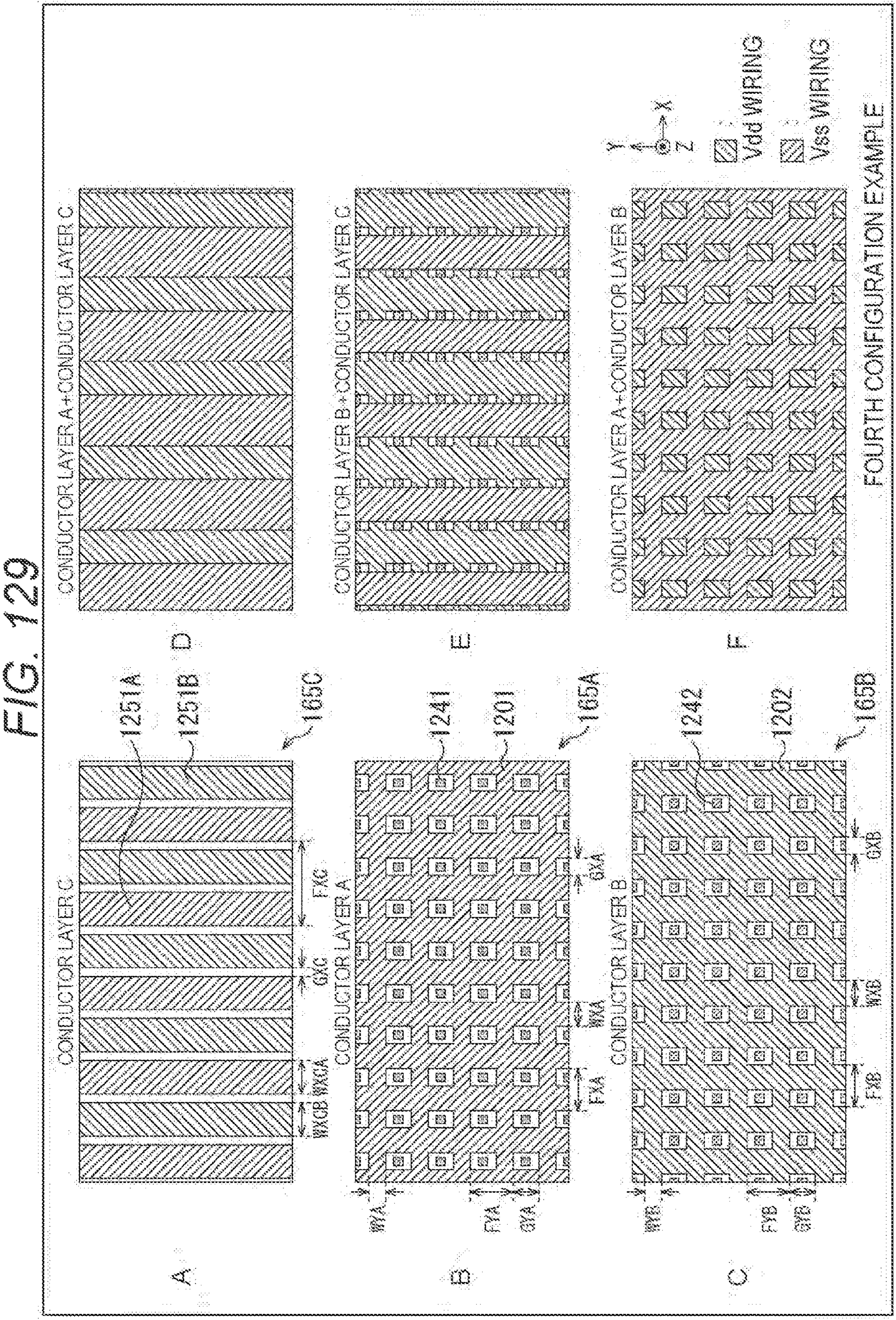

FIG. 129 illustrates a first modification of the fourth configuration example of the three-layer conductor layer.

A in FIG. 129 illustrates the conductor layer C (wiring layer 165C), B in FIG. 129 illustrates the conductor layer A (wiring layer 165A), and C in FIG. 129 illustrates the conductor layer B (wiring layer 165B).

Furthermore, D in FIG. 129 is a plan view of a stacked state of the conductor layer A and the conductor layer C, E in FIG. 129 is a plan view of a stacked state of the conductor layer B and the conductor layer C, and F in FIG. 129 is a plan view of a stacked state of the conductor layer A and the conductor layer B.

In FIG. 129, a portion corresponding to that in the fourth configuration example illustrated in FIG. 128 is given the same reference numeral and description of the portion is omitted as appropriate, and description will be given focusing on different portions.

In the first modification of the fourth configuration example, only the configuration of the conductor layer C in A in FIG. 129 is different from that in FIG. 128.

In the conductor layer C in A in FIG. 128, the linear conductor 1221A long in the X direction and the linear conductor 1221B long in the X direction have been alternately and periodically arranged in the Y direction with the conductor period FYC. Furthermore, the direction in which the current of the conductor layer C is likely to flow and the direction in which the current of the conductor layers A and B is likely to flow are substantially orthogonal and differ by approximately 90 degrees.

In contrast, in the conductor layer C in A in FIG. 129, a linear conductor 1251A long in the Y direction and a linear conductor 1251B long in the Y direction are alternately and periodically arranged in the X direction.

Furthermore, since the linear conductor 1251A and the linear conductor 1251B in A in FIG. 129 are conductors long in the Y direction, the direction in which the current easily flows is the Y direction. Furthermore, the direction in which the current of the reticulated conductors 1201 and 1202 in B and C in FIG. 128 is likely to flow is the Y direction. Thereby, the direction in which the current of the conductor layer C is likely to flow and the direction in which the current of the conductor layers A and B is likely to flow are the same or substantially the same. In this case, the voltage drop can be further improved depending on the wiring layout. Approximately 90 degrees and substantially the same direction is a difference between two directions being 90 degrees or a range that can be regarded as the same angle. The difference is at least less than 45 degrees with respect to 90 degrees or the same angle.

The linear conductor 1251A is, for example, wiring (Vss wiring) connected to the GND or the negative power supply. The linear conductor 1251B is, for example, wiring (Vdd wiring) connected to the positive power supply. The linear conductor 1251A and the linear conductor 1251B are differential conductors whose current directions are opposite to each other. The linear conductor 1251A is connected to, for example, a pad (not illustrated) on an outer periphery of the semiconductor substrate, and is electrically connected to the reticulated conductor 1201 of the conductor layer A. The reticulated conductor 1201 of the conductor layer A and the linear conductor 1251A of the conductor layer C may be electrically connected via, for example, a conductor via (VIA) extending in the Z direction. The linear conductor 1251B is connected to, for example, a pad (not illustrated) on an outer periphery of the semiconductor substrate, and is electrically connected to the reticulated conductor 1202 of the conductor layer B. The reticulated conductor 1202 of the conductor layer B and the linear conductor 1251B of the conductor layer C may be electrically connected via, for example, a conductor via (VIA) extending in the Z direction.

The linear conductor 1251A has a conductor width WXCA in the X direction and the linear conductor 1251B has a conductor width WXCB in the X direction, and the conductor width WXCA of the linear conductor 1251A and the conductor width WXCB of the linear conductor 1251B are the same or substantially the same (the conductor width WXCA=the conductor width WXCB or the conductor width WXCA z the conductor width WXCB). There is a gap with a gap width of GXC between the linear conductor 1251A and the linear conductor 1251B in the Y direction.

Then, the one linear conductor 1251A and the one linear conductor 1251B are periodically arranged in the X direction with a conductor period FXC (=the conductor width WXCA+the conductor width WXCB+2×the gap width GXC). In other words, the conductor period FXC of the linear conductor 1251A and the conductor period FXC of the linear conductor 1251B are the same or substantially the same.

Furthermore, the conductor period FXC that is a repetition period of the linear conductor 1251A of the conductor layer C is an integral multiple of the conductor period FXA that is a repetition period in the X direction of the reticulated conductor 1201 of the conductor layer A. FIG. 129 illustrates an example in which the conductor period FXC is twice the conductor period FYA.

The conductor period FXC that is a repetition period of the linear conductor 1251B of the conductor layer C is an integral multiple of the conductor period FXB that is a repetition period in the X direction of the reticulated conductor 1202 of the conductor layer B. FIG. 129 illustrates an example in which the conductor period FXC is twice the conductor period FXB.

Note that the conductor width WXCA, the conductor width WXCB, and the gap width GXC can be designed to arbitrary values.

When the conductor layer C in which the linear conductor 1251A and the linear conductor 1251B are periodically arranged in the X direction in the conductor period FXC is viewed in a predetermined plane range (plane region), the sum of the conductor widths WXCA of a plurality of linear conductors 1251A and the sum of the conductor widths WXCB of a plurality of linear conductors 1251B in the predetermined plane range are the same or substantially the same because the conductor width WXCA of the linear conductor 1251A and the conductor width WXCB of the linear conductor 1251B are the same or substantially the same. As a result, the current distribution of the linear conductor 1251A and the current distribution of the linear conductor 1251B become the same or substantially the same, so that generation of inductive noise can be suppressed.

Furthermore, in a case where the conductor layer C is arranged near the wiring layer 170, as illustrated in C in FIG. 120, for example, the capacitive noise due to capacitive coupling between the linear conductor 1251A and the linear conductor 1251B of the conductor layer C, and the signal line 132 and the control line 133 of the wiring layer 170 can occur. However, since the linear conductor 1251A and the linear conductor 1251B have the same wiring pattern repeated in the X direction, the capacitive noise can be completely canceled in the X direction. The capacitive noise can be significantly improved as the conductor layer C is closer to the wiring layer 170.

As illustrated in F in FIG. 129, the stacked layer of the conductor layers A and B has a light-shielding structure, and the hot carrier light emission from the active element group 167 can be shielded. In addition, as illustrated in D in FIG. 129, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

Figure 130:
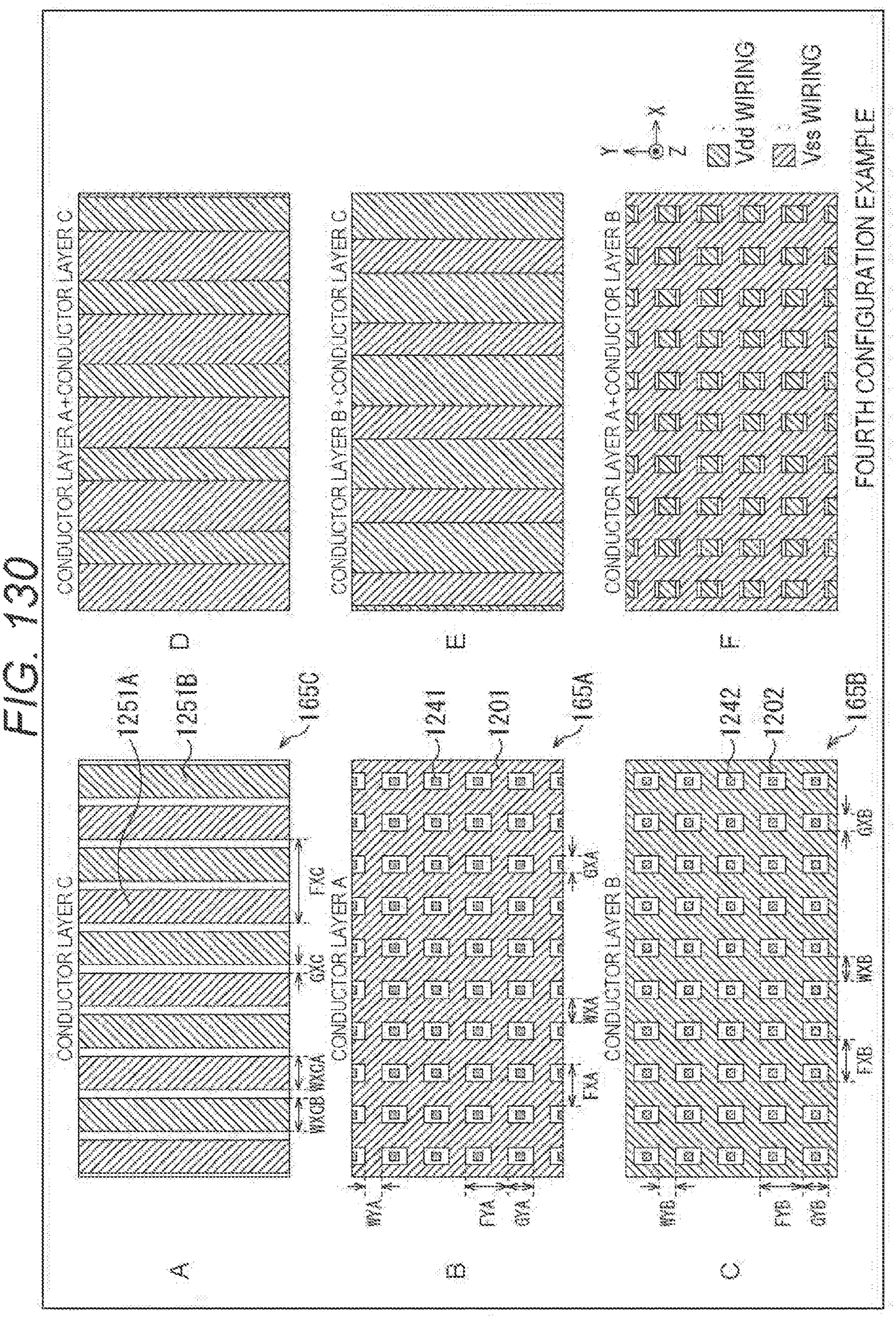

FIG. 130 illustrates a second modification of the fourth configuration example of the three-layer conductor layer.

A to F in FIG. 130 correspond to A to F in FIG. 129, respectively, and description of common parts having the same reference numerals will be omitted as appropriate, and different parts will be described.

In the first modification in FIG. 129, when viewing the positions of the gaps in the reticulated conductor 1201 of the conductor layer A and the reticulated conductor 1202 of the conductor layer B, the positions in the X direction are different and the positions in the Y direction match.

Meanwhile, in the second modification in FIG. 130, when viewing the positions of the gaps in the reticulated conductor 1201 of the conductor layer A and the reticulated conductor 1202 of the conductor layer B, the positions in the X direction match and the positions in the Y direction are different.

In other words, when comparing the conductors in the same or substantially the same direction as a direction (Y direction) into which the signal line 132 of the wiring layer 170 extends between the reticulated conductor 1201 of the conductor layer A and the reticulated conductor 1202 of the conductor layer B, all the conductors overlap as viewed from the stacking direction. The conductor layer A and the conductor layer B having such a configuration correspond to the sixth configuration example of the conductor layers A and B illustrated in FIG. 27, and can significantly improve the inductive noise, as illustrated in the simulation result in C in FIG. 28.

In the first modification in FIG. 129, when comparing the positions between the relay conductor 1241 of the conductor layer A and the relay conductor 1242 of the conductor layer B, the positions in the X direction are different and the positions in the Y direction match. Meanwhile, in the second modification in FIG. 130, the positions in the X direction match and the positions in the Y direction are different.

In the first modification in FIG. 129, the stacked layer of the conductor layers A and B and the stacked layer of the conductor layers A and C have a light-shielding structure, and the light-shielding property is maintained. Meanwhile, in the second modification in FIG. 130, the stacked layer of the conductor layers A and C and the stacked layer of the conductor layers B and C have a light-shielding structure, and the light-shielding property is maintained.

The second modification in FIG. 130 is similar to the first modification in FIG. 129 except for the above-described points.

Even in the second modification in FIG. 130, when the conductor layer C is viewed in a predetermined plane range (plane region), the current distribution of the linear conductor 1251A and the current distribution of the linear conductor 1251B become the same or substantially the same, so that generation of inductive noise can be suppressed.

Furthermore, since the capacitive noise can be completely canceled in the X direction, the capacitive noise can be significantly improved. Since the stacked layer of the conductor layers A and C and the stacked layer of the conductor layers B and C have the light-shielding structure, the light-shielding restrictions of the conductor layers A and B can be significantly alleviated. Furthermore, the wiring resistance can be lowered and the voltage drop can be improved. Moreover, the degree of freedom in layout of the conductor layers A and B can be improved.

Fifth Configuration Example of Three-Layer Conductor Layer

Figure 131:
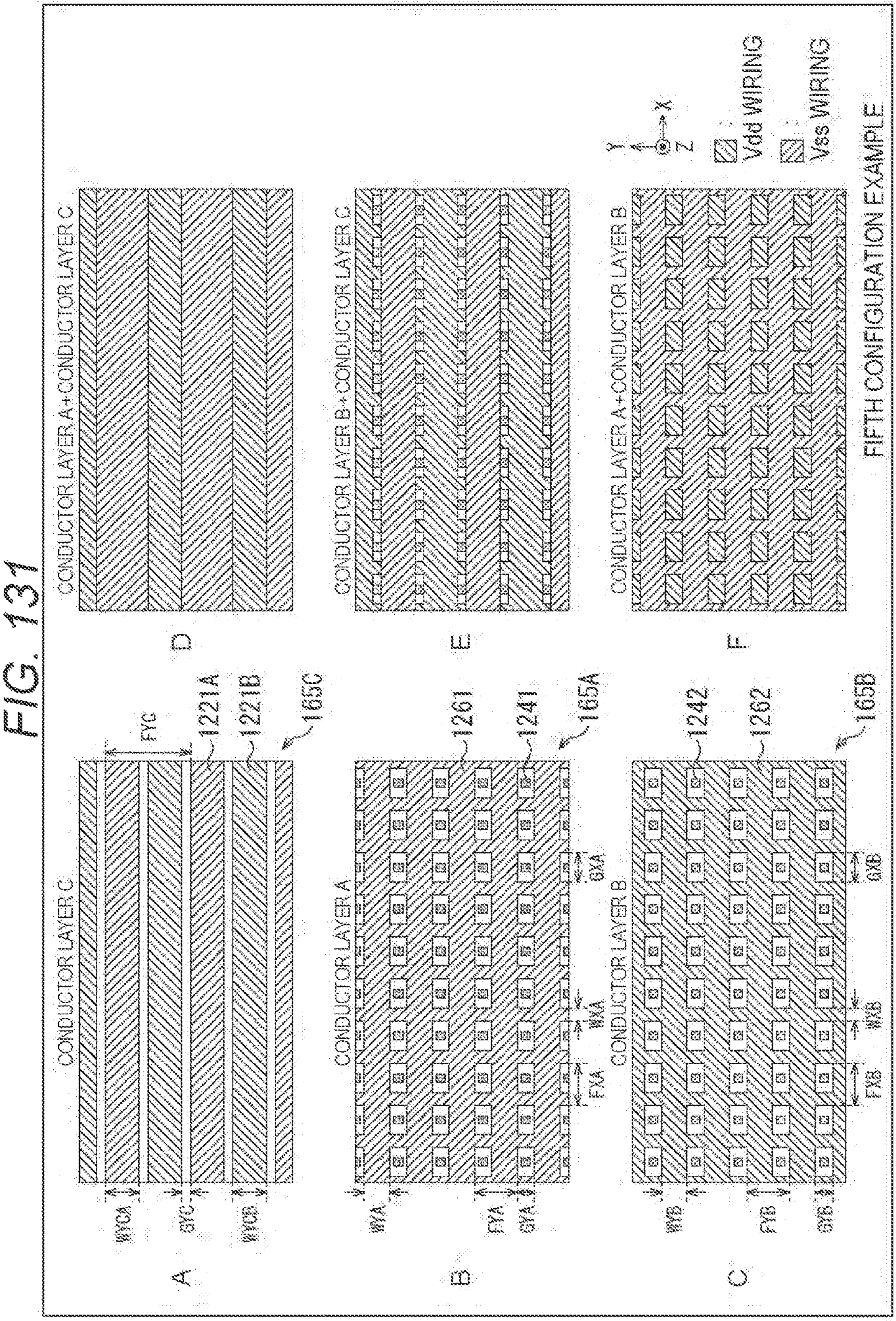

FIG. 131 illustrates a fifth configuration example of the three-layer conductor layer.

A in FIG. 131 illustrates the conductor layer C (wiring layer 165C), B in FIG. 131 illustrates the conductor layer A (wiring layer 165A), and C in FIG. 131 illustrates the conductor layer B (wiring layer 165B).

Furthermore, D in FIG. 131 is a plan view of a stacked state of the conductor layer A and the conductor layer C, E in FIG. 131 is a plan view of a stacked state of the conductor layer B and the conductor layer C, and F in FIG. 131 is a plan view of a stacked state of the conductor layer A and the conductor layer B.

In the fifth configuration example in FIG. 131, a portion corresponding to that in the fourth configuration example illustrated in FIG. 128 is given the same reference numeral and description of the portion is omitted as appropriate, and description will be given focusing on different portions.

The conductor layer A in B in FIG. 131 has a reticulated conductor 1261. The difference of the reticulated conductor 1261 from the reticulated conductor 1201 of the fourth configuration example illustrated in FIG. 128 is the ratio of the gap width GXA in the X direction and the gap width GYA in the Y direction. Specifically, the reticulated conductor 1201 of the conductor layer A of the fourth configuration example illustrated in FIG. 128 has (the gap width GYA/the gap width GXA)>1, whereas the reticulated conductor 1261 of the conductor layer A of the fifth configuration example in B in FIG. 131 has (the gap width GYA/the gap width GXA)<1.

In other words, the reticulated conductor 1201 of the conductor layer A of the fourth configuration example illustrated in FIG. 128 has the conductor width WXA>the conductor width WYA and the gap width GYA>the gap width GXA, and is a conductor in which the current easily flows in the Y direction, whereas the reticulated conductor 1261 of the conductor layer A of the fifth configuration example in B in FIG. 131 has the conductor width WXA<the conductor width WYA and the gap width GYA<the gap width GXA, and is a conductor in which the current easily flows in the X direction.

Moreover, in other words, the direction in which the current easily flows in the conductor layer C of the fourth configuration example illustrated in FIG. 128 and the direction in which the current easily flows in the conductor layers A and B are substantially orthogonal and differ by approximately 90 degrees, whereas the direction in which the current easily flows in the conductor layer C of the fifth configuration example in B in FIG. 131 and the direction in which the current easily flows in the conductor layers A and B are the same or substantially the same. In the case of the fifth configuration example in FIG. 131, the voltage drop can be further improved depending on the wiring layout.

In the fourth configuration example illustrated in FIG. 128, when comparing the positions of the gaps between the reticulated conductor 1201 of the conductor layer A and the reticulated conductor 1202 of the conductor layer B, the positions in the X direction are different and the positions in the Y direction match.

Meanwhile, in the fifth configuration example in B in FIG. 131, the positions of the gaps in the X direction match and the positions of the gaps in the Y direction are different in the reticulated conductor 1261 of the conductor layer A and the reticulated conductor 1262 of the conductor layer B In other words, when comparing the conductors in the same or substantially the same direction as a direction (Y direction) into which the signal line 132 of the wiring layer 170 extends between the reticulated conductor 1261 of the conductor layer A and the reticulated conductor 1262 of the conductor layer B, all the conductors overlap as viewed from the stacking direction. The conductor layer A and the conductor layer B having such a configuration correspond to the sixth configuration example of the conductor layers A and B illustrated in FIG. 27, and can significantly improve the inductive noise, as illustrated in the simulation result in C in FIG. 28.

The second modification in FIG. 130 is similar to the fourth configuration example illustrated in FIG. 128 except for the above-described points.

The conductor layer C in A in FIG. 131 is the same as the conductor layer C of the fourth configuration example illustrated in FIG. 128. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 131, the stacked layer of the conductor layers A and B has a light-shielding structure, and the hot carrier light emission from the active element group 167 can be shielded. In addition, as illustrated in D in FIG. 131, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1261 of the conductor layer A and the linear conductor 1221A of the conductor layer C are electrically connected, and the reticulated conductor 1262 of the conductor layer B and the linear conductor 1221B of the conductor layer C are electrically connected, the current amount of the conductor layers A and B can be made small. Therefore, the inductive noise and the voltage drop from the conductor layer A or B can be further improved.

Sixth Configuration Example of Three-Layer Conductor Layer

FIG. 132 illustrates a sixth configuration example of the three-layer conductor layer.

A in FIG. 132 illustrates the conductor layer C (wiring layer 165C), B in FIG. 132 illustrates the conductor layer A (wiring layer 165A), and C in FIG. 132 illustrates the conductor layer B (wiring layer 165B).

Furthermore, D in FIG. 132 is a plan view of a stacked state of the conductor layer A and the conductor layer C, E in FIG. 132 is a plan view of a stacked state of the conductor layer B and the conductor layer C, and F in FIG. 132 is a plan view of a stacked state of the conductor layer A and the conductor layer B.

In the sixth configuration example in FIG. 132, a portion corresponding to that in the fourth configuration example illustrated in FIG. 128 is given the same reference numeral and description of the portion is omitted as appropriate, and description will be given focusing on different portions.

The sixth configuration example in FIG. 132 is a configuration in which a part of the relay conductor 1241 of the conductor layer A is omitted in the fourth configuration example illustrated in FIG. 128. Specifically, in the fourth configuration example in FIG. 128, the relay conductor 1241 is formed in all the gaps in a matrix of the reticulated conductor 1201, whereas in the sixth configuration example in FIG. 132, a row in which the relay conductor 1241 is formed and a row in which the relay conductor 1241 is not formed are alternately arranged in the Y direction in units of rows. The relay conductor 1241 of the conductor layer A is located in the XY plane region of the linear conductor 1221B of the conductor layer C.

In this way, the relay conductor 1241 formed in each gap of the reticulated conductor 1201 may be thinned out and arranged in a part of the gaps instead of being arranged in all the gaps. The restrictions such as occupancy of the wiring region in the conductor layer A can be secured, and the degree of freedom in designing the wiring layout can be increased.

The sixth configuration example in FIG. 132 is similar to the fourth configuration example illustrated in FIG. 128 except for the above-described points.

The conductor layer C in A in FIG. 132 is the same as the conductor layer C of the fourth configuration example illustrated in FIG. 128. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 132, the stacked layer of the conductor layers A and B has a light-shielding structure, and the hot carrier light emission from the active element group 167 can be shielded. In addition, as illustrated in D and E in FIG. 132, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the sixth configuration example in FIG. 132, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

Modification of Sixth Configuration Example of Three-Layer Conductor Layer

FIG. 133 illustrates a modification of the sixth configuration example of the three-layer conductor layer.

A in FIG. 133 illustrates the conductor layer C (wiring layer 165C), B in FIG. 133 illustrates the conductor layer A (wiring layer 165A), and C in FIG. 133 illustrates the conductor layer B (wiring layer 165B).

Furthermore, D in FIG. 133 is a plan view of a stacked state of the conductor layer A and the conductor layer C, E in FIG. 133 is a plan view of a stacked state of the conductor layer B and the conductor layer C, and F in FIG. 133 is a plan view of a stacked state of the conductor layer A and the conductor layer B.

In FIG. 133, a portion corresponding to that in the sixth configuration example illustrated in FIG. 132 is given the same reference numeral and description of the portion is omitted as appropriate, and description will be given focusing on different portions.

In the modification of the sixth configuration example, the configurations of the conductor layer A and the conductor layer C are different from those of the sixth configuration example in FIG. 132.

In the conductor layer C in A in FIG. 132, the linear conductor 1221A long in the X direction and the linear conductor 1221B long in the X direction have been alternately and periodically arranged in the Y direction. Thereby, the direction in which the current of the conductor layer C is likely to flow and the direction in which the current of the conductor layers A and B is likely to flow are substantially orthogonal and differ by approximately 90 degrees.

In contrast, in the conductor layer C in A in FIG. 133, a linear conductor 1251A long in the Y direction and a linear conductor 1251B long in the Y direction are alternately and periodically arranged in the X direction. Thereby, the direction in which the current of the conductor layer C is likely to flow and the direction in which the current of the conductor layers A and B is likely to flow are the same or substantially the same. In this case, the voltage drop can be further improved depending on the wiring layout.

Next, in the conductor layer A in B in FIG. 132, a row in which the relay conductor 1241 is formed and a row in which the relay conductor 1241 is not formed are alternately arranged in the Y direction in units of rows in the gaps in a matrix of the reticulated conductor 1201.

In contrast, in the conductor layer A in B in FIG. 133, a column in which the relay conductor 1241 is formed and a column in which the relay conductor 1241 is not formed are alternately arranged in the X direction in units of columns in the gaps in a matrix of the reticulated conductor 1201. The relay conductor 1241 of the conductor layer A is located in the XY plane region of the linear conductor 1251B of the conductor layer C.

The modification of the sixth configuration example in FIG. 133 is similar to the sixth configuration example illustrated in FIG. 132 except for the above-described points.

The conductor layer C in A in FIG. 133 is the same as the conductor layer C of the first modification of the fourth configuration example illustrated in FIG. 129. Therefore, the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in F in FIG. 133, the stacked layer of the conductor layers A and B has a light-shielding structure, and the hot carrier light emission from the active element group 167 can be shielded. In addition, as illustrated in D in FIG. 133, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

Note that, in the modification of the sixth configuration example in FIG. 133, the relay conductors 1241 of the conductor layer A are thinned out, and the relay conductors 1242 of the conductor layer B are not thinned out. However, a configuration in which the relay conductors 1242 of the conductor layer B are thinned out and the relay conductors 1241 of the conductor layer A are not thinned out can also be adopted.

Seventh Configuration Example of Three-Layer Conductor Layer

FIG. 134 illustrates a seventh configuration example of the three-layer conductor layer.

A in FIG. 134 illustrates the conductor layer C (wiring layer 165C), B in FIG. 134 illustrates the conductor layer A (wiring layer 165A), and C in FIG. 134 illustrates the conductor layer B (wiring layer 165B).

Furthermore, D in FIG. 134 is a plan view of a stacked state of the conductor layer A and the conductor layer C, E in FIG. 134 is a plan view of a stacked state of the conductor layer B and the conductor layer C, and F in FIG. 134 is a plan view of a stacked state of the conductor layer A and the conductor layer B.

In the seventh configuration example in FIG. 134, a portion corresponding to that in the fifth configuration example illustrated in FIG. 131 is given the same reference numeral and description of the portion is omitted as appropriate, and description will be given focusing on different portions.

In the seventh configuration example, only the configuration of the conductor layer A in B in FIG. 134 is different from that of the fifth configuration example in FIG. 131. The conductor layers B and C of the seventh configuration example are similar to the conductor layers B and C of the fifth configuration example in FIG. 131.

The conductor layer A in B in FIG. 134 in the seventh configuration example has a reticulated conductor 1271. Furthermore, in the conductor layer A, the relay conductor 1241 is not formed inside the gap having the gap width GXA in the X direction and the gap width GYA in the Y direction of the reticulated conductor 1271.

In other words, the gap width GXA and the gap width GYA of the reticulated conductor 1271 in B in FIG. 134 are smaller than the gap width GXA and the gap width GYA of the reticulated conductor 1261 in B in FIG. 131, and the gap is not sufficient to form the relay conductor 1241.

The seventh configuration example in FIG. 134 is similar to the fifth configuration example illustrated in FIG. 131 except for the above-described points.

The conductor layer C in A in FIG. 134 is the same as the conductor layer C of the fifth configuration example illustrated in FIG. 131. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 134, the stacked layer of the conductor layers A and B has a light-shielding structure, and the hot carrier light emission from the active element group 167 can be shielded. In addition, as illustrated in D in FIG. 134, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

The seventh configuration example in FIG. 134 is particularly suitable for the stacking order in which the three conductor layers A to C can be electrically connected, specifically for the stacking order illustrated in B in FIG. 120. In the case of the stacking order of the conductor layers A, B, and C illustrated in B in FIG. 120, the reticulated conductor 1271 of the conductor layer A and the linear conductor 1221A of the conductor layer C can be connected via the conductor via in the Z direction in a part of a region where plane regions overlap, and the reticulated conductor 1262 and the relay conductor 1242 of the conductor layer B can be respectively connected with the linear conductors 1221B and 1221A of the conductor layer C via the conductor via in the Z direction between the conductors having common current characteristics and in a part of a region where plane regions overlap.

Eighth Configuration Example of Three-Layer Conductor Layer

FIG. 135 illustrates an eighth configuration example of the three-layer conductor layer.

A in FIG. 135 illustrates the conductor layer C (wiring layer 165C), B in FIG. 135 illustrates the conductor layer A (wiring layer 165A), and C in FIG. 135 illustrates the conductor layer B (wiring layer 165B).

Furthermore, D in FIG. 135 is a plan view of a stacked state of the conductor layer A and the conductor layer C, E in FIG. 135 is a plan view of a stacked state of the conductor layer B and the conductor layer C, and F in FIG. 135 is a plan view of a stacked state of the conductor layer A and the conductor layer B.

The eighth configuration example in FIG. 135 has a configuration in which a part of the fourth configuration example illustrated in FIG. 128 is changed. The eighth configuration example in FIG. 135 will be described while being compared with the fourth configuration example. Note that, in FIG. 135, the same reference numerals are given to the portions corresponding to those in FIG. 128.

The conductor layer C in A in FIG. 135 is similar to the conductor layer C of the fourth configuration example illustrated in A in FIG. 128. That is, the conductor layer C is configured such that a linear conductor 1221A long in the X direction and a linear conductor 1221B long in the X direction are alternately and periodically arranged in the Y direction.

The conductor layer A in B in FIG. 128 has a configuration in which a part of the relay conductor 1241 of the conductor layer A is omitted in the fourth configuration example illustrated in FIG. 128. Specifically, in the fourth configuration example in FIG. 128, the relay conductor 1241 is formed in all the gaps in a matrix of the reticulated conductor 1201, whereas in the eighth configuration example in FIG. 135, a row in which the relay conductor 1241 is formed and a row in which the relay conductor 1241 is not formed are alternately arranged in the Y direction in units of rows.

Similarly, the conductor layer B in C in FIG. 128 has a configuration in which a part of the relay conductor 1242 of the conductor layer B is omitted in the fourth configuration example illustrated in FIG. 128. Specifically, in the fourth configuration example in FIG. 128, the relay conductor 1242 is formed in all the gaps in a matrix of the reticulated conductor 1201, whereas in the eighth configuration example in FIG. 135, a row in which the relay conductor 1242 is formed and a row in which the relay conductor 1242 is not formed are alternately arranged in the Y direction in units of rows.

Therefore, the eighth configuration example in FIG. 135 has a configuration in which the relay conductors 1241 arranged in the gaps in the matrix of the reticulated conductor 1201 are thinned out every other row in units of rows in the conductor layer A, and the relay conductor 1242 arranged in the gaps in the matrix of the reticulated conductor 1202 are thinned out every other row in units of rows in the conductor layer B, from the fourth configuration example in FIG. 128.

The eighth configuration example in FIG. 135 is similar to the fourth configuration example illustrated in FIG. 128 except for the above-described points.

When the conductor layer C in A in FIG. 135 is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 135, the stacked layer of the conductor layers A and B has a light-shielding structure, and the hot carrier light emission from the active element group 167 can be shielded. In addition, as illustrated in D and E in FIG. 135, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the eighth configuration example in FIG. 135, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

First Modification of Eighth Configuration Example of Three-Layer Conductor Layer FIG. 136 illustrates a first modification of the eighth configuration example of the three-layer conductor layer.

A in FIG. 136 illustrates the conductor layer C (wiring layer 165C), B in FIG. 136 illustrates the conductor layer A (wiring layer 165A), and C in FIG. 136 illustrates the conductor layer B (wiring layer 165B).

Furthermore, D in FIG. 136 is a plan view of a stacked state of the conductor layer A and the conductor layer C, E in FIG. 136 is a plan view of a stacked state of the conductor layer B and the conductor layer C, and F in FIG. 136 is a plan view of a stacked state of the conductor layer A and the conductor layer B.

In FIG. 136, a portion corresponding to that in the eighth configuration example illustrated in FIG. 135 is given the same reference numeral and description of the portion is omitted as appropriate, and description will be given focusing on different portions.

In the first modification of the eighth configuration example, the configurations of the conductor layers A to C are different from those of the eighth configuration example in FIG. 135.

In the conductor layer C in A in FIG. 135, the linear conductor 1221A long in the X direction and the linear conductor 1221B long in the X direction have been alternately and periodically arranged in the Y direction. Thereby, the direction in which the current of the conductor layer C is likely to flow and the direction in which the current of the conductor layers A and B is likely to flow are substantially orthogonal and differ by approximately 90 degrees.

In contrast, in the conductor layer C in A in FIG. 136, a linear conductor 1251A long in the Y direction and a linear conductor 1251B long in the Y direction are alternately and periodically arranged in the X direction. Thereby, the direction in which the current of the conductor layer C is likely to flow and the direction in which the current of the conductor layers A and B is likely to flow are the same or substantially the same. In this case, the voltage drop can be further improved depending on the wiring layout.

Next, in the conductor layer A in B in FIG. 135, a row in which the relay conductor 1241 is formed and a row in which the relay conductor 1241 is not formed are alternately arranged in the Y direction in units of rows in the gaps in a matrix of the reticulated conductor 1201.

In contrast, in the conductor layer A in B in FIG. 136, a column in which the relay conductor 1241 is formed and a column in which the relay conductor 1241 is not formed are alternately arranged in the X direction in units of columns in the gaps in a matrix of the reticulated conductor 1201. The relay conductor 1241 of the conductor layer A is located in the XY plane region of the linear conductor 1251B of the conductor layer C.

Furthermore, in the conductor layer B in C in FIG. 135, a row in which the relay conductor 1242 is formed and a row in which the relay conductor 1242 is not formed are alternately arranged in the Y direction in units of rows in the gaps in a matrix of the reticulated conductor 1202.

In contrast, in the conductor layer B in C in FIG. 136, a column in which the relay conductor 1242 is formed and a column in which the relay conductor 1242 is not formed are alternately arranged in the X direction in units of columns in the gaps in a matrix of the reticulated conductor 1202.

The first modification of the eighth configuration example in FIG. 136 is similar to the eighth configuration example illustrated in FIG. 135 except for the above-described points.

When the conductor layer C in A in FIG. 136 is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in F in FIG. 136, the stacked layer of the conductor layers A and B has a light-shielding structure, and the hot carrier light emission from the active element group 167 can be shielded. In addition, as illustrated in D in FIG. 136, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

By providing the relay conductor 1241 in the conductor layer A, it becomes possible to connect the reticulated conductor 1202 and the linear conductor 1251B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1251A in the substantially shortest distance or a short distance, thereby reducing the voltage drop, energy loss, or inductive noise.

Second Modification of Eighth Configuration Example of Three-Layer Conductor Layer FIG. 137 illustrates a second modification of the eighth configuration example of the three-layer conductor layer.

A in FIG. 137 illustrates the conductor layer C (wiring layer 165C), B in FIG. 137 illustrates the conductor layer A (wiring layer 165A), and C in FIG. 137 illustrates the conductor layer B (wiring layer 165B).

Furthermore, D in FIG. 137 is a plan view of a stacked state of the conductor layer A and the conductor layer C, E in FIG. 137 is a plan view of a stacked state of the conductor layer B and the conductor layer C, and F in FIG. 137 is a plan view of a stacked state of the conductor layer A and the conductor layer B.

In FIG. 137, a portion corresponding to that in the eighth configuration example illustrated in FIG. 135 is given the same reference numeral and description of the portion is omitted as appropriate, and description will be given focusing on different portions.

In the second modification of the eighth configuration example, the configurations of the conductor layer A and the conductor layer B are different from those of the eighth configuration example in FIG. 135.

When comparing the conductor layer A in B in FIG. 137 with the eighth configuration example illustrated in FIG. 135, a reinforced conductor 1281 having a conductor width WYAd1 in the Y direction is newly added in the gap where the relay conductor 1241 of the reticulated conductor 1201 is not formed. The reinforced conductor 1281 is a linear conductor having the conductor width of the gap width GXA in the X direction and long in the X direction.

When comparing the conductor layer B in C in FIG. 137 with the eighth configuration example illustrated in FIG. 135, a reinforced conductor 1282 having a conductor width WYBd1 in the Y direction is newly added in the gap where the relay conductor 1242 of the reticulated conductor 1202 is not formed. The reinforced conductor 1282 is a linear conductor having the conductor width of the gap width GXB in the X direction and long in the X direction.

The second modification of the eighth configuration example in FIG. 137 is similar to the eighth configuration example illustrated in FIG. 135 except for the above-described points.

When the conductor layer C in A in FIG. 137 is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 137, the stacked layer of the conductor layers A and B has a light-shielding structure, and the hot carrier light emission from the active element group 167 can be shielded. In addition, as illustrated in D and E in FIG. 137, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the second modification of the eighth configuration example in FIG. 137, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

In the conductor layer A, the reinforced conductor 1281 long in the X direction is arranged at the position where the relay conductor 1241 has been thinned out, so that the wiring resistance can be made small, and the voltage drop can be further improved. The inductive noise can also be improved as the voltage drop is improved.

In the conductor layer B, the reinforced conductor 1282 long in the X direction is arranged at the position where the relay conductor 1242 has been thinned out, so that the wiring resistance can be made small, and the voltage drop can be further improved. The inductive noise can also be improved as the voltage drop is improved.

Third Modification of Eighth Configuration Example of Three-Layer Conductor Layer FIG. 138 illustrates a third modification of the eighth configuration example of the three-layer conductor layer.

A in FIG. 138 illustrates the conductor layer C (wiring layer 165C), B in FIG. 138 illustrates the conductor layer A (wiring layer 165A), and C in FIG. 138 illustrates the conductor layer B (wiring layer 165B).

Furthermore, D in FIG. 138 is a plan view of a stacked state of the conductor layer A and the conductor layer C, E in FIG. 138 is a plan view of a stacked state of the conductor layer B and the conductor layer C, and F in FIG. 138 is a plan view of a stacked state of the conductor layer A and the conductor layer B.

In FIG. 138, a portion corresponding to that in the eighth configuration example illustrated in FIG. 135 is given the same reference numeral and description of the portion is omitted as appropriate, and description will be given focusing on different portions.

In the third modification of the eighth configuration example, the configurations of the conductor layer A and the conductor layer B are different from the eighth configuration example in FIG. 135.

First, looking at the conductor layer A, in the eighth configuration example illustrated in FIG. 135, the gaps in the matrix of the reticulated conductor 1201 commonly have the gap width GYA in the Y direction. In other words, the gap width GYA in the Y direction is the same for all the gaps in the matrix of the reticulated conductor 1201.

In contrast, in the conductor layer A in B in FIG. 138, the gap in which the relay conductor 1241 is formed has the gap width GYA in the Y direction, and the gap in which the relay conductor 1241 is not formed has a gap width GYAd1 in the Y direction, which is smaller than the gap width GYA (gap width GYA>gap width GYAd1).

Next, looking at the conductor layer B, in the eighth configuration example illustrated in FIG. 135, the gaps in the matrix of the reticulated conductor 1202 commonly have the gap width GYB in the Y direction. In other words, the gap width GYB in the Y direction is the same for all the gaps in the matrix of the reticulated conductor 1202.

In contrast, in the conductor layer A in B in FIG. 138, the gap in which the relay conductor 1242 is formed has the gap width GYB in the Y direction, and the gap in which the relay conductor 1242 is not formed has a gap width GYBd1 in the Y direction, which is smaller than the gap width GYB (gap width GYB>gap width GYBd1).

The third modification of the eighth configuration example in FIG. 138 is similar to the eighth configuration example illustrated in FIG. 135 except for the above-described points.

When the conductor layer C in A in FIG. 138 is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 138, the stacked layer of the conductor layers A and B has a light-shielding structure, and the hot carrier light emission from the active element group 167 can be shielded. In addition, as illustrated in D and E in FIG. 138, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the reticulated conductor 1202 and the linear conductor 1221B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1221A in the substantially shortest distance or a short distance, thereby reducing the voltage drop, energy loss, or inductive noise.

In the third modification of the eighth configuration example in FIG. 138, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

In the conductor layer A, the gap width GYAd1 at the position where the relay conductor 1241 has been thinned out is made smaller than the gap width GYA at the position where the relay conductor 1241 is formed, so that the wiring resistance can be made small, and the voltage drop can be further improved. The inductive noise can also be improved as the voltage drop is improved.

In the conductor layer B, the gap width GYBd1 at the position where the relay conductor 1242 has been thinned out is made smaller than the gap width GYB at the position where the relay conductor 1242 is formed, so that the wiring resistance can be made small, and the voltage drop can be further improved. The inductive noise can also be improved as the voltage drop is improved.

Note that, in the third modification of the eighth configuration example in FIG. 138, the gap width GYAd1 at the position where the relay conductor 1241 has been thinned out may be made smaller than the gap width GYA at the position where the relay conductor 1241 is formed by making the conductor width WYA in the Y direction of the reticulated conductor 1201 of the conductor layer A thicker, or the conductor width WYA in the Y direction may be the same as that of the eighth configuration example in FIG. 135. The same applies to the reticulated conductor 1202 of the conductor layer B.

Fourth Modification of Eighth Configuration Example of Three-Layer Conductor Layer FIG. 139 illustrates a fourth modification of the eighth configuration example of the three-layer conductor layer.

A in FIG. 139 illustrates the conductor layer C (wiring layer 165C), B in FIG. 139 illustrates the conductor layer A (wiring layer 165A), and C in FIG. 139 illustrates the conductor layer B (wiring layer 165B).

Furthermore, D in FIG. 139 is a plan view of a stacked state of the conductor layer A and the conductor layer C, E in FIG. 139 is a plan view of a stacked state of the conductor layer B and the conductor layer C, and F in FIG. 139 is a plan view of a stacked state of the conductor layer A and the conductor layer B.

The fourth modification of the eighth configuration example in FIG. 139 has a configuration in which a part of the first modification of the eighth configuration example in FIG. 136 is changed. In FIG. 139, parts corresponding to those in FIG. 136 are given the same reference numerals and description of the parts will be omitted as appropriate, and different parts will be described.

In the first modification in FIG. 136, when comparing the positions of the gaps between the reticulated conductor 1201 of the conductor layer A and the reticulated conductor 1202 of the conductor layer B, the positions in the X direction are different and the positions in the Y direction match.

Meanwhile, in the fourth modification in FIG. 139, when comparing the positions of the gaps between the reticulated conductor 1201 of the conductor layer A and the reticulated conductor 1202 of the conductor layer B, the positions in the X direction match and the positions in the Y direction are different.

The fourth modification of the eighth configuration example in FIG. 139 is similar to the first modification in FIG. 136 except for the above-described points. For example, the point that the column in which the relay conductor 1241 is formed and the column in which the relay conductor 1241 is not formed in the gaps in the matrix of the reticulated conductor 1201 are alternately arranged in the X direction in units of columns in the conductor layer A, and the point that the column in which the relay conductor 1242 is formed and the column in which the relay conductor 1242 is not formed in the gaps in the matrix of the reticulated conductor 1202 are alternately arranged in the X direction in units of columns in the conductor layer B are also similar.

Furthermore, the fourth modification of the eighth configuration example in FIG. 139 corresponds to a configuration in which the relay conductors 1241 are thinned out every other column in units of columns in the conductor layer A, and the relay conductors 1242 are thinned out every other column in units of columns in the conductor layer B from the second modification of the fourth configuration example illustrated in FIG. 130.

When the conductor layer C in A in FIG. 139 is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in D and E in FIG. 139, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

In the conductor layer C in A in FIG. 139, the direction in which the current of the conductor layer C is likely to flow and the direction in which the current of the conductor layers A and B is likely to flow are the same or substantially the same. In this case, the voltage drop can be further improved depending on the wiring layout.

By providing the relay conductor 1241 in the conductor layer A, it becomes possible to connect the reticulated conductor 1202 and the linear conductor 1251B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1251A in the substantially shortest distance or a short distance, thereby reducing the voltage drop, energy loss, or inductive noise.

Fifth Modification of Eighth Configuration Example of Three-Layer Conductor Layer FIG. 140 illustrates a fifth modification of the eighth configuration example of the three-layer conductor layer.

A in FIG. 140 illustrates the conductor layer C (wiring layer 165C), B in FIG. 140 illustrates the conductor layer A (wiring layer 165A), and C in FIG. 140 illustrates the conductor layer B (wiring layer 165B).

Furthermore, D in FIG. 140 is a plan view of a stacked state of the conductor layer A and the conductor layer C, E in FIG. 140 is a plan view of a stacked state of the conductor layer B and the conductor layer C, and F in FIG. 140 is a plan view of a stacked state of the conductor layer A and the conductor layer B.

The fifth modification of the eighth configuration example in FIG. 140 has a configuration in which a part of the first modification of the eighth configuration example illustrated in FIG. 136 is changed. In FIG. 140, parts corresponding to those in FIG. 136 are given the same reference numerals and description of the parts will be omitted as appropriate, and different parts will be described.

In the fifth modification of the eighth configuration example, only the configuration of the conductor layer B is different from that of the first modification of the eighth configuration example in FIG. 136.

In the first modification in FIG. 136, a column in which the relay conductor 1242 is formed and a column in which the relay conductor 1242 is not formed are alternately arranged in the X direction in units of columns in the gaps in a matrix of the reticulated conductor 1202 in the conductor layer B. In other words, the relay conductors 1241 are thinned out every other column in units of columns.

In contrast, in the conductor layer B in FIG. 140, a column in which the relay conductor 1242 is formed and a column in which the relay conductor 1242 is not formed are alternately arranged in the X direction in units of two columns in the gaps in a matrix of the reticulated conductor 1202. In other words, the relay conductors 1241 are thinned out every two other columns in units of two columns.

The fifth modification of the eighth configuration example in FIG. 140 is similar to the first modification of the eighth configuration example in FIG. 136 except for the above-described points.

When the conductor layer C in A in FIG. 140 is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in F in FIG. 140, the stacked layer of the conductor layers A and B has a light-shielding structure, and the hot carrier light emission from the active element group 167 can be shielded. In addition, as illustrated in D in FIG. 140, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the linear conductor 1251A of the conductor layer C are electrically connected, and the reticulated conductor 1202 of the conductor layer B and the linear conductor 1251B of the conductor layer C are electrically connected, the current amount of the conductor layers A and B can be made small. Therefore, the inductive noise and the voltage drop from the conductor layer A or B can be further improved.

In the conductor layer C in A in FIG. 140, the direction in which the current of the conductor layer C is likely to flow and the direction in which the current of the conductor layers A and B is likely to flow are the same or substantially the same. In this case, the voltage drop can be further improved depending on the wiring layout.

By providing the relay conductor 1241 in the conductor layer A, it becomes possible to connect the reticulated conductor 1202 and the linear conductor 1251B in the substantially shortest distance or a short distance to draw the power supply, thereby reducing the voltage drop, energy loss, or inductive noise.

By providing the relay conductor 1242 in the conductor layer B, it becomes possible to connect the reticulated conductor 1201 and the linear conductor 1251A in the substantially shortest distance or a short distance, thereby reducing the voltage drop, energy loss, or inductive noise.

Ninth Configuration Example of Three-Layer Conductor Layer

FIG. 141 illustrates a ninth configuration example of the three-layer conductor layer.

A in FIG. 141 illustrates the conductor layer C (wiring layer 165C), B in FIG. 141 illustrates the conductor layer A (wiring layer 165A), and C in FIG. 141 illustrates the conductor layer B (wiring layer 165B).

Furthermore, D in FIG. 141 is a plan view of a stacked state of the conductor layer A and the conductor layer C, E in FIG. 141 is a plan view of a stacked state of the conductor layer B and the conductor layer C, and F in FIG. 141 is a plan view of a stacked state of the conductor layer A and the conductor layer B.

The ninth configuration example in FIG. 141 has a configuration in which a part of the sixth configuration example in FIG. 132 is changed. In FIG. 141, parts corresponding to those in FIG. 132 are given the same reference numerals and description of the parts will be omitted as appropriate, and different parts will be described.

In the ninth configuration example, only the configuration of the conductor layer A is different from that of the sixth configuration example in FIG. 132.

In the conductor layer A of the sixth configuration example in FIG. 132, a row in which the relay conductor 1241 is formed and a row in which the relay conductor 1241 is not formed are alternately arranged in the Y direction in units of rows in the gaps in a matrix of the reticulated conductor 1201.

The conductor layer A of the ninth configuration example in FIG. 141 has a configuration in which a relay conductor 1243 (third relay conductor) is newly provided in the gaps of the row where the relay conductors 1241 of the conductor layer A of the sixth configuration example of FIG. 132 are not formed. The relay conductor 1243 is, for example, wiring (Vss wiring) connected to the GND or the negative power supply.

That is, the conductor layer A of the ninth configuration example in FIG. 141 includes the reticulated conductor 1201, and has a configuration in which a row in which the relay conductor 1241 is formed and a column in which a relay conductor 1243 is formed are alternately arranged in the Y direction in units of rows in the gaps in a matrix of the reticulated conductor 1201.

For example, in a case of a stacking order in which the conductor layers A to C of the ninth configuration example in FIG. 141 are in the order of the conductor layer B, the conductor layer C, and the conductor layer A, and the conductor layer C is arranged in the center, the relay conductor 1242 of the conductor layer B can be connected to the linear conductor 1221A of the conductor layer C via a conductor via in the Z direction, and the reticulated conductor 1202 of the conductor layer B can be connected to the linear conductor 1221B of the conductor layer C via a conductor via in the Z direction. Furthermore, the relay conductor 1241 of the conductor layer A is connected to the linear conductor 1221B of the conductor layer C by a conductor via in the Z direction, and the relay conductor 1243 is connected to the linear conductor 1221A of the conductor layer C by a conductor via in the Z direction. Moreover, the reticulated conductor 1201 of the conductor layer A can be connected to the linear conductor 1221A of the conductor layer C by a conductor via in the Z direction. Furthermore, the relay conductor 1243 may be connected to a conductor of a conductor layer different from the conductor layers A to C via a conductor via in the Z direction. Furthermore, not all the relay conductors 1243 may be used for electrical connection, all the relay conductors 1243 may be used for electrical connection, or some of the relay conductors 1243 may be used for electrical connection.

By providing the relay conductor 1241 in the conductor layer A, it becomes possible to connect the linear conductor 1221B at substantially the shortest distance or a short distance, thereby reducing the voltage drop, energy loss, or inductive noise.

By providing the relay conductor 1243 in the conductor layer A, it becomes possible to connect the linear conductor 1221A at substantially the shortest distance or a short distance, thereby reducing the voltage drop, energy loss, or inductive noise.

By providing the relay conductor 1242 in the conductor layer B, it becomes possible to connect the linear conductor 1221A at substantially the shortest distance or a short distance, thereby reducing the voltage drop, energy loss, or inductive noise.

The ninth configuration example in FIG. 141 is similar to the sixth configuration example in FIG. 132 except for the above-described points.

The conductor layer C in A in FIG. 141 is the same as the conductor layer C of the sixth configuration example in FIG. 132. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 141, the stacked layer of the conductor layers A and B has a light-shielding structure, and the hot carrier light emission from the active element group 167 can be shielded. In addition, as illustrated in D and E in FIG. 141, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the ninth configuration example in FIG. 141, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

First Modification of Ninth Configuration Example of Three-Layer Conductor Layer FIG. 142 illustrates a first modification of the ninth configuration example of the three-layer conductor layer.

A in FIG. 142 illustrates the conductor layer C (wiring layer 165C), B in FIG. 142 illustrates the conductor layer A (wiring layer 165A), and C in FIG. 142 illustrates the conductor layer B (wiring layer 165B).

Furthermore, D in FIG. 142 is a plan view of a stacked state of the conductor layer A and the conductor layer C, E in FIG. 142 is a plan view of a stacked state of the conductor layer B and the conductor layer C, and F in FIG. 142 is a plan view of a stacked state of the conductor layer A and the conductor layer B.

The first modification of the ninth configuration example has a configuration in which a part of the first modification of the sixth configuration example in FIG. 133 is changed. In FIG. 142, parts corresponding to those in FIG. 133 are given the same reference numerals and description of the parts will be omitted as appropriate, and different parts will be described.

In the first modification of the ninth configuration example, only the configuration of the conductor layer A is different from that of the first modification of the sixth configuration example in FIG. 133.

In the conductor layer A of the first modification of the sixth configuration example in FIG. 133, a column in which the relay conductor 1241 is formed and a column in which the relay conductor 1241 is not formed are alternately arranged in the Y direction in units of columns in the gaps in a matrix of the reticulated conductor 1201.

The conductor layer A of the first modification of the ninth configuration example in FIG. 142 has a configuration in which the relay conductor 1243 is newly provided in the gaps of the column where the relay conductors 1241 of the conductor layer A of the first modification of the sixth configuration example in FIG. 133 are not formed.

That is, the conductor layer A of the first modification of the ninth configuration example in FIG. 142 includes the reticulated conductor 1201, and has a configuration in which a column in which the relay conductor 1241 is formed and a column in which a relay conductor 1243 is formed are alternately arranged in the X direction in units of columns in the gaps in a matrix of the reticulated conductor 1201.

For example, in the case of the stacking order in which the conductor layers A to C of the ninth configuration example in FIG. 142 are in the order of the conductor layer B, the conductor layer C, and the conductor layer A, and the conductor layer C is arranged in the center, the relay conductor 1242 of the conductor layer B can be connected to the linear conductor 1251A of the conductor layer C, and the reticulated conductor 1202 of the conductor layer B can be connected to the linear conductor 1251B of the conductor layer C via a conductor via in the Z direction. Furthermore, the relay conductor 1241 of the conductor layer A can be connected to the linear conductor 1251B of the conductor layer C, and the relay conductor 1243 can be connected to the linear conductor 1251A of the conductor layer C. Moreover, the reticulated conductor 1201 of the conductor layer A can be connected to the linear conductor 1251A of the conductor layer C by a conductor via in the Z direction.

By providing the relay conductor 1241 in the conductor layer A, it becomes possible to connect the linear conductor 1251B at substantially the shortest distance or a short distance, thereby reducing the voltage drop, energy loss, or inductive noise.

By providing the relay conductor 1243 in the conductor layer A, it becomes possible to connect the linear conductor 1251A at substantially the shortest distance or a short distance, thereby reducing the voltage drop, energy loss, or inductive noise.

By providing the relay conductor 1242 in the conductor layer B, it becomes possible to connect the linear conductor 1251A at substantially the shortest distance or a short distance, thereby reducing the voltage drop, energy loss, or inductive noise.

The first modification of the ninth configuration example in FIG. 142 is similar to the first modification of the sixth configuration example in FIG. 133 except for the above-described points.

The conductor layer C in A in FIG. 142 is the same as the conductor layer C of the sixth configuration example in FIG. 132. Therefore, when the conductor layer C is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in F in FIG. 142, the stacked layer of the conductor layers A and B has a light-shielding structure, and the hot carrier light emission from the active element group 167 can be shielded. In addition, as illustrated in D in FIG. 142, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the first modification of the ninth configuration example in FIG. 142, the direction in which the current of the conductor layer C is likely to flow and the direction in which the current of the conductor layers A and B is likely to flow are the same or substantially the same. In this case, the voltage drop can be further improved depending on the wiring layout.

Second Modification of Ninth Configuration Example of Three-Layer Conductor Layer FIG. 143 illustrates a second modification of the ninth configuration example of the three-layer conductor layer.

A in FIG. 143 illustrates the conductor layer C (wiring layer 165C), B in FIG. 143 illustrates the conductor layer A (wiring layer 165A), and C in FIG. 143 illustrates the conductor layer B (wiring layer 165B).

Furthermore, D in FIG. 143 is a plan view of a stacked state of the conductor layer A and the conductor layer C, E in FIG. 143 is a plan view of a stacked state of the conductor layer B and the conductor layer C, and F in FIG. 143 is a plan view of a stacked state of the conductor layer A and the conductor layer B.

The second modification of the ninth configuration example has a configuration in which a part of the ninth configuration example in FIG. 141 is changed. In FIG. 143, parts corresponding to those in FIG. 141 are given the same reference numerals and description of the parts will be omitted as appropriate, and different parts will be described.

In the second modification of the ninth configuration example, only the configuration of the conductor layer B is different from that of the ninth configuration example in FIG. 141.

The conductor layer B of the ninth configuration example in FIG. 141 has the reticulated conductor 1202, and the relay conductor 1242 is formed in all the gaps in the matrix of the reticulated conductor 1202.

In contrast, in the second modification of the ninth configuration example in FIG. 143, a row in which the relay conductor 1242 is formed and a row in which the relay conductor 1244 (fourth relay conductor) is formed are alternately arranged in the Y direction in units of rows in the gaps of the reticulated conductor 1201. The relay conductor 1244 is, for example, wiring (Vdd wiring) connected to the positive power supply.

For example, in the case of the stacking order in which the conductor layers A to C of the second modification of the ninth configuration example in FIG. 143 are arranged in the order of the conductor layer B, the conductor layer A, and the conductor layer C, and the conductor layer A is arranged in the center, the relay conductor 1242 of the conductor layer B is connected to the reticulated conductor 1201 of the conductor layer A via a conductor via in the Z direction, and the relay conductor 1244 of the conductor layer B is connected to the reticulated conductor 1202 of the conductor layer B via a conductor of a conductor layer different from the conductor layers A to C. Furthermore, the reticulated conductor 1202 of the conductor layer B can be connected to the relay conductor 1241 of the conductor layer A by a conductor via in the Z direction. The relay conductor 1241 of the conductor layer A is connected to the linear conductor 1221B of the conductor layer C by a conductor via in the Z direction, and the relay conductor 1243 is connected to the linear conductor 1221A of the conductor layer C by a conductor via in the Z direction. Moreover, the reticulated conductor 1201 of the conductor layer A can be connected to the linear conductor 1221A of the conductor layer C by a conductor via in the Z direction. Note that not all the relay conductors 1244 may be used for electrical connection, all the relay conductors 1244 may be used for electrical connection, or some of the relay conductors 1244 may be used for electrical connection. In the second modification of the ninth configuration example in FIG. 143, the shape of the Vdd wiring and the shape of the Vss wiring in the conductor layers A and B are the same or substantially the same although there is a positional shift. Therefore, the layout of the conductor layers A to C may be easily designed, and the Vdd wiring and the Vss wiring may be easily made into a suitable current relationship or voltage relationship.

By providing the relay conductor 1241 in the conductor layer A, it becomes possible to connect the linear conductor 1221B at substantially the shortest distance or a short distance, thereby reducing the voltage drop, energy loss, or inductive noise.

By providing the relay conductor 1243 in the conductor layer A, it becomes possible to connect the linear conductor 1221A at substantially the shortest distance or a short distance, thereby reducing the voltage drop, energy loss, or inductive noise.

By providing the relay conductor 1242 in the conductor layer B, it becomes possible to connect the linear conductor 1221A at substantially the shortest distance or a short distance, thereby reducing the voltage drop, energy loss, or inductive noise.

By providing the relay conductor 1244 in the conductor layer B, it becomes possible to connect the linear conductor 1221B at substantially the shortest distance or a short distance, thereby reducing the voltage drop, energy loss, or inductive noise.

The second modification of the ninth configuration example in FIG. 143 is similar to the ninth configuration example in FIG. 141 except for the above-described points.

The conductor layer C in A in FIG. 143 is the same as the conductor layer C of the ninth configuration example in FIG. 141. Therefore, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in F in FIG. 143, the stacked layer of the conductor layers A and B has a light-shielding structure, and the hot carrier light emission from the active element group 167 can be shielded. In addition, as illustrated in D and E in FIG. 143, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the ninth configuration example in FIG. 143, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

Third Modification of Ninth Configuration Example of Three-Layer Conductor Layer FIG. 144 illustrates a third modification of the ninth configuration example of the three-layer conductor layer.

A in FIG. 144 illustrates the conductor layer C (wiring layer 165C), B in FIG. 144 illustrates the conductor layer A (wiring layer 165A), and C in FIG. 144 illustrates the conductor layer B (wiring layer 165B).

Furthermore, D in FIG. 144 is a plan view of a stacked state of the conductor layer A and the conductor layer C, E in FIG. 144 is a plan view of a stacked state of the conductor layer B and the conductor layer C, and F in FIG. 144 is a plan view of a stacked state of the conductor layer A and the conductor layer B.

The third modification of the ninth configuration example has a configuration in which a part of the first modification of the ninth configuration example in FIG. 142 is changed. In FIG. 144, parts corresponding to those in FIG. 142 are given the same reference numerals and description of the parts will be omitted as appropriate, and different parts will be described.

In the third modification of the ninth configuration example, only the configuration of the conductor layer B is different from the first modification of the ninth configuration example in FIG. 142.

The conductor layer B of the first modification of the ninth configuration example in FIG. 142 has the reticulated conductor 1202, and the relay conductor 1242 is formed in all the gaps in the matrix of the reticulated conductor 1202.

In contrast, the conductor layer B of the third modification of the ninth configuration example in FIG. 144 includes the reticulated conductor 1202, and has a configuration in which a column in which the relay conductor 1242 is formed and a column in which a relay conductor 1244 is formed are alternately arranged in the X direction in units of columns in the gaps in a matrix of the reticulated conductor 1202.

For example, in the case of the stacking order in which the conductor layers A to C of the third modification of the ninth configuration example in FIG. 144 are arranged in the order of the conductor layer B, the conductor layer A, and the conductor layer C, and the conductor layer A is arranged in the center, the relay conductor 1242 of the conductor layer B is connected to the reticulated conductor 1201 of the conductor layer A via a conductor via in the Z direction, and the relay conductor 1244 of the conductor layer B is connected to the reticulated conductor 1202 of the conductor layer B via a conductor of a conductor layer different from the conductor layers A to C. Furthermore, the reticulated conductor 1202 of the conductor layer B can be connected to the relay conductor 1241 of the conductor layer A by a conductor via in the Z direction. The relay conductor 1241 of the conductor layer A is connected to the linear conductor 1251B of the conductor layer C by a conductor via in the Z direction, and the relay conductor 1243 is connected to the linear conductor 1251A of the conductor layer C by a conductor via in the Z direction. Moreover, the reticulated conductor 1201 of the conductor layer A can be connected to the linear conductor 1251A of the conductor layer C by a conductor via in the Z direction. In the third modification of the ninth configuration example in FIG. 144, the shape of the Vdd wiring and the shape of the Vss wiring in the conductor layers A and B are the same or substantially the same although there is a positional shift. Therefore, the layout of the conductor layers A to C may be easily designed, and the Vdd wiring and the Vss wiring may be easily made into a suitable current relationship or voltage relationship.

By providing the relay conductor 1241 in the conductor layer A, it becomes possible to connect the linear conductor 1251B at substantially the shortest distance or a short distance, thereby reducing the voltage drop, energy loss, or inductive noise.

By providing the relay conductor 1243 in the conductor layer A, it becomes possible to connect the linear conductor 1251A at substantially the shortest distance or a short distance, thereby reducing the voltage drop, energy loss, or inductive noise.

By providing the relay conductor 1242 in the conductor layer B, it becomes possible to connect the linear conductor 1251A at substantially the shortest distance or a short distance, thereby reducing the voltage drop, energy loss, or inductive noise.

By providing the relay conductor 1244 in the conductor layer B, it becomes possible to connect the linear conductor 1251B at substantially the shortest distance or a short distance, thereby reducing the voltage drop, energy loss, or inductive noise.

The third modification of the ninth configuration example in FIG. 144 is similar to the first modification of the ninth configuration example in FIG. 142 except for the above-described points.

The conductor layer C in A in FIG. 144 is the same as the conductor layer C of the first modification of the ninth configuration example of FIG. 142. Therefore, when the conductor layer C is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

As illustrated in F in FIG. 144, the stacked layer of the conductor layers A and B has a light-shielding structure, and the hot carrier light emission from the active element group 167 can be shielded. In addition, as illustrated in D in FIG. 144, the stacked layer of the conductor layers A and C has also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the third modification of the ninth configuration example in FIG. 144, the direction in which the current of the conductor layer C is likely to flow and the direction in which the current of the conductor layers A and B is likely to flow are the same or substantially the same. In this case, the voltage drop can be further improved depending on the wiring layout.

Fourth Modification of Ninth Configuration Example of Three-Layer Conductor Layer FIG. 145 illustrates a fourth modification of the ninth configuration example of the three-layer conductor layer.

A in FIG. 145 illustrates the conductor layer C (wiring layer 165C), B in FIG. 145 illustrates the conductor layer A (wiring layer 165A), and C in FIG. 145 illustrates the conductor layer B (wiring layer 165B).

Furthermore, D in FIG. 145 is a plan view of a stacked state of the conductor layer A and the conductor layer C, E in FIG. 145 is a plan view of a stacked state of the conductor layer B and the conductor layer C, and F in FIG. 145 is a plan view of a stacked state of the conductor layer A and the conductor layer B.

The fourth modification of the ninth configuration example has a configuration in which a part of the third modification of the ninth configuration example in FIG. 144 is changed. In FIG. 145, parts corresponding to those in FIG. 144 are given the same reference numerals and description of the parts will be omitted as appropriate, and different parts will be described.

In the third modification in FIG. 144, when comparing the positions of the gaps between the reticulated conductor 1201 of the conductor layer A and the reticulated conductor 1202 of the conductor layer B, the positions in the X direction are different and the positions in the Y direction match.

Meanwhile, in the fourth modification in FIG. 145, when comparing the positions of the gaps between the reticulated conductor 1201 of the conductor layer A and the reticulated conductor 1202 of the conductor layer B, the positions in the X direction match and the positions in the Y direction are different.

Furthermore, for example, in the third modification in FIG. 144, when comparing the positions between the relay conductor 1241 of the conductor layer A and the relay conductor 1244 of the conductor layer B, the positions in the X direction are different and the positions in the Y direction match. Meanwhile, in the fourth modification in FIG. 145, the positions in the X direction match and the positions in the Y direction are different.

Furthermore, for example, in the third modification in FIG. 144, when comparing the positions between the relay conductor 1243 of the conductor layer A and the relay conductor 1242 of the conductor layer B, the positions in the X direction are different and the positions in the Y direction match. Meanwhile, in the fourth modification in FIG. 145, the positions in the X direction match and the positions in the Y direction are different.

In the third modification in FIG. 144, the stacked layer of the conductor layers A and B and the stacked layer of the conductor layers A and C have a light-shielding structure, and the light-shielding property is maintained. Meanwhile, in the fourth modification in FIG. 145, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Furthermore, for example, in the case of the stacking order in which the conductor layers A to C of the fourth modification of the ninth configuration example in FIG. 145 are in the order of the conductor layer B, the conductor layer C, and the conductor layer A, and the conductor layer C is arranged in the center, the relay conductor 1242 of the conductor layer B is connected to the linear conductor 1251A of the conductor layer C via a conductor via in the Z direction, and the relay conductor 1244 of the conductor layer B is connected to the linear conductor 1251B of the conductor layer C via a conductor via in the Z direction. Furthermore, the reticulated conductor 1202 of the conductor layer B can be connected to the linear conductor 1251B of the conductor layer C by a conductor via in the Z direction. The relay conductor 1241 of the conductor layer A is connected to the linear conductor 1251B of the conductor layer C by a conductor via in the Z direction, and the relay conductor 1243 is connected to the linear conductor 1251A of the conductor layer C by a conductor via in the Z direction. Moreover, the reticulated conductor 1201 of the conductor layer A can be connected to the linear conductor 1251A of the conductor layer C by a conductor via in the Z direction. Furthermore, the relay conductor 1244 may be connected to a conductor of a conductor layer different from the conductor layers A to C via a conductor via in the Z direction.

The fourth modification in FIG. 145 is similar to the third modification in FIG. 144 except for the above-described points.

When the conductor layer C in A in FIG. 145 is viewed in a predetermined plane range (plane region), the current distribution of the linear conductor 1251A and the current distribution of the linear conductor 1251B become the same or substantially the same, so that generation of inductive noise can be suppressed.

Since the linear conductor 1251A and the linear conductor 1251B repeat the same wiring pattern in the X direction, the capacitive noise can be completely canceled in the X direction. The capacitive noise can be significantly improved as the conductor layer C is closer to the wiring layer 170.

In the fourth modification of the ninth configuration example in FIG. 145, the direction in which the current of the conductor layer C is likely to flow and the direction in which the current of the conductor layers A and B is likely to flow are the same or substantially the same. In this case, the voltage drop can be further improved depending on the wiring layout.

By providing the relay conductor 1241 in the conductor layer A, it becomes possible to connect the linear conductor 1251B at substantially the shortest distance or a short distance, thereby reducing the voltage drop, energy loss, or inductive noise.

By providing the relay conductor 1243 in the conductor layer A, it becomes possible to connect the linear conductor 1251A at substantially the shortest distance or a short distance, thereby reducing the voltage drop, energy loss, or inductive noise.

By providing the relay conductor 1242 in the conductor layer B, it becomes possible to connect the linear conductor 1251A at substantially the shortest distance or a short distance, thereby reducing the voltage drop, energy loss, or inductive noise.

By providing the relay conductor 1244 in the conductor layer B, it becomes possible to connect the linear conductor 1251B at substantially the shortest distance or a short distance, thereby reducing the voltage drop, energy loss, or inductive noise.

Tenth Configuration Example of Three-Layer Conductor Layer

FIG. 146 illustrates a tenth configuration example of the three-layer conductor layer.

A in FIG. 146 illustrates the conductor layer C (wiring layer 165C), B in FIG. 146 illustrates the conductor layer A (wiring layer 165A), and C in FIG. 146 illustrates the conductor layer B (wiring layer 165B).

Furthermore, D in FIG. 146 is a plan view of a stacked state of the conductor layer A and the conductor layer C, E in FIG. 146 is a plan view of a stacked state of the conductor layer B and the conductor layer C, and F in FIG. 146 is a plan view of a stacked state of the conductor layer A and the conductor layer B.

The tenth configuration example has a configuration in which a part of the fourth configuration example in FIG. 128 is changed. In FIG. 146, parts corresponding to those in FIG. 128 are given the same reference numerals and description of the parts will be omitted as appropriate, and different parts will be described.

In the tenth configuration example, only the configuration of the conductor layer C is different from that of the fourth configuration example in FIG. 128.

The conductor layer C in A in FIG. 146 is configured such that a linear conductor 1291A long in the X direction and a linear conductor 1291B long in the X direction are alternately and periodically arranged in the Y direction. The linear conductor 1219A is, for example, wiring (Vss wiring) connected to the GND or the negative power supply. The linear conductor 1291B is, for example, wiring (Vdd wiring) connected to the positive power supply.

In the fourth configuration example in FIG. 128, the conductor period FYC that is a repetition period of the linear conductor 1221A of the conductor layer C in A in FIG. 128 is twice the conductor period FYA that is a repetition period in the Y direction of the reticulated conductor 1201 of the conductor layer A in B in FIG. 128.

In contrast, the conductor period FYC that is a repetition period of the linear conductor 1291A of the conductor layer C in A in FIG. 146 is one time the conductor period FYA that is a repetition period in the Y direction of the reticulated conductor 1201 of the conductor layer A in B in FIG. 146.

Similarly, in the fourth configuration example in FIG. 128, the conductor period FYC of the linear conductor 1221B of the conductor layer C in A in FIG. 128 is twice the conductor period FYB of the reticulated conductor 1202 of the conductor layer B in C in FIG. 128, whereas the conductor period FYC of the linear conductor 1291B of the conductor layer C in A in FIG. 146 is one time the conductor period FYB of the reticulated conductor 1202 of the conductor layer B in C in FIG. 146.

The tenth configuration example in FIG. 146 is similar to the fourth configuration example in FIG. 128 except for the above-described points.

When the conductor layer C in A in FIG. 146 is viewed in a predetermined plane range (plane region), the current distribution of the linear conductor 1291A and the current distribution of the linear conductor 1291B become the same or substantially the same, so that generation of inductive noise can be suppressed.

Since the linear conductor 1291A and the linear conductor 1291B repeat the same wiring pattern in the Y direction, the capacitive noise can be completely canceled in the Y direction. The capacitive noise can be significantly improved as the conductor layer C is closer to the wiring layer 170.

As illustrated in F in FIG. 146, the stacked layer of the conductor layers A and B has a light-shielding structure, and the hot carrier light emission from the active element group 167 can be shielded. In addition, as illustrated in D and E in FIG. 132, the light-shielding property is maintained in a fixed range in the stacked layer of the conductor layers A and C and the stacked layer of the conductor layers B and C. Thereby, since the light-shielding restrictions of the conductor layers A and B can be alleviated, the conductive area of the conductor layers A and B can be used to the maximum, the wiring resistance can be lowered, and the voltage drop can be further improved. Furthermore, the degree of freedom in layout of the conductor layers A and B can be improved.

In the tenth configuration example in FIG. 146, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

By providing the relay conductor 1241 in the conductor layer A, it becomes possible to connect the linear conductor 1291B at substantially the shortest distance or a short distance, thereby reducing the voltage drop, energy loss, or inductive noise.

By providing the relay conductor 1242 in the conductor layer B, it becomes possible to connect the linear conductor 1291A at substantially the shortest distance or a short distance, thereby reducing the voltage drop, energy loss, or inductive noise.

Modification of Tenth Configuration Example of Three-Layer Conductor Layer

FIG. 147 illustrates a modification of the tenth configuration example of the three-layer conductor layer.

A in FIG. 147 illustrates the conductor layer C (wiring layer 165C), B in FIG. 147 illustrates the conductor layer A (wiring layer 165A), and C in FIG. 147 illustrates the conductor layer B (wiring layer 165B).

Furthermore, D in FIG. 147 is a plan view of a stacked state of the conductor layer A and the conductor layer C, E in FIG. 147 is a plan view of a stacked state of the conductor layer B and the conductor layer C, and F in FIG. 147 is a plan view of a stacked state of the conductor layer A and the conductor layer B.

The modification of the tenth configuration example has a configuration in which a part of the fourth configuration example in FIG. 128 is changed. In FIG. 147, parts corresponding to those in FIG. 128 are given the same reference numerals and description of the parts will be omitted as appropriate, and different parts will be described.

In the modification of the tenth configuration example, only the configuration of the conductor layer C is different from that of the fourth configuration example in FIG. 128.

The conductor layer C in A in FIG. 147 is configured such that a linear conductor 1301A long in the X direction and a linear conductor 1301B long in the X direction are alternately and periodically arranged in the Y direction. The linear conductor 1301A is, for example, wiring (Vss wiring) connected to the GND or the negative power supply. The linear conductor 1301B is, for example, wiring (Vdd wiring) connected to the positive power supply. The distance between the linear conductor 1301A and the linear conductor 1301B is alternately changed between a gap width GYC1 and a gap width GYC2.

In the fourth configuration example in FIG. 128, the conductor period FYC that is a repetition period of the linear conductor 1221A of the conductor layer C in A in FIG. 128 is twice the conductor period FYA that is a repetition period in the Y direction of the reticulated conductor 1201 of the conductor layer A in B in FIG. 128.

In contrast, the conductor period FYC that is a repetition period of the linear conductor 1301A of the conductor layer C in A in FIG. 147 is (1/integer) times the conductor period FYA that is a repetition period in the Y direction of the reticulated conductor 1201 of the conductor layer A in B in FIG. 147. FIG. 147 illustrates an example in which the conductor period FYC is ½ times the conductor period FYA.

Similarly, in the fourth configuration example in FIG. 128, the conductor period FYC of the linear conductor 1221B of the conductor layer C in A in FIG. 128 is twice the conductor period FYB of the reticulated conductor 1202 of the conductor layer A in C in FIG. 128, whereas the conductor period FYC of the linear conductor 1301B of the conductor layer C in A in FIG. 147 is (1/integer) times the conductor period FYB of the reticulated conductor 1202 of the conductor layer B in C in FIG. 147. FIG. 147 illustrates an example in which the conductor period FYC is ½ times the conductor period FYB.

The modification of the tenth configuration example in FIG. 147 is similar to the fourth configuration example in FIG. 128 except for the above-described points.

When the conductor layer C in A in FIG. 147 is viewed in a predetermined plane range (plane region), the current distribution of the linear conductor 1301A and the current distribution of the linear conductor 1301B become the same or substantially the same, so that generation of inductive noise can be suppressed.

Since the linear conductor 1301A and the linear conductor 1301B repeat the same wiring pattern in the Y direction, the capacitive noise can be completely canceled in the Y direction. The capacitive noise can be significantly improved as the conductor layer C is closer to the wiring layer 170.

As illustrated in F in FIG. 147, the hot carrier light emission from the active element group 167 can be shielded by the stacked layer of the conductor layers A and B. In addition, as illustrated in D and E in FIG. 132, the light-shielding property is maintained in a fixed range in the stacked layer of the conductor layers A and C and the stacked layer of the conductor layers B and C. Thereby, since the light-shielding restrictions of the conductor layers A and B can be alleviated, the conductive area of the conductor layers A and B can be used to the maximum, the wiring resistance can be lowered, and the voltage drop can be further improved. Furthermore, the degree of freedom in layout of the conductor layers A and B can be improved.

In the modification of the tenth configuration example in FIG. 147, the direction in which the current of the conductor layer C is likely to flow and the direction in which the current of the conductor layers A and B is likely to flow are substantially orthogonal and differ by approximately 90 degrees. As a result, the current becomes easily diffused (the current is less likely to be concentrated), so that the inductive noise can be further improved.

By providing the relay conductor 1241 in the conductor layer A, it becomes possible to connect the linear conductor 1301B at substantially the shortest distance or a short distance, thereby reducing the voltage drop, energy loss, or inductive noise.

By providing the relay conductor 1242 in the conductor layer B, it becomes possible to connect the linear conductor 1301A at substantially the shortest distance or a short distance, thereby reducing the voltage drop, energy loss, or inductive noise.

Eleventh Configuration Example of Three-Layer Conductor Layer

In the first to tenth configuration examples of the three-layer conductor layer, the description has been made adopting the eleventh configuration example using the reticulated conductor having the resistance value in the X direction and the resistance value in the Y direction, which are different, as the configuration of the conductor layer A and the conductor layer B. In other words, the description has been made adopting the configuration in which the gap width GXA in the X direction and the gap width GYA in the Y direction are different, and the gap width GXB in the X direction and the gap width GYB in the Y direction are different, as in the reticulated conductors 1201 and 1202 of the fourth configuration example in FIG. 128 and the reticulated conductors 1261 and 1602 of the fifth configuration example in FIG. 131, as the conductor layer A and the conductor layer B.

However, as the conductor layer A and the conductor layer B, any of the first to thirteenth configuration examples of the conductor layers A and B described with reference to FIGS. 12 to 41 can be adopted.

In next FIGS. 148 to 152, a configuration of uniformly adopting the configuration adopted in FIG. 122 or the like for the conductor layer C (wiring layer 165C), and adopting a reticulated conductor having the same resistance value in the X direction and Y directions for the conductor layer A and the conductor layer B will be described.

FIG. 148 illustrates an eleventh configuration example of the three-layer conductor layer.

A in FIG. 148 illustrates the conductor layer C (wiring layer 165C), B in FIG. 148 illustrates the conductor layer A (wiring layer 165A), and C in FIG. 148 illustrates the conductor layer B (wiring layer 165B).

Furthermore, D in FIG. 148 is a plan view of a stacked state of the conductor layer A and the conductor layer C, E in FIG. 148 is a plan view of a stacked state of the conductor layer B and the conductor layer C, and F in FIG. 148 is a plan view of a stacked state of the conductor layer A and the conductor layer B.

In the eleventh configuration example in FIG. 148, a portion corresponding to that in the fourth configuration example illustrated in FIG. 128 is given the same reference numeral and description of the portion is omitted as appropriate, and description will be given focusing on different portions.

The conductor layer C in A in FIG. 148 is configured such that the linear conductor 1221A long in the X direction and the linear conductor 1221B long in the X direction are alternately and periodically arranged in the Y direction with the conductor period FYC.

The conductor layer A in B in FIG. 148 is configured by a reticulated conductor 1311. The reticulated conductor 1311 has the conductor width WXA, the gap width GXA, and the conductor period FXA in the X direction, and the conductor width WYA, the gap width GYA, and the conductor period FYA in the Y direction. Here, the conductor width WXA=the conductor width WYA, the gap width GXA=the gap width GYA, and the conductor period FXA=the conductor period FYA. Furthermore, the relay conductor 1241 is arranged in each gap of the reticulated conductor 1201. The distance between the relay conductors 1241, in other words, the period of the relay conductor 1241 is also the conductor periods FXA and FYA. The reticulated conductor 1311 is, for example, wiring (Vss wiring) connected to the GND or the negative power supply.

The conductor layer B in C in FIG. 148 is configured by a reticulated conductor 1312. The reticulated conductor 1312 has the conductor width WXB, the gap width GXB, and the conductor period FXB in the X direction, and the conductor width WYB, the gap width GYB, and the conductor period FYB in the Y direction. Here, the conductor width WXB=the conductor width WYB, the gap width GXB=the gap width GYB, and the conductor period FXB=the conductor period FYB. Furthermore, the relay conductor 1242 is arranged in each gap of the reticulated conductor 1312. The distance between the relay conductors 1242, in other words, the period of the relay conductors 1242 is also the conductor periods FXB and FYB. The reticulated conductor 1312 is, for example, wiring (Vdd wiring) connected to the positive power supply.

As illustrated in B and C in FIG. 148, the plane position of the relay conductor 1241 formed in the conductor layer A and the plane position of the relay conductor 1242 formed in the conductor layer B are the same. In other words, the reticulated conductor 1311 of the conductor layer A and the reticulated conductor 1312 of the conductor layer B entirely overlap when viewed from the stacking direction. The conductor layer A and the conductor layer B having such a configuration correspond to the second configuration example of the conductor layers A and B illustrated in FIG. 15, and can significantly improve the inductive noise, as illustrated in the simulation result in FIG. 17.

Therefore, the configuration is suitable for the stacking order in which the conductor layer C (wiring layer 165C) is arranged between the conductor layer A (wiring layer 165A) and the conductor layer B (wiring layer 165B) as illustrated in B in FIG. 120, the reticulated conductor 1311 of the conductor layer A and the linear conductor 1221A of the conductor layer C are connected via the conductor via in the Z direction, and the reticulated conductor 1312 of the conductor layer B and the linear conductor 1221B of the conductor layer C are connected via the conductor via in the Z direction.

When the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B of the conductor layer C repeat the same wiring pattern in the Y direction, the capacitive noise can be completely canceled in the Y direction. The capacitive noise can be significantly improved as the conductor layer C is closer to the wiring layer 170.

As illustrated in F in FIG. 148, the stacked layer of the conductor layer A and the conductor layer B does not have a light-shielding structure, but as illustrated in D and E in FIG. 148, the stacked layer of the conductor layers A and C and the stacked layer of the conductor layers B and C have a light-shielding structure, and the light-shielding property is maintained. As a result, the hot carrier light emission from the active element group 167 can be shielded. Furthermore, since the light-shielding restrictions of the conductor layers A and B can be significantly alleviated, the conductive area of the conductor layers A and B can be used to the maximum, the wiring resistance can be lowered, and the voltage drop can be further improved. The degree of freedom in layout of the conductor layers A and B can be improved.

Twelfth Configuration Example of Three-Layer Conductor Layer

FIG. 149 illustrates a twelfth configuration example of the three-layer conductor layer.

A in FIG. 149 illustrates the conductor layer C (wiring layer 165C), B in FIG. 149 illustrates the conductor layer A (wiring layer 165A), and C in FIG. 149 illustrates the conductor layer B (wiring layer 165B).

Furthermore, D in FIG. 149 is a plan view of a stacked state of the conductor layer A and the conductor layer C, E in FIG. 149 is a plan view of a stacked state of the conductor layer B and the conductor layer C, and F in FIG. 149 is a plan view of a stacked state of the conductor layer A and the conductor layer B.

In the twelfth configuration example in FIG. 149, a portion corresponding to that in the fourth configuration example illustrated in FIG. 128 is given the same reference numeral and description of the portion is omitted as appropriate, and description will be given focusing on different portions.

The conductor layer C in A in FIG. 149 is configured such that the linear conductor 1221A long in the X direction and the linear conductor 1221B long in the X direction are alternately and periodically arranged in the Y direction with the conductor period FYC.

The conductor layer A in B in FIG. 149 is configured by a planar conductor 1321. The planar conductor 1321 is, for example, wiring (Vss wiring) connected to the GND or the negative power supply.

The conductor layer B in C in FIG. 149 is configured by a planar conductor 1322. The planar conductor 1322 is, for example, wiring (Vdd wiring) connected to the positive power supply.

When the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1222A and the linear conductor 1222B repeat the same wiring pattern in the Y direction, the capacitive noise can be completely canceled in the Y direction. The capacitive noise can be significantly improved as the conductor layer C is closer to the wiring layer 170.

As illustrated in F in FIG. 149, the stacked layer of the conductor layers A and B has a light-shielding structure, and the hot carrier light emission from the active element group 167 can be shielded. In addition, as illustrated in D and E in FIG. 149, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Therefore, the twelfth configuration example of the three-layer conductor layer is suitable for the stacking order in which the conductor layer C (wiring layer 165C) is arranged between the conductor layer A (wiring layer 165A) and the conductor layer B (wiring layer 165B), the planar conductor 1321 of the conductor layer A and the linear conductor 1221A of the conductor layer C are connected via the conductor via in the Z direction, and the planar conductor 1322 of the conductor layer B and the linear conductor 1221B of the conductor layer C are connected via the conductor via in the Z direction, as illustrated in B in FIG. 120.

Modification of Twelfth Configuration Example of Three-Layer Conductor Layer FIG. 150 illustrates a first modification of the twelfth configuration example of the three-layer conductor layer.

A in FIG. 150 illustrates the conductor layer C (wiring layer 165C), B in FIG. 150 illustrates the conductor layer A (wiring layer 165A), and C in FIG. 150 illustrates the conductor layer B (wiring layer 165B).

Furthermore, D in FIG. 150 is a plan view of a stacked state of the conductor layer A and the conductor layer C, E in FIG. 150 is a plan view of a stacked state of the conductor layer B and the conductor layer C, and F in FIG. 150 is a plan view of a stacked state of the conductor layer A and the conductor layer B.

In FIG. 150, a portion corresponding to those in the eleventh and twelfth configuration examples illustrated in FIGS. 148 and 149 is given the same reference numeral and description of the portion is omitted as appropriate, and description will be given focusing on different portions.

In the first modification of the twelfth configuration example, only the configuration of the conductor layer B in C in FIG. 150 is different from that in FIG. 149.

The conductor layer B in C in FIG. 150 is configured by a reticulated conductor 1312 and a relay conductor 1242 formed in a gap of the reticulated conductor 1312.

The twelfth configuration example illustrated in FIG. 149 is a configuration in which the reticulated conductor 1311 and the relay conductor 1241 of the eleventh configuration example of the three-layer conductor layer illustrated in FIG. 148 are changed to the planar conductor 1321 in the conductor layer A, and the reticulated conductor 1312 and the relay conductor 1242 of the eleventh configuration example of the three-layer conductor layer illustrated in FIG. 148 are changed to the planar conductor 1322 in the conductor layer B.

In contrast, the first modification of the twelfth configuration example in FIG. 150 is a configuration in which the reticulated conductor 1311 and the relay conductor 1241 of the eleventh configuration example of the three-layer conductor layer illustrated in FIG. 148 are changed to the planar conductor 1321 in the conductor layer A, and the reticulated conductor 1312 and the relay conductor 1242, as in the eleventh configuration example of the three-layer conductor layer illustrated in FIG. 148, are used in the conductor layer B.

FIG. 151 illustrates a second modification of the twelfth configuration example of the three-layer conductor layer.

A in FIG. 151 illustrates the conductor layer C (wiring layer 165C), B in FIG. 151 illustrates the conductor layer A (wiring layer 165A), and C in FIG. 151 illustrates the conductor layer B (wiring layer 165B).

Furthermore, D in FIG. 151 is a plan view of a stacked state of the conductor layer A and the conductor layer C, E in FIG. 151 is a plan view of a stacked state of the conductor layer B and the conductor layer C, and F in FIG. 151 is a plan view of a stacked state of the conductor layer A and the conductor layer B.

In FIG. 151, a portion corresponding to those in the eleventh and twelfth configuration examples illustrated in FIGS. 148 and 149 is given the same reference numeral and description of the portion is omitted as appropriate, and description will be given focusing on different portions.

In the second modification of the twelfth configuration example, only the configuration of the conductor layer A in B in FIG. 151 is different from that in FIG. 149.

The twelfth configuration example illustrated in FIG. 149 is a configuration in which the reticulated conductor 1311 and the relay conductor 1241 of the eleventh configuration example of the three-layer conductor layer illustrated in FIG. 148 are changed to the planar conductor 1321 in the conductor layer A, and the reticulated conductor 1312 and the relay conductor 1242 of the eleventh configuration example of the three-layer conductor layer illustrated in FIG. 148 are changed to the planar conductor 1322 in the conductor layer B.

In contrast, the second modification of the twelfth configuration example in FIG. 151 is a configuration in which the reticulated conductor 1311 and the relay conductor 1241, as in the eleventh configuration example of the three-layer conductor layer illustrated in FIG. 148, are used in the conductor layer A, and the reticulated conductor 1312 and the relay conductor 1242 of the eleventh configuration example of the three-layer conductor layer illustrated in FIG. 148 are changed to the planar conductor 1322 in the conductor layer B.

The first modification and the second modification have effects similar to those of the twelfth configuration example illustrated in FIG. 149.

That is, when the conductor layer C is viewed in a predetermined plane range (plane region), the current distribution of the linear conductor 1221A and the current distribution of the linear conductor 1221B become the same or substantially the same, so that generation of inductive noise can be suppressed.

Since the linear conductor 1222A and the linear conductor 1222B repeat the same wiring pattern in the Y direction, the capacitive noise can be completely canceled in the Y direction. The capacitive noise can be significantly improved as the conductor layer C is closer to the wiring layer 170.

The stacked layer of the conductor layers A and B has a light-shielding structure, and the hot carrier light emission from the active element group 167 can be shielded. In addition, the stacked layer of the conductor layers A and C and the stacked layer of the conductor layers B and C have also a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

The first modification in FIG. 150 is particularly suitable for the stacking order in which the three conductor layers A to C can be electrically connected, specifically for the stacking orders illustrated in A and B in FIG. 120. For example, in the case of the stacking order of the conductor layers A, B, and C illustrated in A in FIG. 120, the planar conductor 1321 of the conductor layer A and the relay conductor 1242 of the conductor layer B can be connected, and the reticulated conductor 1312 and the relay conductor 1242 of the conductor layer B can be respectively connected with the linear conductors 1221B and 1221A of the conductor layer C via the conductor via in the Z direction between the conductors having common current characteristics and in a part of a region where plane regions overlap.

The second modification in FIG. 151 is particularly suitable for the stacking order in which the three conductor layers A to C can be electrically connected, specifically for the stacking orders illustrated in B and C in FIG. 120. For example, in the case of the stacking order of the conductor layers A, B, and C illustrated in B in FIG. 120, the reticulated conductor 1311 and the relay conductor 1241 of the conductor layer A can be respectively connected with the linear conductors 1221A and 1221B of the conductor layer C via the conductor via in the Z direction between the conductors having common current characteristics and in a part of a region where plane regions overlap, and the planar conductor 1322 of the conductor layer B and the linear conductor 1221B of the conductor layer C can be connected.

Thirteenth Configuration Example of Three-Layer Conductor Layer

FIG. 152 illustrates a thirteenth configuration example of the three-layer conductor layer.

A in FIG. 152 illustrates the conductor layer C (wiring layer 165C), B in FIG. 152 illustrates the conductor layer A (wiring layer 165A), and C in FIG. 152 illustrates the conductor layer B (wiring layer 165B).

Furthermore, D in FIG. 152 is a plan view of a stacked state of the conductor layer A and the conductor layer C, E in FIG. 152 is a plan view of a stacked state of the conductor layer B and the conductor layer C, and F in FIG. 152 is a plan view of a stacked state of the conductor layer A and the conductor layer B.

In the twelfth configuration example in FIG. 152, a portion corresponding to that in the eleventh configuration example illustrated in FIG. 148 is given the same reference numeral and description of the portion is omitted as appropriate, and description will be given focusing on different portions.

In the thirteenth configuration example, only the configuration of the conductor layer A in B in FIG. 152 is different from that in FIG. 148.

The conductor layer A in B in FIG. 152 is configured by a reticulated conductor 1331. The reticulated conductor 1331 is, for example, wiring (Vss wiring) connected to the GND or the negative power supply. The reticulated conductor 1331 has the conductor width WXA, the gap width GXA, and the conductor period FXA in the X direction, and the conductor width WYA, the gap width GYA, and the conductor period FYA in the Y direction. Here, the conductor width WXA=the conductor width WYA, the gap width GXA=the gap width GYA, and the conductor period FXA=the conductor period FYA. Note that the gap width GXA and the gap width GYA of the gap of the reticulated conductor 1331 are smaller than the gap width GXB and the gap width GYB of the gap of the reticulated conductor 1312 of the conductor layer B (the gap width GXA=the gap width GYA<the gap width GXB=the gap width GYB). Furthermore, no relay conductor is formed in the gap of the reticulated conductor 1331.

The thirteenth configuration example in FIG. 152 is similar to the eleventh configuration example in FIG. 148 except for the above-described points.

When the conductor layer C in A in FIG. 152 is viewed in a predetermined plane range (plane region), the current distribution of the linear conductor 1221A and the current distribution of the linear conductor 1221B become the same or substantially the same, so that generation of inductive noise can be suppressed.

Since the linear conductor 1221A and the linear conductor 1221B have the same wiring pattern repeated in the Y direction, the capacitive noise can be completely canceled in the Y direction. The capacitive noise can be significantly improved as the conductor layer C is closer to the wiring layer 170.

As illustrated in D and E in FIG. 152, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1242 in the conductor layer B, it becomes possible to connect the linear conductor 1221A at substantially the shortest distance or a short distance, thereby reducing the voltage drop, energy loss, or inductive noise.

The thirteenth configuration example in FIG. 152 is particularly suitable for the stacking order in which the three layers of the conductor layers A to C can be electrically connected, specifically for the stacking order illustrated in B in FIG. 120. For example, in the case of the stacking order of the conductor layers A, B, and C illustrated in B in FIG. 120, the reticulated conductor 1331 of the conductor layer A and the linear conductor 1221A of the conductor layer C can be connected via the conductor via in the Z direction, and the reticulated conductor 1312 and the relay conductor 1242 of the conductor layer B can be respectively connected with the linear conductors 1221B and 1221A of the conductor layer C via the conductor via in the Z direction between the conductors having common current characteristics and in a part of a region where plane regions overlap.

Fourteenth Configuration Example of Three-Layer Conductor Layer

The first to thirteenth configuration examples of the three-layer conductor layer have been described adopting the configuration using the linear conductor long in the X direction or the linear conductor long in the Y direction, which is a vertical stripe or horizontal stripe wiring pattern, as the configuration of the conductor layer C.

However, the conductor layer C is not limited to the vertical stripe or horizontal stripe wiring pattern.

In next FIGS. 153 to 163, a case where the conductor layer C has a configuration other than the vertical stripe or horizontal stripe wiring pattern will be described.

FIG. 153 illustrates a fourteenth configuration example of the three-layer conductor layer.

A in FIG. 153 illustrates the conductor layer C (wiring layer 165C), B in FIG. 153 illustrates the conductor layer A (wiring layer 165A), and C in FIG. 153 illustrates the conductor layer B (wiring layer 165B).

Furthermore, D in FIG. 153 is a plan view of a stacked state of the conductor layer A and the conductor layer C, E in FIG. 153 is a plan view of a stacked state of the conductor layer B and the conductor layer C, and F in FIG. 153 is a plan view of a stacked state of the conductor layer A and the conductor layer B.

In the fourteenth configuration example in FIG. 153, a portion corresponding to that in the eleventh configuration example illustrated in FIG. 148 is given the same reference numeral and description of the portion is omitted as appropriate, and description will be given focusing on different portions.

In the fourteenth configuration example, only the configuration of the conductor layer C in A in FIG. 153 is different from that in FIG. 148.

The conductor layer C in A in FIG. 153 is configured by repeatedly arranging pluralities of rectangular conductors 1341A and 1341B on the same plane with a predetermined repetition period. The rectangular conductor 1341A is, for example, wiring (Vss wiring) connected to the GND or the negative power supply. The rectangular conductor 1341B is, for example, wiring (Vdd wiring) connected to the positive power supply.

Specifically, a row in which the rectangular conductor 1341A is repeatedly arranged with the gap width GXC in the X direction, and a row in which the rectangular conductor 1341B is repeatedly arranged with the gap width GXC in the X direction are alternately and periodically arranged in the Y direction. The rectangular conductors 1341A and 1341B are repeatedly arranged in the X direction with the conductor period FXC, and are repeatedly arranged in the Y direction with the conductor period FYC. There is a gap with the gap width GYC between the rectangular conductor 1341A and the rectangular conductor 1341B in the Y direction. The rectangular conductor 1341A has the conductor width WXCA in the X direction and the conductor width WYCA in the Y direction, and the rectangular conductor 1341B has the conductor width WXCB in the X direction and the conductor width WYCB in the Y direction. Here, the conductor widths WXCA, WYCA, WXCB, and WYCB are the same (the conductor width WXCA=the conductor width WYCA=the conductor width WXCB=the conductor width WYCB).

The fourteenth configuration example in FIG. 153 is similar to the eleventh configuration example in FIG. 148 except for the above-described points.

When the conductor layer C in A in FIG. 153 is viewed in a predetermined plane range (plane region), the current distribution of the rectangular conductor 1341A and the current distribution of the rectangular conductor 1341B become the same or substantially the same, so that generation of inductive noise can be suppressed.

Since the rectangular conductor 1341A and the rectangular conductor 1341B repeat the same wiring pattern in the Y direction, the capacitive noise can be completely canceled in the Y direction. The capacitive noise can be significantly improved as the conductor layer C is closer to the wiring layer 170.

As illustrated in D and E in FIG. 153, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the rectangular conductor 1341B at substantially the shortest distance or a short distance, thereby reducing the voltage drop, energy loss, or inductive noise.

By providing the relay conductor 1242 in the conductor layer B, it becomes possible to connect the rectangular conductor 1341A at substantially the shortest distance or a short distance, thereby reducing the voltage drop, energy loss, or inductive noise.

Modification of Fourteenth Configuration Example of Three-Layer Conductor Layer FIG. 154 illustrates a first modification of the fourteenth configuration example of the three-layer conductor layer.

A in FIG. 154 illustrates the conductor layer C (wiring layer 165C), B in FIG. 154 illustrates the conductor layer A (wiring layer 165A), and C in FIG. 154 illustrates the conductor layer B (wiring layer 165B).

Furthermore, D in FIG. 154 is a plan view of a stacked state of the conductor layer A and the conductor layer C, E in FIG. 154 is a plan view of a stacked state of the conductor layer B and the conductor layer C, and F in FIG. 154 is a plan view of a stacked state of the conductor layer A and the conductor layer B.

In FIG. 154, a portion corresponding to that in the fourteenth configuration example illustrated in FIG. 153 is given the same reference numeral and description of the portion is omitted as appropriate, and description will be given focusing on different portions.

In the first modification of the fourteenth configuration example, only the configuration of the conductor layer C in A in FIG. 154 is different from that in FIG. 153, and the configurations of the conductor layers A and B are similar to those in FIG. 153.

The conductor layer C in A in FIG. 154 is common to that in FIG. 153 in that the pluralities of rectangular conductors 1341A and 1341B are repeatedly arranged on the same plane with a predetermined repetition period, and is different from that in FIG. 153 in that the arrangement is shifted in adjacent columns by ¼ of the conductor period FYC in the Y direction. The conductor period FXC, which is the repetition period in the X direction, is in units of two columns.

FIG. 155 illustrates a second modification of the fourteenth configuration example of the three-layer conductor layer.

A in FIG. 155 illustrates the conductor layer C (wiring layer 165C), B in FIG. 155 illustrates the conductor layer A (wiring layer 165A), and C in FIG. 155 illustrates the conductor layer B (wiring layer 165B).

Furthermore, D in FIG. 155 is a plan view of a stacked state of the conductor layer A and the conductor layer C, E in FIG. 155 is a plan view of a stacked state of the conductor layer B and the conductor layer C, and F in FIG. 155 is a plan view of a stacked state of the conductor layer A and the conductor layer B.

In FIG. 155, a portion corresponding to that in the fourteenth configuration example illustrated in FIG. 153 is given the same reference numeral and description of the portion is omitted as appropriate, and description will be given focusing on different portions.

In the second modification of the fourteenth configuration example, only the configuration of the conductor layer C in A in FIG. 155 is different from that in FIG. 149, and the configurations of the conductor layers A and B are similar to those in FIG. 149.

The conductor layer C in A in FIG. 155 is common to that in FIG. 149 in that the pluralities of rectangular conductors 1341A and 1341B are repeatedly arranged on the same plane with a predetermined repetition period, and is different from that in FIG. 149 in that the arrangement is shifted in adjacent columns by ½ of the conductor period FYC in the Y direction. The conductor period FXC, which is the repetition period in the X direction, is in units of two columns. Note that an amount of shift in the Y direction in adjacent columns of the rectangular conductors 1341A and 1341B can be designed to an arbitrary value.

In the first modification and the second modification of the fourteenth configuration example in FIGS. 154 and 155, when the conductor layer C is viewed in a predetermined plane range (plane region), the current distribution of the rectangular conductor 1341A and the current distribution of the rectangular conductor 1341B become the same or substantially the same, so that generation of inductive noise can be suppressed.

Furthermore, in the first modification and the second modification of the fourteenth configuration example, the rectangular conductor 1341A and the rectangular conductor 1341B repeat the same wiring pattern in the Y direction, and therefore the capacitive noise can be completely canceled in the Y direction. The capacitive noise can be significantly improved as the conductor layer C is closer to the wiring layer 170.

Moreover, in the second modification of the fourteenth configuration example in FIG. 155, the rectangular conductor 1341A and the rectangular conductor 1341B repeat the same wiring pattern in the X direction, and therefore the capacitive noise can be completely canceled in the X direction. The capacitive noise can be significantly improved as the conductor layer C is closer to the wiring layer 170.

In the first modification of the fourteenth configuration example in FIG. 154, the light-shielding property is maintained in a fixed range in the stacked layer of the conductor layers A and B, the stacked layer of the conductor layers A and C, and the stacked layer of the conductor layers B and C. Thereby, since the light-shielding restrictions of the conductor layers A and B can be slightly alleviated, the conductive area of the conductor layers A and B can be used to the maximum, the wiring resistance can be lowered, and the voltage drop can be further improved. Furthermore, the degree of freedom in layout of the conductor layers A and B can be improved.

In the second modification of the fourteenth configuration example in FIG. 155, the stacked layer of the conductor layers A and C and the stacked layer of the conductor layers B and C have a light-shielding structure, and the light-shielding property is maintained. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

By providing the relay conductor 1241 in the conductor layer A, it becomes possible to connect the rectangular conductor 1341B at substantially the shortest distance or a short distance, thereby reducing the voltage drop, energy loss, or inductive noise.

By providing the relay conductor 1242 in the conductor layer B, it becomes possible to connect the rectangular conductor 1341A at substantially the shortest distance or a short distance, thereby reducing the voltage drop, energy loss, or inductive noise.

Other Modifications in Fourteenth Configuration Example of Three-Layer Conductor Layer Hereinafter, other modifications of the fourteenth configuration example of the three-layer conductor layer illustrated in FIG. 153 will be described with reference to FIGS. 156 to 163.

Note that, in the modifications of the fourteenth configuration example, only the configuration of the conductor layer C will be illustrated in FIGS. 156 and 163 because only the configuration of the conductor layer C is changed similarly to the first and second modifications in FIGS. 154 and 155. Furthermore, in FIGS. 156 to 163, the configuration of the conductor layer C will be described by being compared with the conductor layer C of the fourteenth configuration example illustrated in A in FIG. 153.

A in FIG. 156 illustrates the conductor layer C of a third modification of the fourteenth configuration example of the three-layer conductor layer.

The conductor layer C in A in FIG. 156 is configured by repeatedly arranging pluralities of rectangular conductors 1342A and 1342B on the same plane with a predetermined repetition period. The rectangular conductor 1342A is, for example, wiring (Vss wiring) connected to the GND or the negative power supply. The rectangular conductor 1342B is, for example, a wiring (Vdd wiring) connected to the positive power supply.

The difference of the conductor layer C in A in FIG. 156 from the conductor layer C in A in FIG. 153 is the conductor sizes of the rectangular conductors 1342A and 1342B, that is, the conductor widths WXCA, WYCA, WXCB, and WYCB. Note that the conductor widths WXCA, WYCA, WXCB, and WYCB are the same (the conductor width WXCA=the conductor width WYCA=the conductor width WXCB=the conductor width WYCB).

The capacitive noise can be completely canceled in the Y direction in the conductor layer C in A in FIG. 156. The capacitive noise can be significantly improved as the conductor layer C is closer to the wiring layer 170.

Furthermore, the wiring resistance can be further reduced by making the conductor sizes of the rectangular conductors 1342A and 1342B larger than those of the fourteenth configuration example illustrated in A in FIG. 153.

B in FIG. 156 illustrates the conductor layer C of a fourth modification of the fourteenth configuration example of the three-layer conductor layer.

The conductor layer C in B in FIG. 156 is common to that in A in FIG. 156 in that the pluralities of rectangular conductors 1342A and 1342B are repeatedly arranged on the same plane with a predetermined repetition period, and is different from that in A in FIG. 156 in that the arrangement is shifted in adjacent columns by ¼ of the conductor period FYC in the Y direction. The conductor period FXC, which is the repetition period in the X direction, is in units of two columns.

The capacitive noise can be completely canceled in the Y direction in the conductor layer C in B in FIG. 156. The capacitive noise can be significantly improved as the conductor layer C is closer to the wiring layer 170.

C in FIG. 156 illustrates the conductor layer C of a fifth modification of the fourteenth configuration example of the three-layer conductor layer.

The conductor layer C in C in FIG. 156 is common to that in A in FIG. 156 in that the pluralities of rectangular conductors 1342A and 1342B are repeatedly arranged on the same plane with a predetermined repetition period, and is different from that in A in FIG. 156 in that the arrangement is shifted in adjacent columns by ½ of the conductor period FYC in the Y direction. It can be said that the adjacent rows are shifted in arrangement by ½ of the conductor period FXC in the X direction. The conductor period FXC in the X direction is in units of two columns, and the conductor period FYC in the Y direction is in units of two rows. Note that the amount of shift in the Y direction in adjacent columns of the rectangular conductors 1342A and 1342B can be designed to an arbitrary value.

The capacitive noise can be completely canceled in the Y direction in the conductor layer C in C in FIG. 156. The capacitive noise can be significantly improved as the conductor layer C is closer to the wiring layer 170.

Moreover, the capacitive noise can be completely canceled in the X direction in the conductor layer C in C in FIG. 156. The capacitive noise can be significantly improved as the conductor layer C is closer to the wiring layer 170.

A in FIG. 157 illustrates the conductor layer C of a sixth modification of the fourteenth configuration example of the three-layer conductor layer.

The conductor layer C in A in FIG. 157 is configured by repeatedly arranging pluralities of rectangular conductors 1343A and 1343B on the same plane with a predetermined repetition period. The rectangular conductor 1343A is, for example, wiring (Vss wiring) connected to the GND or the negative power supply. The rectangular conductor 1343B is, for example, wiring (Vdd wiring) connected to the positive power supply.

The difference of the conductor layer C in A in FIG. 157 from the conductor layer C in A in FIG. 153 is the conductor sizes of the rectangular conductors 1343A and 1343B, specifically, the conductor widths WXCA and WXCB. Note that the rectangular conductors 1343A and 1343B are rectangular, and the conductor width WXCA>the conductor width WYCA and the conductor width WXCB>the conductor width WYCB. Furthermore, the conductor width WXCA and the conductor width WXCB are the same, and the conductor width WYCA and the conductor width WYCB are the same (the conductor width WXCA=the conductor width WXCB, and the conductor width WYCA=the conductor width WYCB).

The capacitive noise can be completely canceled in the Y direction in the conductor layer C in A in FIG. 157. The capacitive noise can be significantly improved as the conductor layer C is closer to the wiring layer 170.

B in FIG. 157 illustrates the conductor layer C of a seventh modification of the fourteenth configuration example of the three-layer conductor layer.

The conductor layer C in B in FIG. 157 is common to that in A in FIG. 157 in that the pluralities of rectangular conductors 1343A and 1343B are repeatedly arranged on the same plane with a predetermined repetition period, and is different from that in A in FIG. 157 in that the arrangement is shifted in adjacent rows by ½ of the conductor period FXC in the X direction. The conductor period FYC, which is the repetition period in the Y direction, is in units of two rows. Note that an amount of shift in the X direction in adjacent rows of the rectangular conductors 1343A and 1343B can be designed to an arbitrary value.

In the conductor layer C in B in FIG. 157, the rectangular conductor 1343A and the rectangular conductor 1343B do not have repetition of the same wiring pattern in the Y direction. Therefore, there is an X position in which the capacitive noise cannot be completely canceled in the Y direction.

Therefore, in the case of shifting the rows by ½ of the conductor period FXC in the X direction, the conductor layer C can be configured as in the conductor layer C in C in FIG. 157.

C in FIG. 157 illustrates the conductor layer C of an eighth modification of the fourteenth configuration example of the three-layer conductor layer.

The conductor layer C in C in FIG. 157 is configured by shifting the rectangular conductors 1343A and 1343B adjacent in the Y direction by ½ of the conductor period FXC in the X direction in units of two rows, and repeatedly arranging the rectangular conductors 1343A and 1343B on the same plane with a predetermined repetition period.

The capacitive noise can be completely canceled in the Y direction in the conductor layer C in C in FIG. 157. The capacitive noise can be significantly improved as the conductor layer C is closer to the wiring layer 170.

Note that the amount of shift in the X direction in units of adjacent two rows of the rectangular conductors 1343A and 1343B can be designed to an arbitrary value. Furthermore, shift of the rectangular conductors 1343A and 1343B in the X direction in units of two rows may be performed by shifting two non-adjacent rows of rectangular conductors instead of two adjacent rows of rectangular conductors. Furthermore, the shift of the rectangular conductors 1343A and 1343B in the X direction in units of two rows need not be performed in units of two rows because the capacitive noise can be completely canceled in the Y direction if the sum of the conductor widths in the Y direction of the rectangular conductors 1343A and the sum of the conductor widths in the Y direction of the rectangular conductors 1343B in a predetermined plane range (plane region) are the same. In other words, the rectangular conductors 1343A and 1343B may be shifted in the X direction with an amount of shift designed to an arbitrary value in units of two or more rows regardless of whether the rectangular conductors are adjacent or not, and the shift is suitable but not limited to the case where the sum of the conductor widths in the Y direction of the rectangular conductors 1343A and the sum of the conductor widths in the Y direction of the rectangular conductors 1343B in a predetermined plane range (plane region) are the same or substantially the same.

A in FIG. 158 illustrates the conductor layer C of a ninth modification of the fourteenth configuration example of the three-layer conductor layer.

The conductor layer C in A in FIG. 158 is configured by repeatedly arranging pluralities of rectangular conductors 1344A and 1344B on the same plane with a predetermined repetition period. The rectangular conductor 1344A is, for example, wiring (Vss wiring) connected to the GND or the negative power supply. The rectangular conductor 1344B is, for example, a wiring (Vdd wiring) connected to the positive power supply.

The difference of the conductor layer C in A in FIG. 158 from the conductor layer C in A in FIG. 157 is the conductor sizes of the rectangular conductors 1344A and 1344B, specifically, the conductor widths WXCA and WXCB. The conductor widths WXCA and WXCB of the rectangular conductors 1344A and 1344B in A in FIG. 158 are larger than the conductor widths WXCA and WXCB of the rectangular conductors 1343A and 1343B in A in FIG. 157.

Note that the rectangular conductors 1344A and 1344B are rectangular, and the conductor width WXCA>the conductor width WYCA and the conductor width WXCB>the conductor width WYCB. Furthermore, the conductor width WXCA and the conductor width WXCB are the same, and the conductor width WYCA and the conductor width WYCB are the same (the conductor width WXCA=the conductor width WXCB, and the conductor width WYCA=the conductor width WYCB).

The capacitive noise can be completely canceled in the Y direction in the conductor layer C in A in FIG. 158. The capacitive noise can be significantly improved as the conductor layer C is closer to the wiring layer 170.

B in FIG. 158 illustrates the conductor layer C of a tenth modification of the fourteenth configuration example of the three-layer conductor layer.

The conductor layer C in B in FIG. 158 is common to that in A in FIG. 158 in that the pluralities of rectangular conductors 1344A and 1344B are repeatedly arranged on the same plane with a predetermined repetition period, and is different from that in A in FIG. 158 in that the arrangement is shifted in adjacent rows by ⅓ of the conductor period FXC in the X direction. The conductor period FYC, which is the repetition period in the Y direction, is in units of six rows.

The capacitive noise can be completely canceled in the Y direction in the conductor layer C in B in FIG. 158. The capacitive noise can be significantly improved as the conductor layer C is closer to the wiring layer 170.

C in FIG. 158 illustrates the conductor layer C of an eleventh modification of the fourteenth configuration example of the three-layer conductor layer.

The conductor layer C in C in FIG. 158 is configured by shifting the rectangular conductors 1344A and 1344B adjacent in the Y direction by ⅓ of the conductor period FXC in the X direction in units of two rows, and repeatedly arranging the rectangular conductors 1344A and 1344B on the same plane with a predetermined repetition period.

The capacitive noise can be completely canceled in the Y direction in the conductor layer C in C in FIG. 158. The capacitive noise can be significantly improved as the conductor layer C is closer to the wiring layer 170.

A in FIG. 159 illustrates the conductor layer C of a twelfth modification of the fourteenth configuration example of the three-layer conductor layer.

The conductor layer C in A in FIG. 159 is configured by repeatedly arranging pluralities of rectangular conductors 1341A and 1341B on the same plane with a predetermined repetition period.

The difference of the conductor layer C in A in FIG. 159 from the conductor layer C in A in FIG. 153 is the arrangement direction of the rectangular conductors 1341A and 1341B. Specifically, in the conductor layer C in A in FIG. 153, the rectangular conductors 1341A and 1341B are repeatedly arranged in the X direction with the conductor period FXC, and the rectangular conductors 1341A and 1341B are alternately and periodically arranged in the Y direction. In contrast, in the conductor layer C in A in FIG. 159, the rectangular conductors 1341A and 1341B are repeatedly arranged in the Y direction with the conductor period FYC, and the rectangular conductors 1341A and 1341B are alternately and periodically arranged in the X direction.

The capacitive noise can be completely canceled in the X direction in the conductor layer C in A in FIG. 159. The capacitive noise can be significantly improved as the conductor layer C is closer to the wiring layer 170.

B in FIG. 159 illustrates the conductor layer C of a thirteenth modification of the fourteenth configuration example of the three-layer conductor layer.

The conductor layer C in B in FIG. 159 is configured by repeatedly arranging pluralities of rectangular conductors 1361A and 1361B on the same plane with a predetermined repetition period. The rectangular conductor 1361A is, for example, wiring (Vss wiring) connected to the GND or the negative power supply. The rectangular conductor 1361B is, for example, wiring (Vdd wiring) connected to the positive power supply.

The difference of the conductor layer C in B in FIG. 159 from the conductor layer C in A in FIG. 159 is the conductor sizes of the rectangular conductors 1361A and 1361B, specifically, the conductor widths WYCA and WYCB. Note that the rectangular conductors 1361A and 1361B are rectangular, and the conductor width WXCA<the conductor width WYCA, and the conductor width WXCB<the conductor width WYCB. Furthermore, the conductor width WXCA and the conductor width WXCB are the same, and the conductor width WYCA and the conductor width WYCB are the same (the conductor width WXCA=the conductor width WXCB, and the conductor width WYCA=the conductor width WYCB).

The capacitive noise can be completely canceled in the X direction in the conductor layer C in B in FIG. 159. The capacitive noise can be significantly improved as the conductor layer C is closer to the wiring layer 170.

Note that although not illustrated, it is also possible that the rectangular conductors 1361A and 1361B are shifted by ½ of the conductor period FYC in the Y direction in adjacent columns and repeatedly arranged on the same plane with a predetermined repetition period, or are shifted by ⅓ of the conductor period FYC in the Y direction in adjacent columns. Furthermore, the amount of shift in the Y direction in adjacent columns of the rectangular conductors 1361A and 1361B can be designed to an arbitrary value. Furthermore, the rectangular conductors 1361A and 1361B may be shifted in the Y direction with an amount of shift designed to an arbitrary value in units of two or more columns regardless of whether the rectangular conductors are adjacent or not, and the shift is suitable but not limited to the case where the sum of the conductor widths in the X direction of the rectangular conductors 1361A and the sum of the conductor widths in the X direction of the rectangular conductors 1361B in a predetermined plane range (plane region) are the same or substantially the same.

C in FIG. 159 illustrates the conductor layer C of a fourteenth modification of the fourteenth configuration example of the three-layer conductor layer.

The conductor layer C in C in FIG. 159 is configured by shifting the rectangular conductors 1361A and 1361B adjacent in the X direction by ½ of the conductor period FYC in the Y direction in units of two columns, and repeatedly arranging the rectangular conductors 1361A and 1361B on the same plane with a predetermined repetition period.

The capacitive noise can be completely canceled in the X direction in the conductor layer C in C in FIG. 159. The capacitive noise can be significantly improved as the conductor layer C is closer to the wiring layer 170.

A in FIG. 160 illustrates the conductor layer C of a fifteenth modification of the fourteenth configuration example of the three-layer conductor layer.

The conductor layer C in A in FIG. 160 is configured by arranging the two rectangular conductors 1341A and two rectangular conductors 1341B in the X direction and the Y direction on the same plane with a predetermined repetition period. The gap between adjacent rectangular conductors 1341A, the gap between adjacent rectangular conductors 1341B, and the gap between adjacent rectangular conductors 1341A and 1341B have the gap width of GXC in the X direction and the gap width GYC in the Y direction. The two rectangular conductors 1341A and the two rectangular conductors 1341B are repeatedly arranged in the X direction with the conductor period FXC, and are repeatedly arranged in the Y direction with the conductor period FYC.

B in FIG. 160 illustrates the conductor layer C of a sixteenth modification of the fourteenth configuration example of the three-layer conductor layer.

The conductor layer C in B in FIG. 160 is common to that in A in FIG. 157 in that the pluralities of rectangular conductors 1343A and 1343B are repeatedly arranged on the same plane with a predetermined repetition period, and is different from that in A in FIG. 157 in that the arrangement is shifted in adjacent columns by ½ of the conductor period FYC in the Y direction. It can be said that the arrangement in the adjacent rows is shifted by ½ of the conductor period FXC in the X direction. The conductor period FXC in the X direction is in units of two columns, and the conductor period FYC in the Y direction is in units of two rows.

C in FIG. 160 illustrates the conductor layer C of a seventeenth modification of the fourteenth configuration example of the three-layer conductor layer.

The conductor layer C in C in FIG. 160 is common to that in A in FIG. 158 in that the pluralities of rectangular conductors 1344A and 1344B are repeatedly arranged on the same plane with a predetermined repetition period, and is different from that in A in FIG. 158 in that the arrangement is shifted in adjacent columns by ½ of the conductor period FYC in the Y direction. It can be said that the arrangement in the adjacent rows is shifted by ½ of the conductor period FXC in the X direction. The conductor period FXC in the X direction is in units of two columns, and the conductor period FYC in the Y direction is in units of two rows. The conductor layer C in B in FIG. 160 and the conductor layer C in C in FIG. 160 differ only in the conductor widths WXCA and WXCB in the X direction.

In the conductor layers C in A to C in FIG. 160, the capacitive noise can be completely canceled both in the X direction and in the Y direction. The capacitive noise can be significantly improved as the conductor layer C is closer to the wiring layer 170.

A in FIG. 161 illustrates the conductor layer C of an eighteenth modification of the fourteenth configuration example of the three-layer conductor layer.

The conductor layer C in A in FIG. 161 is common to that in A in FIG. 156 in that the two rectangular conductors 1341A and the two rectangular conductors 1341B are repeatedly arranged on the same plane in the X direction and the Y direction with a predetermined repetition period, and is different from that in A in FIG. 156 in that the arrangement is shifted by ¼ of the conductor period FYC in the Y direction in units of two columns.

B in FIG. 161 illustrates the conductor layer C of a nineteenth modification of the fourteenth configuration example of the three-layer conductor layer.

The conductor layer C in B in FIG. 161 is common to that in A in FIG. 157 in that the pluralities of rectangular conductors 1343A and 1343B are repeatedly arranged on the same plane with a predetermined repetition period, and is different from that in A in FIG. 157 in that the arrangement is shifted in adjacent columns by ¼ of the conductor period FYC in the Y direction.

C in FIG. 161 illustrates the conductor layer C of a twentieth modification of the fourteenth configuration example of the three-layer conductor layer.

The conductor layer C in C in FIG. 161 is configured by arranging conductors 1381A and 1381B in the Y direction on the same plane with a predetermined repetition period. The conductor 1381A is, for example, wiring (Vss wiring) connected to the GND or the negative power supply. The conductor 1381B is, for example, wiring (Vdd wiring) connected to the positive power supply.

The conductor 1381A has a shape in which all the rectangular conductors 1343A arranged in the X direction in B in FIG. 161 are connected by the shortest path. The conductor 1381B has a shape in which all the rectangular conductors 1343B arranged in the X direction in B in FIG. 161 are connected by the shortest path. The gap width GXC and the gap width GYC in C in FIG. 161 correspond to the minimum widths in the X direction and the Y direction between adjacent conductors. Note that the conductor 1381A and the conductor 1381B do not need to have the shape connecting all the rectangular conductors arranged in the X direction in B in FIG. 161 by the shortest path, and may have a meander shape or a meandering shape, for example.

In the conductor layers C in A to C in FIG. 161, the capacitive noise can be completely canceled in the Y direction and partially canceled in the X direction. The capacitive noise can be significantly improved as the conductor layer C is closer to the wiring layer 170.

A in FIG. 162 illustrates the conductor layer C of a twenty-first modification of the fourteenth configuration example of the three-layer conductor layer.

The conductor layer C in A in FIG. 162 is common to that in A in FIG. 153 in that the pluralities of rectangular conductors 1341A and 1341B are repeatedly arranged on the same plane with a predetermined repetition period, and is different from that in A in FIG. 153 in that the arrangement is shifted in adjacent columns by ¼ of the conductor period FYC in the Y direction.

B in FIG. 162 illustrates the conductor layer C of a twenty-second modification of the fourteenth configuration example of the three-layer conductor layer.

The conductor layer C in B in FIG. 162 is configured by periodically arranging conductors 1382A and 1382B on the same plane with the conductor period FXC in the X direction and the conductor period FYC in the Y direction. The conductor 1382A is, for example, wiring (Vss wiring) connected to the GND or the negative power supply. The conductor 1382B is, for example, wiring (Vdd wiring) connected to the positive power supply. The conductor 1382A has the conductor width WXCA in the X direction and the conductor width WYCA in the Y direction, and the conductor 1382B has the conductor width WXCB in the X direction and the conductor width WYCB in the Y direction. The gap width GXC and the gap width GYC in B in FIG. 162 correspond to the minimum widths in the X direction and the Y direction between adjacent conductors.

The conductor 1382A has a shape in which two rectangular conductors 1341A arranged in the X direction in A in FIG. 162 are connected by the shortest path. The conductor 1382B has a shape in which two rectangular conductors 1341B arranged in the X direction in A in FIG. 162 are connected by the shortest path. Note that the conductor 1382A and the conductor 1382B do not need to have the shape connected by the shortest path, and may be formed by electrically connecting two or more rectangular conductors arranged in the X direction in A in FIG. 162.

C in FIG. 162 illustrates the conductor layer C of a twenty-third modification of the fourteenth configuration example of the three-layer conductor layer.

The conductor layer C in C in FIG. 162 is configured by arranging conductors 1383A and 1383B on the same plane with a predetermined repetition period in the Y direction. The conductor 1383A is, for example, wiring (Vss wiring) connected to the GND or the negative power supply. The conductor 1383B is, for example, wiring (Vdd wiring) connected to the positive power supply. The conductor 1383A has the conductor width WYCA in the Y direction, and the conductor 1382B has the conductor width WYCB in the Y direction. The gap width GXC and the gap width GYC in C in FIG. 162 correspond to the minimum widths in the X direction and the Y direction between adjacent conductors.

The conductor 1383A has a shape in which all the rectangular conductors 1341A arranged in the X direction in A in FIG. 162 are connected by the shortest path. The conductor 1383B has a shape in which all the rectangular conductors 1341B arranged in the X direction in A in FIG. 162 are connected by the shortest path. Note that the conductors 1383A and 1383B do not need to have the shape connecting all the rectangular conductors arranged in the X direction in A in FIG. 162 by the shortest path, and may have a meander shape or a meandering shape, for example.

In the conductor layers C in A to C in FIG. 162, the capacitive noise can be completely canceled in the Y direction and partially canceled in the X direction. The capacitive noise can be significantly improved as the conductor layer C is closer to the wiring layer 170.

A in FIG. 163 illustrates the conductor layer C of a twenty-fourth modification of the fourteenth configuration example of the three-layer conductor layer.

The conductor layer C in A in FIG. 163 is common to that in A in FIG. 153 in that the rectangular conductors 1341A and 1341B are repeatedly arranged on the same plane with a predetermined repetition period, and is different from that in A in FIG. 153 in that a region in which the arrangement is shifted in adjacent columns by ¼ of the conductor period FYC in the Y direction, and a region in which the arrangement is not shifted coexist. The conductor layer C in A in FIG. 163 has a configuration in which the two rectangular conductors 1341A and 1341B, which are not shifted in the Y direction, are folded back and repeatedly arranged in the X direction with the conductor period FXC with reference to the center in the X direction.

B in FIG. 163 illustrates the conductor layer C of a twenty-fifth modification of the fourteenth configuration example of the three-layer conductor layer.

The conductor layer C in B in FIG. 163 is configured by arranging rectangular conductors 1371A and 1371B and repeatedly arranging conductors 1382A and 1382B on the same plane with a predetermined repetition period.

The conductor layer C in B in FIG. 163 has a configuration in which the conductors 1382A and 1382B are folded back at the center in the X direction of the rectangular conductors 1371A and 1371B, and the conductors 1382A and 1382B are repeatedly arranged in the X direction with the conductor period FXC.

C in FIG. 163 illustrates the conductor layer C of a twenty-sixth modification of the fourteenth configuration example of the three-layer conductor layer.

The conductor layer C in C in FIG. 163 is configured by arranging conductors 1391A and 1391B on the same plane in the Y direction with a predetermined repetition period. The conductor 1391A is, for example, wiring (Vss wiring) connected to the GND or the negative power supply. The conductor 1391B is, for example, wiring (Vdd wiring) connected to the positive power supply. The conductor 1391A has the conductor width WYCA in the Y direction, and the conductor 1391B has the conductor width WYCB in the Y direction. The gap width GXC and the gap width GYC in C in FIG. 163 correspond to the minimum widths in the X direction and the Y direction between adjacent conductors.

The conductor 1391A has a shape in which all the rectangular conductors 1371A and the conductors 1382A arranged in the X direction in B in FIG. 163 are connected by the shortest path. The conductor 1391B has a shape in which all the rectangular conductors 1371B and the conductors 1382B arranged in the X direction in B in FIG. 163 are connected by the shortest path. Note that the conductor 1391A and the conductor 1391B do not need to have the shape connecting all the rectangular conductors arranged in the X direction in B in FIG. 163 by the shortest path, and may have a meander shape or a meandering shape, for example.

The conductor layer C in C in FIG. 163 has a configuration in which the conductor 1391A and the conductor 1391B are folded back and repeatedly arranged in the X direction with the conductor period FXC in the same region units as the conductor layer C in B in FIG. 163.

The conductor layers C in A to C in FIG. 163 have a mirror-symmetrical conductor arrangement in the X direction.

In the conductor layers C in A to C in FIG. 163, the capacitive noise can be completely canceled in the Y direction and partially canceled in the X direction. The capacitive noise can be significantly improved as the conductor layer C is closer to the wiring layer 170. Although some specific examples have been described, the first to fourteenth configuration examples or the modifications thereof (FIGS. 122 to 163) are particularly suitable for the stacking order in which the three layers of the conductor layers A to C can be electrically connected via the conductor via (VIA) or the like extending in the Z direction. Specifically, the configuration examples and the modifications thereof illustrated in FIGS. 122 to 127, 134, 148, 149, and 152 to 163 are suitable for the stacking order illustrated in B in FIG. 120. Furthermore, the configuration examples and the modifications thereof illustrated in FIG. 150 are suitable for the stacking orders illustrated in A and B in FIG. 120. Furthermore, the configuration examples and modifications thereof illustrated in FIGS. 129, 131, 133, 135 to 138, 140, 142 to 144, 146, 147, and 151 are suitable for the stacking orders illustrated in B and C in FIG. 120. Furthermore, the configuration examples and modifications thereof illustrated in FIGS. 128, 130, 132, 139, 141, and 145 are suitable for the stacking orders illustrated in A to C in FIG. 120.

Other Modifications of Three-Layer Conductor Layer

In each of the above configuration examples, the conductor described as the wiring (Vss wiring) connected to the GND or the negative power supply, for example, may be the wiring (Vdd wiring) connected to the positive power supply, for example. The conductor described as the wiring (Vdd wiring) connected to the positive power supply, for example, may be the wiring (Vss wiring) connected to the GND or the negative power supply, for example. The voltage to be Vdd or Vss may be the GND and a power supply, or may be two types of power supplies having different voltages. The voltage to be Vdd or Vss should have two different polarities, but this is not the case. The number and the total area of the conductor vias (VIAs) extending in the Z direction and connecting the conductor layers A, B, and C are desirably the same between Vdd and Vss in a predetermined plane range (plane region), but this is not the case. When thinning out the relay conductors arranged in the gaps, a method other than the above-described method, for example, randomly thinning out the relay conductors may be adopted.

The conductor layer C is a conductor layer having a low sheet resistance in which the current easily flows, but may be a conductor layer having a high sheet resistance in which the current less easily flow. The conductor layer C is desirably, but is not limited to, not the conductor layer in which the current most uneasily flows among circuit boards, semiconductor substrates, and electronic devices. The conductor layer C is desirably, but is not limited to, the conductor layer in which the current most easily flows among circuit boards, semiconductor substrates, and electronic devices. The conductor layer C is desirably, but is not limited to, the conductor layer in which the current more easily flows than at least one of the conductor layer A or the conductor layer B. The conductor layer C is desirably, but is not limited to, the conductor layer in which the current easily flows next to the conductor layer A among circuit boards, semiconductor substrates, and electronic devices. The conductor layer C is desirably, but is not limited to, the conductor layer in which the current easily flows next to the conductor layer B among circuit boards, semiconductor substrates, and electronic devices. For example, the conductor layer C may be the conductor layer in which the current most uneasily flows in the first semiconductor substrate 101 or the second semiconductor substrate 102. For example, the conductor layer C may be the conductor layer in which the current most easily flows in the first semiconductor substrate 101 or the second semiconductor substrate 102. For example, the conductor layer C may be the conductor layer in which the current second-most easily flows in the first semiconductor substrate 101 or the second semiconductor substrate 102. For example, the conductor layer C may be the conductor layer in which the current third most easily flows in the first semiconductor substrate 101 or the second semiconductor substrate 102. For example, the conductor layer C may be the conductor layer in which the current easily flows next to the conductor layer A in the first semiconductor substrate 101 or the second semiconductor substrate 102. For example, the conductor layer C may be the conductor layer in which the current easily flows next to the conductor layer B in the first semiconductor substrate 101 or the second semiconductor substrate 102.

Note that the above-described conductor layer in which the current easily flows among circuit boards, semiconductor substrates, and electronic devices may be considered to be any of a conductor layer in which the current easily flows among the circuit boards, a conductor layer in which the current easily flows among the semiconductor substrates, or a conductor layer in which the current easily flows among the electronic devices. Note that the above-described conductor layer in which the current less easily flows among circuit boards, semiconductor substrates, and electronic devices may be considered to be any of a conductor layer in which the current less easily flows among the circuit boards, a conductor layer in which the current less easily flows among the semiconductor substrates, or a conductor layer in which the current less easily flows among the electronic devices. Furthermore, even if the conductor layer in which the current easily flows is a conductor layer having a low sheet resistance, and the conductor layer in which the current less easily flows is a conductor layer having a high sheet resistance, thereby can be replaced with each other.

As the conductor material used for the conductor layer C, a metal such as copper, aluminum, tungsten, chromium, nickel, tantalum, molybdenum, titanium, gold, silver, or iron, or a mixture, a compound, or an alloy containing at least one of the aforementioned metals, is mainly used. Furthermore, a semiconductor such as silicon, germanium, a compound semiconductor, or an organic semiconductor may be included. Moreover, an insulator such as cotton, paper, polyethylene, polyvinyl chloride, natural rubber, polyester, epoxy resin, melamine resin, phenol resin, polyurethane, synthetic resin, mica, asbestos, glass fiber, or porcelain may be included. Furthermore, the conductor layer C may be an uppermost layer metal or a lowest layer metal, that is, an uppermost layer or a lowest layer conductor layer, or may be a conductor layer used for similar metal bonding such as Cu—Cu bonding, Au—Au bonding, or Al—Al bonding, or dissimilar metal bonding such as Cu—Au bonding, Cu—Al bonding, or Au—Al bonding.

The plane arrangement of each of the conductor layers A to C may be reversed in the X direction or in the Y direction. Furthermore, the plane arrangement may be rotated clockwise by a predetermined angle (for example, 90 degrees) or counterclockwise by a predetermined angle (for example, −90 degrees). Furthermore, some of the above-described configuration examples have been described using the example in which all the conductor periods, conductor widths, and gap widths are uniform. However, this is not the case. For example, the conductor period, the conductor width, and the gap width may be non-uniform, or the conductor period, the conductor width, and the gap width may be modulated depending on a position. Furthermore, some of the above-described configuration examples have been described using the example in which the conductor periods, conductor widths, gap widths, wiring shapes, wiring positions, the numbers of wirings, and the like are substantially the same in the Vdd wiring and the Vss wiring. However, this is not the case. For example, the Vdd wiring and the Vss wiring may have different conductor periods, different conductor widths, different gap widths, different wiring shapes, or different wiring positions. The wiring position may be shifted or misaligned, and the number of wirings may be different.

13. Application

The technology according to the present disclosure is not limited to the description of the above embodiments and its modifications or applications, and various modifications can be carried out. The above-described embodiments and the modifications or applications thereof may be omitted in part, the part or the whole may be changed, the part or the whole may be altered, the part may be replaced with another configuration element, or another configuration element may be added to the part or the whole. Furthermore, a part or the whole of the configuration elements in the above-described embodiments and the modifications or applications thereof may be divided into a plurality of elements, the part or the whole may be separated into a plurality of elements, or at least some of the plurality of divided or separated configuration elements may have different functions or characteristics. Moreover, at least some of the configuration elements in the above-described embodiments and the modifications or applications thereof may be combined to form a different embodiment. Moreover, at least some of the configuration elements in the above-described embodiments and the modifications or applications thereof may be moved to form a different embodiment. Moreover, a coupling element or a relay element may be added to at least some of the configuration elements in the above-described embodiments and the modifications or applications thereof to form a different embodiment. Moreover, a switching element or a switching function may be added to at least some of the configuration elements in the above-described embodiments and the modifications or applications thereof to form a different embodiment.

In the solid-state imaging device 100 of the present embodiment, the conductors forming the conductor layers A and B, which can be the Aggressor conductor loops, are the Vdd wiring or the Vss wiring. That is, the currents flow in the directions opposite to each other in at least some regions in the conductor layers A and B. When the current flows downward in the figure in the conductor layer A, the current flows upward in the figure in the conductor layer B. Note that the magnitudes of the currents are desirably the same as each other. Note that the description has been given using the example in which the conductors forming the conductor layers A and B are configured in the second semiconductor substrate, but this is not the case. For example, the conductors may be configured in the first semiconductor substrate, or some or all of the conductors may be configured in somewhere other than the second semiconductor substrate.

As the signal flowing through the conductor layers A and B, any signal other than Vdd and Vss may flow as long as the signal is a differential signal whose current direction changes in the time direction. That is, it is sufficient that a signal with a current I that changes according to a time t (a minute current change in a minute time dt is dI) flows through the conductor layers A and B. Note that even if a DC current is basically flowing through the conductor layers A and B, if there is a rising current, a time transition of the current, a falling current, or the like, the current I changes according to the time t.

For example, the magnitude of the current flowing through the conductor layer A and the magnitude of the current flowing through the conductor layer B do not have to be the same. On the contrary, the magnitude of the current flowing through the conductor layer A and the magnitude of the current flowing through the conductor layer B may be made the same (currents that change with time flow through the conductor layers A and B at substantially the same timing). In general, the magnitude of the induced electromotive force generated in the Victim conductor loop can be more suppressed in the case where the currents that change with time flow through the conductor layers A and B at substantially the same timing than the case where the magnitude of the current flowing through the conductor layer A and the magnitude of the current flowing through the conductor layer B are not the same. Meanwhile, the signals flowing through the conductor layers A and B do not have to be differential signals. For example, both may be Vdd wiring, both Vss wiring, both GND wiring, the same type of signal line, different types of signal lines, or the like. Furthermore, the conductors forming the conductor layers A and B may be conductors that are not connected to a power supply or a signal source. In these cases, the effect of suppressing the inductive noise is reduced, but other effects of the invention can be obtained.

Furthermore, a frequency signal having a predetermined frequency, such as a clock signal, may flow through the conductor layers A and B. Furthermore, for example, an AC power supply current may flow through the conductor layers A and B. Furthermore, for example, the same frequency signal may flow through the conductor layers A and B. Furthermore, signals including a plurality of frequency components may flow through the conductor layers A and B. Meanwhile, a DC signal with the current I that does not change at all may flow according to the time t. In this case, the effect of suppressing the inductive noise cannot be obtained, but other effects of the invention can be obtained. Meanwhile, the signal may be caused not to flow. In this case, the effects of inductive noise suppression, capacitive noise suppression, and voltage drop (IR-Drop) reduction cannot be obtained, but other effects of the invention can be obtained.

14. Shift Configuration Example of Reticulated Conductor

First Shift Configuration Example of Reticulated Conductor

By the way, in the above-described conductor layers A and B, some configuration examples adopting the reticulated conductors have been proposed.

For example, in the second configuration example illustrated in FIG. 15, the conductor layer A including the reticulated conductor 216 and the conductor layer B including the reticulated conductor 217 have been described. In the fourth configuration example illustrated in FIG. 25, the conductor layer A including the reticulated conductor 231 and the conductor layer B including the reticulated conductor 232 have been described.

Furthermore, the configuration examples in which the relay conductor is arranged within the gap region of the reticulated conductor have been proposed.

For example, in the eighth configuration example illustrated in FIG. 32, the conductor layer A including the reticulated conductor 271 and the conductor layer B including the reticulated conductor 272 and the relay conductor 302 have been described. The relay conductor 302 is a non-reticulated conductor arranged in the gap region that is not the conductor of the reticulated conductor 272. The number of relay conductors arranged in the gap region of the reticulated conductor is not limited to one. For example, a plurality of relay conductors 306 of the conductor layer B in FIG. 40 may be arranged.

Moreover, for example, as in the fourth configuration example of the three-layer conductor layer illustrated in FIG. 128, each of the conductor layer A and the conductor layer B has the relay conductor.

The wiring pattern in which the reticulated conductor is repeated to the same position in the XY direction has a disadvantage in terms of capacitive noise.

Specifically, for example, as illustrated on the left side in FIG. 164, there is a conductor layer 1511 including a reticulated conductor 1501 and a relay conductor 1502 arranged in the gap region of the reticulated conductor 1501. The reticulated conductor 1501 is, for example, wiring (Vss wiring) connected to the GND or the negative power supply. The relay conductor 1502 is, for example, wiring (Vdd wiring) connected to the positive power supply.

Wiring 1512, which constitutes a part of the Victim conductor loop, is arranged in an upper or lower layer of the conductor layer 1511 including the reticulated conductor 1501 and the relay conductor 1502. The wiring 1512 corresponds to, for example, the signal line 132 and the control line 133 of the solid-state imaging device 100.

The signal line 132 is wired longer in the Y direction than in the X direction, and a plurality of signal lines 132 is periodically arranged in the pixel array 121 with a predetermined periodic width (for example, in pixel units). When the signal line 132 is selected by the select transistor 145 of each pixel 131, a signal is transmitted. The control line 133 is wired longer in the X direction than in the Y direction, and a plurality of control lines 133 is periodically arranged in the pixel array 121 with a predetermined periodic width (for example, in pixel units). When the control line 133 is selected by the vertical scanning unit 123, a signal is transmitted.

When the Vdd wiring and the Vss wiring are integrated with a part where the reticulated conductor 1501 and the relay conductor 1502 of the conductor layer 1511 affect a linear conductor that is long in the Y direction, like the wiring 1512, that is, linearly in the Y direction to overlap with the wiring 1512, the total charge amount by Vdd and the total charge amount by Vss are significantly different as illustrated on the right side in FIG. 164. The difference between the positive capacitance due to the Vdd wiring and the negative capacitance due to the Vss wiring generates the capacitive noise.

The capacitive noise refers to, as described with reference to FIG. 62 and the like, generation of a voltage in wiring by capacitive coupling between a conductor that forms a conductor layer and wiring in a case where a voltage is applied to the conductor, and occurrence of voltage noise in the wiring as the applied voltage changes. This voltage noise becomes noise of the pixel signal.

To reduce the noise, a conductor layer to which a predetermined amount of shift is set in a direction orthogonal to a longitudinal direction of the wiring 1512 that constitutes a part of the Victim conductor loop, like the conductor layer 1611 on the left side in FIG. 165, has been conceived by the inventors of the present application.

The conductor layer 1611 includes a reticulated conductor 1601 and a relay conductor 1602 arranged in the gap region of the reticulated conductor 1601. The reticulated conductor 1601 is, for example, wiring (Vss wiring) connected to the GND or the negative power supply. The relay conductor 1602 is, for example, wiring (Vdd wiring) connected to the positive power supply.

In the case of providing the predetermined amount of shift in the direction orthogonal to the longitudinal direction of the wiring 1512 in this way, when the Vdd wiring and the Vss wiring are linearly integrated in the Y direction, the total charge amount by Vdd and the total charge amount by Vss can be made substantially the same, as illustrated on the right side in FIG. 165. Furthermore, the polarities of the voltages of the reticulated conductor 1601 and the relay conductor 1602 are opposite (opposite polarities) between Vdd and Vss. Therefore, according to the conductor layer 1611, the capacitive noise in the wiring 1512 as a Victim conductor can be canceled. In the case where the Vdd wiring and the Vss wiring of Y-direction integration match, the capacitive noise can be completely canceled.

Hereinafter, a configuration example of reducing the capacitive noise, favorably completely canceling the capacitive noise, by providing a predetermined amount of shift in the direction orthogonal to the longitudinal direction of a Victim conductor in a conductor layer of a reticulated conductor, will be described.

First, the conductor widths and gap widths of the reticulated conductor 1601 and the relay conductor 1602 constituting the conductor layer 1611 as a first configuration example of the reticulated conductor provided with an amount of shift (a first shift configuration example of the reticulated conductor) will be described with reference to FIG. 166.

The reticulated conductor 1601 has a conductor width WDX and a gap width GDX in the X direction, and is a repeating pattern of the conductor width WDX and the gap width GDX with a periodic width FDX (=the conductor width WDX+the gap width GDX). Furthermore, in the Y direction, the reticulated conductor 1601 has a conductor width WDY and a gap width GDY, and is a repeating pattern of the conductor width WDY and the gap width GDY with a periodic width FDY (=the conductor width WDY+the gap width GDY). Note that, in the reticulated conductor 1601, the conductor arrangement with the conductor width WDX and the gap width GDX in the X direction is shifted in the X direction by a predetermined amount of shift PDX every time the periodic width FDY in the Y direction is repeated. The amount of shift PDX in the X direction in units of the periodic width FDY is hereinafter also referred to as a periodic shift PDX.

The relay conductor 1602 is arranged in the gap region with the gap width GDX in the X direction and the gap width GDY in the Y direction of the reticulated conductor 1601.

The relay conductor 1602 is a rectangle having a conductor width CDX in the X direction and a conductor width CDY in the Y direction, and is a vertically long rectangle in which the conductor width CDY in the Y direction is larger than the conductor width CDX in the X direction (CDY>CDX).

One end face of the relay conductor 1602 in the X direction is separated from the reticulated conductor 1601 by a first gap width GDX1, and the other end face in the X direction is separated from the reticulated conductor 1601 by a second gap width GDX2. The gap width GDX in the X direction of the reticulated conductor 1601 is equal to the sum of the conductor width CDX in the X direction of the relay conductor 1602, the first gap width GDX1, and the second gap width GDX2. That is, GDX=CDX+GDX1+GDX2.

One end face of the relay conductor 1602 in the Y direction is separated from the reticulated conductor 1601 by a first gap width GDY1, and the other end face in the Y direction is separated from the reticulated conductor 1601 by a second gap width GDY2. The gap width GDY in the Y direction of the reticulated conductor 1601 is equal to the sum of the conductor width CDY in the Y direction of the relay conductor 1602, the first gap width GDY1, and the second gap width GDY2. That is, GDY=CDY+GDY1+GDY2.

Here, the magnitude relationship of the conductor width and the gap width between the reticulated conductor 1601 and the relay conductor 1602 is defined as follows.

As illustrated in FIG. 166, where A is an arbitrary real number, the conductor width WDX in the X direction and the conductor width WDY in the Y direction of the reticulated conductor 1601 are widths of 2A. In other words, the real number A is ½ of the conductor width WDX in the X direction and the conductor width WDY in the Y direction of the reticulated conductor 1601. Furthermore, the first gap width GDX1 and the second gap width GDX2 in the X direction are also 2A.

The conductor width CDX in the X direction of the relay conductor 1602 is set to 6A, and the conductor width CDY in the Y direction is set to 7A. The first gap width GDY1 and the second gap width GDY2 in the Y direction are set to 1A.

Therefore, the periodic width FDX (=the conductor width WDX+the gap width GDX) corresponds to 12A and the periodic width FDY (=the conductor width WDY+the gap width GDY) corresponds to 11A when expressed using the arbitrary real number A.

FIGS. 167 and 168 are plan views of the conductor layer 1611 in which the periodic shift PDX is set to various values.

A in FIG. 167 is a plan view of the conductor layer 1611 in which the periodic shift PDX is set to zero. Note that the conductor layer 1611 in which the periodic shift PDX is set to zero corresponds to the reticulated conductor 1501 in FIG. 164.

B in FIG. 167 is a plan view of the conductor layer 1611 in which the periodic shift PDX in the X direction is set to 1A, that is, 1/12 of the repetition period (periodic width FDX) in the X direction.

C in FIG. 167 is a plan view of the conductor layer 1611 in which the periodic shift PDX is set to 2A, that is, 2/12 of the repetition period (periodic width FDX) in the X direction.

D in FIG. 167 is a plan view of the conductor layer 1611 in which the periodic shift PDX is set to 3A, that is, 3/12 of the repetition period (periodic width FDX) in the X direction.

A in FIG. 168 is a plan view of the conductor layer 1611 in which the periodic shift PDX is set to 4A, that is, 4/12 of the repetition period (periodic width FDX) in the X direction.

B in FIG. 168 is a plan view of the conductor layer 1611 in which the periodic shift PDX is set to 5A, that is, 5/12 of the repetition period (periodic width FDX) in the X direction.

C in FIG. 168 is a plan view of the conductor layer 1611 in which the periodic shift PDX is set to 6A, that is, 6/12 of the repetition period (periodic width FDX) in the X direction.

FIG. 169 is a graph illustrating theoretical values of the capacitive noise of the conductor layer 1611 in which the periodic shift PDX is set to various values as illustrated in FIGS. 167 and 168.

The horizontal axis of FIG. 169 represents coordinates indicating the position of the conductor layer 1611 in the X direction, and the vertical axis represents the capacitive noise of the Vdd wiring and the Vss wiring at each X position. Note that it is assumed that absolute values of the applied voltage of the Vdd wiring (Vdd applied voltage) and the applied voltage of the Vss wiring (Vss applied voltage) are the same. For example, a case in which the Vdd applied voltage is +1 V and the Vss applied voltage is −1 V is assumed.

As illustrated in FIG. 169, in a case where the periodic shift PDX is a predetermined value, the amount of change in the capacitive noise is zero and the absolute value of the capacitive noise is zero. More specifically, in a case where the periodic shift PDX is set to 1/12, 2/12, or 5/12 of the repetition period in the X direction, the amount of change in the capacitive noise is zero and the absolute value of the capacitive noise is zero.

In a case of another periodic shift PDX, specifically, in a case where the periodic shift PDX is 3/12, 4/12, or 6/12 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

FIG. 170 is a graph illustrating theoretical values of the capacitive noise in a case where the periodic shift PDX is set to various values in the conductor layer 1611 from which the relay conductor 1602 is omitted. Although illustration of the conductor layer 1611 from which the relay conductor 1602 is omitted is omitted, it corresponds to each of the conductor layers 1611 in FIGS. 167 and 168 from which the relay conductor 1602 is removed.

In the absence of the relay conductor 1602, the absolute value of the capacitive noise is not zero, as illustrated in FIG. 170, but the amount of change in the capacitive noise is zero in a case where the periodic shift PDX is a predetermined value. The amount of shift at which the amount of change in the capacitive noise becomes zero is the same as the case where the relay conductor 1602 is present. That is, in a case where the periodic shift PDX is set to 1/12, 2/12, or 5/12 of the repetition period in the X direction, the amount of change in the capacitive noise is zero. In a case of another periodic shift PDX, specifically, in a case where the periodic shift PDX is 3/12, 4/12, or 6/12 of the repetition period in the X direction, the amount of change in the capacitive noise is not zero, but the change in the amount of change in the capacitive noise can be made smaller than a case where the periodic shift PDX is zero, that is, in a case of no periodic shift.

When the following conditions are satisfied, the amount of change in the capacitive noise becomes zero according to the graphs in FIGS. 169 and 170.

First, as a premise, the periodic shift PDX is set to a value different from the periodic width FDX (=12A) in the X direction of the reticulated conductor 1601.

In a case where the periodic shift PDX is 2A, that is, the periodic shift PDX is the same as the conductor width WDX in the X direction of the reticulated conductor 1601, the amount of change in the capacitive noise becomes zero. Furthermore, the amount of change in the capacitive noise becomes zero in a case where the periodic shift PDX is 1A and in a case where the periodic shift PDX is 5A.

In a case where the periodic shift PDX is 1A or 5A, the amount of change in the capacitive noise becomes zero in units of twelve rows. Meanwhile, in a case where the periodic shift PDX is 2A, the amount of change in the capacitive noise becomes zero in units of six rows. In a case where the periodic shift PDX is equal to the conductor width WDX of the reticulated conductor 1601, the amount of change in the capacitive noise can be made zero with a small number of rows. Therefore, the degree of freedom in the wiring layout can be increased.

In a case where the periodic shift PDX is different from the repetition period of 3/12 (=3A) in the X direction of the reticulated conductor 1601, in other words, in a case where the periodic shift PDX is not the periodic width FDX (=12A)+4, the amount of change in the capacitive noise becomes zero.

In a case where the periodic shift PDX is different from the repetition period of 4/12 (=4A) in the X direction of the reticulated conductor 1601, in other words, in a case where the periodic shift PDX is not the periodic width FDX (=12A)+3, the amount of change in the capacitive noise becomes zero.

In a case where the periodic shift PDX is different from the repetition period of 6/12 (=6A) in the X direction of the reticulated conductor 1601, in other words, in a case where the periodic shift PDX is not the periodic width FDX (=12A)+2, the amount of change in the capacitive noise becomes zero.

In the presence of the relay conductor 1602, not only the amount of change in the capacitive noise becomes zero but also the absolute value of the capacitive noise can be made zero. In the absence of the relay conductor 1602, the amount of change in the capacitive noise is zero, but the absolute value of the capacitive noise is not zero.

Furthermore, the effect of improving the capacitive noise is greater in the presence of the relay conductor 1602 than the absence of the relay conductor 1602.

In FIGS. 167 to 170, the examples in which the periodic shift PDX is shifted in the positive direction of the X axis until the periodic shift PDX becomes 6A, which is half of the periodic width FDX (=12A), have been described. The same applies to a case where the periodic shift PDX is shifted in the negative direction of the X axis. More specifically, the capacitive noise in the case where the periodic shift PDX is shifted in the negative direction of the X axis by 1A, 2A, 3A, 4A, 5A, and 6A is similar to theoretical values of the capacitive noise in the case where the periodic shift PDX is shifted in the positive direction of the X axis by 1A, 2A, 3A, 4A, 5A, and 6A in FIGS. 169 and 170.

Furthermore, the capacitive noise in the case where the periodic shift PDX is shifted in the positive direction of the X axis by 7A, 8A, 9A, 10A, and 11A is similar to theoretical values of the capacitive noise in the case where the periodic shift PDX is shifted in the negative direction of the X axis by 5A, 4A, 3A, 2A, and 1A in FIGS. 169 and 170. In other words, the capacitive noise in the case where the periodic shift PDX is shifted in the positive direction of the X axis by 7A, 8A, 9A, 10A, and 11A is similar to theoretical values of the capacitive noise in the case where the periodic shift PDX is shifted in the positive direction of the X axis by 5A, 4A, 3A, 2A, and 1A.

Furthermore, the capacitive noise in the case where the periodic shift PDX is shifted in the positive direction of the X axis by 13A, 14A, 15A, 16A, 17A, and 18A is similar to theoretical values of the capacitive noise in the case where the periodic shift PDX is shifted in the positive direction of the X axis by 1A, 2A, 3A, 4A, 5A, and 6A in FIGS. 169 and 170. The same applies in the case where the periodic shift PDX is shifted in the negative direction of the X axis by 13A, 14A, 15A, 16A, 17A, and 18A.

According to the conductor layer 1611 that is the first shift configuration example of the reticulated conductor, the amount of change in the capacitive noise can be made smaller than the case where the periodic shift PDX is zero, that is, in the case of no periodic shift by providing the periodic shift PDX in the X direction. Moreover, in a case where the periodic shift PDX satisfies a predetermined condition, such as a case where the periodic shift PDX is set to be the same as the conductor width WDX in the X direction of the reticulated conductor 1601, for example, the amount of change in the capacitive noise can be made zero.

Moreover, in a case where the relay conductor 1602 is provided in the gap region of the reticulated conductor 1601, the absolute value of the capacitive noise can be made zero in the case where the amount of change in the capacitive noise is zero.

In a case where the following three conditions are satisfied, both the amount of change in the capacitive noise and the absolute value can be zero, that is, the capacitive noise can be completely canceled. The following conditions are referred to as first to third conditions of complete offset.

The area of the *Vdd* conductor within a predetermined range=the area of the *Vss* conductor within the predetermined range 1.

(The conductor width *CDX*)×(the conductor width *CDY*)={(the conductor width *CDY*)+(the first gap width *GDY*1)+(the second gap width *GDY*2)}×(the conductor width *WDX*)+{(the conductor width *CDX*)+(the first gap width *GDX*1)+(the second gap width *GDX*2)}×(the conductor width *WDY*)+(the conductor width *WDX*)×(the conductor width *WDY*)

(The conductor width *CDY*)×{the minimum number of rows−{(the conductor width *WDX*)+(the first gap width *GDX*1)+(the second gap width *GDX*2)}+the conductor width *WDX*}=(the conductor width *WDY*)×the minimum number of rows+(the conductor width *CDY*)+(the first gap width *GDY*1)+(the second gap width *GDY*2) 2.

The periodic shift *PDX*×the number of offset rows=an integer *N*×{(the conductor width *WDX*)+(the first gap width *GDX*1)+(the conductor width *CDX*)+(the second gap width *GDX*2)} 3.

The first condition of complete offset means that the conductive area of the reticulated conductor 1601 within the predetermined range match the conductive area of the relay conductor 1602 within the predetermined range, but the match may not be the exact match and the conductive areas may be substantially the same. Substantially the same means that the conductive areas match within a predetermined range (error) that can be regarded as the same. The minimum number of rows in the second condition represents the minimum number of rows of the reticulated conductor 1601 in which the capacitive noise can be completely canceled in the case where the periodic shift PDX is the conductor width WDX. With some exceptions, there is a condition in which the capacitive noise can be completely canceled in a case where the number of rows of the reticulated conductor 1601 is an integral multiple of the minimum number of rows. Since the second condition can be transformed into "the minimum number of rows={(the first gap width GDY1)+(the second gap width GDY2)+(the conductor width CDY)+(the conductor width CDY)×{(the conductor width WDX)+(the first gap width GDX1)+(the second gap width GDX2)}÷the conductor width WDX}÷{(the conductor width CDY)−(the conductor width WDY)}", the minimum number of rows can be calculated, and since the left side of the formula (the minimum number of rows) is an integer value, the right side of the formula is also an integer value. Note that the second condition is derived from the fact that the complete offset can be performed in the case where the sum of the conductor lengths in the Y direction of the reticulated conductor 1601 in the predetermined range matches the sum of the conductor lengths in the Y direction of the relay conductor 1602 within the predetermined range. That is, it is desirable that the sum of the conductor lengths in the Y direction of the reticulated conductor 1601 in the predetermined range and the sum of the conductor lengths in the Y direction of the relay conductor 1602 within the predetermined range are the same or substantially the same regardless of the minimum number of rows. The number of offset rows in the third condition represents the number of rows of the reticulated conductor 1601 in which the capacitive noise can be completely canceled. The integer N in the third condition represents a condition in which the capacitive noise can be completely canceled. With some exceptions, the number of offset rows is an integer, and in the case where "the periodic shift PDX×the number of offset rows" becomes an integral multiple (N times) of "(the conductor width WDX)+(the first gap width GDX1)+(the conductor width CDX)+(the second gap width GDX2), that is, in the case where "the periodic shift PDX×the number of offset rows" becomes an integral multiple (N times) of the periodic width FDX, there is a condition in which the capacitive noise can be completely canceled. In other words, it is desirable that the sum of the periodic shift PDX of the number of offset rows (the periodic shift PDX×the number of offset rows) and the integral multiple (N times) of the periodic width FDX becomes the same or substantially the same. Furthermore, although there may be some exceptions, there is a condition that the capacitive noise can be completely canceled in the case where the number of offset rows becomes an integral multiple of the minimum number of rows. Furthermore, the capacitive noise can be completely offset in a case where the number of rows of the reticulated conductor 1601 is the number of rows obtained by multiplying the number of offset rows by an integer. Note that it is conceivable that it is necessary to satisfy at least the first condition in order to completely cancel the capacitive noise. However, there are some cases where at least part of the capacitive noise can be canceled in a case where at least one of the second condition or the third condition is satisfied among the first to third conditions. Therefore, at least only part of the first to third conditions may be satisfied. Furthermore, in that case, the minimum number of rows or the number of offset rows may be interpreted as the number of rows of the reticulated conductor 1601.

By providing the periodic shift PDX to some extent, the effect of improving the capacitive noise can be increased even in the case where the amount of change in the capacitive noise is not zero.

Note that, in the above-described first shift configuration example, the absolute values of the Vdd applied voltage and the Vss applied voltage are the same, but the absolute values do not necessarily have to be the same. For example, the Vdd applied voltage may be a positive power supply (+1V) and the Vss applied voltage may be the GND (0 V). Even in the case where the absolute values of the Vdd applied voltage and the Vss applied voltage are not the same, at least a part of the capacitive noise is canceled by providing the periodic shift PDX in the X direction, so that the effect of improving the capacitive noise is obtained. Furthermore, even if the Vdd applied voltage and the Vss applied voltage are not the same, the capacitive noise may be completely canceled when, for example, the current direction differs between the Vdd conductor and the Vss conductor (particularly in the opposite direction), and the capacitive noise caused by a change by the voltage drop (IR-Drop) has an opposite polarity between the Vdd conductor and the Vss conductor.

The reticulated conductor 1601 having the periodic shift PDX in the X direction will be defined with reference to FIG. 171.

The reticulated conductor 1601 can be divided into a plurality of conductors 1651 wired in the X direction, and a plurality of conductors 1652 wired in the Y direction between two adjacent conductors 1651.

The reticulated conductor 1601 includes a first conductor group 1661 including two or more conductors 1651 having the conductor width WDY (first conductor width) arranged in the Y direction (first direction) with the periodic width FDY (first periodic width) and a second conductor group 1662 including two or more conductors 1652 having the conductor width WDX (second conductor width) arranged in the periodic width FDX (second periodic width) in the X direction (second direction) orthogonal to the Y direction.

Moreover, the reticulated conductor 1601 includes a first moving body group 1663 arranged at a position obtained by moving at least a part (for example, all) of the second conductor group 1662 including the two or more conductors 1652 by a factor of 1 of the periodic width FDY in the Y direction and moving at least the part by a factor of 1 of the periodic shift PDX (third periodic width) in the X direction. Here, the periodic shift PDX and the periodic width FDX are different.

Furthermore, in a case where the reticulated conductor 1601 further includes an Mth moving body group 1663 (M=2, 3, 4, 5, . . . , L (L is an integer of 2 or larger)) arranged at a position to which at least a part (for example, all) of the second conductor group 1662 including two or more conductors 1652 is moved by a factor of M of the periodic width FDY in the Y direction, and is moved by a factor of M of the periodic shift PDX (third periodic width) in the X direction, the reticulated conductor 1601 becomes the reticulated conductor illustrated in FIG. 172.

Since the reticulated conductor 1601 has the configuration provided with the periodic shift PDX different from the periodic width FDX, as in FIGS. 171 and 172, the capacitive noise for the wiring (conductor) arranged at the position overlapping with at least a part of the reticulated conductor 1601 as viewed from the Z direction orthogonal to the X direction and the Y direction can be reduced or favorably completely canceled. Examples of the wiring include the signal lines 132 and the control lines 133 of the solid-state imaging device 100, as described with reference to FIGS. 164 and 165.

Modification of First Shift Configuration Example of Reticulated Conductor

FIGS. 173 to 181 illustrate various modifications of the first shift configuration example of the reticulated conductor.

Note that, in FIGS. 173 to 181, the periodic shift PDX is 2A, that is, the conductor width WDX of the reticulated conductor 1601. Furthermore, in the description of the various modifications in FIGS. 173 to 181, for the sake of simplicity, the first shift configuration example of the reticulated conductor illustrated in FIGS. 167 and 168 is referred to as a basic configuration example of periodic shift, and only the parts different from the basic configuration example of periodic shift will be described.

A in FIG. 173 is a plan view illustrating a first modification of the first shift configuration example of the reticulated conductor.

The first modification in A in FIG. 173 is different from the basic configuration example of periodic shift in that arrangement of the relay conductor 1602 is changed to left shift in the gap region. In the basic configuration example of periodic shift, (the first gap width GDX1)=(the second gap width GDX2), whereas in the first modification, (the first gap width GDX1)<(the second gap width GDX2).

B in FIG. 173 is a plan view illustrating a second modification of the first shift configuration example of the reticulated conductor.

The second modification in B in FIG. 173 is different from the basic configuration example of periodic shift in that arrangement of the relay conductor 1602 is changed to right shift in the gap region. In the basic configuration example of periodic shift, (the first gap width GDX1)=(the second gap width GDX2), whereas in the second modification, (the first gap width GDX1)>(the second gap width GDX2).

A in FIG. 174 is a plan view illustrating a third modification of the first shift configuration example of the reticulated conductor.

The third modification in A in FIG. 174 is different from the basic configuration example of periodic shift in that arrangement of the relay conductor 1602 is changed to upper shift in the gap region. In the basic configuration example of periodic shift, (the first gap width GDY1)=(the second gap width GDY2), whereas in the third modification, (the first gap width GDY1)<(the second gap width GDY2).

B in FIG. 174 is a plan view illustrating a fourth modification of the first shift configuration example of the reticulated conductor.

The fourth modification in B in FIG. 174 is different from the basic configuration example of periodic shift in that arrangement of the relay conductor 1602 is changed to lower shift in the gap region. In the basic configuration example of periodic shift, (the first gap width GDY1)=(the second gap width GDY2), whereas in the fourth modification, (the first gap width GDY1)>(the second gap width GDY2).

A in FIG. 175 is a plan view illustrating a fifth modification of the first shift configuration example of the reticulated conductor.

The fifth modification in A in FIG. 175 is different from the basic configuration example of periodic shift in that arrangement of the relay conductor 1602 is changed to alternate arrangement of upper shift and lower shift for each column. The magnitude relationship between (the first gap width GDY1) and (the second gap width GDY2) in each of the upper shift and the lower shift is similar to that in the third modification and the fourth modification.

B in FIG. 175 is a plan view illustrating a sixth modification of the first shift configuration example of the reticulated conductor.

The sixth modification in B in FIG. 175 is different from the basic configuration example of periodic shift in that arrangement of the relay conductor 1602 is changed to alternate arrangement of upper shift and lower shift for each row and for each column. The magnitude relationship between (the first gap width GDY1) and (the second gap width GDY2) in each of the upper shift and the lower shift is similar to that in the third modification and the fourth modification.

Although not illustrated, alternate arrangement of right shift and left shift for each column, or alternate arrangement of right shift and left shift for each row and for each column is also similarly possible.

A in FIG. 176 is a plan view illustrating a seventh modification of the first shift configuration example of the reticulated conductor.

The seventh modification in A in FIG. 176 is different from the basic configuration example of periodic shift in that the arrangement of the relay conductor 1602 is changed to arrangement in which two rows forming a pair and in inner shift are repeated in the Y direction. The magnitude relationship between (the first gap width GDY1) and (the second gap width GDY2) in each of the upper shift and the lower shift is similar to that in the third modification and the fourth modification.

B in FIG. 176 is a plan view illustrating an eighth modification of the first shift configuration example of the reticulated conductor.

The eighth modification in B in FIG. 176 is different from the basic configuration example of periodic shift in that the arrangement of the relay conductor 1602 is changed to arrangement in which two rows forming a pair and in inner shift and outer shift for each two columns and for each two rows are repeated in the Y direction. The magnitude relationship between (the first gap width GDY1) and (the second gap width GDY2) in each of the upper shift and the lower shift is similar to that in the third modification and the fourth modification.

A in FIG. 177 is a plan view illustrating a ninth modification of the first shift configuration example of the reticulated conductor.

The ninth modification in A in FIG. 177 is different from the basic configuration example of periodic shift in that the relay conductor 1602 is evenly separated into two parts in a right-left direction. The separated two relay conductors 1602 are mirror-symmetrically arranged in the separation direction (X direction).

B in FIG. 177 is a plan view illustrating a tenth modification of the first shift configuration example of the reticulated conductor.

The tenth modification in B in FIG. 177 is different from the basic configuration example of periodic shift in that the relay conductor 1602 is separated into two parts in the right-left direction, and arrangements of the two parts in the up-down direction (Y direction) are different.

A in FIG. 178 is a plan view illustrating an eleventh modification of the first shift configuration example of the reticulated conductor.

The eleventh modification in A in FIG. 178 is different from the basic configuration example of periodic shift in that the relay conductor 1602 is unevenly separated into two parts in the right-left direction. In the eleventh modification in A in FIG. 178, the left part of the separated two parts is larger than the right part, but a configuration in which the right part is larger than the left part can also be adopted. Furthermore, a configuration in which the relay conductor 1602 is unevenly separated into two parts in the up-down direction can also be adopted.

B in FIG. 178 is a plan view illustrating a twelfth modification of the first shift configuration example of the reticulated conductor.

The twelfth modification in B in FIG. 178 is different from the basic configuration example of periodic shift in that the relay conductor 1602 is divided into two parts without being separated in the right-left direction, and shifted in the up-down direction In the twelfth modification in B in FIG. 178, the left part is shifted upward and the right part is shifted downward, of the right and left two parts shifted in the up-down direction. However, a configuration in which the right part is shifted upward and the left part is shifted downward can also be adopted. Furthermore, a configuration in which the two parts are shifted in the right-left direction from the center in the up-down direction can also be adopted.

A in FIG. 179 is a plan view illustrating a thirteenth modification of the first shift configuration example of the reticulated conductor.

The thirteenth modification in A in FIG. 179 is different from the basic configuration example of periodic shift in that the relay conductor 1602 is evenly separated into three parts in the right-left direction.

Although not illustrated, configurations similar to the two-separation configurations illustrated in FIGS. 177 and 178 are also possible in addition to such a three-even separation configuration in the right-left direction. For example, a three-even separation configuration in the up-down direction, a three-uneven separation configuration in the right-left direction, a three-uneven separation configuration in the up-down direction, a configuration of three-even separation in the right-left direction and shifted in the up-down direction, a configuration of three-even separation in the up-down direction and shifted in the right-left direction, a configuration in which three divisions without separation are shifted in the up-down direction, a configuration in which three divisions without separation are shifted in the right-left direction, and the like are also possible.

B in FIG. 179 is a plan view illustrating a fourteenth modification of the first shift configuration example of the reticulated conductor.

The fourteenth modification in B in FIG. 179 is different from the basic configuration example of periodic shift in that the relay conductor 1602 is evenly separated into four parts in the up-down direction and the right-left direction.

Even in the configuration in which the relay conductor 1602 is separated into four parts, uneven separation, a configuration in which the separated four parts are shifted in at least one of the up-down direction or the right-left direction, and a configuration in which the separated four are shifted without separation can also be adopted, for example.

In FIGS. 177 to 179, examples in which the relay conductor 1602 is configured by two-separation, three-separation, or four-separation have been described. However, an arbitrary number of separations of five-separation or more is also possible. In FIG. 180, examples of five-separation and nine-separation will be described.

A in FIG. 180 is a plan view illustrating a fifteenth modification of the first shift configuration example of the reticulated conductor.

The fifteenth modification in A in FIG. 180 is different from the basic configuration example of periodic shift in that the relay conductor 1602 is separated into five parts. In the example in A in FIG. 180, the center region is large among the separated five parts. However, such size relationship and arrangement relationship among the five parts are example, and the configuration is not limited to the example.

B in FIG. 180 is a plan view illustrating a sixteenth modification of the first shift configuration example of the reticulated conductor.

The sixteenth modification in B in FIG. 180 is different from the basic configuration example of periodic shift in that the relay conductor 1602 is separated into nine parts. In the example in B in FIG. 180, the center region is large among the separated nine parts. However, such size relationship and arrangement relationship among the nine parts are example, and the configuration is not limited to the example.

A in FIG. 181 is a plan view illustrating a seventeenth modification of the first shift configuration example of the reticulated conductor.

The seventeenth modification in A in FIG. 181 is different from the basic configuration example of periodic shift in that the relay conductor 1602 has one or more gaps (holes) inside. The number, position, and shape of the gaps are not limited to this example.

B in FIG. 181 is a plan view illustrating an eighteenth modification of the first shift configuration example of the reticulated conductor.

The eighteenth modification in B in FIG. 181 is different from the basic configuration example of periodic shift in that the relay conductor 1602 has a configuration in which an outer conductor surrounds an inner conductor. The number, position, and shape of the conductors are not limited to this example.

As described with reference to FIGS. 173 to 181, the relay conductor 1602 need not be centrally arranged in the gap region of the reticulated conductor 1601. For example, the relay conductors 1602 may be arranged with a bias in the X direction or the Y direction, or a plurality of relay conductors 1602 may be arranged. Furthermore, the relay conductor 1602 may have an asymmetric shape in the X direction or the Y direction, a symmetrical shape in the X direction or the Y direction, or a rotationally symmetrical shape. Note that, in the theoretical value of the capacitive noise in each of the modifications in FIGS. 173 to 181, the amount of change in the capacitive noise is zero and the absolute value of the capacitive noise is zero, similarly to the case where the periodic shift PDX is 2A in the first shift configuration example.

Note that regardless of the shape and arrangement of the relay conductor 1602, the relay conductor 1602 is formed to satisfy at least the above-described first condition of complete offset.

In the first to eighteenth modifications illustrated in FIGS. 173 to 181, for example, the degree of freedom in design and the degree of freedom in arranging another conductor, some element or object in the gap region are improved.

Moreover, the relay conductor 1602 may be a non-reticulated conductor that is a conductor not electrically connecting another conductor layer and another conductor layer, rather than the conductor electrically connecting another conductor layer and another conductor layer. Note that the relay conductor 1602 is desirably the conductor electrically relaying other conductor layers, rather than the non-reticulated conductor not electrically connecting other conductor layers. In a case where the relay conductor 1602 is used, the degree of freedom in the wiring layout for drawing in the power supply is improved. Furthermore, the voltage drop can be further improved depending on arrangement of the active elements such as MOS transistors and diodes. Furthermore, the presence of the relay conductor 1602 may improve the inductive noise, and the presence of a plurality of relay conductors 1602 (separation arrangement or division arrangement) may further improve the inductive noise.

Second Shift Configuration Example of Reticulated Conductor

FIG. 182 is a plan view illustrating a second shift configuration example of the reticulated conductor.

In the second shift configuration example of the reticulated conductor, even in a case where some of the dimensions of the reticulated conductor or the relay conductor is changed, the amount of change in the capacitive noise can be made zero.

A conductor layer 1711 in FIG. 182 is configured by a reticulated conductor 1701 and a relay conductor 1702.

In the conductor layer 1711 in FIG. 182, the dimensions of the conductor width CDY, the first gap width GDY1, and the second gap width GDY2 in the Y direction of the relay conductor 1702 are changed to be different from those of the first shift configuration example.

Specifically, as illustrated in FIG. 166, in the above-described first shift configuration example, the conductor width CDY in the Y direction of the relay conductor 1702 is 7A, and the first gap width GDY1 and the second gap width GDY2 are 1A, where ½ of the conductor width WDX in the X direction and the conductor width WDY in the Y direction of the reticulated conductor 1601 is a real number A.

In contrast, in the second shift configuration example in FIG. 182, the conductor width CDY in the Y direction of the relay conductor 1702 is 8A, and the first gap width GDY1 and the second gap width GDY2 are 2A.

In other words, in the above-described first shift configuration example, the gap width GDY in the Y direction of the reticulated conductor 1601 is 9A, whereas in the second shift configuration example, the gap width GDY is expanded to 12A.

In the second shift configuration example, the dimensions of the other conductor widths and gap widths are similar to those in the first shift configuration example. The second shift configuration example also satisfies at least the above-described first condition of complete offset.

FIG. 183 is a graph illustrating theoretical values of the capacitive noise of the conductor layer 1711 in which the periodic shift PDX is set to various values in the second shift configuration example, as in the first shift configuration example.

Since the horizontal axis and the vertical axis of the graph in FIG. 183 are similar to those in FIG. 169, the description thereof will be omitted. Note that the scale of the graph in FIG. 183 is also illustrated in accordance with FIG. 169.

As illustrated in FIG. 183, even in the second shift configuration example, in a case where the periodic shift PDX is a predetermined value, the amount of change in the capacitive noise is zero and the absolute value of the capacitive noise is zero. More specifically, in a case where the periodic shift PDX is set to 1⁄12, 2⁄12, or 5⁄12 of the repetition period in the X direction, the amount of change in the capacitive noise is zero and the absolute value of the capacitive noise is zero.

In a case of another periodic shift PDX, specifically, in a case where the periodic shift PDX is 3⁄12, 4⁄12, or 6⁄12 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

In the second shift configuration example in which the dimensions in the Y direction are expanded, the capacitive noise in the case where the periodic shift PDX is zero, that is, in the case of no periodic shift, illustrated by the broken line in FIG. 183, is worse than the capacitive noise in the case of no periodic shift in the first shift configuration example. It can be seen that an improvement effect is enhanced by setting the periodic shift PDX.

FIG. 184 is a graph illustrating theoretical values of the capacitive noise in a case where the relay conductor 1702 is not present in the second shift configuration example.

Since the horizontal axis and the vertical axis of the graph in FIG. 184 are similar to those in FIG. 169, the description thereof will be omitted. Note that the scale of the graph in FIG. 184 is also illustrated in accordance with FIG. 169.

In the absence of the relay conductor 1602, the absolute value of the capacitive noise is not zero, as illustrated in FIG. 184, but the amount of change in the capacitive noise is zero in a case where the periodic shift PDX is a predetermined value. The amount of shift at which the amount of change in the capacitive noise becomes zero is the same as the case where the relay conductor 1602 is present. That is, in a case where the periodic shift PDX is set to 1⁄12, 2⁄12, or 5⁄12 of the repetition period in the X direction, the amount of change in the capacitive noise is zero.

From the graphs in FIGS. 183 and 184, the condition that the amount of change in the capacitive noise becomes zero in the second shift configuration example is similar to the case in the first shift configuration example.

That is, the periodic shift PDX is set to a value different from the periodic width FDX (=12A) in the X direction of the reticulated conductor 1701.

In a case where the periodic shift PDX is 2A, that is, the periodic shift PDX is the same as the conductor width WDX in the X direction of the reticulated conductor 1701, the amount of change in the capacitive noise becomes zero. Furthermore, the amount of change in the capacitive noise becomes zero in a case where the periodic shift PDX is 1A and in a case where the periodic shift PDX is 5A.

In a case where the periodic shift PDX is 1A or 5A, the amount of change in the capacitive noise becomes zero in units of twelve rows. Meanwhile, in a case where the periodic shift PDX is 2A, the amount of change in the capacitive noise becomes zero in units of six rows. In a case where the periodic shift PDX is equal to the conductor width WDX of the reticulated conductor 1701, the amount of change in the capacitive noise can be made zero with a small number of rows. Therefore, the degree of freedom in the wiring layout can be increased.

In a case where the periodic shift PDX is different from the repetition period of 3⁄12 (=3A) in the X direction of the reticulated conductor 1701, in other words, in a case where the periodic shift PDX is not the periodic width FDX (=12A)+4, the amount of change in the capacitive noise becomes zero.

In a case where the periodic shift PDX is different from the repetition period of 4⁄12 (=4A) in the X direction of the reticulated conductor 1701, in other words, in a case where the periodic shift PDX is not the periodic width FDX (=12A)+3, the amount of change in the capacitive noise becomes zero.

In a case where the periodic shift PDX is different from the repetition period of 6/12 (=6A) in the X direction of the reticulated conductor 1701, in other words, in a case where the periodic shift PDX is not the periodic width FDX (=12A)+2, the amount of change in the capacitive noise becomes zero.

In the presence of the relay conductor 1702, not only the amount of change in the capacitive noise becomes zero but also the absolute value of the capacitive noise can be made zero. In the absence of the relay conductor 1702, the amount of change in the capacitive noise is zero, but the absolute value of the capacitive noise is not zero.

Furthermore, the effect of improving the capacitive noise is greater in the presence of the relay conductor 1702 than the absence of the relay conductor 1702.

Third Shift Configuration Example of Reticulated Conductor

In the first and second shift configuration examples, the condition of the periodic shift PDX when the amount of change in the capacitive noise becomes zero is the same between the presence of the relay conductor and the absence of the relay conductor.

Next, an example in which the condition of the periodic shift PDX when the amount of change in the capacitive noise becomes zero is different between the presence of the relay conductor and the absence of the relay conductor will be described as a third shift configuration example.

FIG. 185 is a plan view for describing a conductor width and a gap width of a conductor layer as a third shift configuration example of the reticulated conductor.

A conductor layer 1731 in FIG. 185 is configured by a reticulated conductor 1721 and a relay conductor 1722.

The reticulated conductor 1721 has the conductor width WDX set to 3A and the conductor width WDY set to 1A, where the arbitrary real number is A. The gap region of the reticulated conductor 1721 is formed by the gap width GDX set to 6A and the gap width GDY set to 17A.

The relay conductor 1722 arranged in the gap region of the reticulated conductor 1721 is a rectangle having the conductor width CDX set to 4A and the conductor width CDY set to 15A, and is a vertically long rectangle in which the conductor width CDY in the Y direction is larger than the conductor width CDX in the X direction (CDY>CDX). Both the first gap width GDX1 and the second gap width GDX2 in the X direction are set to 1A between the reticulated conductor 1721 and the relay conductor 1722. Furthermore, both the first gap width GDY1 and the second gap width GDY2 in the Y direction are set to 1A.

Therefore, the periodic width FDX (=the conductor width WDX+the gap width GDX) corresponds to 9A and the periodic width FDY (=the conductor width WDY+the gap width GDY) corresponds to 18A when expressed using the arbitrary real number A. In the third shift configuration example, the real number A is equal to 1/3 of the conductor width WDX in the X direction of the reticulated conductor 1721.

The third shift configuration example also satisfies at least the above-described first condition of complete offset.

FIGS. 186 and 187 are plan views in which the periodic shift PDX is set to various values in the conductor layer 1731 as a third shift configuration example of the reticulated conductor.

A in FIG. 186 is a plan view of the conductor layer 1731 in which the periodic shift PDX is set to zero.

B in FIG. 186 is a plan view of the conductor layer 1731 in which the periodic shift PDX in the X direction is set to 1A, that is, 1/9 of the repetition period (periodic width FDX) in the X direction.

C in FIG. 186 is a plan view of the conductor layer 1731 in which the periodic shift PDX is set to 2A, that is, 2/9 of the repetition period (periodic width FDX) in the X direction.

A in FIG. 187 is a plan view of the conductor layer 1731 in which the periodic shift PDX is set to 3A, that is, 3/9 of the repetition period (periodic width FDX) in the X direction.

B in FIG. 187 is a plan view of the conductor layer 1731 in which the periodic shift PDX is set to 4A, that is, 4/9 of the repetition period (periodic width FDX) in the X direction.

FIG. 188 is a graph illustrating theoretical values of the capacitive noise of the conductor layer 1731 in which the periodic shift PDX is set to various values as illustrated in FIGS. 186 and 187.

Since the horizontal axis and the vertical axis of the graph in FIG. 188 are similar to those in FIG. 169, the description thereof will be omitted. Note that the scale of the graph in FIG. 188 is also illustrated in accordance with FIG. 169. Conditions for the Vdd applied voltage and Vss applied voltage are similar.

As illustrated in FIG. 188, in a case where the periodic shift PDX is a predetermined value, the amount of change in the capacitive noise is zero and the absolute value of the capacitive noise is zero. More specifically, in a case where the periodic shift PDX is set to 1/9, 2/9, or 4/9 of the repetition period in the X direction, the amount of change in the capacitive noise is zero and the absolute value of the capacitive noise is zero. In a case where the periodic shift PDX is set to 1/9 (=1A), 2/9 (=2A), or 4/9 (=4A) of the repetition period in the X direction, the amount of change in the capacitive noise becomes zero in units of nine rows.

In a case of another periodic shift PDX, specifically, in a case where the periodic shift PDX is 3/9 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

From the above, in the third shift configuration example including the relay conductor 1722, the amount of change in the capacitive noise can be made zero under the following conditions.

First, as a premise, the periodic shift PDX is set to a value different from the periodic width FDX (=9A) in the X direction of the reticulated conductor 1721.

In a case where the periodic shift PDX is 1A, 2A, or 4A, the amount of change in the capacitive noise becomes zero in units of nine rows. Furthermore, in a case where the periodic shift PDX is different from the repetition period of 3/9 (=3A) in the X direction of the reticulated conductor 1721, in other words, in a case where the periodic shift PDX is not the periodic width FDX (=9A)+3, the amount of change in the capacitive noise becomes zero.

FIG. 189 is a graph illustrating theoretical values of the capacitive noise in a case where the periodic shift PDX is set to various values in the conductor layer 1731 in which the relay conductor 1722 is omitted. Although illustration of the conductor layer 1731 from which the relay conductor 1722 is omitted is omitted, it corresponds to each of the conductor layers 1731 in FIGS. 186 and 187 from which the relay conductor 1722 is removed.

In the absence of the relay conductor 1722, the absolute value of the capacitive noise is not zero, as illustrated in FIG. 189, but the amount of change in the capacitive noise is zero in a case where the periodic shift PDX is a predetermined value. The amount of shift at which the amount of change in the capacitive noise becomes zero is different from the case where the relay conductor 1722 is present. Specifically, in a case where the periodic shift PDX is set to 1/9, 2/9, 3/9, or 4/9 of the repetition period in the X direction, the amount of change in the capacitive noise is zero. In a case where the periodic shift PDX is set to 1/9 (=1A), 2/9 (=2A), or 4/9 (=4A) of the repetition period in the X direction, the amount of change in the capacitive noise becomes zero in units of nine rows. In a case where the periodic shift PDX is set to 3/9 (=3A) of the repetition period in the X direction, the amount of change in the capacitive noise becomes zero in units of three rows.

From the above, in the third shift configuration example not including the relay conductor 1722, the amount of change in the capacitive noise can be made zero under the following conditions.

First, as a premise, the periodic shift PDX is set to a value different from the periodic width FDX (=9A) in the X direction of the reticulated conductor 1721.

In a case where the periodic shift PDX is 1A, 2A, or 4A, the amount of change in the capacitive noise becomes zero in units of nine rows. Furthermore, in a case where the periodic shift PDX is the same as 3/9 (=3A) that is the repetition period in the X direction of the reticulated conductor 1721, the amount of change in the capacitive noise becomes zero in units of three rows.

Therefore, in the third shift configuration example, in a case where the periodic shift PDX is set to be the same as the conductor width WDX=3A of the reticulated conductor 1721, the amount of change in the capacitive noise does not become zero in the presence of the relay conductor 1722, but the amount of change in the capacitive noise becomes zero in the absence of the relay conductor 1722. That is, in the third shift configuration example, the condition of the periodic shift PDX of when the amount of change in the capacitive noise becomes zero is different between the presence of the relay conductor 1722 and the absence of the relay conductor 1722.

In the case where an integral multiple of the conductor width WDX of the reticulated conductor 1721 matches the periodic width FDX, and the periodic shift PDX matches the conductor width WDX according to the shape relationship between the conductor part and the gap region of the reticulated conductor 1721, the capacitive noise is evenly distributed. Therefore, the amount of change in the capacitive noise can be made zero in the absence of the relay conductor 1722.

Fourth Shift Configuration Example of Reticulated Conductor

In the first to third shift configuration examples, examples in which the relay conductor has the vertically long shape longer in the X direction than in the Y direction have been described.

Next, an example where the relay conductor has a horizontally long shape shorter in the Y direction than in the X direction will be described as the fourth shift configuration example.

FIG. 190 is a plan view for describing a conductor width and a gap width of a conductor layer as a fourth shift configuration example of the reticulated conductor.

The conductor layer 1771 in FIG. 190 is configured by a reticulated conductor 1761 and a relay conductor 1762.

The reticulated conductor 1761 has the conductor width WDX set to 2A and the conductor width WDY set to 2A, where the arbitrary real number is A. The gap region of the reticulated conductor 1761 is formed by the gap width GDX set to 12A and the gap width GDY set to 10A.

The relay conductor 1762 arranged in the gap region of the reticulated conductor 1761 is a rectangle having the conductor width CDX set to 8A and the conductor width CDY set to 6A, and is a horizontally long rectangle in which the conductor width CDX in the X direction is larger than the conductor width CDY in the Y direction (CDX>CDY). Both the first gap width GDX1 and the second gap width GDX2 in the X direction are set to 2A between the reticulated conductor 1761 and the relay conductor 1762. Furthermore, both the first gap width GDY1 and the second gap width GDY2 in the Y direction are set to 2A.

Therefore, the periodic width FDX (=the conductor width WDX+the gap width GDX) corresponds to 14A and the periodic width FDY (=the conductor width WDY+the gap width GDY) corresponds to 12A when expressed using the arbitrary real number A. In the fourth shift configuration example, the real number A is equal to 1/2 of the conductor width WDX in the X direction of the reticulated conductor 1761.

The fourth shift configuration example also satisfies at least the above-described first condition of complete offset.

FIGS. 191 and 192 are plan views in which the periodic shift PDX is set to various values in the conductor layer 1771 as the fourth shift configuration example of the reticulated conductor.

A in FIG. 191 is a plan view of the conductor layer 1771 in which the periodic shift PDX is set to zero.

B in FIG. 191 is a plan view of the conductor layer 1771 in which the periodic shift PDX in the X direction is set to 1A, that is, 1/14 of the repetition period (periodic width FDX) in the X direction.

C in FIG. 191 is a plan view of the conductor layer 1771 in which the periodic shift PDX is set to 2A, that is, 2/14 of the repetition period (periodic width FDX) in the X direction.

D in FIG. 191 is a plan view of the conductor layer 1771 in which the periodic shift PDX is set to 3A, that is, 3/14 of the repetition period (periodic width FDX) in the X direction.

A in FIG. 192 is a plan view of the conductor layer 1771 in which the periodic shift PDX is set to 4A, that is, 4/14 of the repetition period (periodic width FDX) in the X direction.

B in FIG. 192 is a plan view of the conductor layer 1771 in which the periodic shift PDX is set to 5A, that is, 5/14 of the repetition period (periodic width FDX) in the X direction.

C in FIG. 192 is a plan view of the conductor layer 1771 in which the periodic shift PDX is set to 6A, that is, 6/14 of the repetition period (periodic width FDX) in the X direction.

D in FIG. 192 is a plan view of the conductor layer 1771 in which the periodic shift PDX is set to 7A, that is, 7/14 of the repetition period (periodic width FDX) in the X direction.

FIG. 193 is a graph illustrating theoretical values of the capacitive noise of the conductor layer 1771 in which the periodic shift PDX is set to various values as illustrated in FIGS. 191 and 192.

Since the horizontal axis and the vertical axis of the graph in FIG. 193 are similar to those in FIG. 169, the description thereof will be omitted. Note that the scale of the graph in FIG. 193 is also illustrated in accordance with FIG. 169. Conditions for the Vdd applied voltage and Vss applied voltage are similar.

As illustrated in FIG. 193, in a case where the periodic shift PDX is a predetermined value, the amount of change in the capacitive noise is zero and the absolute value of the capacitive noise is zero. More specifically, in a case where the periodic shift PDX is 1/14, 2/14, 3/14, 4/14, 5/14, or 6/14 of the repetition period in the X direction, the amount of change in the capacitive noise is zero, and the absolute value of the capacitive noise is zero.

In a case where the periodic shift PDX is 1/14 (=1A), 3/14 (=3A), or 5/14 (=5A) of the repetition period in the X direction, the amount of change in the capacitive noise is zero and is the absolute value of the capacitive noise in units of 14 rows.

In a case where the periodic shift PDX is set to 2/14 (2A), 4/14 (=4A), or 6/14 (=6A) of the repetition period in the X direction, the amount of change in the capacitive noise is zero and is the absolute value of the capacitive noise in units of 7 rows. The amount of change in the capacitive noise is zero and is the absolute value of the capacitive noise with a small number of rows even in the case where the periodic shift PDX is equal to a multiple integral of the conductor width WDX in addition to the case where the periodic shift PDX is equal to the conductor width WDX of the reticulated conductor 1721. The amount of change in the capacitive noise is zero and is the absolute value of the capacitive noise with a small number of rows even in a case where the periodic shift PDX is equal to an integral multiple of the conductor width WDX, in the case where the multiple integral of the conductor width WDX does not match the periodic width FDX (=14A)+3 and the periodic width FDX (=14A)+4.

In a case of another periodic shift PDX, specifically, in a case where the periodic shift PDX is 7/14 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

From the above, in the fourth shift configuration example including the relay conductor 1762, the amount of change in the capacitive noise can be made zero under the following conditions.

First, as a premise, the periodic shift PDX is set to a value different from the periodic width FDX (=14A) in the X direction of the reticulated conductor 1761.

In a case where the periodic shift PDX is 2A, that is, the periodic shift PDX is the same as the conductor width WDX in the X direction of the reticulated conductor 1761, the amount of change in the capacitive noise and the absolute value become zero. Furthermore, in a case where the periodic shift PDX is 1A, 3A, 4A, 5A, and 6A, the amount of change in the capacitive noise and the absolute value become zero.

Conversely, in a case where the periodic shift PDX is different from the repetition period of 7/14 (=7A) in the X direction of the reticulated conductor 1761, in other words, in a case where the periodic shift PDX is not the periodic width FDX (=14A)+2, the amount of change in the capacitive noise and the absolute value become zero.

FIG. 194 is a graph illustrating theoretical values of the capacitive noise in a case where the periodic shift PDX is set to various values in the conductor layer 1771 in which the relay conductor 1762 is omitted. Although illustration of the conductor layer 1771 from which the relay conductor 1762 is omitted is omitted, it corresponds to each of the conductor layers 1771 in FIGS. 191 and 192 from which the relay conductor 1762 is removed.

As illustrated in FIG. 194, even in the absence of the relay conductor 1762, the amount of shift by which the amount of change in the capacitive noise becomes zero is the same as the presence of the relay conductor 1762. Note that the absolute value of the capacitive noise is not zero.

From the above, in the fourth shift configuration example not including the relay conductor 1762, the amount of change in the capacitive noise can be made zero under the following conditions.

First, as a premise, the periodic shift PDX is set to a value different from the periodic width FDX (=14A) in the X direction of the reticulated conductor 1761.

In a case where the periodic shift PDX is 2A, that is, the periodic shift PDX is the same as the conductor width WDX in the X direction of the reticulated conductor 1761, the amount of change in the capacitive noise becomes zero. Furthermore, in a case where the periodic shift PDX is 1A, 3A, 4A, 5A, and 6A, the amount of change in the capacitive noise becomes zero.

Conversely, in a case where the periodic shift PDX is different from the repetition period of 7/14 (=7A) in the X direction of the reticulated conductor 1761, in other words, in a case where the periodic shift PDX is not the periodic width FDX (=14A)+2, the amount of change in the capacitive noise becomes zero.

Fifth Shift Configuration Example of Reticulated Conductor

Next, an example in which the conductor width WDX in the X direction of the reticulated conductor is wide will be illustrated as a fifth shift configuration example.

FIG. 195 is a plan view for describing a conductor width and a gap width of a conductor layer as a fifth shift configuration example of the reticulated conductor.

The conductor layer 1791 in FIG. 195 is configured by a reticulated conductor 1781 and a relay conductor 1782.

The reticulated conductor 1781 has the conductor width WDX set to 4A and the conductor width WDY set to 2A, where the arbitrary real number is A. The gap region of the reticulated conductor 1781 is formed by the gap width GDX set to 12A and the gap width GDY set to 16A.

The relay conductor 1782 arranged in the gap region of the reticulated conductor 1781 is a rectangle having the conductor width CDX set to 8A and the conductor width CDY set to 12A, and is a vertically long rectangle in which the conductor width CDY in the Y direction is larger than the conductor width CDX in the X direction (CDY>CDX). Both the first gap width GDX1 and the second gap width GDX2 in the X direction are set to 2A between the reticulated conductor 1781 and the relay conductor 1782. Furthermore, both the first gap width GDY1 and the second gap width GDY2 in the Y direction are set to 2A.

Therefore, the periodic width FDX (=the conductor width WDX+the gap width GDX) corresponds to 16A and the periodic width FDY (=the conductor width WDY+the gap width GDY) corresponds to 18A when expressed using the arbitrary real number A. In the fifth shift configuration example, the real number A is equal to 1/4 of the conductor width WDX in the X direction of the reticulated conductor 1781.

The fifth shift configuration example also satisfies at least the above-described first condition of complete offset.

FIGS. 196 to 198 are plan views in which the periodic shift PDX is set to various values in the conductor layer 1791 as the fifth shift configuration example of the reticulated conductor.

A in FIG. 196 is a plan view of the conductor layer 1791 in which the periodic shift PDX is set to zero.

B in FIG. 196 is a plan view of the conductor layer 1791 in which the periodic shift PDX in the X direction is set to 1A, that is, 1/16 of the repetition period (periodic width FDX) in the X direction.

C in FIG. 196 is a plan view of the conductor layer 1791 in which the periodic shift PDX is set to 2A, that is, 2/16 of the repetition period (periodic width FDX) in the X direction.

A in FIG. 197 is a plan view of the conductor layer 1791 in which the periodic shift PDX is set to 3A, that is, 3/16 of the repetition period (periodic width FDX) in the X direction.

B in FIG. 197 is a plan view of the conductor layer 1791 in which the periodic shift PDX is set to 4A, that is, 4/16 of the repetition period (periodic width FDX) in the X direction.

C in FIG. 197 is a plan view of the conductor layer 1791 in which the periodic shift PDX is set to 5A, that is, 5/16 of the repetition period (periodic width FDX) in the X direction.

A in FIG. 198 is a plan view of the conductor layer 1791 in which the periodic shift PDX is set to 6A, that is, 6/16 of the repetition period (periodic width FDX) in the X direction.

B in FIG. 198 is a plan view of the conductor layer 1791 in which the periodic shift PDX is set to 7A, that is, 7/16 of the repetition period (periodic width FDX) in the X direction.

C in FIG. 198 is a plan view of the conductor layer 1791 in which the periodic shift PDX is set to 8A, that is, 8/16 of the repetition period (periodic width FDX) in the X direction.

FIG. 199 is a graph illustrating theoretical values of the capacitive noise of the conductor layer 1771 in which the periodic shift PDX is set to various values as illustrated in FIGS. 196 to 198.

Since the horizontal axis and the vertical axis of the graph in FIG. 199 are similar to those in FIG. 169, the description thereof will be omitted. Note that the scale of the graph in FIG. 199 is also illustrated in accordance with FIG. 169. Conditions for the Vdd applied voltage and Vss applied voltage are similar.

As illustrated in FIG. 199, in a case where the periodic shift PDX is a predetermined value, the amount of change in the capacitive noise is zero and the absolute value of the capacitive noise is zero. More specifically, in a case where the periodic shift PDX is 1/16 (=1A), 2/16 (=2A), 3/16 (=3A), 4/16 (=4A), 5/16 (=5A), 6/16 (=6A), or 7/16 (=7A) of the repetition period in the X direction, the amount of change in the capacitive noise is zero, and the absolute value of the capacitive noise is zero.

Conversely, in a case where the periodic shift PDX is different from the repetition period of 8/16 (=8A) in the X direction of the reticulated conductor 1781, in other words, in a case where the periodic shift PDX is not the periodic width FDX (=16A)+2, the amount of change in the capacitive noise and the absolute value become zero.

In a case where the periodic shift PDX is 1/16 (=1A), 3/16 (=3A), 5/16 (=5A), or 7/16 (=7A) of the repetition period in the X direction, the amount of change in the capacitive noise is zero and is the absolute value of the capacitive noise in units of 16 rows.

In a case where the periodic shift PDX is set to 2/16 (=2A) or 6/16 (=6A) of the repetition period in the X direction, the amount of change in the capacitive noise is zero and is the absolute value of the capacitive noise in units of 8 rows.

In a case where the periodic shift PDX is set to 4/16 (4A) of the repetition period in the X direction, the amount of change in the capacitive noise is zero and is the absolute value of the capacitive noise in units of 4 rows.

In a case of another periodic shift PDX, specifically, in a case where the periodic shift PDX is 8/16 of the repetition period in the X direction, the amount of change in the capacitive noise and the absolute value are not zero, but the change in the amount of change in the capacitive noise can be made smaller than a case where the periodic shift PDX is zero, that is, in a case of no periodic shift.

From the above, in the fifth shift configuration example including the relay conductor 1762, the amount of change in the capacitive noise can be made zero under the following conditions.

First, as a premise, the periodic shift PDX is set to a value different from the periodic width FDX (=16A) in the X direction of the reticulated conductor 1781.

In a case where the periodic shift PDX is 4A, that is, the periodic shift PDX is the same as the conductor width WDX in the X direction of the reticulated conductor 1781, the amount of change in the capacitive noise and the absolute value become zero.

Furthermore, in a case where the periodic shift PDX is 2A and 6A, the amount of change in the capacitive noise and the absolute value become zero. In a case where the periodic shift PDX is 2A, the periodic shift PDX is equal to one time the half of the conductor width WDX. In a case where the periodic shift PDX is 6A, the periodic shift PDX is equal to three times the half of the conductor width WDX. Furthermore, in a case where the periodic shift PDX is 4A, the periodic shift PDX is equal to twice the half of the conductor width WDX.

In the case where the conductor width WDX in the X direction of the reticulated conductor is set to be narrow as in the above-described fourth shift configuration example, the amount of change in the capacitive noise has become zero and been the absolute value of the capacitive noise in the case where the periodic shift PDX is equal to the multiple integral of the conductor width WDX of the reticulated conductor 1721.

In contrast, in the case where the conductor width WDX in the X direction of the reticulated conductor is set to be wide, the amount of change in the capacitive noise has become zero and been the absolute value of the capacitive noise in the case where the periodic shift PDX is equal to the multiple integral of half of the conductor width WDX of the reticulated conductor 1721.

In this way, in the case where the periodic shift PDX is equal to not only an integral multiple of the conductor width WDX but also an integral multiple of half the conductor width WDX, the amount of change in the capacitive noise and the absolute value may become zero.

FIG. 200 is a graph illustrating theoretical values of the capacitive noise in a case where the periodic shift PDX is set to various values in the conductor layer 1791 in which the relay conductor 1782 is omitted. Although illustration of the conductor layer 1791 from which the relay conductor 1782 is omitted is omitted, it corresponds to each of the conductor layers 1791 in FIGS. 196 to 198 from which the relay conductor 1782 is removed.

As illustrated in FIG. 200, even in the absence of the relay conductor 1782, the amount of shift by which the amount of change in the capacitive noise becomes zero is the same as the presence of the relay conductor 1782. Note that the absolute value of the capacitive noise is not zero.

Sixth Shift Configuration Example of Reticulated Conductor

In the first to fifth shift configuration examples, the examples in which the gap width GDX is larger than the conductor width WDX (the gap width GDX>the conductor width WDX) when focusing on the relationship between the conductor width WDX in the X direction of the reticulated conductor and the gap width GDX have been described.

In the next sixth shift configuration example, an example in which the gap width GDX is smaller than the conductor width WDX (the gap width GDX<the conductor width WDX) will be described.

FIG. 201 is a plan view for describing a conductor width and a gap width of a conductor layer as a sixth shift configuration example of the reticulated conductor.

The conductor layer 1811 in FIG. 201 is configured by a reticulated conductor 1801 and a relay conductor 1802.

The reticulated conductor 1801 has the conductor width WDX set to 6A and the conductor width WDY set to 6A, where the arbitrary real number is A. The gap region of the reticulated conductor 1801 is formed by the gap width GDX set to 4A and the gap width GDY set to 4A. Therefore, the conductor width WDX (=6A) is larger than the gap width GDX (=4A).

The relay conductor 1802 arranged in the gap region of the reticulated conductor 1801 is a rectangle having the conductor width CDX set to 2A and the conductor width CDY set to 2A, and is a square in which the conductor width CDX in the X direction and the conductor width CDY in the Y direction are the same (CDY=CDX). Both the first gap width GDX1 and the second gap width GDX2 in the X direction are set to 1A between the reticulated conductor 1801 and the relay conductor 1802. Furthermore, both the first gap width GDY1 and the second gap width GDY2 in the Y direction are set to 1A.

Therefore, the periodic width FDX (=the conductor width WDX+the gap width GDX) corresponds to 10A and the periodic width FDY (=the conductor width WDY+the gap width GDY) corresponds to 10A when expressed using the arbitrary real number A.

In the sixth shift configuration example, when comparing the conductive area of the reticulated conductor 1801 with the conductive area of the relay conductor 1802 within a predetermined range, the conductive area of the reticulated conductor 1801 is larger, and the above-described first condition of complete offset is not satisfied.

FIGS. 202 and 203 are plan views in which the periodic shift PDX is set to various values in the conductor layer 1811 as the sixth shift configuration example of the reticulated conductor.

A in FIG. 202 is a plan view of the conductor layer 1811 in which the periodic shift PDX is set to zero.

B in FIG. 202 is a plan view of the conductor layer 1811 in which the periodic shift PDX in the X direction is set to 1A, that is, 1/10 of the repetition period (periodic width FDX) in the X direction.

C in FIG. 202 is a plan view of the conductor layer 1811 in which the periodic shift PDX is set to 2A, that is, 2/10 of the repetition period (periodic width FDX) in the X direction.

A in FIG. 203 is a plan view of the conductor layer 1811 in which the periodic shift PDX is set to 3A, that is, 3/10 of the repetition period (periodic width FDX) in the X direction.

B in FIG. 203 is a plan view of the conductor layer 1811 in which the periodic shift PDX is set to 4A, that is, 4/10 of the repetition period (periodic width FDX) in the X direction.

C in FIG. 203 is a plan view of the conductor layer 1811 in which the periodic shift PDX is set to 5A, that is, 5/10 of the repetition period (periodic width FDX) in the X direction.

FIG. 204 is a graph illustrating theoretical values of the capacitive noise of the conductor layer 1811 in which the periodic shift PDX is set to various values as illustrated in FIGS. 202 and 203.

Since the horizontal axis and the vertical axis of the graph in FIG. 204 are similar to those in FIG. 169, the description thereof will be omitted. Note that the scale of the graph in FIG. 204 is also illustrated in accordance with FIG. 169. Conditions for the Vdd applied voltage and Vss applied voltage are similar.

The amount of change in the capacitive noise becomes zero in the case where the periodic shift PDX is a predetermined value, as illustrated in FIG. 204. More specifically, in a case where the periodic shift PDX is 1/10 (=1A), 2/10 (=2A), 3/10 (=3A), or 4/10 (=4A) of the repetition period in the X direction, the amount of change in the capacitive noise is zero. Note that the absolute value of the capacitive noise is not zero.

Conversely, in a case where the periodic shift PDX is different from the repetition period of 5/10 (=5A) in the X direction of the reticulated conductor 1801, in other words, in a case where the periodic shift PDX is not the periodic width FDX (=10A)+2, the amount of change in the capacitive noise becomes zero.

In a case where the periodic shift PDX is set to 1/10 (1A) or 3/10 (=3A) of the repetition period in the X direction, the amount of change in the capacitive noise becomes zero in units of ten rows.

In a case where the periodic shift PDX is set to 2/10 (2A) or 4/10 (=4A) of the repetition period in the X direction, the amount of change in the capacitive noise becomes zero in units of five rows.

In a case of another periodic shift PDX, specifically, in a case where the periodic shift PDX is 5/10 of the repetition period in the X direction, the amount of change in the capacitive noise is not zero, but the change in the amount of change in the capacitive noise can be made smaller than a case where the periodic shift PDX is zero, that is, in a case of no periodic shift.

From the above, in the sixth shift configuration example including the relay conductor 1802, the amount of change in the capacitive noise can be made zero under the following conditions.

First, as a premise, the periodic shift PDX is set to a value different from the periodic width FDX (=10A) in the X direction of the reticulated conductor 1801.

In a case where the periodic shift PDX is 4A, that is, the periodic shift PDX is the same as the gap width GDX in the X direction of the reticulated conductor 1801, the amount of change in the capacitive noise becomes zero. Furthermore, in a case where the periodic shift PDX is 1A, 2A, and 3A, the amount of change in the capacitive noise becomes zero.

Although not illustrated in the graph in FIG. 204, in a case where the periodic shift PDX is 8A, which is twice the gap width GDX (=4A), the periodic width FDX is 10A, and 8/10=(10−2)/10, and thus the case becomes equivalent to the case where the periodic shift PDX is 2A. Therefore, the amount of change in the capacitive noise becomes zero. Furthermore, in a case where the periodic shift PDX is 12A, which is three times the gap width GDX (=4A), the periodic width FDX is 10A, and 12/10=(10+2)/10, and thus the case becomes equivalent to the case where the periodic shift PDX is 2A. Therefore, the amount of change in the capacitive noise becomes zero.

Therefore, in the conductor layer 1811 having the reticulated conductor 1801 in which the gap width GDX is larger than the conductor width WDX, the amount of change in the capacitive noise can be made zero in the case of an integral multiple of the gap width GDX. Note that the amount of change in the capacitive noise becomes zero even in the case where the periodic shift PDX is 1A or 3A, so the case is not limited to an integral multiple of the gap width GDX.

FIG. 205 is a graph illustrating theoretical values of the capacitive noise in a case where the periodic shift PDX is set to various values in the conductor layer 1811 in which the relay conductor 1802 is omitted. Although illustration of the conductor layer 1811 from which the relay conductor 1802 is omitted is omitted, it corresponds to each of the conductor layers 1811 in FIGS. 202 and 203 from which the relay conductor 1802 is removed.

As illustrated in FIG. 205, even in the absence of the relay conductor 1802, the amount of shift by which the amount of change in the capacitive noise becomes zero is the same as the presence of the relay conductor 1802. Note that the absolute value of the capacitive noise is not zero.

Seventh Shift Configuration Example of Reticulated Conductor

Next, an example in which the conductor width WDX in the X direction of the reticulated conductor and the gap width GDX are equal (the conductor width WDX=the gap width GDX) will be illustrated as a seventh shift configuration example.

FIG. 206 is a plan view for describing a conductor width and a gap width of a conductor layer as a seventh shift configuration example of the reticulated conductor.

The conductor layer 1831 in FIG. 206 is configured by a reticulated conductor 1821 and a relay conductor 1822.

The reticulated conductor 1821 has the conductor width WDX set to 6A and the conductor width WDY set to 6A, where the arbitrary real number is A. The gap region of the reticulated conductor 1821 is formed by the gap width GDX set to 6A and the gap width GDY set to 6A. Therefore, the conductor width WDX (=6A) and the gap width GDX (=6A) are equal.

The relay conductor 1822 arranged in the gap region of the reticulated conductor 1821 is a rectangle having the conductor width CDX set to 2A and the conductor width CDY set to 2A, and is a square in which the conductor width CDX in the X direction and the conductor width CDY in the Y direction are the same (CDY=CDX). Both the first gap width GDX1 and the second gap width GDX2 in the X direction are set to 2A between the reticulated conductor 1821 and the relay conductor 1822. Furthermore, both the first gap width GDY1 and the second gap width GDY2 in the Y direction are set to 2A.

Therefore, the periodic width FDX (=the conductor width WDX+the gap width GDX) corresponds to 12A and the periodic width FDY (=the conductor width WDY+the gap width GDY) corresponds to 12A when expressed using the arbitrary real number A.

In the seventh shift configuration example, when comparing the conductive area of the reticulated conductor 1801 with the conductive area of the relay conductor 1802 within a predetermined range, the conductive area of the reticulated conductor 1801 is larger, and the above-described first condition of complete offset is not satisfied.

FIGS. 207 and 208 are plan views in which the periodic shift PDX is set to various values in the conductor layer 1831 as the seventh shift configuration example of the reticulated conductor.

A in FIG. 207 is a plan view of the conductor layer 1831 in which the periodic shift PDX is set to zero.

B in FIG. 207 is a plan view of the conductor layer 1831 in which the periodic shift PDX in the X direction is set to 1A, that is, 1/12 of the repetition period (periodic width FDX) in the X direction.

C in FIG. 207 is a plan view of the conductor layer 1831 in which the periodic shift PDX is set to 2A, that is, 2/12 of the repetition period (periodic width FDX) in the X direction.

D in FIG. 207 is a plan view of the conductor layer 1831 in which the periodic shift PDX is set to 3A, that is, 3/12 of the repetition period (periodic width FDX) in the X direction.

A in FIG. 208 is a plan view of the conductor layer 1831 in which the periodic shift PDX is set to 4A, that is, 4/12 of the repetition period (periodic width FDX) in the X direction.

B in FIG. 208 is a plan view of the conductor layer 1831 in which the periodic shift PDX is set to 5A, that is, 5/12 of the repetition period (periodic width FDX) in the X direction.

C in FIG. 208 is a plan view of the conductor layer 1831 in which the periodic shift PDX is set to 6A, that is, 6/12 of the repetition period (periodic width FDX) in the X direction.

FIG. 209 is a graph illustrating theoretical values of the capacitive noise of the conductor layer 1831 in which the periodic shift PDX is set to various values as illustrated in FIGS. 207 and 208.

Since the horizontal axis and the vertical axis of the graph in FIG. 209 are similar to those in FIG. 169, the description thereof will be omitted. Note that the scale of the graph in FIG. 209 is also illustrated in accordance with FIG. 169. Conditions for the Vdd applied voltage and Vss applied voltage are similar.

The amount of change in the capacitive noise becomes zero in the case where the periodic shift PDX is a predetermined value, as illustrated in FIG. 209. More specifically, in a case where the periodic shift PDX is set to 1/12 (=1A), 2/12 (=2A), or 5/12 (=5A) of the repetition period in the X direction, the amount of change in the capacitive noise becomes zero. Note that the absolute value of the capacitive noise is not zero.

Conversely, in a case where the periodic shift PDX is different from the repetition period of 3/12 (=3A), 4/12 (=4A), and 6/12 (=6A) in the X direction of the reticulated conductor 1821, in other words, in a case where the periodic shift PDX is not the periodic width FDX (=12A)+4, the periodic width FDX (=12A)+3, and the periodic width FDX (=12A)+2, the amount of change in the capacitive noise and the absolute value become zero.

In a case where the periodic shift PDX is set to 1/12 (1A) or 5/12 (=5A) of the repetition period in the X direction, the amount of change in the capacitive noise becomes zero in units of twelve rows.

In a case where the periodic shift PDX is set to 2/12 (2A) of the repetition period in the X direction, the amount of change in the capacitive noise becomes zero in units of six rows. In the reticulated conductor 1821 in which the conductor width WDX in the X direction and the gap width GDX are equal, the amount of change in the capacitive noise can be made zero with a small number of rows in the case where the periodic shift PDX is the same as the conductor width CDX (=2A) in the X direction of the relay conductor 1822. In the case where the periodic shift PDX is the same as the conductor width WDX (=6A) in the X direction of the reticulated conductor 1821, the amount of change in the capacitive noise does not become zero.

In a case where the periodic shift PDX is set to 3/12 (3A), 4/12 (=4A), or 6/12 (=6A) of the repetition period in the X direction of the reticulated conductor 1821, the amount of change in the capacitive noise is not zero, but the change in the amount of change in the capacitive noise can be made smaller than a case where the periodic shift PDX is zero, that is, in a case of no periodic shift.

From the above, in the seventh shift configuration example including the relay conductor 1822, the amount of change in the capacitive noise can be made zero under the following conditions.

First, as a premise, the periodic shift PDX is set to a value different from the periodic width FDX (=12A) in the X direction of the reticulated conductor 1821.

In the case where the periodic shift PDX is 2A, that is, the periodic shift PDX is the same as the conductor width CDX in the X direction of the relay conductor 1822, the amount of change in the capacitive noise becomes zero. Furthermore, in a case where the periodic shift PDX is 1A and 5A, the amount of change in the capacitive noise becomes zero.

In a case where the periodic shift PDX is different from the repetition period of 3/12 (=3A) in the X direction of the reticulated conductor 1821, in other words, in a case where the periodic shift PDX is not the periodic width FDX (=12A)+4, the amount of change in the capacitive noise becomes zero.

In a case where the periodic shift PDX is different from the repetition period of 4/12 (=4A) in the X direction of the reticulated conductor 1821, in other words, in a case where the periodic shift PDX is not the periodic width FDX (=12A)+3, the amount of change in the capacitive noise becomes zero.

In a case where the periodic shift PDX is different from the repetition period of 6/12 (=6A) in the X direction of the reticulated conductor 1821, in other words, in a case where the periodic shift PDX is not the periodic width FDX (=12A)+2, the amount of change in the capacitive noise becomes zero.

FIG. 210 is a graph illustrating theoretical values of the capacitive noise in a case where the periodic shift PDX is set to various values in the conductor layer 1831 in which the relay conductor 1822 is omitted. Although illustration of the conductor layer 1831 from which the relay conductor 1822 is omitted is omitted, it corresponds to each of the conductor layers 1831 in FIGS. 207 and 208 from which the relay conductor 1822 is removed.

Even in the absence of the relay conductor 1822, the amount of change in the capacitive noise becomes zero in the case where the periodic shift PDX is a predetermined value, as illustrated in FIG. 210. Note that the amount of shift at which the amount of change in the capacitive noise becomes zero is different from the case where the relay conductor 1822 is present.

Specifically, in a case where the periodic shift PDX is set to 1/12, 2/12, 3/12, 5/12, or 6/12 of the repetition period in the X direction, the amount of change in the capacitive noise is zero.

In a case where the periodic shift PDX is set to 3/12 (3A) of the repetition period in the X direction, the amount of change in the capacitive noise becomes zero in units of four rows. In a case where the periodic shift PDX is set to 2/12 (=2A) of the repetition period in the X direction, the amount of change in the capacitive noise becomes zero in units of six rows.

In a case where the periodic shift PDX is set to 6/12 (6A) of the repetition period in the X direction, the amount of change in the capacitive noise becomes zero in units of two rows.

From the above, in the seventh shift configuration example not including the relay conductor 1822, the amount of change in the capacitive noise can be made zero under the following conditions.

First, as a premise, the periodic shift PDX is set to a value different from the periodic width FDX (=12A) in the X direction of the reticulated conductor 1821.

In a case where the periodic shift PDX is 1/12 (=1A), 2/12 (=2A), 3/12 (=3A), 5/12 (=5A), or 6/12 (=6A) of the repetition period in the X direction of the reticulated conductor 1821, the amount of change in the capacitive noise becomes zero. 1/12 (=1A), 2/12 (=2A), 3/12 (=3A), and 6/12 (=6A) of the repetition period in the X direction of the reticulated conductor 1821 can be respectively rephrased as the periodic shift PDX being the periodic width FDX (=12A)+12, the periodic width FDX (=12A)+6, the periodic width FDX (=12A)+4, and the periodic width FDX (=12A)+2. Therefore, in a case where the periodic shift PDX is the periodic width FDX an even integer, the amount of change in the capacitive noise becomes zero. In the case where the periodic shift PDX is the periodic width FDX (=12A)+2, which is the case where the periodic shift PDX is 6/12 (=6A) of the repetition period in the X direction, the amount of change in the capacitive noise becomes zero with a smallest number of rows, which is favorable but the configuration is not limited thereto.

Furthermore, in a case where the periodic shift PDX is different from the repetition period of 4/12 (=4A) in the X direction of the reticulated conductor 1821, in other words, in a case where the periodic shift PDX is not the periodic width FDX (=12A)+3, the amount of change in the capacitive noise becomes zero.

Therefore, in the seventh shift configuration example, the condition of the periodic shift PDX of when the amount of change in the capacitive noise becomes zero is different between the presence of the relay conductor 1822 and the absence of the relay conductor 1822.

In the case where an even integral multiple of the periodic shift PDX matches the periodic width FDX according to the shape relationship between the conductor part and the gap region of the reticulated conductor 1821, the capacitive noise is evenly distributed. Therefore, the amount of change in the capacitive noise can be made zero in the absence of the relay conductor 1822.

Modification of Shift Configuration Example of Reticulated Conductor

A configuration in which the following modification is made for at least one of the first to seventh shift configuration examples of the reticulated conductor is also possible.

For example, the conductor width WDY in the Y direction of the reticulated conductor may be made larger than the gap width GDY (the conductor width WDY>the gap width GDY), or the conductor width WDX in the X direction may be made larger than the gap width GDX (the conductor width WDX>the gap width GDX). In this case, it is advantageous in terms of light-shielding property and conductor occupancy.

On the contrary, for example, the conductor width WDY in the Y direction of the reticulated conductor may be made the same as or smaller than the gap width GDY (the conductor width WDY≤the gap width GDY), or the conductor width WDX in the X direction may be made the same or smaller than the gap width GDX (the conductor width WDX≤the gap width GDX). In this case, it is advantageous in terms of offset property the capacitive noise.

In the above-described shift configuration examples of the reticulated conductor, the examples of shifting the reticulated conductor in the positive direction of the X-axis have been described, but the reticulated conductor may be shifted in the negative direction of the X axis. Furthermore, the shift in the positive direction and the shift in the negative direction of the X axis may be combined, such as alternately arranging the shift of one or a plurality of rows in the positive direction of the X axis and the shift of one or a plurality of rows in the negative direction of the X axis.

The conductor layer having the above-described shift configuration of the reticulated conductor is particularly suitable, but not limited, in a case of a conductor layer close to a Victim conductor. The conductor layer having the shift configuration of the reticulated conductor has been described as an example applicable to the reticulated conductor of the conductor layer A (wiring layer 165A) or the conductor layer B (wiring layer 165B), but is also applicable to a conductor layer other than the conductor layer A or B. For example, the conductor layer may be applied to the conductor layer C (wiring layer 165C) or may be applied to any conductor layer in a circuit board, a semiconductor substrate, or an electronic device. Furthermore, two or more conductor layers having the shift configuration of the reticulated conductor may be provided, and in that case, it is desirable that the periodic shift amounts in the respective conductor layers of the two layers are the same or substantially the same from the viewpoint of the inductive noise. However, the periodic shift amounts may be made different from each other. Furthermore, two or more conductor layers having the reticulated conductor are provided, and the periodic shift may be provided in the reticulated conductor of some conductor layers and the periodic shift may not be provided in the reticulated conductor of the other conductor layers. Furthermore, a plurality of reticulated conductors having different periodic shift amounts may be provided in one conductor layer, and both a reticulated conductor having the periodic shift and a reticulated conductor having no periodic shift may be provided.

The wiring period, wiring width, wiring gap width, and wiring periodic shift of the wiring as the reticulated conductor or the relay conductor may have a structure modulated depending on the position. For example, the wiring period, wiring width, gap width, and periodic shift may have a structure that becomes gradually larger according to the distance in the X direction or the Y direction, or may have a structure that becomes gradually smaller according to the distance in the X direction or the Y direction. Furthermore, a structure in which the structure that becomes gradually larger according to the distance in the X direction or the Y direction and the structure that becomes gradually smaller according to the distance in the X direction or the Y direction are combined or alternately arranged.

At least a part of the reticulated conductor or the relay conductor may be separated into a plurality of conductors, or may be a shape in which a plurality of divided but unseparated shapes is coupled, as in B in FIG. 178. Furthermore, at least a part of the reticulated conductor may be cut and separated.

In the above-described shift configuration example of the reticulated conductor, the reticulated conductor is the wiring (Vss wiring) connected to the GND or the negative power supply, and the relay conductor is the wiring (Vdd wiring) connected to the positive power supply. Furthermore, an example in which the absolute values of the Vdd applied voltage and the Vss applied voltage are the same has been described.

However, the Vdd applied voltage and the Vss applied voltage may be opposite. That is, the reticulated conductor may be the wiring (Vdd wiring) connected to the positive power supply, and the relay conductor may be the wiring (Vss wiring) connected to the GND or the negative power supply. Furthermore, the absolute values of the Vdd applied voltage and the Vss applied voltage may not be the same. For example, the Vdd applied voltage may be a positive power supply (for example, +1 V) and the Vss applied voltage may be the GND (0 V).

The voltage applied to the reticulated conductor and the voltage applied to the relay conductor are not limited to the above examples, and may be different power sources, and may be any two types of power supplies. In this case, it is desirable, but not limited to, that the polarities of the two types of power supplies are different from each other.

The plane arrangement of the conductor layer having the shift configuration of the reticulated conductor may be reversed in the X direction or in the Y direction. Furthermore, the plane arrangement may be rotated clockwise by a predetermined angle (for example, 90 degrees) or counterclockwise by a predetermined angle (for example, −90 degrees).

In the present disclosure, the effect of improving the capacitive noise by the periodic shift of the reticulated conductor has been illustrated, but the reticulated conductor and the relay conductor not having the periodic shift are not excluded. As described above, the conductor layer having no periodic shift and both the presence and absence of the relay conductor can be applied as a reticulated conductor of the conductor layer A (wiring layer 165A) or the conductor layer B (wiring layer 165B).

The relay conductor may have any shape such as a circular shape, a polygonal shape, a symmetrical shape, an asymmetrical shape, a star shape, a radial shape, or a complicated shape. Furthermore, in the above-described shift configuration of the reticulated conductor, the conductor used as the relay conductor may be a conductor that does not electrically relay between other conductor layers, and may be non-reticulated conductor arranged in the gap region of the reticulated conductor. The non-reticulated conductor including the relay conductor may be arranged in all of the gap regions of the reticulated conductor, or may be arranged only in a predetermined part of the gap region.

15. Configuration Examples of Three-Power Supply

Next, a configuration example of the conductor layer (wiring layer 165) in a case where the solid-state imaging device 100 has a three-power supply will be described.

In the above-described various configuration examples, in either case of the two layers of the conductor layers A and B (wiring layers 165A and 165B) or the three layers of the conductor layers A to C (wiring layers 165A to 165C), the power supply to be supplied to the wiring layer is the two power supplies of Vdd as a positive power supply, for example, and Vss as a GND or a negative power supply, for example.

However, the solid-state imaging device 100 may be controlled by, for example, a three-power supply of a first power supply Vdd, a second power supply Vss1, and a third power supply Vss2. Note that, hereinafter, in the case of the three-power supply, the power supplies are referred to as the first power supply Vdd, the second power supply Vss1, and the third power supply Vss2, but in the case of a two-power supply, the power supplies are referred to as a first power supply Vdd and a second power supply Vss.

FIG. 211 is conceptual diagrams in cases where the solid-state imaging device 100 adopts a two-power supply and a three-power supply.

A of FIG. 211 is a conceptual diagram in the case where the solid-state imaging device 100 described so far is controlled by the two-power supply.

The power supply Vdd is supplied to a circuit block 2001 included in the solid-state imaging device 100 via wiring 2011, and the power supply Vss is supplied to the circuit block 2001 via wiring 2012. The circuit block 2001 is a circuit block in which the active element group 167 is formed, and corresponds to, for example, the circuit blocks 202 to 204 in FIG. 7. The wiring 2011 and the wiring 2012 correspond to the wiring (conductors) included in the conductor layers A and B in the case of two layers and the conductor layers A to C in the case of three layers in the above-described various configuration examples. However, the wiring 2011 and the wiring 2012 may include conductors of other conductor layers, and may include conductors having a configuration different from the wiring (conductors) described in the above-described various configuration examples.

B of FIG. 211 is a conceptual diagram a first configuration example in the case where the solid-state imaging device 100 is controlled by the three-power supply.

In the first configuration example controlled by the three-power supply, the first power supply Vdd is supplied to the circuit block 2001 via wiring 2021, the second power supply Vss1 is supplied to the circuit block 2001 via wiring 2022, and the third power supply Vss2 is supplied to the circuit block 2001 via wiring 2023. The second power supply Vss1 and the third power supply Vss2 may be configured to be constantly supplied to the circuit block 2001 via the wiring 2022 and 2023, or the circuit block 2001 may internally control the connection with the wiring 2022 and 2023 and select one of the second power supply Vss1 and the third power supply Vss2 according to an operation mode or the like.

C of FIG. 211 is a conceptual diagram a second configuration example in the case where the solid-state imaging device 100 is controlled by the three-power supply.

In the second configuration example of controlling the solid-state imaging device 100 by the three-power supply, a selection unit 2002 is separately provided from the circuit block 2001. The selection unit 2002 selects at least one of the second power supply Vss1 or the third power supply Vss2 according to the operation mode or the like under the control of the circuit block 2001. In other words, the selection unit 2002 selects at least one of a first path including the first power supply Vdd, the wiring 2021, the circuit block 2001, the wiring 2022, and the second power supply Vss1, or a second path including the first power supply Vdd, the wiring 2021, the circuit block 2001, the wiring 2023, and the third power supply Vss2.

D of FIG. 211 is a conceptual diagram of a third configuration example in the case where the solid-state imaging device 100 is controlled by the three-power supply.

The third configuration example of controlling the solid-state imaging device 100 by the three-power supply is a configuration in which a control unit 2003 for controlling selection of the second power supply Vss1 and the third power supply Vss2 is separately provided from the circuit block 2001. The control unit 2003 determines the selection of the second power supply Vss1 and the third power supply Vss2 and instructs the selection unit 2002, and the selection unit 2002 selects at least one of the second power supply Vss1 or the third power supply Vss2 on the basis of the instruction of the control unit 2003.

Each of the configurations of the three-power supply in B to D of FIG. 211 is the configuration in which the circuit block 2001 is electrically connected to the first power supply Vdd via the wiring 2021, electrically connected to the second power supply Vss1 via the wiring 2022, and electrically connected to the third power supply Vss2 via the wiring 2023.

Note that, in the case of selecting and operating the second power supply Vss1 and the third power supply Vss2 in each configuration of the three-power supply in B to D of FIG. 211, either one of the second power supply Vss1 and the third power supply Vss2 may be selectively selected, or the second power supply Vss1 and the third power supply Vss2 may be selected at the same time.

Regarding the magnitude relationship of power supply voltages of the three-power supply, the first power supply Vdd is larger than the second power supply Vss1, and the first power supply Vdd is larger than the third power supply Vss2. The second power supply Vss1 and the third power supply Vss2 are the same, or the second power supply Vss1 is larger than the third power supply Vss2. That is, the first power supply Vdd>the second power supply Vss1, the first power supply Vdd>the third power supply Vss2, and the second power supply Vss1≥the third power supply Vss2. Total power consumption when the solid-state imaging device 100 selects the second power supply Vss1 is equal to or larger than total power consumption when the solid-state imaging device 100 selects the third power supply Vss2. Furthermore, a total current amount when the solid-state imaging device 100 selects the second power supply Vss1 is equal to or larger than a total current amount when the solid-state imaging device 100 selects the third power supply Vss2. In these cases, "a total number of pads (Vdd pads) to which the first power supply Vdd is electrically connected≥a total number of pads (Vss2 pads) to which the third power supply Vss2 is electrically connected", and "a total number of pads (Vss1 pads) to which the second power supply Vss1 is electrically connected≥a total number of pads (Vss2 pads) to which the third power supply Vss2 is electrically connected" can be obtained. That is, since restrictions due to the total power consumption and the total current amount are small, the total number of pads to which the third power supply Vss2 is electrically connected can be made smaller than the total number of pads to which the first power supply Vdd or the second power supply Vss1 is electrically connected. Moreover, it may be set that "the total number of pads to which the first power supply Vdd is electrically connected z the total number of pads to which the second power supply Vss1 is electrically connected".

Note that as for the pad arrangement in the case of the three-power supply, the pad arrangement example in the above-described case of the two-power supply may be applied, so details are omitted. For example, the Vdd pads, Vss1 pads, and Vss2 pads may be alternately or mirror-symmetrically arranged, as described above, on any one side, two sides, three sides, or four sides.

The first power supply Vdd is, for example, a power supply of 0 V or higher, and may have a fixed voltage or a variable voltage. The second power supply Vss1 and the third power supply Vss2 are, for example, a GND or a negative power supply. More specifically, for example, a configuration in which the second power supply Vss1 is the GND (grounded) and the third power supply Vss2 is a negative power supply, or a configuration in which the second power supply Vss1 is a first negative power supply voltage and the third power supply Vss2 is a second negative power supply voltage different from the first negative power supply voltage can be adopted. In the present embodiment, the first power supply Vdd, the second power supply Vss1, and the third power supply Vss2 distinguish power supply voltage levels supplied to the circuit block 2001, and include the GND (ground). Furthermore, the second power supply Vss1 and the third power supply Vss2 may both be the GND or negative power supplies having the same voltage. In other words, the first power supply Vdd, the second power supply Vss1, and the third power supply Vss2 may be a two-system three-power supply in which the second power supply Vss1 and the third power supply Vss2 are the same power supply voltage, or may be a three-system three-power supply in which the second power supply Vss1 and the third power supply Vss2 are different power supply voltages.

Note that, hereinafter, the conductor connected to the first power supply Vdd is also referred to as a Vdd conductor, the conductor connected to the second power supply Vss1 is also referred to as a Vss1 conductor, and the conductor connected to the third power supply Vss2 is also referred to as a Vss2 conductor.

Furthermore, as a combination of the three-power supply, a configuration in which two power supply voltages of 0 or higher, such as a first power supply Vdd1, a second power supply Vdd2, and a third power supply Vss, can be adopted. The configuration of the first power supply Vdd1, the second power supply Vdd2, and the third power supply Vss is applicable by appropriately replacing the first power supply Vdd, the second power supply Vss1, and the third power supply Vss2 to be described below, so description will be omitted. In the case of the configuration of the first power supply Vdd1, the second power supply Vdd2, and the third power supply Vss, the first power supply Vdd1 and/or the second power supply Vdd2 is selectively selected or are selected at the same time, and the third power supply Vss is a commonly used element.

First Configuration Example of Three-Power Supply

Hereinafter, a configuration example of the wiring layer in the case where the solid-state imaging device 100 is controlled by the three-power supply will be described. First, a configuration example of arranging the wiring of the three-power supply in the two wiring layers (wiring layers 165A and 165B) of the plurality of wiring layers forming the multilayer wiring layer 163 will be described. Next, a configuration example of arranging the wiring of the three-power supply in the three wiring layers (wiring layers 165A to 165C) will be described. The wiring layer 165A will be referred to as the conductor layer A, the wiring layer 165B will be referred to as the conductor layer B, and the wiring layer 165C will be referred to as the conductor layer C, similarly to the above-described example, and description will be given.

FIGS. 212 and 213 illustrate a first configuration example of the three-power supply.

In both the coordinate systems in FIGS. 212 and 213, the horizontal direction is the X axis, the vertical direction is the Y axis, and the direction perpendicular to the XY plane is the Z axis.

A of FIG. 212 is a plan view of the conductor layer A (wiring layer 165A), and B of FIG. 212 is a plan view of the conductor layer B (wiring layer 165B). Note that FIG. 212 may be considered as the entire region of each conductor layer or may be considered as a partial region.

The conductor layer A in A in FIG. 212 is configured by arranging three linear conductors 2101 to 2103, which are long in the Y direction, in the X direction in a predetermined order, and periodically arranging the three linear conductors 2101 to 2103 in the X direction.

The linear conductor 2101 is wiring (Vdd wiring) connected to the first power supply Vdd. The linear conductor 2102 is wiring (Vss1 wiring) connected to the second power supply Vss1. The linear conductor 2103 is wiring (Vss2 wiring) connected to the third power supply Vss2.

Therefore, in A in FIG. 212, the three linear conductors 2101 to 2103 are arranged in the positive direction of the X-axis in the order of the Vdd wiring, Vss2 wiring, and Vss1 wiring, but the order of arranging the three linear conductors 2101 to 2103 is not limited to this example and can be any order.

The linear conductor 2101 has a conductor width WXAD in the X direction, the linear conductor 2102 has a conductor width WXAS1 in the X direction, and the linear conductor 2103 has a conductor width WXAS2 in the X direction. The conductor width WXAD of the linear conductor 2101, the conductor width WXAS1 of the linear conductor 2102, and the conductor width WXAS2 of the linear conductor 2103 are, for example, the same (the conductor width WXAD=the conductor width WXAS1=the conductor width WXAS2). Furthermore, a gap with the gap width GXA is formed between two adjacent linear conductors of the linear conductors 2101 to 2103.

The linear conductor 2101 is periodically arranged in the X direction with a conductor period FXAD, and the linear conductor 2102 is periodically arranged in the X direction with a conductor period FXAS1. Similarly, the linear conductor 2103 is periodically arranged in the X direction with a conductor period FXAS2. The conductor period FXAD, the conductor period FXAS1, and the conductor period FXAS2 are, for example, the same (the conductor period FXAD=the conductor period FXAS1=the conductor period FXAS2).

Therefore, in a rectangular region within a predetermined range of the conductor layer A, the sum of the conductor widths WXAD in the X direction of the linear conductors 2101 connected to the first power supply Vdd, the sum of the conductor widths WXAS1 in the X direction of the linear conductors 2102 connected to the second power supply Vss1, and the sum of the conductor widths WXAS2 in the X direction of the linear conductors 2103 connected to the third power supply Vss2 are the same. Furthermore, in a rectangular region within a predetermined range of the conductor layer A, the conductive area of the linear conductor 2101 connected to the first power supply Vdd, the conductive area of the linear conductor 2102 connected to the second power supply Vss1, and the conductive area of the linear conductor 2103 connected to the third power supply Vss2 are the same.

The conductor layer B in B in FIG. 212 is configured by arranging, in the X direction, three linear conductors 2111 to 2113 long in the Y direction in a predetermined order, and periodically arranging the three linear conductors 2111 to 2113 in the X direction.

The linear conductor 2111 is wiring (Vdd wiring) connected to the first power supply Vdd. The linear conductor 2112 is wiring (Vss1 wiring) connected to the second power supply Vss1. The linear conductor 2113 is wiring (Vss2 wiring) connected to the third power supply Vss2.

Therefore, in B in FIG. 212, the three linear conductors 2111 to 2113 are arranged in the positive direction of the X-axis in the order of the Vdd wiring, Vss2 wiring, and Vss1 wiring, but the order of arranging the three linear conductors 2101 to 2103 is not limited to this example and can be any order.

The linear conductor 2111 has a conductor width WXBD in the X direction, the linear conductor 2112 has a conductor width WXBS1 in the X direction, and the linear conductor 2113 has a conductor width WXBS2 in the X direction. The conductor width WXBD of the linear conductor 2111, the conductor width WXBS1 of the linear conductor 2112, and the conductor width WXBS2 of the linear conductor 2113 are, for example, the same (the conductor width WXBD=the conductor width WXBS1=the conductor width WXBS2). A gap with the gap width GXB is formed between two adjacent linear conductors of the linear conductors 2111 to 2113.

The, the linear conductor 2111 is periodically arranged in the X direction with a conductor period FXBD. The linear conductor 2112 is periodically arranged in the X direction with a conductor period FXBS1, and the linear conductor 2113 is periodically arranged in the X direction with a conductor period FXBS2. The conductor period FXBD, the conductor period FXBS1, and the conductor period FXBS2 are, for example, the same (the conductor period FXBD=the conductor period FXBS1=the conductor period FXBS2).

Therefore, in a rectangular region within a predetermined range of the conductor layer B, the sum of the conductor widths WXBD in the X direction of the linear conductors 2111 connected to the first power supply Vdd, the sum of the conductor widths WXBS1 in the X direction of the linear conductors 2112 connected to the second power supply Vss1, and the sum of the conductor widths WXBS2 in the X direction of the linear conductors 2113 connected to the third power supply Vss2 are the same. Furthermore, in a rectangular region within a predetermined range of the conductor layer B, the conductive area of the linear conductor 2111 connected to the first power supply Vdd, the conductive area of the linear conductor 2112 connected to the second power supply Vss1, and the conductive area of the linear conductor 2113 connected to the third power supply Vss2 are the same.

Next, in the conductor layer A and the conductor layer B, comparing the linear conductor 2101 and the linear conductor 2111 connected to the same first power supply Vdd, the conductor width WXAD and the conductor width WXBD are the same, and the conductor period FXAD and conductor period FXBD are also the same. Note that the positions of the linear conductor 2101 and the linear conductor 2111 in the X direction are different. The amount of shift in the X-direction position between the linear conductor 2101 and the linear conductor 2111 is equal to or larger than the gap widths GXA and GXB in the X direction and equal or smaller than the conductor widths WXAD and WXBD in the X direction, and is more favorably larger than the gap widths GXA and GXB in the X direction and smaller than the conductor widths WXAD and WXBD in the X direction.

Furthermore, when comparing the linear conductor 2102 and the linear conductor 2112 connected to the second power supply Vss1, the conductor width WXAS1 and the conductor width WXBS1 are the same, and the conductor period FXAS1 and the conductor period FXBS1 are also the same. Note that the positions of the linear conductor 2102 and the linear conductor 2112 in the X direction are different. The amount of shift in the X-direction position between the linear conductor 2102 and the linear conductor 2112 is equal to or larger than the gap widths GXA and GXB in the X direction and equal or smaller than the conductor widths WXAS1 and WXBS1 in the X direction, and is more favorably larger than the gap widths GXA and GXB in the X direction and smaller than the conductor widths WXAS1 and WXBS1 in the X direction.

Furthermore, comparing the linear conductor 2103 and the linear conductor 2113 connected to the third power supply Vss2, the conductor width WXAS2 and the conductor width WXBS2 are the same, and the conductor period FXAS2 and the conductor period FXBS2 are also the same. Note that the positions of the linear conductor 2103 and the linear conductor 2113 in the X direction are different. The amount of shift in the X-direction position between the linear conductor 2103 and the linear conductor 2113 is equal to or larger than the gap widths GXA and GXB in the X direction and equal or smaller than the conductor widths WXAS2 and WXBS2 in the X direction, and is more favorably larger than the gap widths GXA and GXB in the X direction and smaller than the conductor widths WXAS2 and WXBS2 in the X direction.

FIG. 213 is a plan view illustrating a stacked state of the conductor layer A in A in FIG. 212 and the conductor layer B in B in FIG. 212.

In the case where the amount of shift in the X-direction position between the linear conductors of the conductor layer A and the conductor layer B, and the conductor widths and the gap widths in the X direction are in the above favorable relationship, the conductor layer A and the conductor layer B can be stacked to form a light-shielding structure, as illustrated in FIG. 213, and can shield the hot carrier light emission.

Furthermore, in the case where the amount of shift in the X-direction position between the linear conductors of the conductor layer A and the conductor layer B, and the gap widths and the conductor widths in the X direction are in the above-favorable relationship, the linear conductors connected to the same power supply of the conductor layers A and B may be electrically connected via a conductor via (VIA) extending in the Z direction, in a predetermined partial region where the positions overlap. From the viewpoint of voltage drop (IR-Drop), it is desirable, but not limited to, that the linear conductors connected to the same power supply be electrically connected to each other.

Furthermore, for example, in the case where either the second power supply Vss1 or the third power supply Vss2 is selected by the selection unit 2002 or the like in FIG. 211, both the conductor layers A and B form a differential structure. Specifically, in the conductor layer A, in the case where the second power supply Vss1 is selected, the current distribution of the linear conductor 2101 connected to the first power supply Vdd and the current distribution of the linear conductor 2102 connected to the second power supply Vss1 are substantially equal and have opposite characteristics, and in the case where the third power supply Vss2 is selected, the current distribution of the linear conductor 2101 connected to the first power supply Vdd and the current distribution of the linear conductor 2103 connected to the third power supply Vss2 are substantially equal and have opposite characteristics. Furthermore, in the conductor layer B, in the case where the second power supply Vss1 is selected, the current distribution of the linear conductor 2111 connected to the first power supply Vdd and the current distribution of the linear conductor 2112 connected to the second power supply Vss1 are substantially equal and have opposite characteristics, and in the case where the third power supply Vss2 is selected, the current distribution of the linear conductor 2111 connected to the first power supply Vdd and the current distribution of the linear conductor 2113 connected to the third power supply Vss2 are substantially equal and have opposite characteristics. Here, the substantially uniform is a difference in a range that can be regarded as uniform, but for example, the difference may be a difference in a range not exceeding at least twice. Thereby, inductive noise can be suppressed as compared with a non-differential structure. Moreover, since the differential structure is a symmetrical structure, noise design is easy.

First Modification of First Configuration Example of Three-Power Supply

FIGS. 214 and 215 illustrate a first modification of the first configuration example of the three-power supply.

In both the coordinate systems in FIGS. 214 and 215, the horizontal direction is the X axis, the vertical direction is the Y axis, and the direction perpendicular to the XY plane is the Z axis.

A of FIG. 214 is a plan view of the conductor layer A, and B of FIG. 214 is a plan view of the conductor layer B. Note that FIG. 214 may be considered as the entire region of each conductor layer or may be considered as a partial region.

Since the conductor layer A in A in FIG. 214 is the same as the conductor layer A of the first configuration example illustrated in A in FIG. 212, description thereof will be omitted.

In the conductor layer B in B in FIG. 214, linear conductors 2121 to 2123 long in the Y direction are arranged in units of two in a predetermined order in the X direction. Furthermore, the linear conductors 2121 to 2123 in units of two are periodically arranged in the X direction.

In other words, the conductor layer B of the second configuration example has a configuration in which linear conductors 2111 to 2113 as the Vdd wiring, the Vss2 wiring, and the Vss1 wiring of the conductor layer B of the first configuration example are respectively replaced with the two linear conductors 2121 to 2123, and the linear conductors 2121 to 2123 are periodically arranged in the X direction.

The linear conductor 2121 is wiring (Vdd wiring) connected to the first power supply Vdd. The linear conductor 2122 is wiring (Vss1 wiring) connected to the second power supply Vss1. The linear conductor 2123 is wiring (Vss2 wiring) connected to the third power supply Vss2.

Therefore, in B in FIG. 214, the linear conductors 2121 to 2123 in units of two are arranged in the positive direction of the X-axis in the order of the Vdd wiring, Vss2 wiring, and Vss1 wiring, but the order of arranging the linear conductors 2121 to 2123 in units of two is not limited to this example and can be any order.

The linear conductor 2121 has the conductor width WXBD in the X direction, the linear conductor 2122 has the conductor width WXBS1 in the X direction, and the linear conductor 2123 has the conductor width WXBS2 in the X direction. The conductor width WXBD of the linear conductor 2121, the conductor width WXBS1 of the linear conductor 2122, and the conductor width WXBS2 of the linear conductor 2123 are, for example, the same (the conductor width WXBD=the conductor width WXBS1=the conductor width WXBS2). A gap with the gap width GXB is formed between two adjacent linear conductors of the linear conductors 2121 to 2123.

Then, the two linear conductors 2121 are periodically arranged in the X direction with the conductor period FXBD. The two linear conductors 2122 are periodically arranged in the X direction with the conductor period FXBS1, and the two linear conductors 2123 are periodically arranged in the X direction with the conductor period FXBS2. The conductor period FXBD, the conductor period FXBS1, and the conductor period FXBS2 are, for example, the same (the conductor period FXBD=the conductor period FXBS1=the conductor period FXBS2).

Therefore, in a rectangular region within a predetermined range of the conductor layer B, the sum of the conductor widths WXBD in the X direction of the linear conductors 2121 connected to the first power supply Vdd, the sum of the conductor widths WXBS1 in the X direction of the linear conductors 2122 connected to the second power supply Vss1, and the sum of the conductor widths WXBS2 in the X direction of the linear conductors 2123 connected to the third power supply Vss2 are the same. Furthermore, in a rectangular region within a predetermined range of the conductor layer B, the conductive area of the linear conductor 2121 connected to the first power supply Vdd, the conductive area of the linear conductor 2122 connected to the second power supply Vss1, and the conductive area of the linear conductor 2123 connected to the third power supply Vss2 are the same.

In the case where either the second power supply Vss1 or the third power supply Vss2 is selected in the conductor layer B, the conductor layer B forms a differential structure and thus can suppress the inductive noise more than a non-differential structure, and noise design is easier.

FIG. 215 is a plan view illustrating a stacked state of the conductor layer A in A in FIG. 214 and the conductor layer B in B in FIG. 214.

By setting the amount of shift in the X-direction position between the linear conductors of the conductor layer A and the conductor layer B, and the conductor widths and the gap widths in the X direction to predetermined conditions, the conductor layer A and the conductor layer B can have a light-shielding structure in a stacked state, as illustrated in FIG. 215, and can shield the hot carrier light emission.

The linear conductors connected to the same power supply of the conductor layers A and B may be electrically connected via a conductor via extending in the Z direction, or the like, in a predetermined partial region where the positions overlap. From the viewpoint of voltage drop, it is desirable, but not limited to, that the linear conductors connected to the same power supply be electrically connected to each other.

The first modification of the first configuration example illustrated in FIG. 214 has a configuration in which the linear conductors 2111 to 2113 as the Vdd wiring, the Vss2 wiring, and the Vss1 wiring of the conductor layer B, of the conductor layers A and B of the first configuration example of the three-power supply illustrated in FIG. 212, are respectively replaced with the two linear conductors 2121 and 2123, and the linear conductors 2121 and 2123 are periodically arranged in the X direction.

However, a predetermined number of three or more linear conductors may be periodically arranged instead of the periodic arrangement of the linear conductors 2121 to 2123 in units of two.

Furthermore, for example, a configuration in which the linear conductors 2101 to 2103 as the Vdd wiring, the Vss2 wiring, and the Vss1 wiring of the conductor layer A, of the conductor layers A and B of the first configuration example of the three-power supply illustrated in FIG. 212, can be respectively replaced with the two linear conductors 2121 and 2123, and the linear conductors 2121 and 2123 are periodically arranged in the X direction, can also be adopted.

Alternatively, a configuration in which the Vdd wiring, the Vss2 wiring, and the Vss1 wiring of both the conductor layers A and B are respectively replaced with two or more predetermined number of linear conductors 2121 to 2123, and the linear conductors 2121 to 2123 are periodically arranged in the X direction, can also be adopted. In this case, the conductor widths, conductor periods, and gap widths of the linear conductors 2121 to 2123 of the conductor layers A and B may be the same or different between the conductor layer A and the conductor layer B. One or two of the conductor widths, the conductor periods, and the gap widths may be the same and the others may be different between the conductor layer A and the conductor layer B.

Second Modification of First Configuration Example of Three-Power Supply

FIGS. 216 and 217 illustrate a second modification of the first configuration example of the three-power supply.

In both the coordinate systems in FIGS. 216 and 217, the horizontal direction is the X axis, the vertical direction is the Y axis, and the direction perpendicular to the XY plane is the Z axis.

A of FIG. 216 is a plan view of the conductor layer A, and B of FIG. 216 is a plan view of the conductor layer B. Note that FIG. 216 may be considered as the entire region of each conductor layer or may be considered as a partial region.

In the conductor layer A of the first configuration example illustrated in A in FIG. 212, the three Vdd conductor, Vss1 conductor, and Vss2 conductor periodically arranged in the X direction have the same conductor width, whereas in the conductor layer A of the second modification in A in FIG. 216, the Vdd conductor and the Vss1 conductor have the same conductor width but the conductor width of the Vss2 conductor is smaller than the conductor width of the Vdd conductor and the Vss1 conductor (the conductor width WXAD=the conductor width WXAS1>the conductor width WXAS2).

Specifically, the conductor layer A in A in FIG. 216 is configured by arranging three linear conductors 2131 to 2133, which are long in the Y direction, in the X direction in a predetermined order, and periodically arranging the three linear conductors 2131 to 2133 in the X direction.

The linear conductor 2131 is wiring (Vdd wiring) connected to the first power supply Vdd. The linear conductor 2132 is wiring (Vss1 wiring) connected to the second power supply Vss1. The linear conductor 2133 is wiring (Vss2 wiring) connected to the third power supply Vss2.

The linear conductor 2131 has the conductor width WXAD in the X direction, the linear conductor 2132 has the conductor width WXAS1 in the X direction, and the linear conductor 2133 has the conductor width WXAS2 in the X direction. The conductor width WXAD of the linear conductor 2131 and the conductor width WXAS1 of the linear conductor 2132 are, for example, the same (the conductor width WXAD=the conductor width WXAS1), and the conductor width WXAS2 of the linear conductor 2133 is smaller than the conductor width WXAD of the linear conductor 2131 and the conductor width WXAS1 of the linear conductor 2132 (the conductor width WXAD=the conductor width WXAS1>the conductor width WXAS2). Furthermore, a gap with the gap width GXA is formed between two adjacent linear conductors of the linear conductors 2131 to 2133.

The linear conductor 2131 is periodically arranged in the X direction with the conductor period FXAD, and the linear conductor 2132 is periodically arranged in the X direction with the conductor period FXAS1. Similarly, the linear conductors 2133 are periodically arranged in the X direction with the conductor period FXAS2. The conductor period FXAD, the conductor period FXAS1, and the conductor period FXAS2 are, for example, the same (the conductor period FXAD=the conductor period FXAS1=the conductor period FXAS2).

Therefore, in a rectangular region within a predetermined range of the conductor layer A, the sum of the conductor widths WXAD in the X direction of the linear conductors 2131 connected to the first power supply Vdd and the sum of the conductor widths WXAS1 in the X direction of the linear conductors 2132 connected to the second power supply Vss1 are the same. Then, the sum of the conductor widths WXAS2 in the X direction of the linear conductor 2133 connected to the third power supply Vss2 is smaller than the sum of the conductor widths WXAS1 in the X direction of the linear conductors 2132 connected to the second power supply Vss1.

Furthermore, in a rectangular region within a predetermined range of the conductor layer A, the conductive area of the linear conductor 2131 connected to the first power supply Vdd and the conductive area of the linear conductor 2132 connected to the second power supply Vss1 are the same. Then, the conductive area of the linear conductor 2133 connected to the third power supply Vss2 is smaller than the conductive area of the linear conductor 2132 connected to the second power supply Vss1.

In the conductor layer B of the second modification in B in FIG. 216, the Vdd conductor and the Vss1 conductor have the same conductor width, and the conductor width of the Vss2 conductor is smaller than the conductor widths of the Vdd conductor and the Vss1 conductor, similarly to the conductor layer A of the second modification.

Specifically, the conductor layer B in B in FIG. 216 is configured by arranging three linear conductors 2141 to 2143, which are long in the Y direction, in the X direction in a predetermined order, and periodically arranging the three linear conductors 2141 to 2143 in the X direction.

The linear conductor 2141 is wiring (Vdd wiring) connected to the first power supply Vdd. The linear conductor 2142 is wiring (Vss1 wiring) connected to the second power supply Vss1. The linear conductor 2143 is wiring (Vss2 wiring) connected to the third power supply Vss2.

The linear conductor 2141 has the conductor width WXBD in the X direction, the linear conductor 2142 has the conductor width WXBS1 in the X direction, and the linear conductor 2143 has the conductor width WXBS2 in the X direction. The conductor width WXBD of the linear conductor 2141 and the conductor width WXBS1 of the linear conductor 2142 are, for example, the same (the conductor width WXBD=the conductor width WXBS1), and the conductor width WXBS2 of the linear conductor 2143 is smaller than the conductor width WXBD of the linear conductor 2141 and the conductor width WXBS1 of the linear conductor 2142 (the conductor width WXBD=the conductor width WXBS1>the conductor width WXBS2). Furthermore, a gap with the gap width GXB is formed between two adjacent linear conductors of the linear conductors 2141 to 2143.

The linear conductor 2141 is periodically arranged in the X direction with the conductor period FXBD, and the linear conductor 2142 is periodically arranged in the X direction with the conductor period FXBS1. Similarly, the linear conductor 2143 is periodically arranged in the X direction with the conductor period FXBS2. The conductor period FXBD, the conductor period FXBS1, and the conductor period FXBS2 are, for example, the same (the conductor period FXBD=the conductor period FXBS1=the conductor period FXBS2).

Therefore, in a rectangular region within a predetermined range of the conductor layer B, the sum of the conductor widths WXBD in the X direction of the linear conductors 2141 connected to the first power supply Vdd and the sum of the conductor widths WXBS1 in the X direction of the linear conductors 2142 connected to the second power supply Vss1 are the same. Then, the sum of the conductor widths WXBS2 in the X direction of the linear conductors 2143 connected to the third power supply Vss2 is smaller than the sum of the conductor widths WXBS1 in the X direction of the linear conductors 2142 connected to the second power supply Vss1.

Furthermore, in a rectangular region within a predetermined range of the conductor layer B, the conductive area of the linear conductor 2141 connected to the first power supply Vdd and the conductive area of the linear conductor 2142 connected to the second power supply Vss1 are the same. Then, the conductive area of the linear conductor 2143 connected to the third power supply Vss2 is smaller than the conductive area of the linear conductor 2142 connected to the second power supply Vss1.

FIG. 217 is a plan view illustrating a stacked state of the conductor layer A in A in FIG. 216 and the conductor layer B in B in FIG. 216.

By setting the amount of shift in the X-direction position between the linear conductors of the conductor layer A and the conductor layer B, and the conductor widths and the gap widths in the X direction to predetermined conditions, the conductor layer A and the conductor layer B can have a light-shielding structure in a stacked state, as illustrated in FIG. 217, and can shield the hot carrier light emission.

The linear conductors connected to the same power supply of the conductor layers A and B may be electrically connected via a conductor via extending in the Z direction, or the like, in a predetermined partial region where the positions overlap. From the viewpoint of voltage drop, it is desirable, but not limited to, that the linear conductors connected to the same power supply be electrically connected to each other.

In the conductor layer A and the conductor layer B of the second modification of the first configuration example of the three-power supply configured as described above, the sum of the conductor widths in the X direction of the Vss2 conductors is smaller than the sum of the conductor widths in the X direction of the Vss1 conductors, and thus in a case where the total current amount when the third power supply Vss2 is selected is smaller than the total current amount when the second power supply Vss1 is selected, the total current amount flowing through the Vss2 conductor is smaller than the total current amount flowing through the Vss1 conductor, and the voltage of the Vss2 conductor is less likely to drop than the voltage of the Vss1 conductor. Thereby, the conductor resistance of the Vss2 conductor can be made larger than that of the Vss1 conductor as long as an acceptable level of the voltage drop is satisfied. When the conductor width WXAS2 of the Vss2 conductor becomes smaller, the Vdd conductor and the Vss1 conductor can be arranged densely, which leads to improvement of the voltage drop of the Vdd conductor and the Vss1 conductor when a comparison is performed on the assumption that the wiring regions have the same area. Furthermore, since the area of an Aggressor loop that generates a magnetic field becomes smaller as the conductor period becomes shorter, the inductive noise can be improved as described with reference to FIGS. 46 to 57.

Third Modification of First Configuration Example of Three-Power Supply

FIGS. 218 and 219 illustrate a third modification of the first configuration example of the three-power supply.

In both the coordinate systems in FIGS. 218 and 219, the horizontal direction is the X axis, the vertical direction is the Y axis, and the direction perpendicular to the XY plane is the Z axis.

A of FIG. 218 is a plan view of the conductor layer A, and B of FIG. 218 is a plan view of the conductor layer B. Note that FIG. 218 may be considered as the entire region of each conductor layer or may be considered as a partial region.

In the conductor layer A of the first configuration example illustrated in A in FIG. 212, the three Vdd conductor, Vss1 conductor, and Vss2 conductor periodically arranged in the X direction have the same conductor width, whereas in the conductor layer A of the third modification in A in FIG. 218, the conductor width of the Vss1 conductor is smaller than the conductor width of the Vdd conductor, and the conductor width of the Vss2 conductor is smaller than the conductor width of the Vss1 conductor (the conductor width WXAD>the conductor width WXAS1>the conductor width WXAS2).

Specifically, the conductor layer A in A in FIG. 218 is configured by arranging three linear conductors 2151 to 2153, which are long in the Y direction, in the X direction in a predetermined order, and periodically arranging the three linear conductors 2151 to 2153 in the X direction.

The linear conductor 2151 is wiring (Vdd wiring) connected to the first power supply Vdd. The linear conductor 2152 is wiring (Vss1 wiring) connected to the second power supply Vss1. The linear conductor 2153 is wiring (Vss2 wiring) connected to the third power supply Vss2.

The linear conductor 2151 has the conductor width WXAD in the X direction, the linear conductor 2152 has the conductor width WXAS1 in the X direction, and the linear conductor 2153 has the conductor width WXAS2 in the X direction. The conductor width WXAD of the linear conductor 2151 is larger than the conductor width WXAS1 of the linear conductor 2152 (the conductor width WXAD>the conductor width WXAS1), and the conductor width WXAS2 of the linear conductor 2153 is smaller than the conductor width WXAS1 of the linear conductor 2152 (the conductor width WXAS1>the conductor width WXAS2). Furthermore, a gap with the gap width GXA is formed between two adjacent linear conductors of the linear conductors 2151 to 2153.

The linear conductor 2151 is periodically arranged in the X direction with the conductor period FXAD, and the linear conductor 2152 is periodically arranged in the X direction with the conductor period FXAS1. Similarly, the linear conductor 2153 is periodically arranged in the X direction with the conductor period FXAS2. The conductor period FXAD, the conductor period FXAS1, and the conductor period FXAS2 are, for example, the same (the conductor period FXAD=the conductor period FXAS1=the conductor period FXAS2).

Therefore, in a rectangular region within a predetermined range of the conductor layer A, the sum of the conductor widths WXAS1 in the X direction of the linear conductors 2152 connected to the second power supply Vss1 is smaller than the sum of the conductor widths WXAD in the X direction of the linear conductors 2151 connected to the first power supply Vdd. Then, the sum of the conductor widths WXAS2 in the X direction of the linear conductors 2153 connected to the third power supply Vss2 is smaller than the sum of the conductor widths WXAS1 in the X direction of the linear conductors 2152 connected to the second power supply Vss1.

In a rectangular region within a predetermined range of the conductor layer A, the conductive area of the linear conductor 2152 connected to the second power supply Vss1 is smaller than the conductive area of the linear conductor 2151 connected to the first power supply Vdd. Then, the conductive area of the linear conductor 2153 connected to the third power supply Vss2 is smaller than the conductive area of the linear conductor 2152 connected to the second power supply Vss1. That is, the conductive areas of the Vdd conductor, the Vss1 conductor, and the Vss2 conductor of the conductor layer A are different.

In the conductor layer B of the third modification in B in FIG. 218, the conductor width of the Vss1 conductor is smaller than the conductor width of the Vdd conductor, and the conductor width of the Vss2 conductor is smaller than the conductor width of the Vss1 conductor (the conductor width WXBD>the conductor width WXBS1>the conductor width WXBS2), similarly to the conductor layer A of the third modification.

Specifically, the conductor layer B in B in FIG. 218 is configured by arranging three linear conductors 2161 to 2163, which are long in the Y direction, in the X direction in a predetermined order, and periodically arranging the three linear conductors 2161 to 2163 in the X direction.

The linear conductor 2161 is wiring (Vdd wiring) connected to the first power supply Vdd. The linear conductor 2162 is wiring (Vss1 wiring) connected to the second power supply Vss1. The linear conductor 2163 is wiring (Vss2 wiring) connected to the third power supply Vss2.

The linear conductor 2161 has the conductor width WXBD in the X direction, the linear conductor 2162 has the conductor width WXBS1 in the X direction, and the linear conductor 2163 has a conductor width WXAB2 in the X direction. The conductor width WXBD of the linear conductor 2161 is larger than the conductor width WXBS1 of the linear conductor 2162 (the conductor width WXBD>the conductor width WXBS1), and the conductor width WXBS2 of the linear conductor 2163 is smaller than the conductor width WXBS1 of the linear conductor 2162 (the conductor width WXBS1>the conductor width WXBS2). Furthermore, a gap with the gap width GXB is formed between two adjacent linear conductors of the linear conductors 2161 to 2163.

The linear conductor 2161 is periodically arranged in the X direction with the conductor period FXBD, and the linear conductor 2162 is periodically arranged in the X direction with the conductor period FXBS1. Similarly, the linear conductor 2163 is periodically arranged in the X direction with the conductor period FXBS2. The conductor period FXBD, the conductor period FXBS1, and the conductor period FXBS2 are, for example, the same (the conductor period FXBD=the conductor period FXBS1=the conductor period FXBS2).

Therefore, in a rectangular region within a predetermined range of the conductor layer B, the sum of the conductor widths WXBS1 in the X direction of the linear conductors 2162 connected to the second power supply Vss1 is smaller than the sum of the conductor widths WXBD in the X direction of the linear conductors 2161 connected to the first power supply Vdd. Then, the sum of the conductor widths WXBS2 in the X direction of the linear conductors 2163 connected to the third power supply Vss2 is smaller than the sum of the conductor widths WXBS1 in the X direction of the linear conductors 2162 connected to the second power supply Vss1.

Furthermore, in a rectangular region within a predetermined range of the conductor layer B, the conductive area of the linear conductor 2162 connected to the second power supply Vss1 is smaller than the conductive area of the linear conductor 2161 connected to the first power supply Vdd. Then, the conductive area of the linear conductor 2163 connected to the third power supply Vss2 is smaller than the conductive area of the linear conductor 2162 connected to the second power supply Vss1. That is, the conductive areas of the Vdd conductor, the Vss1 conductor, and the Vss2 conductor of the conductor layer B are different.

FIG. 219 is a plan view illustrating a stacked state of the conductor layer A in A in FIG. 218 and the conductor layer B in B in FIG. 218.

By setting the amount of shift in the X-direction position between the linear conductors of the conductor layer A and the conductor layer B, and the conductor widths and the gap widths in the X direction to predetermined conditions, the conductor layer A and the conductor layer B can have a light-shielding structure in a stacked state, as illustrated in FIG. 219, and can shield the hot carrier light emission.

The linear conductors connected to the same power supply of the conductor layers A and B may be electrically connected via a conductor via extending in the Z direction, or the like, in a predetermined partial region where the positions overlap. From the viewpoint of voltage drop, it is desirable, but not limited to, that the linear conductors connected to the same power supply be electrically connected to each other.

In the conductor layer A and the conductor layer B of the third modification of the first configuration example of the three-power supply configured as described above, the sum of the conductor widths in the X direction of the Vss2 conductors is smaller than the sum of the conductor widths in the X direction of the Vss1 conductors, and thus in a case where the total current amount when the third power supply Vss2 is selected is smaller than the total current amount when the second power supply Vss1 is selected, the total current amount flowing through the Vss2 conductor is smaller than the total current amount flowing through the Vss1 conductor, and the voltage of the Vss2 conductor is less likely to drop than the voltage of the Vss1 conductor. Thereby, the conductor resistance of the Vss2 conductor can be made larger than that of the Vss1 conductor as long as an acceptable level of the voltage drop is satisfied.

In the configuration in which the second power supply Vss1 and the third power supply Vss2 are selectively switched, the Vdd conductor is a commonly used element. By making the commonly used Vdd conductor less likely to have a voltage drop than the Vss1 conductor and the Vss2 conductor, the voltage drop of both the combination of the Vdd conductor and the Vss1 conductor and the combination of the Vdd conductor and the Vss2 conductor may be able to be improved. Furthermore, in the third modification, the conductors are arranged more densely than those in the second modification, so that the voltage drop and the inductive noise may be able to be further improved.

Fourth Modification of First Configuration Example of Three-Power Supply

FIGS. 220 and 221 illustrate a fourth modification of the first configuration example of the three-power supply.

In both the coordinate systems in FIGS. 220 and 221, the horizontal direction is the X axis, the vertical direction is the Y axis, and the direction perpendicular to the XY plane is the Z axis.

A of FIG. 220 is a plan view of the conductor layer A, and B of FIG. 220 is a plan view of the conductor layer B. Note that FIG. 220 may be considered as the entire region of each conductor layer or may be considered as a partial region.

In the conductor layer A of the first configuration example illustrated in A in FIG. 220, the three Vdd conductor, Vss1 conductor, and Vss2 conductor periodically arranged in the X direction have the same conductor width, whereas in the conductor layer A of the fourth modification in A in FIG. 220, the conductor widths of the Vss1 conductor and the Vss2 conductor are smaller than the conductor width of the Vdd conductor, and the conductor widths of the Vss1 conductor and the Vss2 conductor are the same (the conductor width WXAD>the conductor width WXAS1=the conductor width WXAS2).

Specifically, the conductor layer A in A in FIG. 220 is configured by arranging three linear conductors 2171 to 2173, which are long in the Y direction, in the X direction in a predetermined order, and periodically arranging the three linear conductors 2171 to 2173 in the X direction.

The linear conductor 2171 is wiring (Vdd wiring) connected to the first power supply Vdd. The linear conductor 2172 is wiring (Vss1 wiring) connected to the second power supply Vss1. The linear conductor 2173 is wiring (Vss2 wiring) connected to the third power supply Vss2.

The linear conductor 2171 has the conductor width WXAD in the X direction, the linear conductor 2172 has the conductor width WXAS1 in the X direction, and the linear conductor 2173 has the conductor width WXAS2 in the X direction. The conductor width WXAD of the linear conductor 2171 is larger than both the conductor width WXAS1 of the linear conductor 2172 and the conductor width WXAS2 of the linear conductor 2173, and the conductor width WXAS1 of the linear conductor 2172 and the conductor width WXAS2 of the linear conductor 2173 are, for example, the same (the conductor width WXAD>the conductor width WXAS1=the conductor width WXAS2). Furthermore, a gap with the gap width GXA is formed between two adjacent linear conductors of the linear conductors 2171 to 2173.

The linear conductor 2171 is periodically arranged in the X direction with the conductor period FXAD, and the linear conductor 2172 is periodically arranged in the X direction with the conductor period FXAS1. Similarly, the linear conductor 2173 is periodically arranged in the X direction with the conductor period FXAS2. The conductor period FXAD, the conductor period FXAS1, and the conductor period FXAS2 are, for example, the same (the conductor period FXAD=the conductor period FXAS1=the conductor period FXAS2).

Therefore, in a rectangular region within a predetermined range of the conductor layer A, each of the sum of the conductor widths WXAS1 in the X direction of the linear conductors 2172 connected to the second power supply Vss1 and the sum of the conductor widths WXAS2 in the X direction of the linear conductors 2173 connected to the third power supply Vss2 is smaller than the sum of the conductor widths WXAD in the X direction of the linear conductors 2171 connected to the first power supply Vdd. Then, the sum of the conductor widths WXAS1 in the X direction of the linear conductors 2172 connected to the second power supply Vss1 and the sum of the conductor widths WXAS2 in the X direction of the linear conductors 2173 connected to the third power supply Vss2 are equal.

Furthermore, in a rectangular region within a predetermined range of the conductor layer A, each of the conductive area of the linear conductor 2172 connected to the second power supply Vss1 and the conductive area of the linear conductor 2173 connected to the third power supply Vss2 is smaller than the conductive area of the linear conductor 2171 connected to the first power supply Vdd. Then, the conductive area of the linear conductor 2172 connected to the second power supply Vss1 and the conductive area of the linear conductor 2173 connected to the third power supply Vss2 are equal.

In the conductor layer B of the fourth modification in B in FIG. 220, the conductor widths of the Vss1 conductor and the Vss2 conductor are smaller than the conductor width of the Vdd conductor, and the conductor widths of the Vss1 conductor and the Vss2 conductor are the same (the conductor width WXBD>the conductor width WXBS1=the conductor width WXBS2), similarly to the conductor layer A of the fourth modification.

Specifically, the conductor layer B in B in FIG. 220 is configured by arranging three linear conductors 2181 to 2183, which are long in the Y direction, in the X direction in a predetermined order, and periodically arranging the three linear conductors 2181 to 2183 in the X direction.

The linear conductor 2181 is wiring (Vdd wiring) connected to the first power supply Vdd. The linear conductor 2182 is wiring (Vss1 wiring) connected to the second power supply Vss1. The linear conductor 2183 is wiring (Vss2 wiring) connected to the third power supply Vss2.

The linear conductor 2181 has the conductor width WXBD in the X direction, the linear conductor 2182 has the conductor width WXBS1 in the X direction, and the linear conductor 2183 has the conductor width WXAB2 in the X direction. The conductor width WXBD of the linear conductor 2181 is larger than both the conductor width WXBS1 of the linear conductor 2182 and the conductor width WXBS2 of the linear conductor 2183, and the conductor width WXBS1 of the linear conductor 2182 and the conductor width WXBS2 of the linear conductor 2183 are, for example, the same (the conductor width WXBD>the conductor width WXBS1=the conductor width WXBS2). Furthermore, a gap with the gap width GXB is formed between two adjacent linear conductors of the linear conductors 2181 to 2183.

The linear conductor 2181 is periodically arranged in the X direction with the conductor period FXBD, and the linear conductor 2182 is periodically arranged in the X direction with the conductor period FXBS1. Similarly, the linear conductor 2183 is periodically arranged in the X direction with the conductor period FXBS2. The conductor period FXBD, the conductor period FXBS1, and the conductor period FXBS2 are the same (the conductor period FXBD=the conductor period FXBS1=the conductor period FXBS2).

Therefore, in a rectangular region within a predetermined range of the conductor layer B, each of the sum of the conductor widths WXBS1 in the X direction of the linear conductors 2182 connected to the second power supply Vss1 and the sum of the conductor widths WXBS2 in the X direction of the linear conductors 2183 connected to the third power supply Vss2 is smaller than the sum of the conductor widths WXBD in the X direction of the linear conductors 2181 connected to the first power supply Vdd. Then, the sum of the conductor widths WXBS1 in the X direction of the linear conductors 2182 connected to the second power supply Vss1 and the sum of the conductor widths WXBS2 in the X direction of the linear conductors 2183 connected to the third power supply Vss2 are equal.

Furthermore, in a rectangular region within a predetermined range of the conductor layer B, each of the conductive area of the linear conductor 2182 connected to the second power supply Vss1 and the conductive area of the linear conductor 2183 connected to the third power supply Vss2 is smaller than the conductive area of the linear conductor 2181 connected to the first power supply Vdd. Then, the conductive area of the linear conductor 2182 connected to the second power supply Vss1 and the conductive area of the linear conductor 2183 connected to the third power supply Vss2 are equal.

FIG. 221 is a plan view illustrating a stacked state of the conductor layer A in A in FIG. 220 and the conductor layer B in B in FIG. 220.

By setting the amount of shift in the X-direction position between the linear conductors of the conductor layer A and the conductor layer B, and the conductor widths and the gap widths in the X direction to predetermined conditions, the conductor layer A and the conductor layer B can have a light-shielding structure in a stacked state, as illustrated in FIG. 221, and can shield the hot carrier light emission.

The linear conductors connected to the same power supply of the conductor layers A and B may be electrically connected via a conductor via extending in the Z direction, or the like, in a predetermined partial region where the positions overlap. From the viewpoint of voltage drop, it is desirable, but not limited to, that the linear conductors connected to the same power supply be electrically connected to each other.

In the conductor layer A and the conductor layer B of the fourth modification of the first configuration example of the three-power supply configured as described above, in the configuration in which the second power supply Vss1 and the third power supply Vss2 are selectively switched, a structural difference between the combination of the Vdd conductor and the Vss1 conductor and the combination of the Vdd conductor and the Vss2 conductor can be made small. Thereby, for example, in the case where the second power supply Vss1 and the third power supply Vss2 have the same power supply voltage, the difference in the voltage drop and the difference in the inductive noise can be reduced. Furthermore, in the fourth modification, the conductors are arranged more densely than those in the third modification, so that the voltage drop and the inductive noise may be able to be further improved.

In the first configuration example of the three-power supply and the first to fourth modifications, an example in which the conductor layer A and the conductor layer B form a light-shielding structure has been described, but the conductor layer A and the conductor layer B do not necessarily have the light-shielding structure. For example, a configuration in which the gap width in the X direction is larger than the positional shift in the X direction, the positional shift in the X direction is larger than the conductor width in the X direction, or the positional shift in the X direction is zero or a value close to zero may be adopted. Note that the stacked state of the conductor layer A and the conductor layer B becomes the light-shielding structure even with the configuration in which the positional shift in the X direction is larger than the conductor width in the X direction, depending on the configuration of the linear conductors of the conductor layer A and the conductor layer B. Furthermore, a configuration in which either one of the conductor layer A or the conductor layer B is not provided, or a configuration in which either the conductor layer A or the conductor layer B has a conductor arrangement other than the above-described configuration may be adopted. Even in the case where the stacked state of the conductor layer A and the conductor layer B is not the light-shielding structure, the voltage drop and the inductive noise can be improved.

Second Configuration Example of Three-Power Supply

FIGS. 222 and 223 illustrate a second configuration example of the three-power supply.

In both the coordinate systems in FIGS. 222 and 223, the horizontal direction is the X axis, the vertical direction is the Y axis, and the direction perpendicular to the XY plane is the Z axis.

A of FIG. 222 is a plan view of the conductor layer A, and B of FIG. 222 is a plan view of the conductor layer B. Note that FIG. 222 may be considered as the entire region of each conductor layer or may be considered as a partial region.

In the above-described first configuration example and its modifications, the repeating directions of the linear conductors of the conductor layer A and the conductor layer B are the same X direction, whereas in the second configuration example, the repeating direction of the linear conductor of the conductor layer A and the repeating direction of the linear conductor of the conductor layer B are orthogonal to each other in the X direction and the Y direction.

Since the conductor layer A in A in FIG. 222 is the same as the conductor layer A of the first configuration example illustrated in A in FIG. 212, description thereof will be omitted. The repeating direction of the linear conductors 2101 to 2103 long in the Y direction of the conductor layer A is the X direction.

Meanwhile, the repeating direction of the linear conductor of the conductor layer B in B in FIG. 222 is the Y direction orthogonal to the X direction that is the repeating direction of the conductor layer A.

Specifically, the conductor layer B is configured by arranging three linear conductors 2191 to 2193, which are long in the X direction, in the Y direction in a predetermined order, and periodically arranging the three linear conductors 2191 to 2193 in the Y direction.

The linear conductor 2191 is wiring (Vdd wiring) connected to the first power supply Vdd. The linear conductor 2192 is wiring (Vss1 wiring) connected to the second power supply Vss1. The linear conductor 2193 is wiring (Vss2 wiring) connected to the third power supply Vss2.

Therefore, in B of FIG. 222, the three linear conductors 2191 to 2193 are arranged in the positive direction of the Y-axis in the order of the Vdd wiring, Vss2 wiring, and Vss1 wiring, but the order of arranging the three linear conductors 2191 to 2193 is not limited to this example and can be any order.

The linear conductor 2191 has a conductor width WYBD in the Y direction, the linear conductor 2192 has a conductor width WYBS1 in the Y direction, and the linear conductor 2193 has a conductor width WYBS2 in the Y direction. The conductor width WYBD of the linear conductor 2191, the conductor width WYBS1 of the linear conductor 2192, and the conductor width WYBS2 of the linear conductor 2193 are, for example, the same (the conductor width WYBD=the conductor width WYBS1=the conductor width WYBS2). A gap with the gap width GYB is formed between two adjacent linear conductors of the linear conductors 2191 to 2193.

Then, the linear conductor 2191 is periodically arranged in the Y direction with a conductor period FYBD. The linear conductor 2192 is periodically arranged in the Y direction with a conductor period FYBS1, and the linear conductor 2193 is periodically arranged in the Y direction with a conductor period FYBS2. The conductor period FYBD, the conductor period FYBS1, and the conductor period FYBS2 are, for example, the same (the conductor period FYBD=the conductor period FYBS1=the conductor period FYBS2).

Therefore, in a rectangular region within a predetermined range of the conductor layer B, the sum of the conductor widths WYBD in the Y direction of the linear conductors 2191 connected to the first power supply Vdd, the sum of the conductor widths WYBS1 in the Y direction of the linear conductors 2192 connected to the second power supply Vss1, and the sum of the conductor widths WYBS2 in the Y direction of the linear conductors 2193 connected to the third power supply Vss2 are the same.

Furthermore, in a rectangular region within a predetermined range of the conductor layer B, the conductive area of the linear conductor 2191 connected to the first power supply Vdd, the conductive area of the linear conductor 2192 connected to the second power supply Vss1, and the conductive area of the linear conductor 2193 connected to the third power supply Vss2 are the same.

FIG. 223 is a plan view illustrating a stacked state of the conductor layer A in A in FIG. 222 and the conductor layer B in B in FIG. 222.

As illustrated in FIG. 223, the stacked layer of the conductor layer A and the conductor layer B by the second configuration example, that is, the stacked layer of the conductor layer A having a periodic arrangement of the linear conductors 2101 to 2103 long in the Y direction and the conductor layer B having a periodic arrangement of the linear conductors 2191 to 2193 long in the X direction cannot realize a perfect light-shielding structure but can have a certain degree of light-shielding property.

The linear conductors connected to the same power supply of the conductor layers A and B may be electrically connected via a conductor via extending in the Z direction or the like in a predetermined partial region where the positions overlap. From the viewpoint of voltage drop, it is desirable, but not limited to, that the linear conductors connected to the same power supply be electrically connected to each other.

A of FIG. 224 is a plan view illustrating a stacked state of only the linear conductor 2101 and the linear conductor 2191 as the Vdd conductors of the conductor layer A and the conductor layer B.

B of FIG. 224 is a plan view illustrating a stacked state of only the linear conductor 2102 and the linear conductor 2192 as the Vss1 conductors of the conductor layer A and the conductor layer B.

FIG. 225 is a plan view illustrating a stacked state of only the linear conductor 2103 and the linear conductor 2193 as the Vss2 conductors of the conductor layer A and the conductor layer B.

In the case of electrically connecting the linear conductors connected to the same power supply of the conductor layers A and B via a conductor via in the Z direction or the like, the two layers of the conductor layers A and B can implement a reticulated structure of the three-power supply of the Vdd conductor, the Vss1 conductor, and the Vss2 conductor, as illustrated in FIGS. 224 and 225. For example, the case of implementing the three-power supply using the conductor layers of the reticulated conductors as in the fourth configuration example of the conductor layers A and B illustrated in FIG. 25 requires the three layers of conductor layers. Therefore, according to the second configuration example of the three-power supply, the degree of freedom of wiring layout can be increased with a small number of stacked layers.

By implementing the reticulated structure of the three-power supply with the two layers of the conductor layer A and the conductor layer B, the current is easily diffused in the X direction, so that the inductive noise can be improved. Furthermore, the conductor resistance seen from a pad end can be reduced depending on a pad arrangement, so that the voltage drop can be improved.

According to the second configuration example of the three-power supply, comparing the linear conductor 2101 and the linear conductor 2191 connected to the same first power supply Vdd in the conductor layer A and the conductor layer B, the conductor width WXAD and the conductor width WYBD are different. However, the conductor width WXAD and the conductor width WYBD may be configured to be the same. Similarly, the conductor period FXAD and the conductor period FYBD are different, but the conductor period FXAD and the conductor period FYBD may be configured to be the same.

First Modification of Second Configuration Example of Three-Power Supply

FIG. 226 illustrates a first modification of the second configuration example of the three-power supply.

In the coordinate system in FIG. 226, the horizontal direction is the X axis, the vertical direction is the Y axis, and the direction perpendicular to the XY plane is the Z axis.

A of FIG. 226 is a plan view of the conductor layer A, and B of FIG. 226 is a plan view of the conductor layer B. Note that FIG. 226 may be considered as the entire region of each conductor layer or may be considered as a partial region. In the first modification of the second configuration example, the plan view illustrating a stacked state of the conductor layer A and the conductor layer B is omitted.

The conductor layer A in A in FIG. 226 is the same as the conductor layer A of the second modification of the first configuration example illustrated in A in FIG. 216. In other words, in the conductor layer A of the second configuration example illustrated in A in FIG. 222, the Vdd conductor, the Vss1 conductor, and the Vss2 conductor have the same conductor width, whereas in the conductor layer A of the first modification of FIG. 226, the Vdd conductor and the Vss1 conductor have the same conductor width, and the conductor width of the Vss2 conductor is smaller than the conductor width of the Vdd conductor and the Vss1 conductor (the conductor width WXAD=the conductor width WXAS1>the conductor width WXAS2). Thereby, in the first modification, the conductor period FXAD, the conductor period FXAS1, and the conductor period FXAS2 in the X direction are smaller than those in the second configuration example.

Since the conductor layer B in B in FIG. 226 is the same as the conductor layer B of the second configuration example illustrated in B in FIG. 222, description thereof will be omitted.

Second Modification of Second Configuration Example of Three-Power Supply

FIG. 227 illustrates a second modification of the second configuration example of the three-power supply.

In the coordinate system in FIG. 227, the horizontal direction is the X axis, the vertical direction is the Y axis, and the direction perpendicular to the XY plane is the Z axis.

A of FIG. 227 is a plan view of the conductor layer A, and B of FIG. 227 is a plan view of the conductor layer B. Note that FIG. 227 may be considered as the entire region of each conductor layer or may be considered as a partial region. In the second modification of the second configuration example, the plan view illustrating a stacked state of the conductor layer A and the conductor layer B is omitted.

The conductor layer A in A in FIG. 227 is the same as the conductor layer A of the first modification of the second configuration example illustrated in A in FIG. 226. That is, the conductor layer A has the configuration in which the conductor width of the Vss2 conductor is set to be smaller than the conductor width of the Vdd conductor and the Vss1 conductor formed with the same conductor width (the conductor width WXAD=the conductor width WXAS1>the conductor width WXAS2).

The conductor layer B in B in FIG. 227 has a configuration in which the conductor width of the Vss2 conductor connected to the third power supply Vss2 is smaller than the conductor layer B of the first modification of the second configuration example illustrated in B in FIG. 226.

Specifically, the conductor layer B is configured by arranging three linear conductors 2201 to 2203, which are long in the X direction, in the Y direction in a predetermined order, and periodically arranging the three linear conductors 2201 to 2203 in the Y direction.

The linear conductor 2201 is wiring (Vdd wiring) connected to the first power supply Vdd. The linear conductor 2202 is wiring (Vss1 wiring) connected to the second power supply Vss1. The linear conductor 2203 is wiring (Vss2 wiring) connected to the third power supply Vss2.

The linear conductor 2201 has a conductor width WYBD in the Y direction, the linear conductor 2202 has a conductor width WYBS1 in the Y direction, and the linear conductor 2203 has a conductor width WYBS2 in the Y direction. The conductor width WYBD of the linear conductor 2201 and the conductor width WYBS1 of the linear conductor 2202 are, for example, the same, and the conductor width WYBS2 of the linear conductor 2203 is smaller than the conductor width WYBD of the linear conductor 2201 and the conductor width WYBS1 of the linear conductor 2202 (the conductor width WYBD=the conductor width WYBS1>the conductor width WYBS2). A gap with the gap width GYB is formed between two adjacent linear conductors of the linear conductors 2201 to 2203.

Then, the linear conductor 2201 is periodically arranged in the Y direction with a conductor period FYBD. The linear conductor 2202 is periodically arranged in the Y direction with a conductor period FYBS1, and the linear conductor 2203 is periodically arranged in the Y direction with a conductor period FYBS2. The conductor period FYBD, the conductor period FYBS1, and the conductor period FYBS2 are, for example, the same (the conductor period FYBD=the conductor period FYBS1=the conductor period FYBS2). In the second modification, the conductor period FYBD, the conductor period FYBS1, and the conductor period FYBS2 in the Y direction are smaller than those of the second configuration example illustrated in FIG. 222.

The configuration in which the conductor width WXBS2 of the Vss2 conductor of the conductor layer A is made smaller and the conductor periods (the conductor period FXAD, the conductor period FXAS1, and the conductor period FXAS2) in the X direction are made smaller than those of the second configuration example, as in the first modification illustrated in FIG. 226, or the configuration in which not only the conductor layer A but also the conductor width WYBS2 of the Vss2 conductor of the conductor layer B is made small, and both the conductor period in the X direction of the conductor layer A and the conductor periods (the conductor period FYBD, the conductor period FYBS1, and the conductor period FYBS2) in the Y direction of the conductor layer B are made small, as in the second modification illustrated in FIG. 227, can be adopted. By making the conductor period small, the inductive noise can be improved and the voltage drop can also be improved.

In the first modification and the second modification, the conductor width of only the Vss2 conductor is made smaller than that of the Vdd conductor in both the conductor layer A and the conductor layer B, but the conductor widths of both the Vss1 conductor and the Vss2 conductor may be made smaller than that of the Vdd conductor. In that case, the conductor widths of the Vss1 conductor and the Vss2 conductor may be the same or different.

To make current distributions of the Vdd conductor, the Vss1 conductor, and the Vss2 conductor the same between the conductor layer A and the conductor layer B, proportions of the conductor widths of the Vdd conductor, the Vss1 conductor, and the Vss2 conductor are desirably made the same between the conductor layer A and the conductor layer B but the proportions may be made different. For example, a larger discrepancy in the proportions of the conductor widths between the conductor layer A and the conductor layer B can be tolerated as the sheet resistance of the conductor layer B is larger than that of the conductor layer A, such as two times or more, three times or more, four times or more, or the like.

Third Configuration Example of Three-Power Supply

FIGS. 228 and 229 illustrate a third configuration example of the three-power supply.

In both the coordinate systems in FIGS. 228 and 229, the horizontal direction is the X axis, the vertical direction is the Y axis, and the direction perpendicular to the XY plane is the Z axis.

A of FIG. 228 is a plan view of the conductor layer A, and B of FIG. 228 is a plan view of the conductor layer B. Note that FIG. 228 may be considered as the entire region of each conductor layer or may be considered as a partial region.

Regarding the conductor layer A, the first configuration example and the second configuration example have used the linear conductors long in the Y direction connected to the same power supply at the same X position even if the Y positions are different, whereas the conductor A in A in FIG. 228 is different in that the rectangular Vdd conductor, the rectangular Vss1 conductor, and the rectangular Vss2 conductor are repeatedly arranged with a predetermined period in the Y direction.

More specifically, a rectangular conductor 2211 connected to the first power supply Vdd (hereinafter referred to as a rectangular Vdd conductor 2211), a rectangle conductor 2212 connected to the second power supply Vss1 (hereinafter referred to as a rectangular Vss1 conductor 2212), and a rectangular conductor 2213 connected to the third power supply Vss2 (hereinafter referred to as a rectangular Vss2 conductor 2213) are periodically arranged in the positive direction of the Y axis in that order at a predetermined X position of the conductor layer A. Note that the order of arranging the three rectangular conductors 2211 to 2213 is not limited to the example, and may be any order. The rectangular Vdd conductor 2211 has the conductor width WXAD in the X direction and a conductor width WYAD in the Y direction. The rectangular Vss1 conductor 2212 has the conductor width WXAS1 in the X direction and a conductor width WYAS1 in the Y direction. The rectangular Vss2 conductor 2213 has the conductor width WXAS2 in the X direction and a conductor width WYAS2 in the Y direction. A gap with the gap width GXA in the X direction and the gap width GYB in the Y direction is formed between adjacent rectangular conductors.

A period in the X direction (rectangular conductor period) in which the rectangular conductor, that is one of the rectangular Vdd conductor, the rectangular Vss1 conductor, or the rectangular Vss2 conductor, is arranged, is the conductor width in the X direction+the gap width in the X direction, and a period in the Y direction (rectangular conductor period) is the conductor width in the Y direction+ the gap width in the Y direction.

Furthermore, in the conductor layer A, adjacent three columns each having a set of the rectangular Vdd conductor 2211, the rectangular Vss1 conductor 2212, and the rectangular Vss2 conductor 2213 periodically arranged in the Y direction are formed into one group, and the Y-direction positions of the rectangular conductors are shifted in group units so that regarding gap positions of groups adjacent in the X direction, the gap position of one group comes to a middle in the Y direction of the gap positions of the other adjacent group.

Furthermore, focusing on the arrangement of the rectangular Vdd conductors 2211, the rectangular Vss1 conductors 2212, and the rectangular Vss2 conductors 2213 of the three columns forming one group, the Y-direction positions of the rectangular Vdd conductors, the rectangular Vss1 conductors, and the rectangular Vss2 conductors are shifted so that the rectangular conductors connected to the same power supply are not arranged at the same Y-direction position of the columns. Meanwhile, looking at the arrangement of the rectangular conductors in the three columns for each connected power supply, for example, the rectangular Vdd conductor 2211 is arranged at positions of the left column, center column, right column, left column, center column, right column, and the like for every time the rectangular conductor is periodically shifted in the positive direction of the Y axis. The same applies to the arrangement of the rectangular Vss1 conductor 2212 and the rectangular Vss2 conductor 2213.

With the arrangement of shifting the positions of the rectangular Vdd conductor, the rectangular Vss1 conductor, and the rectangular Vss2 conductor for each column, the magnetic field is distributed, so that the inductive noise can be reduced. Furthermore, by alternately arranging the Vdd conductor (rectangular Vdd conductor) and the Vss conductors (rectangular Vss1 conductor and rectangular Vss2 conductor) in one column, the capacitive noise can be reduced. Moreover, by grouping the three columns into one group and shifting the Y-direction positions of the rectangular conductors in group units, the magnetic field is further distributed, and the inductive noise can be further reduced.

Meanwhile, since the conductor layer B in B in FIG. 228 is the same as the conductor layer B of the second configuration example illustrated in B in FIG. 222, description thereof will be omitted.

FIG. 229 is a plan view illustrating a stacked state of the conductor layer A in A in FIG. 228 and the conductor layer B in B in FIG. 228.

As illustrated in FIG. 229, the stacked layer of the conductor layer A and the conductor layer B cannot implement a perfect light-shielding structure but can have a certain degree of light-shielding property, the conductor layer A having three columns in which the Y-direction positions of the rectangular Vdd conductor, the rectangular Vss1 conductor, and the rectangular Vss2 conductor are shifted for each column as one group, and having the Y-direction positions of the rectangular conductors shifted in group units, and the conductor layer B having the periodic arrangement of the linear conductors 2191 to 2193 long in the X direction.

The linear conductors connected to the same power supply of the conductor layers A and B may be electrically connected via a conductor via extending in the Z direction or the like in a predetermined partial region where the positions overlap. From the viewpoint of voltage drop, it is desirable, but not limited to, that the linear conductors connected to the same power supply be electrically connected to each other.

A of FIG. 230 is a plan view illustrating a stacked state of only the rectangular Vdd conductor 2211 and the linear conductor 2191 as the Vdd conductors of the conductor layer A and the conductor layer B.

B of FIG. 230 is a plan view illustrating a stacked state of only the rectangular Vss1 conductor 2212 and the linear conductor 2192 as the Vss1 conductors of the conductor layer A and the conductor layer B.

FIG. 231 is a plan view illustrating a stacked state of only the rectangular Vss2 conductor 2213 and the linear conductor 2193 as the Vss2 conductors of the conductor layer A and the conductor layer B.

According to the third configuration example of the three-power supply, in the case of electrically connecting the conductors connected to the same power supply of the conductor layers A and B by the configuration of shifting the Y-directional positions of the rectangular conductors in group units, the pseudo reticulated structure can be configured by the two layers of the conductor layers A and B, as illustrated in FIGS. 230 and 231. Therefore, the current can flow in both the X and Y directions, and the degree of freedom of wiring layout can be enhanced. In the case where the conductor layer B is configured by the periodic arrangement of the linear conductors in the X direction or the Y direction, if the periodic shift of the conductor layer A in the Y direction in group units is eliminated, it becomes difficult to cause the current to flow in both the X and Y directions by the two layers of the conductor layer A and the conductor layer B. However, when the conductor layer A is provided with the periodic shift in the Y direction in group units, a pseudo reticulated structure can be implemented, and the degree of freedom of wiring layout can be increased. For example, in a case where the conductor layer B is a diagonal conductor or a stepped conductor extending in an oblique direction in the X direction or the Y direction, the conductor layer A may not be provided with the periodic shift in the Y direction in group units. Of course, the conductor layer A may be provided with the periodic shift in the Y direction in group units.

By implementing the pseudo-reticulated structure of the three-power supply with the two layers of the conductor layer A and the conductor layer B, the current is easily diffused in the X direction, so that the inductive noise can be improved. Furthermore, the conductor resistance seen from a pad end can be reduced depending on a pad arrangement, so that the voltage drop can be improved.

First Modification of Third Configuration Example of Three-Power Supply

FIGS. 232 and 233 illustrate a first modification of the third configuration example of the three-power supply.

In both the coordinate systems in FIGS. 232 and 233, the horizontal direction is the X axis, the vertical direction is the Y axis, and the direction perpendicular to the XY plane is the Z axis.

A of FIG. 232 is a plan view of the conductor layer A, and B of FIG. 232 is a plan view of the conductor layer B. Note that FIG. 232 may be considered as the entire region of each conductor layer or may be considered as a partial region.

Since the conductor layer A in A in FIG. 232 is the same as the conductor layer A of the third configuration example illustrated in A in FIG. 228, description thereof will be omitted.

The conductor layer B in B in FIG. 232 is different from the conductor layer B of the third configuration example illustrated in B in FIG. 228 in that the conductor widths of the Vdd conductor, the Vss1 conductor, and the Vss2 conductor are smaller.

Specifically, the conductor layer B is configured by arranging three linear conductors 2221 to 2223, which are long in the X direction, in the Y direction in a predetermined order, and periodically arranging the three linear conductors 2221 to 2223 in the Y direction.

The linear conductor 2221 is wiring (Vdd wiring) connected to the first power supply Vdd. The linear conductor 2222 is wiring (Vss1 wiring) connected to the second power supply Vss1. The linear conductor 2223 is wiring (Vss2 wiring) connected to the third power supply Vss2.

Therefore, in B in FIG. 232, the three linear conductors 2221 to 2223 are arranged in the positive direction of the Y axis in the order of the Vdd wiring, Vss2 wiring, and Vss1 wiring, but the order of arranging the three linear conductors 2221 to 2223 is not limited to this example and can be any order.

The linear conductor 2221 has a conductor width WYBD in the Y direction, the linear conductor 2222 has a conductor width WYBS1 in the Y direction, and the linear conductor 2223 has a conductor width WYBS2 in the Y direction. The conductor width WYBD of the linear conductor 2221, the conductor width WYBS1 of the linear conductor 2222, and the conductor width WYBS2 of the linear conductor 2223 are, for example, the same (the conductor width WYBD=the conductor width WYBS1=the conductor width WYBS2). A gap with the gap width GYB is formed between two adjacent linear conductors of the linear conductors 2221 to 2223.

The conductor width WYBD of the linear conductor 2221, the conductor width WYBS1 of the linear conductor 2222, and the conductor width WYBS2 of the linear conductor 2223 are smaller than the conductor width WYBD of the linear conductor 2191, the conductor width WYBS1 of the linear conductor 2192, and the conductor width WYBS2 of the linear conductor 2193 in the third configuration example illustrated in B in FIG. 228. For example, the conductor width WYBD, the conductor width WYBS1, and the conductor width WYBS2 have the same width as the gap width GYB in B in FIG. 232.

The linear conductor 2221 is periodically arranged in the Y direction with a conductor period FYBD. The linear conductor 2222 is periodically arranged in the Y direction with a conductor period FYBS1, and the linear conductor 2223 is periodically arranged in the Y direction with a conductor period FYBS2. The conductor period FYBD, the conductor period FYBS1, and the conductor period FYBS2 are, for example, the same (the conductor period FYBD=the conductor period FYBS1=the conductor period FYBS2).

Therefore, in a rectangular region within a predetermined range of the conductor layer B, the sum of the conductor widths WYBD in the Y direction of the linear conductors 2221 connected to the first power supply Vdd, the sum of the conductor widths WYBS1 in the Y direction of the linear conductors 2222 connected to the second power supply Vss1, and the sum of the conductor widths WYBS2 in the Y direction of the linear conductors 2223 connected to the third power supply Vss2 are the same.

Furthermore, in a rectangular region within a predetermined range of the conductor layer B, the conductive area of the linear conductor 2221 connected to the first power supply Vdd, the conductive area of the linear conductor 2222 connected to the second power supply Vss1, and the conductive area of the linear conductor 2223 connected to the third power supply Vss2 are the same.

FIG. 233 is a plan view illustrating a stacked state of the conductor layer A in A in FIG. 232 and the conductor layer B in B in FIG. 232.

As illustrated in FIG. 233, the stacked layer of the conductor layer A and the conductor layer B cannot implement a perfect light-shielding structure but can have a certain degree of light-shielding property, the conductor layer A having the three columns in which the Y-direction positions of the rectangular Vdd conductor, the rectangular Vss1 conductor, and the rectangular Vss2 conductor are shifted for each column as one group, and having the Y-direction positions of the rectangular conductors shifted in group units, and the conductor layer B having the periodic arrangement of the linear conductors 2221 to 2223 long in the X direction.

The linear conductors connected to the same power supply of the conductor layers A and B may be electrically connected via a conductor via extending in the Z direction or the like in a predetermined partial region where the positions overlap. From the viewpoint of voltage drop, it is desirable, but not limited to, that the linear conductors connected to the same power supply be electrically connected to each other.

As in the first modification of the third configuration example, the conductor widths of the linear conductors of the conductor layer B may be made extremely small so that the conductor widths of the conductor layer A and the conductor layer B become different. In this case, the conductor period of the conductor layer B is also smaller than the conductor period of the conductor layer A. Since the area of an Aggressor loop that generates a magnetic field becomes smaller as the conductor period becomes shorter, the inductive noise can be improved.

Second Modification of Third Configuration Example of Three-Power Supply

FIG. 234 illustrates a second modification of the third configuration example of the three-power supply.

In the coordinate system in FIG. 234, the horizontal direction is the X axis, the vertical direction is the Y axis, and the direction perpendicular to the XY plane is the Z axis.

A of FIG. 234 is a plan view of the conductor layer A, and B of FIG. 234 is a plan view of the conductor layer B. Note that FIG. 234 may be considered as the entire region of each conductor layer or may be considered as a partial region. In the third modification of the second configuration example, the plan view illustrating a stacked state of the conductor layer A and the conductor layer B is omitted.

Comparing the conductor layer A in A in FIG. 234 with the conductor layer A of the third configuration example illustrated in A in FIG. 228, both the conductor layers A satisfy the relationship of "(the conductor width WYAD+the gap width GYA)=(the conductor width WYAS1+the gap width GYA)=(the conductor width WYAS2+the gap width GYA)=(5×the conductor period FYBD)=(5×the conductor period FYBS1)=(5×the conductor period FYBS2)", but the periodic shift in the Y direction for each group is different.

That is, in the conductor layer A of the third configuration example illustrated in A in FIG. 228, the group configured by the adjacent three columns is shifted from another group adjacent on the positive side of the X axis by ½ of the rectangular conductor period in the Y direction so that the gap position comes to the middle in the Y direction of the gap positions of the adjacent group.

In contrast, in the conductor layer A illustrated in A in FIG. 234, the gap position of another group adjacent on the positive side of the X axis is shifted by twice the conductor period FYBD (≠½ of the rectangular conductor period in the Y direction) in the positive direction of the Y axis with respect to a predetermined group configured by adjacent three columns. The another group adjacent on the positive side of the X axis is regularly shifted in the positive direction of the Y axis by twice the conductor period FYBD (≠½ of the rectangular conductor period in the Y direction) with respect to the predetermined group that is a reference group. As described above, in the case where the relationship of "(the conductor width WYAD+the gap width GYA)=(the conductor width WYAS1+the gap width GYA)=(the conductor width WYAS2+the gap width GYA)=(an integer N1×the conductor period FYBD)=(an integer N1×the conductor period FYBS1)=(an integer N1×the conductor period FYBS2)" is satisfied and the amount of shift in the positive direction of the Y axis is "an integer N2×the conductor period FYBD", the number of linear conductors 2221 connected to the rectangular conductor 2211, the number of linear conductors 2222 connected to the rectangular conductor 2212, and the number of linear conductors 2223 connected to the rectangular conductor 2213 can be made the same in a rectangular region in a predetermined range. In other words, in a rectangular region within a predetermined range, the sum of the conductive areas of the linear conductors 2221 connected to the rectangular conductor 2211, the sum of the conductive areas of the linear conductors 2222 connected to the rectangular conductor 2212, and the sum of the conductive areas of the linear conductors 2223 connected to the rectangular conductor 2213 can be made the same. In such a case, the current distributions of the Vdd conductor, the Vss1 conductor, and the Vss2 conductor can be brought close to the same current distribution. Therefore, the inductive noise can be improved. Note that, to cause the current to flow in both the X and Y directions without using diagonal conductors or stepped conductors, the condition of "(the conductor width WYAD+the gap width GYA)=(the conductor width WYAS1+the gap width GYA)=(the conductor width WYAS2+the gap width GYA)>(the conductor period FYBD=the conductor period FYBS1=the conductor period FYBS2)" needs to be satisfied. That is, "the integer N1>1" is desirable, but to cause the current to flow in both the X and Y directions, a condition of "the integer N1>the integer N2≥1" needs to be satisfied. Note that these relationships need not be satisfied as long as an acceptable level of the inductive noise is satisfied.

Since the conductor layer B in B in FIG. 234 is the same as the conductor layer B of the first modification of the third configuration example illustrated in B in FIG. 232, description thereof will be omitted.

Third Modification of Third Configuration Example of Three-Power Supply

FIG. 235 illustrates a third modification of the third configuration example of the three-power supply.

In the coordinate system in FIG. 235, the horizontal direction is the X axis, the vertical direction is the Y axis, and the direction perpendicular to the XY plane is the Z axis.

A of FIG. 235 is a plan view of the conductor layer A, and B of FIG. 235 is a plan view of the conductor layer B. Note that FIG. 235 may be considered as the entire region of each conductor layer or may be considered as a partial region. In the third modification of the third configuration example, the plan view illustrating a stacked state of the conductor layer A and the conductor layer B is omitted.

The conductor layer A in A in FIG. 235 is different from the conductor layer A of the third configuration example illustrated in A in FIG. 228 in that the periodic shift in the Y direction in group units is different.

That is, in the conductor layer A of the third configuration example illustrated in A in FIG. 228, the group configured by the adjacent three columns is shifted from another group adjacent on the positive side of the X axis by ½ of the rectangular conductor period in the Y direction so that the gap position comes to the middle in the Y direction of the gap positions of the adjacent group.

In contrast, in the conductor layer A illustrated in A in FIG. 235, the gap position of another group adjacent on the positive side of the X axis is shifted by twice the conductor period FYBD (≠½ of the rectangular conductor period in the Y direction) with respect to a predetermined group configured by adjacent three columns.

Note that, in the second modification illustrated in FIG. 234, the arrangement of shifting another group adjacent on the positive side of the X axis by twice the conductor period FYBD in the positive direction of the Y axis and the arrangement of shifting the another group by twice the conductor period FYBD in the negative direction of the Y axis are alternately arranged with respect to the predetermined reference group, whereas in the third modification in FIG. 235, another group adjacent on the positive side of the X axis is always shifted by twice the conductor period FYBD in the positive direction of the Y axis.

Since the conductor layer B in B in FIG. 235 is the same as the conductor layer B of the first modification of the third configuration example illustrated in B in FIG. 232, description thereof will be omitted.

As in the third modification and the fourth modification, the periodic shift in the Y direction in group units may be in the positive direction or the negative direction, or may be any combination of the positive direction and the negative direction. Although a plan view illustrating a stacked state of the conductor layer A and the conductor layer B is omitted, a pseudo-reticulated structure of the three-power supply can be implemented by the two layers of the conductor layer A and the conductor layer B, as in FIGS. 230 and 231, and the current is easily diffused in the X direction, so that the inductive noise can be improved. Furthermore, the degree of freedom of wiring layout can be increased. Moreover, the conductor resistance seen from a pad end can be reduced, so that the voltage drop can be improved, depending on the pad arrangement.

Fourth Modification and Fifth Modification of Third Configuration Example of Three-Power Supply FIG. 236 illustrates a fourth modification and a fifth modification of the third configuration example of the three-power supply.

In the coordinate system in FIG. 236, the horizontal direction is the X axis, the vertical direction is the Y axis, and the direction perpendicular to the XY plane is the Z axis.

Both A and B in FIG. 236 illustrate plan views of the conductor layer A. A of FIG. 236 is a plan view of the conductor layer A of the fourth modification of the third configuration example, and B of FIG. 236 is a plan view of the conductor layer A of the fifth modification of the third configuration example.

Although plan views of the conductor layer B are omitted, the conductor layer B is, for example, the conductor layer B of the third configuration example illustrated in B in FIG. 228 or the conductor layer B of the first modification of the third configuration example illustrated in B in FIG. 232. A plan view illustrating a stacked state of the conductor layer A and the conductor layer B is also omitted.

The conductor layer A of the fourth modification illustrated in A in FIG. 236 and the conductor layer A of the fifth modification illustrated in B in FIG. 236 are common to the conductor layer A of the third modification of the third configuration example illustrated in A in FIG. 235 in that three columns in each of which the Y-direction positions of the rectangular Vdd conductor, the rectangular Vss1 conductor, and the rectangular Vss2 conductor are shifted for each column are formed into a group, and the Y-direction positions of the rectangular conductors are shifted in group units.

Meanwhile, in the conductor layer A of the third modification of the third configuration example illustrated in A in FIG. 235, the conductor widths in the X direction of the rectangular Vdd conductor, the rectangular Vss1 conductor, and the rectangular Vss2 conductor are the same. In contrast, in the conductor layer A of the fourth modification in A in FIG. 236, the conductor width in the X direction of the rectangular Vss2 conductor is smaller than the conductor widths in the X direction of the rectangular Vdd conductor and the rectangular Vss1 conductor.

More specifically, a rectangular conductor 2251 (hereinafter referred to as a rectangular Vdd conductor 2251) connected to the first power supply Vdd has the conductor width WXAD in the X direction and the conductor width WYAD in the Y direction. A rectangular conductor 2252 (hereinafter referred to as a rectangular Vss1 conductor 2252) connected to the second power supply Vss1 has the conductor width WXAS1 in the X direction and the conductor width WYAS1 in the Y direction. A rectangular conductor 2253 (hereinafter referred to as a rectangular Vss2 conductor 2253) connected to the third power supply Vss2 has the conductor width WXAS2 in the X direction and the conductor width WYAS2 in the Y direction. Then, the conductor width WXAD in the X direction of the rectangular Vdd conductor 2251 is equal to the conductor width WXAS1 in the X direction of the rectangular Vss1 conductor 2252, and the conductor width WXAS2 in the X direction of the rectangular Vss2 conductor 2253 is smaller than the conductor width WXAD and the conductor width WXAS1.

Meanwhile, in the conductor layer A of the fifth modification in B in FIG. 236, the conductor widths in the X direction of both the rectangular Vss1 conductor and the rectangular Vss2 conductor are smaller than the conductor width in the X direction of the rectangular Vdd conductor.

More specifically, the conductor width WXAS1 in the X direction of the rectangular Vss1 conductor 2252 and the conductor width WXAS2 in the X direction of the rectangular Vss2 conductor 2253 are equal, and the conductor width WXAS1 and the conductor width WXAS2 are smaller than the conductor width WXAD in the X direction of the rectangular Vdd conductor 2251 (the conductor width WXAD>the conductor width WXAS1=the conductor width WXAS2).

As described above, the conductor widths in the X direction of the rectangular Vdd conductor, the rectangular Vss1 conductor, and the rectangular Vss2 conductor may be the same or different. Although not illustrated, the conductor width WXAS1 in the X direction of the rectangular Vss1 conductor 2252 may be smaller than the conductor width WXAD in the X direction of the rectangular Vdd conductor 2251, and the conductor width WXAS2 in the X direction of the rectangular Vss2 conductor 2253 may be smaller than the conductor width WXAS1 in the X direction of the rectangular Vss1 conductor 2252 (the conductor width WXAD>the conductor width WXAS1>the conductor width WXAS2).

When the conductor width of the Vss2 conductor becomes smaller, the Vdd conductor and the Vss1 conductor can be arranged densely, which leads to improvement of the voltage drop of the Vdd conductor and the Vss1 conductor when a comparison is performed on the assumption that the wiring regions have the same area. When the conductor widths of both the Vss1 conductor and the Vss2 conductor in the X direction become small, which leads to improvement of the voltage drop of the Vdd conductor when a comparison is performed on the assumption that the wiring regions have the same area. Furthermore, since the area of an Aggressor loop that generates a magnetic field becomes smaller as the conductor period becomes shorter, the inductive noise can be improved.

Fourth Configuration Example of Three-Power Supply

FIGS. 237 and 238 illustrate a fourth configuration example of the three-power supply.

In both the coordinate systems in FIGS. 237 and 238, the horizontal direction is the X axis, the vertical direction is the Y axis, and the direction perpendicular to the XY plane is the Z axis.

A of FIG. 237 is a plan view of the conductor layer A, and B of FIG. 237 is a plan view of the conductor layer B. Note that FIG. 237 may be considered as the entire region of each conductor layer or may be considered as a partial region.

The conductor layer A is common to the conductor layer A of the third configuration example illustrated in A in FIG. 228 in that the set of the rectangular Vdd conductor 2211, the rectangular Vss1 conductor 2212, and the rectangular Vss2 conductor 2213 is arrayed in the X direction and in the Y direction, but is different from the conductor layer A of the third configuration example in a rule of the array.

Specifically, the conductor layer A of the fourth configuration example is configured by periodically arranging in the X direction with the rectangular conductor period in the X direction, the column in which the set of the rectangular Vdd conductor 2211, the rectangular Vss1 conductor 2212, and the rectangular Vss2 conductor 2213 is periodically arranged in the Y direction. Comparing the gap positions between a predetermined column of the conductor layer A and another column adjacent on the positive side of the X axis, the gap position of the rectangular conductors is shifted by ½ of the rectangular conductor period in the Y direction so that the gap position of the rectangular conductors comes to the middle in the Y direction of the gap positions of the adjacent column. Thereby, the conductor layer A has a pseudo stepped structure in which the positions in the Y direction of the rectangular Vdd conductor 2211, the rectangular Vss1 conductor 2212, and the rectangular Vss2 conductor 2213 of each column are shifted by ½ of the rectangular conductor period in the Y direction on the positive side of the Y axis as the positions go to the positive side of the X axis. Note that the amount of shift of the rectangular conductor period in the Y direction is not necessarily ½ of the rectangular conductor period in the Y direction, and an integral multiple of the conductor period FYBD is desirable and the amount of shift can be designed to any value.

Meanwhile, since the conductor layer B in B in FIG. 237 is the same as the conductor layer B of the third configuration example illustrated in B in FIG. 228, description thereof will be omitted.

FIG. 238 is a plan view illustrating a stacked state of the conductor layer A in A in FIG. 237 and the conductor layer B in B in FIG. 237.

As illustrated in FIG. 238, the stacked layer of the conductor layer A and the conductor layer B cannot implement a perfect light-shielding structure but can have a certain degree of light-shielding property, the conductor layer A having a column shifted in a pseudo stepwise manner and periodically arranged in the positive direction of the X axis, the column having the set of the rectangular Vdd conductor 2211, the rectangular Vss1 conductor 2212, and the rectangular Vss2 conductor 2213 periodically arranged in the Y direction, and the conductor layer B having the periodic arrangement of the linear conductors 2191 to 2193 long in the X direction.

The linear conductors connected to the same power supply of the conductor layers A and B may be electrically connected via a conductor via extending in the Z direction or the like in a predetermined partial region where the positions overlap. From the viewpoint of voltage drop, it is desirable, but not limited to, that the linear conductors connected to the same power supply be electrically connected to each other.

A of FIG. 239 is a plan view illustrating a stacked state of only the rectangular Vdd conductor 2211 and the linear conductor 2191 as the Vdd conductors of the conductor layer A and the conductor layer B.

B of FIG. 239 is a plan view illustrating a stacked state of only the rectangular Vss1 conductor 2212 and the linear conductor 2192 as the Vss1 conductors of the conductor layer A and the conductor layer B.

FIG. 240 is a plan view illustrating a stacked state of only the rectangular Vss2 conductor 2213 and the linear conductor 2193 as the Vss2 conductors of the conductor layer A and the conductor layer B.

According to the fourth configuration example of the three-power supply, in the case of electrically connecting the conductors connected to the same power supply of the conductor layers A and B by a conductor via in the Z direction or the like by the configuration of shifting the Y-directional positions of the rectangular conductors in column units so that the Y-directional positions of the rectangular conductors connected to the power supplies form a stepped shape, the pseudo reticulated structure can be configured by the two layers of the conductor layers A and B, as illustrated in FIGS. 239 and 240. Therefore, the current can flow in both the X and Y directions, and the degree of freedom of wiring layout can be enhanced.

By implementing the pseudo-reticulated structure of the three-power supply with the two layers of the conductor layer A and the conductor layer B, the current is easily diffused in the X direction, so that the inductive noise can be improved. Furthermore, the conductor resistance seen from a pad end can be reduced depending on a pad arrangement, so that the voltage drop can be improved.

Fifth Configuration Example of Three-Power Supply

FIGS. 241 and 242 illustrate a fifth configuration example of the three-power supply.

In both the coordinate systems in FIGS. 241 and 242, the horizontal direction is the X axis, the vertical direction is the Y axis, and the direction perpendicular to the XY plane is the Z axis.

A of FIG. 241 is a plan view of the conductor layer A, and B of FIG. 241 is a plan view of the conductor layer B. Note that FIG. 241 may be considered as the entire region of each conductor layer or may be considered as a partial region.

The conductor layer A in A in FIG. 241 is configured such that a group of three columns is periodically arranged in the X direction. The three columns include one column of one linear conductor 2271 connected to the first power supply Vdd and two columns in which a rectangular conductor 2272 (hereinafter referred to as a rectangular Vss1 conductor 2272) connected to the second power supply Vss1 and a rectangular conductor 2273 (hereinafter referred to as a rectangular Vss2 conductor 2273) connected to the third power supply Vss2 are alternately arranged in the Y direction, which are adjacent to the linear conductor 2271 on both sides.

The linear conductor 2171 is arranged extending in the Y direction with the conductor width WXAD in the X direction. The rectangular Vss1 conductor 2272 has the conductor width WXAS1 in the X direction and the conductor width WYAS1 in the Y direction. The rectangular Vss2 conductor 2273 has the conductor width WXAS2 in the X direction and the conductor width WYAS2 in the Y direction. The conductor width WXAD, the conductor width WXAS1, and the conductor width WXAS2 in the X direction are, for example, the same (the conductor width WXAD=the conductor width WYAS1=the conductor width WYAS2). A gap with the gap width GXA in the X direction and the gap width GYB in the Y direction is formed between adjacent conductors.

Focusing on the arrangement of the rectangular Vss1 conductor 2272 and the rectangular Vss2 conductor 2273 arranged in the columns on both sides in the three columns forming one group, the rectangular Vss1 conductor 2272 and the rectangular Vss2 conductor 2273 are arranged on both sides of the linear conductor 2271 at the same Y position such that the rectangular Vss1 conductor 2272 is arranged at a position in one column and the rectangular Vss2 conductor 2273 is arranged at a position corresponding to the position in the other column. Furthermore, the gap positions in the Y direction of the two columns of the rectangular Vss1 conductor 2272 and the rectangular Vss2 conductor 2273 on both sides are the same.

Moreover, focusing on the arrangements of the rectangular Vss1 conductors 2272 and the rectangular Vss2 conductors 2273 of two groups adjacent in the X direction, the Y-direction positions of the rectangular Vss1 conductors 2272 and the rectangular Vss2 conductors 2273 of the adjacent two groups are shifted to each other by ½ of the rectangular conductor period in the Y direction.

Since the conductor layer B in B in FIG. 241 is the same as the conductor layer B of the third configuration example illustrated in B in FIG. 228, description thereof will be omitted.

FIG. 242 is a plan view illustrating a stacked state of the conductor layer A in A in FIG. 241 and the conductor layer B in B in FIG. 241.

As illustrated in FIG. 242, the stacked layer of the conductor layer A and the conductor layer B cannot implement a perfect light-shielding structure but can have a certain degree of light-shielding property, the conductor layer A having the group of three columns periodically arranged in the X direction, the three columns including one column of the linear conductor 2271 long in the Y direction, and the two columns in which the rectangular Vss1 conductor 2272 and the rectangular Vss2 conductor 2273 are alternately arranged, which are arranged on both sides of the linear conductor 2271, and the conductor layer B having the periodic arrangement in the Y direction of the linear conductors 2191 to 2193 long in the X direction.

The conductors of the conductor layers A and B connected to the same power supply may be electrically connected to each other via a conductor via in the Z direction or the like in a predetermined partial region where the positions overlap. From the viewpoint of voltage drop, it is desirable, but not limited to, that the conductor layers A and B connected to the same power supply be electrically connected to each other.

A of FIG. 243 is a plan view illustrating a stacked state of only the linear conductor 2271 and the linear conductor 2191 as the Vdd conductors of the conductor layer A and the conductor layer B.

B of FIG. 243 is a plan view illustrating a stacked state of only the rectangular Vss1 conductor 2272 and the linear conductor 2192 as the Vss1 conductors of the conductor layer A and the conductor layer B.

FIG. 244 is a plan view illustrating a stacked state of only the rectangular Vss2 conductor 2273 and the linear conductor 2193 as the Vss2 conductors of the conductor layer A and the conductor layer B.

According to the fifth configuration example of the three-power supply, in the case of electrically connecting the conductors connected to the same power supply of the conductor layers A and B, the reticulated structure can be configured by the two layers of the conductor layers A and B for the Vdd conductor, and the pseudo reticulated structure can be configured by the two layers of the conductor layers A and B for the Vss1 conductor and the Vss2 conductor, as illustrated in FIGS. 243 and 244. Therefore, the current can flow in both the X and Y directions, and the degree of freedom of wiring layout can be enhanced. The Vdd conductor, which is commonly used in the configuration where the second power supply Vss1 and the third power supply Vss2 are selected and switched, has the reticulated structure, and the Vss1 conductor and the Vss2 conductor have the pseudo-reticulated structure, whereby the commonly used Vdd conductor can have a smaller voltage drop than the Vss1 and Vss2 conductors. By improving the voltage drop of the Vdd conductor, which is a commonly used element, the voltage drop of the stacked conductor layer as a whole can be improved.

By implementing the pseudo-reticulated structure of the three-power supply with the two layers of the conductor layer A and the conductor layer B, the current is easily diffused in the X direction, so that the inductive noise can be improved. Furthermore, the conductor resistance seen from a pad end can be reduced depending on a pad arrangement, so that the voltage drop can be improved.

First Modification of Fifth Configuration Example of Three-Power Supply

FIGS. 245 and 246 illustrate a first modification of the fifth configuration example of the three-power supply.

In both the coordinate systems in FIGS. 245 and 246, the horizontal direction is the X axis, the vertical direction is the Y axis, and the direction perpendicular to the XY plane is the Z axis.

A of FIG. 245 is a plan view of the conductor layer A, and B of FIG. 245 is a plan view of the conductor layer B. Note that FIG. 245 may be considered as the entire region of each conductor layer or may be considered as a partial region.

The conductor layer A in A in FIG. 245 is common to the conductor layer A of the fifth configuration example illustrated in A in FIG. 241 in periodically arranging the group of three columns in the X direction, the three columns including one column of the linear conductor 2271 long in the Y direction and the two columns in which the rectangular Vss1 conductor 2272 and the rectangular Vss2 conductor 2273 are alternately arranged, which are arranged on both sides of the linear conductor 2271.

However, the arrangement of the two columns of the rectangular Vss1 conductor 2272 and the rectangular Vss2 conductor 2273 on both sides of the linear conductor 2271 long in the Y direction is different from the conductor layer A of the fifth configuration example illustrated in A in FIG. 241.

That is, in the conductor layer A of the fifth configuration example illustrated in A in FIG. 241, the gap positions in the Y direction of the rectangular Vss1 conductor 2272 and the rectangular Vss2 conductor 2273 arranged on both sides of the linear conductor 2271 long in the Y direction are the same.

Meanwhile, in the conductor layer A in A in FIG. 245, the gap positions in the Y direction of the rectangular Vss1 conductor 2272 and the rectangular Vss2 conductor 2273 arranged on both sides of the linear conductor 2271 long in the Y direction are different. Specifically, the gap position in the Y direction of the right column and the gap position in the Y direction of the left column are shifted by ½ of the rectangular conductor period in the Y direction. Note that the amount of shift of the rectangular conductor period in the Y direction is not necessarily ½ of the rectangular conductor period in the Y direction, and an integral multiple of the conductor period FYBD is desirable and the amount of shift can be designed to any value.

Furthermore, focusing on the arrangements of the rectangular Vss1 conductors 2272 and the rectangular Vss2 conductors 2273 of two groups adjacent in the X direction, where the linear conductor 2271 long in the Y direction and the two columns on both sides of the linear conductor 2271 are formed into one group, the arrangements of the rectangular Vss1 conductors 2272 and the rectangular Vss2 conductors 2273 of the adjacent two groups are opposite.

Since the conductor layer B in B in FIG. 245 is the same as the conductor layer B of the fifth configuration example illustrated in B in FIG. 241, description thereof will be omitted.

FIG. 246 is a plan view illustrating a stacked state of the conductor layer A in A in FIG. 245 and the conductor layer B in B in FIG. 245.

As illustrated in FIG. 246, the stacked layer of the conductor layer A and the conductor layer B cannot implement a perfect light-shielding structure but can have a certain degree of light-shielding property, the conductor layer A having the group of three columns periodically arranged in the X direction, the three columns including one column of the linear conductor 2271 long in the Y direction, and the two columns in which the rectangular Vss1 conductor 2272 and the rectangular Vss2 conductor 2273 are alternately arranged, which are arranged on both sides of the linear conductor 2271, and the conductor layer B having the periodic arrangement of the linear conductors 2191 to 2193 long in the X direction.

The conductors of the conductor layers A and B connected to the same power supply may be electrically connected to each other via a conductor via in the Z direction or the like in a predetermined partial region where the positions overlap. From the viewpoint of voltage drop, it is desirable, but not limited to, that the conductor layers A and B connected to the same power supply be electrically connected to each other.

Even in the first modification of the fifth configuration example, in the case of electrically connecting the conductors connected to the same power supply of the conductor layers A and B, the reticulated structure can be configured by the two layers of the conductor layers A and B for the Vdd conductor, and the pseudo reticulated structure can be configured by the two layers of the conductor layers A and B for the Vss1 conductor and the Vss2 conductor. Therefore, the current can flow in both the X and Y directions, and the degree of freedom of wiring layout can be enhanced. The Vdd conductor, which is commonly used in the configuration where the second power supply Vss1 and the third power supply Vss2 are selected and switched, has the reticulated structure, and the Vss1 conductor and the Vss2 conductor have the pseudo-reticulated structure, whereby the commonly used Vdd conductor can have a smaller voltage drop than the Vss1 and Vss2 conductors. By improving the voltage drop of the Vdd conductor, which is a commonly used element, the voltage drop of the stacked conductor layer as a whole can be improved.

By implementing the pseudo-reticulated structure of the three-power supply with the two layers of the conductor layer A and the conductor layer B, the current is easily diffused in the X direction, so that the inductive noise can be improved. Furthermore, the conductor resistance seen from a pad end can be reduced depending on a pad arrangement, so that the voltage drop can be improved.

Second Modification and Third Modification of Fifth Configuration Example of Three-Power Supply FIG. 247 illustrates a second modification and a third modification of the fifth configuration example of the three-power supply.

In the coordinate system in FIG. 247, the horizontal direction is the X axis, the vertical direction is the Y axis, and the direction perpendicular to the XY plane is the Z axis.

Both A and B in FIG. 247 illustrate plan views of the conductor layer A. A of FIG. 247 is a plan view of the conductor layer A of the second modification of the fifth configuration example, and B of FIG. 247 is a plan view of the conductor layer A of the third modification of the fifth configuration example.

Although a plan view of the conductor layer B is omitted, the conductor layer B is the same as the conductor layer B of the fifth configuration example illustrated in B in FIG. 241, for example. A plan view illustrating a stacked state of the conductor layer A and the conductor layer B is also omitted.

In the conductor layer A of the second modification in A in FIG. 247, the conductor widths in the X direction of both the rectangular Vss1 conductor and the rectangular Vss2 conductor are smaller than the conductor width in the X direction of the rectangular Vdd conductor.

That is, in the conductor layer A of the fifth configuration example illustrated in A in FIG. 241, the conductor width WXAD in the X direction of the linear conductor 2171, the conductor width WXAS1 in the X direction of the rectangular Vss1 conductor 2272, and the conductor width WXAS2 in the X direction of the rectangular Vss2 conductor 2273 are the same (the conductor width WXAD=the conductor width WYAS1=the conductor width WYAS2), In contrast, in the conductor layer A of the second modification in A in FIG. 247, the conductor width WXAS1 in the X direction of the rectangular Vss1 conductor 2272 and the conductor width WXAS2 in the X direction of the rectangular Vss2 conductor 2273 are equal, and the conductor width WXAS1 and the conductor width WXAS2 are smaller than the conductor width WXAD in the X direction of the linear conductor 2171 (the conductor width WXAD>the conductor width WXAS1=the conductor width WXAS2). Other configurations are similar to those of the conductor layer A of the fifth configuration example illustrated in A in FIG. 241.

Note that, in the conductor layer A in A in FIG. 247, the conductor width WXAS1 in the X direction of the rectangular Vss1 conductor 2272 and the conductor width WXAS2 in the X direction of the rectangular Vss2 conductor 2273 are the same but may be made different. That is, the conductor width WXAS1 in the X direction of the rectangular Vss1 conductor 2272 may be made smaller than the conductor width WXAD in the X direction of the linear conductor 2171, and the conductor width WXAS2 in the X direction of the rectangular Vss2 conductor 2273 may be made smaller than the conductor width WXAS1 in the X direction of the rectangular Vss1 conductor 2272 (the conductor width WXAD>the conductor width WXAS1>the conductor width WXAS2).

According to the second modification in A in FIG. 247, the Vss1 conductor and the Vss2 conductor can be densely arranged by reducing the conductor width in the X direction. Therefore, the inductive noise can be improved, and the voltage drop may be able to be improved by reducing the conductor period in the X direction. By making the commonly used Vdd conductor less likely to have a voltage drop, the voltage drop of both the combination of the Vdd conductor and the Vss1 conductor and the combination of the Vdd conductor and the Vss2 conductor may be able to be improved.

The reticulated structure can be configured by the two layers of the conductor layers A and B for the Vdd conductor, and the pseudo reticulated structure can be configured by the two layers of the conductor layers A and B for the Vss1 conductor and the Vss2 conductor. Therefore, the current can flow in both the X and Y directions, and the degree of freedom of wiring layout can be enhanced.

Meanwhile, the conductor layer A in B in FIG. 247 is configured such that a group of three columns is periodically arranged in the X direction. The three columns include one column of one linear conductor 2283 connected to the third power supply Vss2 and two columns in which a rectangular conductor 2281 (hereinafter referred to as a rectangular Vdd conductor 2281) connected to the first power supply Vdd connected to the first power supply Vdd and a rectangular conductor 2282 (hereinafter referred to as a rectangular Vss1 conductor 2282) connected to the second power supply Vss1 are alternately arranged in the Y direction, which are adjacent to the linear conductor 2283 on both sides.

Therefore, the conductor layer A of the third modification in B in FIG. 247 has a configuration in which the arrangement of the Vdd conductor, the Vss1 conductor, and the Vss2 conductor of the conductor layer A of the fifth configuration example illustrated in A in FIG. 241 is rearranged, where the middle column of the three columns forming one group is not the Vdd conductor but the Vss2 conductor, and the Vdd conductor and the Vss1 conductor are arranged on both sides of the Vss2 conductor. Since the Vdd conductor and the Vss1 conductor are alternately arranged in the Y direction, the capacitive noise can be canceled.

Furthermore, according to the third modification in B in FIG. 247, by implementing a pseudo-reticulated structure of three-power supply with the two layers of the conductor layer A and the conductor layer B, the current is easily diffused in the X direction, so that the inductive noise can be improved. Furthermore, the conductor resistance seen from a pad end can be reduced depending on a pad arrangement, so that the voltage drop can be improved.

Sixth Configuration Example of Three-Power Supply

Next, a configuration example in which a three-power supply is implemented using three wiring layers (wiring layers 165A to 165C) will be described.

FIG. 248 illustrates a sixth configuration example of the three-power supply.

In the coordinate system in FIG. 248, the horizontal direction is the X axis, the vertical direction is the Y axis, and the direction perpendicular to the XY plane is the Z axis.

A in FIG. 248 illustrates the conductor layer A (wiring layer 165A), B in FIG. 248 illustrates the conductor layer B (wiring layer 165B), and C in FIG. 248 illustrates the conductor layer C (wiring layer 165C).

Furthermore, D in FIG. 248 is a plan view of a stacked state of the conductor layer A and the conductor layer B, E in FIG. 248 is a plan view of a stacked state of the conductor layer A and the conductor layer C, and F in FIG. 248 is a plan view of a stacked state of the conductor layer B and the conductor layer C. Note that FIG. 248 may be considered as the entire region of each conductor layer or may be considered as a partial region.

The conductor layer A in A in FIG. 248 includes a reticulated conductor 2301. That is, the reticulated conductor 2301 has the conductor width WXA, the gap width GXA, and the conductor period FXA in the X direction, and the conductor width WYA, the gap width GYA, and the conductor period FYA in the Y direction. The reticulated conductor 2301 is a conductor having a shape in which basic patterns of the conductor period FXA and the conductor period FYA are repeatedly arranged on the same plane. The reticulated conductor 2301 is, for example, wiring (Vss1 wiring) connected to the second power supply Vss1.

The conductor layer B in B in FIG. 248 includes a reticulated conductor 2302. That is, the reticulated conductor 2302 has the conductor width WXB, the gap width GXB, and the conductor period FXB in the X direction, and the conductor width WYB, the gap width GYB, and the conductor period FYB in the Y direction. The reticulated conductor 2302 is a conductor having a shape in which basic patterns of the conductor period FXB and the conductor period FYB are repeatedly arranged on the same plane. The reticulated conductor 2302 is, for example, wiring (Vdd wiring) connected to the first power supply Vdd. The conductor periods of the reticulated conductor 2301 and the reticulated conductor 2302 are, for example, the same, and the conductor period FXA=the conductor period FXB, and the conductor period FYA=the conductor period FYB.

The conductor layer C in C in FIG. 248 includes a reticulated conductor 2303. That is, the reticulated conductor 2303 has the conductor width WXC, the gap width GXC, and the conductor period FXC in the X direction, and the conductor width WYC, the gap width GYC, and the conductor period FYC in the Y direction. The reticulated conductor 2303 is a conductor having a shape in which basic patterns of the conductor period FXC and the conductor period FYC are repeatedly arranged on the same plane. The reticulated conductor 2303 is, for example, wiring (Vss2 wiring) connected to the third power supply Vss2. The conductor periods of the reticulated conductor 2301 and the reticulated conductor 2303 are, for example, the same, and the conductor period FXB=the conductor period FXC, and the conductor period FYB=the conductor period FYC.

The conductor layers A to C in FIG. 248 are stacked in order of the conductor layers A, B, and C so that the conductor layer B is arranged in the center, for example. In this case, both the distance between the Vdd conductor and the Vss1 conductor and the distance between the Vdd conductor and the Vss2 conductor can be reduced, and the inductive noise can be improved. However, the conductor layer B does not necessarily have to be arranged in the middle.

An example is illustrated in which the shapes of the reticulated conductor 2301 that is the Vss1 conductor, the reticulated conductor 2302 that is the Vdd conductor, and the reticulated conductor 2303 that is the Vss2 conductor are completely matched, but the shapes may be different in other regions.

First Modification of Sixth Configuration Example of Three-Power Supply

FIGS. 249 to 253 illustrate first to fifth modifications of the sixth configuration example illustrated in FIG. 248.

In FIGS. 249 to 253, the arrangement of the conductor layer A (wiring layer 165A), the conductor layer B (wiring layer 165B), the conductor layer C (wiring layer 165C), the plan view of the stacked state of the conductor layer A and the conductor layer B, the plan view of the stacked state of the conductor layer A and the conductor layer C, and the plan view of the stacked state of the conductor layer B and the conductor layer C is similar to that in FIG. 248. This also similarly applies to the coordinate system.

FIG. 249 illustrates a first modification of the sixth configuration example of the three-power supply.

In the sixth configuration example illustrated in FIG. 248, the conductor layer A has been the Vss1 conductor connected to the second power supply Vss1 and the conductor layer C has been the Vss2 conductor connected to the third power supply Vss2, whereas in the first modification in FIG. 249, both the conductor layers A and C are the Vss conductors connected to the same power supply Vss (the second power supply Vss1 or the third power supply Vss2).

In the example of FIG. 249, the conductor layer A includes a reticulated conductor 2301*a* and the conductor layer C includes a reticulated conductor 2301*c*, and both the reticulated conductors 2301*a* and 2301*c* are the same as the reticulated conductor 2301 connected to the second power supply Vss1.

The conductor layer B in B in FIG. 249 includes the reticulated conductor 2302, as in the sixth configuration example illustrated in FIG. 248.

In the first modification of the sixth configuration example, the Vdd conductor of the conductor layer B is sandwiched between the two layers of Vss conductors, so that further improvement in the inductive noise can be expected, and further improvement in the voltage drop can be expected by using the three-layer stacked structure instead of a two-layer stacked structure. Note that It is favorable that the sheet resistance of the conductor layer B and the sheet resistance of the conductor layer A and the conductor layer B combined are substantially the same, but this is not the case.

Second Modification of Sixth Configuration Example of Three-Power Supply

FIG. 250 illustrates a second modification of the sixth configuration example of the three-power supply.

The conductor layer A in A in FIG. 250 includes the reticulated conductor 2301 connected to the second power supply Vss1 and a relay conductor 2304. The relay conductor 2304 is arranged in a gap region that is not the conductor of the reticulated conductor 2301 and is electrically insulated from the reticulated conductor 2301, and is electrically connected to, for example, the reticulated conductor 2302 of the conductor layer B and another conductor layer.

The conductor layer B in B in FIG. 250 includes the reticulated conductor 2302 connected to the first power supply Vdd, as in the sixth configuration example illustrated in FIG. 248.

The conductor layer C in C in FIG. 250 includes the reticulated conductor 2303 connected to the third power supply Vss2 and a relay conductor 2305. The relay conductor 2305 is arranged in a gap region that is not the conductor of the reticulated conductor 2303 and is electrically insulated from the reticulated conductor 2303, and is electrically connected to, for example, the reticulated conductor 2302 of the conductor layer B and another conductor layer.

In the example of FIG. 250, the planar shape of the relay conductor 2304 and the relay conductor 2305 is a rectangular shape having a predetermined conductor width having a gap inside, but the shape is not limited to the case and any shape is adopted as long as the shape can be formed inside the gap region.

Third Modification of Sixth Configuration Example of Three-Power Supply

FIG. 251 illustrates a third modification of the sixth configuration example of the three-power supply.

In the third modification of the sixth configuration example illustrated in FIG. 251, the conductor layer A and the conductor layer C are similarly configured to those in the second modification of the sixth configuration example, and only the conductor layer B has a different configuration from that in the second modification of the sixth configuration example.

Specifically, the conductor layer A in A in FIG. 251 includes the reticulated conductor 2301 connected to the second power supply Vss1 and the relay conductor 2304.

The conductor layer B in B in FIG. 251 is configured by a reticulated conductor 2306 having a shape in which a column having a rectangular conductor arranged in the Y direction with a predetermined period with a gap, and a column having a rectangular conductor having a predetermined conductor width with a gap inside arranged in the Y direction with a predetermined period with a gap are alternately arranged in the X direction. The reticulated conductor 2306 is, for example, wiring (Vdd wiring) connected to the first power supply Vdd.

The conductor layer C in C in FIG. 251 includes the reticulated conductor 2303 connected to the third power supply Vss2 and the relay conductor 2305.

Fourth Modification of Sixth Configuration Example of Three-Power Supply

FIG. 252 illustrates a fourth modification of the sixth configuration example of the three-power supply.

The fourth modification of the sixth configuration example illustrated in FIG. 252 is a configuration in which the relay conductors of the conductor layer A and the conductor layer C of the second modification of the sixth configuration example illustrated in FIG. 250 are replaced.

Specifically, the conductor layer A in A in FIG. 252 includes the reticulated conductor 2301 connected to the second power supply Vss1 and a relay conductor 2311. The relay conductor 2304 of the conductor layer A of the second modification illustrated in FIG. 250 has been a rectangular conductor having a predetermined conductor width having a gap inside. In contrast, the relay conductor 2311 of the fourth modification is rectangular conductors distributed in four places in the gap region of the reticulated conductor 2301.

The conductor layer B in B in FIG. 252 includes the reticulated conductor 2302 connected to the first power supply Vdd, as in the sixth configuration example illustrated in FIG. 248.

The conductor layer C in C in FIG. 252 includes the reticulated conductor 2303 connected to the third power supply Vss2 and a relay conductor 2312. The relay conductor 2305 of the conductor layer C of the second modification illustrated in FIG. 250 has been a rectangular conductor having a predetermined conductor width having a gap inside. In contrast, the relay conductor 2312 of the fourth modification is rectangular conductors distributed in four places in the gap region of the reticulated conductor 2303.

Fifth Modification of Sixth Configuration Example of Three-Power Supply

FIG. 253 illustrates a fifth modification of the sixth configuration example of the three-power supply.

The fifth modification of the sixth configuration example illustrated in FIG. 253 has a configuration in which the common relay conductor is included and the reticulated conductor is replaced with respect to the fourth modification of the sixth configuration example illustrated in FIG. 252.

Specifically, the conductor layer A in A in FIG. 253 includes the reticulated conductor 2321 connected to the second power supply Vss1 and the relay conductor 2311. In the reticulated conductor 2321, the conductor width WXA in the X direction and the conductor width WYA in the Y direction are thicker than those of the reticulated conductor 2301 of the fourth modification illustrated in FIG. 252, the gap width GXA in the X direction and the gap width GYA in the Y direction are narrowly formed, and the relay conductors 2311 are arranged in four corners as non-conductor portions of the gap region.

The conductor layer B in B in FIG. 253 is configured by a reticulated conductor 2322 having a shape in which a column having a rectangular conductor arranged in the Y direction with a predetermined period with a gap, and a column having a rectangular shape having a predetermined conductor width with a gap inside arranged in the Y direction with a predetermined period with a gap are alternately arranged in the X direction. The reticulated conductor 2322 is, for example, wiring (Vdd wiring) connected to the first power supply Vdd.

The conductor layer C in C in FIG. 253 includes a reticulated conductor 2323 connected to the third power supply Vss2 and the relay conductor 2312. In the reticulated conductor 2323, the conductor width WXC in the X direction and the conductor width WYC in the Y direction are thicker than those of the reticulated conductor 2303 of the fourth modification illustrated in FIG. 252, the gap width GXC in the X direction and the gap width GYC in the Y direction are narrowly formed, and the relay conductors 2312 are arranged in four corners as non-conductor portions of the gap region.

In the second modification to the fifth modification in FIGS. 250 to 253, the shapes of the conductor layer A and the conductor layer C completely match, and the shapes of the conductor layer A and the conductor layer B and the shapes of the conductor layer B and the conductor layer C do not match. However, the shapes of which two conductor layers match can be arbitrarily designed. Furthermore, the shapes may match in a part and may not match in another part of the regions of the conductor layers.

Seventh Configuration Example of Three-Power Supply

FIG. 254 illustrates a seventh configuration example of the three-power supply.

In the coordinate system in FIG. 254, the horizontal direction is the X axis, the vertical direction is the Y axis, and the direction perpendicular to the XY plane is the Z axis.

A in FIG. 254 illustrates the conductor layer A (wiring layer 165A), B in FIG. 254 illustrates the conductor layer B (wiring layer 165B), and C in FIG. 254 illustrates the conductor layer C (wiring layer 165C).

Furthermore, D in FIG. 254 is a plan view of a stacked state of the conductor layer A and the conductor layer B, E in FIG. 254 is a plan view of a stacked state of the conductor layer A and the conductor layer C, and F in FIG. 254 is a plan view of a stacked state of the conductor layer B and the conductor layer C. Note that FIG. 254 may be considered as the entire region of each conductor layer or may be considered as a partial region.

The conductor layer A in A in FIG. 254 includes a reticulated conductor 2331. That is, the reticulated conductor 2331 has the conductor width WXA, the gap width GXA, and the conductor period FXA in the X direction, and the conductor width WYA, the gap width GYA, and the conductor period FYA in the Y direction. The reticulated conductor 2331 is a conductor having a shape in which basic patterns of the conductor period FXA and the conductor period FYA are repeatedly arranged on the same plane. The reticulated conductor 2331 is, for example, wiring (Vss1 wiring) connected to the second power supply Vss1.

The conductor layer B in B in FIG. 254 includes a reticulated conductor 2332. That is, the reticulated conductor 2332 has the conductor width WXB, the gap width GXB, and the conductor period FXB in the X direction, and the conductor width WYB, the gap width GYB, and the conductor period FYB in the Y direction. The reticulated conductor 2332 is a conductor having a shape in which basic patterns of the conductor period FXB and the conductor period FYB are repeatedly arranged on the same plane. The reticulated conductor 2332 is, for example, wiring (Vdd wiring) connected to the first power supply Vdd. The conductor periods of the reticulated conductor 2331 and the reticulated conductor 2332 are, for example, the same, and the conductor period FXA=the conductor period FXB, and the conductor period FYA=the conductor period FYB.

The conductor layer C in C in FIG. 254 includes a reticulated conductor 2333. That is, the reticulated conductor 2333 has the conductor width WXC, the gap width GXC, and the conductor period FXC in the X direction, and the conductor width WYC, the gap width GYC, and the conductor period FYC in the Y direction. The reticulated conductor 2333 is a conductor having a shape in which basic patterns of the conductor period FXC and the conductor period FYC are repeatedly arranged on the same plane. The reticulated conductor 2333 is, for example, wiring (Vss2 wiring) connected to the third power supply Vss2. The conductor periods of the reticulated conductor 2331 and the reticulated conductor 2333 are the same, and the conductor period FXB=the conductor period FXC, and the conductor period FYB=the conductor period FYC.

The positions of the conductor portions of the reticulated conductor 2331 of the conductor layer A and the reticulated conductor 2333 of the conductor layer C overlap in both the X and Y directions, but the positions of the conductor portions of the reticulated conductor 2331 of the conductor layer A and the reticulated conductor 2332 of the conductor layer B overlap in the X-direction but are shifted in the Y-direction. In other words, the gap region of the reticulated conductor 2331 of the conductor layer A is located in the conductor portion of the reticulated conductor 2332 of the conductor layer B, and the gap region of the reticulated conductor 2333 of the conductor layer C is located in the conductor portion of the reticulated conductor 2332 of the conductor layer B. Thereby, as illustrated in D and F in FIG. 254, the stacked layer of the conductor layer A and the conductor layer B forms a light-shielding structure, and the stacked layer of the conductor layer B and the conductor layer C forms a light-shielding structure. Thereby, the hot carrier light emission can be shielded.

Modification of Seventh Configuration Example of Three-Power Supply

FIG. 255 illustrates a modification of the seventh configuration example of the three-power supply.

In the coordinate system in FIG. 255, the horizontal direction is the X axis, the vertical direction is the Y axis, and the direction perpendicular to the XY plane is the Z axis.

A in FIG. 255 illustrates the conductor layer A (wiring layer 165A), B in FIG. 255 illustrates the conductor layer B (wiring layer 165B), and C in FIG. 255 illustrates the conductor layer C (wiring layer 165C).

Furthermore, D in FIG. 255 is a plan view of a stacked state of the conductor layer A and the conductor layer B, E in FIG. 255 is a plan view of a stacked state of the conductor layer A and the conductor layer C, and F in FIG. 255 is a plan view of a stacked state of the conductor layer B and the conductor layer C. Note that FIG. 255 may be considered as the entire region of each conductor layer or may be considered as a partial region.

The conductor layer A in A in FIG. 255 includes the reticulated conductor 2331 connected to the second power supply Vss1 and a rectangular relay conductor 2341. In other words, the conductor layer A in A in FIG. 255 has a configuration in which the relay conductor 2341 is added to the gap region of the reticulated conductor 2331 illustrated in A in FIG. 254, but the gap region of the reticulated conductor 2331 is formed larger than the reticulated conductor 2331 in A in FIG. 254 for arranging the relay conductor 2341. The relay conductor 2341 is arranged in a gap region that is not the conductor of the reticulated conductor 2331 and is electrically insulated from the reticulated conductor 2331, and is electrically connected to, for example, the reticulated conductor 2332 of the conductor layer B and another conductor layer.

The conductor layer B in B in FIG. 255 includes the reticulated conductor 2332 connected to the first power supply Vdd, as in the seventh configuration example illustrated in FIG. 254.

The conductor layer C in C in FIG. 255 includes the reticulated conductor 2333 connected to the third power supply Vss2 and a rectangular relay conductor 2342. In other words, the conductor layer C in C in FIG. 255 has a configuration in which the relay conductor 2342 is added to the gap region of the reticulated conductor 2333 illustrated in C in FIG. 254, but the gap region of the reticulated conductor 2333 is formed larger than the reticulated conductor 2333 in C in FIG. 254 for arranging the relay conductor 2342. The relay conductor 2342 is arranged in a gap region that is not the conductor of the reticulated conductor 2333 and is electrically insulated from the reticulated conductor 2333, and is electrically connected to, for example, the reticulated conductor 2332 of the conductor layer B and another conductor layer.

Even in the modification of the seventh configuration example, the stacked layer of the conductor layer A and the conductor layer B forms a light-shielding structure, and the stacked layer of the conductor layer B and the conductor layer C forms a light-shielding structure, as illustrated in D and F in FIG. 255. Thereby, the hot carrier light emission can be shielded.

Note that, in the seventh configuration example and its modifications in FIGS. 254 and 255, the light-shielding structure has been implemented by the stacked layer of the two layers. However, a light-shielding structure may be configured by a stacked layer of three layers although a light-shielding structure is not formed by a stacked layer of two layers.

Eighth Configuration Example of Three-Power Supply

FIG. 256 illustrates an eighth configuration example of the three-power supply.

In the coordinate system in FIG. 256, the horizontal direction is the X axis, the vertical direction is the Y axis, and the direction perpendicular to the XY plane is the Z axis.

A in FIG. 256 illustrates the conductor layer A (wiring layer 165A), B in FIG. 256 illustrates the conductor layer B (wiring layer 165B), and C in FIG. 256 illustrates the conductor layer C (wiring layer 165C).

Furthermore, D in FIG. 256 is a plan view of a stacked state of the conductor layer A and the conductor layer B, E in FIG. 256 is a plan view of a stacked state of the conductor layer A and the conductor layer C, and F in FIG. 256 is a plan view of a stacked state of the conductor layer B and the conductor layer C. Note that FIG. 256 may be considered as the entire region of each conductor layer or may be considered as a partial region.

The conductor layer A in A in FIG. 256 is configured by the reticulated conductor 2331 connected to the second power supply Vss1, similarly to the seventh configuration example illustrated in FIG. 254.

The conductor layer B in B in FIG. 256 includes the reticulated conductor 2332 connected to the first power supply Vdd and a rectangular relay conductor 2351. In other words, the conductor layer B in B in FIG. 256 has a configuration in which the relay conductor 2351 is added to the gap region of the reticulated conductor 2332 of the seventh configuration example illustrated in B in FIG. 254, but the gap region of the reticulated conductor 2332 is formed larger than the reticulated conductor 2332 in B in FIG. 254 for arranging the relay conductor 2351. The relay conductor 2351 is arranged in a gap region that is not the conductor of the reticulated conductor 2332 and is electrically insulated from the reticulated conductor 2332, and is electrically connected to, for example, the reticulated conductor 2331 of the conductor layer A and a relay conductor 2353 of the conductor layer C.

The conductor layer C in C in FIG. 256 includes the reticulated conductor 2333 connected to the third power supply Vss2 and the rectangular relay conductors 2352 and 2353. In other words, the conductor layer C in C in FIG. 256 has a configuration in which the relay conductors 2352 and 2353 are added to the gap region of the reticulated conductor 2333 of the seventh configuration example illustrated in C in FIG. 254, but the gap region of the reticulated conductor 2333 is formed larger than the reticulated conductor 2333 in C in FIG. 254 for arranging the relay conductors 2352 and 2353. The relay conductor 2352 is arranged in a gap region that is not the conductor of the reticulated conductor 2333 and is electrically insulated from the reticulated conductor 2333, and is electrically connected to, for example, the reticulated conductor 2332 of the conductor layer B and another conductor layer. The relay conductor 2353 is arranged in a gap region that is not the conductor of the reticulated conductor 2333 and is electrically insulated from the reticulated conductor 2333, and is electrically connected to, for example, the relay conductor 2351 of the conductor layer B and another conductor layer.

The positions of the conductor portions of the reticulated conductor 2331 of the conductor layer A and the reticulated conductor 2332 of the conductor layer B partially overlap in the X direction but are shifted in the Y direction. Thereby, the stacked layer of the conductor layer A and the conductor layer B forms a light-shielding structure. Furthermore, the positions of the conductor portions of the reticulated conductor 2331 of the conductor layer A and the reticulated conductor 2333 of the conductor layer C are shifted in both the X and Y directions. Thereby, the stacked layer of the conductor layer A and the conductor layer C forms a light-shielding structure. Thereby, the hot carrier light emission can be shielded.

In the eighth configuration example in FIG. 256, the X-direction positions of the conductor portions of the reticulated conductors are shifted between the conductor layer B and the conductor layer C, whereby the Vdd conductor and the Vss conductor of the conductor layers A and B can be electrically connected to a lower layer or an upper layer than the conductor layer C via a conductor via extending in the Z direction or the like with a short path.

Note that, in the eighth configuration example in FIG. 256, the conductor layer A configured by the reticulated conductor having the largest conductor width is not provided with a relay conductor among the conductor layers A to C but may be provided with a relay conductor.

First Modification of Eighth Configuration Example of Three-Power Supply

FIGS. 257 to 260 illustrate first to fourth modifications of the eighth configuration example of the three-power supply.

In FIGS. 257 to 260, the arrangement of the conductor layer A (wiring layer 165A), the conductor layer B (wiring layer 165B), the conductor layer C (wiring layer 165C), the plan view of the stacked state of the conductor layer A and the conductor layer B, the plan view of the stacked state of the conductor layer A and the conductor layer C, and the plan view of the stacked state of the conductor layer B and the conductor layer C is similar to that in FIG. 248. This also similarly applies to the coordinate system.

FIG. 257 illustrates a first modification of the eighth configuration example of the three-power supply.

The conductor layer A in A in FIG. 257 includes a reticulated conductor 2361. That is, the reticulated conductor 2361 has the conductor width WXA, the gap width GXA, and the conductor period FXA in the X direction, and the conductor width WYA, the gap width GYA, and the conductor period FYA in the Y direction. The reticulated conductor 2361 is a conductor having a shape in which basic patterns of the conductor period FXA and the conductor period FYA are repeatedly arranged on the same plane. The reticulated conductor 2361 is, for example, wiring (Vdd wiring) connected to the first power supply Vdd.

The conductor layer B in B in FIG. 257 includes a reticulated conductor 2362 connected to the second power supply Vss1 and a rectangular relay conductor 2363. The relay conductor 2363 is arranged in a gap region that is not the conductor of the reticulated conductor 2362 and is electrically insulated from the reticulated conductor 2362, and is electrically connected to, for example, the reticulated conductor 2361 of the conductor layer A and the relay conductor 2352 of the conductor layer C.

The conductor layer C in C in FIG. 257 includes the reticulated conductor 2333 connected to the third power supply Vss2, the rectangular relay conductor 2352 connected to the first power supply Vdd, and the rectangular relay conductor 2353 connected to the second power supply Vss1, similarly to the eighth configuration example illustrated in FIG. 256.

Therefore, the first modification in FIG. 257 is a configuration in which the connection destinations of the power supplies in the conductor layer A and the conductor layer B are interchanged with respect to the eighth configuration example in FIG. 256. In the first modification in FIG. 257, in the case where the conductor layer A is a conductor layer having a sheet resistance smaller than the conductor layer B or the conductor layer C, for example, the conductor layer A having a small sheet resistance is used as a Vdd conductor. In such a case, it is desirable that the conductor layer A is not provided with the relay conductor from the viewpoint of voltage drop. In this way, the conductor layer A having a small sheet resistance can be the conductor layer (Vdd conductor) connected to the power supply commonly used in the configuration of selecting and switching the second power supply Vss1 and the third power supply Vss2.

Second Modification of Eighth Configuration Example of Three-Power Supply

FIG. 258 illustrates a second modification of the eighth configuration example of the three-power supply.

The conductor layer A in A in FIG. 258 includes the reticulated conductor 2361 connected to the first power supply Vdd, similarly to the first modification in A in FIG. 257.

The conductor layer B in B in FIG. 258 includes the reticulated conductor 2362 connected to the second power supply Vss1 and rectangular relay conductors 2371 and 2372. The relay conductor 2371 is arranged in a gap region that is not the conductor of the reticulated conductor 2362 and is electrically insulated from the reticulated conductor 2362, and is electrically connected to, for example, the reticulated conductor 2361 of the conductor layer A and the relay conductor 2352 of the conductor layer C. The relay conductor 2372 is arranged in a gap region that is not the conductor of the reticulated conductor 2362 and is electrically insulated from the reticulated conductor 2362, and is electrically connected to, for example, the reticulated conductor 2333 of the conductor layer C and another conductor layer.

The conductor layer C in C in FIG. 258 includes the reticulated conductor 2333 connected to the third power supply Vss2, the rectangular relay conductor 2352 connected to the first power supply Vdd, and the rectangular relay conductor 2353 connected to the second power supply Vss1, similarly to the eighth configuration example illustrated in FIG. 256.

Therefore, the second modification in FIG. 258 has a configuration in which the relay conductor of the conductor layer B is replaced with respect to the first modification in FIG. 257.

Third Modification of Eighth Configuration Example of Three-Power Supply

FIG. 259 illustrates a third modification of the eighth configuration example of the three-power supply.

The conductor layer A in A in FIG. 259 includes the reticulated conductor 2361 connected to the first power supply Vdd, similarly to the second modification in A in FIG. 258.

The conductor layer B in B in FIG. 259 includes the reticulated conductor 2362 connected to the second power supply Vss1, the rectangular relay conductor 2371 connected to the first power supply Vdd, and the rectangular relay conductor 2372 connected to the third power supply Vss2, similarly to the second modification in B in FIG. 258.

The conductor layer C in C in FIG. 259 includes the reticulated conductor 2333 connected to the third power supply Vss2, the rectangular relay conductor 2352 connected to the first power supply Vdd, and the rectangular relay conductor 2353 connected to the second power supply Vss1, similarly to the second modification in C in FIG. 258.

Therefore, the third modification in FIG. 259 has the same conductor configuration as the second modification illustrated in FIG. 258, but the positional relationship among the conductor layers A to C is different from that of the second modification.

Specifically, comparing the X-direction positions of the conductor layer A and the conductor layer B between the second modification illustrated in FIG. 258 and the third modification illustrated in FIG. 259, in the second modification illustrated in FIG. 258, the conductor portion of the reticulated conductor 2362 of the conductor layer B is arranged at the position of the gap region of the reticulated conductor 2361 of the conductor layer A, whereas in the third modification of FIG. 259, the conductor portion of the reticulated conductor 2362 of the conductor layer B is arranged at the position of the conductor portion of the reticulated conductor 2361 of the conductor layer A. The positional relationship between the conductor layer B and the conductor layer C is the same in the second modification and the third modification.

The stacked states of the two layers of D to F in FIG. 259 are the same in the second modification and the third modification.

In the second modification illustrated in FIG. 258 and the third modification illustrated in FIG. 259 are common in that the conductor layer B and the conductor layer C include the reticulated conductor as the Vss1 conductor or the Vss2 conductor, and the two rectangular relay conductors are arranged in the gap region. In the configurations of the second modification and the third modification, the shape of the Vss1 conductor and the shape of the Vss2 conductor are pseudo-identical, so that the combination of the Vdd conductor and the Vss1 conductor and the combination of the Vdd conductor and the Vss2 conductor can reduce the difference in voltage drop and the difference in inductive noise, which may be favorable. Of course, the shape of the Vss1 conductor and the shape of the Vss2 conductor can be made not pseudo-identical.

Fourth Modification of Eighth Configuration Example of Three-Power Supply

FIG. 260 illustrates a fourth modification of the eighth configuration example of the three-power supply.

The conductor layer A in A in FIG. 260 includes the reticulated conductor 2361 connected to the first power supply Vdd, similarly to the second modification in A in FIG. 258.

The conductor layer B in B in FIG. 260 includes the reticulated conductor 2362 connected to the second power supply Vss1 and the rectangular relay conductor 2363 connected to the first power supply Vdd. Therefore, the conductor layer B is common to the conductor layer B of the first modification illustrated in B in FIG. 257 in including the reticulated conductor 2362 and the rectangular relay conductor 2363 but is different from the first modification in the rectangular shape of the relay conductor 2363. The rectangular shape of the relay conductor 2363 has a large difference in the conductor width between the X direction and the Y direction in the first modification, whereas the rectangular shape is close to a square having a small difference in the conductor width between the X direction and the Y direction in the fourth modification.

The conductor layer C in C in FIG. 260 includes the reticulated conductor 2333 connected to the third power supply Vss2, the rectangular relay conductor 2352 connected to the first power supply Vdd, and the rectangular relay conductor 2353 connected to the second power supply Vss1. Therefore, the conductor layer C is common to the conductor layer C of the first modification illustrated in C in FIG. 257 in including the reticulated conductor 2333, the relay conductor 2352, and the relay conductor 2353, but is different from the first modification in the conductor width (the conductor width WXB and the conductor width WYB) of the reticulated conductor 2333 and the gap width (the gap width GXB and the gap width GYB). The conductor width of the fourth modification in C in FIG. 260 is formed to be extremely narrower than the conductor width of the first modification illustrated in C of FIG. 257. Thereby, the gap region of the reticulated conductor 2333 is significantly changed. On the other hand, the conductor widths in the X and Y directions of the relay conductors 2352 and 2353 in the fourth modification are significantly changed to be larger than those of the relay conductors 2352 and 2353 in the first modification.

Therefore, in the fourth modification, the conductor width of the reticulated conductor 2333 as the Vss2 conductor is extremely smaller than the conductor width of the reticulated conductor 2361 as the Vdd conductor and the conductor width of the reticulated conductor 2362 as the Vss1 conductor. In this way, by securing the conductor widths of the Vdd conductor and the Vss1 conductor as large as possible, the Vdd conductor and the Vss1 conductor can be prioritized from the viewpoint of voltage drop. Alternatively, the conductor width of the reticulated conductor 2362 as the Vss1 conductor may be also extremely smaller than the conductor width of the reticulated conductor 2361 as the Vdd conductor, and only the Vdd conductor may be prioritized from the viewpoint of voltage drop. On the contrary, at least one of the Vss1 conductor or the Vss2 conductor may be prioritized over the Vdd conductor from the viewpoint of voltage drop.

Ninth Configuration Example of Three-Power Supply

FIG. 261 illustrates a ninth configuration example of the three-power supply.

In the coordinate system in FIG. 261, the horizontal direction is the X axis, the vertical direction is the Y axis, and the direction perpendicular to the XY plane is the Z axis.

A in FIG. 261 illustrates the conductor layer A (wiring layer 165A), B in FIG. 261 illustrates the conductor layer B (wiring layer 165B), and C in FIG. 261 illustrates the conductor layer C (wiring layer 165C).

Furthermore, D in FIG. 261 is a plan view of a stacked state of the conductor layer A and the conductor layer B, E in FIG. 261 is a plan view of a stacked state of the conductor layer A and the conductor layer C, and F in FIG. 261 is a plan view of a stacked state of the conductor layer B and the conductor layer C. Note that FIG. 261 may be considered as the entire region of each conductor layer or may be considered as a partial region.

The conductor layer A in A in FIG. 261 is configured such that a linear conductor 2411 long in the X direction and a linear conductor 2412 long in the X direction are alternately and periodically arranged in the Y direction.

The linear conductor 2411 is, for example, wiring (Vdd wiring) connected to the first power supply Vdd. The linear conductor 2412 is, for example, wiring (Vss1 wiring) connected to the second power supply Vss1. The linear conductor 2411 and the linear conductor 2412 are differential conductors (differential structure) having the current directions opposite to each other.

The linear conductor 2411 has the conductor width WYAD in the Y direction and the linear conductor 2412 has the conductor width WYAS1 in the Y direction, and the conductor width WYAD of the linear conductor 2411 and the conductor width WYAS1 of the linear conductor 2412 are, for example, the same (the conductor width WYAD=the conductor width WYAS1). There is a gap with the gap width GYA between the linear conductor 2411 and the linear conductor 2412 in the Y direction.

The linear conductor 2411 long in the X direction is periodically arranged in the Y direction with a conductor period FYAD (=the conductor width WYAD+the conductor width WYAS1+2×the gap width GYA). The linear conductor 2412 long in the X direction is periodically arranged in the Y direction with a conductor period FYAS1 (=the conductor width WYAD+the conductor width WYAS1+2×the gap width GYA). The conductor period FYAD of the linear conductor 2411 and the conductor period FYAS1 of the linear conductor 2412 are, for example, the same (the conductor period FYAD=the conductor period FYAS1).

The conductor layer B in B in FIG. 261 is configured such that a linear conductor 2421 long in the Y direction and a linear conductor 2422 long in the Y direction are alternately and periodically arranged in the X direction.

The linear conductor 2421 is, for example, wiring (Vdd wiring) connected to the first power supply Vdd. The linear conductor 2422 is, for example, wiring (Vss1 wiring) connected to the second power supply Vss1. The linear conductor 2421 and the linear conductor 2422 are differential conductors (differential structure) having the current directions opposite to each other.

The linear conductor 2421 has a conductor width WXBD in the X direction and the linear conductor 2422 has a conductor width WXBS1 in the X direction, and the conductor width WXBD of the linear conductor 2421 and the conductor width WXBS1 of the linear conductor 2422 are, for example, the same (the conductor width WXBD=the conductor width WXBS1). There is a gap with the gap width GXB between the linear conductor 2421 and the linear conductor 2422 in the X direction.

The linear conductor 2421 long in the Y direction is periodically arranged in the X direction with the conductor period FXBD (=the conductor width WXBD+the conductor width WXBS1+2×the gap width GXB). The linear conductor 2422 long in the Y direction is periodically arranged in the X direction with the conductor period FXBS1 (=the conductor width WXBD+the conductor width WXBS1+2×the gap width GXB). The conductor period FXBD of the linear conductor 2421 and the conductor period FXBS1 of the linear conductor 2422 are, for example, the same (the conductor period FXBD=the conductor period FXBS1).

The conductor layer C in C in FIG. 261 includes the reticulated conductor 2333 connected to the third power supply Vss2, the rectangular relay conductor 2352 connected to the first power supply Vdd, and the rectangular relay conductor 2353 connected to the second power supply Vss1, similarly to the eighth configuration example illustrated in FIG. 256.

As illustrated in D and F in FIG. 261, the stacked layer of the conductor layer A and the conductor layer B and the stacked layer of the conductor layer B and the conductor layer C do not form a perfect light-shielding structure, but the stacked layer of the conductor layer A and the conductor layer C forms a light-shielding structure, as illustrated in E in FIG. 261.

As illustrated in FIG. 261, the ninth configuration example has a configuration in which the conductor layer A has a differential configuration of the Vdd conductor and the Vss1 conductor, the conductor layer B has a differential configuration of the Vdd conductor and the Vss1 conductor, and the wiring directions are orthogonal to each other between the conductor layer A and the conductor layer B. Then, the conductor layer C includes the reticulated conductor (Vss2 conductor) connected to the third power supply Vss2. Furthermore, the conductor layer C is provided with the rectangular relay conductor 2352 connected to the first power supply Vdd and the rectangular relay conductor 2353 connected to the second power supply Vss1. One or both of the relay conductor 2352 and the relay conductor 2353 may be omitted.

Modification of First to Ninth Configuration Examples of Three-Power Supply

In the linear conductor, the reticulated conductor, or the rectangular conductor of the first to ninth configuration examples provided with the above-described three-power supply, those described as being the same may be substantially the same. For example, the same conductor width, the same conductor period, and the same conductive area may be substantially the same conductor width, substantially the same conductor period, and substantially the same conductive area, respectively. Here, the substantially the same is a difference in a range that can be regarded as the same, but for example, the difference may be a difference in a range not exceeding at least twice.

Any two of the conductor layers A to C can be electrically connected via a conductor via extending in the Z direction or the like, as needed, in the region where the conductors connected to the same power supply overlap.

In the above-described example of the stacked layer of the two layers of the conductor layers A and B or the three layers of the conductor layers A to C, the order of stacking the conductor layers A and B can be arbitrarily determined. Further, in each of the above-described configuration examples, the conductor described as the conductor (Vdd conductor) connected to the first power supply Vdd may be used as the conductor connected to the second power supply Vss1 or the third power supply Vss2. The conductor described as the conductor (Vss1 conductor) connected to the second power supply Vss1 may be used as the conductor connected to the first power supply Vdd or the third power supply Vss2. The conductor described as the conductor (Vss2 conductor) connected to the third power supply Vss2 may be used as the conductor connected to the first power supply Vdd or the second power supply Vss1. In each of the above-described configuration examples, the description has been made using the examples in which the gap widths GXA, GXB, GYA, and GYB are the same example regardless of their positions, but these gap widths may be different depending on the positions or may be modulated according to the positions. Furthermore, some description has been made using the examples in which the conductor widths WXAD, WXAS1, WXAS2, WXBD, WXBS1, WXBS2, WYAD, WYAS1, WYAS2, WYBD, WYBS1, and WYBS2 are the same regardless of their positions, but these conductor widths may be different depending on the positions or may be modulated according to the positions. Furthermore, it is considered favorable to satisfy "the conductor width WYAD=the conductor width WYAS1=the conductor width WYAS2", but it may be configured not to satisfy the above. Furthermore, some description has been made using the examples in which the conductor periods FXAD, FXAS1, FXAS2, FXBD, FXBS1, FXBS2, FYAD, FYAS1, FYBD, FYBS1, FYBS2, FXA, FXB, FXC, FYA, FYB, and FYC are the same regardless of their positions, but these conductor periods may be different depending on the positions or may be modulated according to the positions. Furthermore, it is considered favorable to satisfy "the conductor period FXAD=the conductor period FXAS1=the conductor period FXAS2", "the conductor period FXBD=the conductor period FXBS1=the conductor period FXBS2", "the conductor period FYAD=the conductor period FYAS1", "the conductor period FYBD=the conductor period FYBS1=the conductor period FYBS2", "the conductor period FXA=the conductor period FXB=the conductor period FXC", or "the conductor period FYA=the conductor period FYB=the conductor period FYC", but it may be configured not to satisfy the above. Furthermore, at least a part or all of the above-described reticulated conductors may be a planar conductor or a linear conductor. Although the configuration examples and the modifications when the solid-state imaging device adopts the three-power supply have been described, configuration examples and modifications in which the solid-state imaging device can adopt a four-power supply or more are also possible. For example, in the case of the four-power supply, at least one of the first to third power supplies may be replaced with a fourth power supply, and at least one of the first path or the second path may be replaced with a third path connected to the fourth power supply. Furthermore, the fourth power supply may be added to the first to third power supplies, or the third path connected to the fourth power supply may be added to the first path and the second path. The same applies to the case where the solid-state imaging device adopts a five-power supply or more.

16. Other Configuration Examples of Case Having Three Conductor Layers

In the above <12. Configuration Example of Case Having Three Conductor Layers>, the configuration examples of the three-layer conductor layer (the first to fourteenth configuration examples of the three-layer conductor layer) including the conductor layers A to C (the wiring layers 165A to 165C) have been described with reference to FIGS. 122 to 163. Other configuration examples of the three-layer conductor layer will be further described.

Specifically, an example of a conductor in which the conductor layer C has a diagonal or stepped shape and an example of a conductor having a mirror-symmetrical shape will be described. Hereinafter, the same reference numeral is given to a portion corresponding to the above-described configuration example and description thereof is omitted as appropriate.

Note that, in FIGS. 262 to 283 to be described below, the pattern (design) used for the conductor of the wiring (Vss wiring) connected to the GND or the negative power supply (Vss) and the pattern (design) used for the conductor of the wiring (Vdd wiring) connected to the positive power supply (Vdd) are changed from the patterns (design) used in the drawings so far. In the drawings so far, hatching (diagonal line pattern) has been used for the pattern used for the conductor of the Vss wiring and the pattern used for the conductor of the Vdd wiring. This is because if hatching is used for the conductor which has a diagonal or stepped shape, the boundary between the pattern portion (conductor portion) and the gap portion cannot be distinguished.

To reconfirm the above-described configuration of the conductor layer, the wiring layer 170 (conductor group) and the active element layer 171 are arranged in the Z-axis direction of the conductor layers A to C as described with reference to FIG. 120. An active element such as the MOS transistor 164 is arranged in the active element layer 171. The wiring layer 170 (conductor group) includes at least a part of the control line 133 that controls the transistor of the pixel 131 or at least a part of the signal line 132 that transmits the pixel signal. For example, the wiring layer 170 includes the plurality of signal lines 132 with a predetermined periodic width in the X direction and the plurality of control lines 133 with a predetermined periodic width in the Y direction. The signal line 132 is wiring longer in the Y direction than in the X direction, and the control line 133 is wiring longer in the X direction than in the Y direction. The wiring layer 170 may be configured by two or more conductor layers, and the plurality of signal lines 132 and the plurality of control lines 133 as the wiring layer 170 may be arranged in the pixel array 121. The plurality of signal lines 132 and control lines 133 arranged in the pixel array 121 are selectively switched by the vertical scanning unit 123 switching a target pixel for exposure and readout of the pixel signal.

Fifteenth Configuration Example of Three-Layer Conductor Layer

FIG. 262 illustrates a fifteenth configuration example of the three-layer conductor layer.

A in FIG. 262 illustrates the conductor layer C (wiring layer 165C), B in FIG. 262 illustrates the conductor layer A (wiring layer 165A), and C in FIG. 262 illustrates the conductor layer B (wiring layer 165B).

Furthermore, D in FIG. 262 is a plan view of a stacked state of the conductor layer A and the conductor layer C, E in FIG. 262 is a plan view of a stacked state of the conductor layer B and the conductor layer C, and F in FIG. 262 is a plan view of a stacked state of the conductor layer A and the conductor layer B.

The conductor layer A in B in FIG. 262 includes the same reticulated conductor 1201 and relay conductor 1241 as in FIG. 128. Note that the reticulated conductor 1201 is, for example, wiring (Vss wiring) connected to the GND and the negative power supply (Vss), and the relay conductor 1241 is, for example, wiring (Vdd wiring) connected to the positive power supply (Vdd).

The conductor layer B in C in FIG. 262 includes the same reticulated conductor 1202 and relay conductor 1242 as in FIG. 128. The reticulated conductor 1202 is, for example, wiring (Vdd wiring) connected to the positive power supply, and the relay conductor 1242 is, for example, wiring (Vss wiring) connected to the GND and the negative power supply.

The conductor layer C in A in FIG. 262 is a conductor layer having a low sheet resistance through which the current easily flows, and is configured by alternately and periodically arranging a diagonal conductor 2501A long in a diagonal direction and a diagonal conductor 2501B long in a diagonal direction in a direction orthogonal to an extending direction of the diagonal conductors 2501A and 2501B (hereinafter referred to as a diagonally extending direction). The diagonally extending direction is the direction of an angle θ ($0<\theta<90$) with respect to the Y axis.

The diagonal conductor 2501A is, for example, wiring (Vss wiring) connected to the GND and the negative power supply (Vss). The diagonal conductor 2501B is, for example, wiring (Vdd wiring) connected to the positive power supply (Vdd). The diagonal conductor 2501A and the diagonal conductor 2501B are differential conductors (differential structure) having the current directions opposite to each other. The diagonal conductor 2501A is directly or indirectly connected to, for example, a pad (not illustrated)

on an outer peripheral portion of the semiconductor substrate, and is electrically connected to the reticulated conductor 1201 of the conductor layer A. The reticulated conductor 1201 of the conductor layer A and the diagonal conductor 2501A of the conductor layer C may be electrically connected via, for example, a conductor via (VIA) extending in the Z direction. The diagonal conductor 2501B is directly or indirectly connected to, for example, a pad (not illustrated) on an outer peripheral portion of the semiconductor substrate, and is electrically connected to the reticulated conductor 1202 of the conductor layer B. The reticulated conductor 1202 of the conductor layer B and the diagonal conductor 2501B of the conductor layer C may be electrically connected via, for example, a conductor via (VIA) extending in the Z direction.

The diagonal conductor 2501A has a conductor width WSCA in the direction orthogonal to the diagonally extending direction, and the diagonal conductor 2501B has a conductor width WSCB in the direction orthogonal to the diagonally extending direction. In the fifteenth configuration example in FIG. 262, the conductor width WSCA of the diagonal conductor 2501A and the conductor width WSCB of the diagonal conductor 2501B are the same (the conductor width WSCA=the conductor width WSCB). The conductor width WSCA and the conductor width WSCB may not be the same or may be substantially the same (the conductor width WSCA≈the conductor width WSCB), or may be different conductor widths. There is a gap with a gap width GSC between the diagonal conductor 2501A and the diagonal conductor 2501B.

The diagonal conductor 2501A and the diagonal conductor 2501B are periodically arranged in the direction orthogonal to the diagonally extending direction with a conductor period FSC (=the conductor width WSCA+the conductor width WSCB+2×the gap width GSC). A conductor period FSCA of the diagonal conductor 2501A and a conductor period FSCB of the diagonal conductor 2501B are the same (FSC=FSCA=FSCB) or substantially the same (FSCA z FSCB).

Note that the conductor width WSCA, the conductor width WSCB, and the gap width GSC can be designed to arbitrary values.

When the conductor layer C in which the diagonal conductor 2501A and the diagonal conductor 2501B are periodically arranged in the diagonally extending direction with the conductor period FSC is viewed in a predetermined plane range (plane region), the sum of the conductor widths WSCA of a plurality of diagonal conductors 2501A and the sum of the conductor widths WSCB of a plurality of diagonal conductors 2501B in the predetermined plane range are the same or substantially the same because the conductor width WSCA of the diagonal conductor 2501A and the conductor width WSCB of the diagonal conductor 2501B are the same or substantially the same. As a result, the current distribution of the diagonal conductor 2501A and the current distribution of the diagonal conductor 2501B become the same or substantially the same, so that generation of inductive noise can be suppressed.

Furthermore, in a case where the conductor layer C is arranged near the wiring layer 170, as illustrated in C in FIG. 120, for example, the capacitive noise due to capacitive coupling between the diagonal conductor 2501A and the diagonal conductor 2501B of the conductor layer C, and the signal line 132 and the control line 133 of the wiring layer 170 can occur. However, since the diagonal conductor 2501A and the diagonal conductor 2501B have the same wiring pattern repeated in the X and Y directions, the capacitive noise generated from the conductors can be completely canceled in both the X and Y directions. The capacitive noise can be significantly improved as the conductor layer C is closer to the wiring layer 170.

As illustrated in F in FIG. 262, the stacked layer of the conductor layers A and B has a light-shielding structure, and the hot carrier light emission from the active element group 167 can be shielded. In addition, as illustrated in D and E in FIG. 262, the light-shielding property is maintained in a fixed range in the stacked layer of the conductor layers A and C and the stacked layer of the conductor layers B and C. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the diagonal conductor 2501A of the conductor layer C are electrically connected, and the reticulated conductor 1202 of the conductor layer B and the diagonal conductor 2501B of the conductor layer C are electrically connected, the current amount of the conductor layers A and B can be made small. Therefore, the inductive noise and the voltage drop from the conductor layer A or B can be further improved.

Sixteenth Configuration Example of Three-Layer Conductor Layer

FIG. 263 illustrates a sixteenth configuration example of the three-layer conductor layer.

A in FIG. 263 illustrates the conductor layer C (wiring layer 165C), B in FIG. 263 illustrates the conductor layer A (wiring layer 165A), and C in FIG. 263 illustrates the conductor layer B (wiring layer 165B).

Furthermore, D in FIG. 263 is a plan view of a stacked state of the conductor layer A and the conductor layer C, E in FIG. 263 is a plan view of a stacked state of the conductor layer B and the conductor layer C, and F in FIG. 263 is a plan view of a stacked state of the conductor layer A and the conductor layer B.

In the sixteenth configuration example, only the configuration of the conductor layer C in A in FIG. 263 is different from that in FIG. 262.

In the conductor layer C in A in FIG. 262, the diagonal conductors 2501A and 2501B having a linear shape in the diagonally extending direction have been alternately and periodically arranged with the conductor period FSC.

Meanwhile, in the conductor layer C in A in FIG. 263, stepped conductors 2511A and 2511B having a stepped shape in the diagonally extending direction are alternately and periodically arranged with the conductor period FSC.

The sixteenth configuration example in FIG. 263 is similar to the fifteenth configuration example in FIG. 262 except for the above-described points.

When the conductor layer C in which the stepped conductor 2511A and the stepped conductor 2511B are periodically arranged in the diagonally extending direction with the conductor period FSC is viewed in a predetermined plane range (plane region), the sum of the conductor widths WSCA of a plurality of stepped conductors 2511A and the sum of the conductor widths WSCB of a plurality of stepped conductors 2511B in the predetermined plane range are the same or substantially the same because the conductor width WSCA of the stepped conductor 2511A and the conductor width WSCB of the stepped conductor 2511B are the same or substantially the same. As a result, the current distribution of the stepped conductor 2511A and the current distribution of the stepped conductor 2511B become the same or substantially the same, so that generation of inductive noise can be suppressed.

Furthermore, in a case where the conductor layer C is arranged near the wiring layer 170, as illustrated in C in FIG. 120, for example, the capacitive noise due to capacitive coupling between the stepped conductor 2511A and the stepped conductor 2511B of the conductor layer C, and the signal line 132 and the control line 133 of the wiring layer 170 can occur. However, since the stepped conductor 2511A and the stepped conductor 2511B have the same wiring pattern repeated in the X and Y directions, the capacitive noise generated from the conductors can be completely canceled in both the X and Y directions. The capacitive noise can be significantly improved as the conductor layer C is closer to the wiring layer 170.

As illustrated in F of FIG. 263, the stacked layer of the conductor layers A and B has a light-shielding structure, and the hot carrier light emission from the active element group 167 can be shielded. In addition, as illustrated in D and E in FIG. 263, the light-shielding property is maintained in a fixed range in the stacked layer of the conductor layers A and C and the stacked layer of the conductor layers B and C. Thereby, since the light-shielding restrictions of the conductor layers A and B can be significantly alleviated, the conductive area of the conductor layers A and B can be used to the maximum, the wiring resistance can be lowered, and the voltage drop can be further improved. Furthermore, the degree of freedom in layout of the conductor layers A and B can be improved.

Moreover, in the case where the reticulated conductor 1201 of the conductor layer A and the stepped conductor 2511A of the conductor layer C are electrically connected, and the reticulated conductor 1202 of the conductor layer B and the stepped conductor 25111B of the conductor layer C are electrically connected, the current amount of the conductor layers A and B can be made small. Therefore, the inductive noise and the voltage drop from the conductor layer A or B can be further improved.

Note that, in the fifteenth configuration example in FIG. 262 and the sixteenth configuration example in FIG. 263, the configurations of the conductor layers A and B in FIG. 128 have been adopted as the configurations of the conductor layers A and B, but the configurations of the conductor layers A and B are not limited to the configurations of the conductor layers A and B in FIG. 128. Any of the configurations of the conductor layers A and B of the first to fourteenth configuration examples of the three-layer conductor layer can be applied to the conductor layers A and B.

Moreover, the wiring pattern of the diagonal conductor or the stepped conductor of the conductor layer C can be applied to the case where the conductor layers A and B are configured by the wiring connected to the three-power supply such as the first power supply Vdd, the second power supply Vss1, and the third power supply Vss2, as described in <15. Configuration Examples of Three-power Supply> above. In this case, the wiring pattern of the diagonal conductor or the stepped conductor of the conductor layer C can be configured such that diagonal or stepped Vdd wiring, Vss1 wiring, and Vss2 wiring are periodically arranged in the direction orthogonal to the diagonally extending direction.

Other Modifications in Fifteenth Configuration Example of Three-layer Conductor Layer Hereinafter, other modifications of the fifteenth configuration example of the three-layer conductor layer illustrated in FIG. 262 will be described with reference to FIGS. 264 to 273.

Note that, in the modifications of the fifteenth configuration example, only the configuration of the conductor layer C is illustrated in FIGS. 264 to 273 because only the configuration of the conductor layer C is changed.

A in FIG. 264 illustrates the conductor layer C of a first modification of the fifteenth configuration example of the three-layer conductor layer.

The conductor layer C in A in FIG. 264 is a conductor layer having a low sheet resistance through which a current easily flows, and a diagonal conductor 2521A and a diagonal conductor 2521B long in the diagonal direction are alternately and periodically arranged. Note that the diagonal conductor 2521A is, for example, wiring (Vss wiring) connected to the GND and the negative power supply (Vss), and the diagonal conductor 2521B is, for example, wiring (Vdd wiring) connected to the positive power supply (Vdd).

Furthermore, assuming that the conductor layer C is divided into four first region $\mathbf{2531}_1$ to fourth region $\mathbf{2531}_4$ with a center of the entire region in the XY directions as an origin, the diagonal conductors 2521A and 2521B of the regions 2531 are mirror-symmetrically arranged in an X-shaped manner with respect to the X and Y directions. Note that the conductor periods, conductor widths, gap widths, and periodic widths of the diagonal conductors 2521A and 2521B in each region 2531 are similar to those of the diagonal conductors 2501A and 2501B in A in FIG. 262 for the sake of simplicity.

Specifically, the diagonal conductors 2521A and the diagonal conductor 2521B in the first region $\mathbf{2531}_1$ are periodically formed in the direction of the angle θ ($0<\theta<90$) with respect to the Y axis as the diagonally extending direction, similarly to the diagonal conductors 2501A and 2501B in A in FIG. 262. Then, the diagonal conductor 2521A and the diagonal conductor 2521B of the second region $\mathbf{2531}_2$ are formed such that the first region $\mathbf{2531}_1$ and the second region $\mathbf{2531}_2$ become mirror-symmetrical with respect to the Y direction. The third region $\mathbf{2531}_3$ is formed such that the second region $\mathbf{2531}_2$ and the third region $\mathbf{2531}_3$ become mirror-symmetrical with respect to the X direction. The fourth region $\mathbf{2531}_4$ is formed such that the first region $\mathbf{2531}_1$ and the fourth region $\mathbf{2531}_4$ become mirror-symmetrical with respect to the X direction.

Therefore, the diagonally extending direction of the diagonal conductor 2521A and the diagonal conductor 2521B in the first region $\mathbf{2531}_1$ and the third region $\mathbf{2531}_3$ is the direction of the angle θ with respect to the Y axis, and the diagonally extending direction of the diagonal conductor 2521A and the diagonal conductor 2521B in the second region $\mathbf{2531}_2$ and the fourth region $\mathbf{2531}_4$ is a direction of an angle −θ with respect to the Y axis. Therefore, absolute values of the angle of the diagonally extending direction of the diagonal conductor 2521 in the first region $\mathbf{2531}_1$ and the third region $\mathbf{2531}_3$ and of the angle of the diagonally extending direction of the diagonal conductor 2521 in the second region $\mathbf{2531}_2$ and the fourth region $\mathbf{2531}_4$ are the same. The diagonal conductor 2521A and the diagonal conductor 2521B in each region 2531 are periodically arranged in the direction orthogonal to the diagonally extending direction with the conductor period FSC.

B in FIG. 264 illustrates the conductor layer C of a second modification of the fifteenth configuration example of the three-layer conductor layer.

The conductor layer C in B in FIG. 264 is configured such that the diagonal conductor 2521A and the diagonal conductor 2521B are alternately and periodically arranged, and the diagonal conductor 2521A and the diagonal conductor 2521B in the four first region 2531$_1$ to fourth region 2531$_4$ are mirror-symmetrically arranged in an X-shaped manner with respect to the X and Y directions.

The difference between the conductor layer C of the first modification in A in FIG. 264 and the conductor layer C of the second modification in B in FIG. 264 is the arrangement of the diagonal conductor 2521A and the diagonal conductor 2521B. For example, in the first modification in A in FIG. 264, the center of the entire region of the conductor layer C in the XY directions is a gap, whereas in the second modification in B in FIG. 264, the center of the entire region of the conductor layer C in the XY directions is an intersection of the diagonal conductor 2521B. Other configurations are common to the first modification and the second modification.

A in FIG. 265 illustrates the conductor layer C of a third modification of the fifteenth configuration example of the three-layer conductor layer.

The conductor layer C in A in FIG. 265 is configured such that the diagonal conductor 2521A and the diagonal conductor 2521B are alternately and periodically arranged, and the diagonal conductor 2521A and the diagonal conductor 2521B in the four first region 2531$_1$ to fourth region 2531$_4$ are mirror-symmetrically arranged in a diamond-shaped manner with respect to the X and Y directions.

The difference between the conductor layer C of the first modification in A in FIG. 264 and the conductor layer C of the third modification in A in FIG. 265 is the direction (angle) of the diagonally extending direction of the diagonal conductor 2521A and the diagonal conductor 2521B. The diagonally extending direction of the diagonal conductor 2521A and the diagonal conductor 2521B in the first region 2531$_1$ and the third region 2531$_3$ is the direction of the angle $-\theta$ with respect to the Y axis, and the diagonally extending direction of the diagonal conductor 2521A and the diagonal conductor 2521B in the second region 2531$_2$ and the fourth region 2531$_4$ is the direction of the angle $\theta$ with respect to the Y axis. Other configurations are common to the first modification and the second modification.

B in FIG. 265 illustrates the conductor layer C of a fourth modification of the fifteenth configuration example of the three-layer conductor layer.

The conductor layer C in B in FIG. 265 is configured such that the diagonal conductor 2521A and the diagonal conductor 2521B are alternately and periodically arranged, and the diagonal conductor 2521A and the diagonal conductor 2521B in the four first region 2531$_1$ to fourth region 2531$_4$ are mirror-symmetrically arranged in a diamond-shaped manner with respect to the X and Y directions.

The difference between the conductor layer C of the third modification in A in FIG. 265 and the conductor layer C of the fourth modification in B in FIG. 265 is the arrangement of the diagonal conductor 2521A and the diagonal conductor 2521B. For example, in the third modification in A in FIG. 265, the diagonal conductor 2521A and the diagonal conductor 2521B are periodically arranged having the diagonal conductor 2521A as the center of the entire region of the conductor layer C in the XY directions, whereas in the fourth modification in B in FIG. 265, the diagonal conductor 2521A and the diagonal conductor 2521B are periodically arranged having the diagonal conductor 2521B as the center of the entire region of the conductor layer C in the XY directions. Other configurations are common to the third modification and the fourth modification.

In the first to fourth modifications in FIGS. 264 and 265, the diagonal conductor 2521A (first conductor) periodically arranged in the first region 2531$_1$ with the conductor period FSCA (first periodic width), the diagonal conductor 2521B (second conductor) periodically arranged in the first region 2531$_1$ with the conductor period FSCB (second periodic width), the diagonal conductor 2521A (third conductor) periodically arranged in the second region 2531$_2$ different from the first region 2531$_1$ with the conductor period FSCA (third periodic width), and the diagonal conductor 2521B (fourth conductor) periodically arranged in the second region 2531$_2$ with the conductor period FSCB (fourth periodic width) are included.

The first region 2531$_1$ and the second region 2531$_2$ have a mirror-symmetrical or substantially mirror-symmetrical conductor structure in the Y direction (first direction), and the first power supply (Vss) connected to the diagonal conductor 2521A (first conductor) in the first region 2531$_1$ and the diagonal conductor 2521A (third conductor) in the second region 2531$_2$ and the second power supply (Vdd) connected to the diagonal conductor 2521B (second conductor) in the first region 2531$_1$ and the diagonal conductor 2521B (fourth conductor) in the second region 2531$_2$ have different voltage values.

In the first to fourth modifications, the conductor period FSCA (first periodic width) of the diagonal conductor 2521A (first conductor) in the first region 2531$_1$ and the conductor period FSCB (second periodic width) of the diagonal conductor 2521B (second conductor width) are the same (FSC=FSCA=FSCB), but do not have to be the same as long as the conductor periods have a rational number relationship. Similarly, the conductor period FSCA (third periodic width) of the diagonal conductor 2521A (third conductor) in the second region 2531$_2$ and the conductor period FSCB (fourth periodic width) of the diagonal conductor 2521B (fourth conductor) in the second region 2531$_2$ are the same (FSC=FSCA=FSCB), but do not have to be the same as long as the conductor periods have a rational number relationship. The rational number relationship is defined as "A and B are in the rational number relationship" when the relationship of "a real number A×an integer a=a real number B×an integer b" holds.

The conductor period FSCA (first periodic width) of the diagonal conductor 2521A (first conductor) in the first region 2531$_1$ and the conductor period FSCB (fourth periodic width) of the diagonal conductor 2521B (fourth conductor) in the second region 2531$_2$ are the same or substantially the same.

In this case, the sum of the conductive areas within a predetermined range of the diagonal conductor 2521A (first conductor) in the first region 2531$_1$ and the diagonal conductor 2521A (third conductor) in the second region 2531$_2$, and the sum of the conductive areas within the predetermined range of the diagonal conductor 2521B (second conductor) in the first region 2531$_1$ and the diagonal conductor 2521B (fourth conductor) in the second region 2531$_2$ are the same.

Furthermore, the sum of the conductor widths within a predetermined range of the diagonal conductor 2521A (first conductor) in the first region 2531$_1$ and the diagonal conductor 2521A (third conductor) in the second region 2531$_2$, and the sum of the conductor widths within the predetermined range of the diagonal conductor 2521B (second conductor) in the first region $2531_1$ and the diagonal conductor 2521B (fourth conductor) of the second region $2531_2$ are the same.

Furthermore, in the first to fourth modifications of the conductor layer C in FIGS. 264 and 265, the diagonal conductor 2521A (fifth conductor) periodically arranged in the third region $2531_3$ with the conductor period FSC (fifth periodic width), the diagonal conductor 2521B (sixth conductor) periodically arranged in the third region $2531_3$ with the conductor period FSC (sixth periodic width), the diagonal conductor 2521A (seventh conductor) periodically arranged in the fourth region $2531_4$ different from the third region $2531_3$ with the conductor period FSC (seventh periodic width), and the diagonal conductor 2521B (eighth conductor) periodically arranged in the fourth region $2531_4$ with the conductor period FSC (eighth periodic width) are included.

The third region $2531_3$ and the fourth region $2531_4$ have a mirror-symmetrical or substantially mirror-symmetrical conductor structure in the Y direction (first direction), and the first power supply (Vss) connected to the diagonal conductor 2521A (fifth conductor) in the third region $2531_3$ and the diagonal conductor 2521A (seventh conductor) in the fourth region $2531_4$ and the second power supply (Vdd) connected to the diagonal conductor 2521B (sixth conductor) in the third region $2531_3$ and the diagonal conductor 2521B (eighth conductor) in the fourth region $2531_4$ have different voltage values.

In the first to fourth modifications, the conductor period FSCA (fifth periodic width) of the diagonal conductor 2521A (fifth conductor) in the third region $2531_3$ and the conductor period FSCB (sixth period width) of the diagonal conductor 2521B (sixth conductor) are the same (FSC=FSCA=FSCB), but do not have to be the same as long as the conductor periods have a rational number relationship. Similarly, the conductor period FSCA (seventh periodic width) of the diagonal conductor 2521A (seventh conductor) in the fourth region $2531_4$ and the conductor period FSCB (eighth period width) of the diagonal conductor 2521B (eighth conductor) in the fourth region $2531_4$ are the same (FSC=FSCA=FSCB), but do not have to be the same as long as the conductor periods have a rational number relationship.

The conductor period FSCA (fifth periodic width) of the diagonal conductor 2521A (fifth conductor) in the third region $2531_3$ and the conductor period FSCB (eighth conductor period) of the diagonal conductor 2521B (eighth conductor) in the fourth region $2531_4$ are the same or substantially the same.

In this case, the sum of the conductive areas within a predetermined range of the diagonal conductor 2521A (fifth conductor) in the third region $2531_3$ and the diagonal conductor 2521A (seventh conductor) in the fourth region $2531_4$, and the sum of the conductive areas within the predetermined range of the diagonal conductor 2521B (sixth conductor) in the third region $2531_3$ and the diagonal conductor 2521B (eighth conductor) in the fourth region $2531_4$ are the same.

Furthermore, the sum of the conductor widths within a predetermined range of the diagonal conductor 2521A (fifth conductor) in the third region $2531_3$ and the diagonal conductor 2521A (seventh conductor) in the fourth region $2531_4$, and the sum of the conductor widths within a predetermined range of the diagonal conductor 2521B (sixth conductor) in the third region $2531_3$ and the diagonal conductor 2521B (eighth conductor) in the fourth region $2531_4$ are the same.

Then, the first region $2531_1$ and the second region $2531_2$ have a mirror-symmetrical or substantially mirror-symmetrical conductor structure even in the X direction (second direction) orthogonal to the Y direction (first direction). Therefore, the first region $2531_1$ and the fourth region $2531_4$ have a mirror-symmetrical or substantially mirror-symmetrical conductor structure in the X direction (second direction), and the second region $2531_2$ and the third region $2531_3$ have a mirror-symmetrical or substantially mirror-symmetrical conductor structure in the X direction (second direction).

As described above, in the first to fourth modifications in FIGS. 264 and 265, the diagonal conductors 2521A and 2521B have a mirror-symmetrical conductor structure in the X and Y directions in units of regions 2531. Thereby, the capacitive noise generated from the conductors can be completely canceled in both the X and Y directions.

A in FIG. 266 illustrates the conductor layer C of a fifth modification of the fifteenth configuration example of the three-layer conductor layer.

The conductor layer C in A in FIG. 266 is a conductor layer having a low sheet resistance through which a current easily flows, and a linear conductor 2631A and a linear conductor 2631B long in the Y direction are alternately and periodically arranged in the X direction. The linear conductor 2631A is, for example, wiring (Vss wiring) connected to the GND and the negative power supply, and the linear conductor 2631B is, for example, wiring (Vdd wiring) connected to the positive power supply.

Furthermore, assuming that the conductor layer C is divided into a first region 26321 and a second region 26322 with reference to a center line in the X direction of the entire region, the linear conductors 2631A and 2531B in the regions 2632 are mirror-symmetrically arranged with respect to the X direction.

B in FIG. 266 illustrates the conductor layer C of a sixth modification of the fifteenth configuration example of the three-layer conductor layer.

The conductor layer C in B in FIG. 266 is configured such that the linear conductor 2631A and the linear conductor 2631B are alternately and periodically arranged in the X direction, and the linear conductor 2631A and the linear conductor 2631B in the first region 26321 and the second region 26322 are mirror-symmetrically arranged with respect to the X direction.

The difference between the conductor layer C of the fifth modification in A in FIG. 266 and the conductor layer C of the sixth modification in B in FIG. 266 is the arrangement of the linear conductor 2631A and the linear conductor 2631B. For example, in the fifth modification in A in FIG. 266, the linear conductor 2631A is arranged on the center line in the X direction of the entire region of the conductor layer C, whereas in the sixth modification in B in FIG. 266, there is a gap on the center line in the X direction of the entire region of the conductor layer C. Other configurations are common to the fifth modification and the sixth modification.

The fifth modification and the sixth modification can completely cancel the capacitive noise generated from the conductors in the X direction.

A in FIG. 267 illustrates the conductor layer C of a seventh modification of the fifteenth configuration example of the three-layer conductor layer.

The conductor layer C in A in FIG. 267 is a conductor layer having a low sheet resistance through which a current easily flows, and a linear conductor 2633A and a linear conductor 2633B long in the X direction are alternately and periodically arranged in the Y direction. The linear conductor 2633A is, for example, wiring (Vss wiring) connected to the GND and the negative power supply, and the linear conductor 2633B is, for example, wiring (Vdd wiring) connected to the positive power supply.

Furthermore, assuming that the conductor layer C is divided into a first region 26341 and a second region 26342 with reference to a center line in the Y direction of the entire region, the linear conductors 2633A and 2533B in the regions 2634 are mirror-symmetrically arranged with respect to the Y direction.

B in FIG. 267 illustrates the conductor layer C of an eighth modification of the fifteenth configuration example of the three-layer conductor layer.

The conductor layer C in B in FIG. 267 is configured such that the linear conductor 2633A and the linear conductor 2633B are alternately and periodically arranged in the Y direction, and the linear conductor 2633A and the linear conductor 2633B in the first region 26341 and the second region 26342 are mirror-symmetrically arranged with respect to the Y direction.

The difference between the conductor layer C of the seventh modification in A in FIG. 267 and the conductor layer C of the eighth modification in B in FIG. 267 is the arrangement of the linear conductor 2633A and the linear conductor 2633B. For example, in the seventh modification in A in FIG. 267, the linear conductor 2633A is arranged on the center line in the Y direction of the entire region of the conductor layer C, whereas in the eighth modification in B in FIG. 267, there is a gap on the center line in the Y direction of the entire region of the conductor layer C. Other configurations are common to the fifth modification and the sixth modification.

The seventh modification and the eighth modification can completely cancel the capacitive noise generated from the conductors in the Y direction.

A in FIG. 268 illustrates the conductor layer C of a ninth modification of the fifteenth configuration example of the three-layer conductor layer.

The conductor layer C in A in FIG. 268 is a conductor layer having a low sheet resistance through which an electric current easily flows, and is configured by alternately and periodically arranging the conductors 2651A and 2651B having a shape of a combination of a linear conductor extending in the Y direction and a diagonal conductor in the diagonal direction. Furthermore, the conductor layer C has a configuration in which the conductors 2651A and 2651B of each region 2531 are mirror-symmetrically arranged with respect to the X direction and the Y direction. The conductor 2651A is, for example, wiring (Vss wiring) connected to the GND and the negative power supply, and the conductor 2651B is, for example, wiring (Vdd wiring) connected to the positive power supply.

The ninth modification can completely cancel the capacitive noise generated from the conductors in the X direction and can partially cancel the capacitive noise in the Y direction.

B in FIG. 268 illustrates the conductor layer C of a tenth modification of the fifteenth configuration example of the three-layer conductor layer.

The conductor layer C in B in FIG. 268 is a conductor layer having a low sheet resistance through which an electric current easily flows, and is configured by alternately and periodically arranging the conductors 2652A and 2652B having a shape of a combination of a linear conductor extending in the Y direction and a diagonal conductor in the diagonal direction. Furthermore, the conductor layer C has a configuration in which the conductors 2652A and 2652B of each region 2531 are mirror-symmetrically arranged with respect to the X direction and the Y direction. The conductor 2652A is, for example, wiring (Vss wiring) connected to the GND and the negative power supply, and the conductor 2652B is, for example, wiring (Vdd wiring) connected to the positive power supply.

The tenth modification can completely cancel the capacitive noise generated from the conductors in the X direction and can partially cancel the capacitive noise in the Y direction.

A in FIG. 269 illustrates the conductor layer C of an eleventh modification of the fifteenth configuration example of the three-layer conductor layer.

The conductor layer C in A in FIG. 269 is a conductor layer having a low sheet resistance through which an electric current easily flows, and is configured by alternately and periodically arranging the conductors 2653A and 2653B having a shape of a combination of a linear conductor extending in the X direction and a diagonal conductor in the diagonal direction. Furthermore, the conductor layer C has a configuration in which the conductors 2653A and 2653B of each region 2531 are mirror-symmetrically arranged with respect to the X direction and the Y direction. The conductor 2653A is, for example, wiring (Vss wiring) connected to the GND and the negative power supply, and the conductor 2653B is, for example, wiring (Vdd wiring) connected to the positive power supply.

The eleventh modification can completely cancel the capacitive noise generated from the conductors in the Y direction and can partially cancel the capacitive noise in the X direction.

B in FIG. 269 illustrates the conductor layer C of a twelfth modification of the fifteenth configuration example of the three-layer conductor layer.

The conductor layer C in B in FIG. 269 is a conductor layer having a low sheet resistance through which an electric current easily flows, and is configured by alternately and periodically arranging the conductors 2654A and 2654B having a shape of a combination of a linear conductor extending in the X direction and a diagonal conductor in the diagonal direction. Furthermore, the conductor layer C has a configuration in which the conductors 2654A and 2654B of each region 2531 are mirror-symmetrically arranged with respect to the X direction and the Y direction. The conductor 2654A is, for example, wiring (Vss wiring) connected to the GND and the negative power supply, and the conductor 2654B is, for example, wiring (Vdd wiring) connected to the positive power supply.

The twelfth modification can completely cancel the capacitive noise generated from the conductors in the Y direction and can partially cancel the capacitive noise in the X direction.

A in FIG. 270 illustrates the conductor layer C of a thirteenth modification of the fifteenth configuration example of the three-layer conductor layer.

The conductor layer C in A in FIG. 270 is a conductor layer having a low sheet resistance through which an electric current easily flows, and is configured by alternately and periodically arranging the conductors 2655A and 2655B having a shape of a combination of a linear conductor extending in the X or Y direction and a diagonal conductor in the diagonal direction. Furthermore, the conductor layer C has a configuration in which the conductors 2655A and 2655B of each region 2531 are mirror-symmetrically arranged with respect to the X direction and the Y direction. Conductors 2656A and 2656B are not arranged in a central region including a mirror-symmetrical reference point. The conductor 2655A is, for example, wiring (Vss wiring) connected to the GND and the negative power supply, and the conductor 2655B is, for example, wiring (Vdd wiring) connected to the positive power supply.

The thirteenth modification can partially cancel the capacitive noise generated from the conductors in the X direction and can partially cancel the capacitive noise in the Y direction. Note that there are also positions where the capacitive noise generated from the conductor can be completely canceled in the X direction or in the Y direction.

B in FIG. 270 illustrates the conductor layer C of a fourteenth modification of the fifteenth configuration example of the three-layer conductor layer.

The conductor layer C in B in FIG. 270 is a conductor layer having a low sheet resistance through which an electric current easily flows, and is configured by alternately and periodically arranging the conductors 2656A and 2656B having a shape of a combination of a linear conductor extending in the X or Y direction and a diagonal conductor in the diagonal direction. Furthermore, the conductor layer C has a configuration in which the conductors 2656A and 2656B of each region 2531 are mirror-symmetrically arranged with respect to the X direction and the Y direction. Conductors 2656A and 2656B are not arranged in a central region including a mirror-symmetrical reference point. The conductor 2656A is, for example, wiring (Vss wiring) connected to the GND and the negative power supply, and the conductor 2656B is, for example, wiring (Vdd wiring) connected to the positive power supply.

The fourteenth modification can partially cancel the capacitive noise generated from the conductors in the X direction and can partially cancel the capacitive noise in the Y direction. Note that there are also positions where the capacitive noise generated from the conductor can be completely canceled in the X direction or in the Y direction.

In FIGS. 264 to 270, regarding the conductor layer C divided into the four first region $\mathbf{2531}_1$ to fourth region $\mathbf{2531}_4$ and mirror-symmetrically formed, two regions 2531 may be omitted, and the remaining two regions 2531 may be mirror-symmetrical in the X or Y direction.

In the first to fourteenth modifications illustrated in FIGS. 264 to 270, examples of the diagonal conductors have been described, but at least a part or all of the diagonal conductors can be replaced with stepped conductors.

In the fifteenth configuration example in FIGS. 262 to 270, an example in which the diagonal conductor or the stepped conductor is adopted for the conductor layer C in the three-layer stacked structure of the conductor layers A to C has been described. However, the above-described diagonal conductor or stepped conductor may be adopted for the conductor layer A or the conductor layer B. Furthermore, the above-described diagonal conductor or stepped conductor may be adopted for a plurality of layers of the conductor layers A to C. Moreover, the above-described diagonal conductor or stepped conductor may be adopted for a single conductor layer (wiring layer) that is not stacked. In addition, in the fifteenth configuration example in FIGS. 262 to 270, the conductor layer C has been described as a conductor layer having a low sheet resistance in which a current easily flows, but the conductor layer C may be a conductor having a high sheet resistance in which a current does not easily flow.

<Effect of Mirror-Symmetrical Arrangement>

The effect of the mirror-symmetrical arrangement will be described with reference to FIGS. 271 and 272.

A conductor layer 2711 in A in FIG. 271 is configured by alternately and periodically arranging a linear conductor 2712A as the Vss wiring and a linear conductor 2712B as the Vdd wiring in the X direction.

The conductor layer 2711 in B in FIG. 271 is configured by alternately and periodically arranging a linear conductor 2713A as the Vss wiring and a linear conductor 2713B as the Vdd wiring in the diagonal direction.

Consider a case in which MOS transistors are arranged at positions shifted in the Z direction in a central region 2714 of the conductor layer 2711 including the linear conductor 2712 or the diagonal conductor 2713, and the linear conductor 2712 or the diagonal conductor 2713 is electrically connected to the MOS transistors.

A pad region 2715 in which a pad (electrode) that supplies a predetermined power supply voltage to the linear conductor 2712 or the diagonal conductor 2713 is arranged is a peripheral portion along the extending direction of the linear conductor 2712 or the diagonal conductor 2713 overlapping with the central region 2714, as illustrated in A or B in FIG. 271.

In a case of adopting the mirror-symmetrical arrangement of the conductor layer C of the first modification of the fifteenth configuration example illustrated in A in FIG. 264 for the above-described configuration, for example, a pad region 2811 in which a pad for supplying a predetermined power supply voltage to the diagonal conductor 2521 is arranged is arranged as in A in FIG. 272. The pad region 2811 in A in FIG. 272 is wider than pad region 2715 in A and B in FIG. 271. That is, the pad region can be expanded by arranging the diagonal conductor or the stepped conductor in the mirror-symmetrical arrangement. Since the pads can be effectively arranged, the degree of freedom of pad arrangement is improved, and many pads can be arranged. Therefore, IR-Drop (voltage drop) may be able to be improved.

Furthermore, in the case of adopting the mirror-symmetrical arrangement for each of the two conductor layers, for example, in the case of adopting the structure of the first modification of the fifteenth configuration example illustrated in A in FIG. 264 for the conductor layer A and adopting the structure of the third modification of the fifteenth configuration example illustrated in A in FIG. 265 for the conductor layer B, the pad region 2811 can be arranged as illustrated in B in FIG. 272, and the pad region can be further expanded. The pad region can be similarly expanded in the case of adopting the structure of the third modification of the fifteenth configuration example illustrated in A in FIG. 265 for the conductor layer A and adopting the structure of the first modification of the fifteenth configuration example illustrated in A in FIG. 264 for the conductor layer B.

A in FIG. 273 is a plan view illustrating a stacked state in the case of adopting the structure of the first modification of the fifteenth configuration example illustrated in A in FIG. 264 for the conductor layer A and adopting the structure of the second modification of the fifteenth configuration example illustrated in B in FIG. 264 for the conductor layer B. The stacked structure in the case of adopting the structure of the second modification of the fifteenth configuration example illustrated in B in FIG. 264 for the conductor layer A and adopting the structure of the first modification of the fifteenth configuration example illustrated in A in FIG. 264 for the conductor layer B is also similar.

B in FIG. 273 is a plan view illustrating a stacked state in the case of adopting the structure of the third modification of the fifteenth configuration example illustrated in A in FIG. 265 for the conductor layer A and adopting the structure of the fourth modification of the fifteenth configuration example illustrated in B in FIG. 265 for the conductor layer B. The stacked structure in the case of adopting the structure of the fourth modification of the fifteenth configuration example illustrated in B in FIG. 265 for the conductor layer A and adopting the structure of the third modification of the fifteenth configuration example illustrated in A in FIG. 265 for the conductor layer B is also similar.

When adopting the stacked layer of the conductor layers having the mirror arrangement structure, the light-shielding structure can be formed.

First Configuration Example of Mirror-Symmetrical Arrangement with Gap

Next, another configuration example of the mirror-symmetrical conductor layers will be described.

In the above-described example, the mirror-symmetrically arranged regions 2531 are continuously arranged without a gap, whereas a conductor layer 2861 in FIG. 274 is an example of a configuration in which the mirror-symmetrically arranged conductor regions are non-continuously arranged with a gap.

FIG. 274 is a plan view illustrating a first configuration example of a conductor layer (wiring layer) having mirror-symmetrically arranged conductors with a gap.

The conductor layer 2861 in FIG. 274 includes a first conductor region 2851-1 and a second conductor region 2851-2 and a gap region 2852 therebetween, and a conductor arranged in at least a part of the first conductor region 2851-1 and a conductor arranged in at least a part of the second conductor region 2851-2 are mirror-symmetrically arranged in the Y direction. That is, the first conductor region 2851-1 and the second conductor region 2851-2 are symmetrically arranged with respect to a center line L2861 in the Y direction of the conductor layer 2861.

The conductor layer 2861 can be applied as at least one of the conductor layers A to C and can also be used as a single-layer conductor layer.

In the conductor layer 2861, a pad region 2862 can be arranged on each side of outer peripheral portions of a region including the first conductor region 2851-1, the second conductor region 2851-2, and the gap region 2852. The pad region 2862 does not have to be arranged on all the four sides but may be arranged on at least one side. Furthermore, the pads do not have to be arranged in the entire pad region 2862, and some pads may be arranged. Another conductor region may be provided between the first conductor region 2851-1 and the second conductor region 2851-2, and the pad region 2862.

The timings at which transistors operate may be the same or substantially the same, or different between a transistor group connected to the conductor in the first conductor region 2851-1 and a transistor group connected to the conductor in the second conductor region 2851-2. In the case where the timings at which transistors operate are different between the transistor group in the first conductor region 2851-1 and the transistor group in the second conductor region 2851-2, the capacitive noise in the Y direction generated from the conductors can be reduced.

FIGS. 275 to 277 illustrate examples of conductors that can be arranged in the first conductor region 2851-1 and the second conductor region 2851-2 that are mirror-symmetrical in the Y direction.

FIG. 275 illustrates a first conductor example that can be arranged in the first conductor region 2851-1 and the second conductor region 2851-2 in FIG. 274, which are mirror-symmetrical in the Y direction.

A in FIG. 275 illustrates conductors arranged in the first conductor region 2851-1. In the first conductor region 2851-1, a linear conductor 2871A as the Vss wiring and a linear conductor 2871B as the Vdd wiring are alternately and periodically arranged in the X direction.

B in FIG. 275 illustrates conductors arranged in the second conductor region 2851-2. In the second conductor region 2851-2, a linear conductor 2872A as the Vss wiring and a linear conductor 2872B as the Vdd wiring are alternately and periodically arranged in the X direction.

According to the conductor configuration in FIG. 275, the capacitive noise generated from the conductor can be completely canceled in the X direction.

FIG. 276 illustrates a second conductor example that can be arranged in the first conductor region 2851-1 and the second conductor region 2851-2 in FIG. 274, which are mirror-symmetrical in the Y direction.

A in FIG. 276 illustrates conductors arranged in the first conductor region 2851-1. In the first conductor region 2851-1, a rectangular conductor 2881A as the Vss wiring and a rectangular conductor 2881B as the Vdd wiring are alternately and periodically arranged in the X and Y directions.

B in FIG. 276 illustrates conductors arranged in the second conductor region 2851-2. In the second conductor region 2851-2, a rectangular conductor 2882A as the Vss wiring and a rectangular conductor 2882B as the Vdd wiring are alternately and periodically arranged in the X and Y directions.

According to the conductor configuration in FIG. 276, the capacitive noise generated from the conductors can be completely canceled in the X direction and can be partially canceled in the Y direction.

FIG. 277 illustrates a third conductor example that can be arranged in the first conductor region 2851-1 and the second conductor region 2851-2 in FIG. 274, which are mirror-symmetrical in the Y direction.

A in FIG. 277 illustrates conductors arranged in the first conductor region 2851-1. In the first conductor region 2851-1, a conductor 2883A as the Vss wiring and a conductor 2883B as the Vdd wiring are alternately and periodically arranged in the X direction. The conductors 2883A and 2883B are conductors having a shape of a combination of a linear conductor extending in the Y direction and a diagonal conductor in the diagonal direction.

B in FIG. 277 illustrates conductors arranged in the second conductor region 2851-2. In the second conductor region 2851-2, a conductor 2884A as the Vss wiring and a conductor 2884B as the Vdd wiring are alternately and periodically arranged in the X direction. The conductors 2884A and 2884B are conductors having a shape of a combination of a linear conductor extending in the Y direction and a diagonal conductor in the diagonal direction.

According to the conductor configuration in FIG. 277, the capacitive noise generated from the conductor can be completely canceled in the X direction and can be partially canceled in the Y direction.

Second Configuration Example of Mirror-Symmetrical Arrangement

FIG. 278 is a plan view illustrating a second configuration example of a conductor layer (wiring layer) having mirror-symmetrically arranged conductors.

A conductor layer 2901 in FIG. 278 includes a first conductor region 2911-1 and a second conductor region 2911-2, and a gap region 2912 therebetween, and a conductor arranged in at least a part of the first conductor region 2911-1 and a conductor arranged in at least a part of the second conductor region 2911-2 are mirror-symmetrically arranged in the Y direction. That is, the first conductor region 2911-1 and the second conductor region 2911-2 are symmetrically arranged with respect to a center line L2901 in the Y direction of the conductor layer 2901. Furthermore, the conductor layer 2901 of the second configuration example is different from the conductor layer 2861 of the first configuration example illustrated in FIG. 274 in that a power supply connected to the conductor arranged in the first conductor region 2911-1 and a power supply connected to the conductor arranged in the second conductor region 2911-2 are inverted in polarity.

The conductor layer 2901 can be applied as at least one of the conductor layers A to C and can also be used as a single-layer conductor layer.

In the conductor layer 2901, a pad region 2902 can be arranged on each side of outer peripheral portions of a region including the first conductor region 2911-1, the second conductor region 2911-2, and the gap region 2912. The pad region 2902 does not have to be arranged on all the four sides but may be arranged on at least one side. Furthermore, the pads do not have to be arranged in the entire pad region 2902, and some pads may be arranged. Another conductor region may be provided between the first conductor region 2911-1 and the second conductor region 2911-2, and the pad region 2902.

The timings at which transistors operate may be the same or substantially the same, or different between a transistor group connected to the conductor in the first conductor region 2911-1 and a transistor group connected to the conductor in the second conductor region 2911-2. In the case where the timings at which transistors operate are the same or substantially the same between the transistor group in the first conductor region 2911-1 and the transistor group in the second conductor region 2911-2, the capacitive noise in the Y direction generated from the conductors can be completely canceled.

FIG. 279 illustrates a first conductor example that can be arranged in the first conductor region 2911-1 and the second conductor region 2911-2 in FIG. 278, which are mirror-symmetrical in the Y direction.

A in FIG. 279 illustrates conductors arranged in the first conductor region 2911-1. In the first conductor region 2911-1, a conductor having the same configuration as the conductor arranged in the first conductor region 2851-1 in FIG. 275 is arranged.

B in FIG. 279 illustrates conductors arranged in the second conductor region 2911-2. In the second conductor region 2911-2, a conductor having a configuration in which the power supply polarity is made opposite to the conductor arranged in the second conductor region 2851-2 in FIG. 275 is arranged.

In other words, in FIG. 275, the polarities of the power supplies to which the linear conductor 2871 and the linear conductor 2872 at the same X position in the first conductor region 2851-1 and the second conductor region 2851-2 are respectively connected are the same.

In contrast, in FIG. 279, the polarities of the power supplies to which the linear conductor 2871 and the linear conductor 2872 at the same X position in the first conductor region 2911-1 and the second conductor region 2911-2 are respectively connected are different (opposite).

According to the conductor configuration in FIG. 279, the capacitive noise generated from the conductors can be completely canceled in the X and Y directions.

FIG. 280 illustrates a second conductor example that can be arranged in the first conductor region 2911-1 and the second conductor region 2911-2 in FIG. 278, which are mirror-symmetrical in the Y direction.

A in FIG. 280 illustrates conductors arranged in the first conductor region 2911-1. In the first conductor region 2911-1, a conductor having the same configuration as the conductor arranged in the first conductor region 2851-1 in FIG. 276 is arranged.

B in FIG. 280 illustrates conductors arranged in the second conductor region 2911-2. In the second conductor region 2911-2, a conductor having a configuration in which the power supply polarity is made opposite to the conductor arranged in the second conductor region 2851-2 in FIG. 276 is arranged.

In other words, in FIG. 276, the polarities of the power supplies to which the rectangular conductor 2881 and the rectangular conductor 2882 at the same X position in the first conductor region 2851-1 and the second conductor region 2851-2 and symmetrical in the Y direction are respectively connected are the same.

In contrast, in FIG. 280, the polarities of the power supplies to which the rectangular conductor 2881 and the rectangular conductor 2882 at the same X position in the first conductor region 2911-1 and the second conductor region 2911-2 and symmetrical in the Y direction are respectively connected are different (opposite).

According to the conductor configuration in FIG. 280, the capacitive noise generated from the conductors can be completely canceled in the X and Y directions.

FIG. 281 illustrates a third conductor example that can be arranged in the first conductor region 2911-1 and the second conductor region 2911-2 in FIG. 278, which are mirror-symmetrical in the Y direction.

A in FIG. 281 illustrates conductors arranged in the first conductor region 2911-1. In the first conductor region 2911-1, a conductor having the same configuration as the conductor arranged in the first conductor region 2851-1 in FIG. 277 is arranged.

B in FIG. 281 illustrates conductors arranged in the second conductor region 2911-2. In the second conductor region 2911-2, a conductor having a configuration in which the power supply polarity is made opposite to the conductor arranged in the second conductor region 2851-2 in FIG. 277 is arranged.

In other words, in FIG. 277, the polarities of the power supplies to which the conductor 2883 and the conductor 2884 at the same X position in the first conductor region 2851-1 and the second conductor region 2851-2 and symmetrical in the Y direction are respectively connected are the same.

In contrast, in FIG. 281, the polarities of the power supplies to which the conductor 2883 and the conductor 2884 at the same X position in the first conductor region 2911-1 and the second conductor region 2911-2 and symmetrical in the Y direction are respectively connected are different (opposite).

According to the conductor configuration in FIG. 281, the capacitive noise generated from the conductors can be completely canceled in the X and Y directions.

FIG. 282 illustrates a fourth conductor example that can be arranged in the first conductor region 2911-1 and the second conductor region 2911-2 in FIG. 278, which are mirror-symmetrical in the Y direction.

A in FIG. 282 illustrates conductors arranged in the first conductor region 2911-1. In the first conductor region 2911-1, a reticulated conductor 2891 as the Vss wiring and a relay conductor 2892 as the Vdd wiring are arranged. Note that for the sake of simplicity, the conductor widths, gap widths, periods, and the like of the reticulated conductor 2891 and the relay conductor 2892 are the same as those of the reticulated conductor 1201 and the relay conductor 1241 of the conductor layer A in B in FIG. 262.

B in FIG. 282 illustrates conductors arranged in the second conductor region 2911-2. In the second conductor region 2911-2, a reticulated conductor 2893 as the Vss wiring and a relay conductor 2894 as the Vdd wiring are arranged. Note that or the sake of simplicity, the conductor widths, gap widths, periods, and the like of the reticulated conductor 2893 and the relay conductor 2894 are the same as those of the reticulated conductor 1202 and the relay conductor 1242 of the conductor layer B in C in FIG. 262.

According to the conductor configuration in FIG. 282, the capacitive noise generated from the conductor can be completely canceled in the Y direction.

FIG. 283 illustrates a fifth conductor example that can be arranged in the first conductor region 2911-1 and the second conductor region 2911-2 in FIG. 274, which are mirror-symmetrical in the Y direction.

The fifth conductor example of FIG. 283 is different from the fourth conductor example in FIG. 282 in that the power supply polarities connected to the reticulated conductor and the relay conductor are inverted.

That is, in the fourth conductor example in FIG. 282, the reticulated conductor 2891 in the first conductor region 2911-1 has been the Vss wiring and the relay conductor 2892 has been the Vdd wiring, whereas in the fifth conductor example in FIG. 283, the reticulated conductor 2895 in the first conductor region 2911-1 is the Vdd wiring and the relay conductor 2896 is the Vss wiring.

Furthermore, in the fourth conductor example in FIG. 282, the reticulated conductor 2893 in the second conductor region 2911-2 has been the Vdd wiring and the relay conductor 2894 has been the Vss wiring, whereas in the fifth conductor example in FIG. 283, the reticulated conductor 2897 in the second conductor region 2911-2 is the Vss wiring, and the relay conductor 2898 is the Vdd wiring.

According to the conductor configuration in FIG. 283, the capacitive noise generated from the conductor can be completely canceled in the Y direction.

Note that, in the case where the first conductor region 2911-1 and the second conductor region 2911-2 include a reticulated conductor as in the conductor configuration in FIGS. 282 and 283, some or all of the relay conductors in the gap may be omitted. In other words, the conductor period of the reticulated conductor and the conductor period of the non-reticulated conductor (relay conductor) can be in a rational number relationship.

Furthermore, the reticulated conductor may be replaced with a planar conductor without providing a gap. Even in this case, the capacitive noise generated from the conductors can be completely canceled in the Y direction.

Furthermore, for example, by inverting the power supply polarities of the first conductor region 2911-1 and the second conductor region 2911-2 in the stacked two conductor layers, as in the stacked layer configuration adopting the fourth conductor example in FIG. 282 for the conductor layer A and the fifth conductor example in FIG. 283 for the conductor layer B, the direction of the loop plane in which the magnetic flux is generated from the Aggressor conductor loop and the direction of the loop plane that generates the induced electromotive force in the Victim conductor loop are different. Therefore, deterioration of an image output from the solid-state imaging device 100 (generation of the inductive noise) can be reduced. The stacked layer configuration of inverting the power supply polarities of the first conductor region 2911-1 and the second conductor region 2911-2 in the overlapping two conductor layers can be similarly applied to the first conductor example in FIG. 279 in which the power supply polarities are inverted between the first conductor region 2911-1 and the second conductor region 2911-2 in the conductor layer, the second conductor example in FIG. 280, and the third conductor example in FIG. 281. Furthermore, in the stacked layer configuration adopting the fourth conductor example in FIG. 282 for the conductor layer A and the fifth conductor example in FIG. 283 for the conductor layer B, the light-shielding structure can be formed by the stacked layer of the conductor layers A and B, and the hot carrier light emission can be shielded.

To effectively cancel the capacitive noise, the conductor widths in the X direction of the conductor arranged in the first conductor region 2911-1 and the conductor arranged in the second conductor region 2911-2 are desirably, but not limited to, the same or substantially the same. For the same reason, the conductor widths in the Y direction are desirably, but not limited to, the same or substantially the same.

Third Configuration Example of Mirror-Symmetrical Arrangement

FIG. 284 is a plan view illustrating a third configuration example of a conductor layer (wiring layer) having mirror-symmetrically arranged conductors.

In FIG. 284, a portion corresponding to the mirror-symmetrical arrangement of the second configuration example illustrated in FIG. 278 is given the same reference numeral and description thereof is omitted as appropriate.

The third configuration example of the mirror-symmetrical arrangement illustrated in FIG. 284 is different from the second configuration example of the mirror-symmetrical arrangement illustrated in FIG. 278 in that a third conductor region 2931 is additionally provided in the gap region 2912 of the second configuration example. The gap region 2912 is formed between the third conductor region 2931 and the first conductor region 2911-1 or the second conductor region 2911-2. Other points of the third configuration example are common to the second configuration example of the mirror-symmetrical arrangement illustrated in FIG. 278.

The first conductor region 2911-1 and the second conductor region 2911-2 are symmetrically arranged with respect to a center line L2921 in the Y direction of a conductor layer 2921, and the polarities of the power supply connected to the conductor arranged in the first conductor region 2911-1 and the power supply connected to the conductor arranged in the second conductor region 2911-2 are inverted. Furthermore, the added third conductor region 2931 is also symmetrically arranged with respect to the center line L2921 in the Y direction of the conductor layer 2921. Therefore, the conductor layer 2921 in FIG. 284 has a mirror-symmetrical arrangement in the Y direction.

The conductor arranged in the third conductor region 2931 is connected to a power supply different from the power supply connected to the conductor arranged in the first conductor region 2911-1 and the conductor arranged in the second conductor region 2911-2, or the timing is different even if the power supply is the same.

Fourth Configuration Example of Mirror-Symmetrical Arrangement

FIG. 285 is a plan view illustrating a fourth configuration example of a conductor layer (wiring layer) having mirror-symmetrically arranged conductors.

A conductor layer 2941 in FIG. 285 includes a first conductor region 2951-1 to a fourth conductor region 2951-4 and a gap region 2952 therebetween.

The conductor arranged in at least a part of the first conductor region 2951-1 and the conductor arranged in at least a part of the second conductor region 2951-2 are symmetrically arranged with respect to a center line L2941 in the Y direction. The polarities of the power supply connected to the conductor arranged in the first conductor region 2951-1 and the power supply connected to the conductor arranged in the second conductor region 2951-2 are inverted.

The conductor arranged in at least a part of the third conductor region 2951-3 and the conductor arranged in at least a part of the fourth conductor region 2951-4 are symmetrically arranged with respect to a center line L2942 in the Y direction. The polarities of the power supply connected to the conductor located in the third conductor region 2951-3 and the power supply connected to the conductor located in the fourth conductor region 2951-4 are inverted.

Furthermore, the power supply connected to the conductor arranged in the first conductor region 2951-1 and the power supply connected to the conductor arranged in the third conductor region 2951-3 are the same, and the power supply connected to the conductor arranged in the second conductor region 2951-2 and the power supply connected to the conductor arranged in the fourth conductor region 2951-4 are the same.

As described above, the conductor layer 2941 is mirror-symmetrically arranged in the Y direction. The conductor layer 2941 can be applied as at least one of the conductor layers A to C and can also be used as a single-layer conductor layer.

In the conductor layer 2941, a pad region 2942 can be arranged on each side of outer peripheral portions of a region including the first conductor regions 2951-1 to the fourth conductor region 2951-4, and the gap region 2952 therebetween. The pad region 2942 does not have to be arranged on all the four sides but may be arranged on at least one side. Furthermore, the pads do not have to be arranged in the entire pad region 2942, and some pads may be arranged. Another conductor region may be provided between the first conductor regions 2951-1 to the fourth conductor region 2951-4, and the gap region 2952 therebetween.

The sum of the conductor width in the Y direction of the conductor arranged in the first conductor region 2951-1 and the conductor width in the Y direction of the conductor arranged in the third conductor region 2951-3 (the sum of Y conductor widths of the Vss conductors) and the sum of the conductor width in the Y direction of the conductor arranged in the second conductor region 2951-2 and the conductor width in the Y direction of the conductor arranged in the fourth conductor region 2951-4 (the sum of Y conductor widths of the Vdd conductors) are desirably, but not limited to, the same or substantially the same. In the case where the sum of the Y conductor width of the Vss conductor and the sum of the Y conductor width of the Vdd conductor are the same, the capacitive noise in the Y direction generated from the conductors can be completely canceled.

Fifth Configuration Example of Mirror-Symmetrical Arrangement

FIG. 286 is a plan view illustrating a fifth configuration example of a conductor layer (wiring layer) having mirror-symmetrically arranged conductors.

A conductor layer 2961 in FIG. 286 includes a first conductor region 2971-1 to a fourth conductor region 2971-4 and a gap region 2972 therebetween.

The conductor arranged in at least a part of the first conductor region 2971-1 and the conductor arranged in at least a part of the second conductor region 2971-2 are symmetrically arranged with respect to a center line L2961 in the Y direction. The polarities of the power supply connected to the conductor arranged in the first conductor region 2971-1 and the power supply connected to the conductor arranged in the second conductor region 2971-2 are inverted.

The conductor arranged in at least a part of the third conductor region 2971-3 and the conductor arranged in at least a part of the fourth conductor region 2971-4 are symmetrically arranged with respect to a center line L2962 in the Y direction. The polarities of the power supply connected to the conductor arranged in the third conductor region 2971-3 and the power supply connected to the conductor arranged in the fourth conductor region 2971-4 are inverted.

Furthermore, the power supply connected to the conductor arranged in the first conductor region 2971-1 and the power supply connected to the conductor arranged in the third conductor region 2971-3 are the same, and the power supply connected to the conductor arranged in the second conductor region 2971-2 and the power supply connected to the conductor arranged in the fourth conductor region 2971-4 are the same. In the fifth configuration example in FIG. 286, the positions of the third conductor region 2971-3 and the fourth conductor region 2971-4 are interchanged as compared with the fourth configuration example in FIG. 285.

As described above, the conductor layer 2961 is mirror-symmetrically arranged in the Y direction. The conductor layer 2961 can be applied as at least one of the conductor layers A to C and can also be used as a single-layer conductor layer.

In the conductor layer 2961, a pad region 2962 can be arranged on each side of outer peripheral portions of a region including the first conductor regions 2971-1 to the fourth conductor region 2971-4, and the gap region 2972 therebetween. The pad region 2962 does not have to be arranged on all the four sides but may be arranged on at least one side. Furthermore, the pads do not have to be arranged in the entire pad region 2962, and some pads may be arranged. Another conductor region may be provided between the first conductor regions 2971-1 to the fourth conductor region 2971-4, and the gap region 2972 therebetween.

The sum of the conductor width in the Y direction of the conductor arranged in the first conductor region 2971-1 and the conductor width in the Y direction of the conductor arranged in the third conductor region 2971-3 (the sum of Y conductor widths of the Vss conductors) and the sum of the conductor width in the Y direction of the conductor arranged in the second conductor region 2971-2 and the conductor width in the Y direction of the conductor arranged in the fourth conductor region 2971-4 (the sum of Y conductor widths of the Vdd conductors) are desirably, but not limited to, the same or substantially the same. In the case where the sum of the Y conductor width of the Vss conductor and the sum of the Y conductor width of the Vdd conductor are the same, the capacitive noise in the Y direction generated from the conductors can be completely canceled.

Sixth Configuration Example of Mirror-Symmetrical Arrangement

FIG. 287 is a plan view illustrating a sixth configuration example of a conductor layer (wiring layer) having mirror-symmetrically arranged conductors.

A conductor layer 2981 in FIG. 287 includes a first conductor region 2991-1 to a third conductor region 2991-3 and a gap region 2992 therebetween.

The conductor arranged in at least a part of the first conductor region 2991-1 and the conductor arranged in at least a part of the third conductor region 2991-3 are symmetrically arranged with respect to a center line L2981 in the Y direction. The conductor arranged in at least a part of the second conductor region 2991-2 is also arranged symmetrically with respect to the center line L2981 in the Y direction.

The power supply connected to the conductor arranged in the first conductor region 2991-1 and the power supply connected to the conductor arranged in the third conductor region 2991-3 are the same, the polarities of the power supplies are opposite to the polarity of the power supply connected to the conductor arranged in the second conductor region 2991-2.

As described above, the conductor layer 2981 is mirror-symmetrically arranged in the Y direction. The conductor layer 2981 can be applied as at least one of the conductor layers A to C and can also be used as a single-layer conductor layer.

In the conductor layer 2981, a pad region 2982 can be arranged on each side of outer peripheral portions of a region including the first conductor regions 2991-1 to the third conductor region 2991-3, and the gap region 2992 therebetween. The pad region 2982 does not have to be arranged on all the four sides but may be arranged on at least one side. Furthermore, the pads do not have to be arranged in the entire pad region 2982, and some pads may be arranged. Another conductor region may be provided between the first conductor regions 2991-1 to the third conductor region 2991-3, and the gap region 2992 therebetween.

The sum of the conductor width in the Y direction of the conductor arranged in the first conductor region 2991-1 and the conductor width in the Y direction of the conductor arranged in the third conductor region 2991-3 (the sum of Y conductor widths of the Vss conductors) and the sum of the conductor widths in the Y direction of the conductors arranged in the second conductor region 2991-2 (the sum of Y conductor widths of the Vdd conductor) are desirably, but not limited to, the same or substantially the same. In the case where the sum of the Y conductor width of the Vss conductor and the sum of the Y conductor width of the Vdd conductor are the same, the capacitive noise in the Y direction generated from the conductors can be completely canceled.

In the first to sixth configuration examples of the mirror-symmetrical arrangement, the polarity of the power supply to which each conductor is connected may be the opposite of the above-described example. That is, in the above-described first to sixth configuration examples, for example, the wiring connected to the GND or the negative power supply (Vss wiring) may be the wiring connected to the positive power supply (Vdd wiring), and the wiring (Vdd wiring) connected to the positive power supply may be the wiring (Vss wiring) connected to the GND or the negative power supply.

In the first to sixth configuration examples of the mirror-symmetrical arrangement, the dimensional difference and the angular difference described as being the same may be substantially the same. The substantially the same is a difference in a range that can be regarded as the same, but for example, the difference is a difference in a range not exceeding at least twice. The mirror symmetry may also be substantially mirror symmetry. The substantially mirror symmetry is, for example, a difference in a range in which the structural dimensional difference or angular difference do not exceed at least twice.

17. Configuration Example of Imaging Device

For example, the above-described solid-state imaging device 100 can be applied to a camera system such as a digital camera or a video camera, a mobile phone having an imaging function, another device having an imaging function, or an electronic device including a semiconductor device including a high-sensitivity analog element such as a flash memory.

FIG. 288 is a block diagram illustrating a configuration example of an imaging device 700 as an example of the electronic device.

The imaging device 700 includes a solid-state image sensor 701, an optical system 702 that guides incident light to the solid-state image sensor 701, a shutter mechanism 703 provided between the solid-state image sensor 701 and the optical system 702, and a drive circuit 704 that drives the solid-state image sensor 701. Moreover, the imaging device 700 includes a signal processing circuit 705 that processes an output signal of the solid-state image sensor 701.

The solid-state image sensor 701 corresponds to the above-described solid-state imaging device 100. The optical system 702 includes an optical lens group or the like, and causes image light (incident light) from an object to be incident on the solid-state image sensor 701. Thereby, a signal charge is accumulated in the solid-state image sensor 701 for a fixed period. The shutter mechanism 703 controls a light irradiation period and a light blocking period of the incident light on the solid-state image sensor 701.

The drive circuit 704 supplies a drive signal to the solid-state image sensor 701 and the shutter mechanism 703. Then, the drive circuit 704 controls a signal output operation of the solid-state image sensor 701 to the signal processing circuit 705 and a shutter operation of the shutter mechanism 703 by the supplied drive signal. That is, in this example, a signal transfer operation from the solid-state image sensor 701 to the signal processing circuit 705 is performed by the drive signal (timing signal) supplied from the drive circuit 704.

The signal processing circuit 705 applies various types of signal processing to the signal transferred from the solid-state image sensor 701. Then, the signal (video signal) to which the various types of signal processing have been applied is stored in a storage medium (not illustrated) such as a memory, or output to a monitor (not illustrated).

According to the electronic device such as the above-described imaging device 700, noise generation due to leakage of light such as hot carrier light emission from an active element such as a MOS transistor or a diode into a light-receiving element during operation in a peripheral circuit can be suppressed in the solid-state image sensor 701. Therefore, a high-quality electronic device with improved image quality can be provided.

18. Application to In-Vivo Information Acquisition System

The technology according to the present disclosure (present technology) can be applied to various products. For example, the technology according to the present disclosure may be applied to an in-vivo information acquisition system for patients using a capsule endoscope.

FIG. 289 is a block diagram illustrating an example of a schematic configuration of an in-vivo information acquisition system for patients using a capsule endoscope, to which the technology according to the present disclosure is applicable.

An in-vivo information acquisition system 10001 includes a capsule endoscope 10100 and an external control device 10200.

The capsule endoscope 10100 is swallowed by a patient at the time of examination. The capsule endoscope 10100 has an imaging function and a wireless communication function, and sequentially captures images of inside of organs (hereinafter also referred to as in-vivo images) at predetermined intervals while moving inside the organs such as stomach and intestine by peristaltic movement or the like until the patient naturally discharges the capsule endoscope 10100, and sequentially wirelessly transmits information of the in-vivo images to the external control device 10200 outside the body.

The external control device 10200 comprehensively controls the operation of the in-vivo information acquisition system 10001. Furthermore, the external control device 10200 receives information regarding the in-vivo image transmitted from the capsule endoscope 10100, and transmits image data for displaying the in-vivo image to the display device (not illustrated) on the basis of the information regarding the received in-vivo image.

As described above, the in-vivo information acquisition system 10001 can acquire the in-vivo images obtained by imaging the inside of the patient's body from time to time during a period from when the capsule endoscope 10100 is swallowed to when the capsule endoscope 10100 is discharged.

The configurations and functions of the capsule endoscope 10100 and the external control device 10200 will be described in more detail.

The capsule endoscope 10100 has a capsule-shaped housing 10101, and a light source unit 10111, an imaging unit 10112, an image processing unit 10113, a wireless communication unit 10114, a power feed unit 10115, a power supply unit 10116, and a control unit 10117 are housed inside the housing 10101.

The light source unit 10111 includes, for example, a light source such as a light emitting diode (LED), and irradiates an imaging field of view of the imaging unit 10112 with light.

The imaging unit 10112 includes an optical system including an imaging element and a plurality of lenses provided in front of the imaging element. Reflected light (hereinafter referred to as observation light) of the light radiated on a body tissue that is an observation target is collected by the optical system and enters the imaging element. The imaging unit 10112 photoelectrically converts the observation light having entered the imaging element to generate an image signal corresponding to the observation light. The image signal generated by the imaging unit 10112 is provided to the image processing unit 10113.

The image processing unit 10113 includes processors such as a central processing unit (CPU) and a graphics processing unit (GPU), and performs various types of signal processing for the image signal generated by the imaging unit 10112. The image processing unit 10113 provides the image signal to which the signal processing has been applied to the wireless communication unit 10114 as raw data.

The wireless communication unit 10114 performs predetermined processing such as modulation processing for the image signal to which the signal processing has been applied by the image processing unit 10113 and transmits the image signal to the external control device 10200 via an antenna 10114A. Furthermore, the wireless communication unit 10114 receives a control signal related to drive control of the capsule endoscope 10100 from the external control device 10200 via the antenna 10114A. The wireless communication unit 10114 provides the control signal received from the external control device 10200 to the control unit 10117.

The power feed unit 10115 includes an antenna coil for power reception, a power regeneration circuit for regenerating power from a current generated in the antenna coil, a booster circuit, and the like. The power feed unit 10115 generates power using a principle of so-called non-contact charging.

The power supply unit 10116 includes a secondary battery, and stores the power generated by the power feed unit 10115. In FIG. 289, illustration of arrows or the like indicating a supply destination of the power from the power supply unit 10116 is omitted to avoid complication of the drawing. However, the power stored in the power supply unit 10116 is supplied to the light source unit 10111, the imaging unit 10112, the image processing unit 10113, the wireless communication unit 10114, and the control unit 10117, and can be used to drive these units.

The control unit 10117 includes a processor such as a CPU and appropriately controls drive of the light source unit 10111, the imaging unit 10112, the image processing unit 10113, the wireless communication unit 10114, and the power feed unit 10115 with control signals transmitted from the external control device 10200.

The external control device 10200 includes a processor such as a CPU and a GPU, a microcomputer in which a processor and a memory element such as a memory are mixed, a control board, or the like. The external control device 10200 controls the operation of the capsule endoscope 10100 by transmitting a control signal to the control unit 10117 of the capsule endoscope 10100 via an antenna 10200A. In the capsule endoscope 10100, for example, irradiation conditions of light with respect to the observation target in the light source unit 10111 can be changed according to the control signal from the external control device 10200. Furthermore, imaging conditions (for example, a frame rate in the imaging unit 10112, an exposure value, and the like) can be changed according to the control signal from the external control device 10200. Furthermore, the content of the processing in the image processing unit 10113, and conditions for transmitting the image signal by the wireless communication unit 10114 (for example, a transmission interval, the number of transmitted images, and the like) may be changed according to the control signal from the external control device 10200.

Furthermore, the external control device 10200 applies various types of image processing to the image signal transmitted from the capsule endoscope 10100 to generate image data for displaying the captured in-vivo image on the display device. As the image processing, various types of signal processing can be performed, such as development processing (demosaicing processing), high image quality processing (band enhancement processing, super resolution processing, noise reduction (NR) processing, and/or camera shake correction processing, for example), and/or enlargement processing (electronic zoom processing), for example. The external control device 10200 controls drive of the display device and displays in-vivo images captured on the basis of the generated image data. Alternatively, the external control device 10200 may cause a recording device (not illustrated) to record the generated image data or cause a printing device (not illustrated) to print out the generated image data.

An example of the in-vivo information acquisition system to which the technology according to the present disclosure is applicable has been described. The technology according to the present disclosure is applicable to the imaging unit 10112 among the above-described configurations. Specifically, the above-described solid-state imaging device 100 can be applied as the imaging unit 10112. By applying the technology according to the present disclosure to the imaging unit 10112, by applying the technology according to the present disclosure to the imaging unit 10112, generation of noise is suppressed and a clearer operation portion image can be obtained. Therefore, the accuracy of an examination is improved.

19. Application to Endoscopic Surgical System

The technology according to the present disclosure (present technology) can be applied to various products. For example, the technology according to the present disclosure may be applied to an endoscopic surgical system.

FIG. 290 is a diagram illustrating an example of a schematic configuration of an endoscopic surgical system to which the technology according to the present disclosure (present technology) is applicable.

FIG. 290 illustrates a state in which an operator (surgeon) 11131 is performing surgery for a patient 11132 on a patient bed 11133, using an endoscopic surgical system 11000. As illustrated in FIG. 213, the endoscopic surgical system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 213 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a forward-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, in other words, an image signal corresponding to an observed image is generated. The image signal is transmitted to a camera control unit (CCU) 11201 as raw data.

The CCU 11201 includes a central processing unit (CPU), a graphics processing unit (GPU), and the like, and comprehensively controls an operation of the endoscope 11100 and a display device 11202. Moreover, the CCU 11201 receives the image signal from the camera head 11102, and applies various types of image processing for displaying an image based on the image signal, such as developing processing (demosaicing processing) or the like, to the image signal.

The display device 11202 displays the image based on the image signal to which the image processing has been applied by the CCU 11201, by control of the CCU 11201.

The light source device 11203 includes a light source such as a light emitting diode (LED) for example, and supplies irradiation light to the endoscope 11100 in capturing an operation portion or the like.

An input device 11204 is an input interface for the endoscopic surgical system 11000. A user can input various types of information and instructions to the endoscopic surgical system 11000 through the input device 11204. For example, the user inputs an instruction to change imaging conditions (a type of irradiation light, a magnification, a focal length, and the like) by the endoscope 11100, and the like.

A treatment tool control device 11205 controls driving of the energy treatment tool 11112 for cauterization and incision of tissue, sealing of a blood vessel, and the like. A pneumoperitoneum device 11206 sends a gas into the body cavity of the patient 11132 through the pneumoperitoneum tube 11111 to expand the body cavity for the purpose of securing a field of view by the endoscope 11100 and a work space for the operator. A recorder 11207 is a device that can record various types of information regarding the surgery. A printer 11208 is a device that can print the various types of information regarding the surgery in various formats such as a text, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the drive of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, drive of the light source device 11203 may be controlled to change intensity of light to be output every predetermined time. The drive of the imaging element of the camera head 11102 is controlled in synchronization with change timing of the intensity of light and images are acquired in a time division manner, and the images are synthesized, so that a high-dynamic range image without so-called clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to observe fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image, for example, can be performed. The light source device 11203 can be configured to be able to supply narrow band light and/or exciting light corresponding to such special light observation.

FIG. 291 is a block diagram illustrating an example of functional configurations of the camera head 11102 and the CCU 11201 illustrated in FIG. 290.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured by a combination of a plurality of lenses including a zoom lens and a focus lens.

The imaging unit 11402 is configured by an imaging element. The imaging element that configures the imaging unit 11402 may be one imaging element (so-called single imaging element) or may be a plurality of imaging elements (so-called multiple imaging elements). In a case where the imaging unit 11402 is configured by multiple imaging elements, for example, a color image may be obtained by generating image signals respectively corresponding to RGB by the imaging elements and synthesizing the image signals. Alternatively, the imaging unit 11402 may be configured by a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured by the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured by an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured by a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling drive of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls drive of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling drive of the camera head 11102 to the camera head 11102. The image signal and the control signal can be transmitted through telecommunication, optical communication, or the like.

The image processing unit 11412 applies various types of image processing to the image signal as raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling drive of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion using a result of the recognition, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscopic surgical system to which the technology according to the present disclosure is applicable has been described. The technology according to the present disclosure is applicable to, for example, the imaging unit 11402 of the camera head 11102 in the above-described configurations. Specifically, the above-described solid-state imaging device 100 can be applied as the imaging unit 11402. By applying the technology according to the present disclosure to the imaging unit 11402, generation of noise is suppressed and a clearer operation portion image can be obtained. Therefore, the operator can reliably confirm the operation portion.

Note that, here, the endoscopic surgical system has been described as an example. However, the technology according to the present disclosure may be applied to microsurgery system or the like, for example.

20. Application to Moving Bodies

Moreover, the technology according to the present disclosure may be implemented as, for example, a device mounted on any type of moving bodies including an automobile, an electric automobile, a hybrid electric automobile, a motorcycle, a bicycle, a personal mobility, an airplane, a drone, a ship, a robot, and the like.

FIG. 292 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 292, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 292, as the output device, an audio speaker 12061, a display unit 12062, and an instrument panel 12063 are exemplarily illustrated. The display unit 12062 may include, for example, at least one of an on-board display or a head-up display.

FIG. 293 is a diagram illustrating an example of an installation position of the imaging unit 12031.

In FIG. 293, a vehicle 12100 includes, as the imaging unit 12031, imaging units 12101, 12102, 12103, 12104, and 12105.

The imaging units 12101, 12102, 12103, 12104, and 12105 are provided at positions of a front nose, side mirrors, a rear bumper or a back door, an upper portion of a windshield, and the like in an interior of the vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires a rear image of the vehicle 12100. The front images acquired in the imaging units 12101 and 12105 are mainly used for detection of a leading vehicle, a pedestrian, an obstacle, a traffic light, a traffic sign, a lane, or the like.

Note that FIG. 293 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an image element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to particularly extract a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to, for example, the imaging unit 12031 among the above-described configurations. Specifically, the above-described solid-state imaging device 100 can be applied as the imaging unit 12031. By applying the technology according to the present disclosure to the imaging unit 12031, generation of noise can be suppressed, and an easier-to-see captured image can be obtained. Therefore, the driving by the driver can be appropriately assisted.

Embodiments of the present technology are not limited to the above-described embodiments, and various modifications can be made without departing from the gist of the present technology.

Note that the effects described in the present specification are merely illustrative and are not restrictive, and effects other than the effects described in the present specification may be exhibited.

Note that the present technology can have the following configurations.

(1)

A circuit board including:

a first conductor periodically arranged with a first periodic width in a first region;

a second conductor periodically arranged with a second periodic width in the first region;

a third conductor periodically arranged with a third periodic width in a second region different from the first region; and a fourth conductor periodically arranged with a fourth periodic width in the second region, in which the first periodic width and the second periodic width are in a rational number relationship, the third periodic width and the fourth periodic width are in a rational number relationship, the first periodic width and the fourth periodic width are same or substantially same, the first region and the second region have a conductor structure mirror-symmetrical or substantially mirror-symmetrical in a first direction, and a first power supply connected to the first conductor and the third conductor and a second power supply connected to the second conductor and the fourth conductor are power supplies having different voltage values.

(2)

The circuit board according to (1), in which a sum of conductive areas within a predetermined range of the first conductor and the third conductor connected to the first power supply, and a sum of conductive areas within a predetermined range of the second conductor and the fourth conductor connected to the second power supply are same or substantially same.

(3)

The circuit board according to (1) or (2), in which a sum of conductor widths within a predetermined range of the first conductor and the third conductor connected to the first power supply, and a sum of conductor widths within a predetermined range of the second conductor and the fourth conductor connected to the second power supply are same or substantially same.

(4)

The circuit board according to any one of (1) to (3), in which the first conductor and the second conductor in the first region are diagonal conductors or stepped conductors arranged at a first angle with respect to the first direction, the third conductor and the fourth conductor in the second region are diagonal conductors or stepped conductors arranged at a second angle with respect to the first direction, the first angle is in a relationship of 0°<the first angle <90°, the second angle is in a relationship of −90°<the second angle <0°, and an absolute value of the first angle and an absolute angle of the second angle are same or substantially same.

(5)

The circuit board according to (4), in which the first conductor is periodically arranged with the first periodic width in a direction orthogonal to the first angle, the second conductor is periodically arranged with the second periodic width in a direction orthogonal to the first angle, the third conductor is periodically arranged with the third periodic width in a direction orthogonal to the second angle, and the fourth conductor is periodically arranged with the fourth periodic width in a direction orthogonal to the second angle.

(6)

The circuit board according to any one of (1) to (5), in which the first region and the second region also have a conductor structure mirror-symmetrical or substantially mirror-symmetrical in a second direction orthogonal to the first direction.

(7)

The circuit board according to any one of (1) to (6), in which the first to fourth conductors are arranged in a same first conductor layer.

(8)

The circuit board according to any one of (1) to (7), in which each of the first to fourth conductors is at least one of a linear conductor or a rectangular conductor.

(9)

The circuit board according to any one of (1) to (7), in which each of the first to fourth conductors is at least one of a reticulated conductor or a planar conductor.

(10)

The circuit board according to any one of (1) to (7), in which the first conductor and the fourth conductor are reticulated conductors, and the second conductor and the third conductor are non-reticulated conductors.

(11)

The circuit board according to any one of (1) to (10), in which the first conductor and the third conductor are mirror-symmetrically or substantially mirror-symmetrically arranged in the first direction, and the second conductor and the fourth conductor are mirror-symmetrically or substantially mirror-symmetrically arranged in the first direction.

(12)

The circuit board according to any one of (1) to (10), in which the first conductor and the fourth conductor are mirror-symmetrically or substantially mirror-symmetrically arranged in the first direction, and the second conductor and the third conductor are mirror-symmetrically or substantially mirror-symmetrically arranged in the first direction.

(13)

The circuit board according to any one of (1) to (12), in which the first region and the second region are continuously arranged without providing a gap between the first region and the second region.

(14)

The circuit board according to any one of (1) to (12), in which the first region and the second region are discontinuously arranged with providing a gap between the first region and the second region.

(15)

The circuit board according to any one of (1) to (14), further including:

a conductor group arranged at a position overlapping with at least a part of the first region and at least a part of the second region as viewed from the first direction and a third direction orthogonal to the second direction orthogonal to the first direction.

(16)

The circuit board according to (15), in which the conductor group is a control line that controls a transistor of a pixel or a signal line that transmits a pixel signal.

(17)

The circuit board according to (15) or (16), in which the conductor group is configured by periodically arranging two or more conductors longer in the first direction than in the second direction with a fifth periodic width in the second direction.

(18)

The circuit board according to (17), further including:

a circuit configured to selectively switch one or more conductors from among the two or more conductors configuring the conductor group.

(19)

A semiconductor device including a circuit board including:

a first conductor periodically arranged with a first periodic width in a first region;

a second conductor periodically arranged with a second periodic width in the first region;

a third conductor periodically arranged with a third periodic width in a second region different from the first region; and a fourth conductor periodically arranged with a fourth periodic width in the second region, in which the first periodic width and the second periodic width are in a rational number relationship, the third periodic width and the fourth periodic width are in a rational number relationship, the first periodic width and the fourth periodic width are same or substantially same, the first region and the second region have a conductor structure mirror-symmetrical or substantially mirror-symmetrical in a first direction, and a first power supply connected to the first conductor and the third conductor and a second power supply connected to the second conductor and the fourth conductor are power supplies having different voltage values.

(20)

An electronic device including a semiconductor device including a circuit board including:

a first conductor periodically arranged with a first periodic width in a first region;

a second conductor periodically arranged with a second periodic width in the first region;

a third conductor periodically arranged with a third periodic width in a second region different from the first region; and a fourth conductor periodically arranged with a fourth periodic width in the second region, in which the first periodic width and the second periodic width are in a rational number relationship, the third periodic width and the fourth periodic width are in a rational number relationship, the first periodic width and the fourth periodic width are same or substantially same, the first region and the second region have a conductor structure mirror-symmetrical or substantially mirror-symmetrical in a first direction, and a first power supply connected to the first conductor and the third conductor and a second power supply connected to the second conductor and the fourth conductor are power supplies having different voltage values.

REFERENCE SIGNS LIST

10 Pixel board
11 Victim conductor loop
20 Logic board
21 Power wiring
100 Solid-state imaging device
101 First semiconductor substrate
102 Second semiconductor substrate
111 Pixel/analog processing unit
112 Digital processing unit
121 Pixel array
122 A/D conversion unit
123 Vertical scanning unit
131 Pixel
132 Signal line
133 Control line
141 Photodiode
Vdd First power supply
Vss1 Second power supply
Vss2 Third power supply
165A to 165C Wiring layer
2501 (2501A, 2501B) Diagonal conductor
2511 (2511A, 2511B) Stepped conductor
2521 (2521A, 2521B) Diagonal conductor
2631 (2631A, 2631B) Linear conductor
2633 (2633A, 2633B) Linear conductor
2651 to 2656 Conductor
2711 Conductor layer
2712 (2712A, 2712B) Linear conductor
2713 (2713A, 2713B) Diagonal conductor
2851-1 First conductor region
2851-2 Second conductor region
2852 Gap region
2861 Conductor layer
2862 Pad region
2871 (2871A, 2871B) Linear conductor
2872 (2872A, 2872B) Linear conductor
2881 (2881A, 2881B) Rectangular conductor
2882 (2882A, 2882B) Rectangular conductor
2883 (2883A, 2883B) Conductor
2884 (2884A, 2884B) Conductor
2891 Reticulated conductor
2892 Relay conductor
2893 Reticulated conductor
2894 Relay conductor
2895 Reticulated conductor
2896 Relay conductor
2897 Reticulated conductor
2898 Relay conductor
2901 Conductor layer
2911-1 First conductor region
2911-2 Second conductor region
2912 Gap region
2921 Conductor layer
2931 Third conductor region
2941 Conductor layer
2942 Pad region
2951-1 First conductor region
2951-2 Second conductor region
2951-3 Third conductor region
2951-4 Fourth conductor region
2952 Gap region
2961 Conductor layer
2962 Pad region
2971-1 First conductor region
2971-2 Second conductor region

2971-3 Third conductor region
2971-4 Fourth conductor region
2972 Gap region
2981 Conductor layer
2982 Pad region
2991-1 First conductor region
2991-2 Second conductor region
2991-3 Third conductor region
2991-4 Fourth conductor region
2992 Gap region
700 Imaging device
701 Solid-state image sensor

The invention claimed is:

1. A circuit board, comprising:

a first conductor periodically arranged with a first periodic width in a first region;

a second conductor periodically arranged with a second periodic width in the first region;

a third conductor periodically arranged with a third periodic width in a second region different from the first region; and a fourth conductor periodically arranged with a fourth periodic width in the second region, wherein the first periodic width and the second periodic width are in a first rational number relationship, the third periodic width and the fourth periodic width are in a second rational number relationship, the first periodic width and the fourth periodic width are same or substantially same, the first region and the second region have a conductor structure which is mirror-symmetrical or substantially mirror-symmetrical in a first direction, the first conductor and the second conductor in the first region are one of diagonal conductors or stepped conductors arranged at a first angle with respect to the first direction, the third conductor and the fourth conductor in the second region are one of the diagonal conductors or the stepped conductors arranged at a second angle with respect to the first direction, the first angle is more than 0° and lesser than 90°, the second angle is more than −90° and lesser than 0°, an absolute value of the first angle and an absolute angle of the second angle are same or substantially same, a first power supply is connected to the first conductor and the third conductor, a second power supply is connected to the second conductor and the fourth conductor, and the first power supply and the second power supply have different voltage values.

2. The circuit board according to claim 1, wherein a first sum of first conductive areas within a first range of the first conductor and the third conductor connected to the first power supply, and a second sum of second conductive areas within a second range of the second conductor and the fourth conductor connected to the second power supply are same or substantially same.

3. The circuit board according to claim 1, wherein a first sum of first conductor widths within a first range of the first conductor and the third conductor connected to the first power supply, and a second sum of second conductor widths within a second range of the second conductor and the fourth conductor connected to the second power supply are same or substantially same.

4. The circuit board according to claim 1, wherein the first conductor is periodically arranged with the first periodic width in a direction orthogonal to the first angle, the second conductor is periodically arranged with the second periodic width in the direction orthogonal to the first angle, the third conductor is periodically arranged with the third periodic width in a direction orthogonal to the second angle, and the fourth conductor is periodically arranged with the fourth periodic width in the direction orthogonal to the second angle.

5. The circuit board according to claim 1, wherein the first region and the second region further have the conductor structure which is mirror-symmetrical or substantially mirror-symmetrical in a second direction orthogonal to the first direction.

6. The circuit board according to claim 1, wherein the first conductor, the second conductor, the third conductor and the fourth conductor are in a same first conductor layer.

7. The circuit board according to claim 1, wherein each of the first conductor, the second conductor, the third conductor and the fourth conductor is at least one of a linear conductor or a rectangular conductor.

8. The circuit board according to claim 1, wherein each of the first conductor, the second conductor, the third conductor and the fourth conductor is at least one of a reticulated conductor or a planar conductor.

9. The circuit board according to claim 1, wherein the first conductor and the fourth conductor are reticulated conductors, and the second conductor and the third conductor are non-reticulated conductors.

10. The circuit board according to claim 1, wherein the first conductor and the third conductor are mirror-symmetrically or substantially mirror-symmetrically arranged in the first direction, and the second conductor and the fourth conductor are mirror-symmetrically or substantially mirror-symmetrically arranged in the first direction.

11. The circuit board according to claim 1, wherein the first conductor and the fourth conductor are mirror-symmetrically or substantially mirror-symmetrically arranged in the first direction, and the second conductor and the third conductor are mirror-symmetrically or substantially mirror-symmetrically arranged in the first direction.

12. The circuit board according to claim 1, wherein the first region and the second region are continuously arranged without a gap between the first region and the second region.

13. The circuit board according to claim 1, wherein the first region and the second region are discontinuously arranged with a gap between the first region and the second region.

14. The circuit board according to claim 1, further comprising a conductor group at a position that overlaps with at least a part of the first region and at least a part of the second region as viewed from the first direction and a third direction, wherein the third direction is orthogonal to a second direction, and the second direction is orthogonal to the first direction.

15. The circuit board according to claim 14, wherein the conductor group is one of a control line configured to control a transistor of a pixel or a signal line configured to transmit a pixel signal.

16. The circuit board according to claim 14, wherein the conductor group is includes two or more conductors periodically arranged with a fifth periodic width in the second direction, and the two or more conductors are longer in the first direction than in the second direction.

17. The circuit board according to claim 16, further comprising a circuit configured to selectively switch at least one conductor from the two or more conductors of the conductor group.

18. A semiconductor device, comprising:

a circuit board including:

a first conductor periodically arranged with a first periodic width in a first region;

a second conductor periodically arranged with a second periodic width in the first region;

a third conductor periodically arranged with a third periodic width in a second region different from the first region; and a fourth conductor periodically arranged with a fourth periodic width in the second region, wherein the first periodic width and the second periodic width are in a first rational number relationship, the third periodic width and the fourth periodic width are in a second rational number relationship, the first periodic width and the fourth periodic width are same or substantially same, the first region and the second region have a conductor structure which is mirror-symmetrical or substantially mirror-symmetrical in a first direction, the first conductor and the second conductor in the first region are one of diagonal conductors or stepped conductors arranged at a first angle with respect to the first direction, the third conductor and the fourth conductor in the second region are one of the diagonal conductors or the stepped conductors arranged at a second angle with respect to the first direction, the first angle is more than 0° and lesser than 90°, the second angle is more than −90° and lesser than 0°, an absolute value of the first angle and an absolute angle of the second angle are same or substantially same, a first power supply is connected to the first conductor and the third conductor, a second power supply is connected to the second conductor and the fourth conductor, and the first power supply and the second power supply have different voltage values.

19. An electronic device, comprising:

a semiconductor device including a circuit board, wherein the circuit board includes:

a first conductor periodically arranged with a first periodic width in a first region;

a second conductor periodically arranged with a second periodic width in the first region;

a third conductor periodically arranged with a third periodic width in a second region different from the first region; and a fourth conductor periodically arranged with a fourth periodic width in the second region, wherein the first periodic width and the second periodic width are in a first rational number relationship, the third periodic width and the fourth periodic width are in a second rational number relationship, the first periodic width and the fourth periodic width are same or substantially same, the first region and the second region have a conductor structure which is mirror-symmetrical or substantially mirror-symmetrical in a first direction, the first conductor and the second conductor in the first region are one of diagonal conductors or stepped conductors arranged at a first angle with respect to the first direction, the third conductor and the fourth conductor in the second region are one of the diagonal conductors or the stepped conductors arranged at a second angle with respect to the first direction, the first angle is more than 0° and lesser than 90°, the second angle is more than −90° and lesser than 0°, an absolute value of the first angle and an absolute angle of the second angle are same or substantially same, a first power supply is connected to the first conductor and the third conductor, a second power supply is connected to the second conductor and the fourth conductor, and the first power supply and the second power supply have different voltage values.

* * * * *